US012063804B2

(12) United States Patent
Kim et al.

(10) Patent No.: US 12,063,804 B2
(45) Date of Patent: Aug. 13, 2024

(54) ORGANIC LIGHT-EMITTING DEVICE

(71) Applicant: Samsung Electronics Co., Ltd., Suwon-si (KR)

(72) Inventors: Jong Soo Kim, Hanam-si (KR); Jiwhan Kim, Seoul (KR); Hyeonho Choi, Seoul (KR); Hosuk Kang, Suwon-si (KR); Sangmo Kim, Hwaseong-si (KR); Juhyun Kim, Seoul (KR); Joonghyuk Kim, Seoul (KR); Sungho Nam, Daegu (KR); Yusuke Maruyama, Hwaseong-si (KR); Minsik Min, Suwon-si (KR); Sangho Park, Anyang-si (KR); Hyejin Bae, Suwon-si (KR); Sooghang Ihn, Hwaseong-si (KR); Soonok Jeon, Suwon-si (KR); Yongsik Jung, Seoul (KR); Kyeongsik Ju, Suwon-si (KR); Hyesung Choi, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 664 days.

(21) Appl. No.: 17/202,464

(22) Filed: Mar. 16, 2021

(65) Prior Publication Data

US 2022/0093878 A1 Mar. 24, 2022

(30) Foreign Application Priority Data

Sep. 21, 2020 (KR) ........................ 10-2020-0121785

(51) Int. Cl.

| | |
|---|---|
| ***H10K 50/12*** | (2023.01) |
| ***H10K 85/30*** | (2023.01) |
| ***H10K 85/60*** | (2023.01) |
| *H10K 101/00* | (2023.01) |

(52) U.S. Cl.

CPC ......... *H10K 50/121* (2023.02); *H10K 85/346* (2023.02); *H10K 85/636* (2023.02); *H10K 85/658* (2023.02); *H10K 2101/00* (2023.02)

(58) Field of Classification Search

CPC .......... H10K 85/657; C07F 5/02; C07F 5/027
See application file for complete search history.

(56) References Cited

U.S. PATENT DOCUMENTS

| | | | | |
|---|---|---|---|---|
| 9,944,627 B2 | | 4/2018 | Wong et al. | |
| 2018/0182980 A1 | * | 6/2018 | Lennartz | H10K 85/6574 |
| 2019/0181353 A1 | | 6/2019 | Ihn et al. | |
| 2019/0341557 A1 | | 11/2019 | Lin et al. | |

(Continued)

FOREIGN PATENT DOCUMENTS

| | | | | |
|---|---|---|---|---|
| CN | 112786818 A | * | 5/2021 | C07F 5/02 |
| KR | 1020190067694 A | | 6/2019 | |
| KR | 2020000098 A | * | 1/2020 | G06F 8/65 |

(Continued)

OTHER PUBLICATIONS

Machine translation of WO 2019/235452 (no date).*

(Continued)

*Primary Examiner* — Amanda C. Walke

(74) *Attorney, Agent, or Firm* — CANTOR COLBURN LLP

(57) ABSTRACT

Provided is an organic light-emitting device including an emission layer that includes a host, a sensitizer, and an emitter.

20 Claims, 5 Drawing Sheets

10

(56) References Cited

U.S. PATENT DOCUMENTS

| | | | | |
|---|---|---|---|---|
| 2020/0321537 | A1* | 10/2020 | Jeon | C09K 11/02 |
| 2022/0149287 | A1* | 5/2022 | Kim | H10K 85/6574 |

FOREIGN PATENT DOCUMENTS

| | | | | | |
|---|---|---|---|---|---|
| WO | WO-2015102118 | A1 | * | 7/2015 | C07F 5/02 |
| WO | WO-2017188111 | A1 | * | 11/2017 | C07D 209/80 |
| WO | WO-2018150832 | A1 | * | 8/2018 | C07C 15/28 |
| WO | 2018216820 | A1 | | 11/2018 | |
| WO | WO-2019102936 | A1 | * | 5/2019 | C07F 5/027 |
| WO | WO-2019235452 | A1 | * | 12/2019 | C07F 5/027 |
| WO | WO-2020039930 | A1 | * | 2/2020 | C07D 209/86 |

OTHER PUBLICATIONS

Si Hyun Han, et al., Ideal Blue Thermally Activated Delayed Fluorescence Emission Assisted by a Thermally Activated Delayed Fluorescence Assistant Dopant Through a Fast Reverse Intersystem Crossing Mediated Cascade Energy Transfer Process, J. Mater. Chem. C, 2019, 7, 3082-3089.

* cited by examiner

ORGANIC LIGHT-EMITTING DEVICE

CROSS-REFERENCE TO RELATED APPLICATION

This application claims priority under 35 U.S.C. § 119 to Korean Patent Application No. 10-2020-0121785, filed on Sep. 21, 2020, in the Korean Intellectual Property Office, the content of which is incorporated by reference herein in its entirety.

BACKGROUND

1. Field

Provided is an organic light-emitting device including an emission layer that satisfies a predetermined condition.

2. Description of Related Art

Organic light-emitting devices are self-emission devices that produce full-color images, and also have wide viewing angles, high contrast ratios, short response times, and excellent characteristics in terms of brightness, driving voltage, and response speed, compared to devices in the art.

In an example, an organic light-emitting device includes an anode, a cathode, and an organic layer between the anode and the cathode, wherein the organic layer includes an emission layer. A hole transport region may be located between the anode and the emission layer, and an electron transport region may be located between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state to thereby generate light.

SUMMARY

Provided is an organic light-emitting device including an emission layer that satisfies a certain condition.

Additional aspects will be set forth in part in the description which follows and, in part, will be apparent from the description, or may be learned by practice of the presented embodiments of the disclosure.

According to an aspect, provided is an organic light-emitting device including: a first electrode; a second electrode; and an organic layer between the first electrode and the second electrode, wherein the organic layer includes an emission layer, the emission layer includes a host, a sensitizer, and an emitter, the sensitizer includes a fourth-row transition metal of the Periodic Table of Elements, a fifth-row transition metal of the Periodic Table of Elements, a sixth-row transition metal of the Periodic Table of Elements, a lanthanide metal, an actinide metal, or any combination thereof, and the emission layer satisfies Condition 1 below:

$$\Theta_{H+S+E}/\Theta_{H+S}\times 100>109(\%). \quad \text{Condition 1}$$

In Condition 1, $\Theta_{H+S+E}$ is a horizontal orientation ratio of the emission layer, and $\Theta_{H+S}$ is a horizontal orientation ratio of a thin film consisting of the host and the sensitizer included in the emission layer.

According to another aspect, provided is an organic light-emitting device including: a first electrode; a second electrode; and m emission units located between the first electrode and the second electrode and including at least one emission layer; and m−1 charge generation layers located between two adjacent emission units of the m emission units and including an n-type charge generation layer and a p-type charge generation layer, wherein a maximum emission wavelength of light emitted from the at least one emission unit of the m emission units is different from a maximum emission wavelength of light emitted from at least one emission unit of the remaining emission units, wherein at least one of emission layers includes a host, a sensitizer, and an emitter, the sensitizer includes a fourth-row transition metal of the Periodic Table of Elements, a fifth-row transition metal of the Periodic Table of Elements, a sixth-row transition metal of the Periodic Table of Elements, a lanthanide metal, an actinide metal, or any combination thereof, and the at least one emission layer satisfies Condition 1.

According to another aspect, provided is an organic light-emitting device including: a first electrode; a second electrode; and m emission layers between the first electrode and the second electrode, wherein m is an integer of 2 or more, a maximum emission wavelength of light emitted from the at least one emission layer of the m emission layers is different from a maximum emission wavelength of light emitted from at least one emission layer of the remaining emission layers, wherein at least one of the m emission layers includes a host, a sensitizer, and an emitter, wherein the sensitizer includes a fourth-row transition metal of the Periodic Table of Elements, a fifth-row transition metal of the Periodic Table of Elements, a sixth-row transition metal of the Periodic Table of Elements, a lanthanide metal, a actinide metal, or any combination thereof, and the emission layers satisfy Condition 1.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
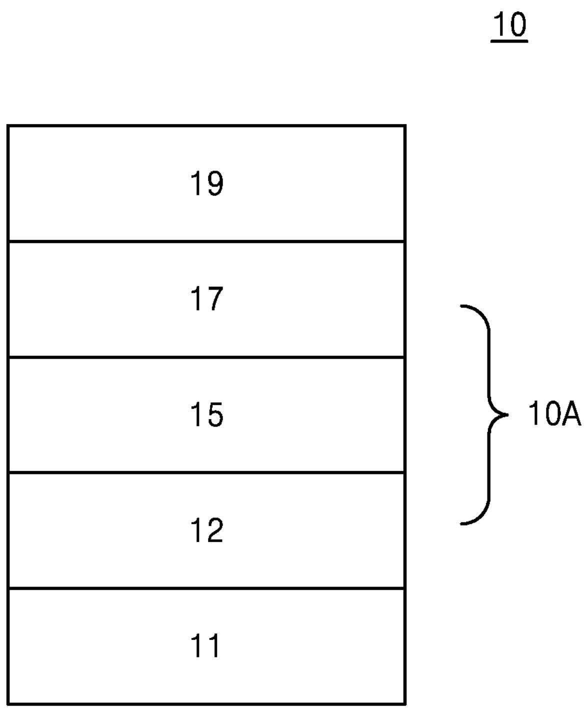
FIG. 1 is a schematic cross-sectional view of an organic light-emitting device according to an exemplary embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween In contrast, when an element is referred to as being "directly on" another element, there are no intervening elements present It will be understood that, although the terms "first," "second," "third" etc. may be used herein to describe various elements, components, regions, layers and/or sections, these elements, components, regions, layers and/or sections should not be limited by these terms These terms are only used to distinguish one element, component, region, layer or section from another element, component, region, layer or section Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures It will be understood that relative terms are intended to encompass different orientations of the device in addition to the orientation depicted in the Figures For example, if the device in one of the figures is turned over, elements described as being on the "lower" side of other elements would then be oriented on "upper" sides of the other elements The exemplary term "lower," can therefore, encompasses both an orientation of "lower" and "upper," depending on the particular orientation of the figure Similarly, if the device in one of the figures is turned over, elements described as "below" or "beneath" other elements would then be oriented "above" the other elements The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments As such, variations from the shapes of the illustrations as a result, for example, of manufacturing techniques and/or tolerances, are to be expected Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features Moreover, sharp angles that are illustrated may be rounded Thus, the regions illustrated in the figures are schematic in nature and their shapes are not intended to illustrate the precise shape of a region and are not intended to limit the scope of the present claims.

Description of FIG. 1

FIG. 1 is a schematic view of an organic light-emitting device 10 according to an exemplary embodiment. Hereinafter, a structure and a manufacturing method of an organic light-emitting device according to an embodiment of the present disclosure will be described with reference to FIG. 1.

The organic light-emitting device 10 of FIG. 1 includes a first electrode 11, a second electrode 19 facing the first electrode 11, and an organic layer 10A between the first electrode 11 and the second electrode 19.

The organic layer 10A includes an emission layer 15, a hole transport region 12 located between the first electrode 11 and the emission layer 15, and an electron transport region 17 located between the emission layer 15 and the second electrode 19.

A substrate may be additionally located under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

First Electrode 11

In one or more embodiments, the first electrode 11 may be formed by depositing or sputtering a material for forming the first electrode 11 on the substrate. The first electrode 11 may be an anode. The material for forming the first electrode 11 may be a material with a high work function to facilitate hole injection.

The first electrode 11 may be a reflective electrode, a semi-transmissive electrode, or a transmissive electrode. When the first electrode 11 is a transmissive electrode, a material for forming a first electrode may be indium tin oxide (ITO), indium zinc oxide (IZO), tin oxide ($SnO_2$), zinc oxide (ZnO), and any combinations thereof, but embodiments of the present disclosure are not limited thereto. In one or more embodiments, when the first electrode 110 is a semi-transmissive electrode or a reflective electrode, a material for forming the first electrode 110 may be magnesium (Mg), silver (Ag), aluminum (Al), aluminum-lithium (Al—

Li), calcium (Ca), magnesium-indium (Mg—In), magnesium-silver (Mg—Ag), and any combination thereof, but embodiments of the present disclosure are not limited thereto.

The first electrode 11 may have a single-layered structure or a multi-layered structure including two or more layers.

Emission Layer 15

The emission layer 15 includes a host, a sensitizer, and an emitter.

Since the emission layer 15 includes a host, a sensitizer, and an emitter and fluorescence or delayed fluorescence is emitted from the emitter, the organic light-emitting device 10 may have higher efficiency and/or longer lifespan than other organic light-emitting devices, for example, an organic light-emitting device that does not include a sensitizer, and particularly, an increase in the efficiency thereof may be remarkable. Without wishing to be bound by theory, triplet excitons formed at a host, which is 75% of the total excitons, are transferred to a sensitizer through Dexter energy transfer, and energy of singlet excitons formed at the host, which is 25% of the total excitons, is transferred to singlet and triplet of the sensitizer, wherein the singlet undergoes intersystem crossing into a triplet, and then, the triplet energy of the sensitizer is transferred to an emitter through Förster energy transfer. Accordingly, by transferring all the singlet excitons and the triplet excitons generated in the emission layer to an emitter, an organic light-emitting device having improved efficiency may be obtained. In addition, since an organic light-emitting device with significantly reduced energy loss may be obtained, the lifespan characteristics of the organic light-emitting device may be improved.

The emission layer 15 may satisfy the following Condition 1:

$$\Theta_{H+S+E}/\Theta_{H+S}\times 100 > \text{about } 109(\%). \quad \text{Condition 1}$$

In Condition 1, $\Theta_{H+S+E}$ is a horizontal orientation ratio of the emission layer 15, and $\Theta_{H+S}$ is a horizontal orientation ratio of a thin film consisting of the host and the sensitizer included in the emission layer.

$\Theta_{H+S+E}$ is a value obtained by preparing a quartz substrate having a thickness of 50 nm and formed by depositing the host, the sensitizer, and the emitter at a weight ratio of {100−(a+b)}:a:b, and comparing a graph obtained by measuring photoluminescence (PL) intensity of the same according to an angle of 0° to 90° with simulated graphs having different horizontal orientation ratios, for example, a horizontal orientation ratio of 100% and a horizontal orientation ratio of 67%. Here, a and b are each an arbitrary constant.

$\Theta_{H+S}$ is a value obtained by preparing a quartz substrate having a thickness of 50 nm and formed by depositing the host and the sensitizer at a weight ratio of (100−c):c, and comparing a graph obtained by measuring PL intensity of the same according to an angle of 0° to 90° with simulated graphs having different horizontal orientation ratios, for example, a horizontal orientation ratio of 100% and a horizontal orientation ratio of 67%. Here, c is an arbitrary constant.

When Condition 1 is satisfied, improved spectral overlap may be secured, and thus, efficiency and/or lifespan of the organic light-emitting device may be increased.

In detail, $\Theta_{H+S+E}/\Theta_{H+S}\times 100$ of the emission layer 15 may be about 140% or less, about 135% or less, about 111% or more, or about 110% or more.

In an embodiment, a spectral overlap integral (SOI) constant (J) of the sensitizer and the emitter is greater than or equal to about $1\times10^{14}$. J is a value obtained from the following Equation 1:

$$J = \int_0^\infty F_D(\lambda)\varepsilon_A(\lambda)\lambda^4 d\lambda. \quad \text{Equation 1}$$

In Equation 1,

λ is an emission wavelength (nm), $F_D(A)$ is an emission spectrum of the sensitizer, and $\varepsilon_A(A)$ is an extinction coefficient spectrum of the emitter.

When Equation 1 is satisfied, J may be greater than or equal to about $1\times10^{14}$, energy transfer to the emitter may be efficiency performed. Accordingly, the efficiency of the organic light-emitting device 10 and the lifespan of the organic light-emitting device may be increased at the same time.

In an embodiment, the host, the emitter, and the sensitizer may further satisfy the following Condition 2:

$$T_1(H) \geq T_1(S) \geq S_1(E). \quad \text{Condition 2}$$

In Condition 2, $T_1(H)$ is a lowest excitation triplet energy level of the host, $S_1(E)$ is a lowest excitation singlet energy level of the emitter, and $T_1(S)$ is a lowest excitation triplet energy level of the sensitizer.

When the host, the emitter, and the sensitizer satisfy Condition 2, triplet excitons may be effectively transferred from the emission layer to the emitter, and thus, an organic light-emitting device having improved efficiency may be obtained. In addition, when Condition 2 is further satisfied, only the emitter substantially emits light in the emission layer, and thus, a horizontal orientation ratio of the emission layer may vary according to a type of the emitter, regardless of the composition of the emission layer.

In an embodiment, the host and the sensitizer may further satisfy the following Condition 3:

$$T_1(H) > T_1(S). \quad \text{Condition 3}$$

In Condition 3, $T_1(H)$ is a lowest excitation triplet energy level of the host, and $T_1(S)$ is a lowest excitation triplet energy level of the sensitizer.

When the host and the sensitizer further satisfy Condition 3, in an emission layer consisting of the host and the sensitizer, only the sensitizer substantially emits light, and thus, a horizontal orientation ratio of the emission layer may vary according to a type of the sensitizer, regardless of the composition of the emission layer.

In an embodiment, $\Theta_{H+S+E}$ may be greater than or equal to about 80%. Because $\Theta_{H+S+E}$ is greater than or equal to 80%, the efficiency and/or the lifespan may be improved. In detail, because $\Theta_{H+S+E}$ is greater than or equal to about 80%, during the organic light-emitting device 10 is driven, an electric field may be emitted in a substantially horizontal direction (i.e., a direction parallel to the first electrode) with respect to the emission layer, and thus, optical loss due to a waveguide mode and/or a surface plasmon polariton mode may be reduced. Light emitted by such a mechanism may have high external extraction efficiency, and the organic light-emitting device 10 may achieve high luminescence efficiency.

In detail, $\ominus_{H+S+E}$ may be, for example, about 84% or more, about 87% or more, about 90% or more, about 93% or more, about 96% or more, about 99% or more, or 100% or less.

Among total emission components emitted from the emission layer, a proportion of emission components emitted from the emitter may be greater than or equal to about 80%. In an embodiment, the emitter may be a delayed fluorescence dopant emitting delayed fluorescence. A proportion of delayed fluorescence components to total emission components in time-resolved photoluminescence (TRPL) of the emitter may be about 85% or more, for example, about 90% or more, about 95% or more, or about 99% or more. The emitter emits delayed fluorescence. Accordingly, when the emitter is used, an organic light-emitting device having high efficiency may be obtained. The proportion of delayed fluorescence components (DF portion) may be evaluated using a known method. A more detailed evaluation method of the DF portion will be described with reference to embodiments to be described later.

Each of the host and the sensitizer may not emit light.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

Host in Emission Layer 15

The host may not include metal atoms.

In an embodiment, the host may include one type of host. When the host includes one type of host, the one type of host may be an amphiprotic host, an electron transport host, or a hole transport host, which will be described later.

In one or more embodiments, the host may include a mixture of two or more different hosts. For example, the host may be a mixture of an electron transport host and a hole transport host, a mixture of two different types of electron transport hosts, or a mixture of two different types of hole transport hosts. The electron transport host and the hole transport host may be understood by referring to the related description to be presented later.

In one or more embodiments, the host may include an electron transport host including at least one electron transport moiety and a hole transport host that does not include an electron transport moiety.

The electron transport host may include at least one electron transport moiety. The hole transport host may not include an electron transport moiety.

In the present specification, the electron transport moiety may be a cyano group, —F, —$CFH_2$, —$CF_2H$, —$CF_3$, a π-electron-deficient nitrogen-containing cyclic group, or a group represented by one of the following formulae:

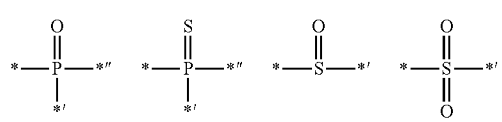

In the formulae, *, *', and *" each indicate a binding site to a neighboring atom.

In an embodiment, the electron transport host may include a cyano group, a π-electron-deficient nitrogen-containing cyclic group, or any combination thereof.

In one or more embodiments, the electron transport host may include at least one cyano group.

In one or more embodiments, the electron transport host may include at least one cyano group and at least one π-electron-deficient nitrogen-containing cyclic group.

In an embodiment, the hole transport host may include at least one π-electron-deficient nitrogen-free cyclic group and may not include an electron transport moiety.

In the present specification, the term "π-electron-deficient nitrogen-containing cyclic group" refers to a cyclic group having at least one *—N=*' moiety, and for example, may be: an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, a benzoisoxazole group, a triazole group, a tetrazole group, an oxadiazole group, a triazine group, a thiadiazole group, an imidazopyridine group, an imidazopyrimidine group, and an azacarbazole group; or a condensed cyclic group of two or more π-electron-deficient nitrogen-containing cyclic groups.

In the present specification, the term "π-electron-deficient nitrogen-free cyclic group" may be, for example, a benzene group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a corogen group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, or a triindolobenzene group; or a condensed cyclic group of two or more π-electron-deficient nitrogen-free cyclic groups, but embodiments of the present disclosure are not limited thereto.

In one or more embodiments, the electron transport host may be a compound represented by Formula E-1 and the hole transport host may be a compound represented by Formula H-1, but embodiments of the present disclosure are not limited thereto:

$$[Ar_{301}]_{xb11}\text{-}[(L_{301})_{xb1}\text{-}R_{301}]_{xb21} \qquad \text{Formula E-1}$$

In Formula E-1, $Ar_{301}$ is a substituted or unsubstituted $C_5$-$C_{60}$ carbocyclic group or a substituted or unsubstituted $C_1$-$C_{60}$ heterocyclic group, xb11 is 1, 2, or 3, $L_{301}$ is a single bond, a group represented by the following formulae, a substituted or unsubstituted $C_5$-$C_{60}$ carbocyclic group, or a substituted or unsubstituted $C_1$-$C_{60}$ heterocyclic group, and *, *', and *" in the following formulae are each a binding site to a neighboring atom,

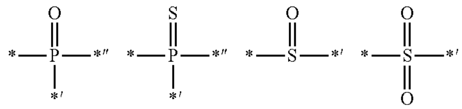

xb1 is an integer from 1 to 5, $R_{301}$ is hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_{60}$ alkoxy group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), —S(=O)($Q_{301}$), —P(=O)($Q_{301}$)($Q_{302}$), or —P(=S)($Q_{301}$)($Q_{302}$), xb21 is an integer from 1 to 5, $Q_{301}$ to $Q_{303}$ are each independently a $C_1$-$C_{10}$ alkyl group, a $C_1$-$C_{10}$ alkoxy group, a phenyl group, a biphenyl group, a terphenyl group, or a naphthyl group, and at least one of the following Condition A to Condition C is satisfied.

Condition A at least one of $Ar_{301}$, $L_{301}$, and $R_{301}$ in Formula E-1 each independently includes a π-electron-deficient nitrogen-containing cyclic group;

Condition B $L_{301}$ in Formula E-1 is a group represented by one of the following formulae:

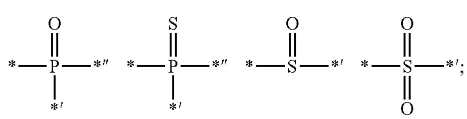

Condition C $R_{301}$ in Formula E-1 is a cyano group, —S(=O)$_2$($Q_{301}$), —S(=O)($Q_{301}$), —P(=O)($Q_{301}$)($Q_{302}$), or —P(=S)($Q_{301}$)($Q_{302}$).

Formula H-1

$$Ar_{401}-(L_{401})_{xd1}-(Ar_{402})_{xd11}$$

11

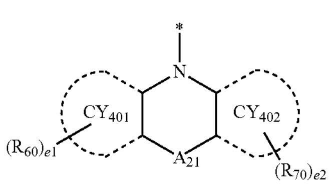

-continued

12

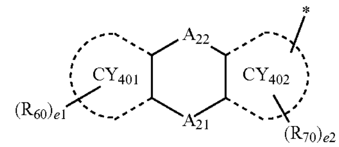

11

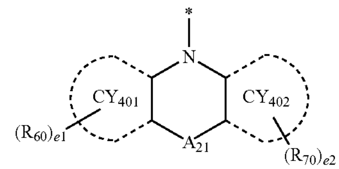

화학식

12

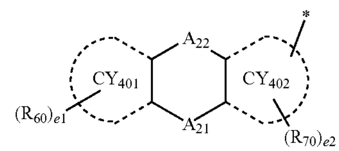

화학식

In Formulae H-1, 11, and 12, $L_{401}$ is: a single bond; or a benzene group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a corogen group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, and a triindolobenzene group, each unsubstituted or substituted with at least one deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group, or —Si($Q_{401}$)($Q_{402}$)($Q_{403}$), xd1 is an integer from 1 to 10, wherein, when xd1 is 2 or more, two or more of $L_{401}$(s) may be identical to or different from each other, $Ar_{401}$ is groups represented by Formulae 11 or 12, $Ar_{402}$ is: a group represented by Formulae 11 or 12, a phenyl group, a naphthyl group, a fluorenyl group, a carbazolyl group, a dibenzofuranyl group, a dibenzothiophenyl group, a biphenyl group, a terphenyl group, or a triphenylenyl group; or a phenyl group, a naphthyl group, a fluorenyl group, a carbazolyl group, a dibenzofuranyl group, a dibenzothiophenyl group, a biphenyl group, a terphenyl group, or a triphenylenyl group, each substituted with at least one deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a carbazolyl group, a dibenzofuranyl group, a dibenzothiophenyl group, a biphenyl group, a terphenyl group, a triphenylenyl group, or any combination thereof, $CY_{401}$ and $CY_{402}$ are each independently a benzene group, a naphthalene group, a fluorene group, a carbazole group, a benzocarbazole group, an indolocarbazole group, a dibenzofuran group, a dibenzothiophene group, a dibenzosilole group, a benzonaphthofuran group, a benzonaphthothiophene group, or a benzonaphthosilole group, $A_{21}$ is a single bond, O, S, $N(R_{51})$, $C(R_{51})(R_{52})$, or $Si(R_{51})(R_{52})$, $A_{22}$ is a single bond, O, S, $N(R_{53})$, $C(R_{53})(R_{54})$, or $Si(R_{53})(R_{54})$, at least one of $A_{21}$ and $A_{22}$ in Formula 12 is not a single bond, $R_{51}$ to $R_{54}$, $R_{60}$, and $R_{70}$ are each independently:

hydrogen, deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with at least one deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a carbazolyl group, a dibenzofuranyl group, a dibenzothiophenyl group, or any combination thereof;

a π-electron-deficient nitrogen-free cyclic group (for example, a phenyl group, a naphthyl group, a fluorenyl group, a carbazolyl group, a dibenzofuranyl group, a dibenzothiophenyl group, a biphenyl group, a terphenyl group, and a triphenylenyl group);

a π-electron-deficient nitrogen-free cyclic group (for example, a phenyl group, a naphthyl group, a fluorenyl group, a carbazolyl group, a dibenzofuranyl group, a dibenzothiophenyl group, a biphenyl group, a terphenyl group, and a triphenylenyl group) that is substituted with at least one deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a carbazolyl group, a dibenzofuranyl group, a dibenzothiophenyl group, a biphenyl group, or any combination thereof; or —$Si(Q_{404})(Q_{405})(Q_{406})$, e1 and e2 are each independently an integer from 0 to 10, $Q_{401}$ to $Q_{406}$ are each independently hydrogen, deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a carbazolyl group, a dibenzofuranyl group, a dibenzothiophenyl group, a biphenyl group, a terphenyl group, or a triphenylenyl group, and

* indicates a binding site to an adjacent atom.

In one or more embodiments, in Formula E-1, $Ar_{301}$ and $L_{301}$ may each independently be a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, or an azacarbazole group, each unsubstituted or substituted with at least one deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, a cyano-containing phenyl group, a cyano-containing biphenyl group, a cyano-containing terphenyl group, a cyano-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl)triazinyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, —$P(=O)(Q_{31})(Q_{32})$, or any combination thereof;

at least one of $L_{301}$(s) in the number of xb1 may each independently be an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, or an azacarbazole group, each unsubstituted or substituted with at least one deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, a cyano-containing phenyl group, a cyano-containing biphenyl group, a cyano-containing terphenyl group, a cyano-containing naphthyl group, a pyridinyl group, a phenylpyridinyl group, a diphenylpyhdinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl)triazinyl group. —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, —$P(=O)(Q_{31})(Q_{32})$, or any combination thereof;

$R_{301}$ may be hydrogen, deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a tetraphenyl group, a naphthyl group, a cyano-containing phenyl group, a cyano-containing biphenyl group, a cyano-containing terphenyl group, a cyano-containing tetraphenyl group, a cyano-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl) triazinyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, and $Q_{31}$ to $Q_{33}$ may each independently be a $C_1$-$C_{10}$ alkyl group, a $C_1$-$C_{10}$ alkoxy group, a phenyl group, a biphenyl group, a terphenyl group, or a naphthyl group, but embodiments of the present disclosure are not limited thereto.

In one or more embodiments, $Ar_{301}$ may be: a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, or a dibenzothiophene group, each unsubstituted or substituted with at least one deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a cyano group-containing phenyl group, a cyano group-containing biphenyl group, a cyano group-containing terphenyl group, a cyano group-containing naphthyl group, a pyridinyl group, a phenyl pyridinyl group, a diphenyl pyridinyl group, a biphenyl pyridinyl group, a di(biphenyl) pyridinyl group, a pyrazinyl group, a phenyl pyrazinyl group, a diphenyl pyrazinyl group, a biphenyl pyrazinyl group, a di(biphenyl) pyrazinyl group, a pyridazinyl group, a phenyl pyridazinyl group, a diphenyl pyridazinyl group, a biphenyl pyridazinyl group, a di(biphenyl) pyridazinyl group, a pyrimidinyl group, a phenyl pyrimidinyl group, a diphenyl pyrimidinyl group, a biphenyl pyrimidinyl group, a di(biphenyl) pyrimidinyl group, a triazinyl group, a phenyl triazinyl group, a diphenyl triazinyl group, a biphenyl triazinyl group, a di(biphenyl) triazinyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, —$P(=O)(Q_{31})(Q_{32})$, or any combination thereof; or A group represented by one of Formulae 5-1 to 5-3 and Formulae 6-1 to 6-33, and $L_{301}$ may be a group represented by one of Formulae 5-1 to 5-3 and Formulae 6-1 to 6-33:

5-1

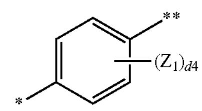

5-2

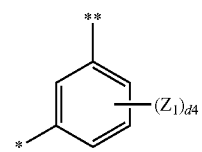

5-3

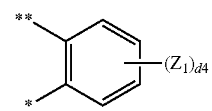

6-1

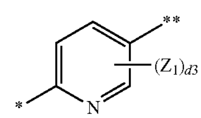

6-2

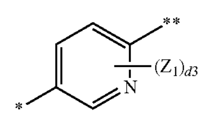

6-3

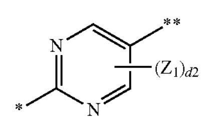

6-4

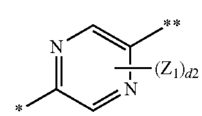

6-5

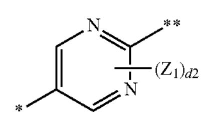

6-6

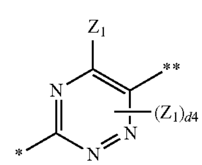

6-7

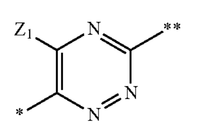

6-8

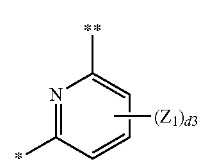

-continued
6-9
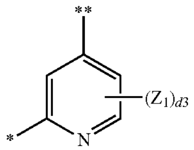
6-10
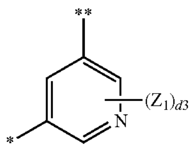
6-11
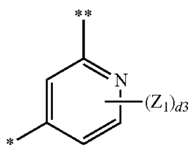
6-12
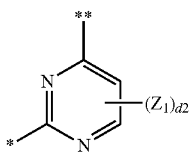
6-13
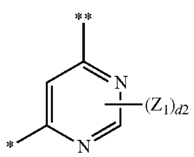
6-14
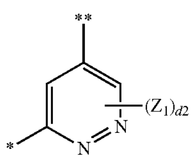
6-15
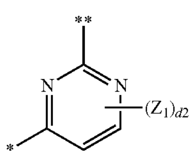
6-16
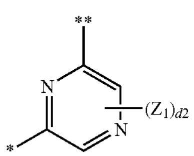
6-17
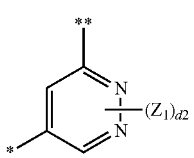
6-18
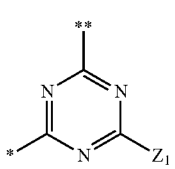
-continued
6-19
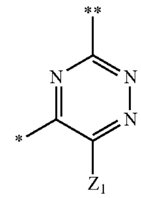
6-20
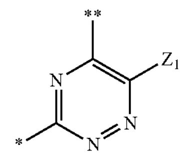
6-21
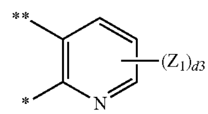
6-22
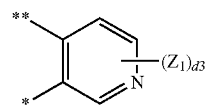
6-23
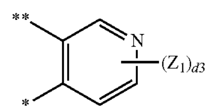
6-24
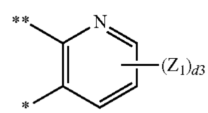
6-25
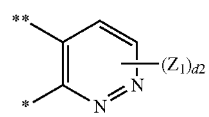
6-26
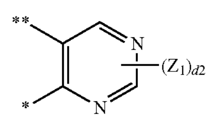
6-27
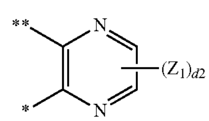
6-28
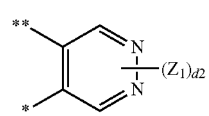
6-29
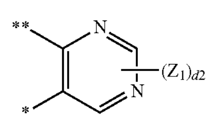
6-30
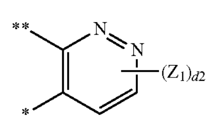

-continued 6-31

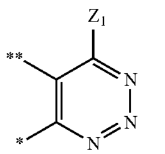

6-32

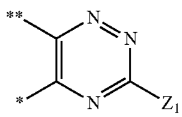

6-33

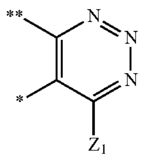

In Formulae 5-1 to 5-3 and 6-1 to 6-33, $Z_1$ is hydrogen, deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, a cyano-containing phenyl group, a cyano-containing biphenyl group, a cyano-containing terphenyl group, a cyano-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl)triazinyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$), d4 is 0, 1, 2, 3, or 4, d3 is 0, 1, 2, or 3, d2 is 0, 1, or 2, and

* and *' each indicate a binding site to a neighboring atom.

$Q_{31}$ to $Q_{33}$ are the same as described above.

In one or more embodiments, $L_{301}$ may be a group represented by one of Formulae 5-2, 5-3, and 6-8 to 6-33.

In one or more embodiments, $R_{301}$ may be a cyano group or a group represented by one of Formulae 7-1 to 7-18, and at least one of $Ar_{402}$ in the number of xd11 may be a group represented by one of Formulae 7-1 to 7-18, but embodiments of the present disclosure are not limited thereto:

7-1

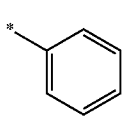

-continued 7-2

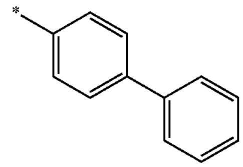

7-3

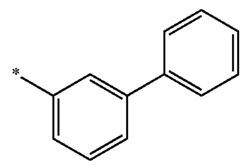

7-4

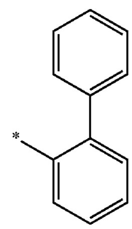

7-5

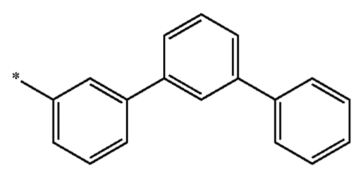

7-6

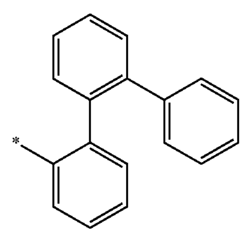

7-7

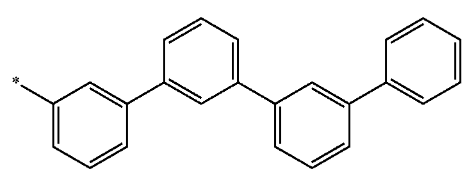

7-8

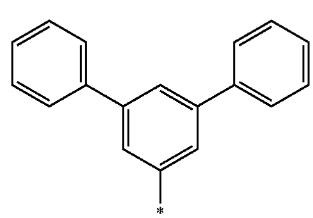

-continued 7-9

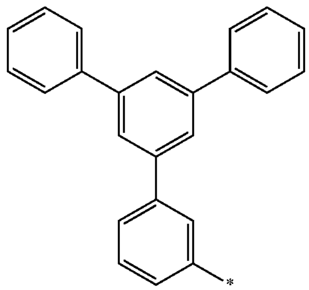

7-10

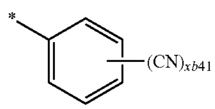

7-11

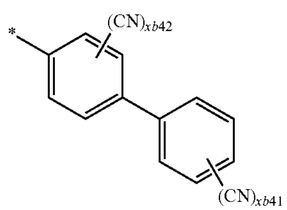

7-12

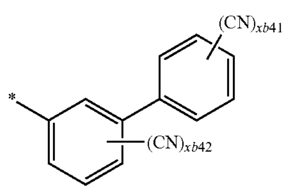

7-13

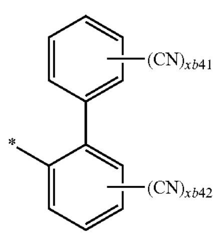

7-14

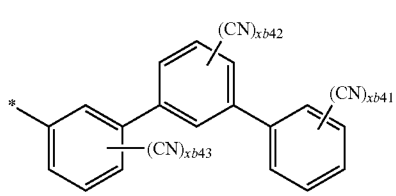

7-15

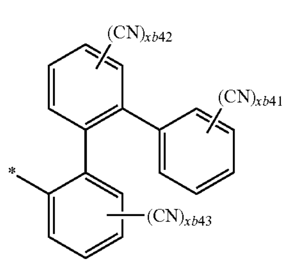

-continued 7-16

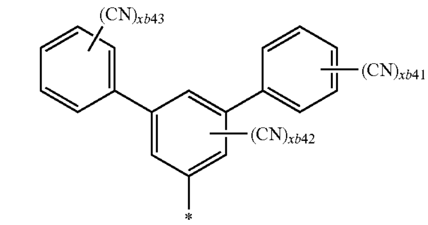

7-17

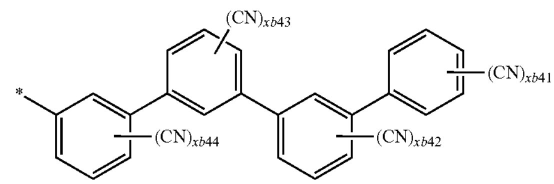

7-18

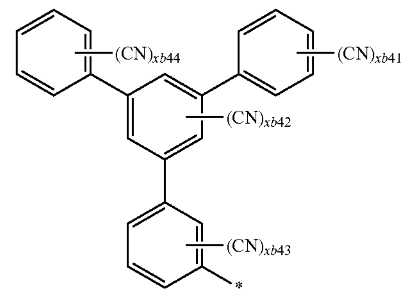

in Formulae 7-1 to 7-18, xb41 to xb44 are each 0, 1, or 2, wherein xb41 in Formula 7-10 is not 0, the sum of xb41 and xb42 in Formulae 7-11 to 7-13 is not 0, the sum of xb41, xb42, and xb43 in Formulae 7-14 to 7-16 is not 0, the sum of xb41, xb42, xb43, and xb44 in Formulae 7-17 and 7-18 is not 0, and * indicates a binding site to a neighboring atom.

Two or more of $Ar_{301}$(s) in Formula E-1 are identical to or different from each other, two or more of $L_{301}$(s) in Formula E-1 are identical to or different from each other, two or more of $L_{401}$(s) in Formula H-1 are identical to or different from each other, and two or more of $Ar_{402}$(s) in Formula H-1 are identical to or different from each other.

The electron transport host may be, for example, a compound of a group HE1 to HE7, but embodiments of the present disclosure are not limited thereto:

Group HE1

H-E1

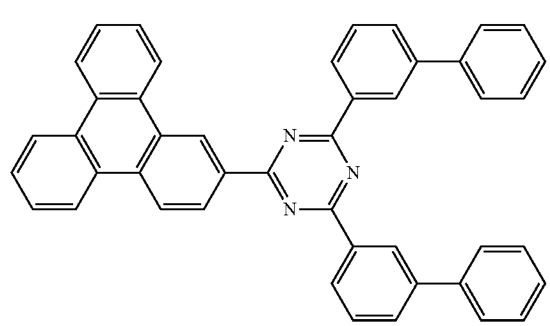

-continued
H-E2
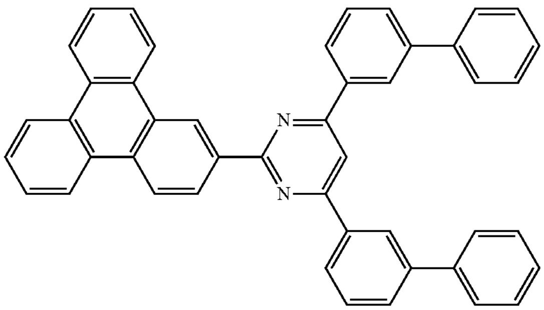
H-E3
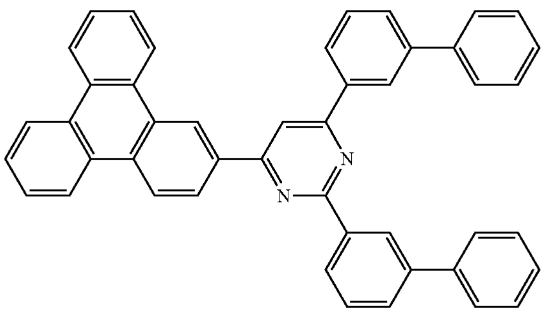
H-E4
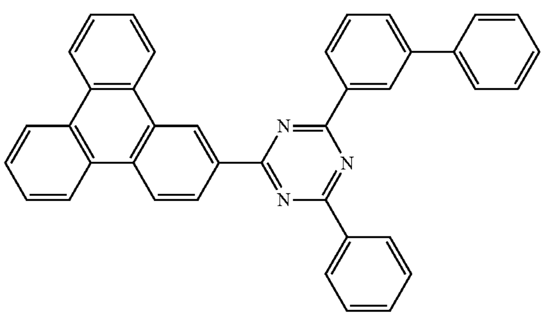
H-E5
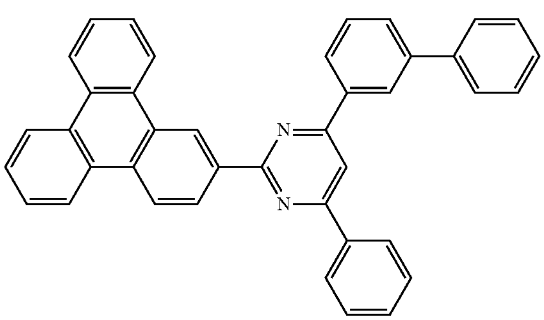
-continued
H-E6
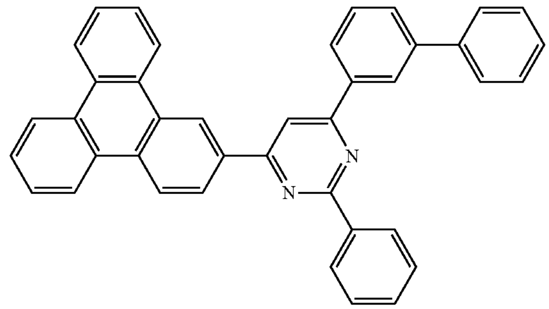
H-E7
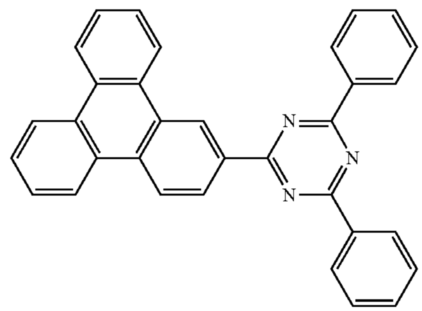
H-E8
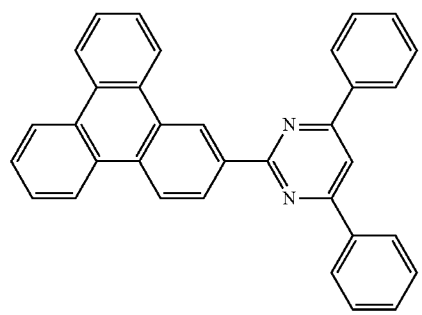
H-E9
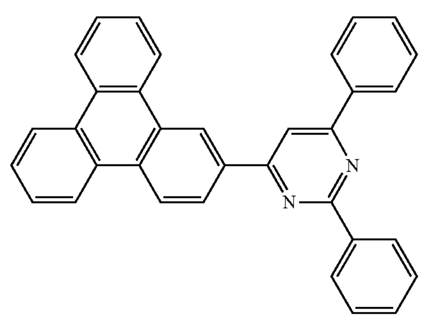
H-E10
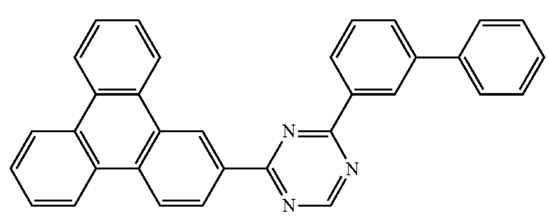

-continued
H-E11
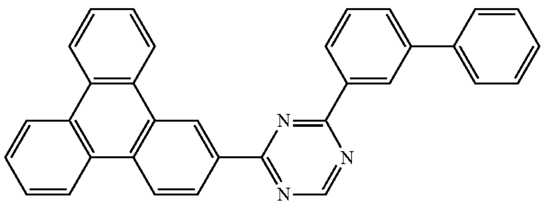
H-E12
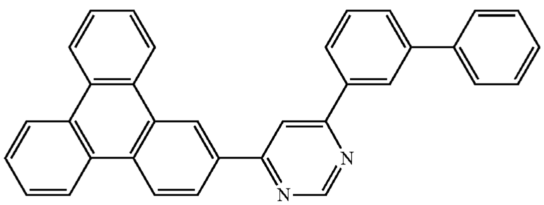
H-E13
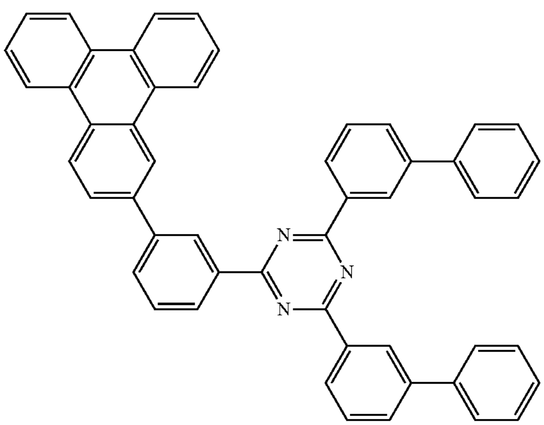
H-E14
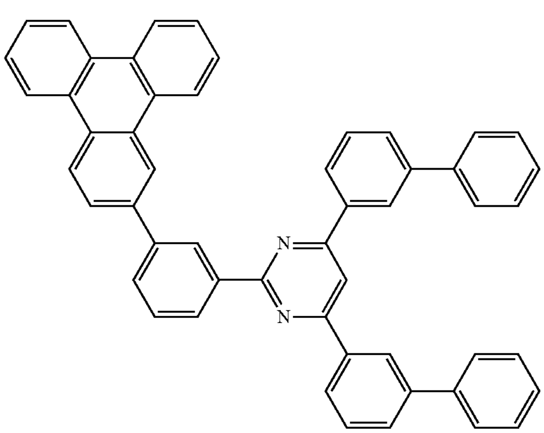
-continued
H-E15
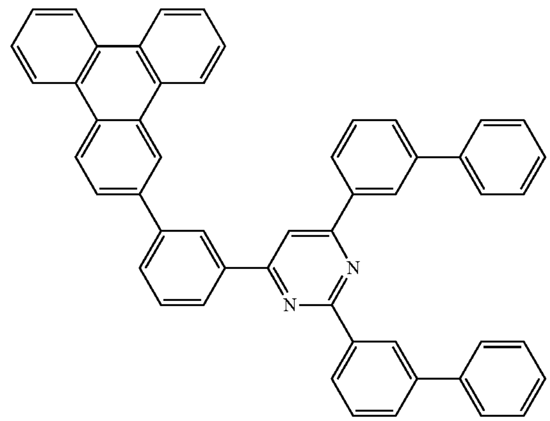
H-E16
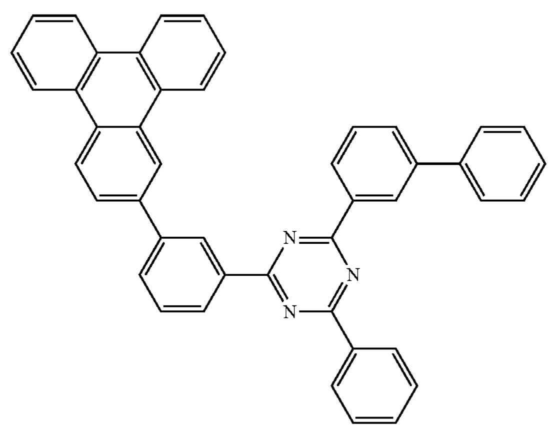
H-E17
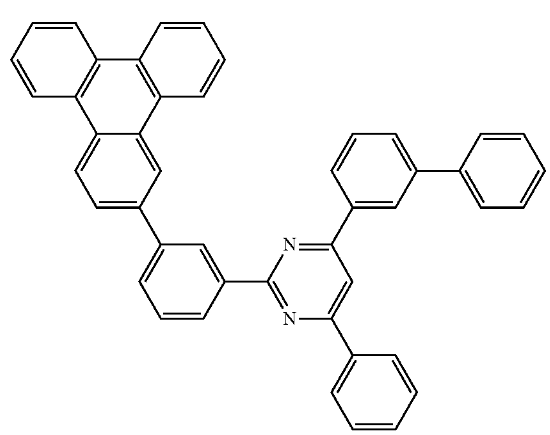

-continued
H-E18
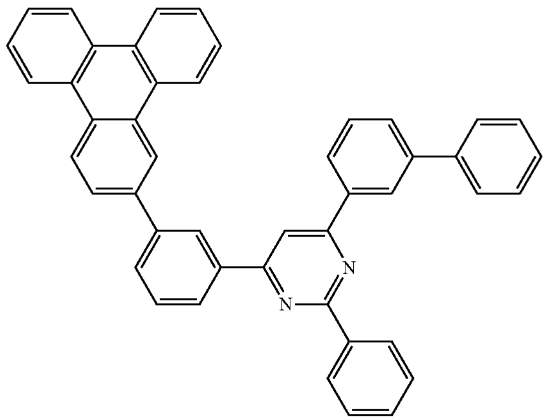
H-E19
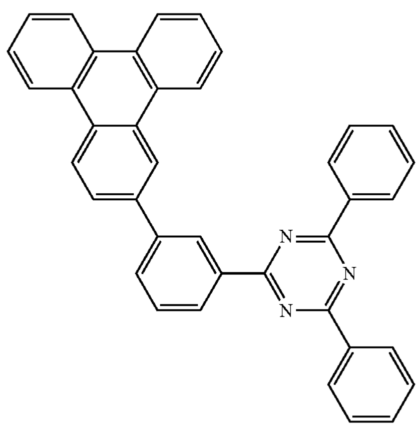
H-E20
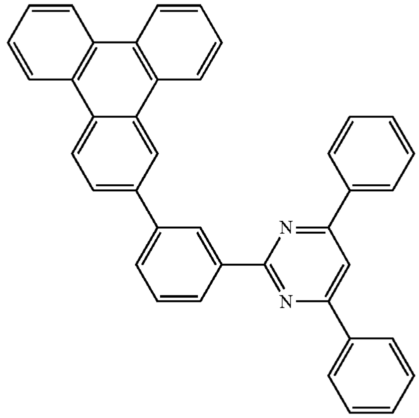
-continued
H-E21
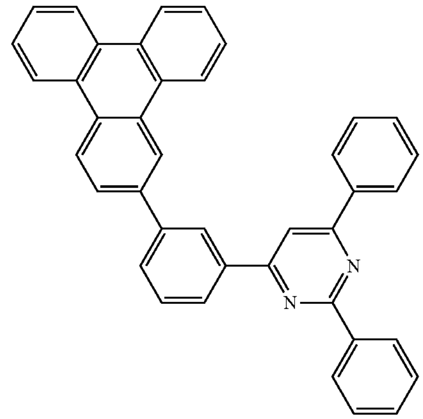
H-E22
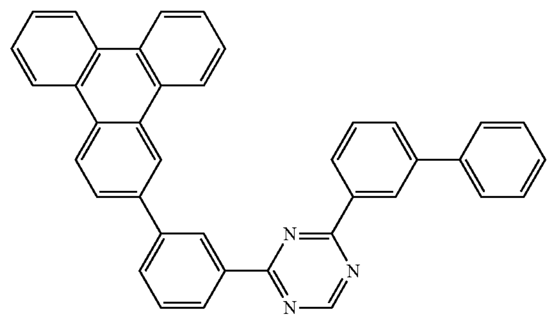
H-E23
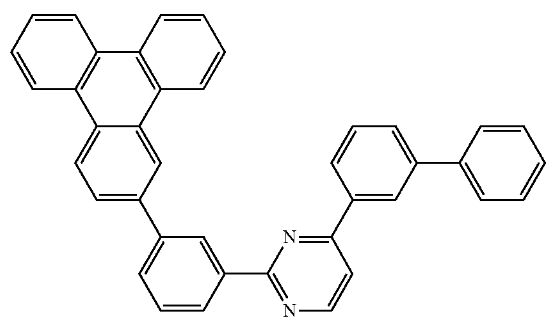
H-E24
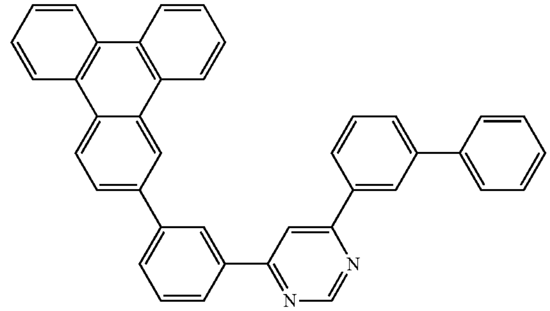

H-E25
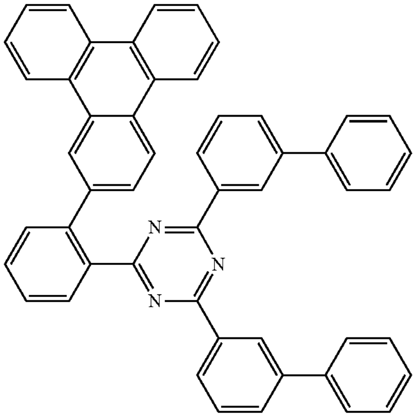
H-E26
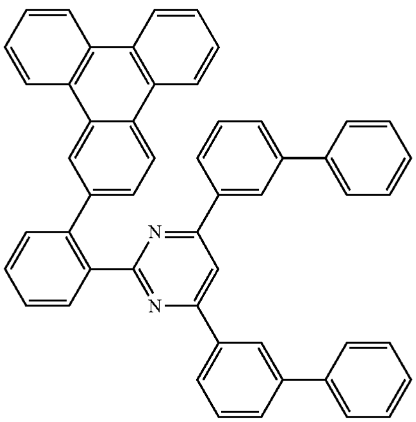
H-E27
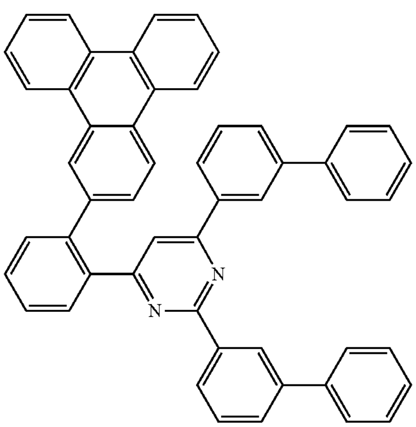
H-E28
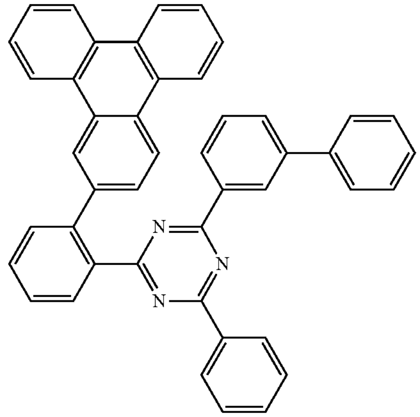
H-E29
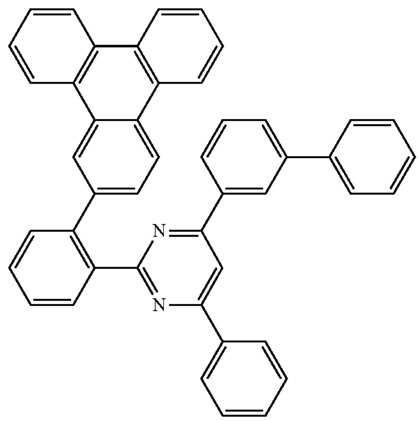
H-E30
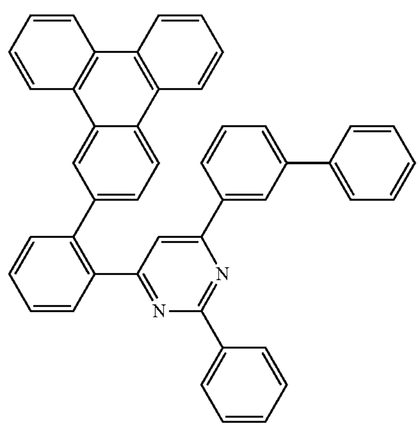

-continued
H-E31
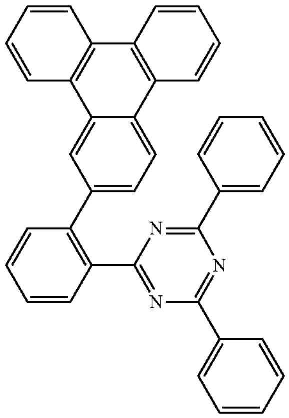
H-E32
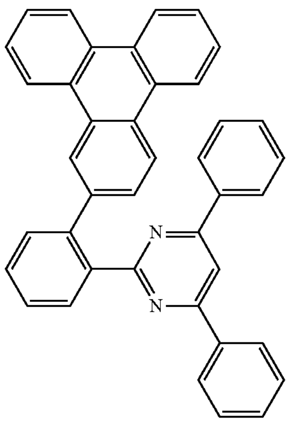
H-E33
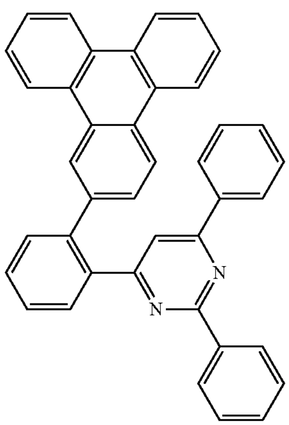
H-E34
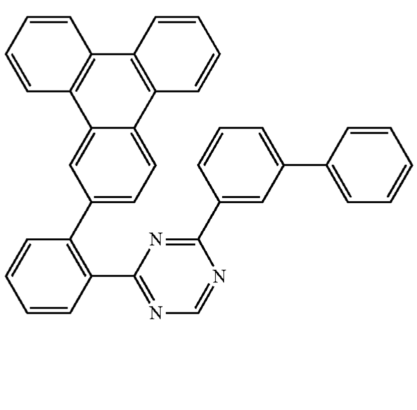
-continued
H-E35
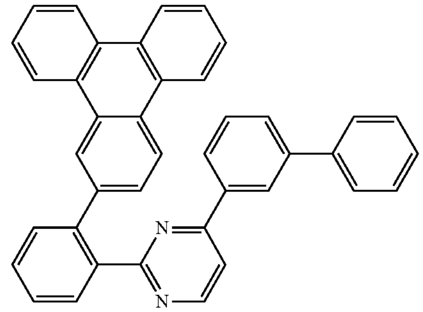
H-E36
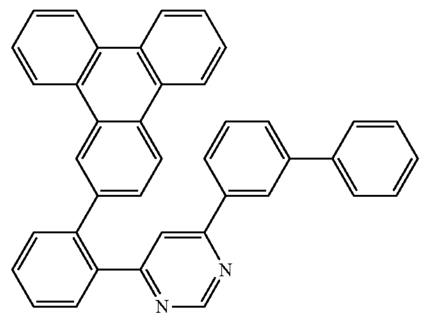
H-E37
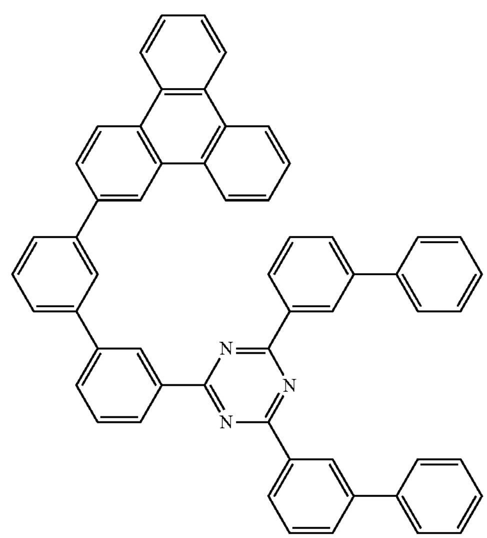

H-E38
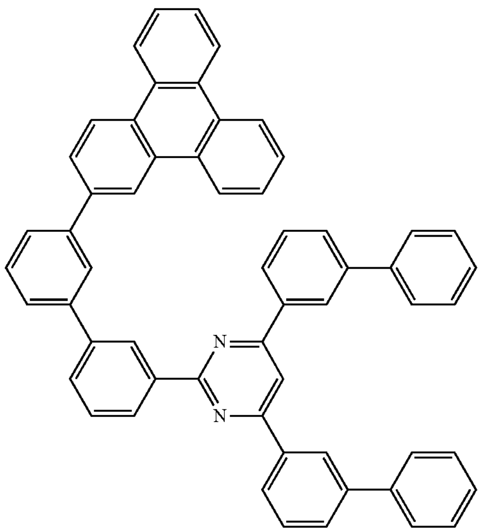
H-E39
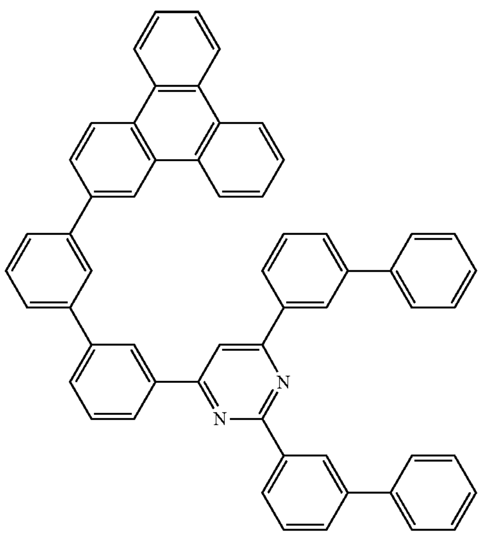
H-E40
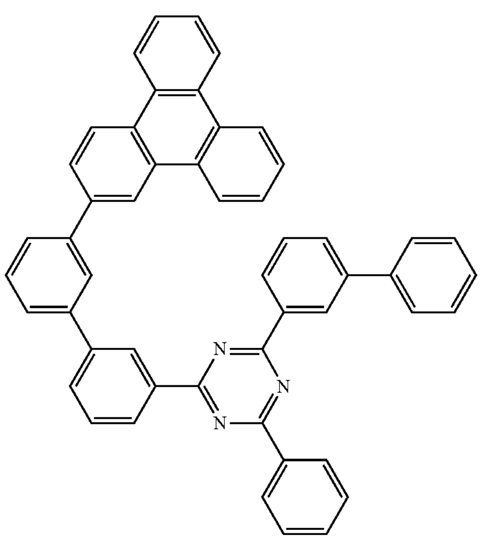
H-E41
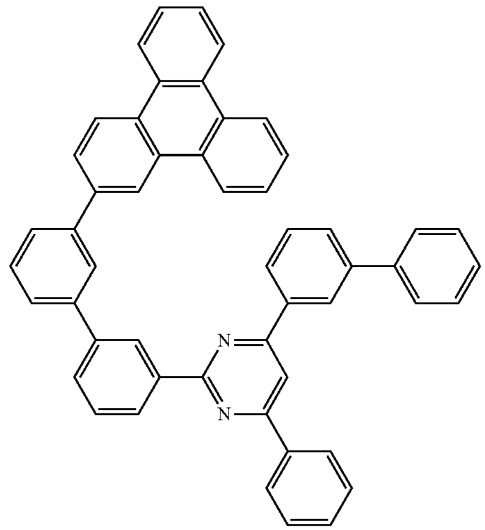
H-E42
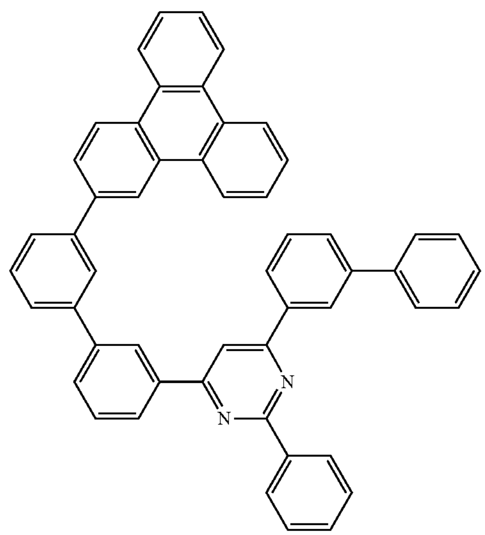
H-E43
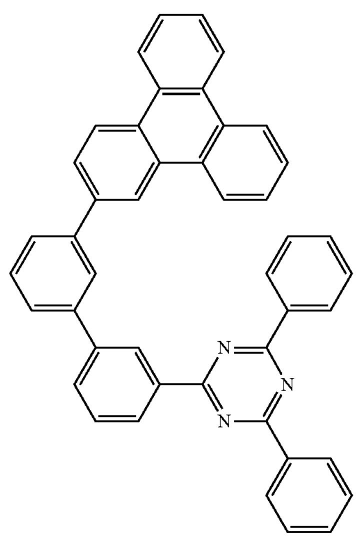

-continued
H-E44
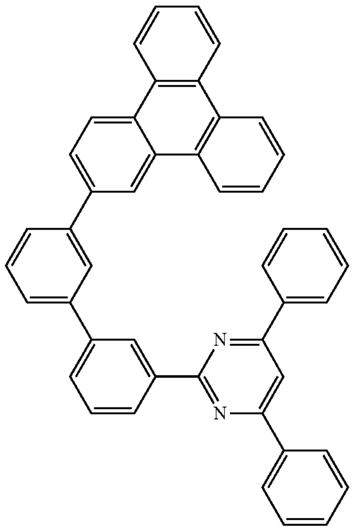
H-E45
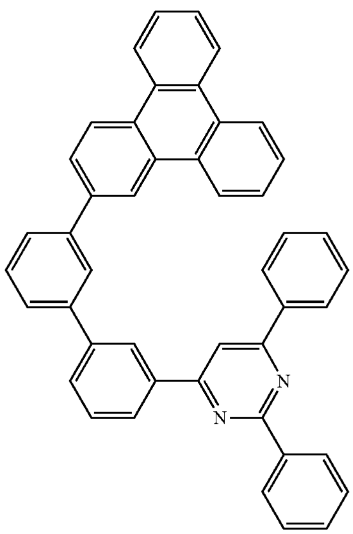
H-E46
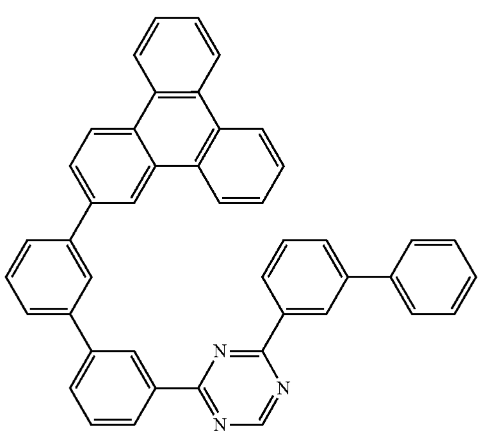
-continued
H-E47
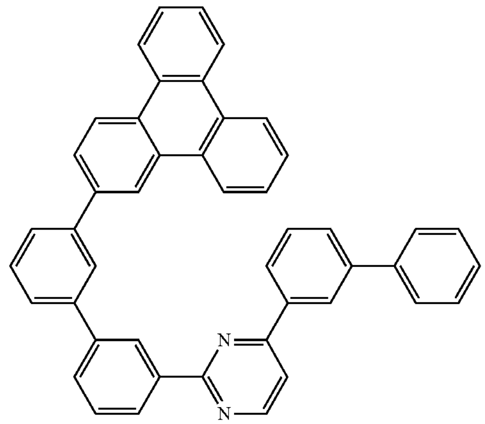
H-E48
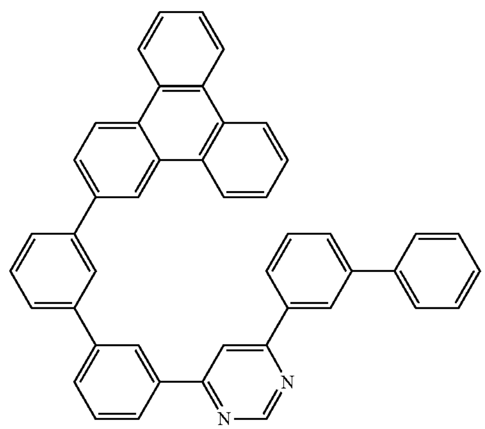
H-E49
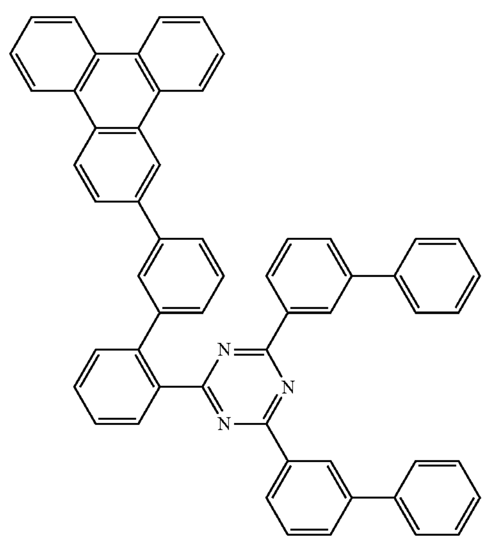

-continued
H-E50
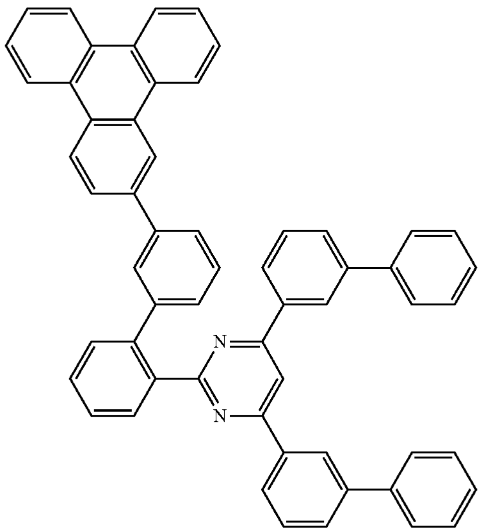
H-E51
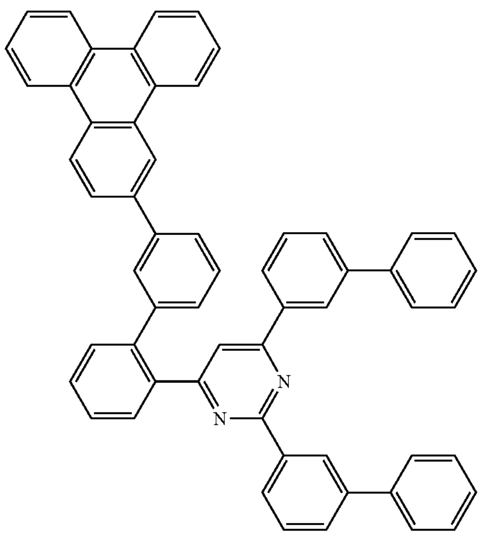
H-E52
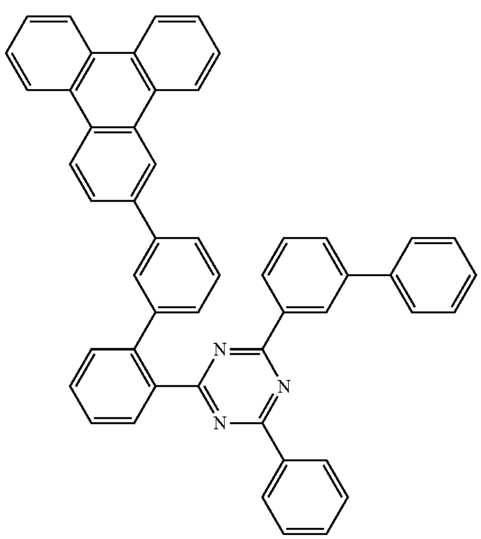
-continued
H-E53
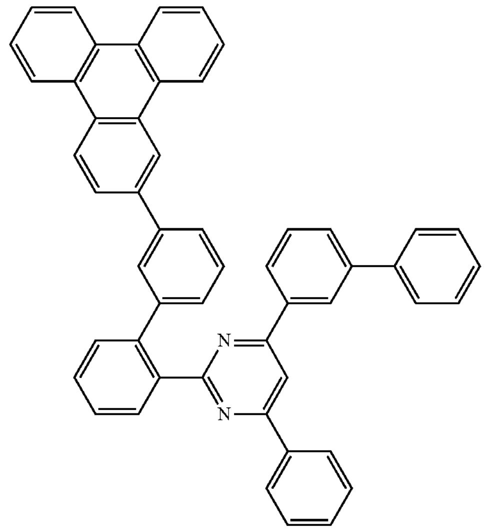
H-E54
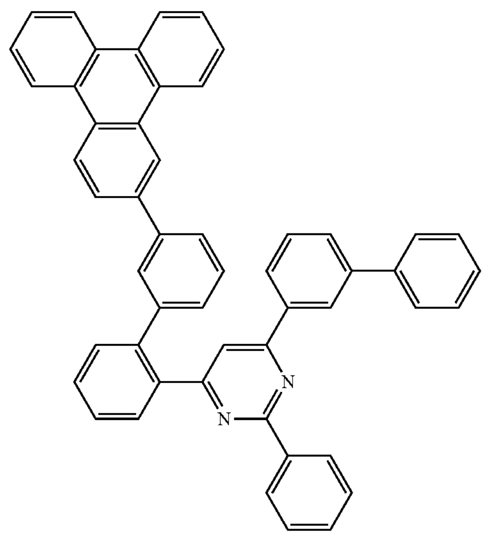
H-E55
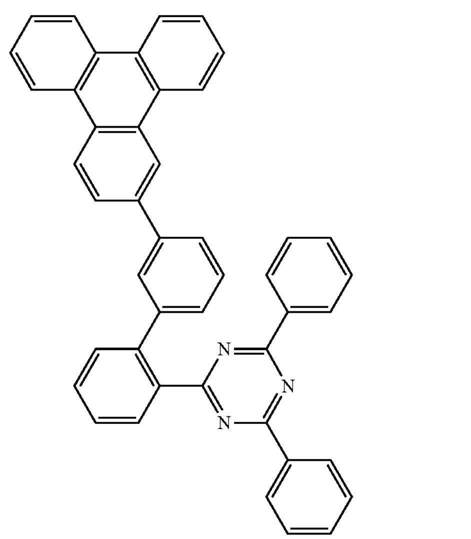

-continued
H-E56
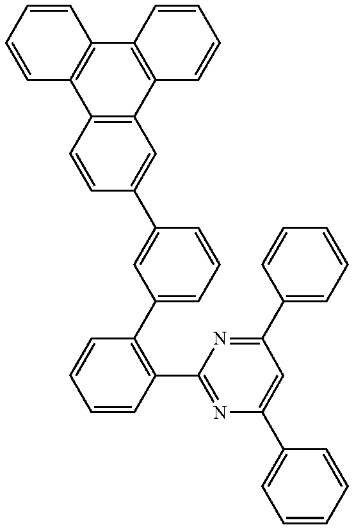
H-E57
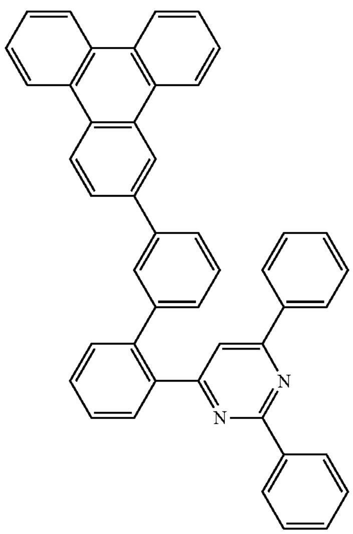
H-E58
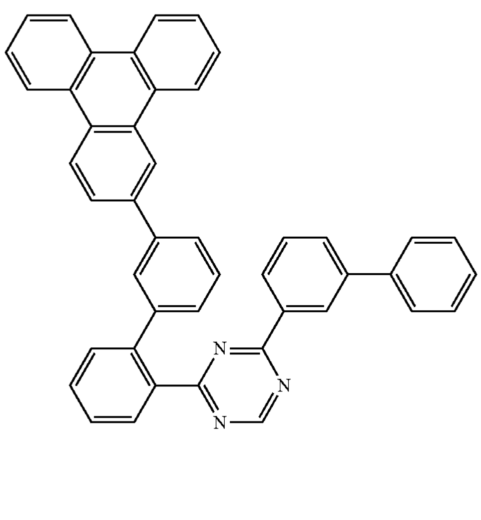
-continued
H-E59
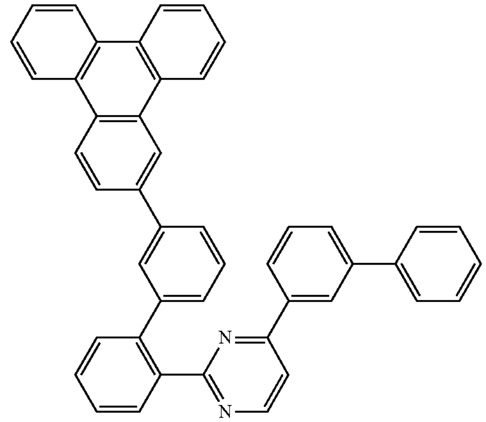
H-E60
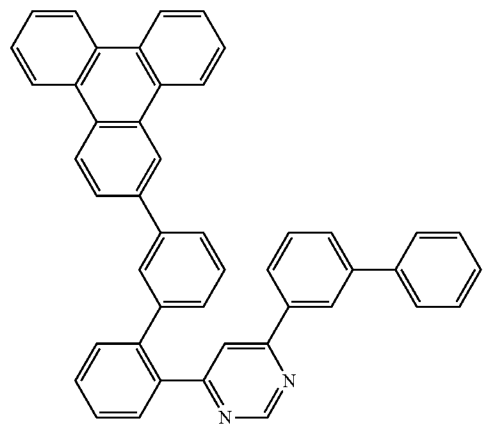
H-E61
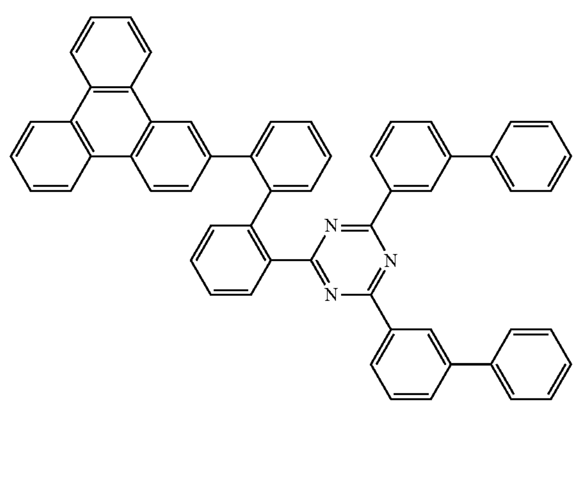

H-E62
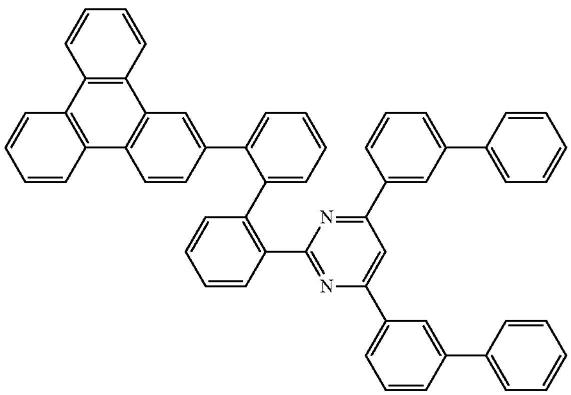
H-E63
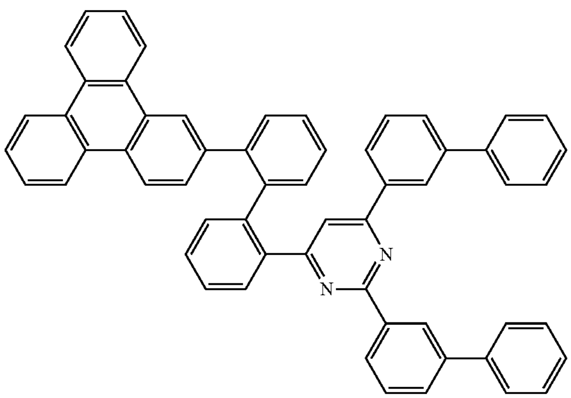
H-E64
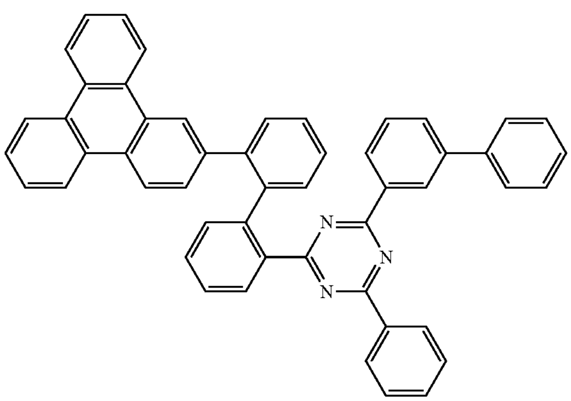
H-E65
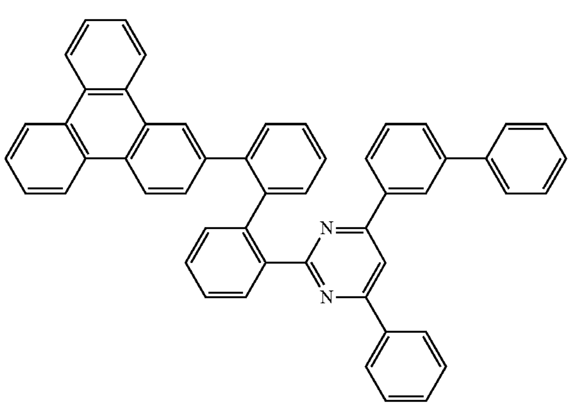
H-E66
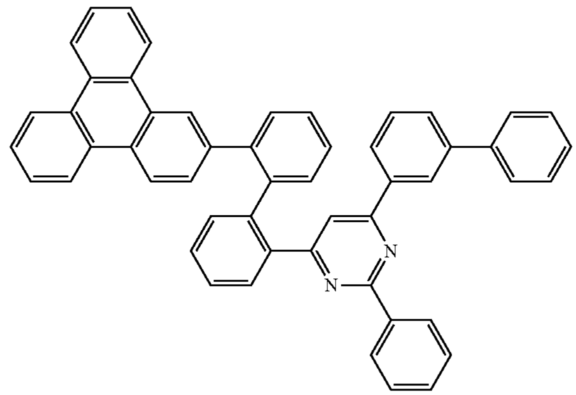
H-E67
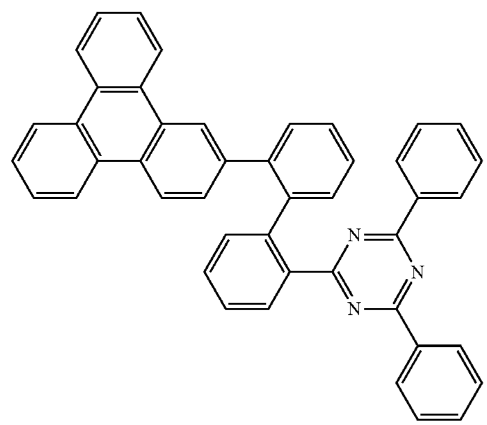
H-E68
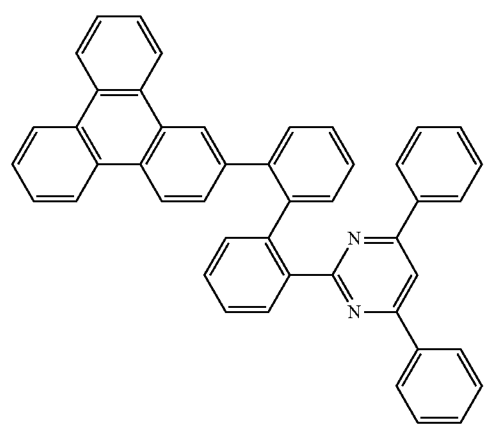

H-E69
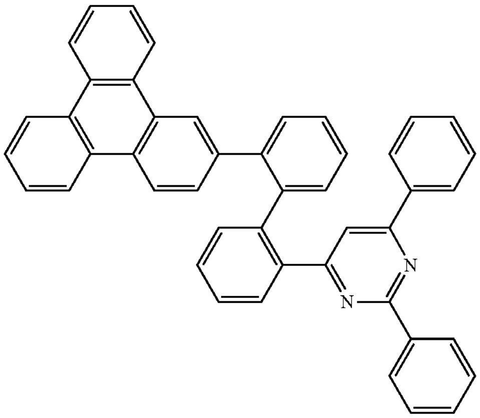
H-E70
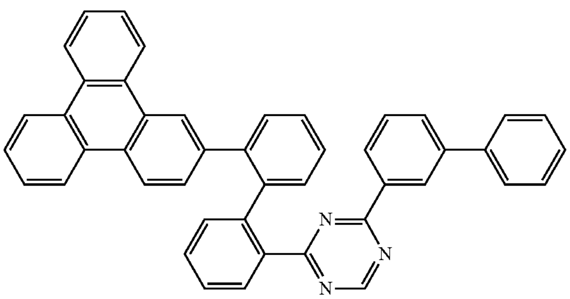
H-E71
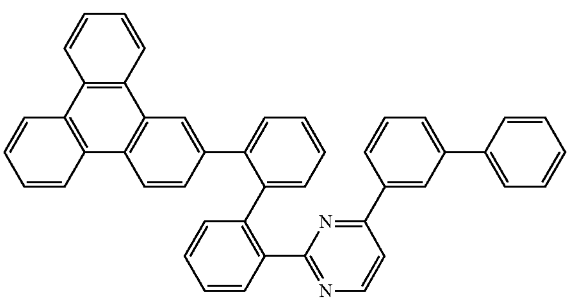
H-E72
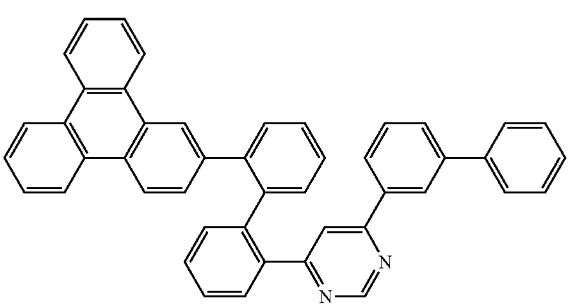
H-E73
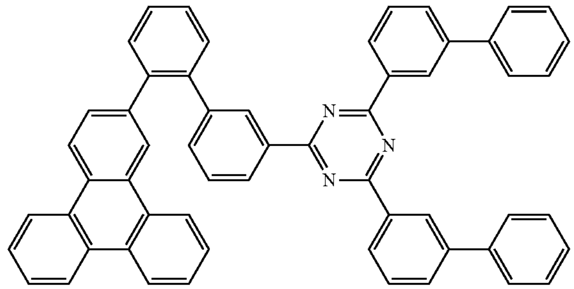
H-E74
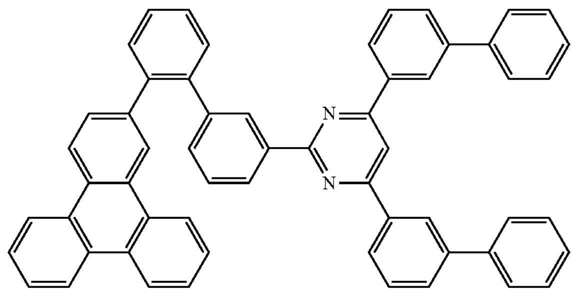
H-E75
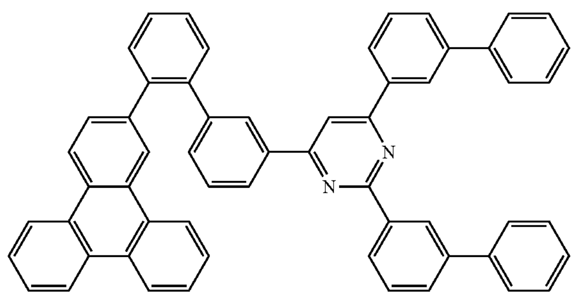
H-E76
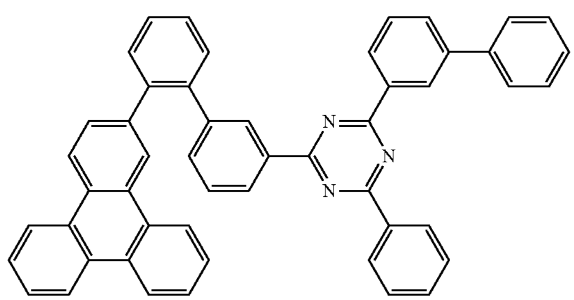
H-E77
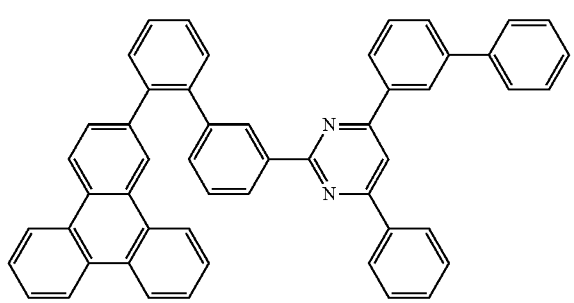

-continued
H-E78
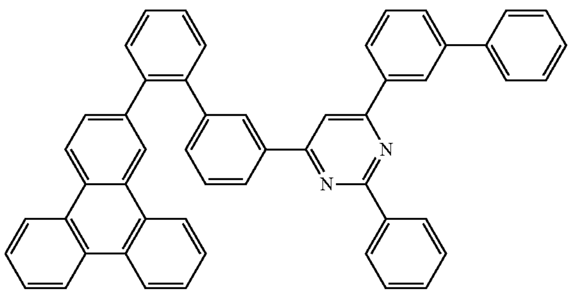
H-E79
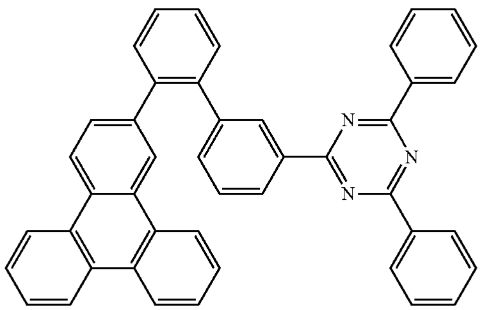
H-E80
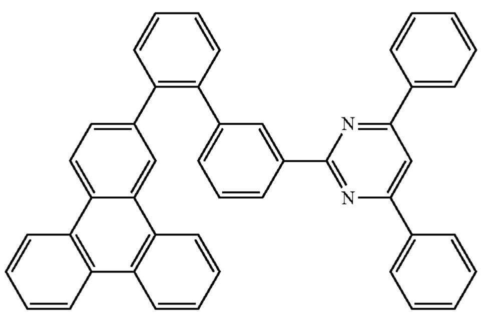
H-E81
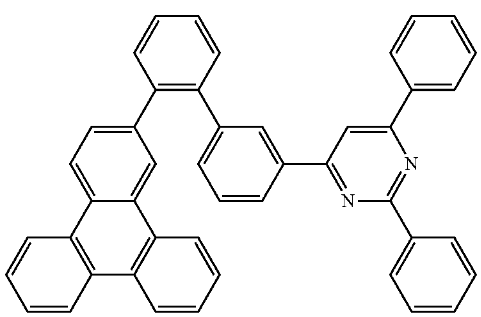
H-E82
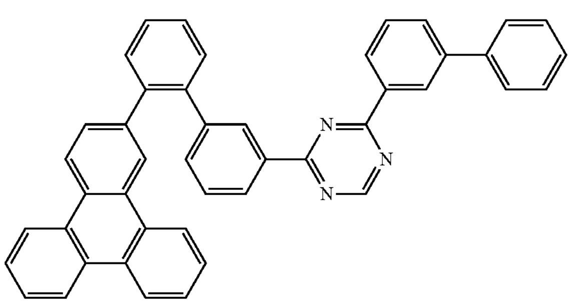
-continued
H-E83
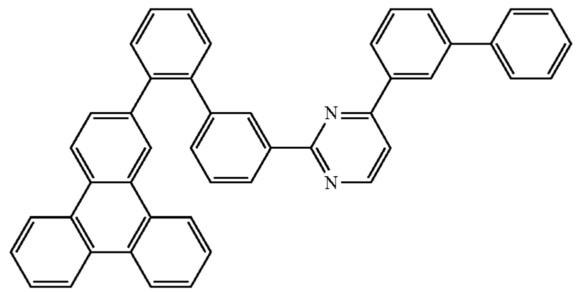
H-E84
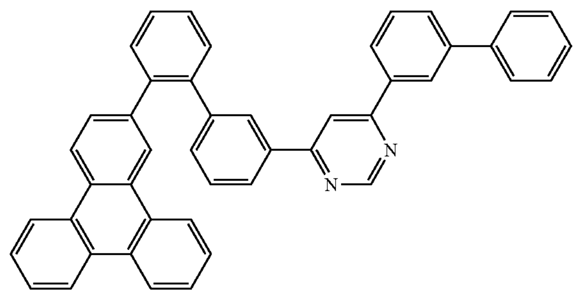
H-E(1)
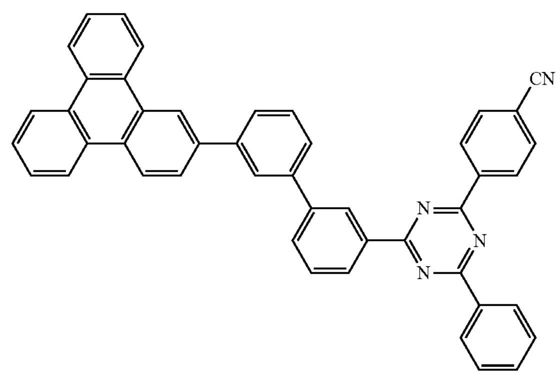
H-E(2)
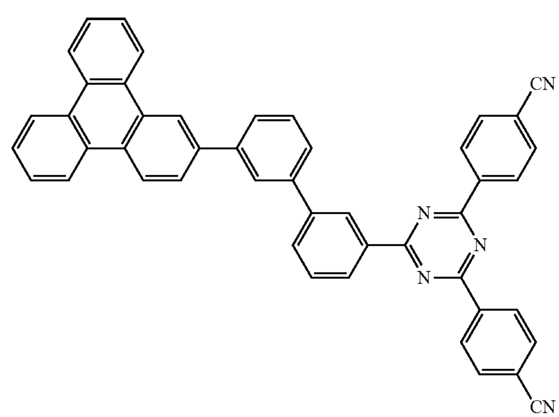

-continued
H-E(3)
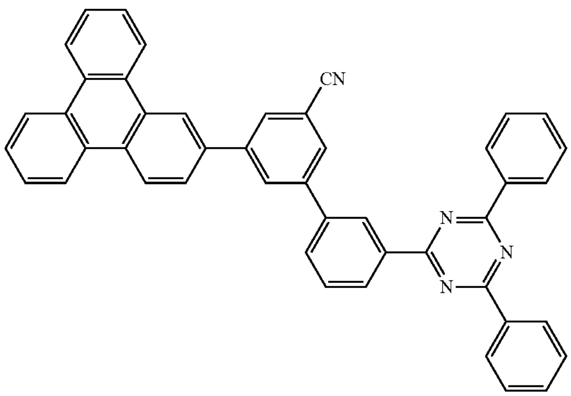
H-E(4)
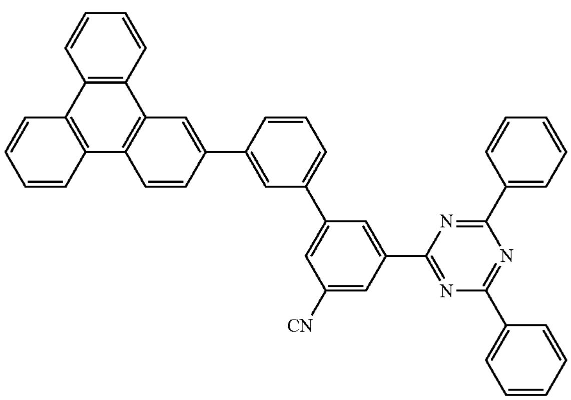
A-1
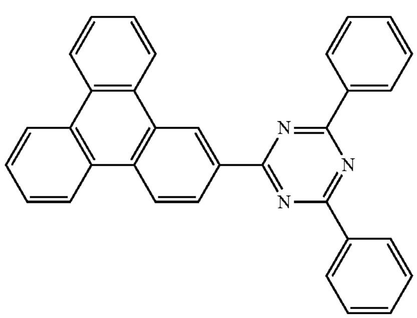
A-2
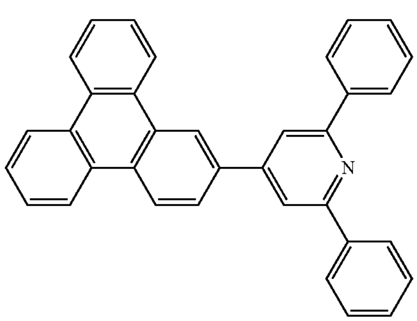
-continued
A3
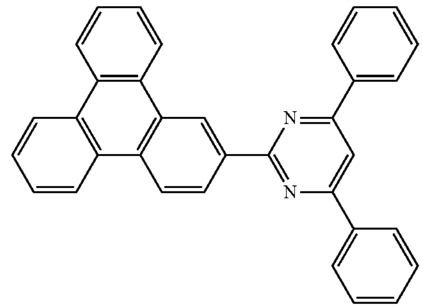
A4
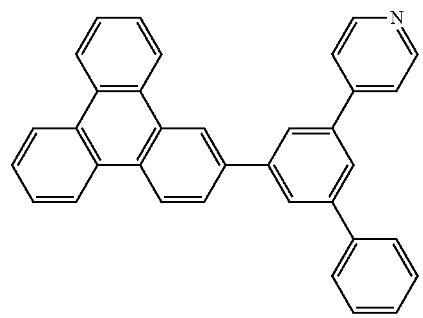
A5
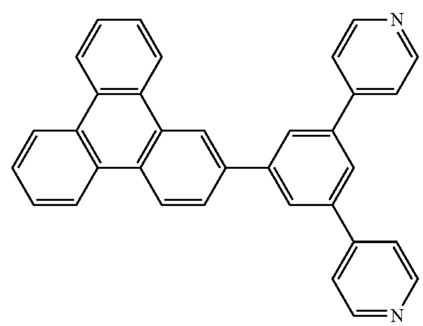
A6
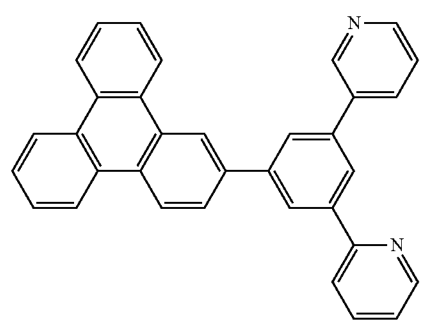
A7
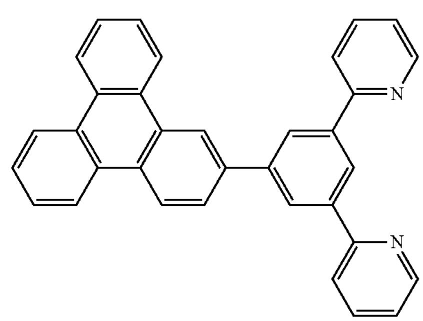

-continued
A8
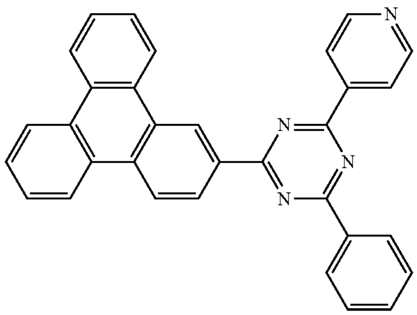
A9
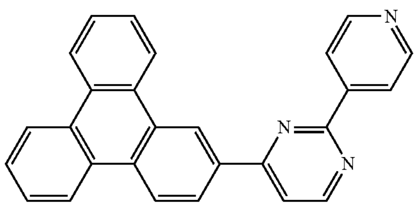
A10
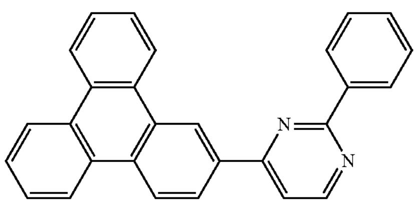
A11
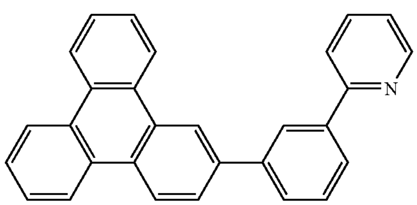
A12
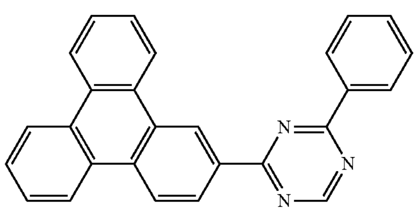
A13
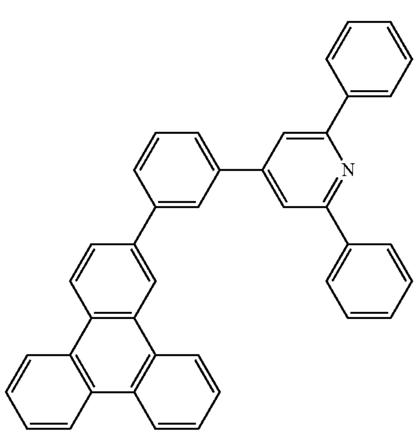
-continued
A14
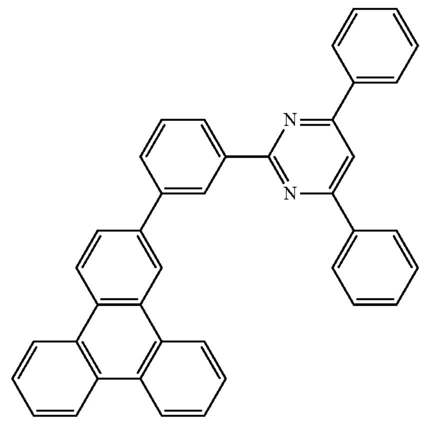
A15
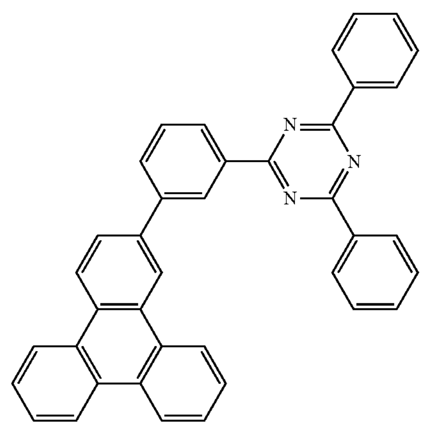
A16
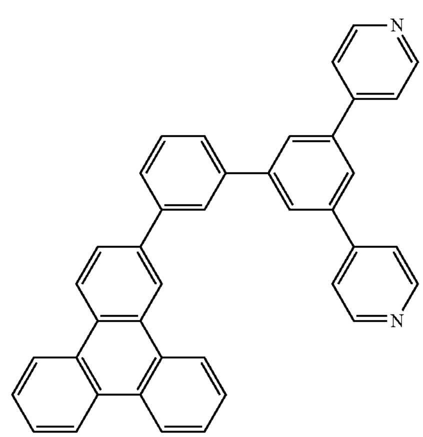

-continued
A17
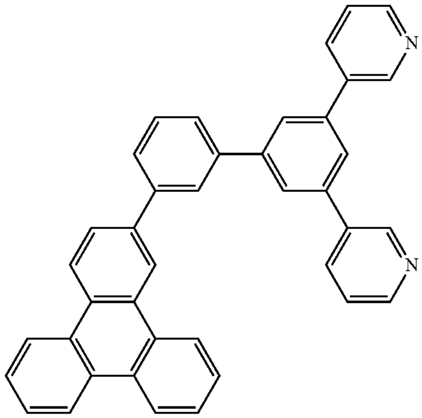
A18
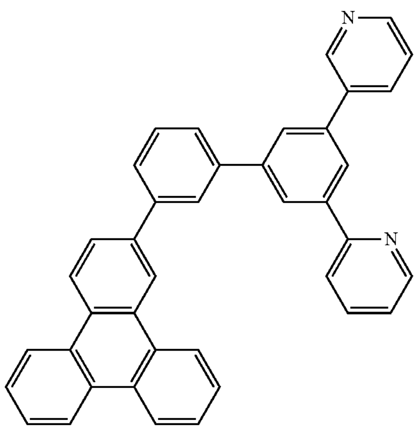
A19
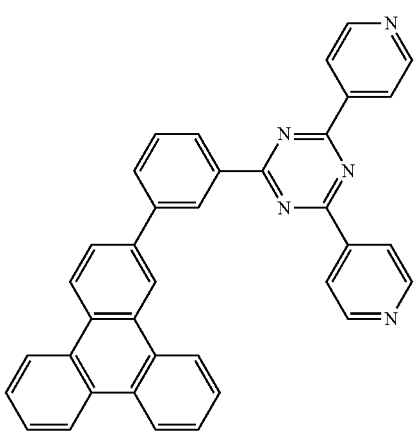
-continued
A20
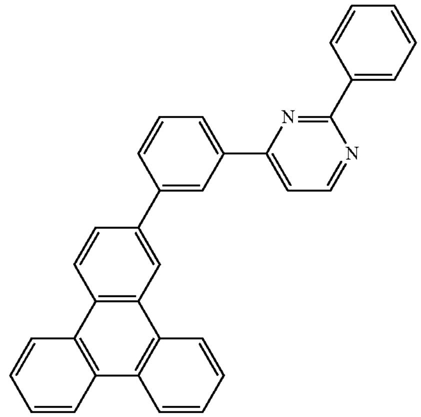
A21
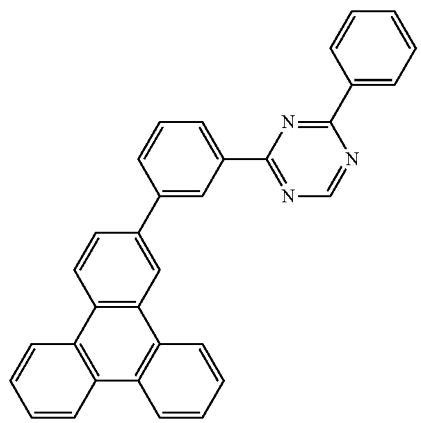
A-22
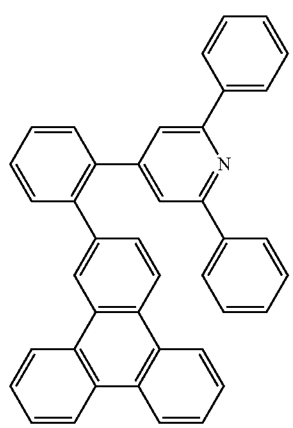

-continued
A-23
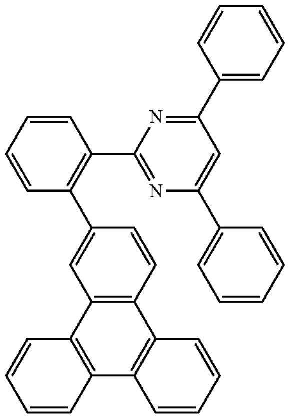
A-24
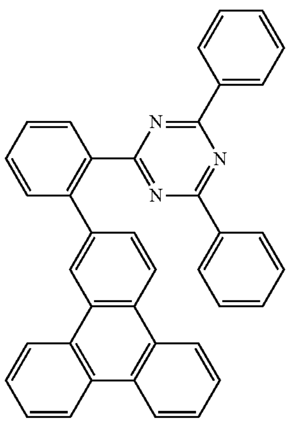
A-25
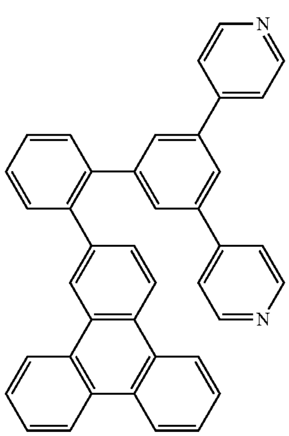
-continued
A-26
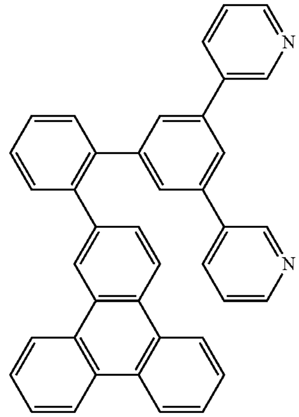
A-27
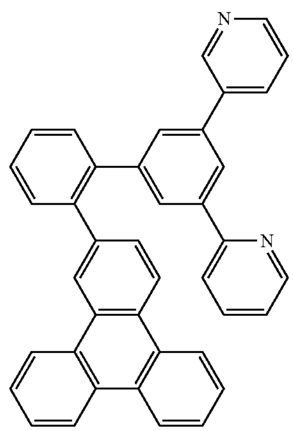
A-28
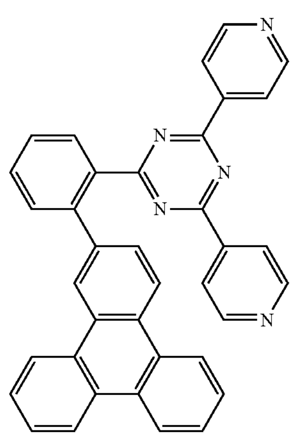

-continued
A-29
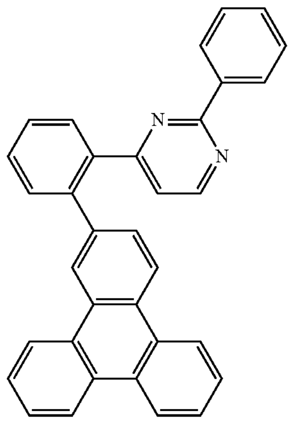
A-30
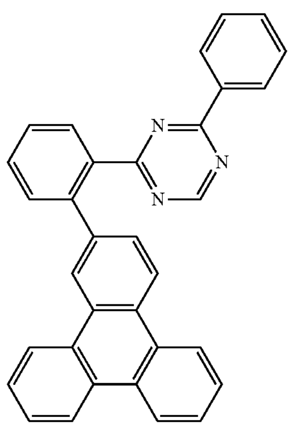
A-31
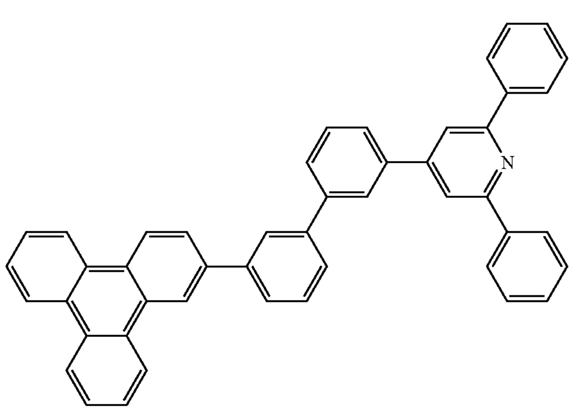
-continued
A-32
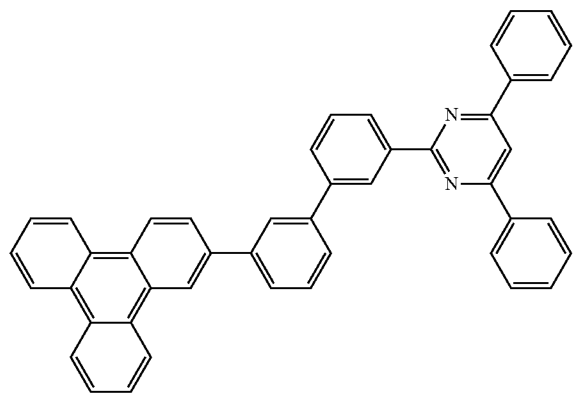
A-33
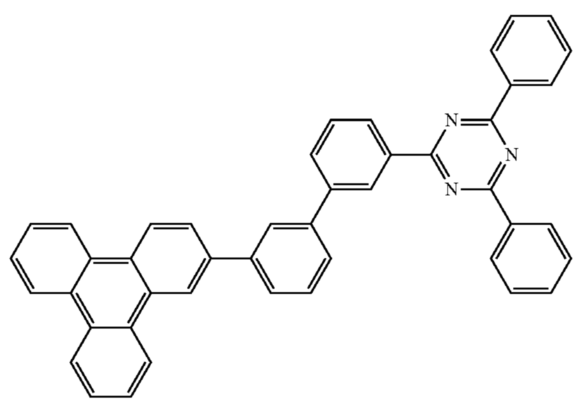
A-34
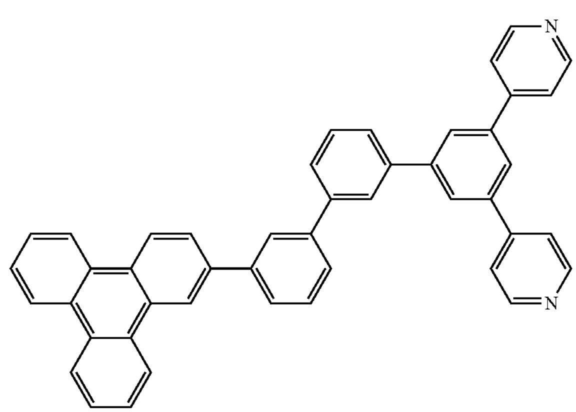

-continued
A-35
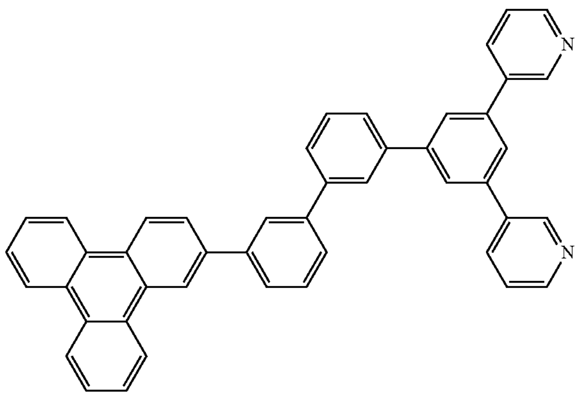
A-36
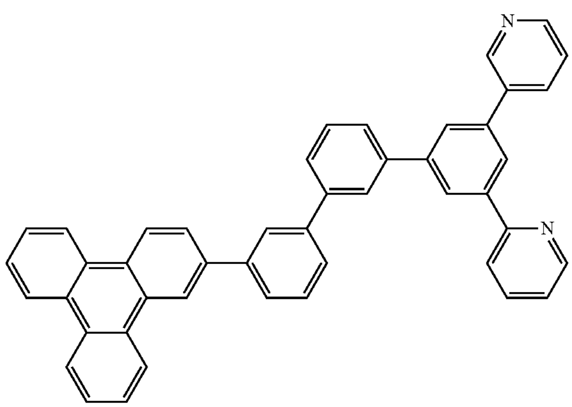
A-37
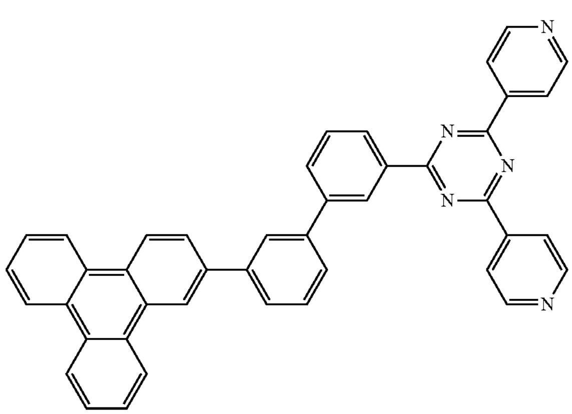
-continued
A-38
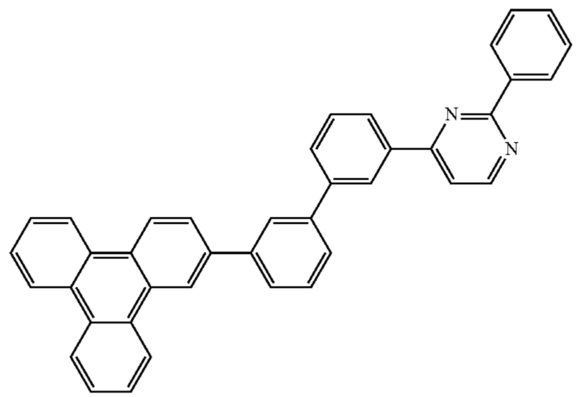
A-39
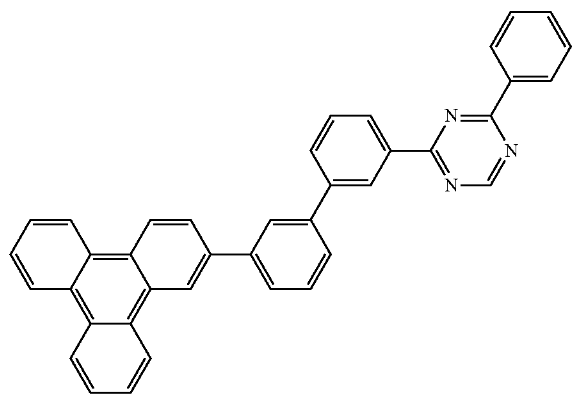
A-40
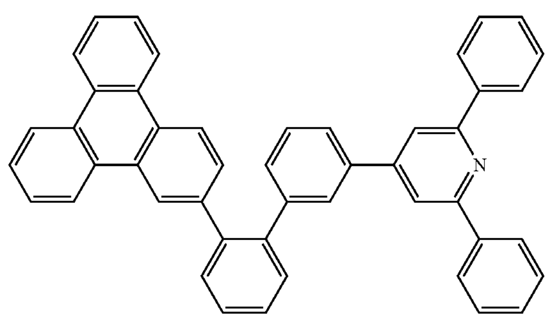
A-41
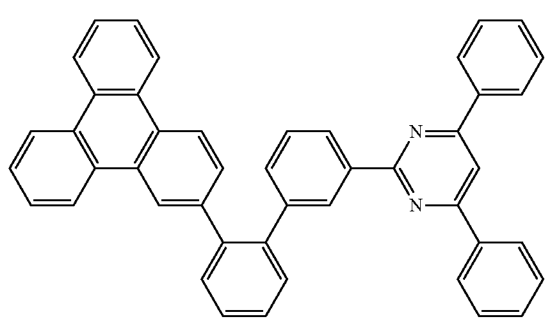

-continued
A-42
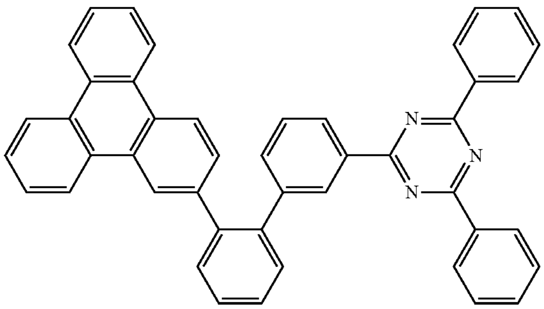
A-43
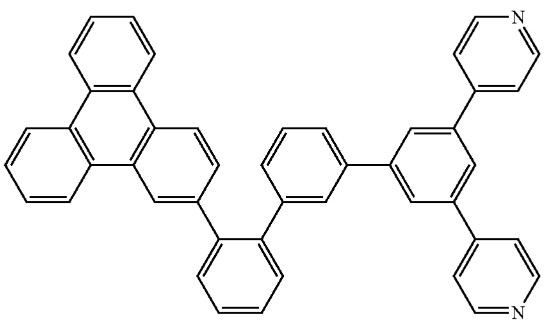
A-44
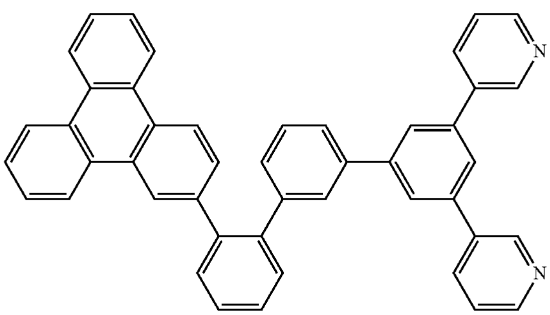
A-45
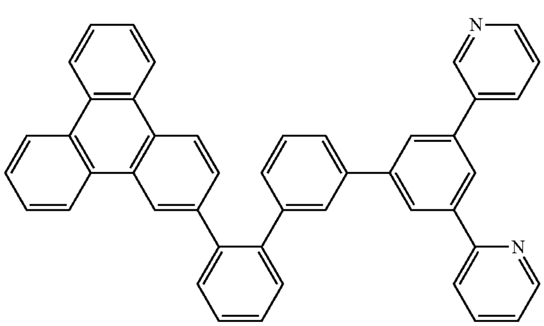
-continued
A-46
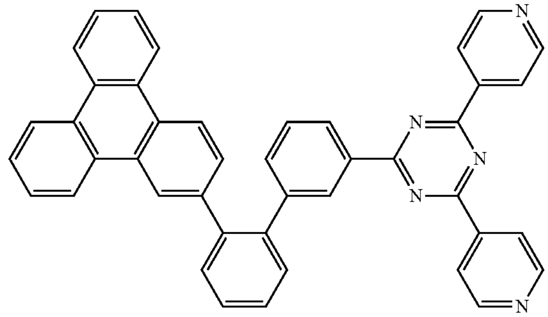
A-47
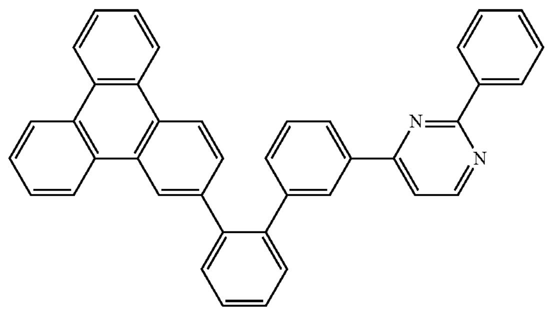
A-48
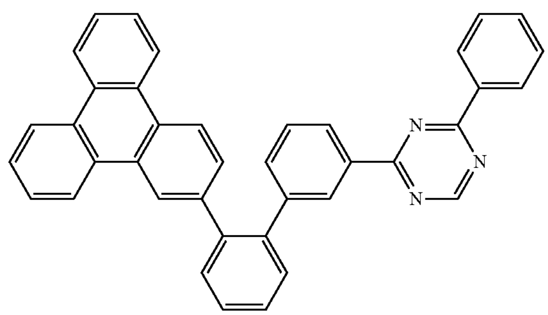
A-49
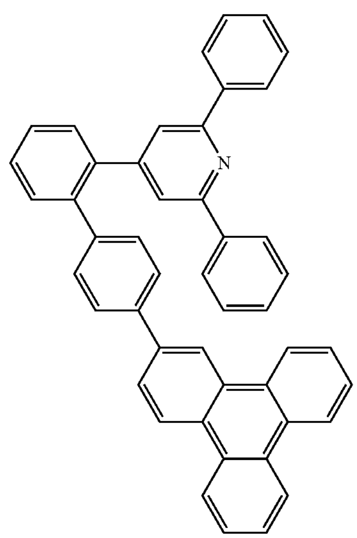

-continued
A-50
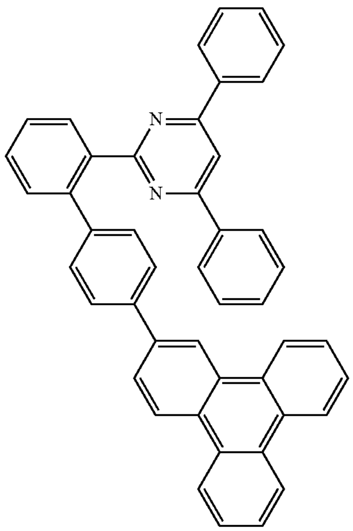
A-51
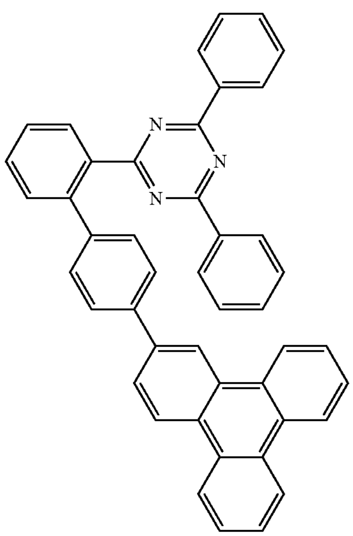
A-52
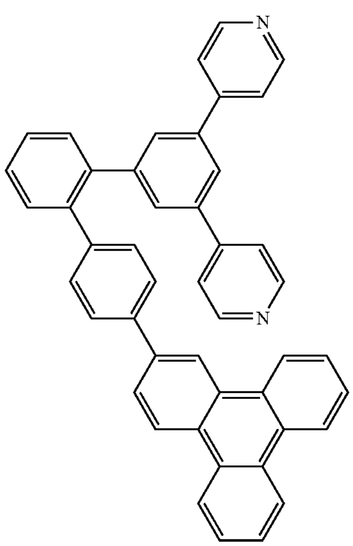
-continued
A-53
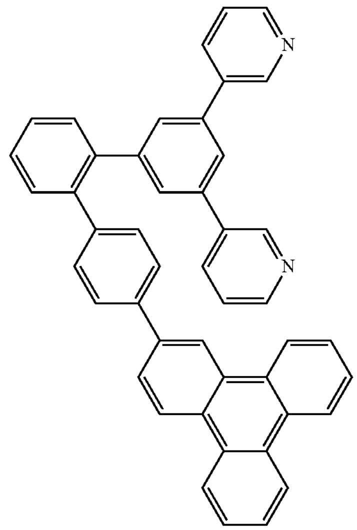
A-54
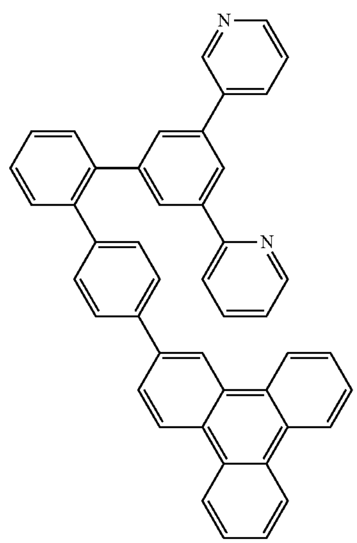
A-55
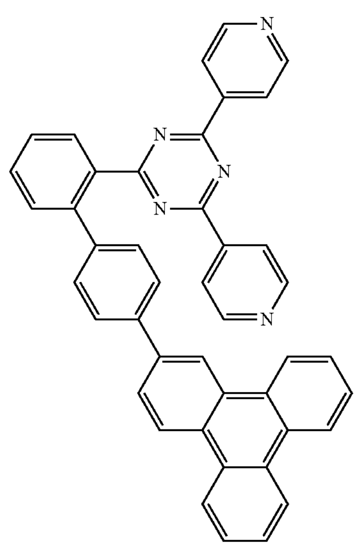

-continued
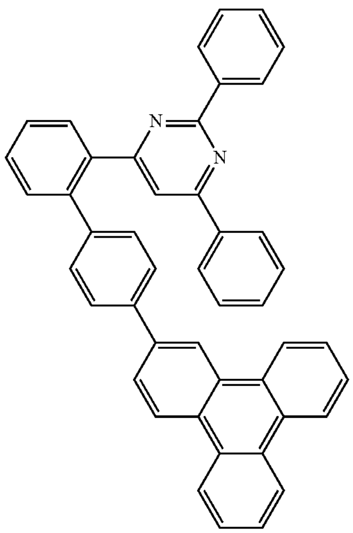
A-56
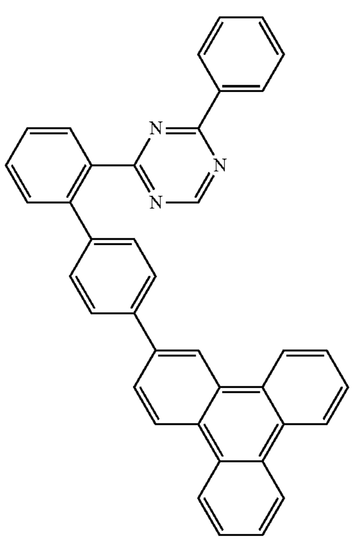
A-57
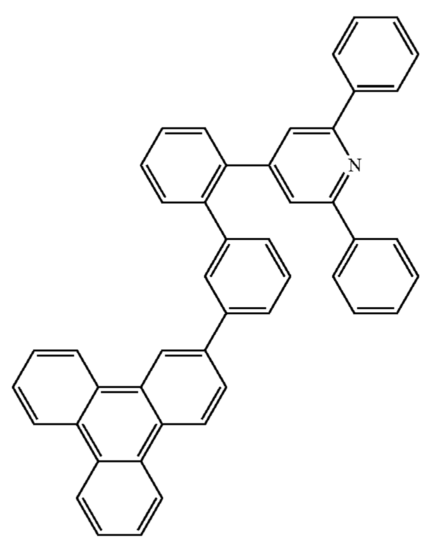
A-58

-continued
A-59
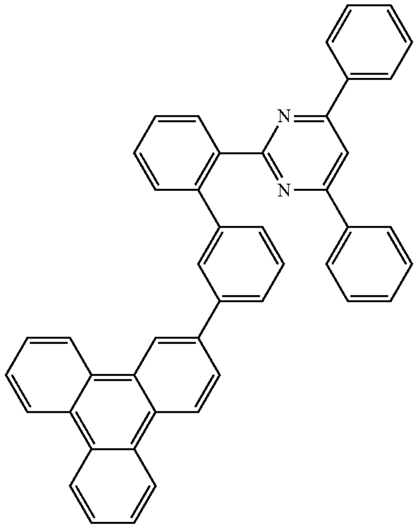
A-60
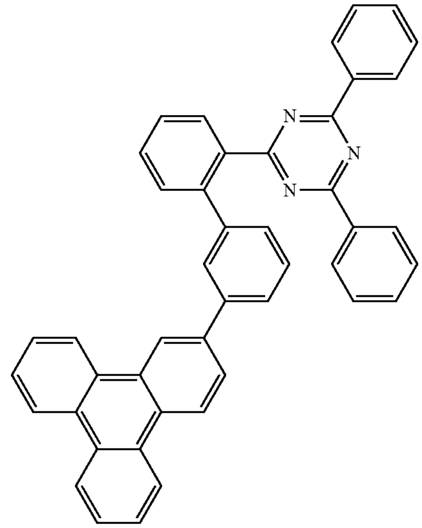
A-61
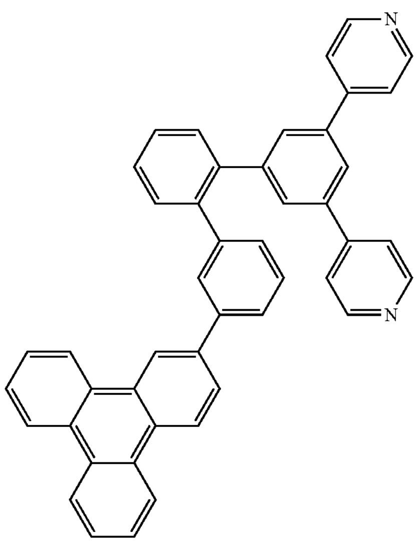
A-62
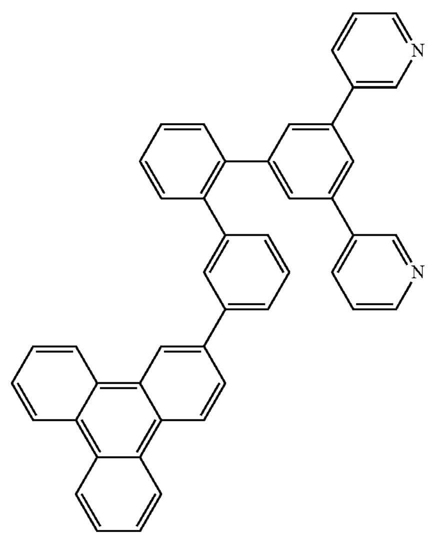
A-63
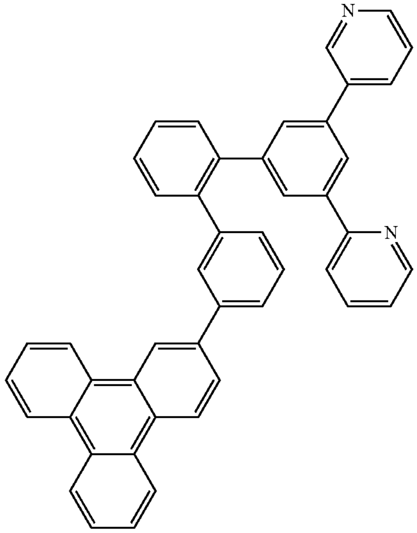
A-64
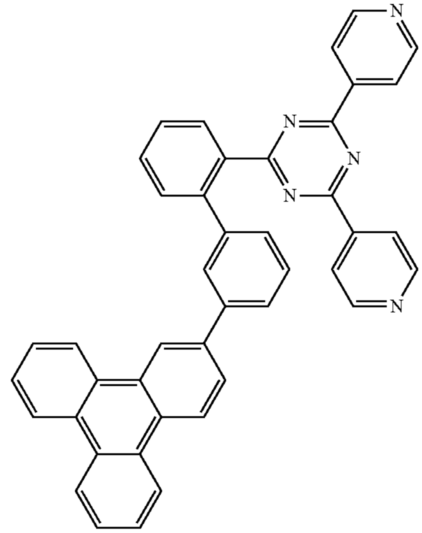

-continued
A-65
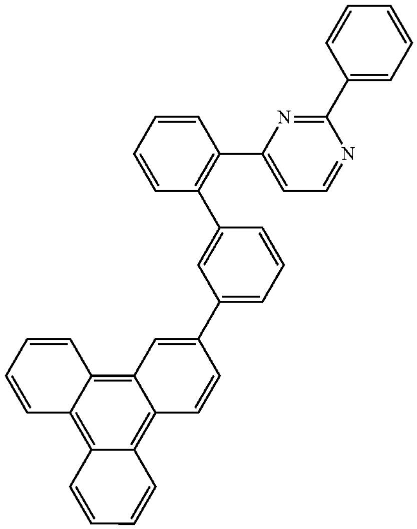
A-66
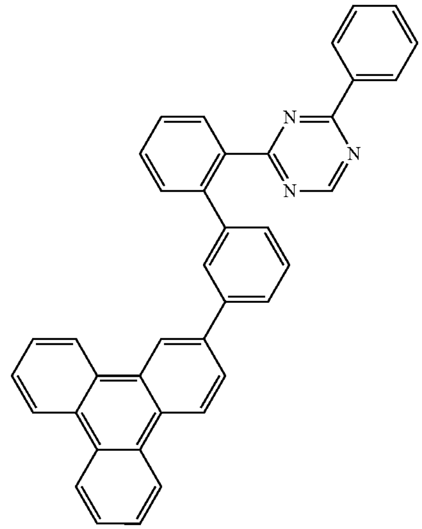
A-67
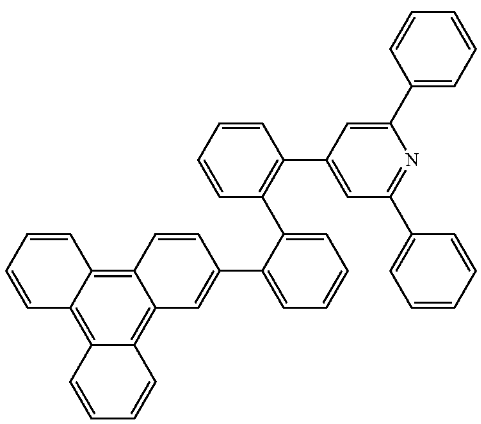
A-68
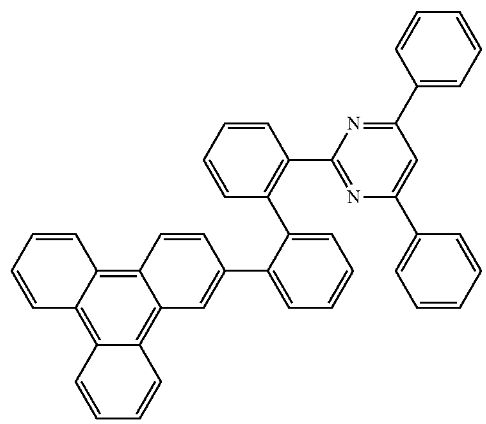
A-69
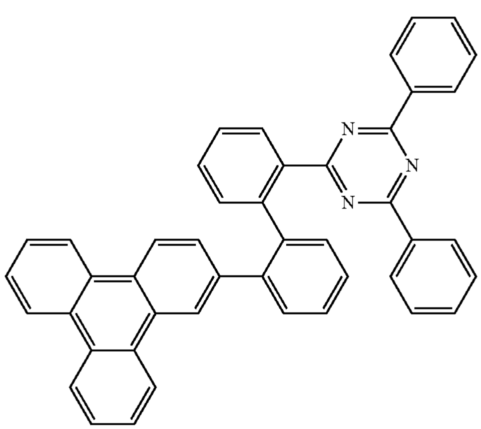
A-70
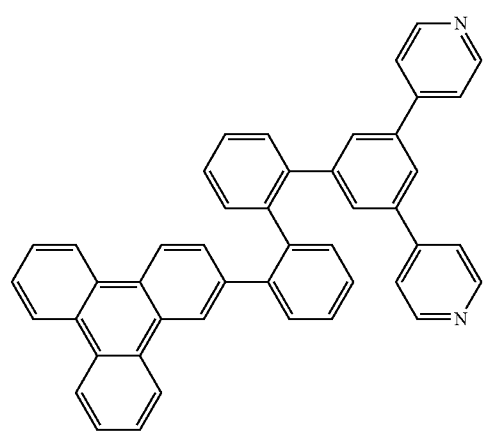

-continued
A-71
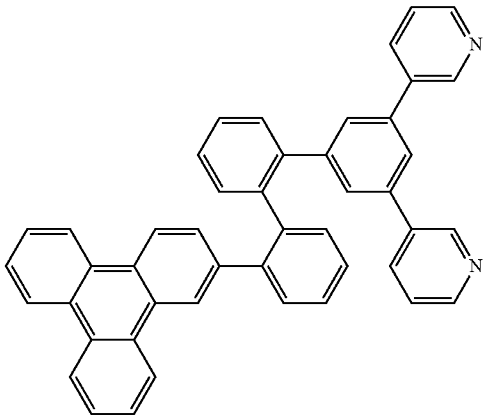
A-72
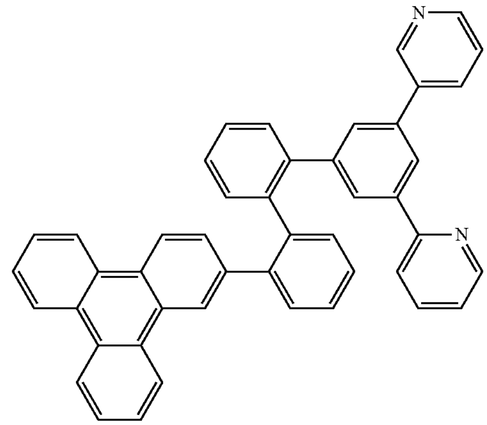
A-73
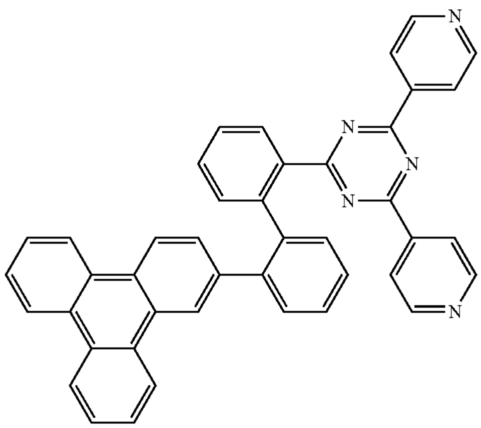
A-74
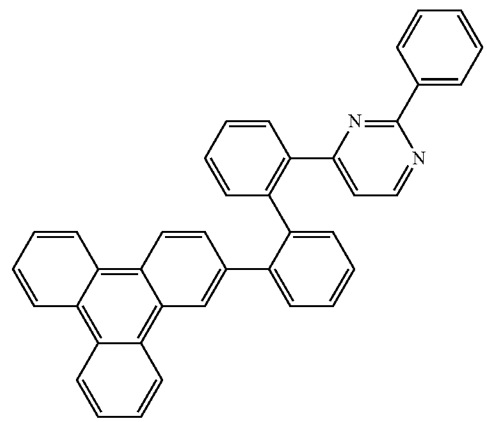
A-75
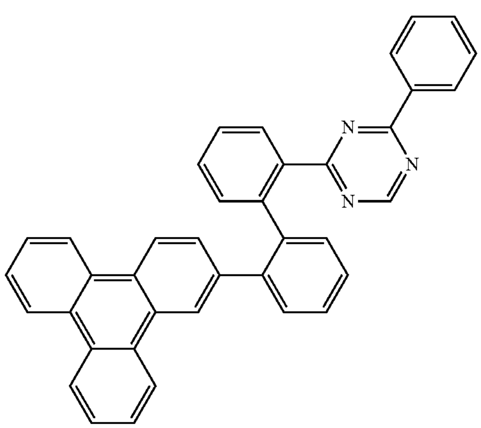
A-76
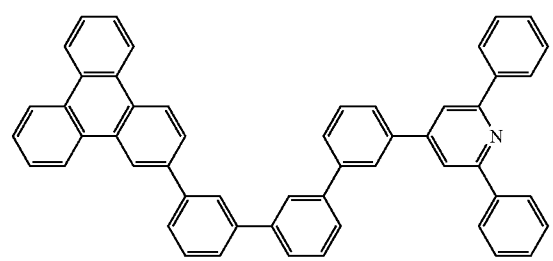
A-77
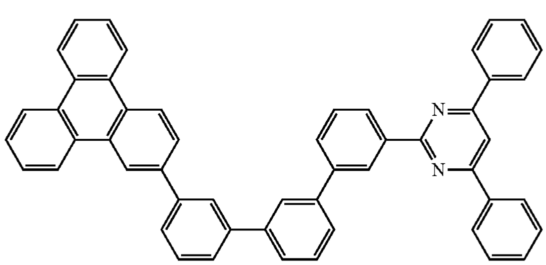
A-78
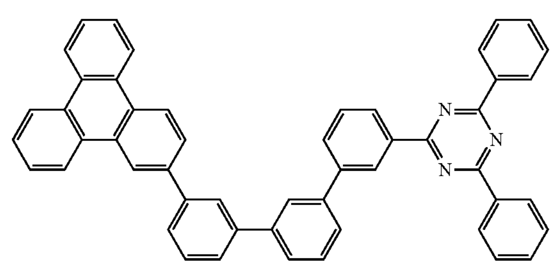

-continued
A-79
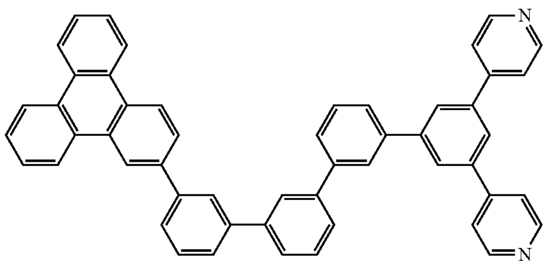
A-80
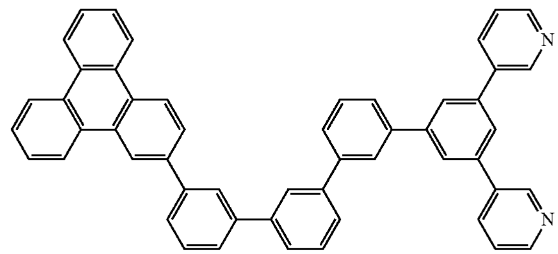
A-81
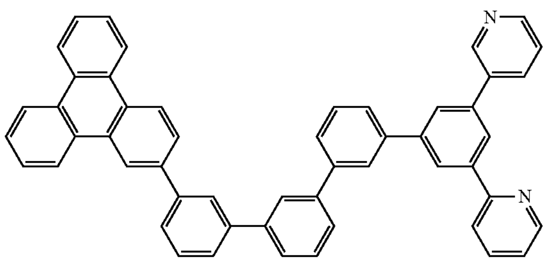
A-82
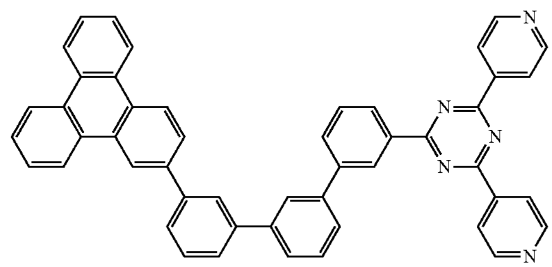
A-83
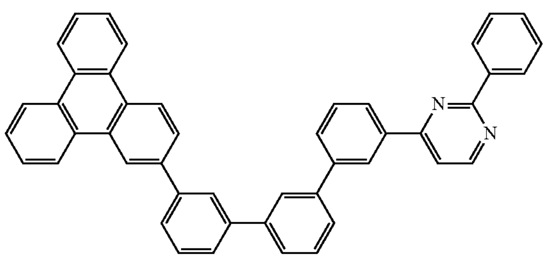
A-84
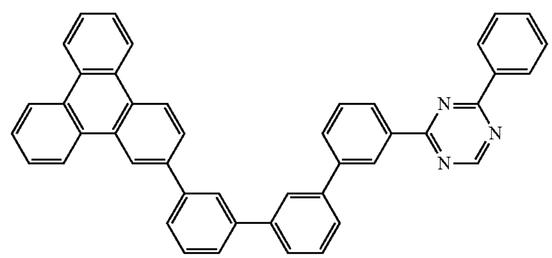
A-85
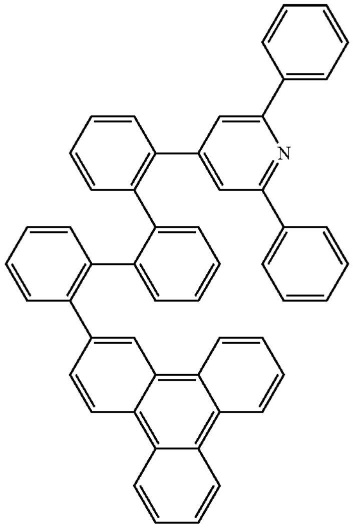
A-86
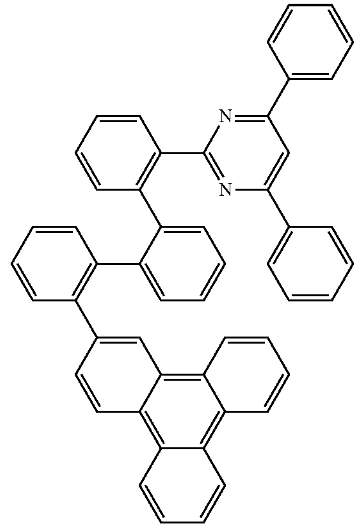

-continued
A-87
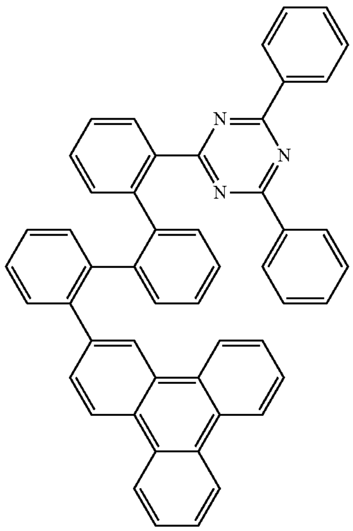
A-88
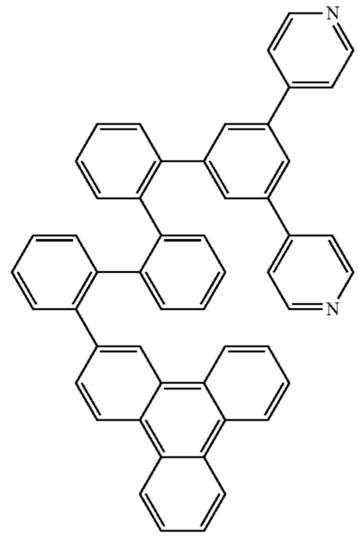
A-89
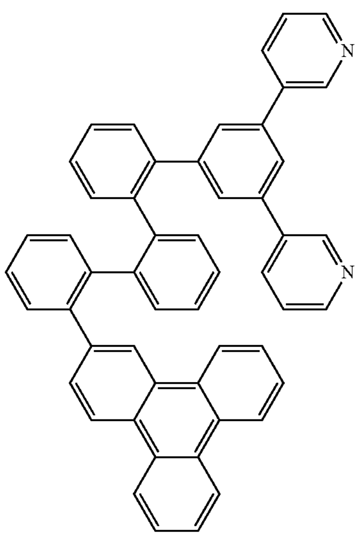
A-90
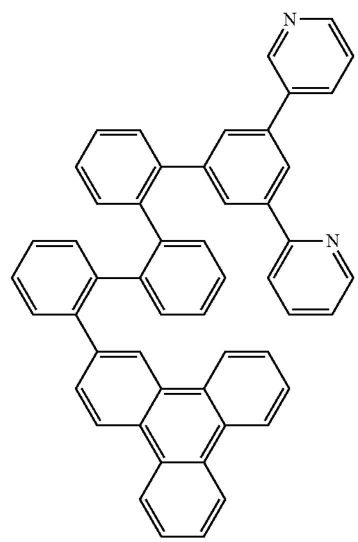
A-91
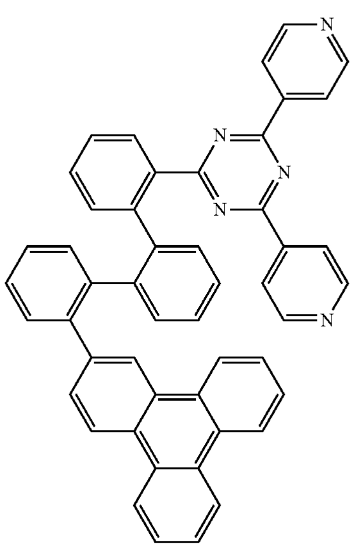
A-92
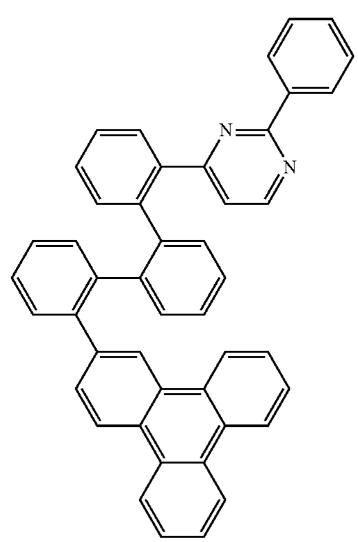

-continued
A-93
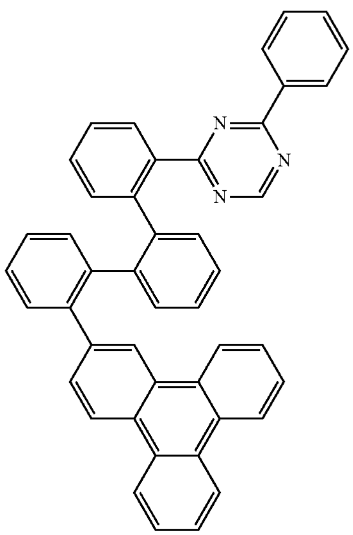
A-94
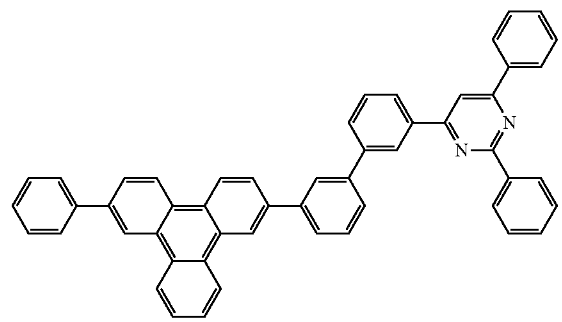
A-95
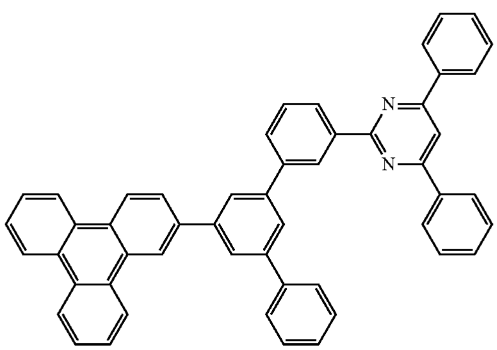
A-96
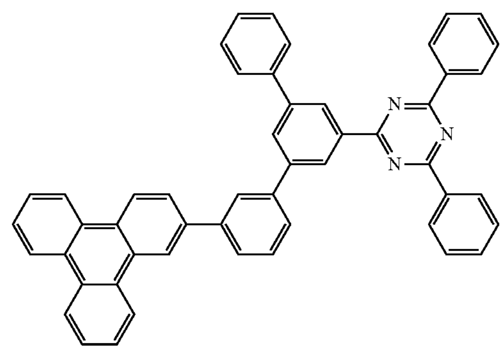
A-97
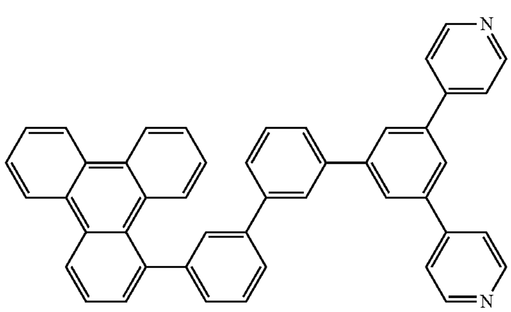
A-98
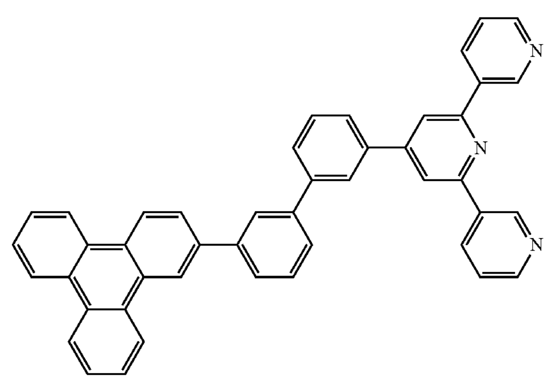
A-99
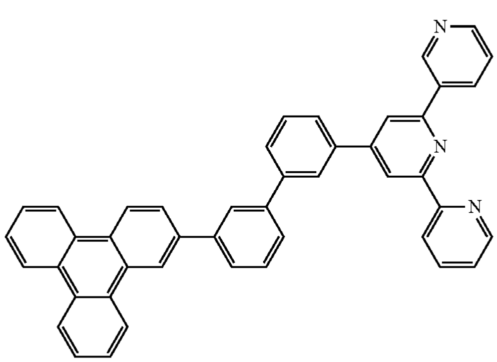
A-100
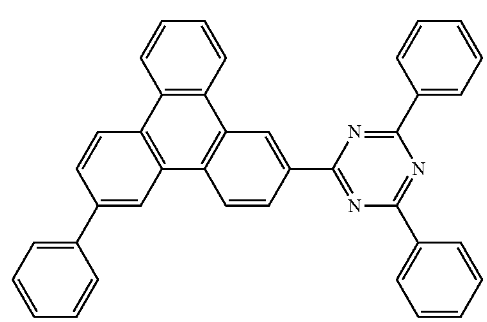

-continued
A-101
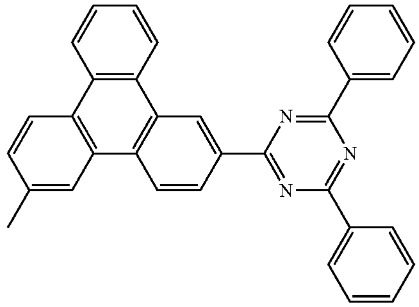
A-102
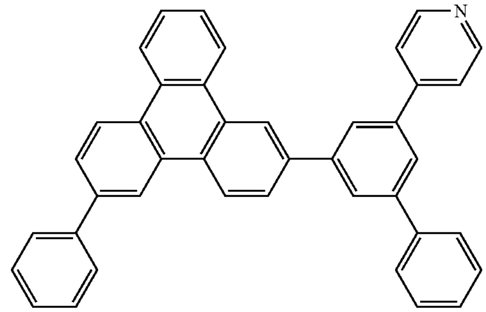
A-103
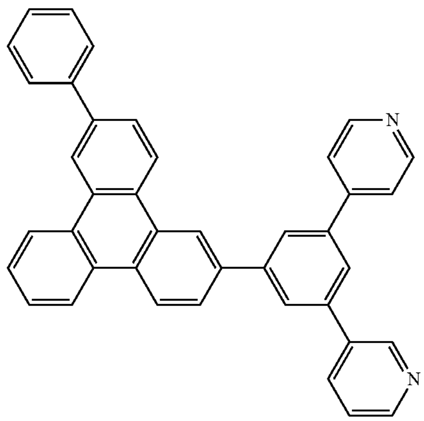
A-104
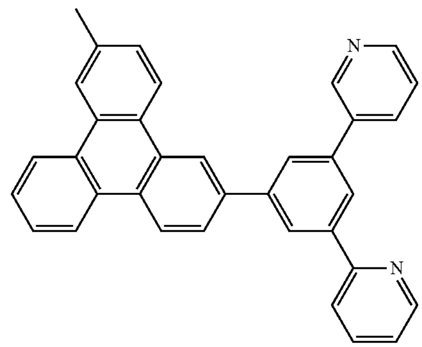
A-105
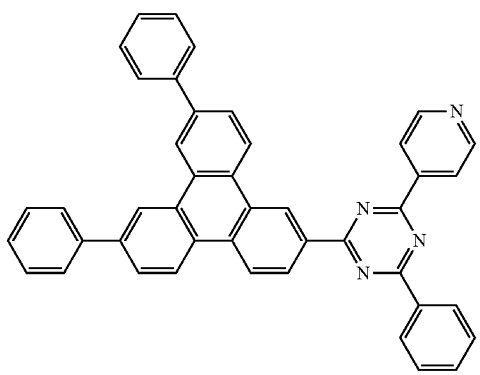
A-106
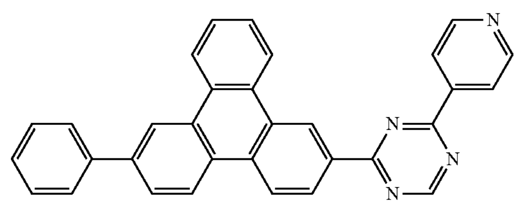
A-107
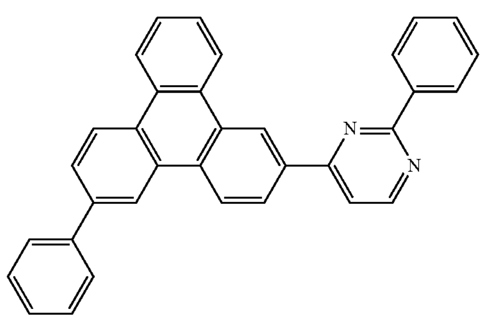
A-108
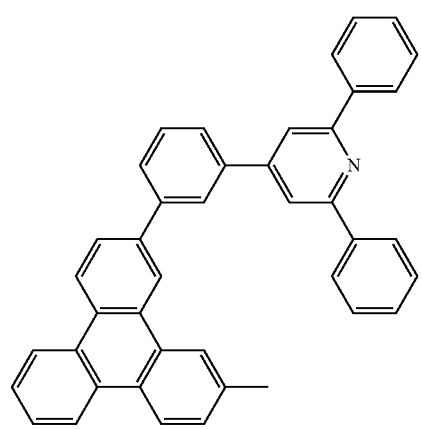

-continued
A-109
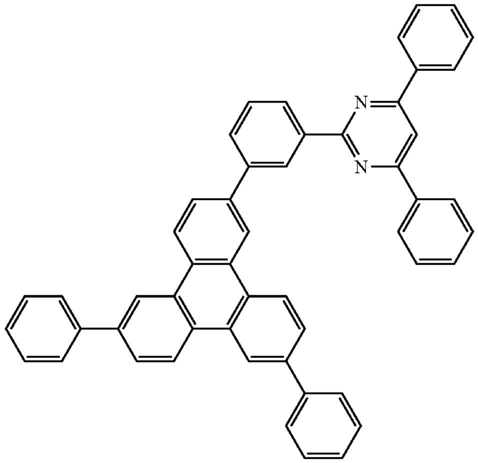
A-110
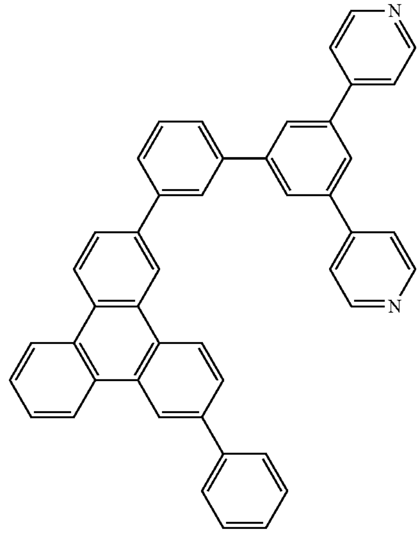
A-111
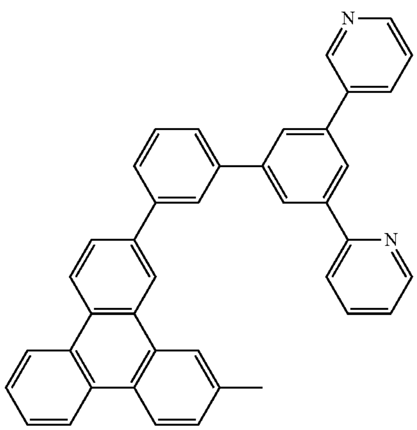
A-112
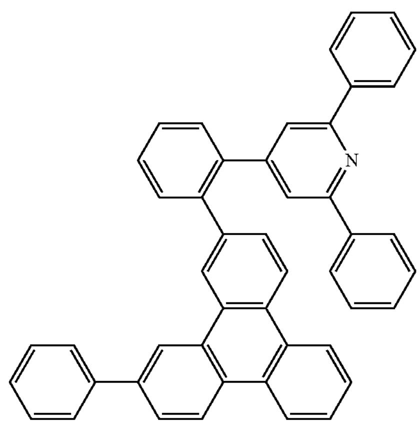
A-113
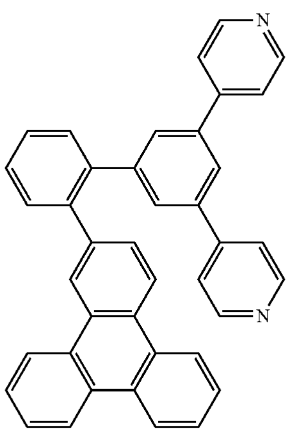
A-114
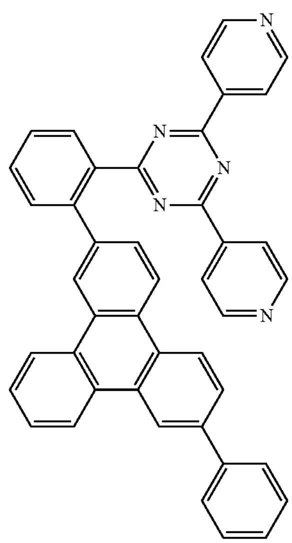

-continued
A-115
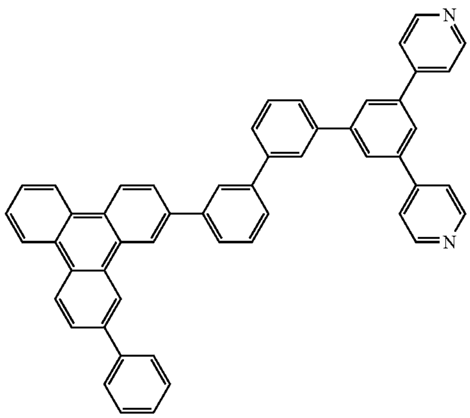
A-116
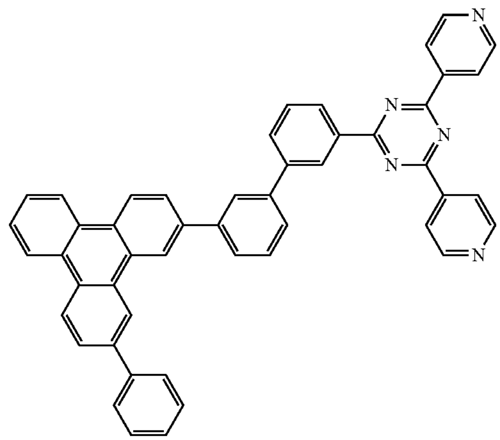
A-117
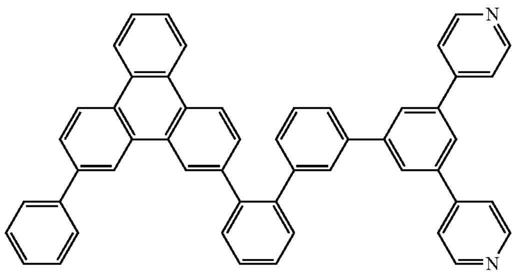
A-118
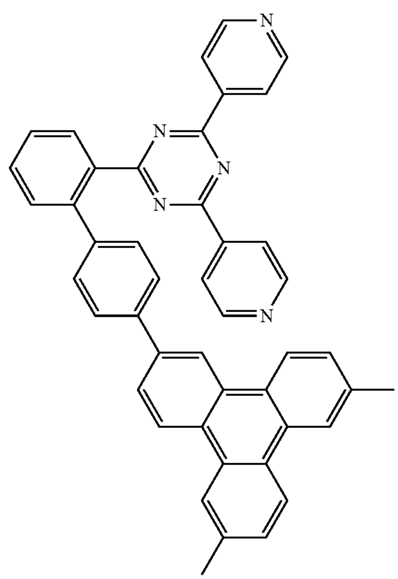
A-119
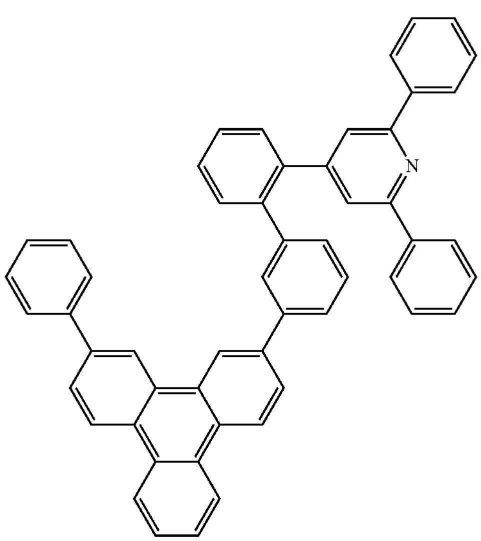
A-120
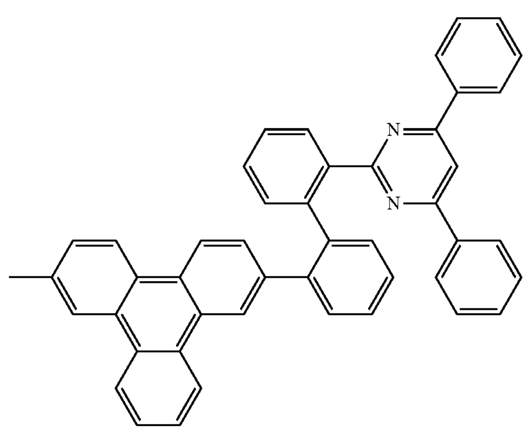

-continued
A-121
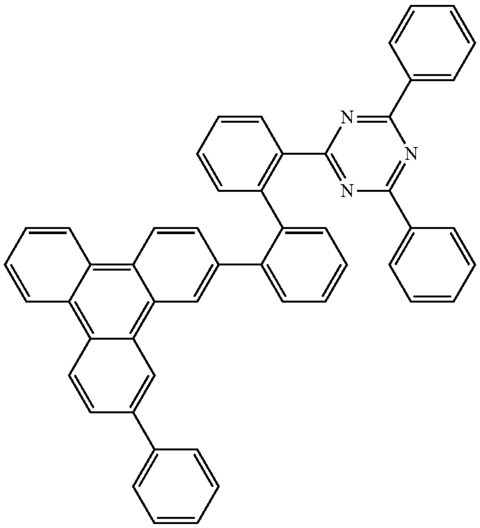
A-122
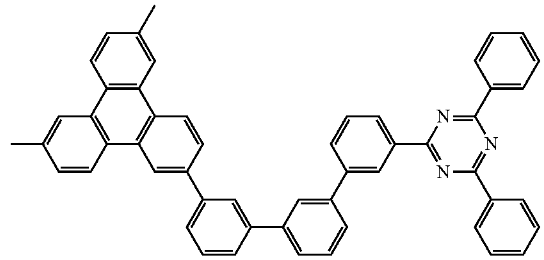
A-123
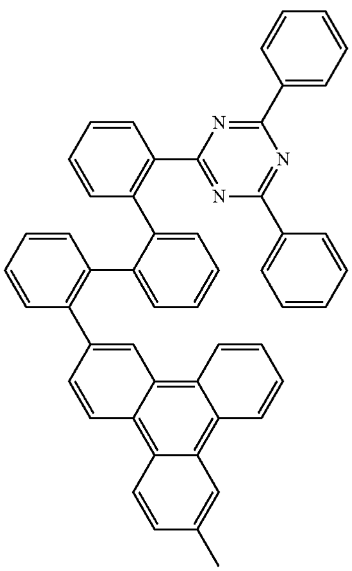
A-124
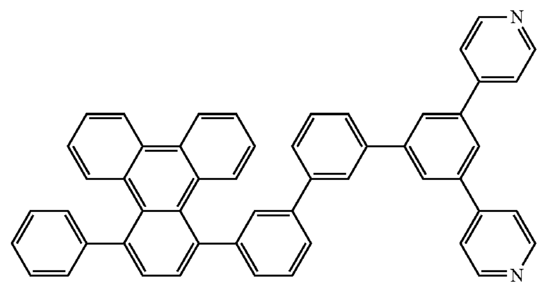
A-125
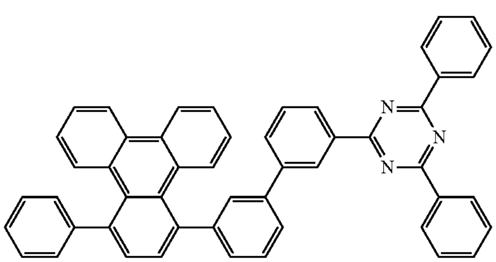
A(1)
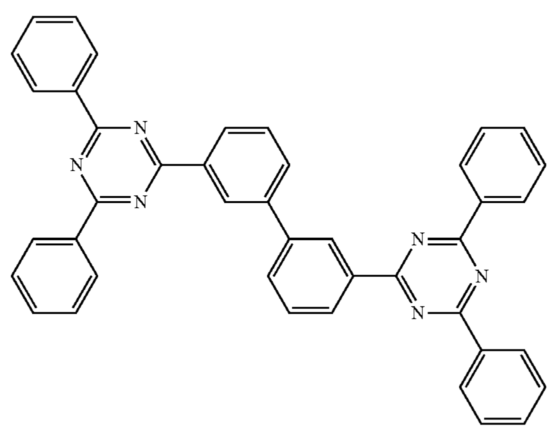

-continued
A(2)
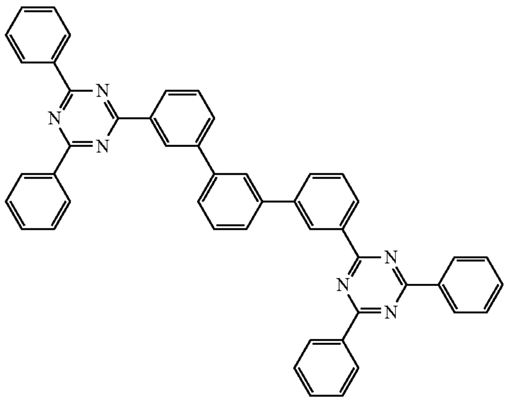
A(3)
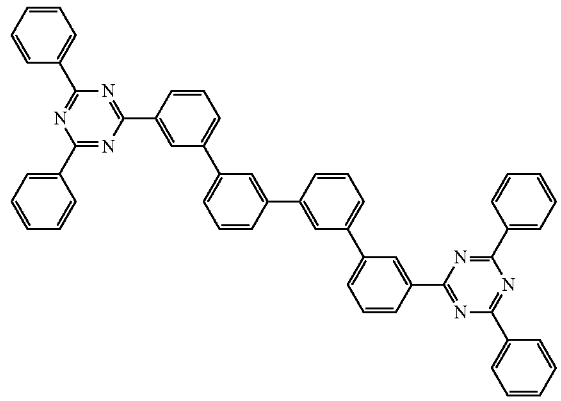
A(4)
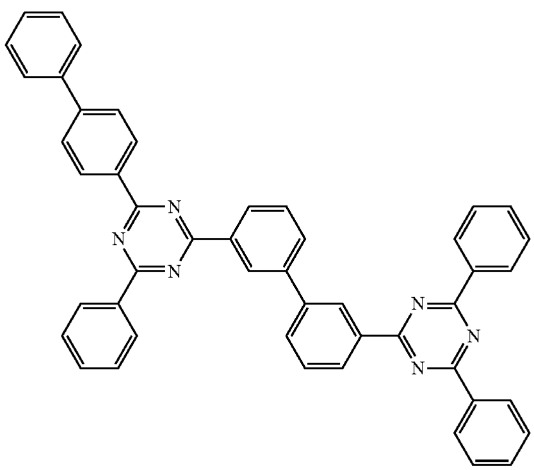
A(5)
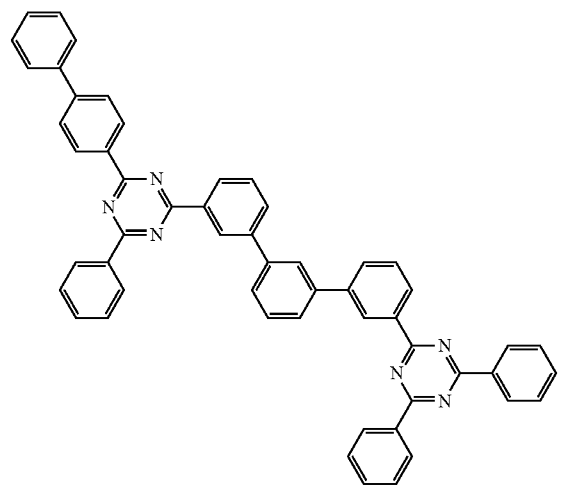
A(6)
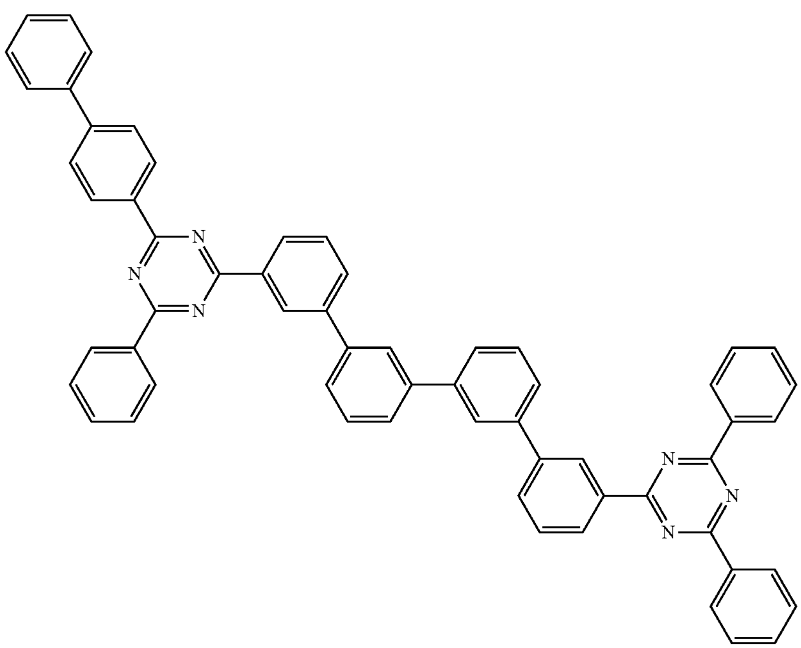

-continued
A(7)
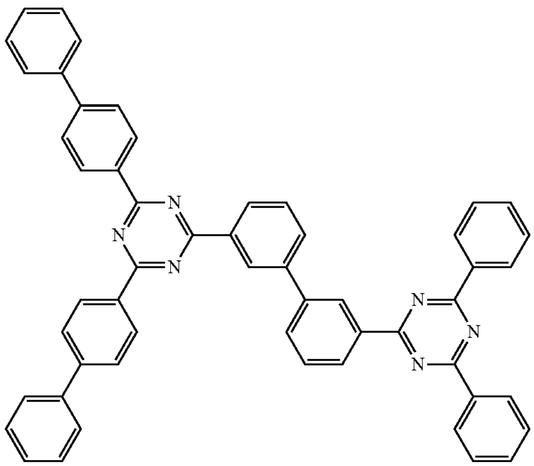
A(8)
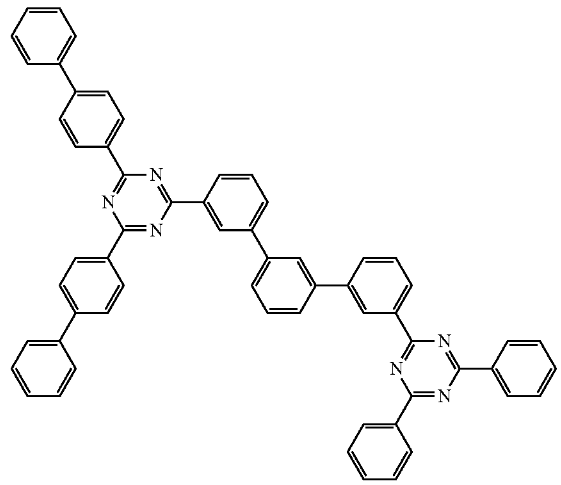
A(9)
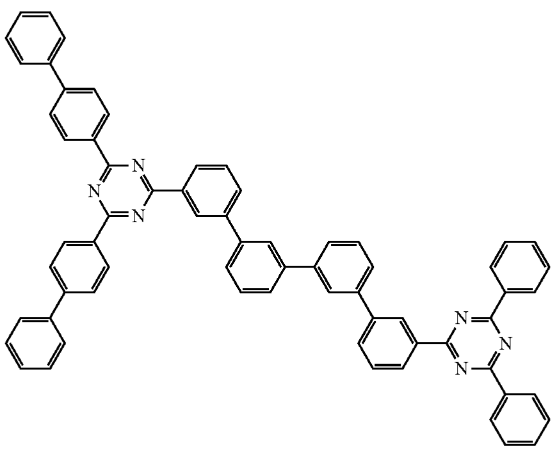
A(10)
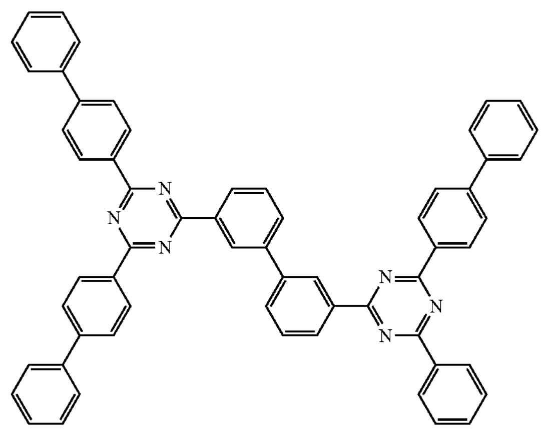
A(11)
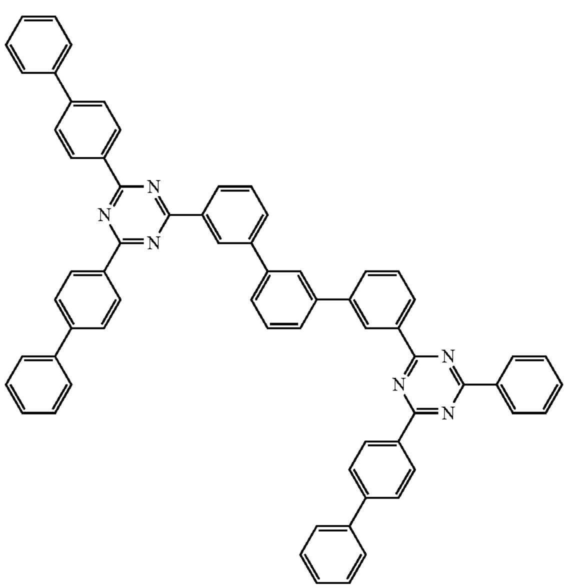

-continued
A(12)
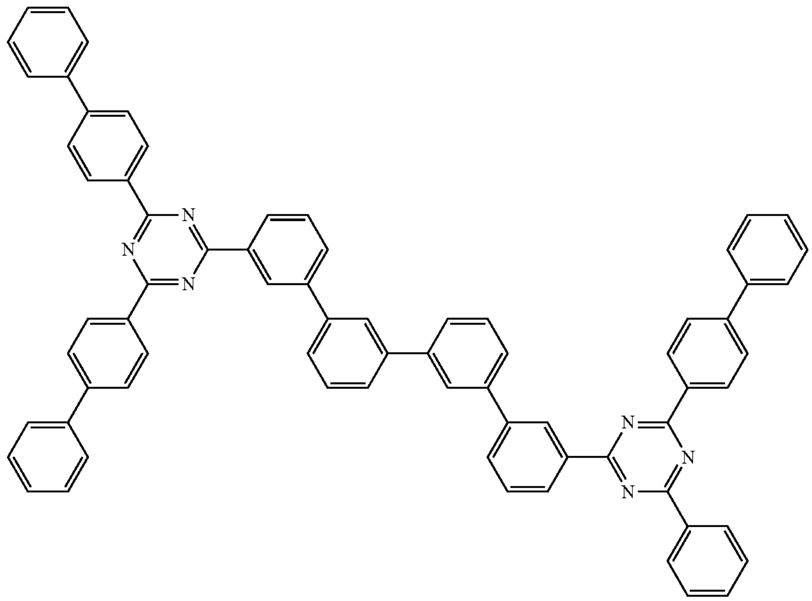
A(13)
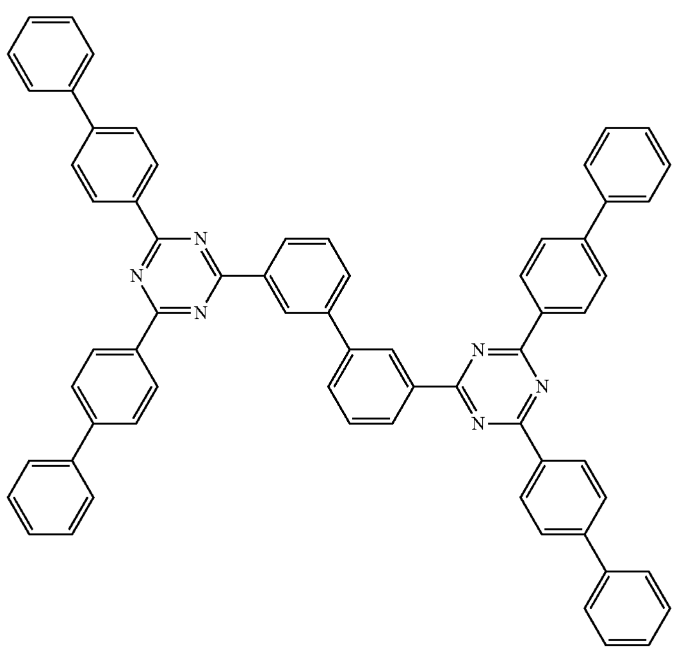

-continued
A(14)
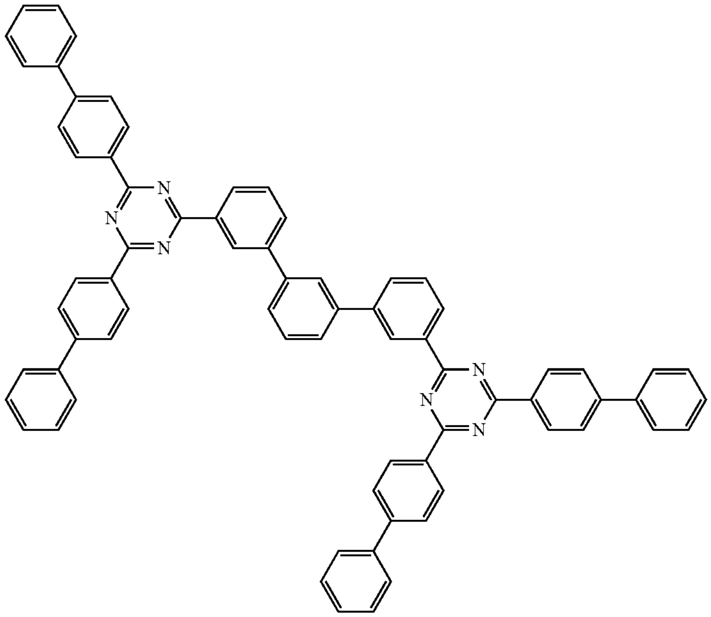
A(15)
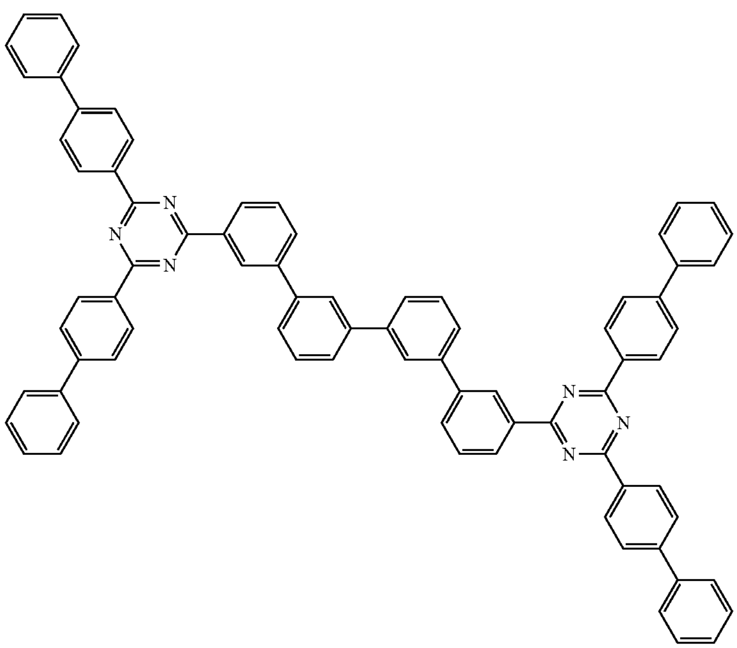

-continued
A(16)
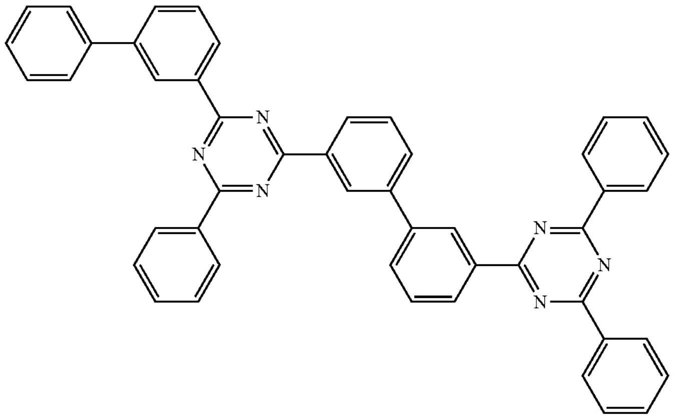
A(17)
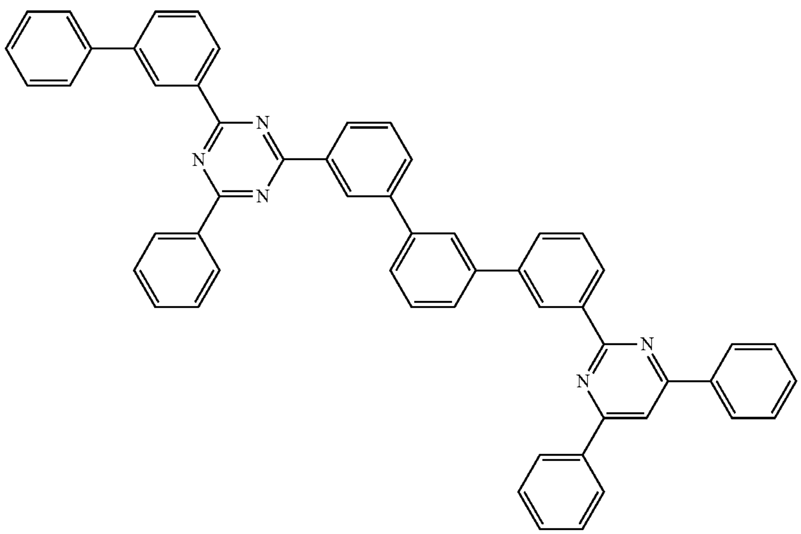
A(18)
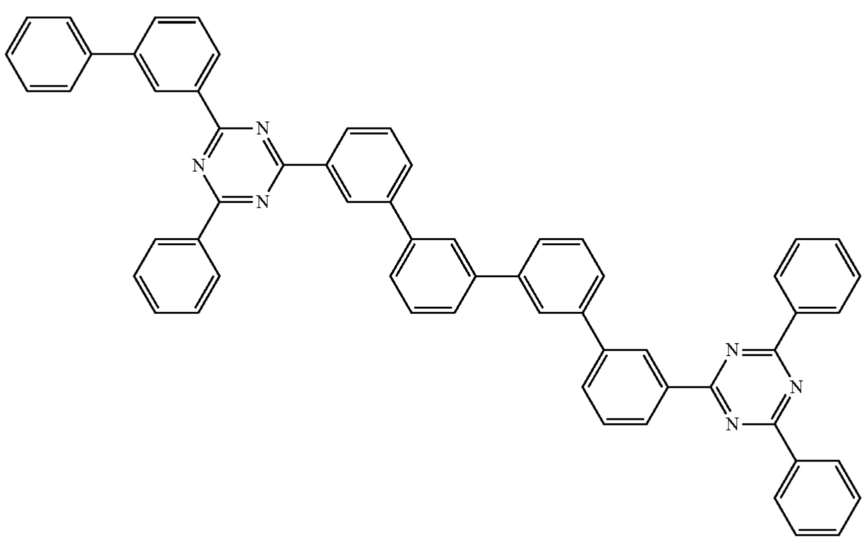

-continued
A(19)
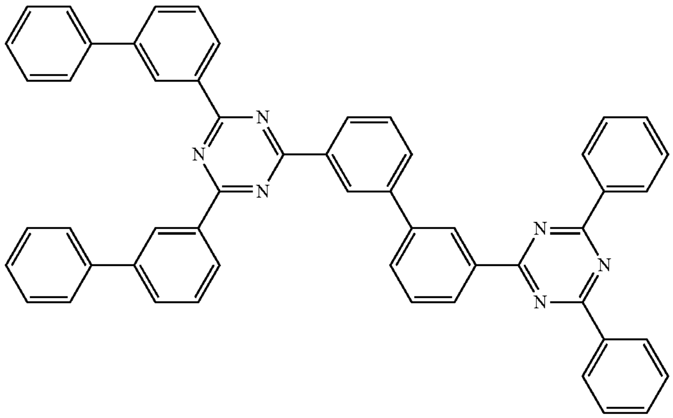
A(20)
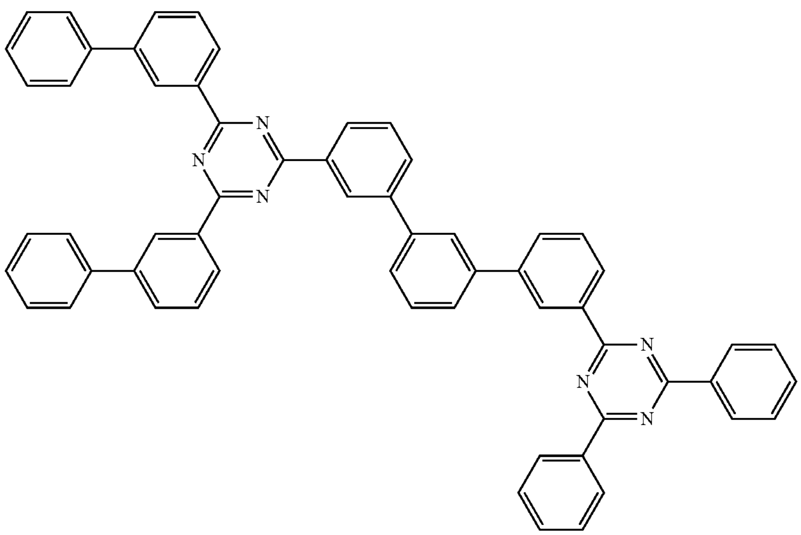
A(21)
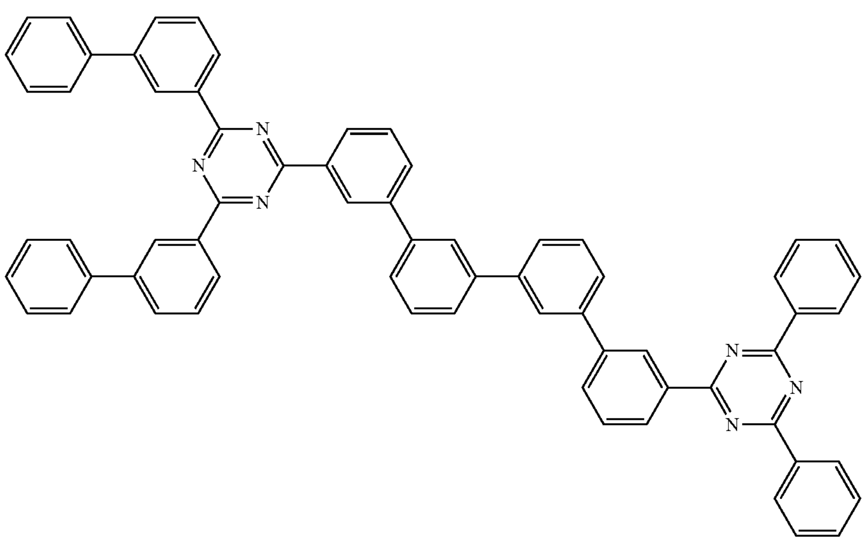

-continued
A(22)
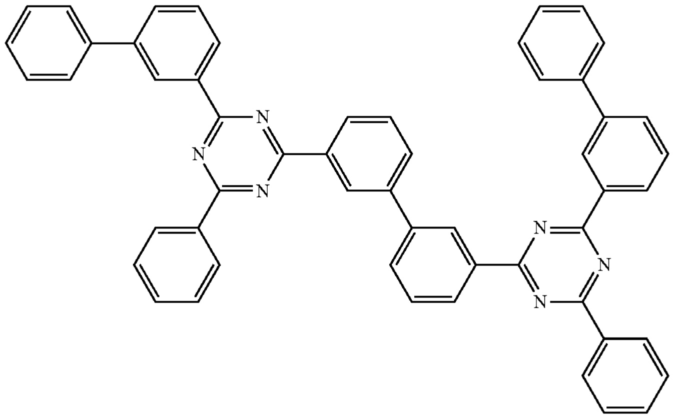
A(23)
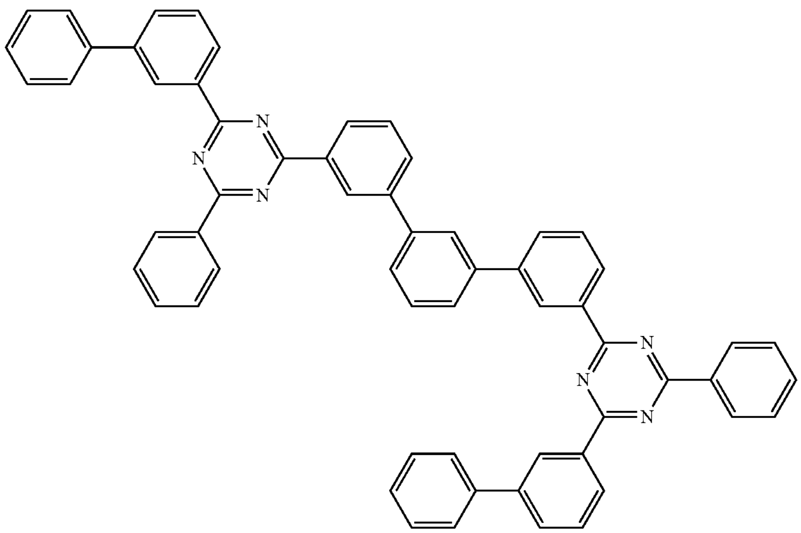
A(24)
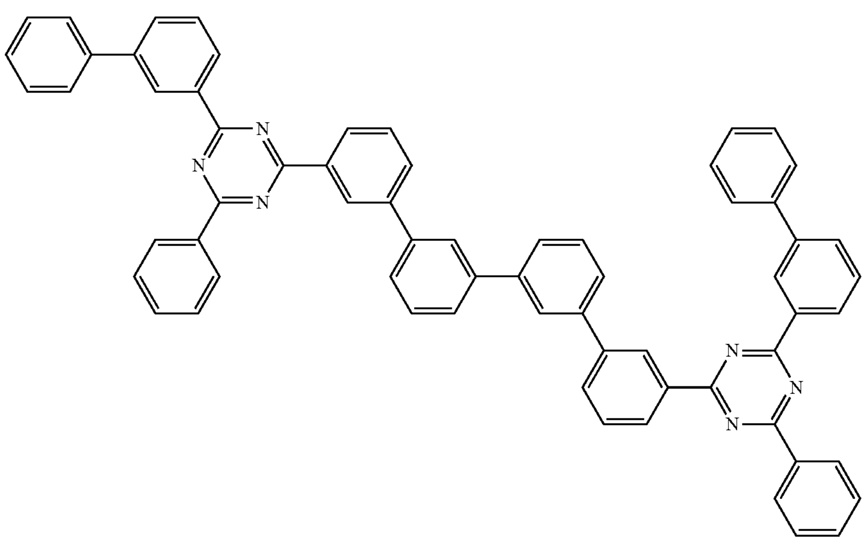

-continued
A(25)
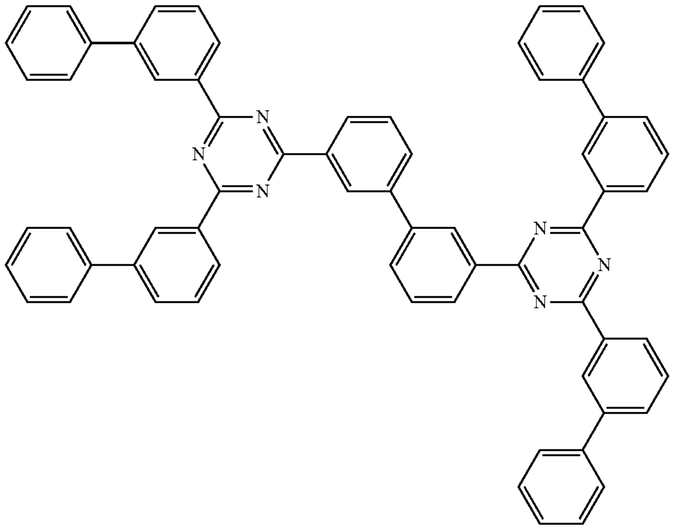
A(26)
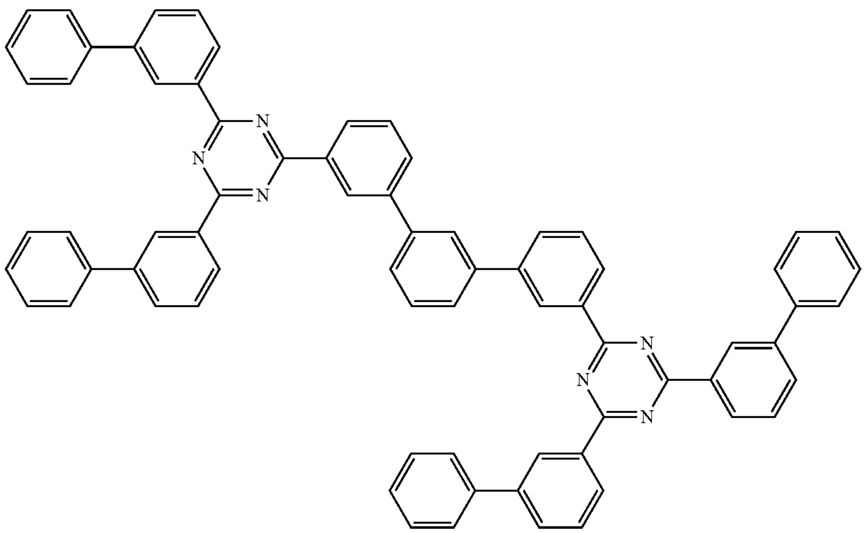
A(27)
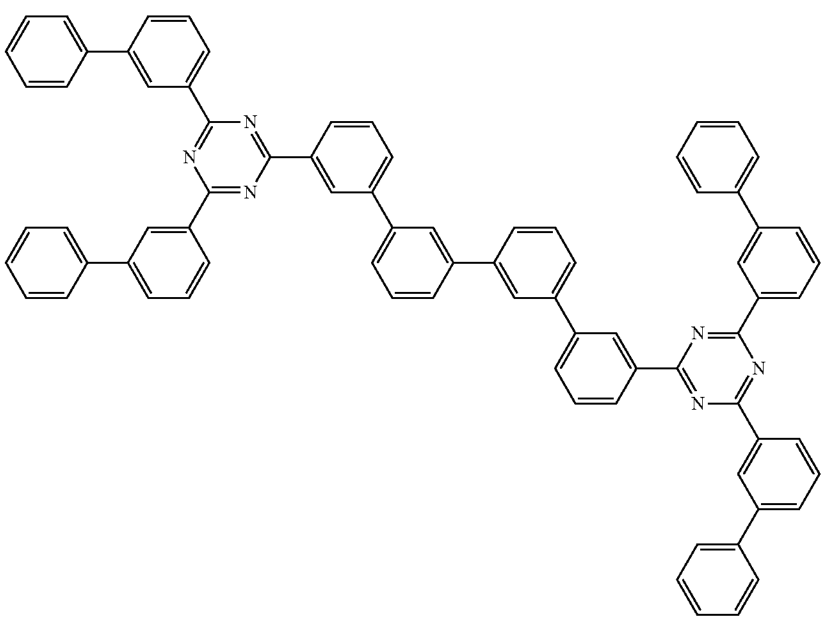

-continued
A(28)
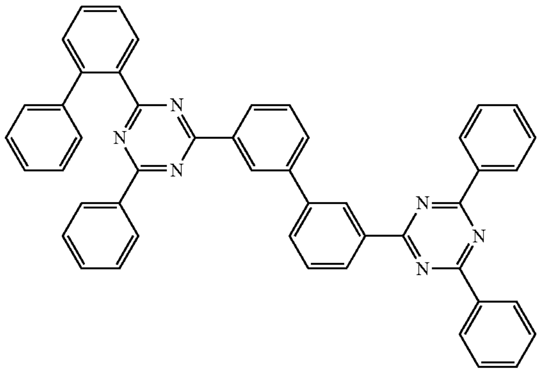
A(29)
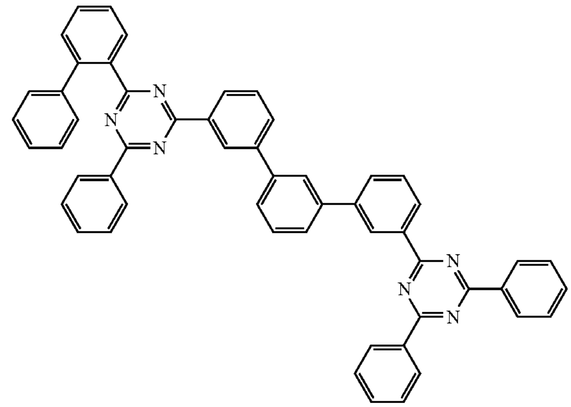
A(30)
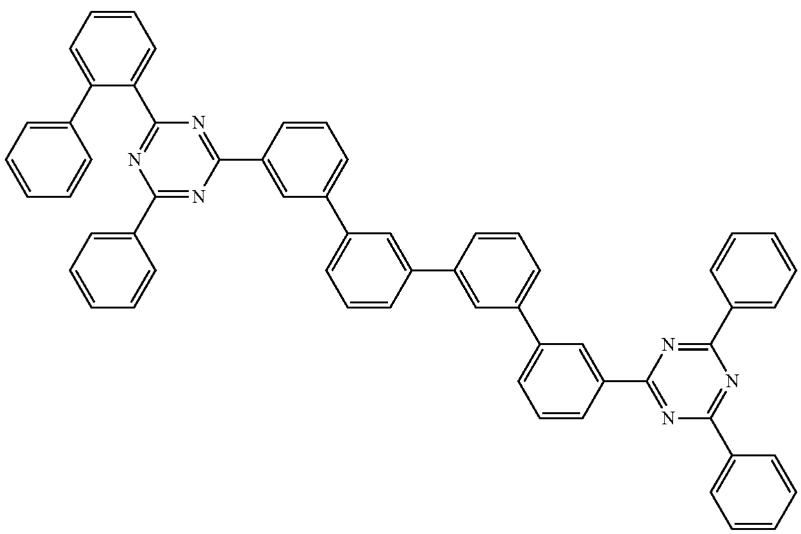
A(31)
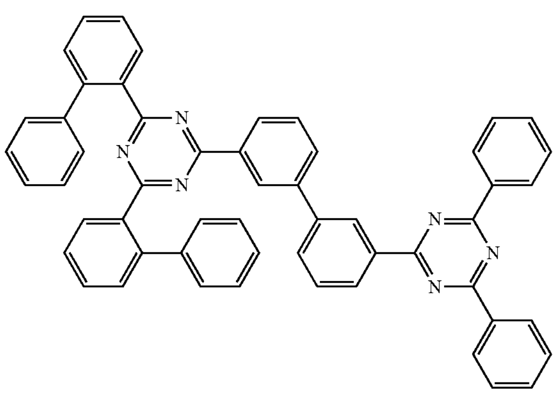
A(32)
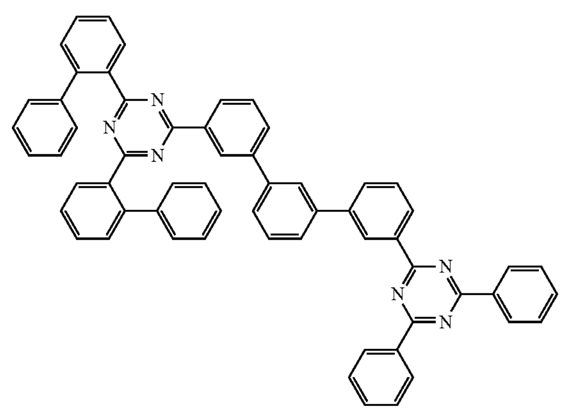

-continued
A(33)
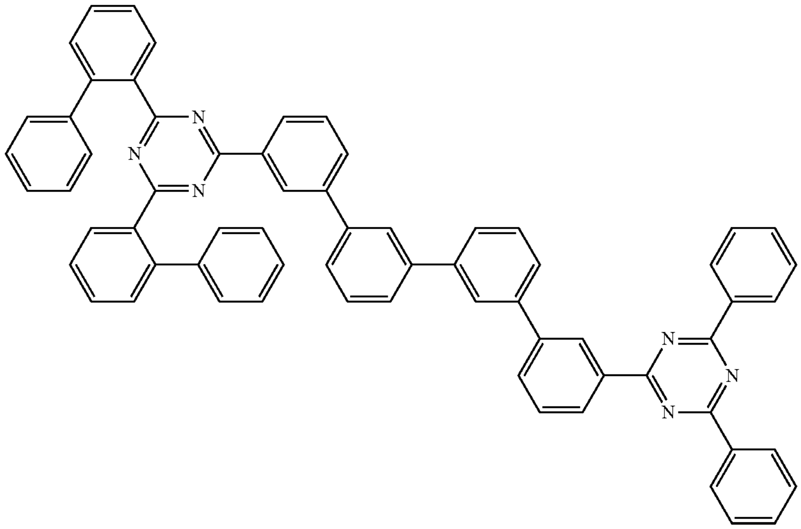
A(34)
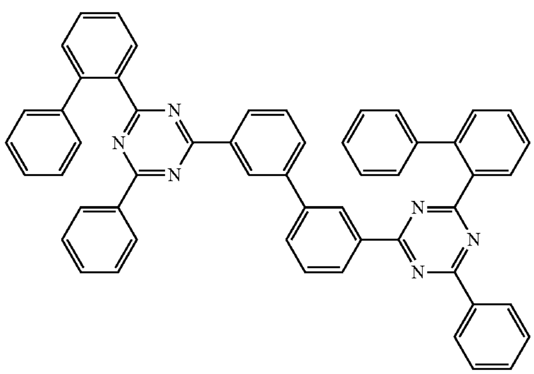
A(35)
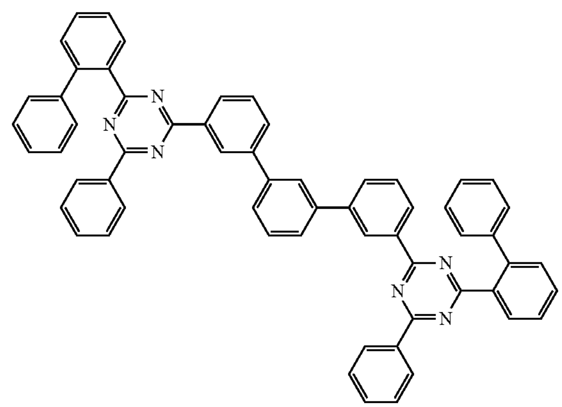
A(36)
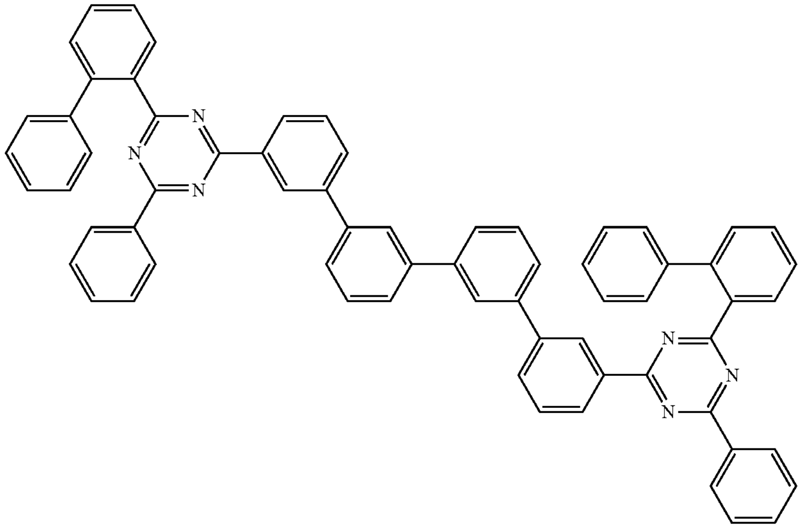

-continued
A(37)
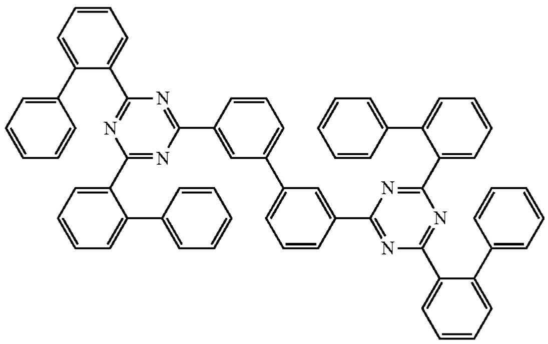
A(38)
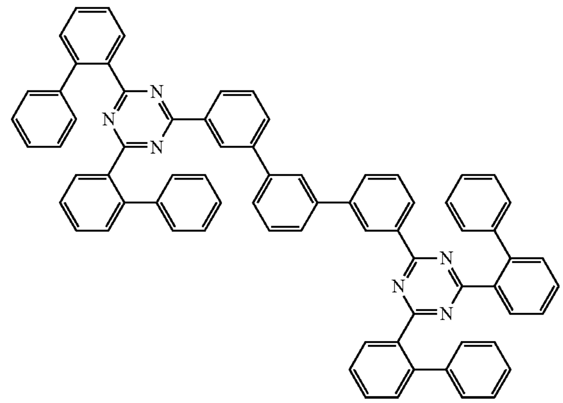
A(39)
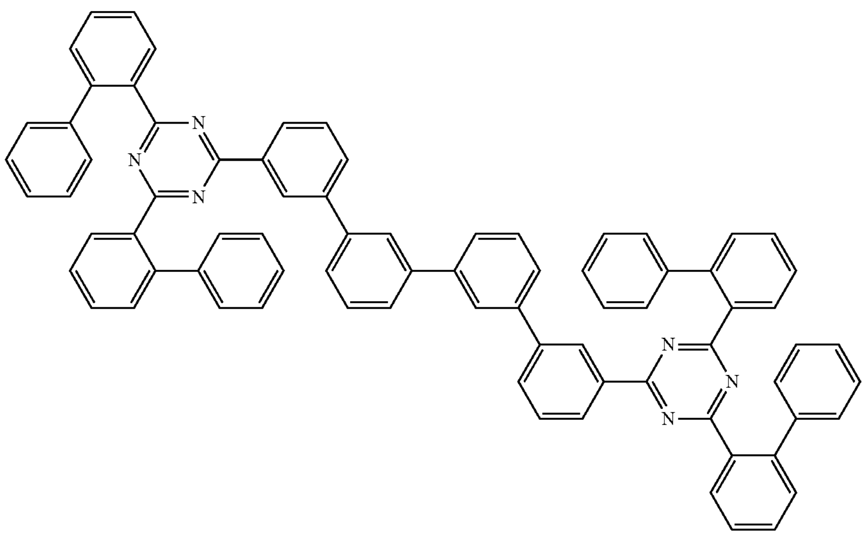
A(40)
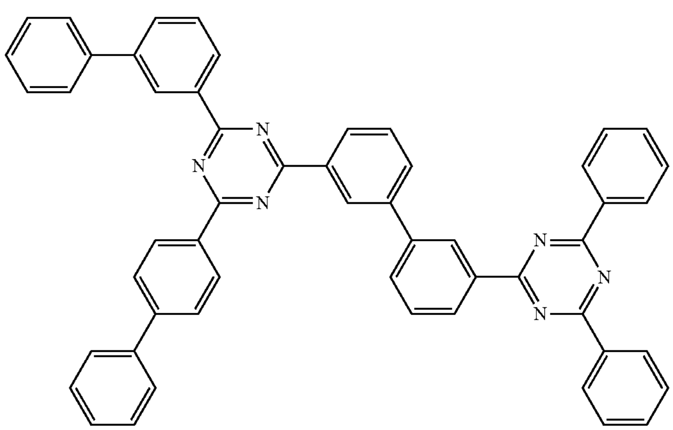

-continued
A(41)
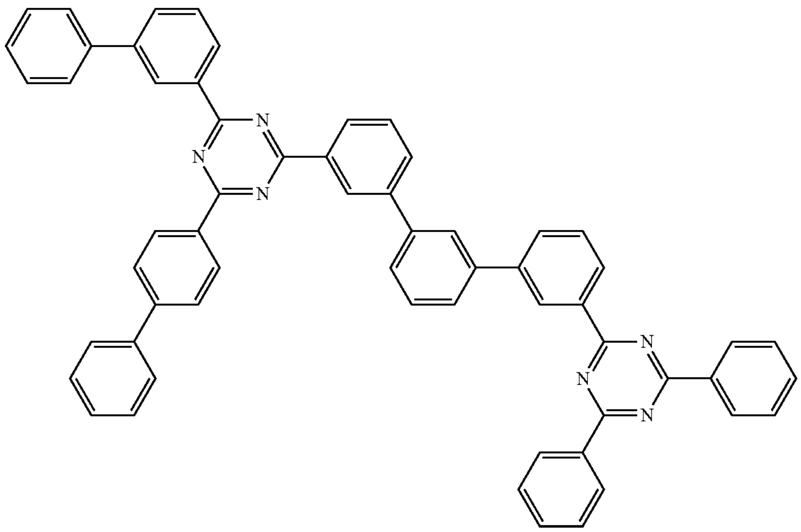
A(42)
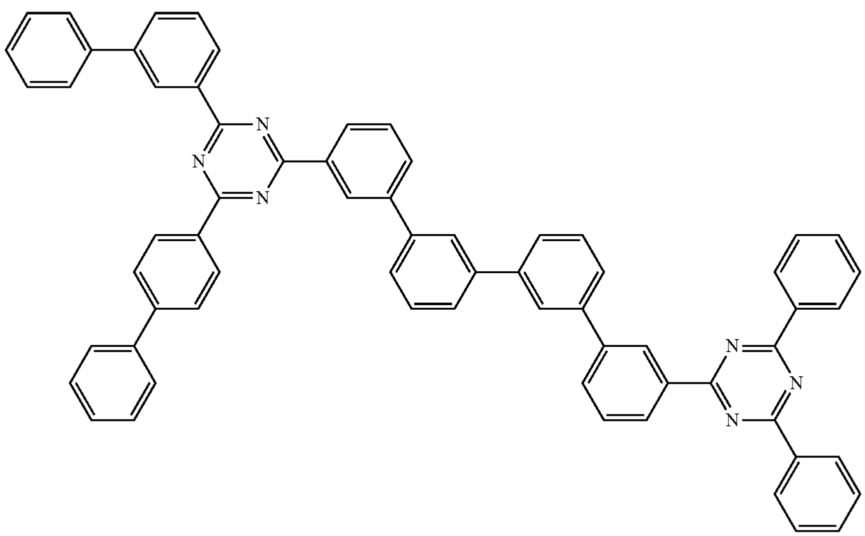
A(43)
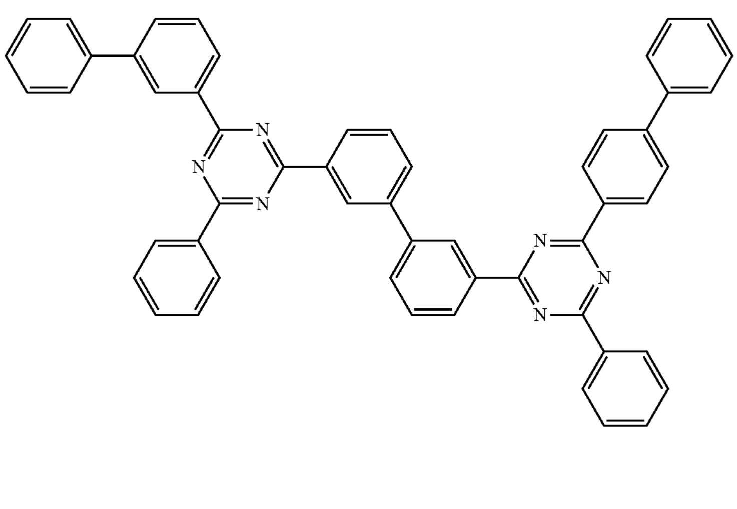

-continued
A(44)
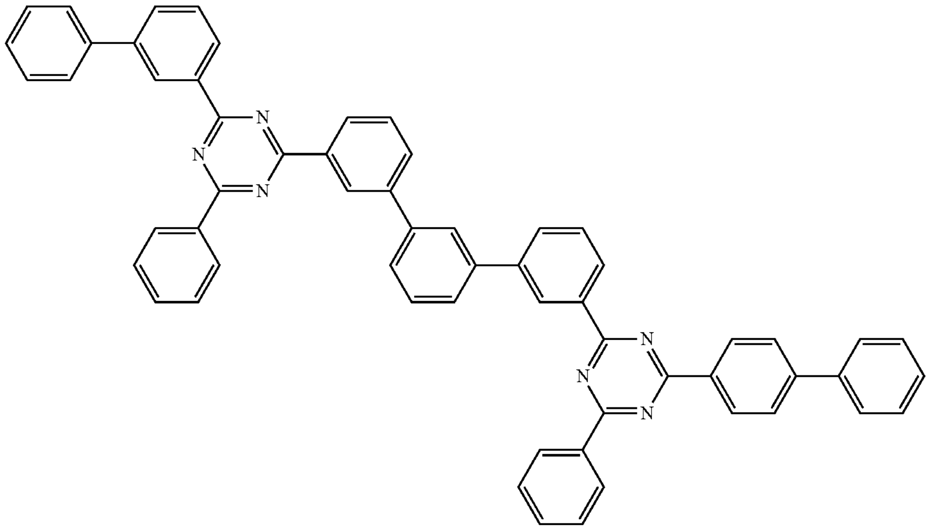
A(45)
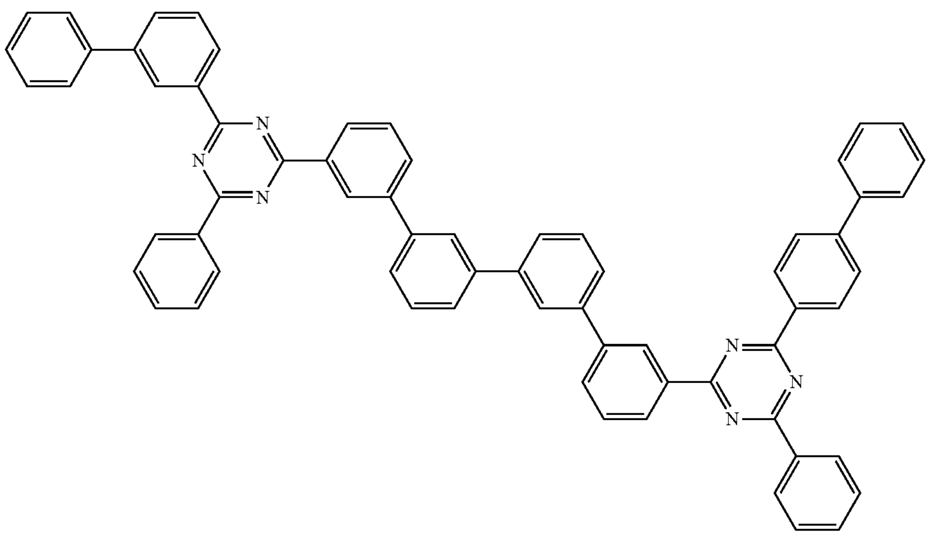
A(46)
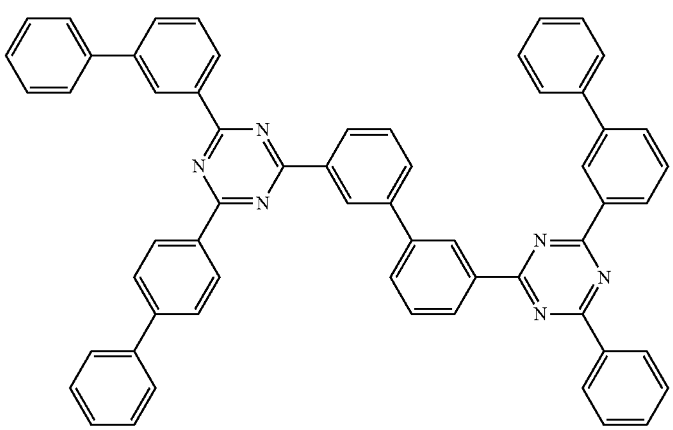

-continued
A(47)
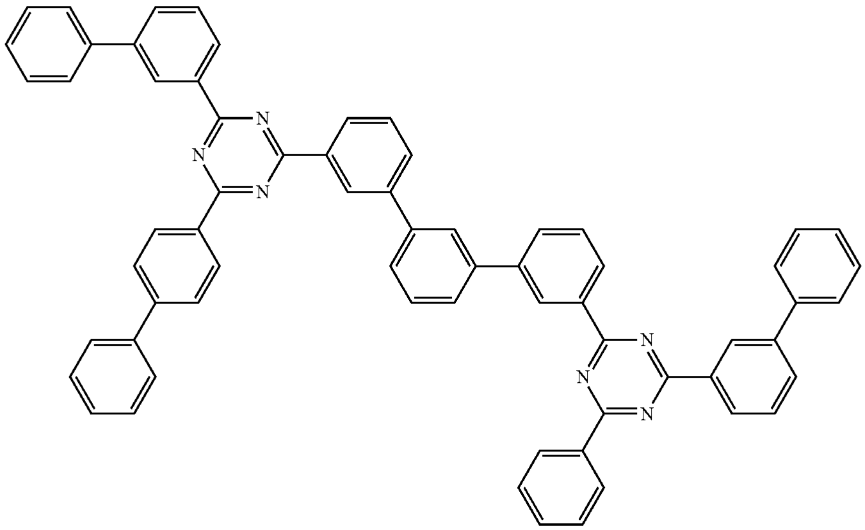
A(48)
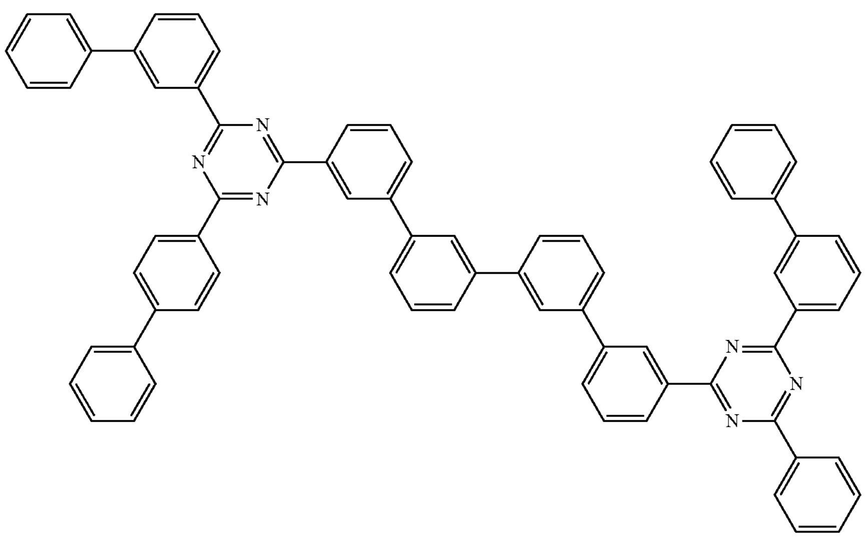
A(49)
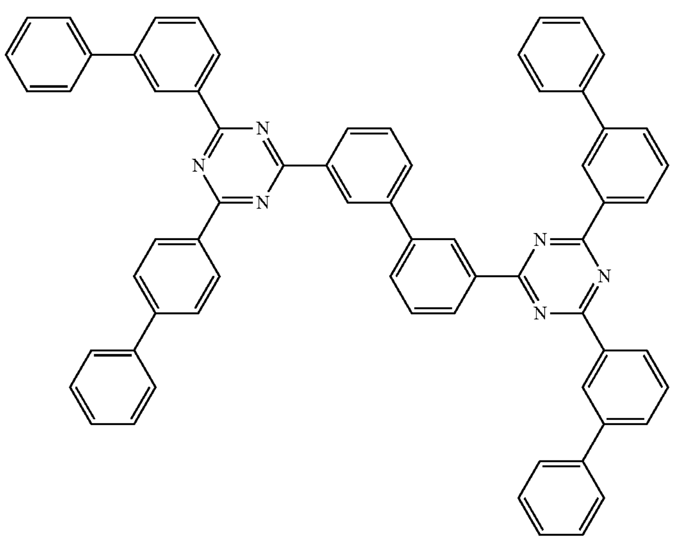

-continued
A(50)
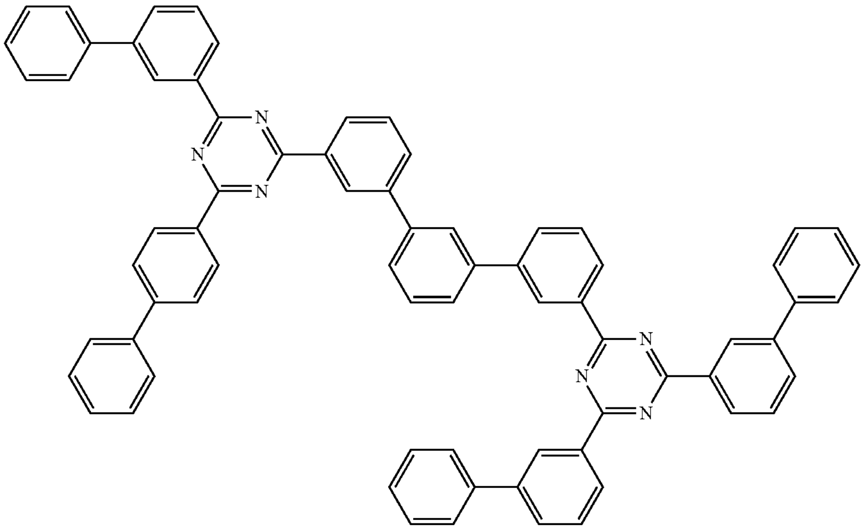
A(51)
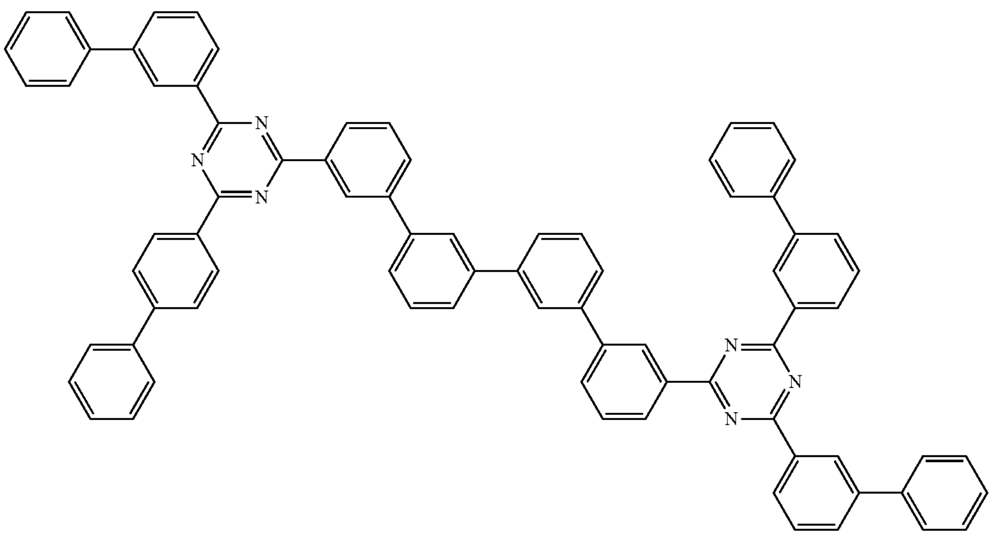
A(52)
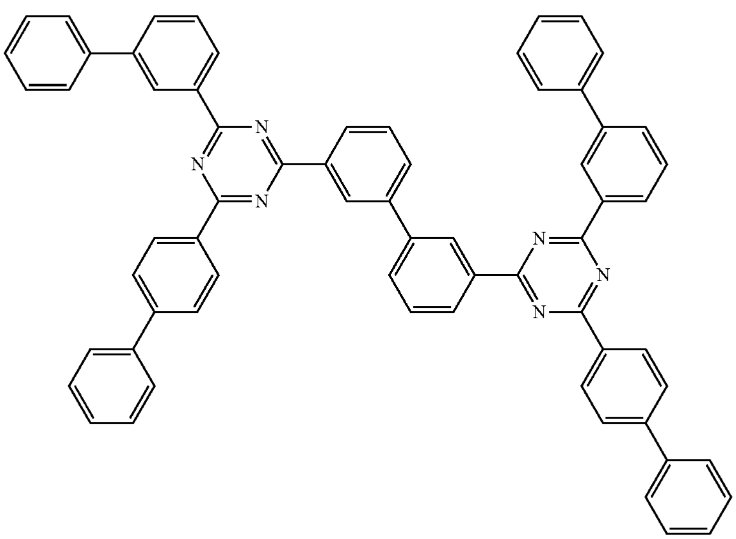

-continued
A(53)
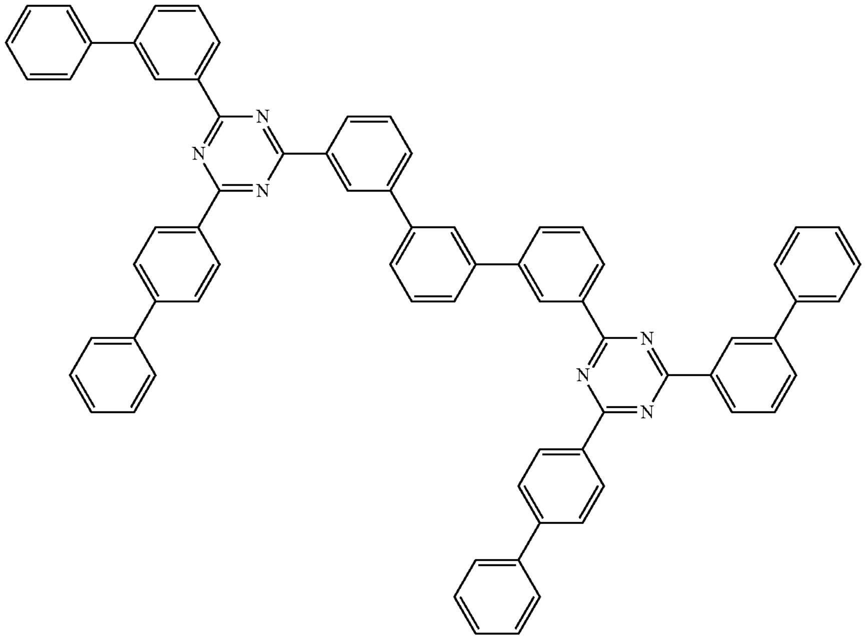
A(54)
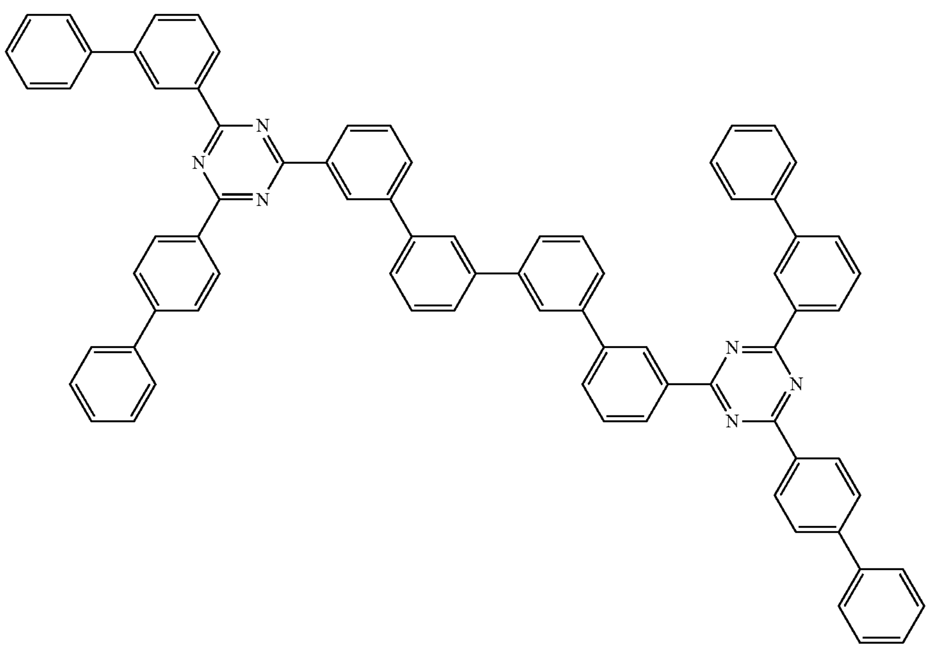

-continued
A(55)
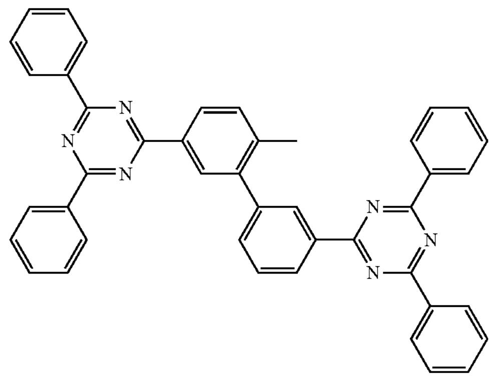
A(56)
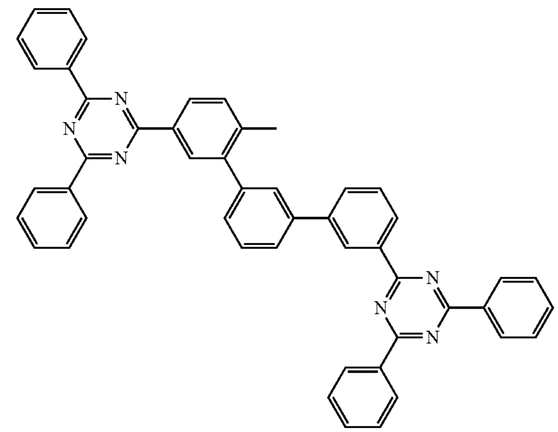
A(57)
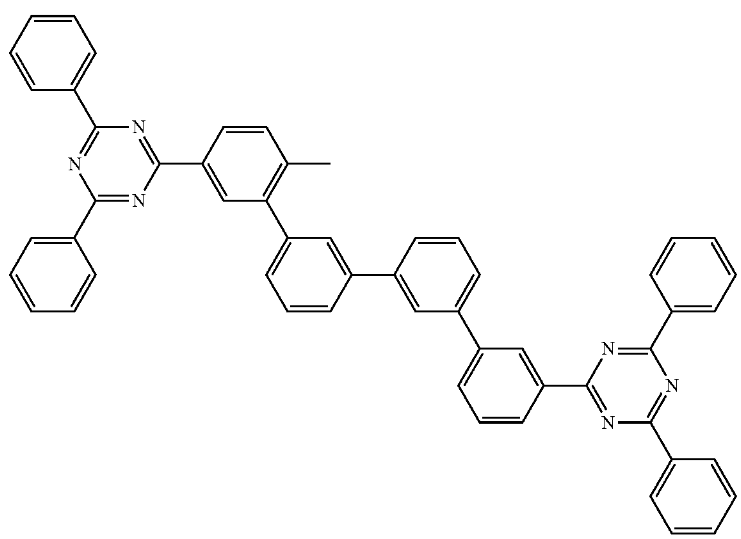
A(58)
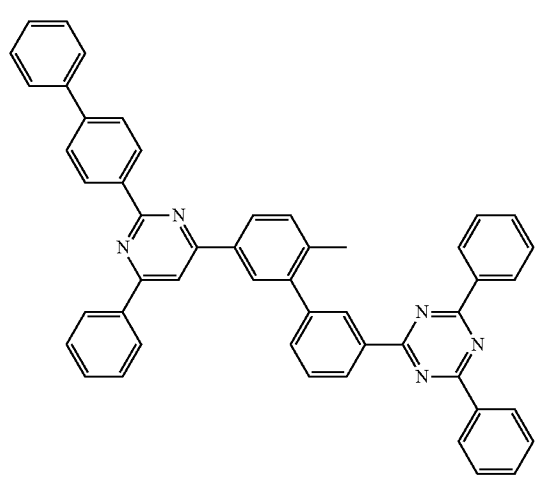
A(59)
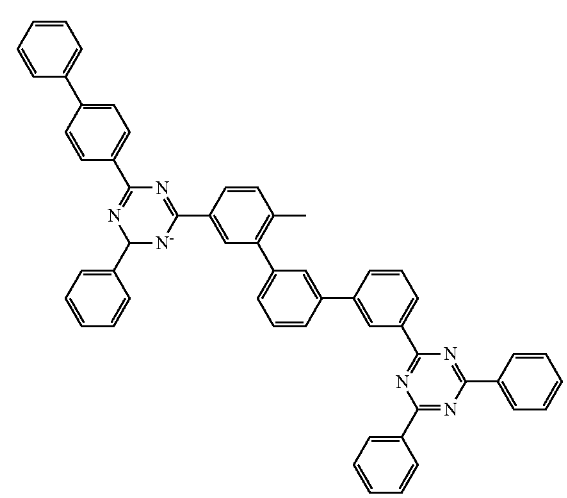

-continued
A(60)
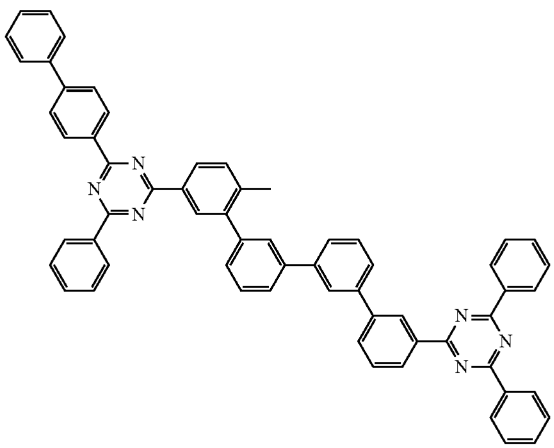
A(61)
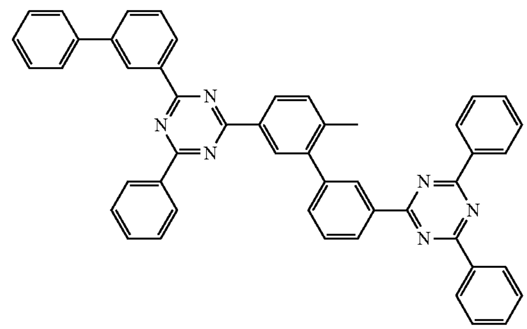
A(62)
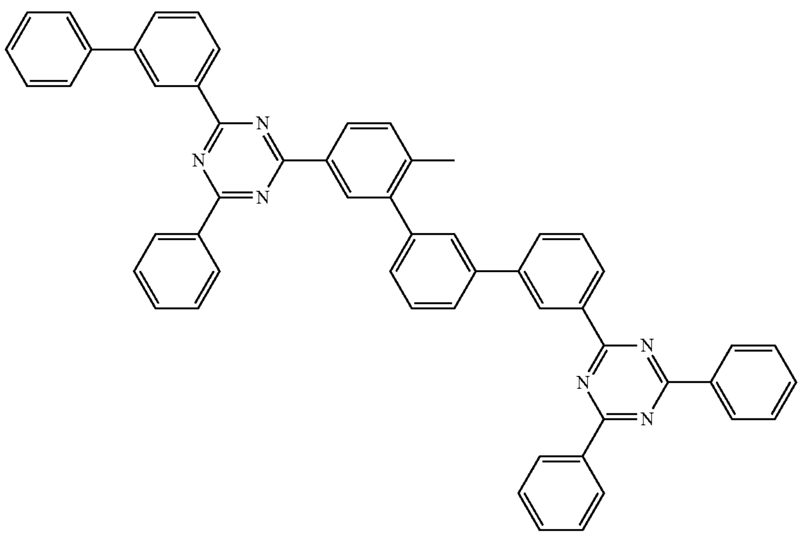
A(63)
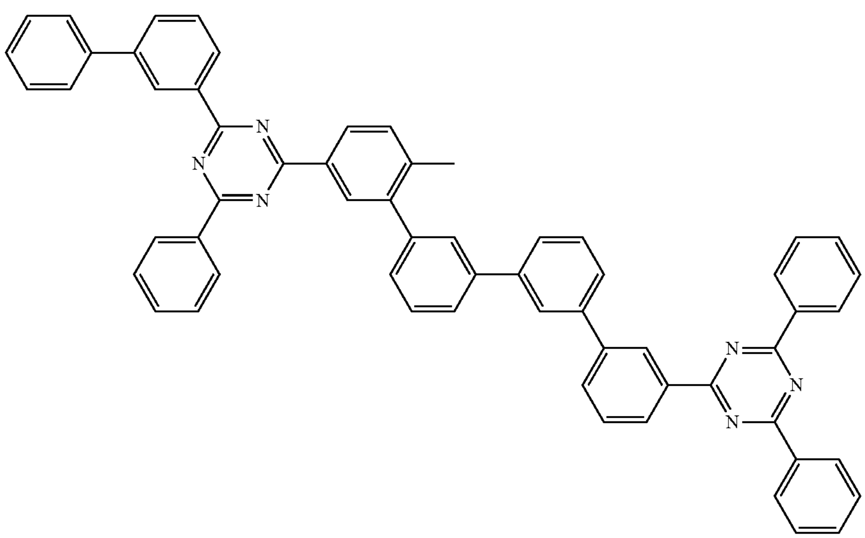

-continued
A(64)
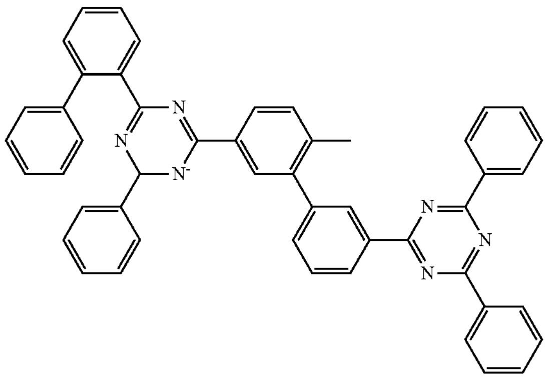
A(65)
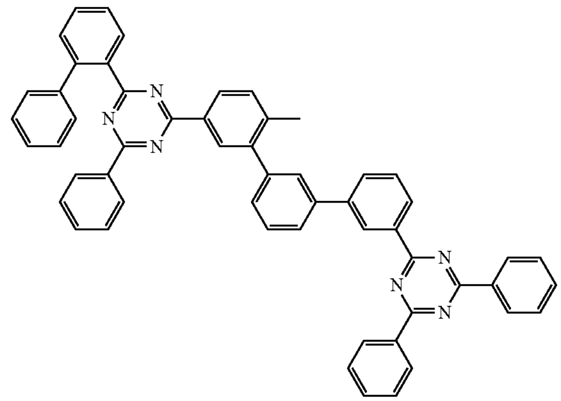
A(66)
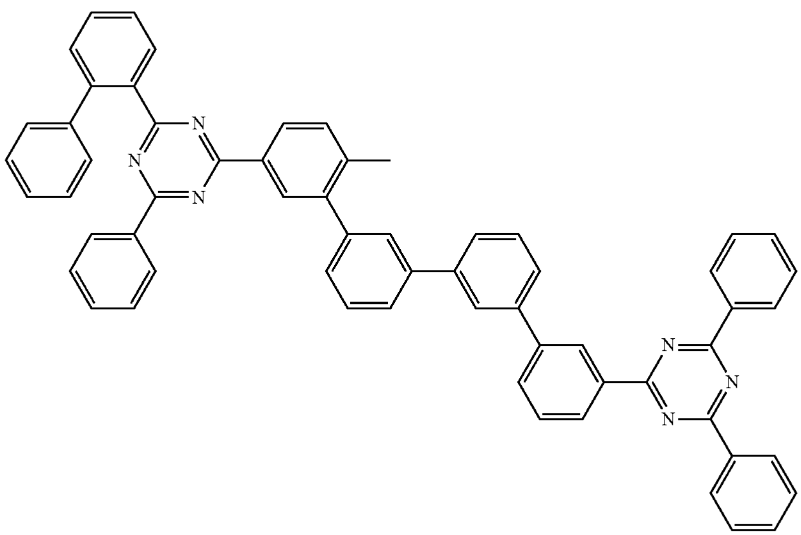
A(67)
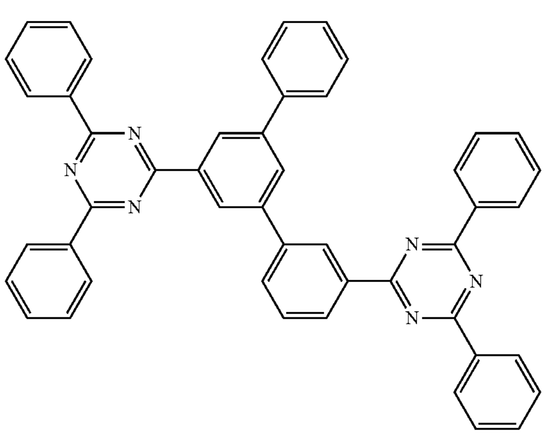
A(68)
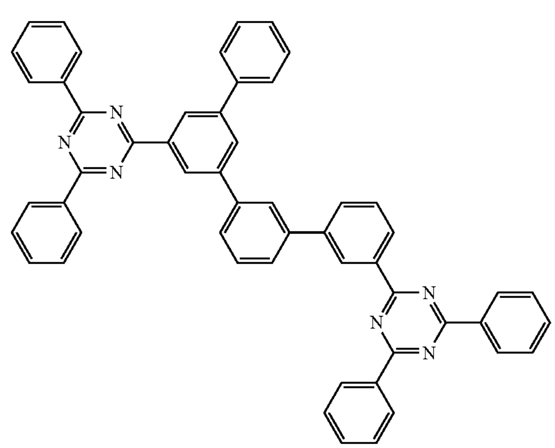

-continued
A(69)
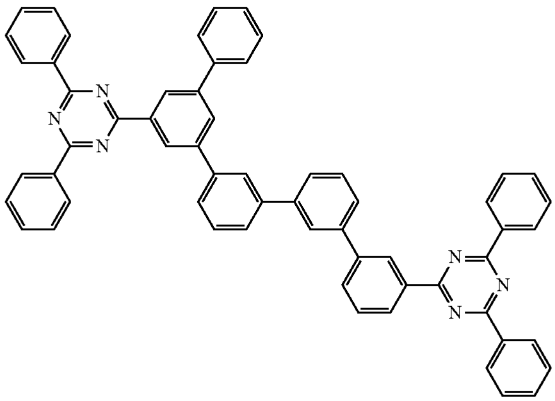
A(70)
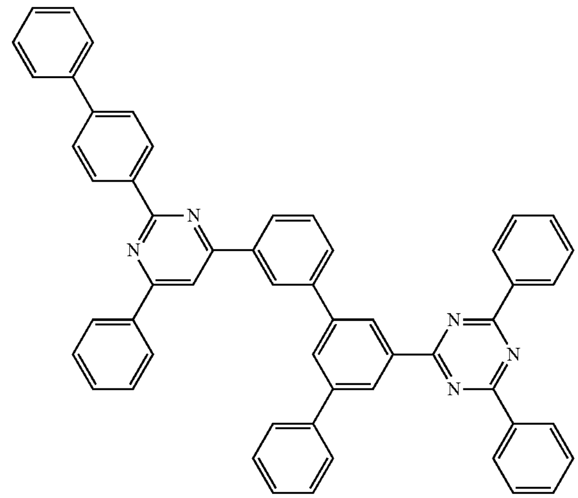
A(71)
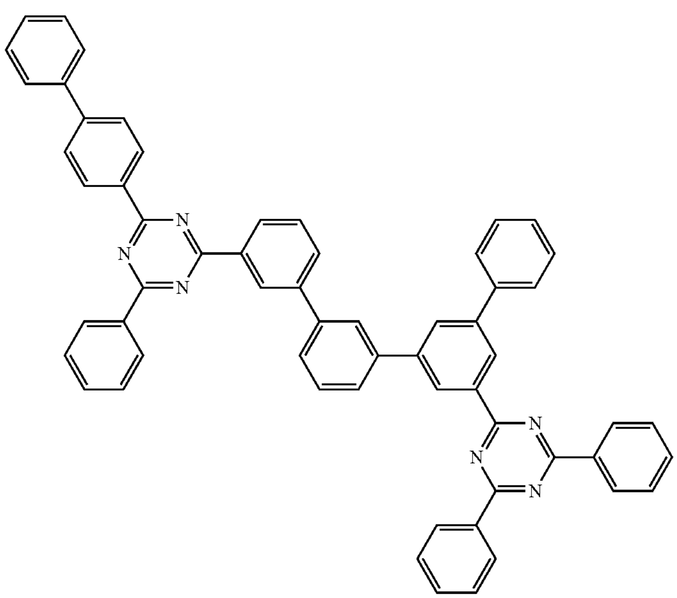

-continued
A(72)
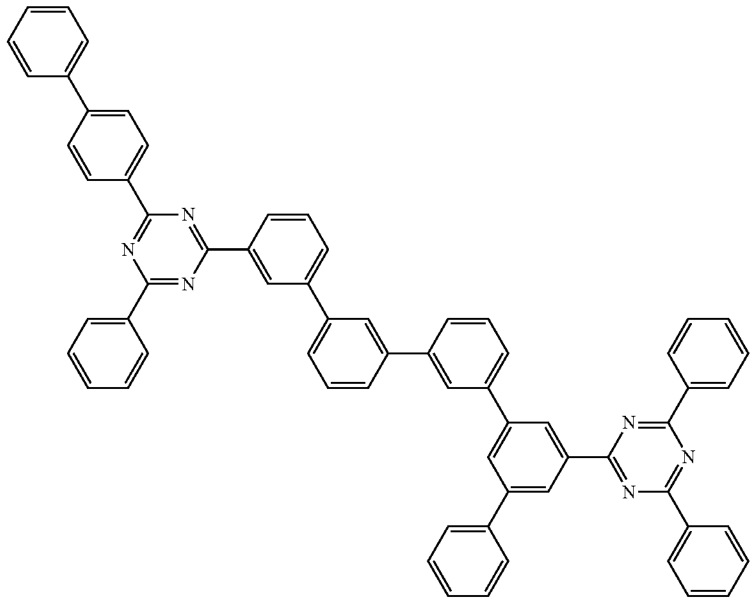
A(73)
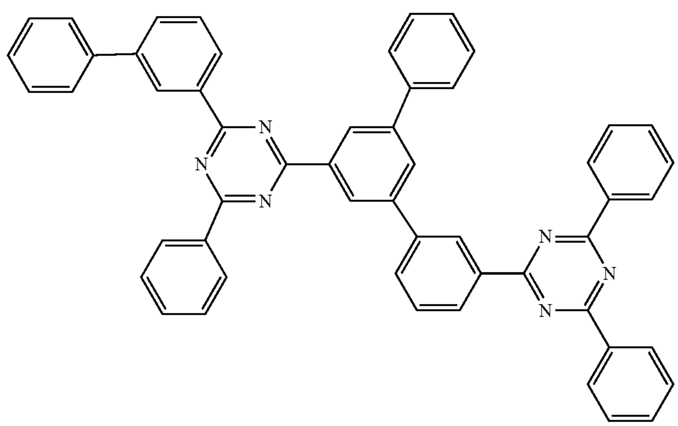
A(74)
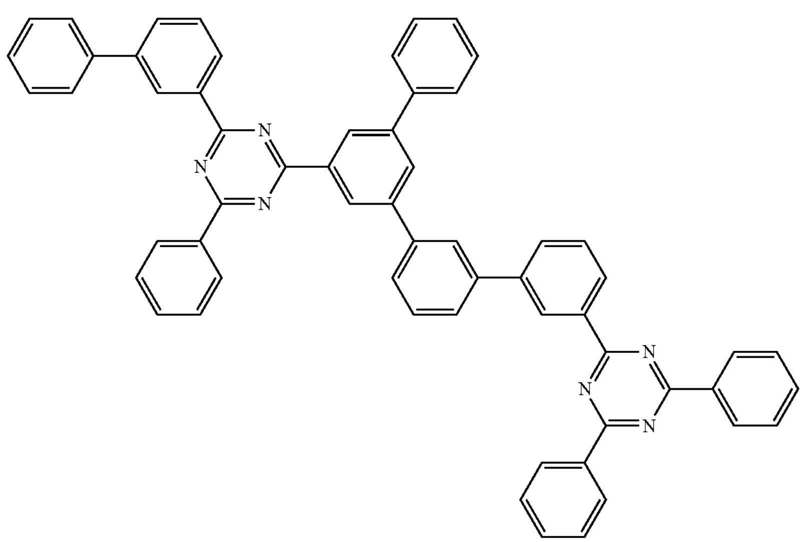

-continued
A(75)
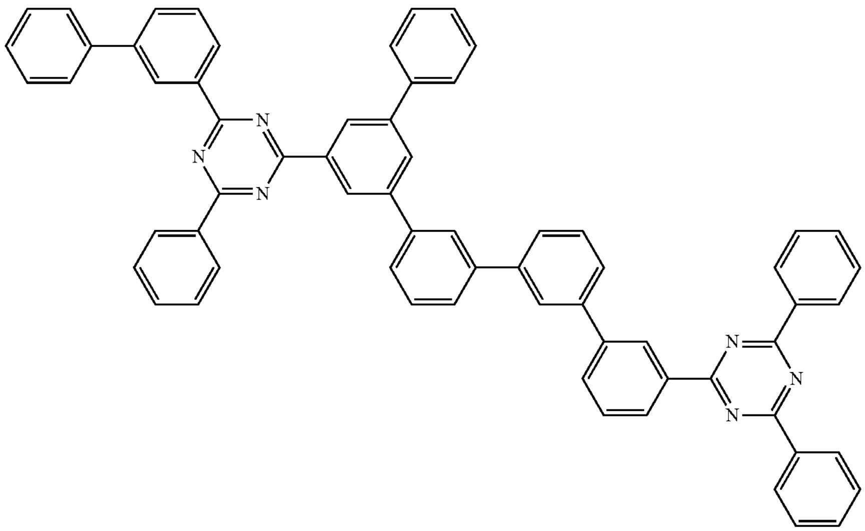
A(76)
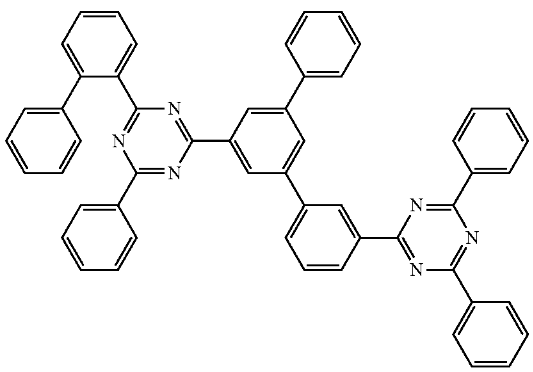
A(77)
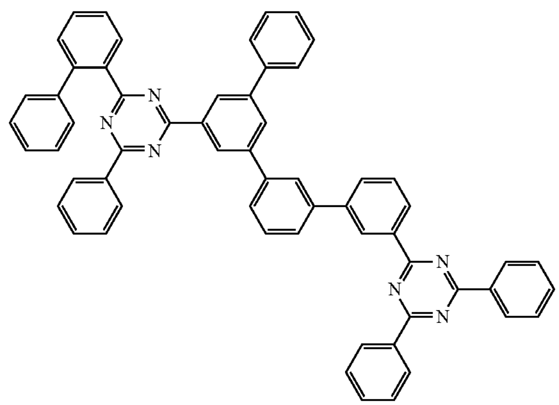
A(78)
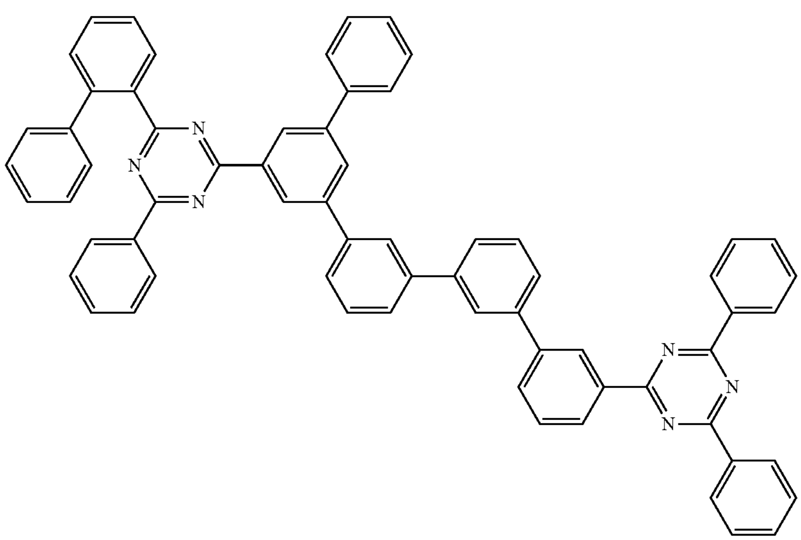

-continued
A(79)
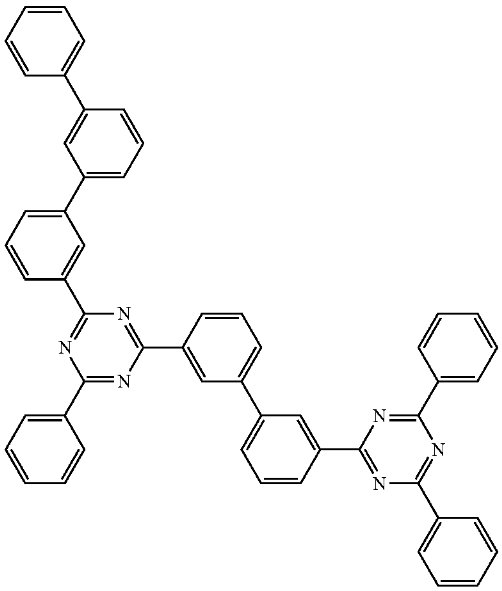
A(80)
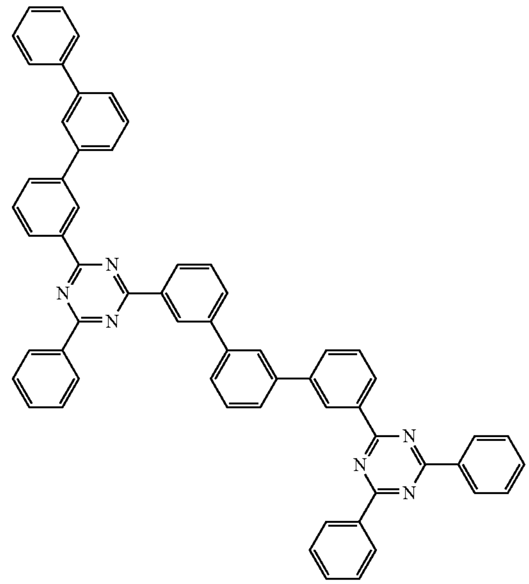
A(81)
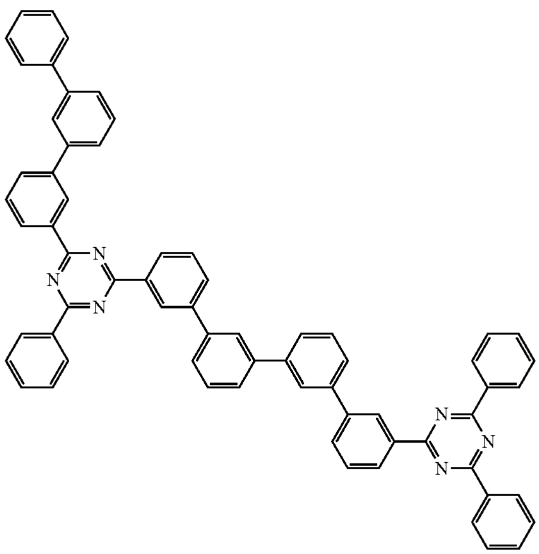
A(82)
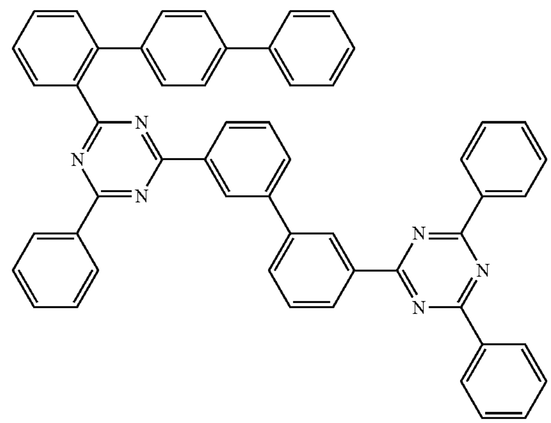
A(83)
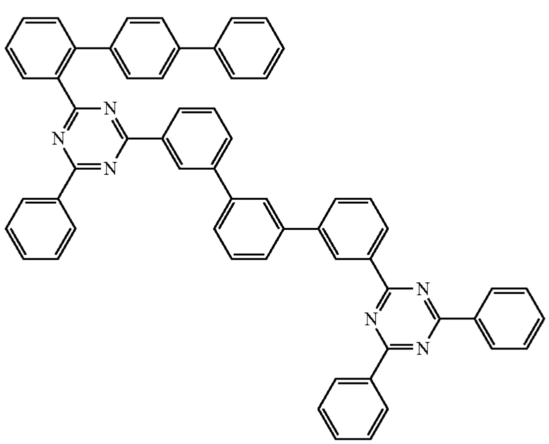
A(84)
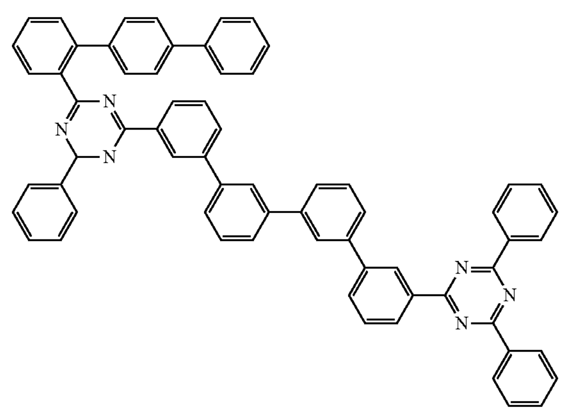

-continued
A(85)
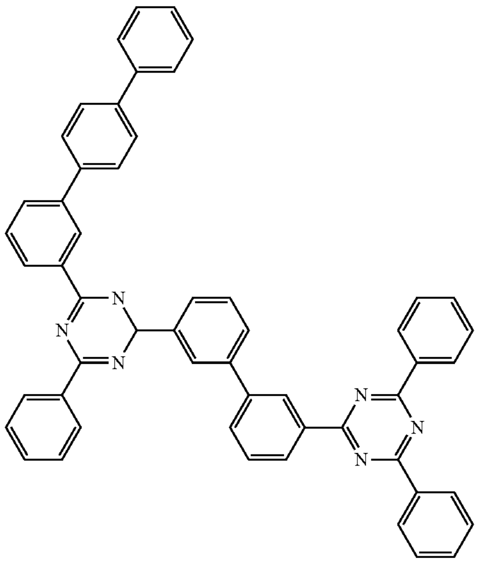
A(86)
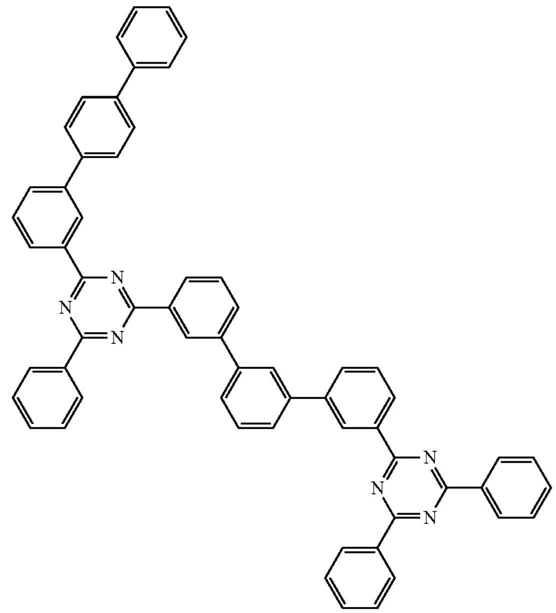
A(87)
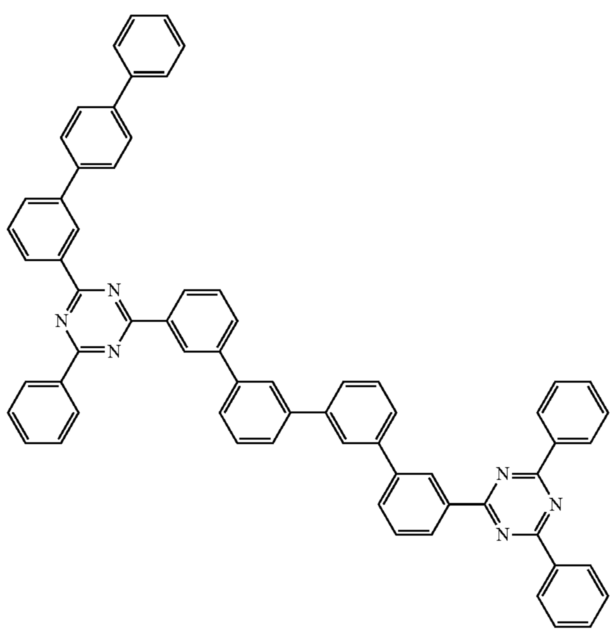

A(88)
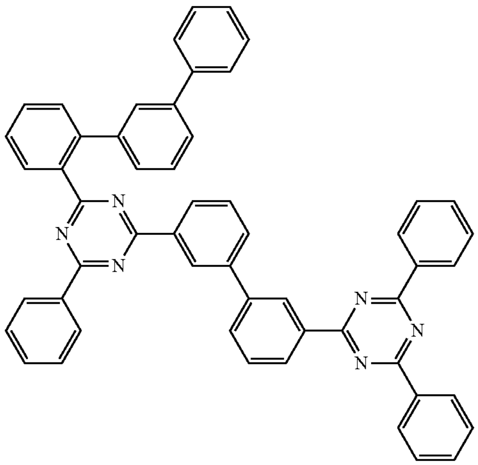
A(89)
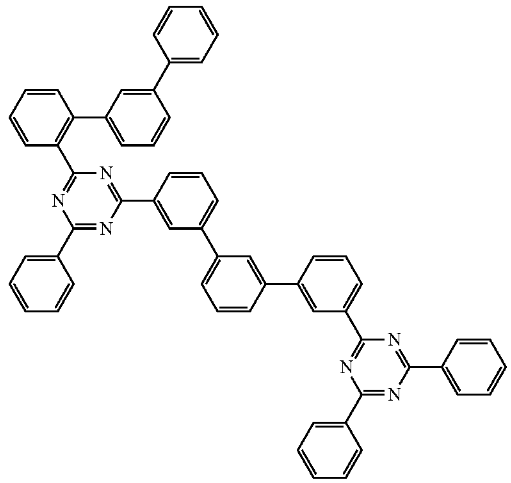
A(90)
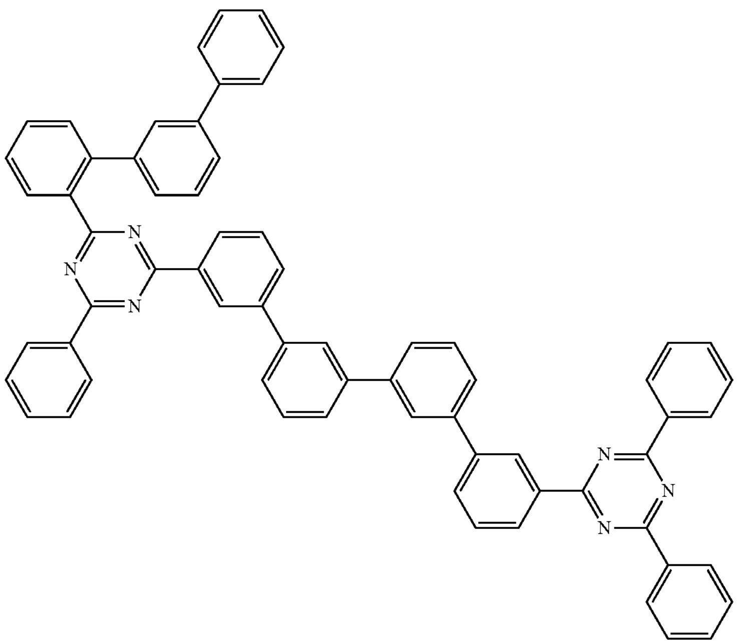
A(91)
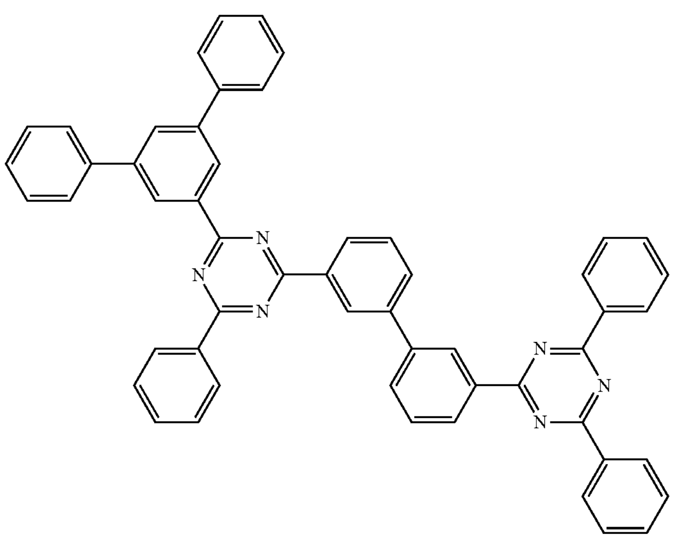

-continued
A(92)
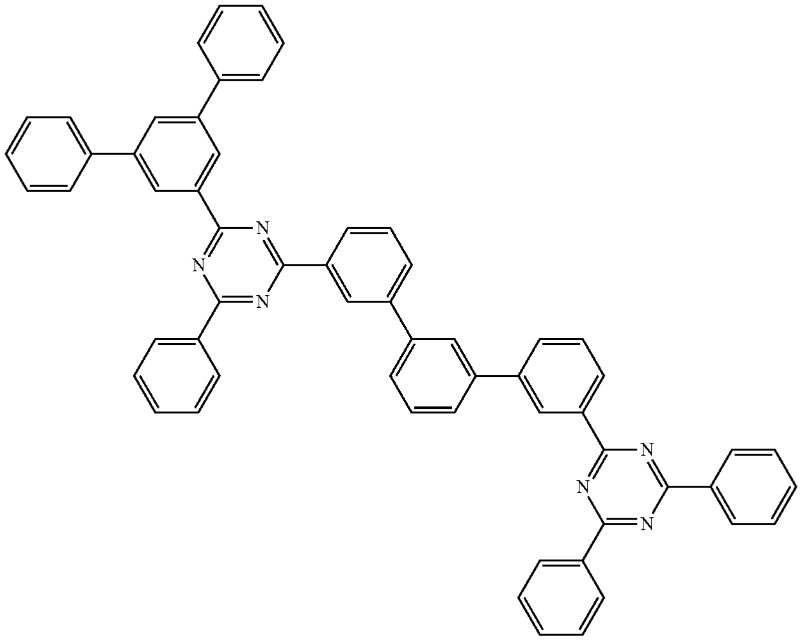
A(93)
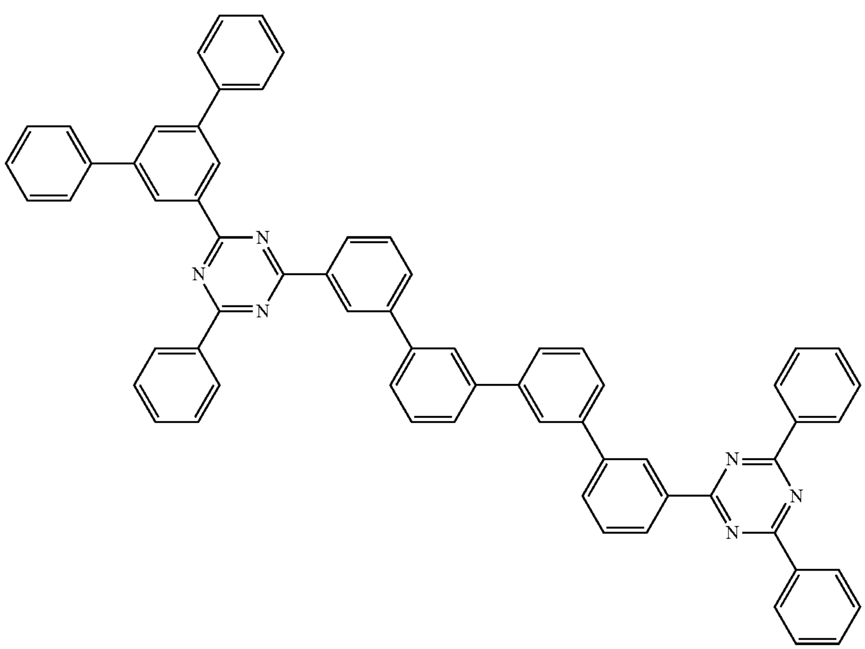

-continued
A(94)
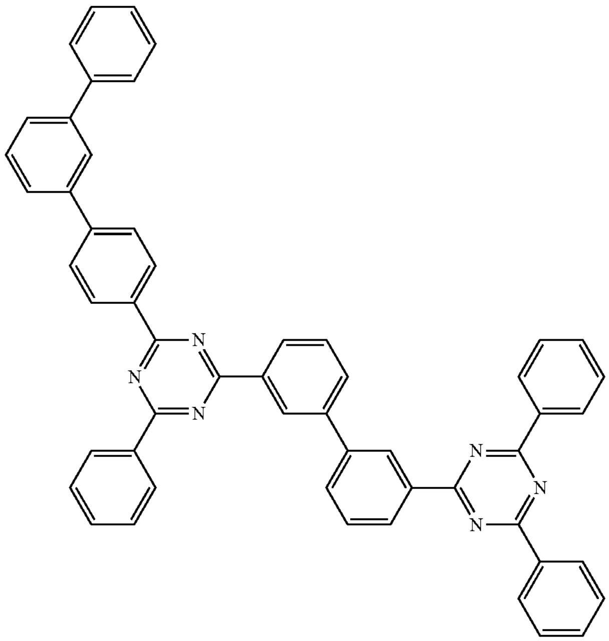
A(95)
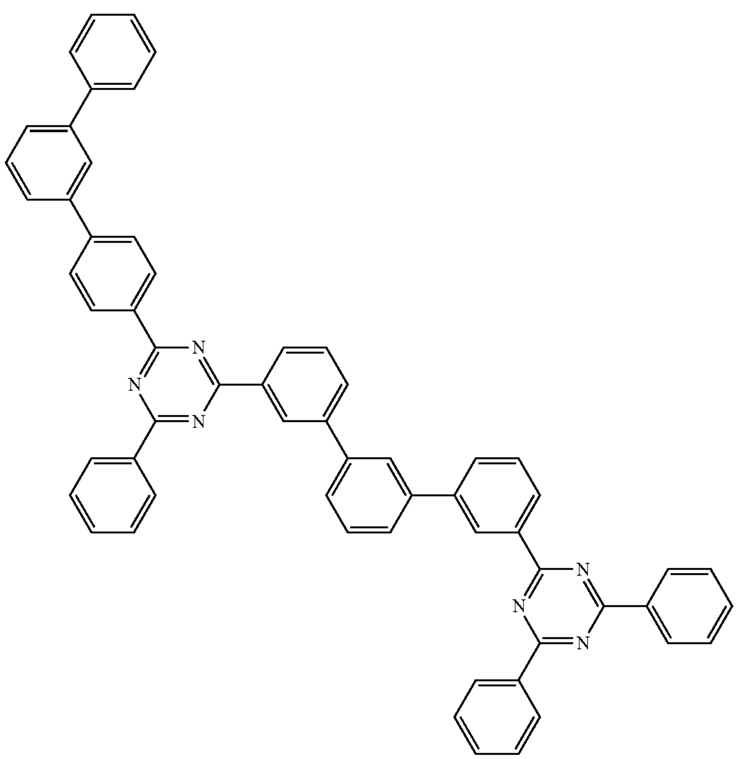

-continued
A(96)
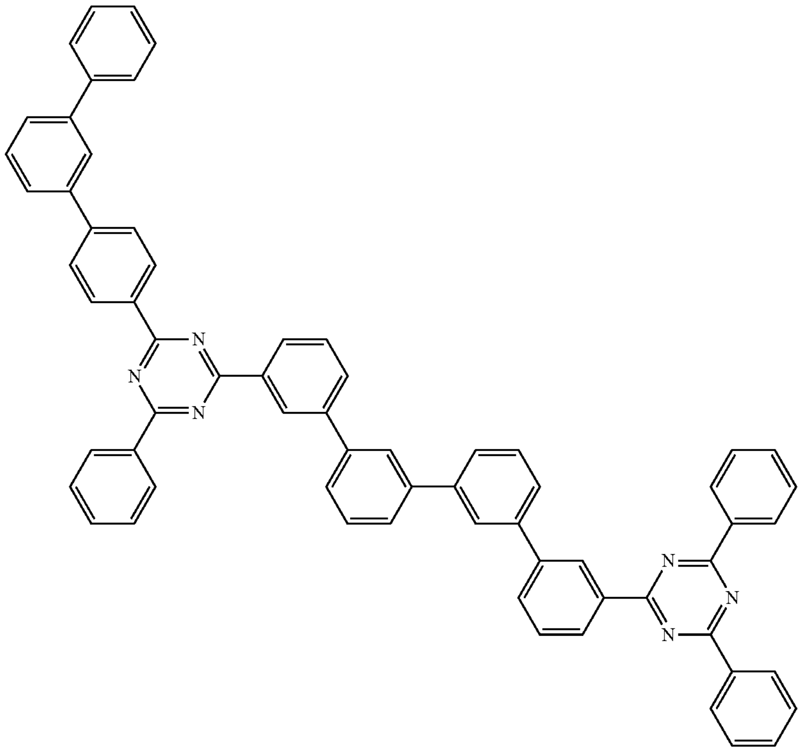
A(97)
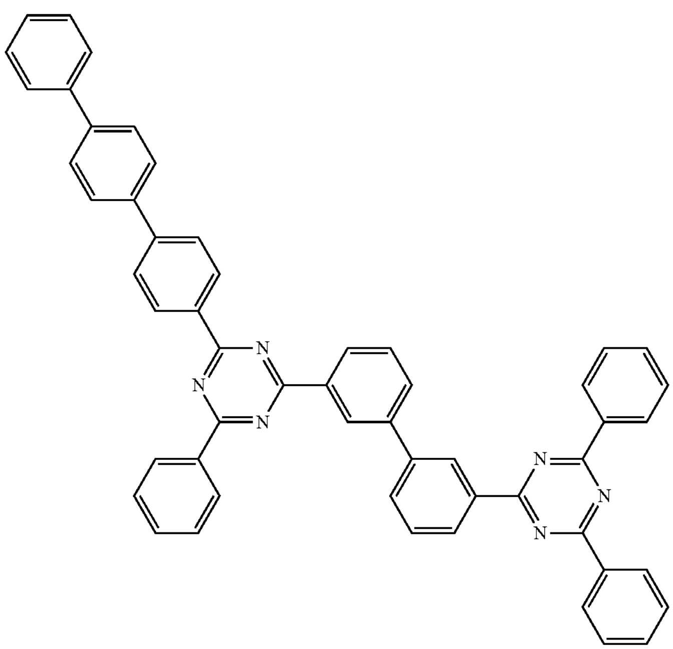

-continued
A(98)
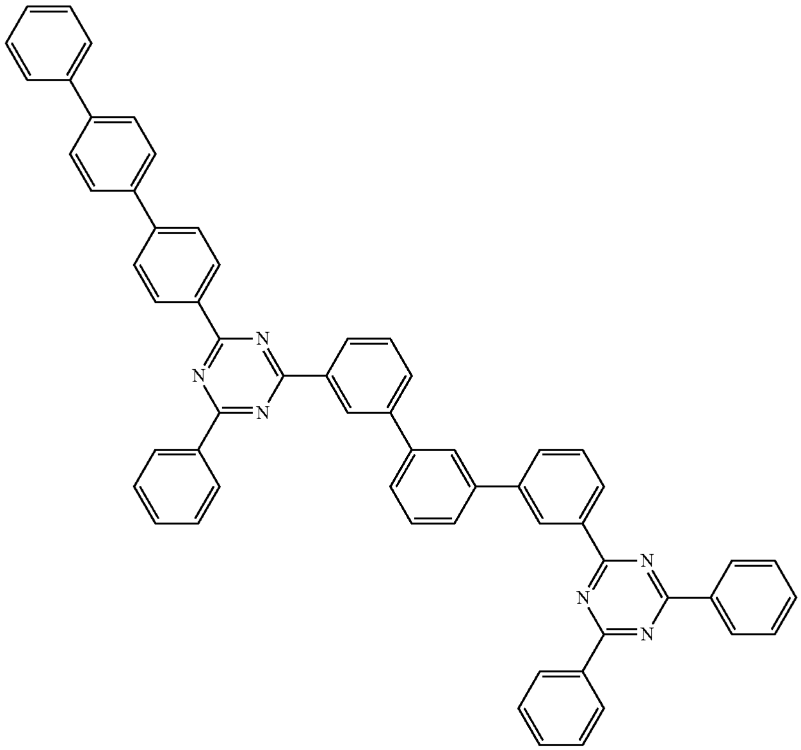
A(99)
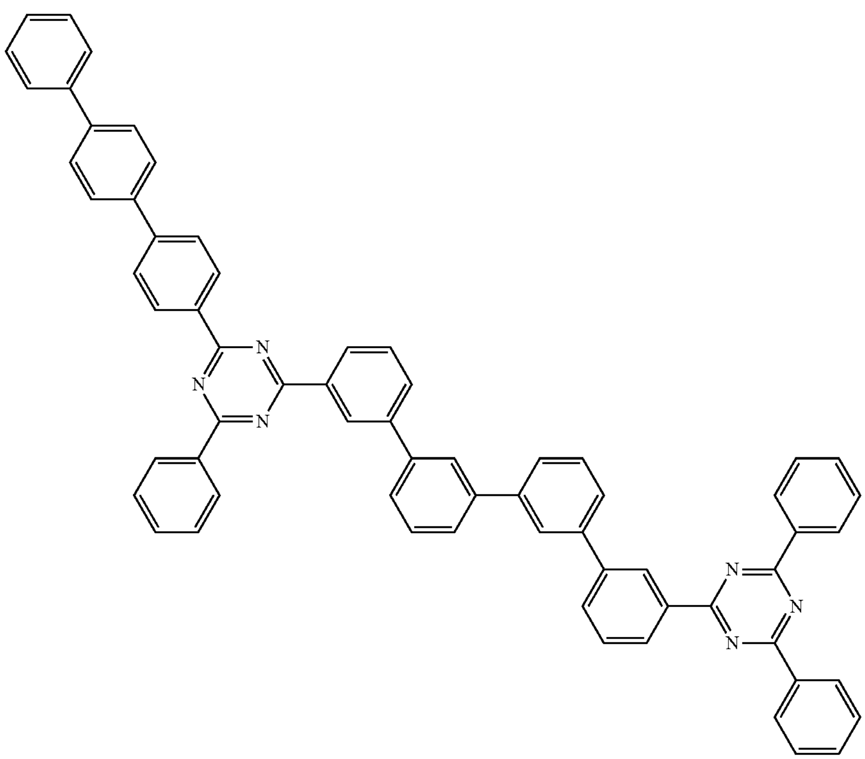

-continued
A(100)
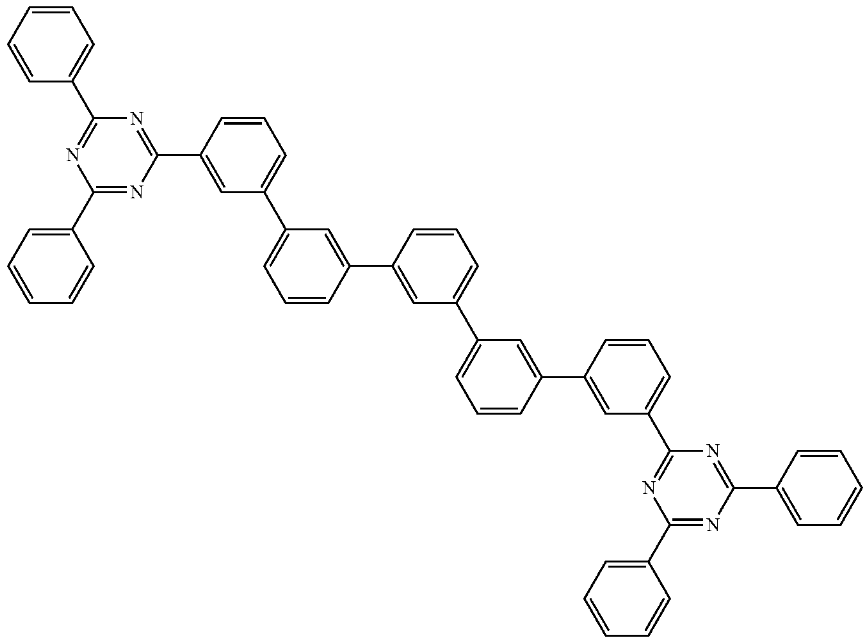
A(101)
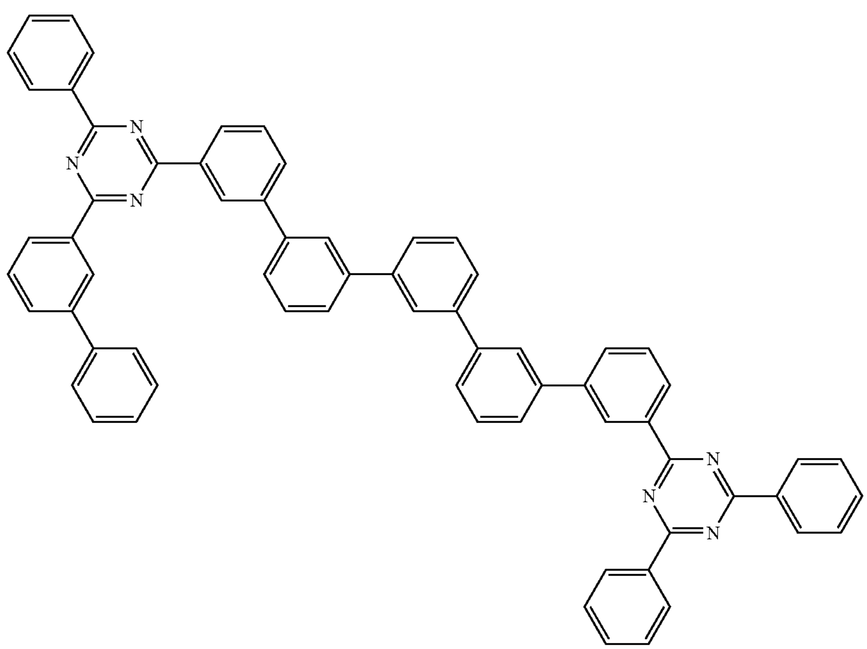

-continued
A(102)
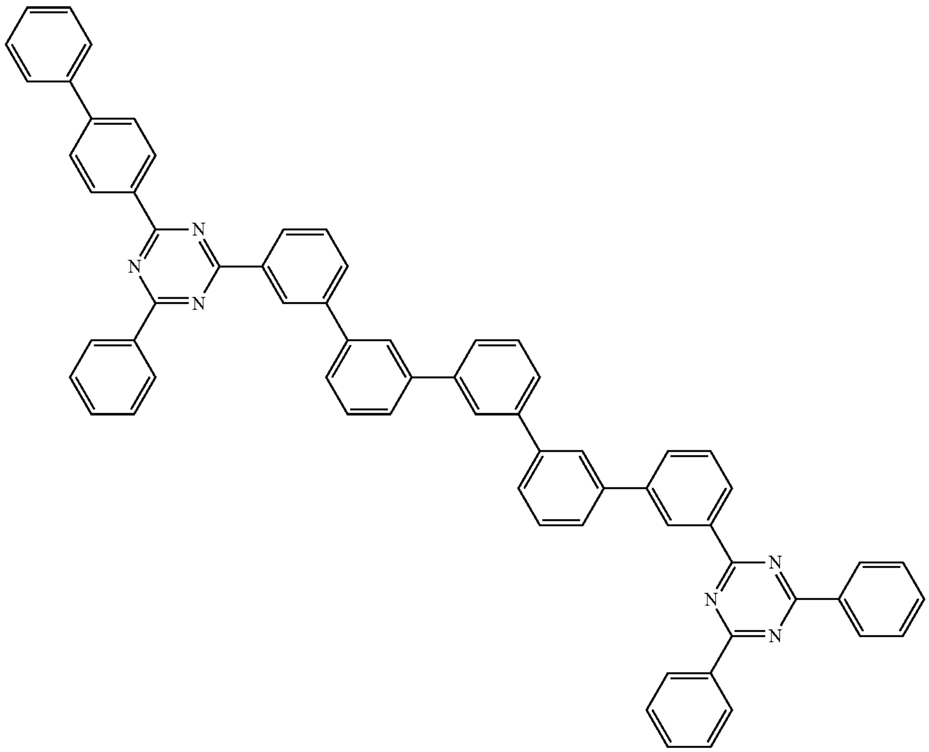
A(103)
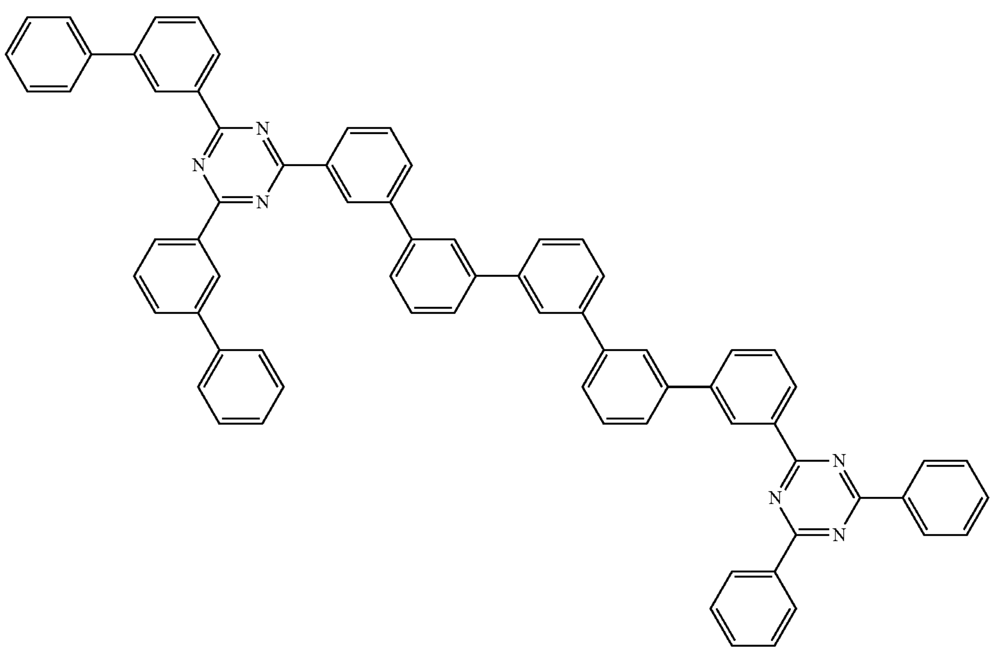

-continued
A(104)
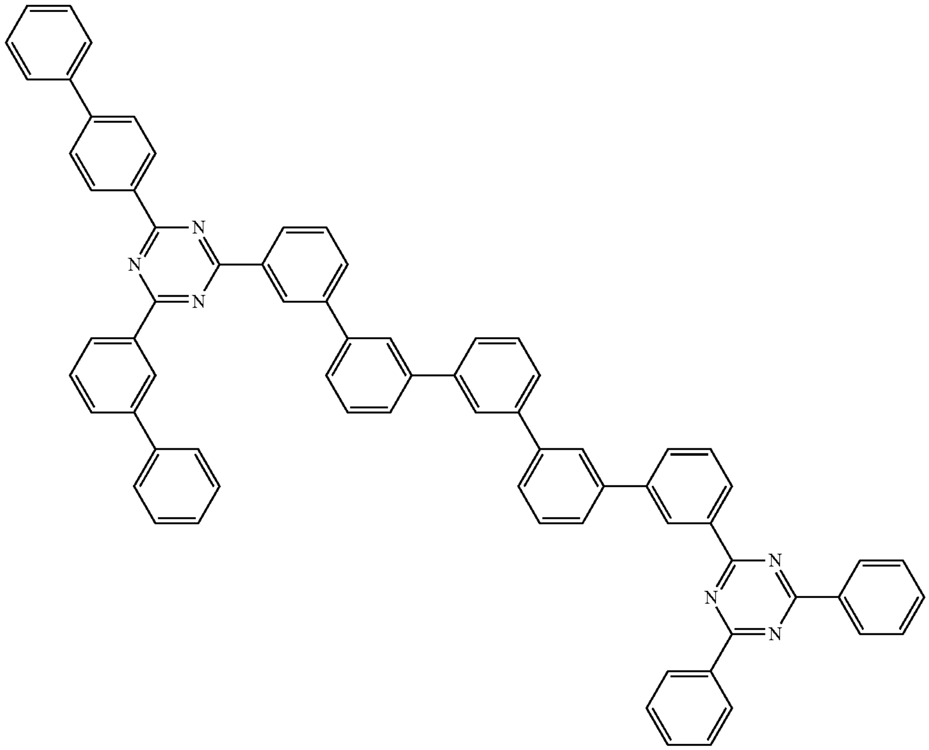
A(105)
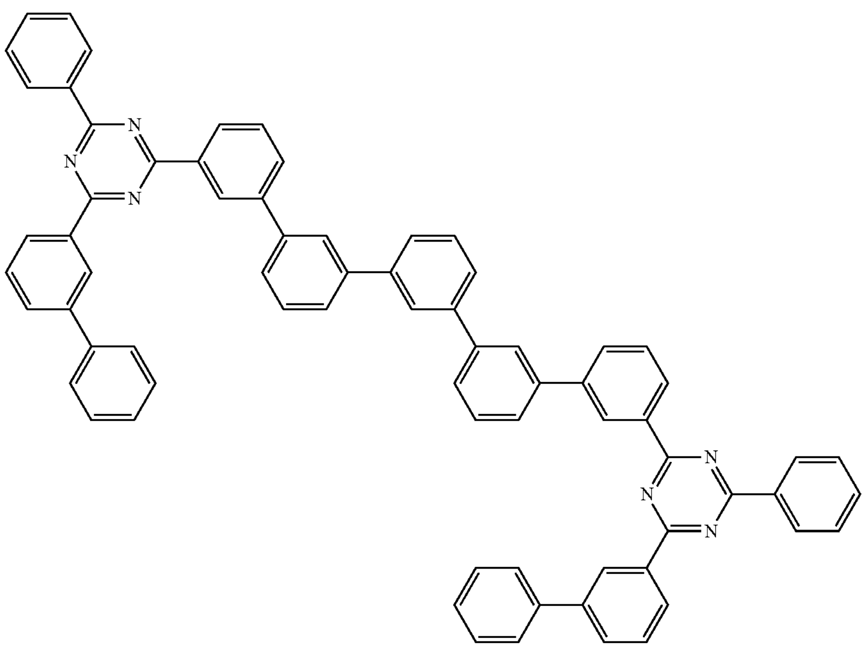

-continued
A(106)
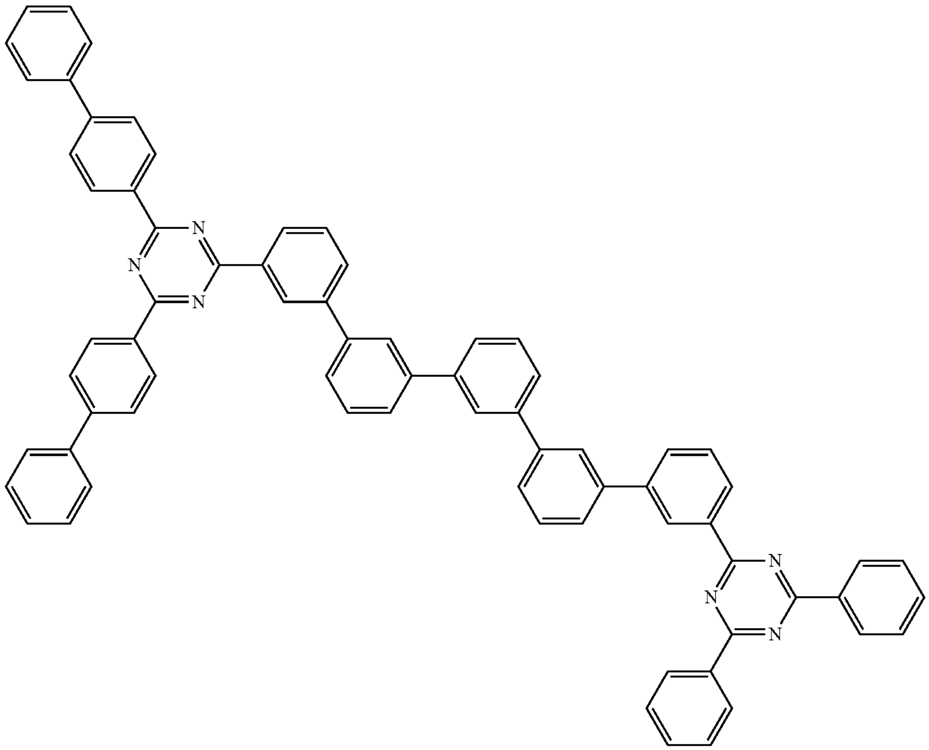
A(107)
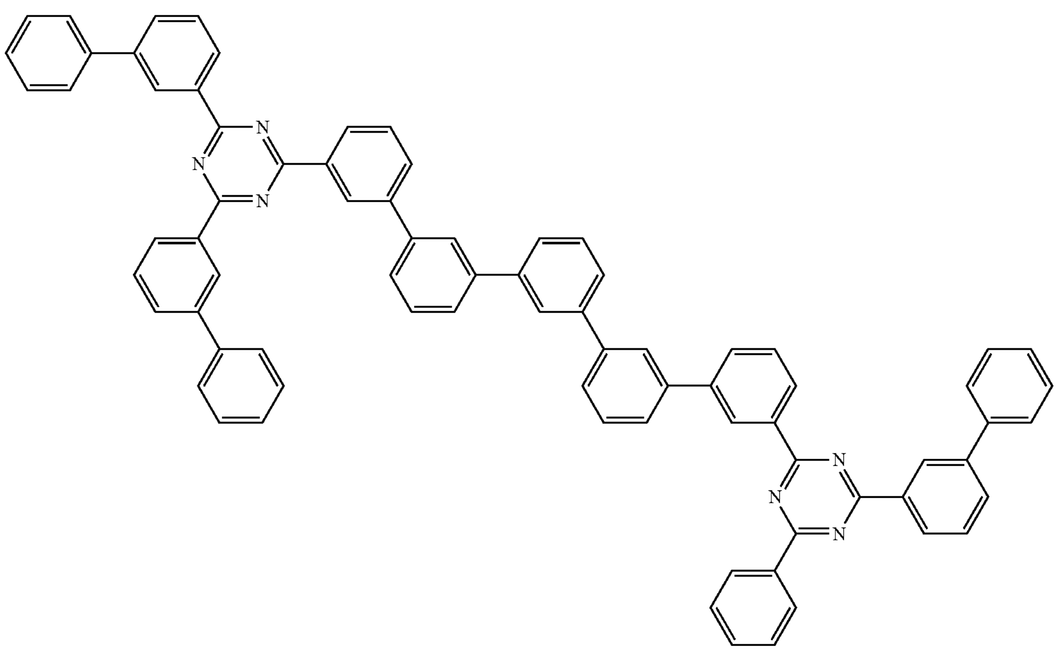

-continued
A(108)
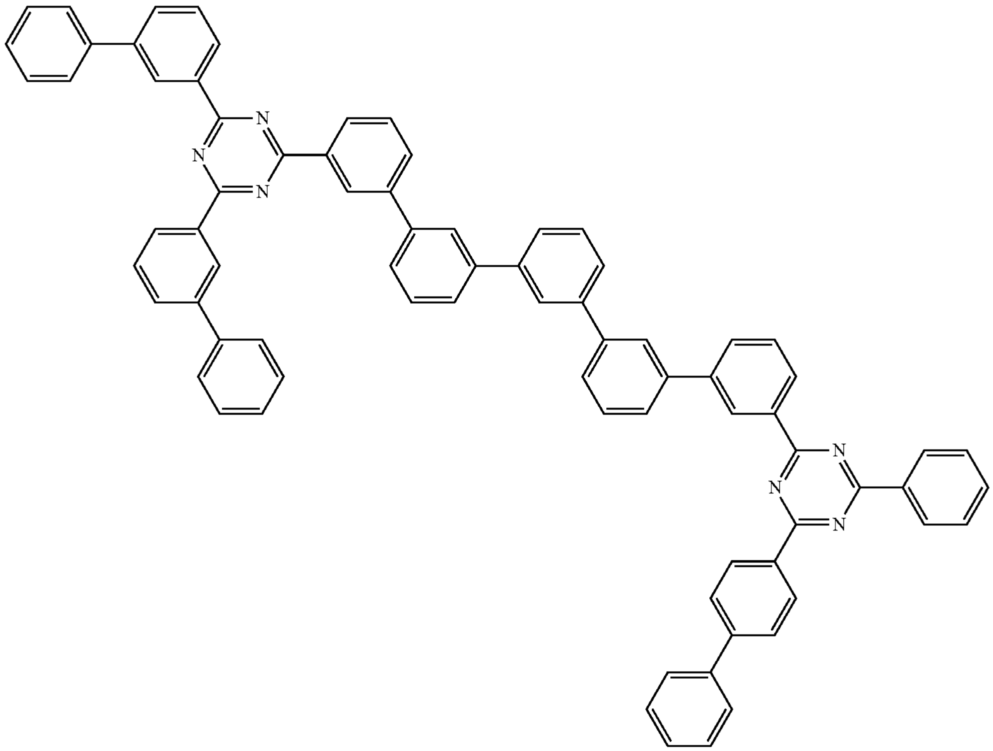
A(109)
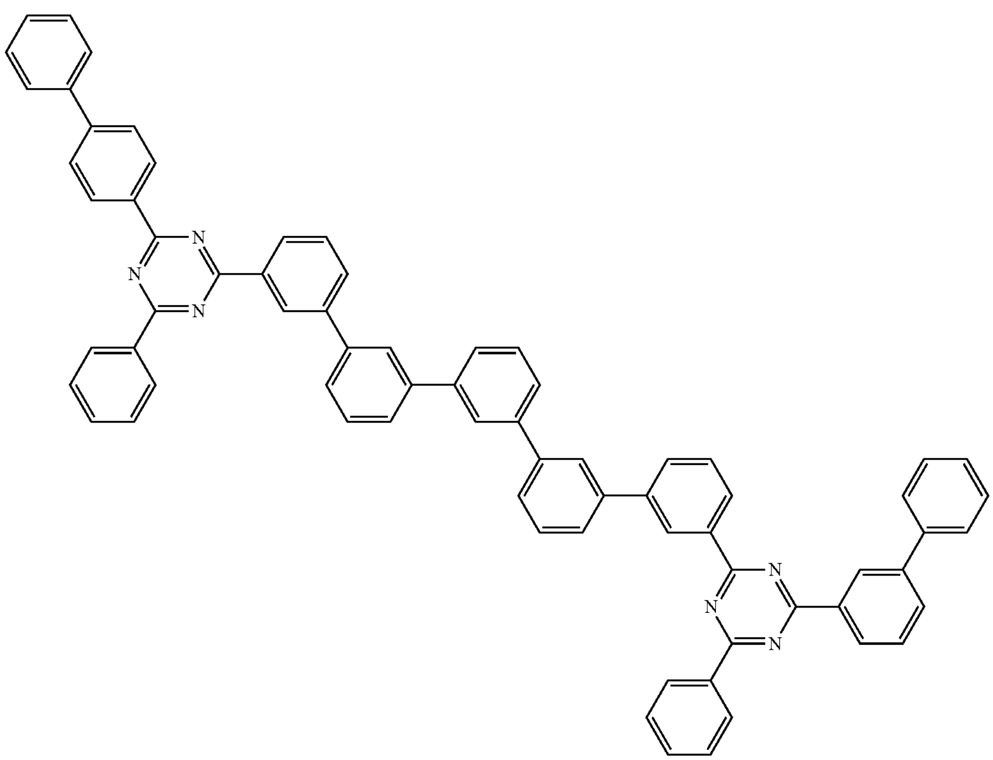

-continued
A(110)
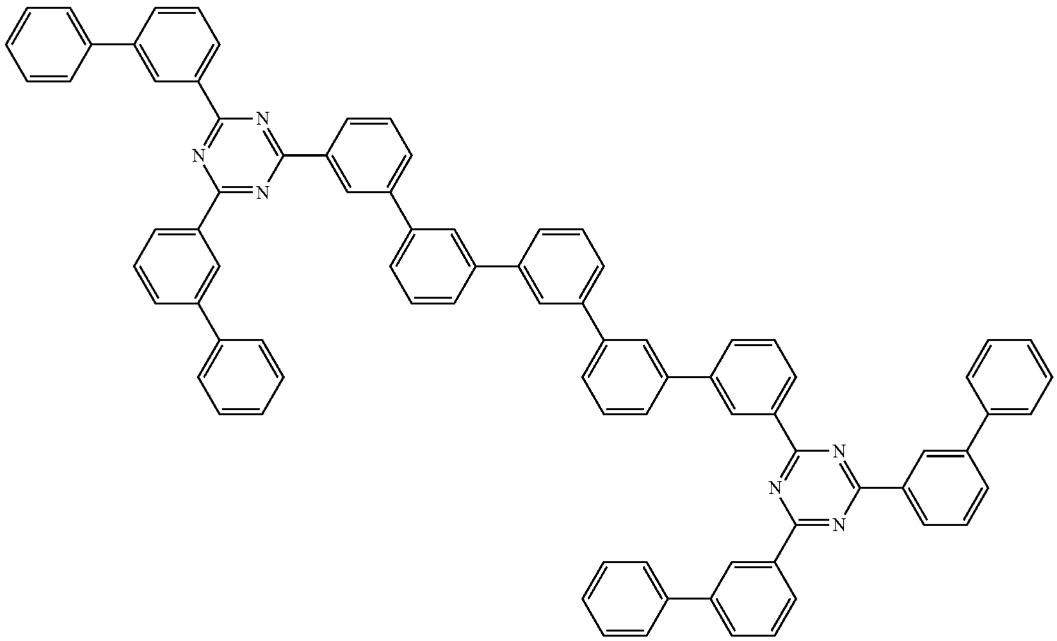
A(111)
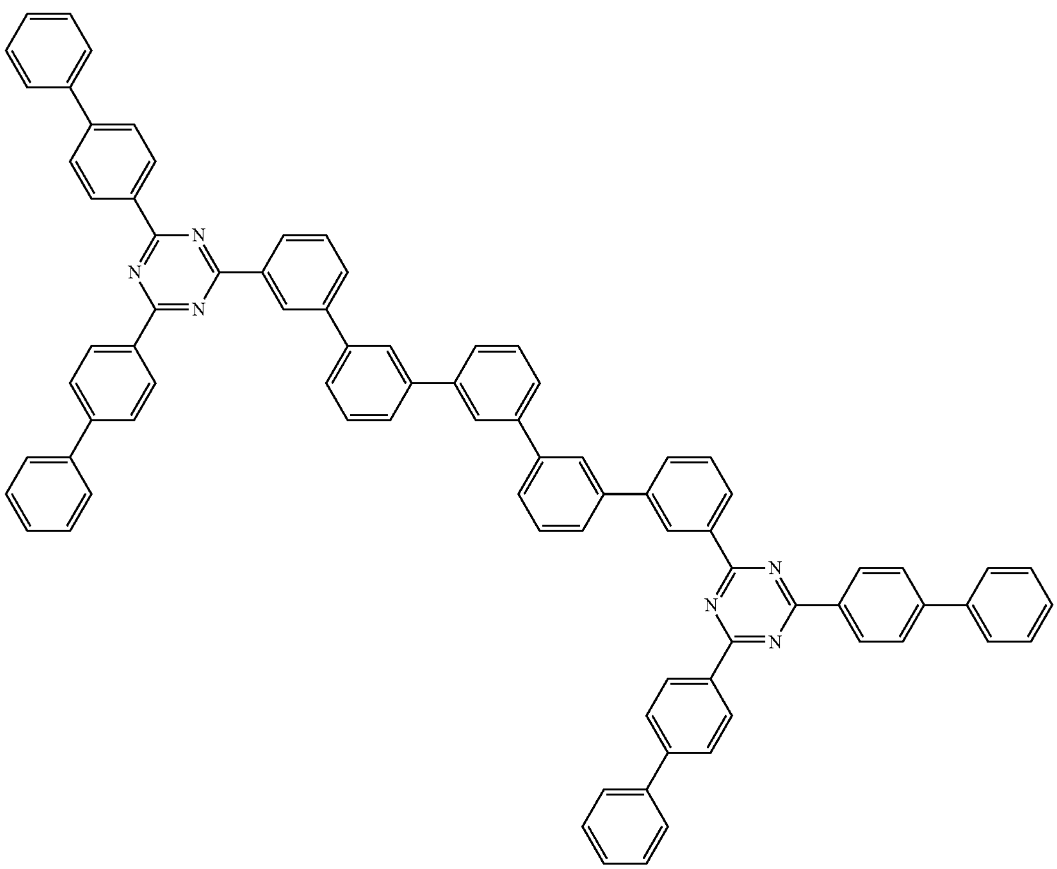

-continued
A(112)
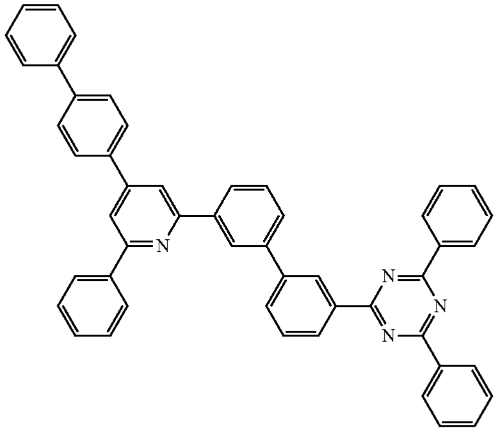
A(113)
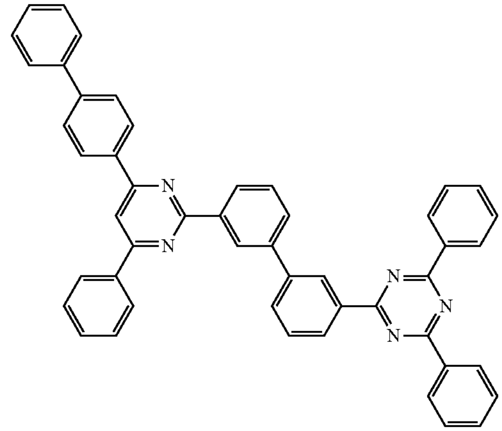
A(114)
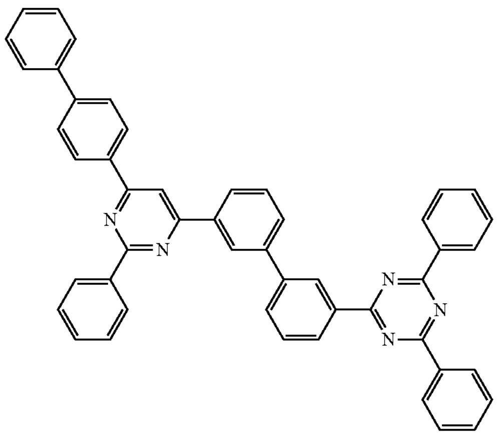
A(115)
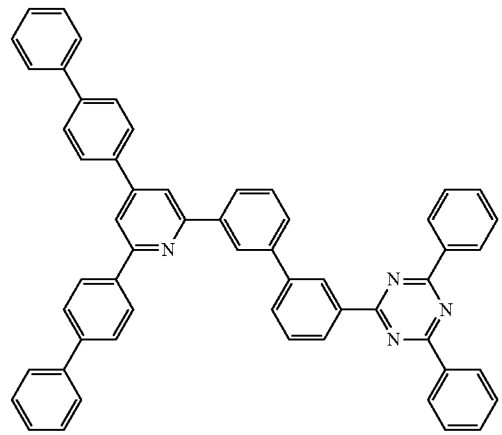
A(116)
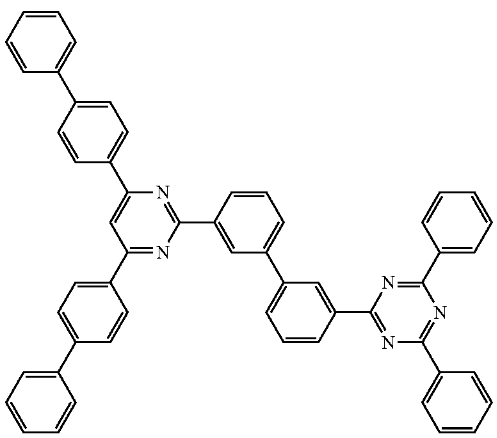
A(117)
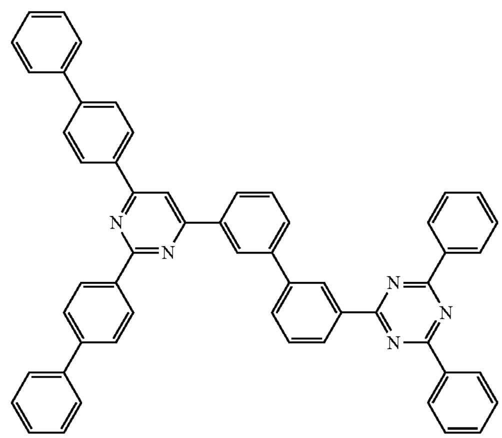
A(118)
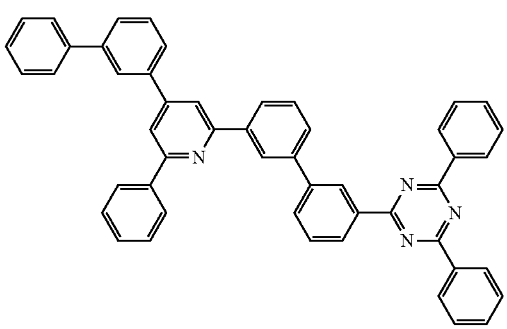
A(119)
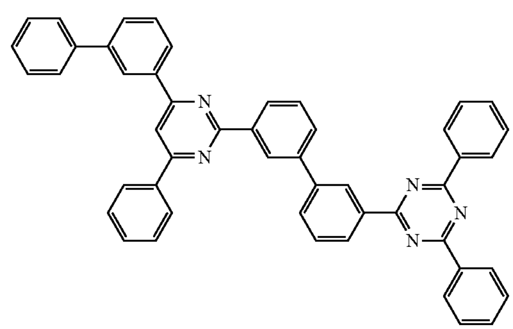

-continued
A(120)
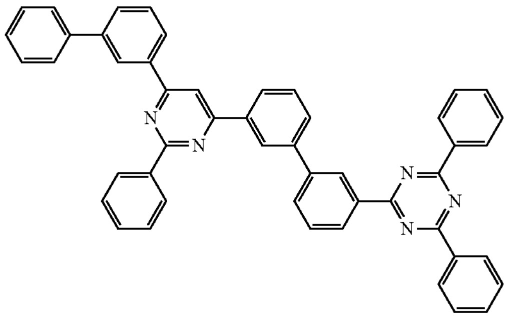
A(121)
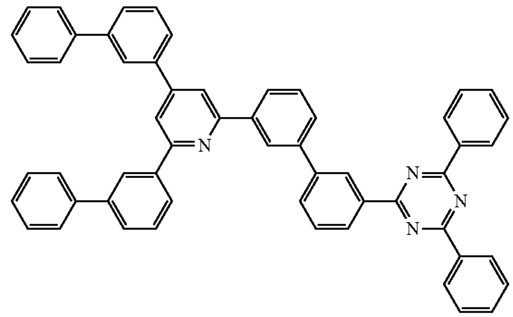
A(122)
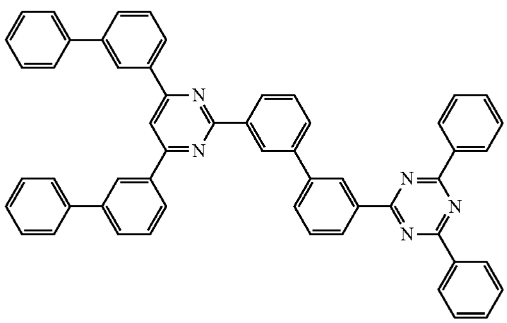
A(123)
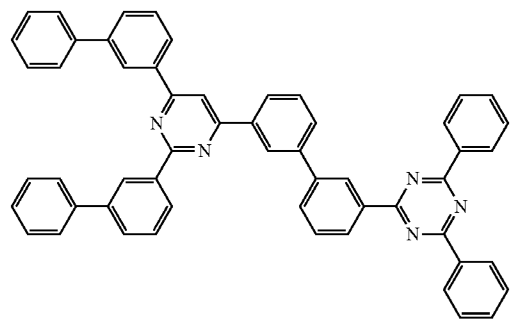
A(124)
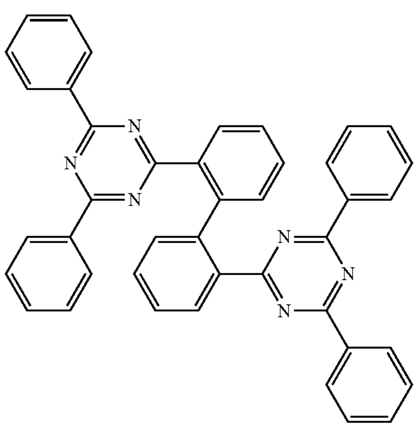
A(125)
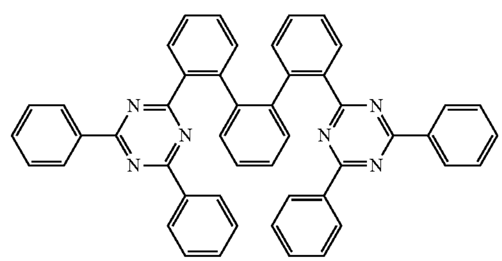
A(126)
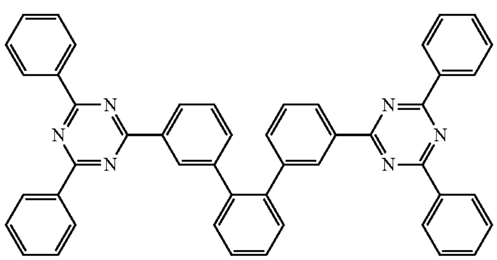
A(127)
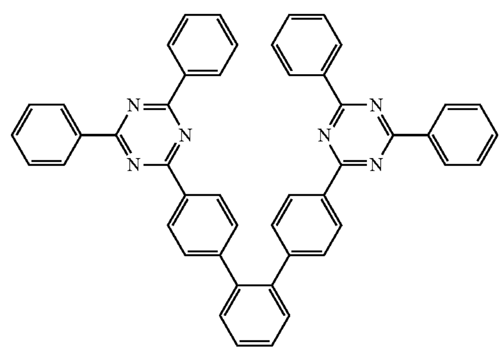

-continued
A(128)
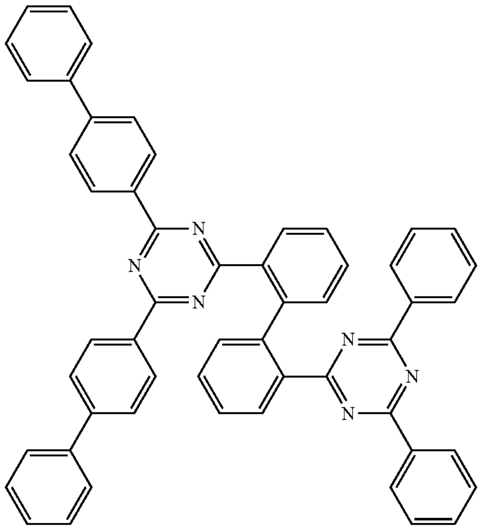
A(129)
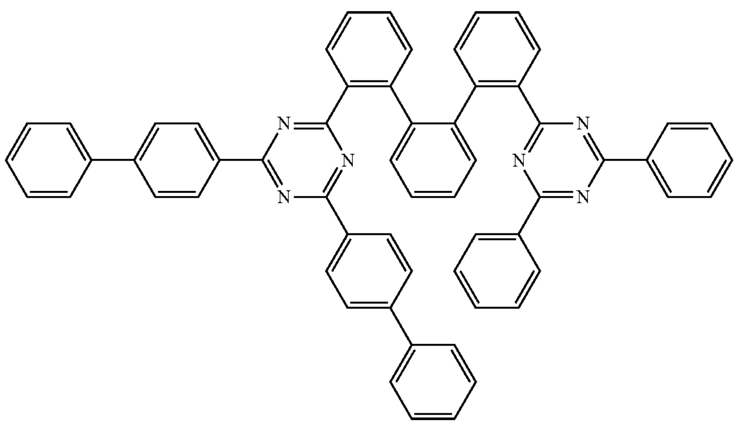
A(130)
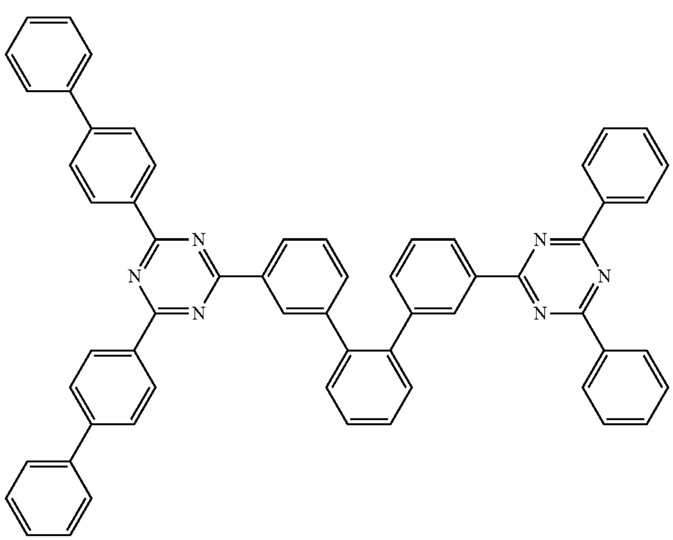

-continued
A(131)
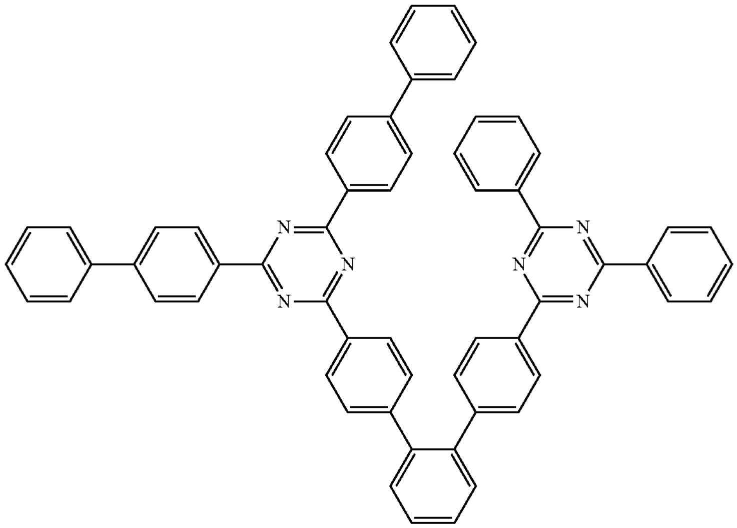
A(132)
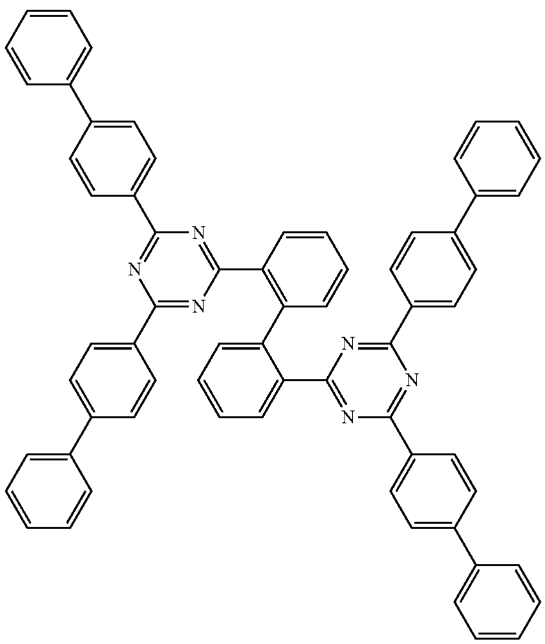
A(133)
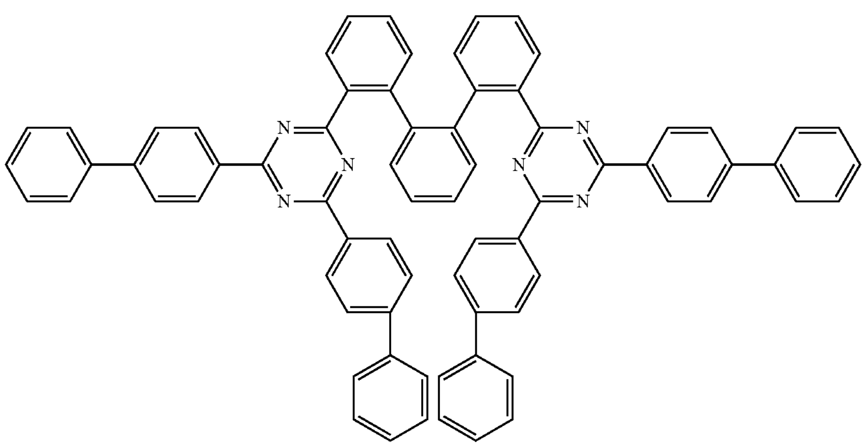

-continued
A(134)
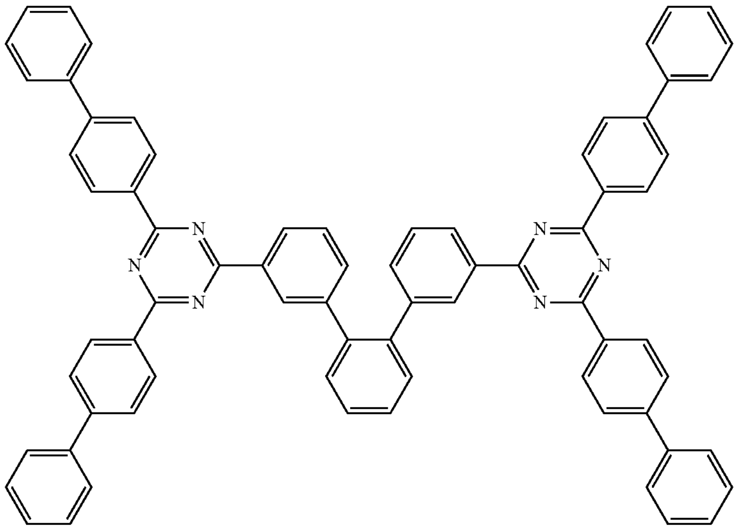
A(135)
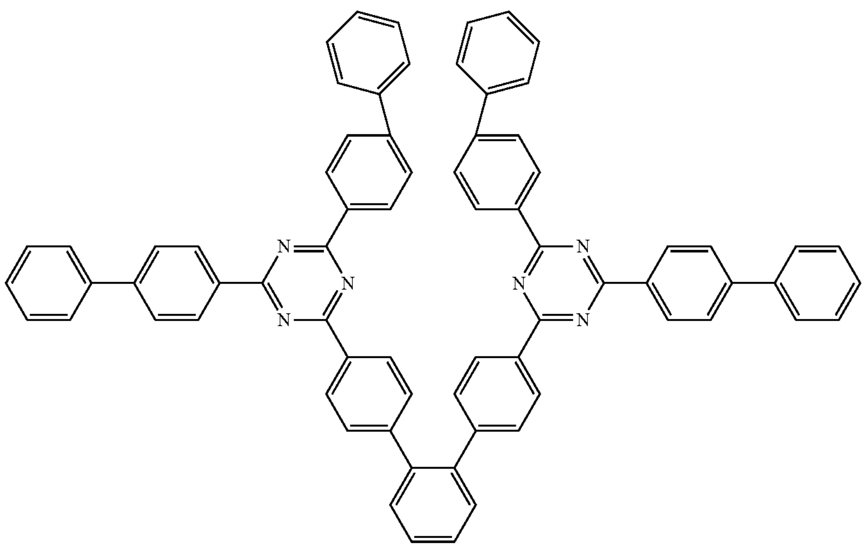
A(136)
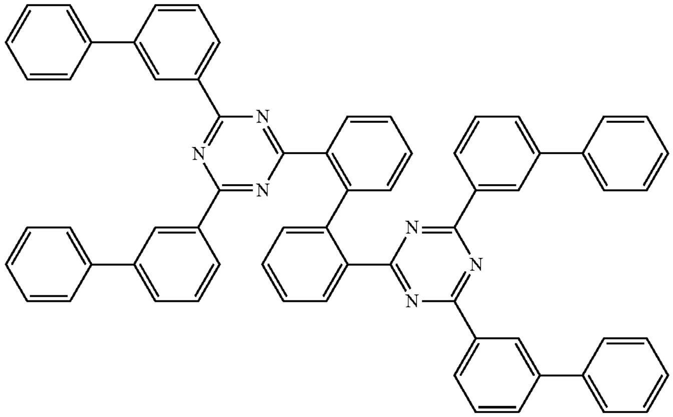

-continued
A(137)
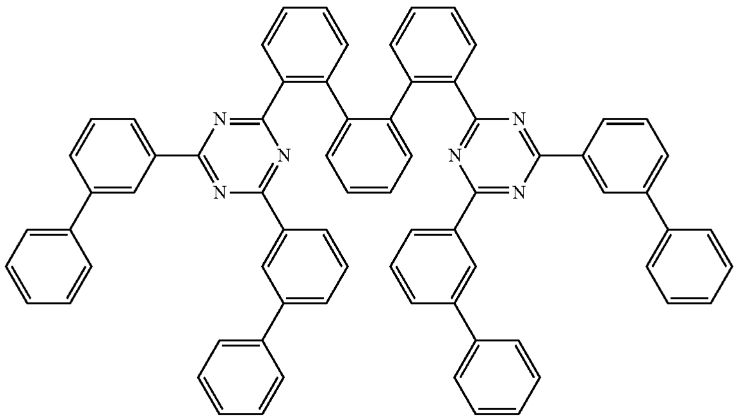
A(138)
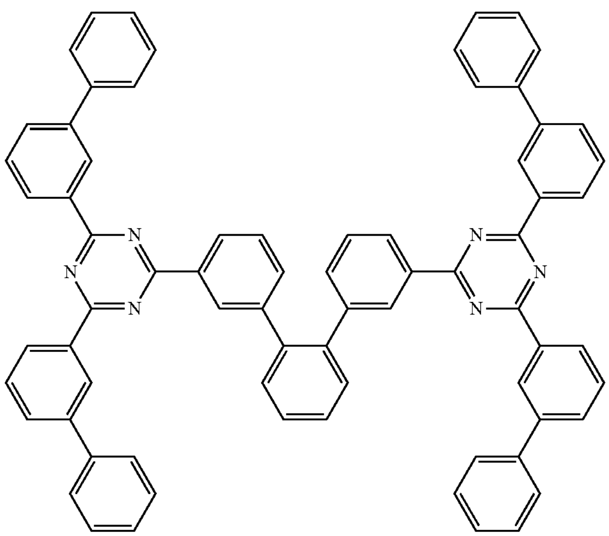
A(139)
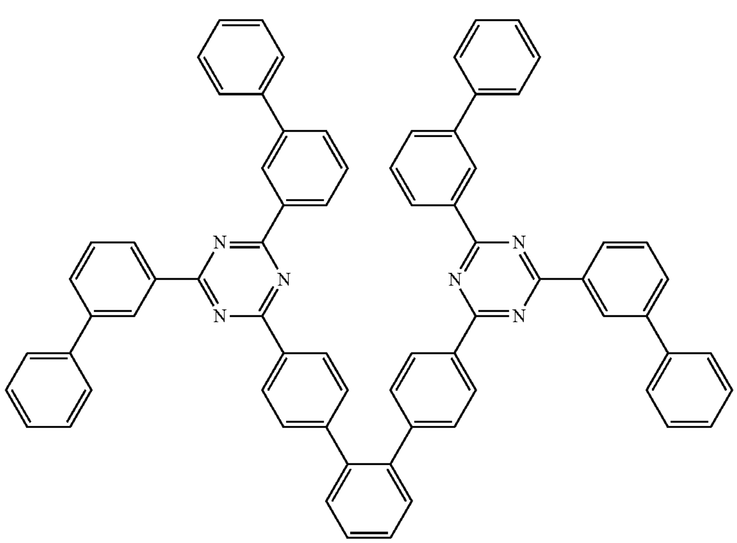

-continued
A(140)
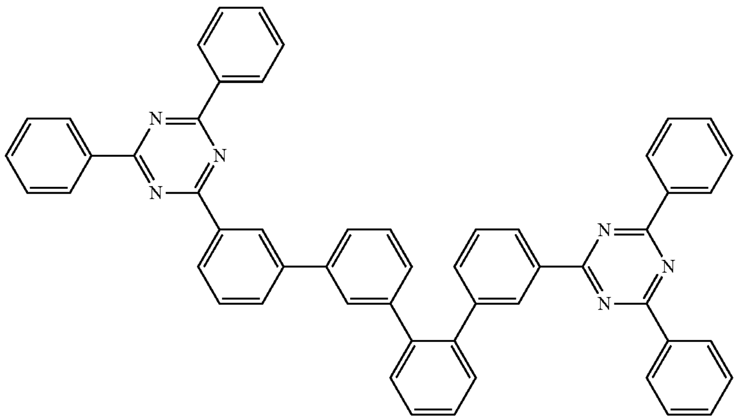
A(141)
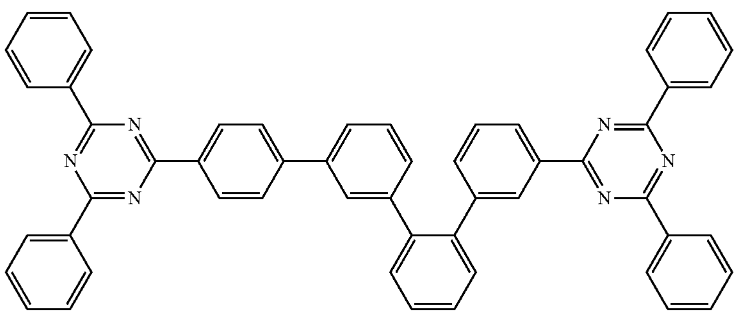
A(142)
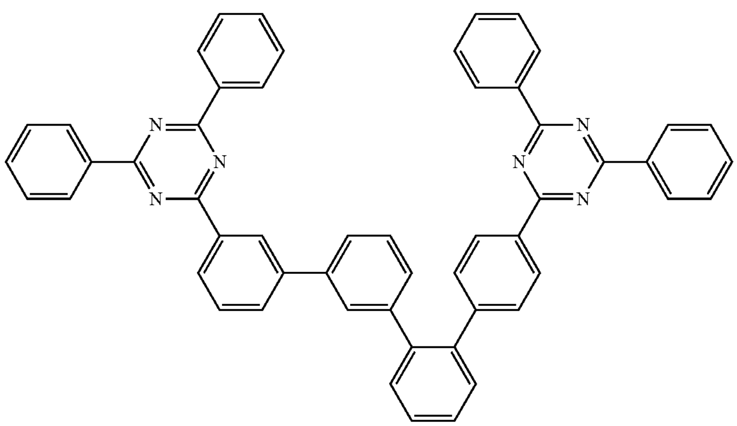
A(143)
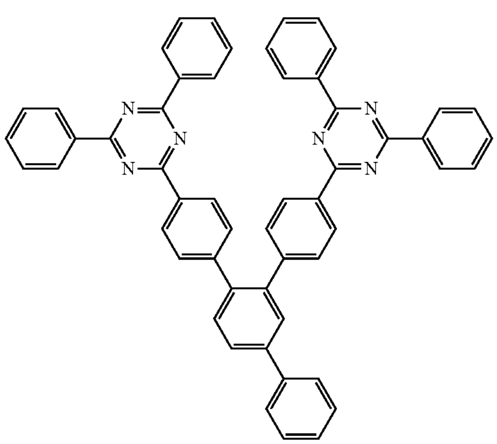
A(144)
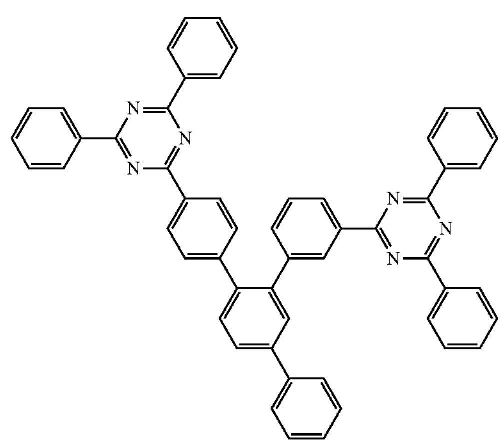

-continued
A(145)
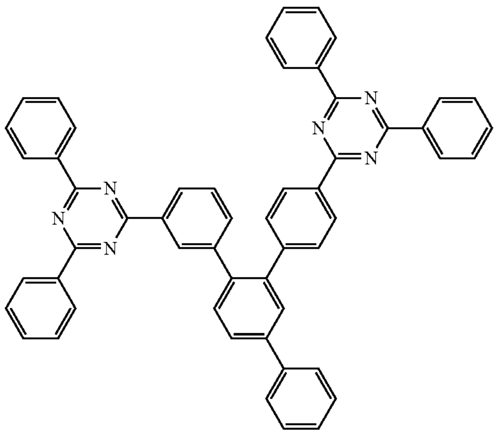
A(146)
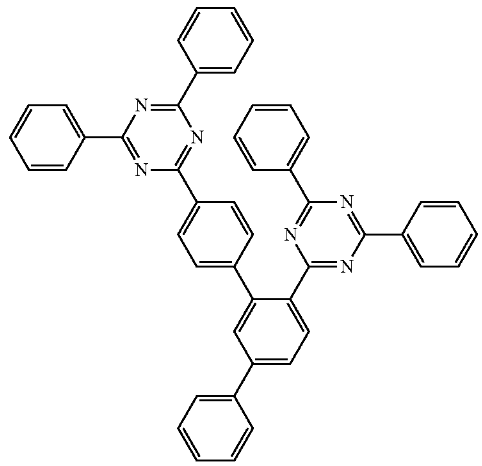
A(147)
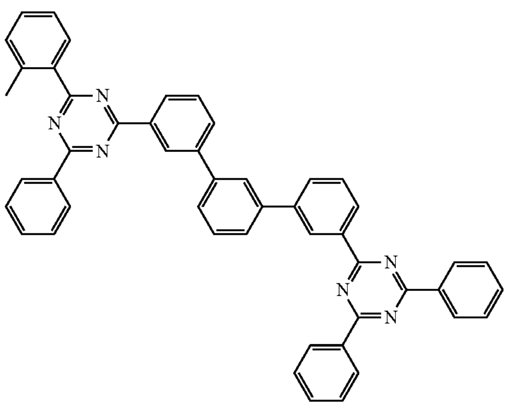
A(148)
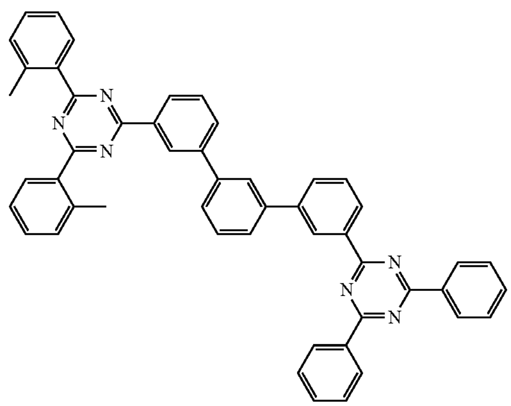
A(149)
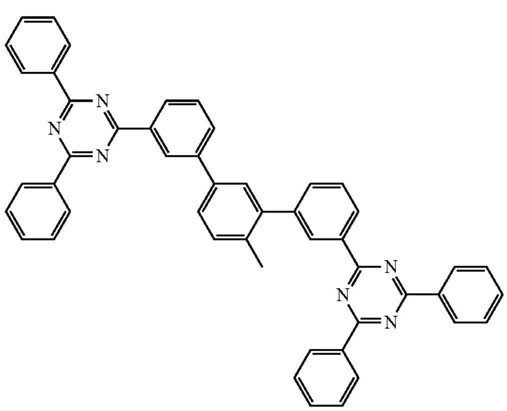
A(150)
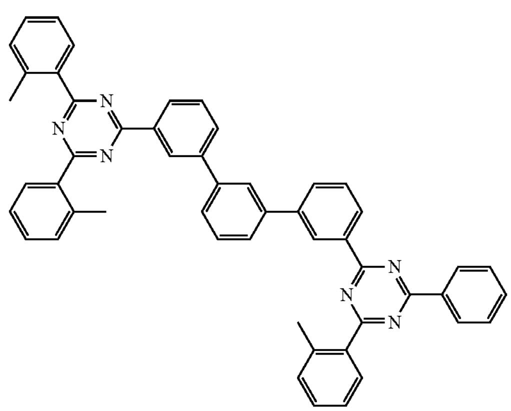

-continued
A(151)
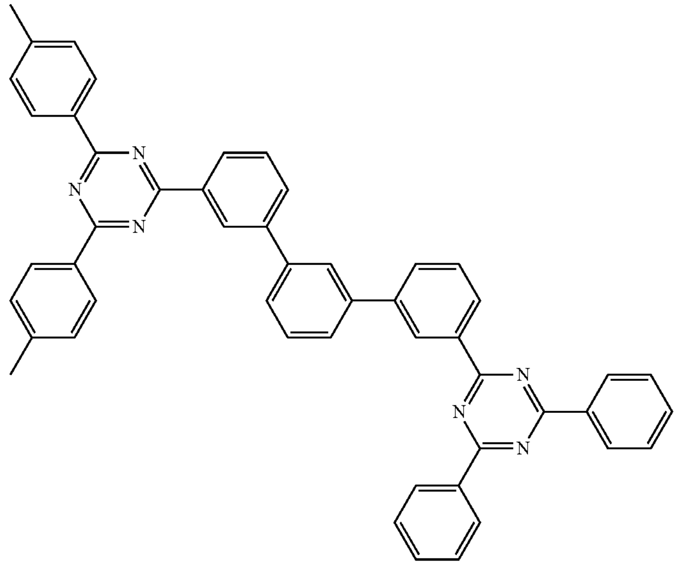
A(152)
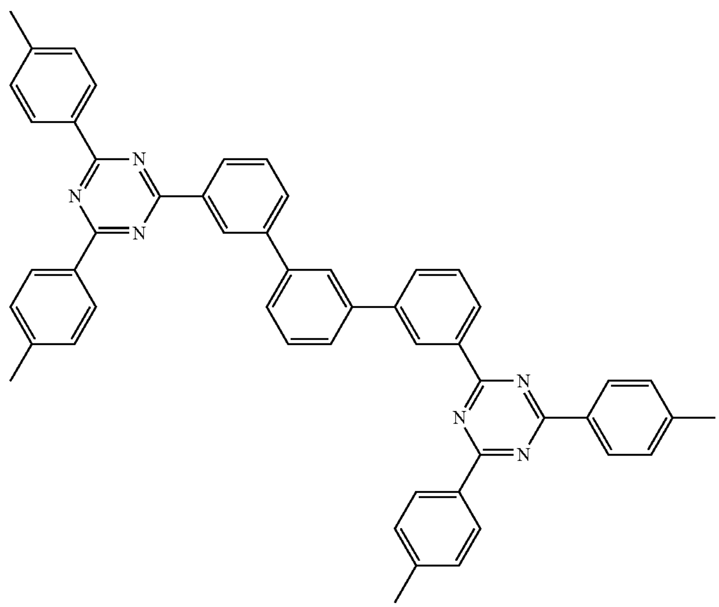
A(153)
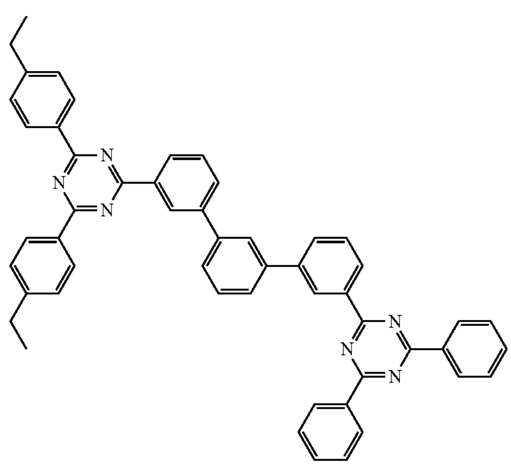
A(154)
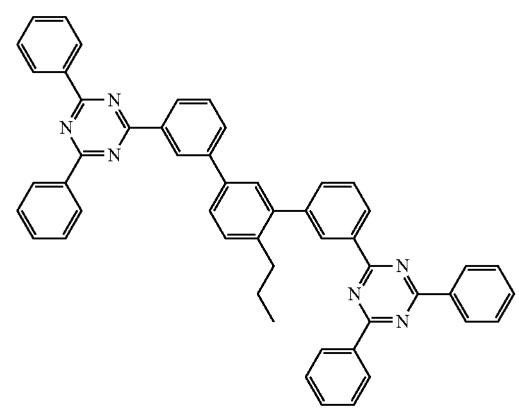

-continued
Group HE2
1
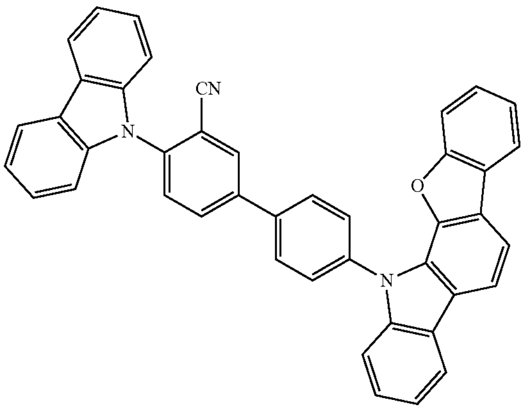
2
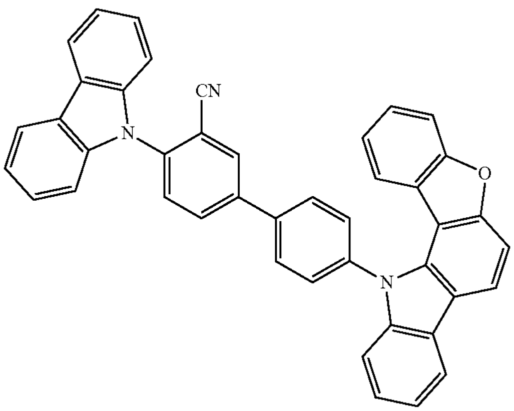
3
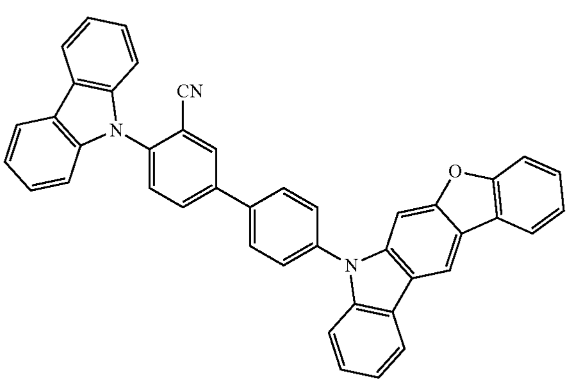
4
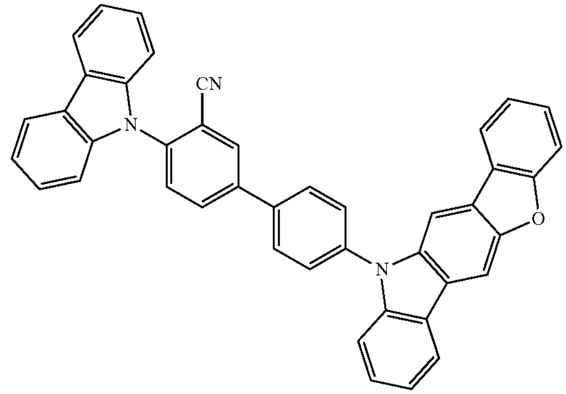
5
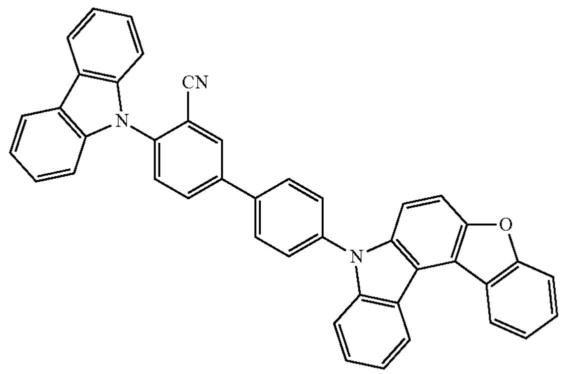
6
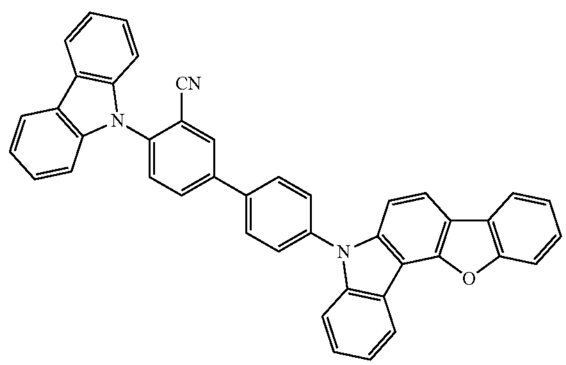
7
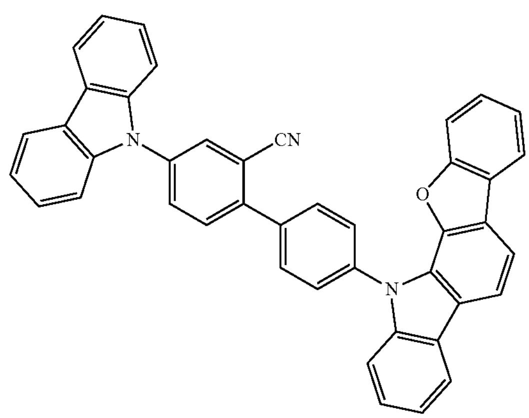

8
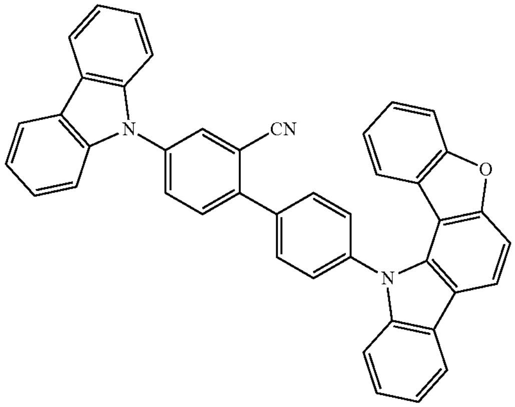
9
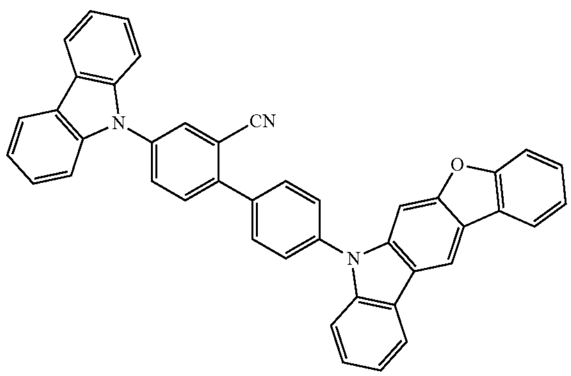
10
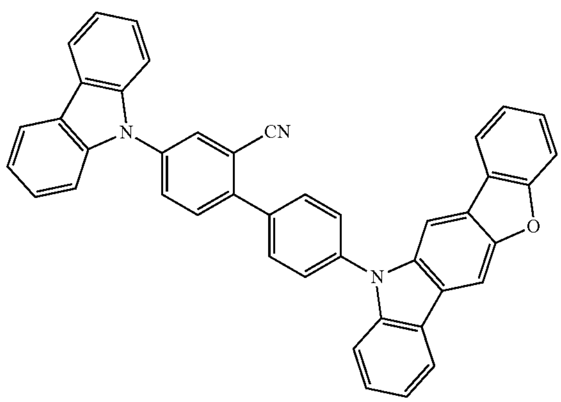
11
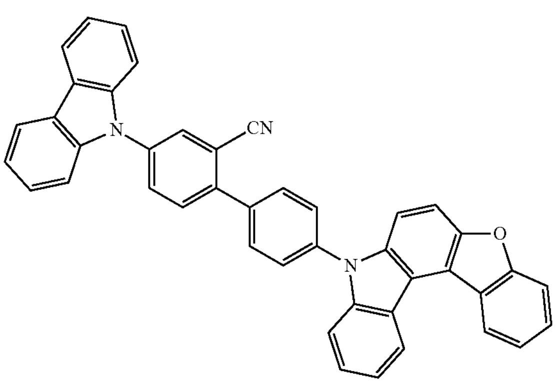
12
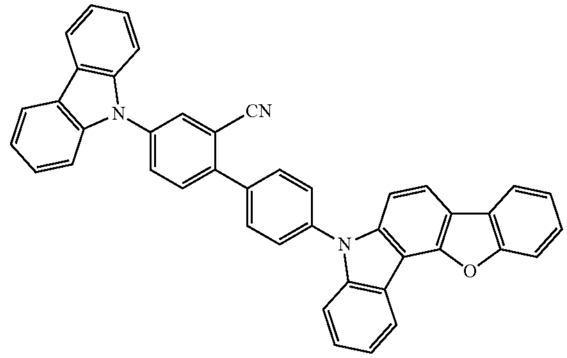
13
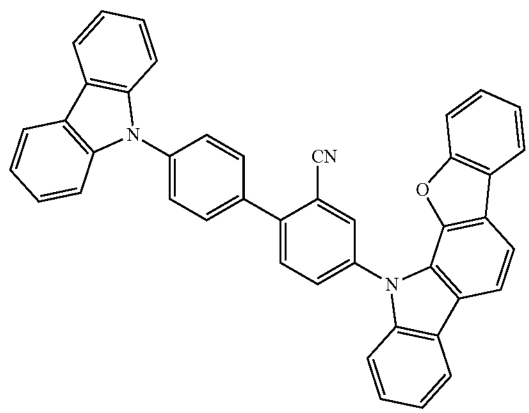
14
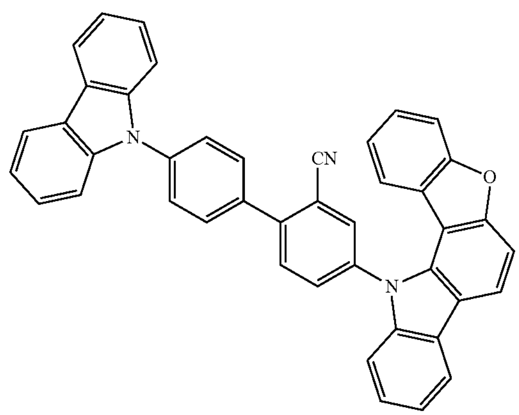
15
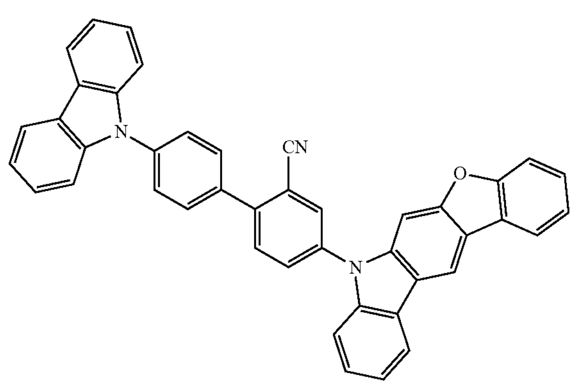

-continued
16
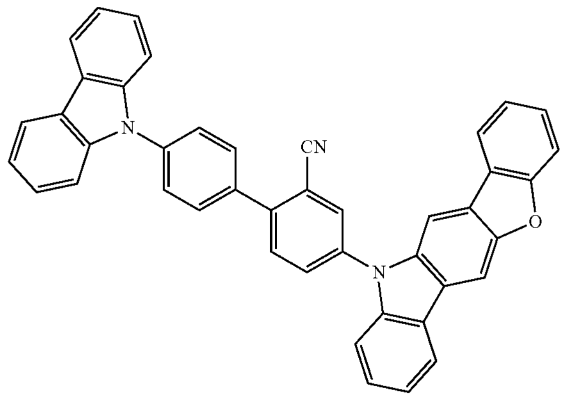
17
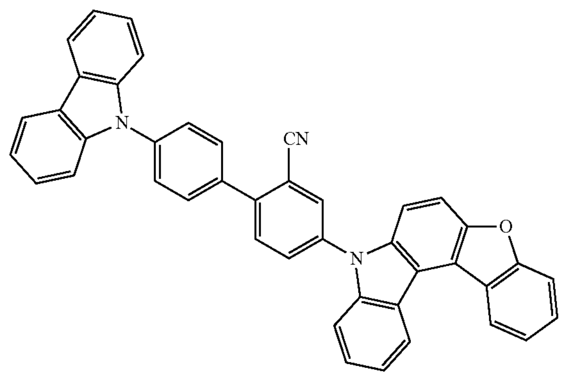
18
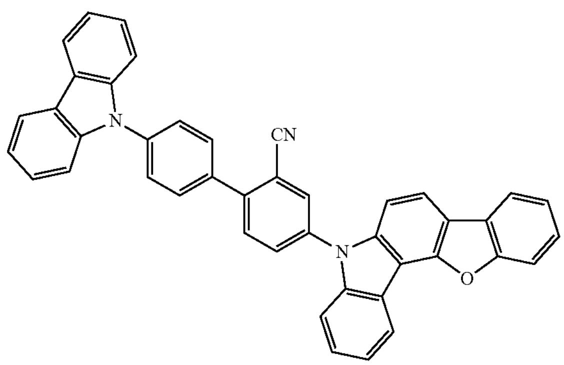
19
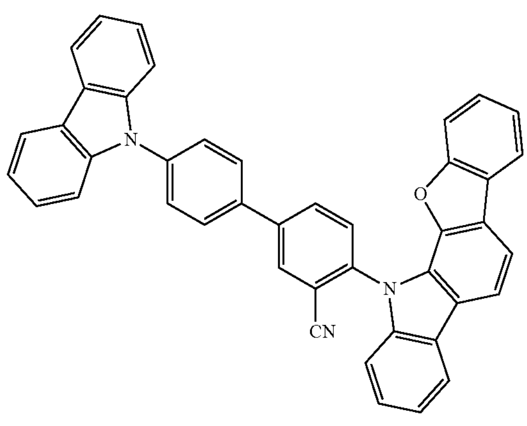
-continued
20
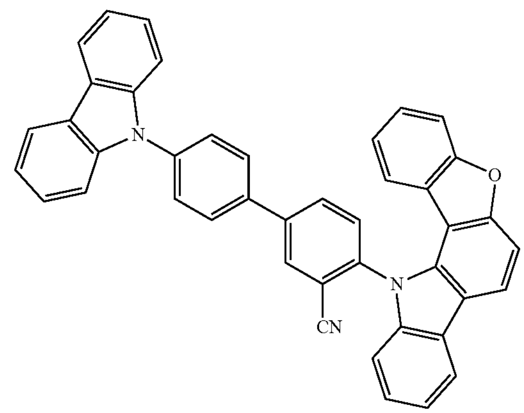
21
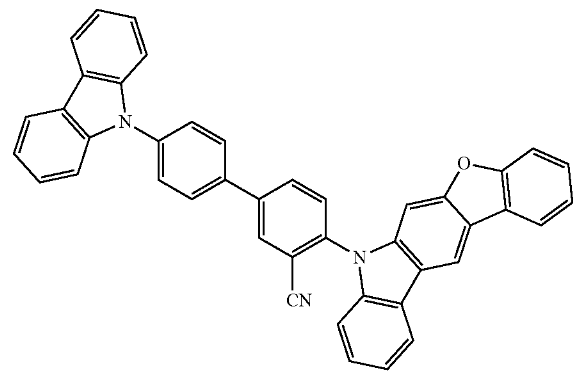
22
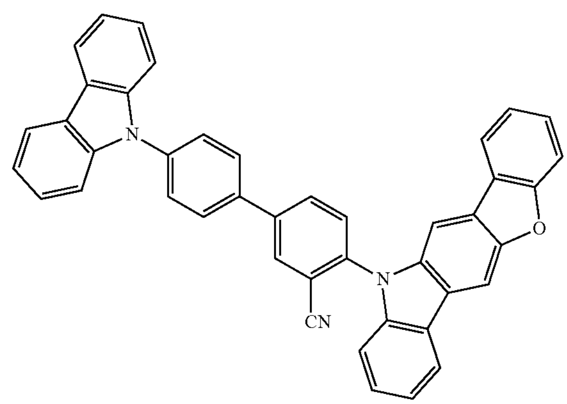
23
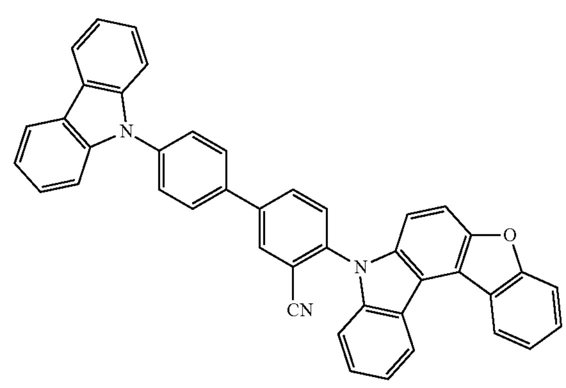

24
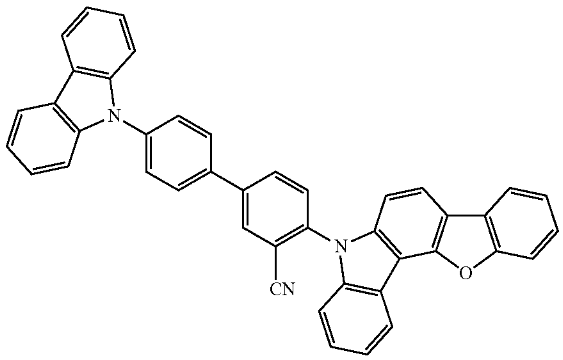
25
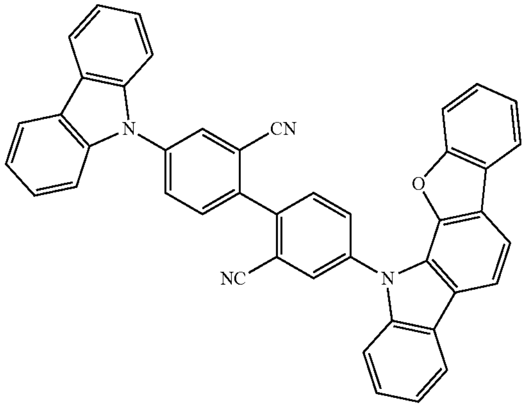
26
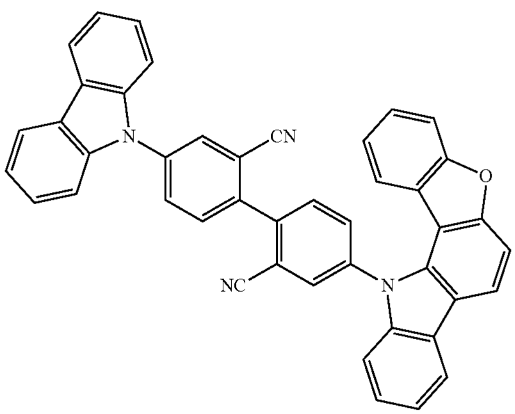
27
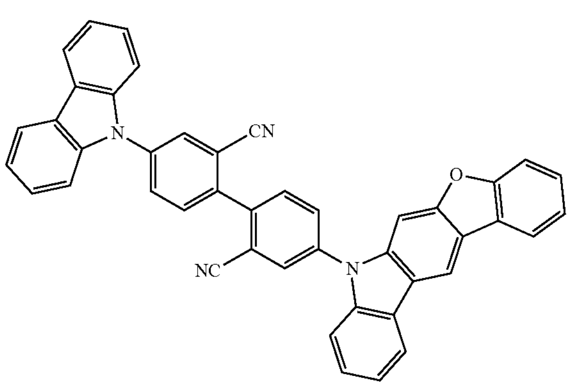
28
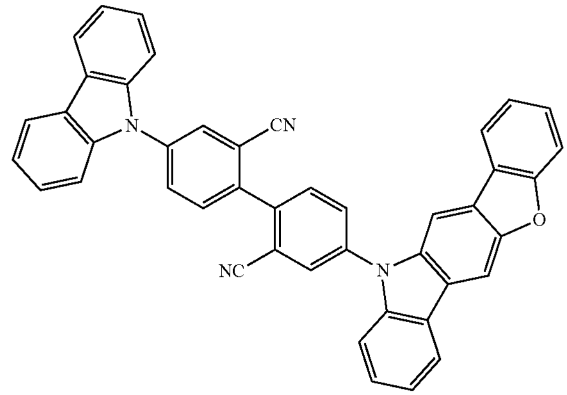
29
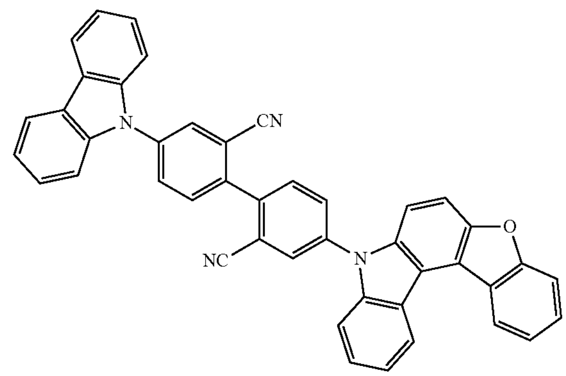
30
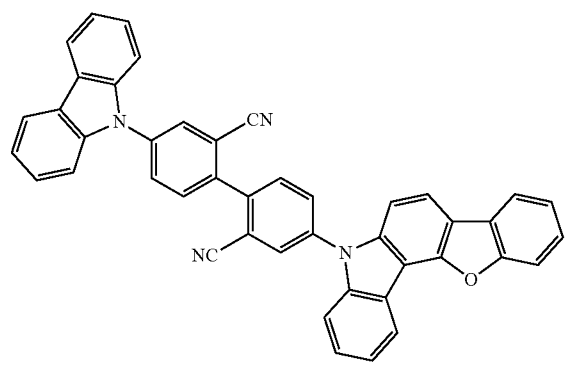
31
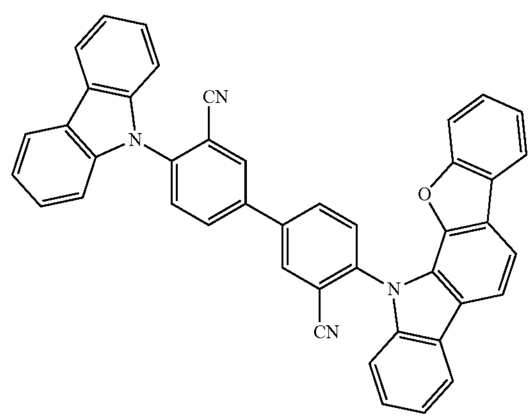

32
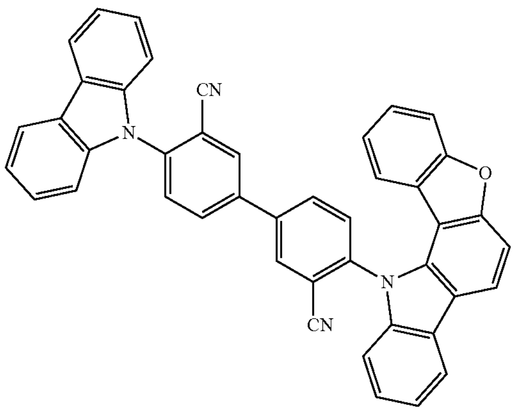
33
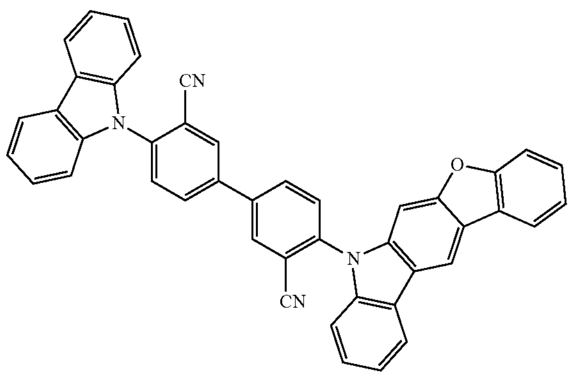
34
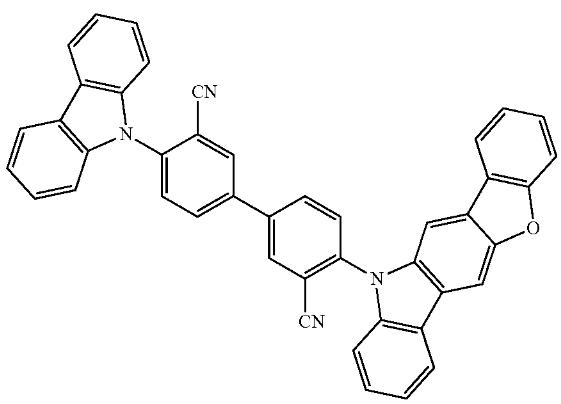
35
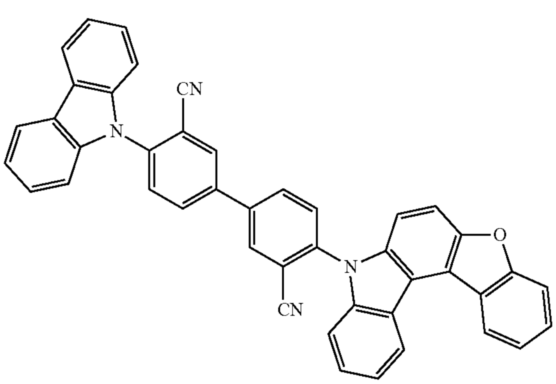
36
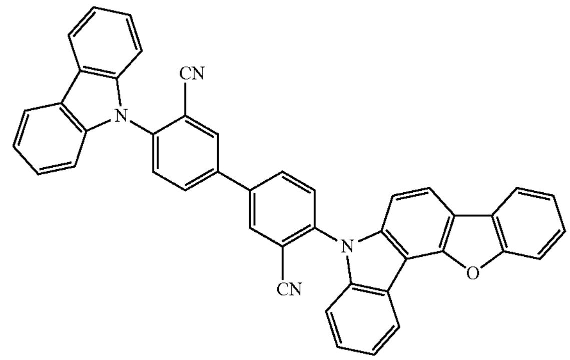
37
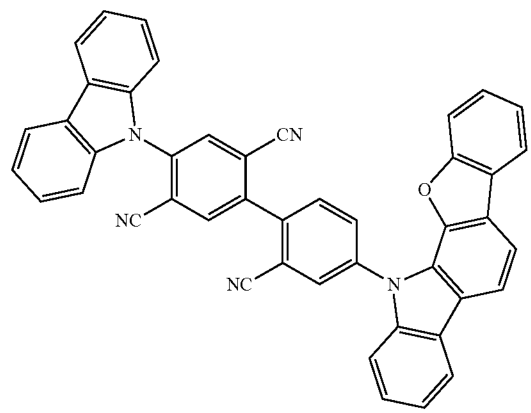
38
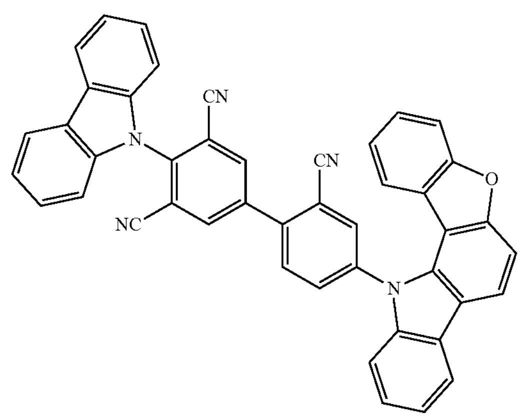
39
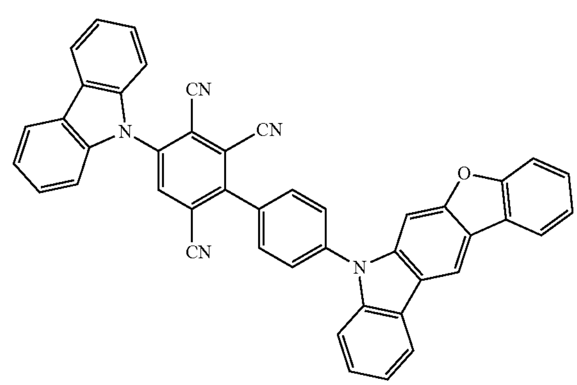

-continued
40
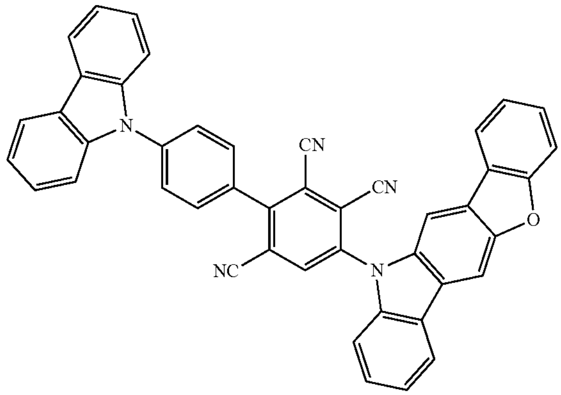
41
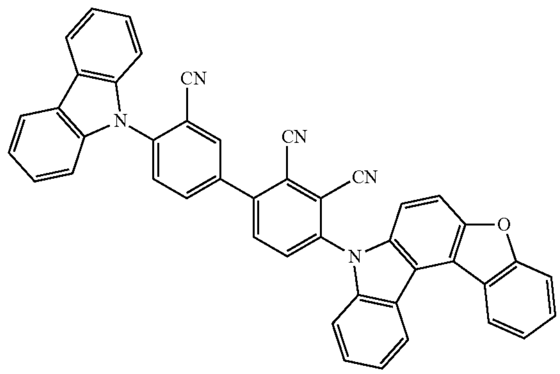
42
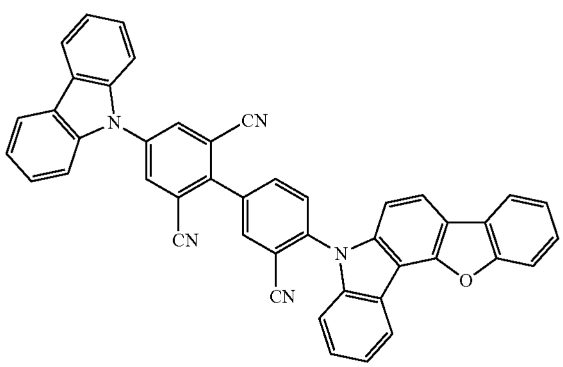
43
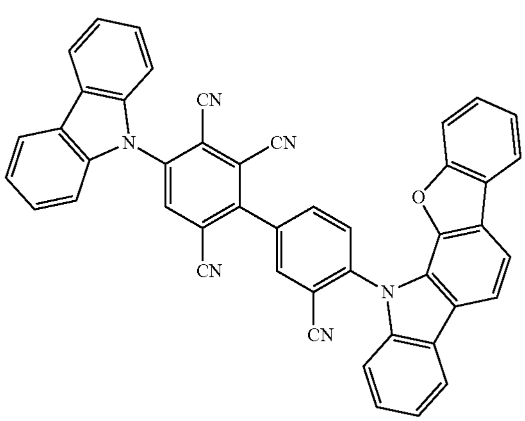
-continued
44
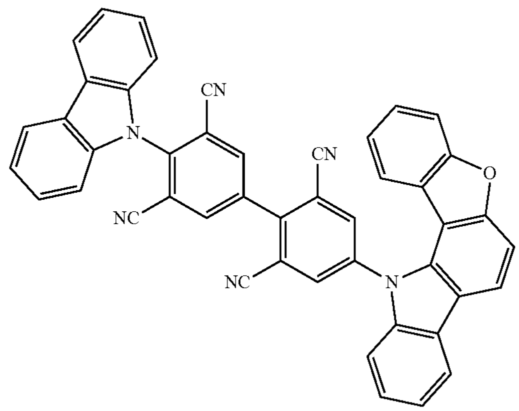
45
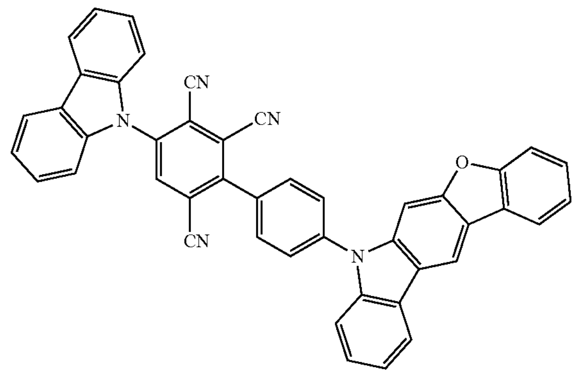
46
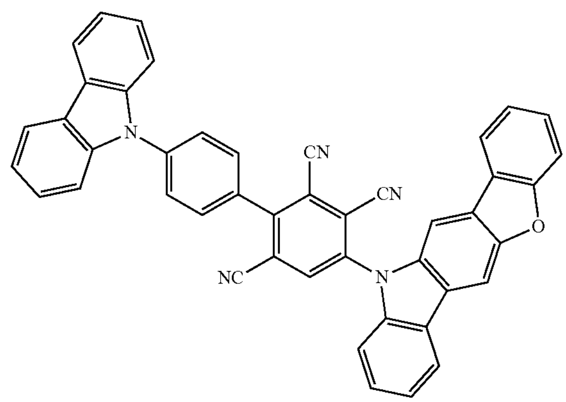
47
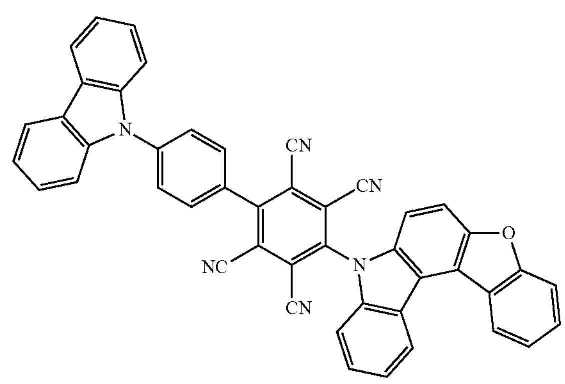

-continued
48
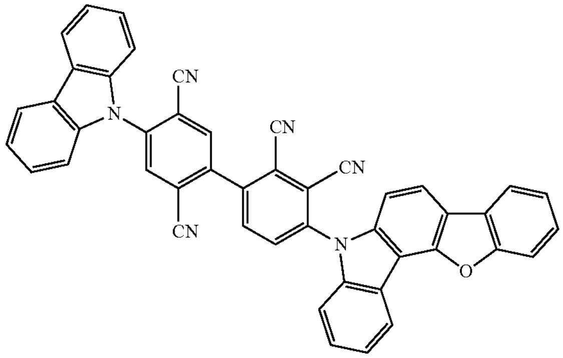
49
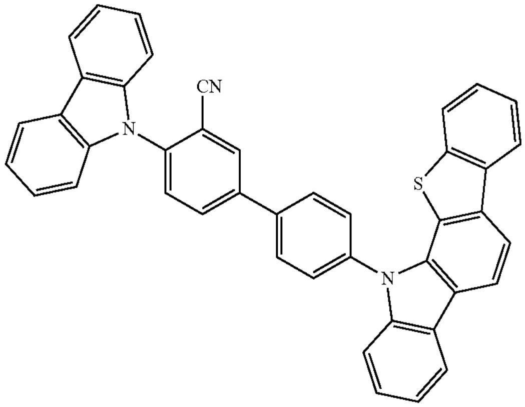
50
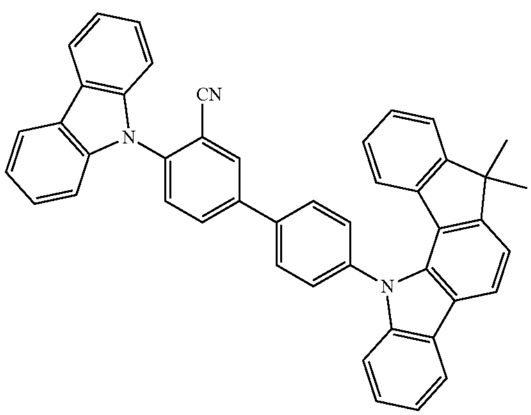
51
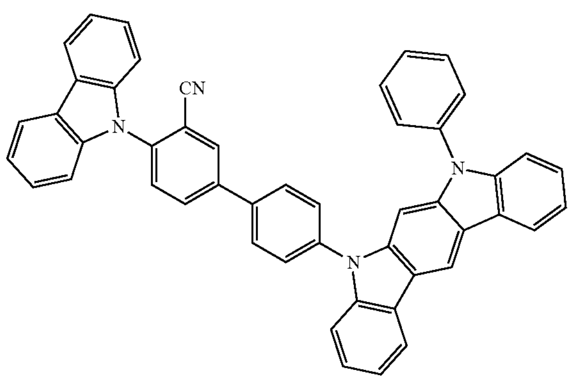
-continued
52
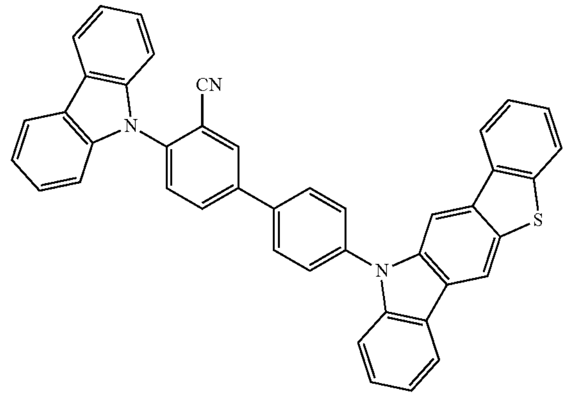
53
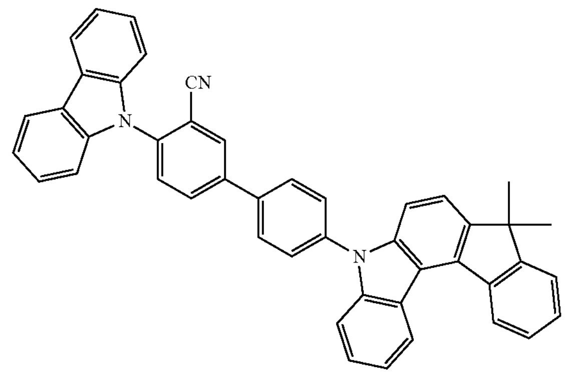
54
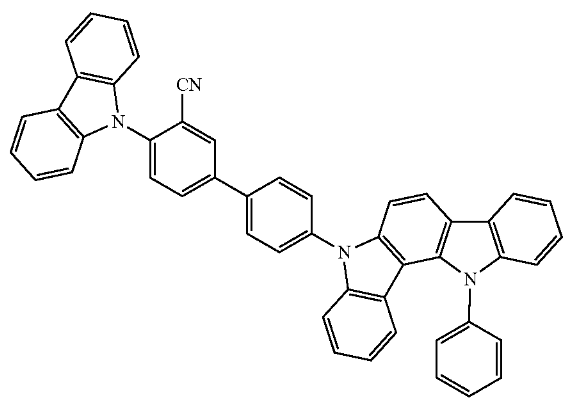
55
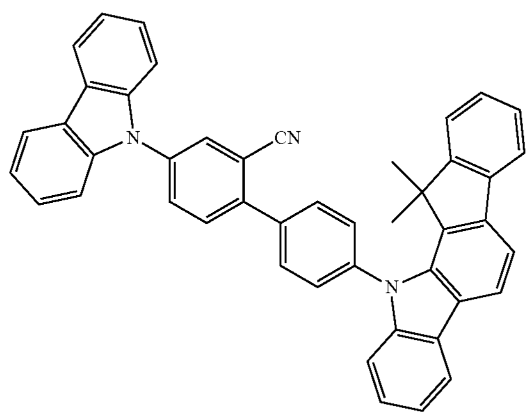

-continued
56
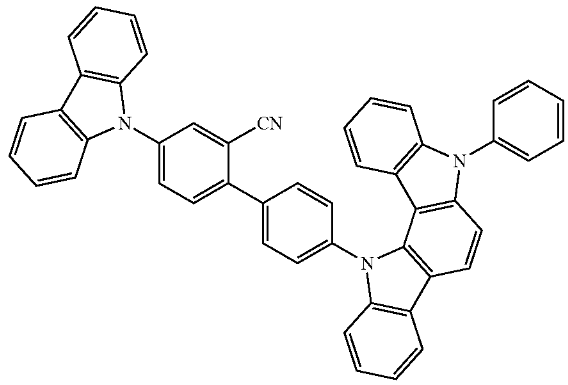
57
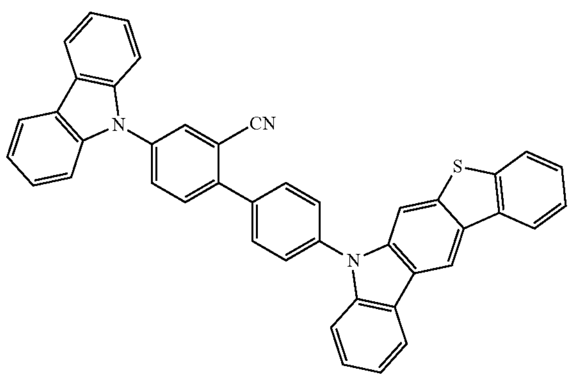
58
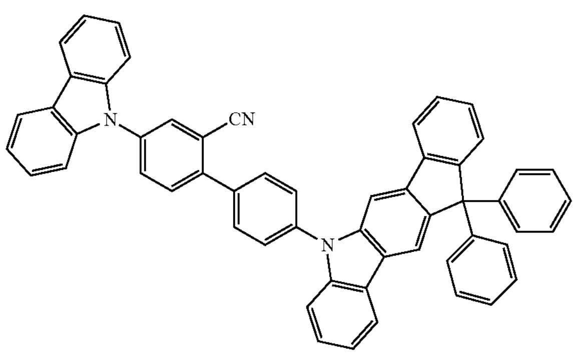
59
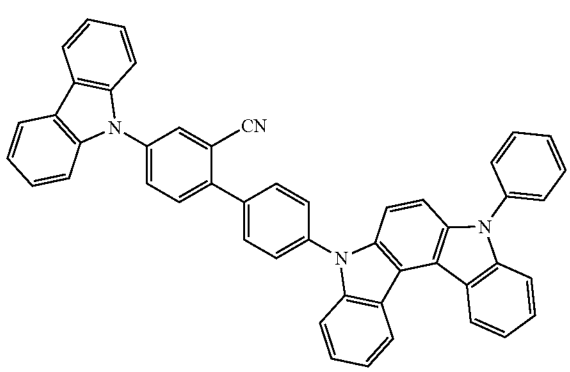
-continued
60
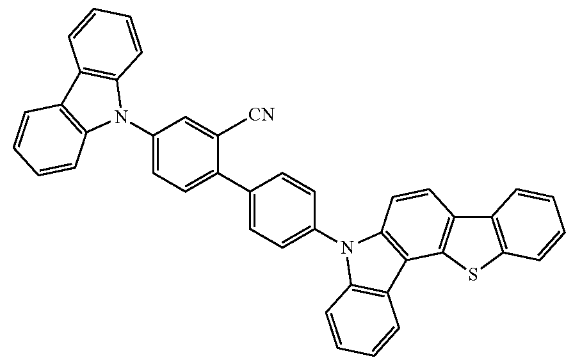
61
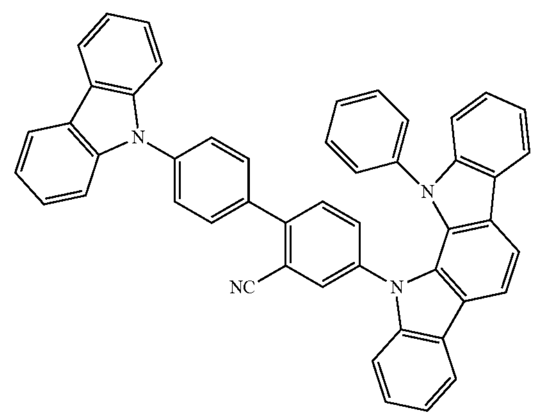
62
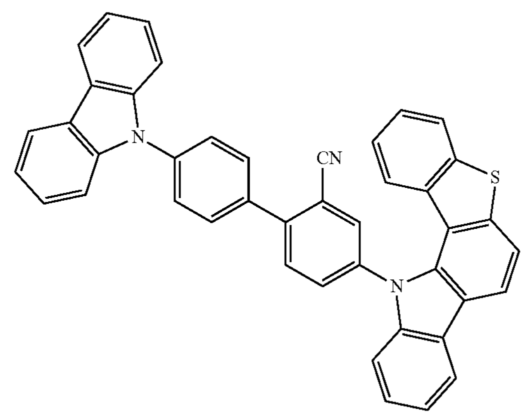
63
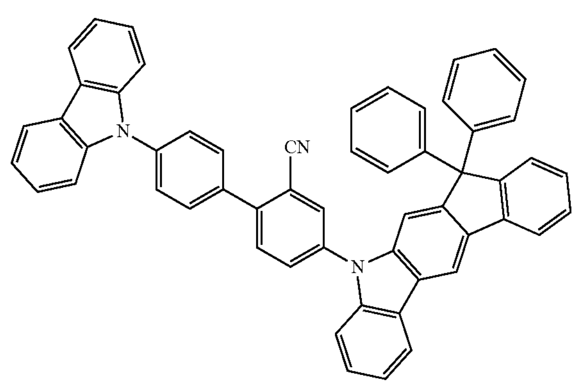

-continued
64
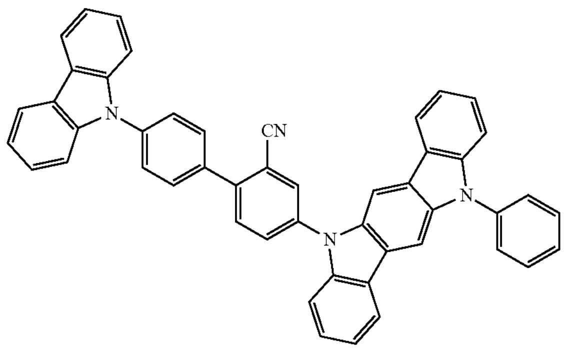
65
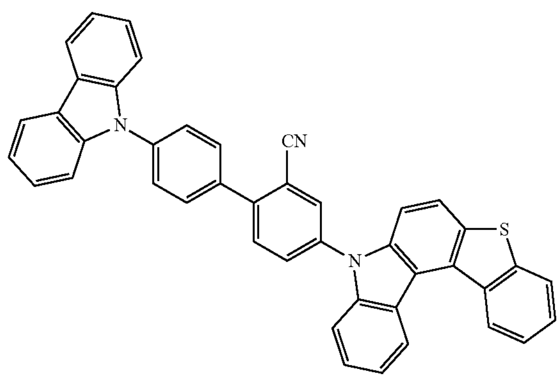
66
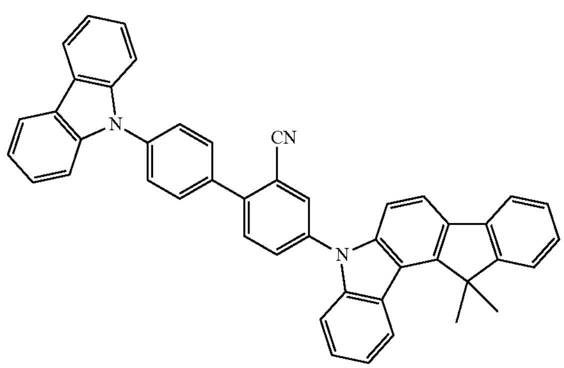
67
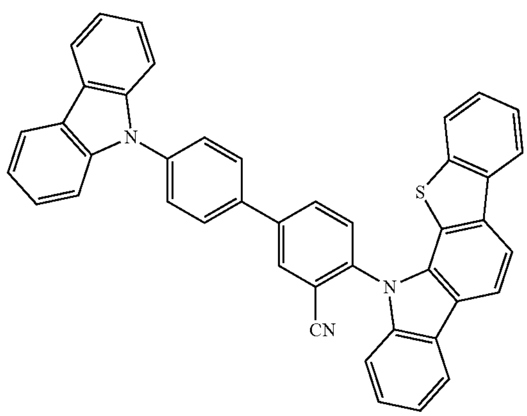
-continued
68
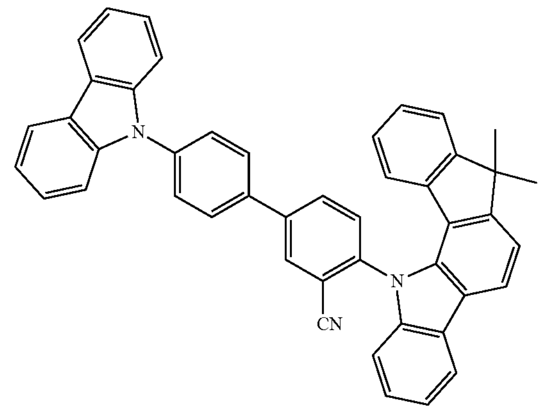
69
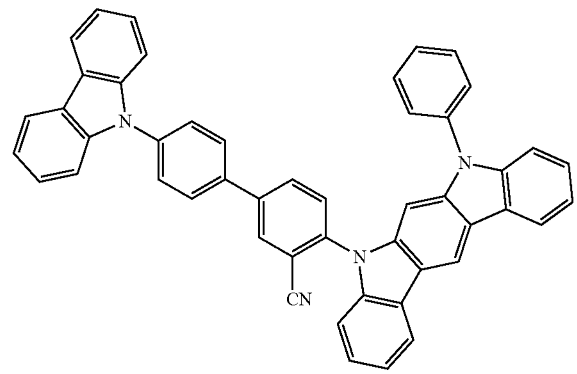
70
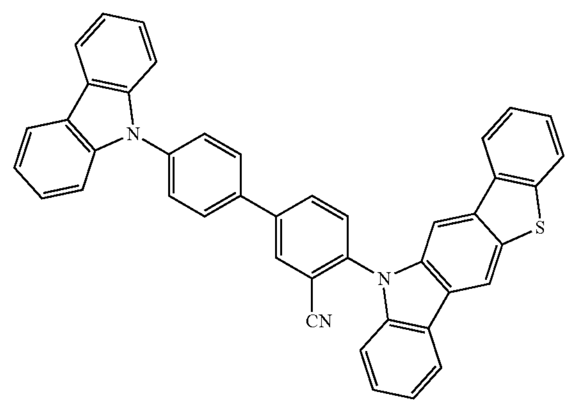
71
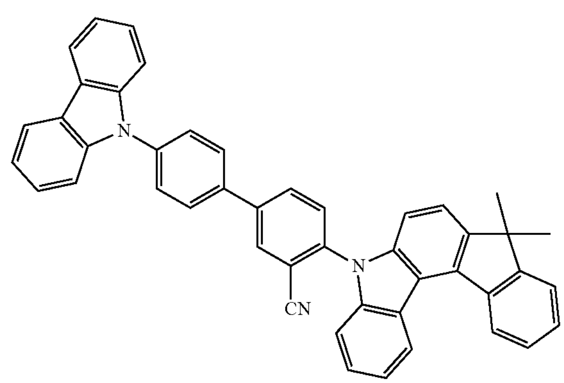

72
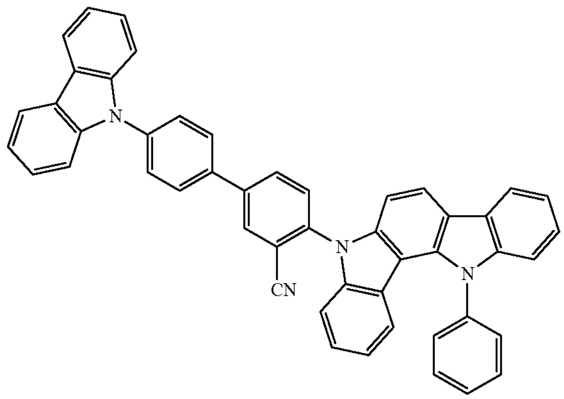
73
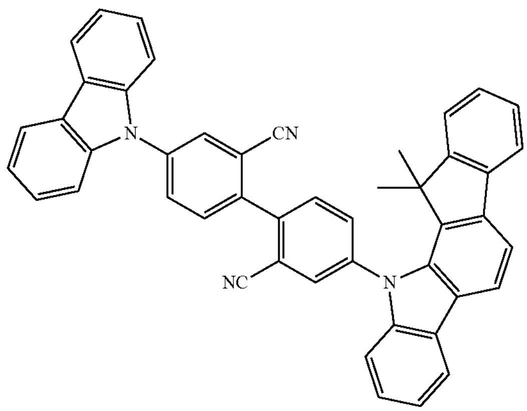
74
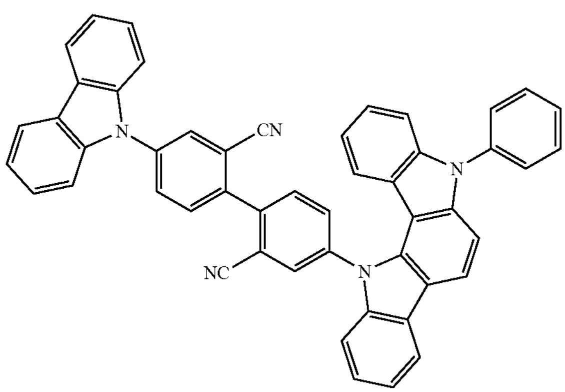
75
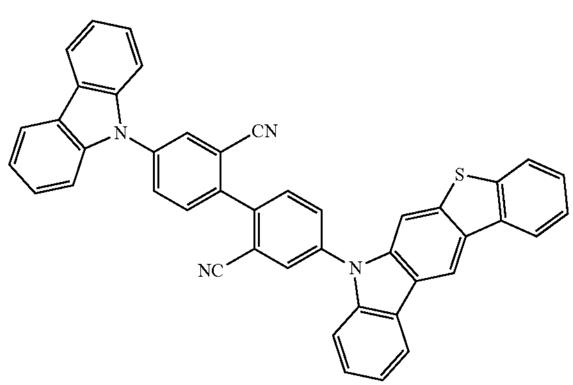
76
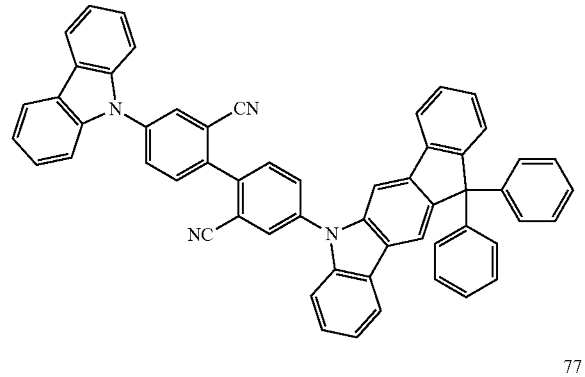
77
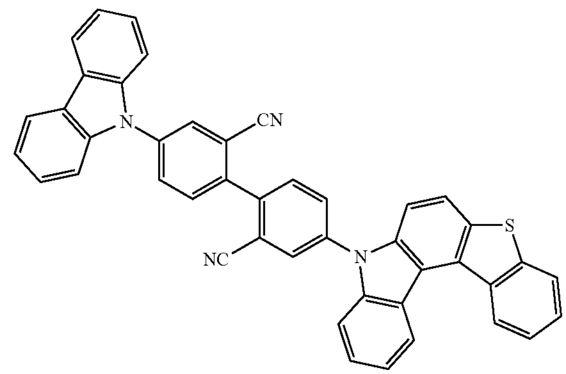
78
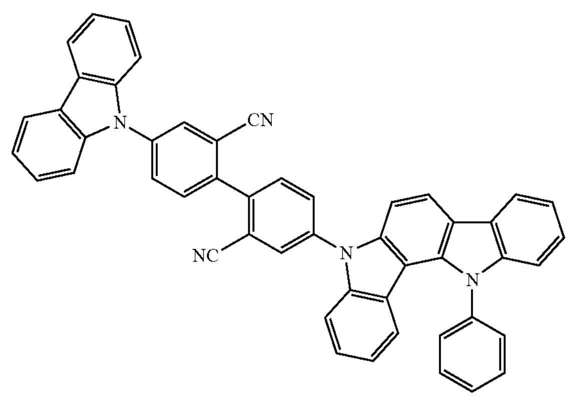
79
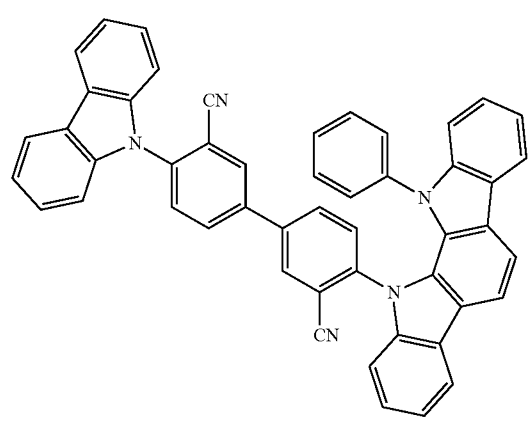

80
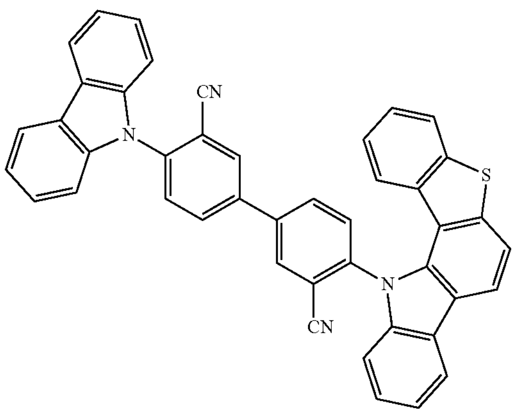
81
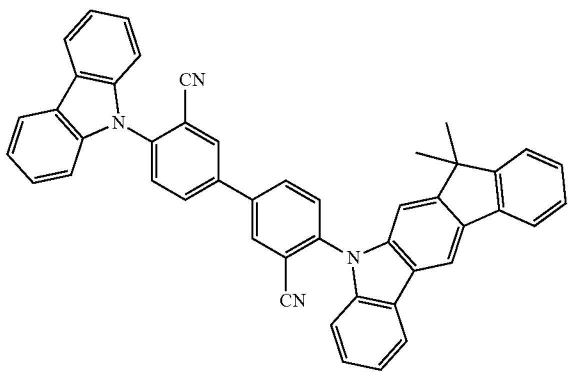
82
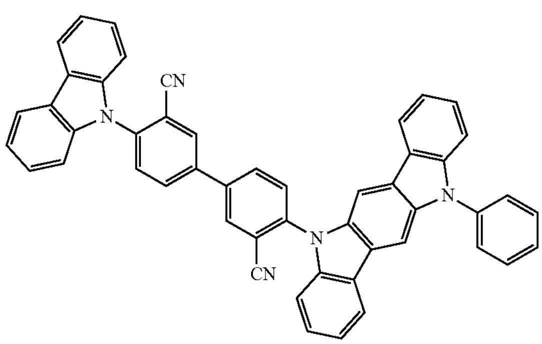
83
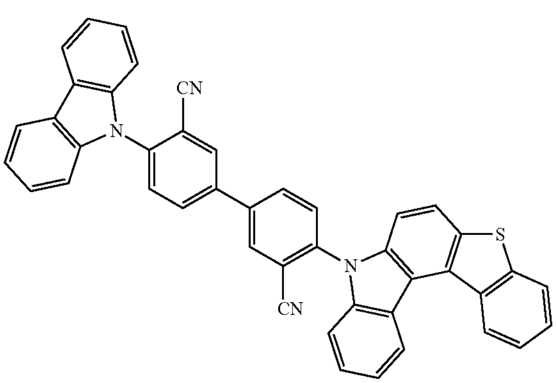
84
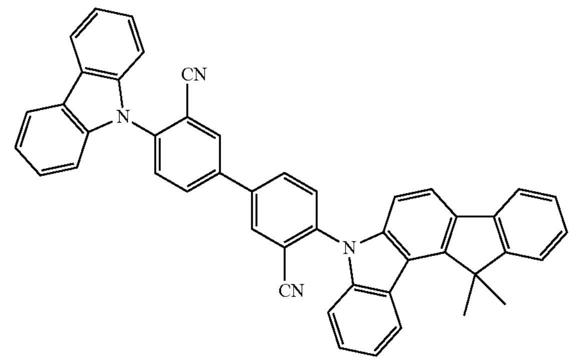
85
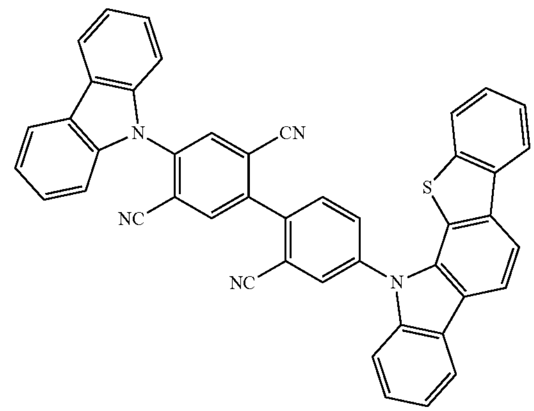
86
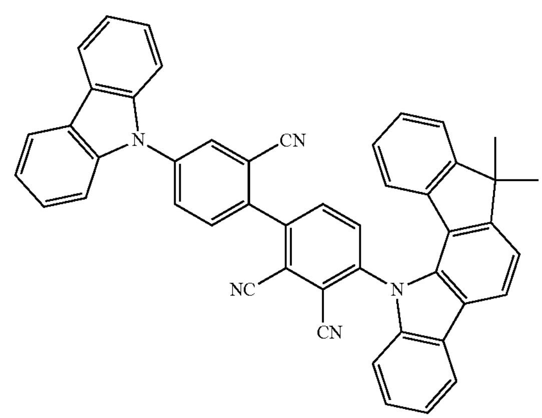
87
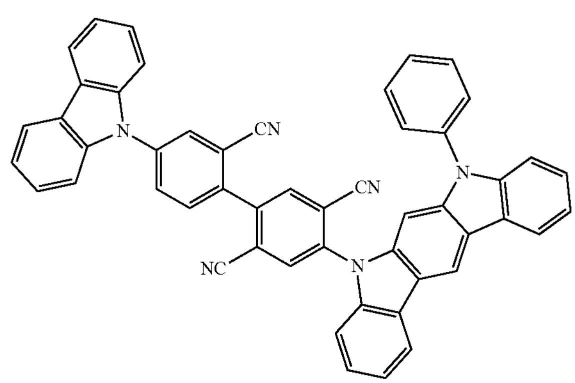

88
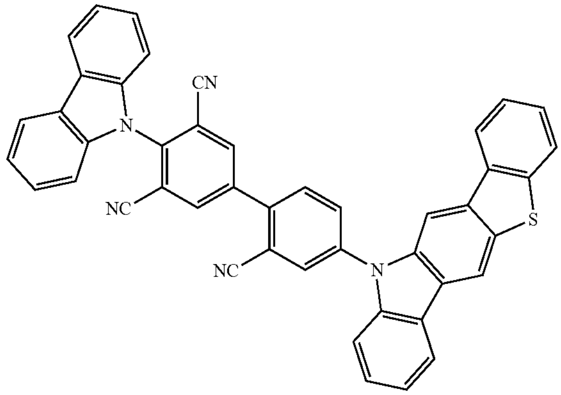
89
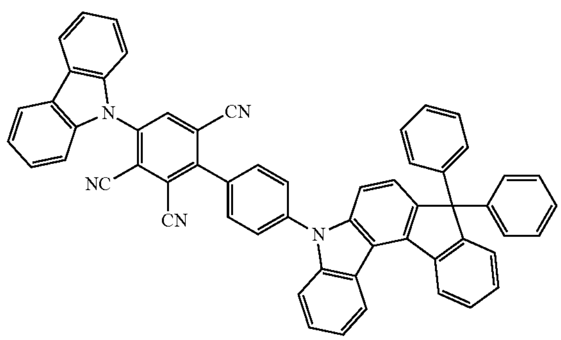
90
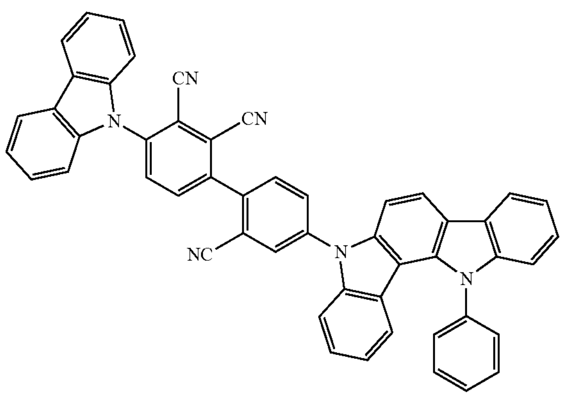
91
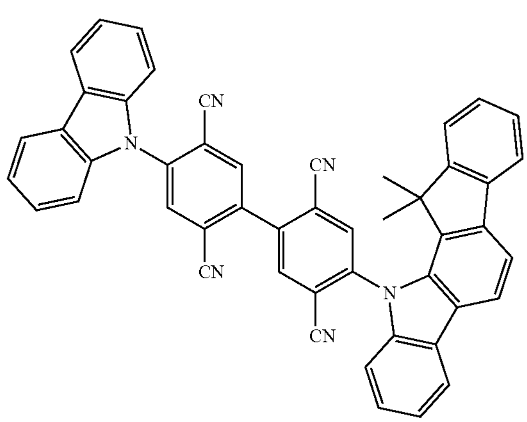
92
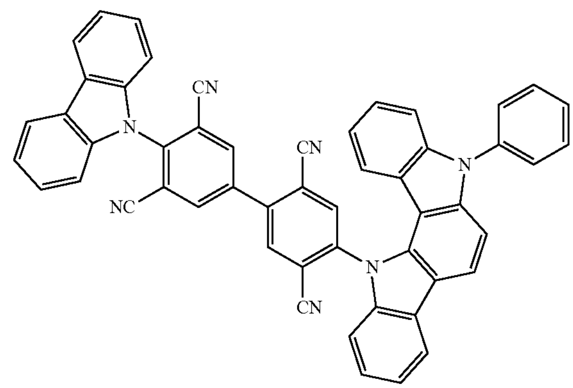
93
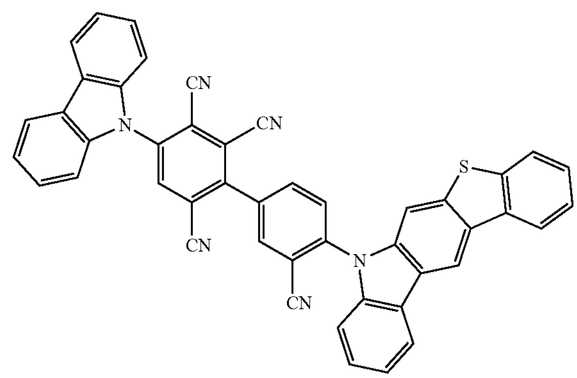
94
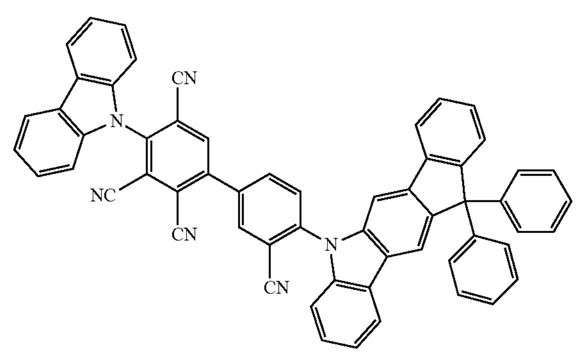
95
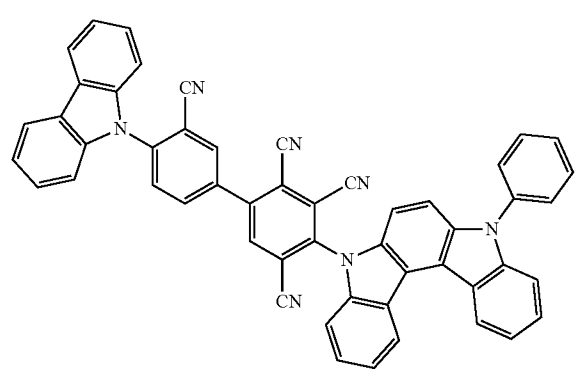

-continued
96
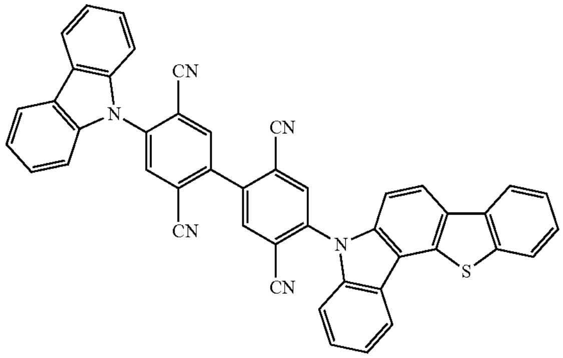
97
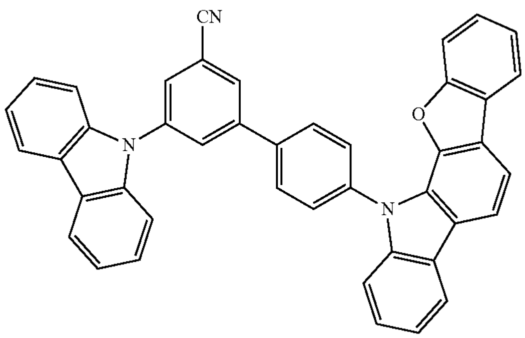
98
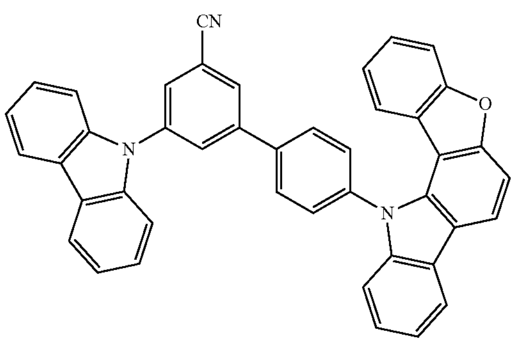
99
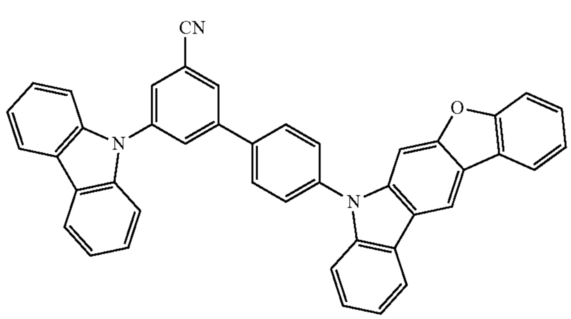
-continued
100
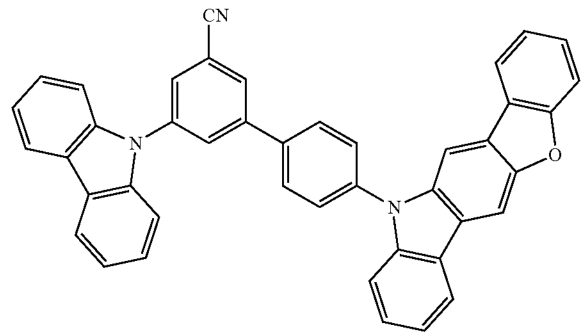
101
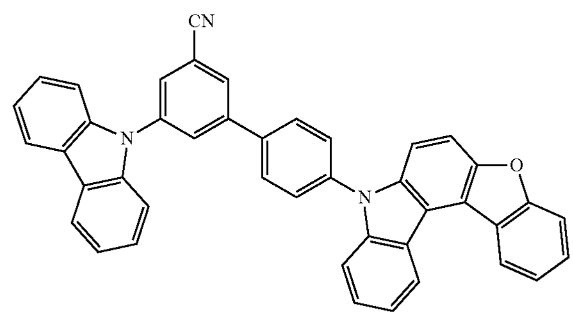
102
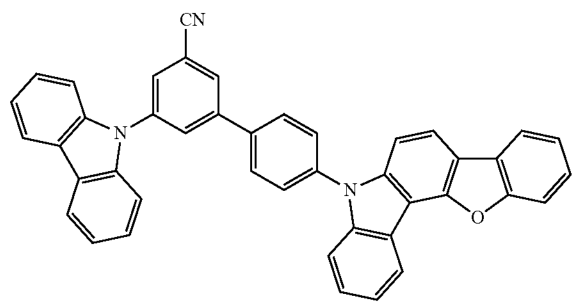
103
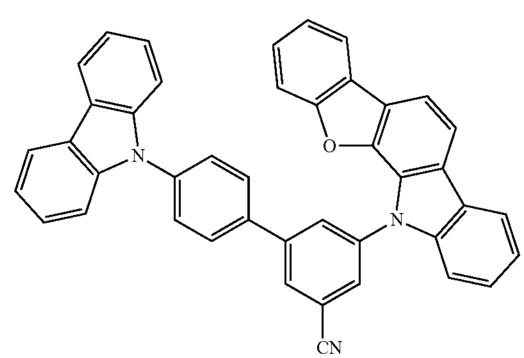

-continued
104
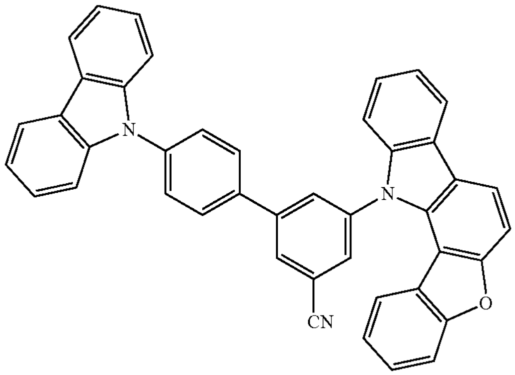
105
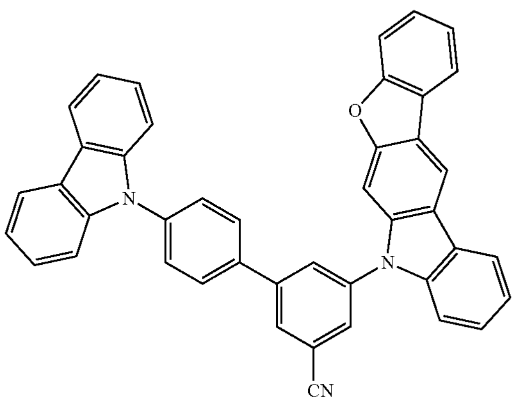
106
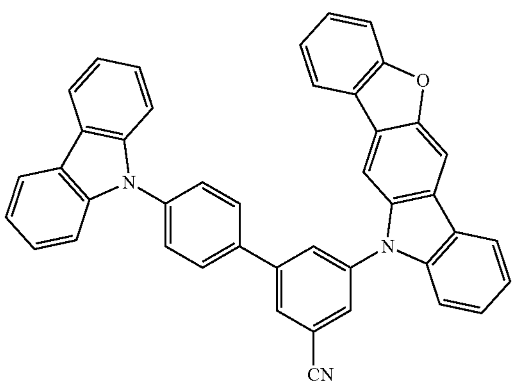
107
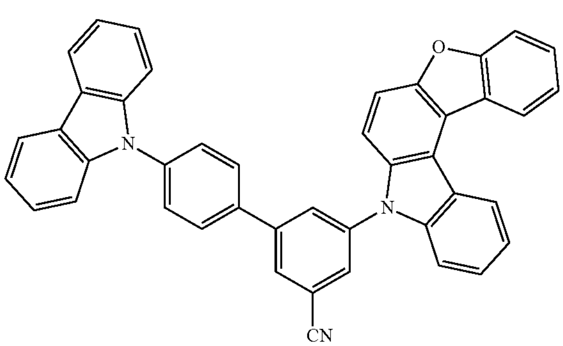
-continued
108
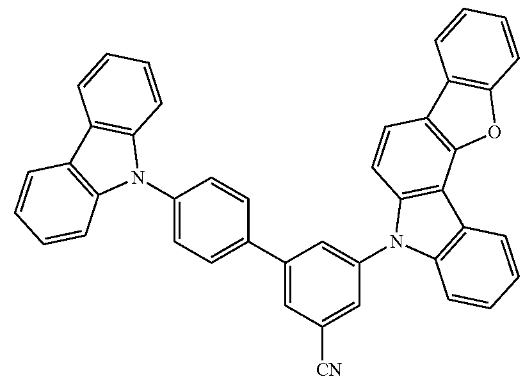
109
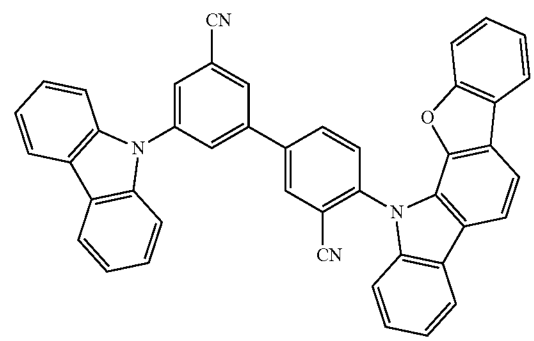
110
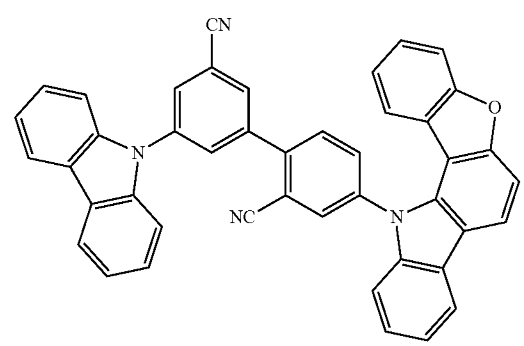
111
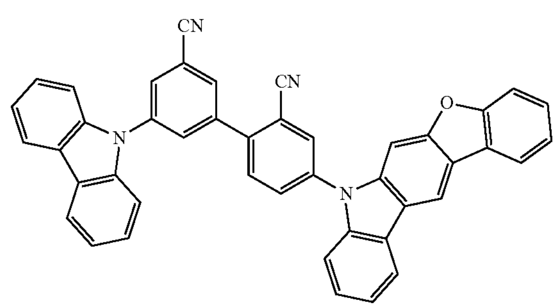

-continued
112
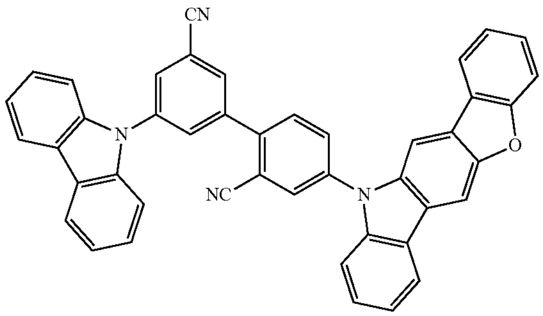
113
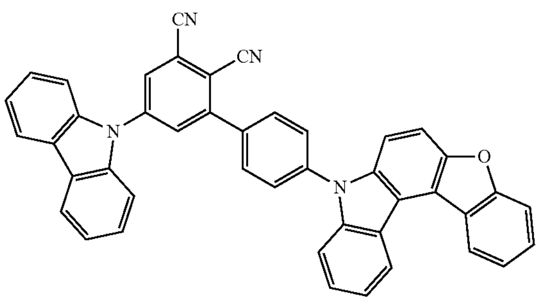
114
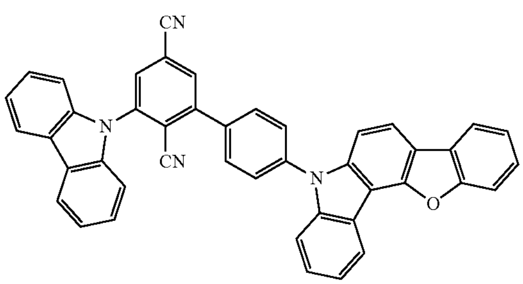
115
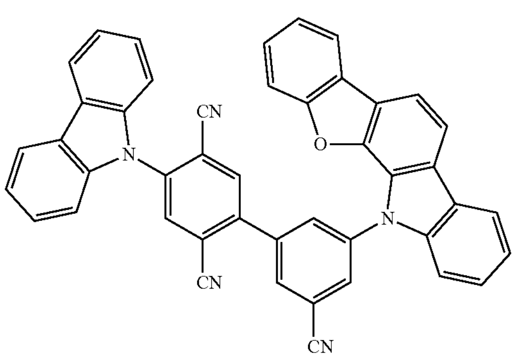
-continued
116
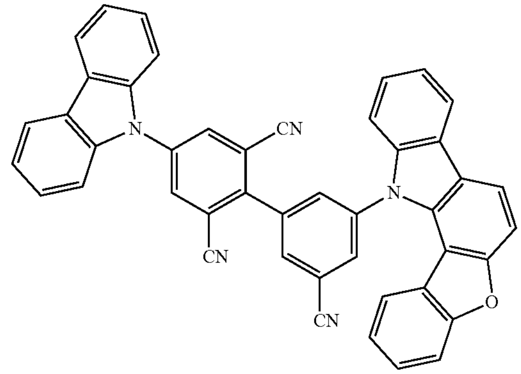
117
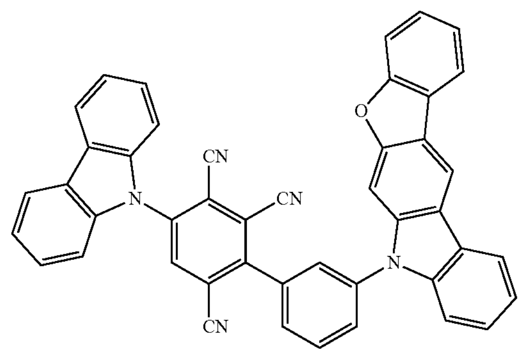
118
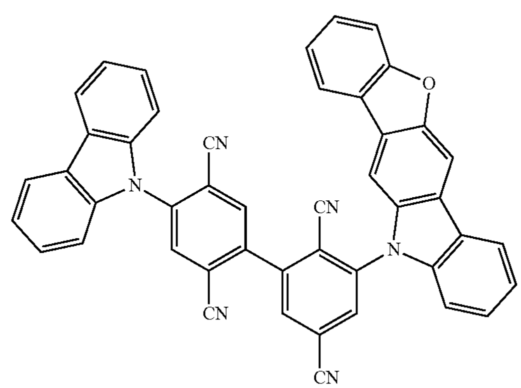
119
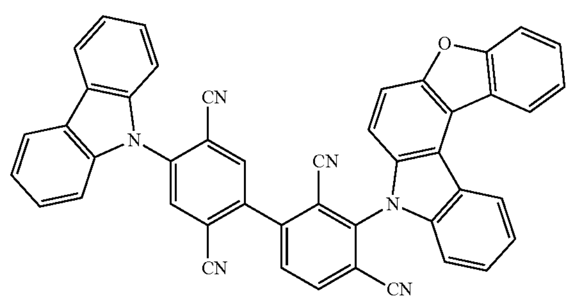

-continued
120
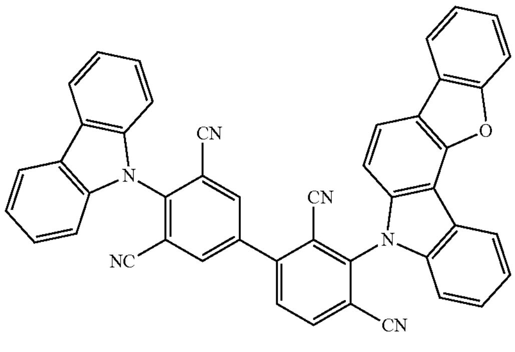
121
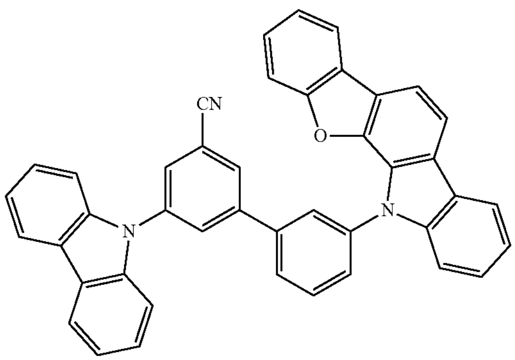
122
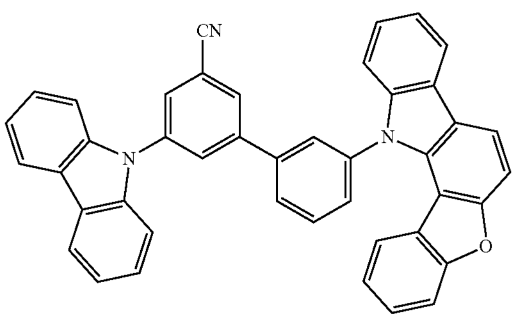
123
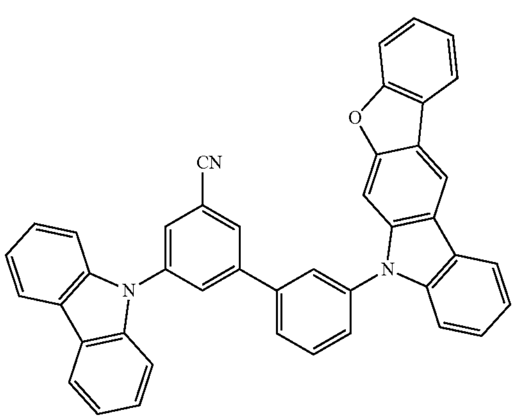
-continued
124
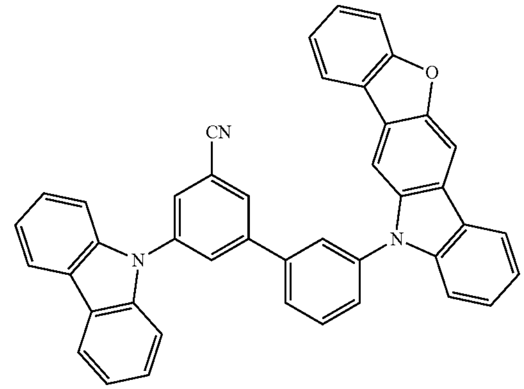
125
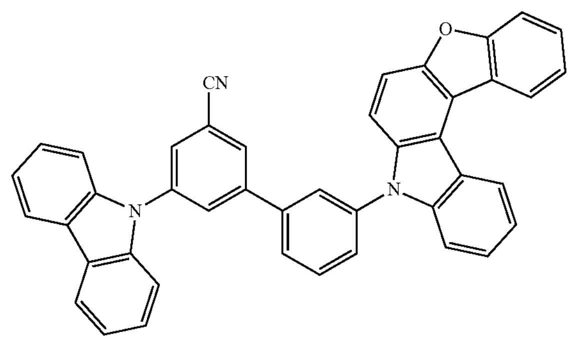
126
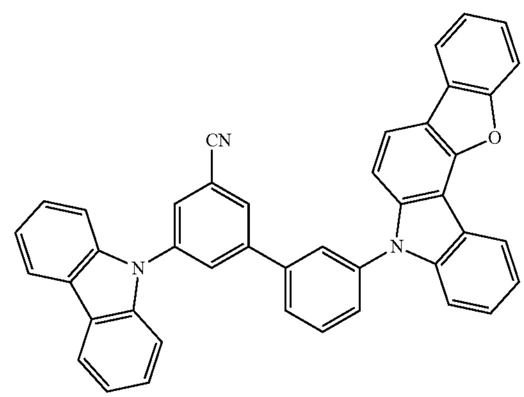
127
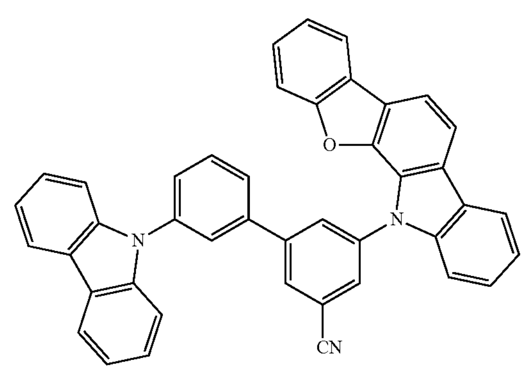

-continued
128
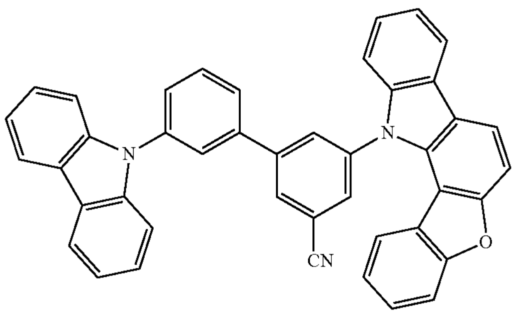
129
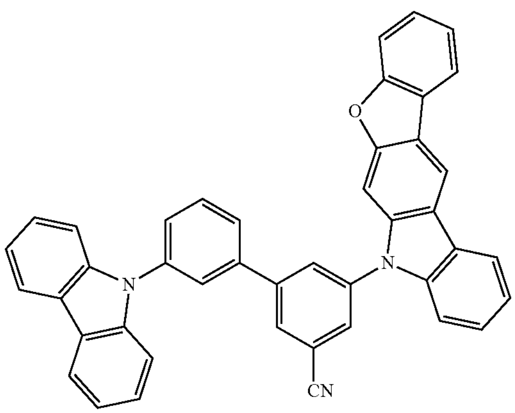
130
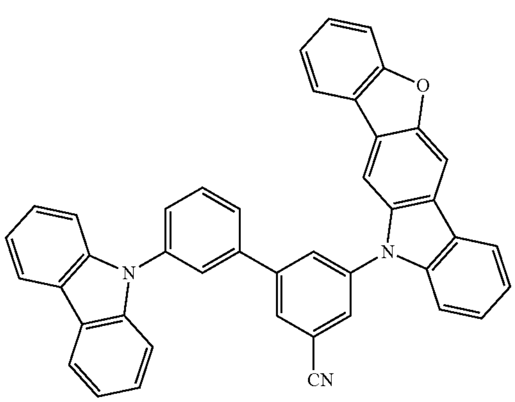
131
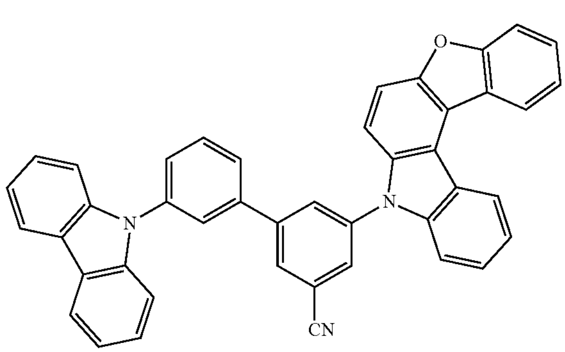
-continued
132
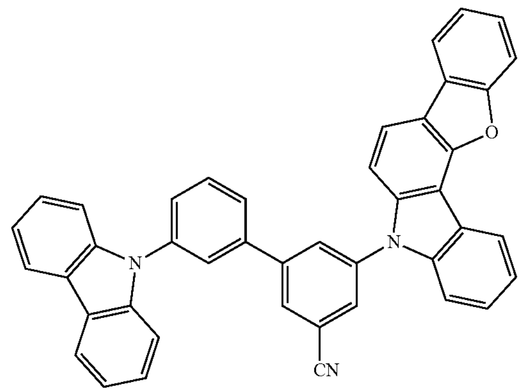
133
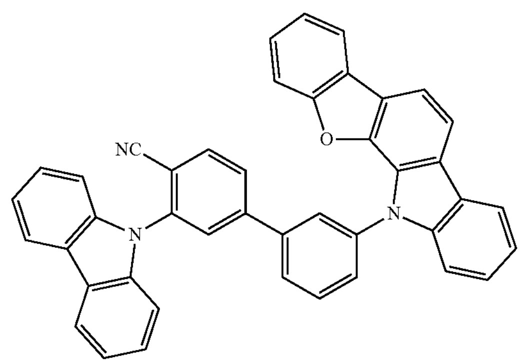
134
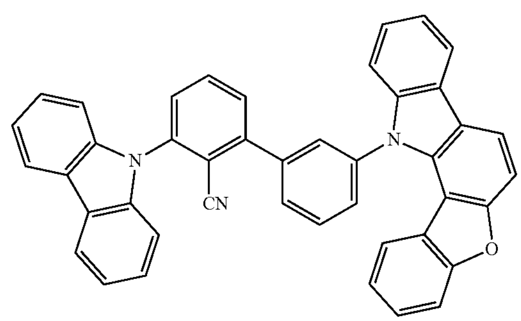
135
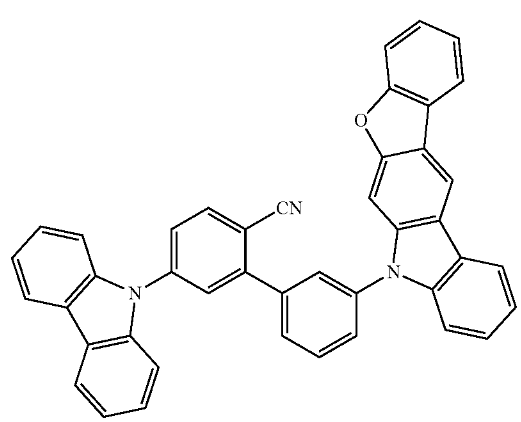

-continued
136
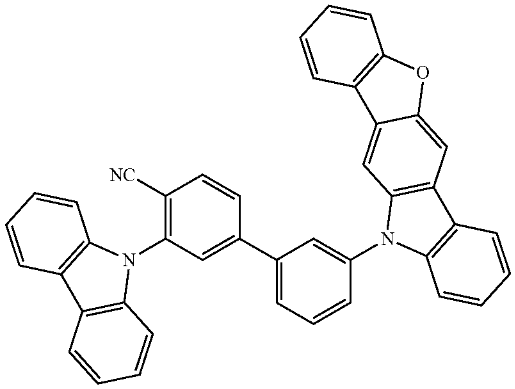
137
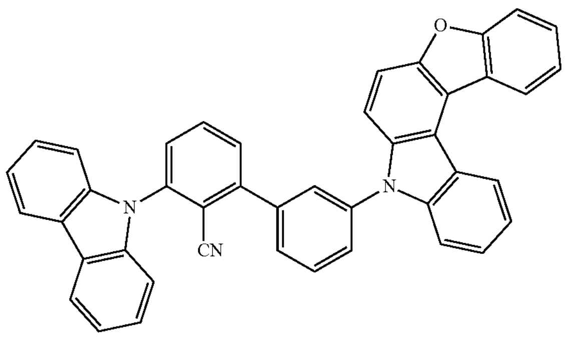
138
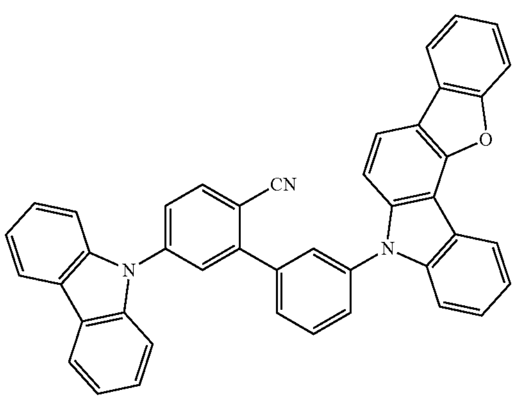
139
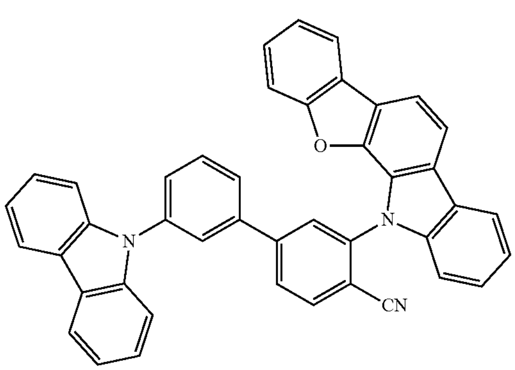
-continued
140
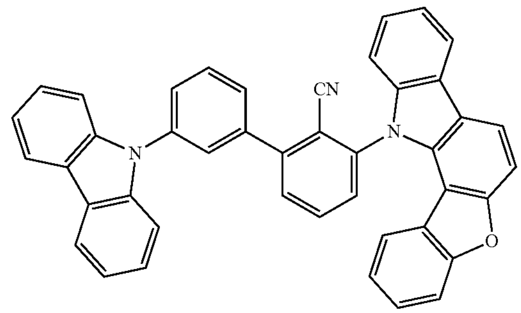
141
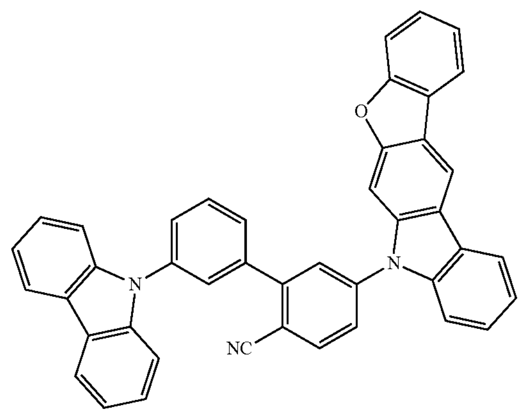
142
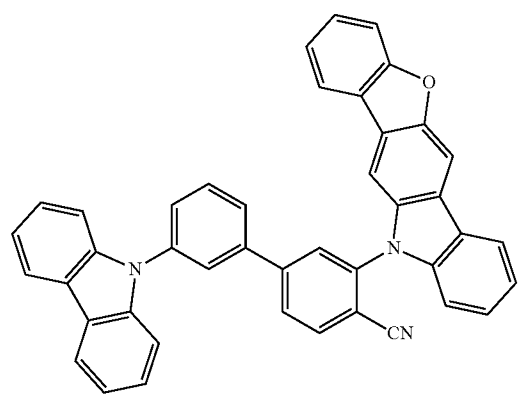
143
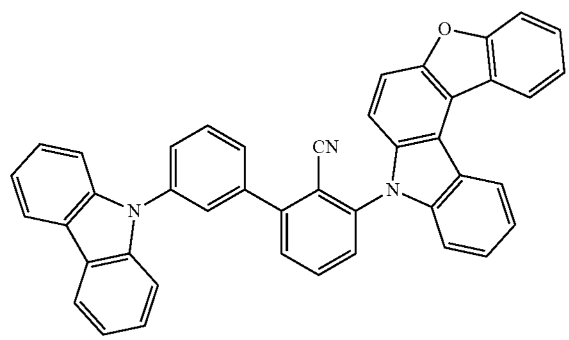

144
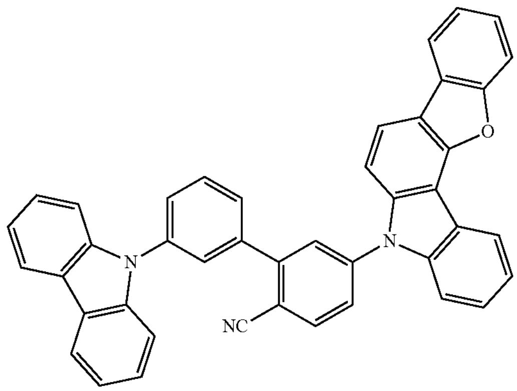
145
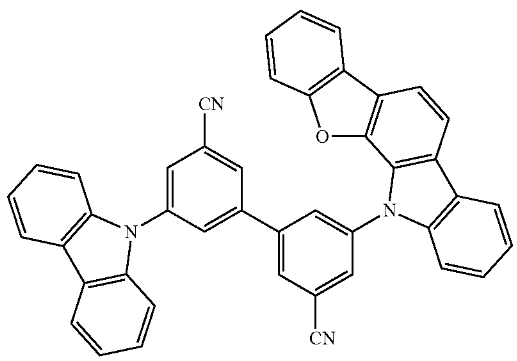
146
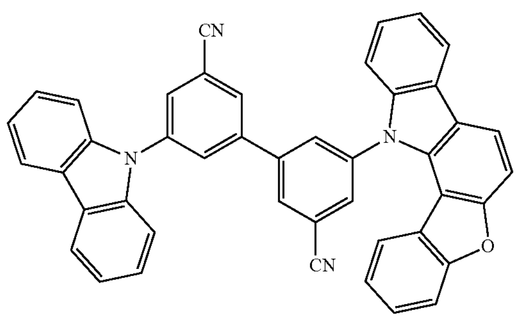
147
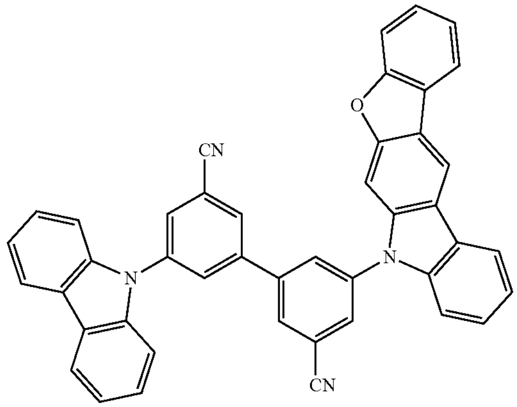
148
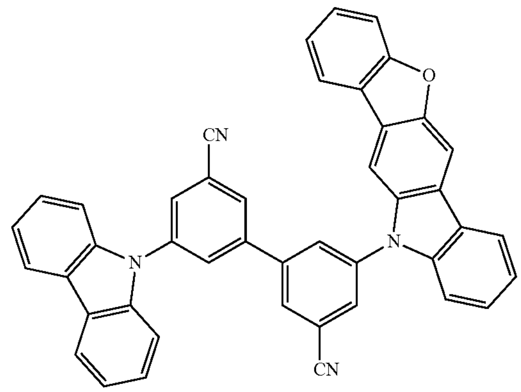
149
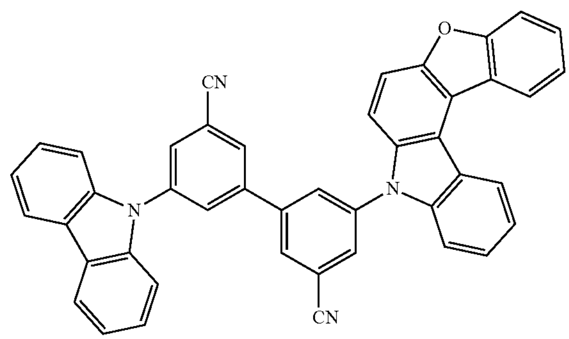
150
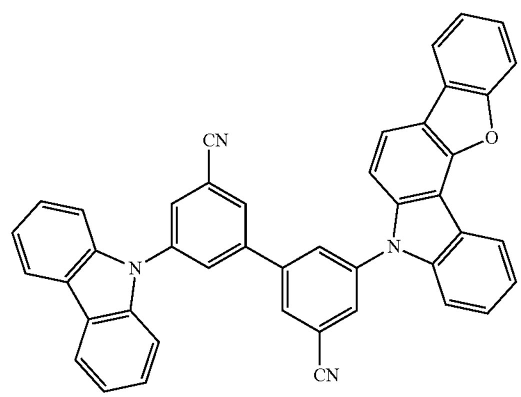
151
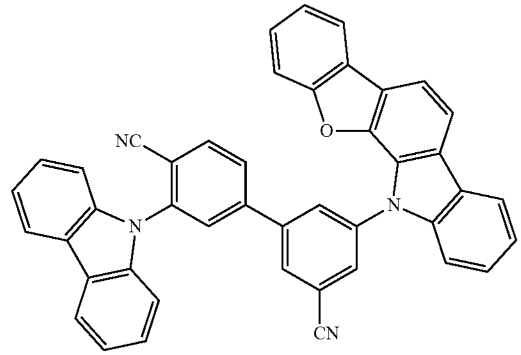

152
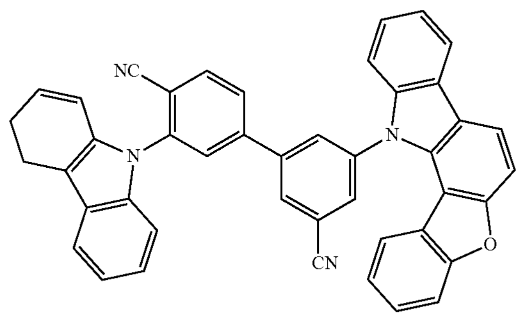
153
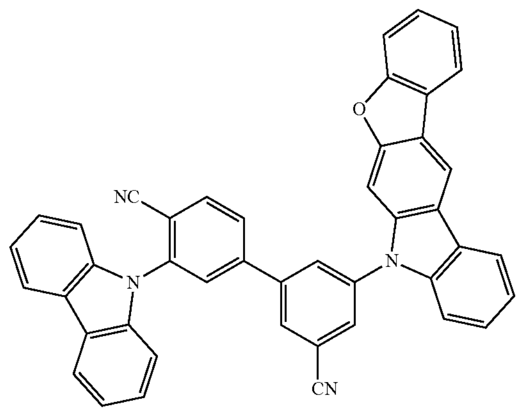
154
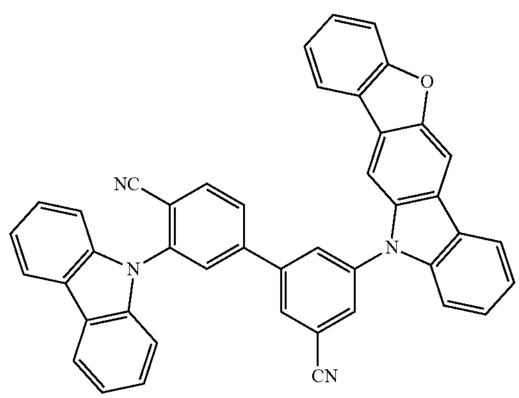
155
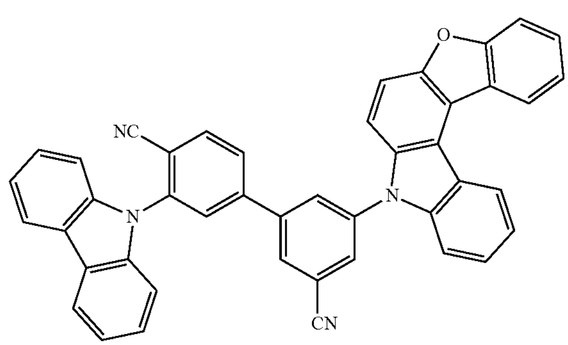
156
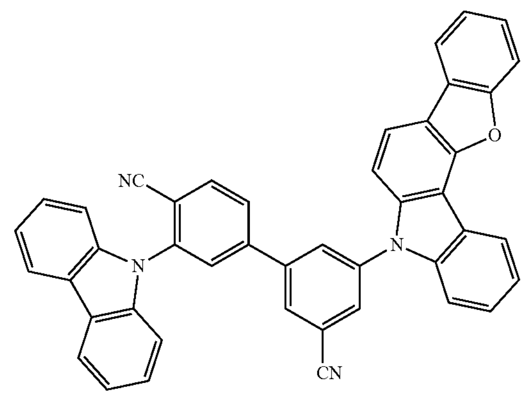
157
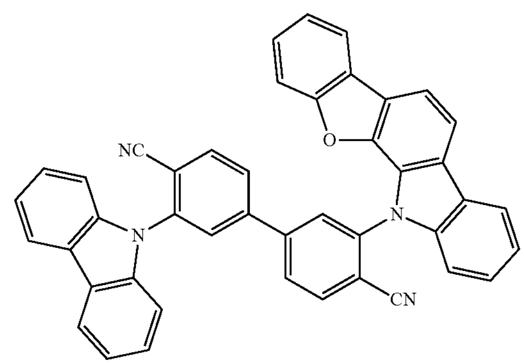
158
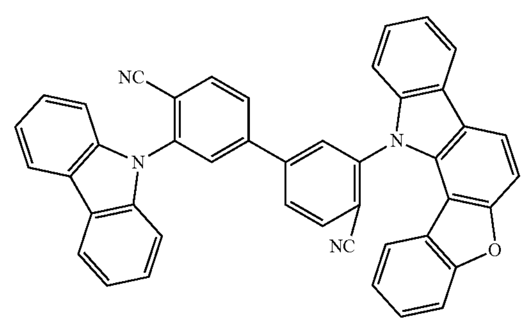
159
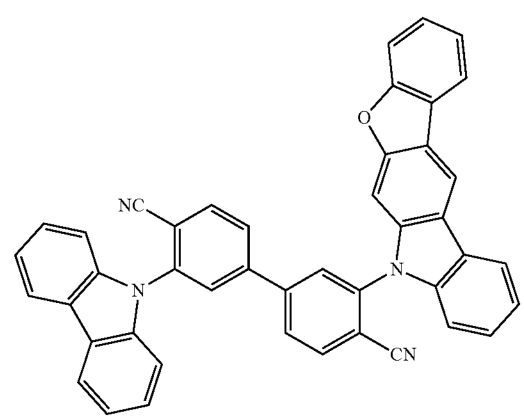

-continued
160
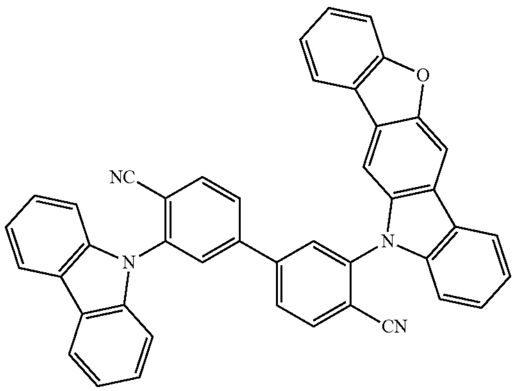
161
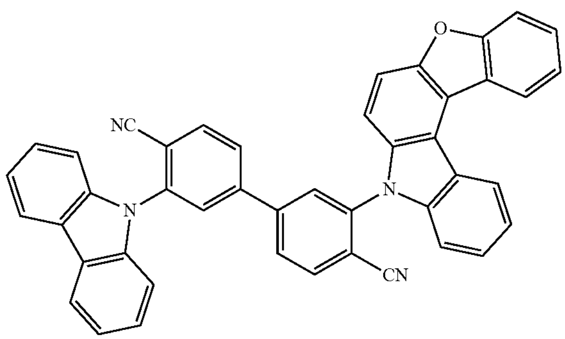
162
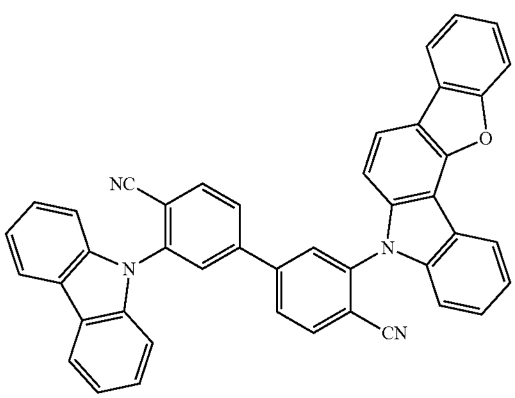
163
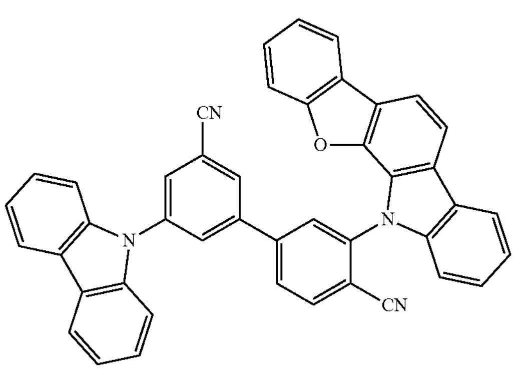
-continued
164
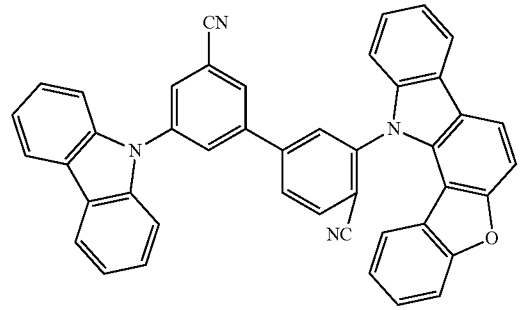
165
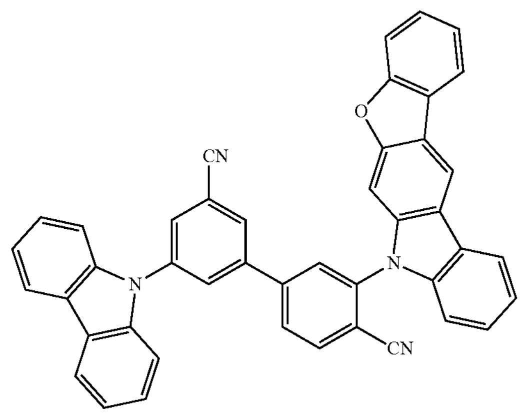
166
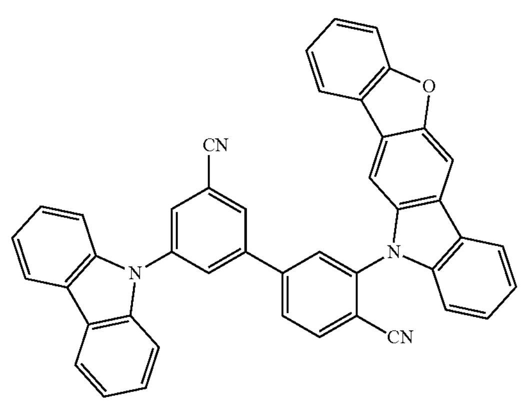
167
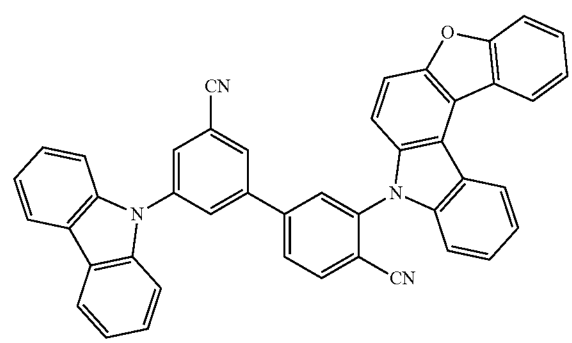

-continued
168
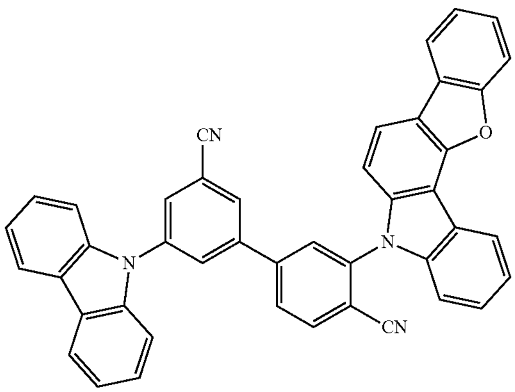
169
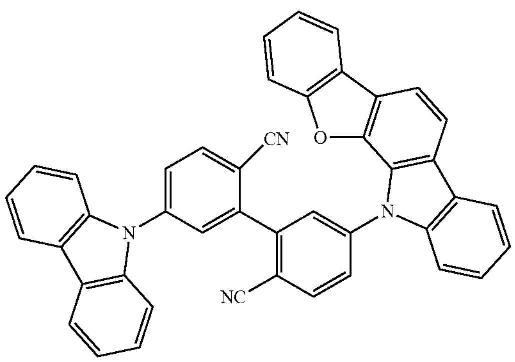
170
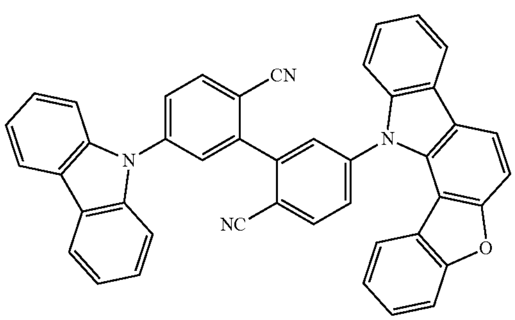
171
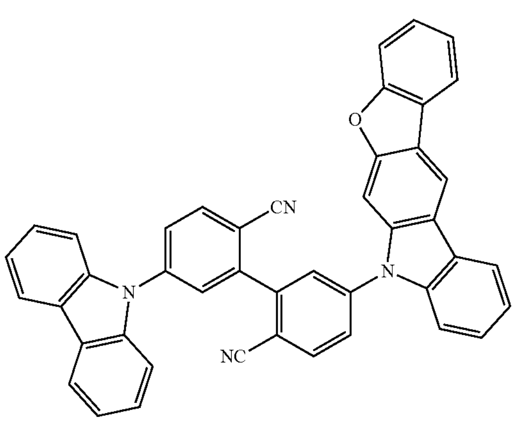
-continued
172
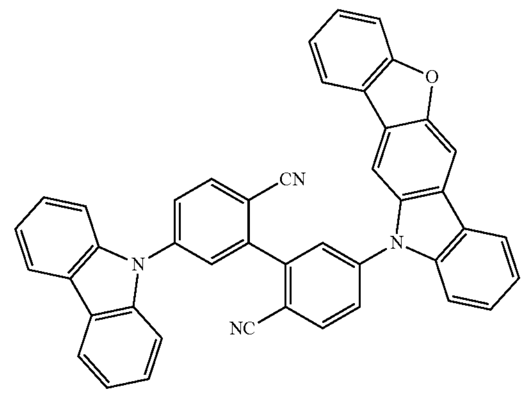
173
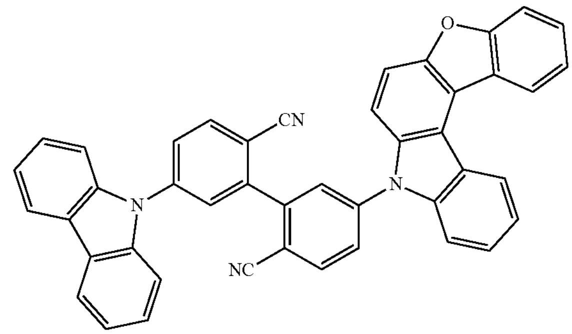
174
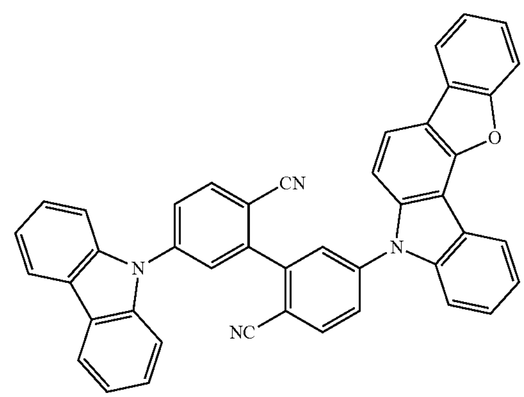
175
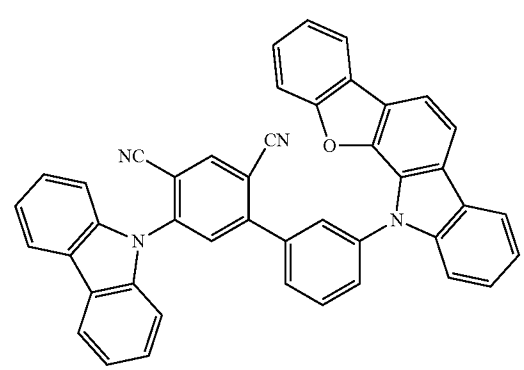

-continued
176
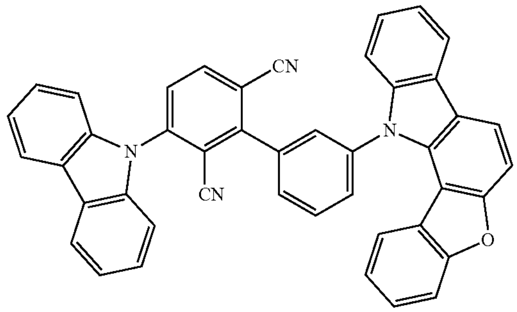
177
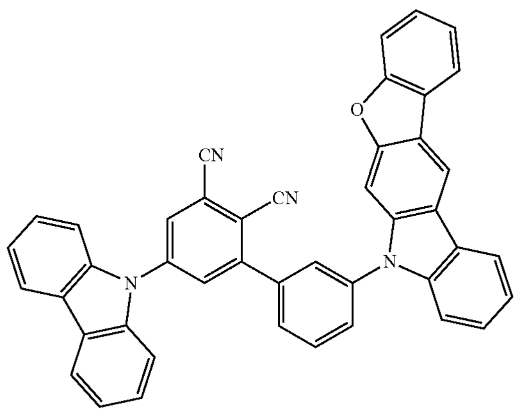
178
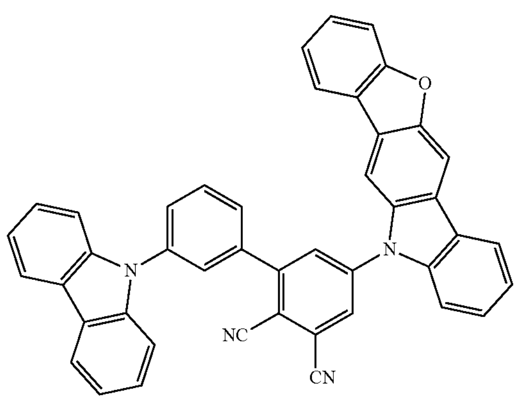
179
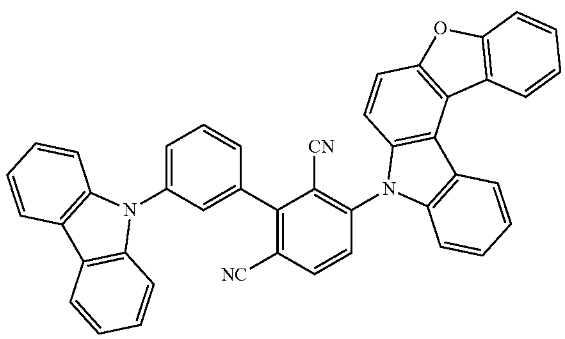
-continued
180
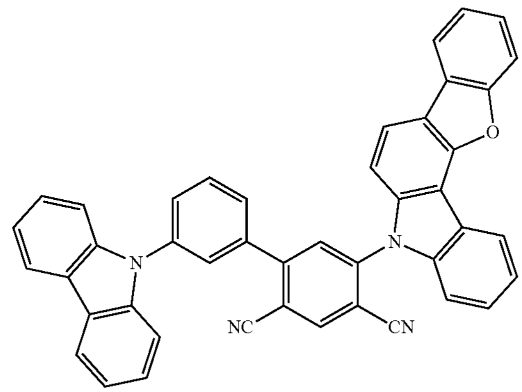
181
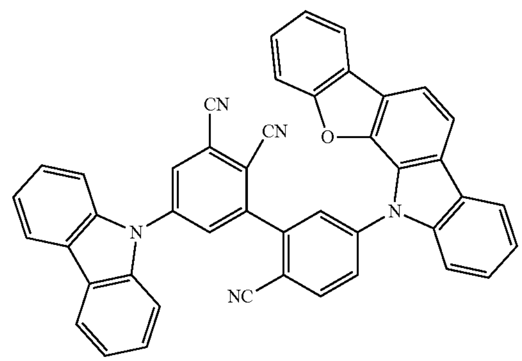
182
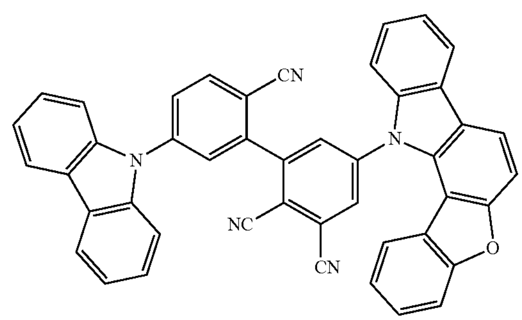
183
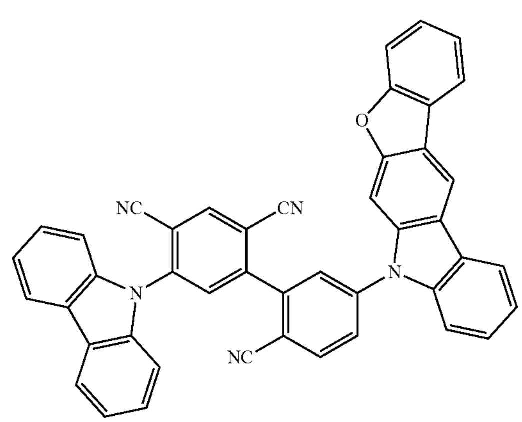

-continued
184
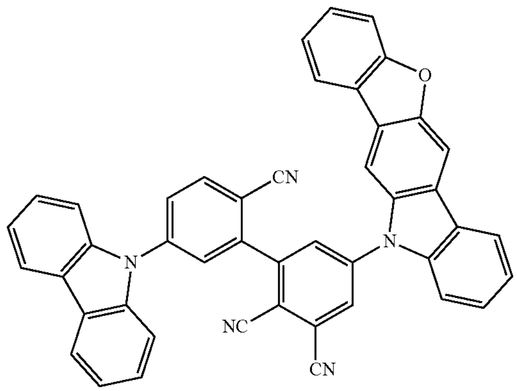
185
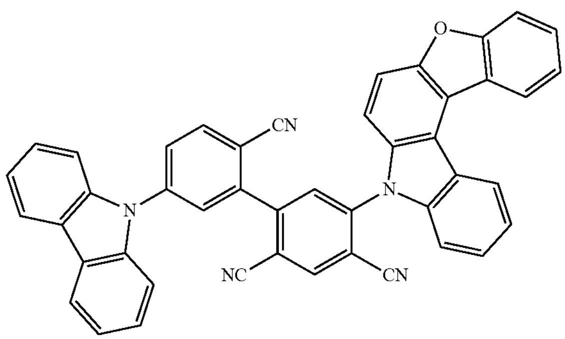
186
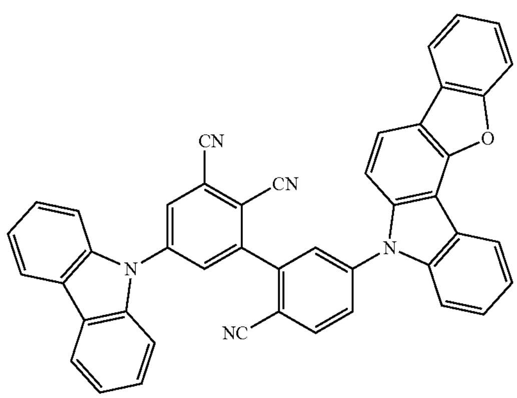
187
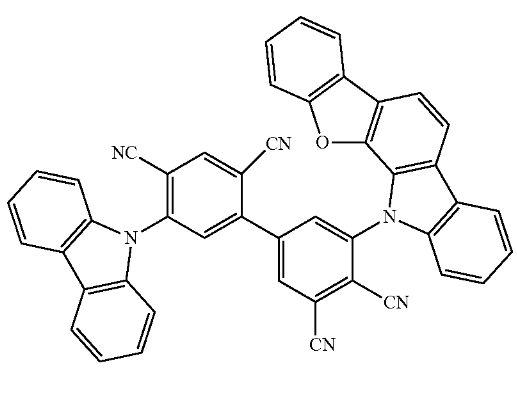
-continued
188
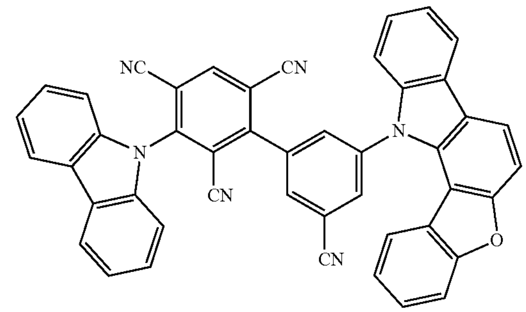
189
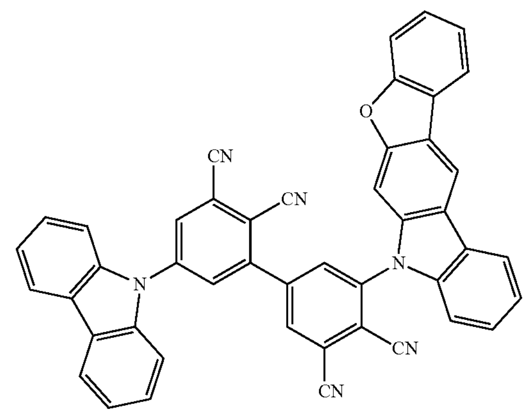
190
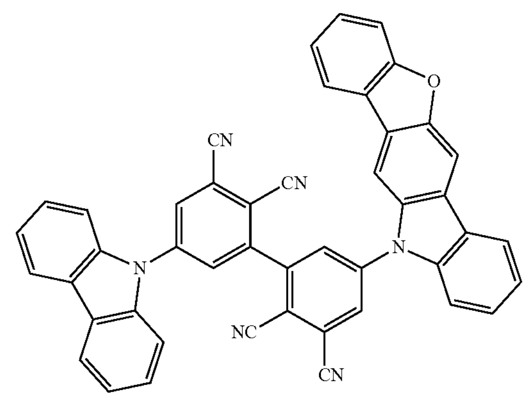
191
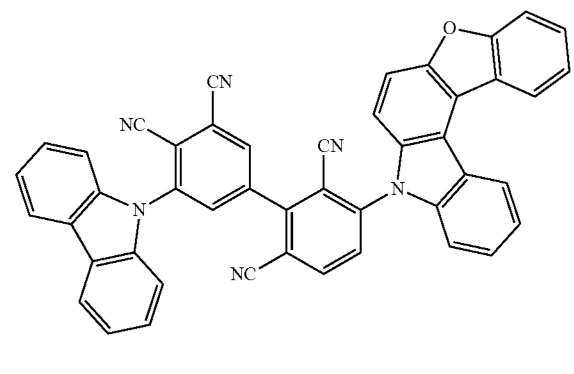

-continued
192
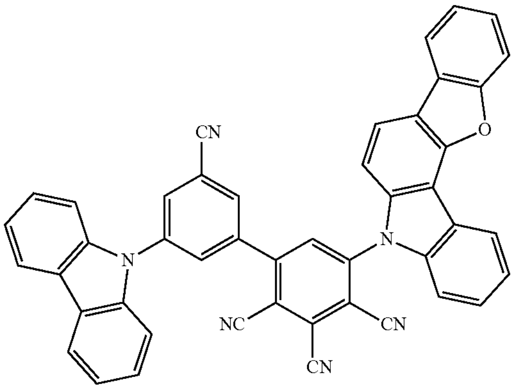
193
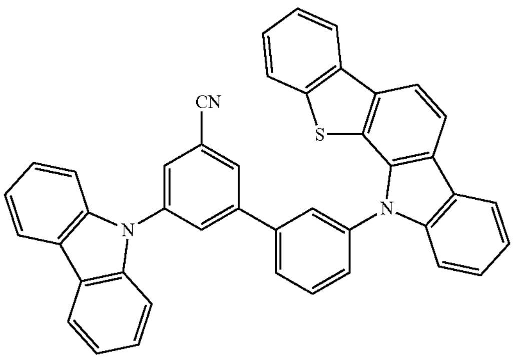
194
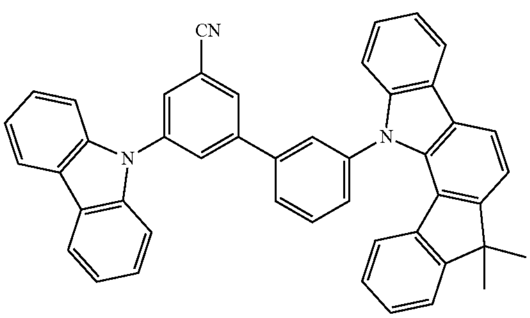
195
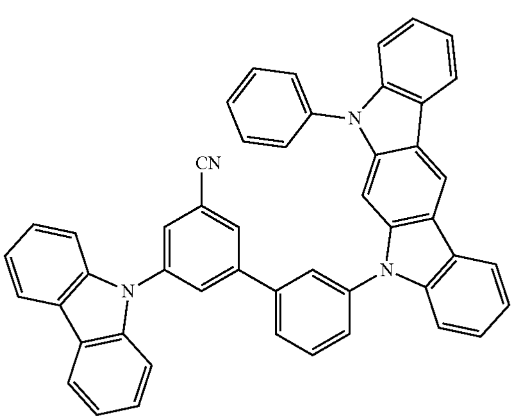
-continued
196
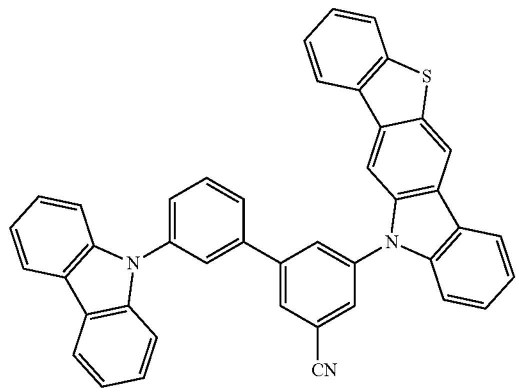
197
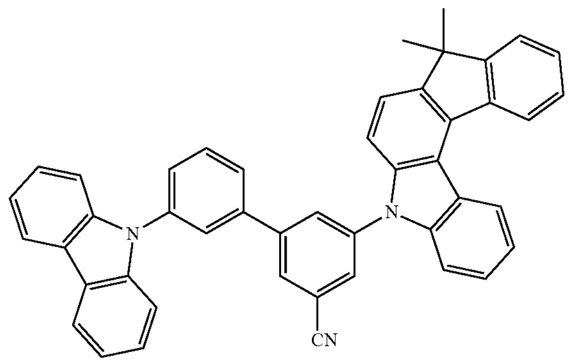
198
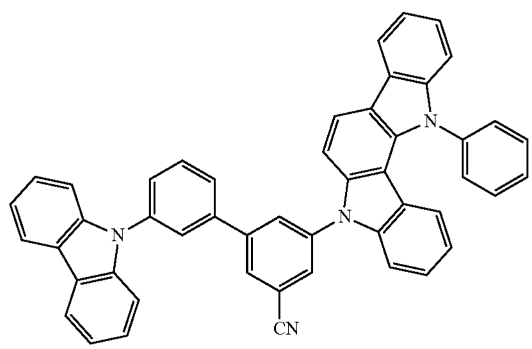
199
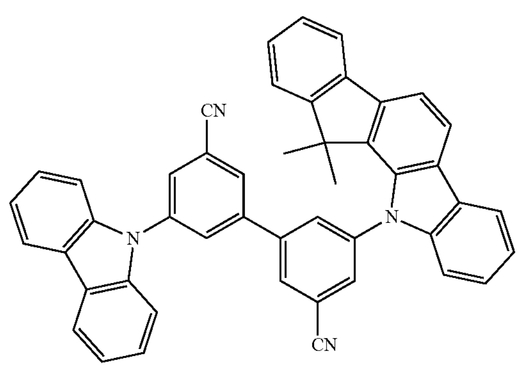

200
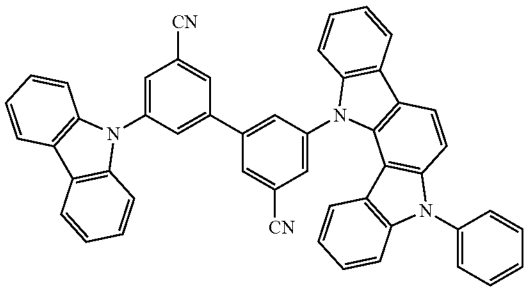
201
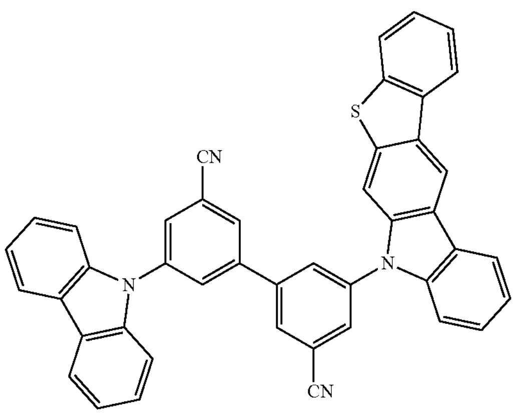
202
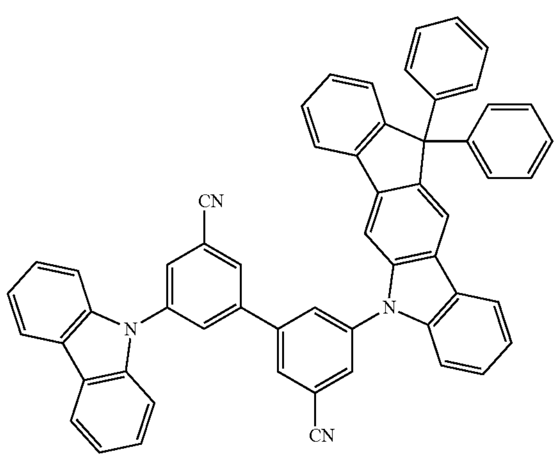
203
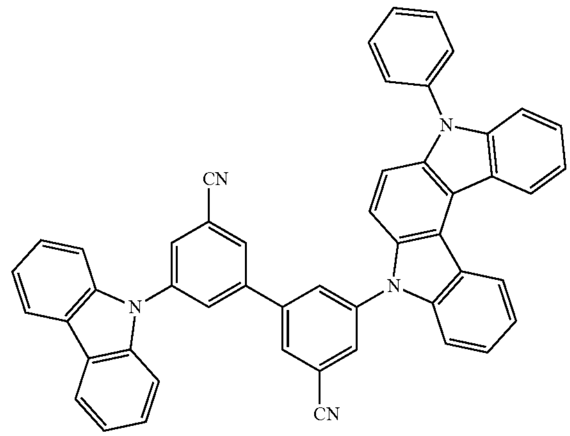
204
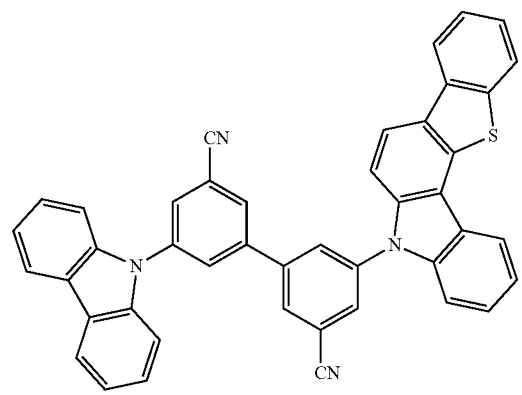
205
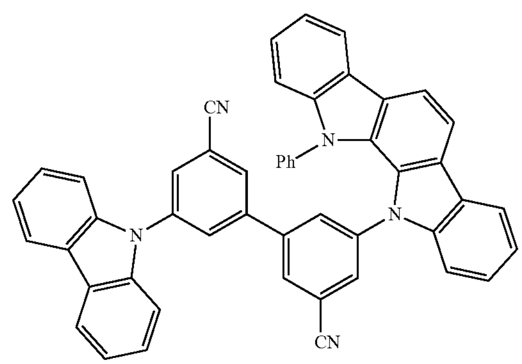
206
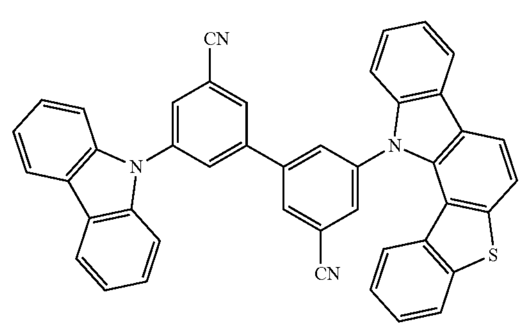

-continued
207
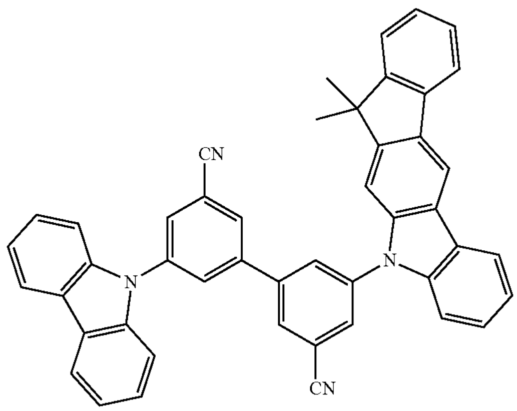
208
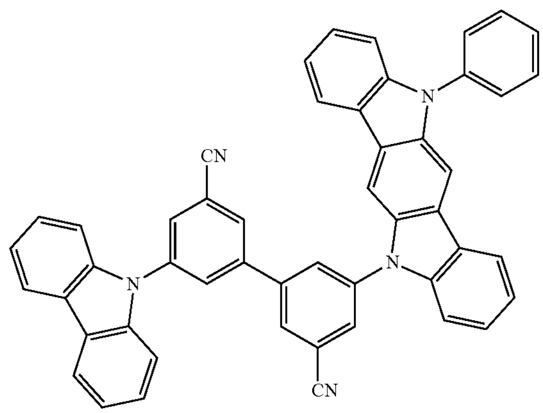
209
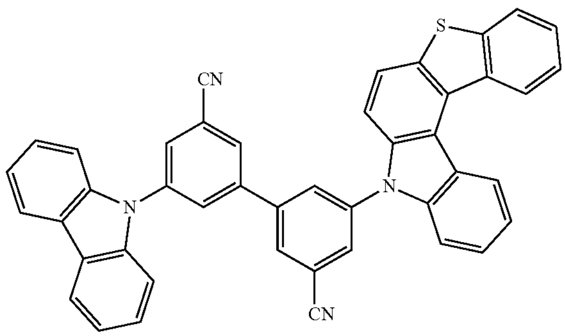
210
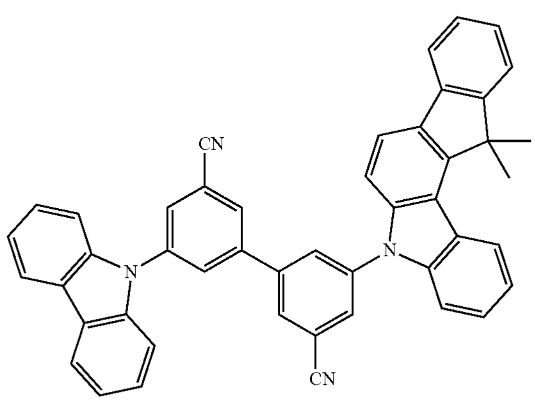
-continued
211
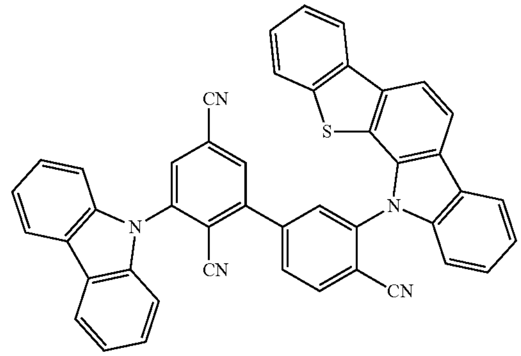
212
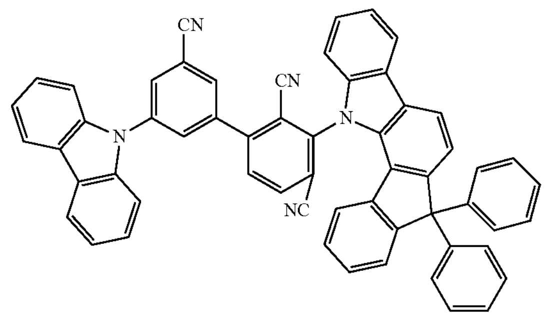
213
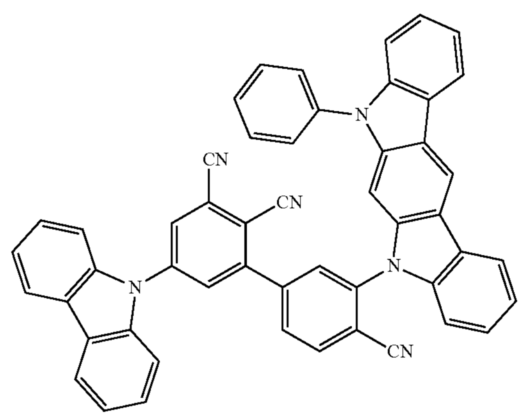
214
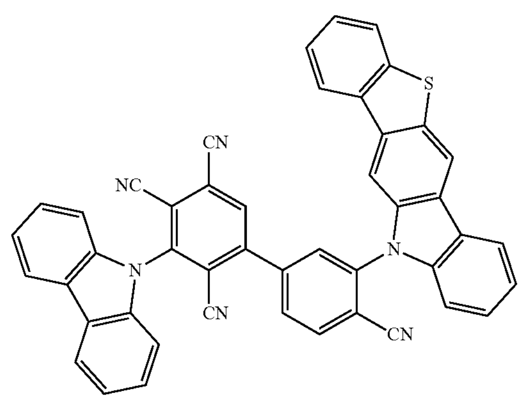

-continued
215
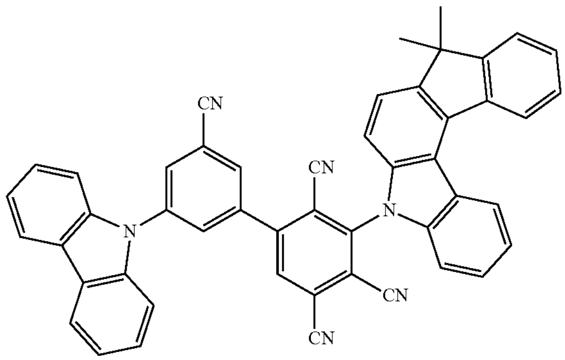
216
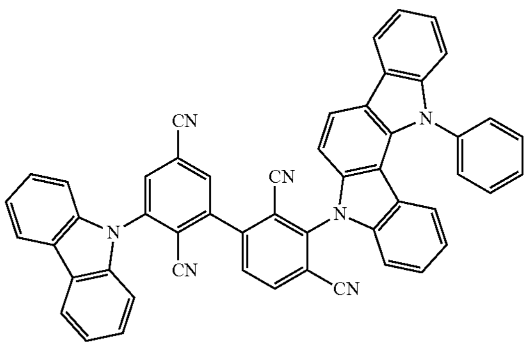
217
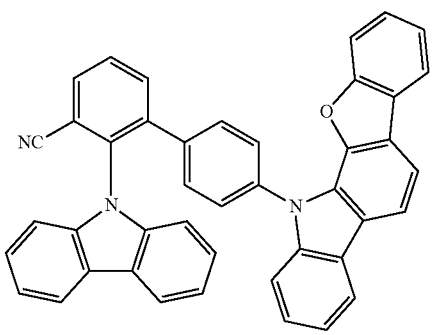
218
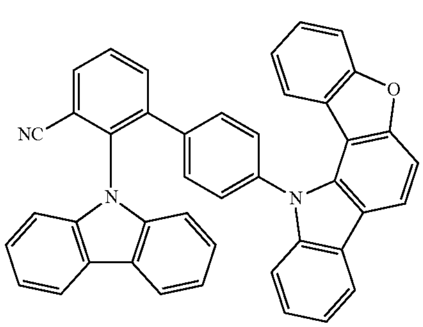
-continued
219
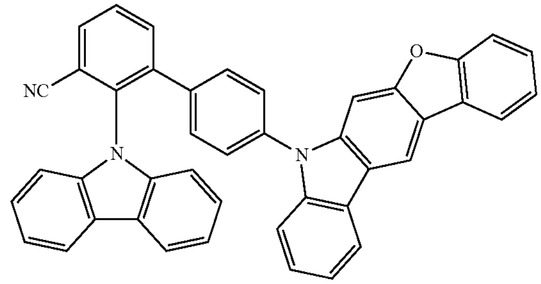
220
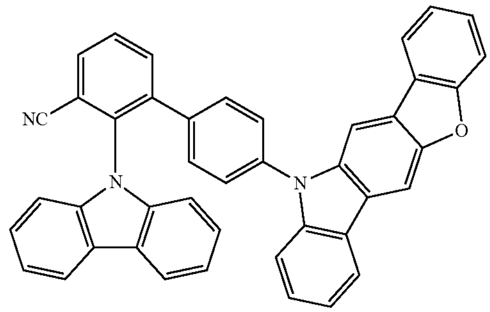
221
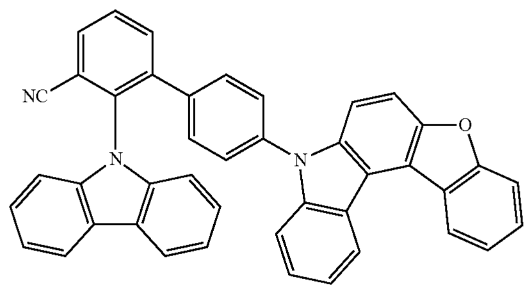
222
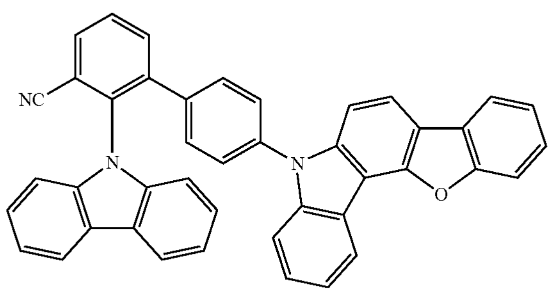
223
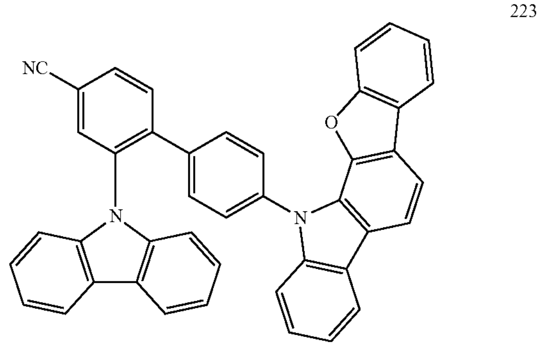

224
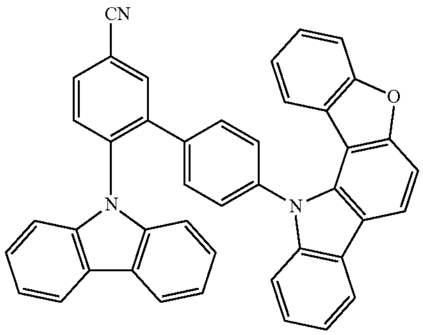
225
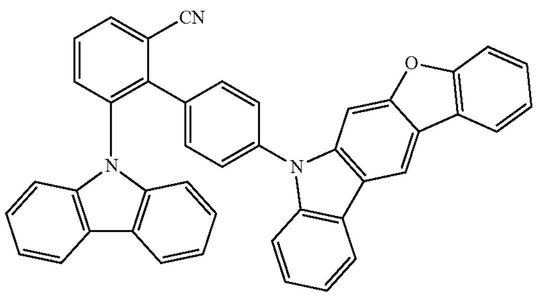
226
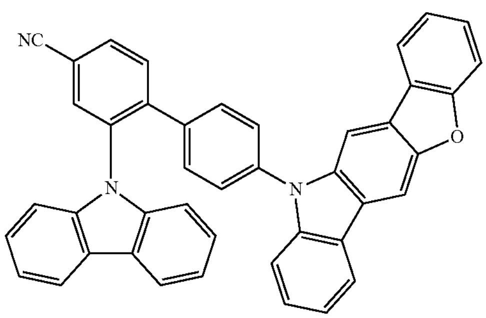
227
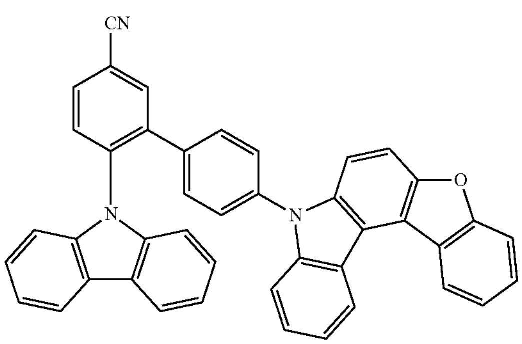
228
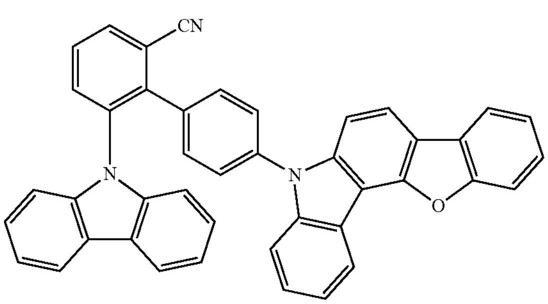
229
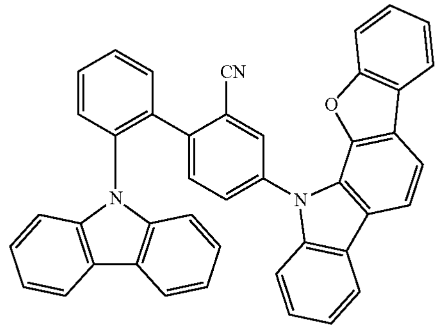
230
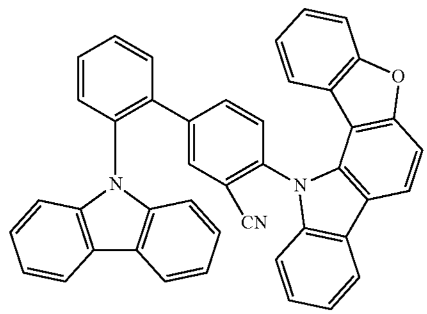
231
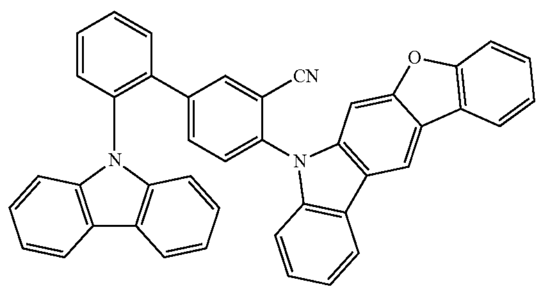
232
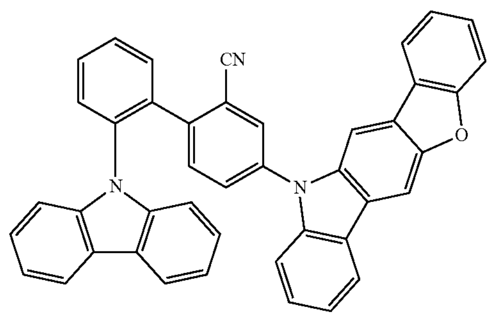
233
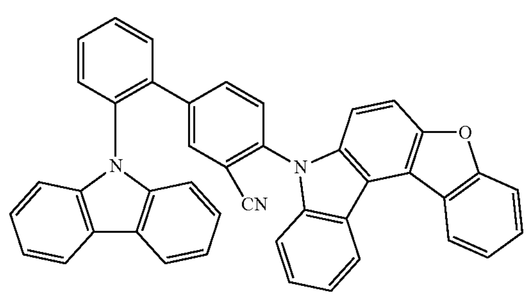

-continued
234
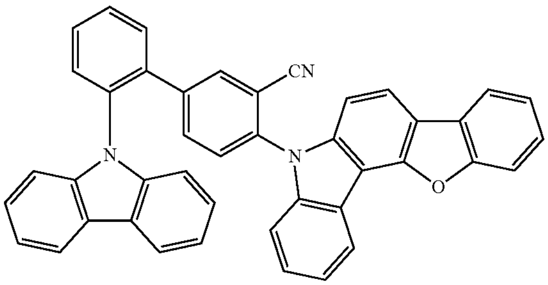
235
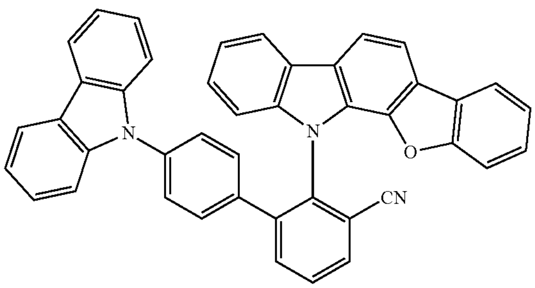
236
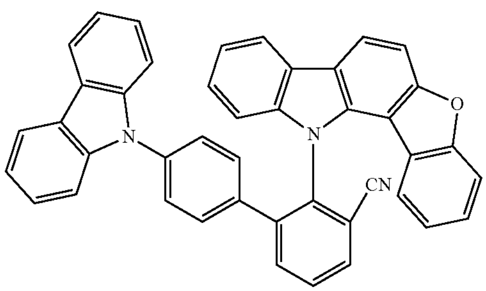
237
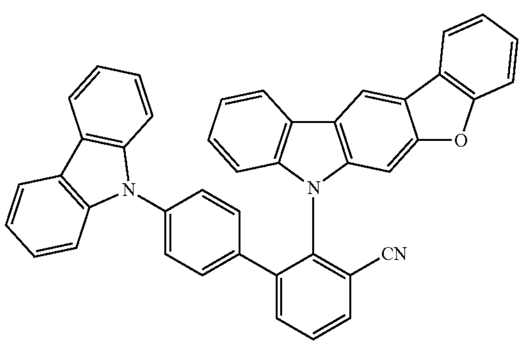
238
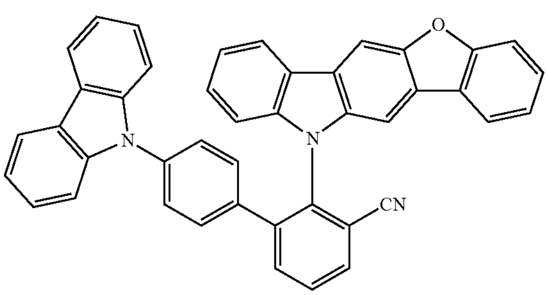
-continued
239
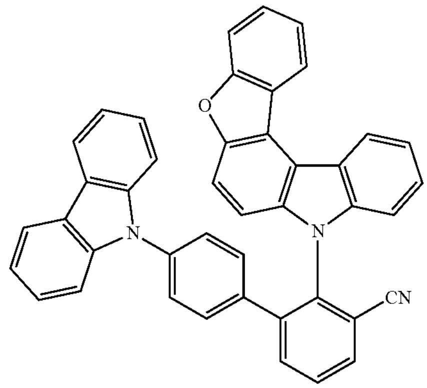
240
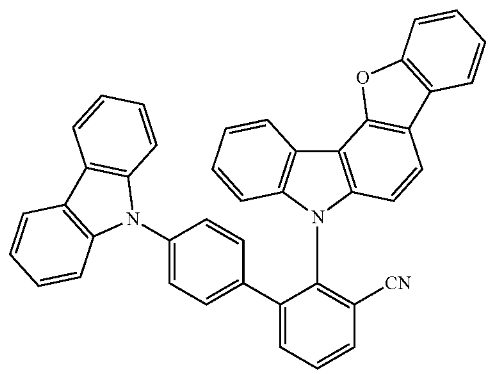
241
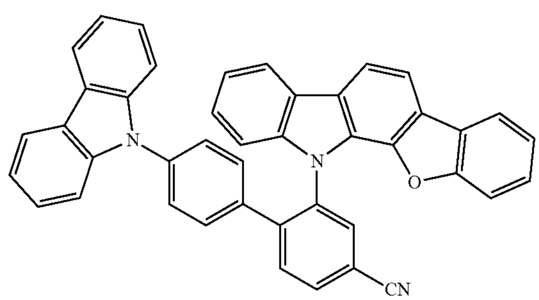
242
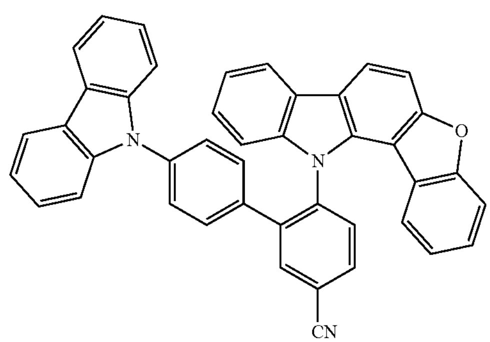

-continued
243
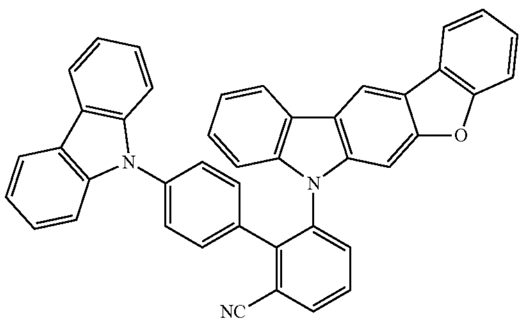
244
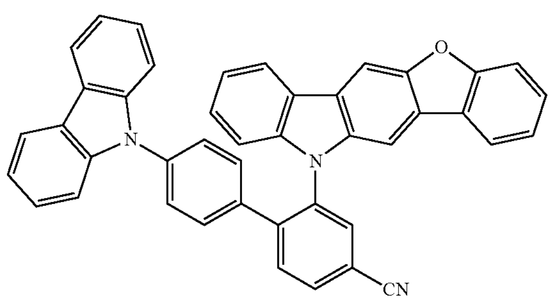
245
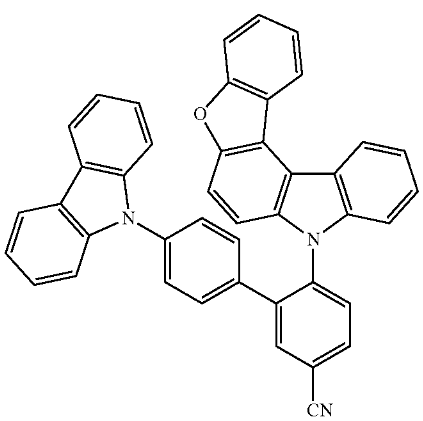
246
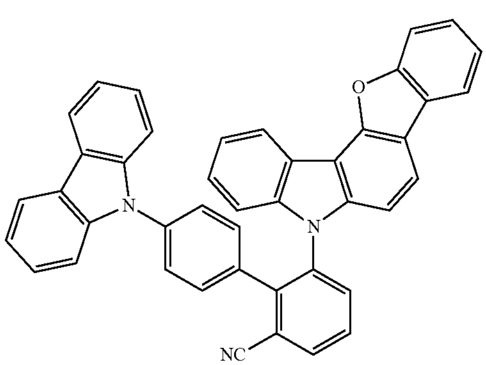
-continued
247
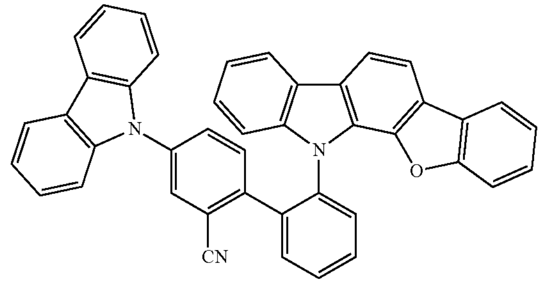
248
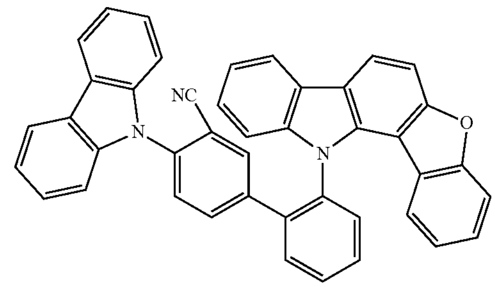
249
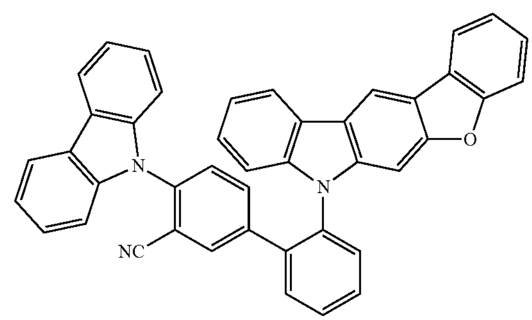
250
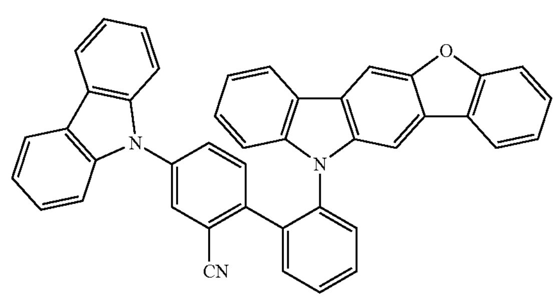
251
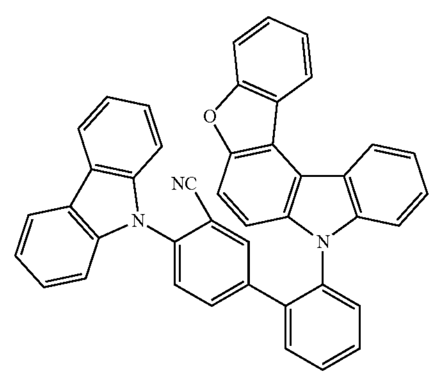

-continued
252
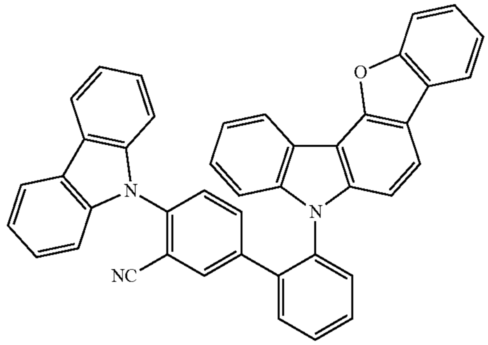
253
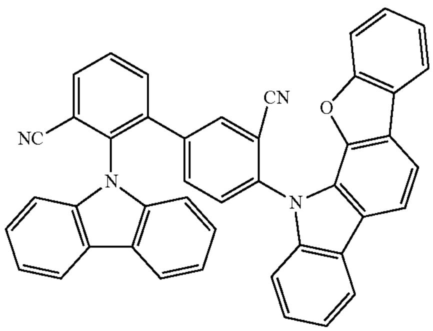
254
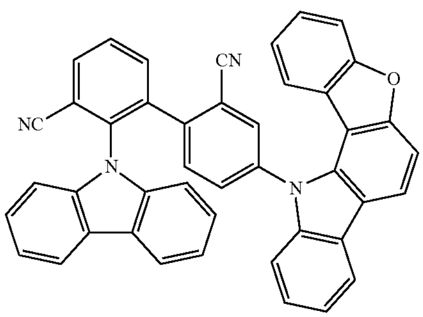
255
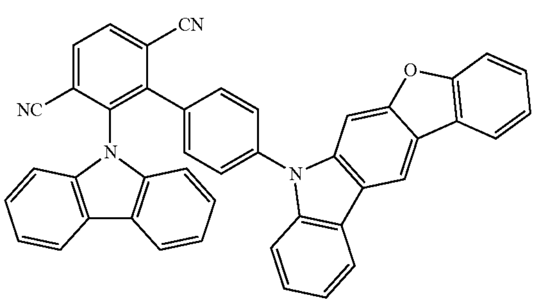
256
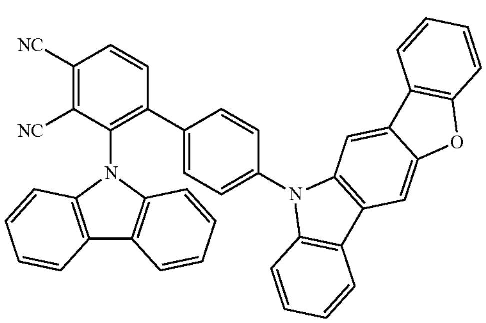
-continued
257
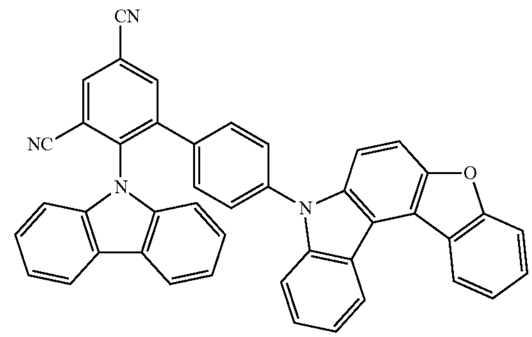
258
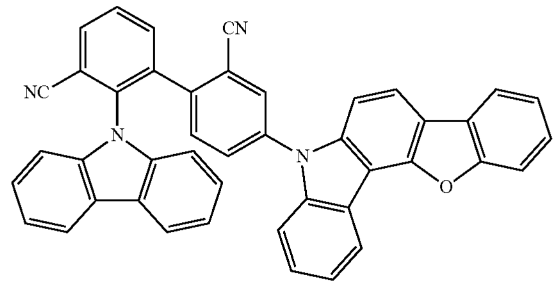
259
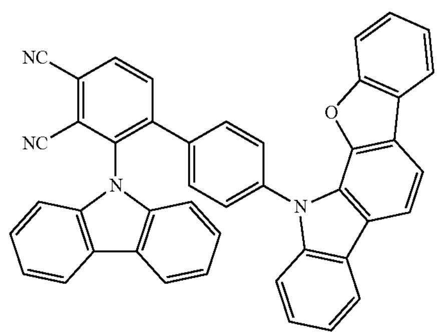
260
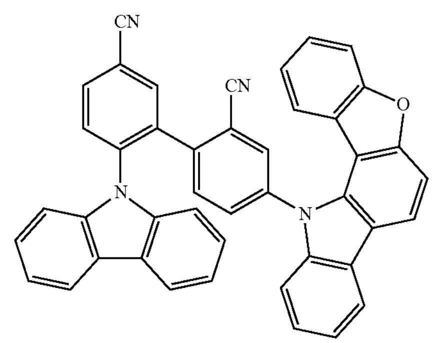
261
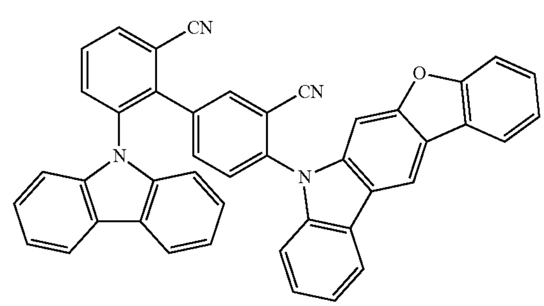

262
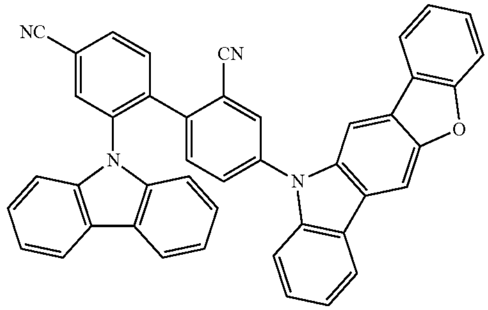
263
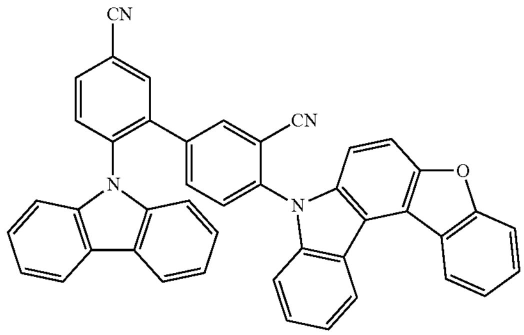
264
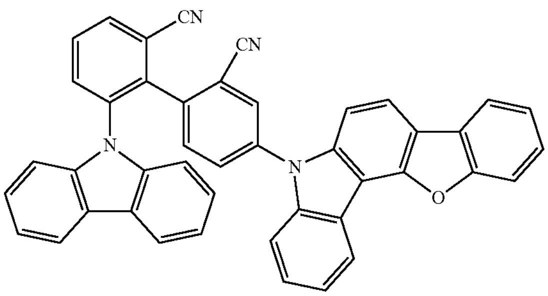
265
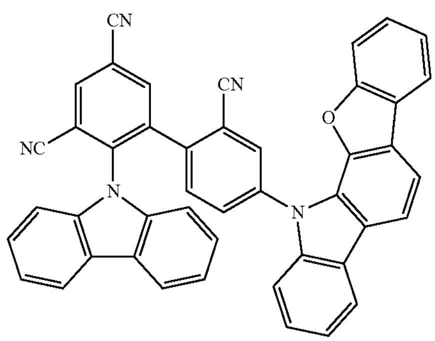
266
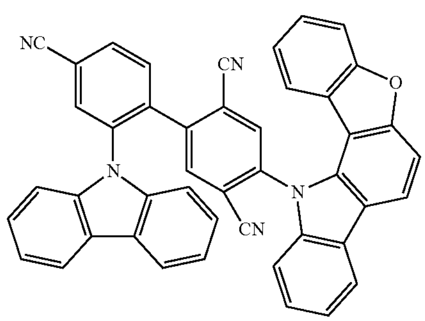
267
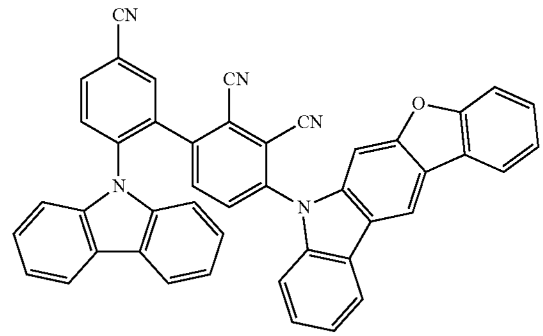
268
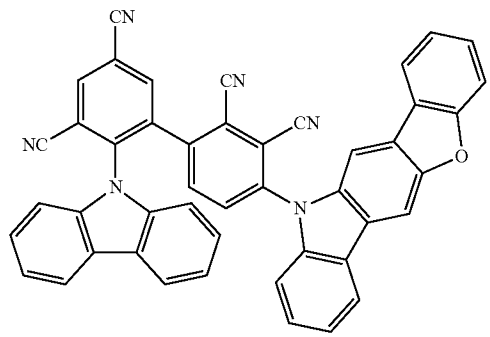
269
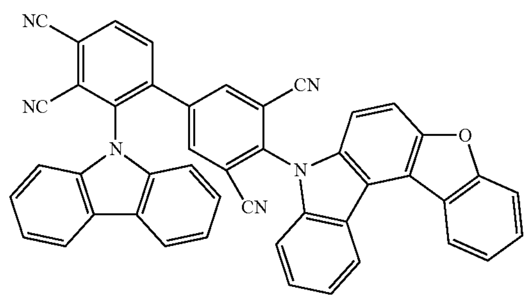
270
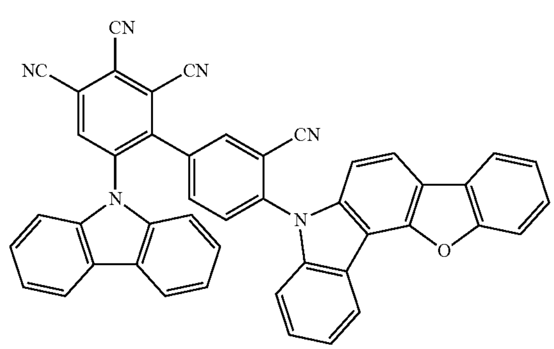

-continued
271
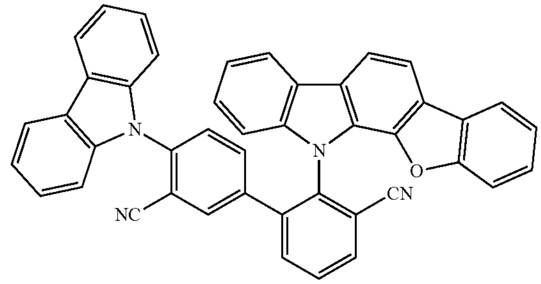
272
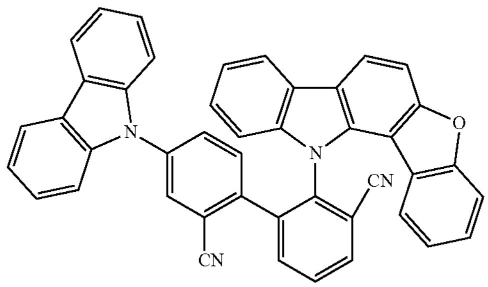
273
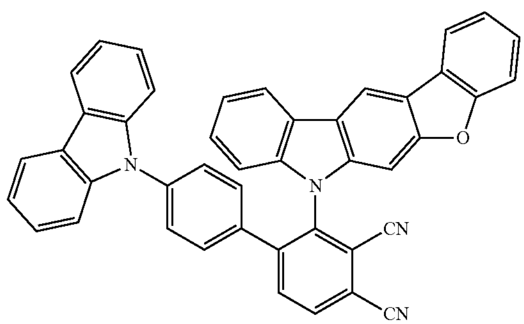
274
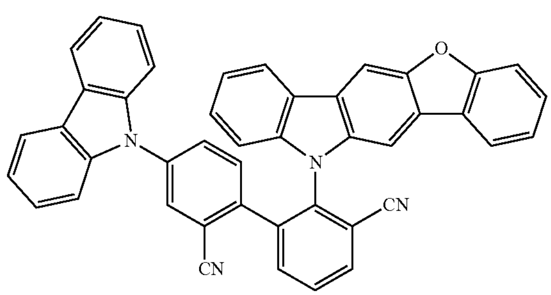
275
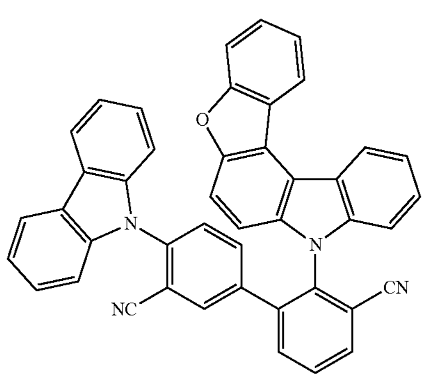
-continued
276
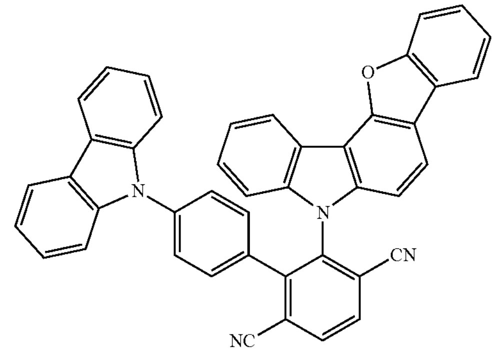
277
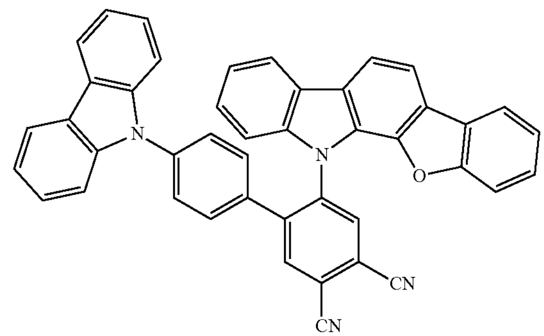
278
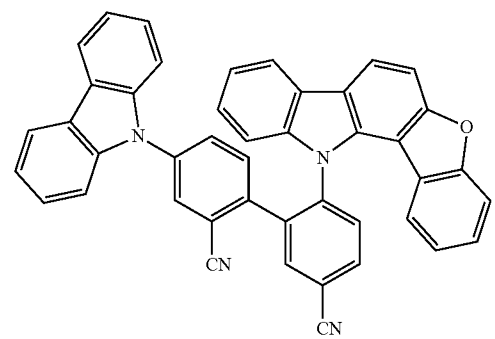
279
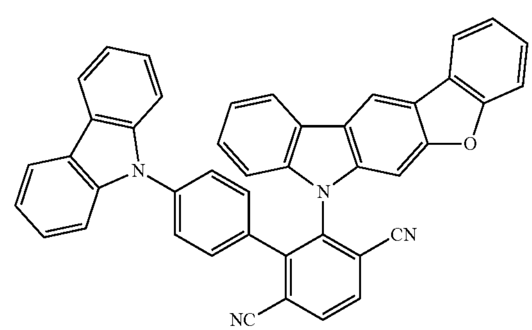

280
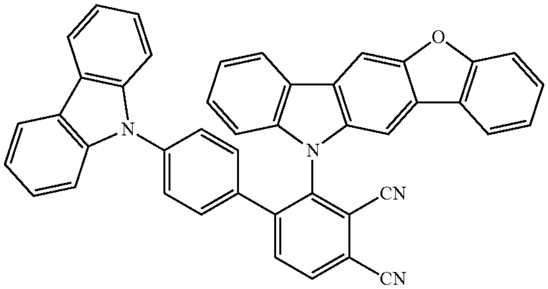
281
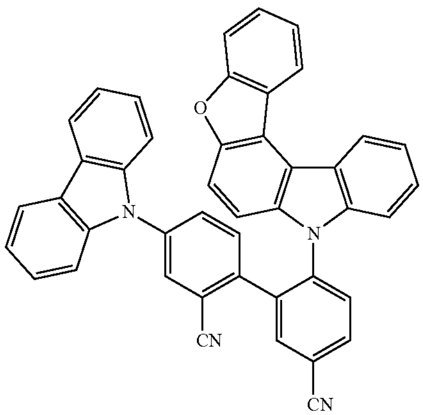
282
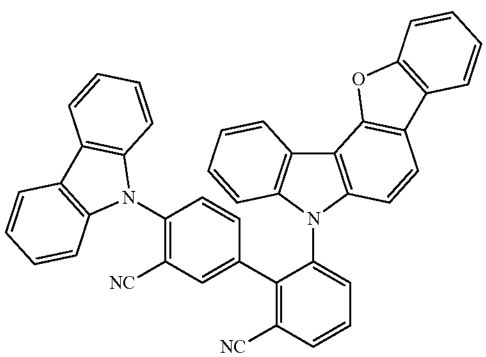
283
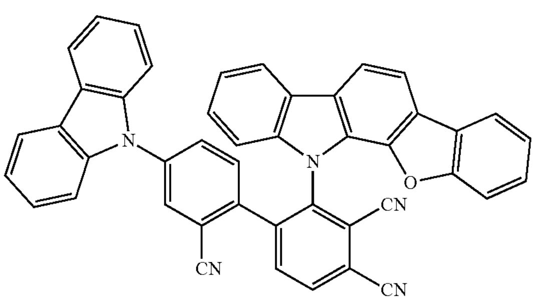
284
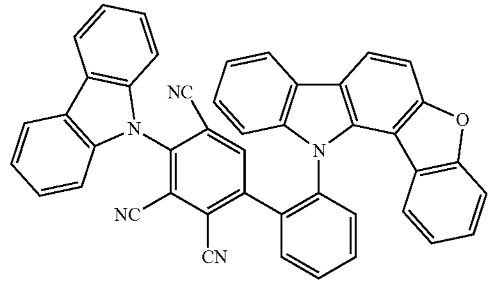
285
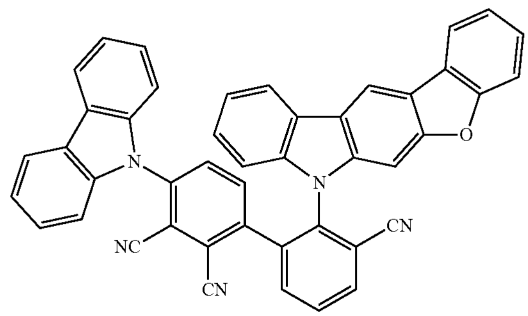
286
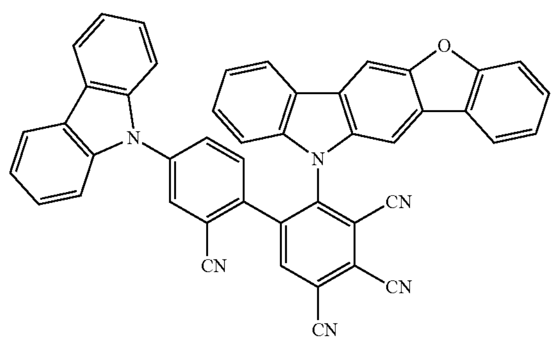
287
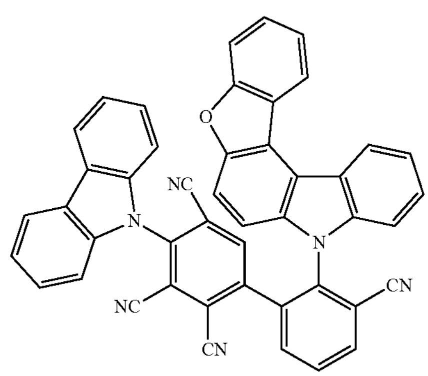

-continued
288
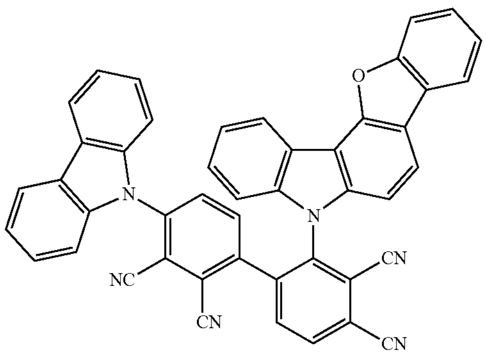
289
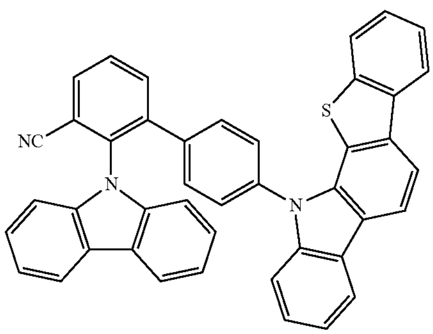
290
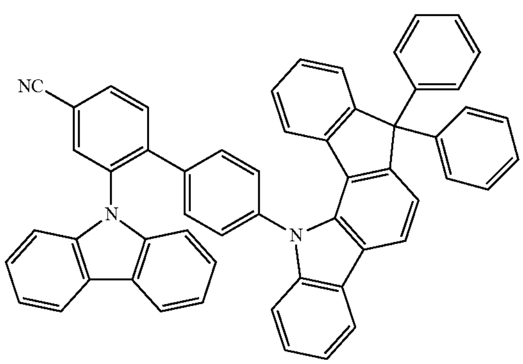
291
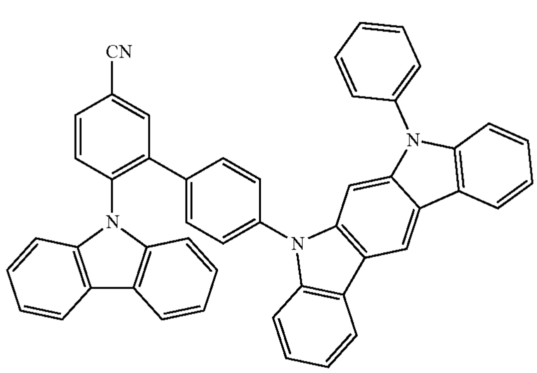
-continued
292
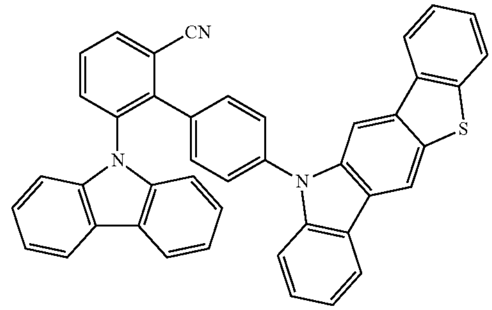
293
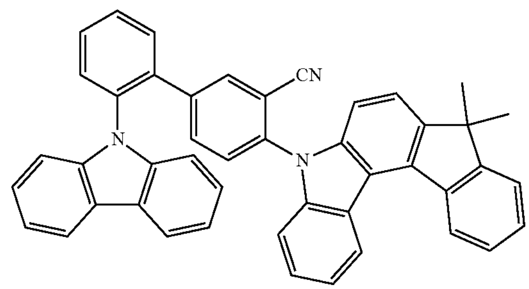
294
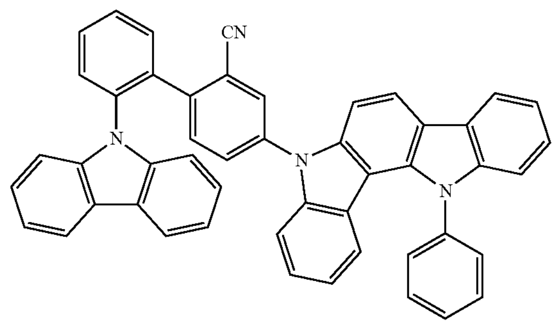
295
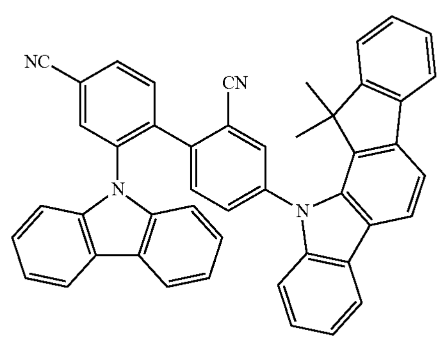
296
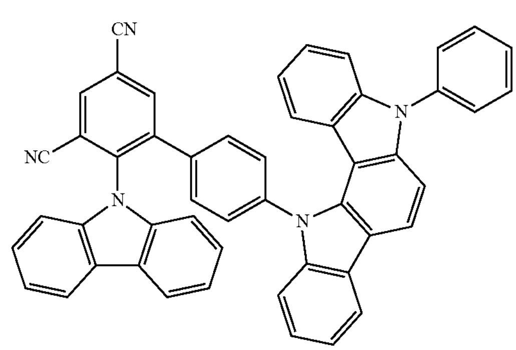

-continued
297
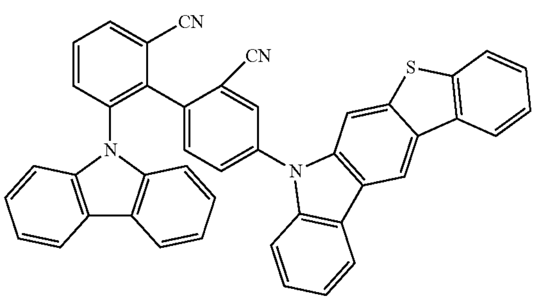
298
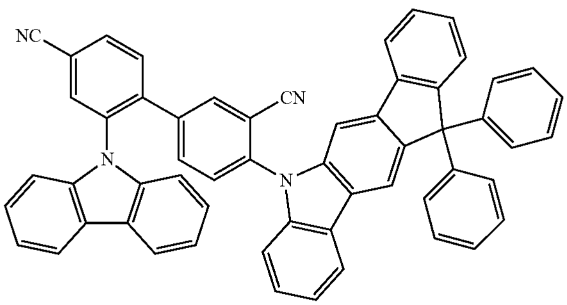
299
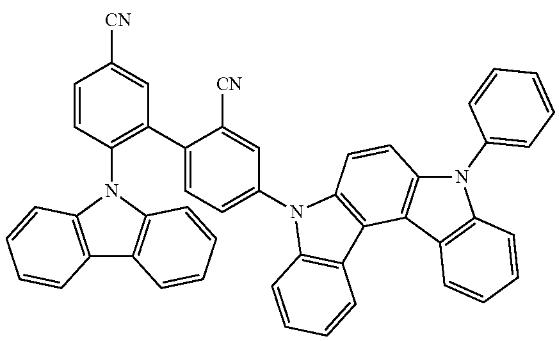
300
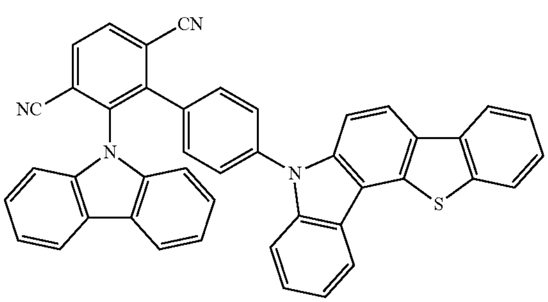
301
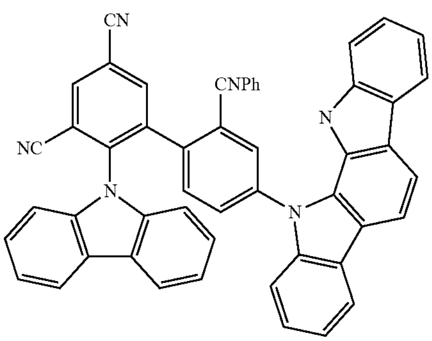
-continued
302
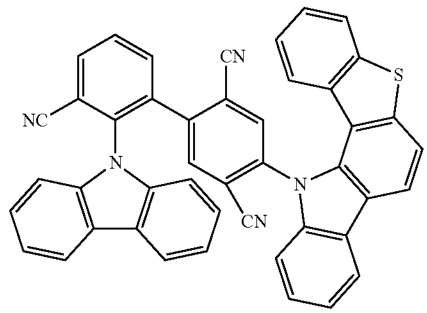
303
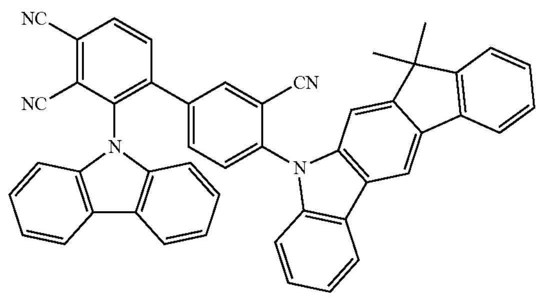
304
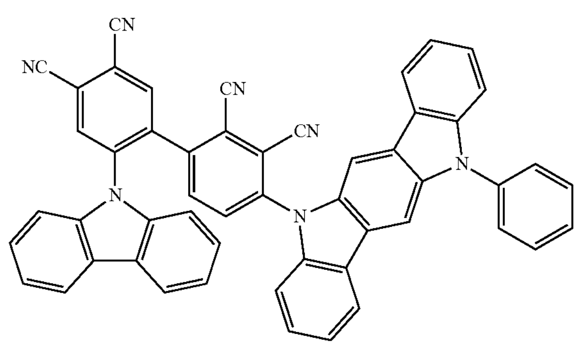
305
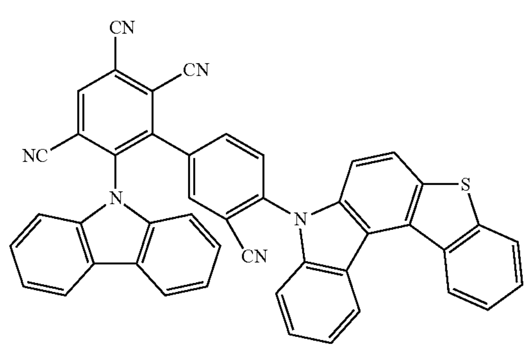

-continued
306
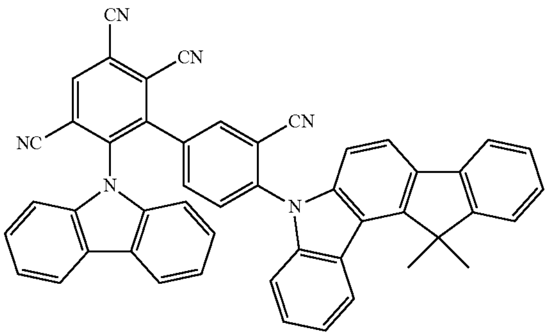
307
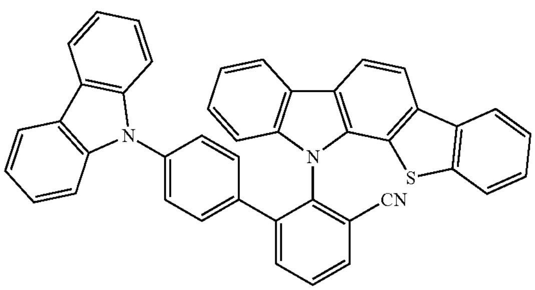
308
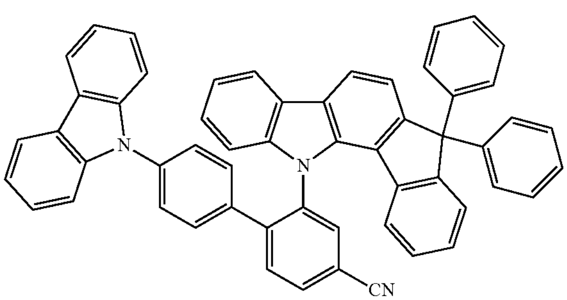
309
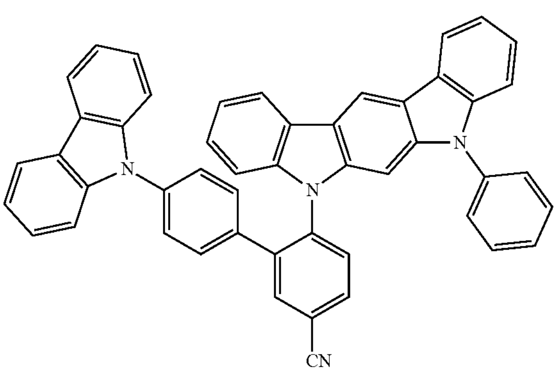
-continued
310
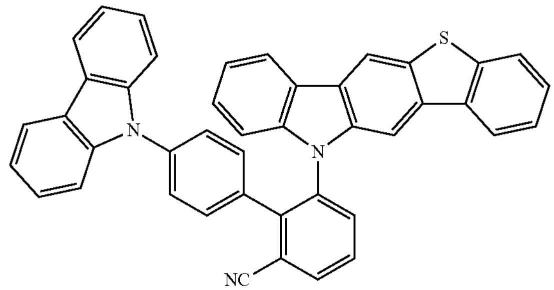
311
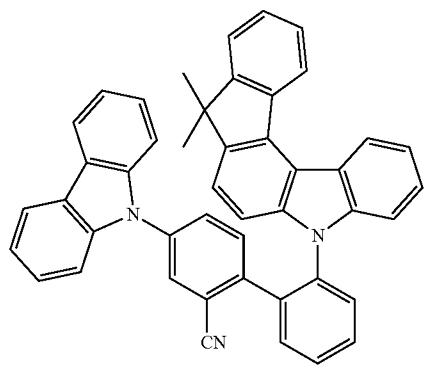
312
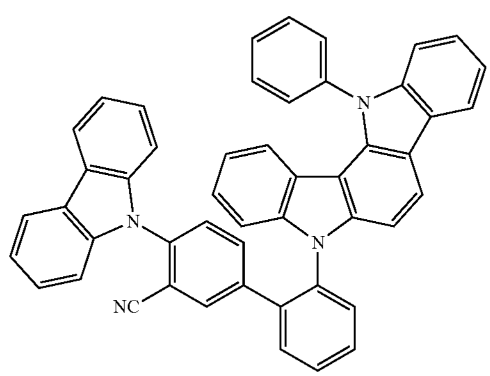
313
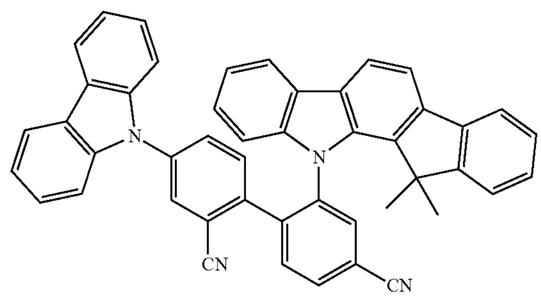

-continued
314
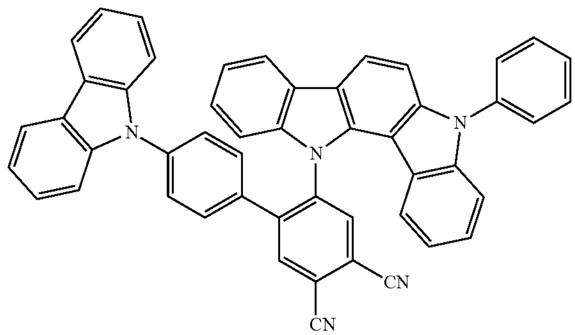
315
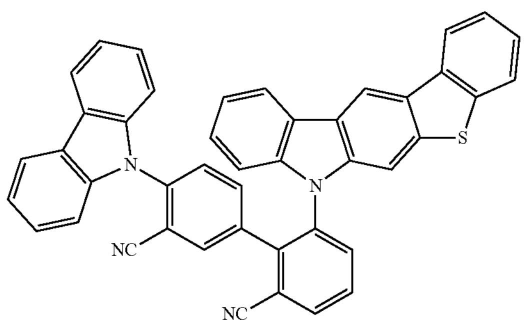
316
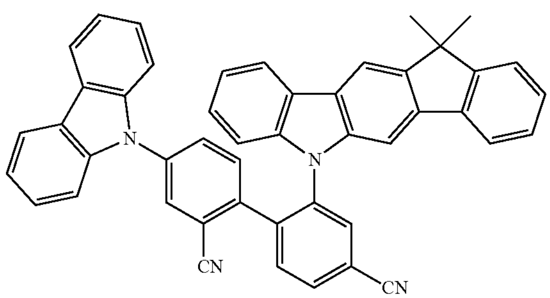
317
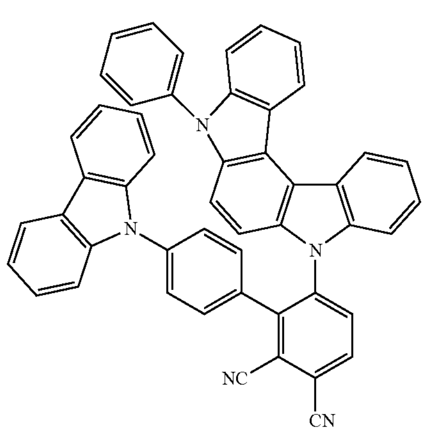
-continued
318
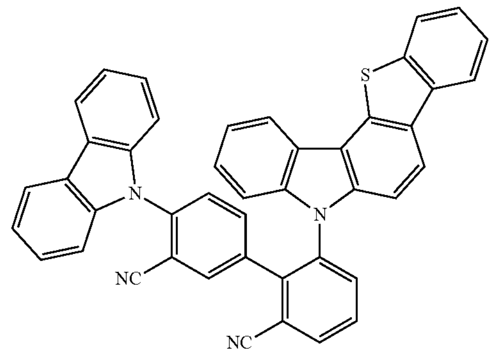
319
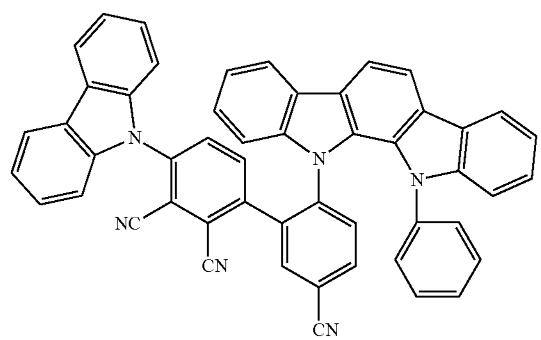
320
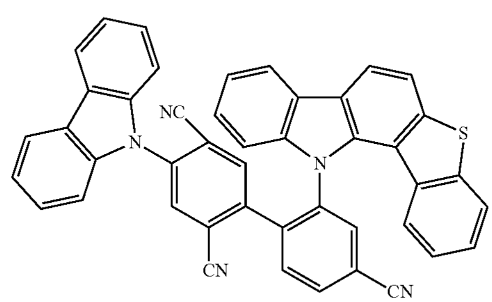
321
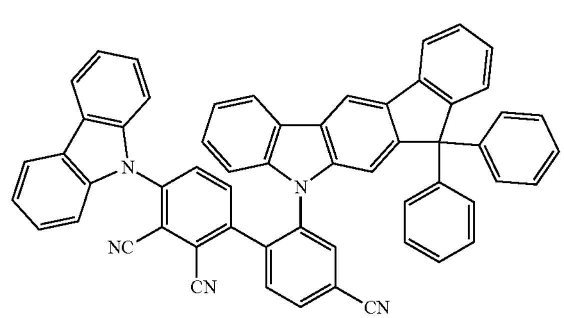

-continued
322
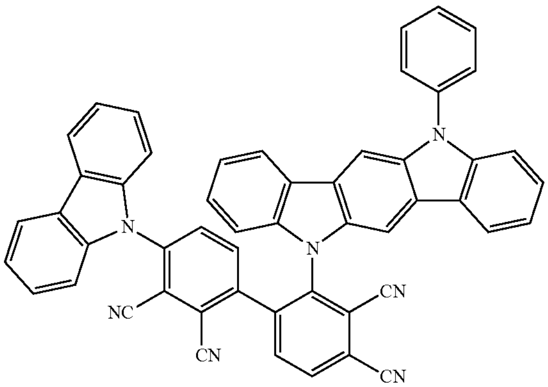
323
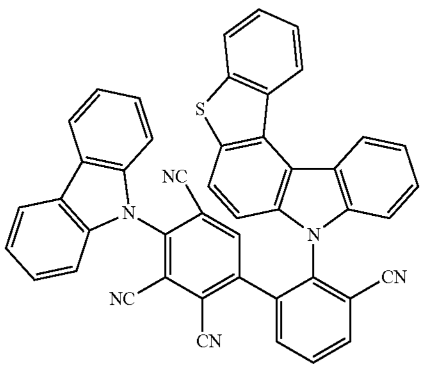
324
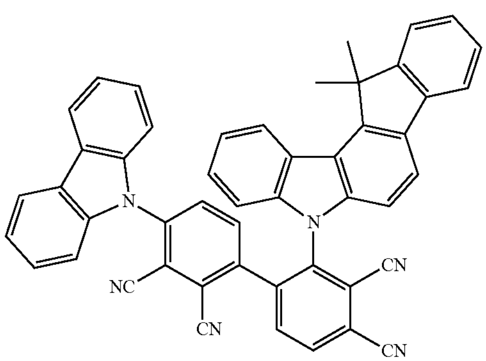
325
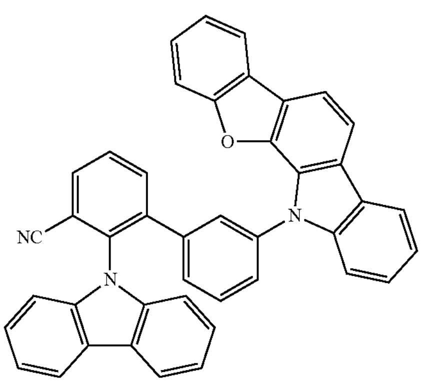
-continued
326
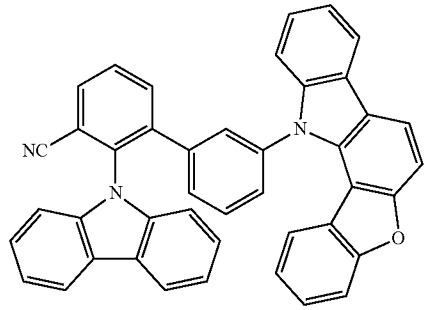
327
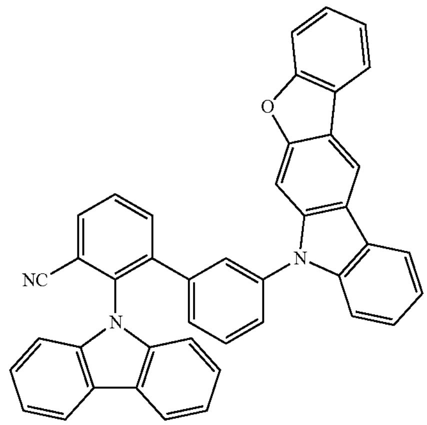
328
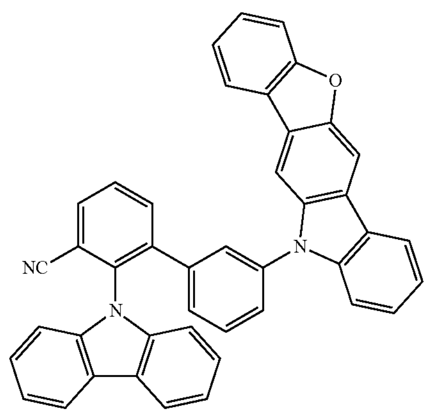
329
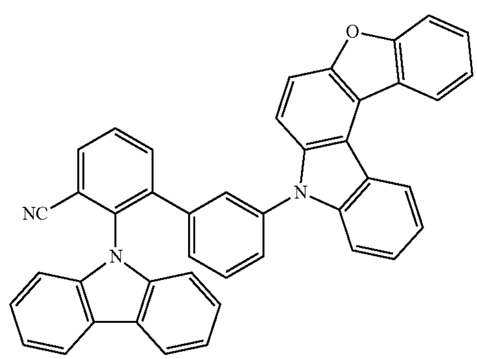

330
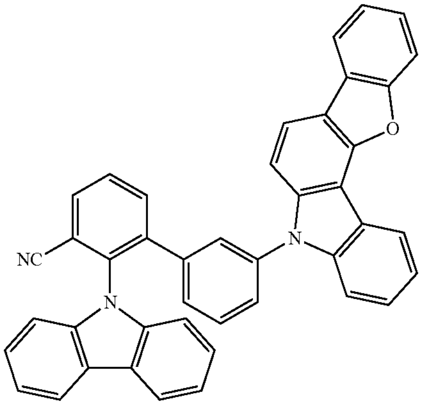
331
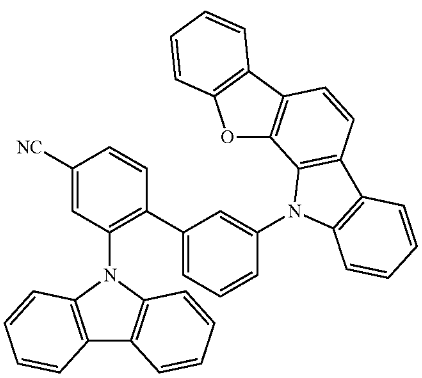
332
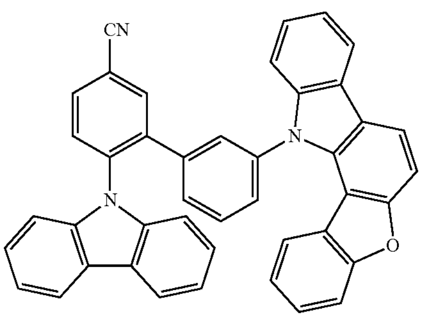
333
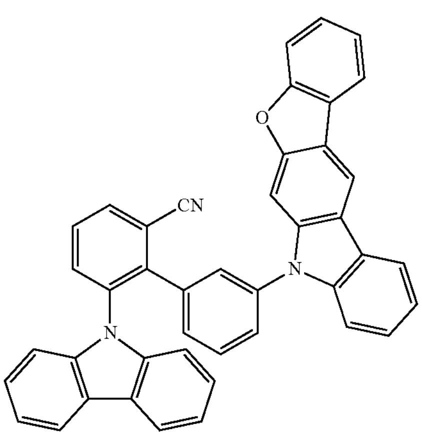
334
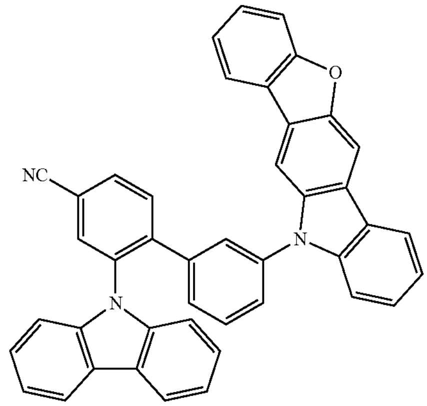
335
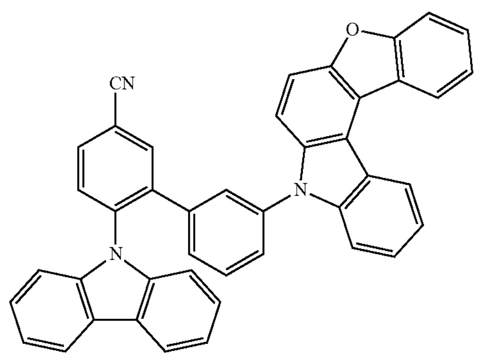
336
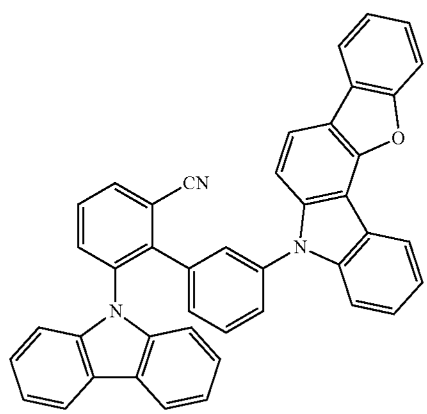
337
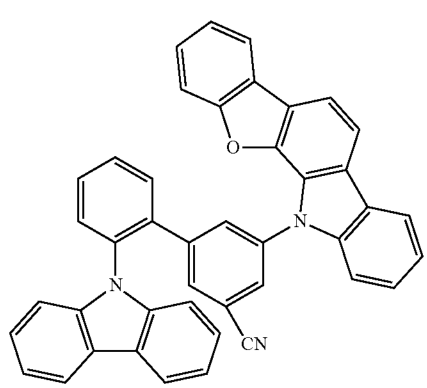

-continued
338
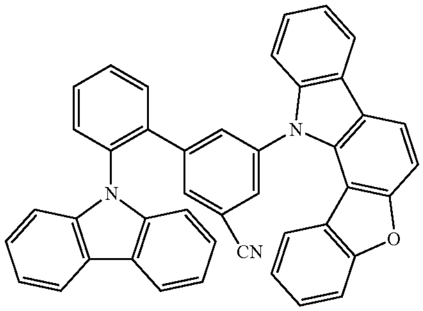
339
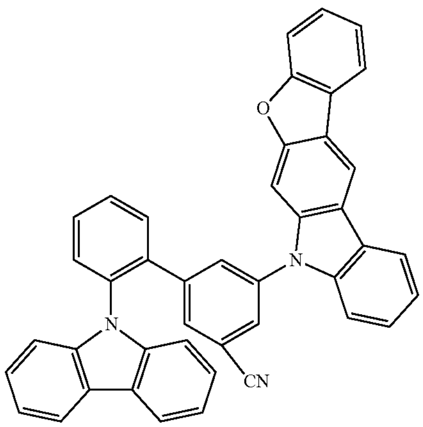
340
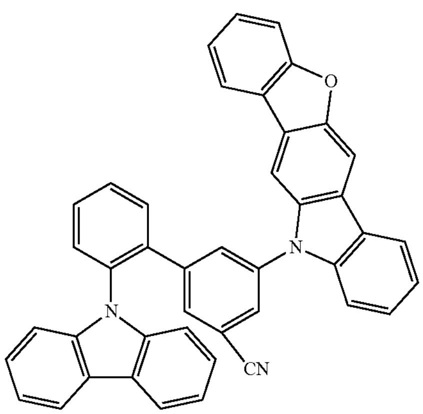
341
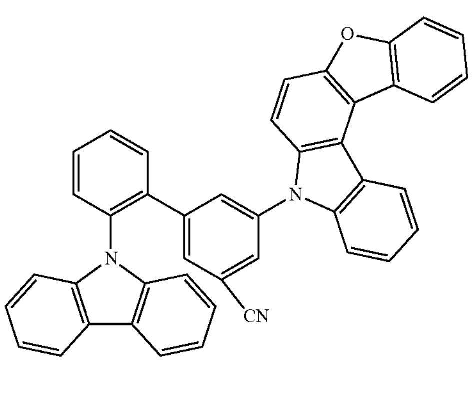
-continued
342
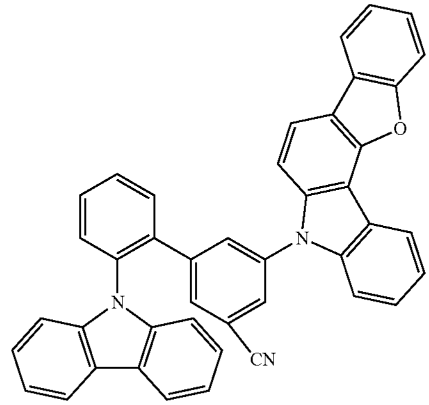
343
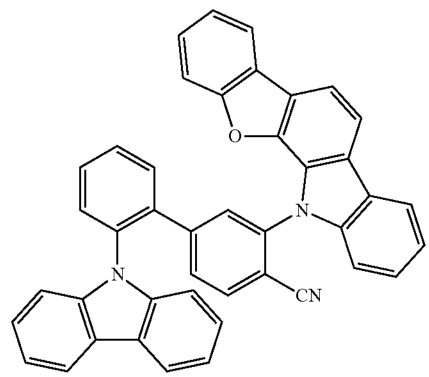
344
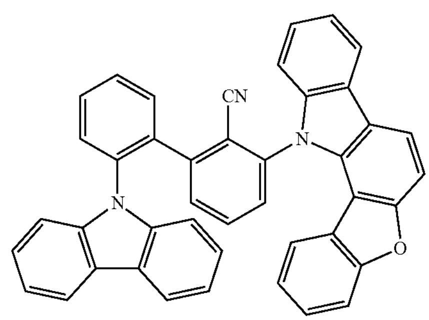
345
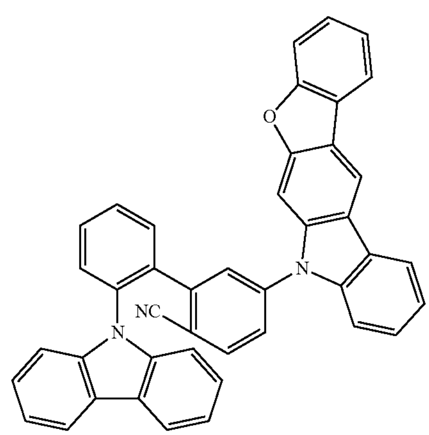

-continued
346
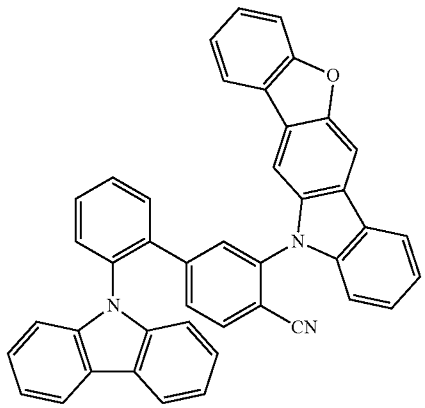
347
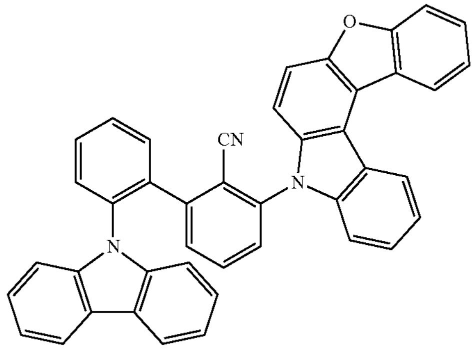
348
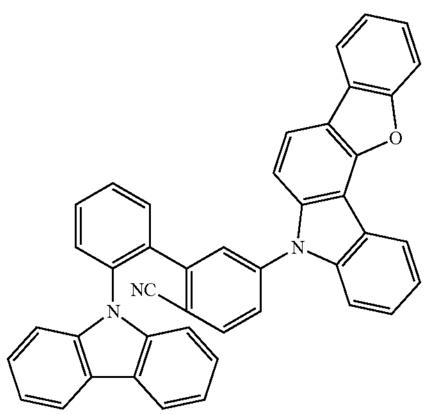
349
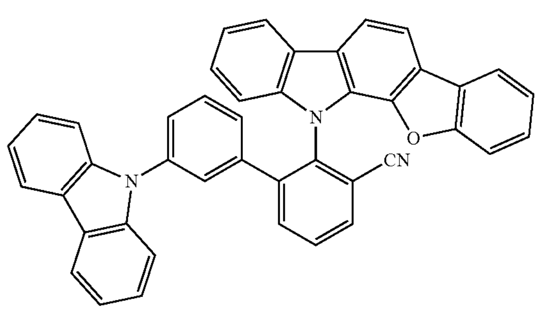
-continued
350
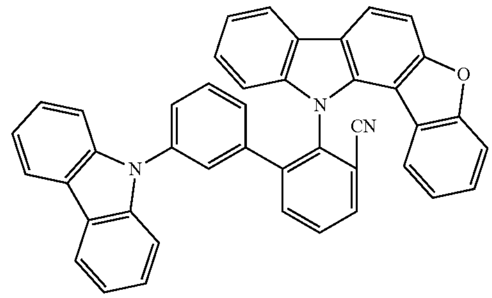
351
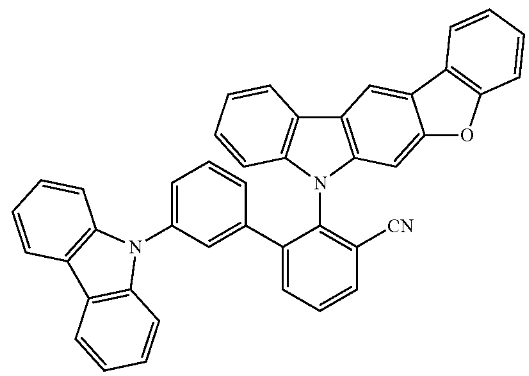
352
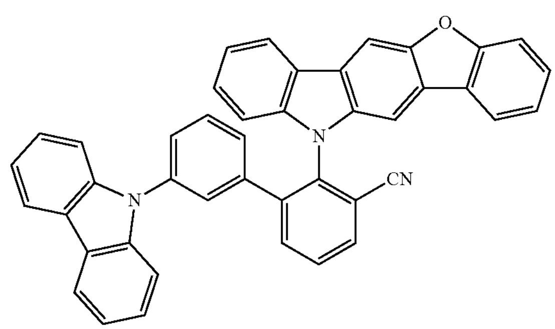
353
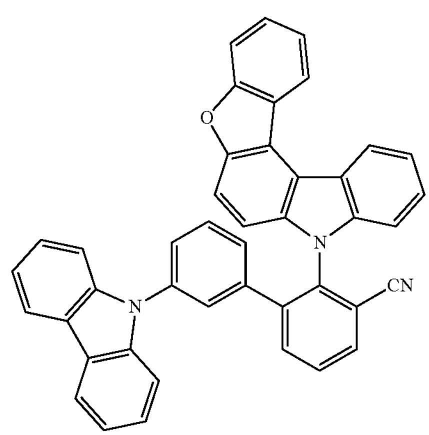

354
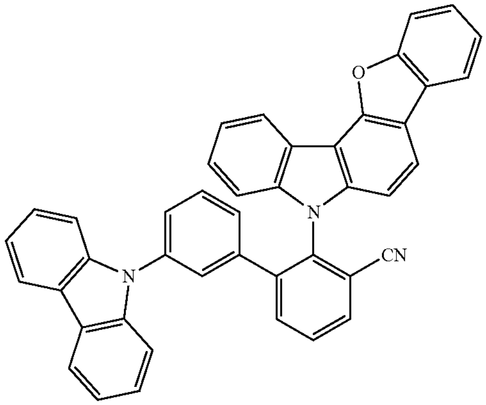
355
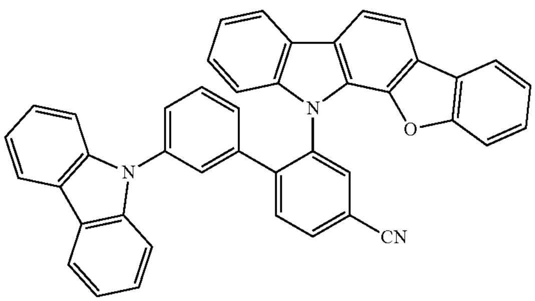
356
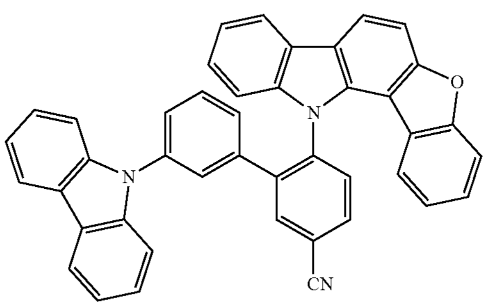
357
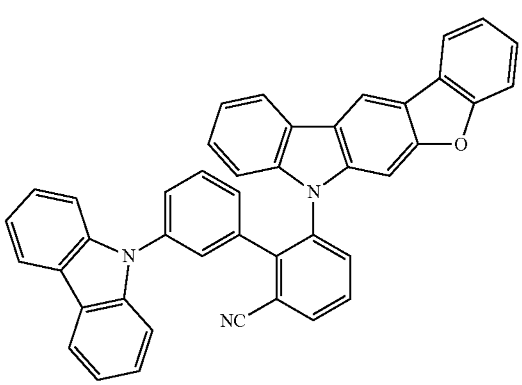
358
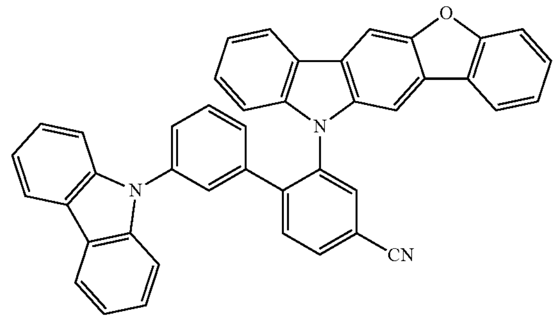
359
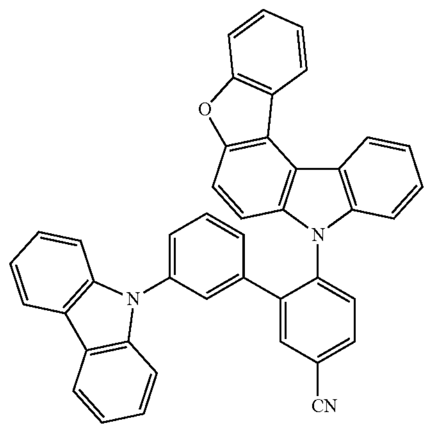
360
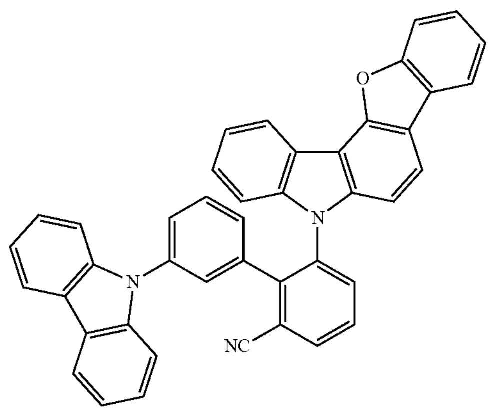
361
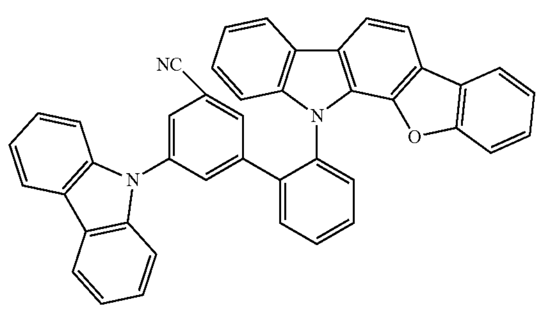

-continued
362
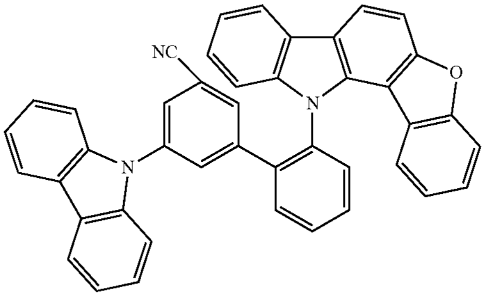
363
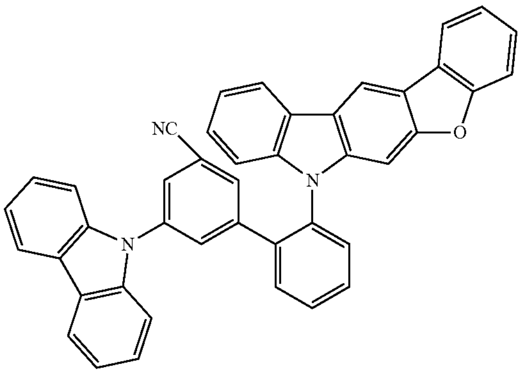
364
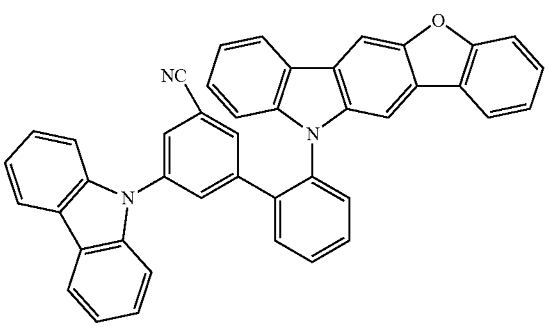
365
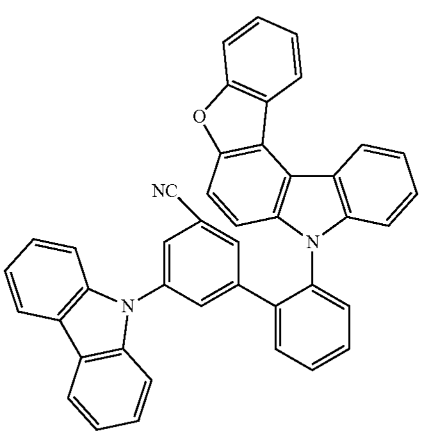
-continued
366
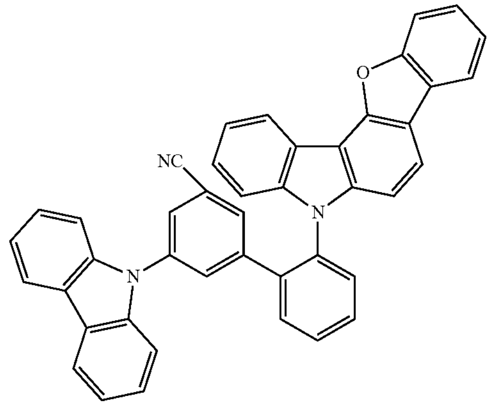
367
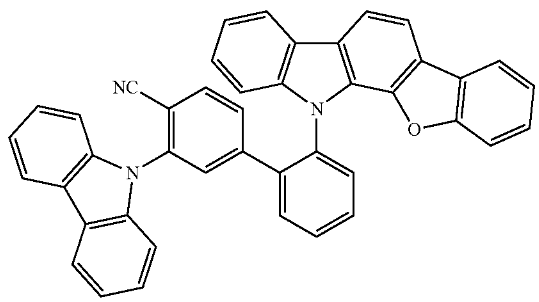
368
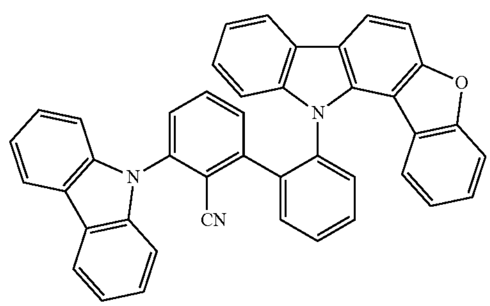
369
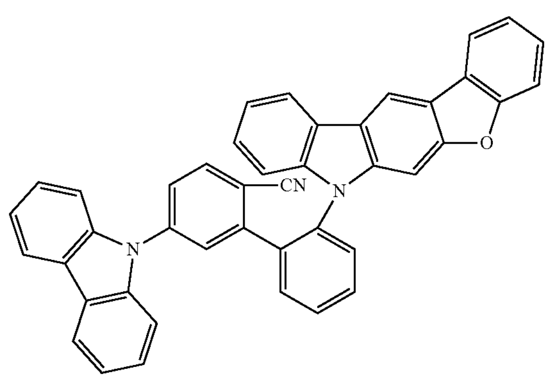

-continued
370
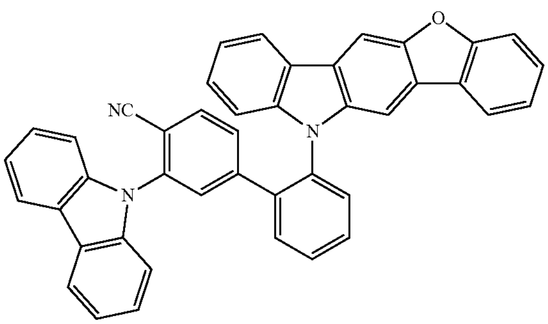
371
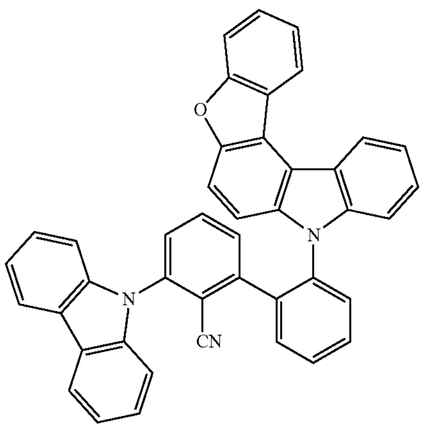
372
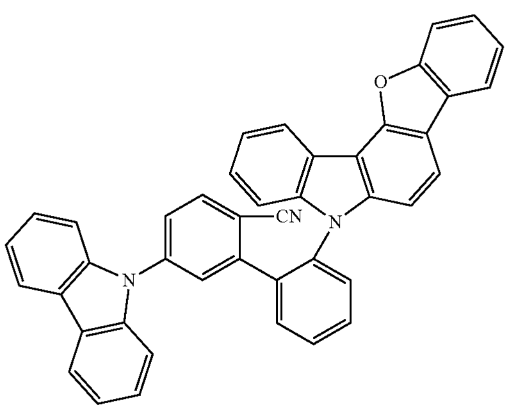
373
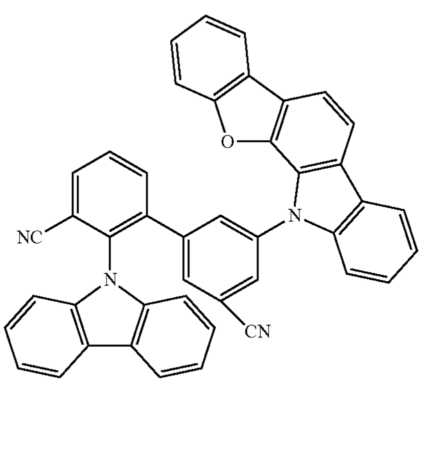
-continued
374
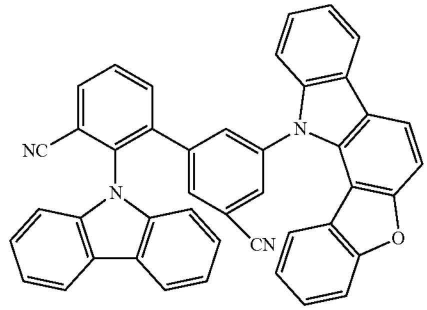
375
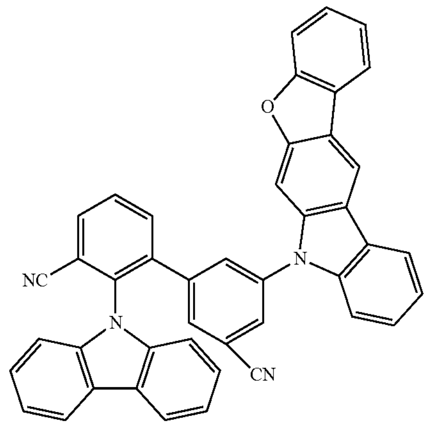
376
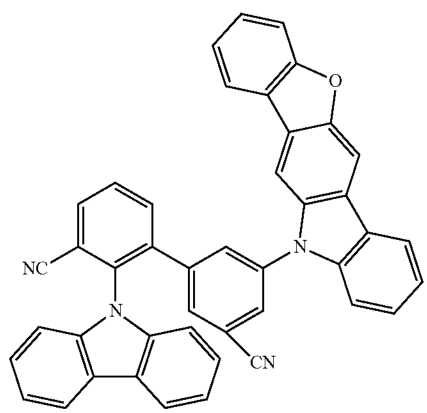
377
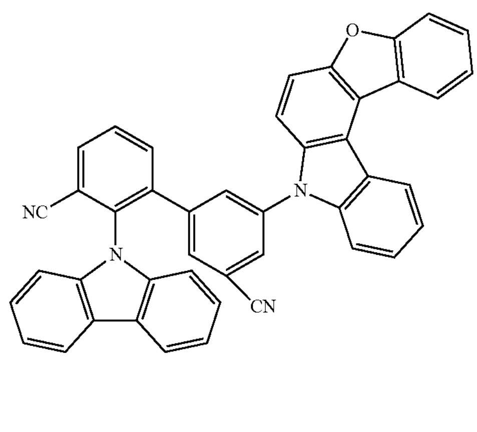

-continued
378
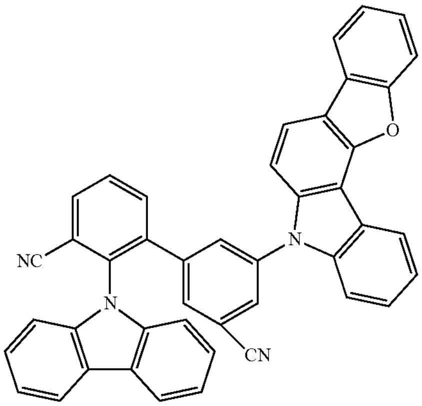
379
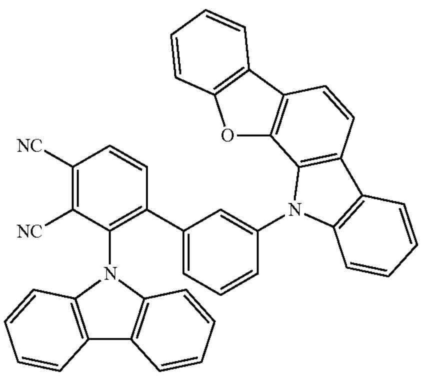
380
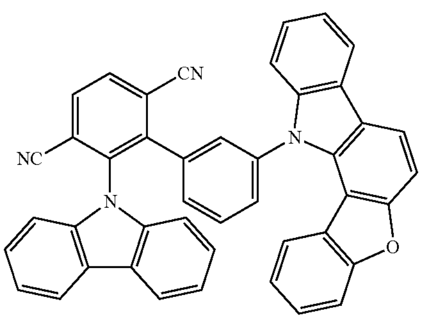
381
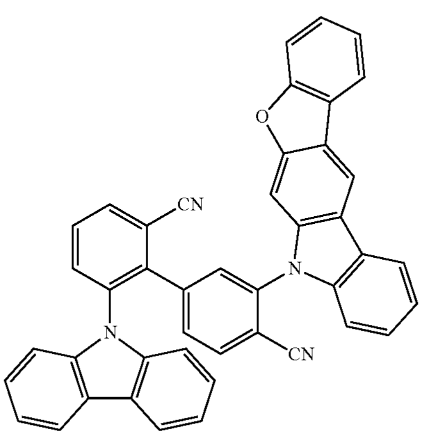
-continued
382
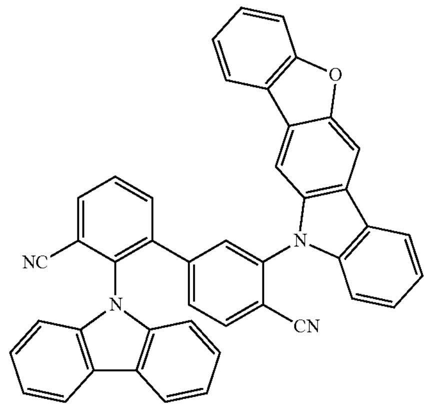
383
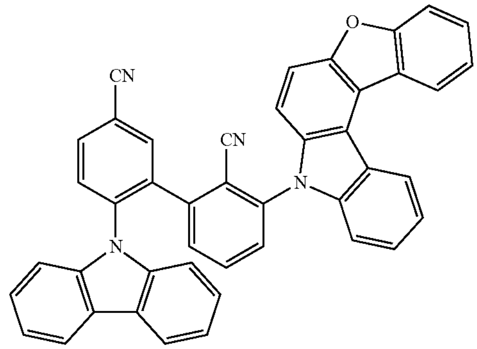
384
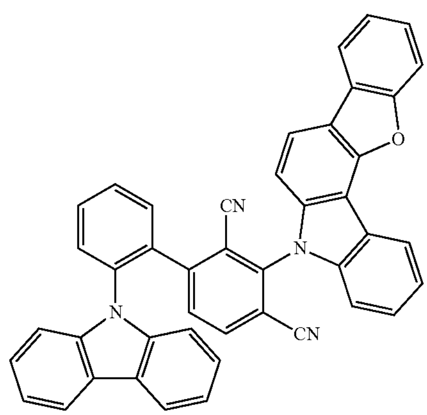
385
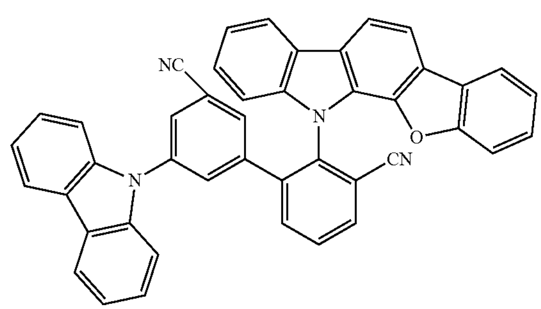

-continued
386
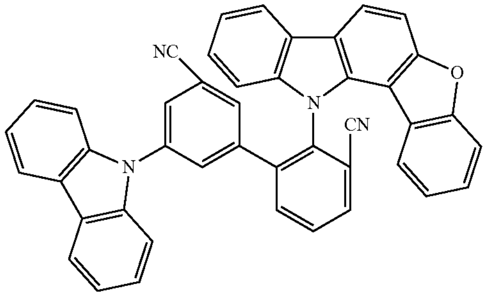
387
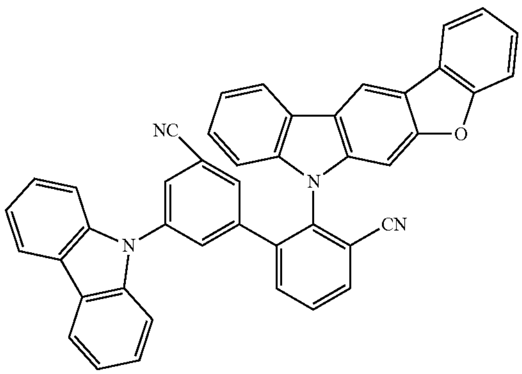
388
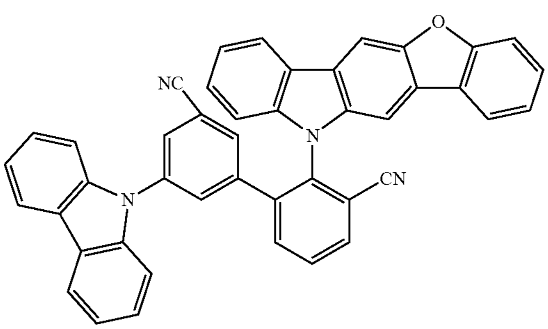
389
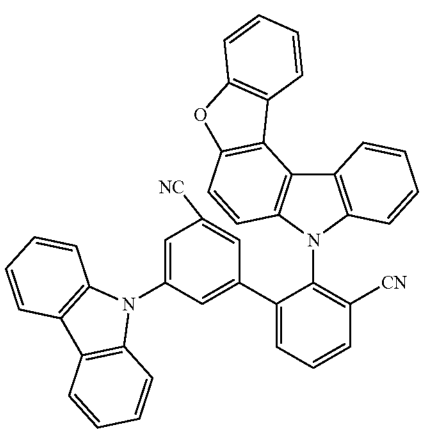
-continued
390
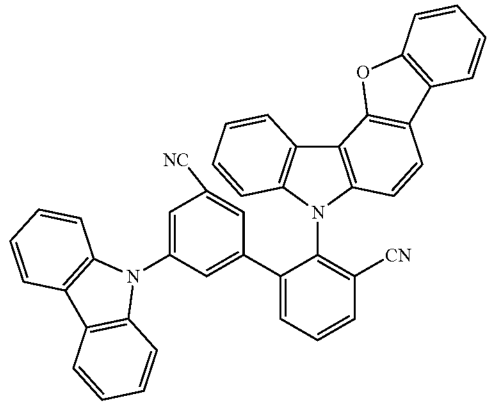
391
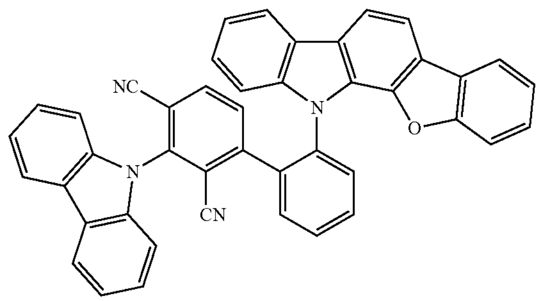
392
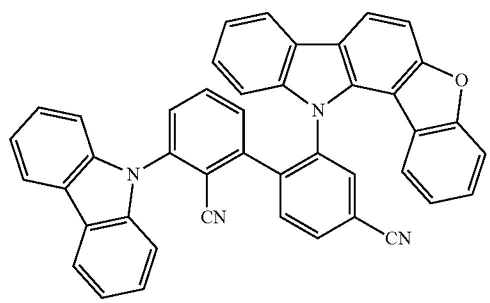
393
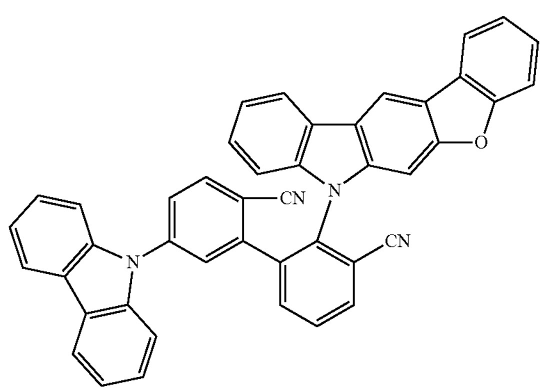

394
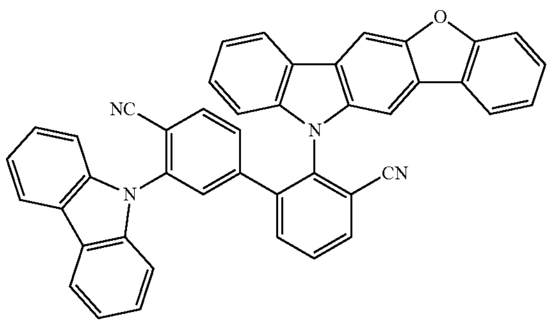
395
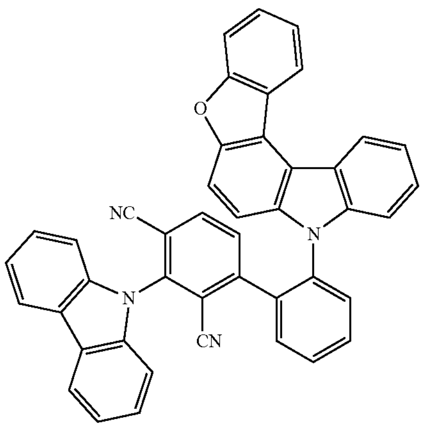
396
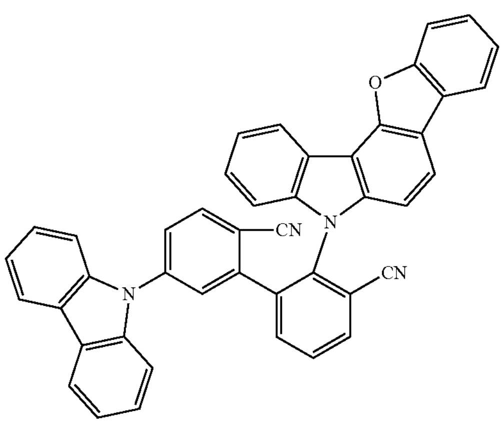
397
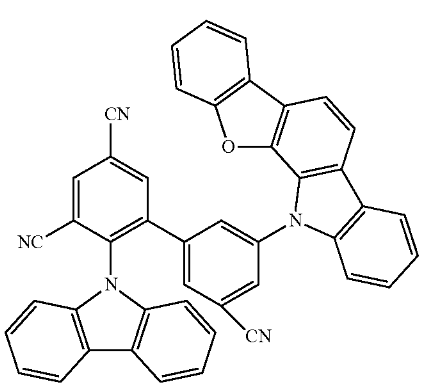
398
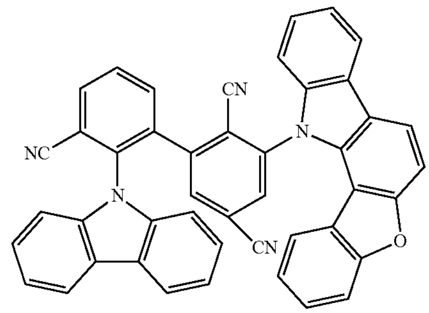
399
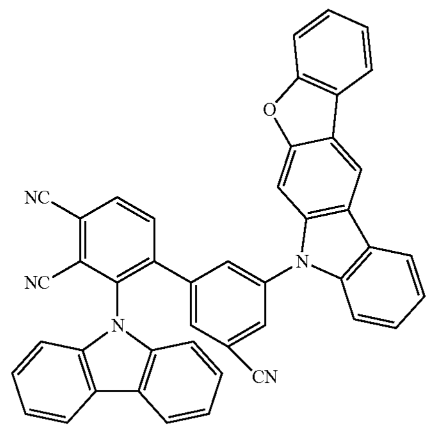
400
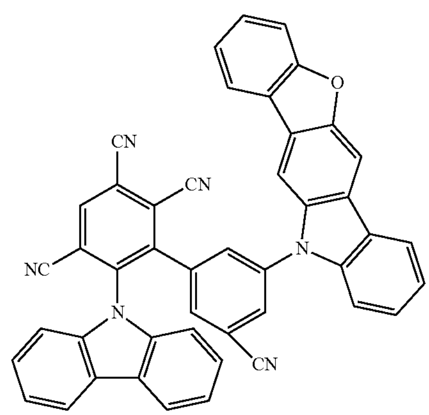
401
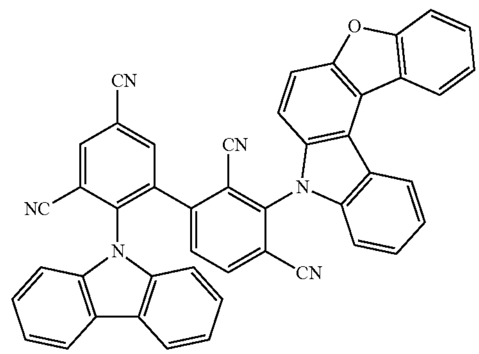

-continued
402
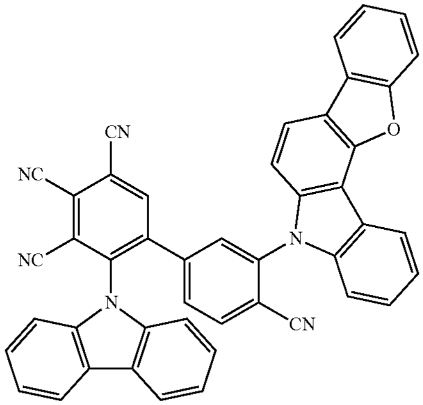
403
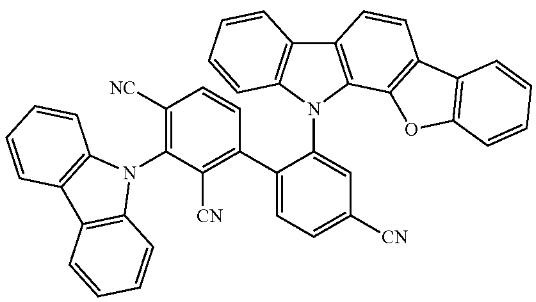
404
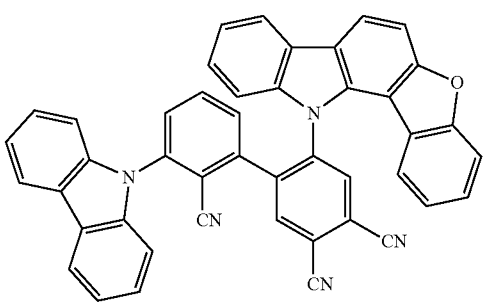
405
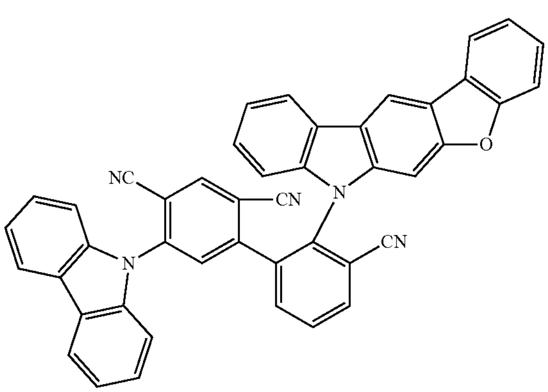
-continued
406
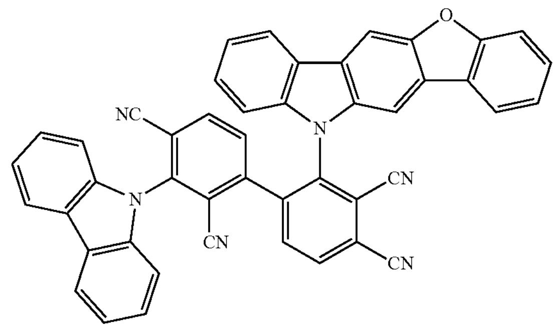
407
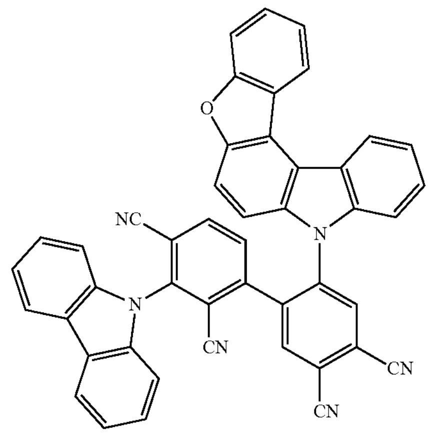
408
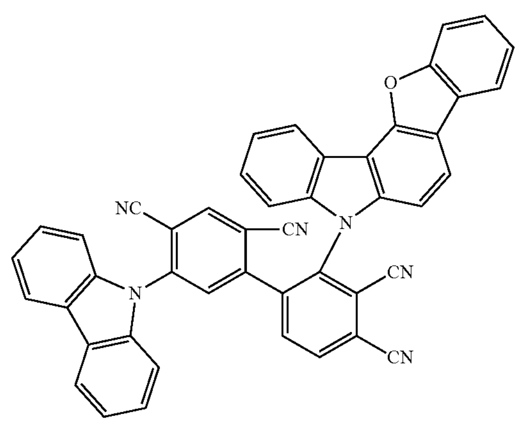
409
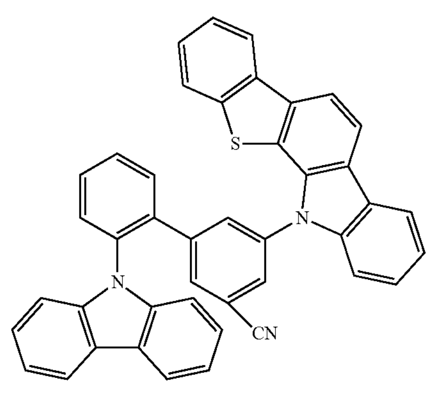

410
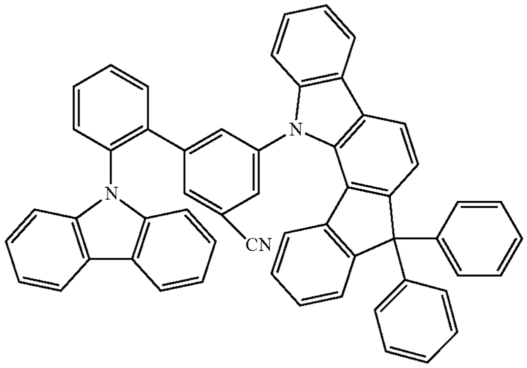
411
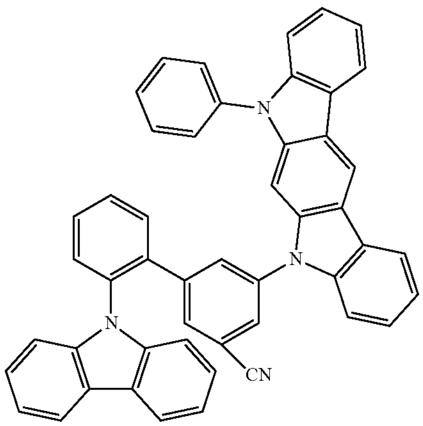
412
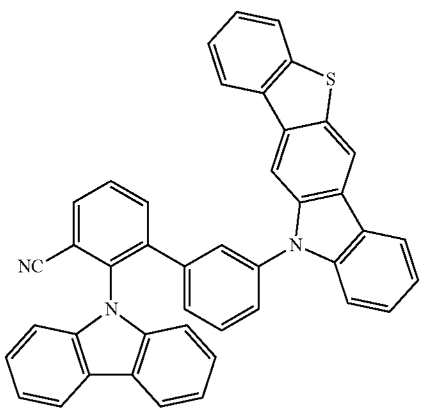
413
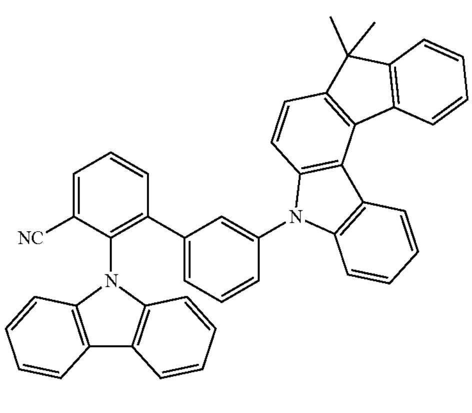
414
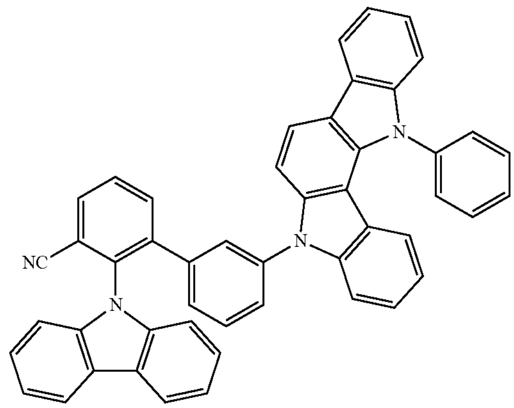
415
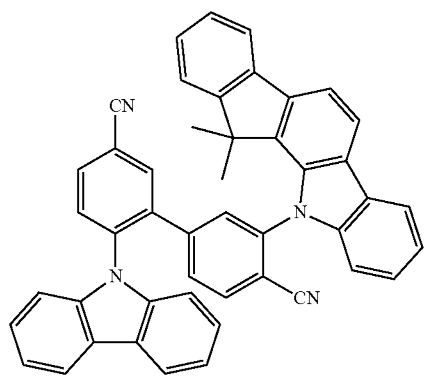
416
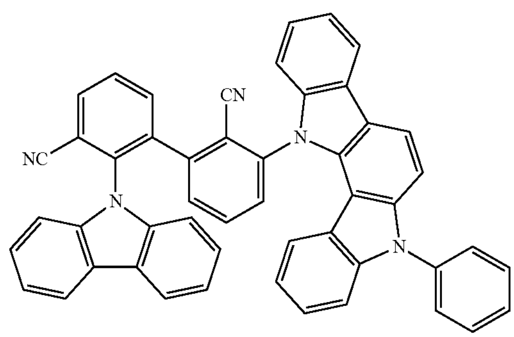
417
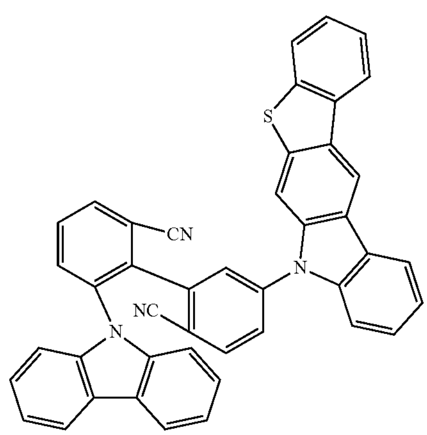

418
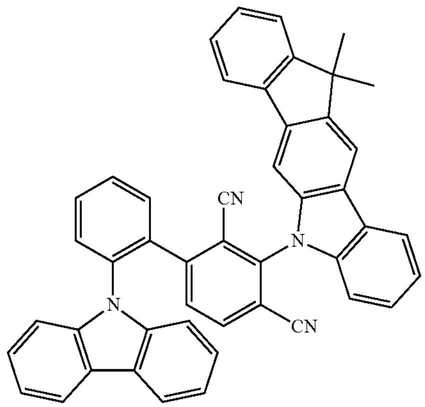
419
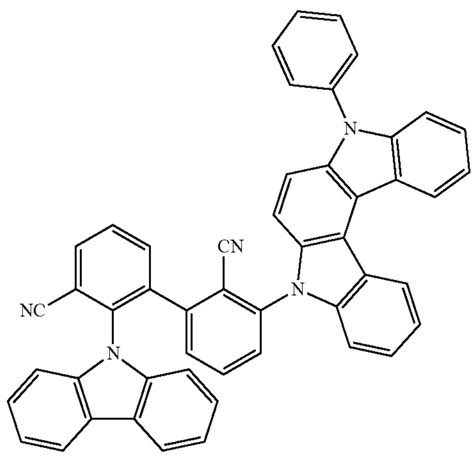
420
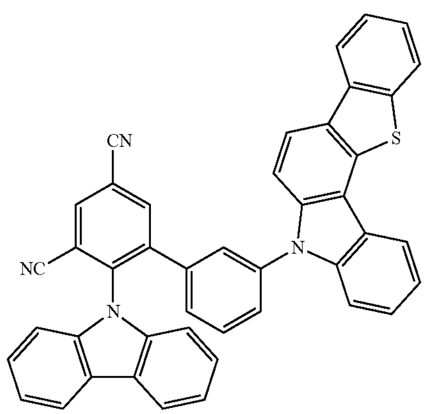
421
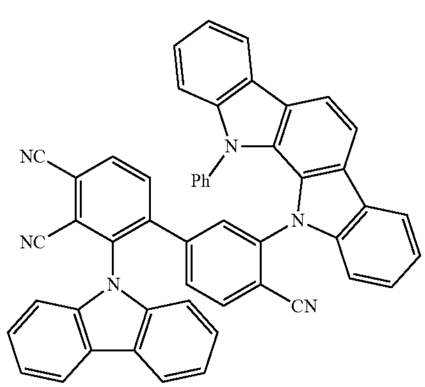
422
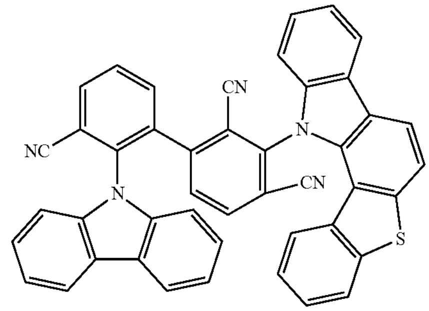
423
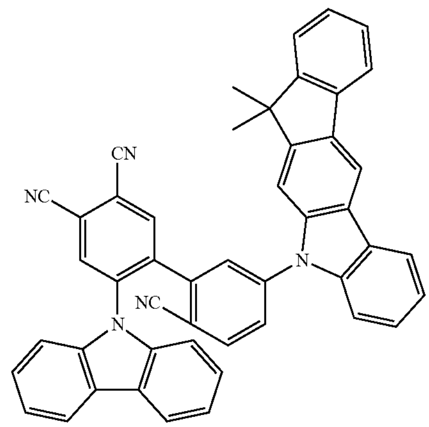
424
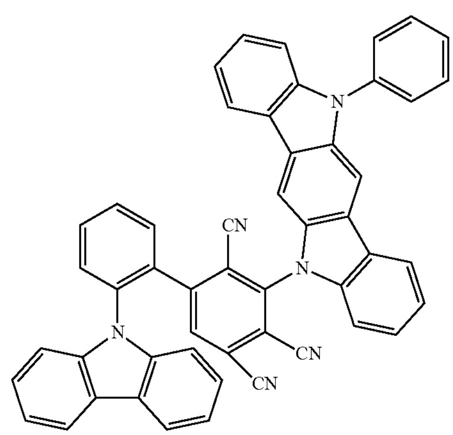
425
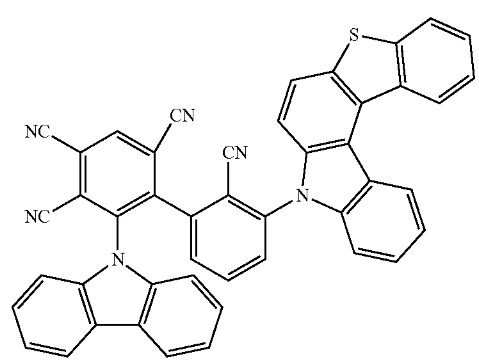

426
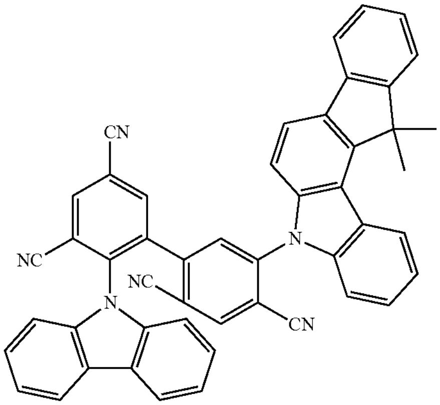
427
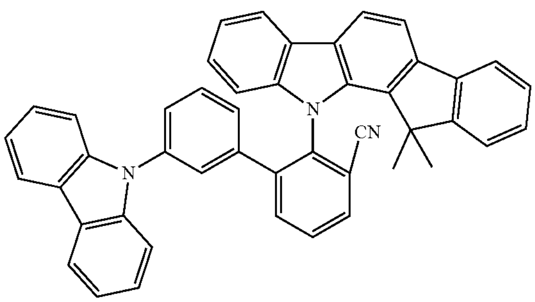
428
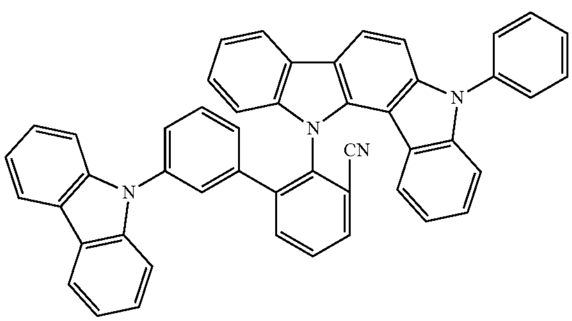
429
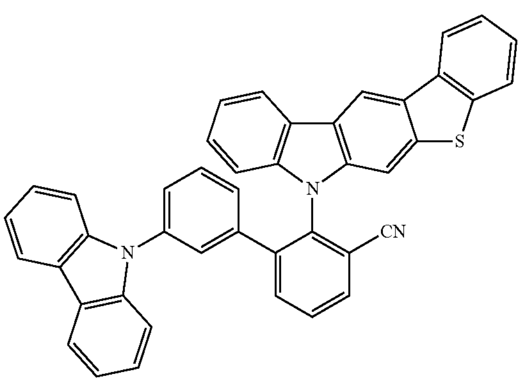
430
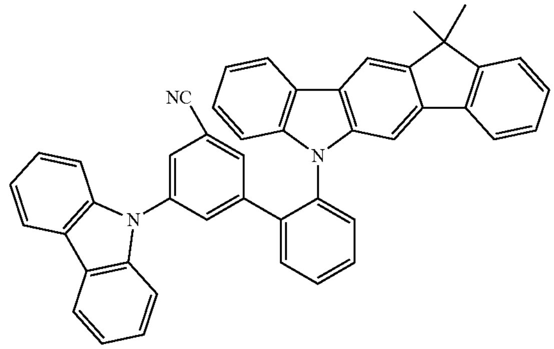
431
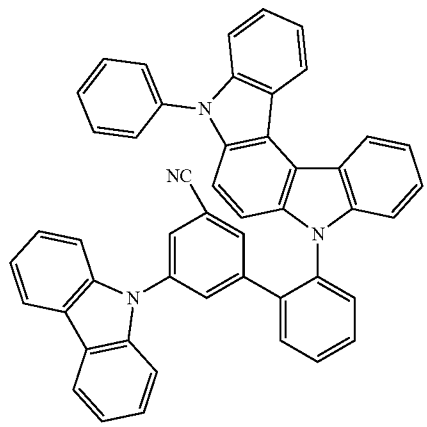
432
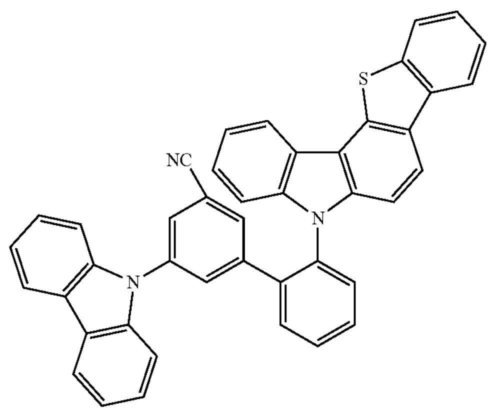
433
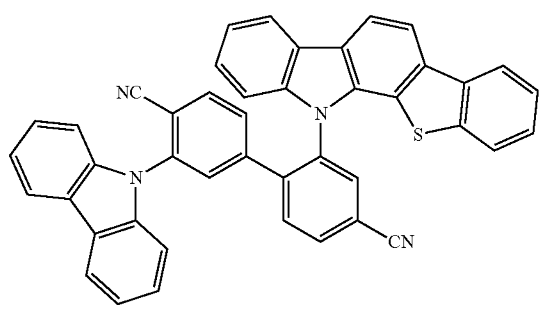

-continued
434
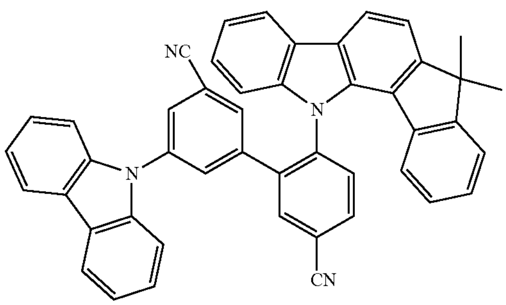
435
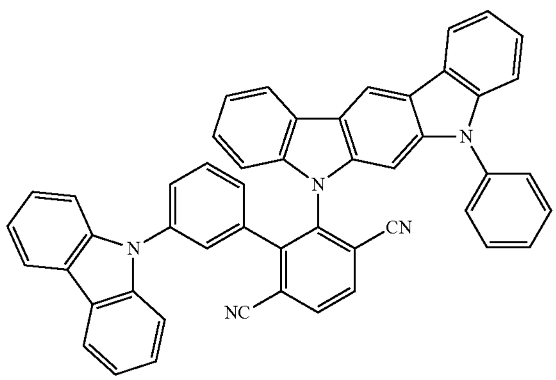
436
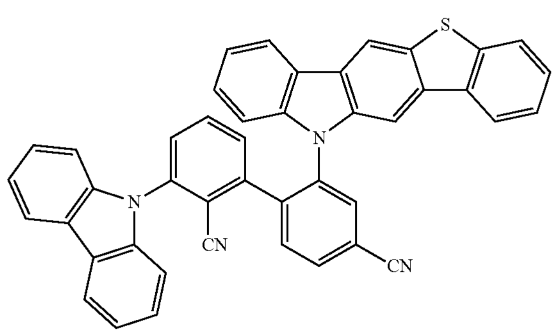
437
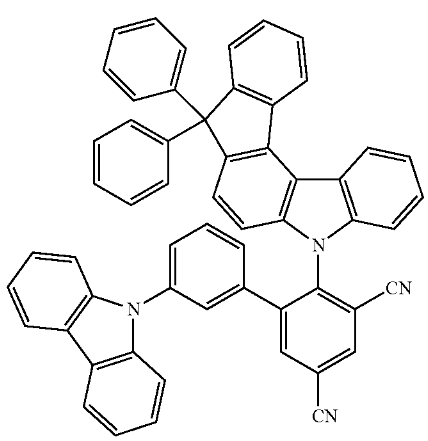
-continued
438
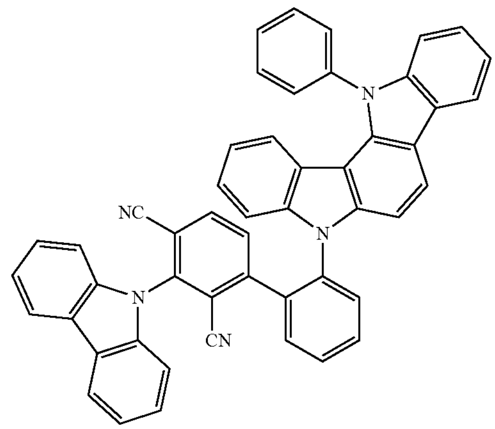
439
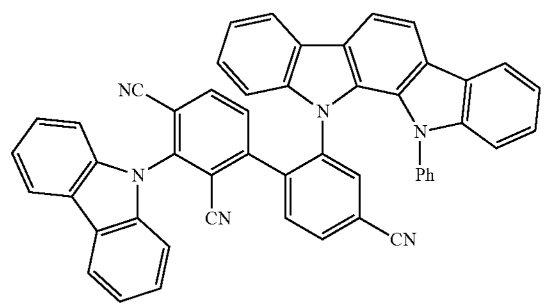
440
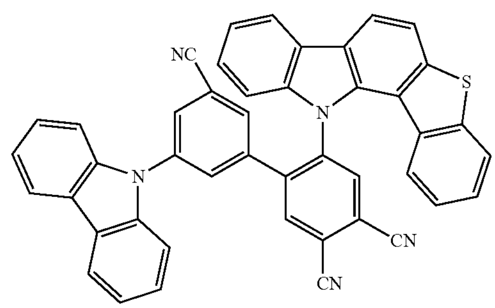
441
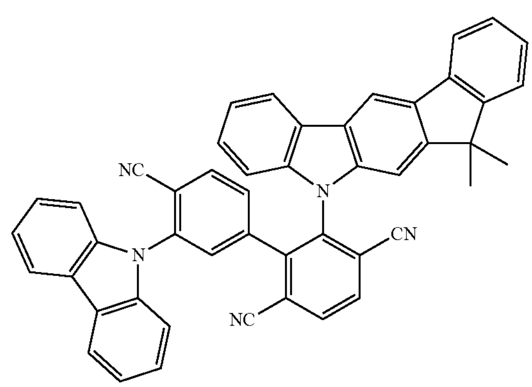

442
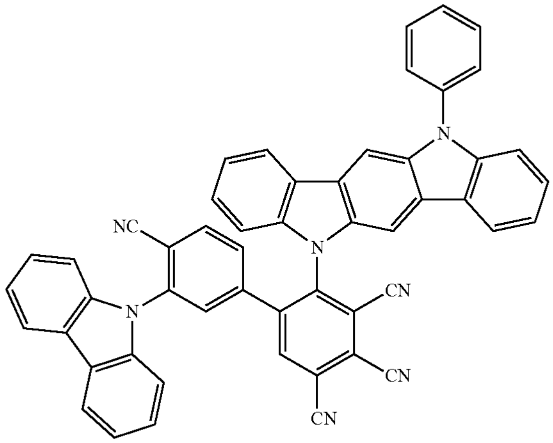
443
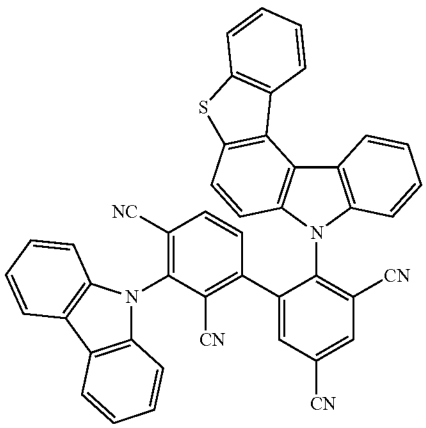
444
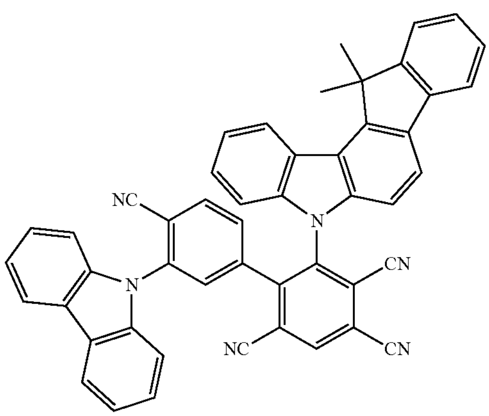
445
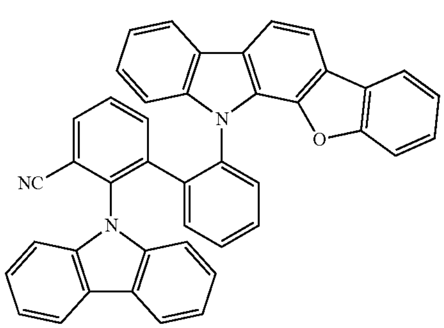
446
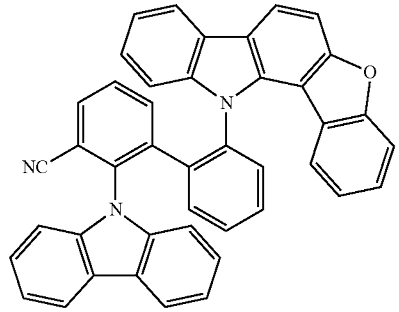
447
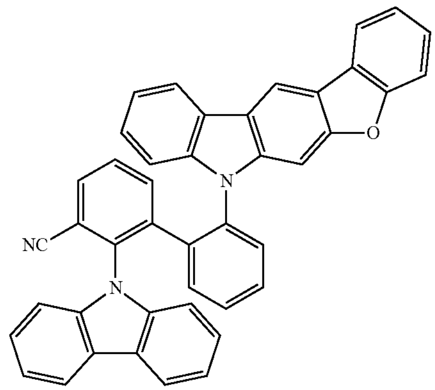
448
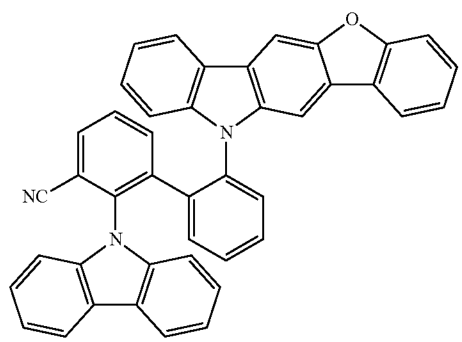
449
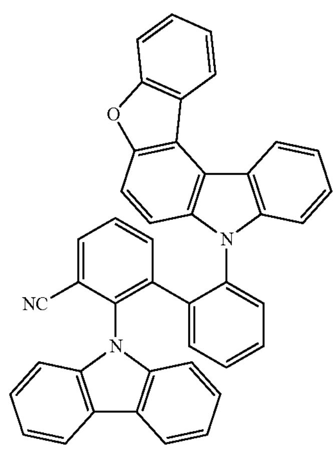

450
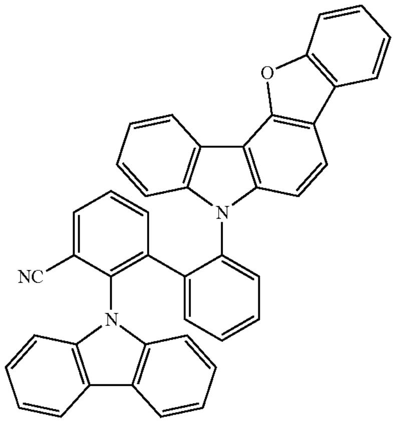
451
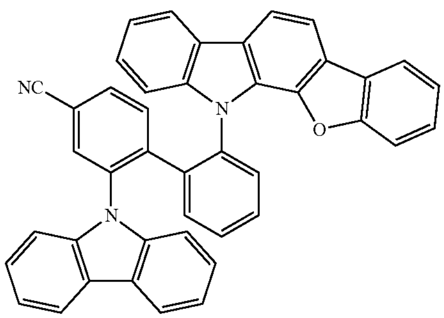
452
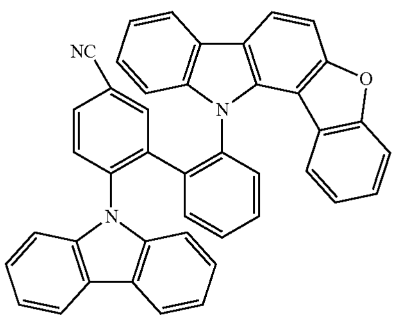
453
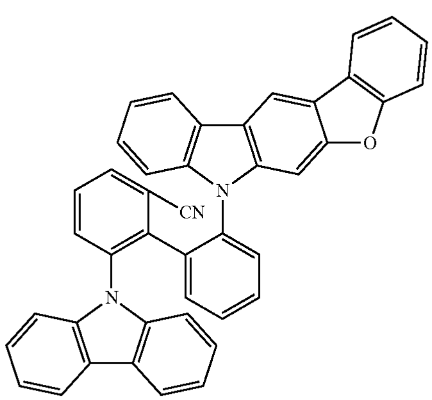
454
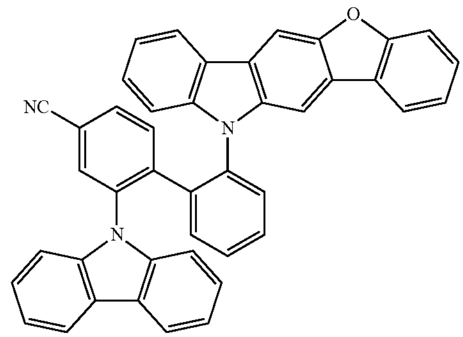
455
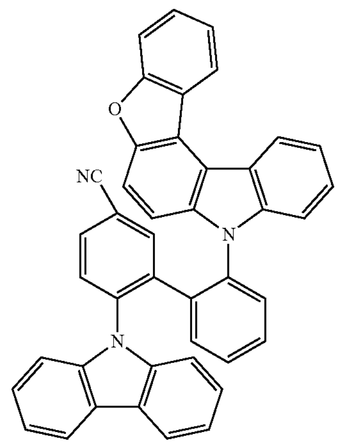
456
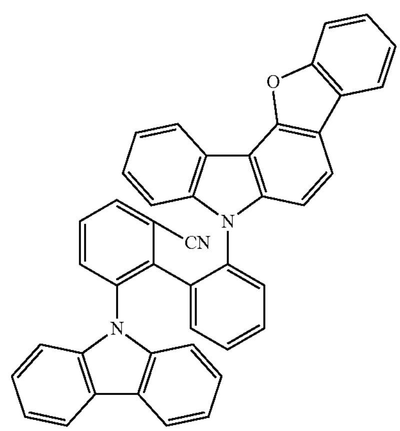
457
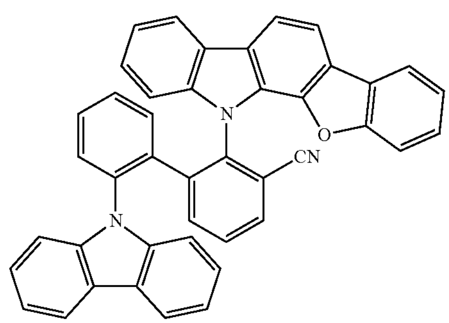

458
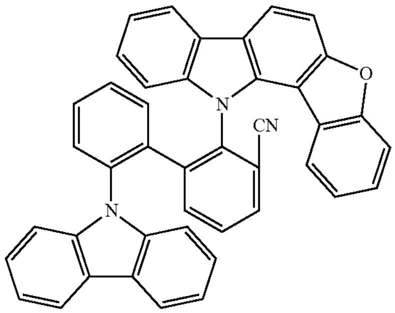
459
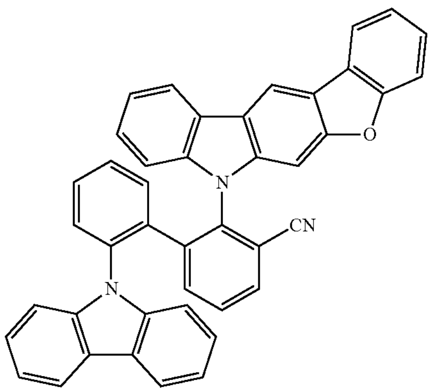
460
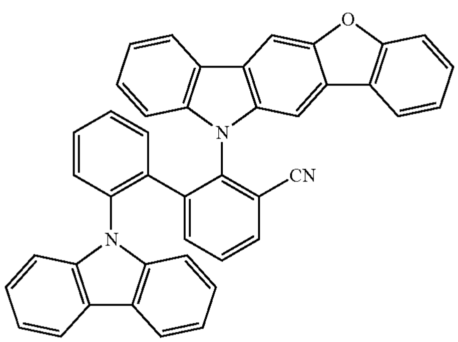
461
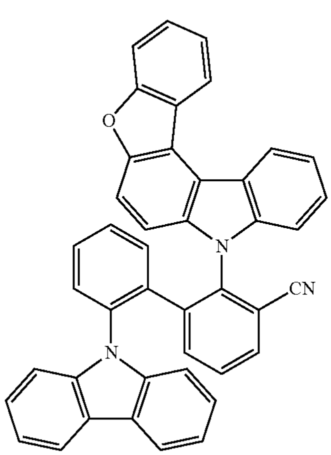
462
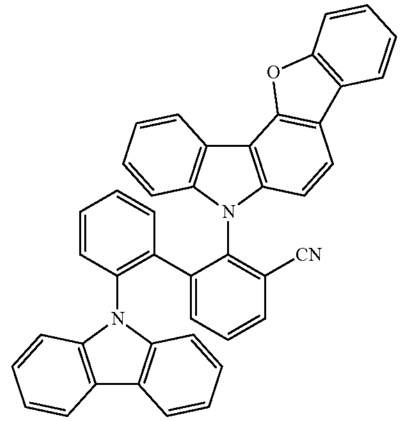
463
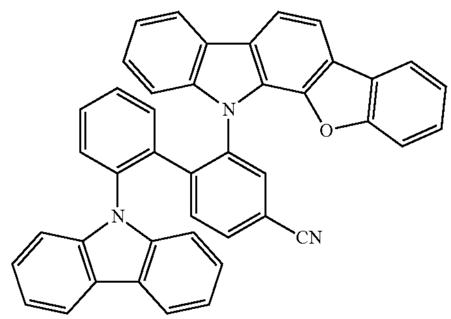
464
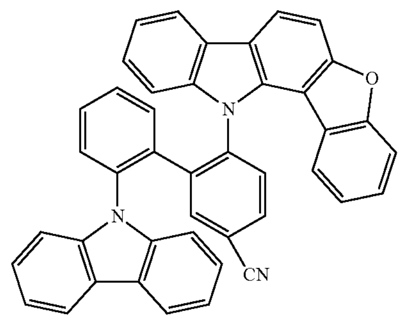
465
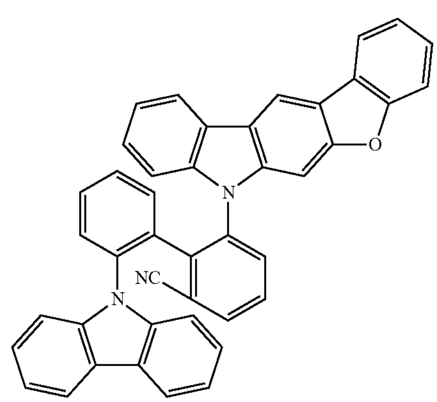

-continued
466
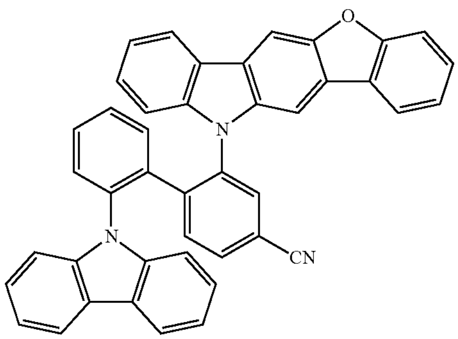
467
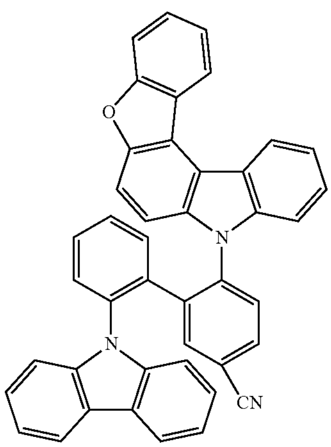
468
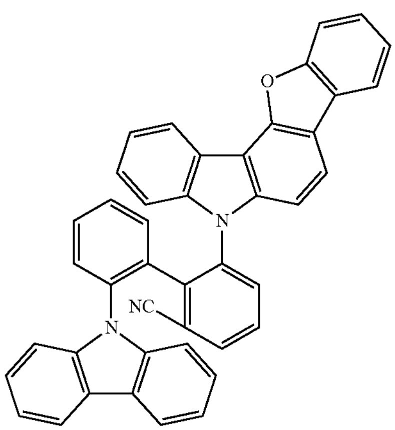
469
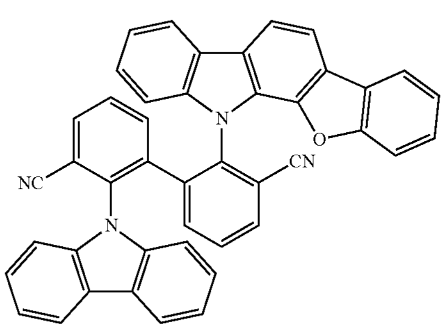
-continued
470
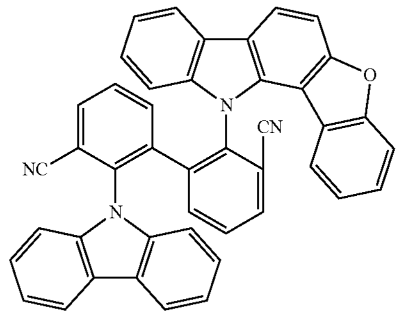
471
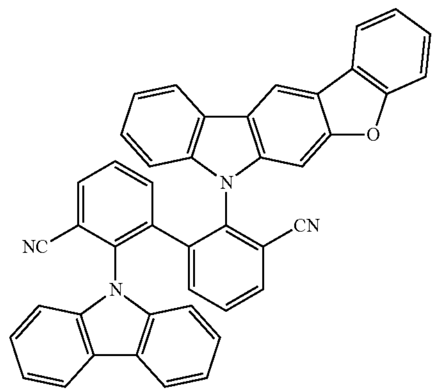
472
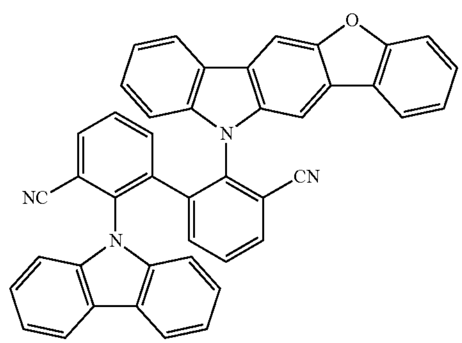
473
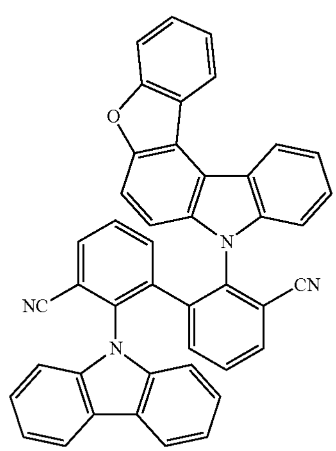

474
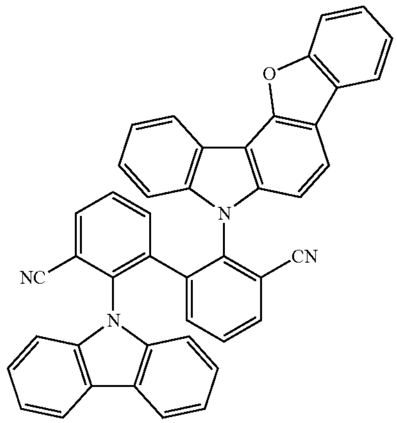
475
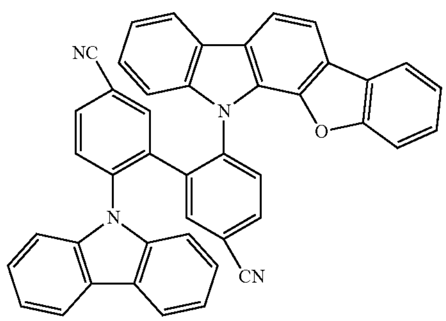
476
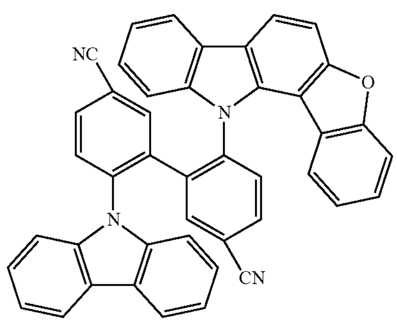
477
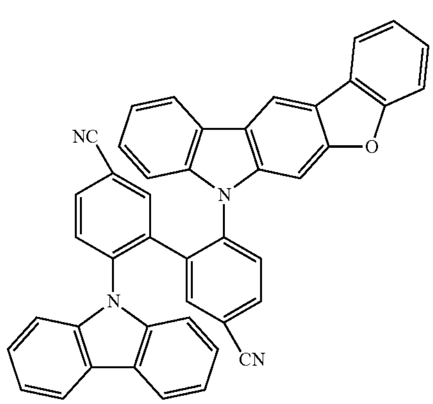
478
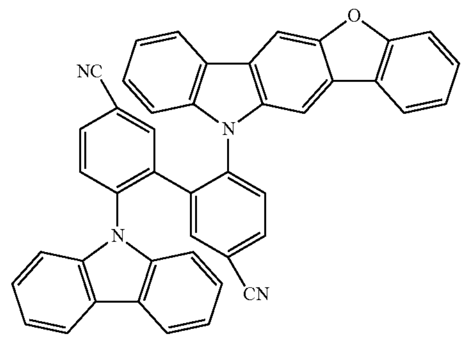
479
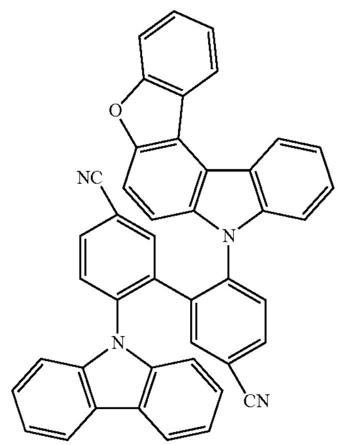
480
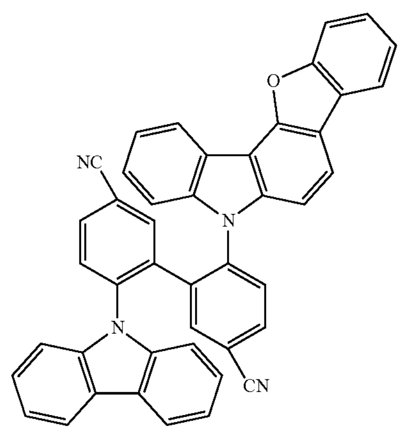
481
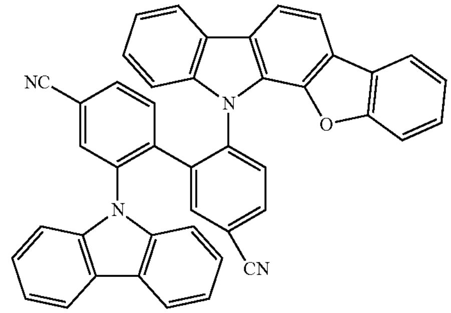

-continued
482
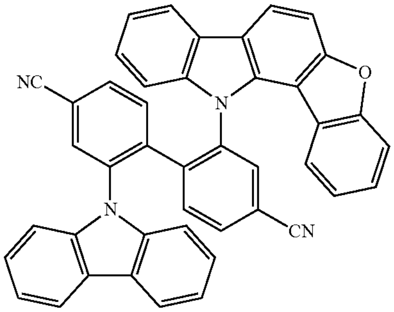
483
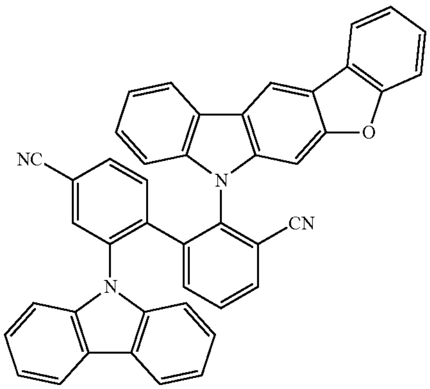
484
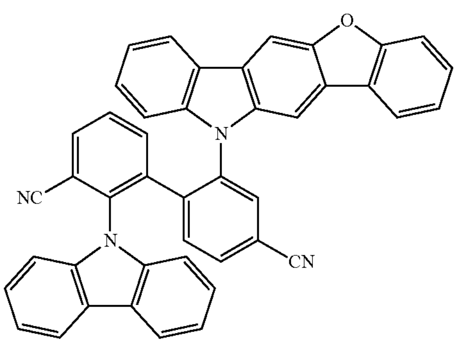
485
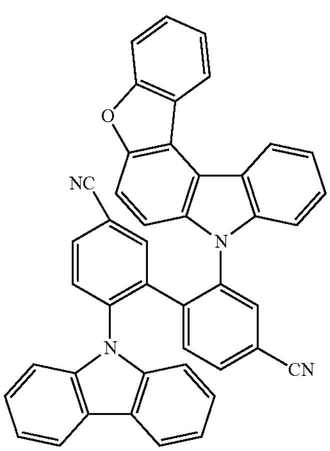
-continued
486
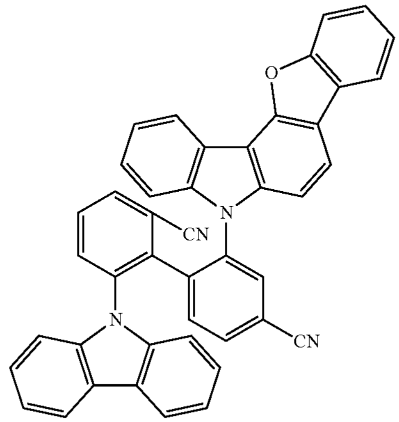
487
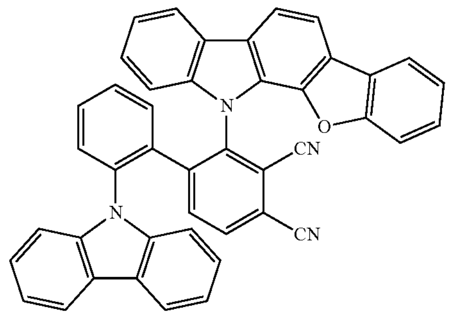
488
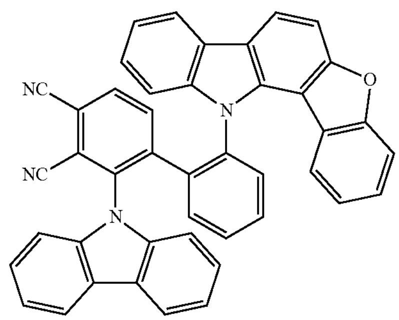
489
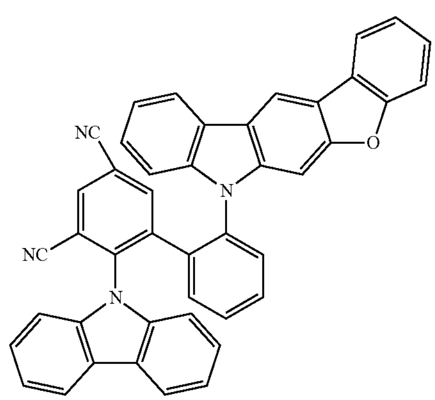

-continued
490
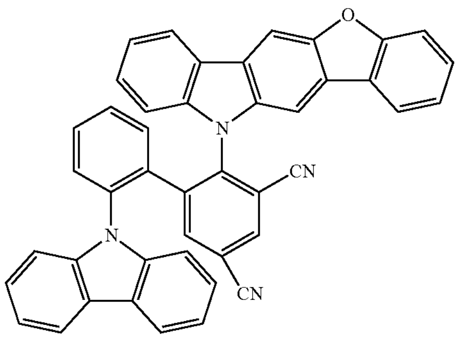
491
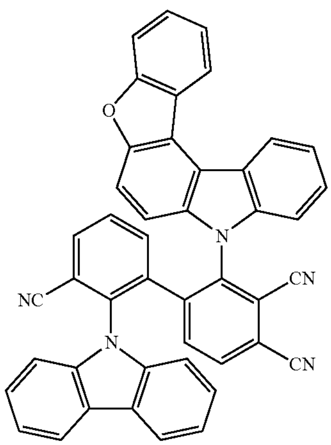
492
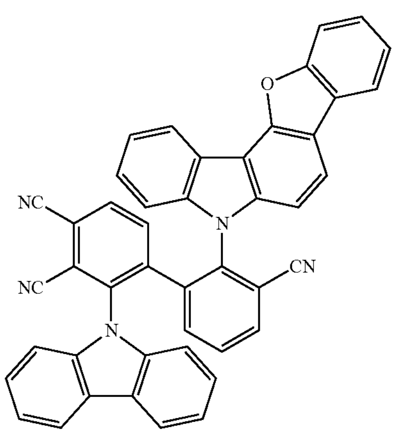
493
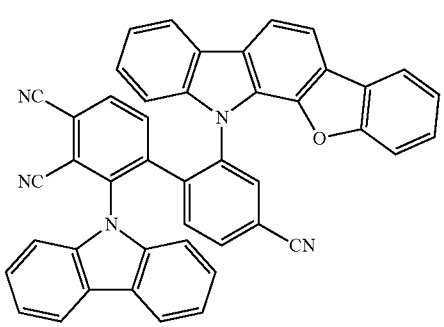
-continued
494
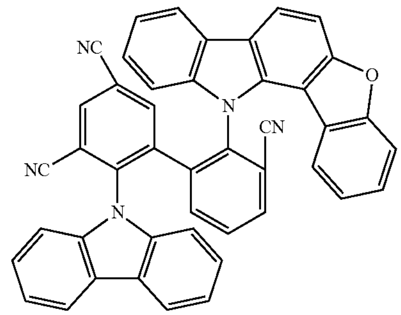
495
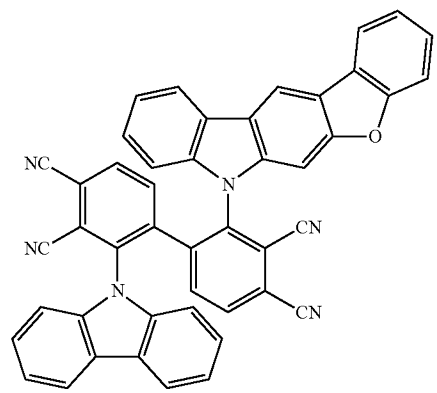
496
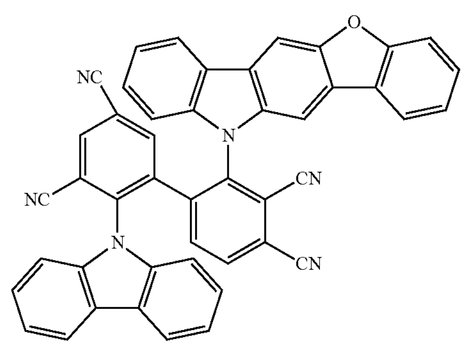
497
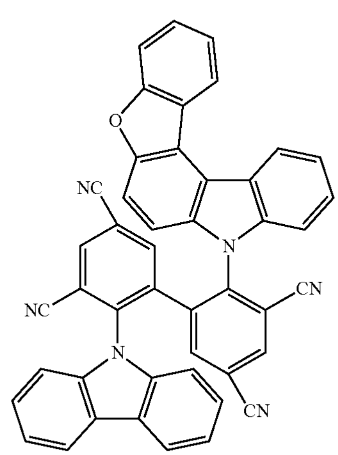

-continued
498
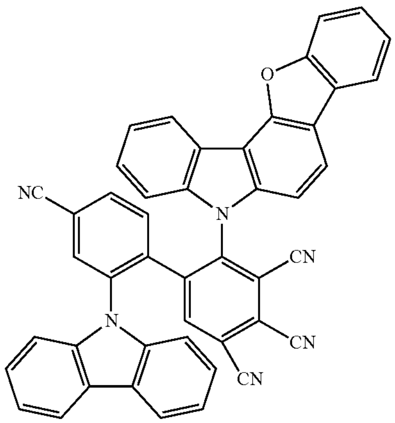
499
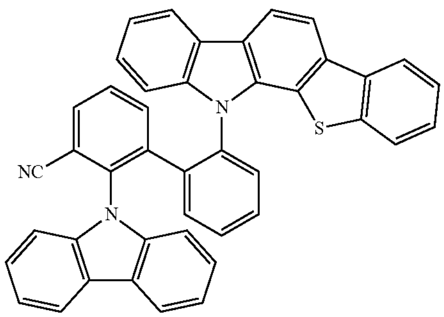
500
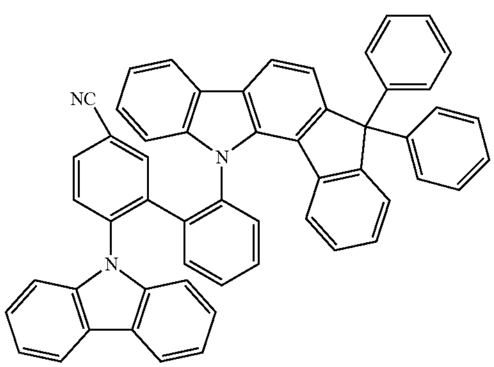
501
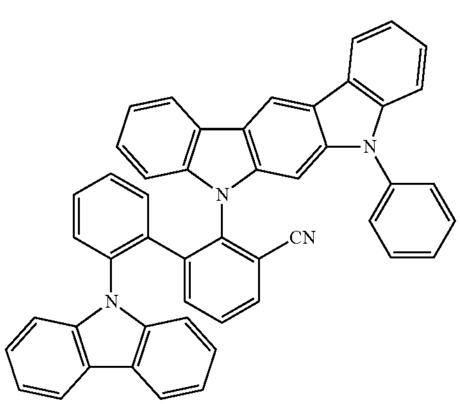
502
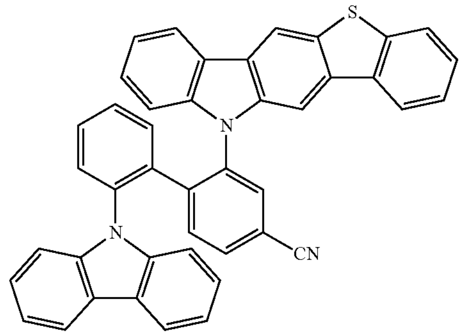
503
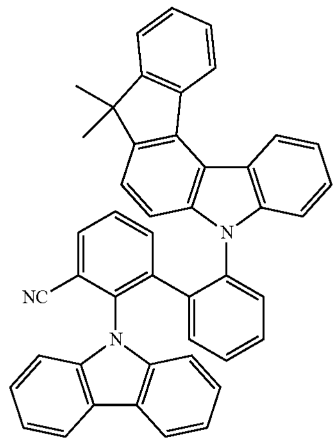
504
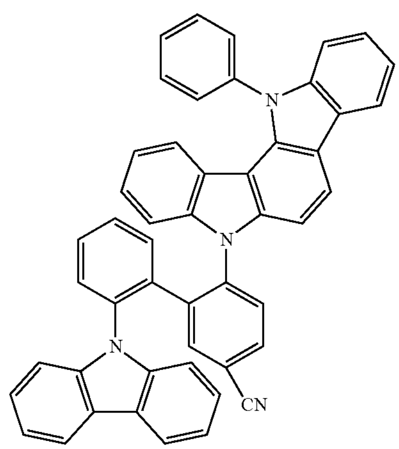
505
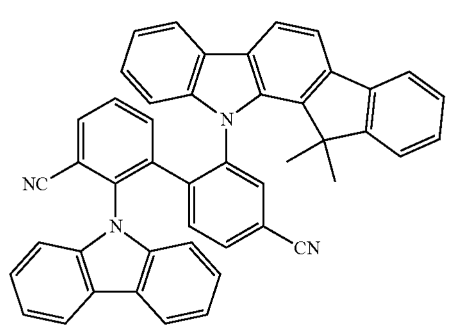

506
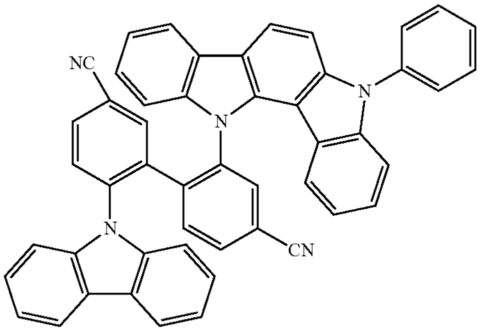
507
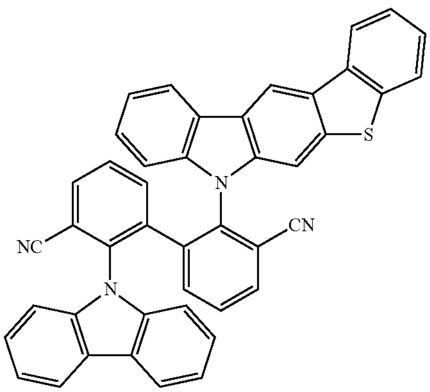
508
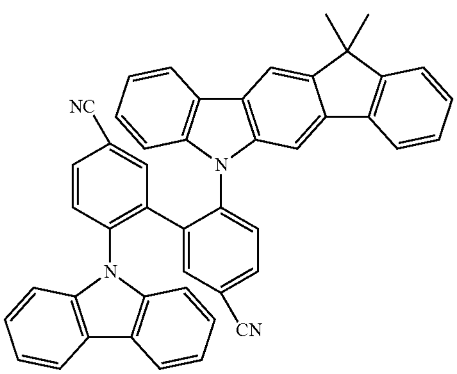
509
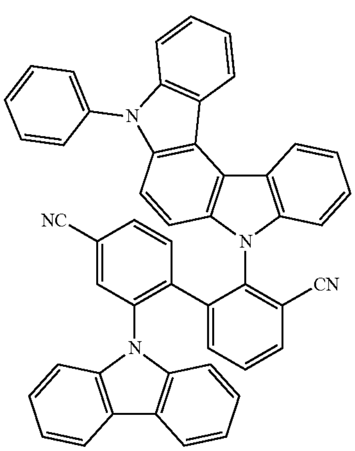
510
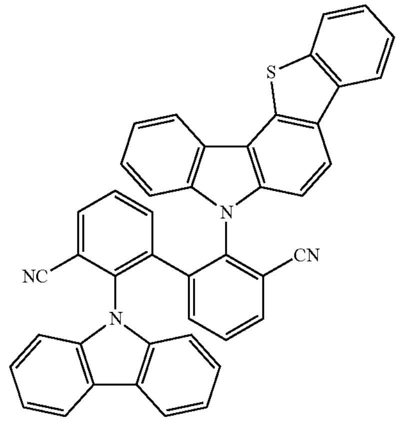
511
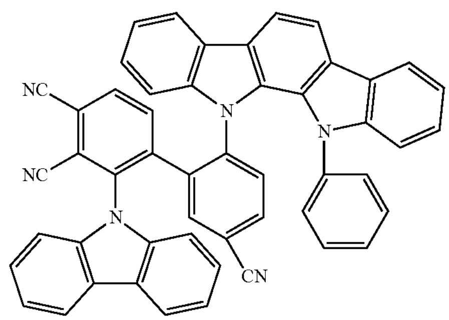
512
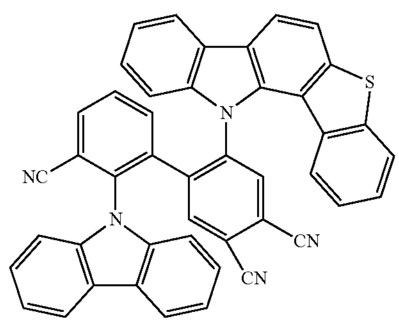
513
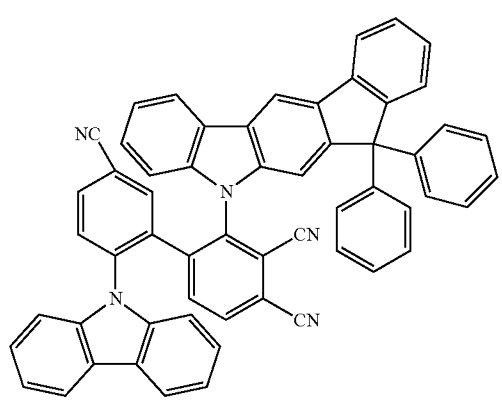

-continued
514
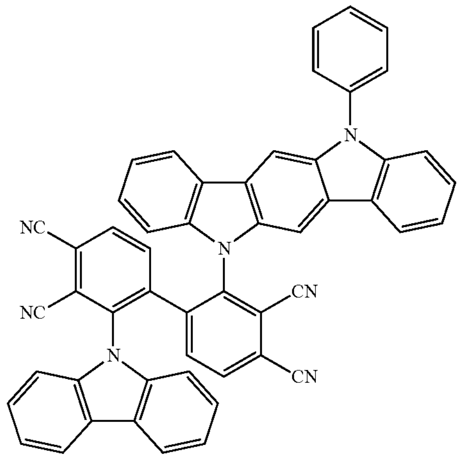
515
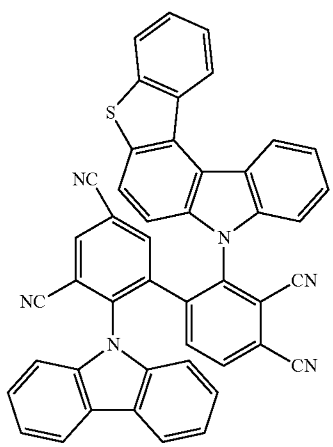
516
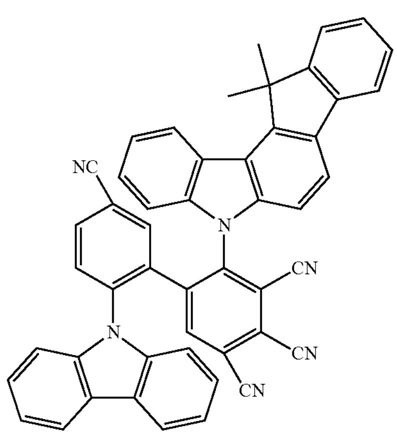
-continued
517
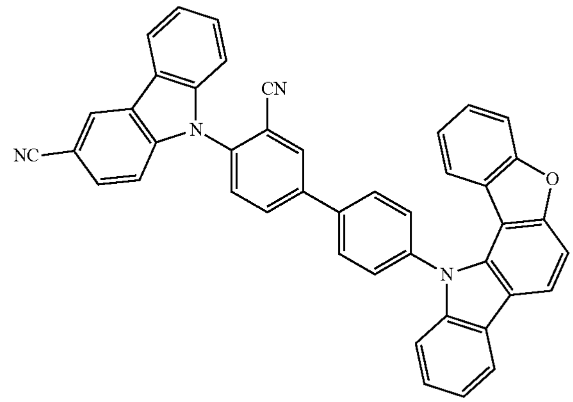
518
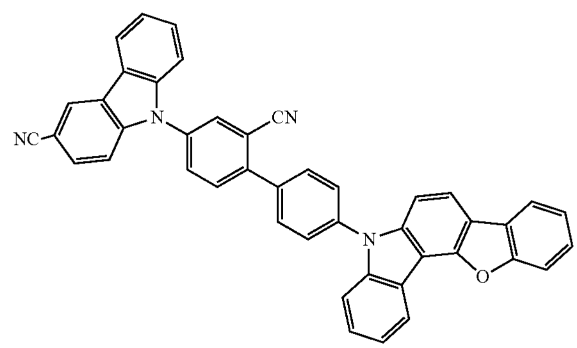
519
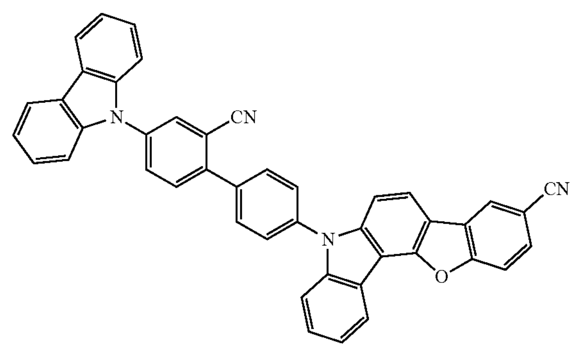
520
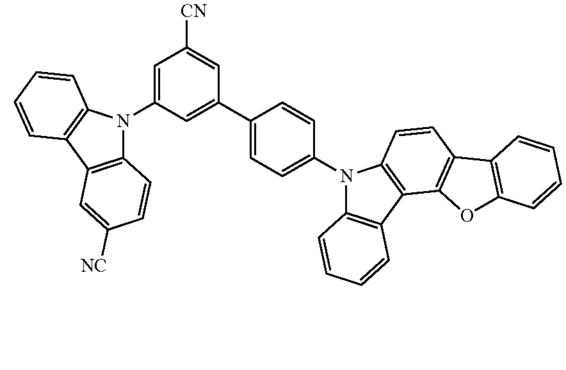

-continued
521
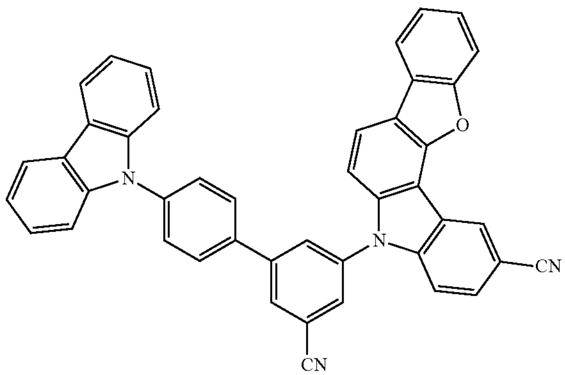
522
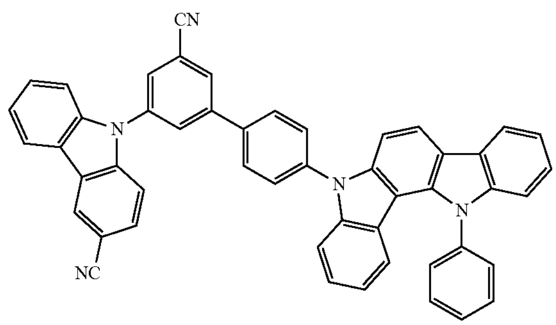
523
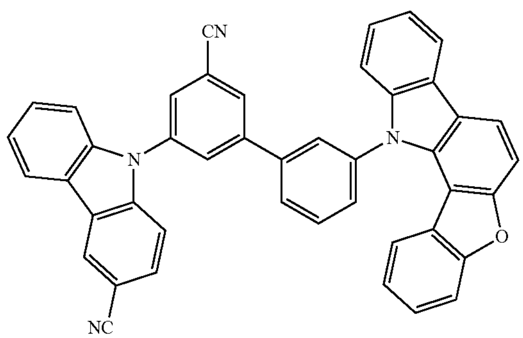
524
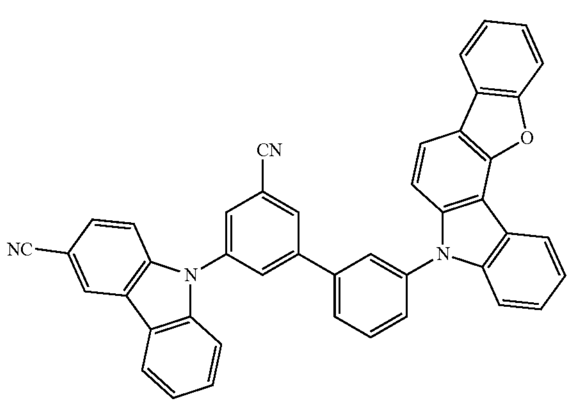
-continued
525
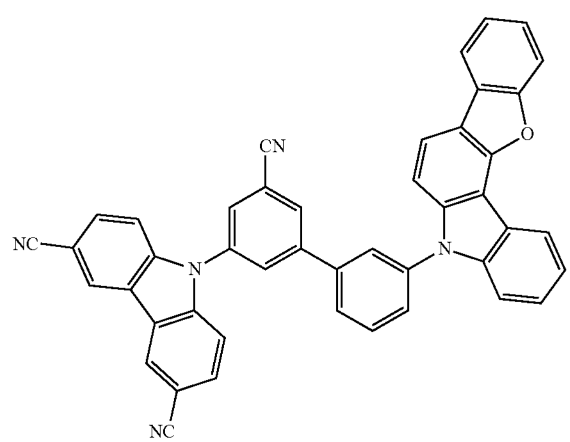
526
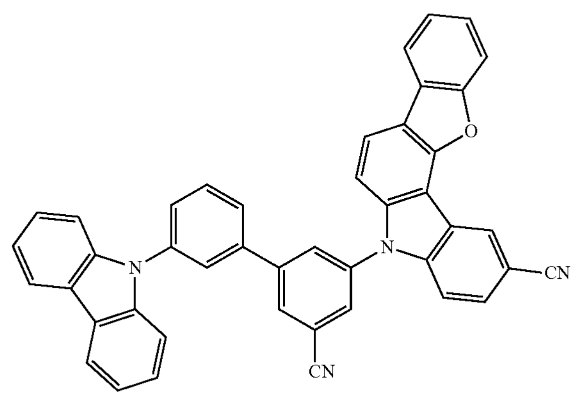
527
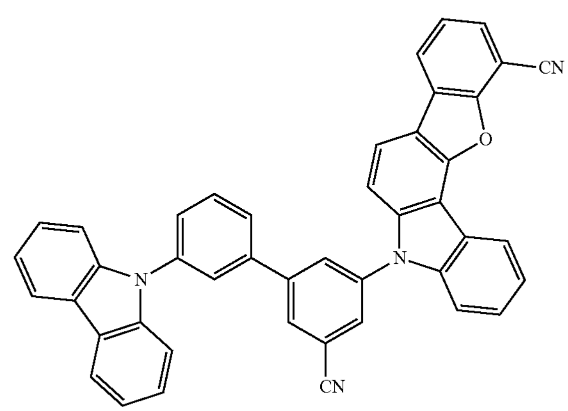

-continued
528
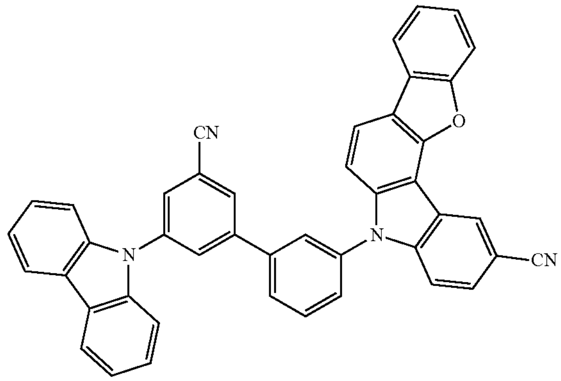
529
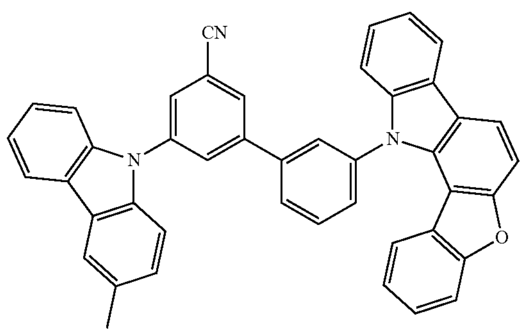
530
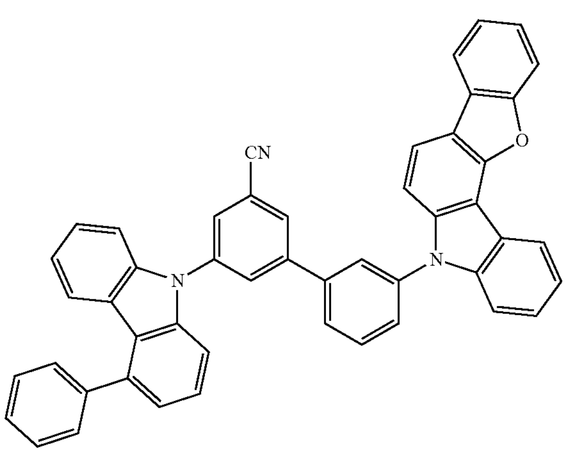
-continued
531
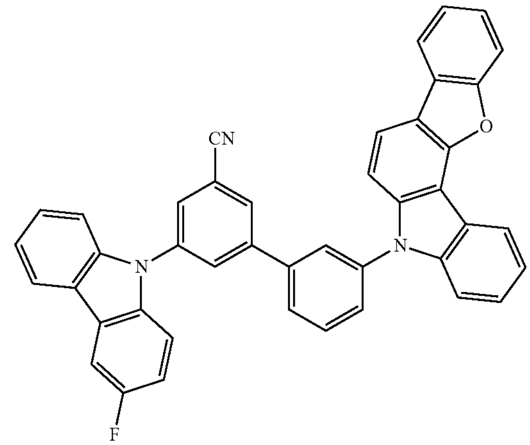
532
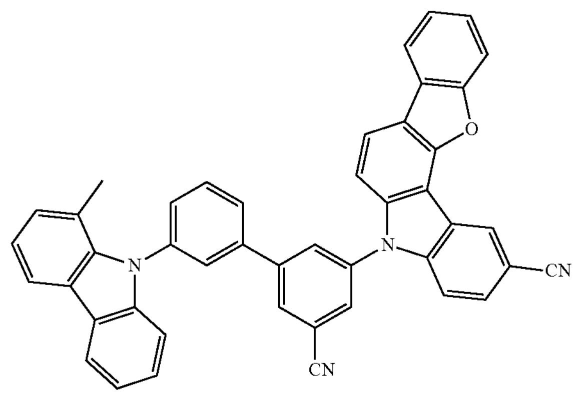
533
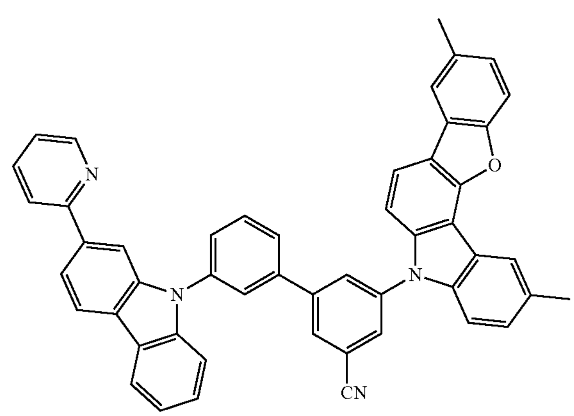

534
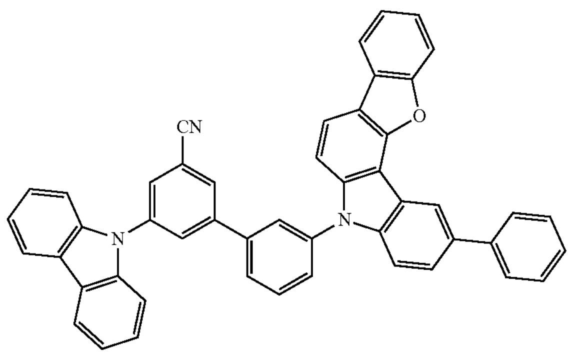
535
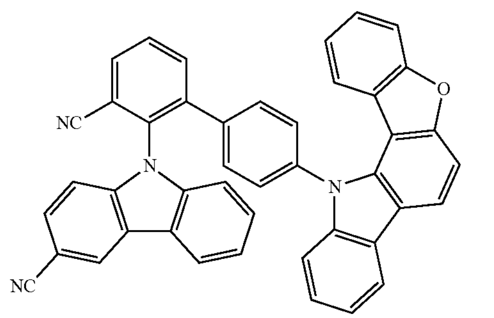
536
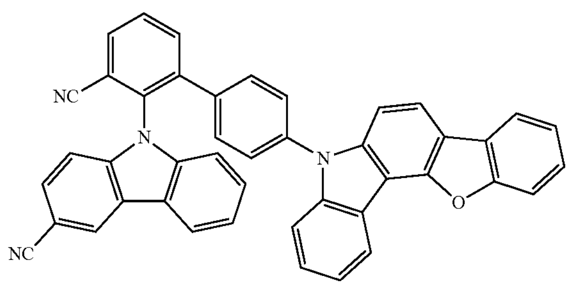
537
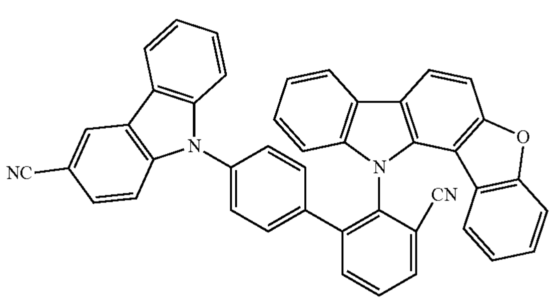
538
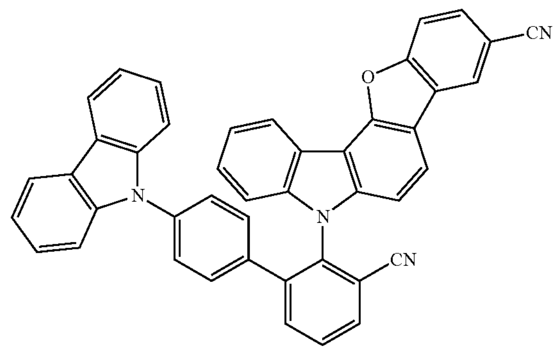
539
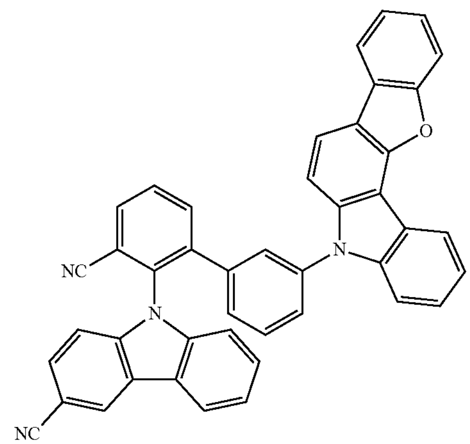
540
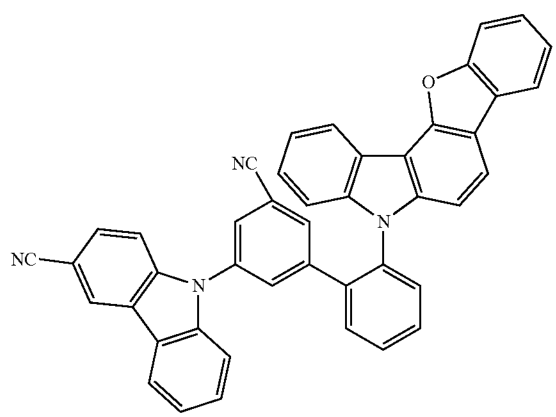
541
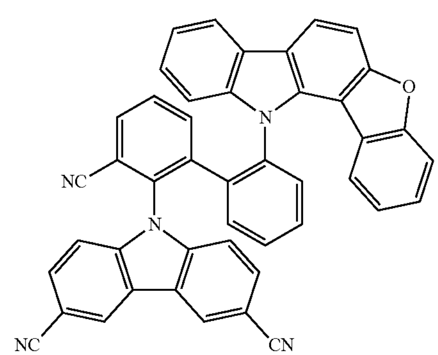

-continued
542
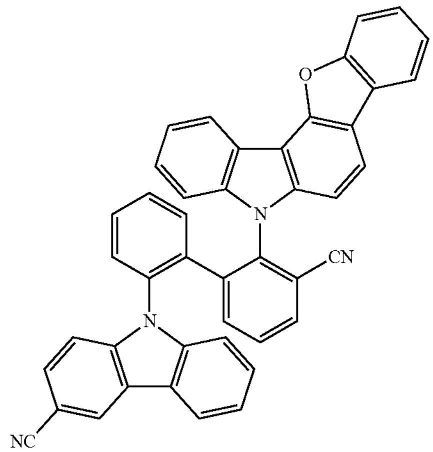
543
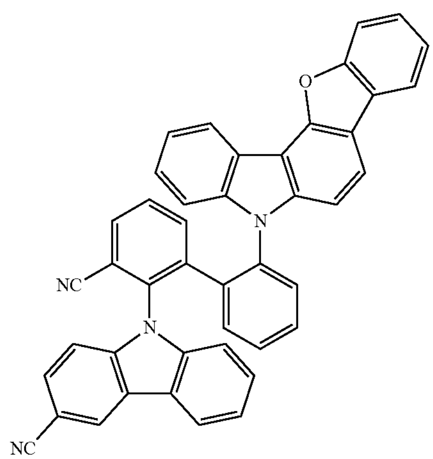
544
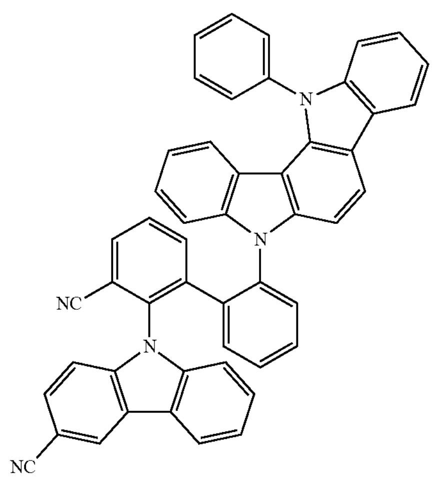
-continued
545
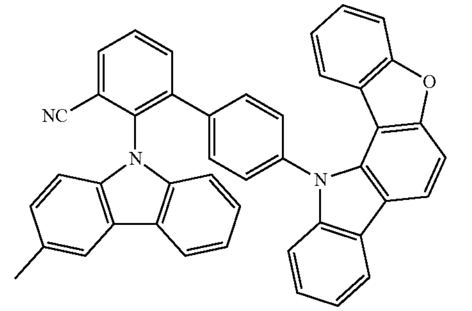
546
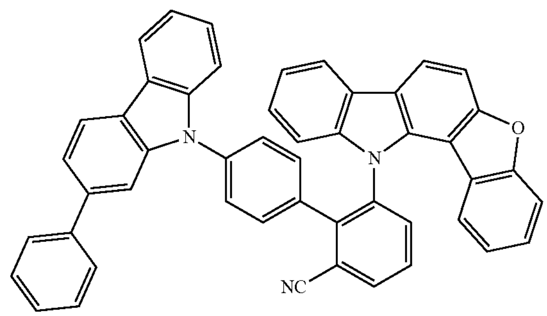
547
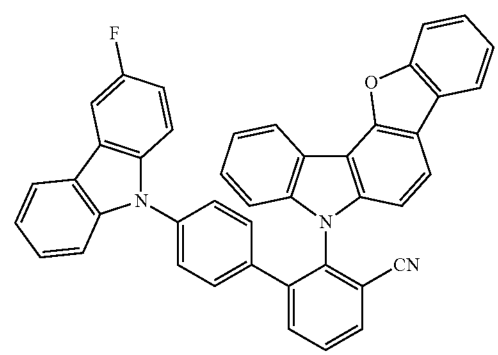
548
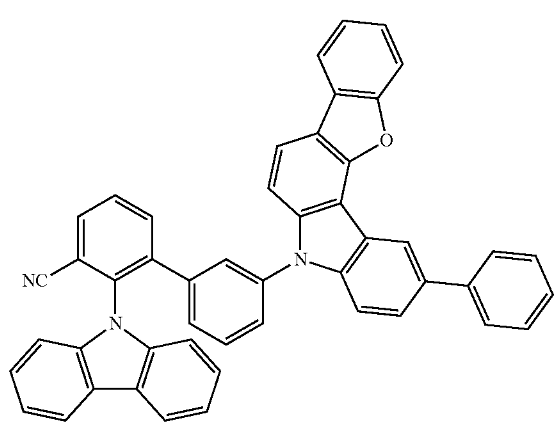

-continued
549
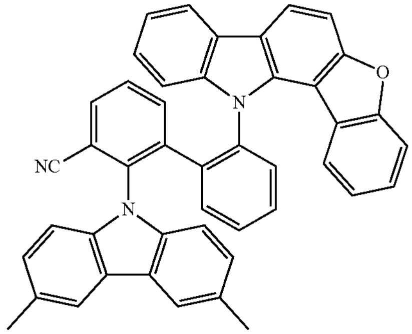
550
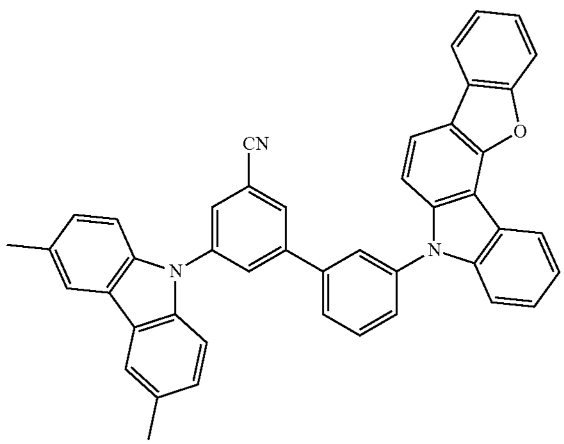
551
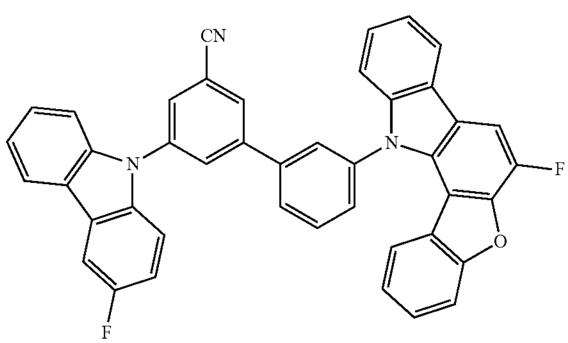
552
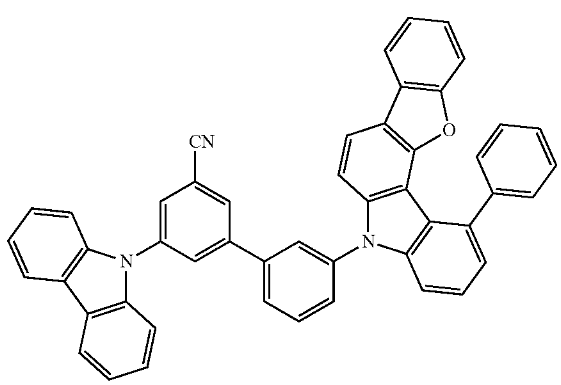
-continued
553
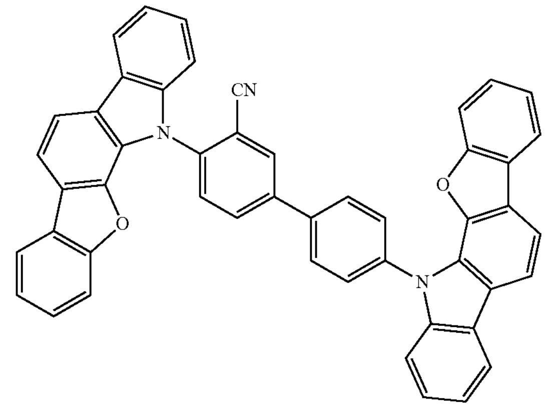
554
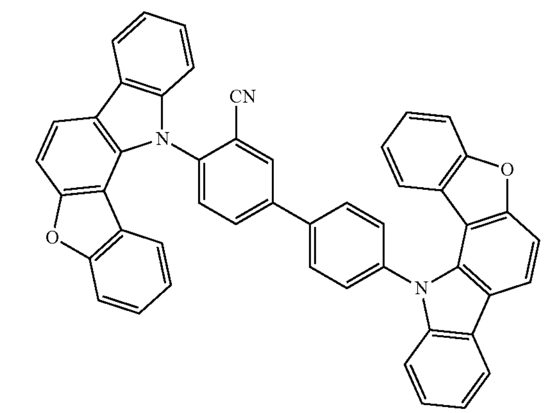
555
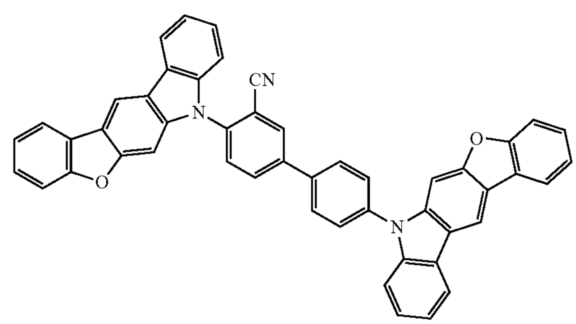
556
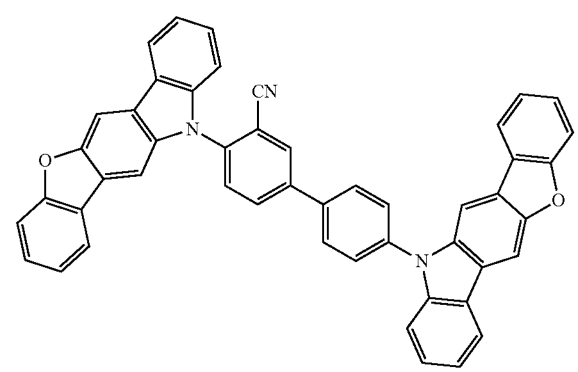

-continued
557
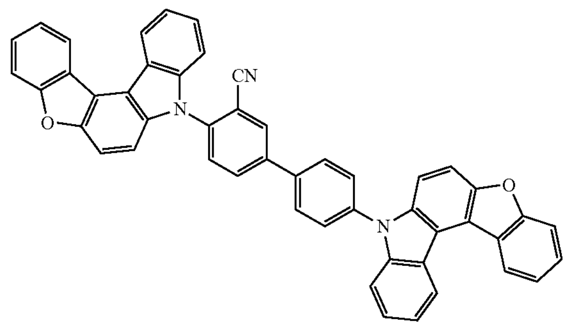
558
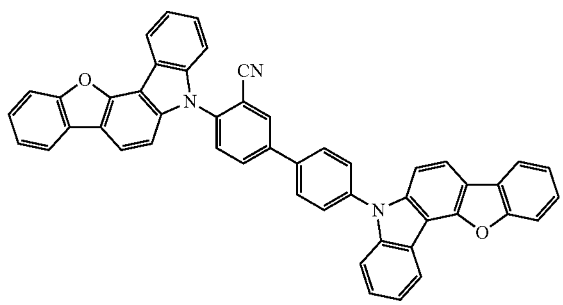
559
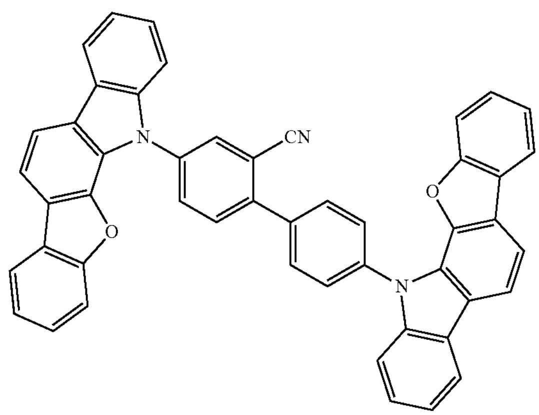
560
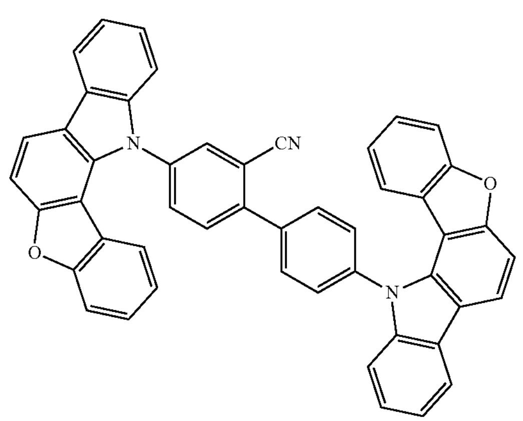
-continued
561
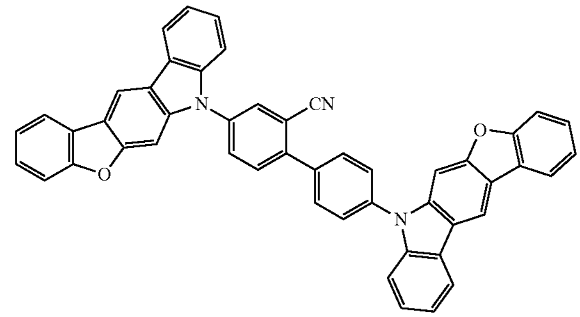
562
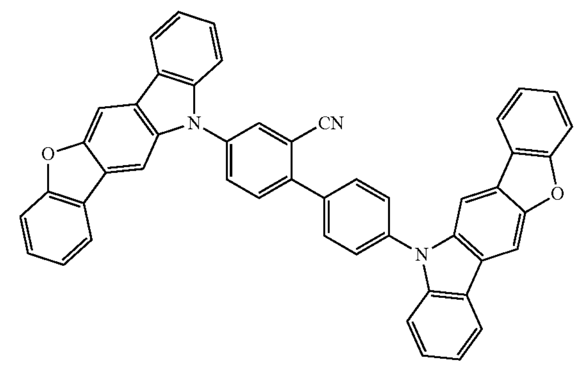
563
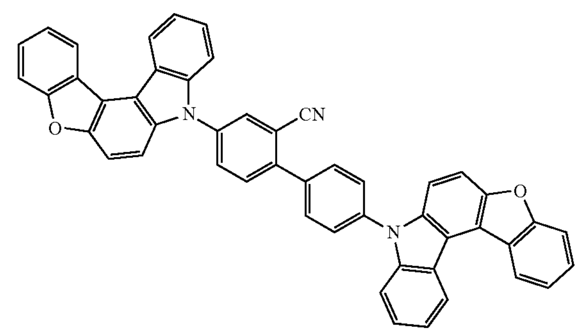
564
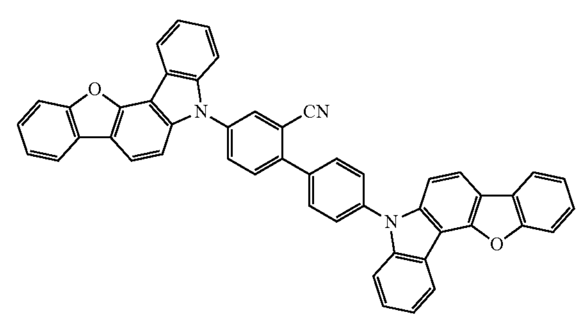

-continued
565
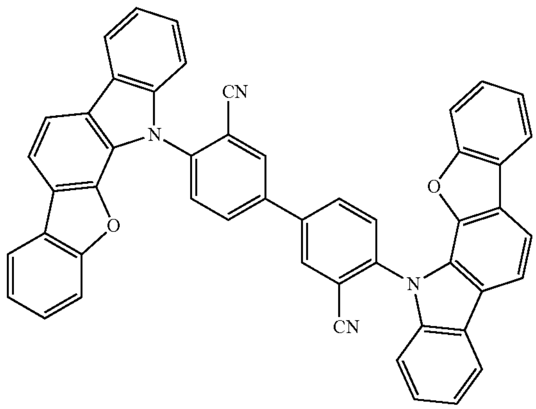
566
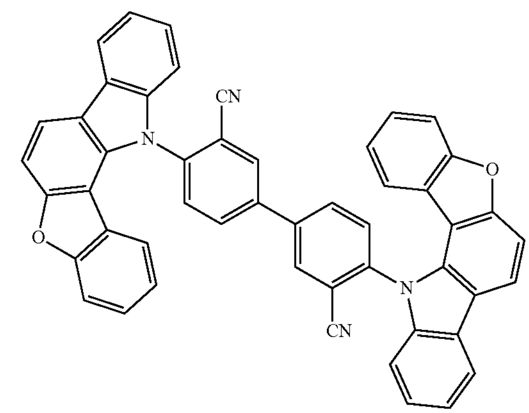
567
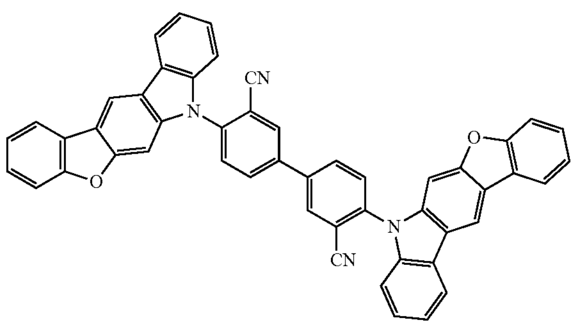
568
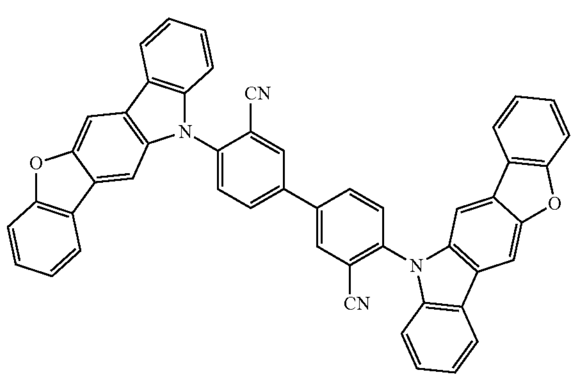
-continued
569
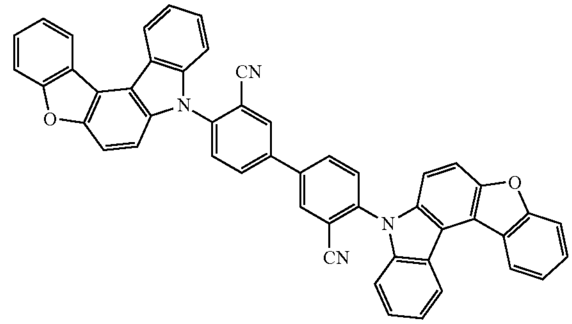
570
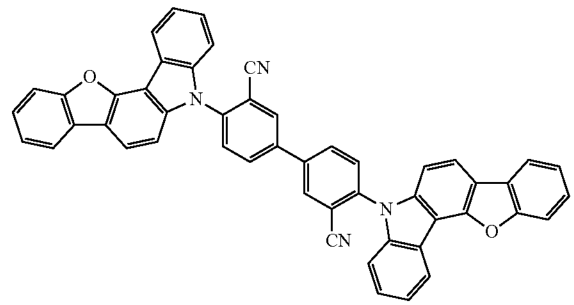
571
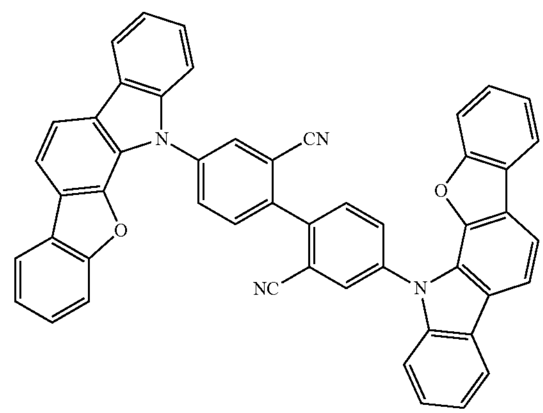
572
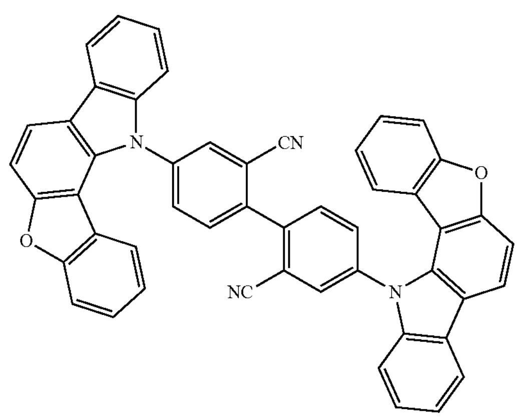

-continued
573
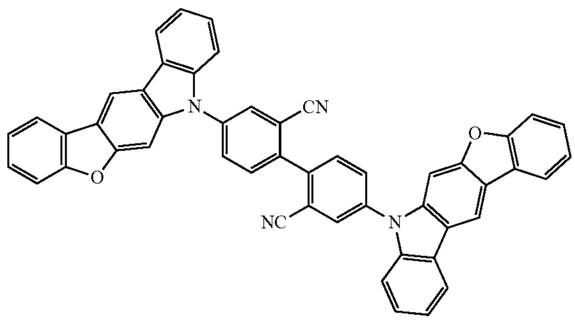
574
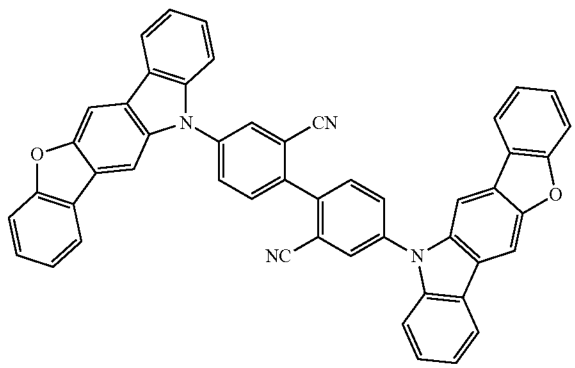
575
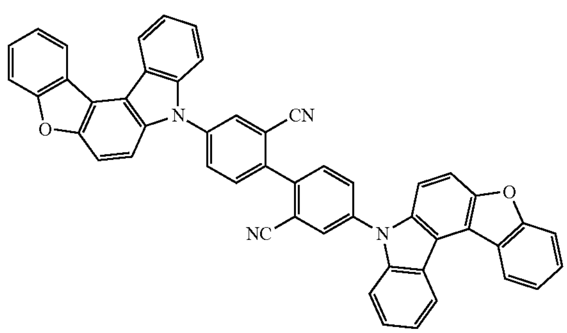
576
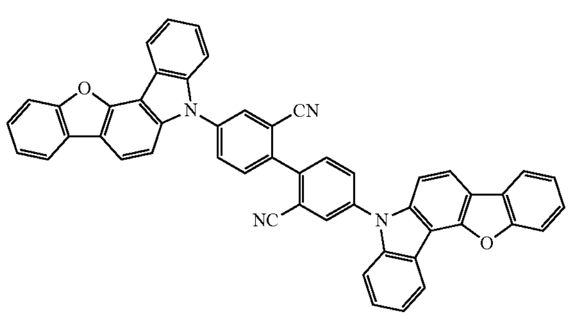
-continued
577
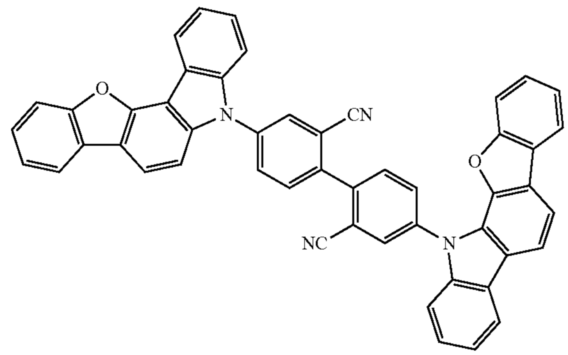
578
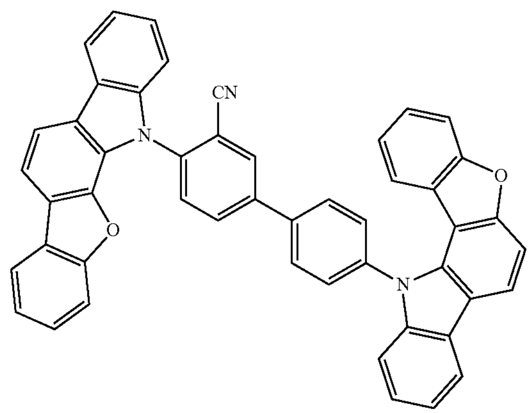
579
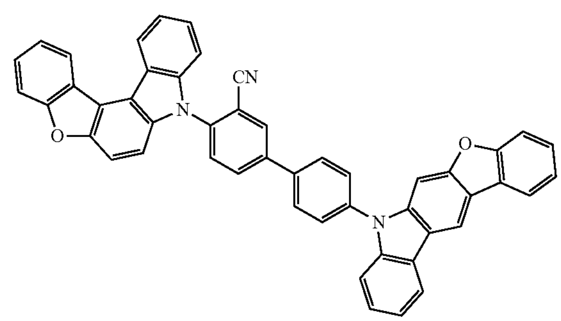
580
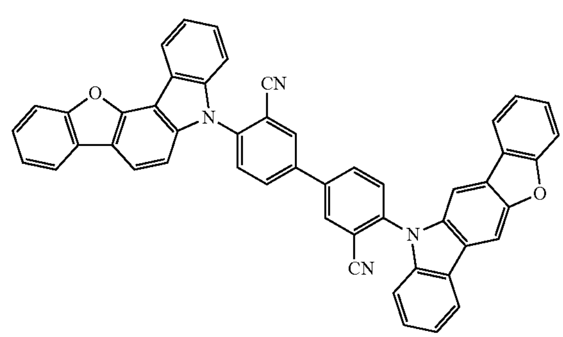

581
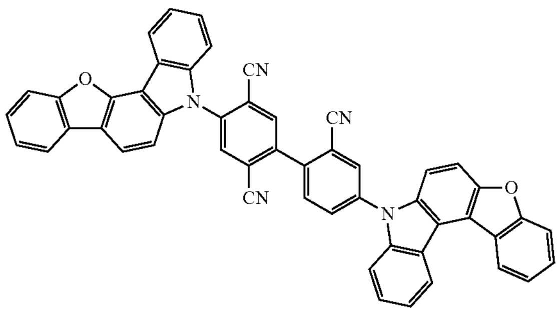
582
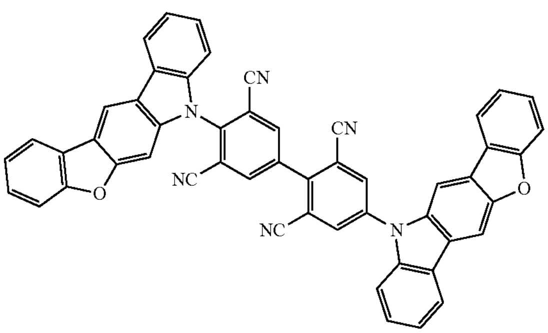
583
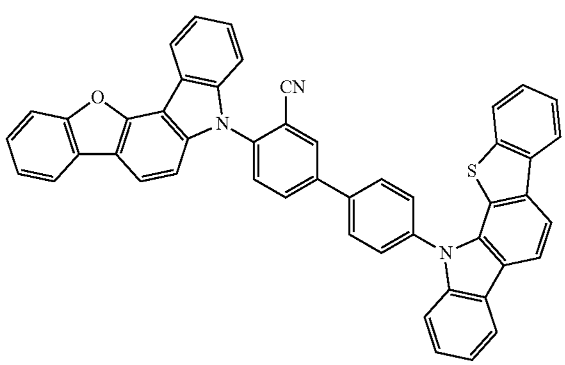
584
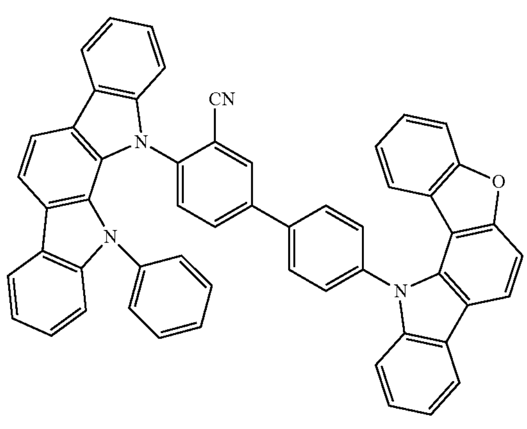
585
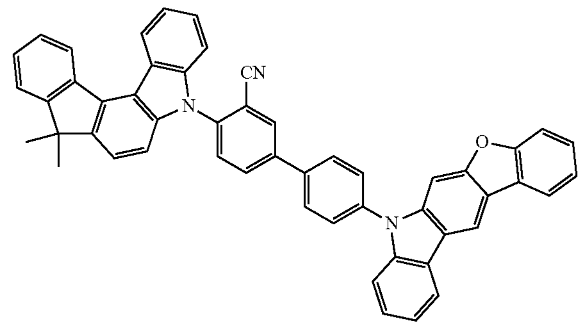
586
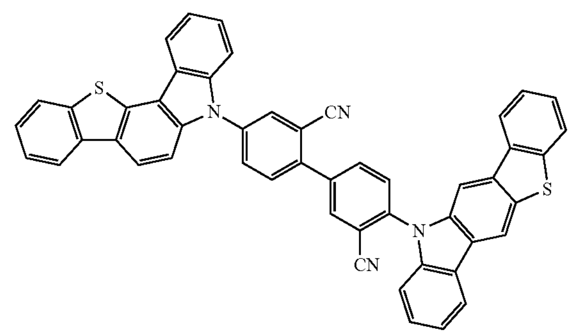
587
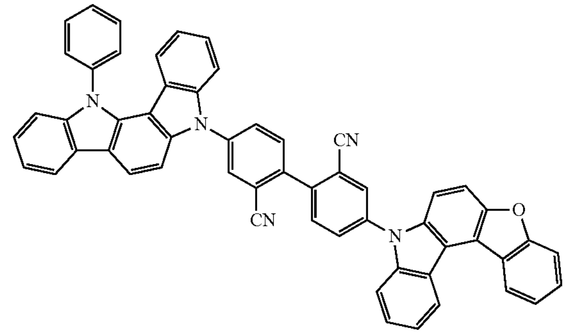
588
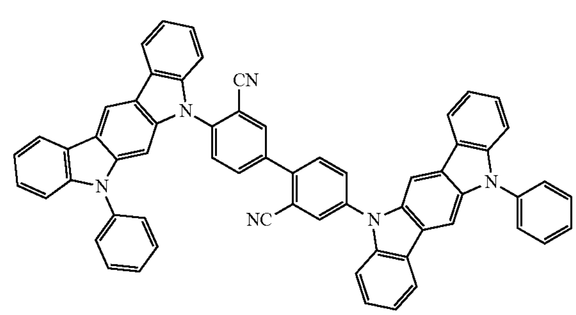

-continued
589
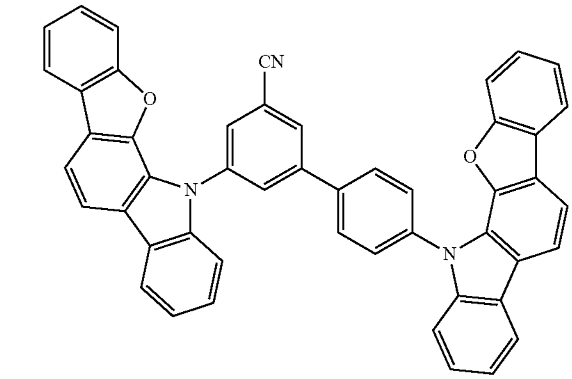
590
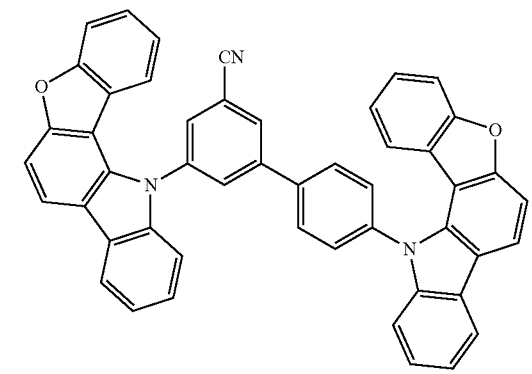
591
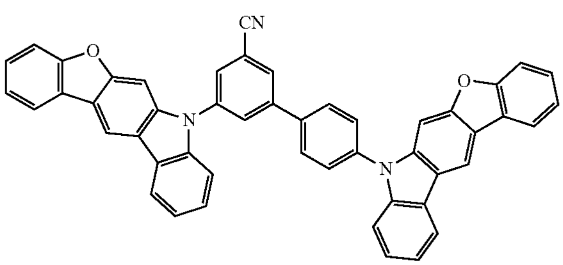
592
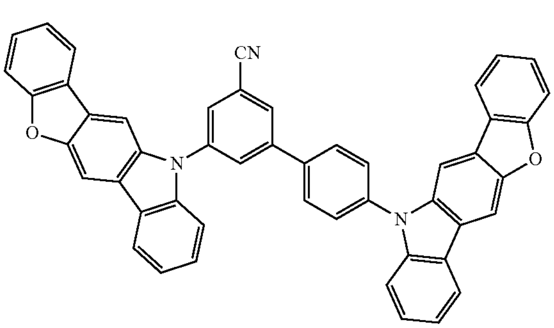
-continued
593
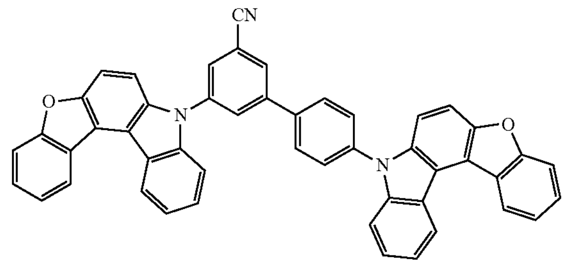
594
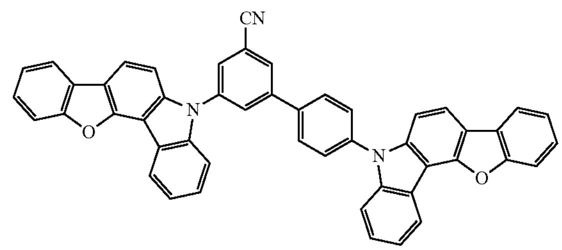
595
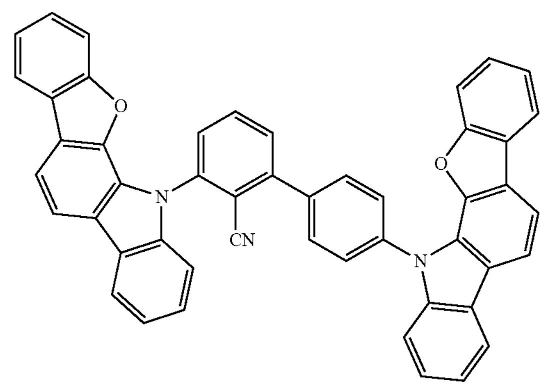
596
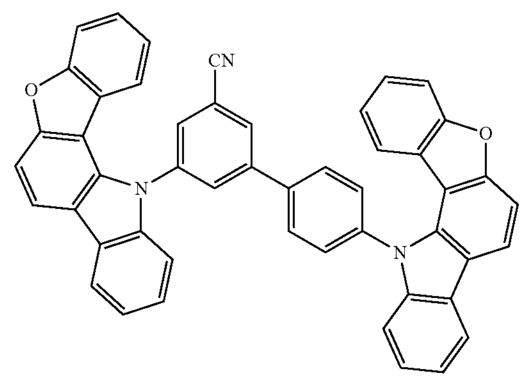
597
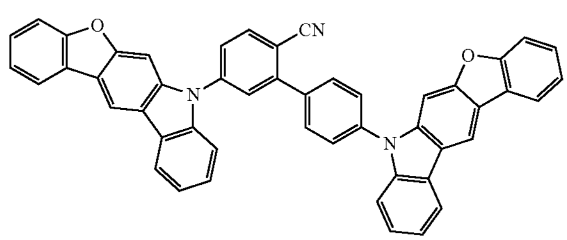

-continued
598
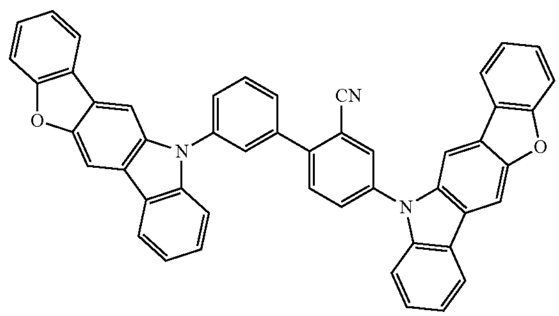
599
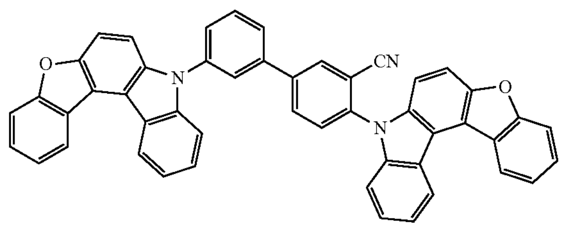
600
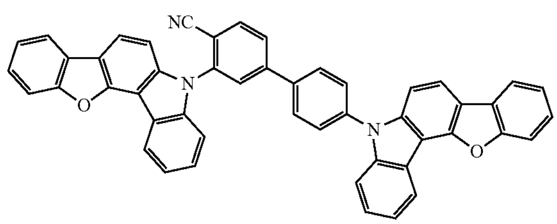
601
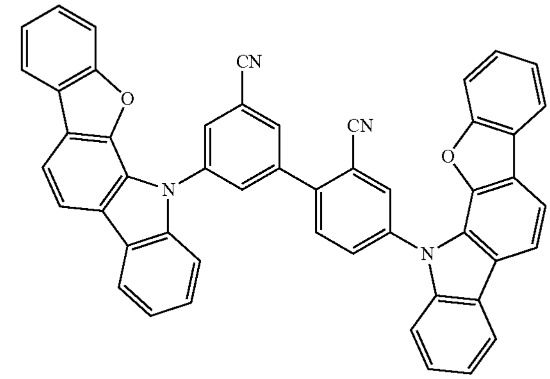
602
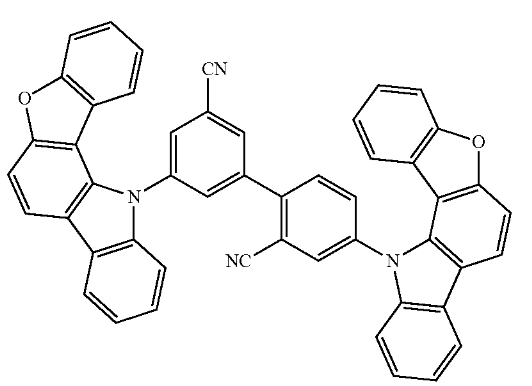
-continued
603
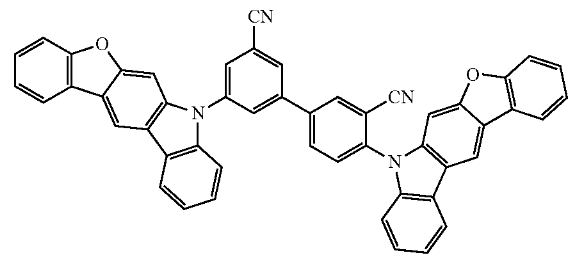
604
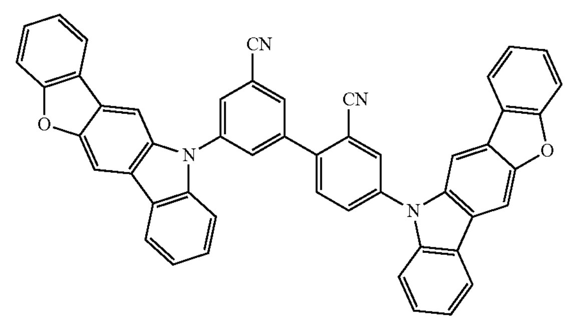
605
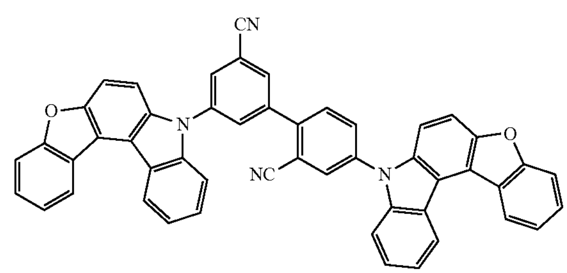
606
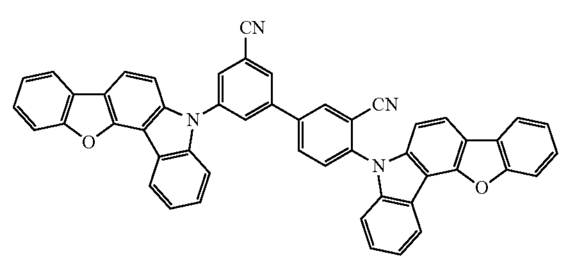
607
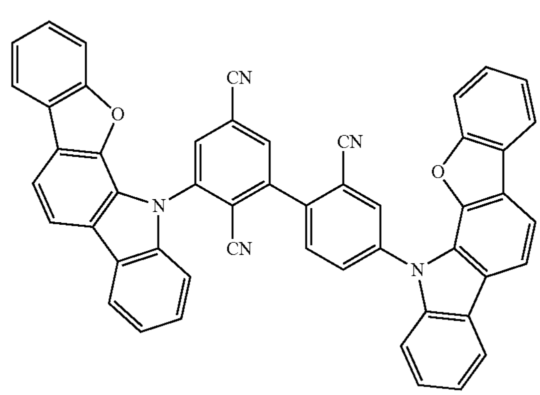

-continued
608
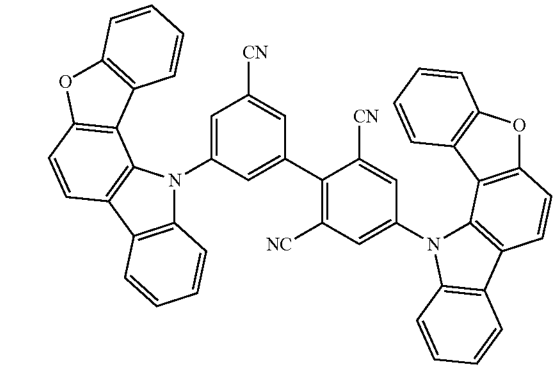
609
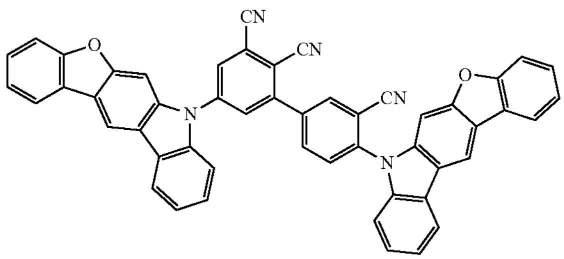
610
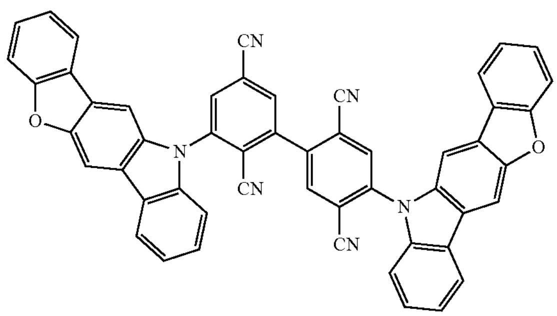
611
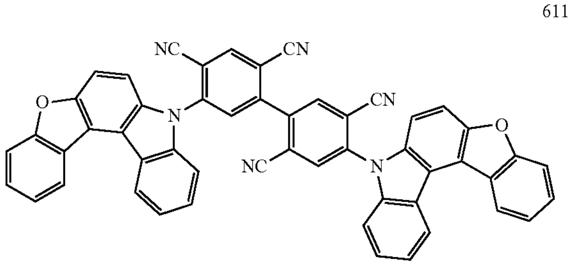
612
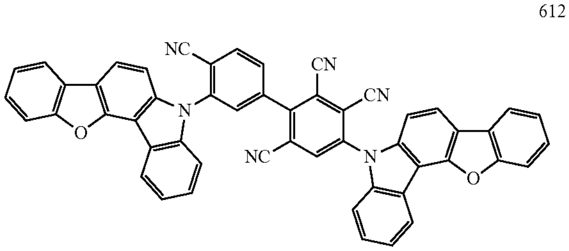
-continued
613
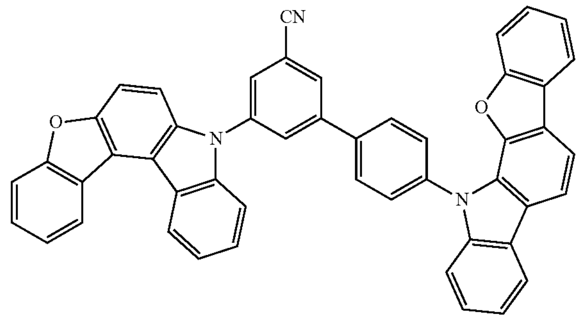
614
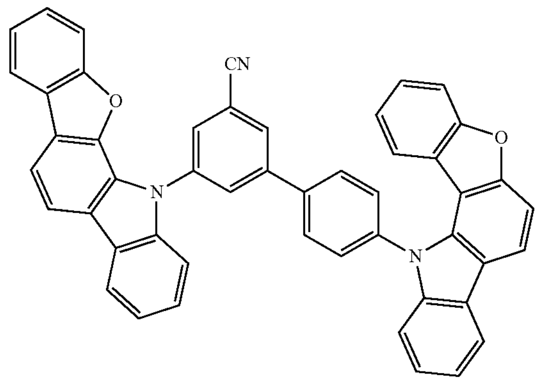
615
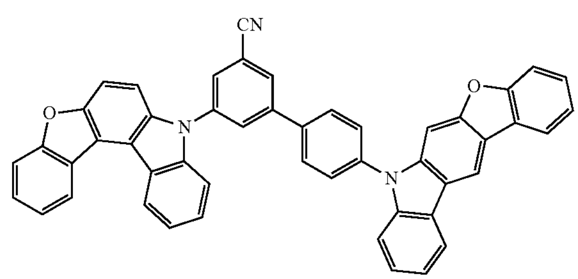
616
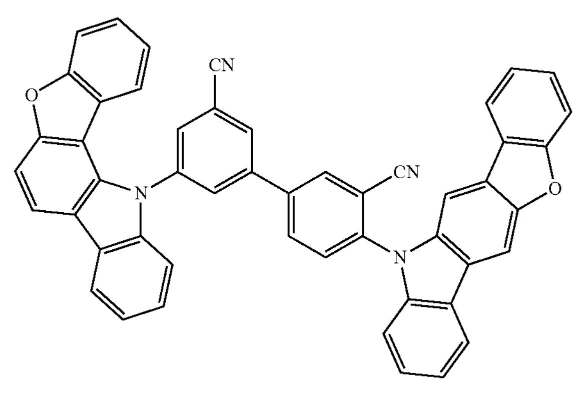

617
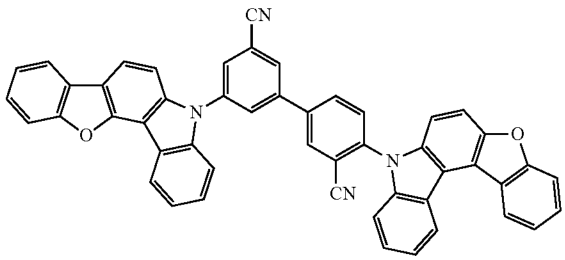
618
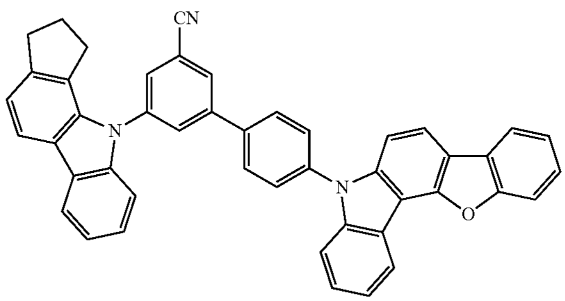
619
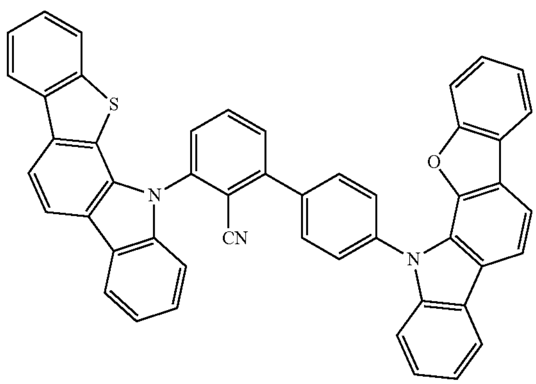
620
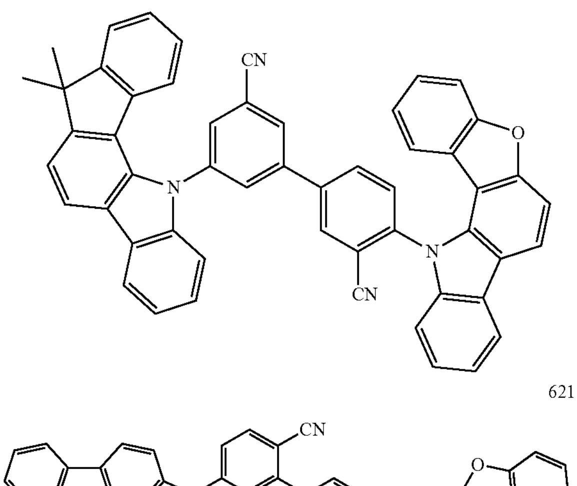
621
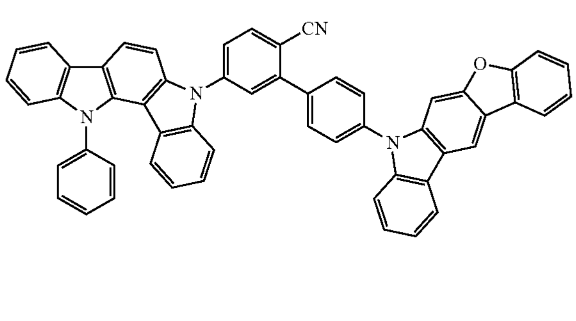
622
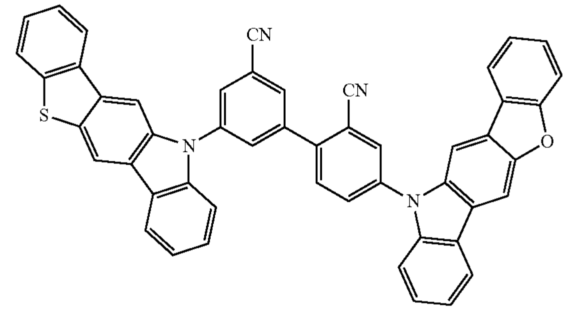
623
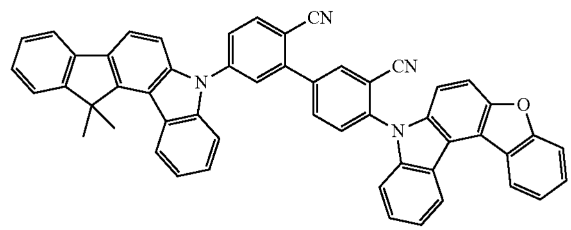
624
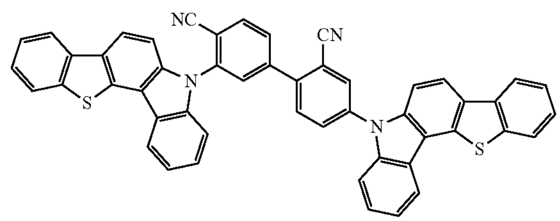
625
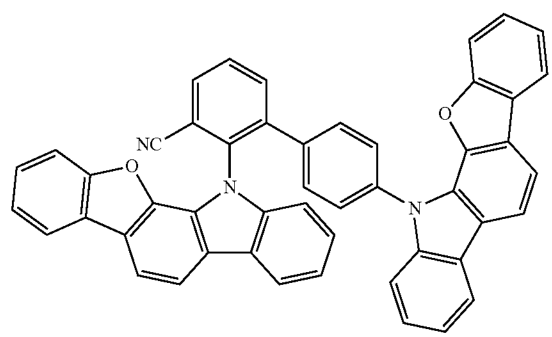
626
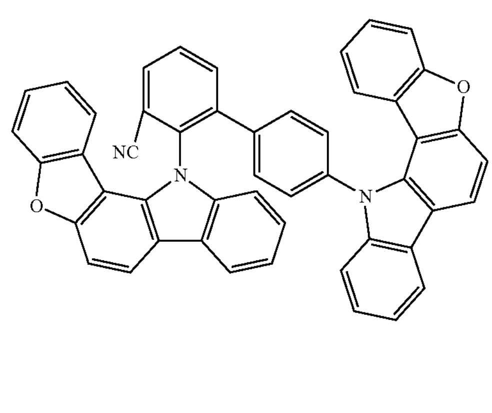

-continued
627
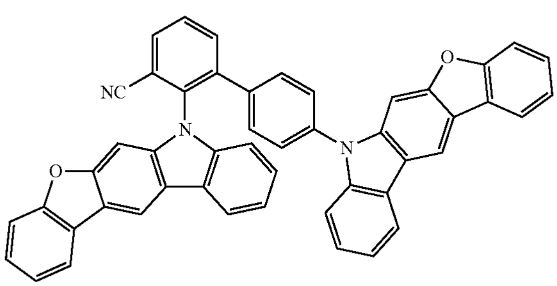
628
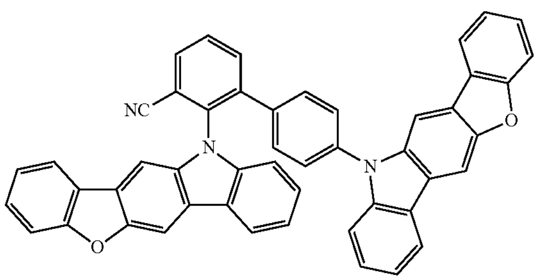
629
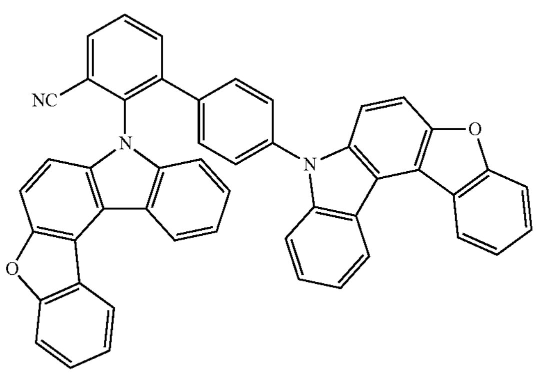
630
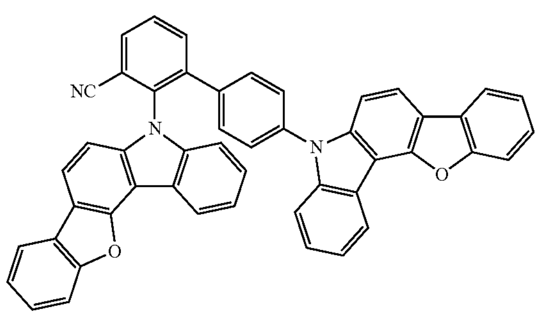
631
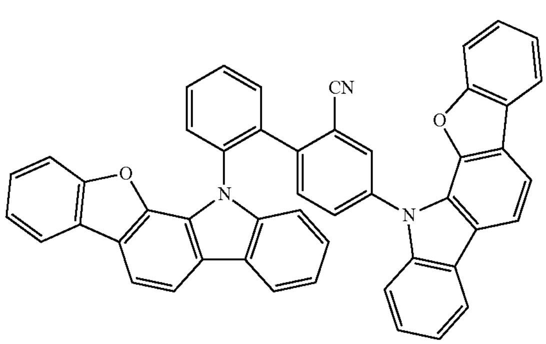
-continued
632
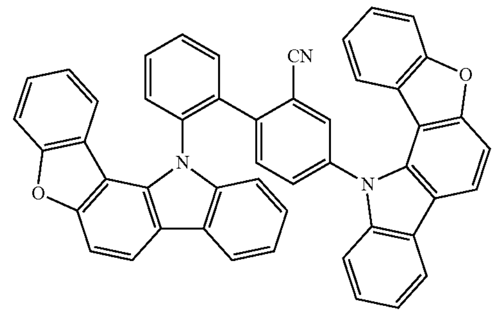
633
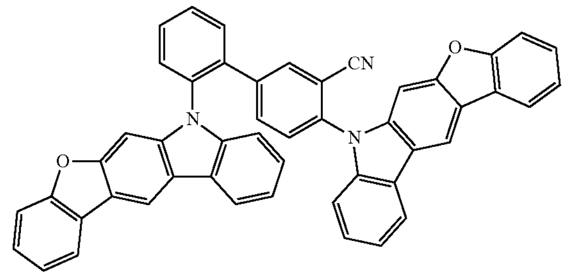
634
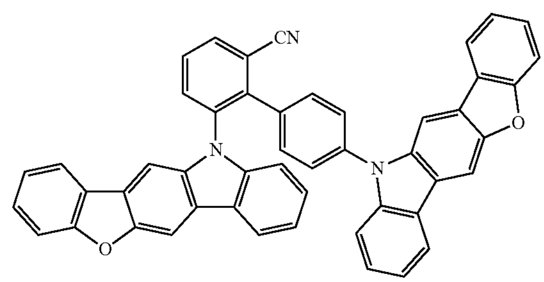
635
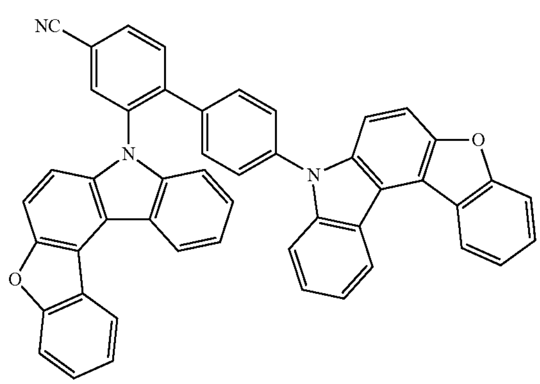
636
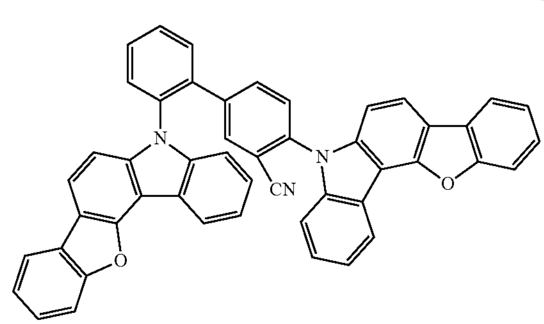

-continued
637
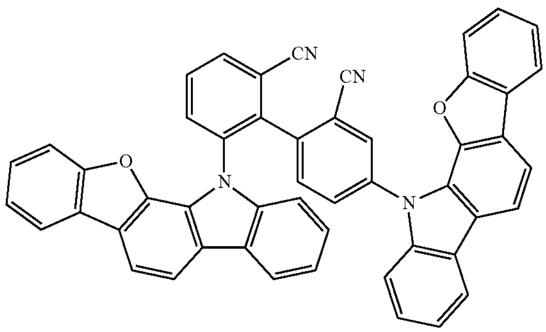
638
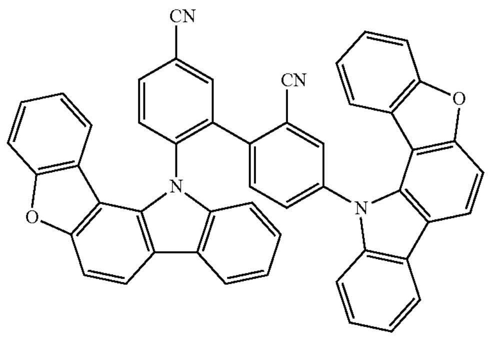
639
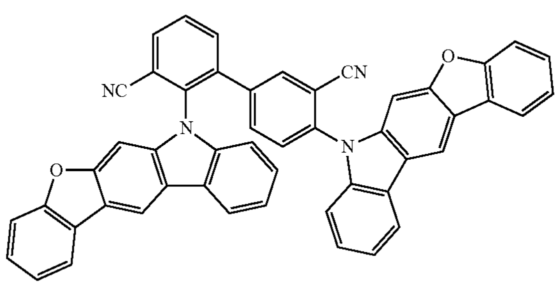
640
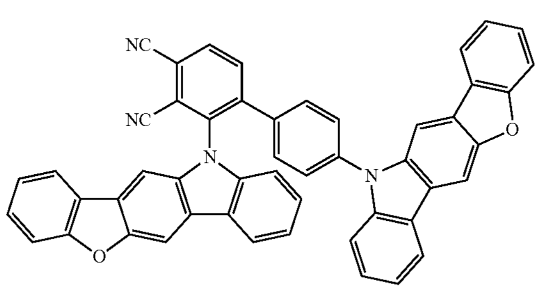
-continued
641
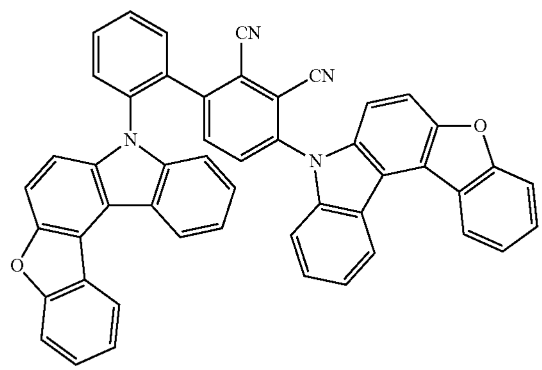
642
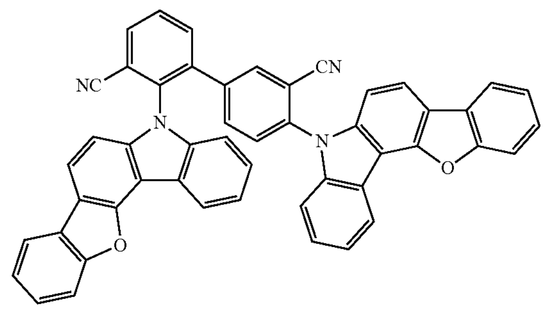
643
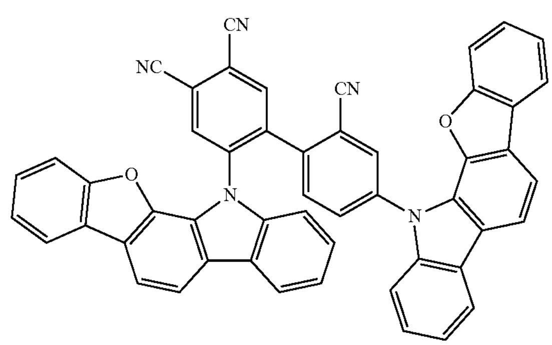
644
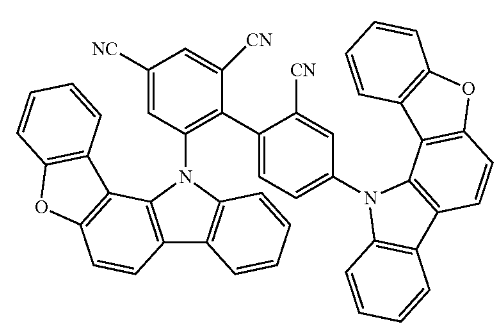

-continued
645
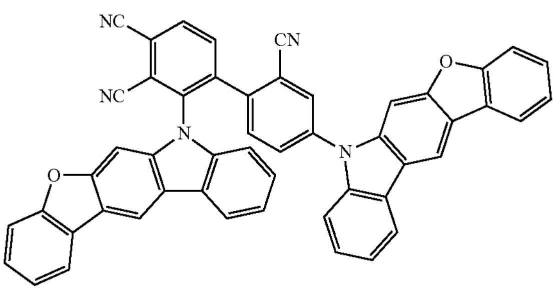
646
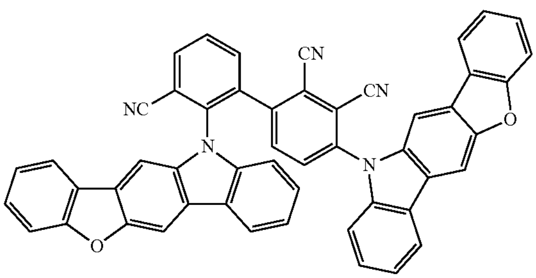
647
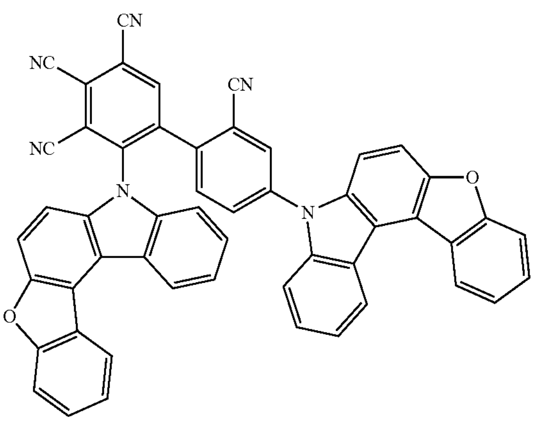
648
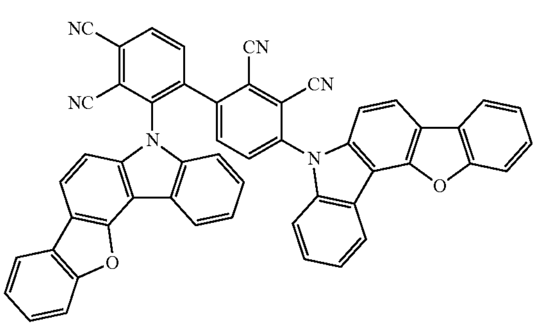
-continued
649
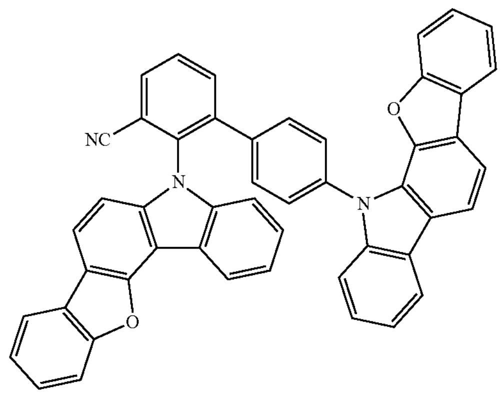
650
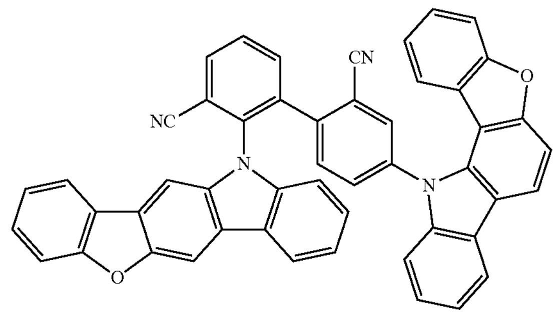
651
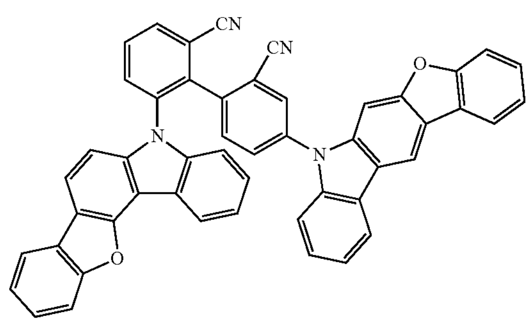
652
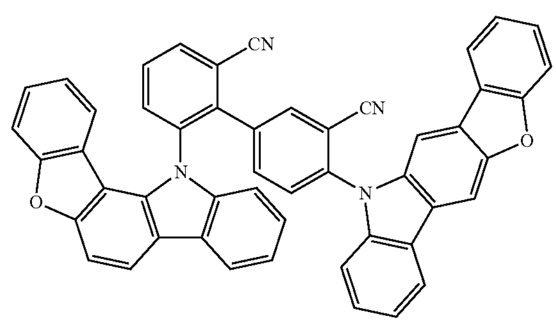

-continued
653
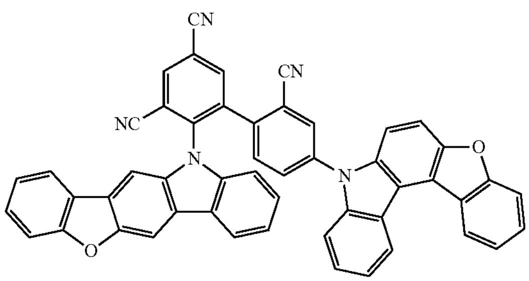
654
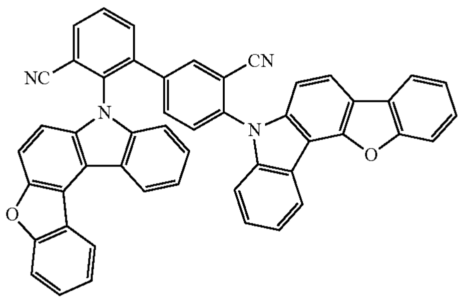
655
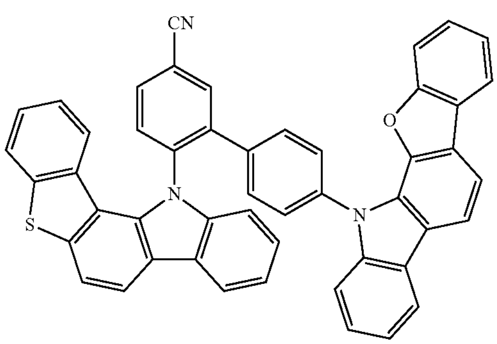
656
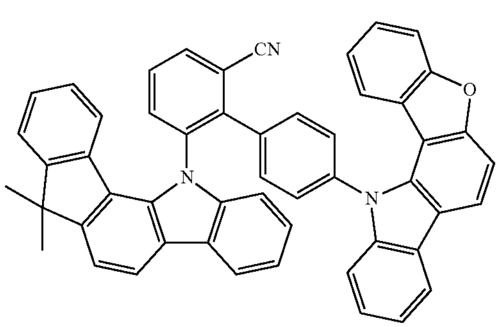
-continued
657
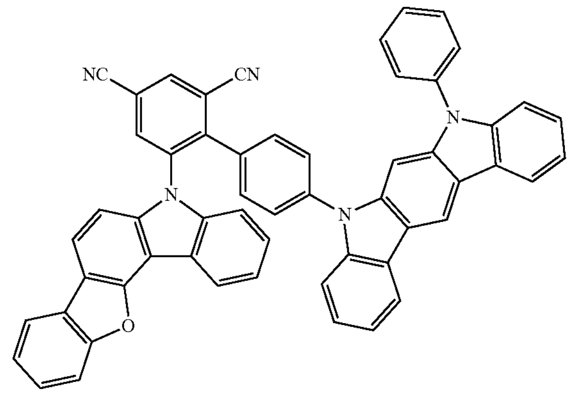
658
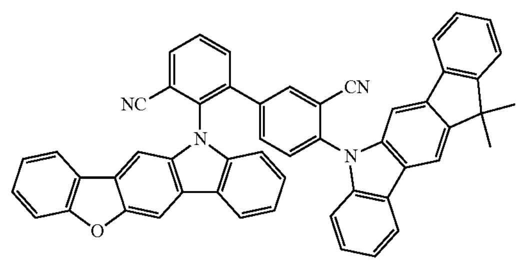
659
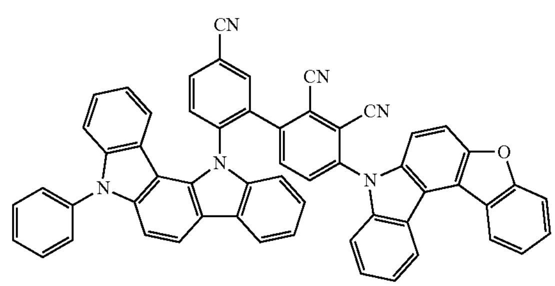
660
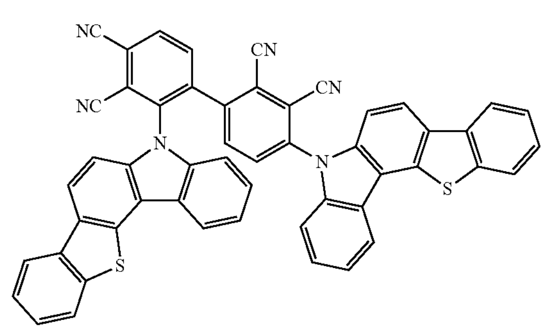

-continued
661
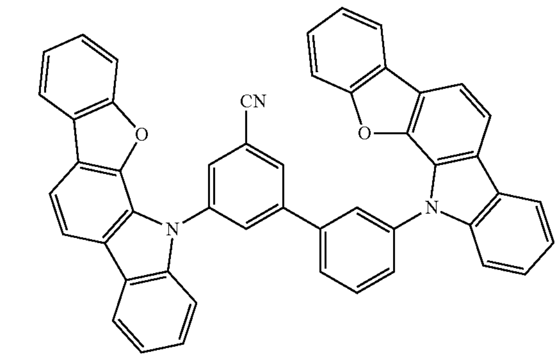
665
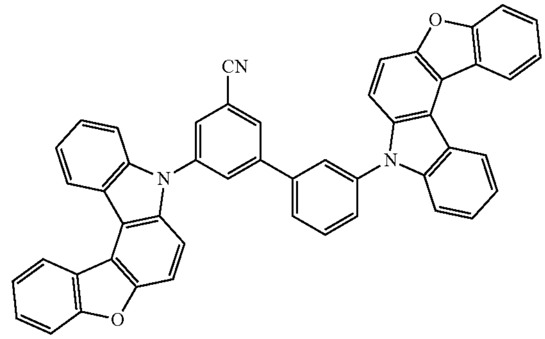
662
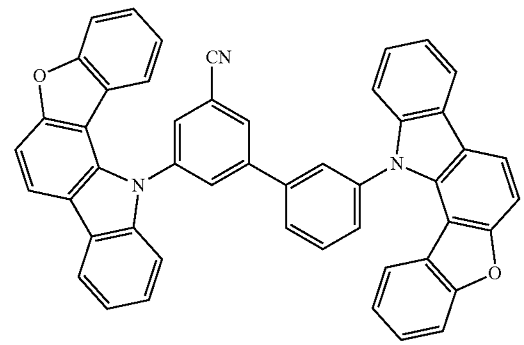
666
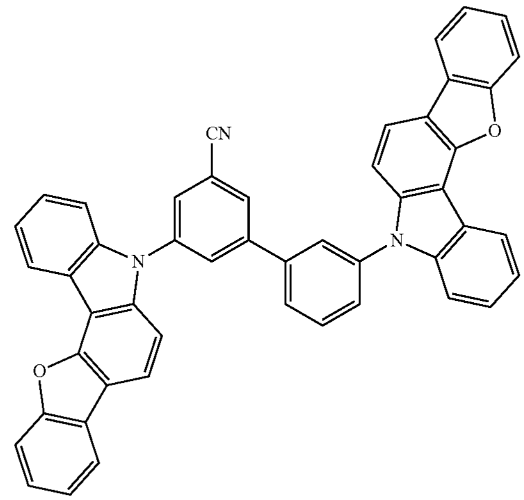
663
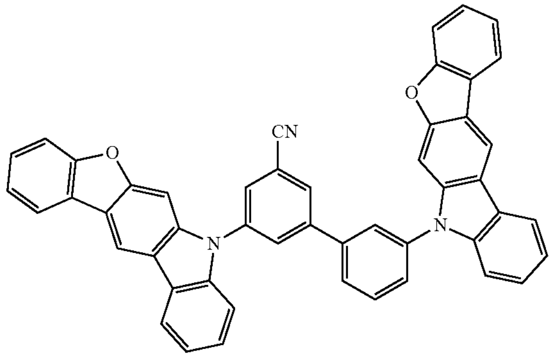
667
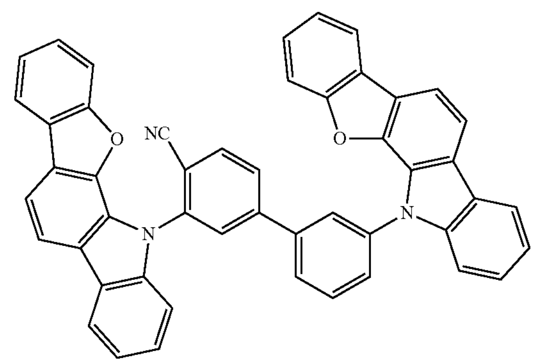
664
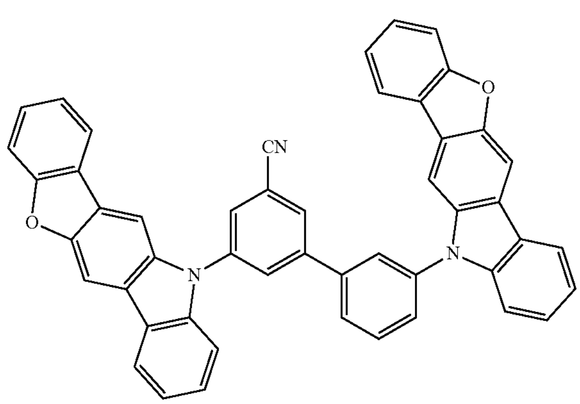
668
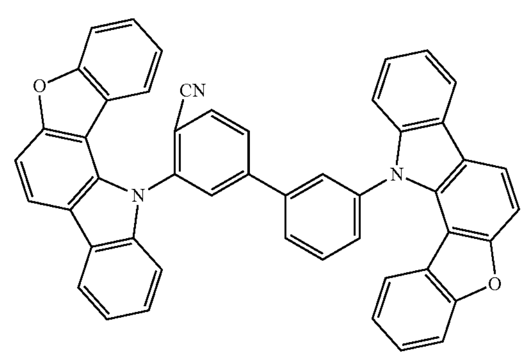

-continued
669
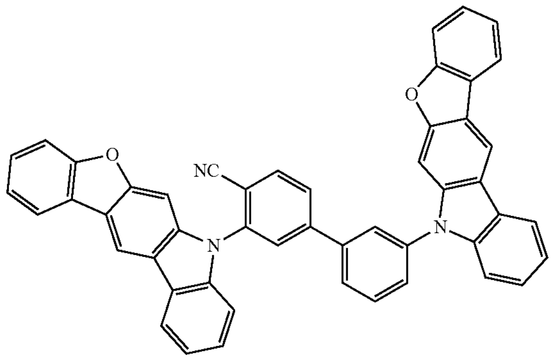
670
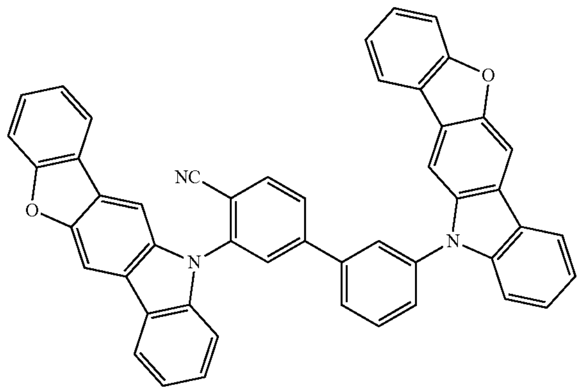
671
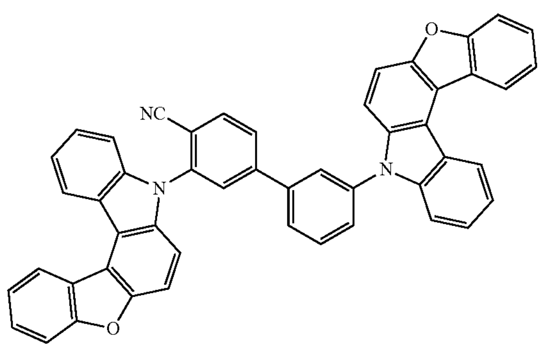
672
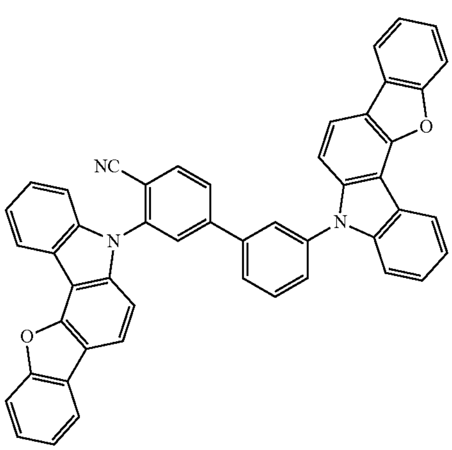
-continued
673
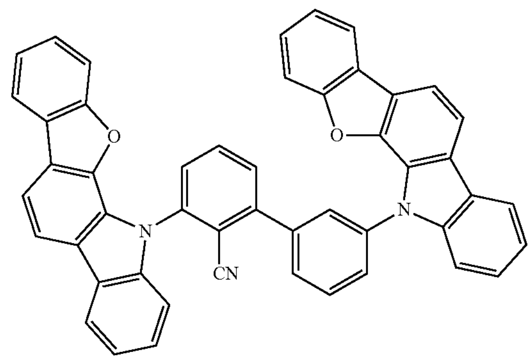
674
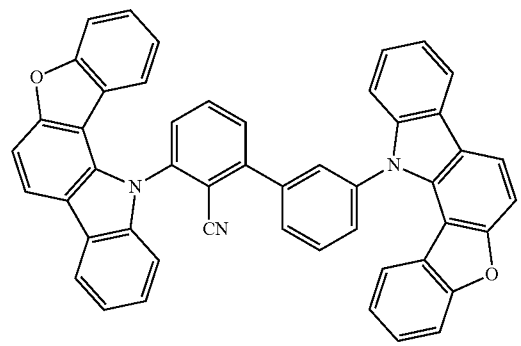
675
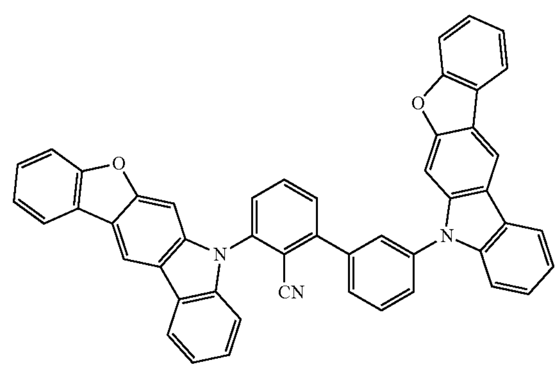
676
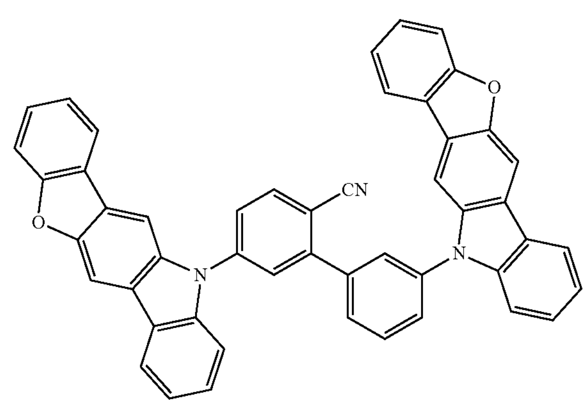

-continued
677
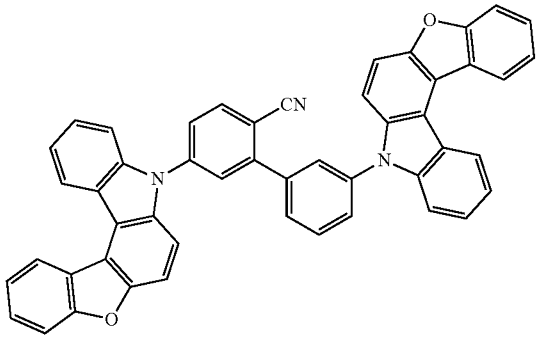
678
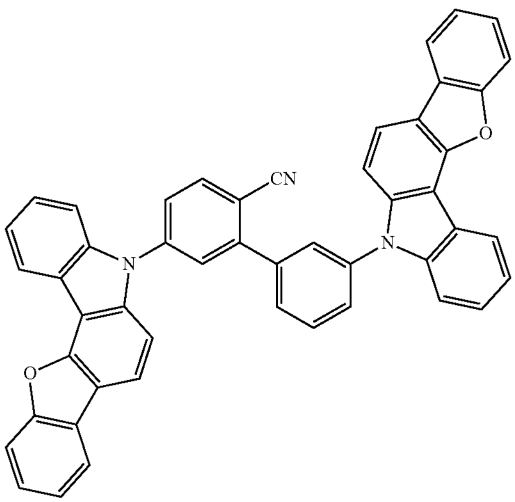
679
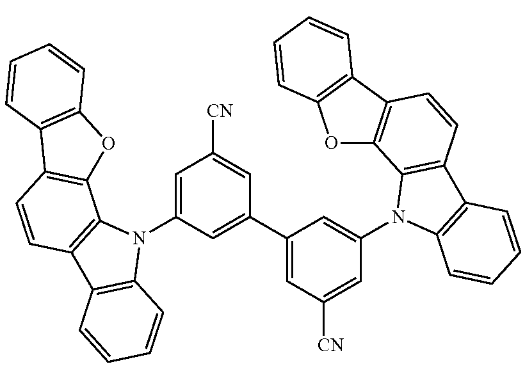
680
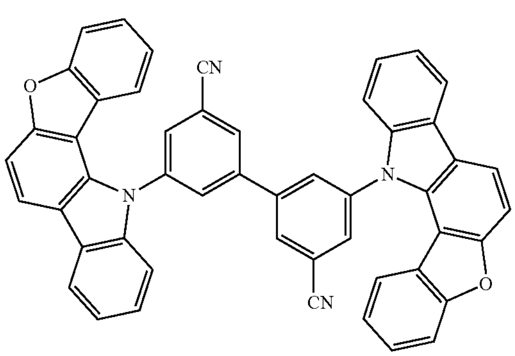
-continued
681
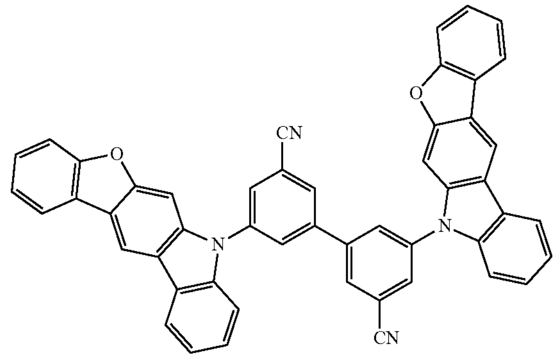
682
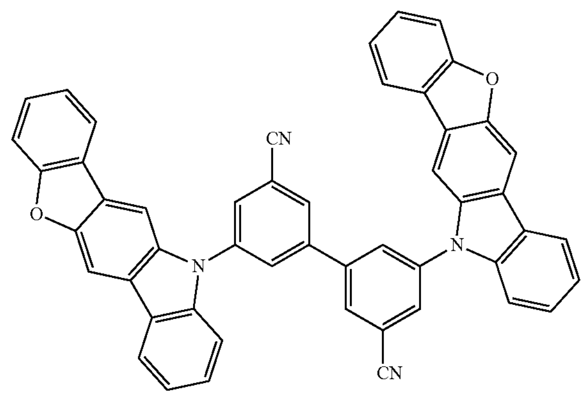
683
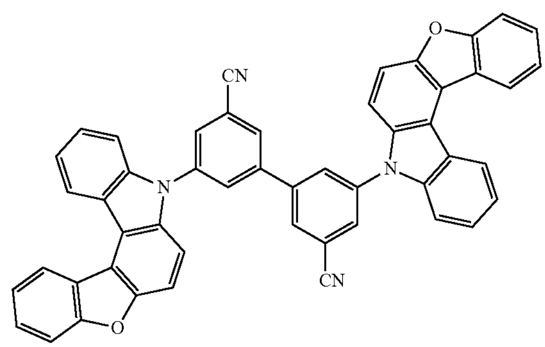
684
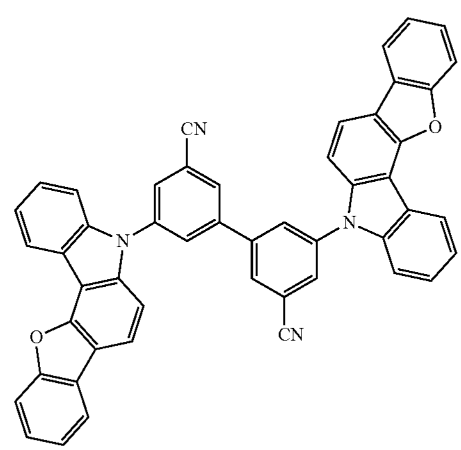

-continued
685
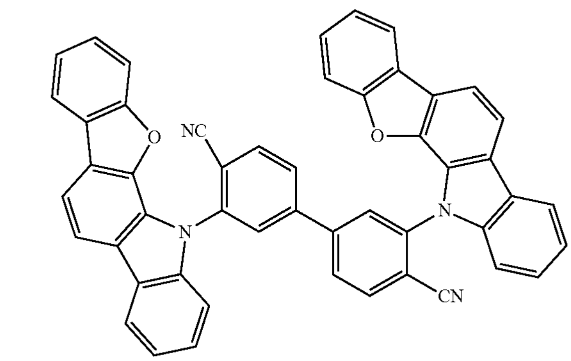
686
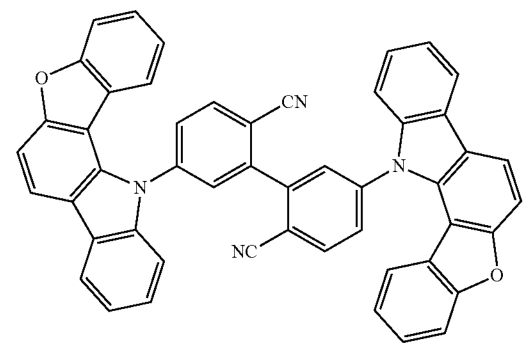
687
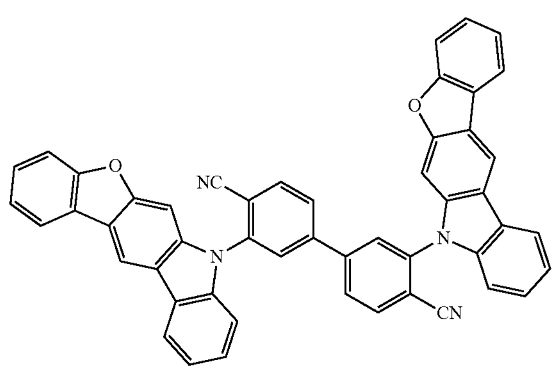
688
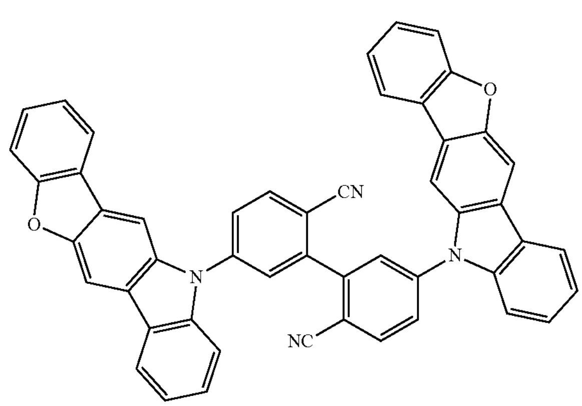
-continued
689
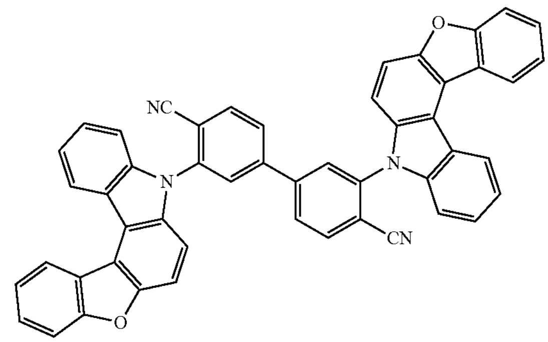
690
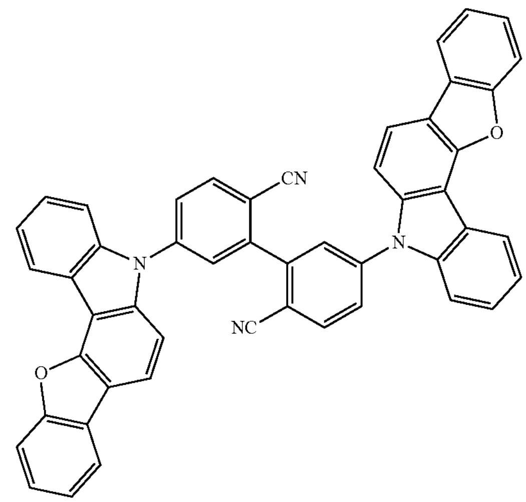
691
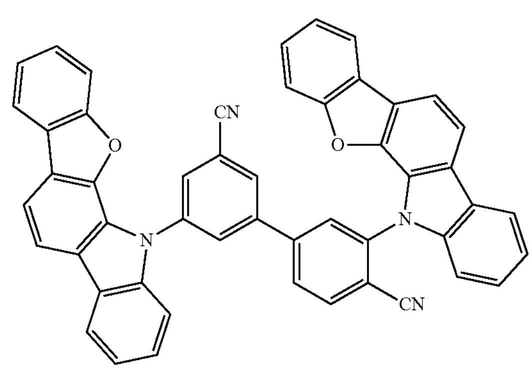
692
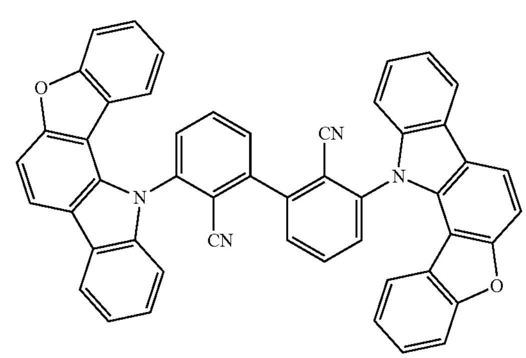

693
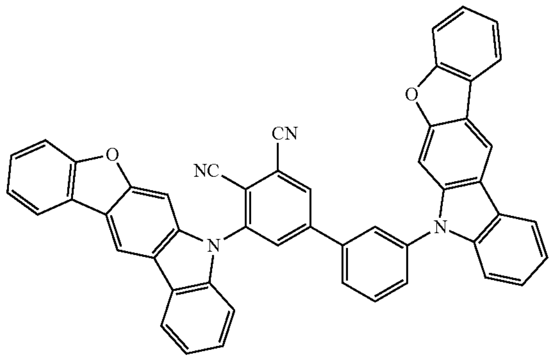
694
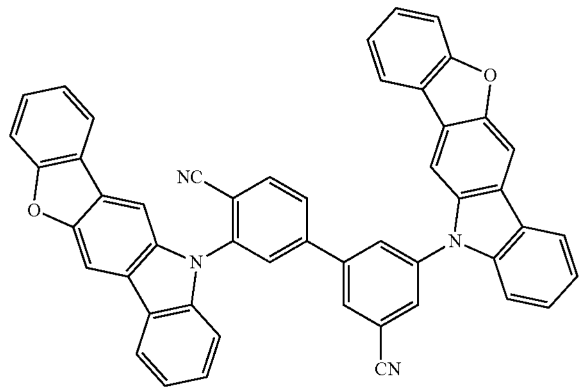
695
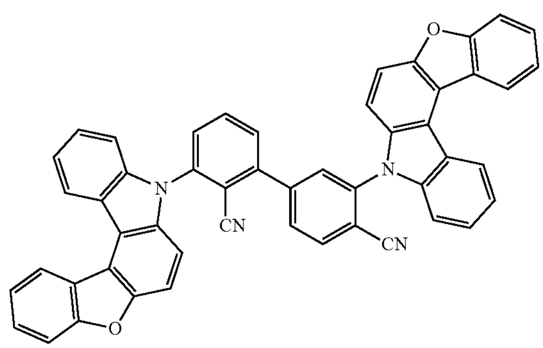
696
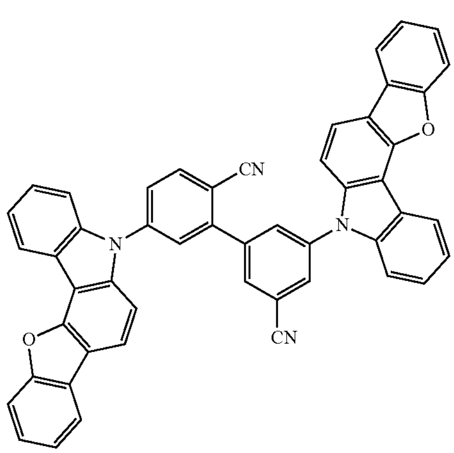
697
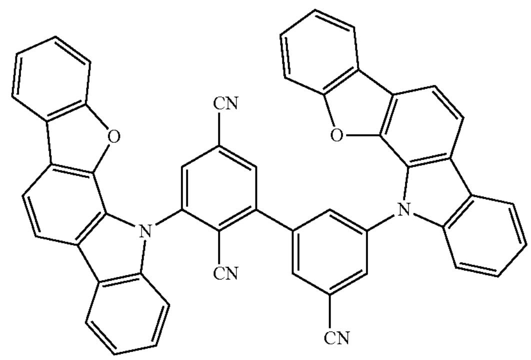
698
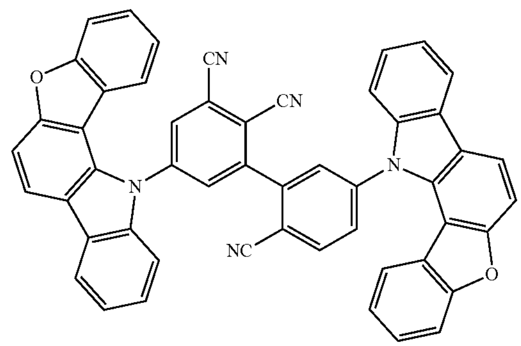
699
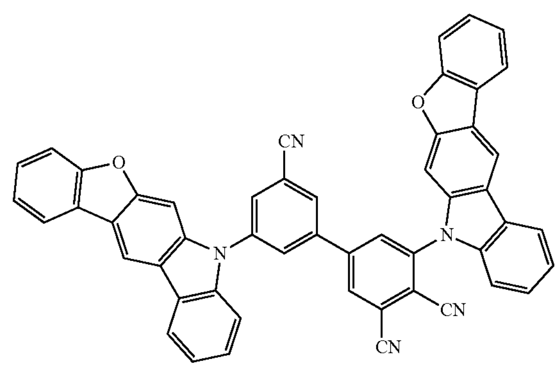
700
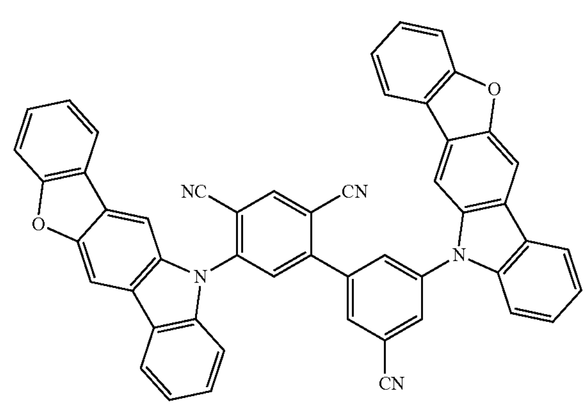

-continued
701
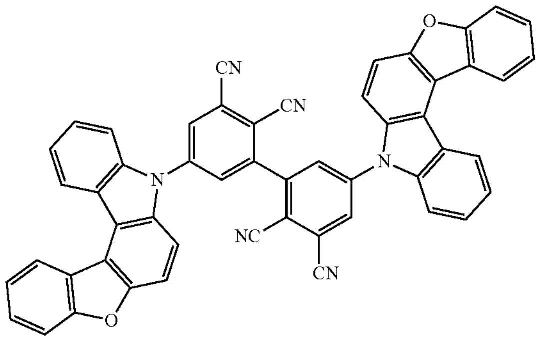
702
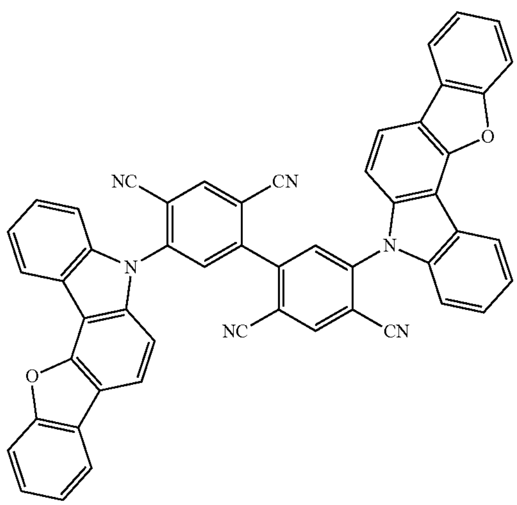
703
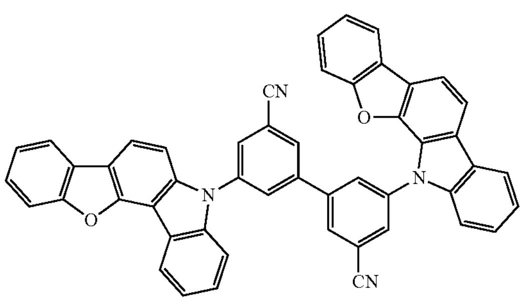
704
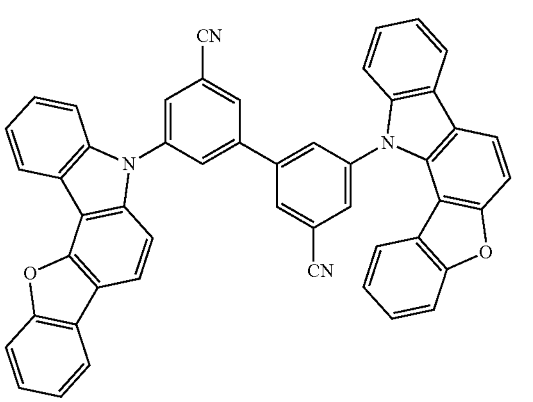
-continued
705
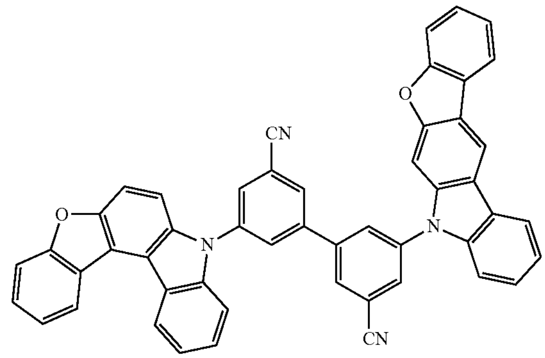
706
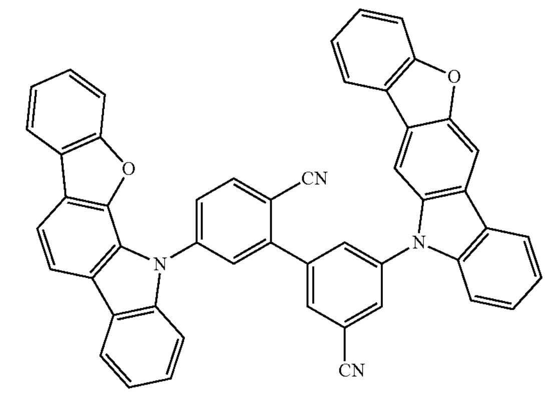
707
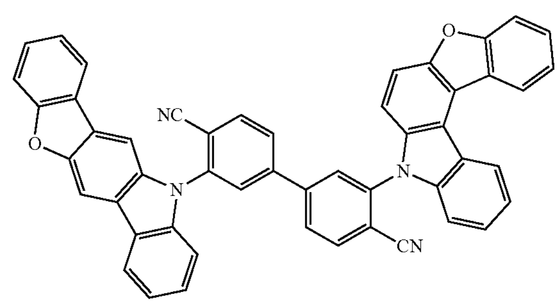
708
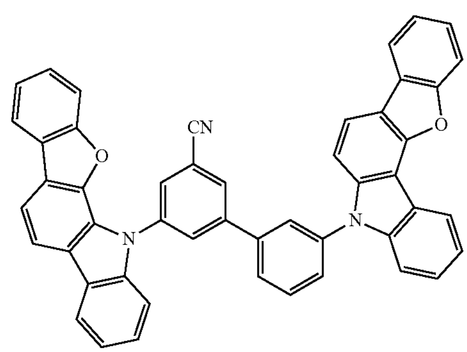

-continued
709
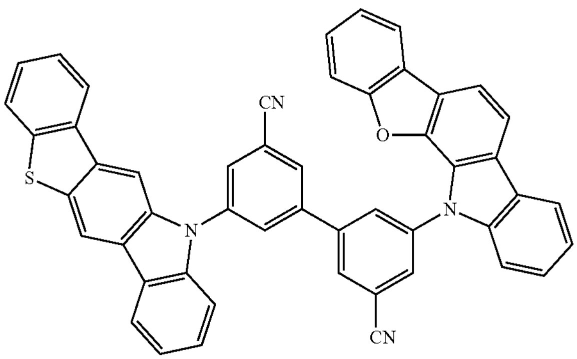
710
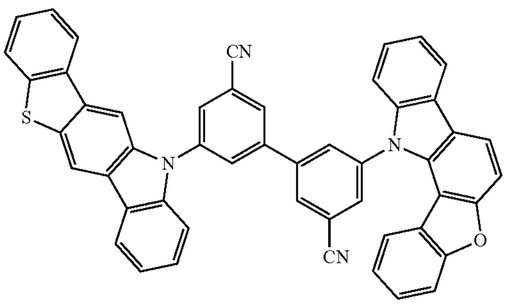
711
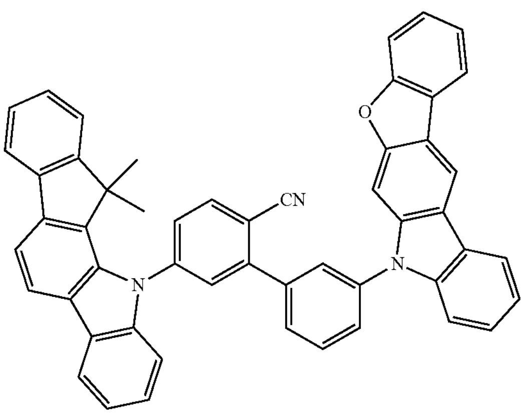
712
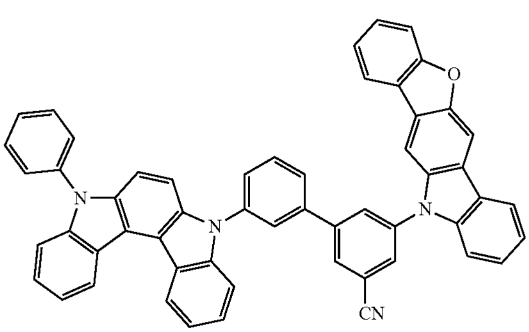
-continued
713
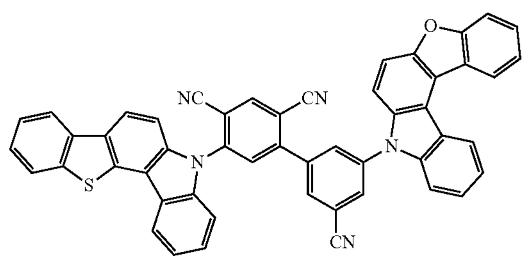
714
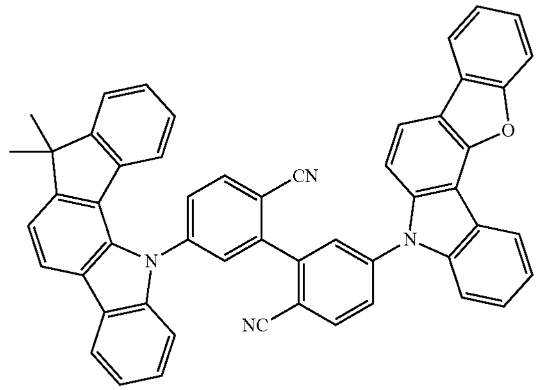
715
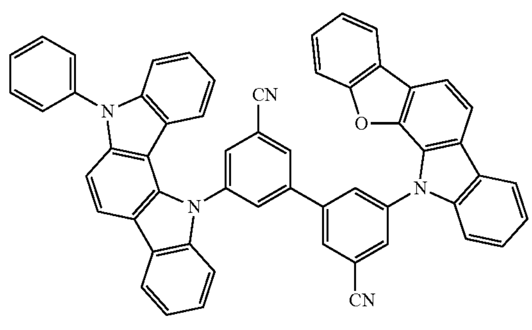
716
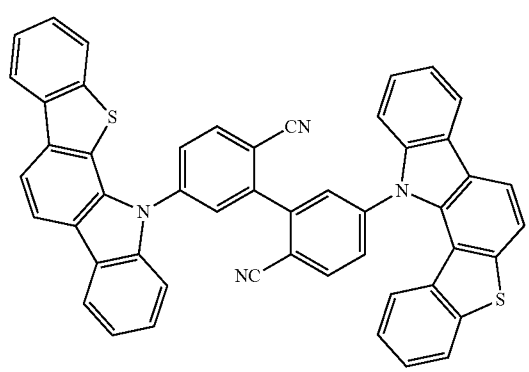

-continued
717
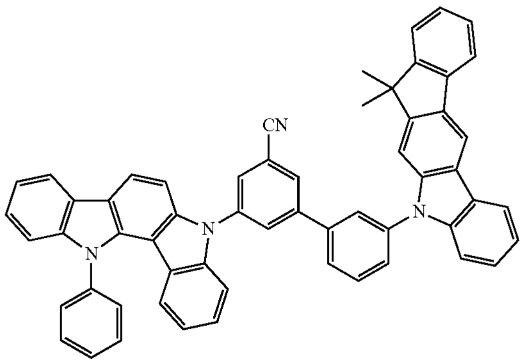
718
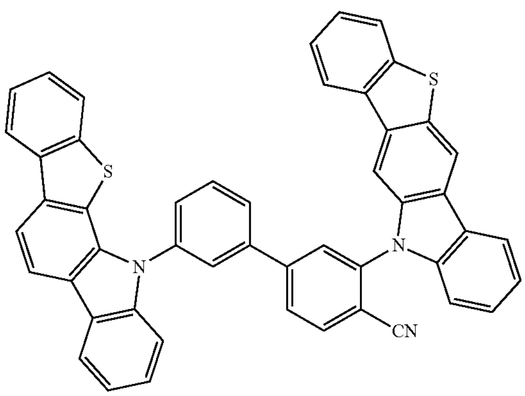
719
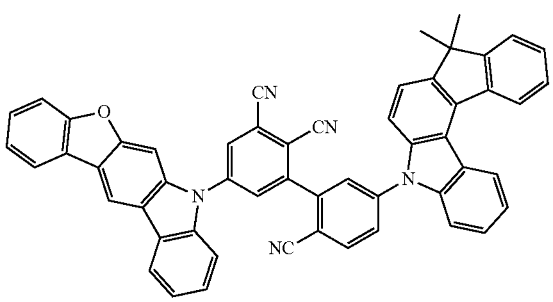
720
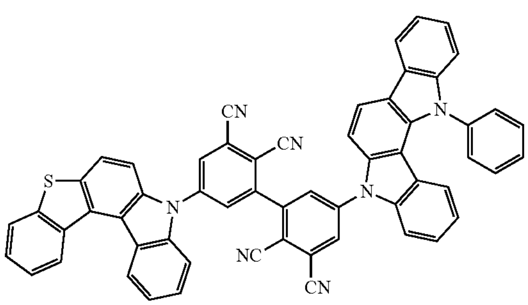
-continued
721
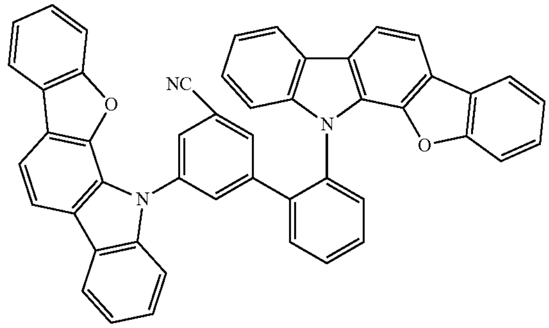
722
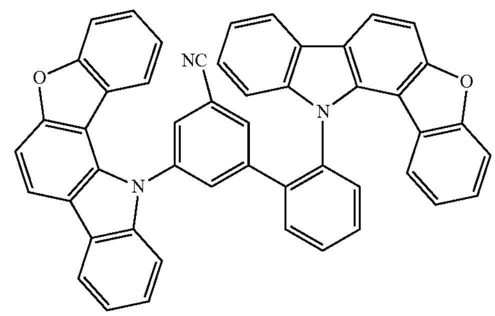
723
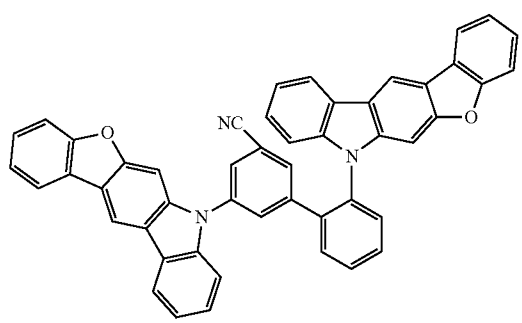
724
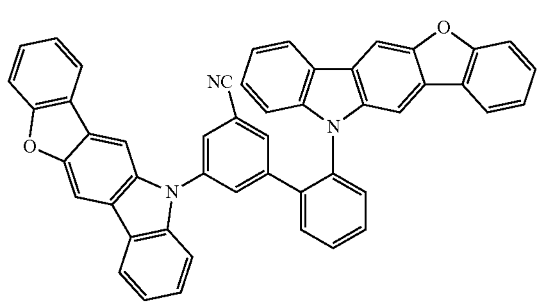

725
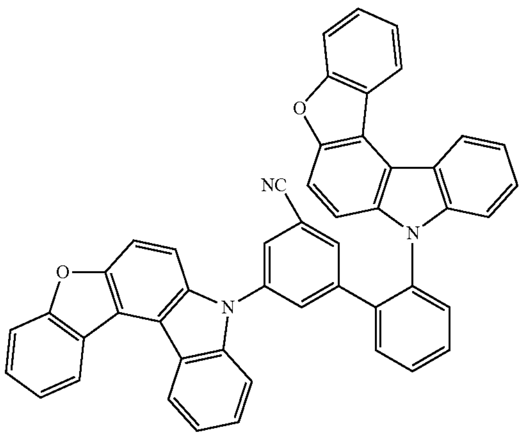
726
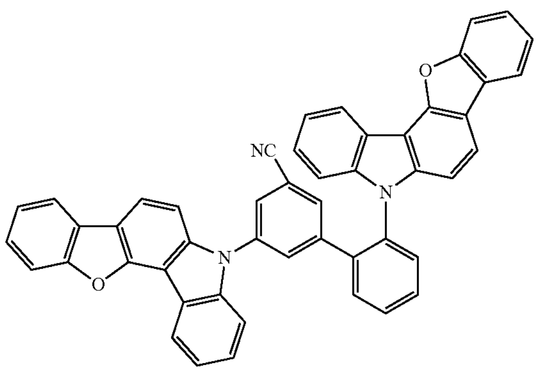
727
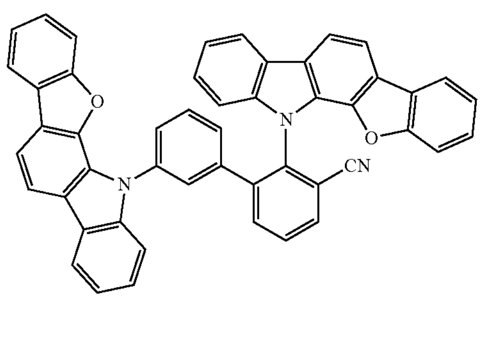
728
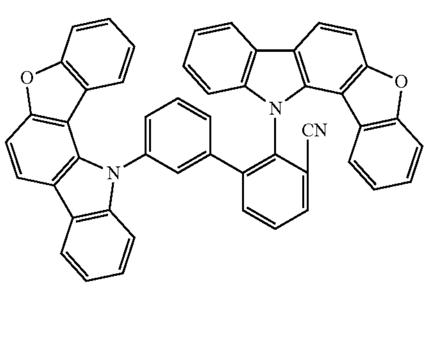
729
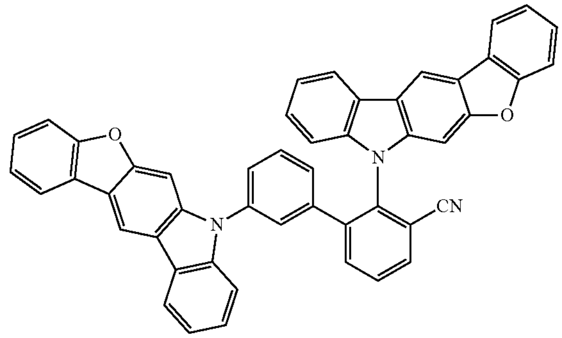
730
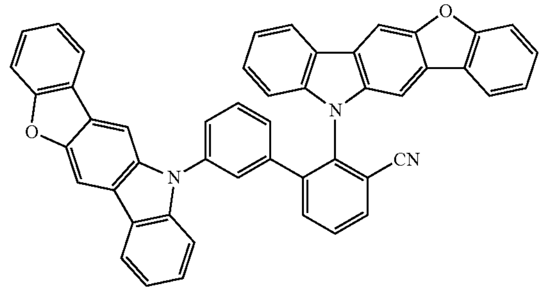
731
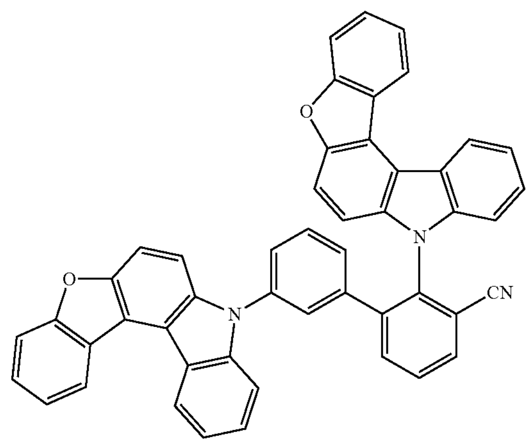
732
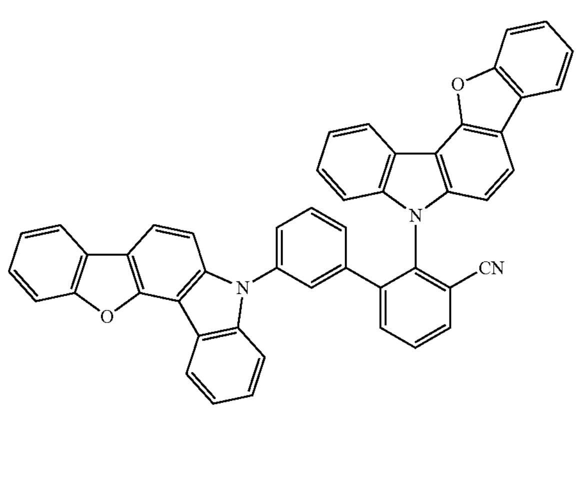

-continued
733
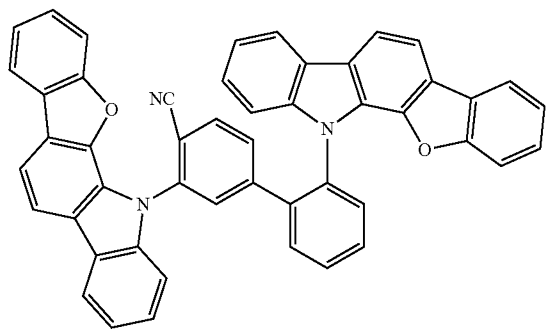
734
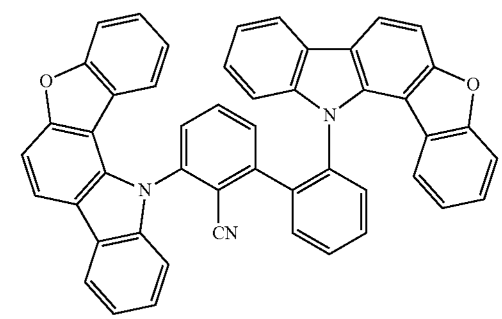
735
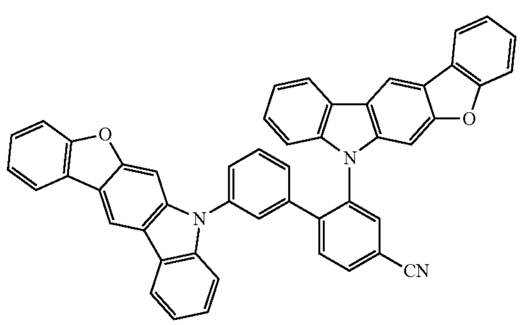
736
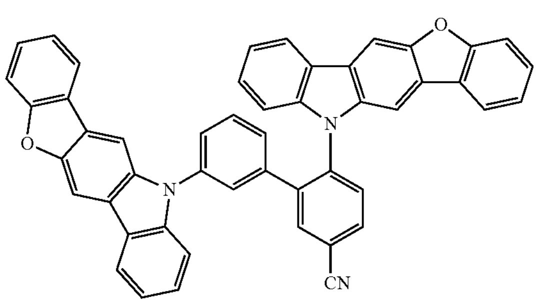
-continued
737
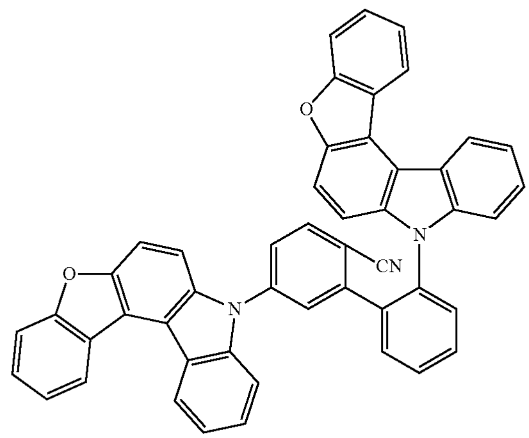
738
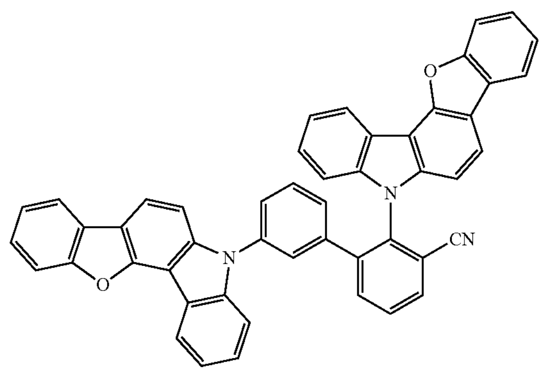
739
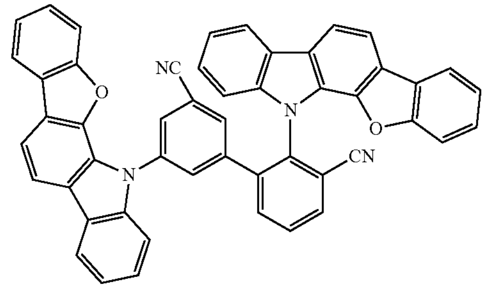
740
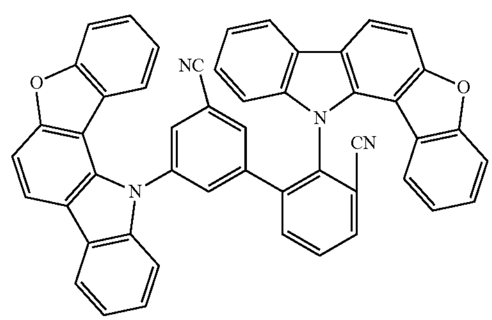

741
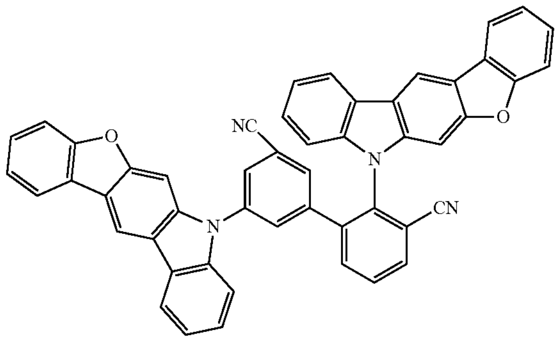
742
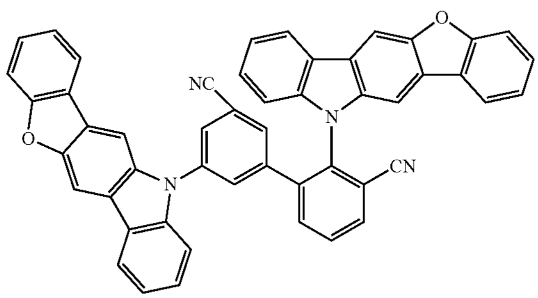
743
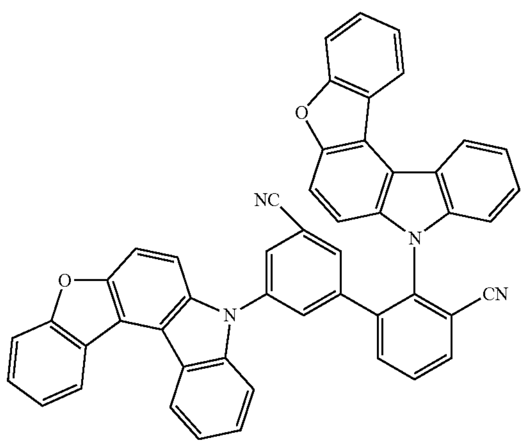
744
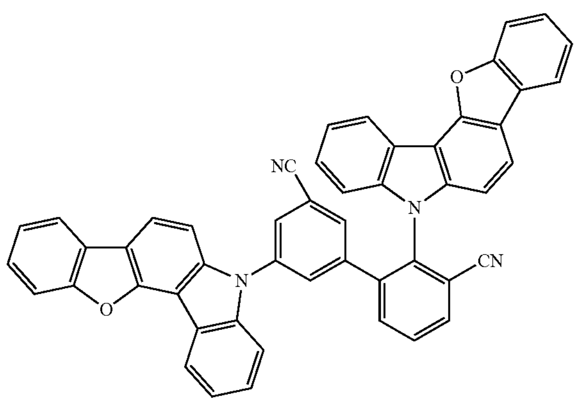
745
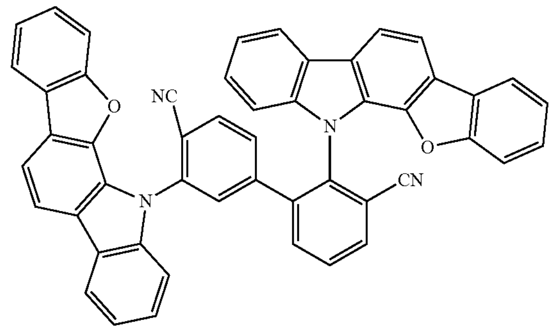
746
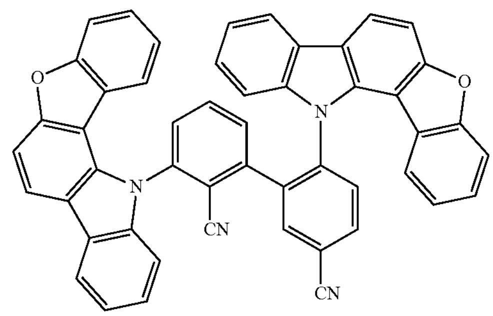
747
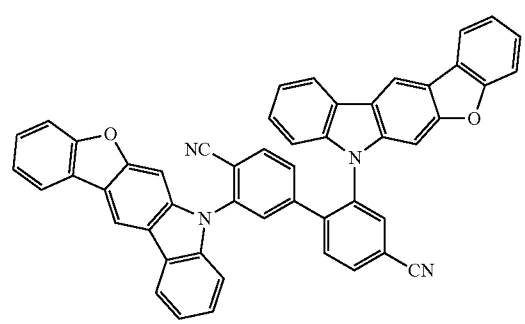
748
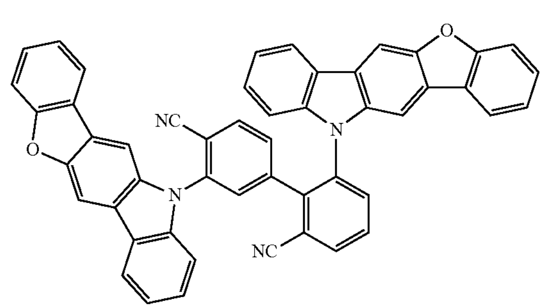

-continued
749
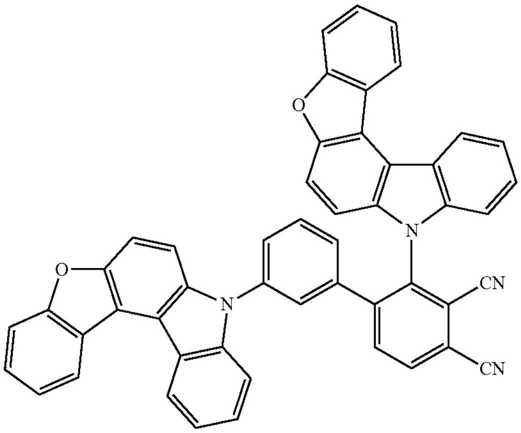
750
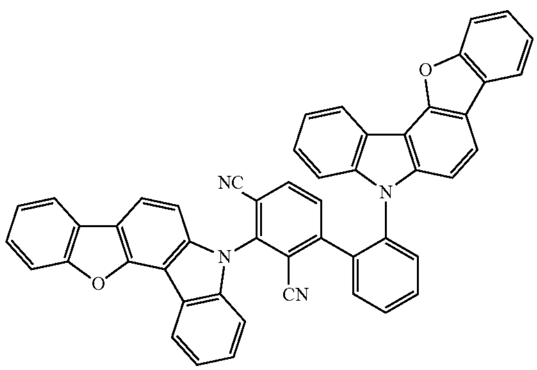
751
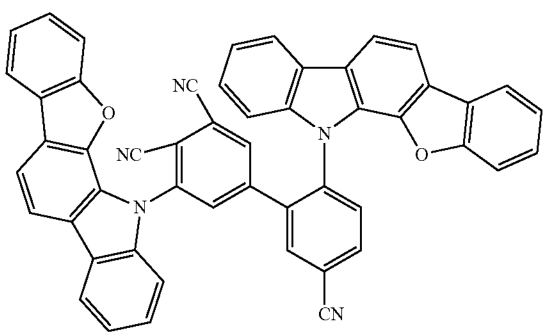
752
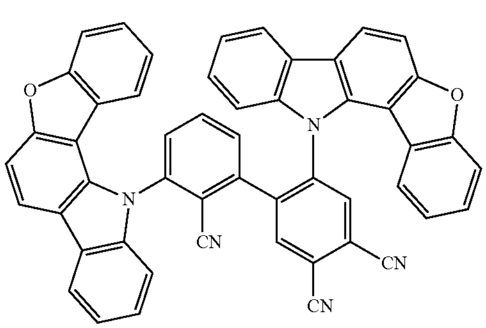
-continued
753
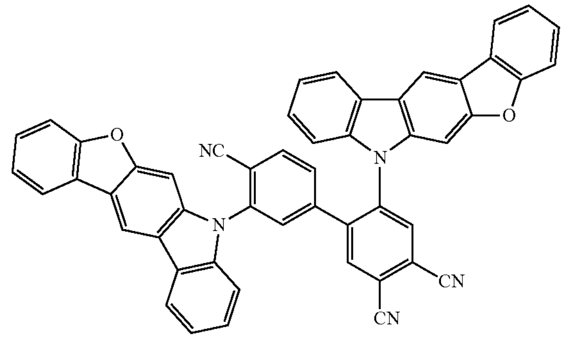
754
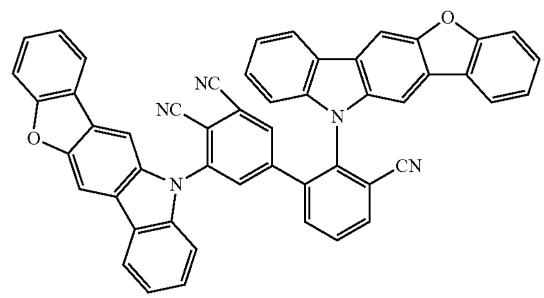
755
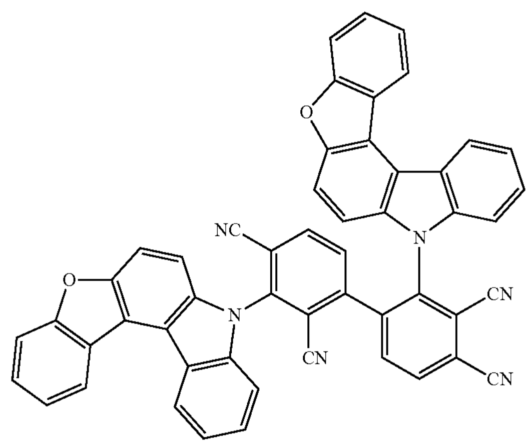
756
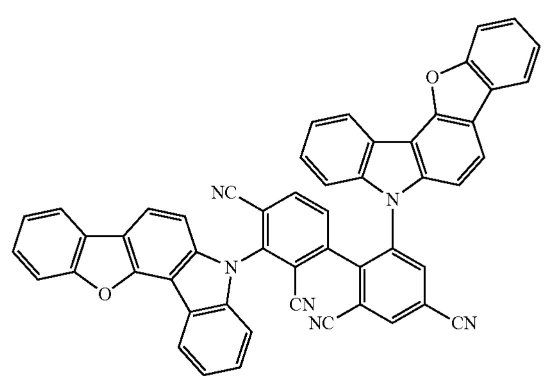

-continued
757
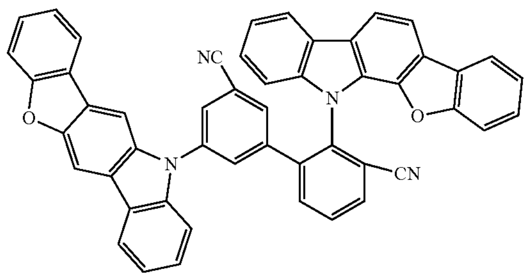
758
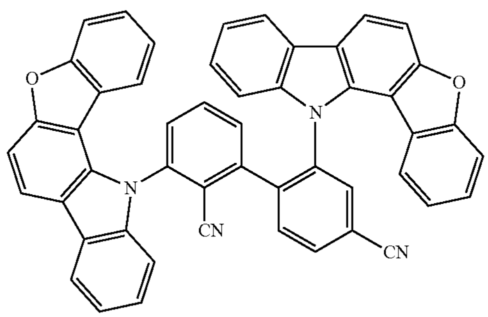
759
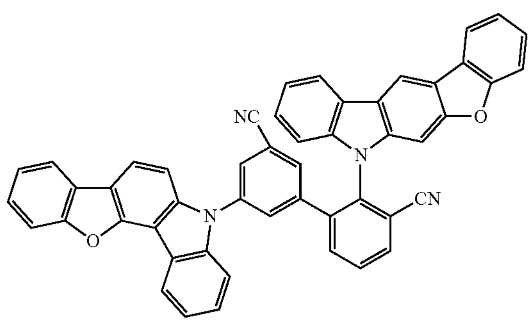
760
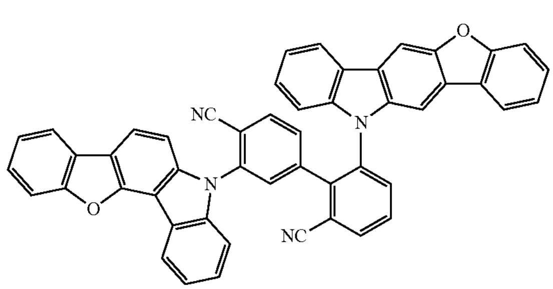
-continued
761
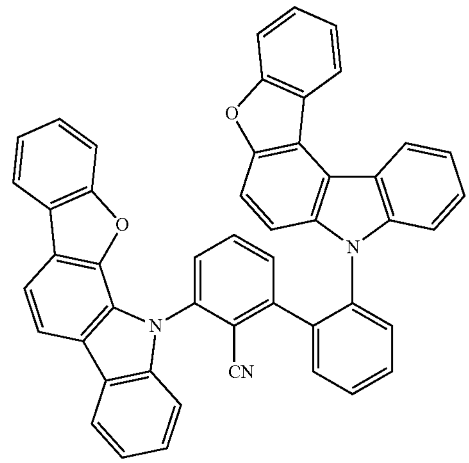
762
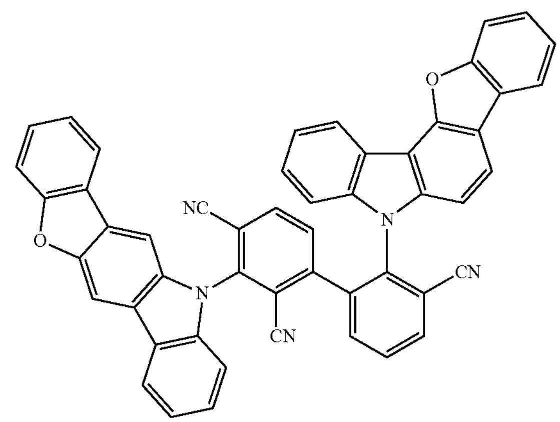
763
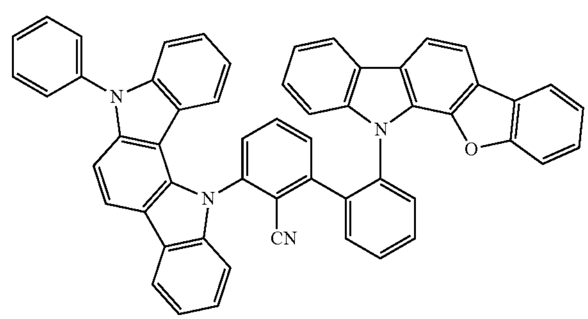
764
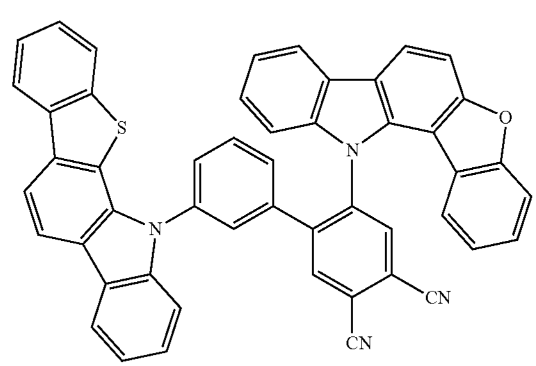

765
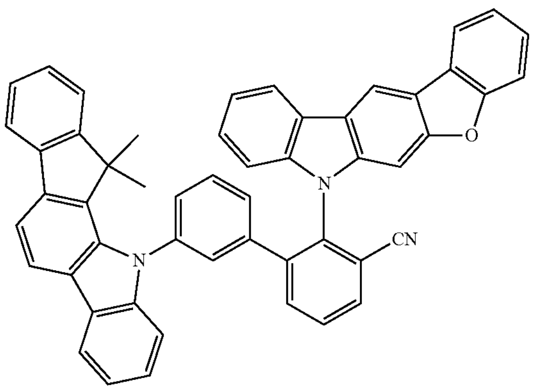
766
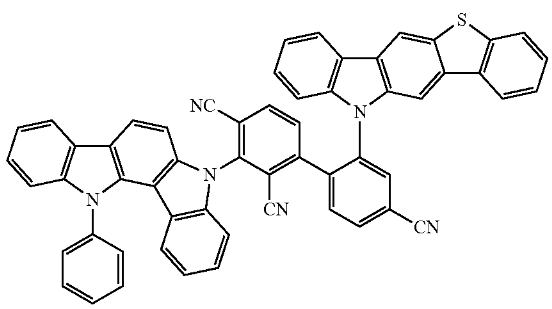
767
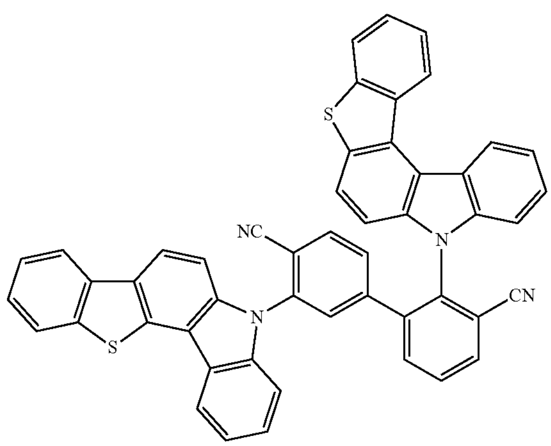
768
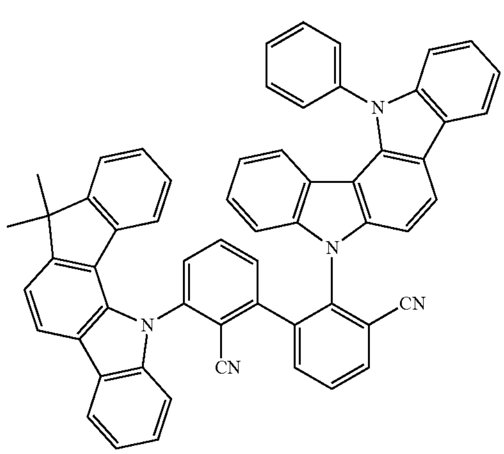
769
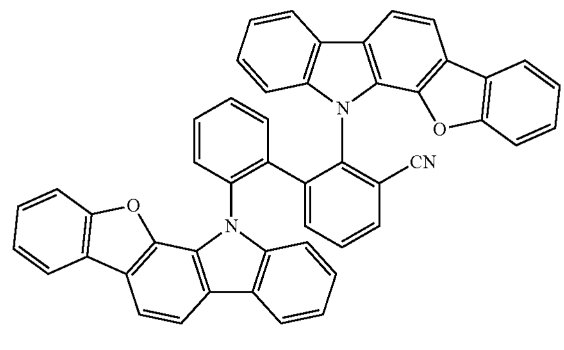
770
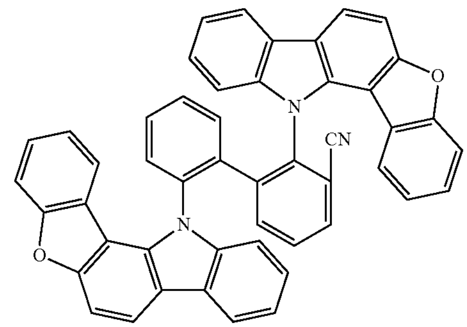
771
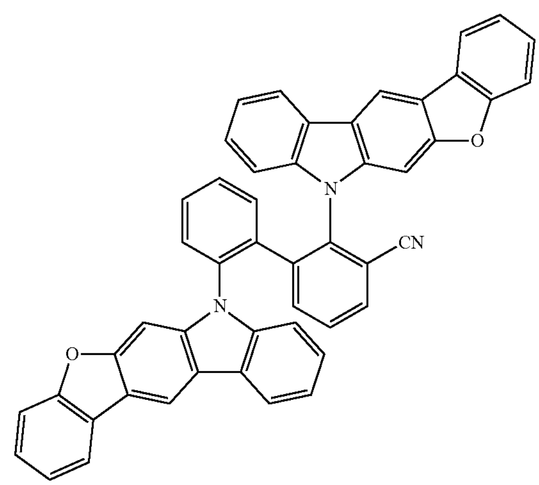
772
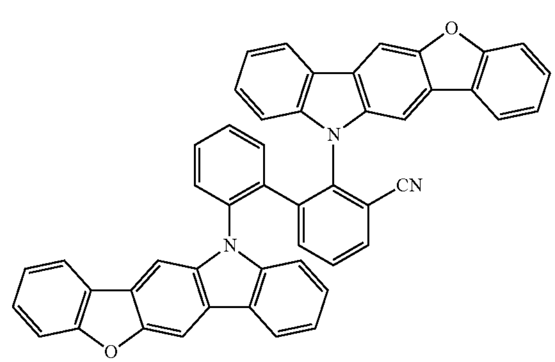

-continued
773
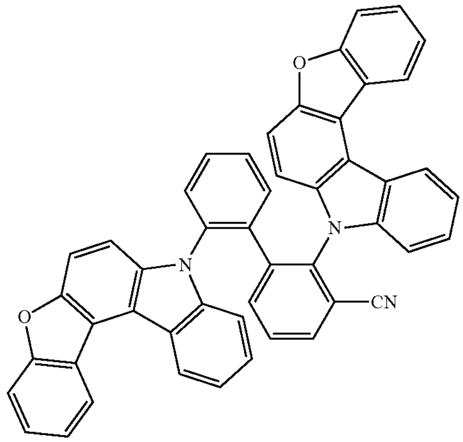
774
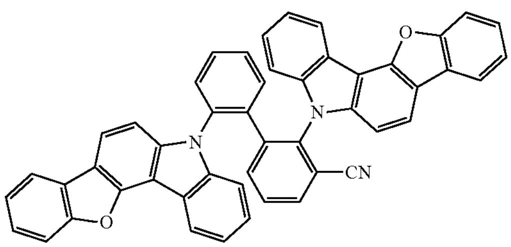
775
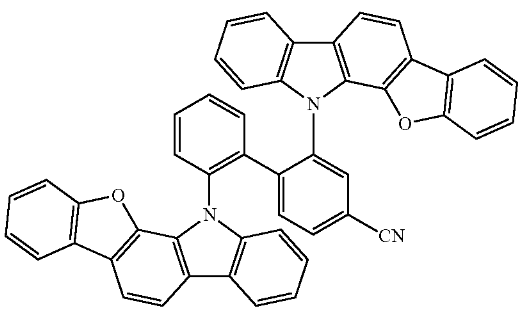
776
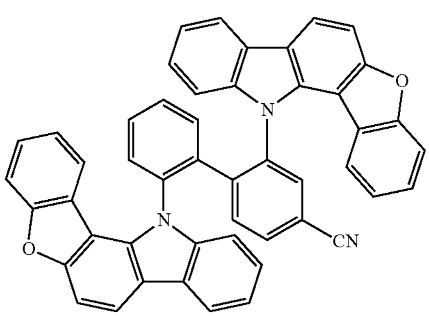
-continued
777
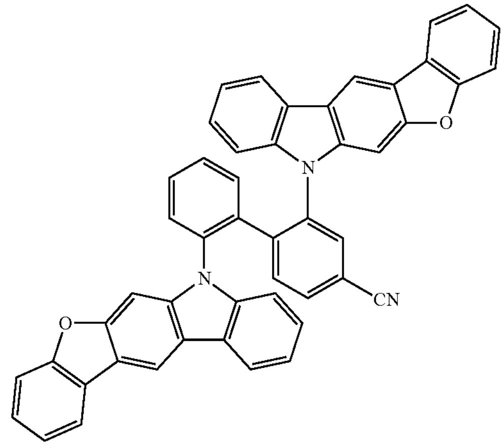
778
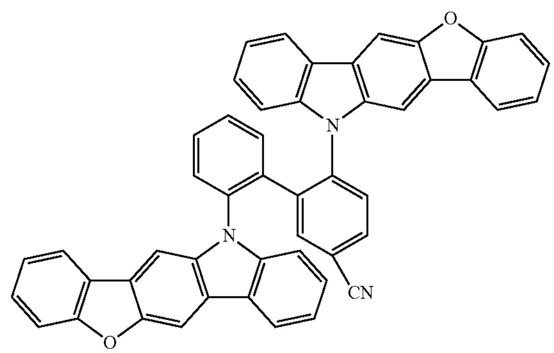
779
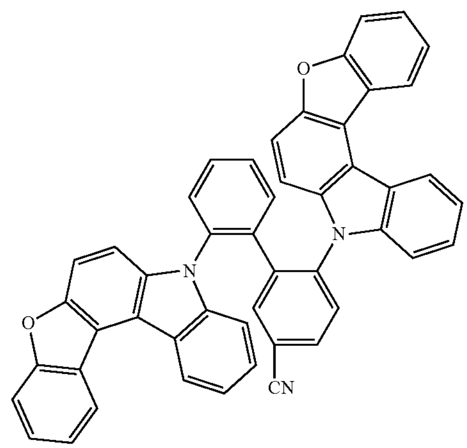
780
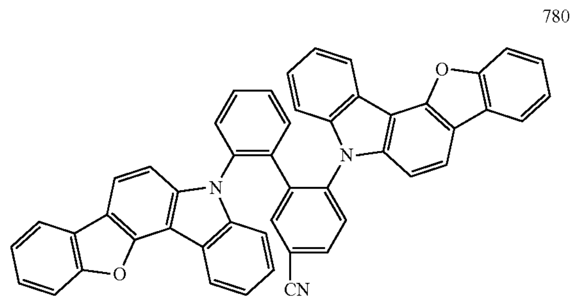

-continued
781
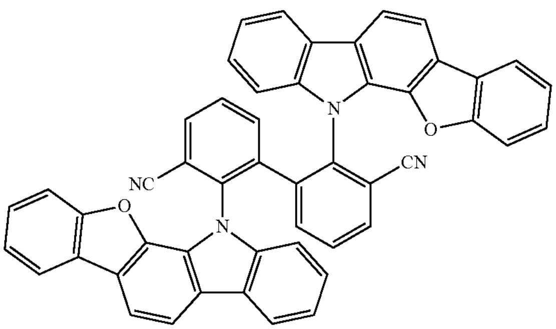
782
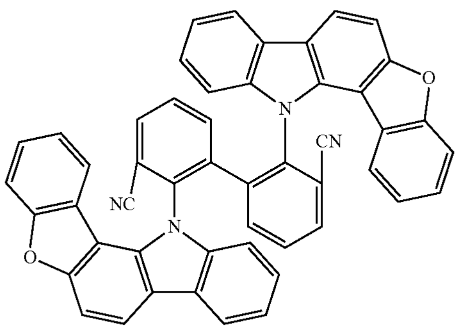
793
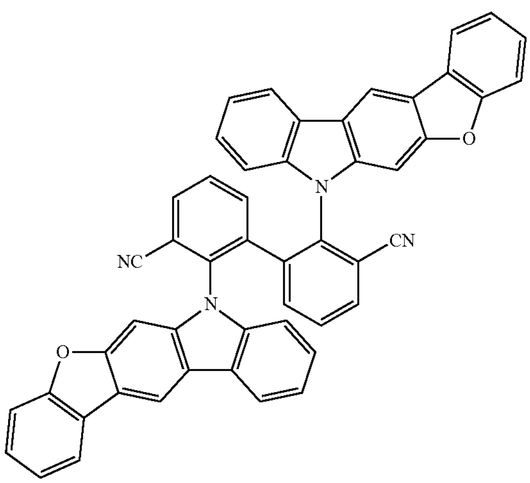
784
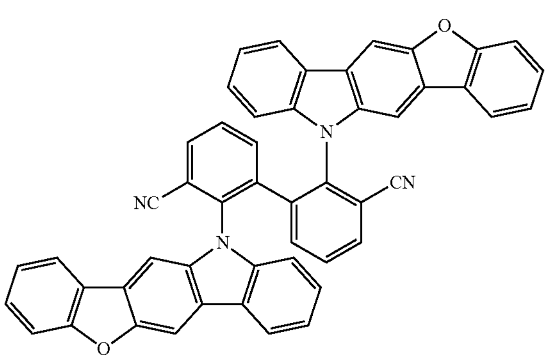
-continued
785
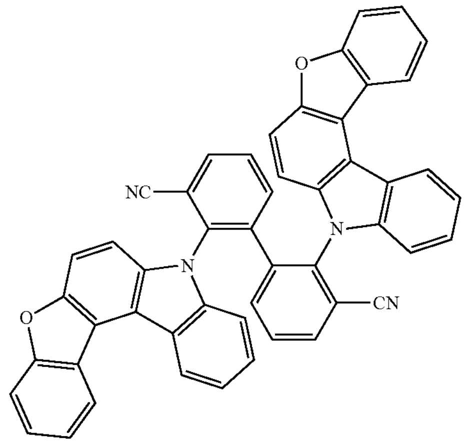
786
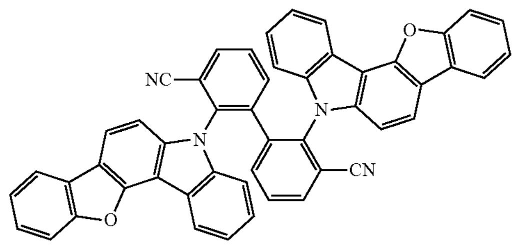
787
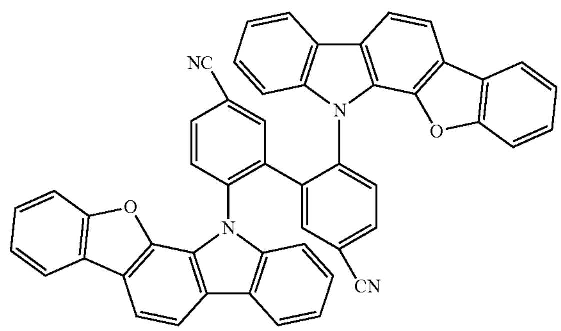
788
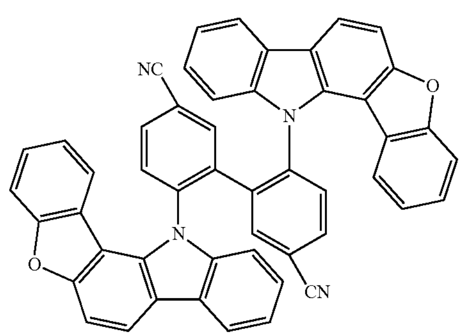

-continued
789
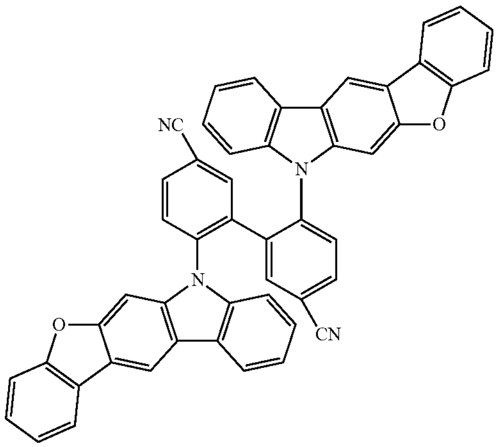
790
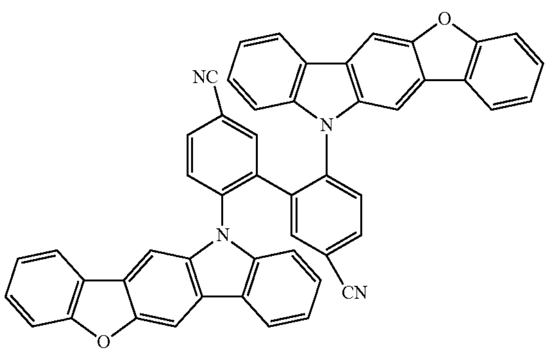
791
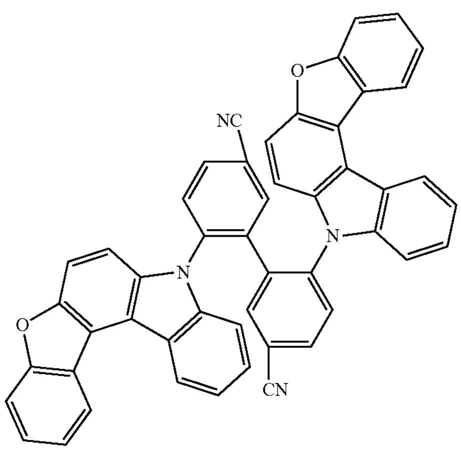
792
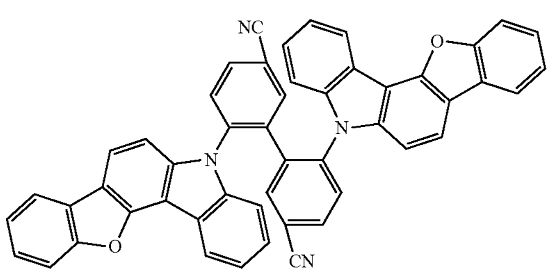
793
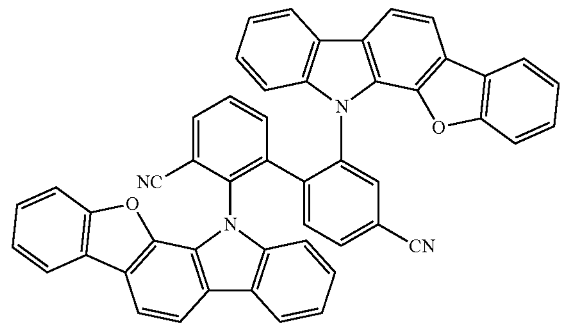
794
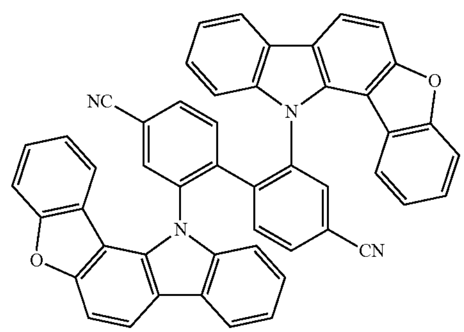
795
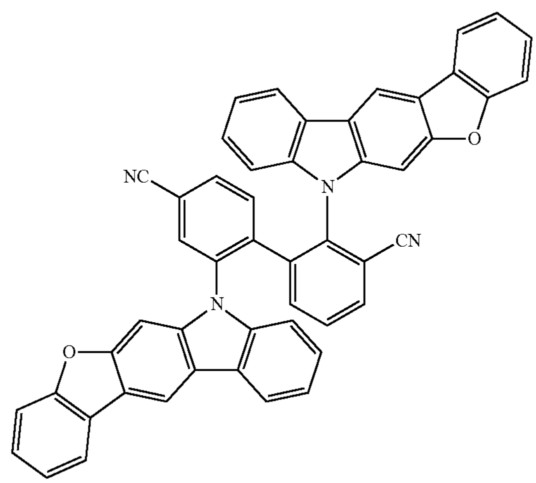
796
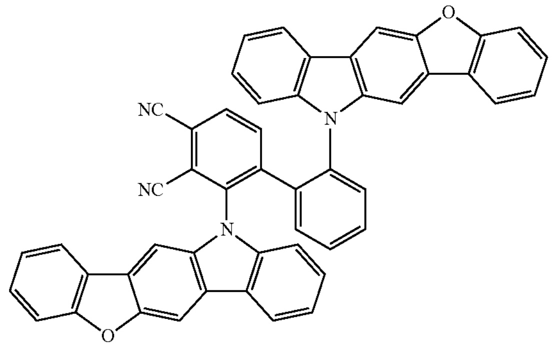

797
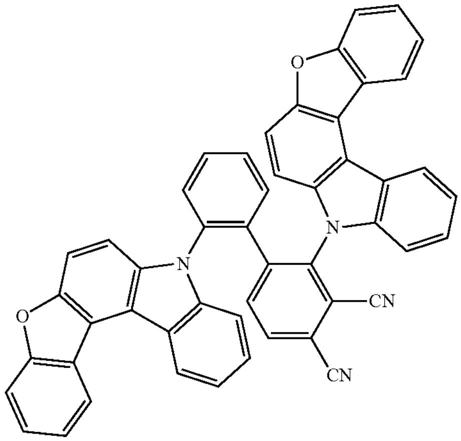
798
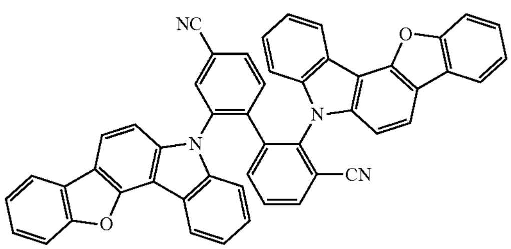
799
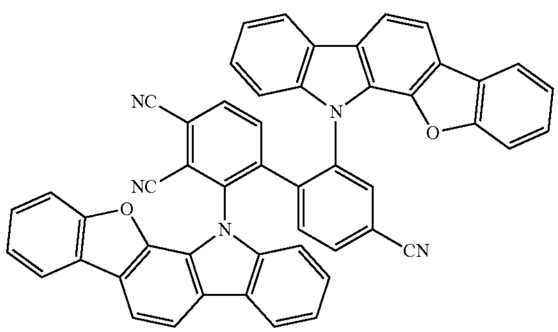
800
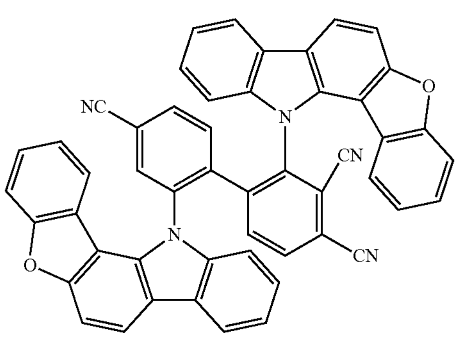
801
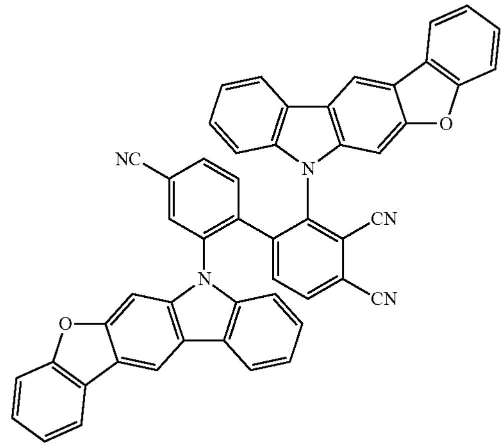
802
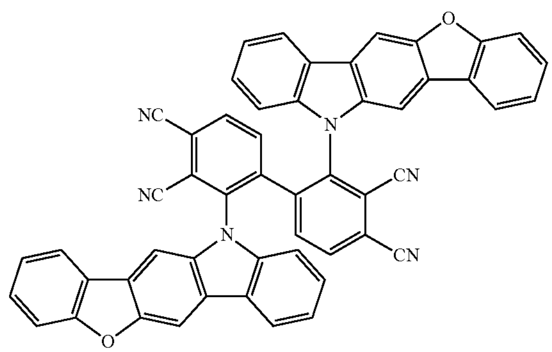
803
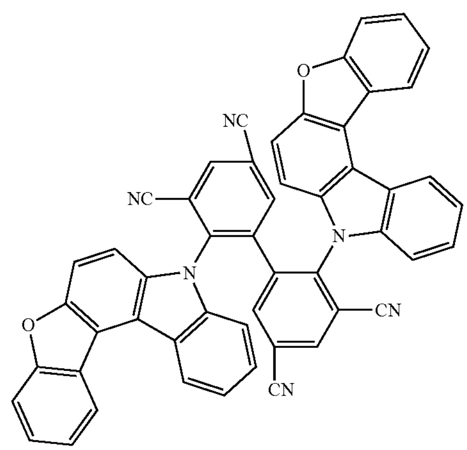
804
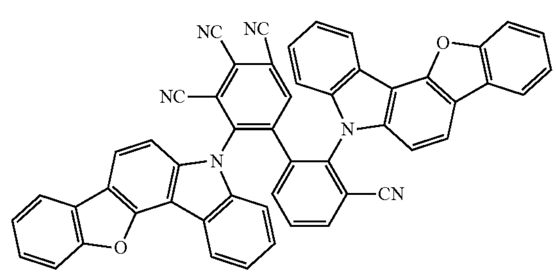

805
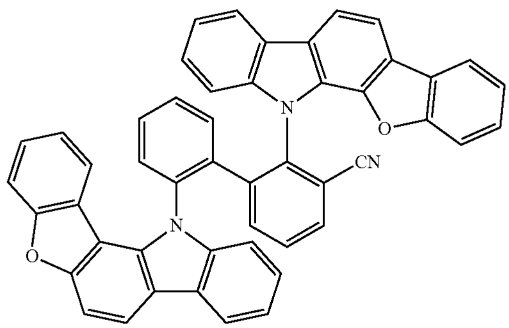
806
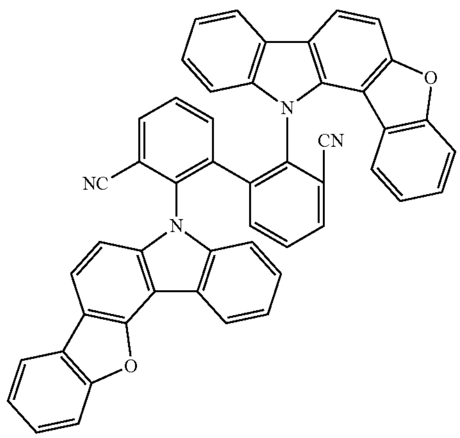
807
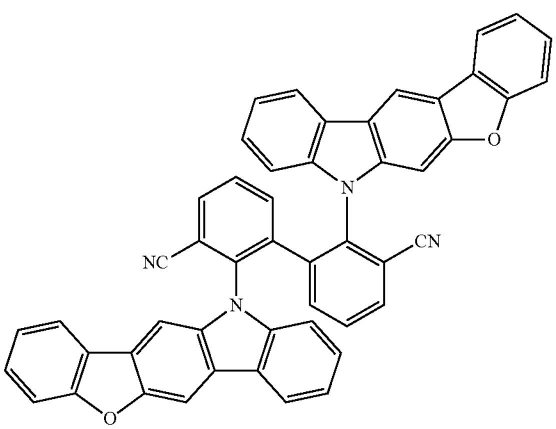
808
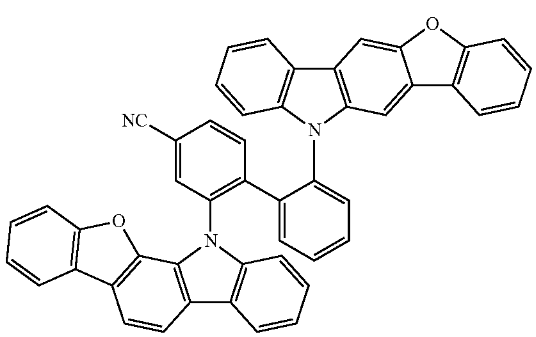
809
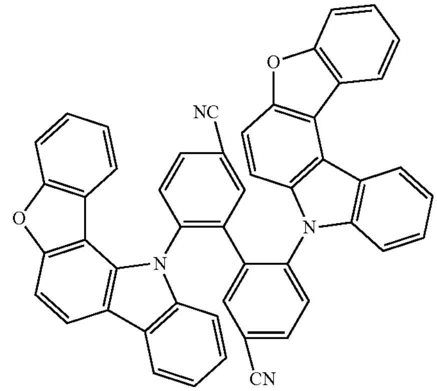
810
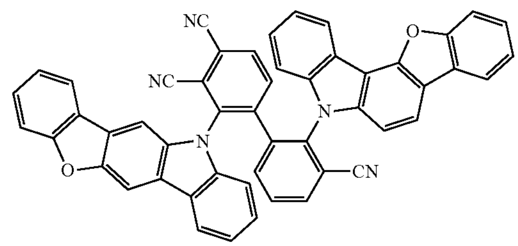
811
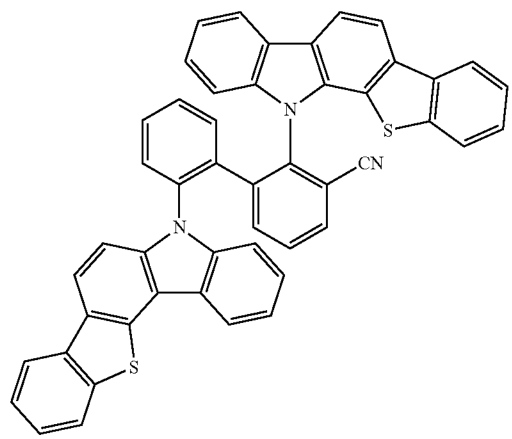
812
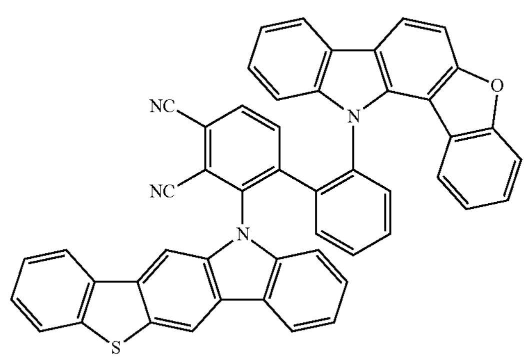

-continued
813
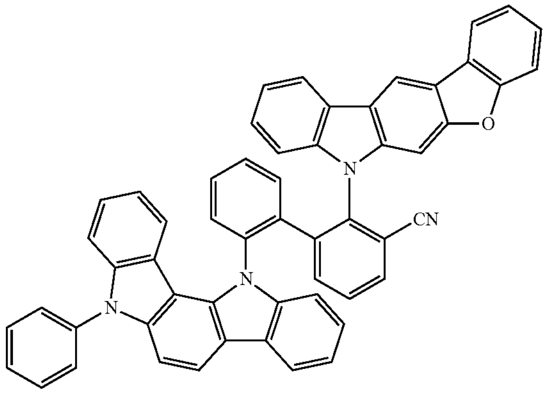
814
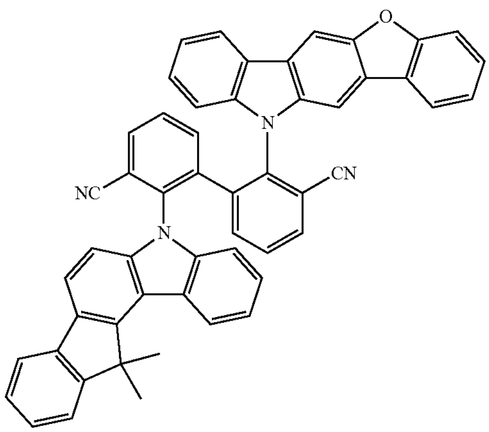
815
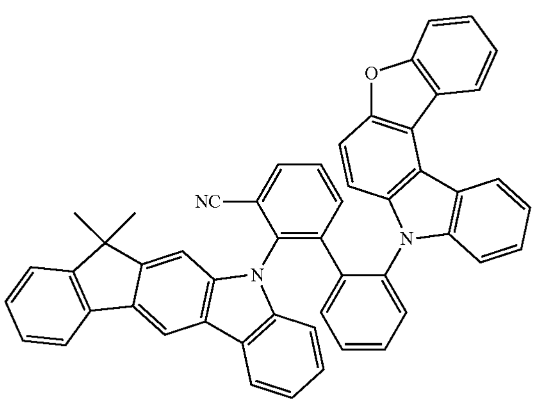
816
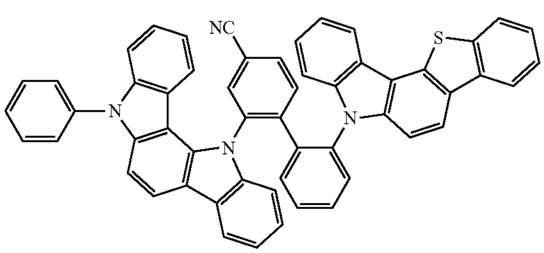
-continued
817
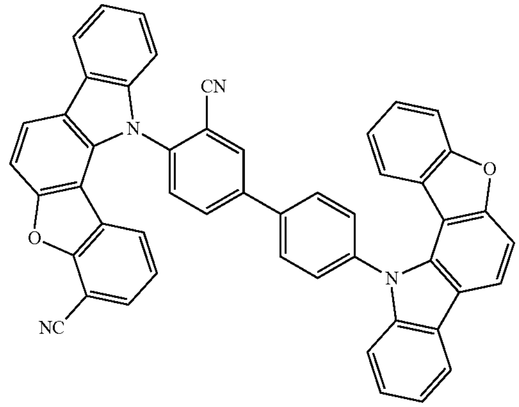
818
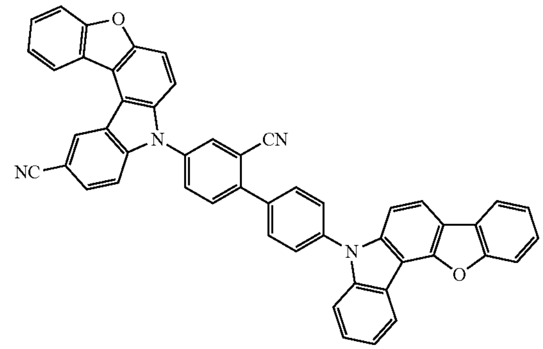
819
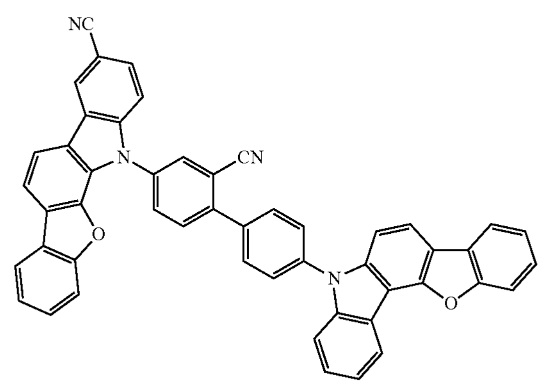
820
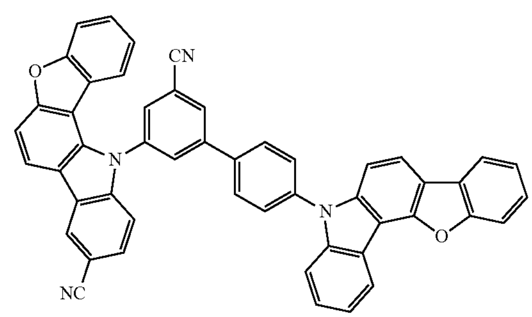

821
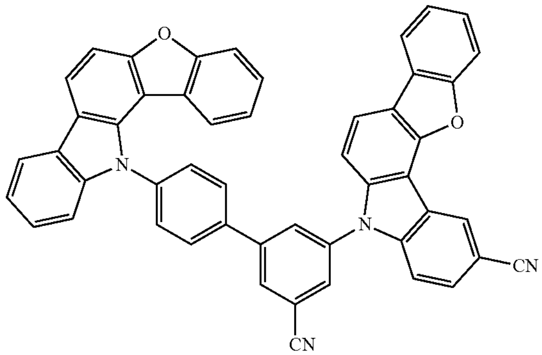
822
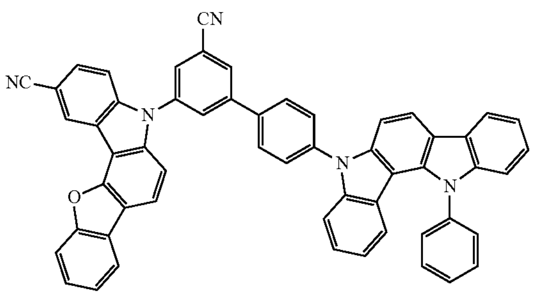
823
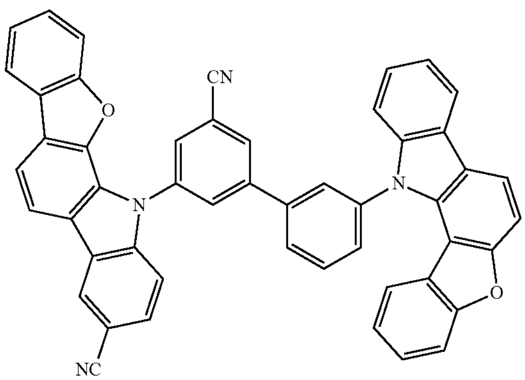
824
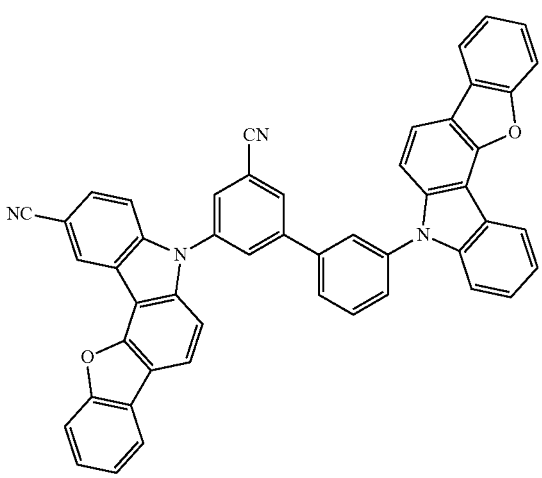
825
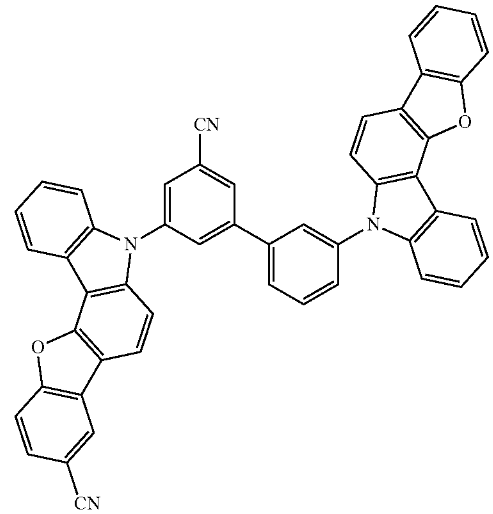
826
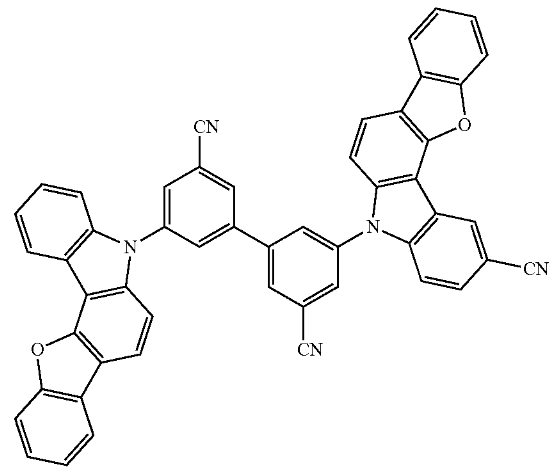
827
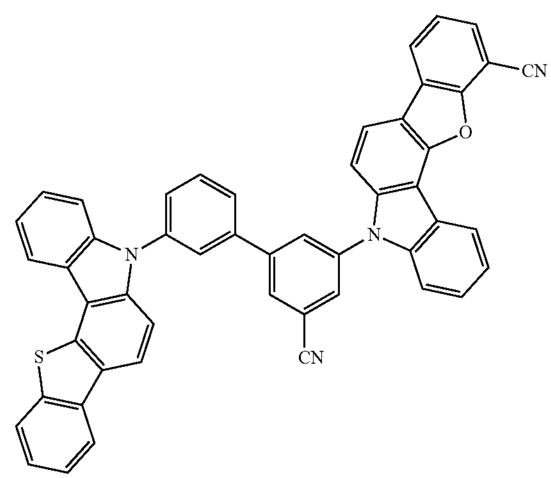

828
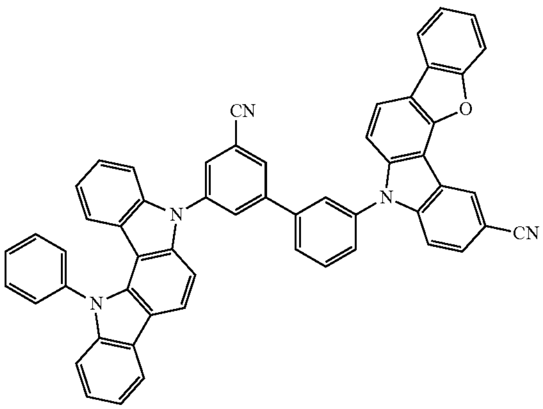
829
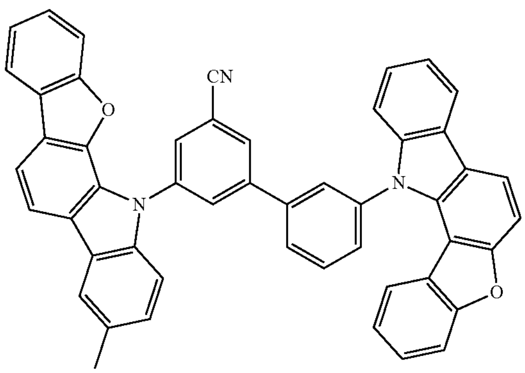
830
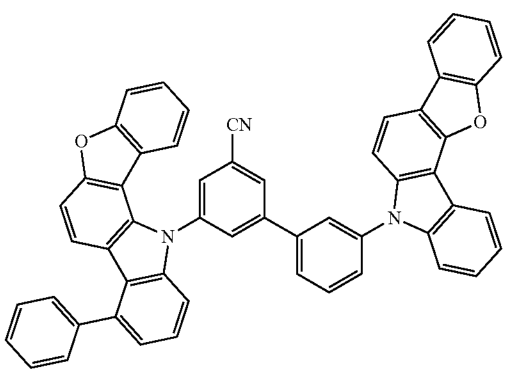
831
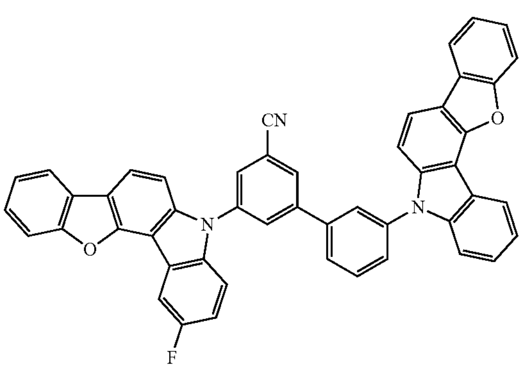
832
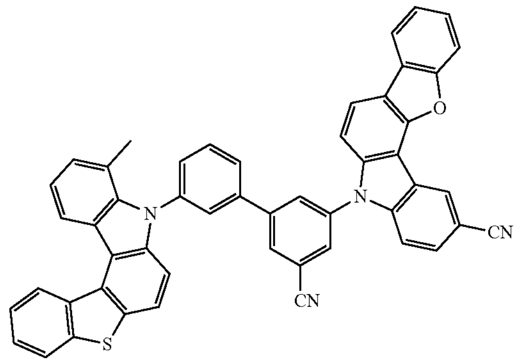
833
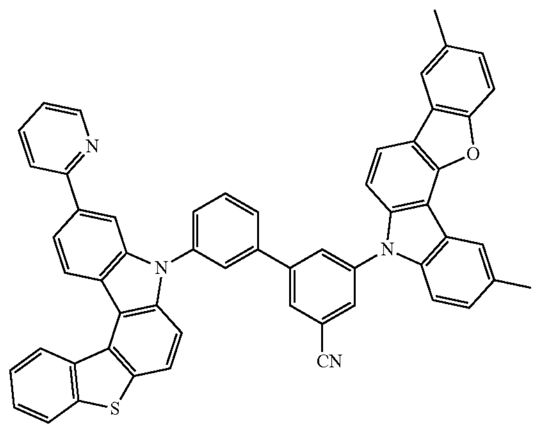
834
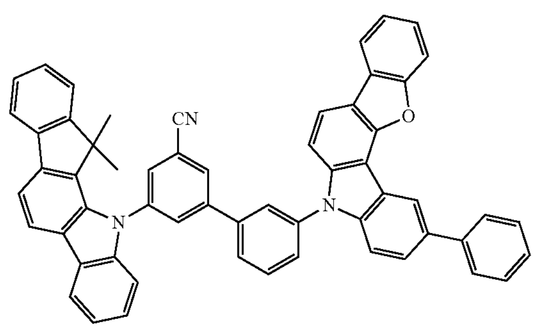
835
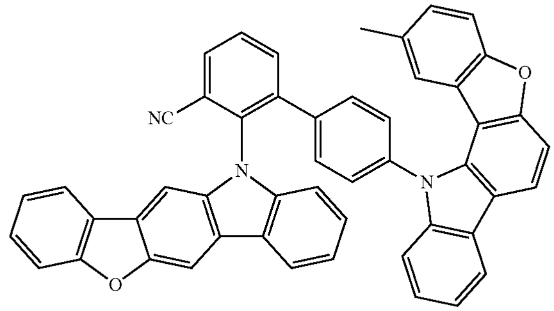

836
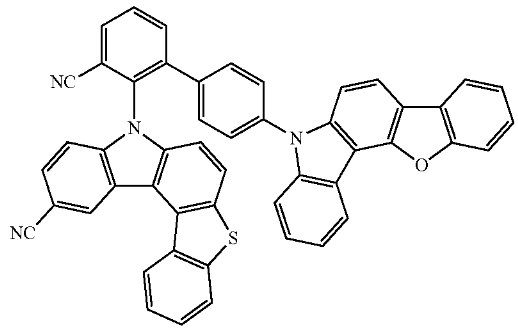
837
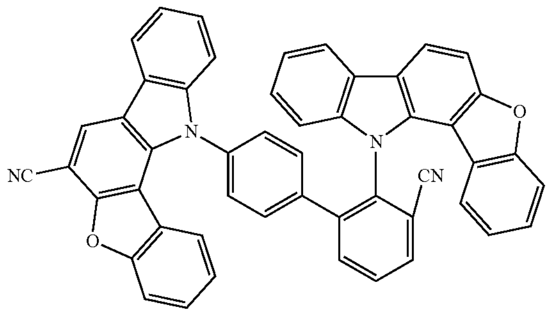
838
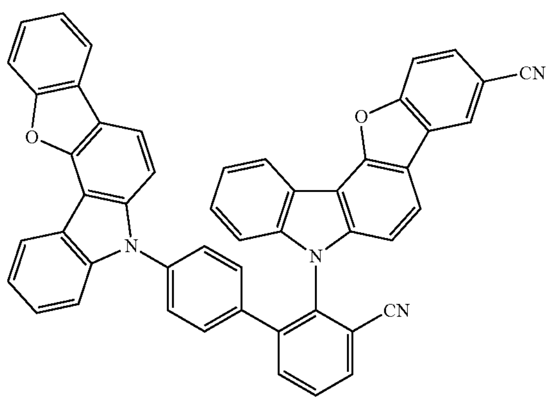
839
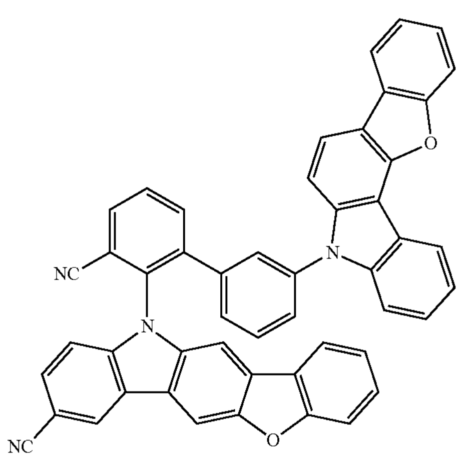
840
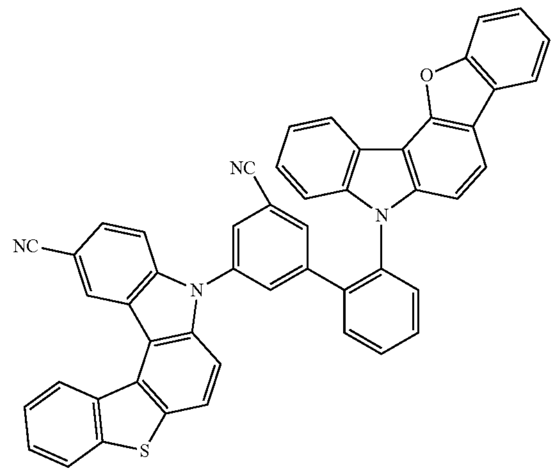
841
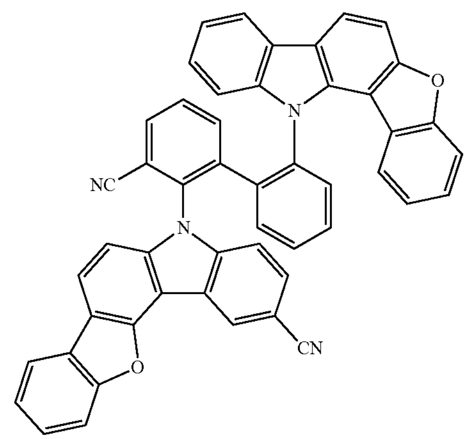
842
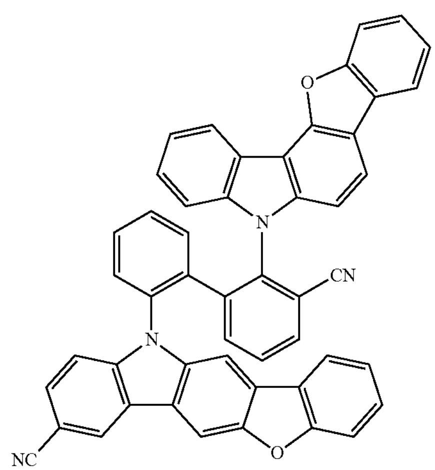

-continued
843
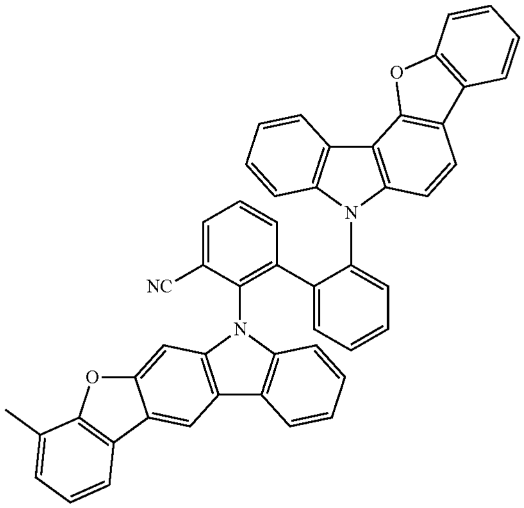
844
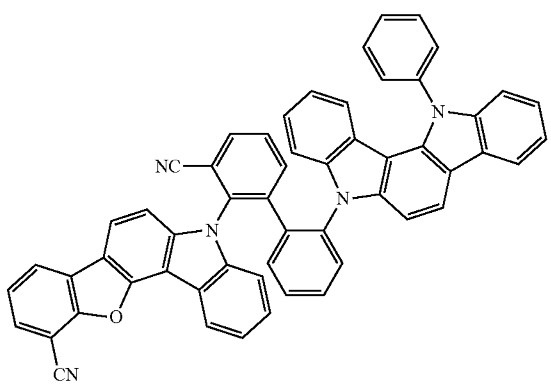
845
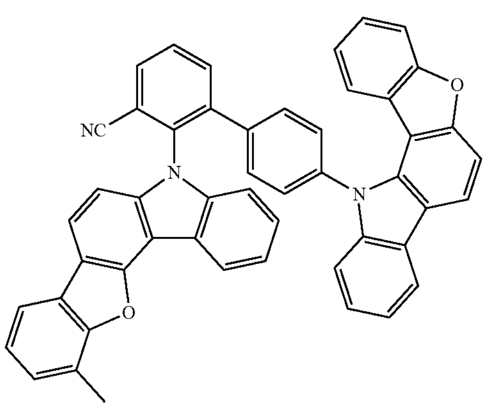
-continued
846
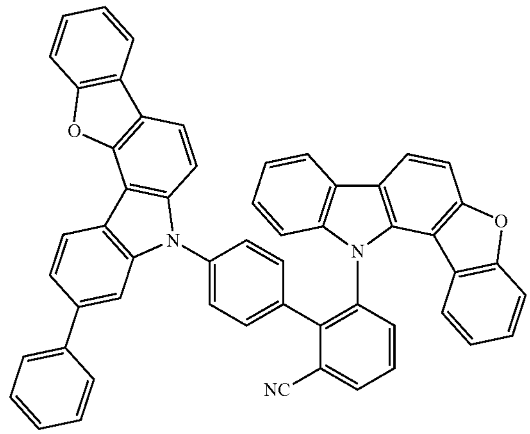
847
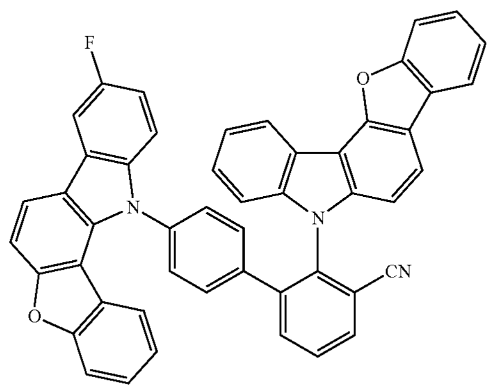
848
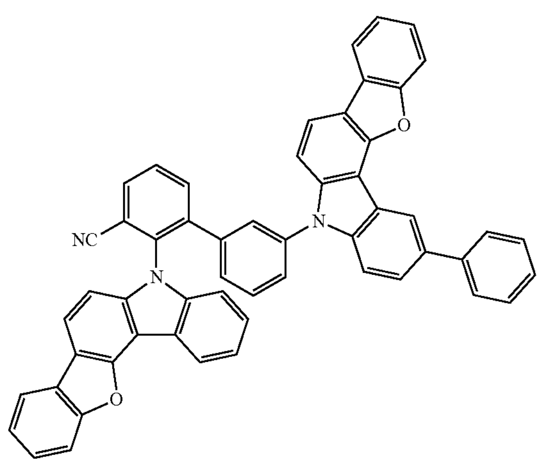

-continued
849
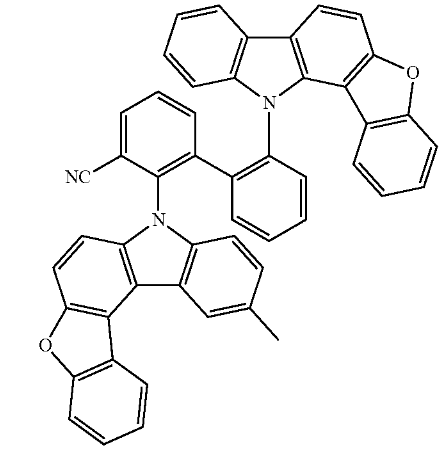
850
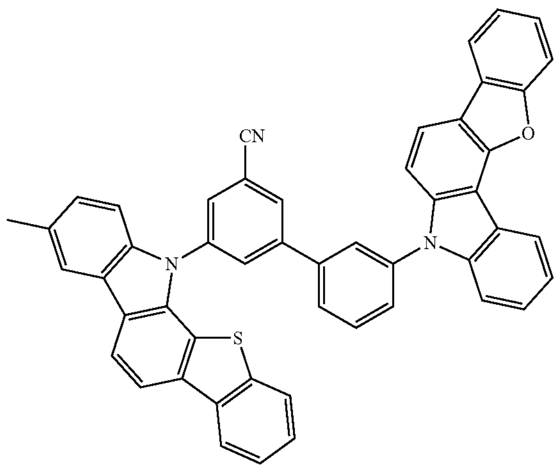
851
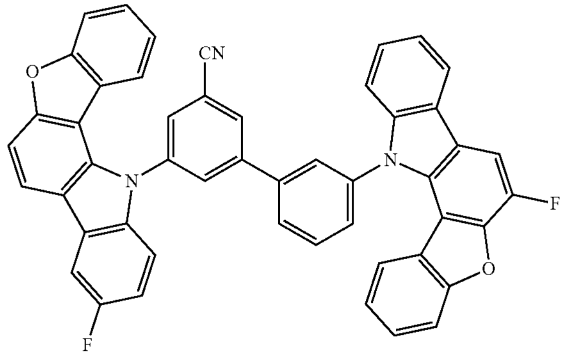
-continued
852
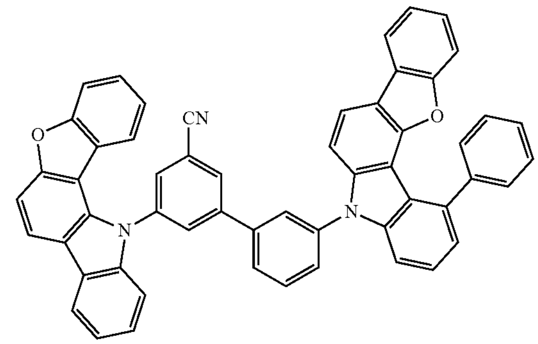
Group HE3
1
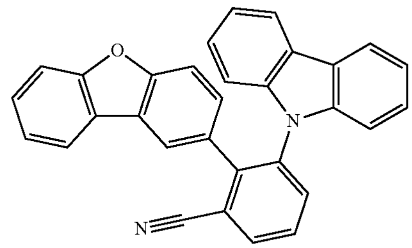
2
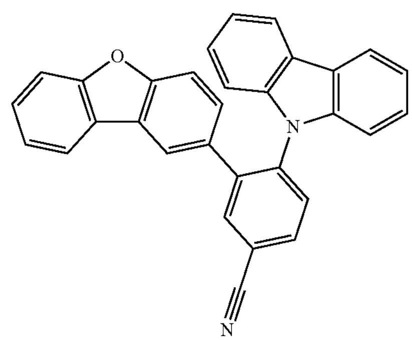
3
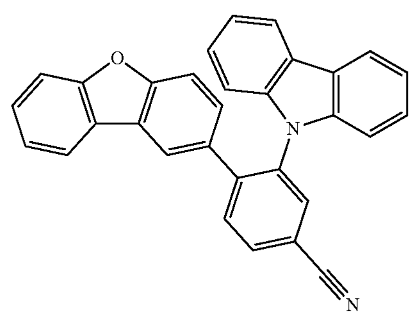
4
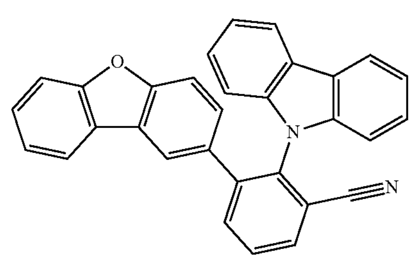

-continued
5
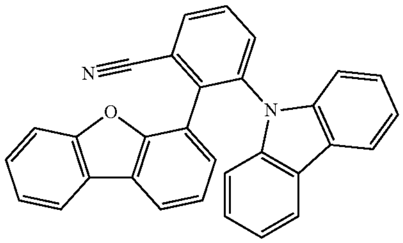
6
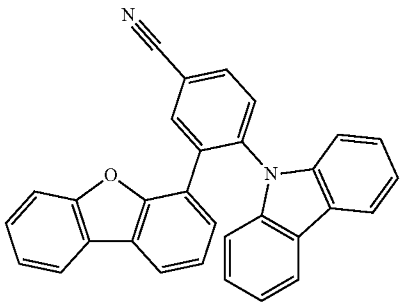
7
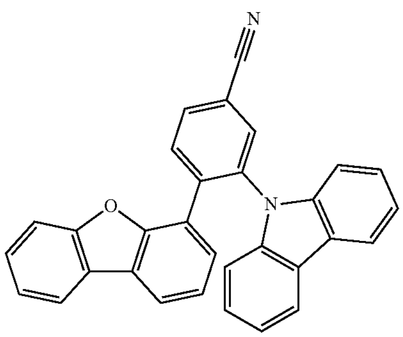
8
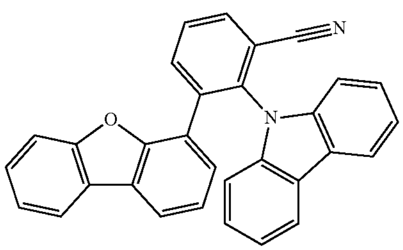
9
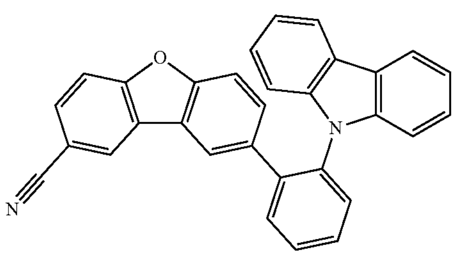
10
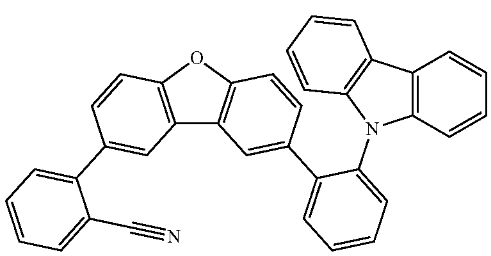
-continued
11
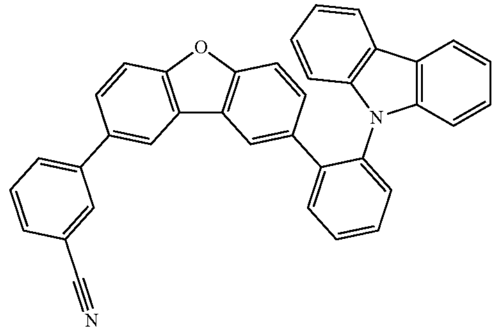
12
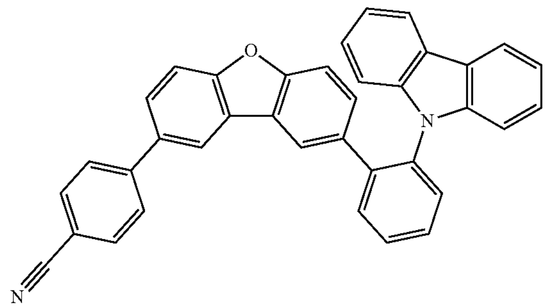
13
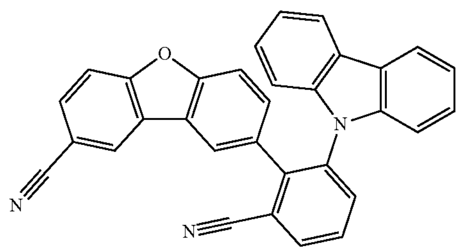
14
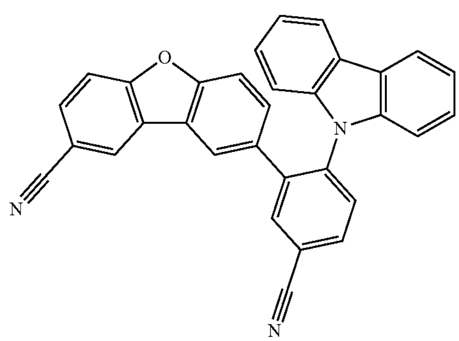
15
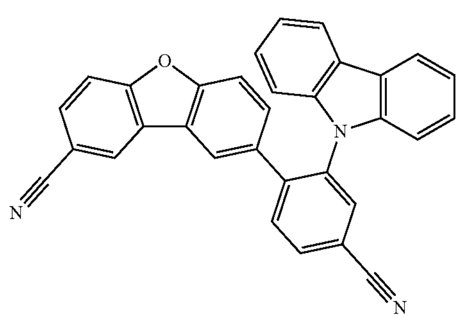

-continued
16
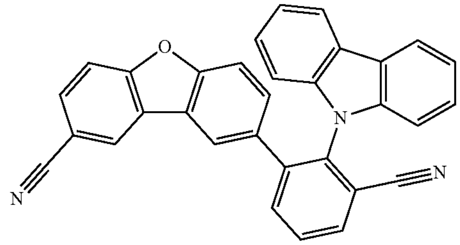
17
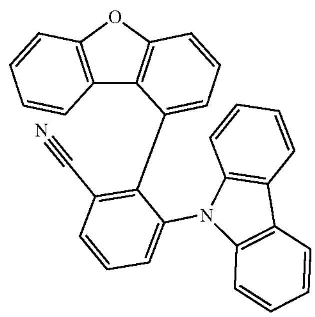
18
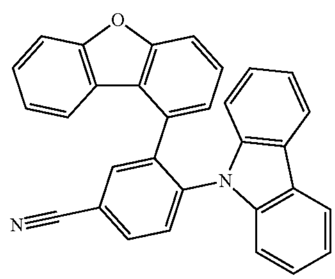
19
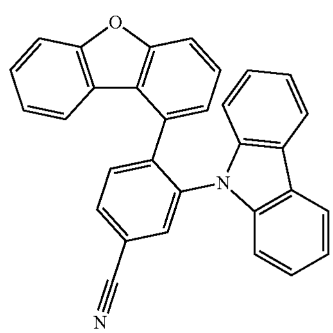
20
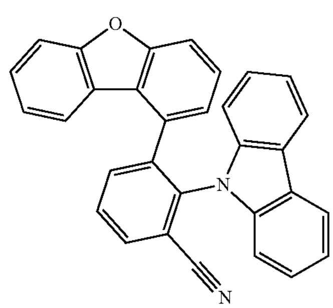
-continued
21
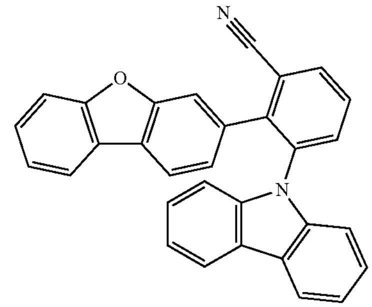
22
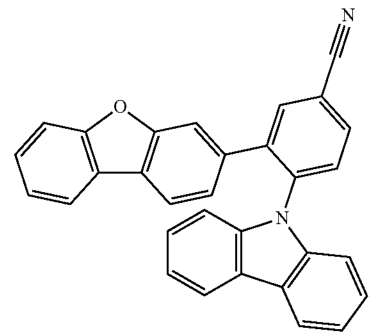
23
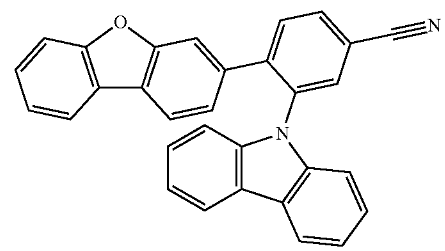
24
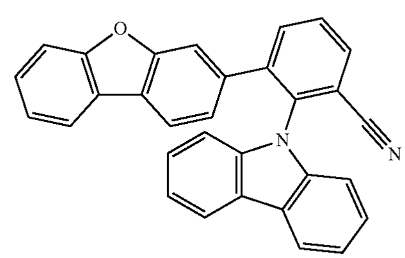
25
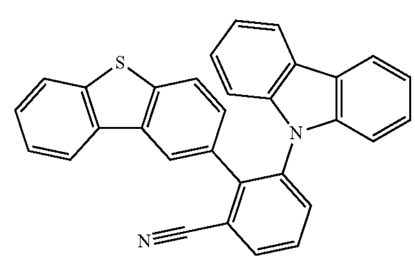

-continued
26
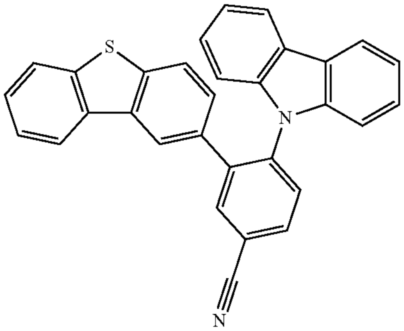
27
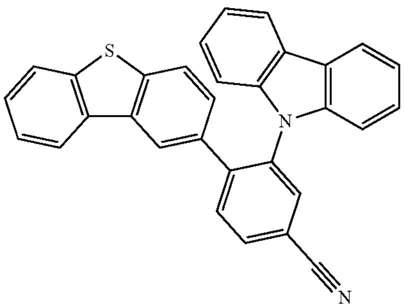
28
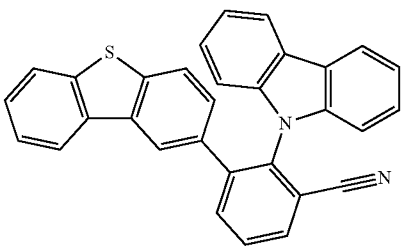
29
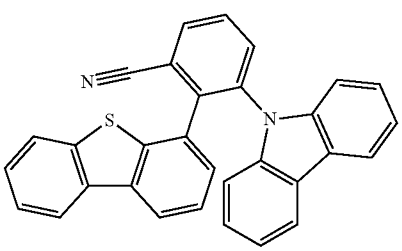
30
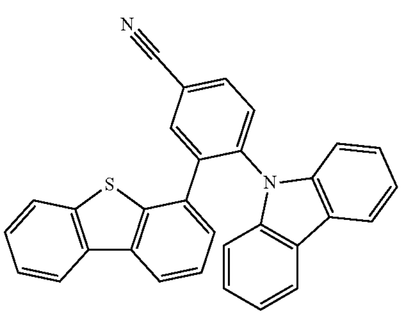
-continued
31
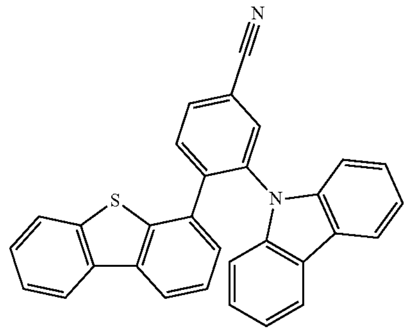
32
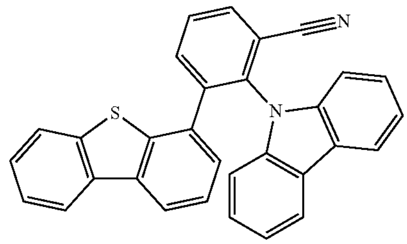
33
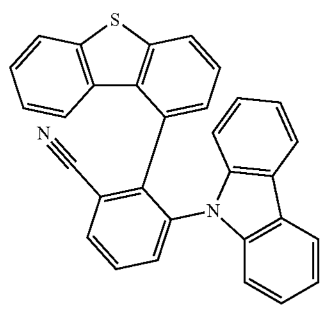
34
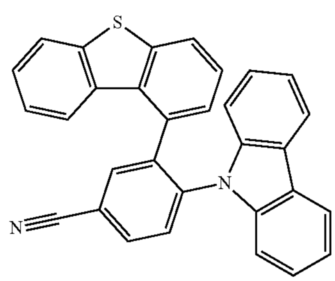
35
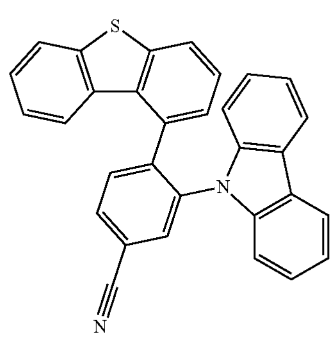

-continued
36
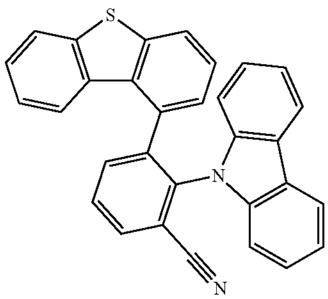
37
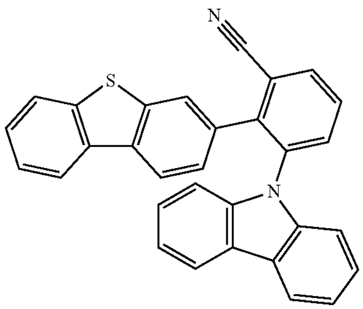
38
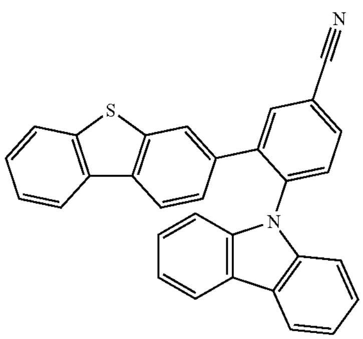
39
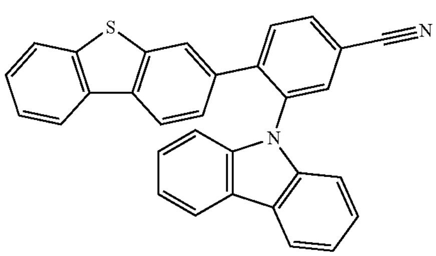
40
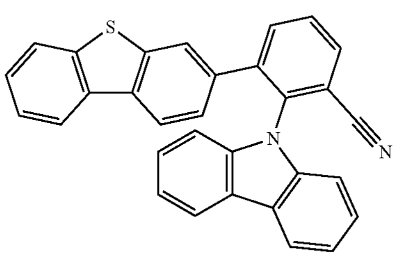
-continued
41
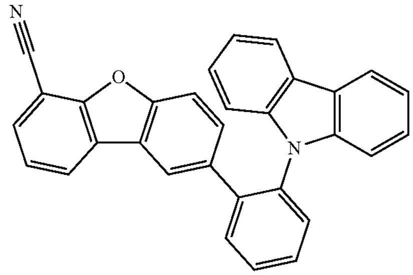
42
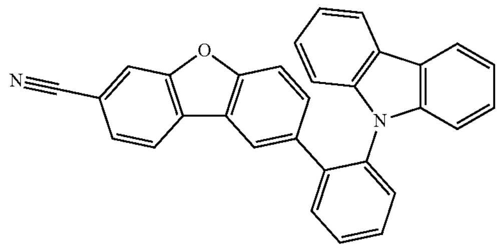
43
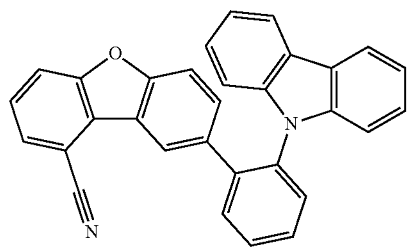
44
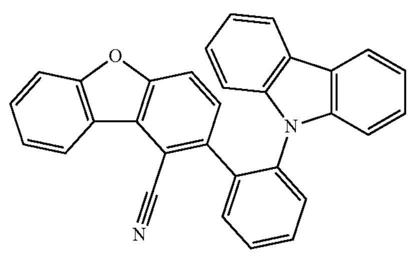
45
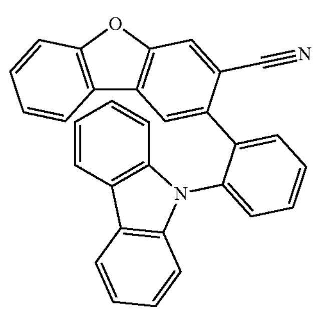

-continued
46
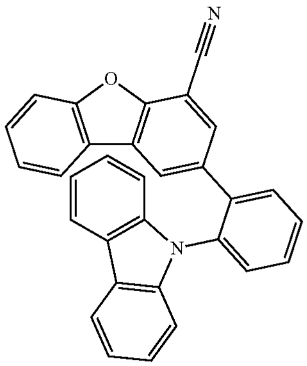
47
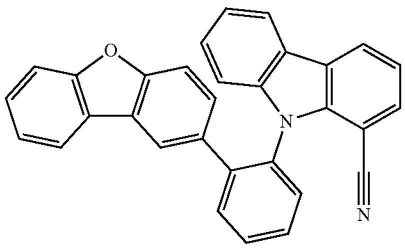
48
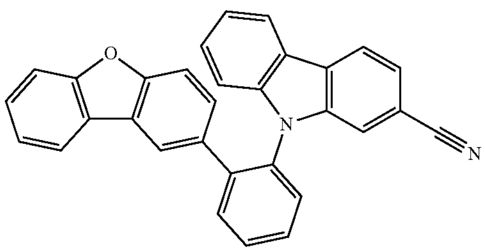
49
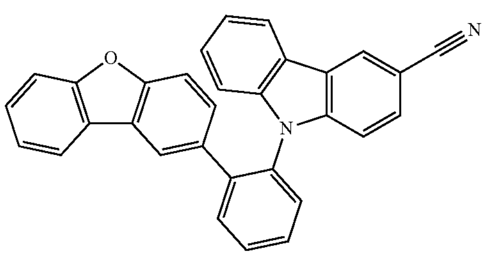
50
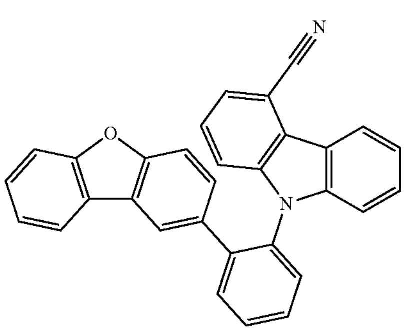
-continued
51
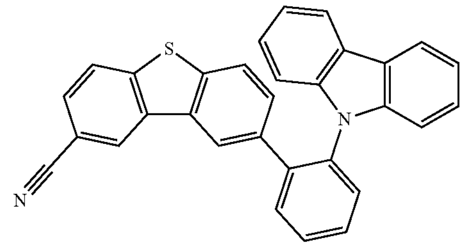
52
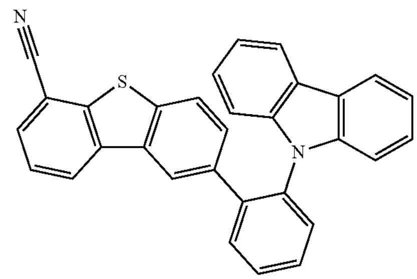
53
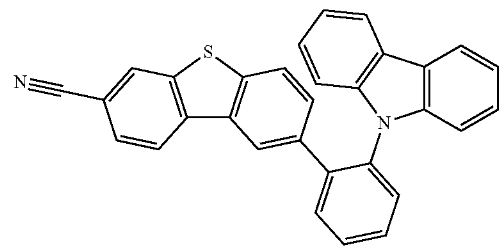
54
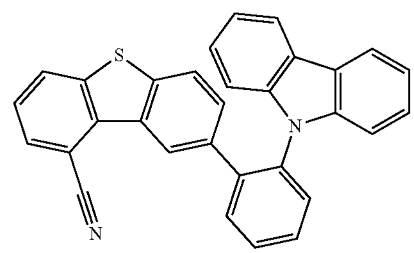
55
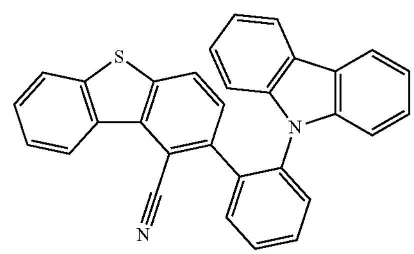
56
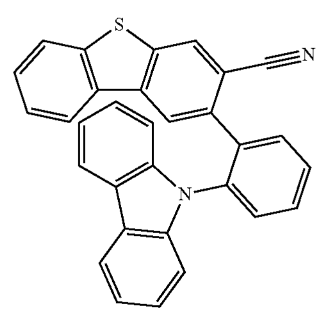

-continued
57
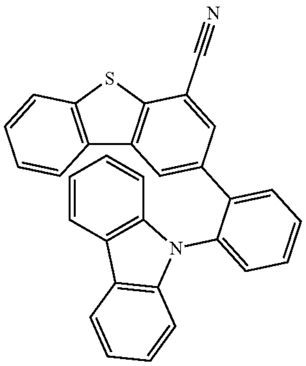
58
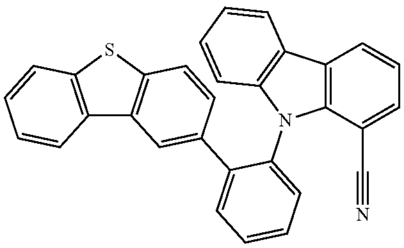
59
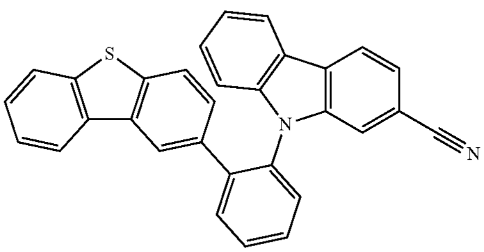
60
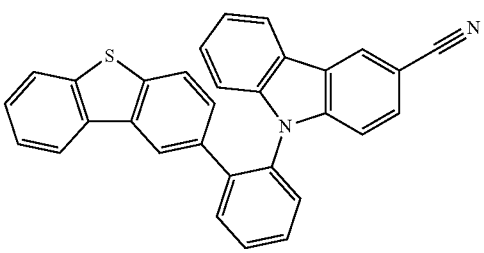
61
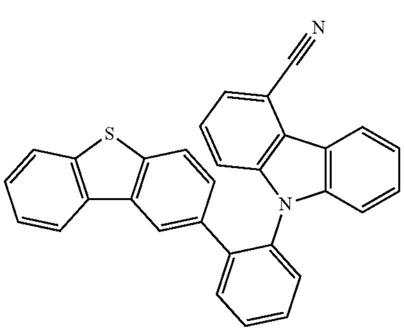
-continued
62
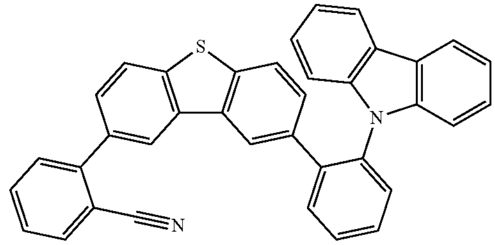
63
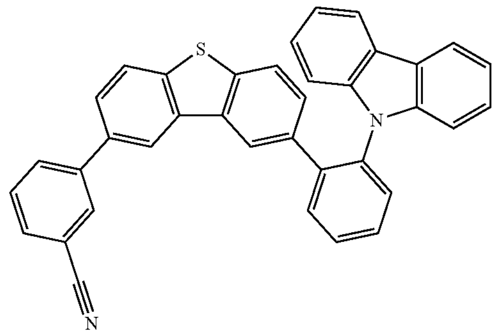
64
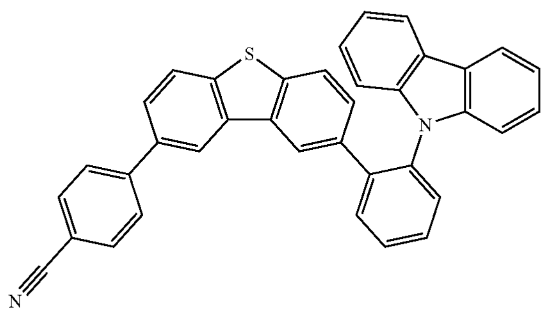
65
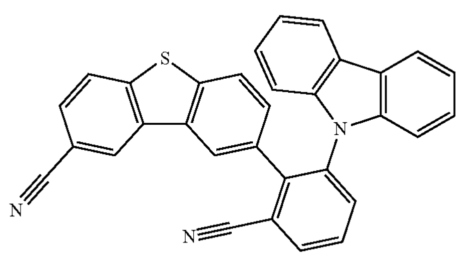
66
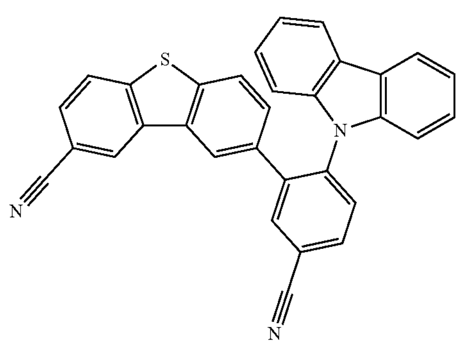

67
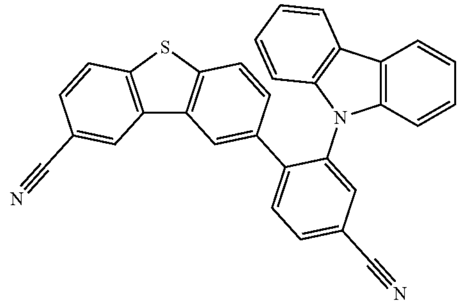
68
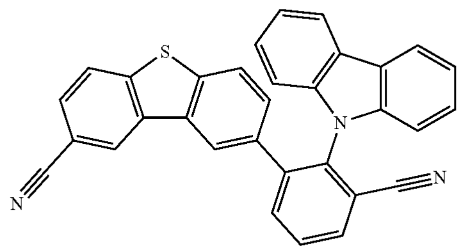
69
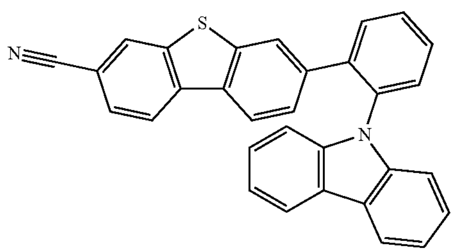
70
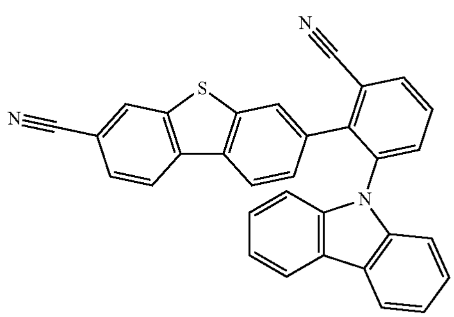
71
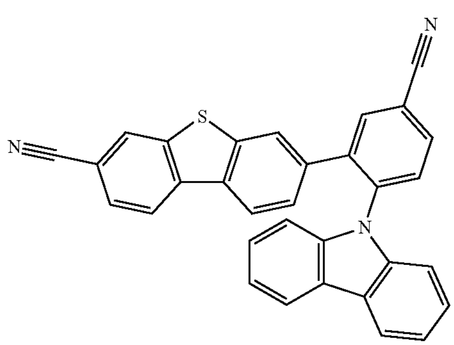
72
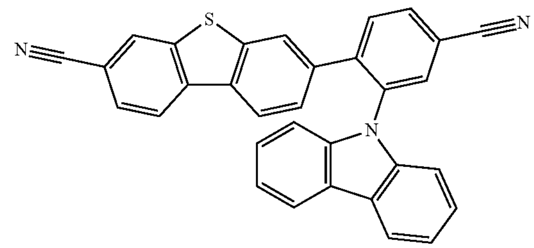
73
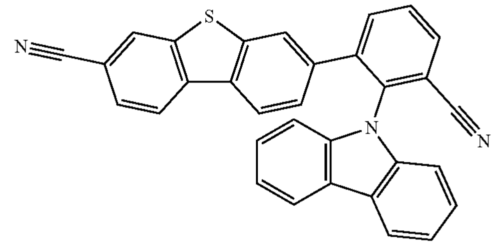
74
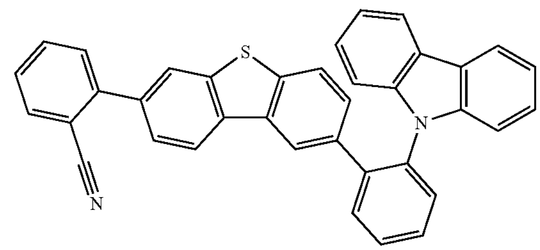
75
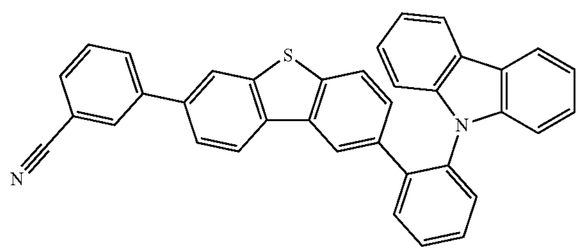
76
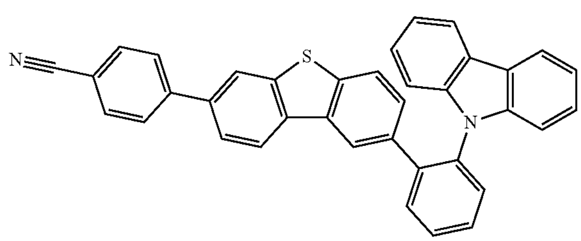
77
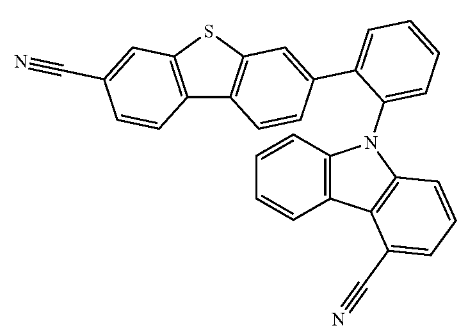

-continued
78
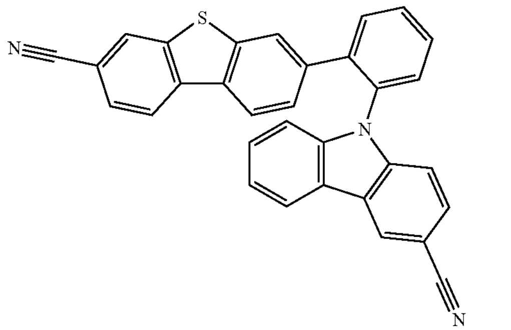
79
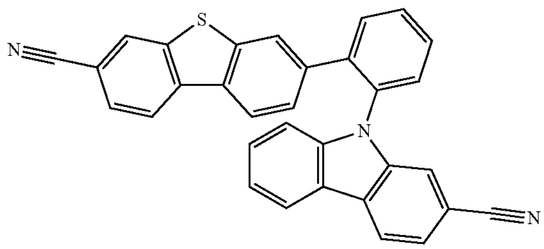
80
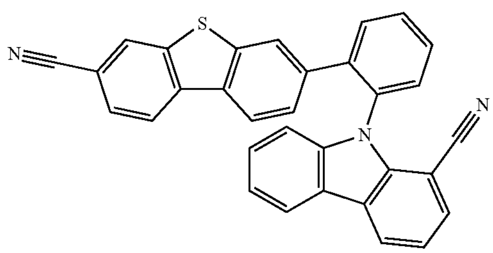
81
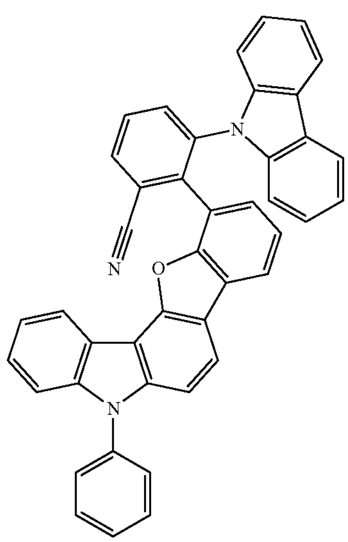
-continued
82
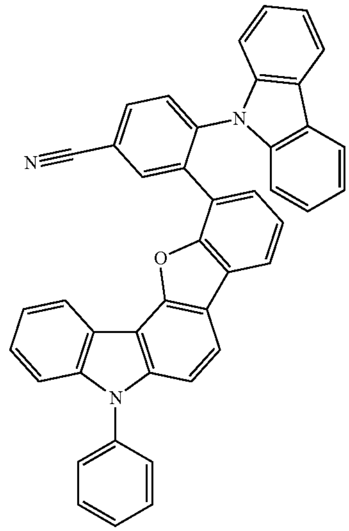
83
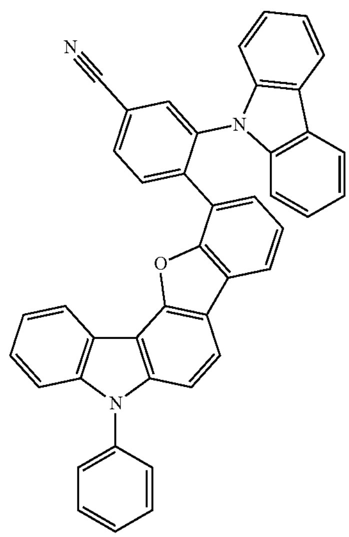
84
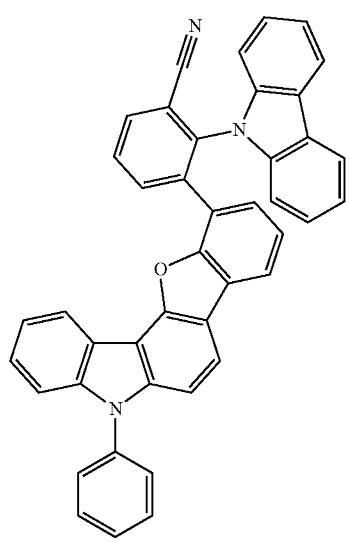

85
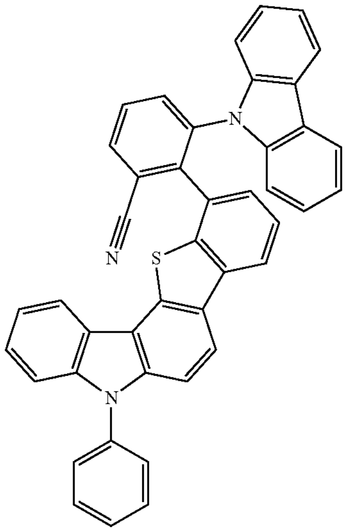
86
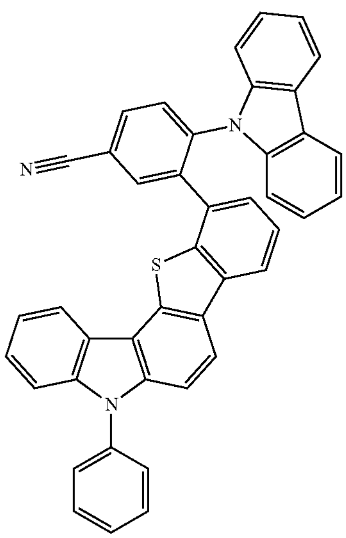
87
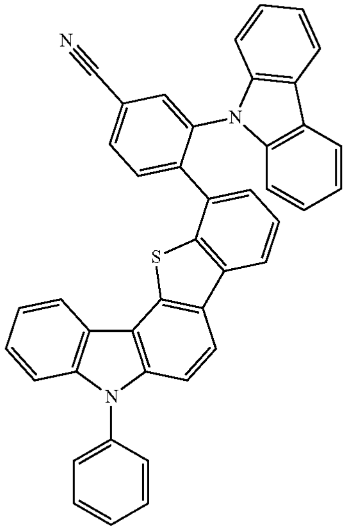
88
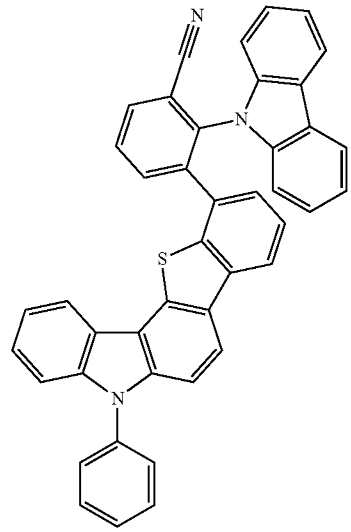
89
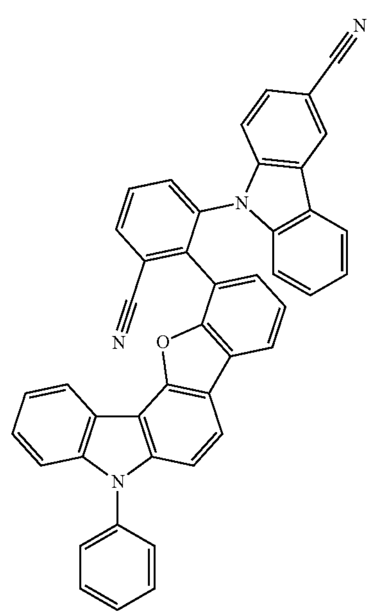

90
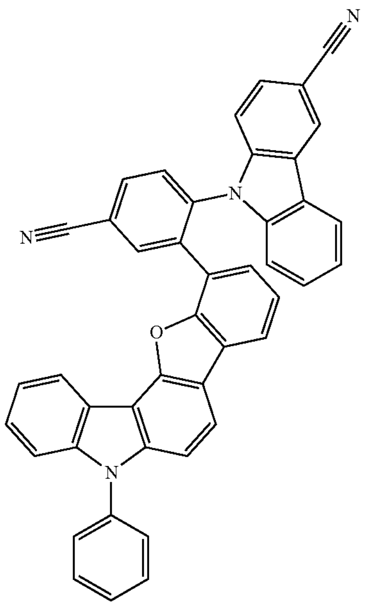
91
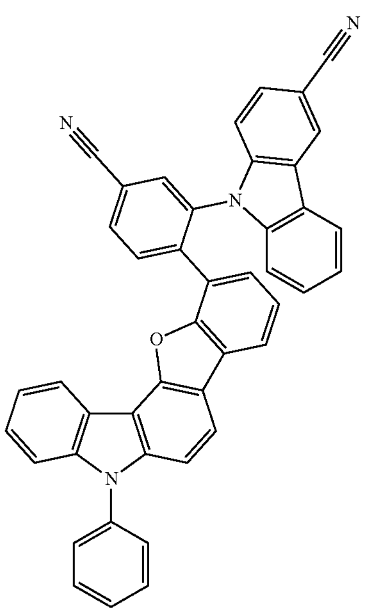
92
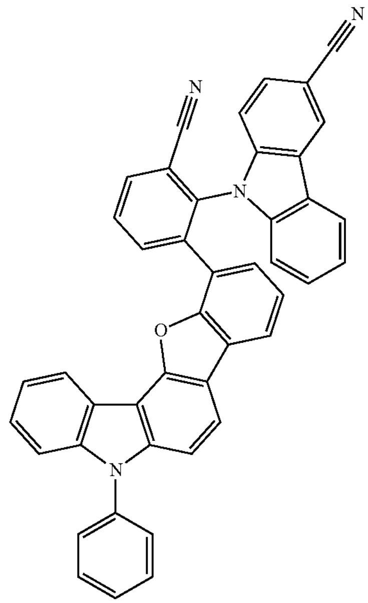
93
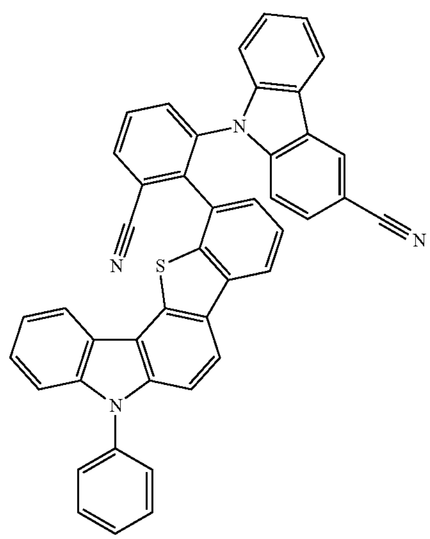
94
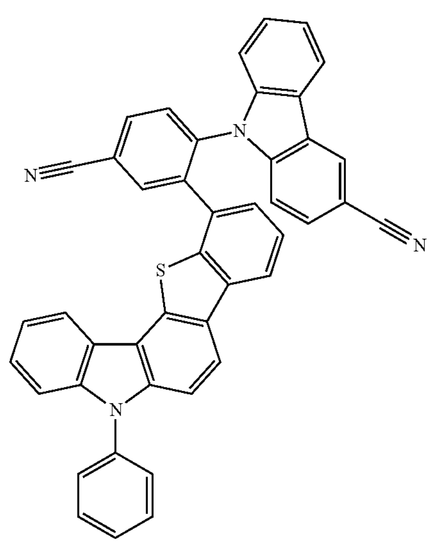

-continued
95
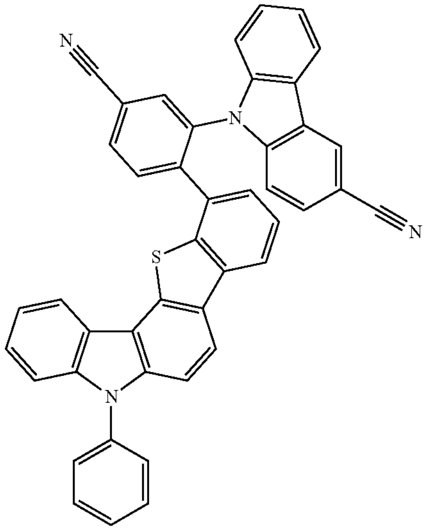
96
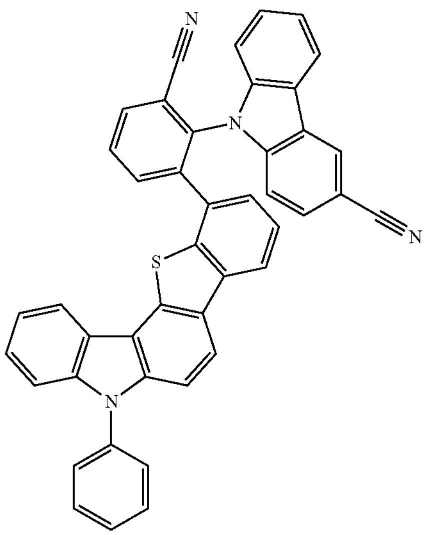
97
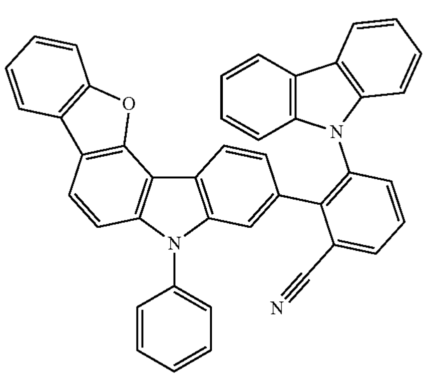
-continued
98
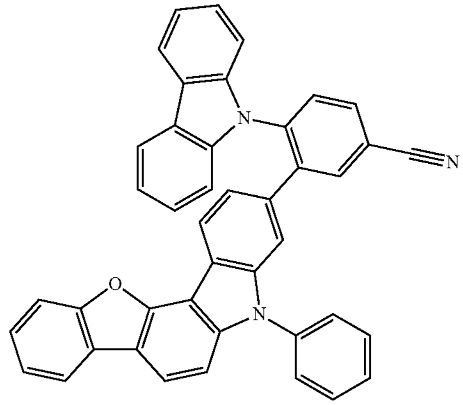
99
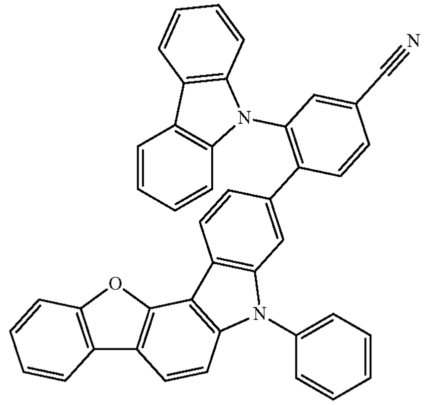
100
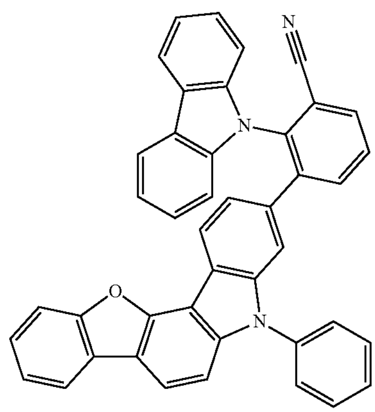
101
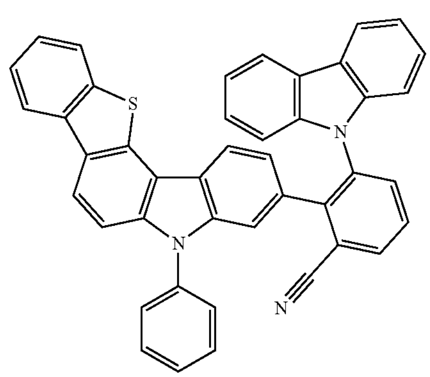

102
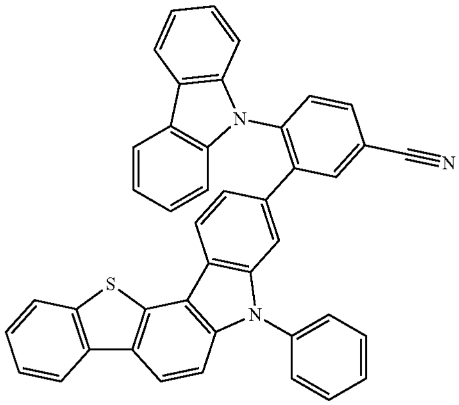
103
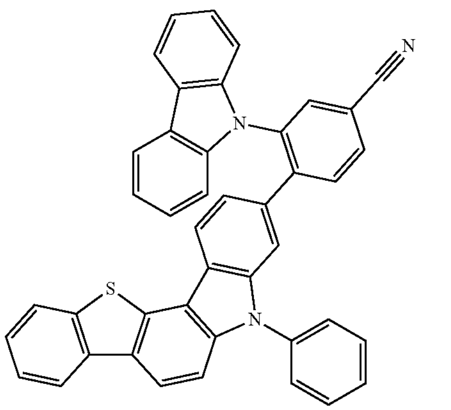
104
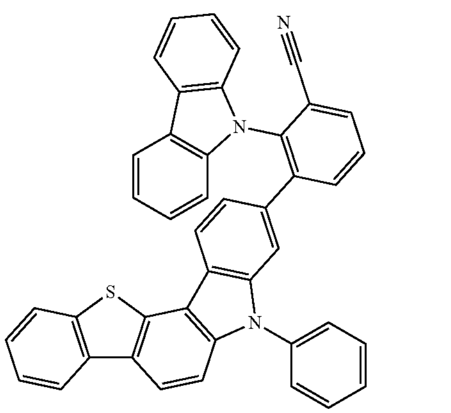
105
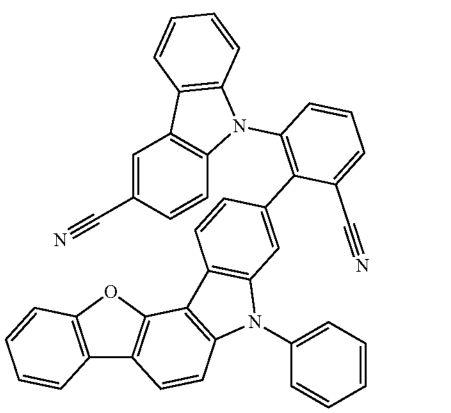
106
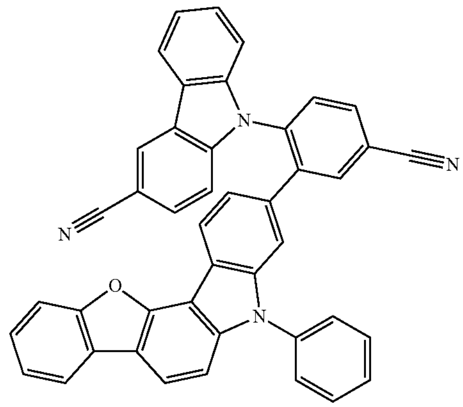
107
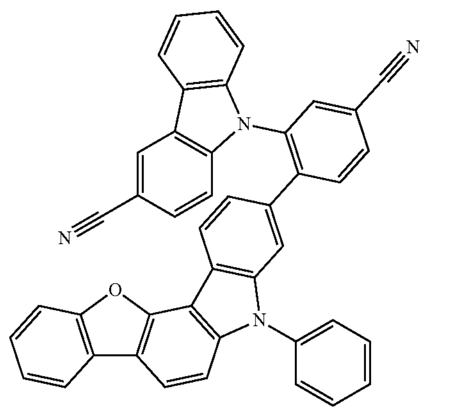
108
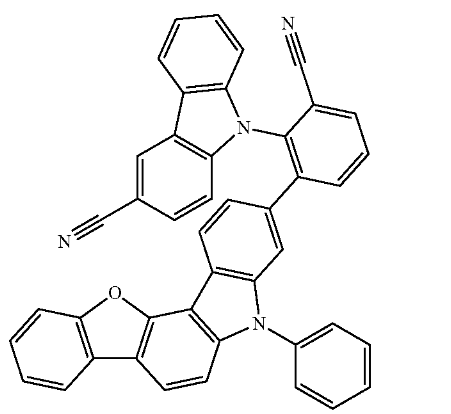
109
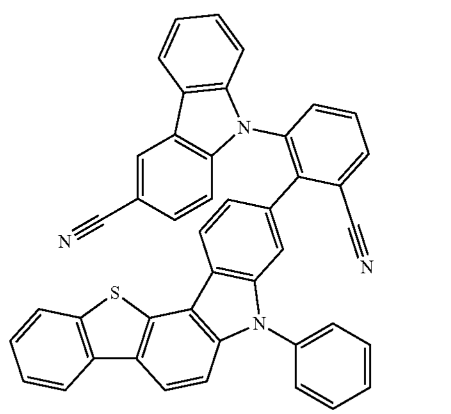

-continued
110
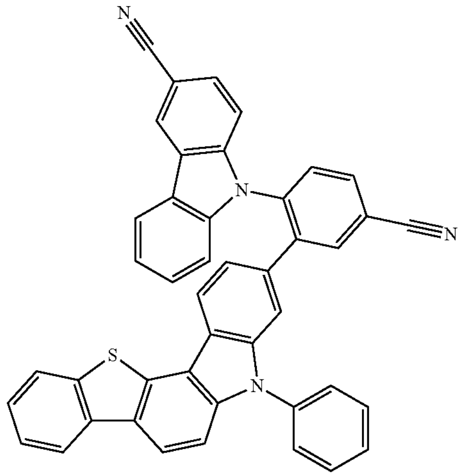
111
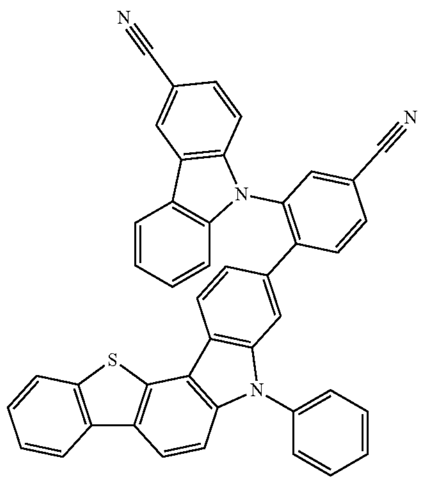
112
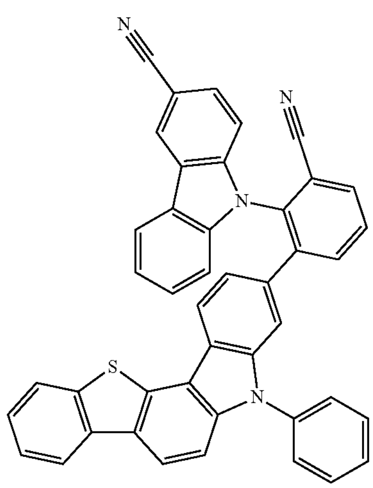
-continued
113
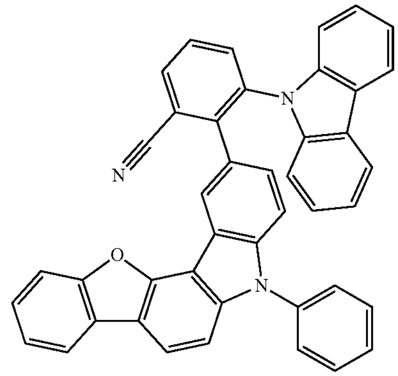
114
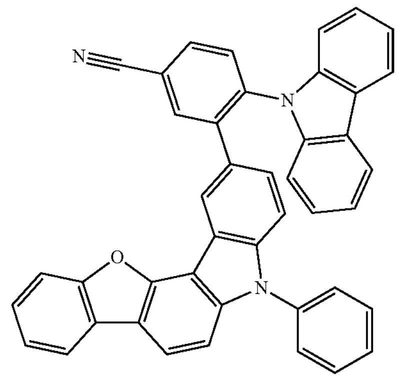
115
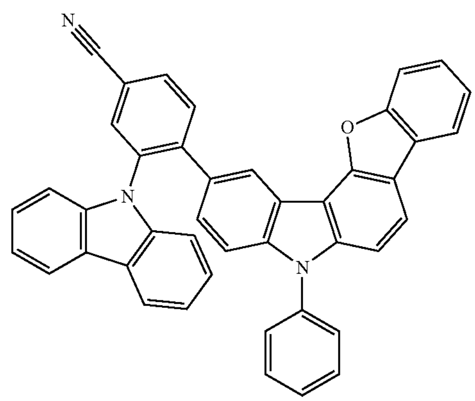
116
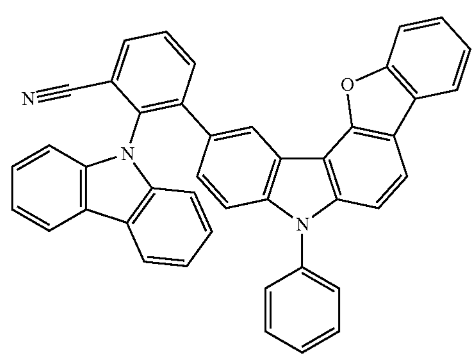

-continued
117
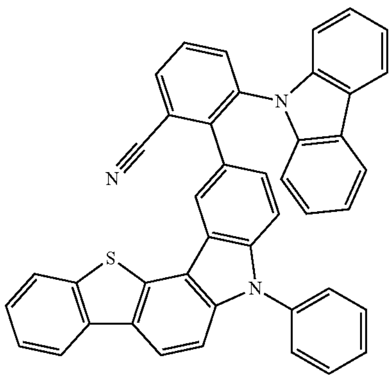
118
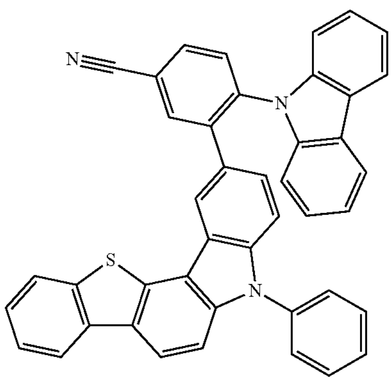
119
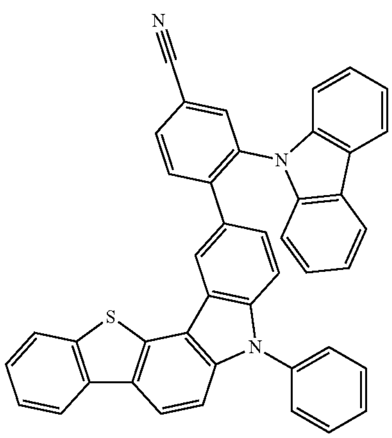
120
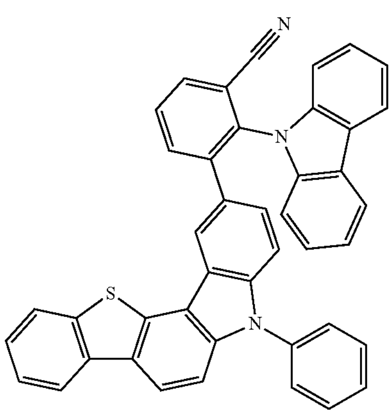
-continued
121
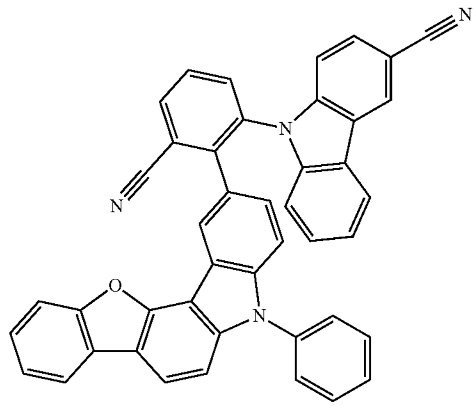
122
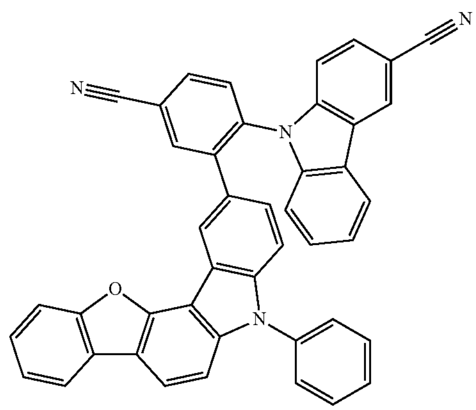
123
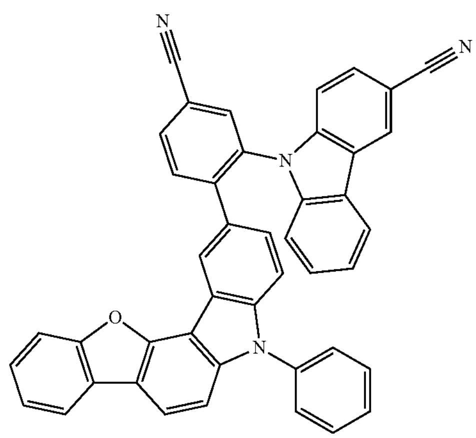
124
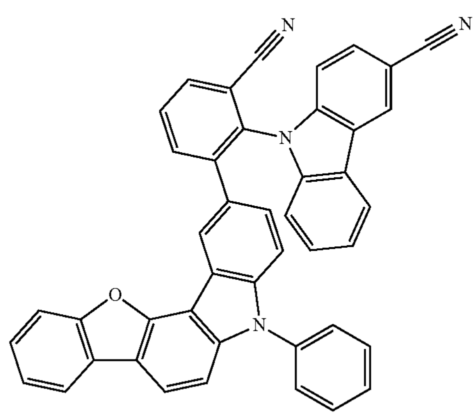

125
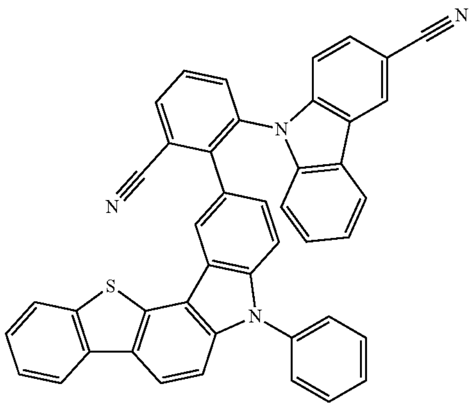
126
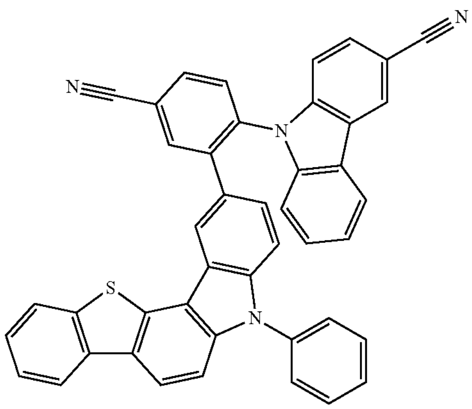
127
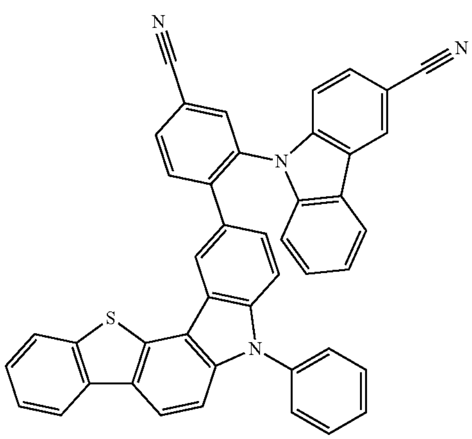
128
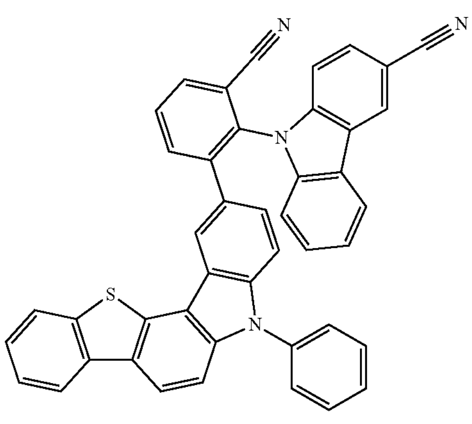
129
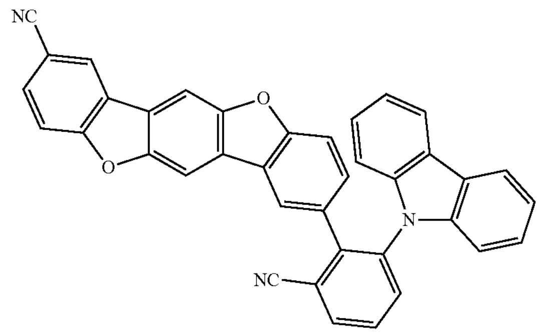
130
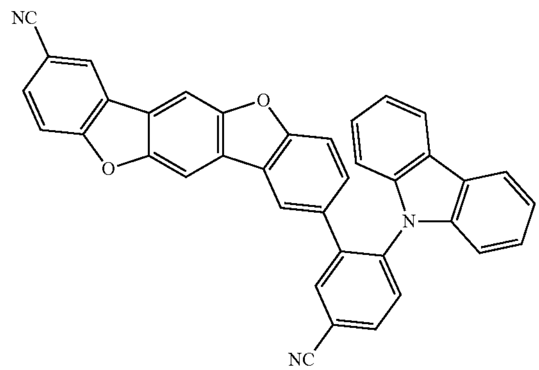
131.
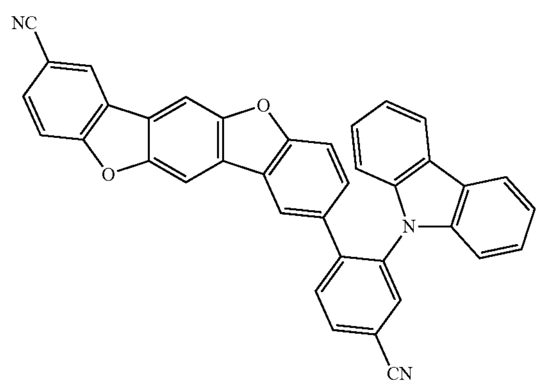
132
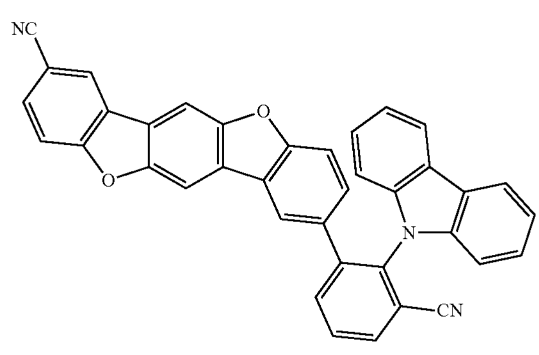

-continued
133
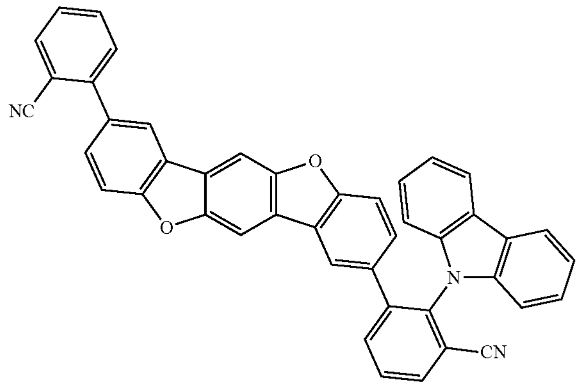
134
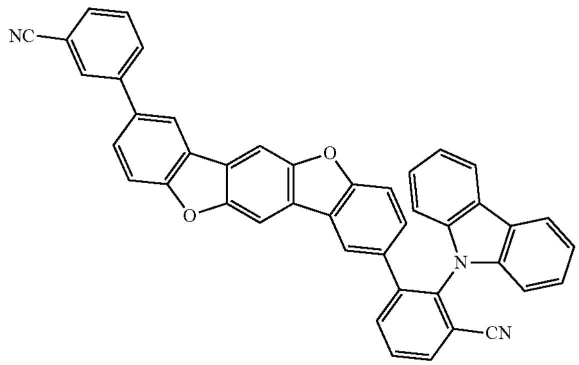
135
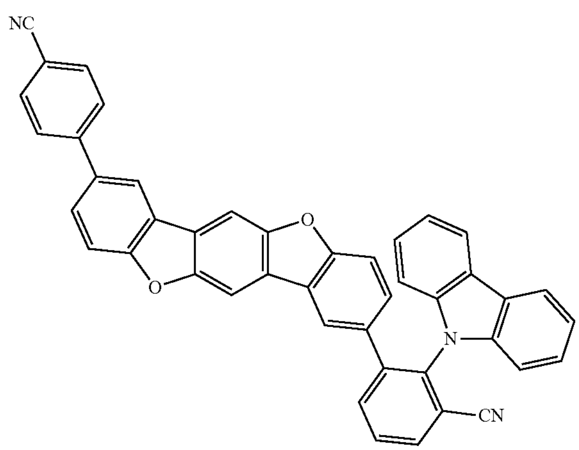
136
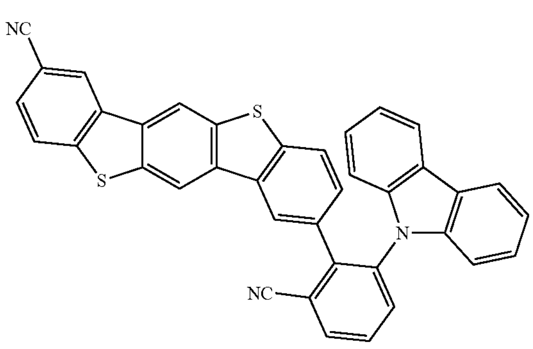
-continued
137
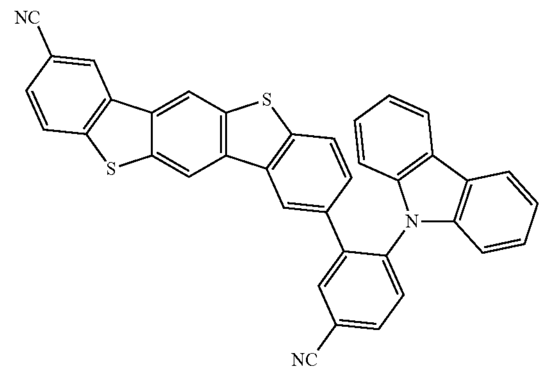
138
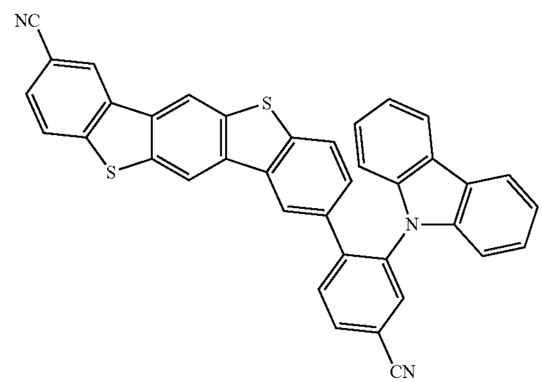
139
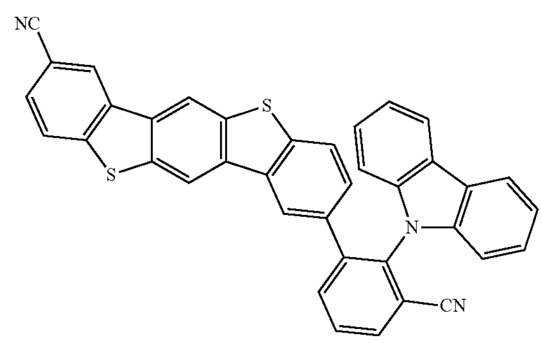
140
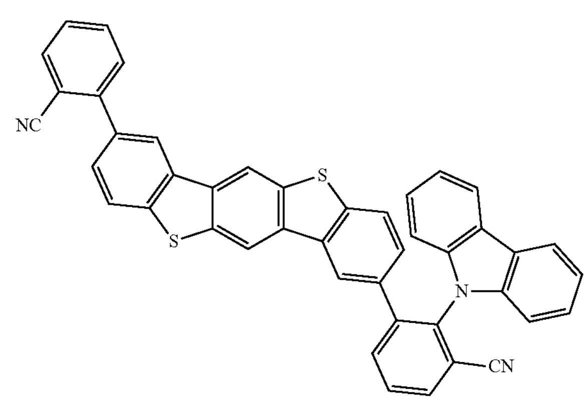

141
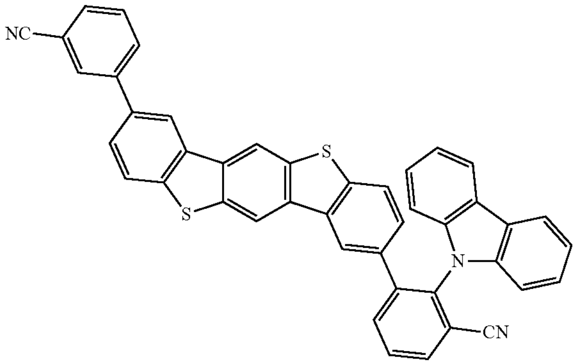
142
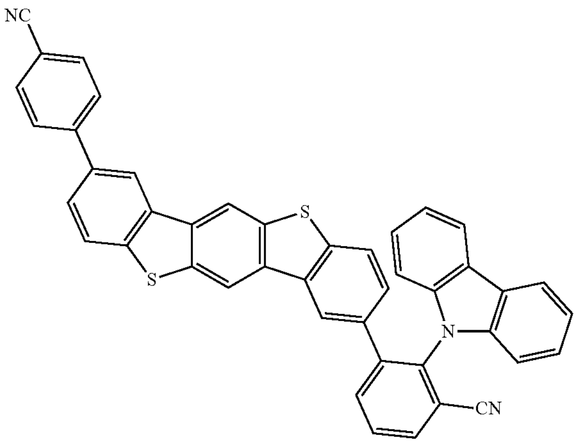
143
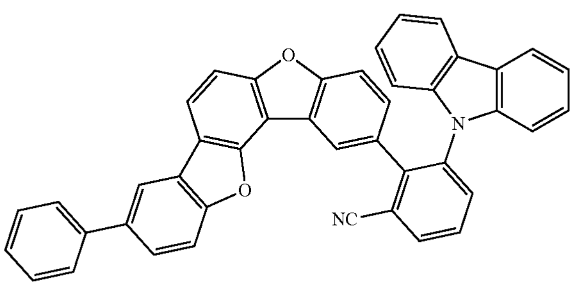
144
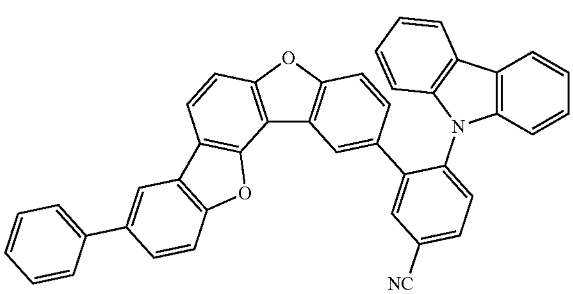
145
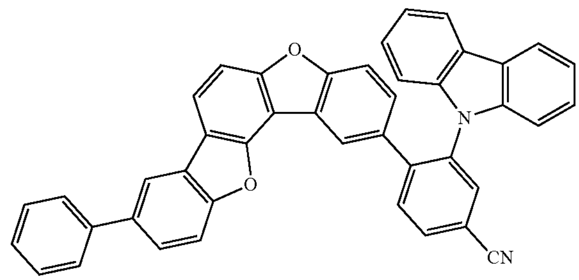
146
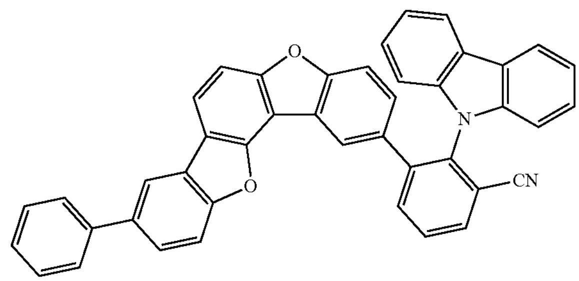
147
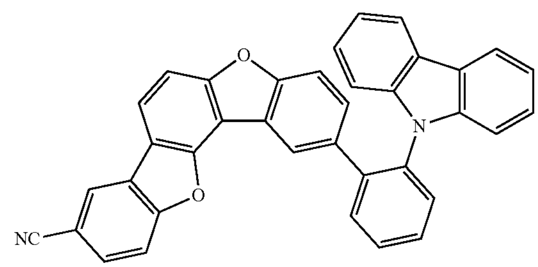
148
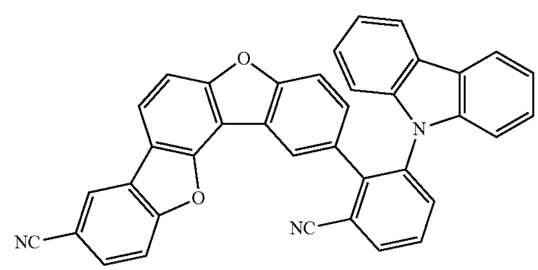
149
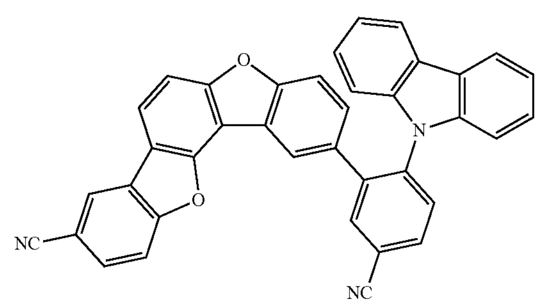

-continued
150
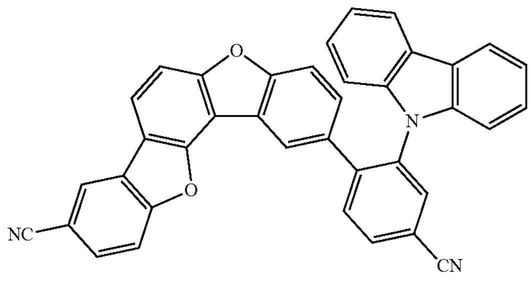
151
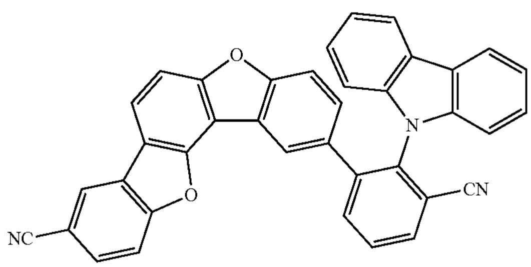
152
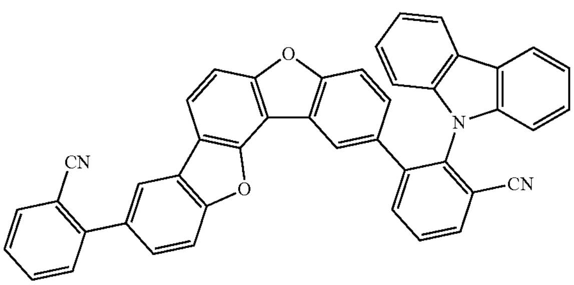
153
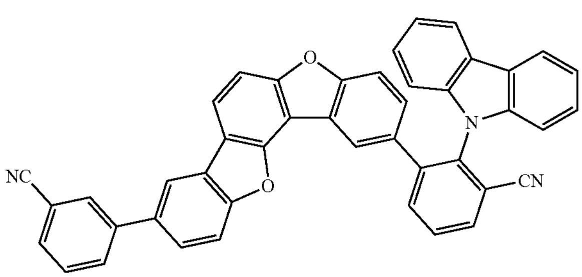
154
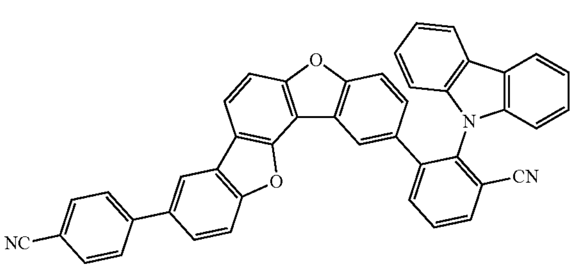
-continued
155
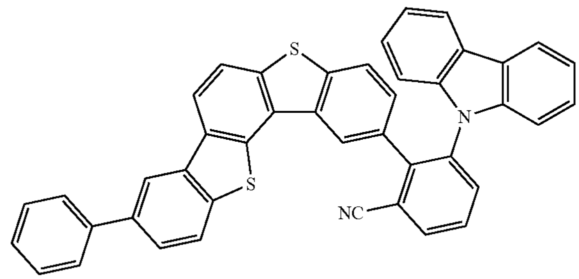
156
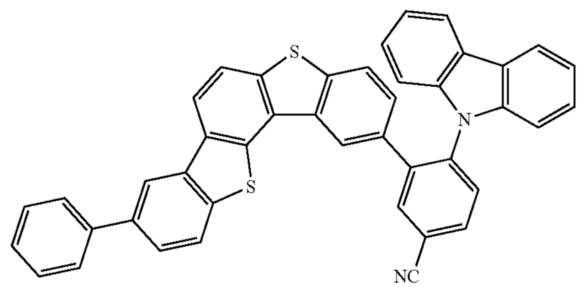
157
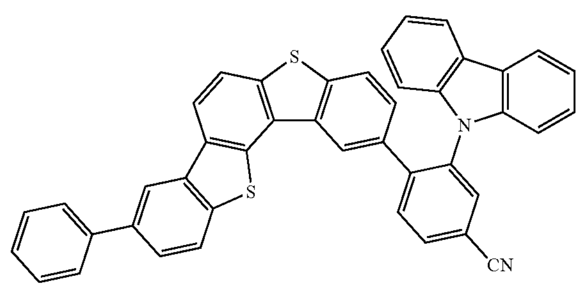
158
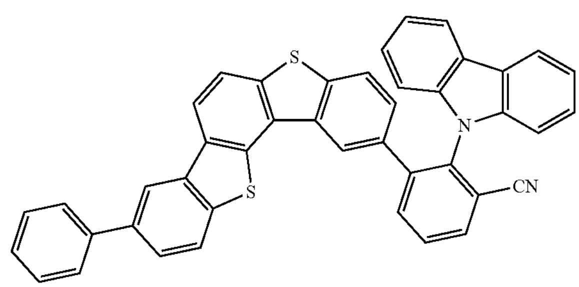
159
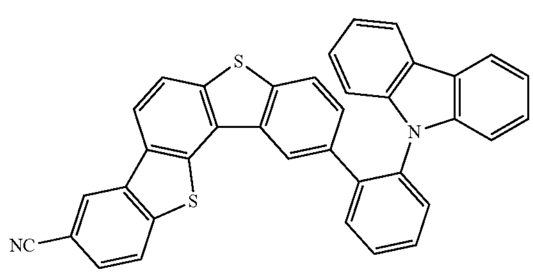

-continued
160
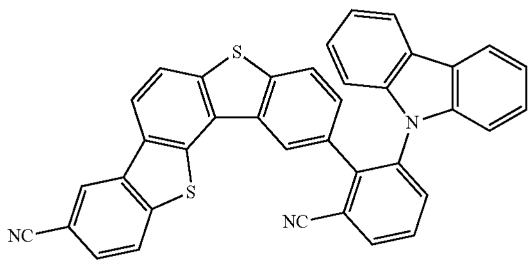
161
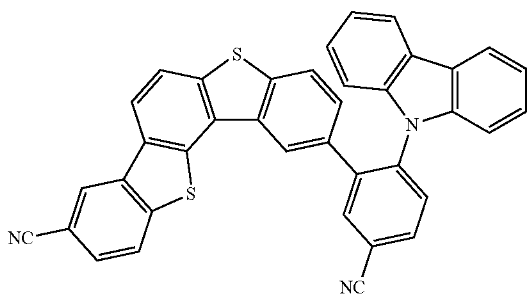
162
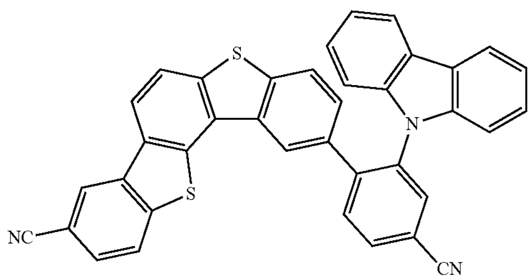
163
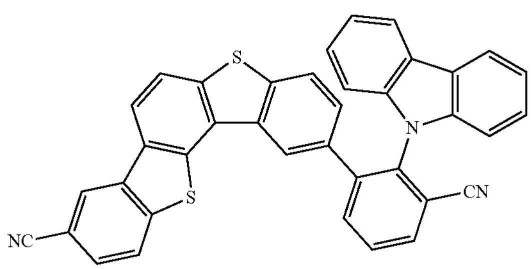
164
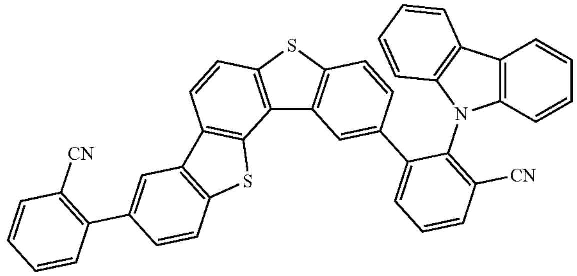
-continued
165
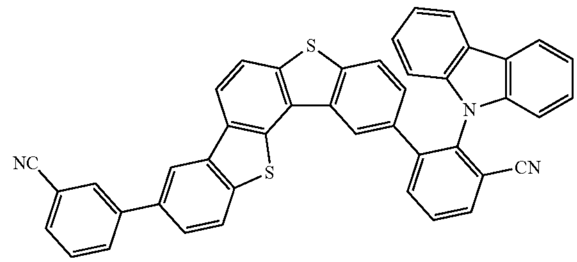
166
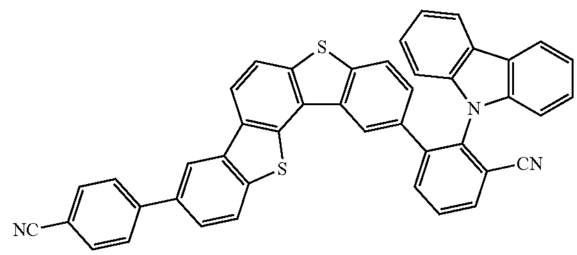
167
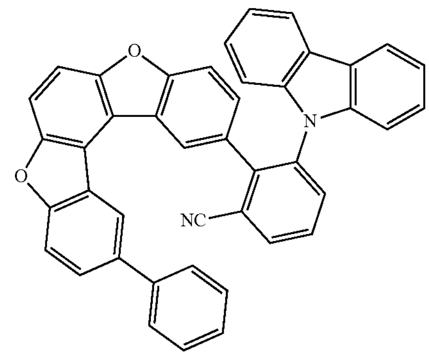
168
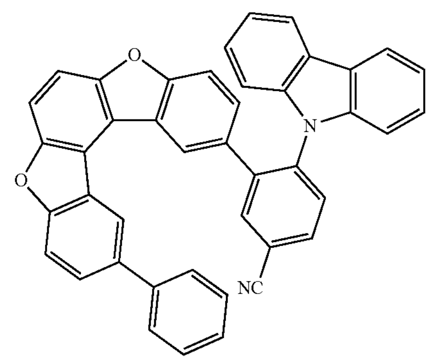
169
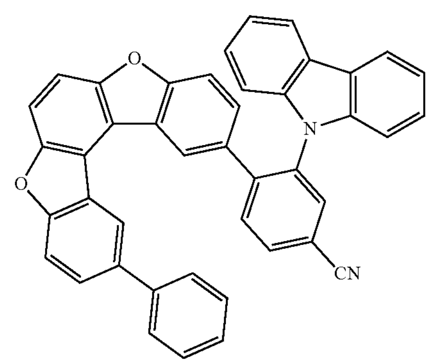

-continued
170
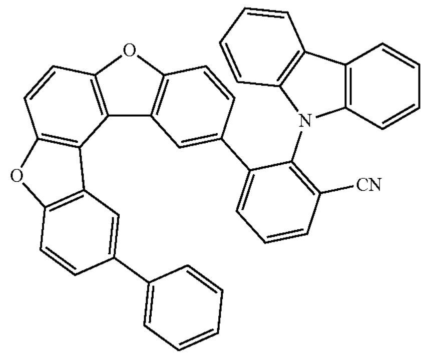
171
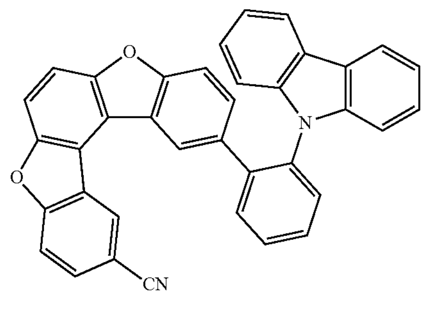
172
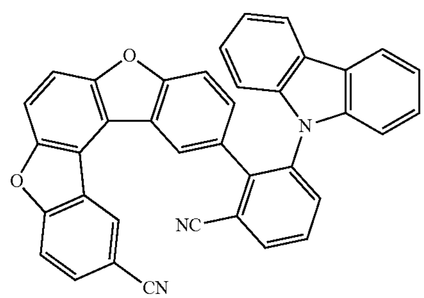
173
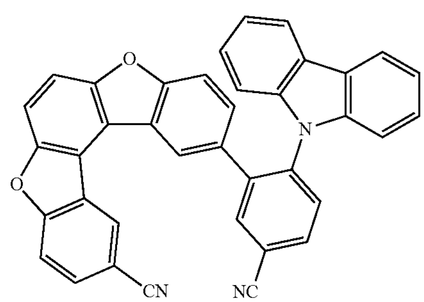
174
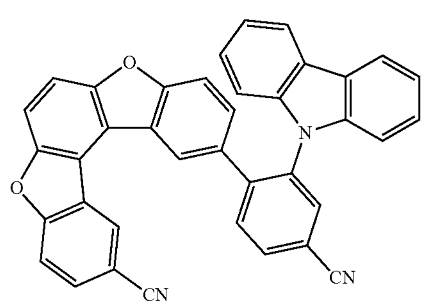
-continued
175
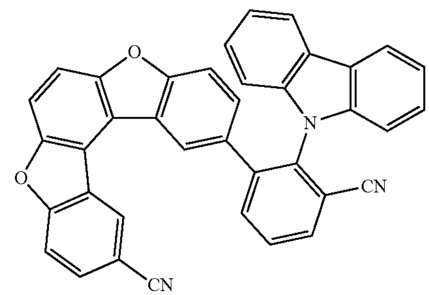
176
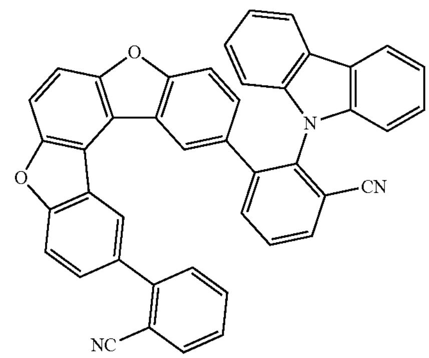
177
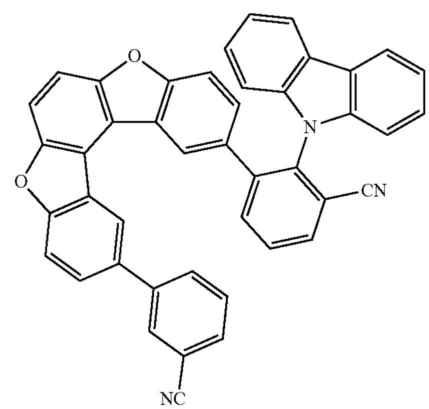
178
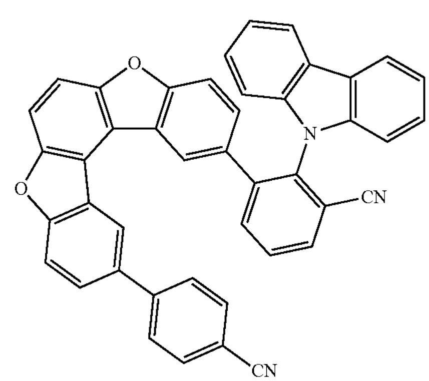

179
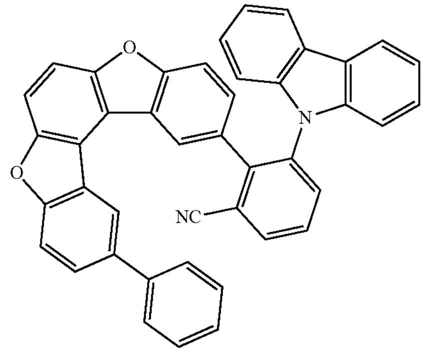
180
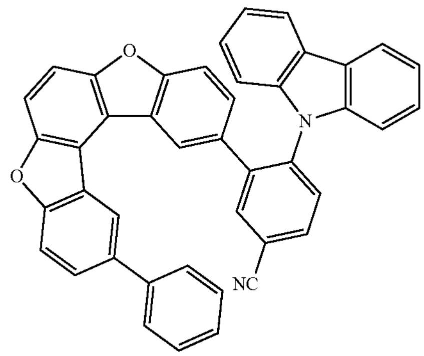
181
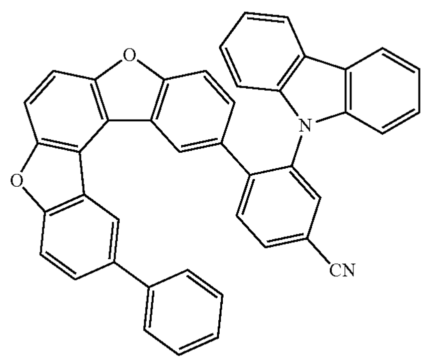
182
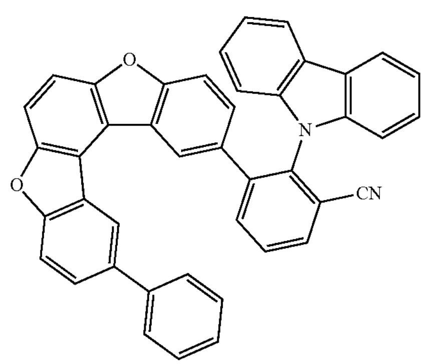
183
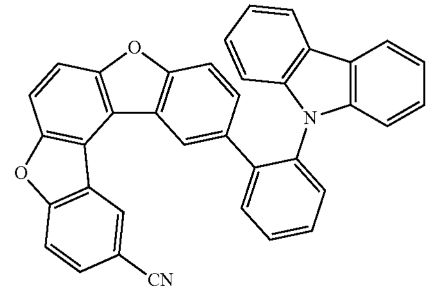
184
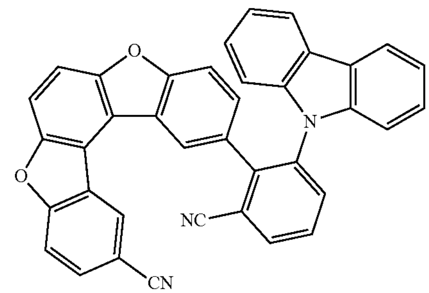
185
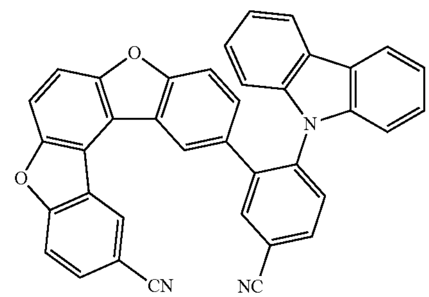
186
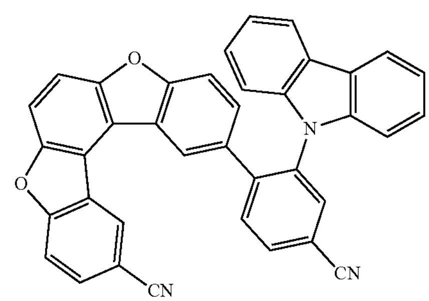
187
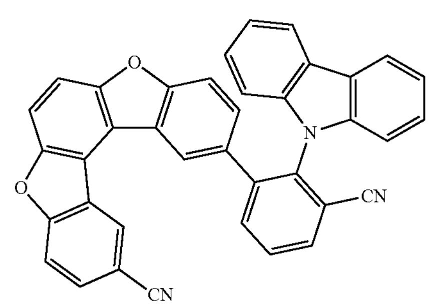

-continued
188
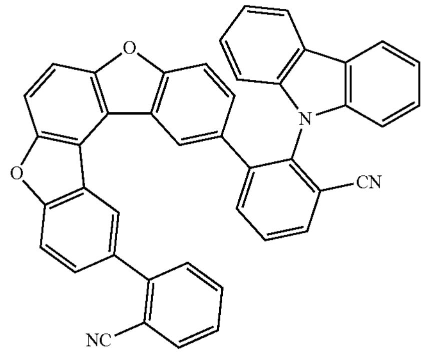
189
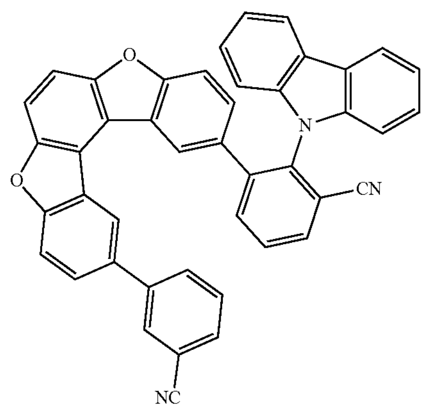
190
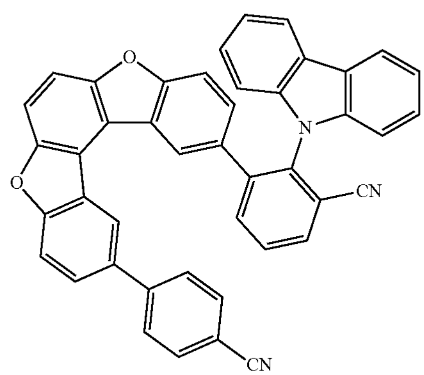
191
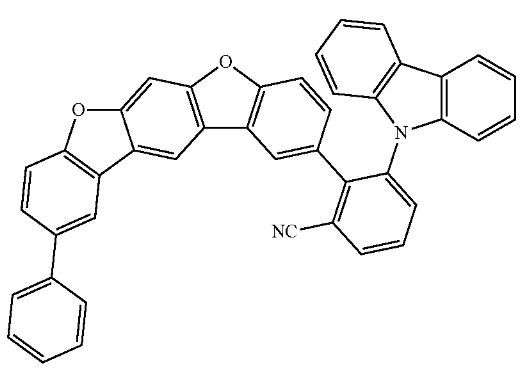
-continued
192
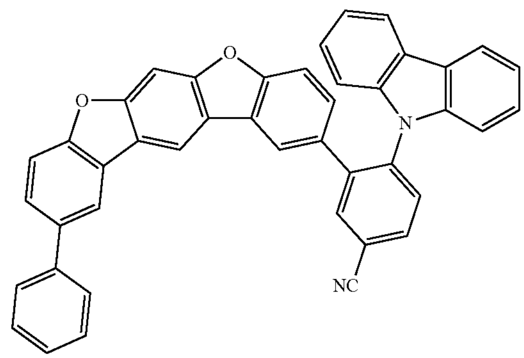
193
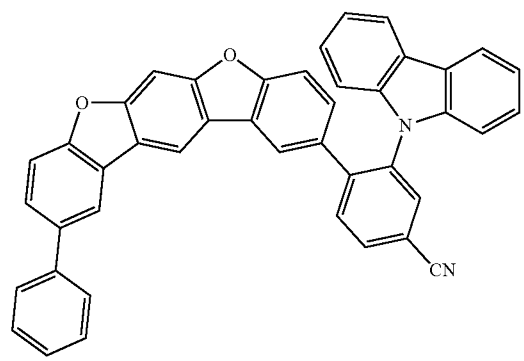
194
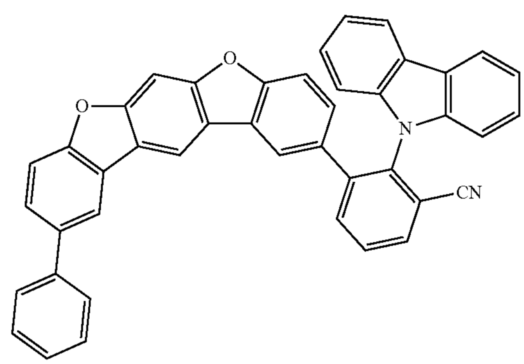
195
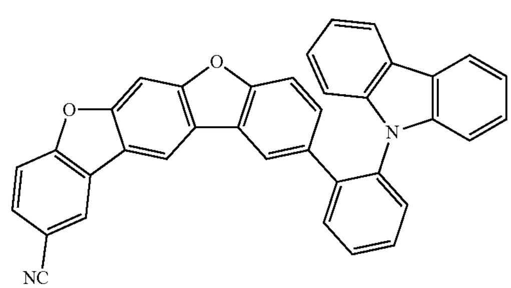

196
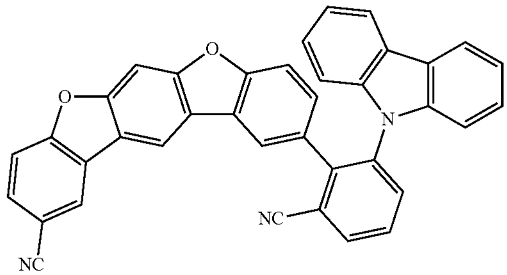
197
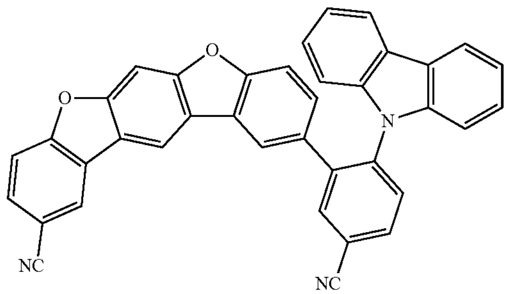
198
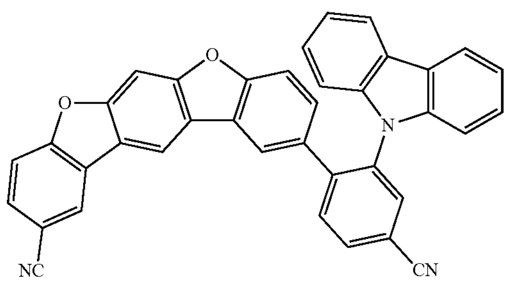
199
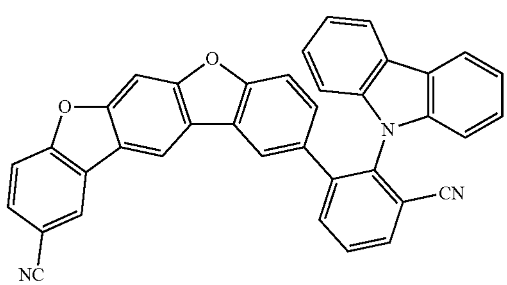
200
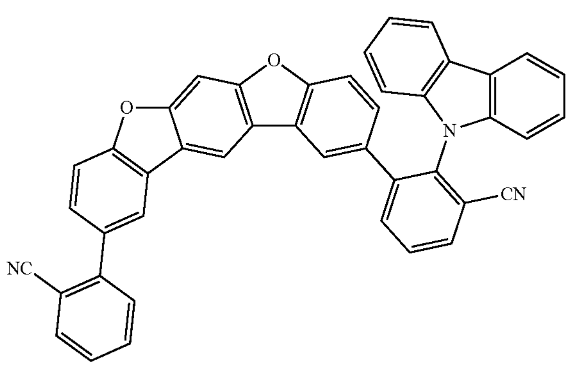
201
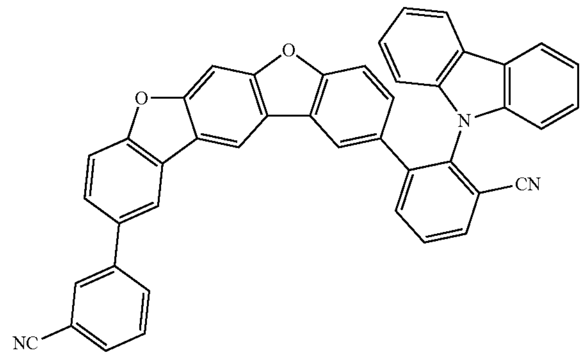
202
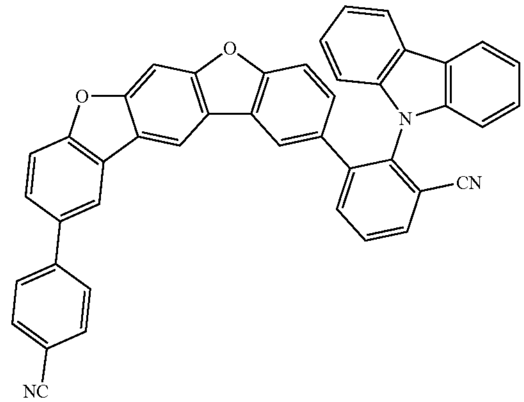
203
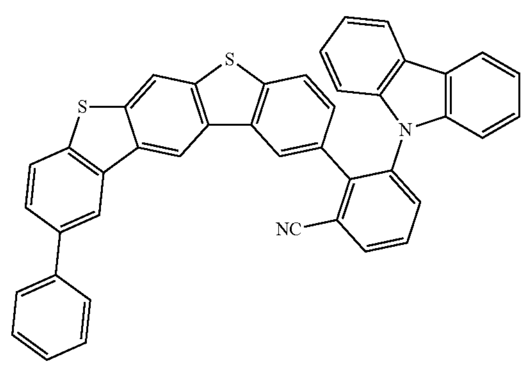
204
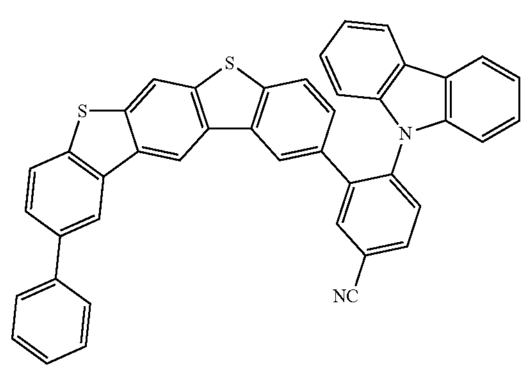

-continued
205
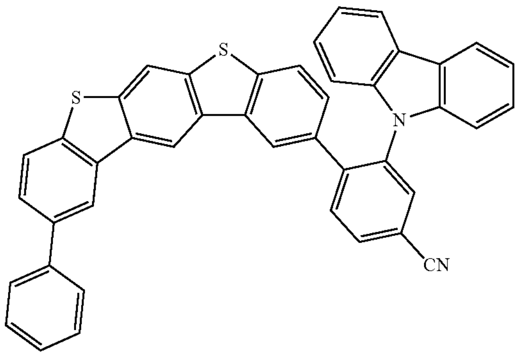
206
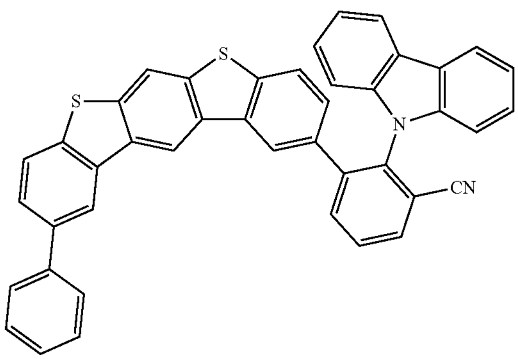
207
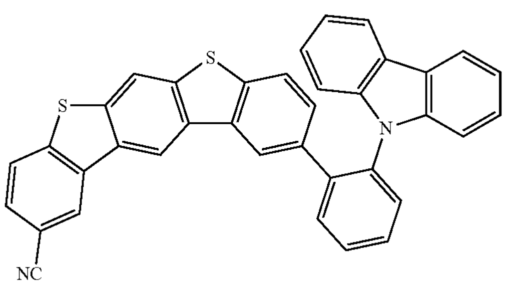
208
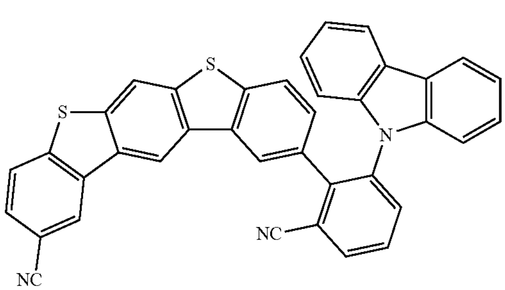
-continued
209
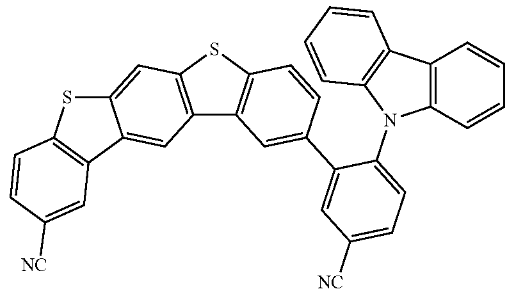
210
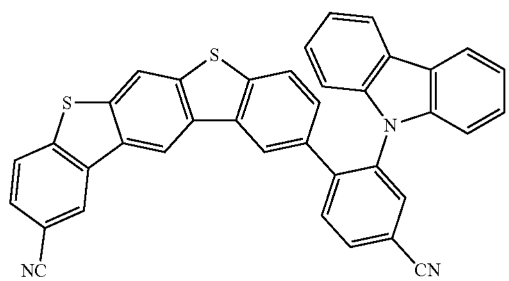
211
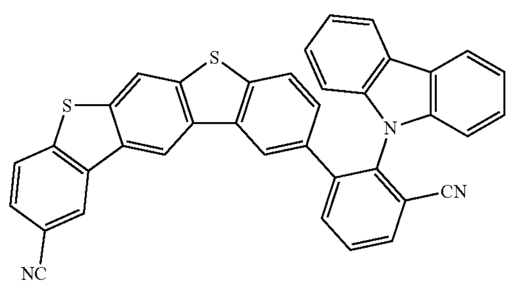
212
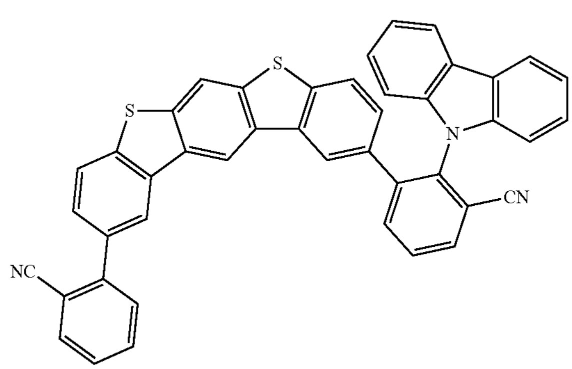

213
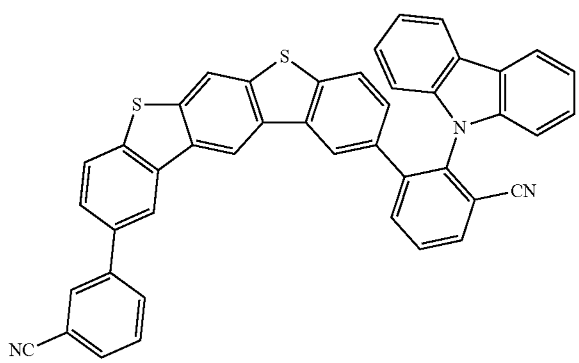
214
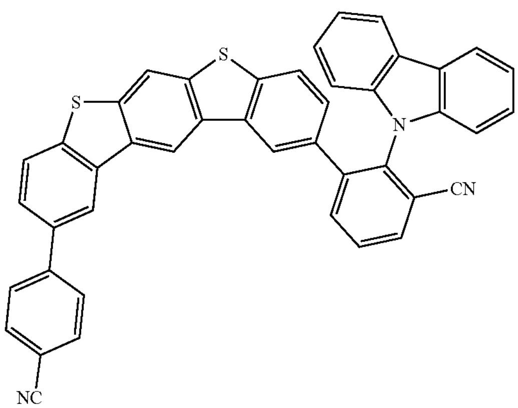
215
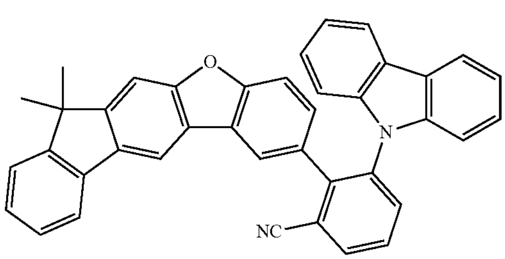
216
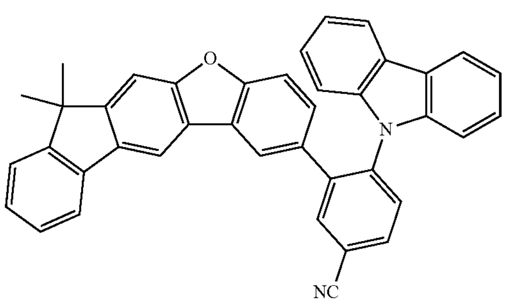
217
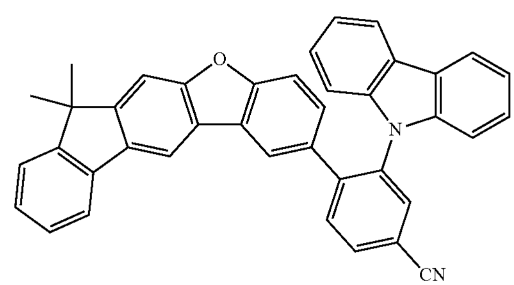
218
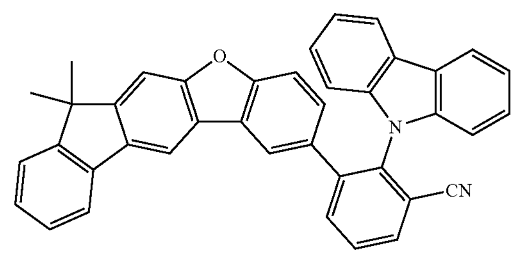
219
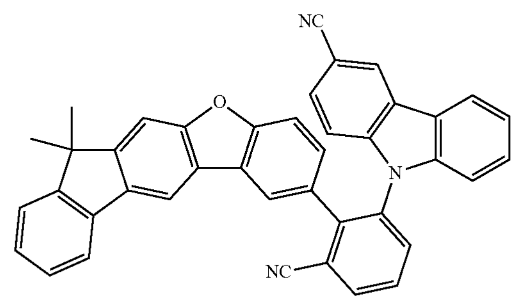
220
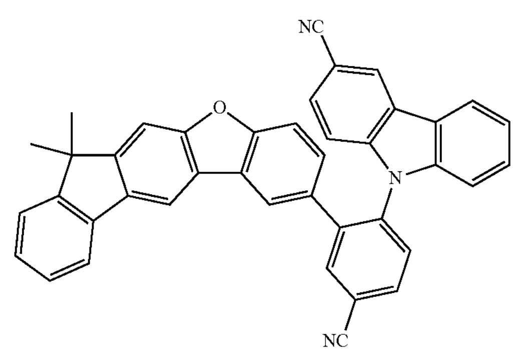
221
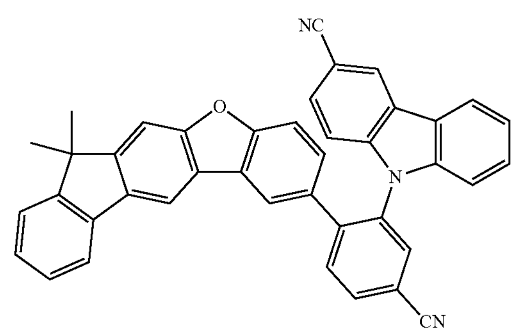

-continued
222
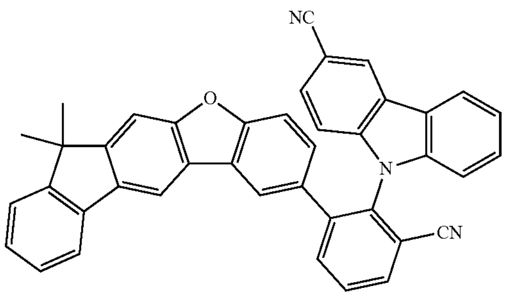
223
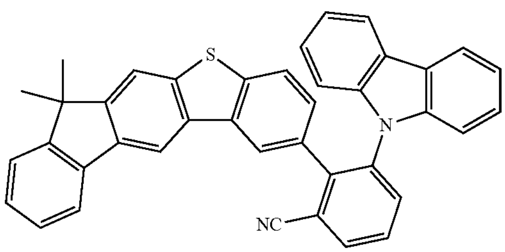
224
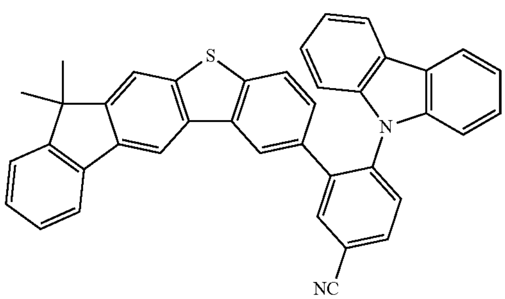
225
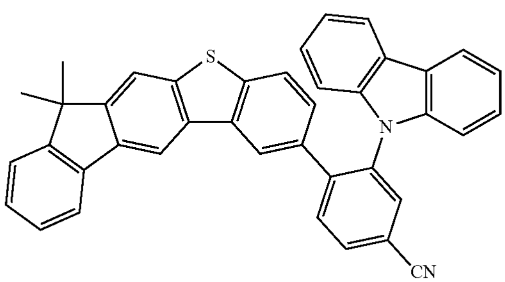
226
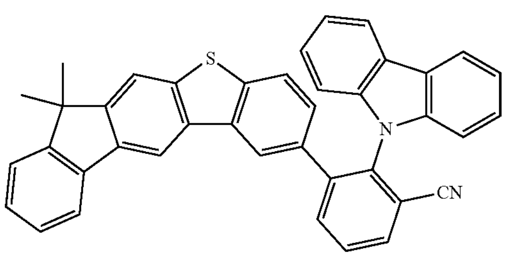
-continued
227
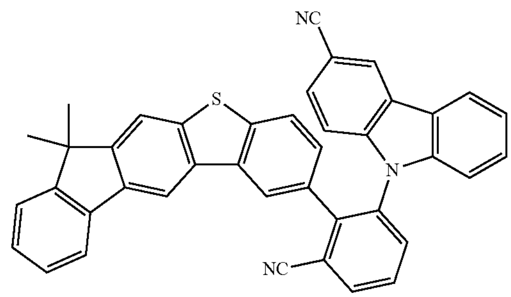
228
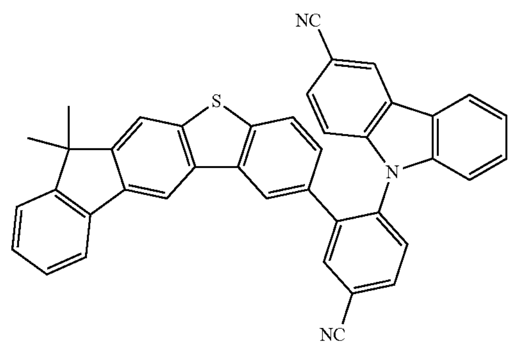
229
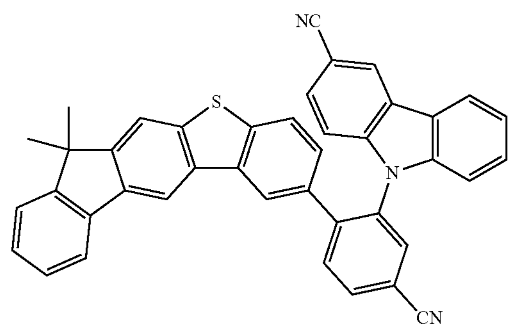
230
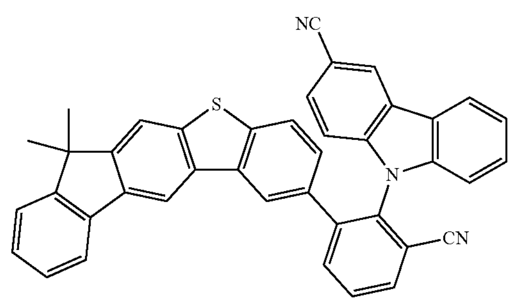
231
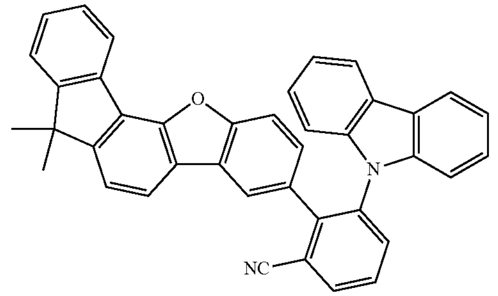

-continued
232
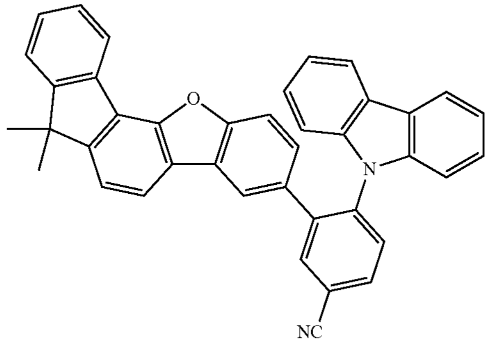
233
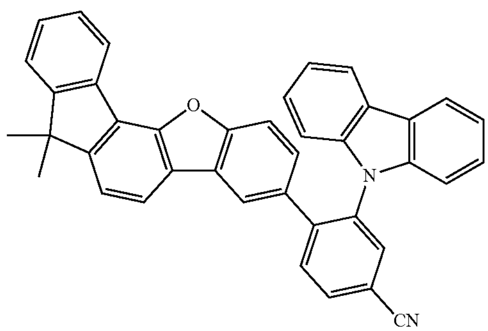
234
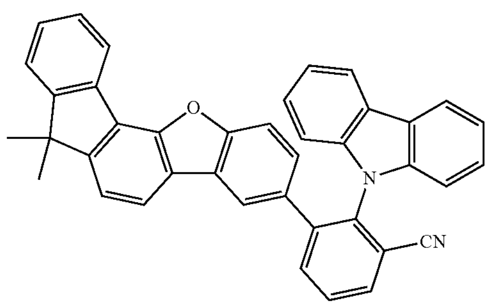
235
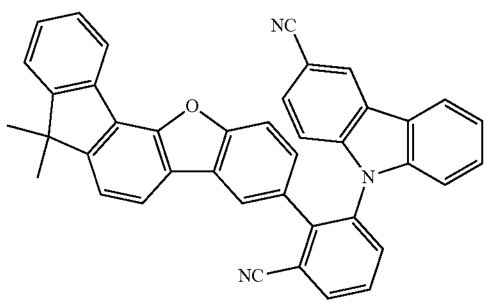
236
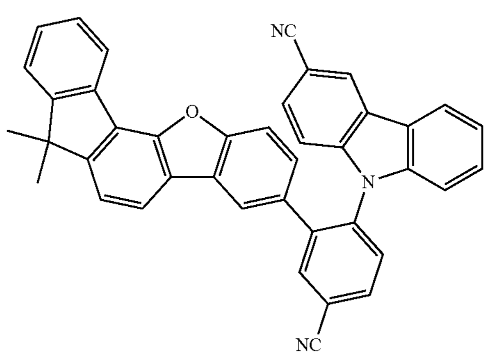
-continued
237
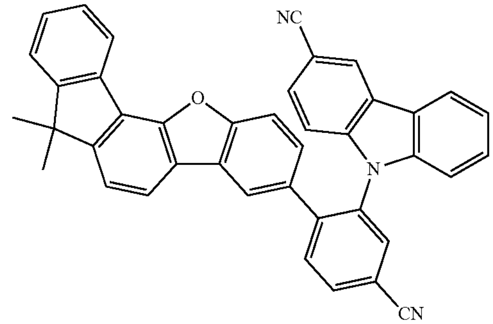
238
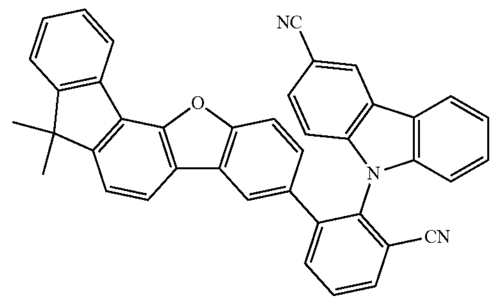
239
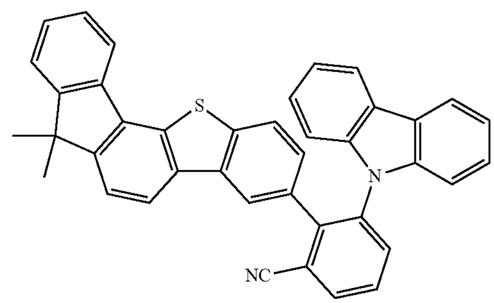
240
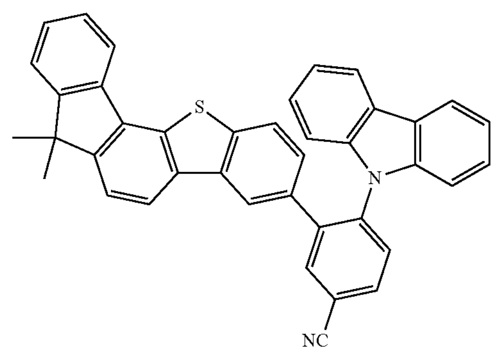
241
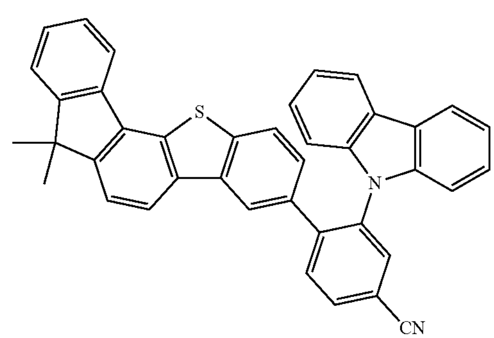

-continued
242
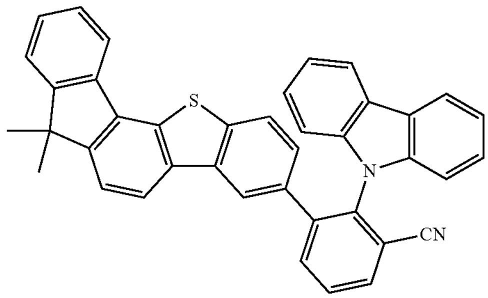
243
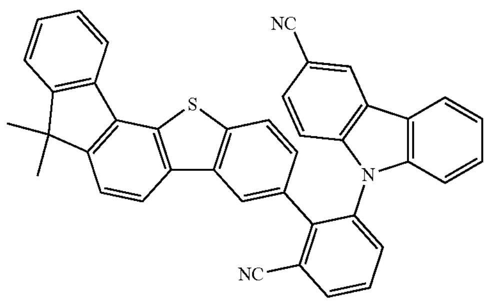
244
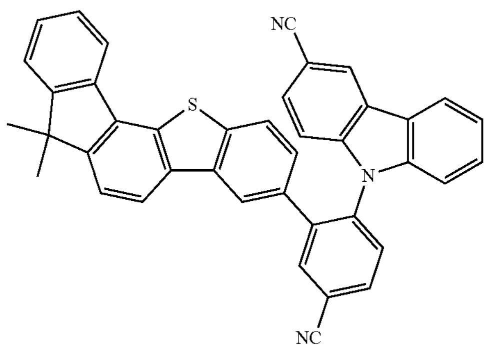
245
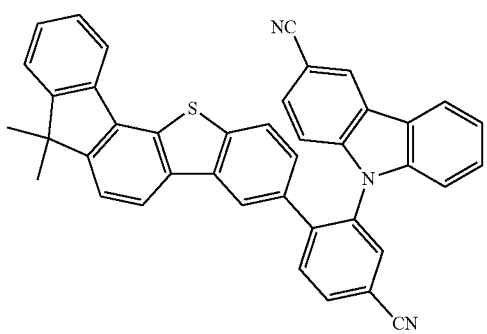
246
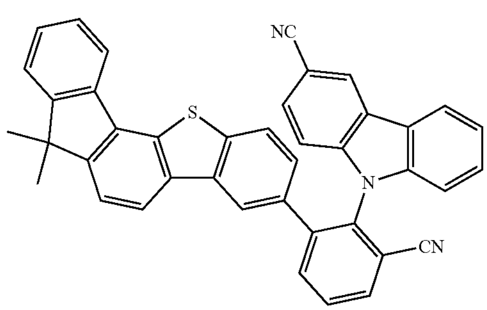
-continued
247
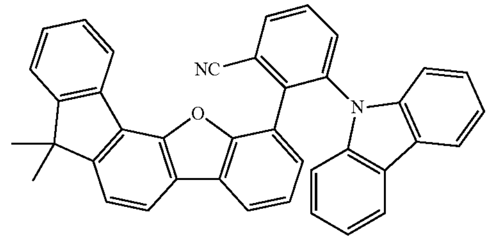
248
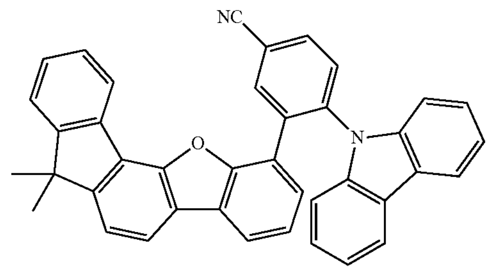
249
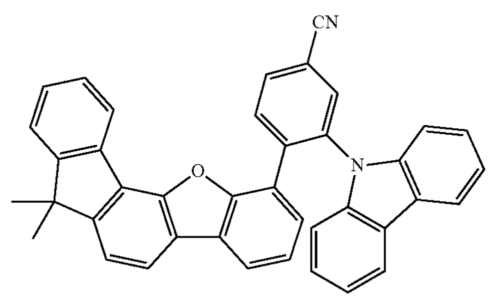
250
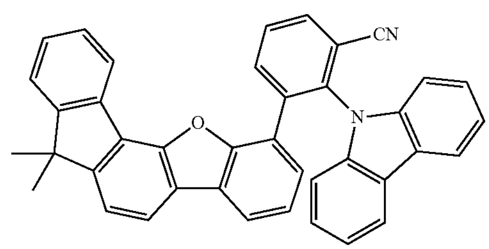
251
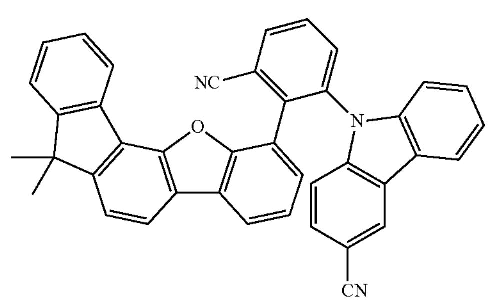

-continued
252
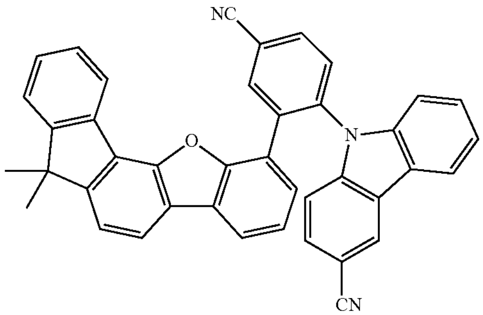
253
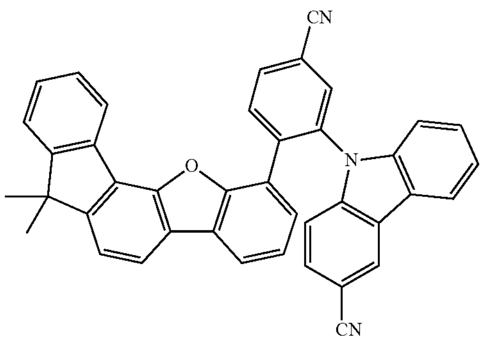
254
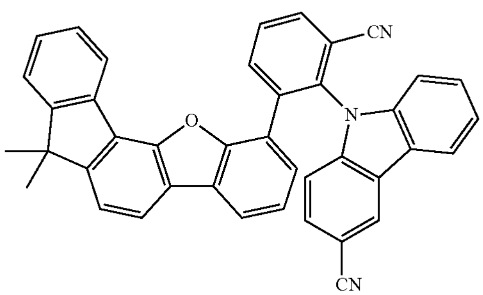
255
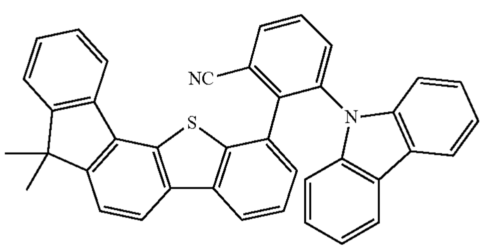
256
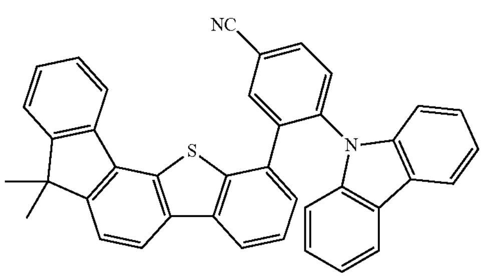
-continued
257
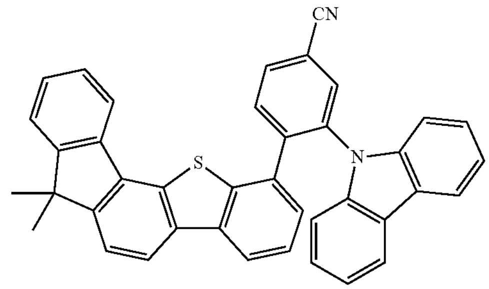
258
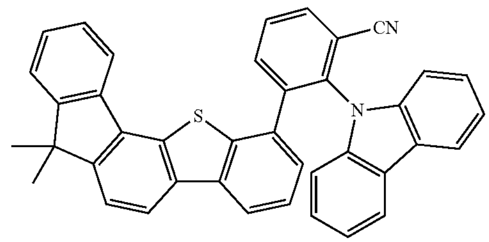
259
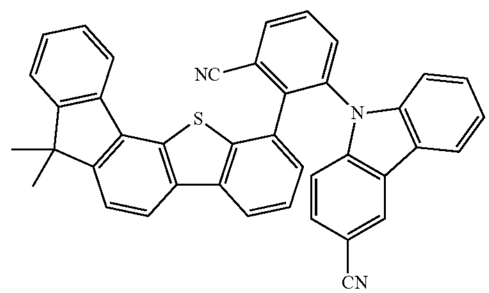
260
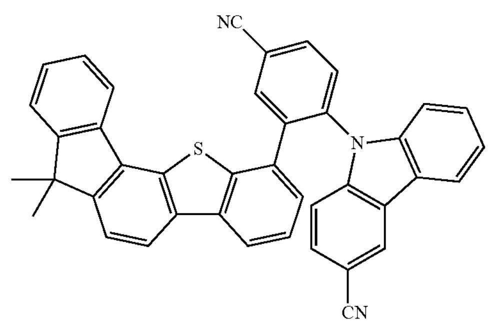
261
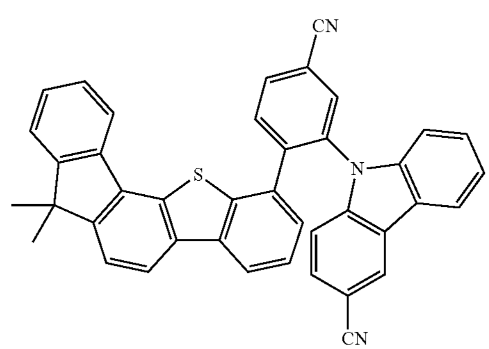

262
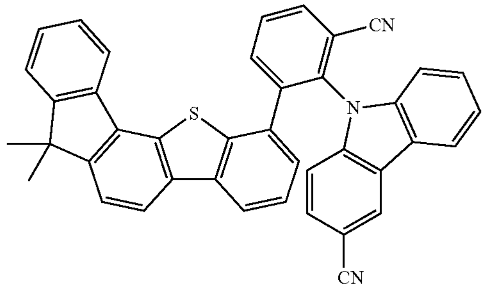
263
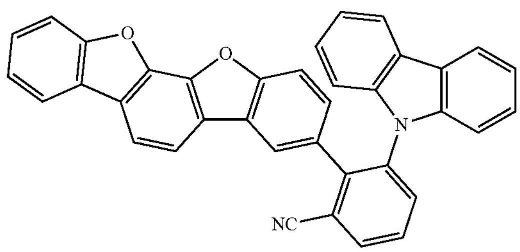
264
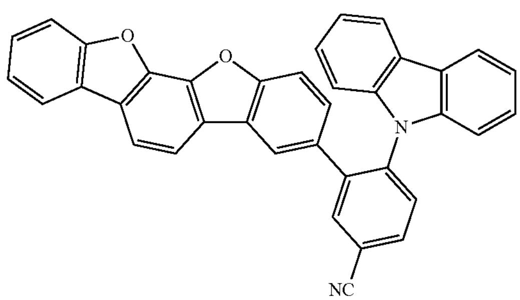
265
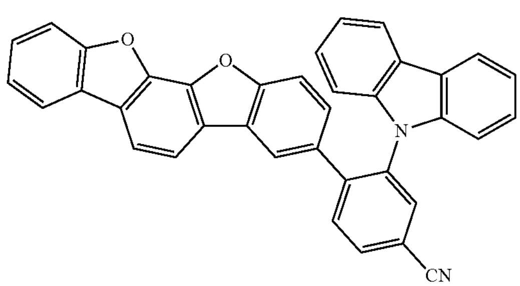
266
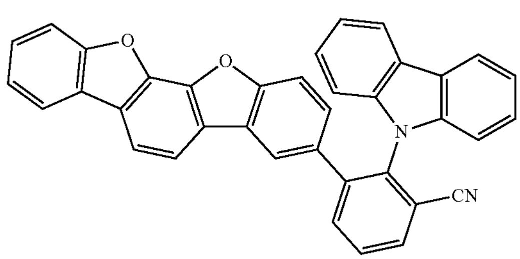
267
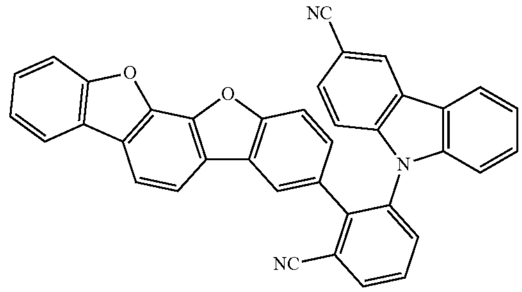
268
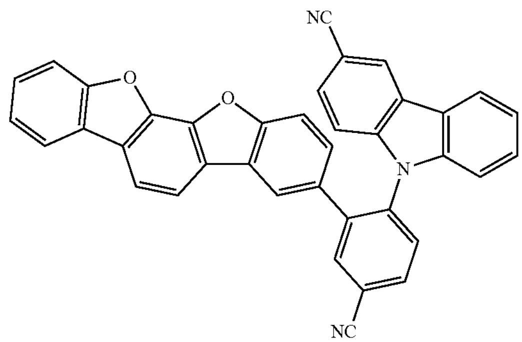
269
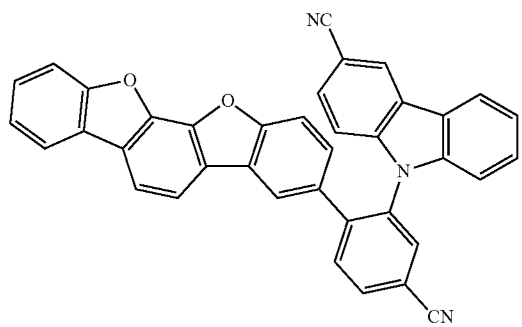
270
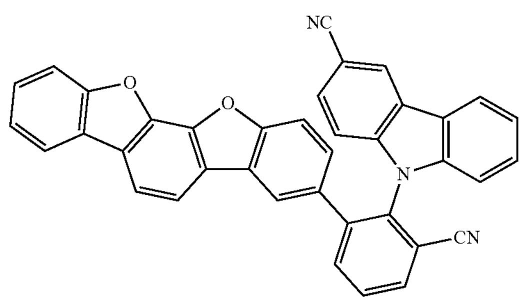
271
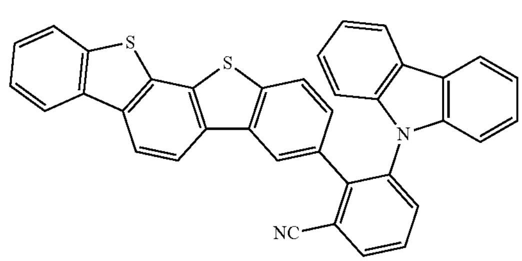

-continued
272
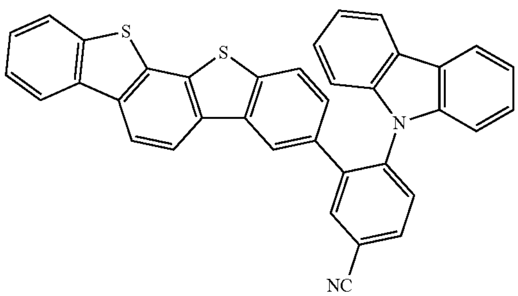
273
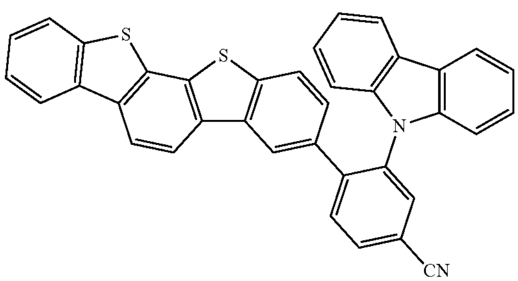
274
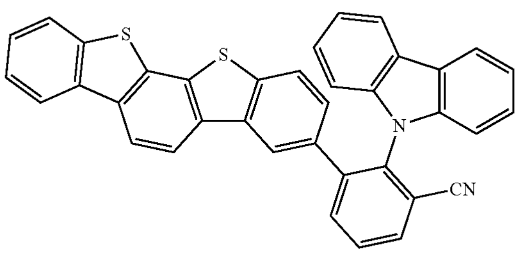
275
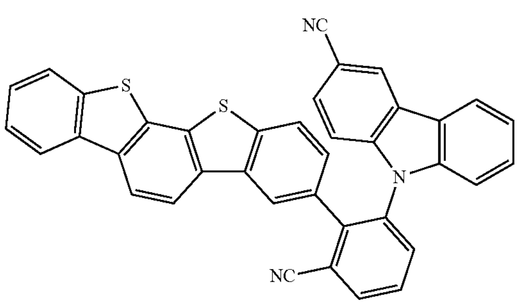
276
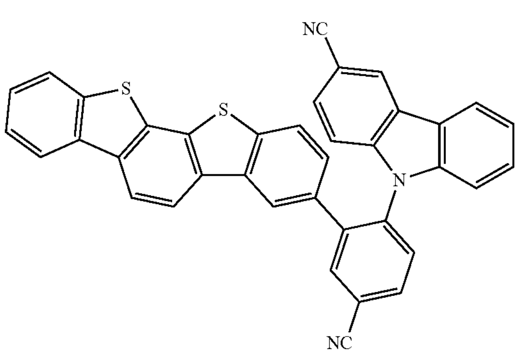
-continued
277
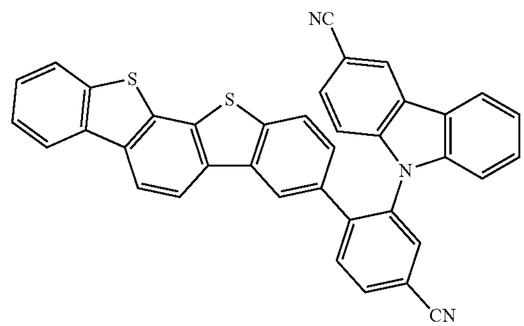
278
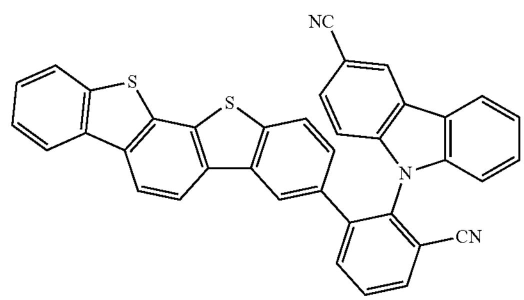
279
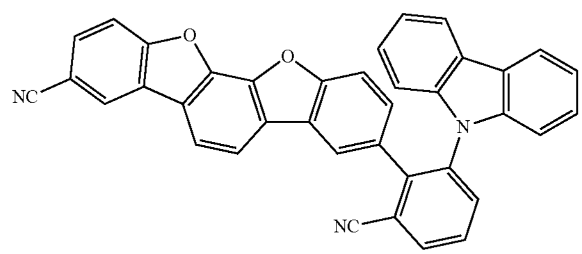
280
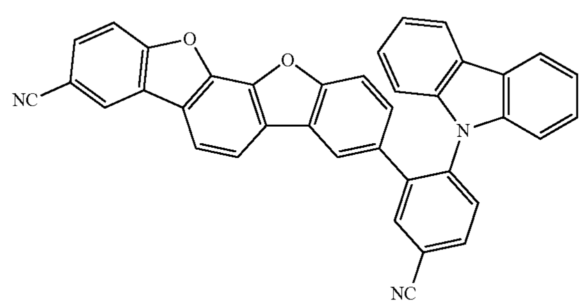
281
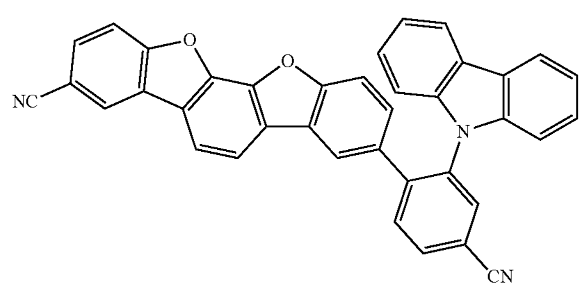

-continued
282
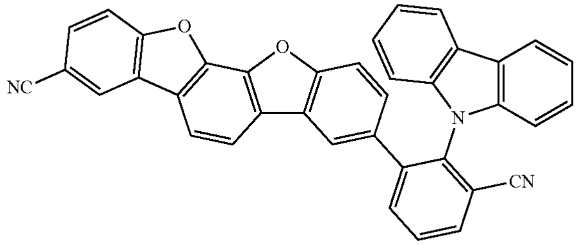
283
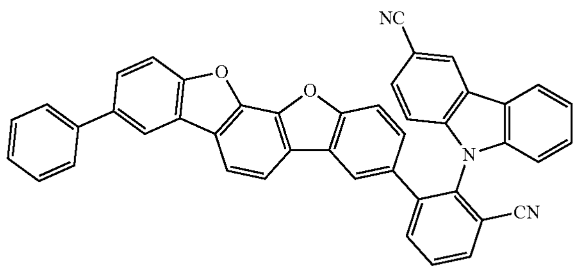
284
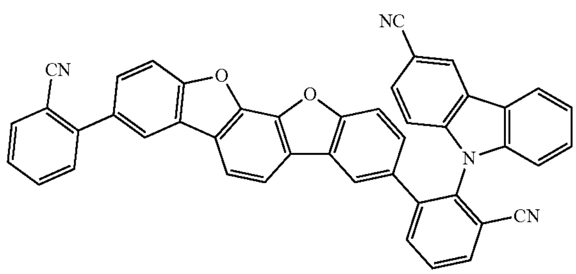
285
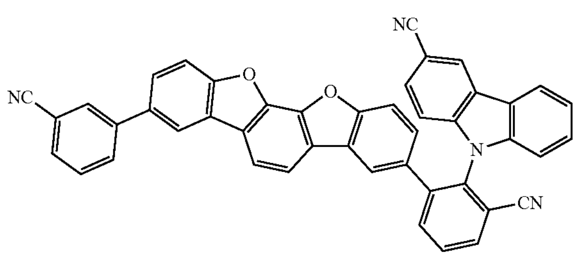
286
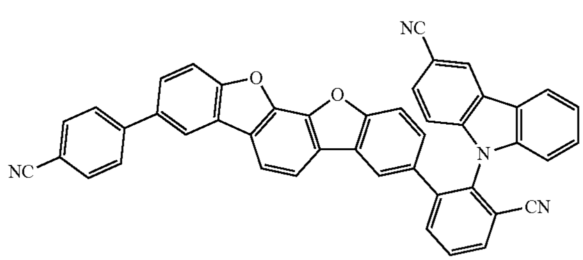
-continued
287
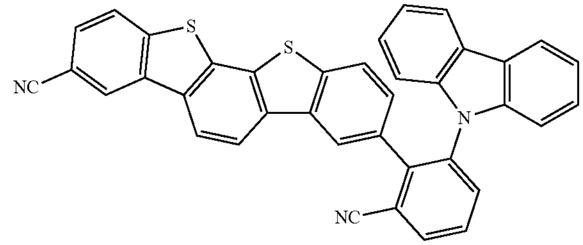
288
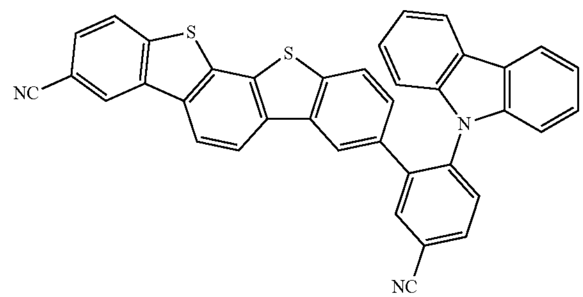
289
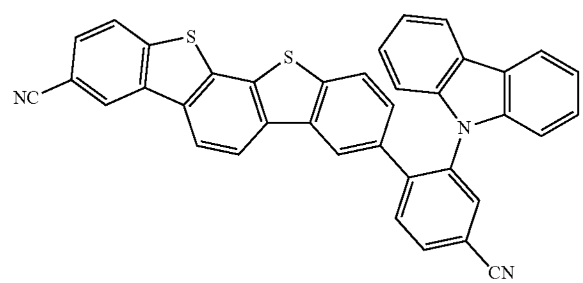
290
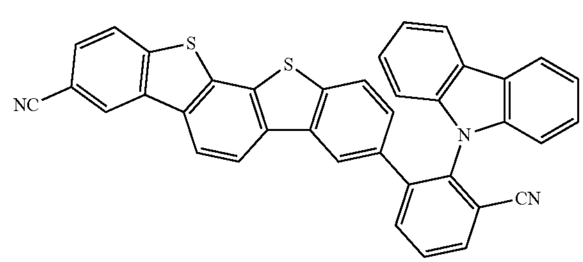
291
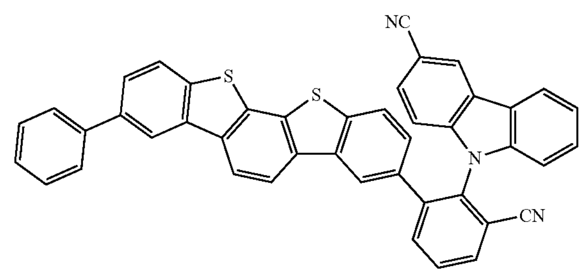

292
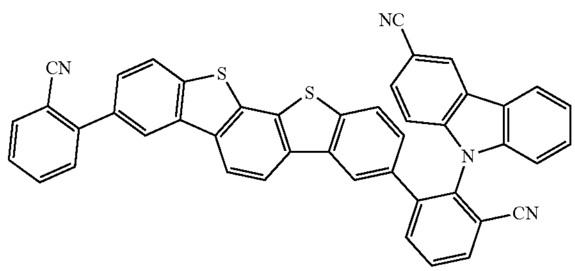
293
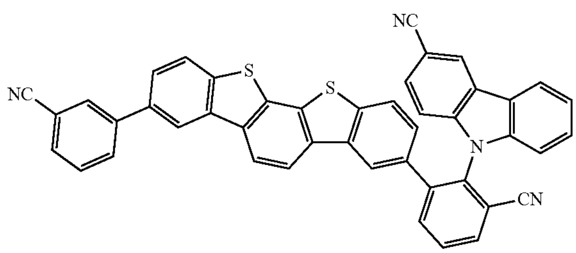
294
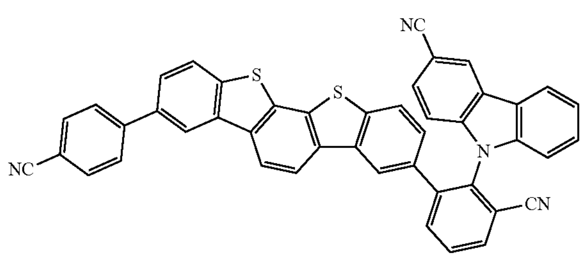
295
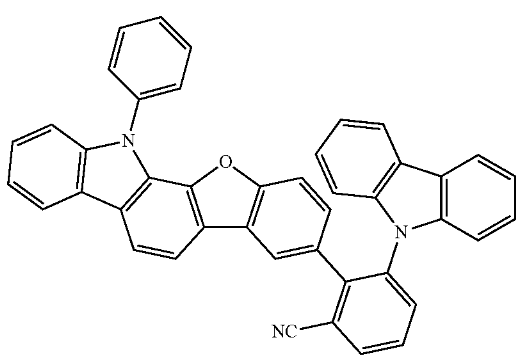
296
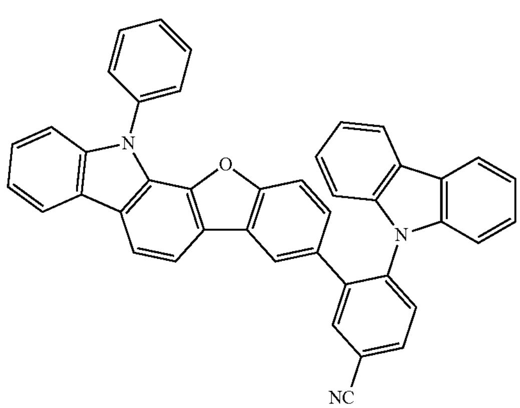
297
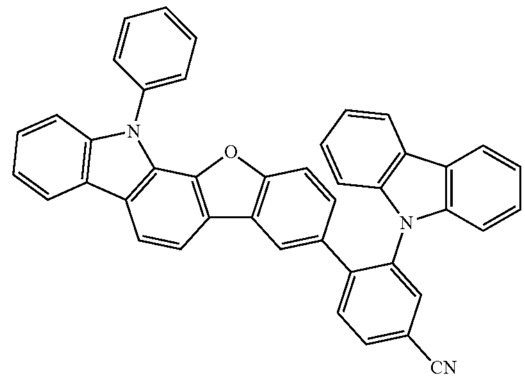
298
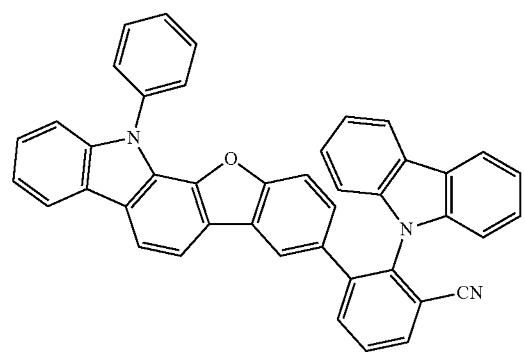
299
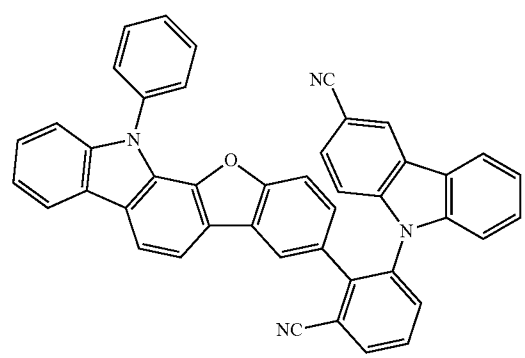
300
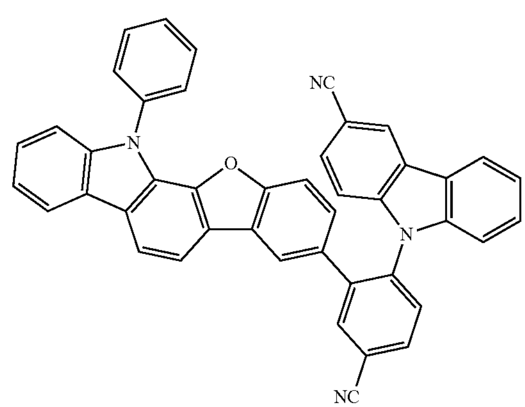

301
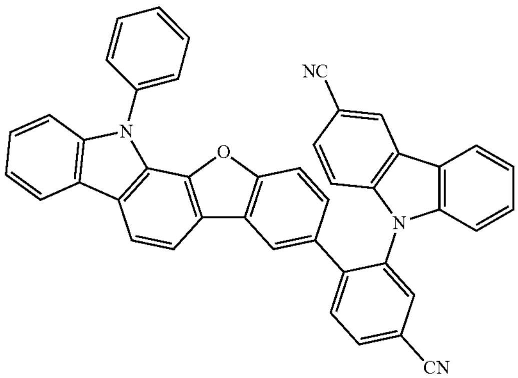
302
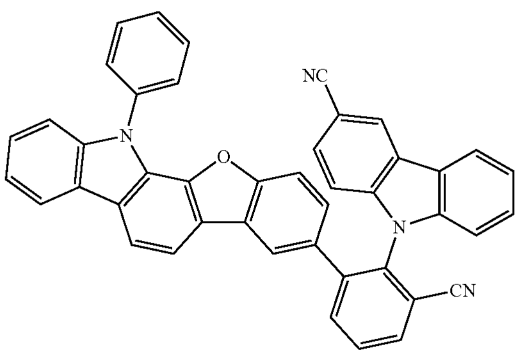
303
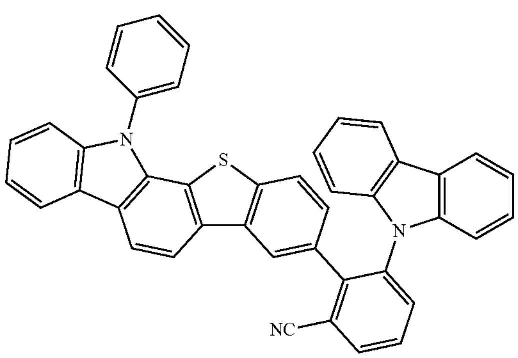
304
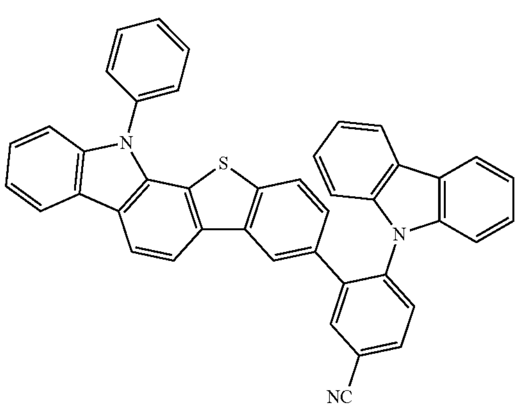
305
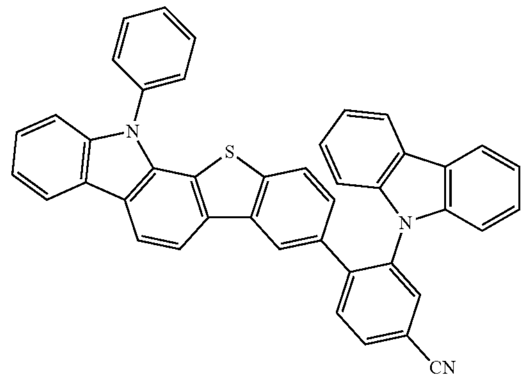
306
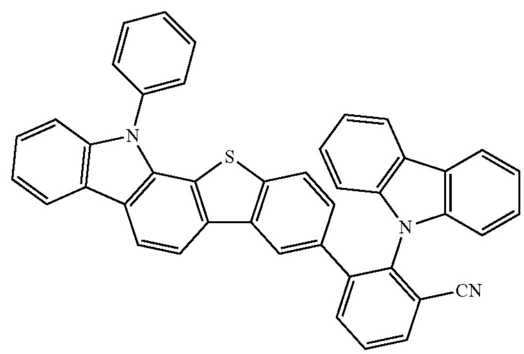
307
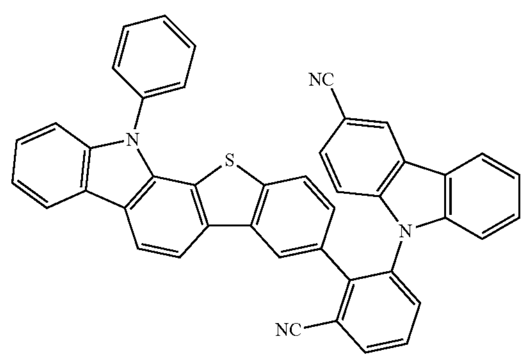
308
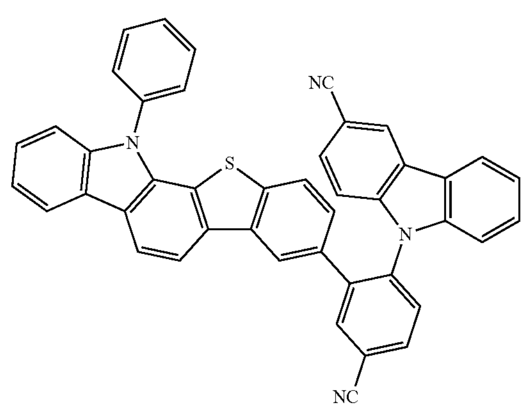

-continued
309
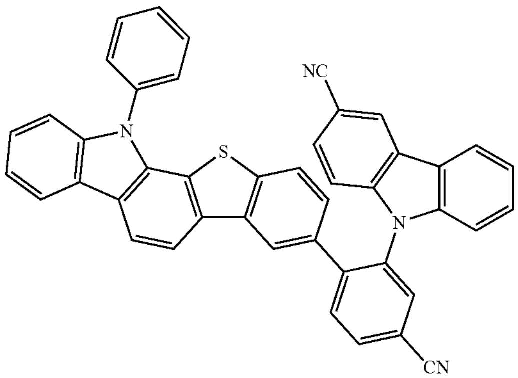
310
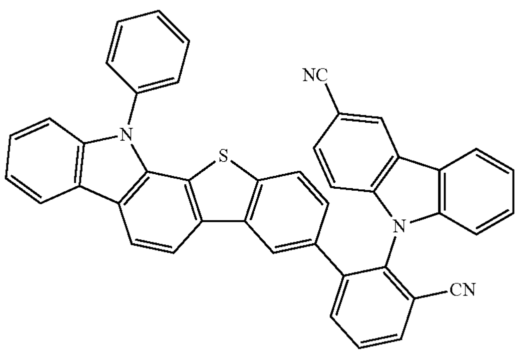
311
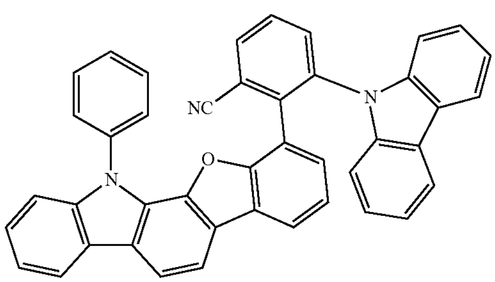
312
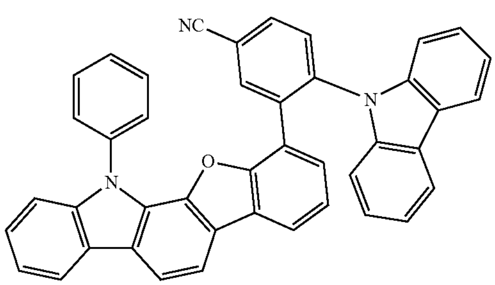
-continued
313
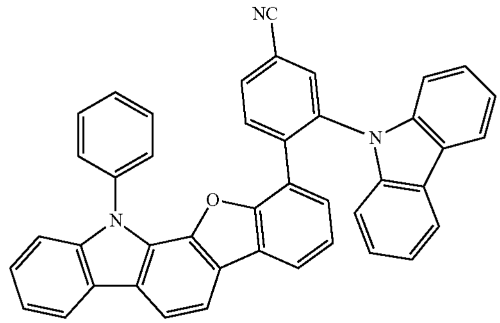
314
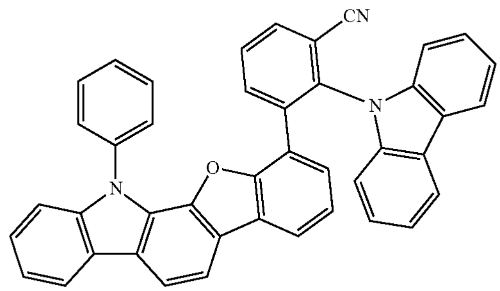
315
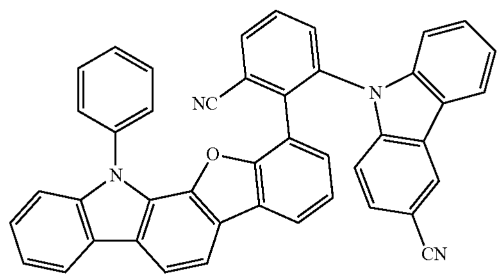
316
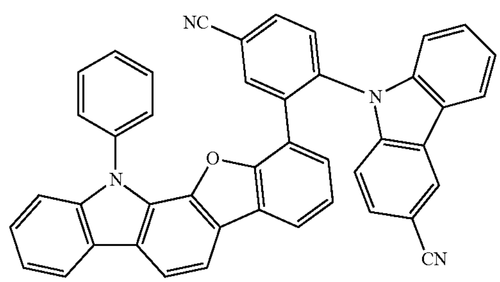
317
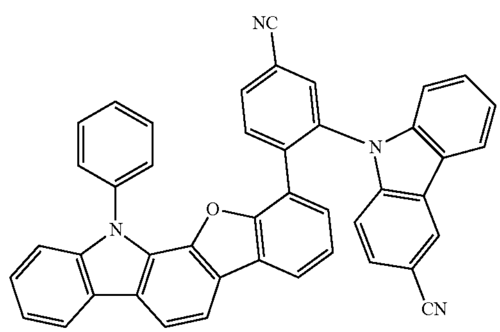

-continued
318
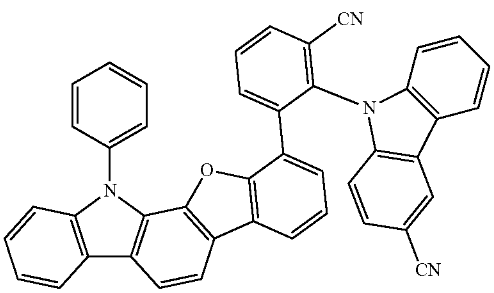
319
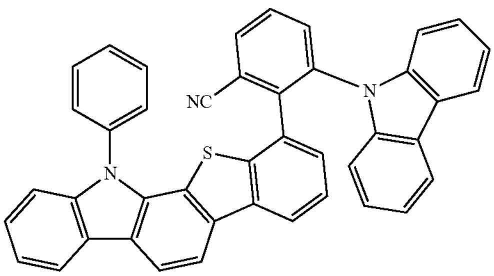
320
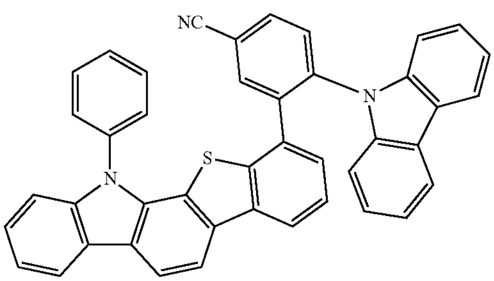
321
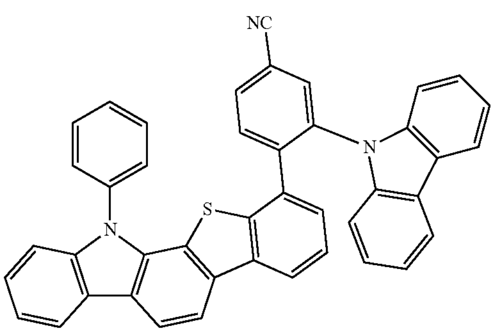
322
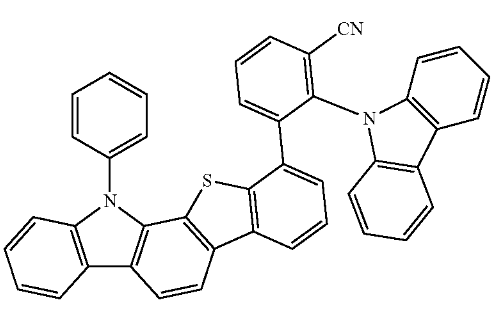
323
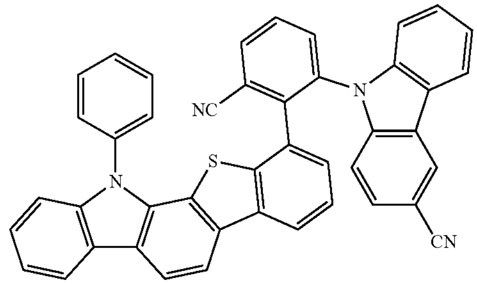
324
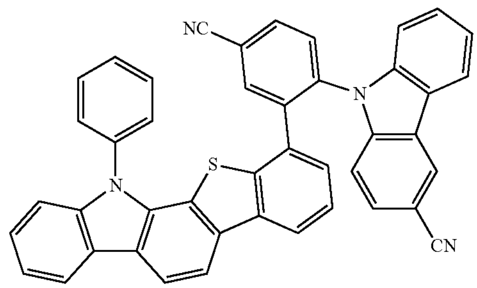
325
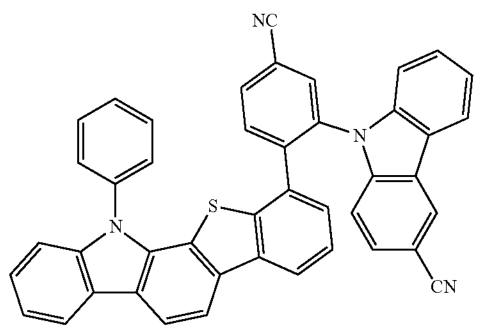
326
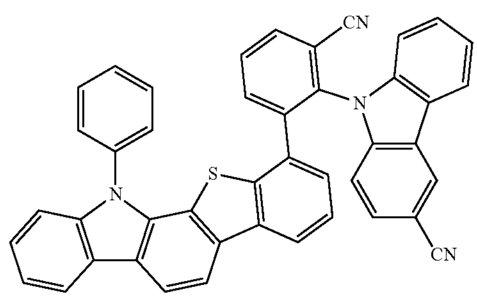
327
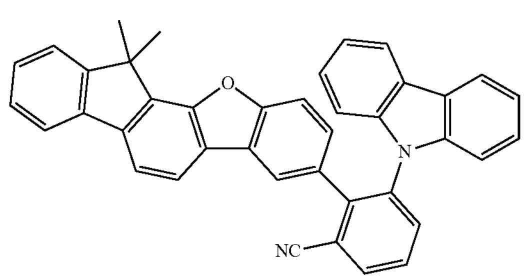

-continued
328
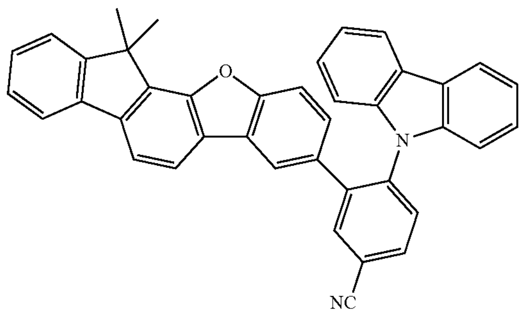
329
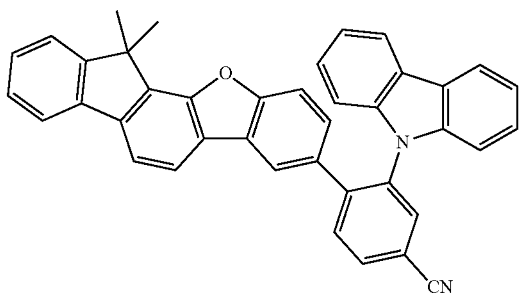
330
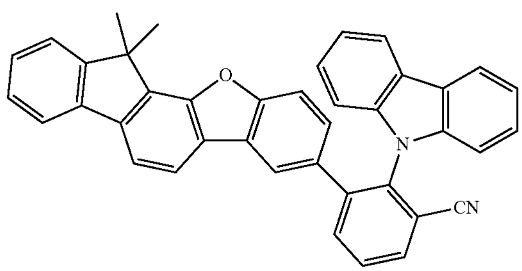
331
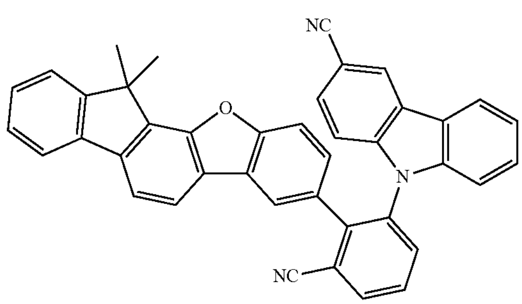
332
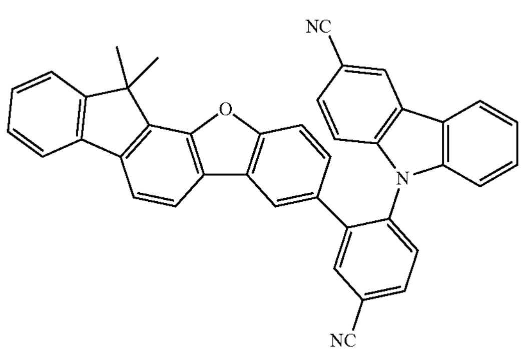
-continued
333
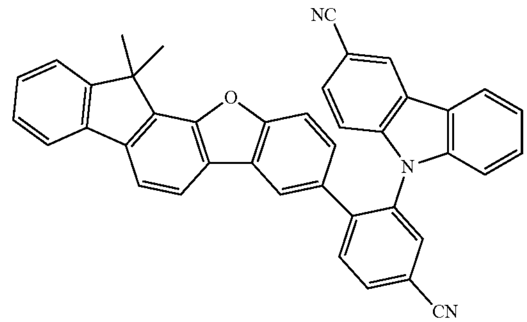
334
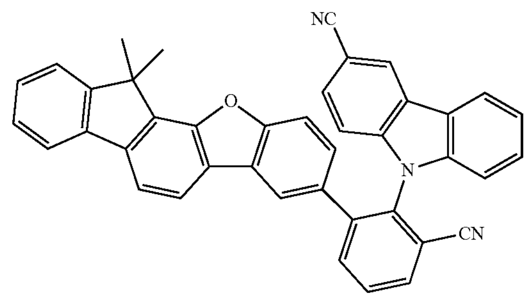
335
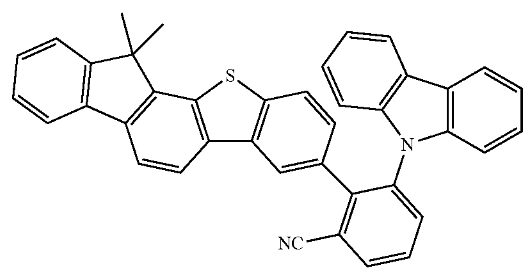
336
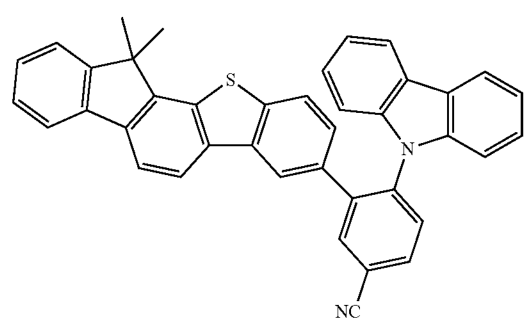
337
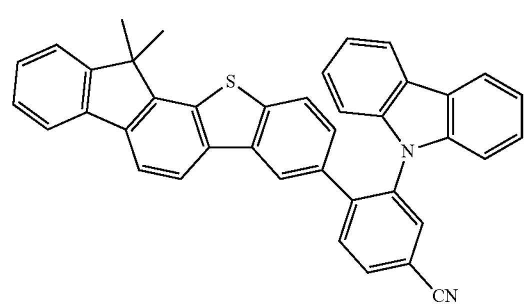

-continued
338
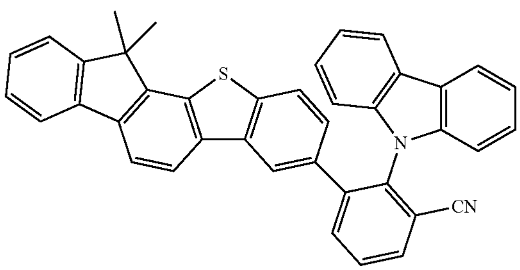
339
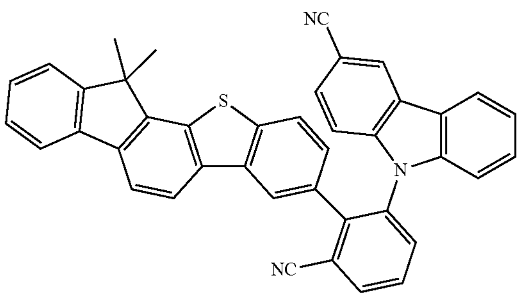
340
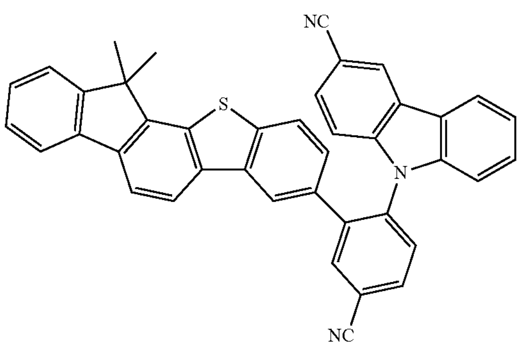
341
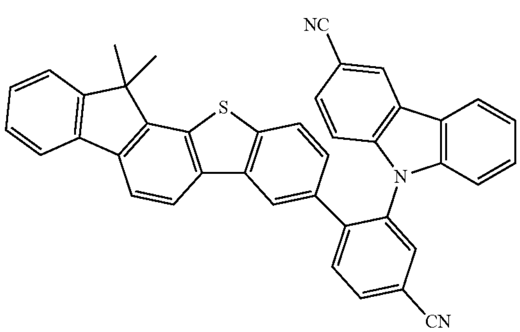
342
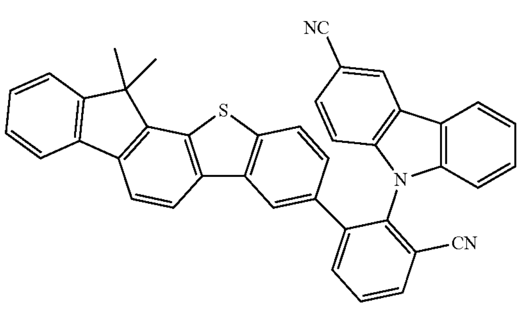
-continued
343
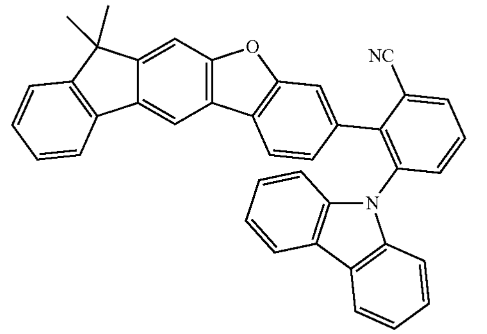
344
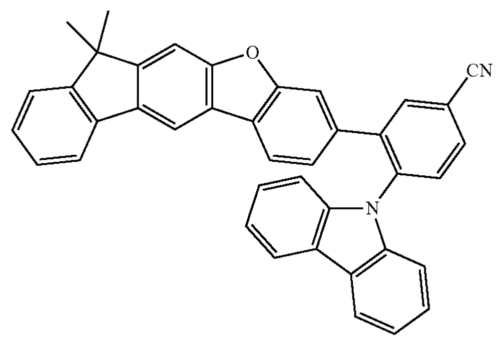
345
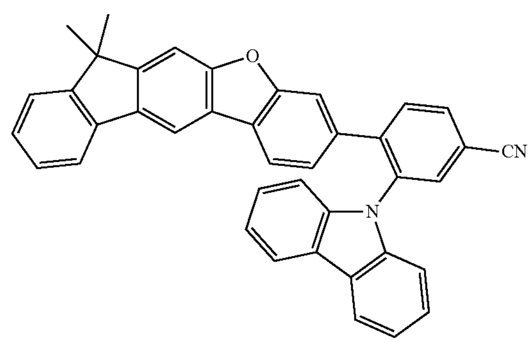
346
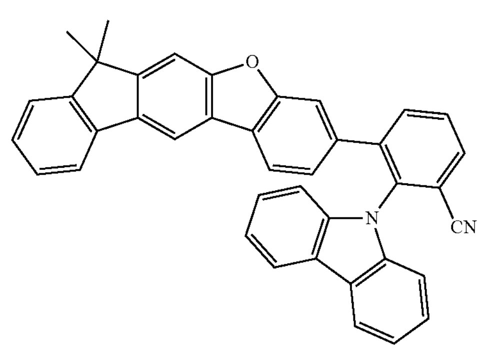

-continued
347
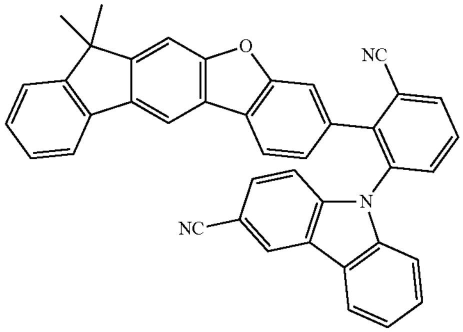
348
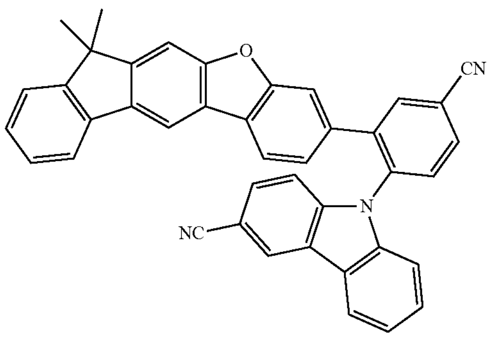
349
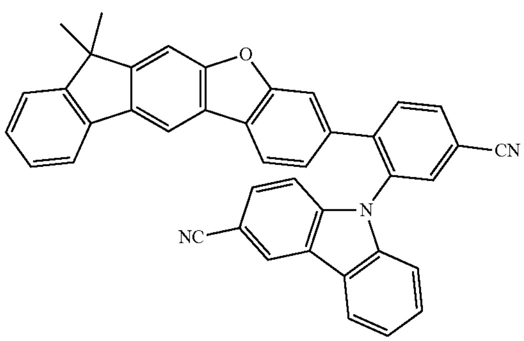
350
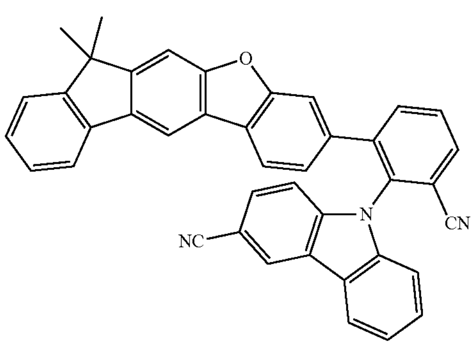
-continued
351
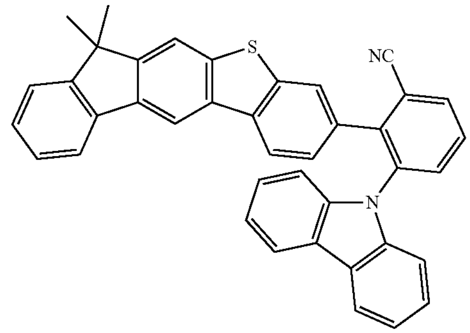
352
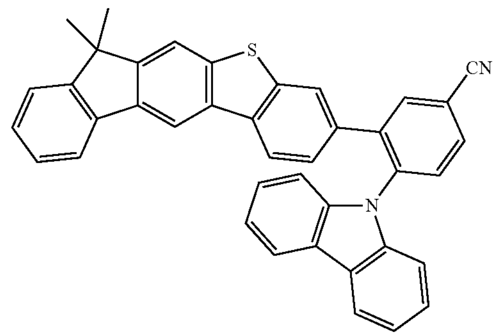
353
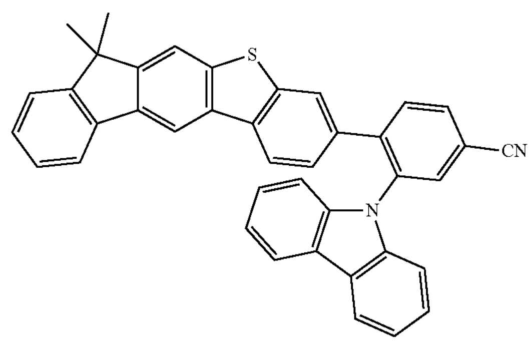
354
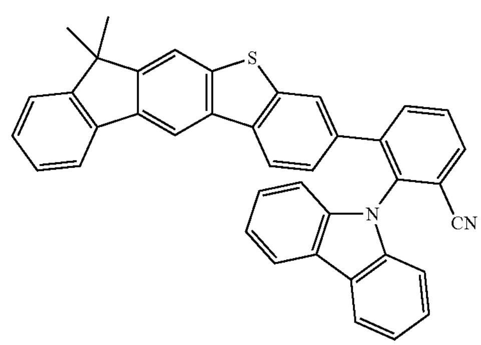

-continued
355
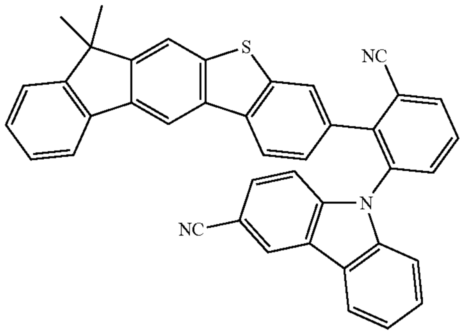
356
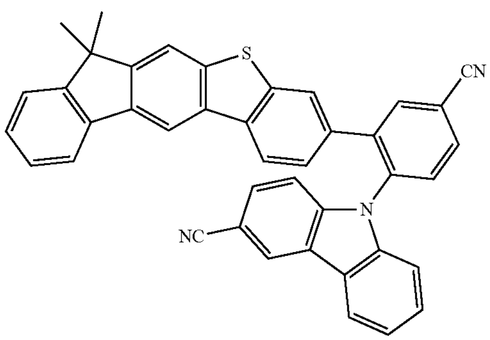
357
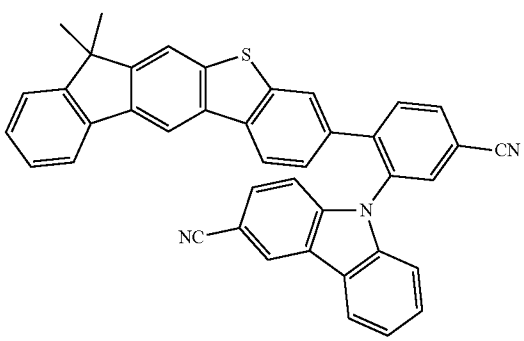
358
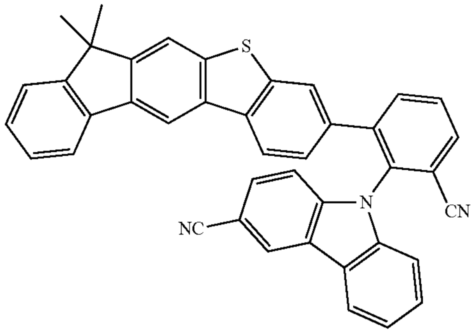
-continued
359
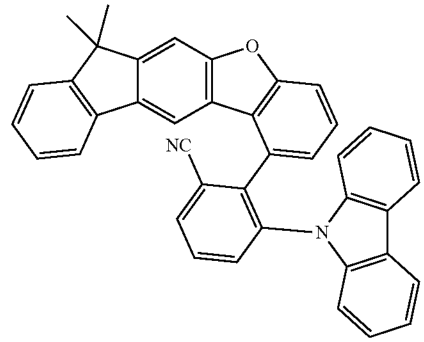
360
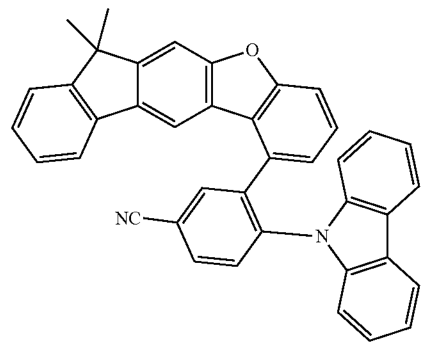
361
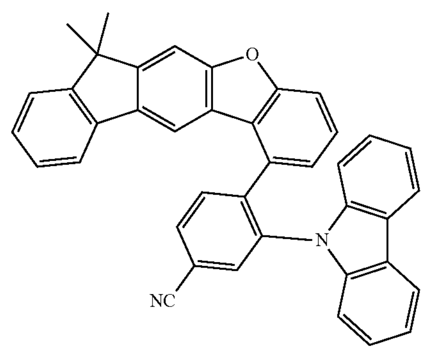
362
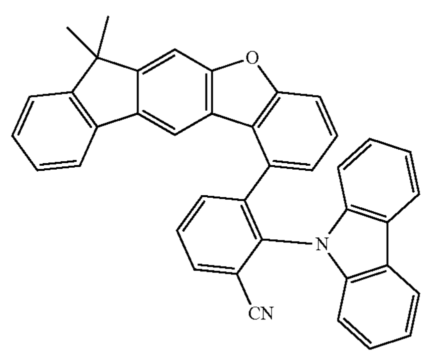

363
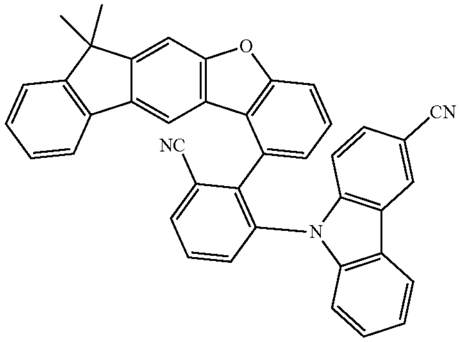
364
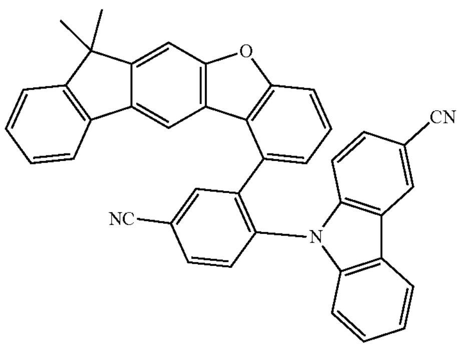
365
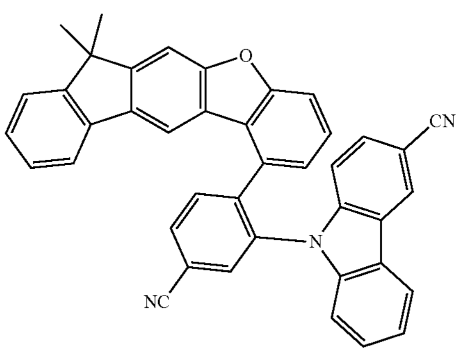
366
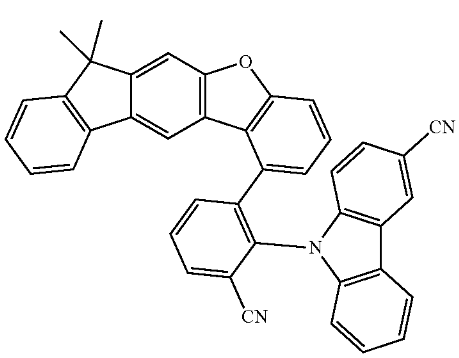
367
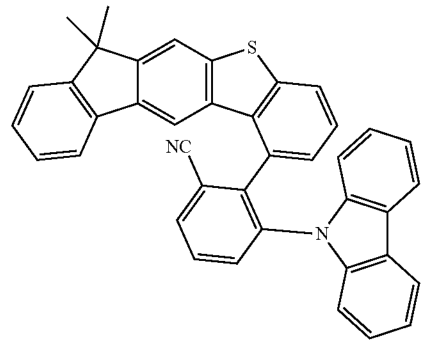
368
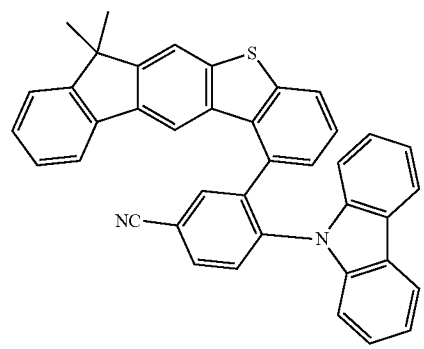
369
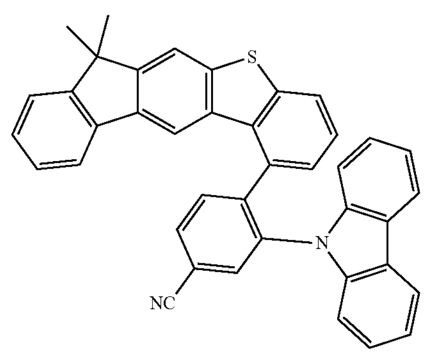
370
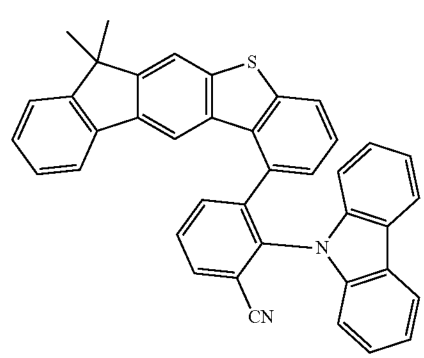

-continued
371
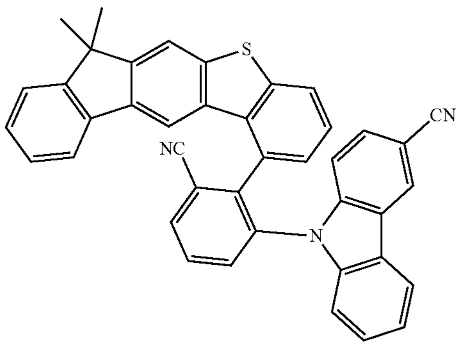
372
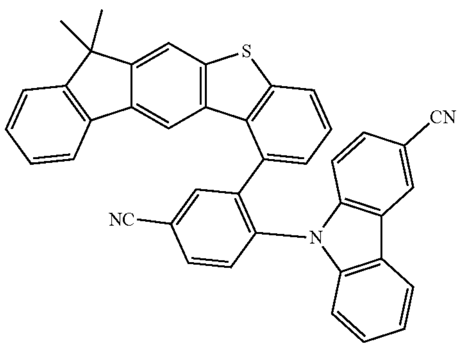
373
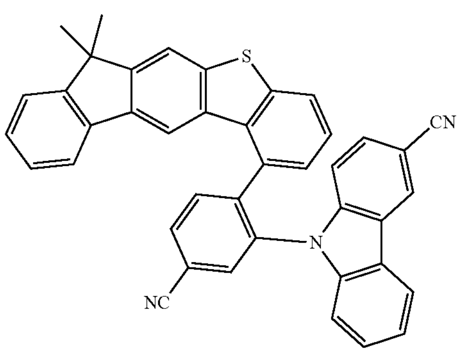
374
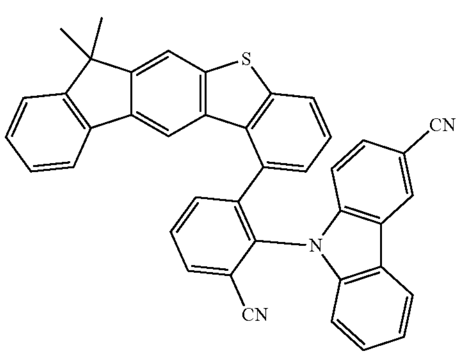
-continued
375
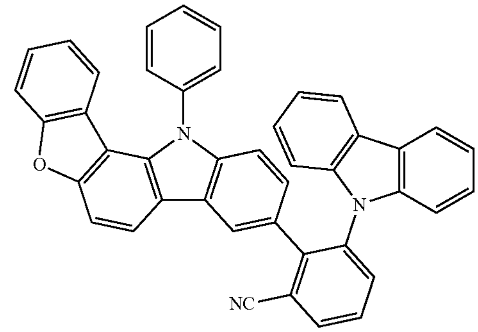
376
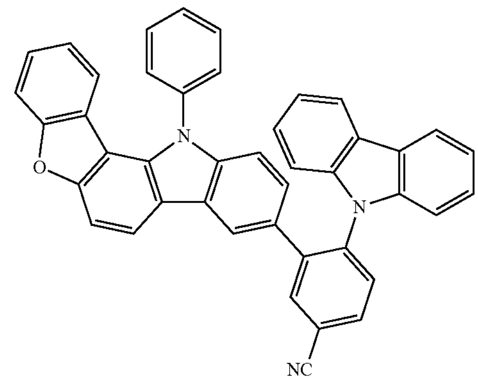
377
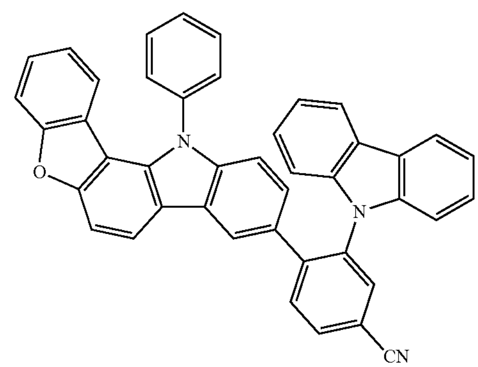
378
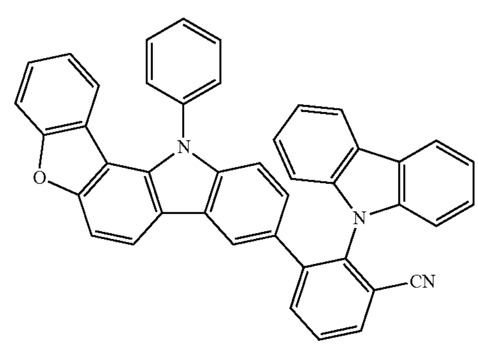

-continued
379
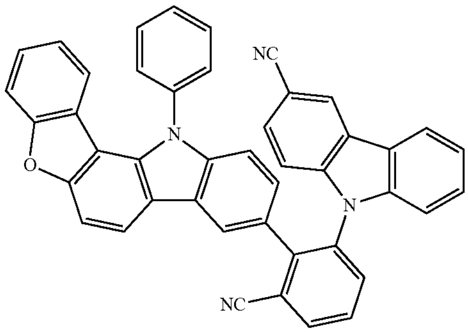
380
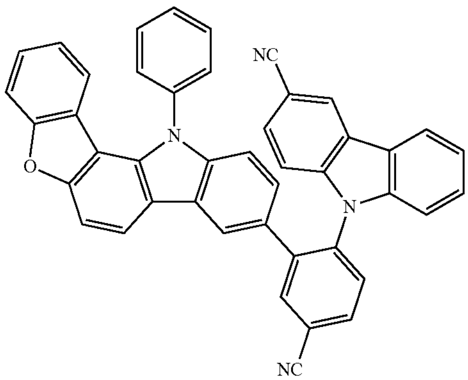
381
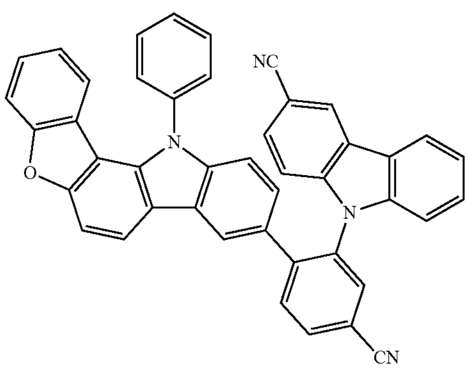
382
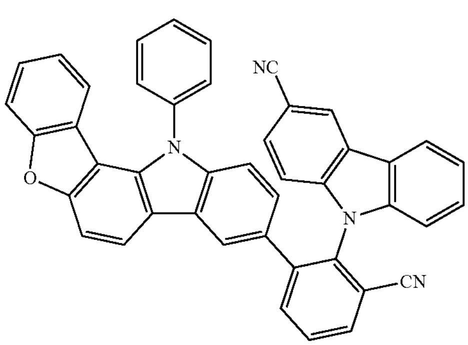
-continued
383
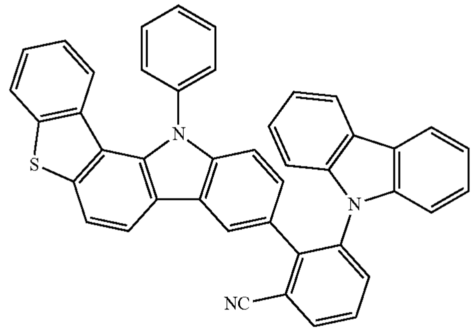
384
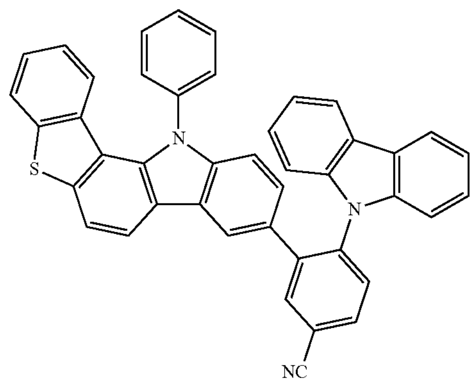
385
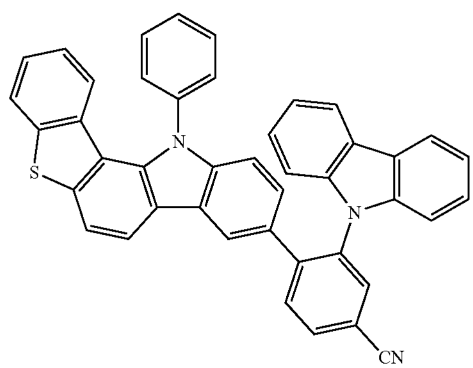
386
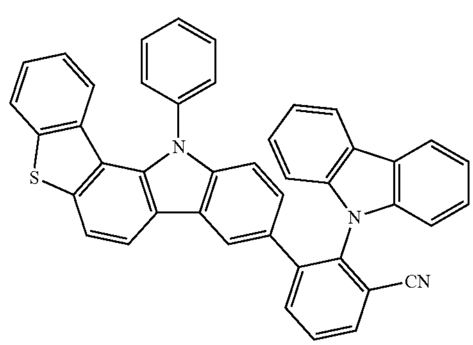

-continued
387
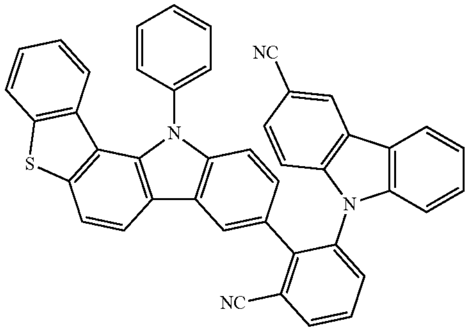
388
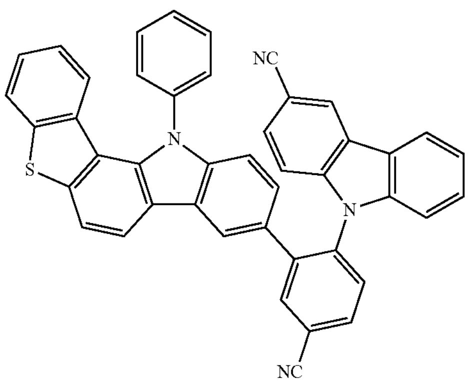
389
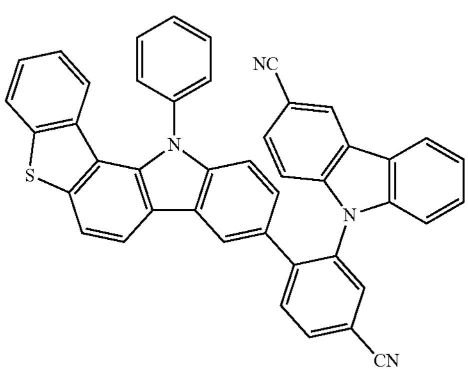
390
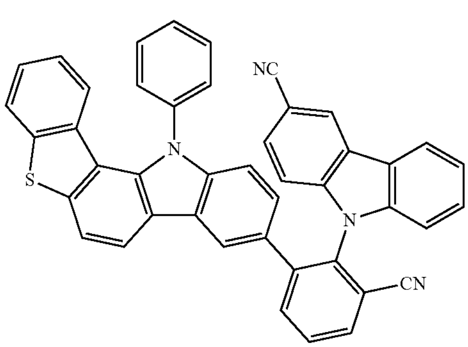
-continued
391
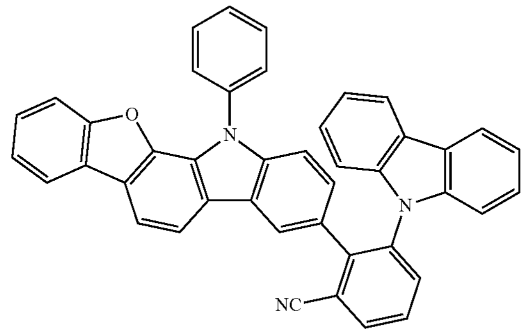
392
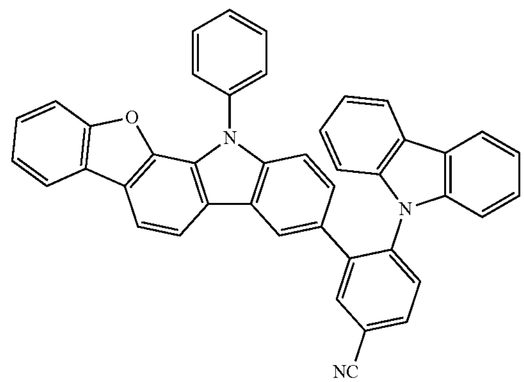
393
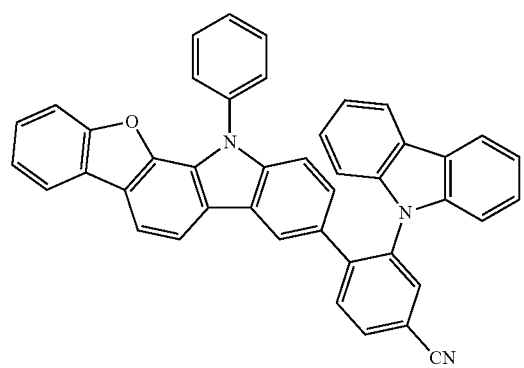
394
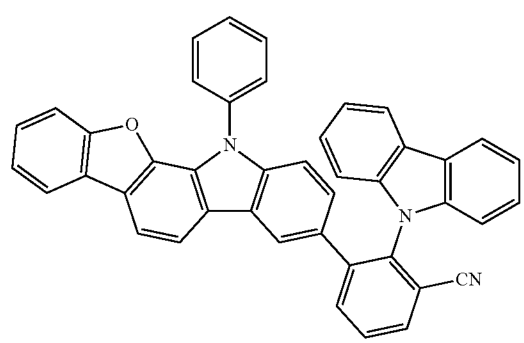

-continued
395
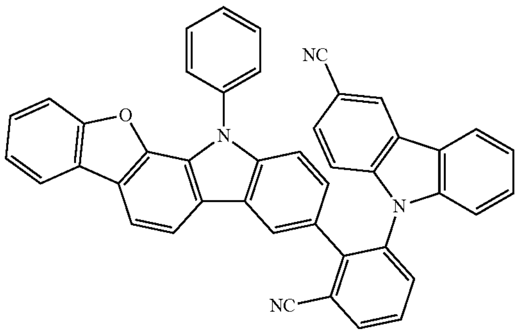
396
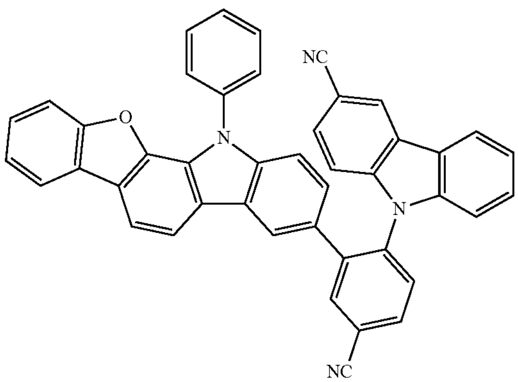
397
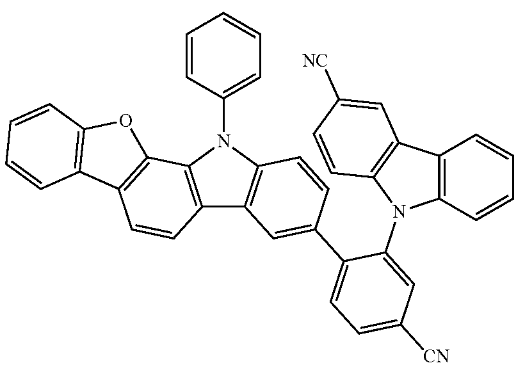
398
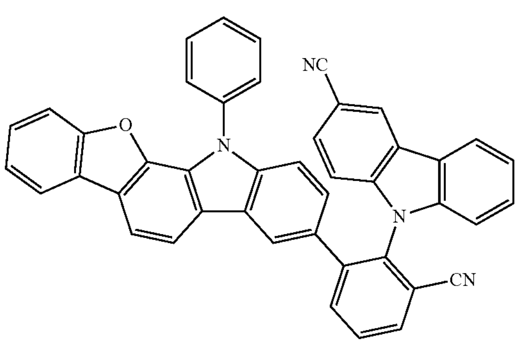
-continued
399
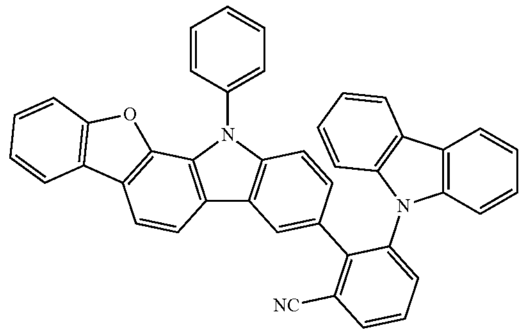
400
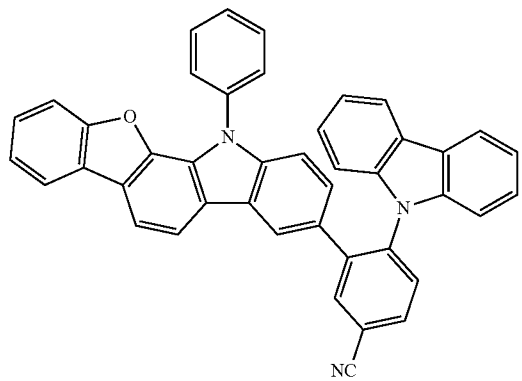
401
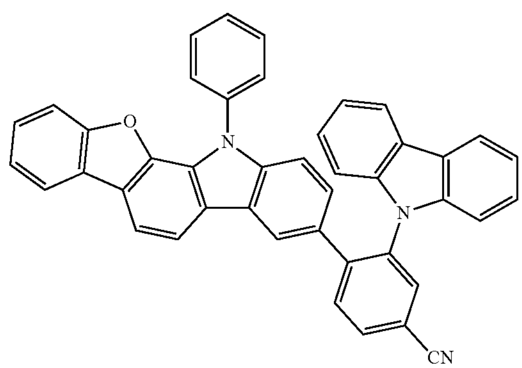
402
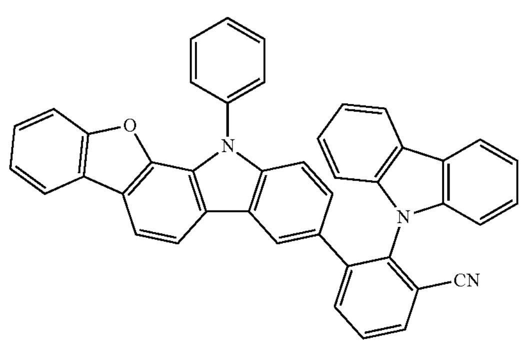

-continued
403
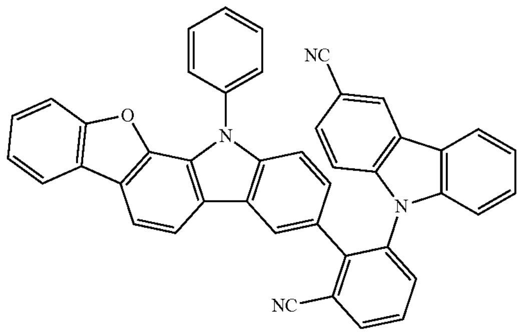
404
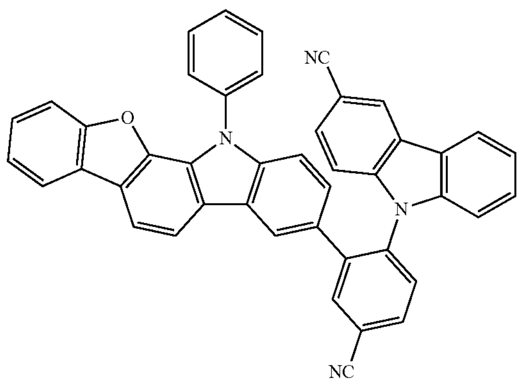
405
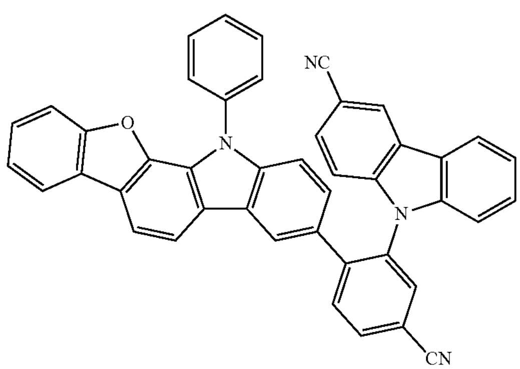
406
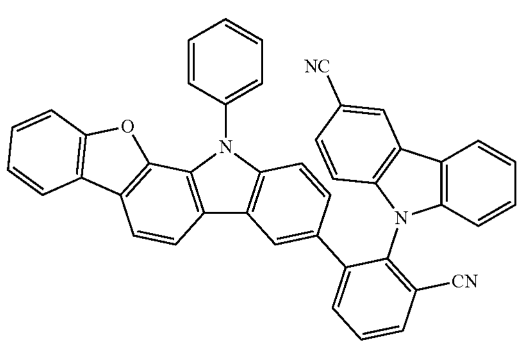
-continued
407
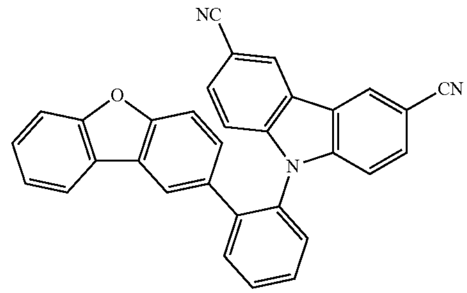
408
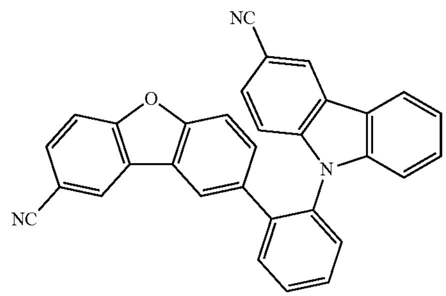
409
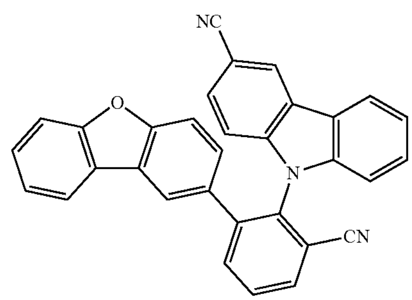
410
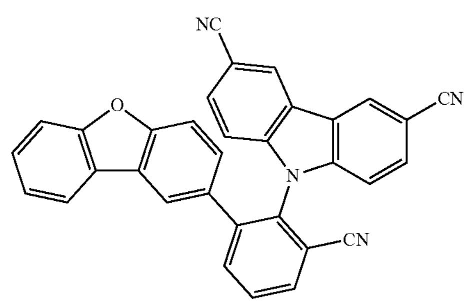
411
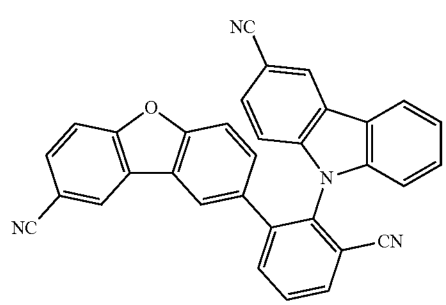

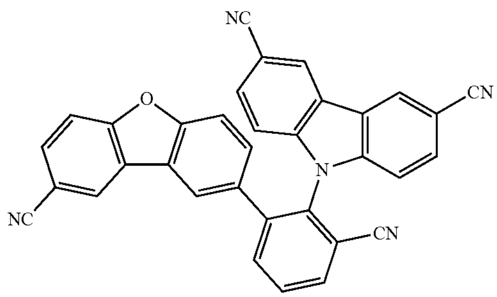
412
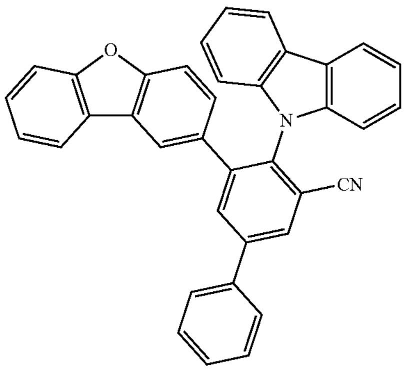
413
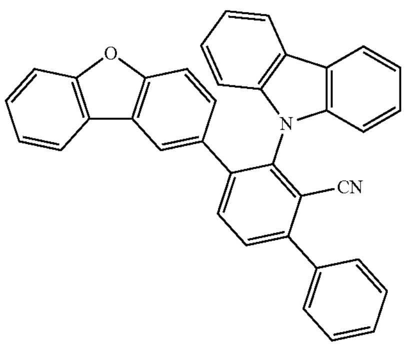
414
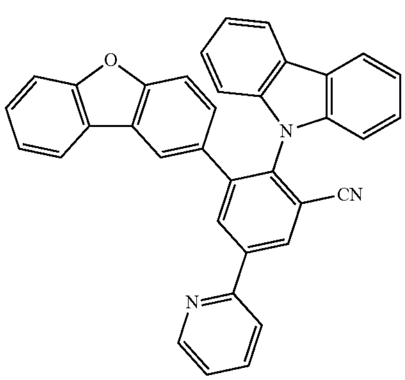
415
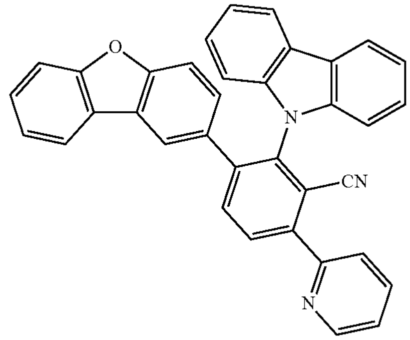
416
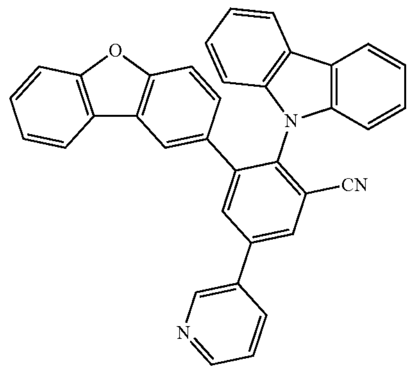
417
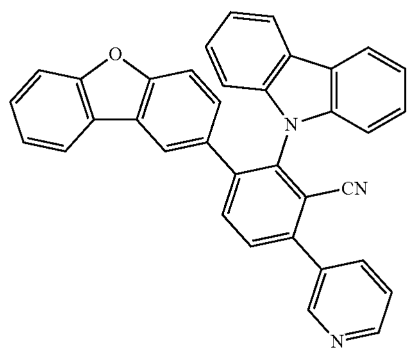
418
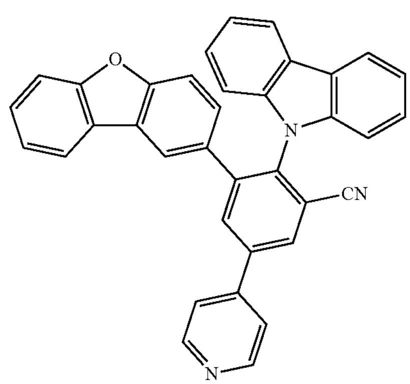
419

420
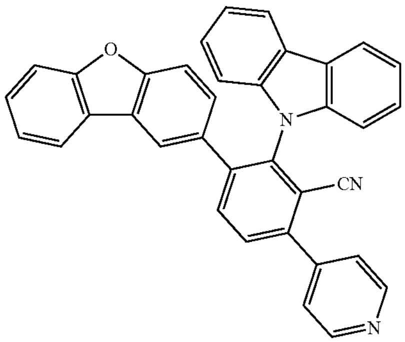
421
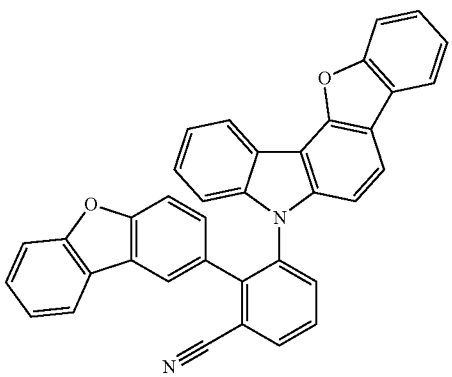
422
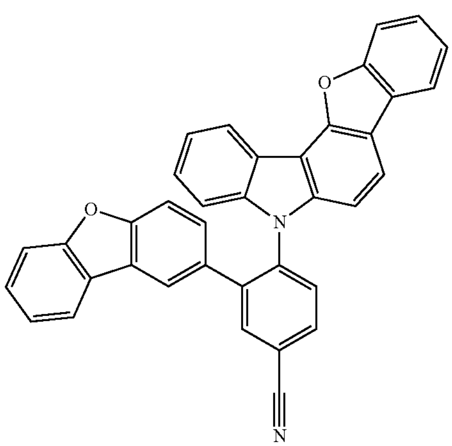
423
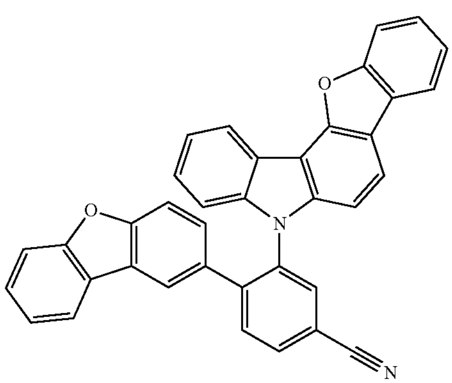
424
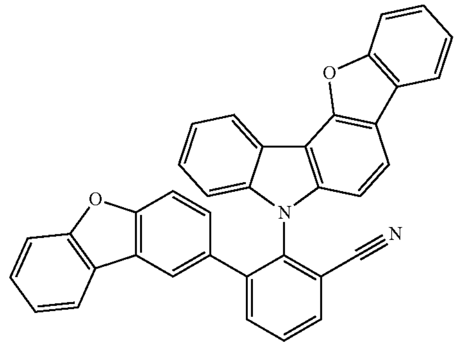
425
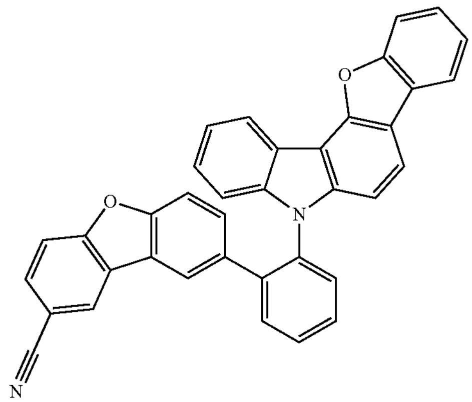
426
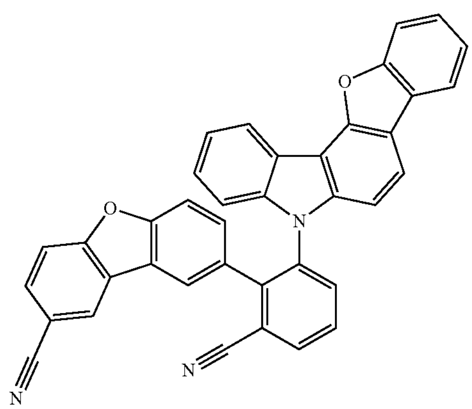
427
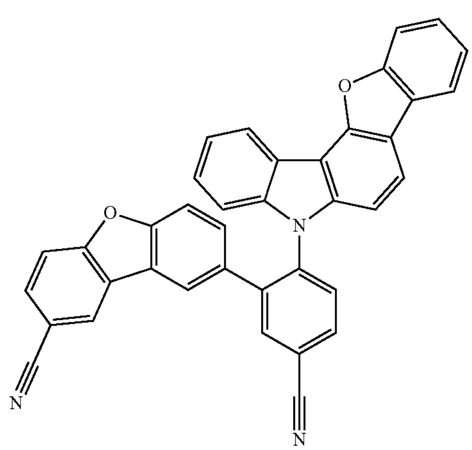

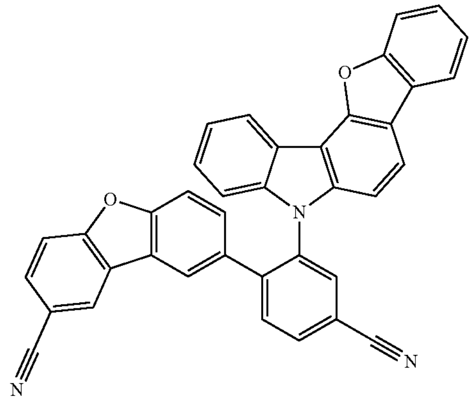
428
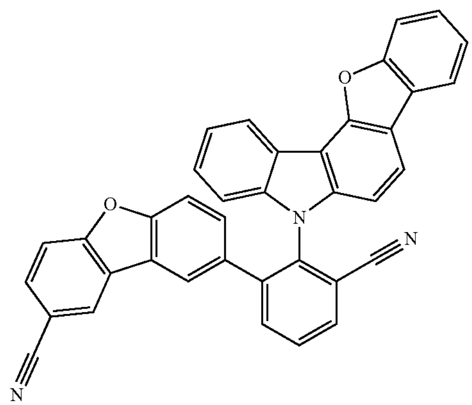
429
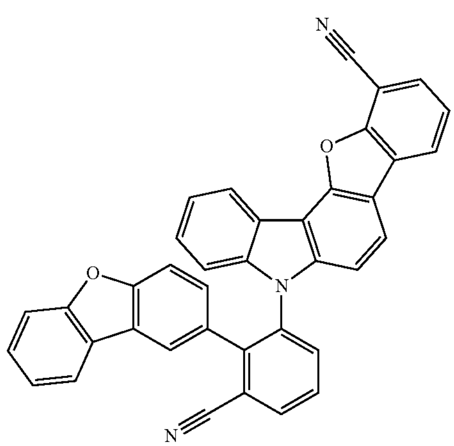
430
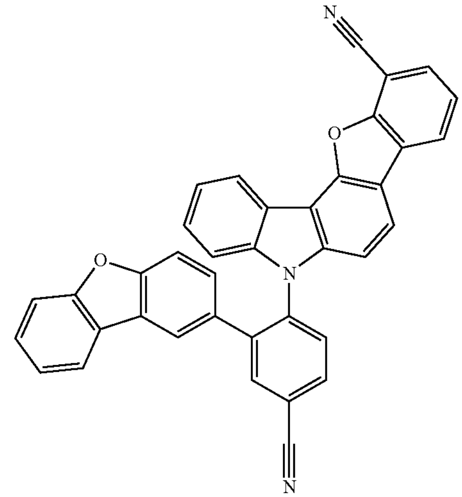
431
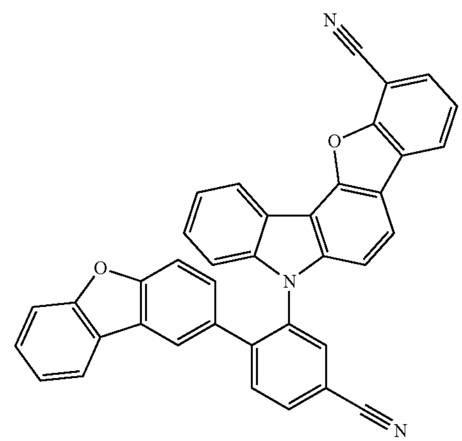
432
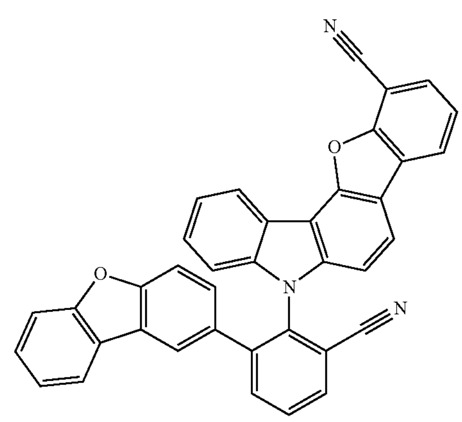
433

-continued
434
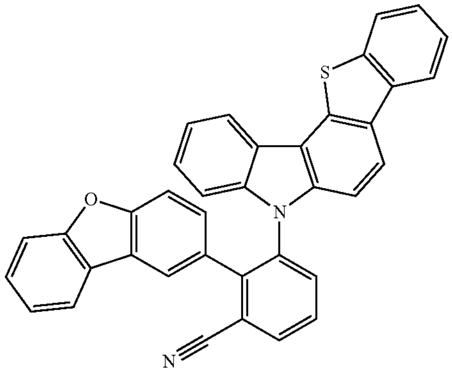
435
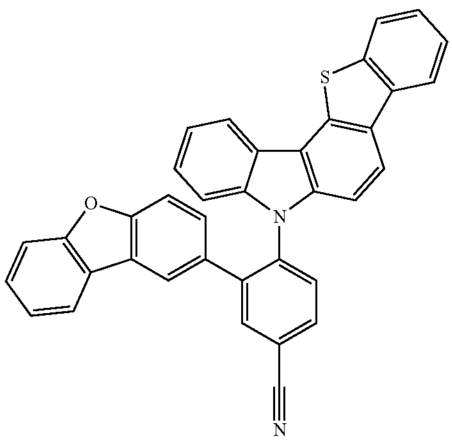
436
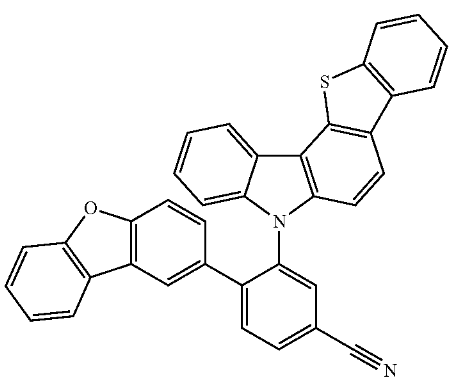
437
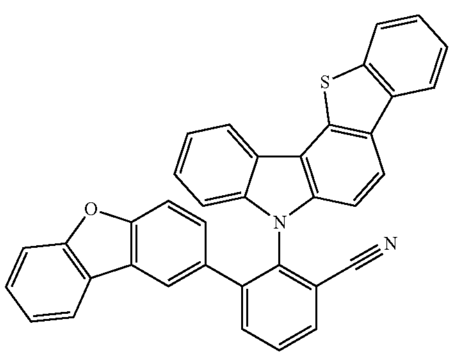
-continued
438
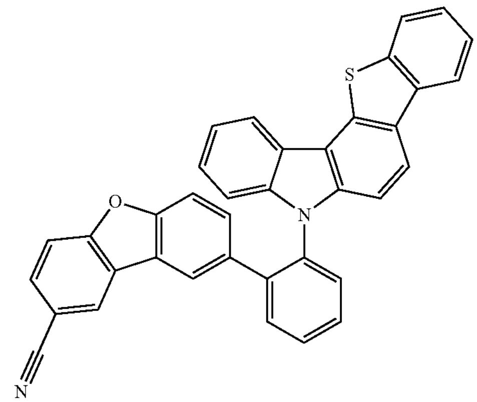
439
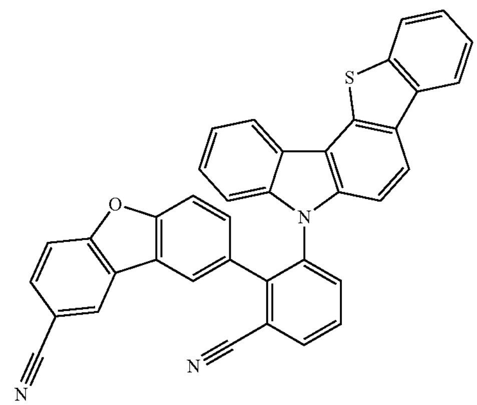
440
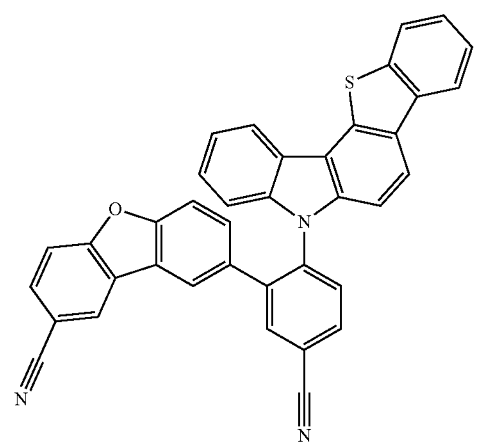
441
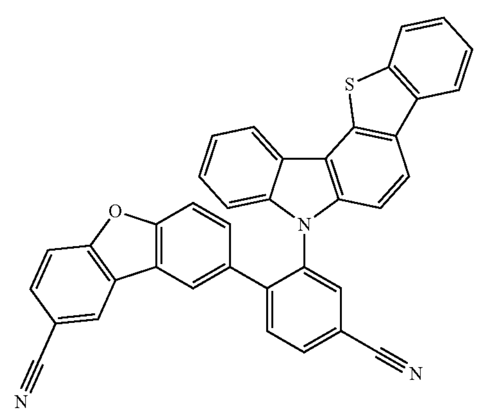

-continued
442
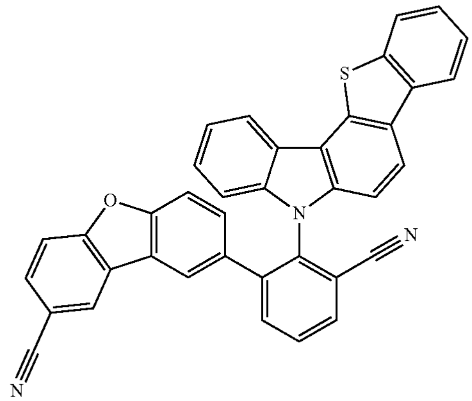
443
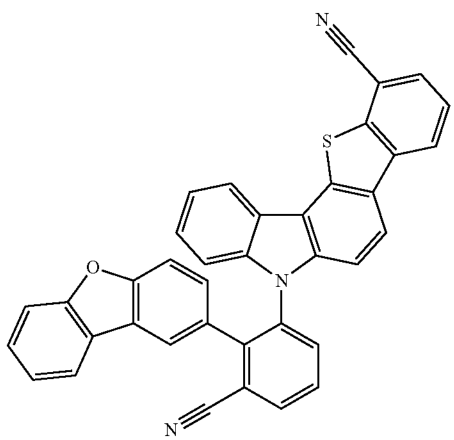
444
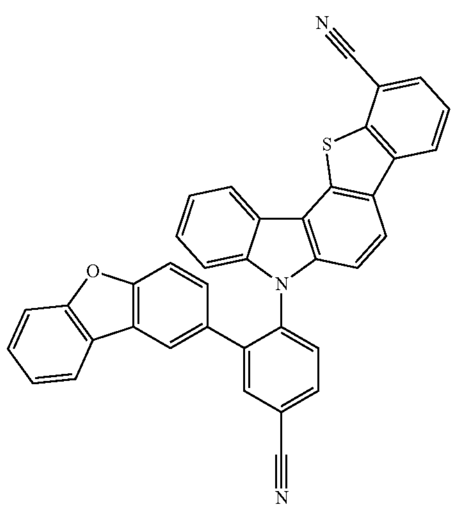
-continued
445
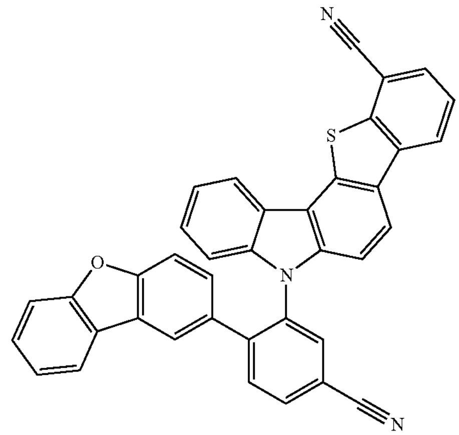
446
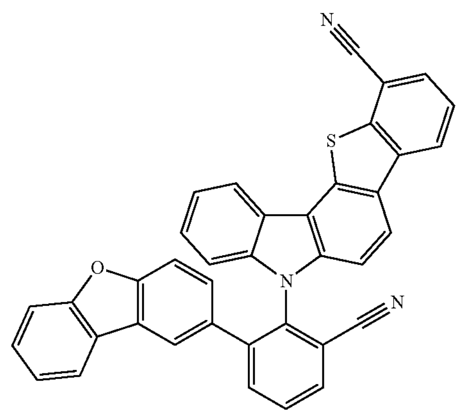
447
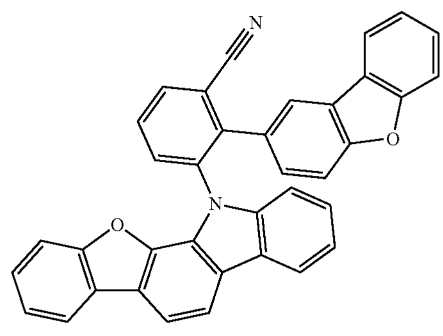
448
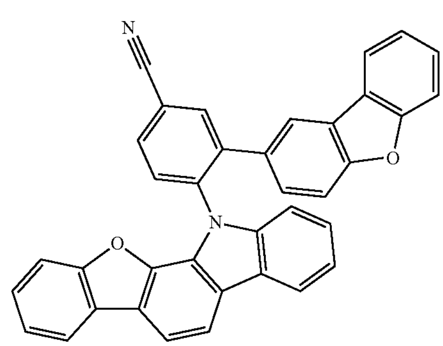

449
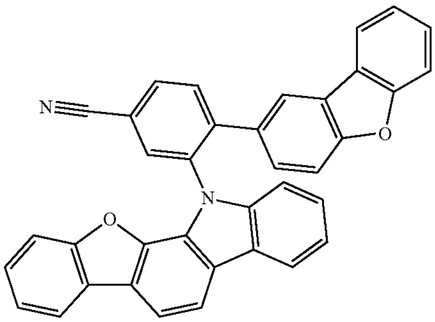
450
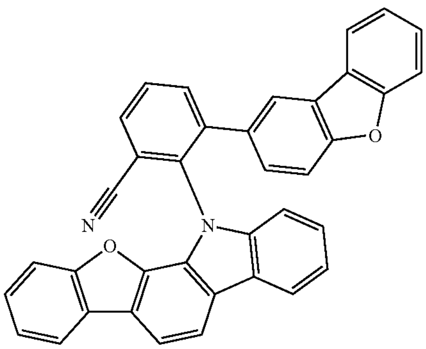
451
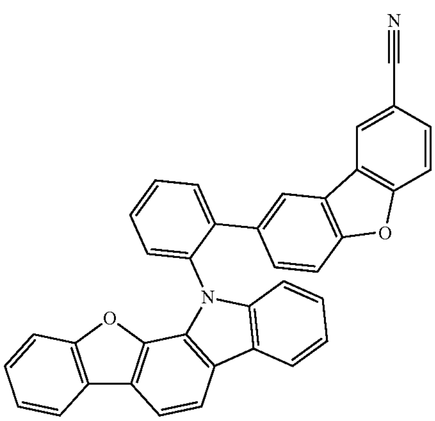
452
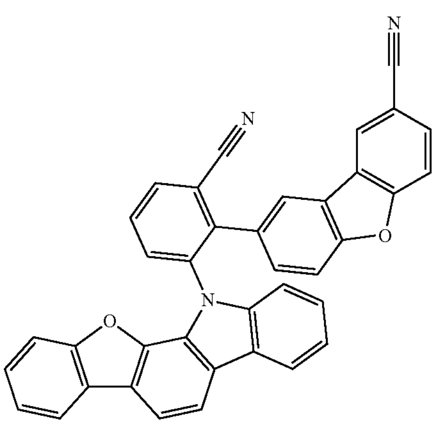
453
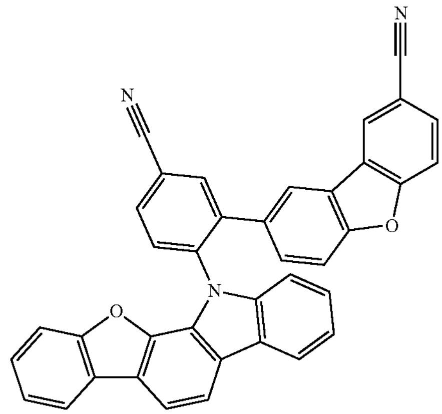
454
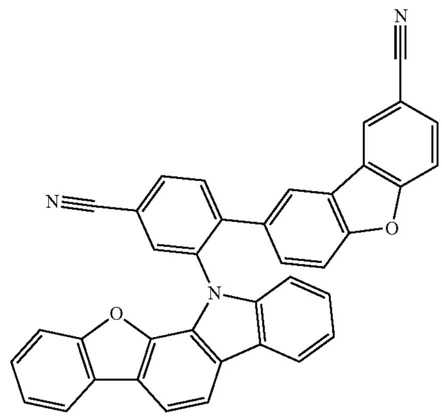
455
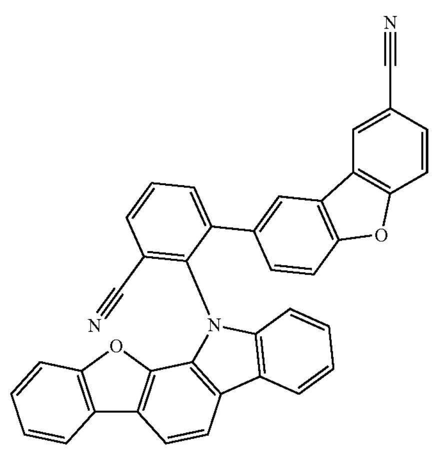
456
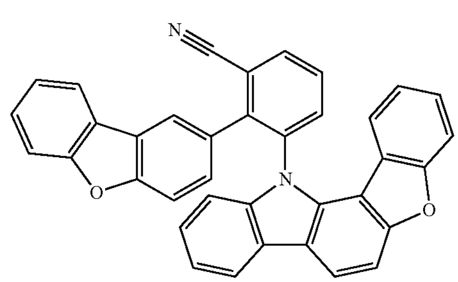

-continued
457
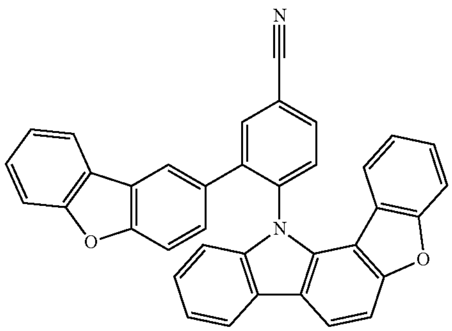
458
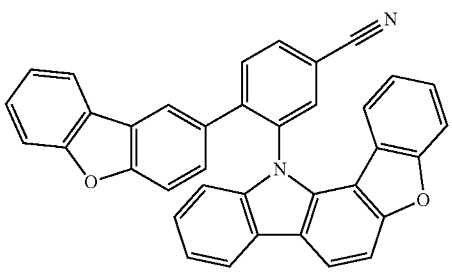
459
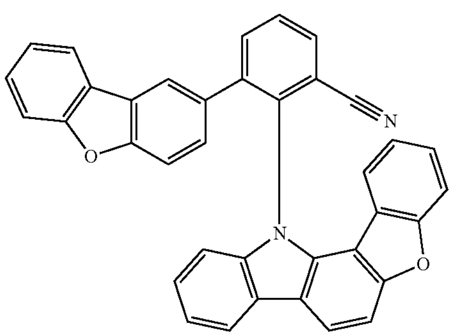
460
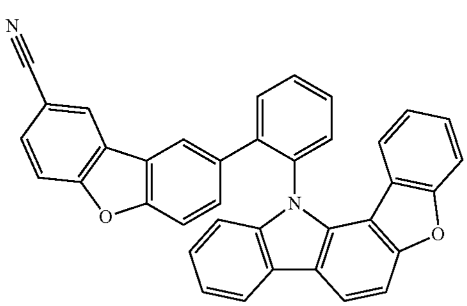
461
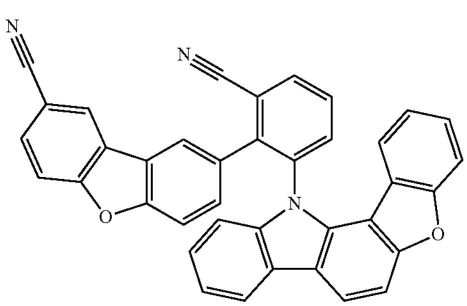
-continued
462
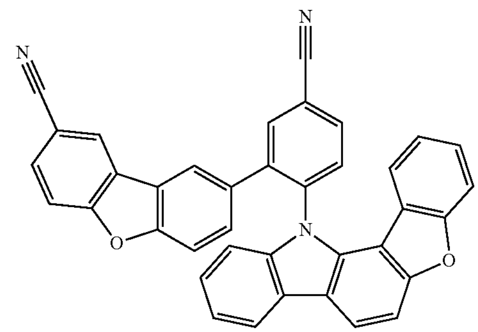
463
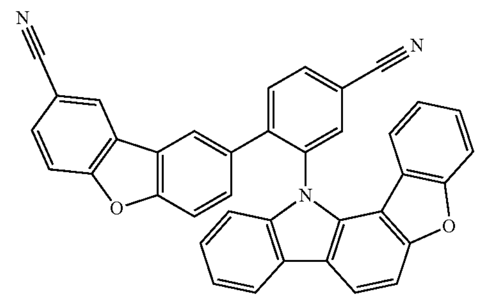
464
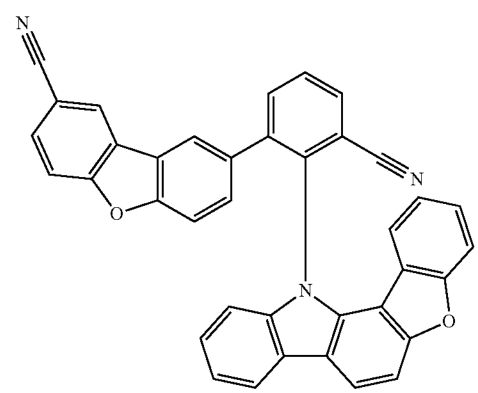
465
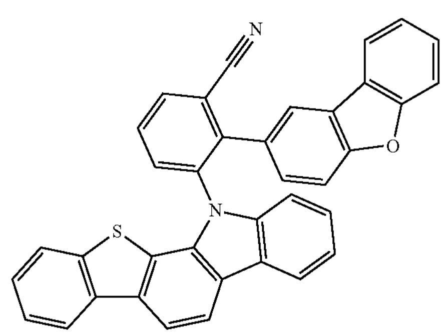

466
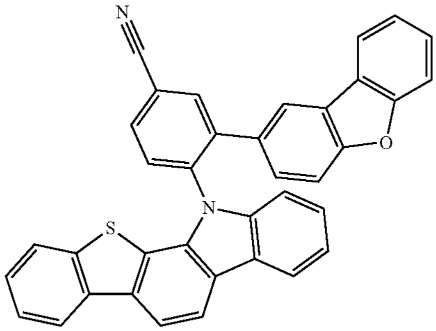
467
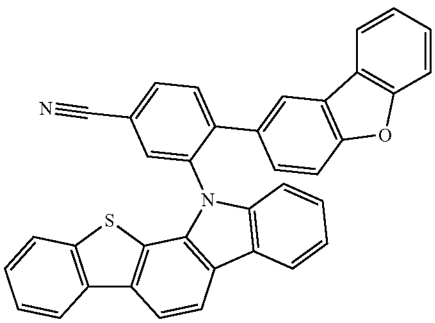
468
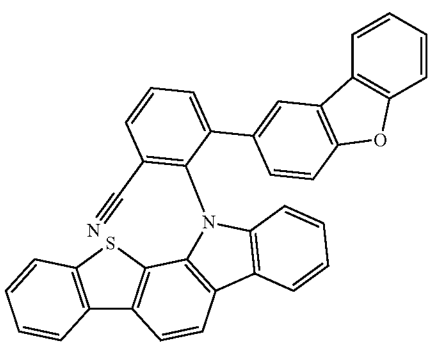
469
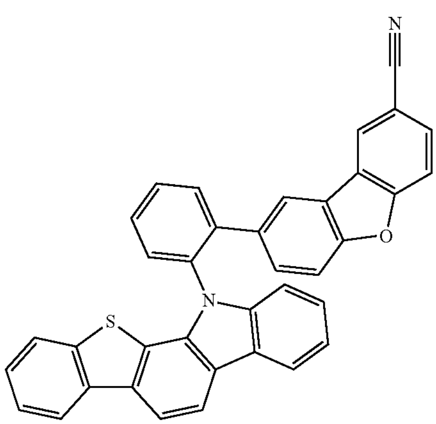
470
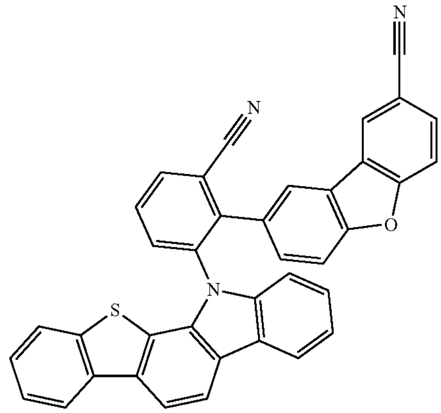
471
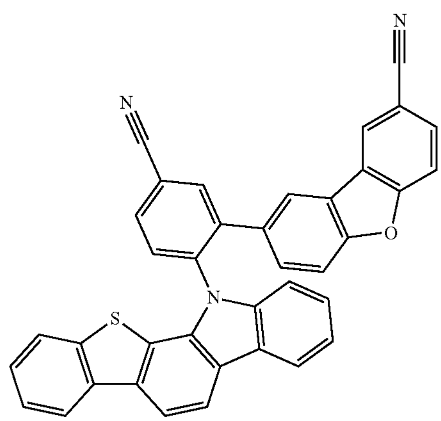
472
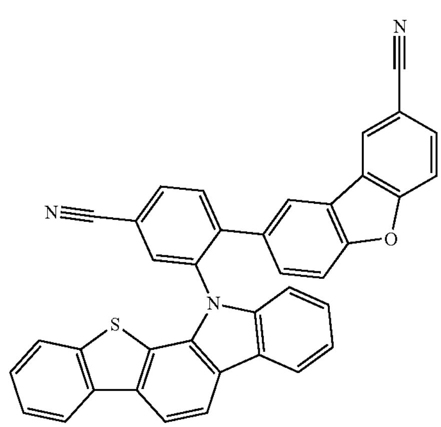

-continued
473
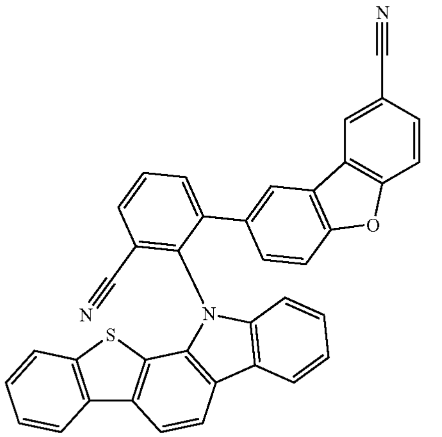
474
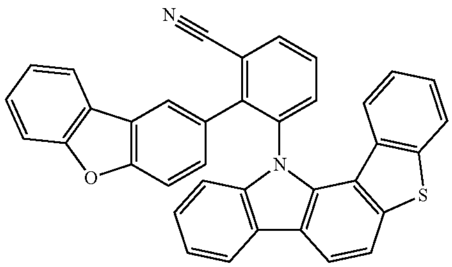
475
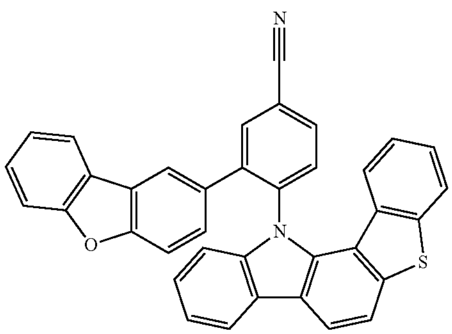
476
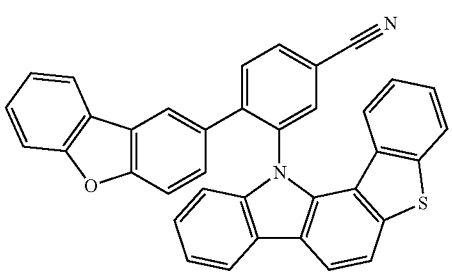
477
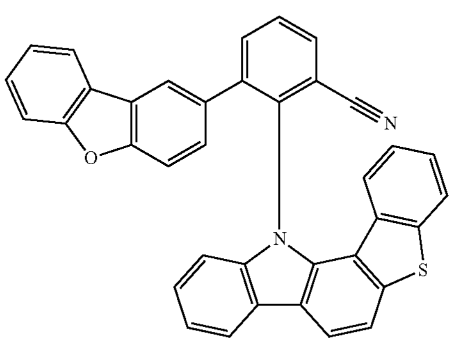
-continued
478
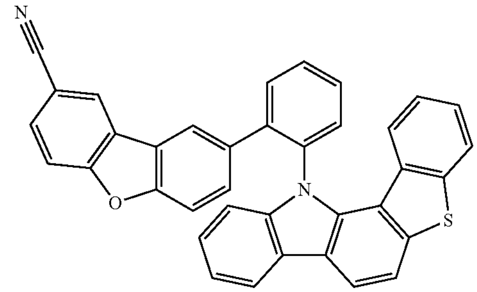
479
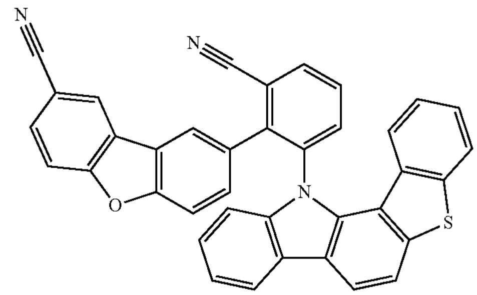
480
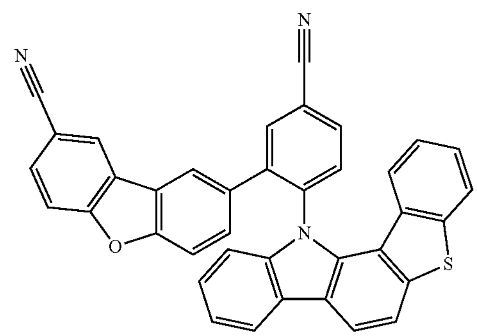
481
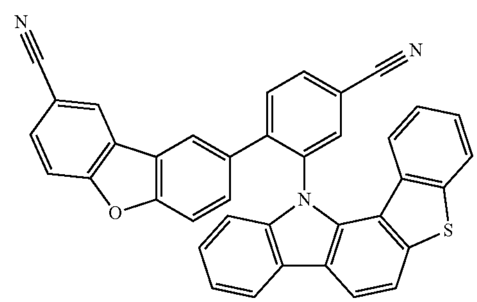
482
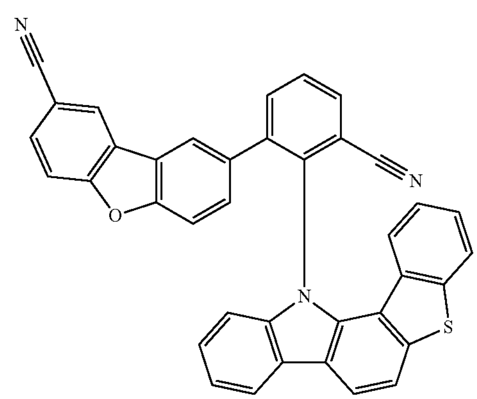

-continued
Group HE4
1
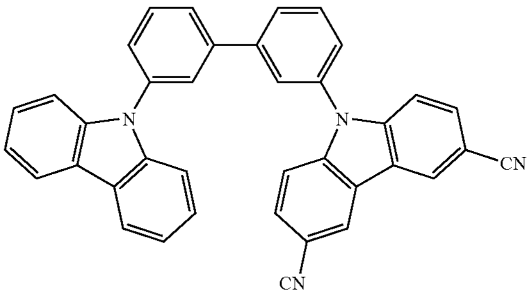
2
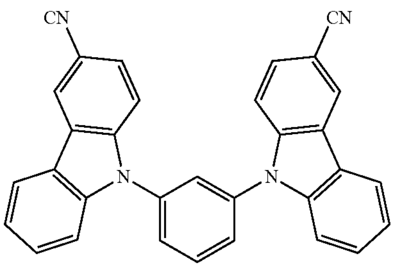
3
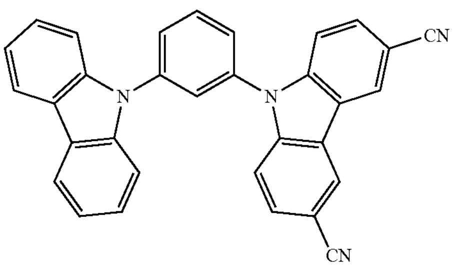
4
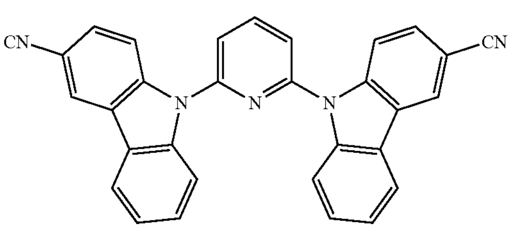
5
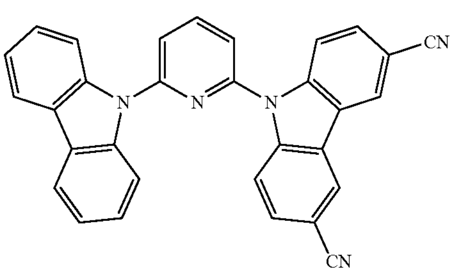
6
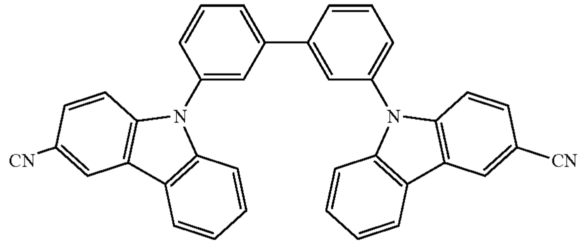
7
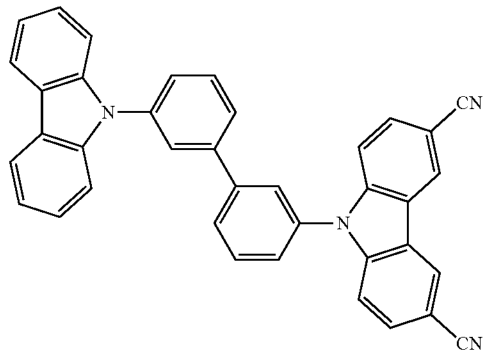
8
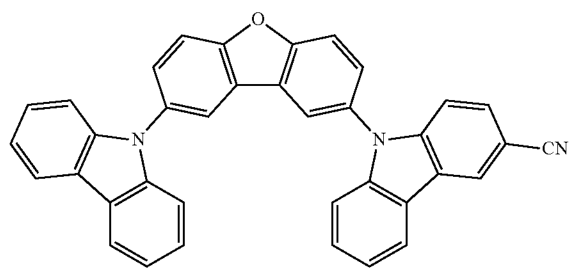
9
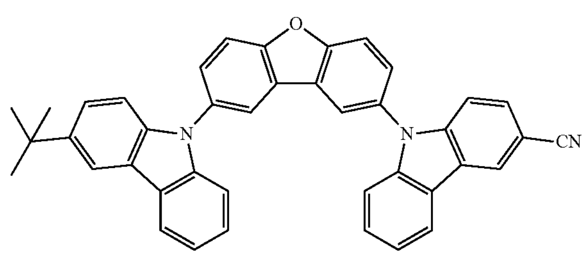
10
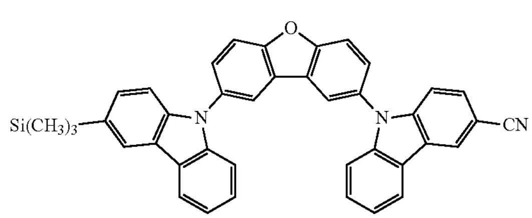

-continued
11
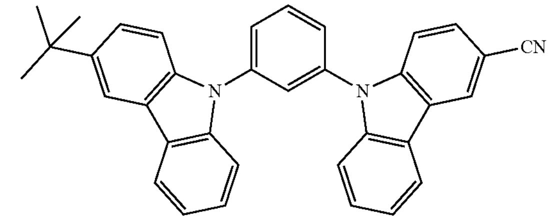
12
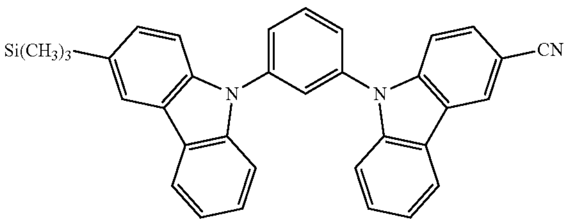
13
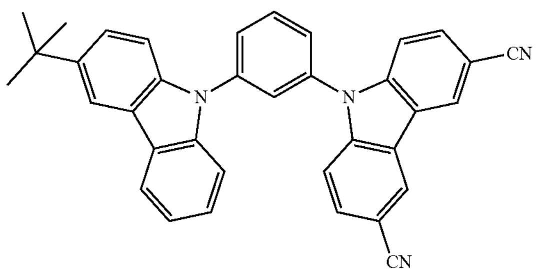
14
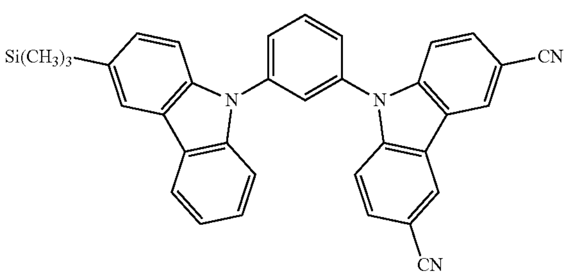
15
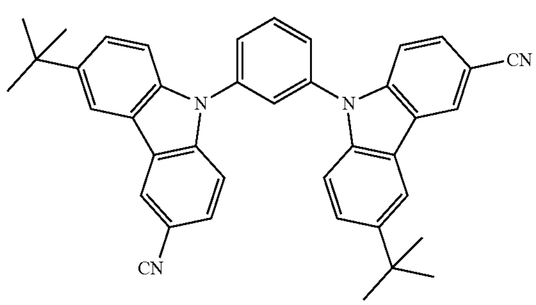
-continued
16
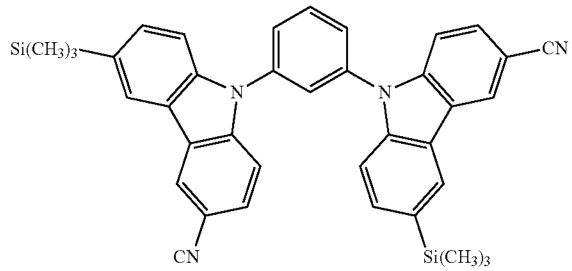
17
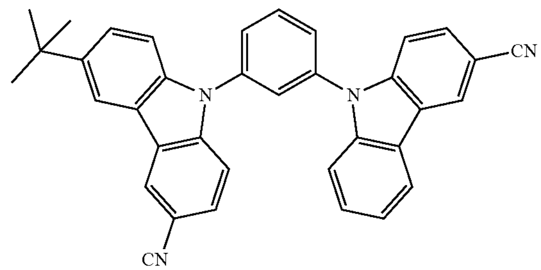
18
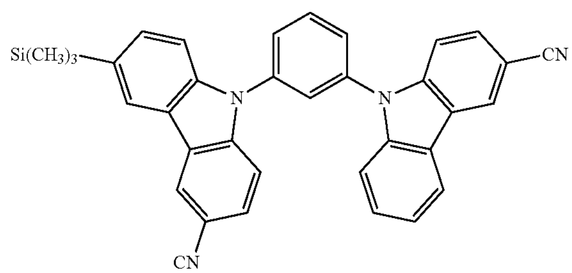
19
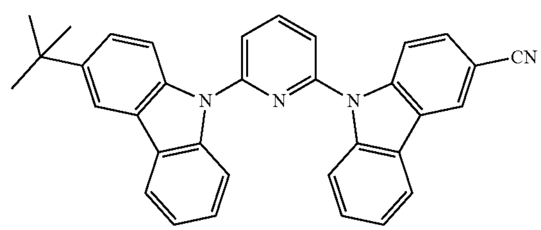
20
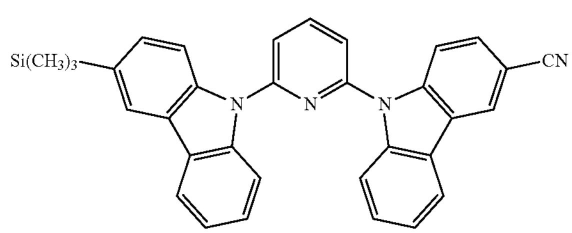

-continued
21
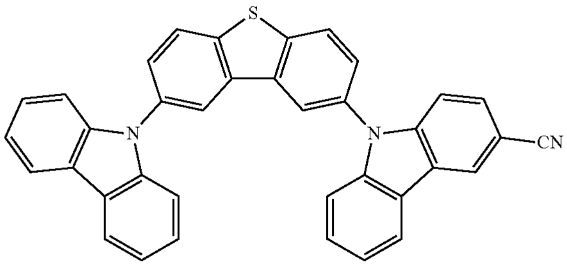
22
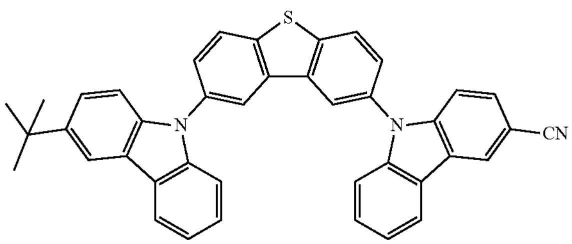
23
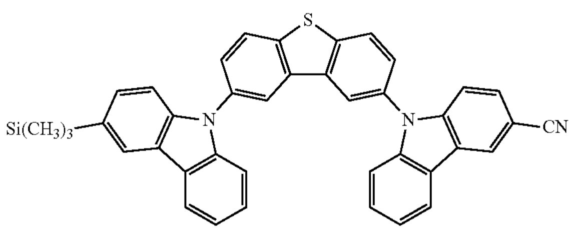
24
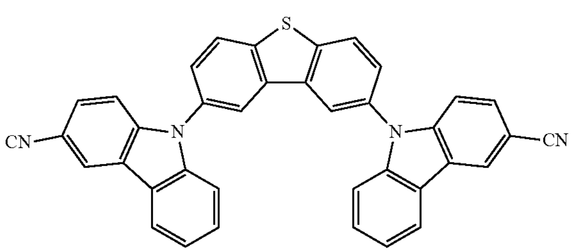
25
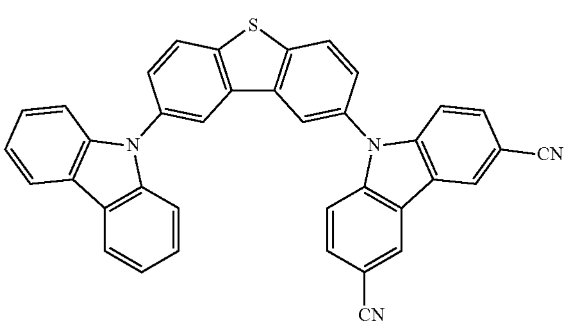
-continued
26
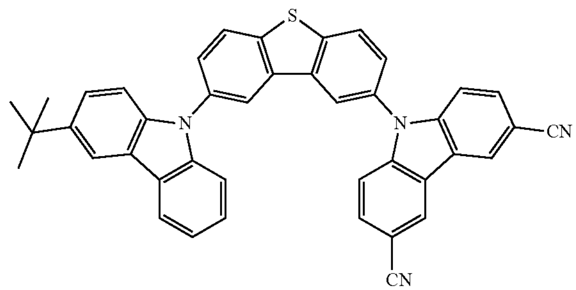
27
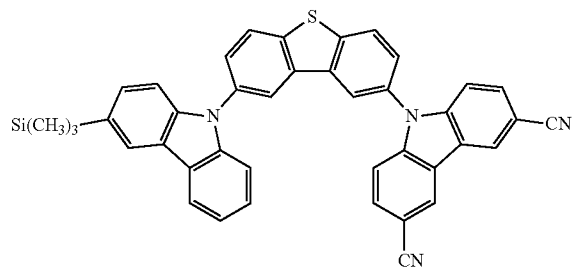
28
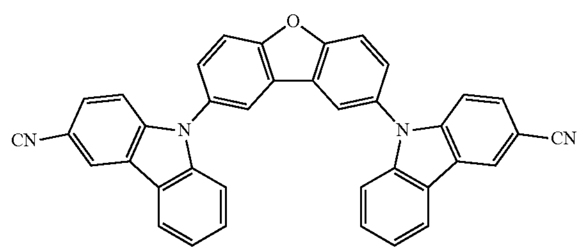
29
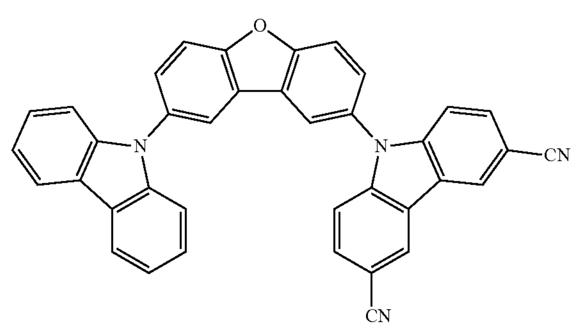
30
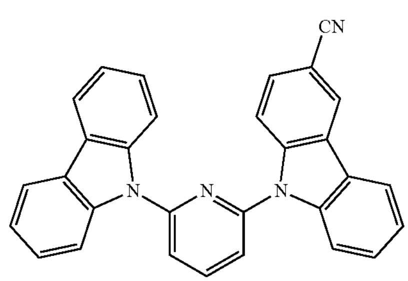

-continued
31
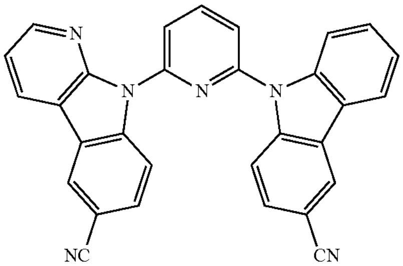
32
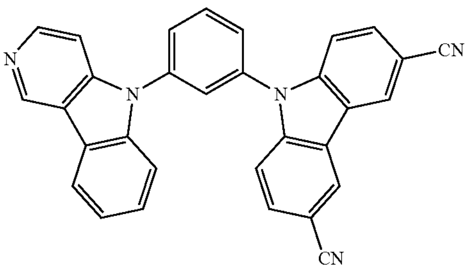
33
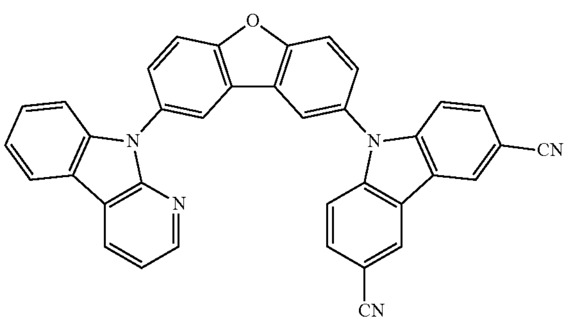
34
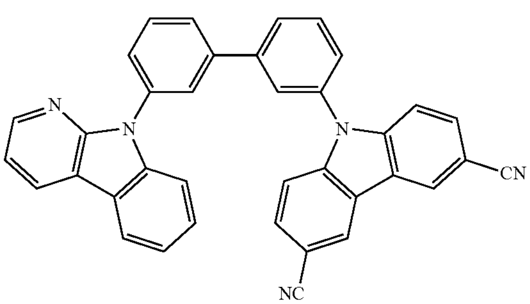
35
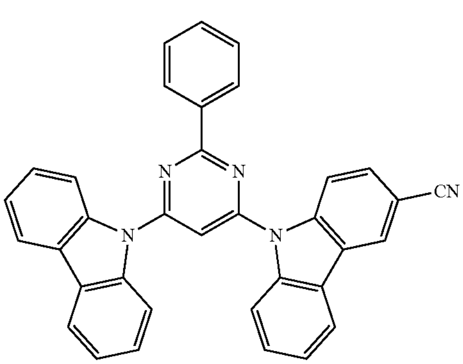
-continued
36
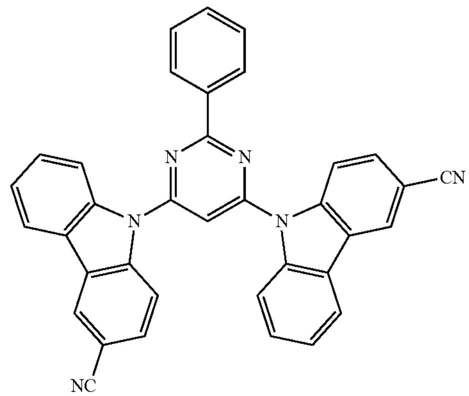
37
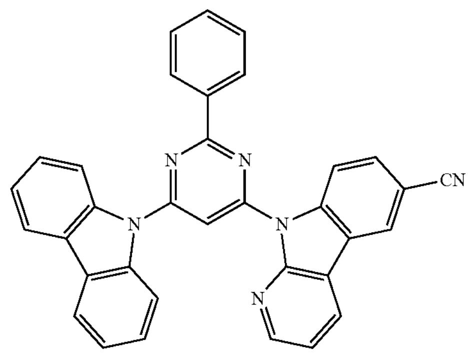
38
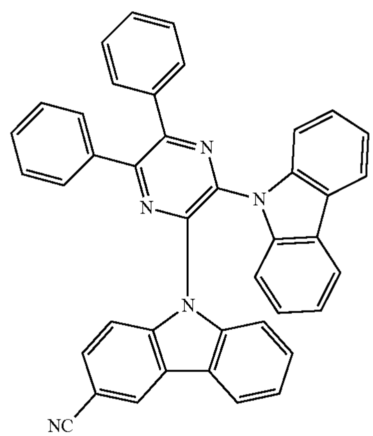
39
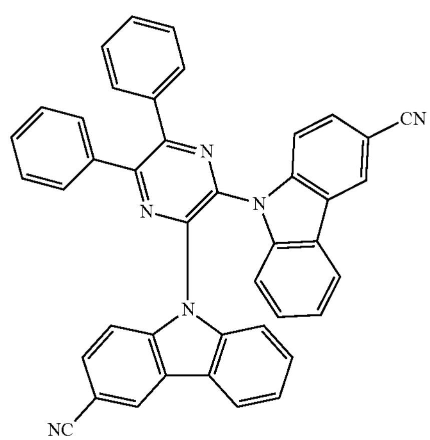

40
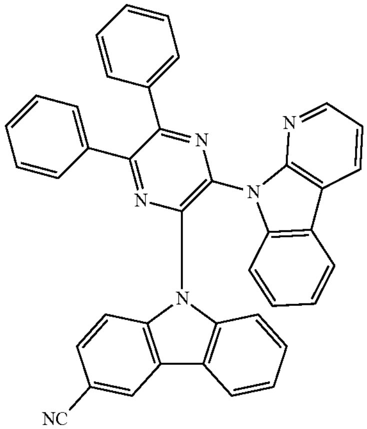
41
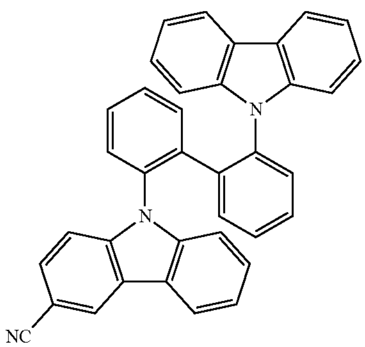
42
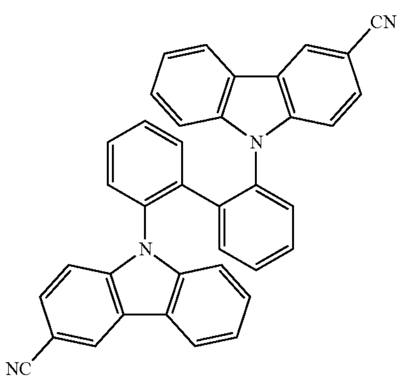
43
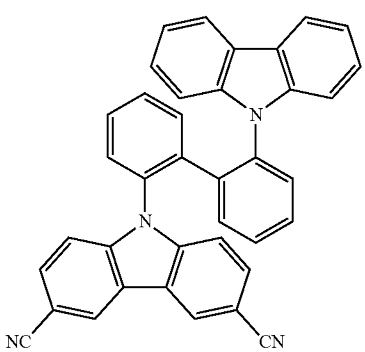
44
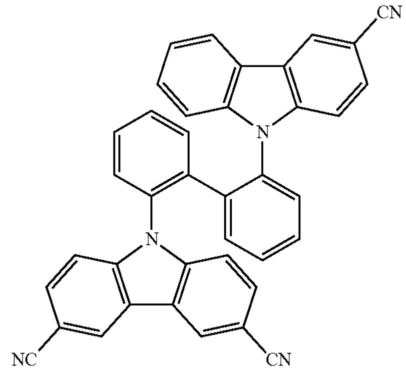
45
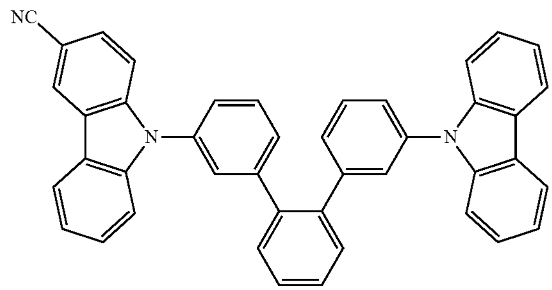
46
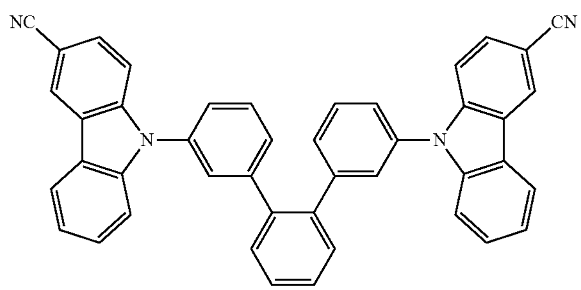
47
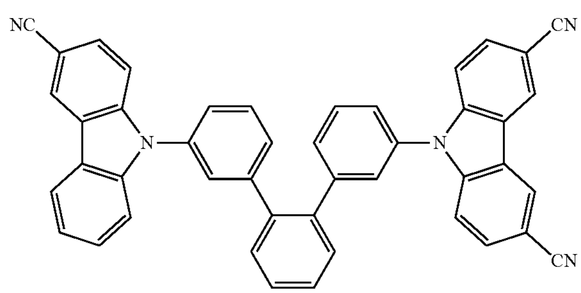
48
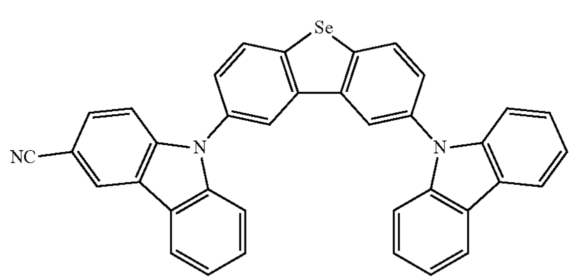

49
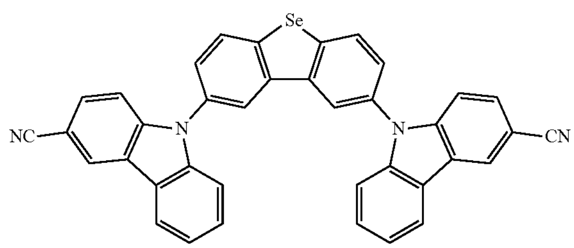
50
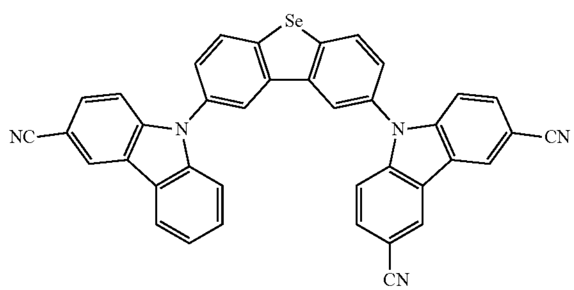
51
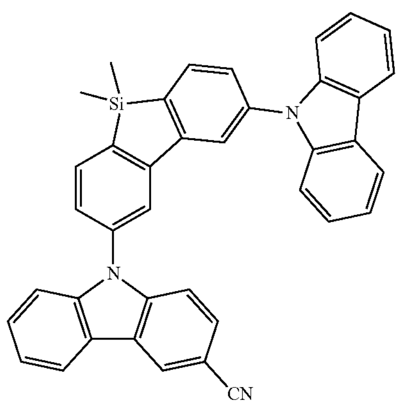
52
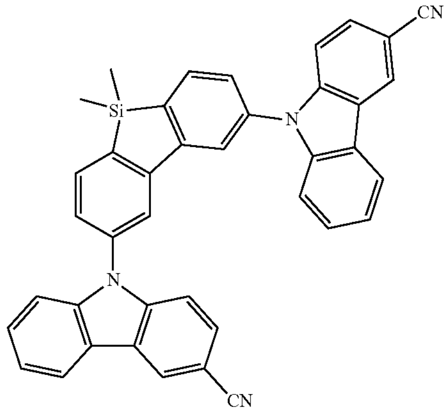
53
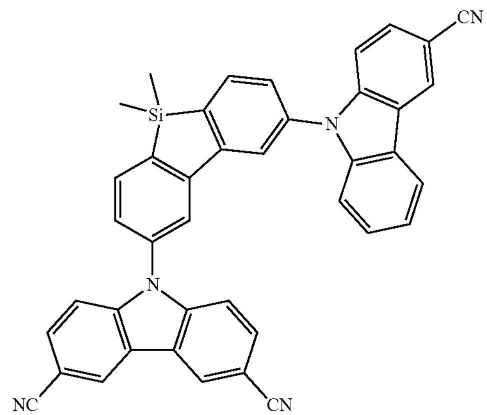
54
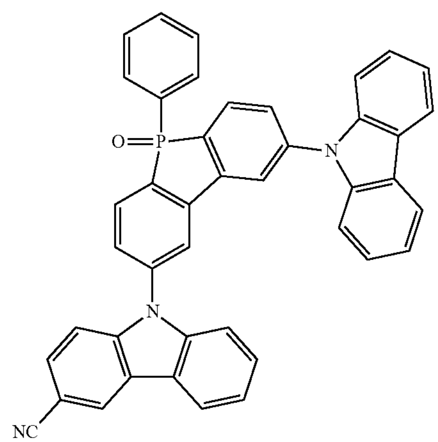
55
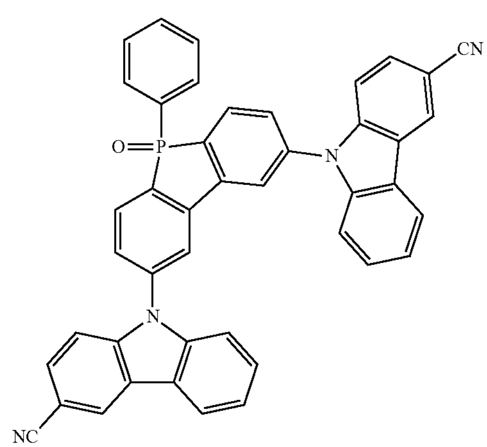

56
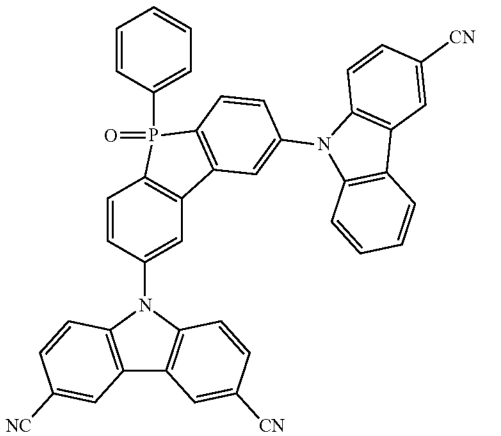
Group HE5
1
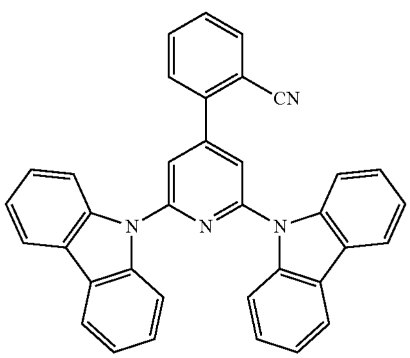
2
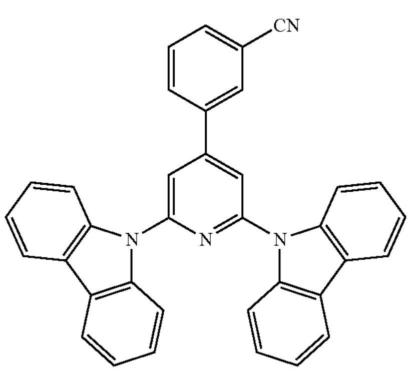
3
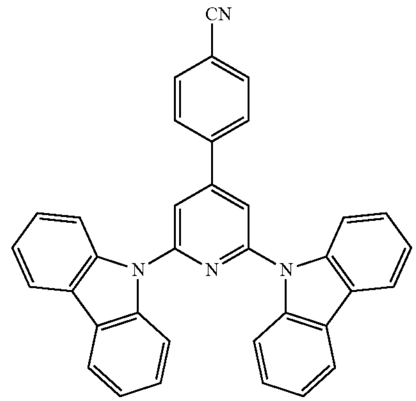
4
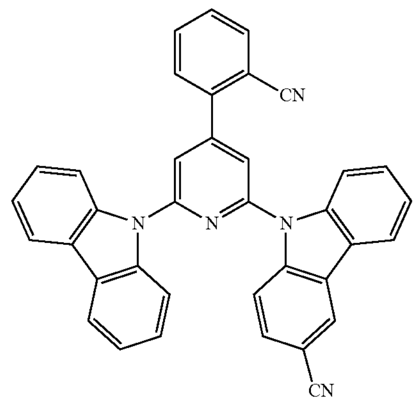
5
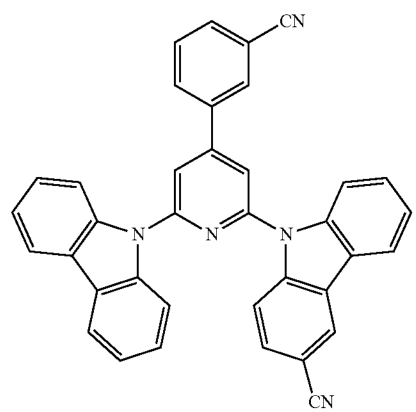
6
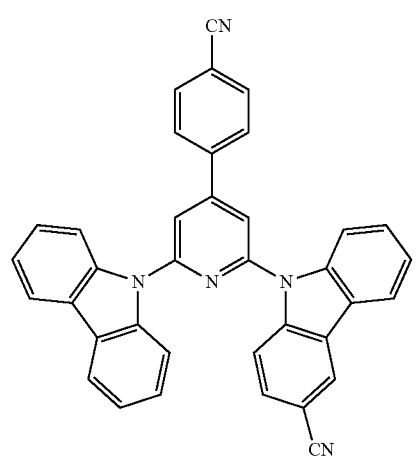

-continued
7
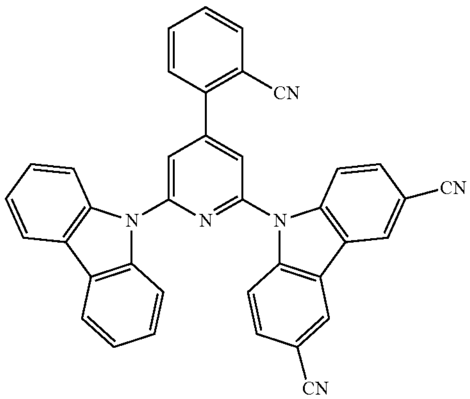
8
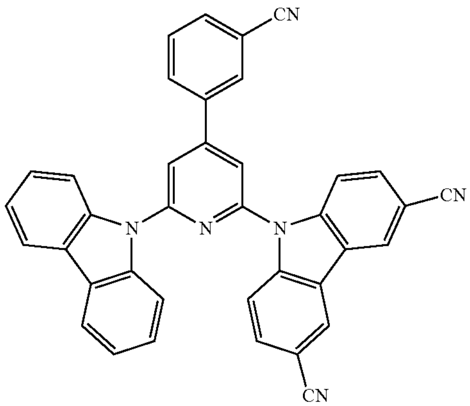
9
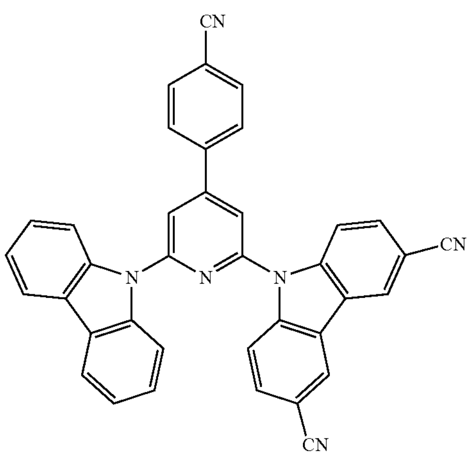
10
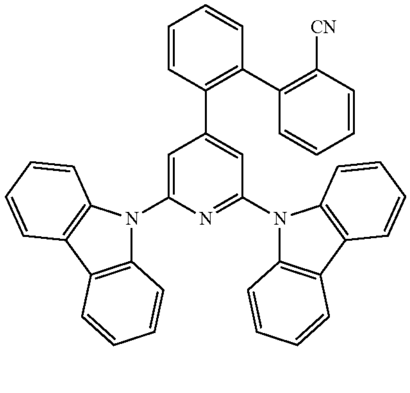
-continued
11
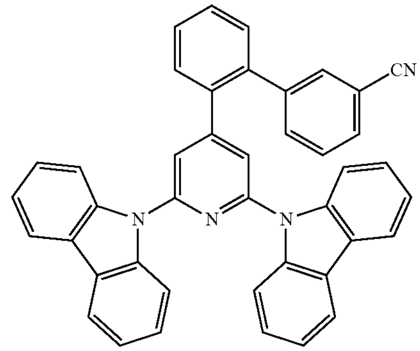
12
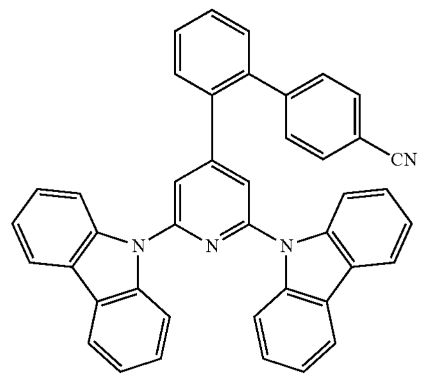
13
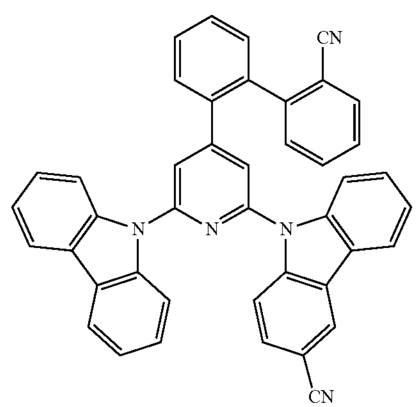
14
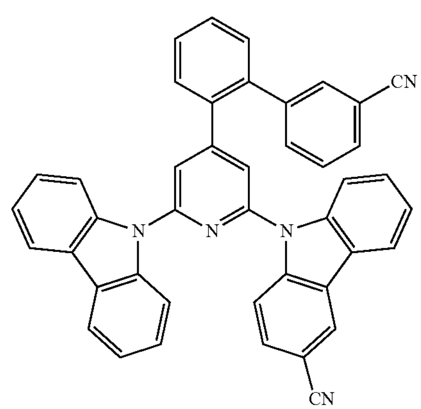

-continued
15
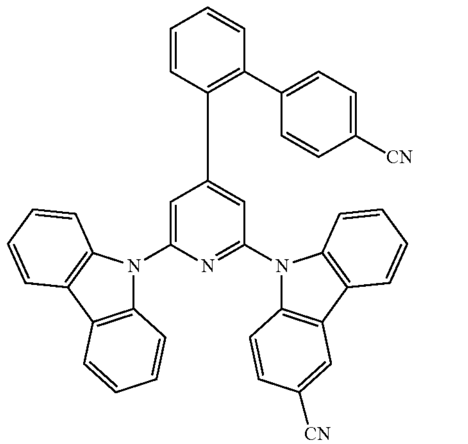
16
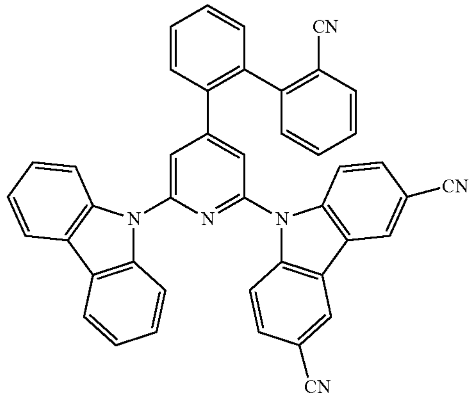
17
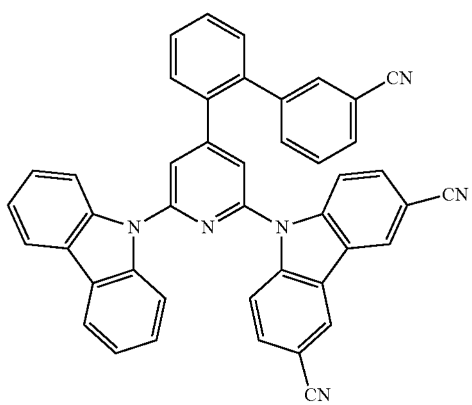
-continued
18
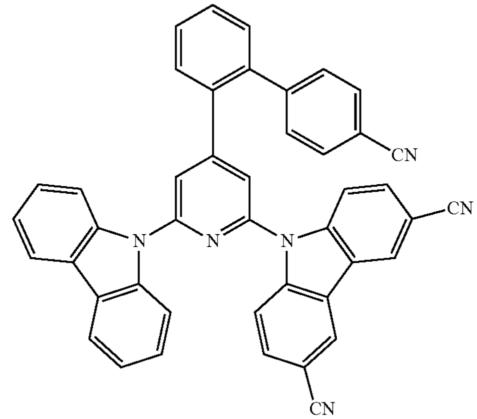
19
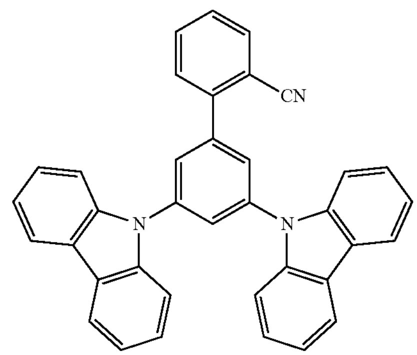
20
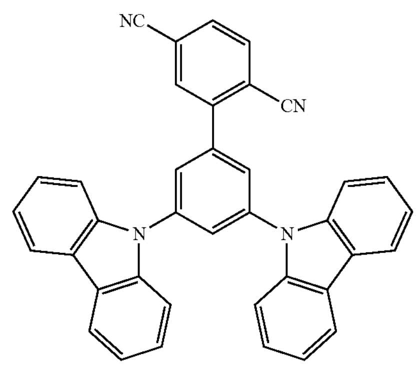
21
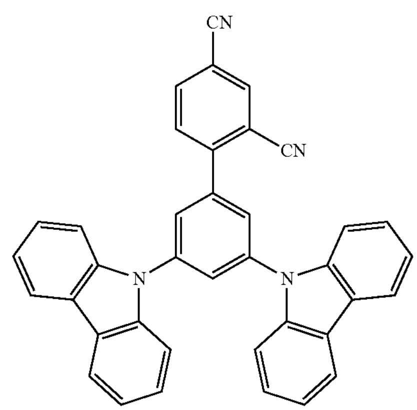

-continued
22
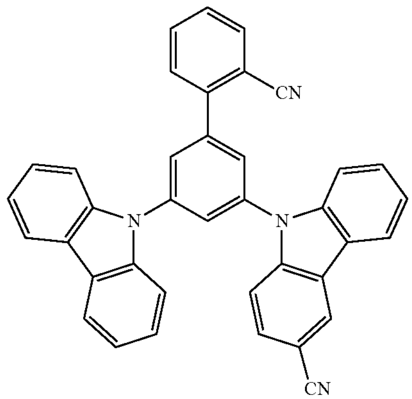
23
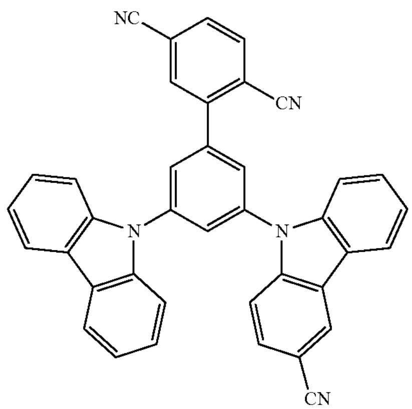
24
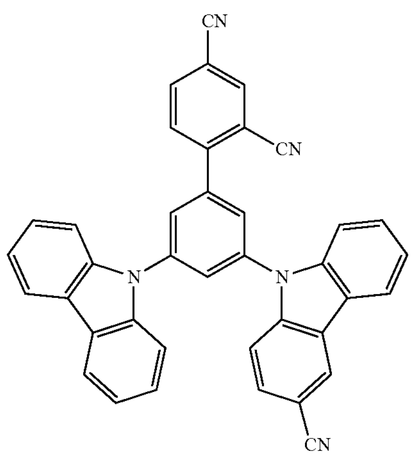
25
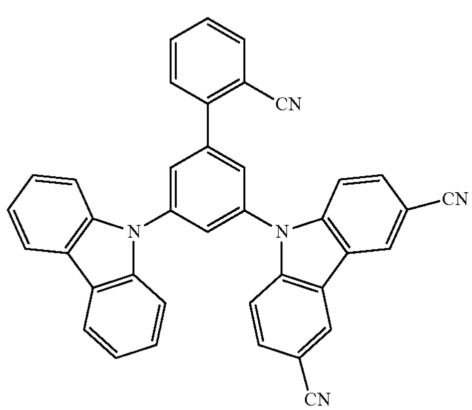
-continued
26
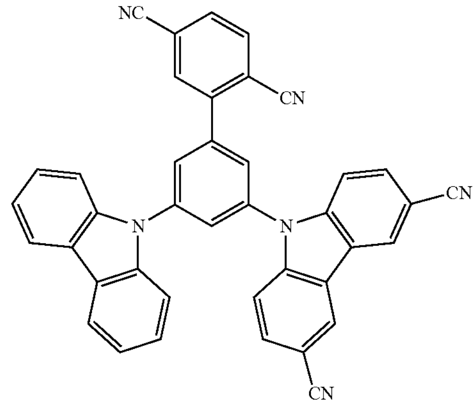
27
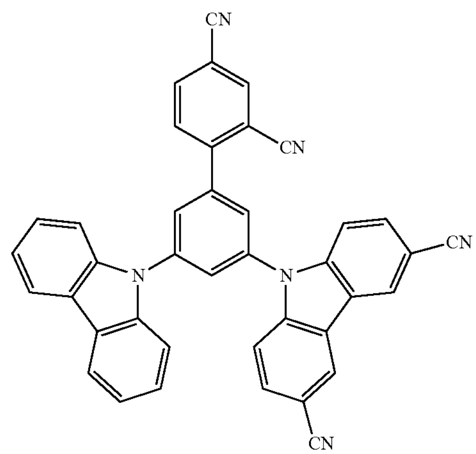
28
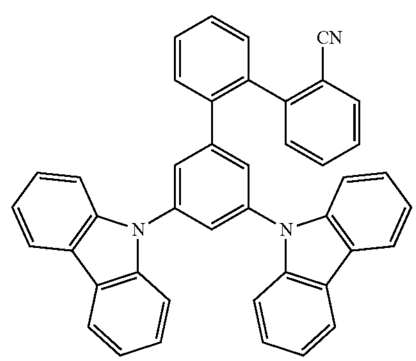
29
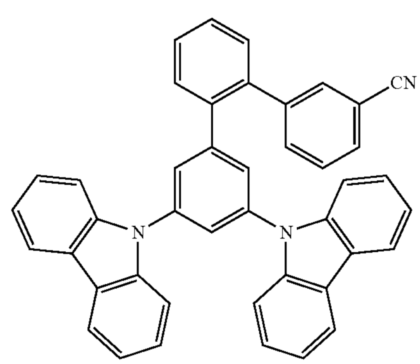

-continued
30
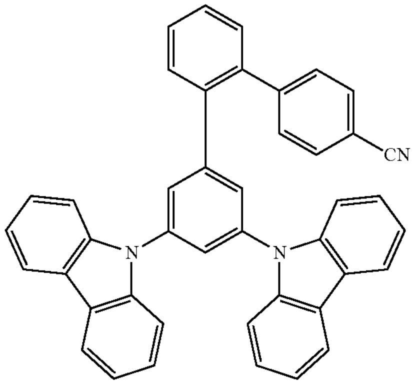
31
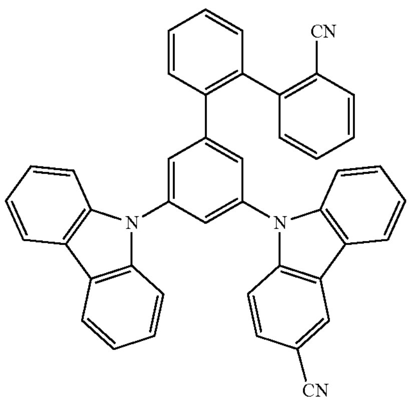
32
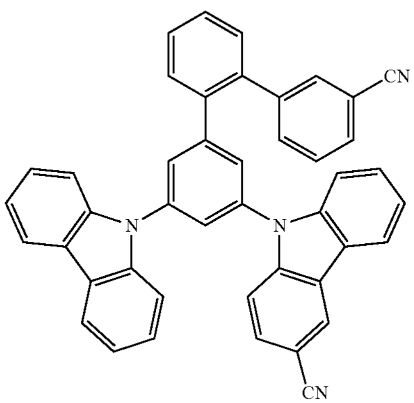
33
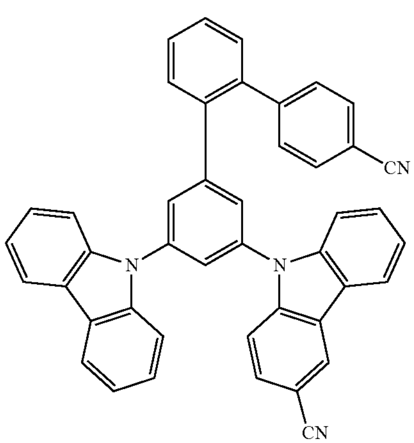
-continued
34
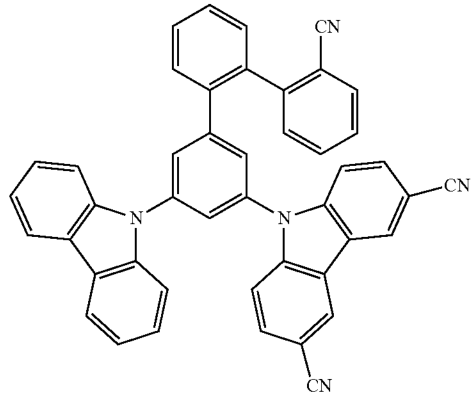
35
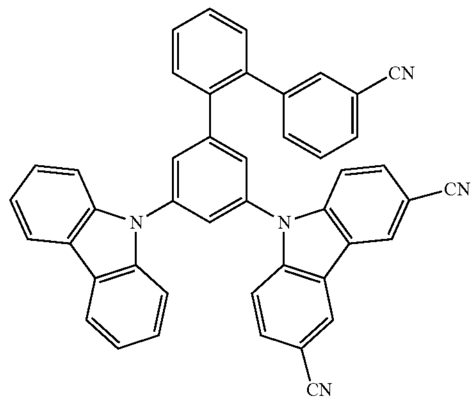
36
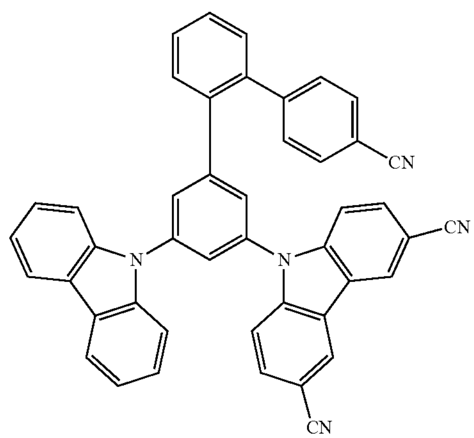
37
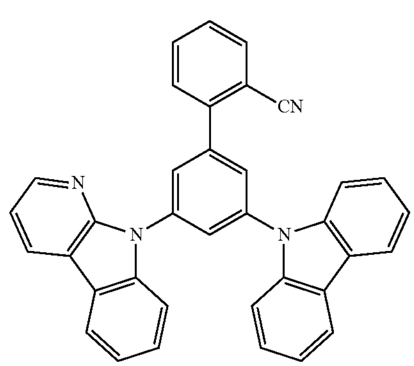

-continued
38
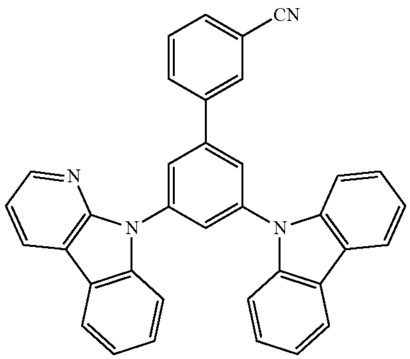
39
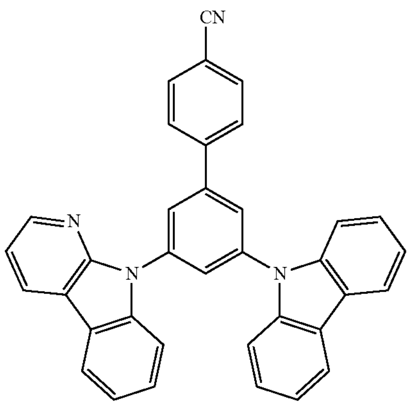
40
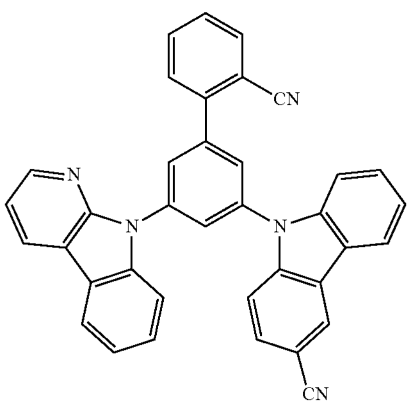
41
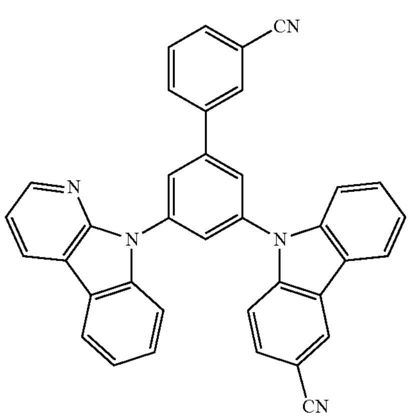
-continued
42
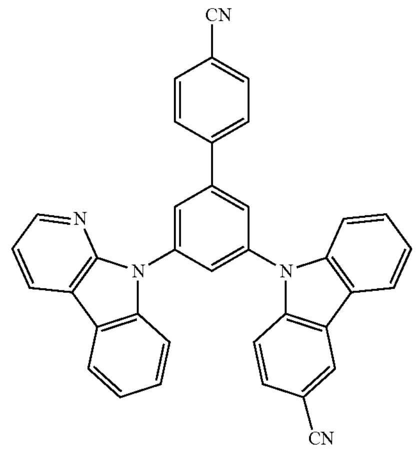
43
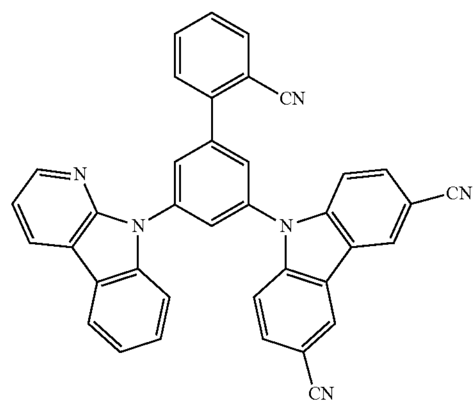
44
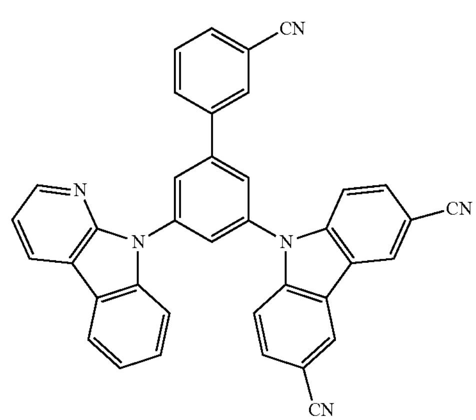

-continued
45
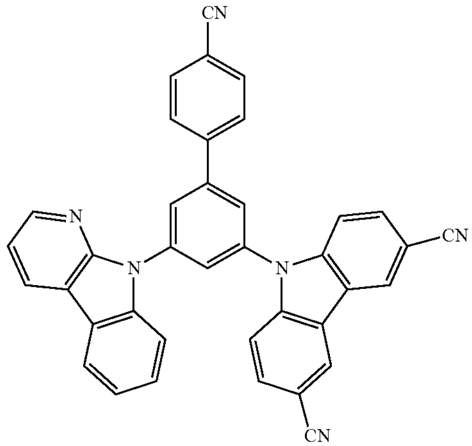
46
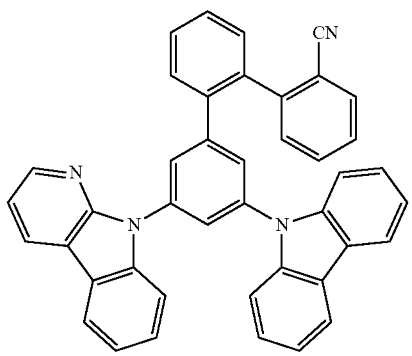
47
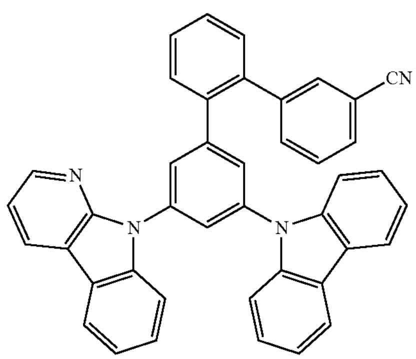
48
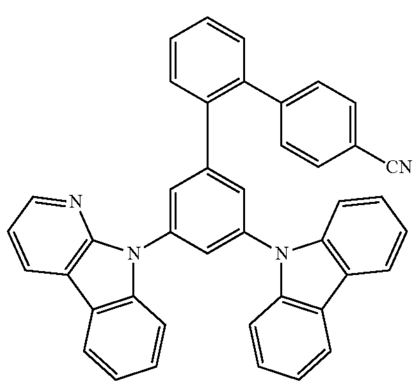
-continued
49
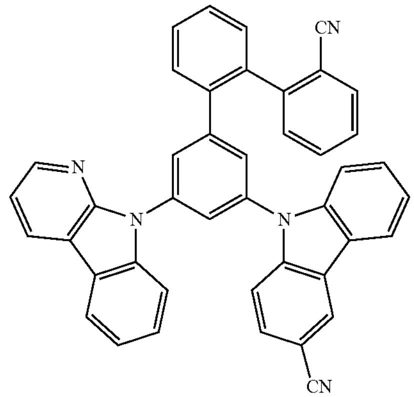
50
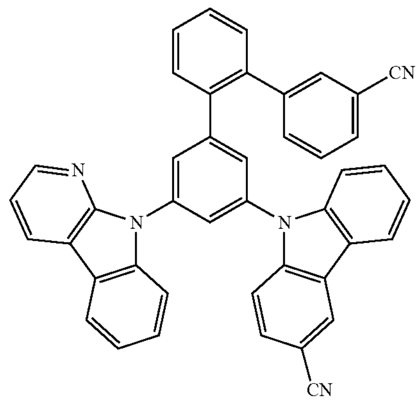
51
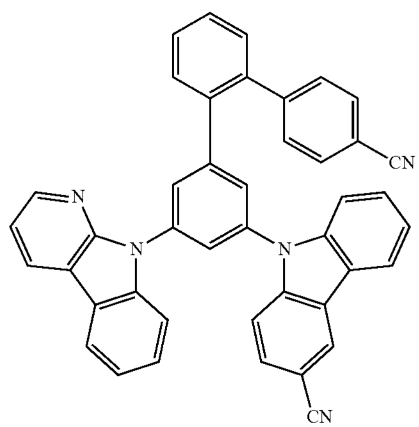
52
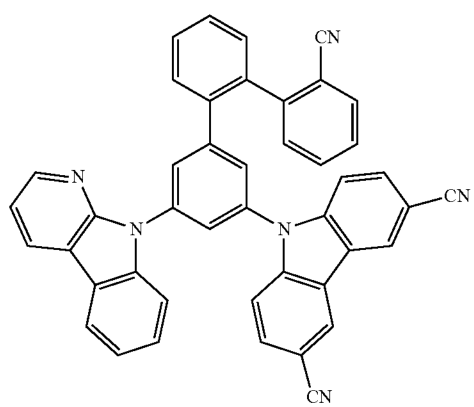

-continued
53
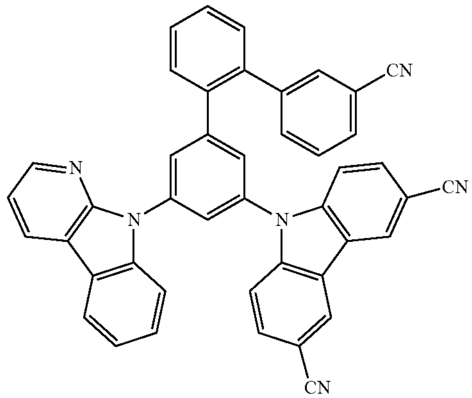
54
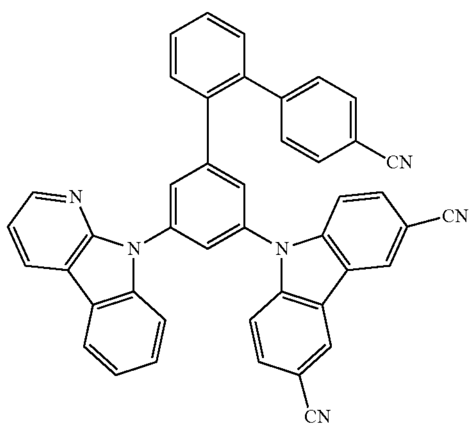
55
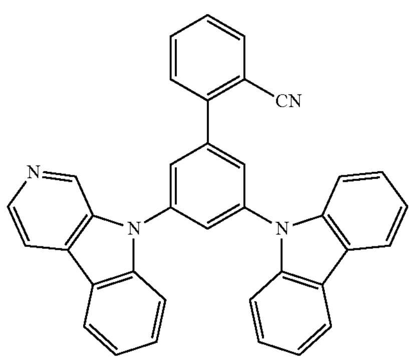
56
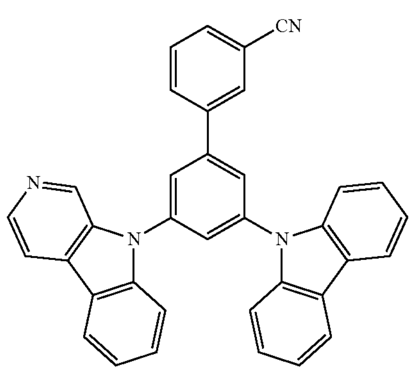
-continued
57
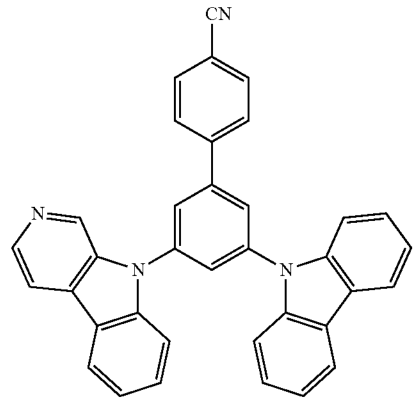
58
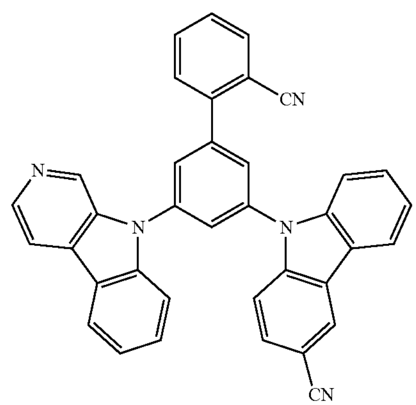
59
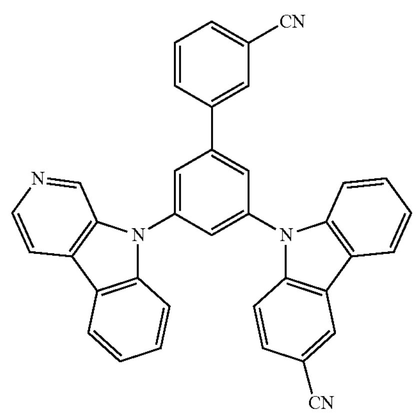
60
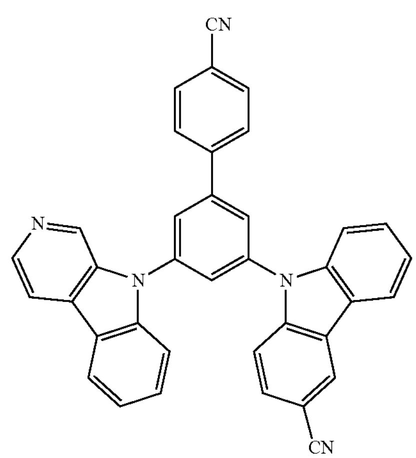

-continued
61
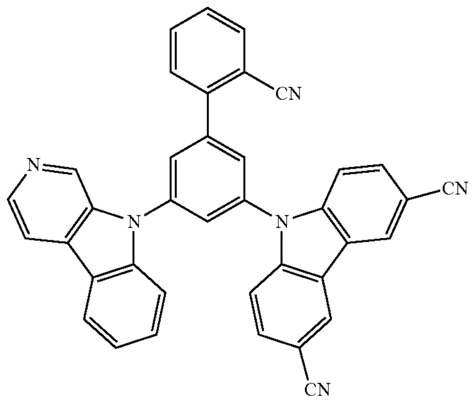
62
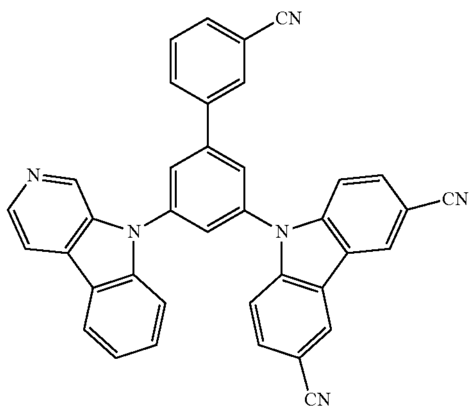
63
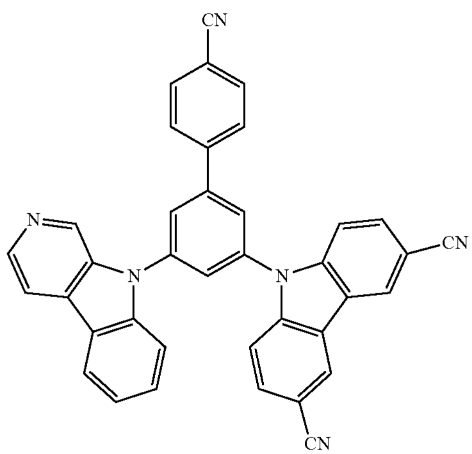
64
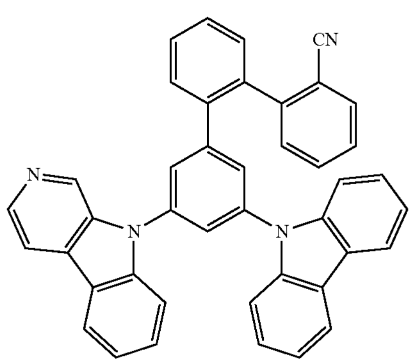
-continued
65
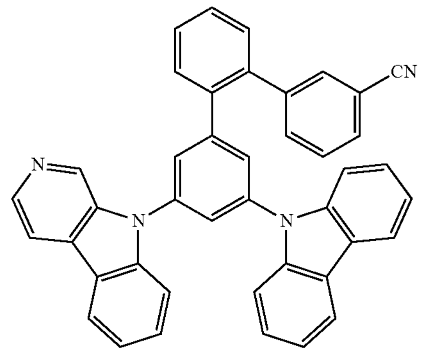
66
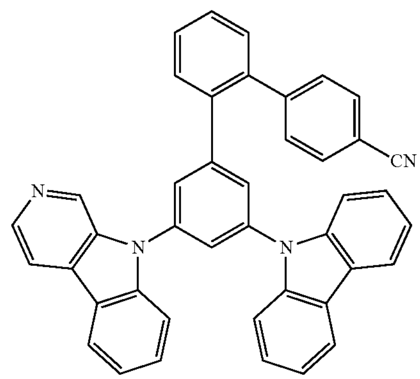
67
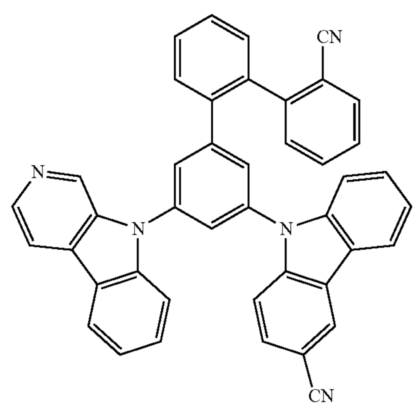
68
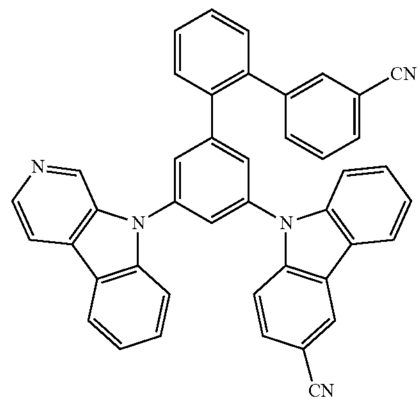

-continued
69
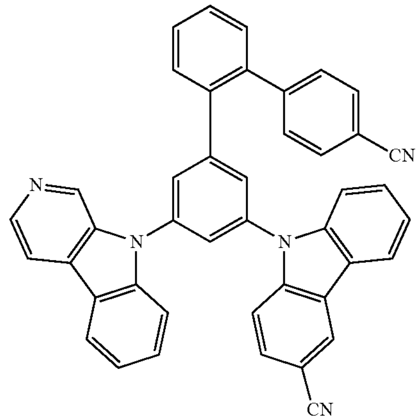
70
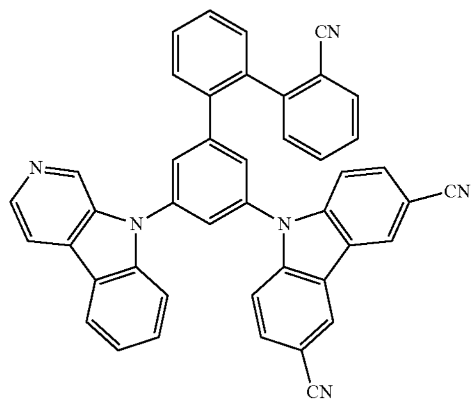
71
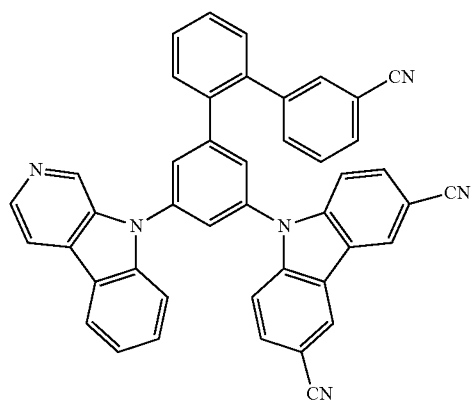
72
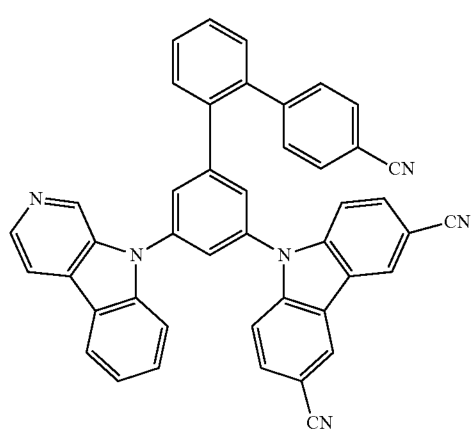
-continued
73
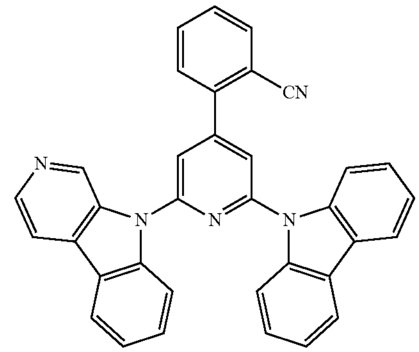
74
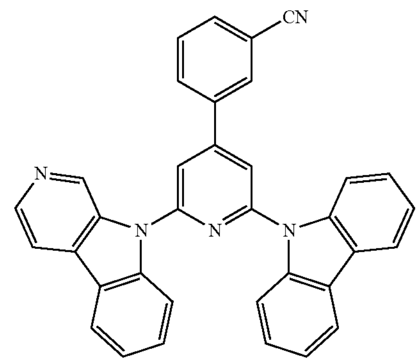
75
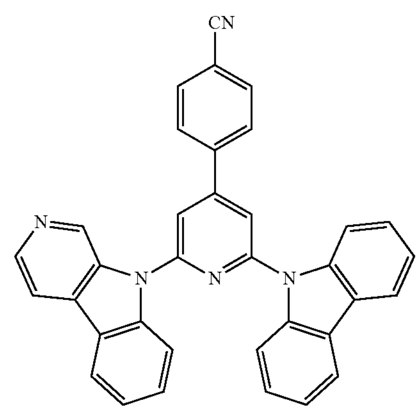
76
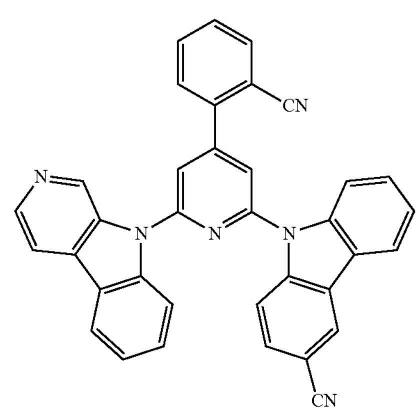

-continued
77
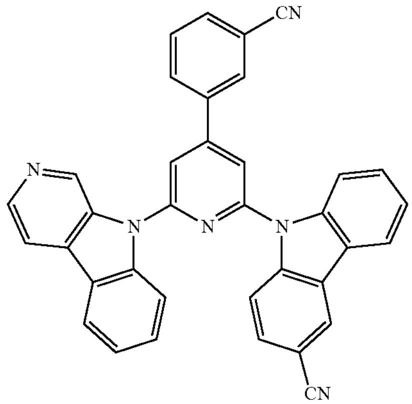
78
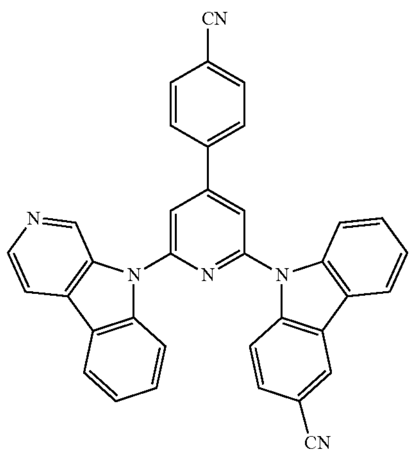
79
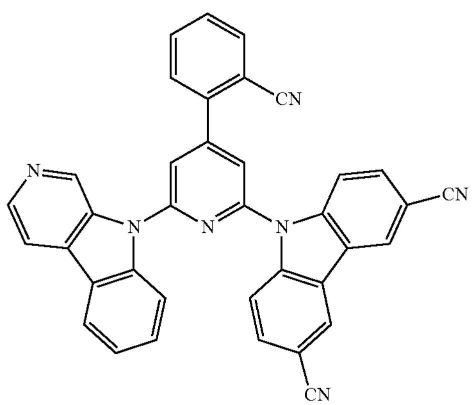
80
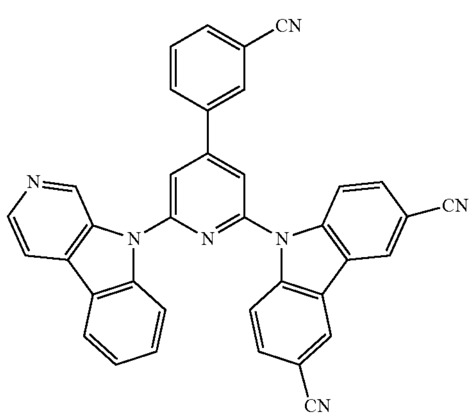
-continued
81
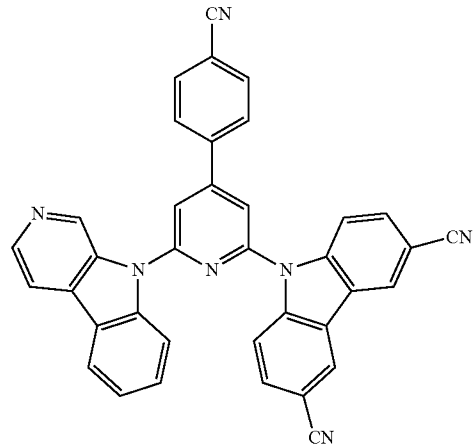
82
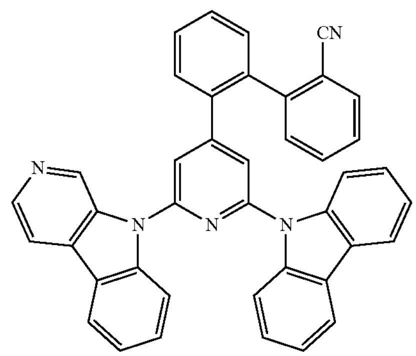
83
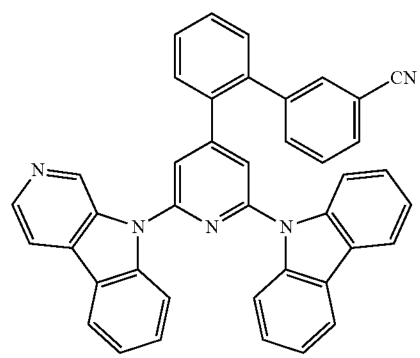
84
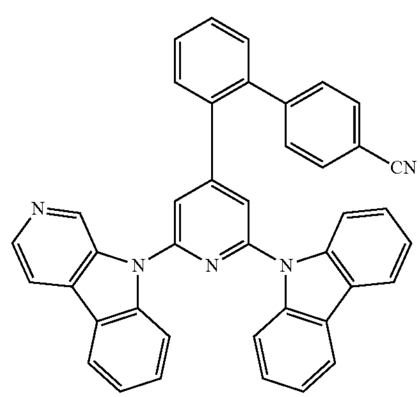

-continued
85
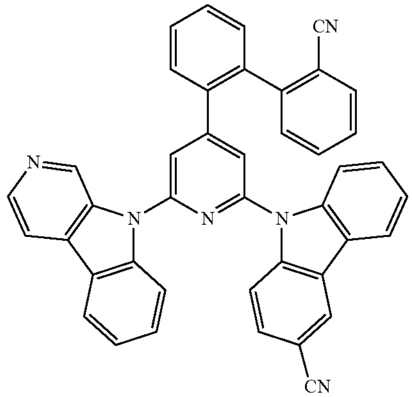
86
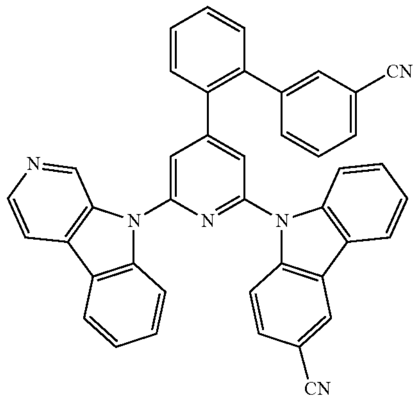
87
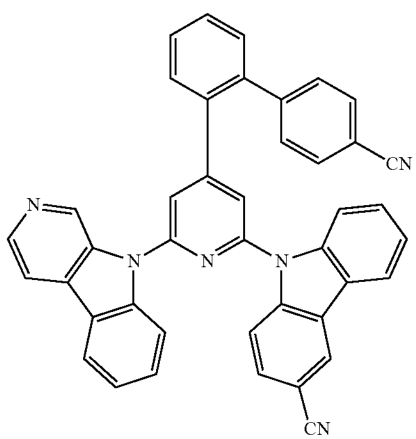
88
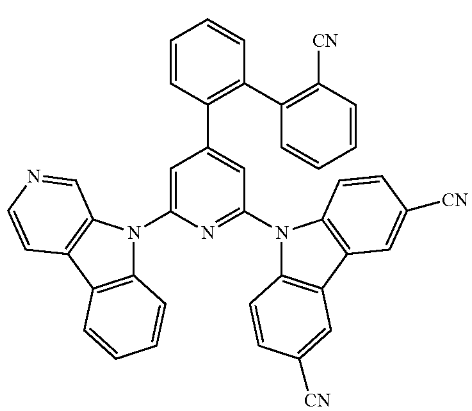
-continued
89
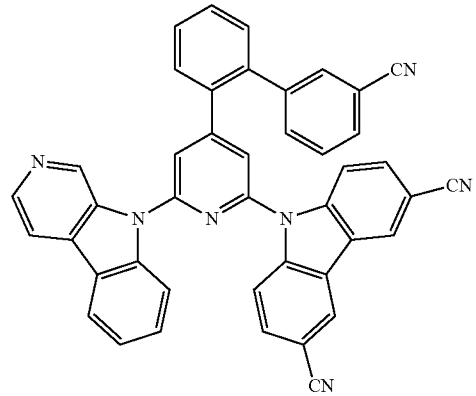
90
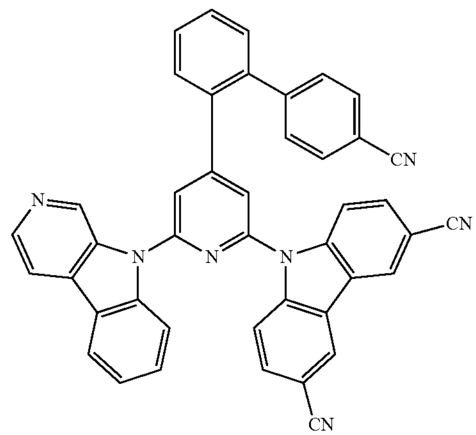
91
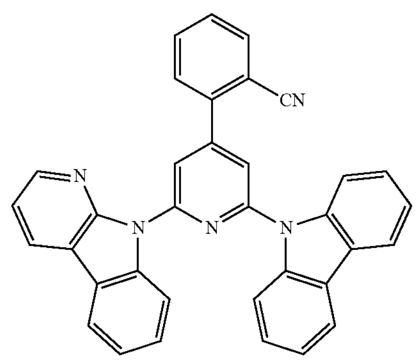
92
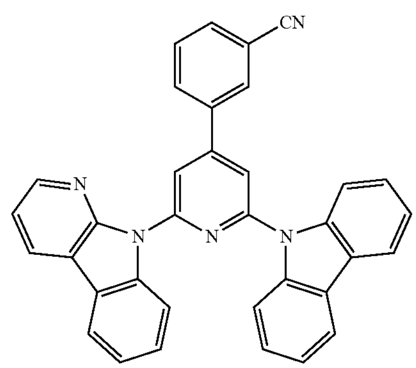

-continued
93
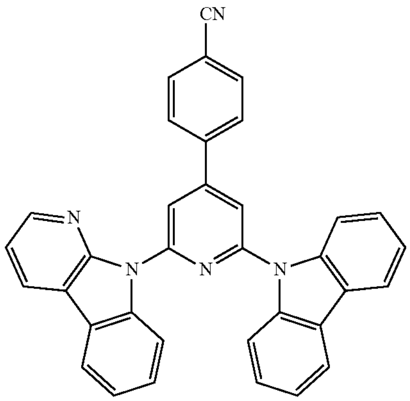
94
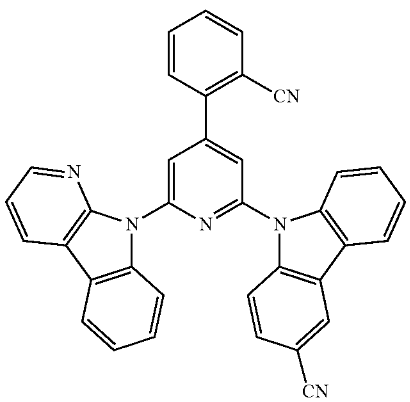
95
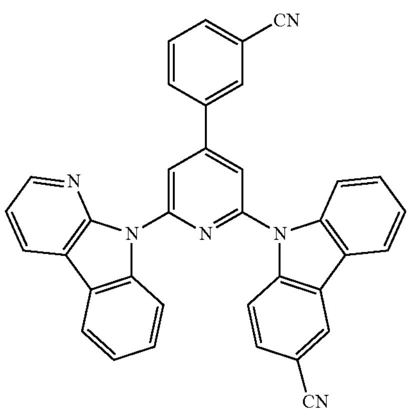
96
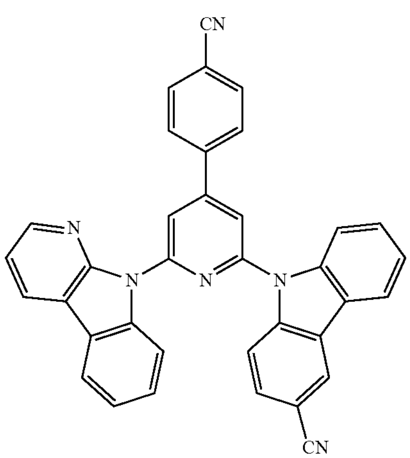
-continued
97
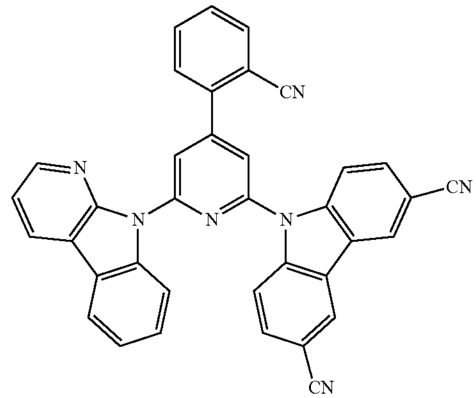
98
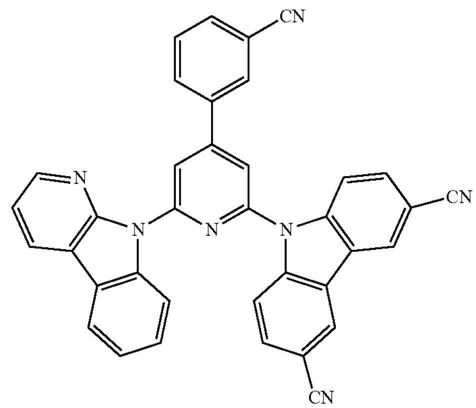
99
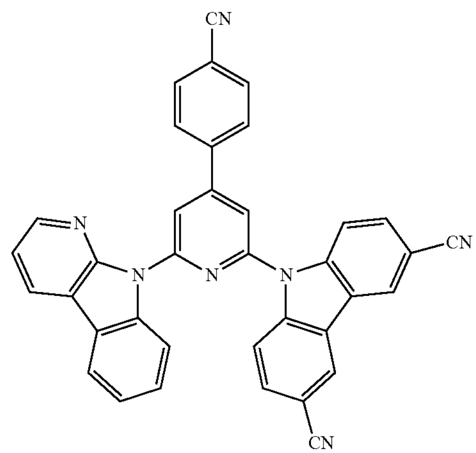
100
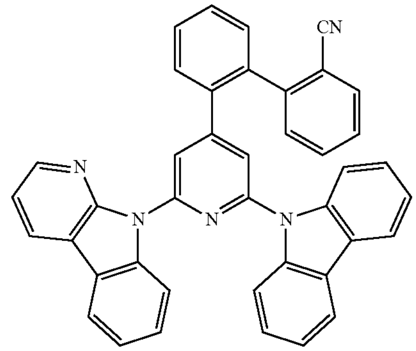

-continued
101
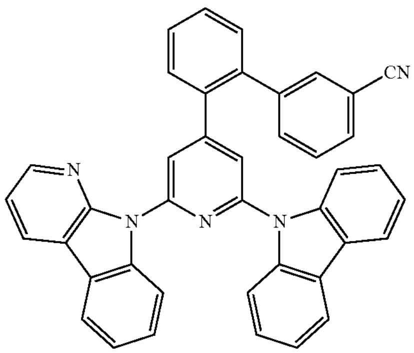
102
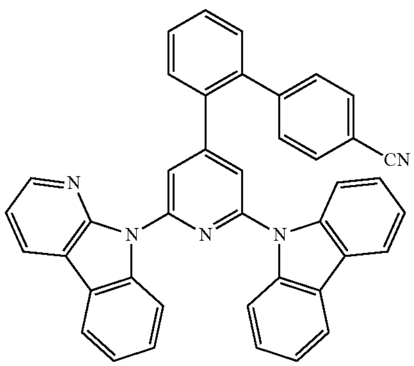
103
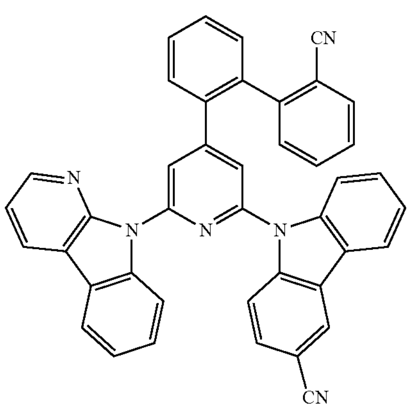
104
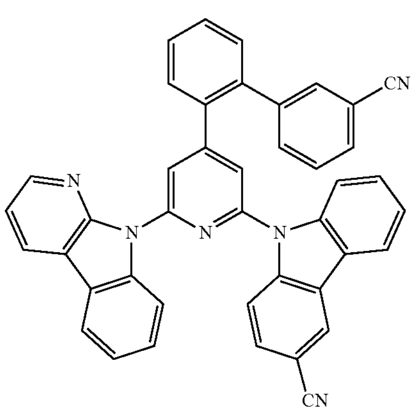
-continued
105
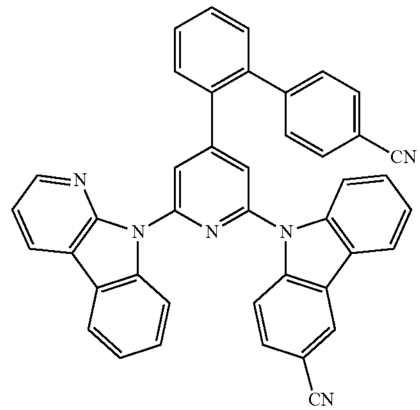
106
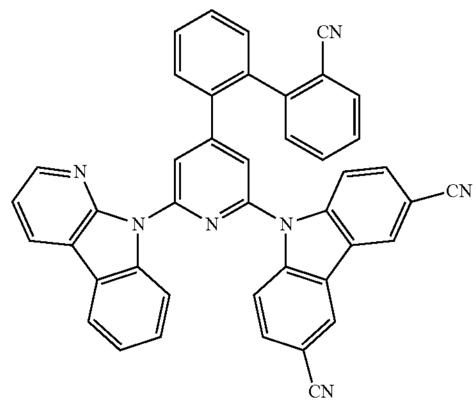
107
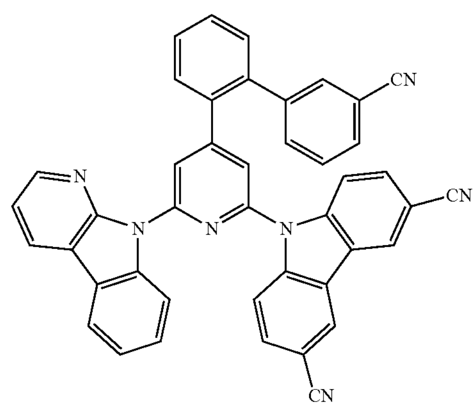
108
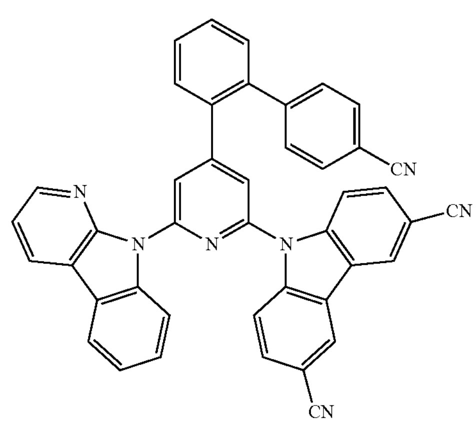

-continued
109
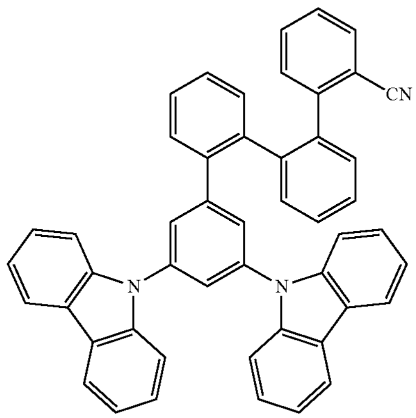
110
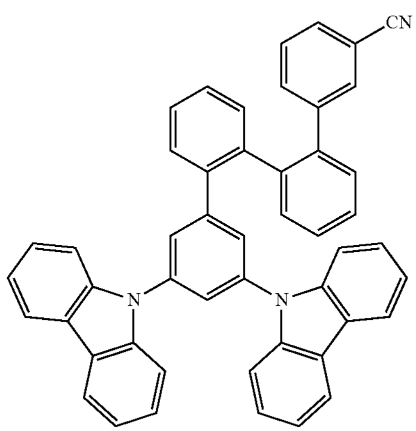
111
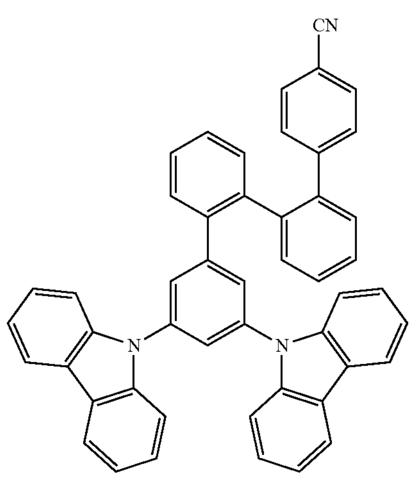
-continued
112
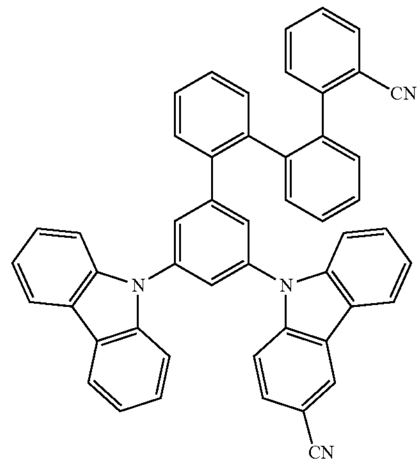
113
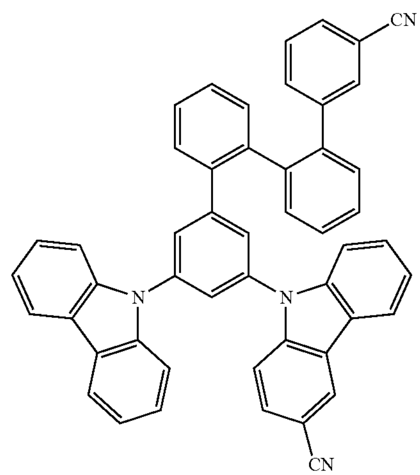
114
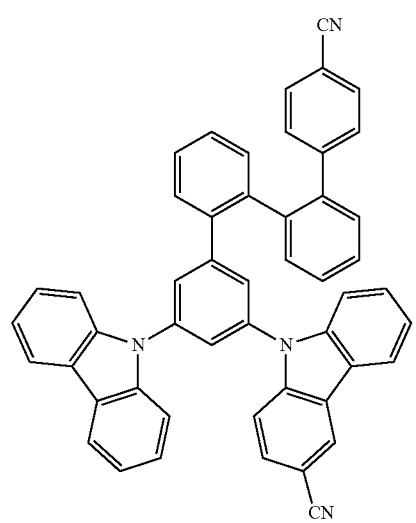

-continued
115
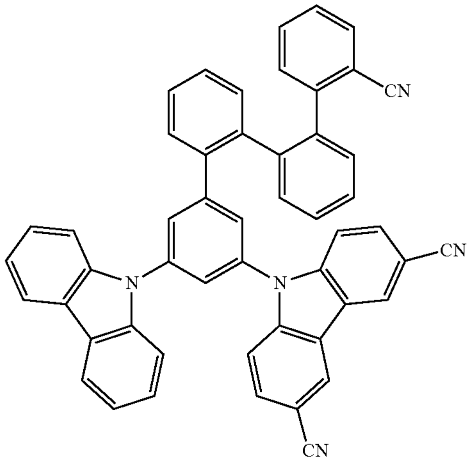
116
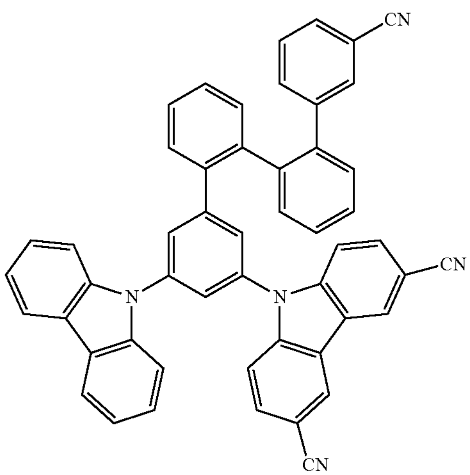
117
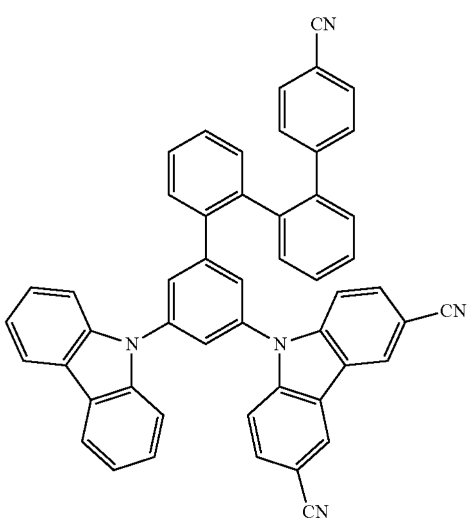
-continued
118
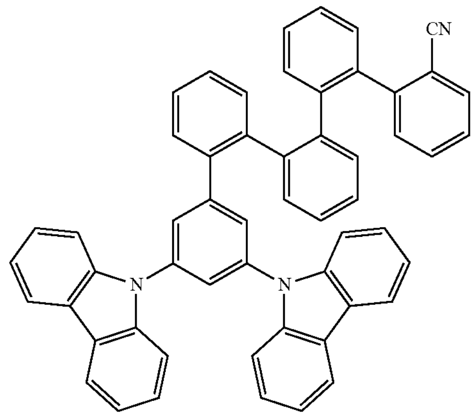
119
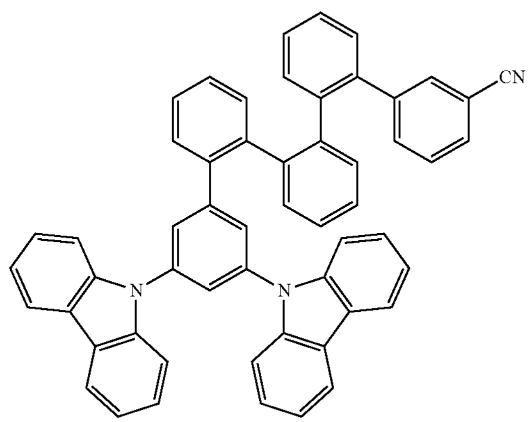
120
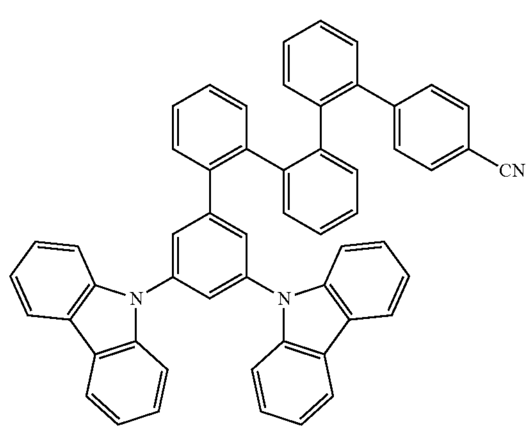

-continued
121
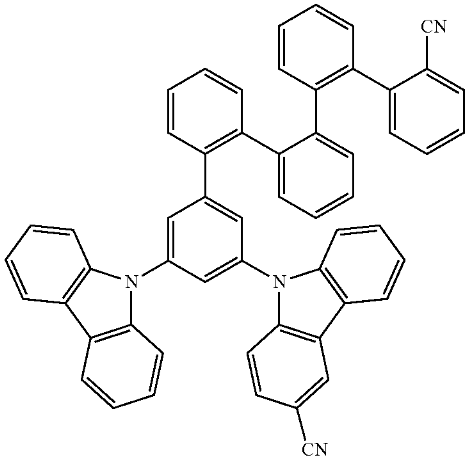
122
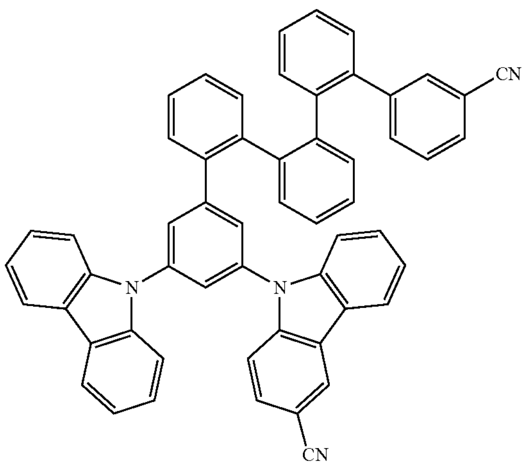
123
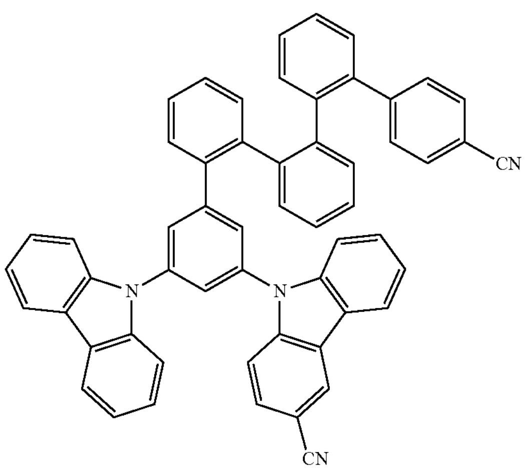
-continued
124
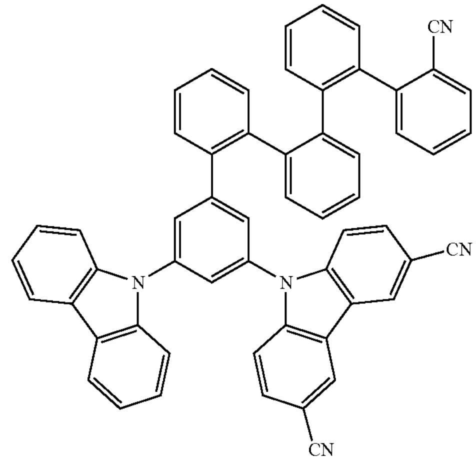
125
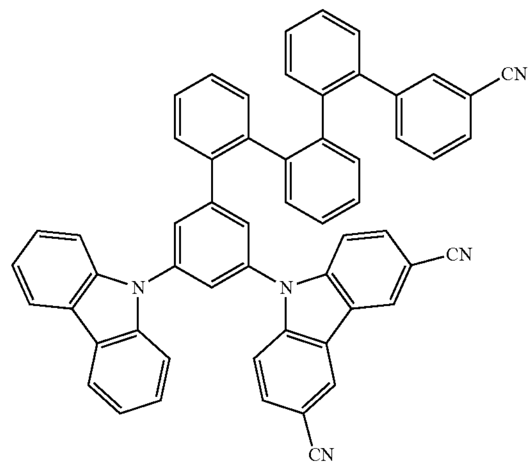
126
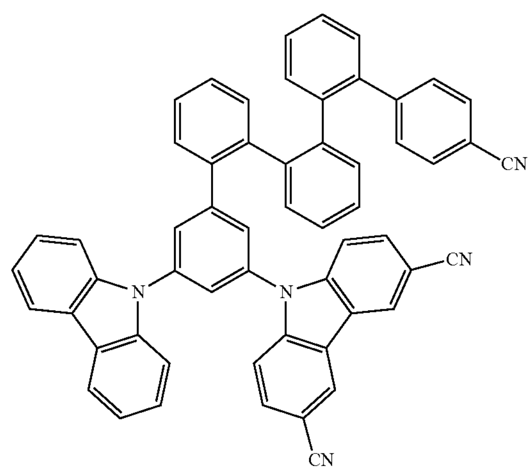

127
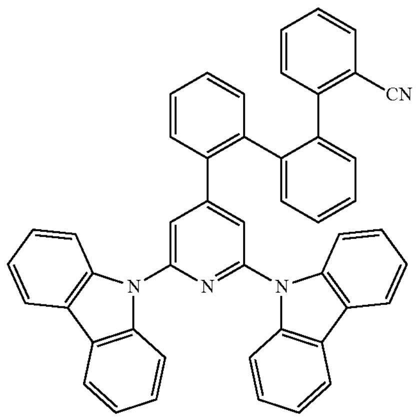
128
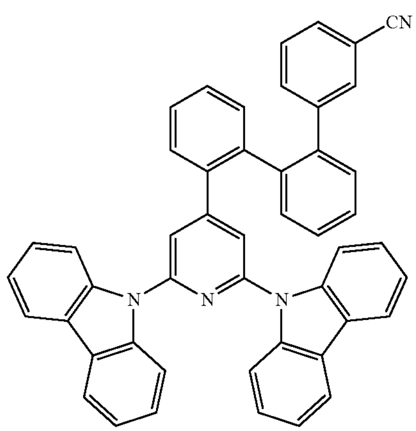
129
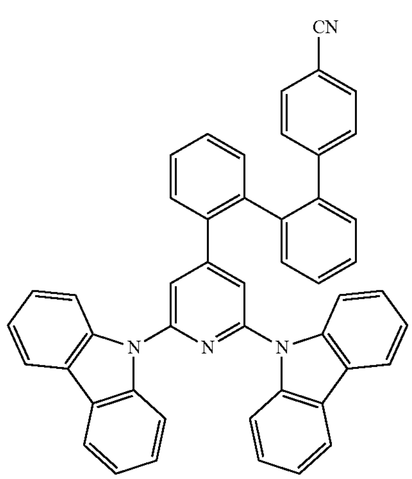
130
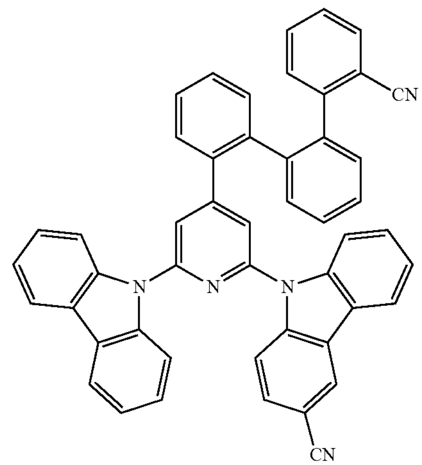
131
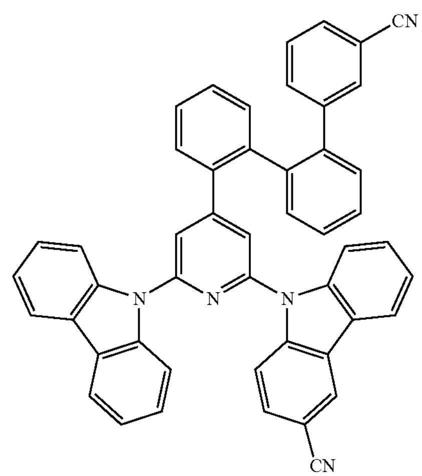
132
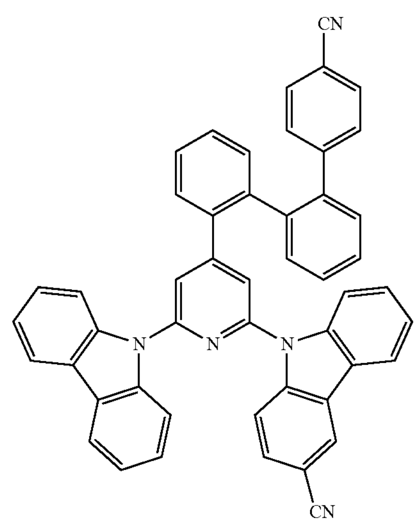

-continued
133
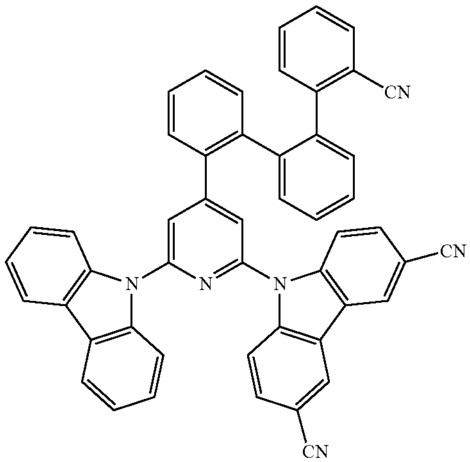
134
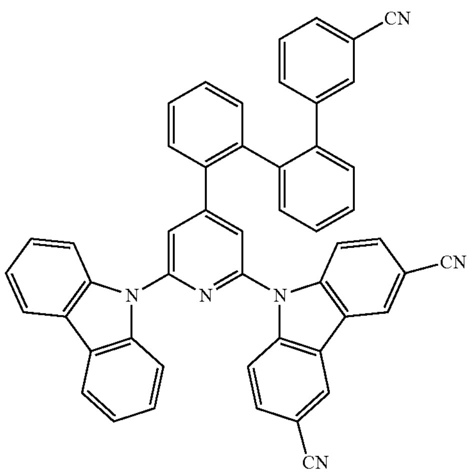
135
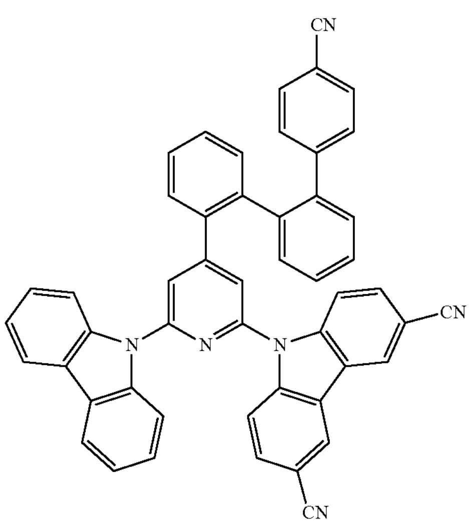
-continued
136
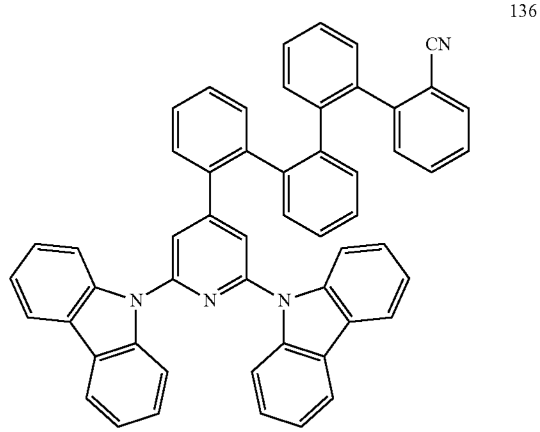
137
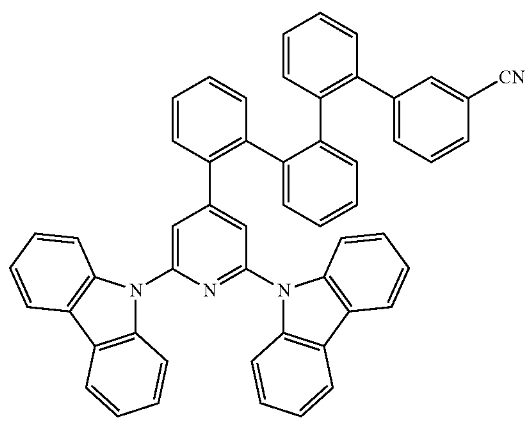
138
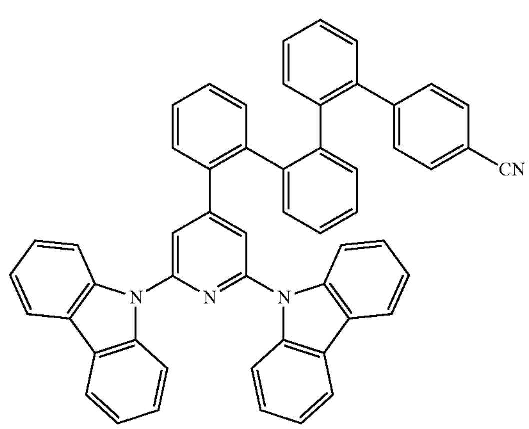

139
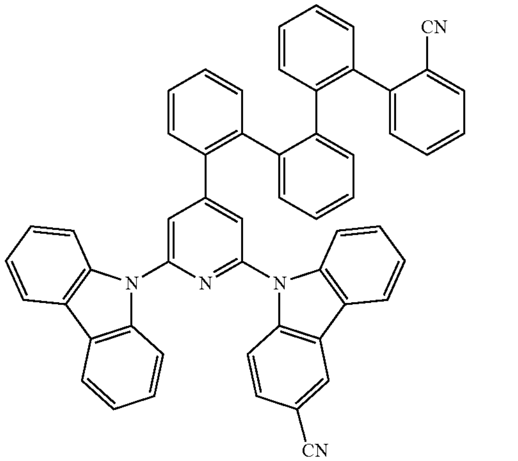
140
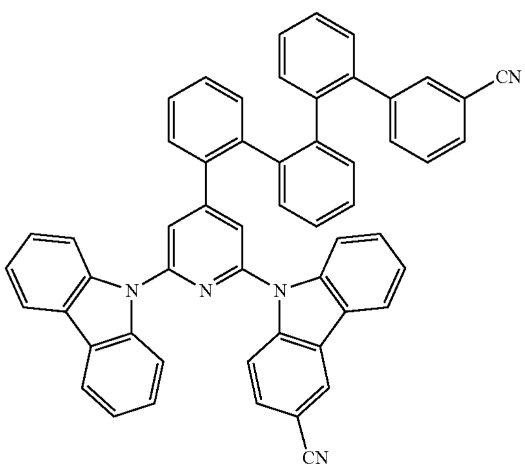
141
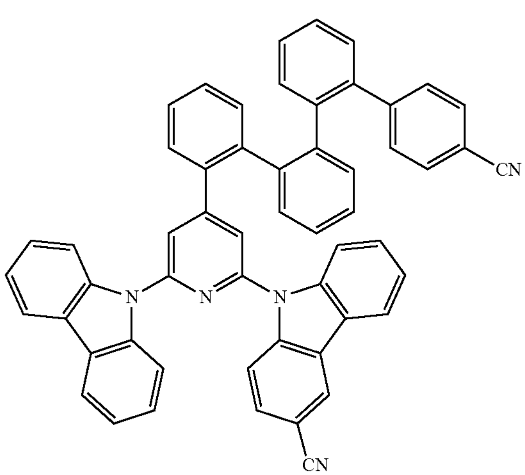
142
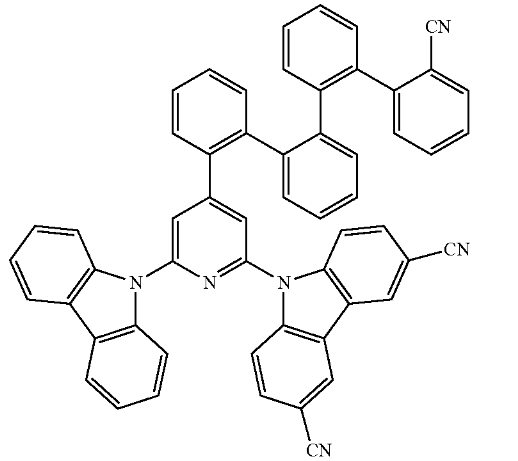
143
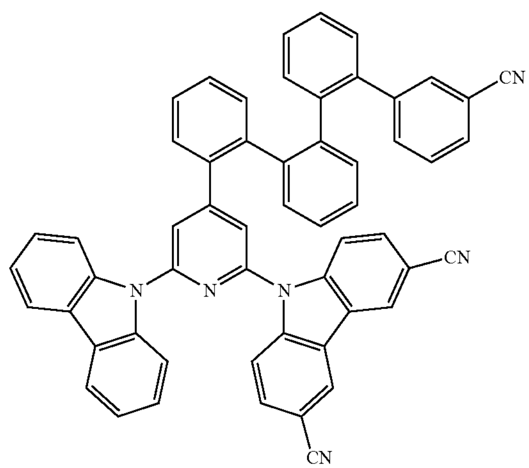
144
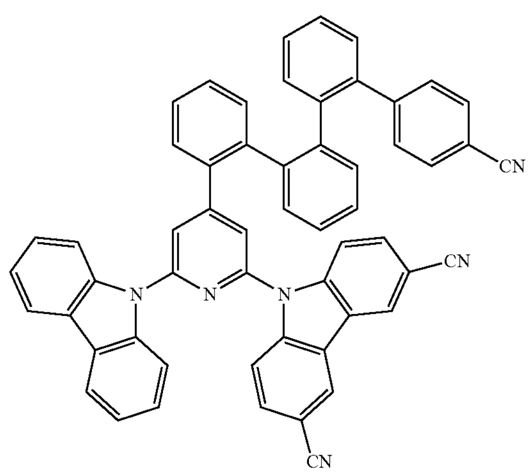

-continued
145
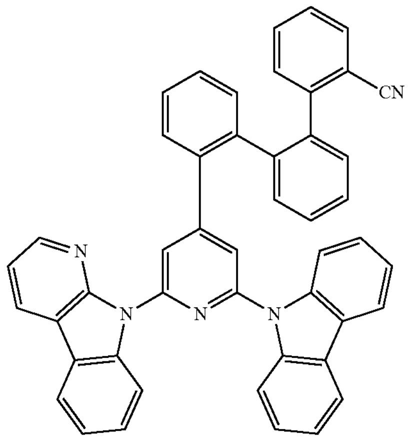
146
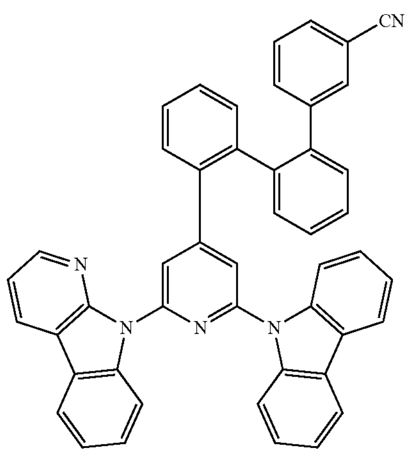
147
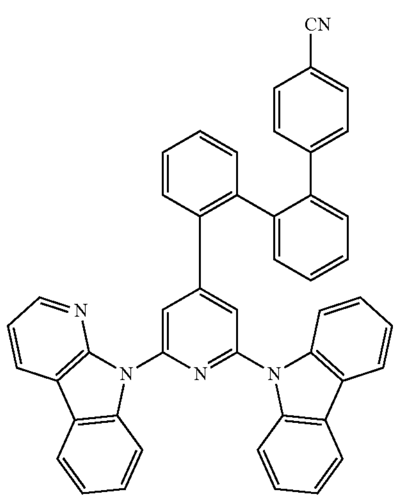
148
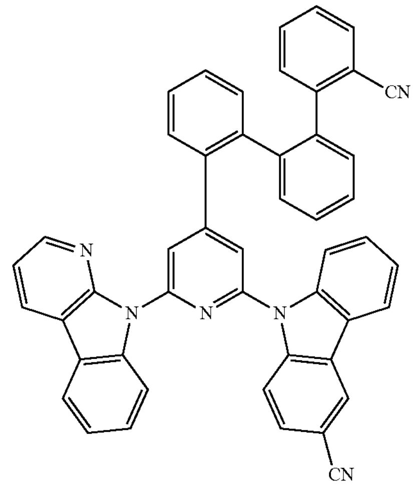
149
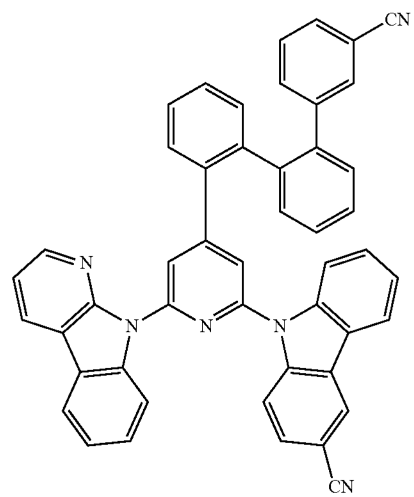
150
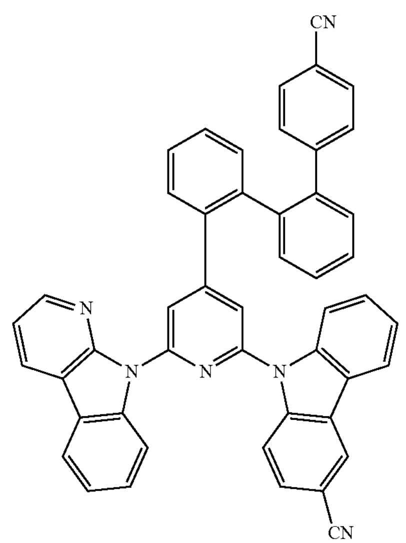

-continued
151
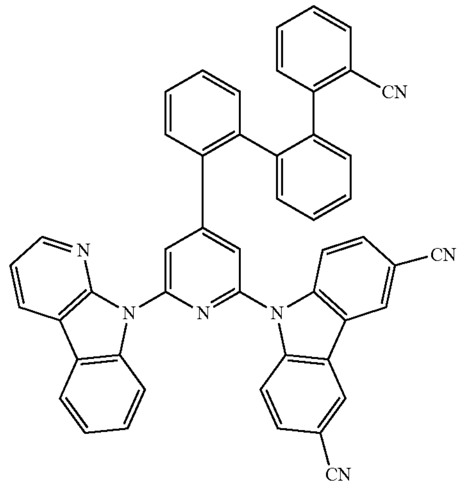
152
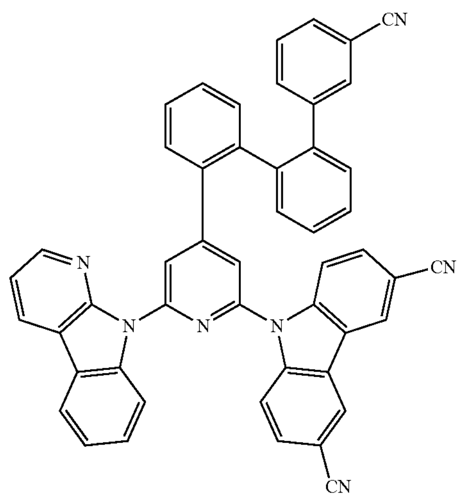
153
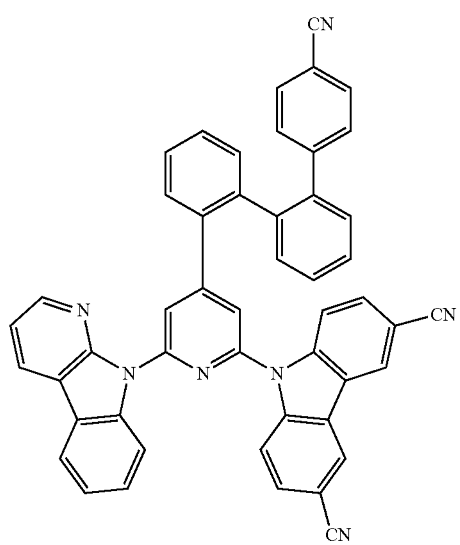
-continued
154
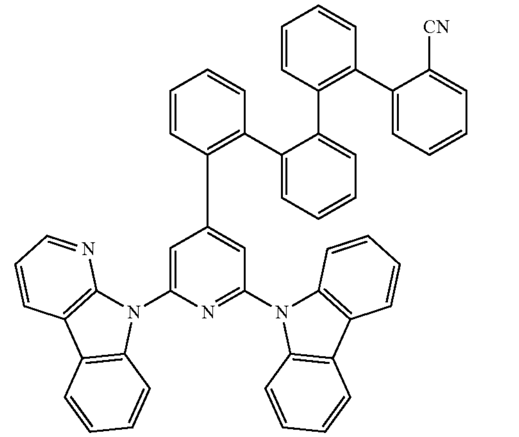
155
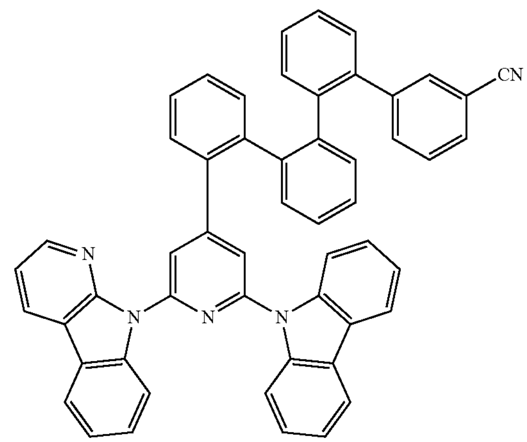
156
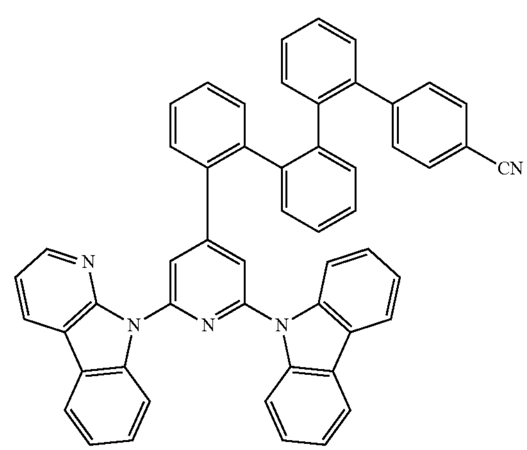

-continued
157
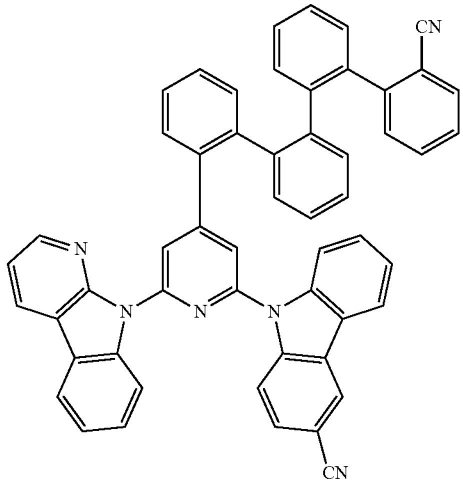
158
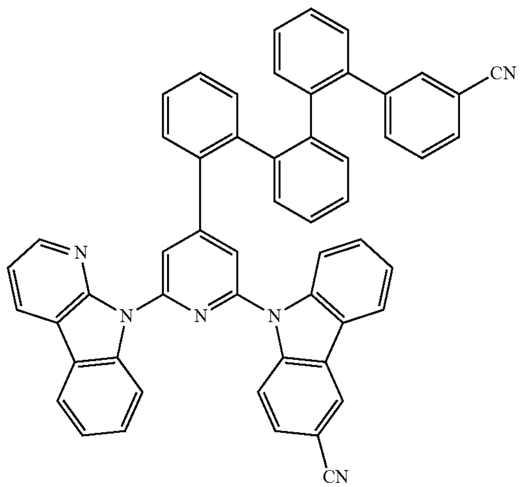
159
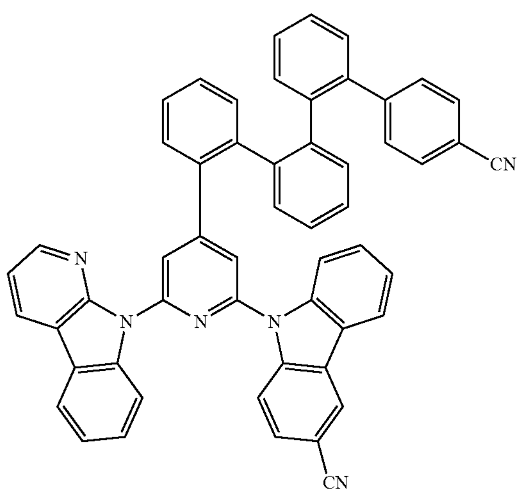
-continued
160
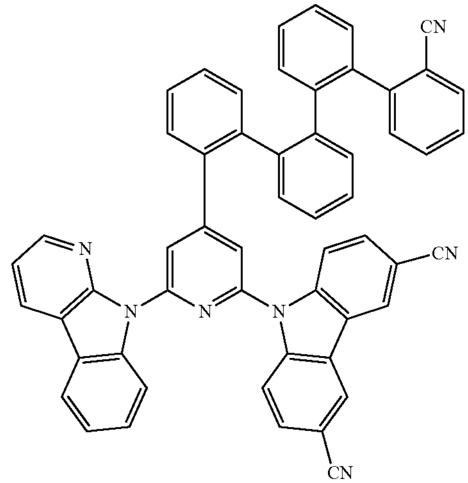
161
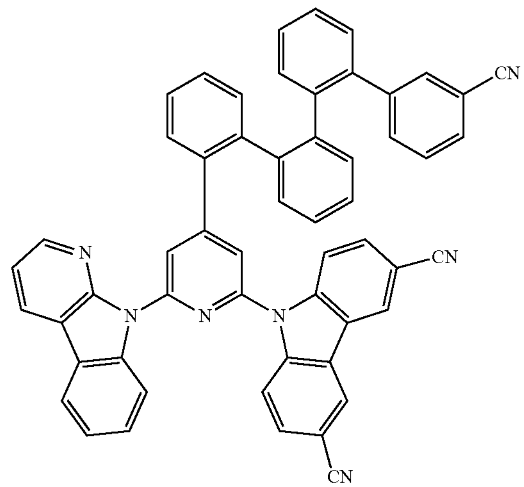
162
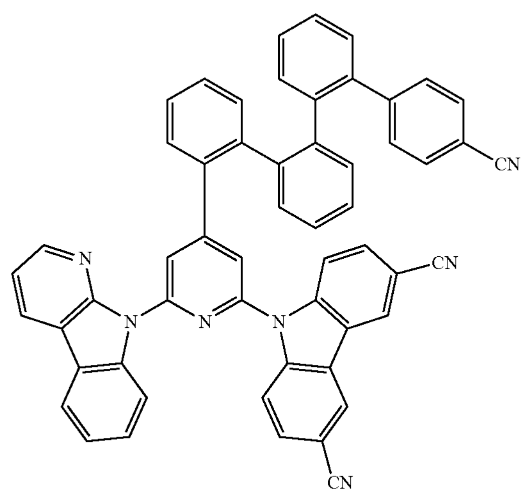

-continued
163
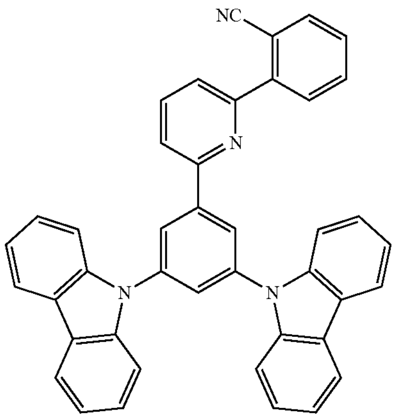
166
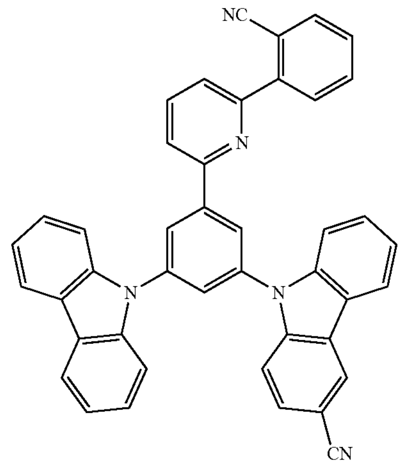
164
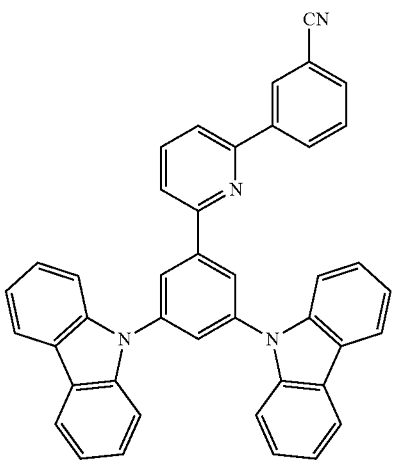
167
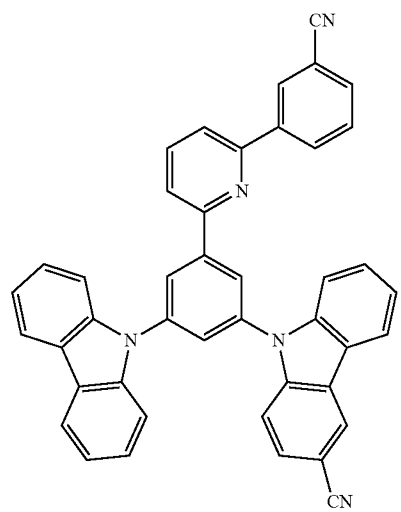
165
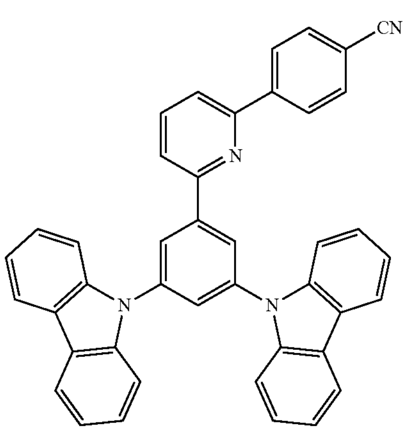
168
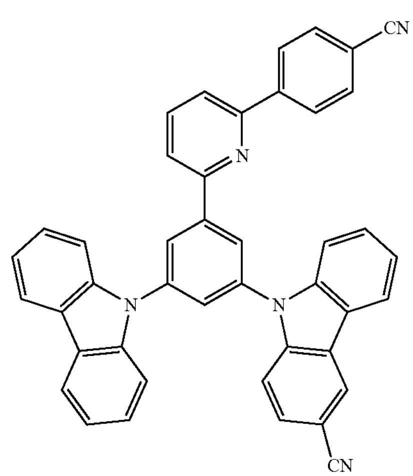

-continued
169
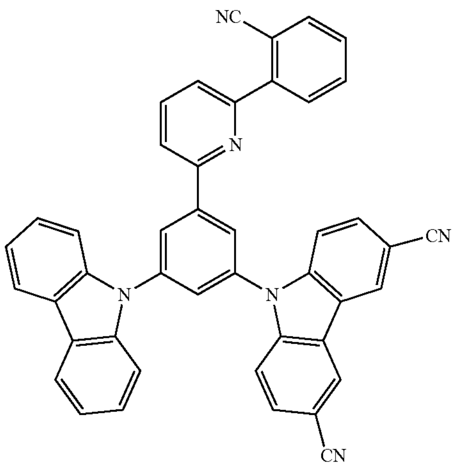
170
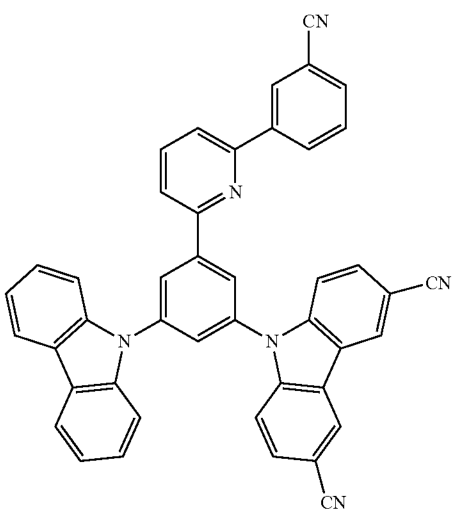
171
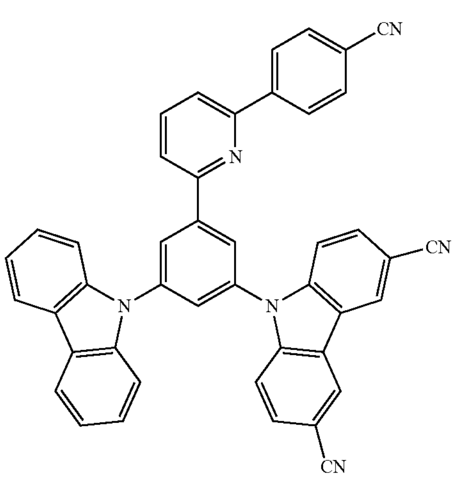
-continued
172
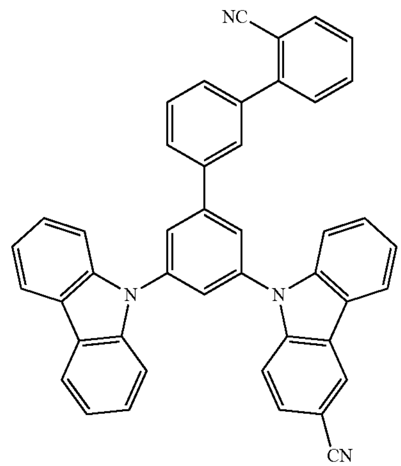
173
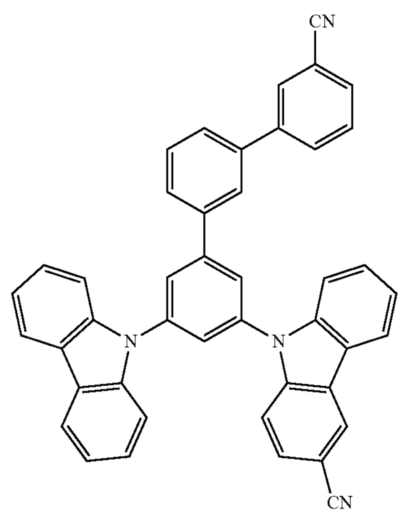
174
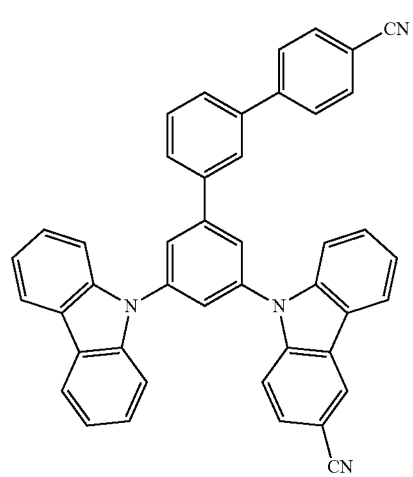

-continued
175
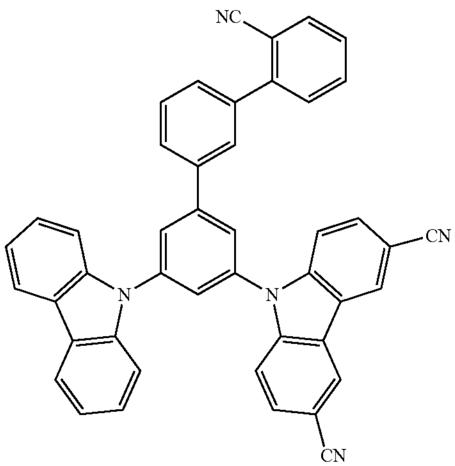
176
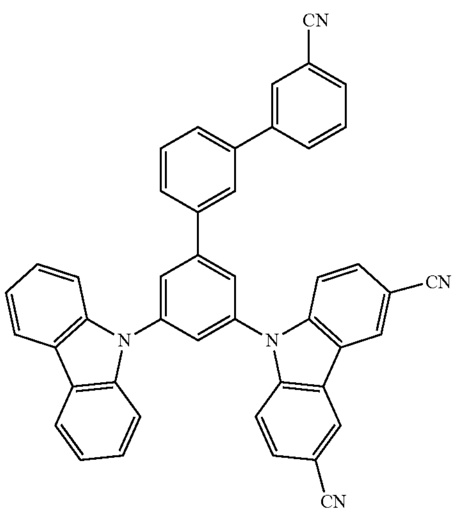
177
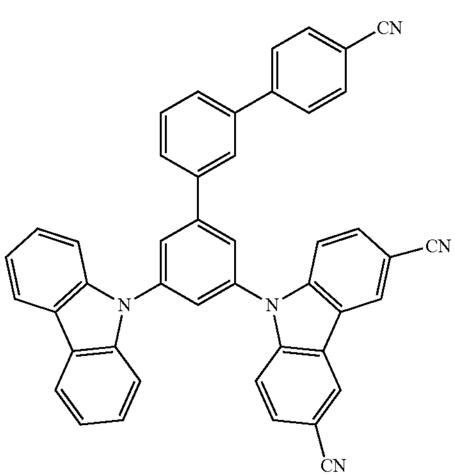
-continued
178
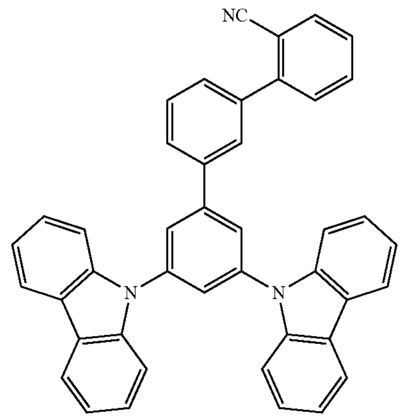
179
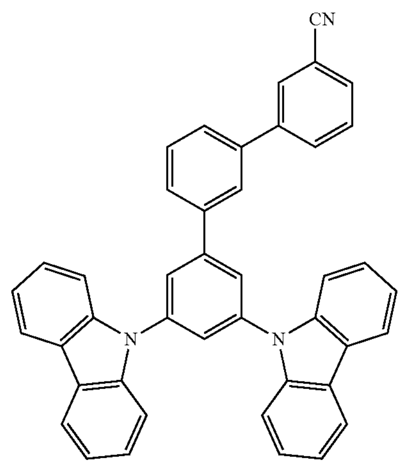
180
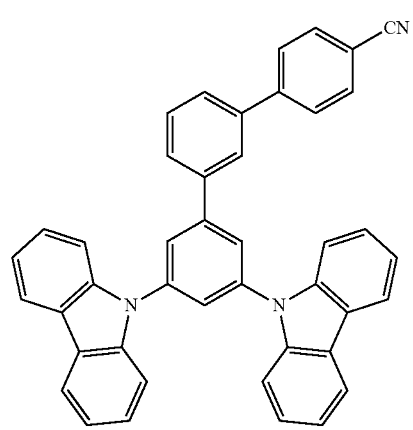

-continued
181
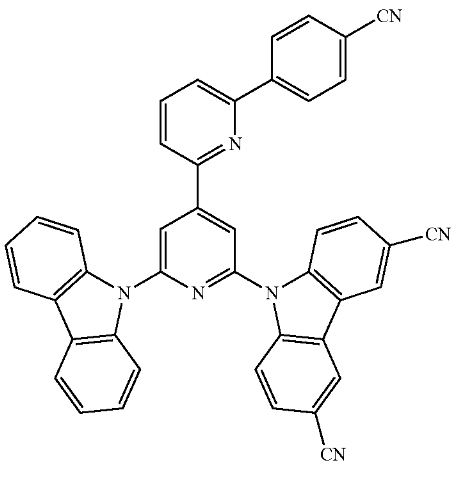
182
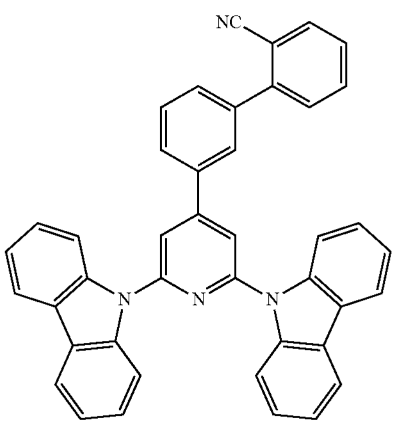
183
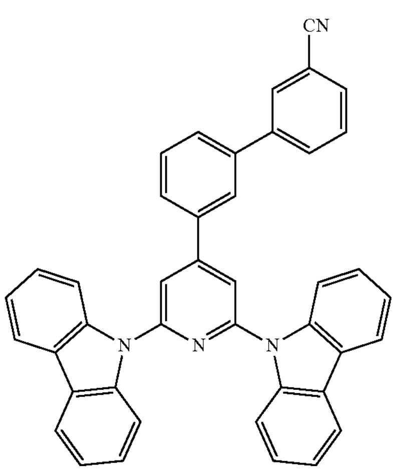
-continued
184
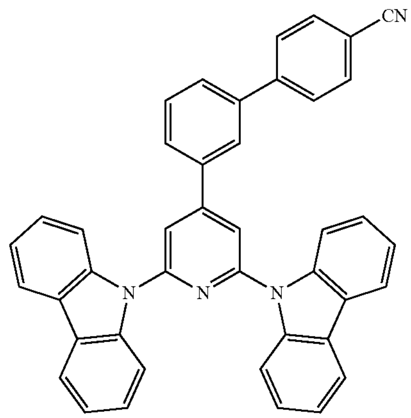
185
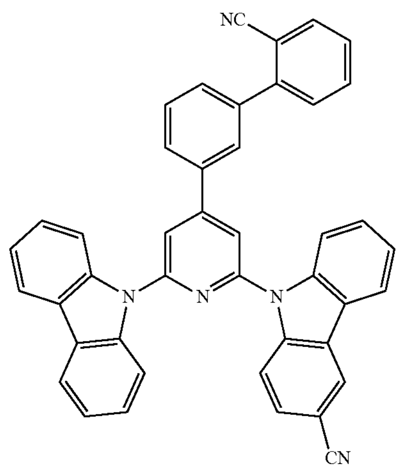
186
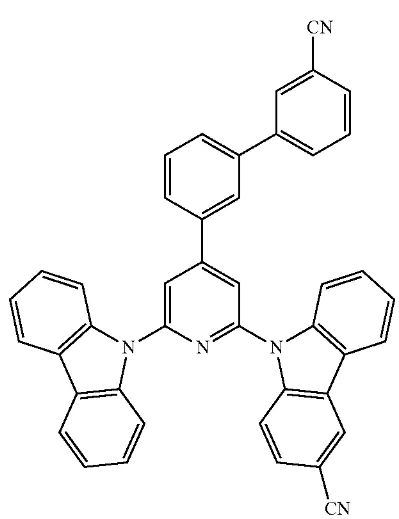

-continued
187
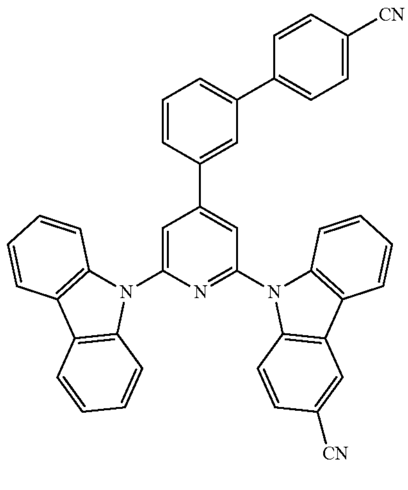
188
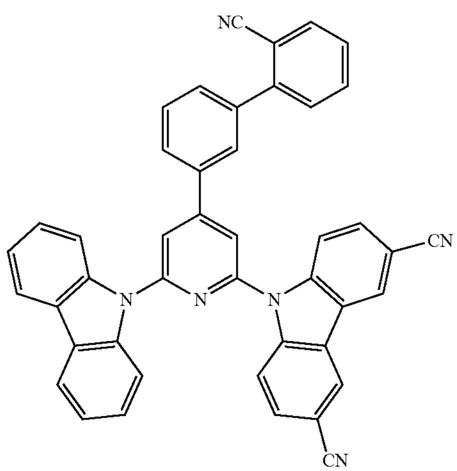
189
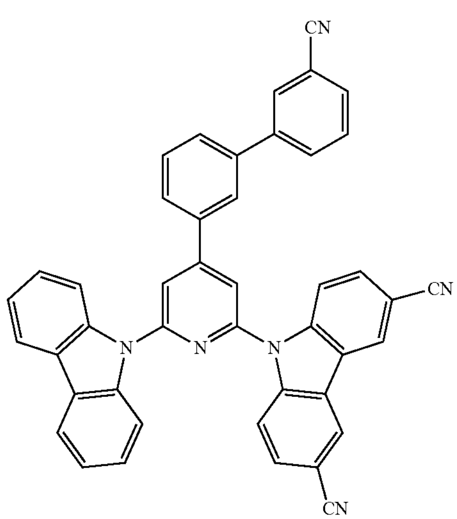
-continued
190
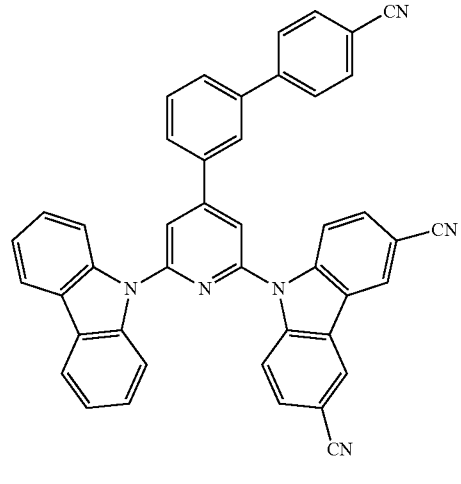
191
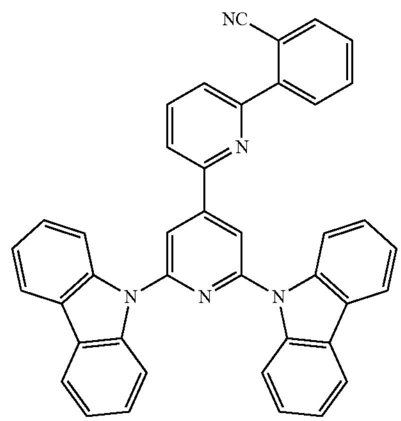
192
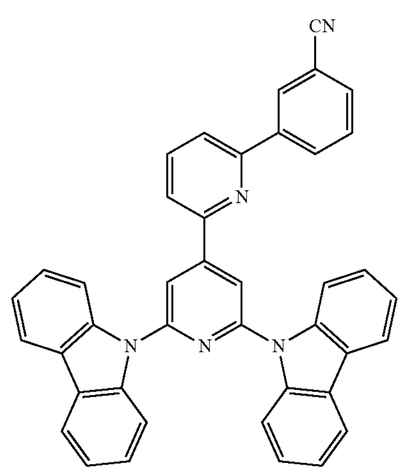

193
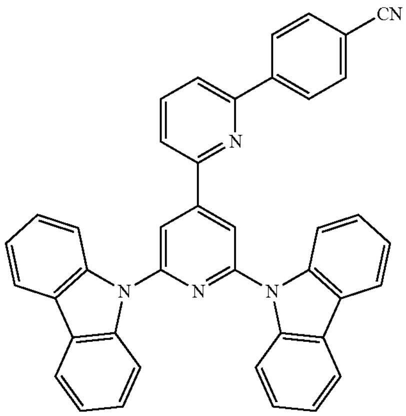
194
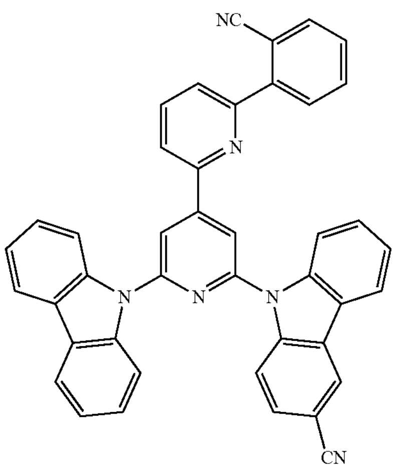
195
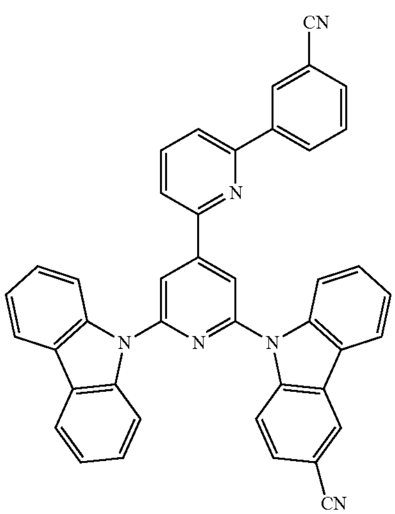
196
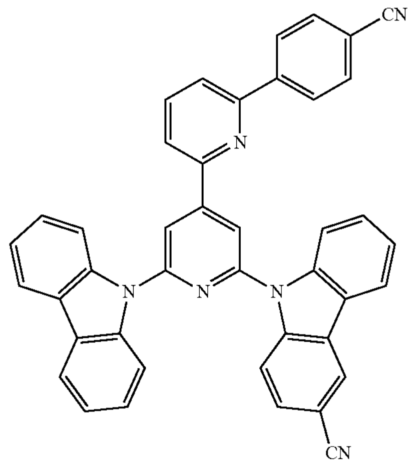
197
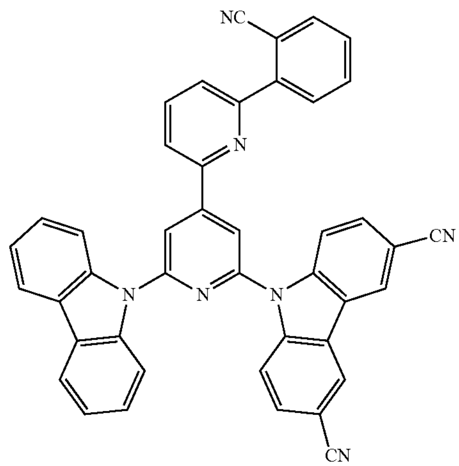
198
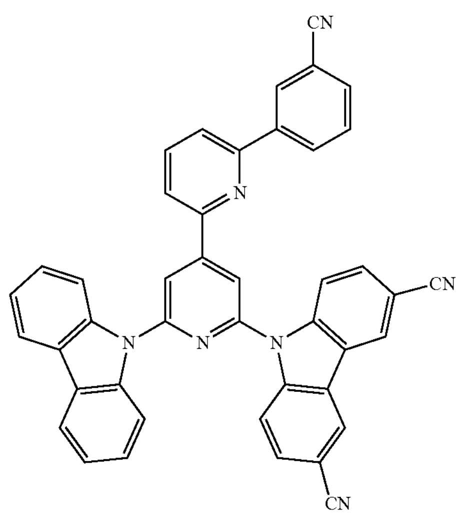

-continued
199
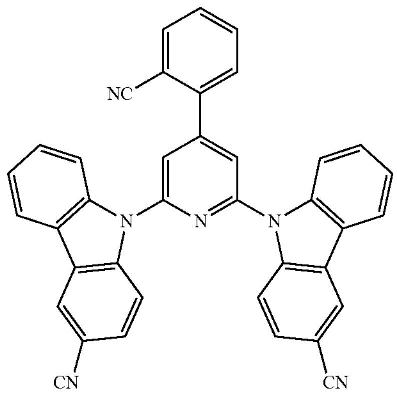
200
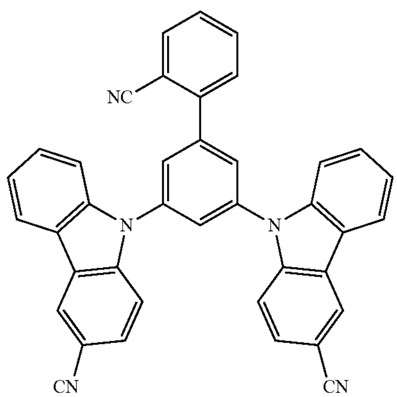
201
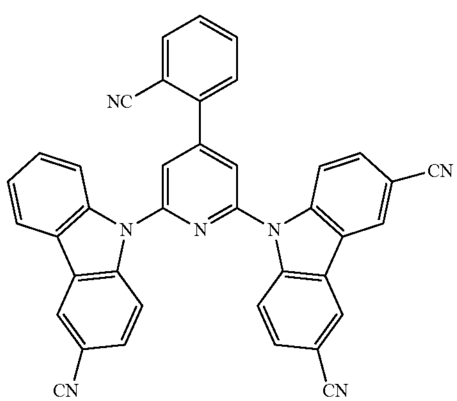
202
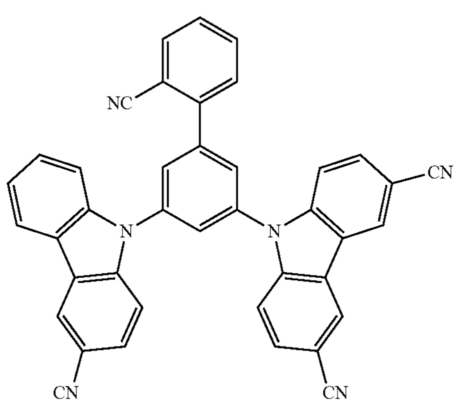
-continued
Group HE6
1
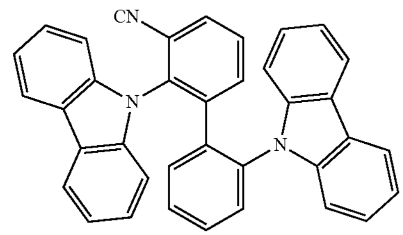
2
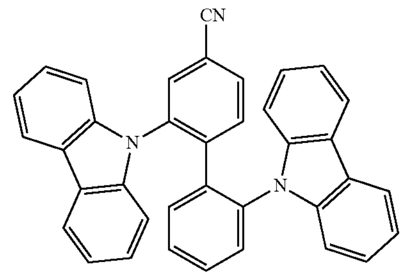
3
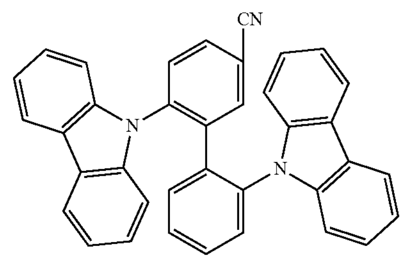
4
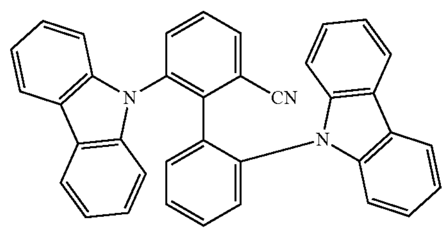
5
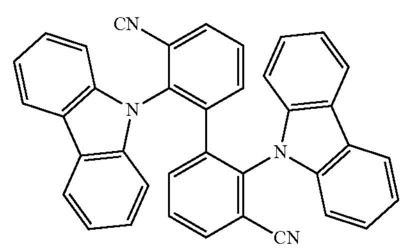
6
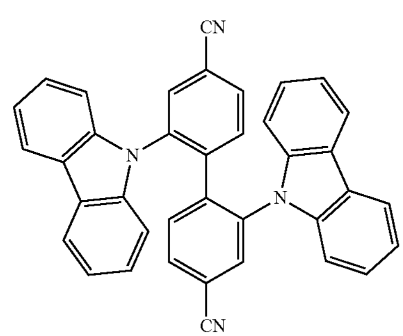

-continued
7
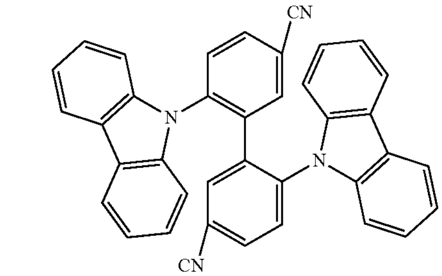
8
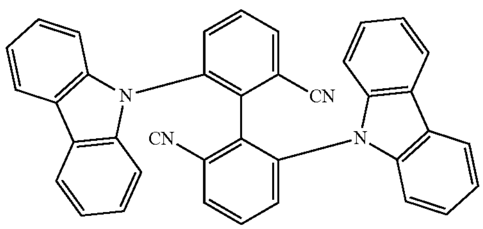
9
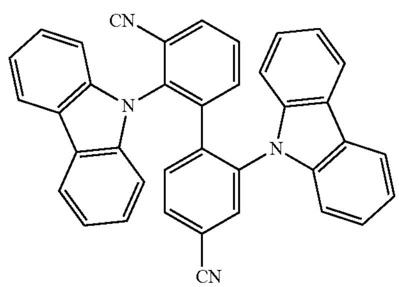
10
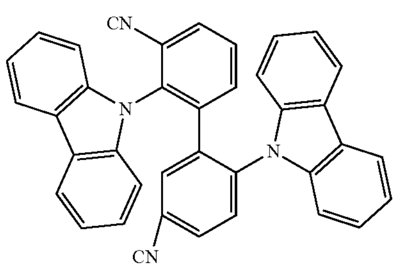
11
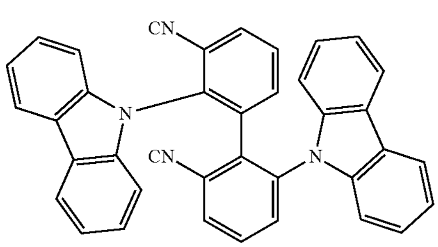
12
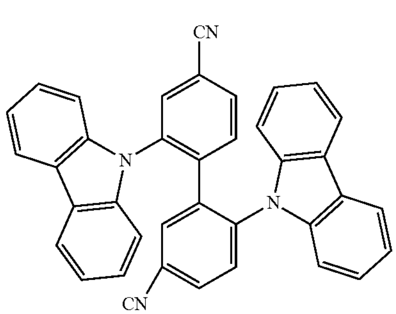
-continued
13
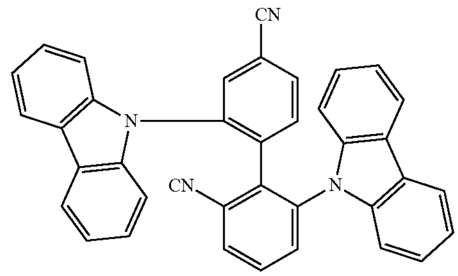
14
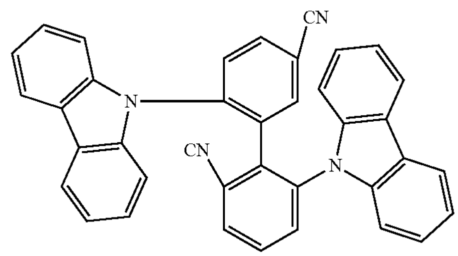
15
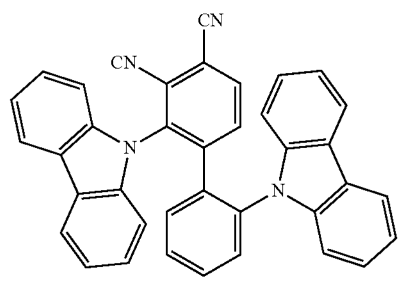
16
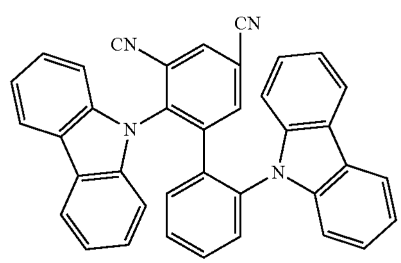
17
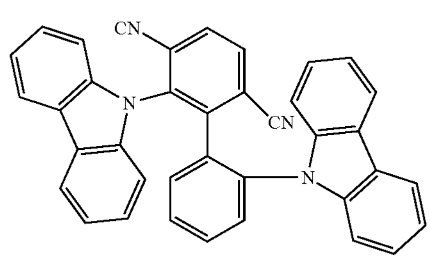
18
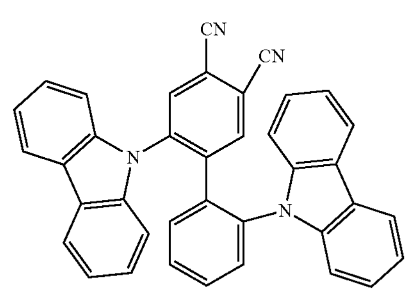

19
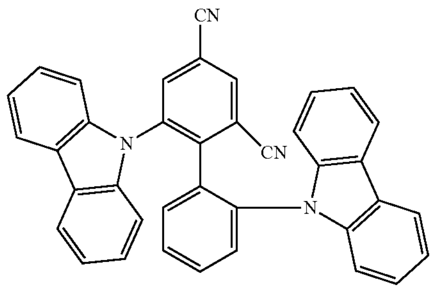
20
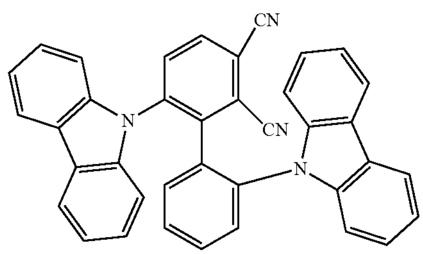
21
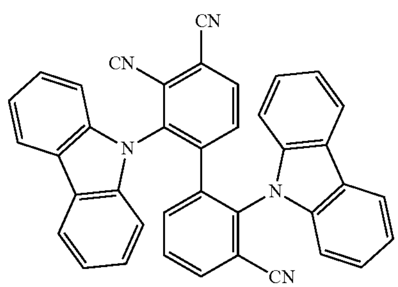
22
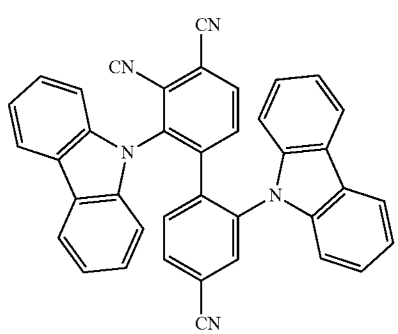
23
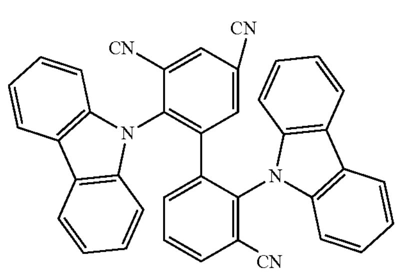
24
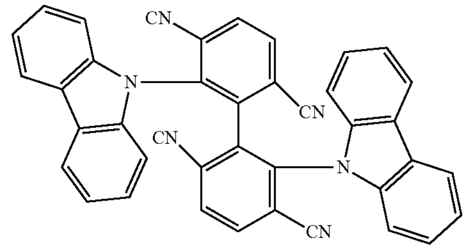
25
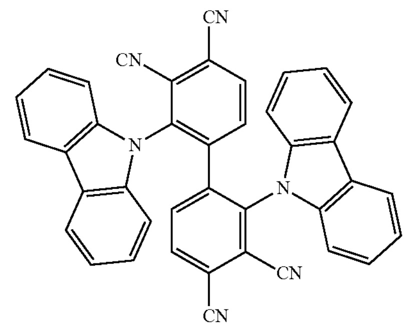
26
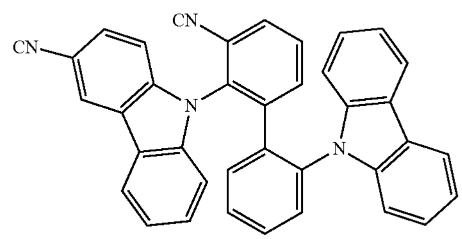
27
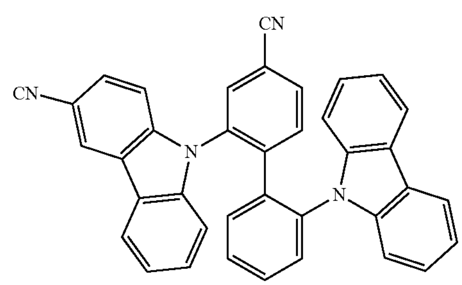
28
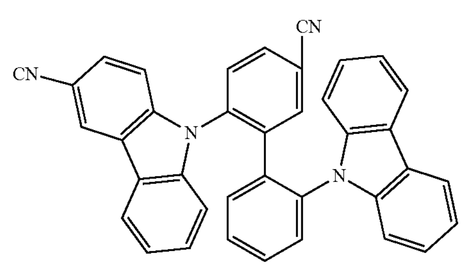
29
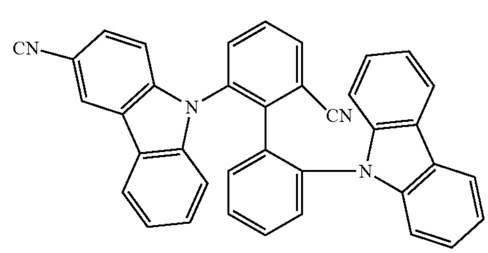

-continued
30
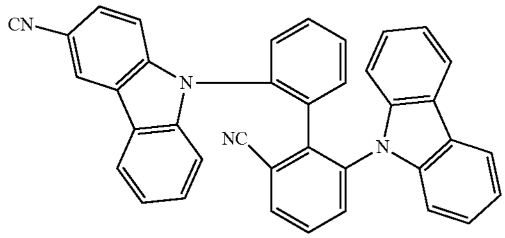
31
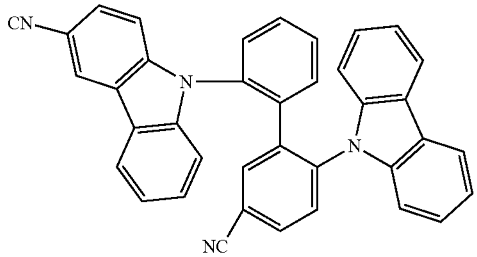
32
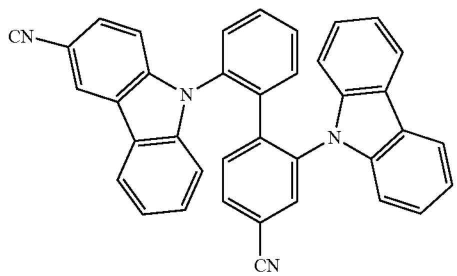
33
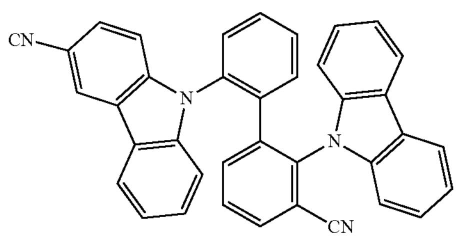
34
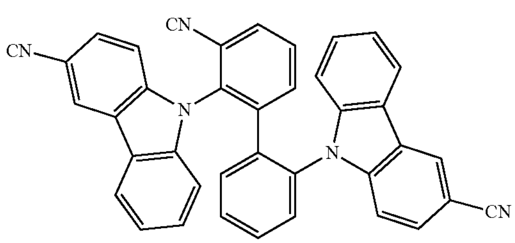
35
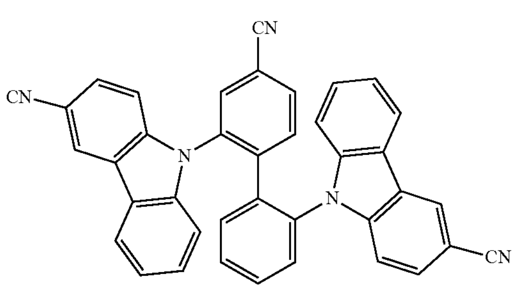
-continued
36
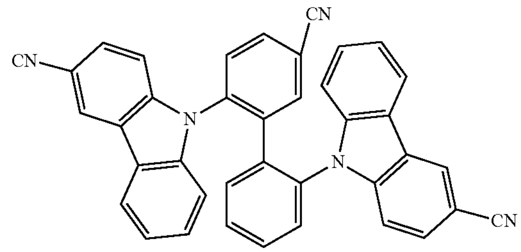
37
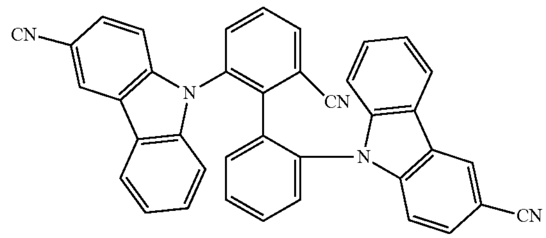
38
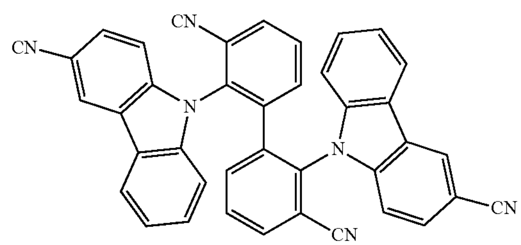
39
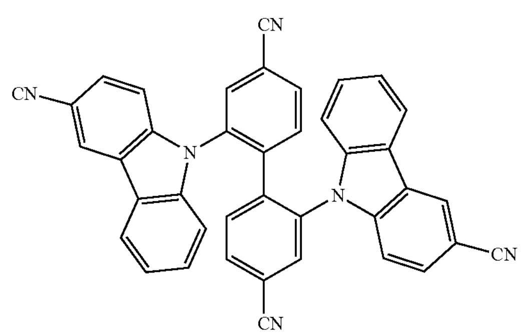
40
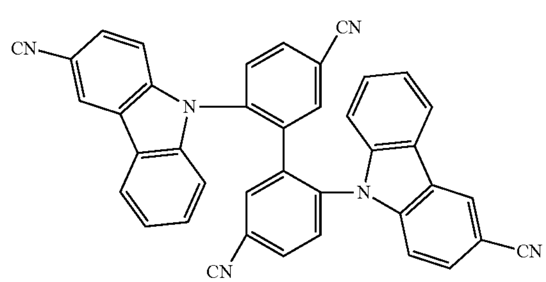

-continued
41
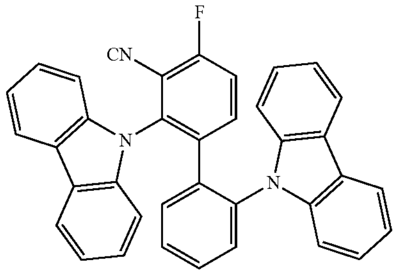
42
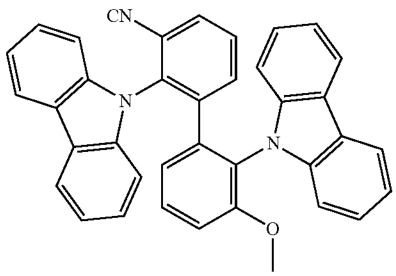
43
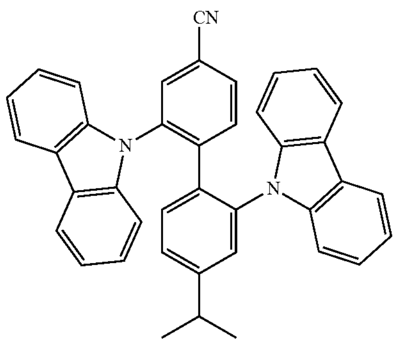
44
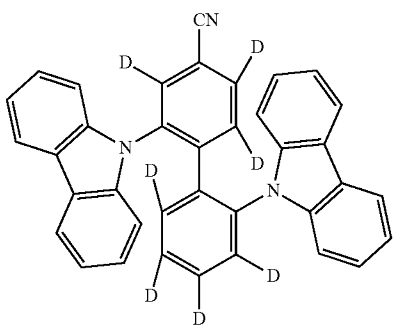
45
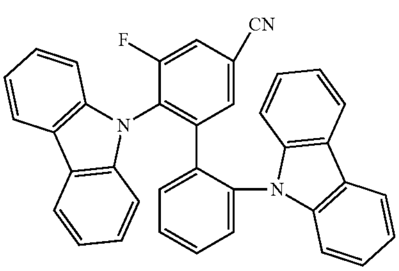
-continued
46
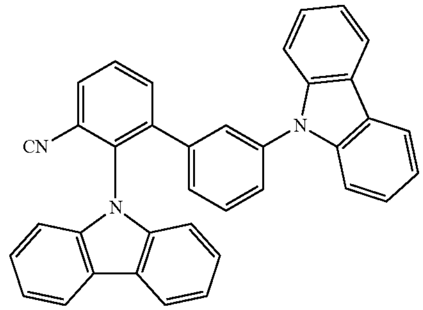
47
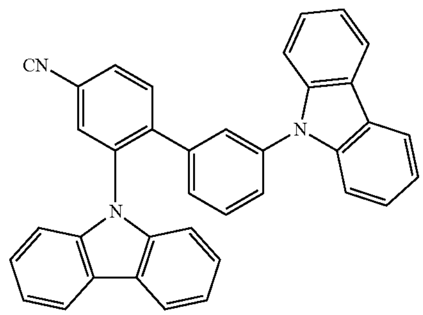
48
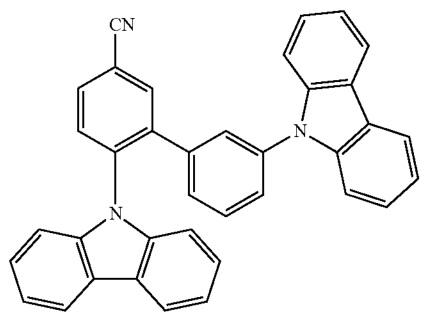
49
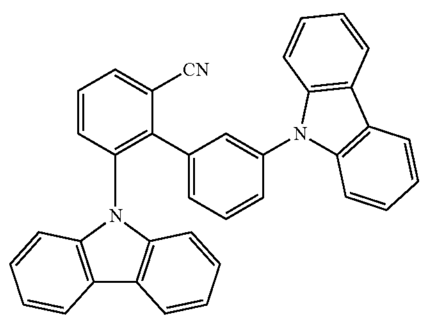
50
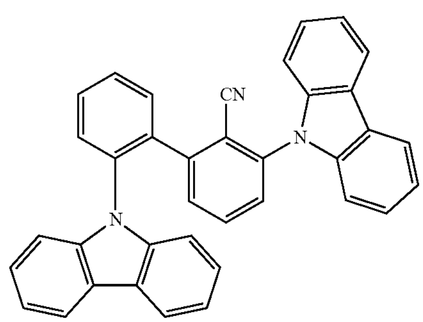

-continued
51
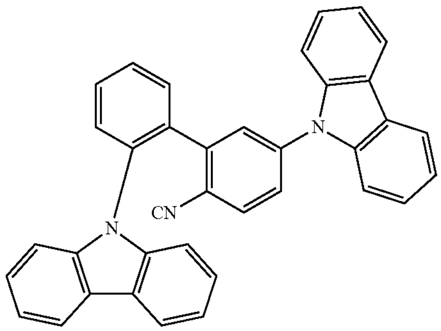
52
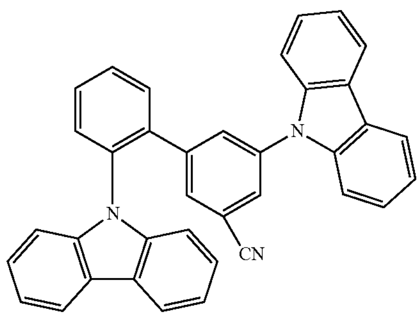
53
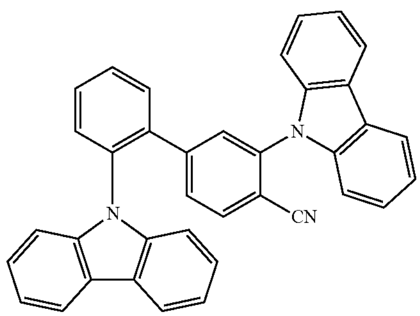
54
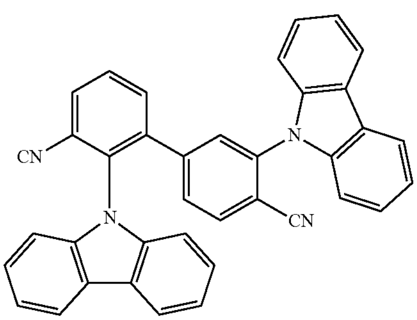
55
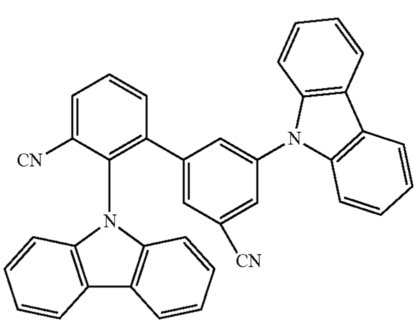
-continued
56
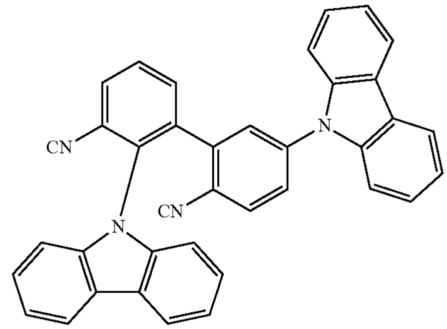
57
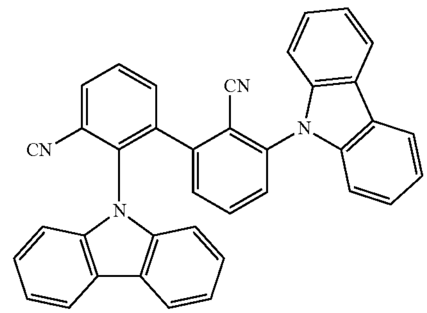
58
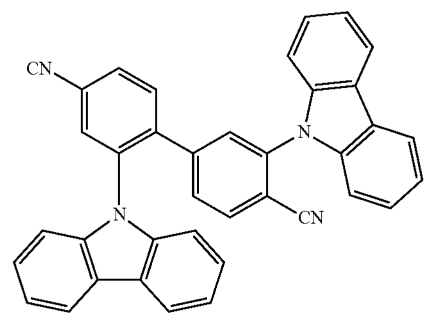
59
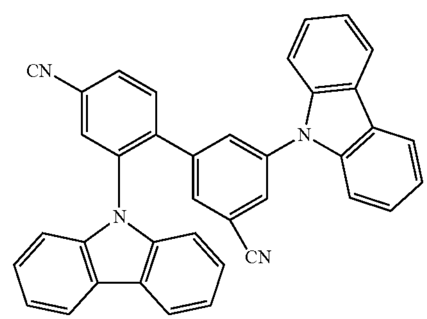
60
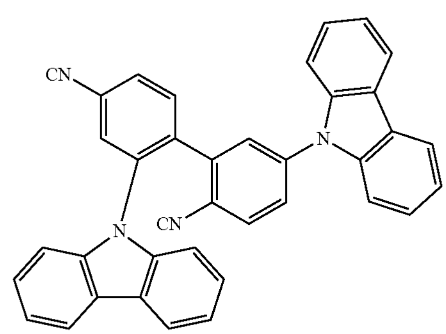

-continued
61
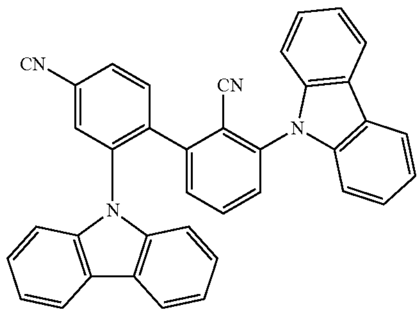
62
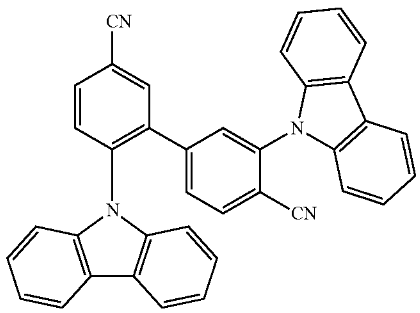
63
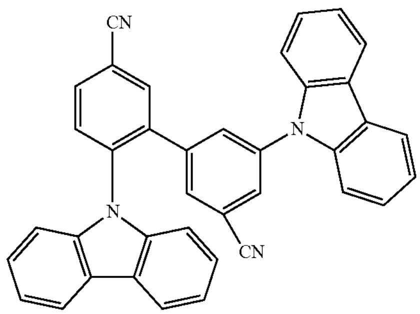
64
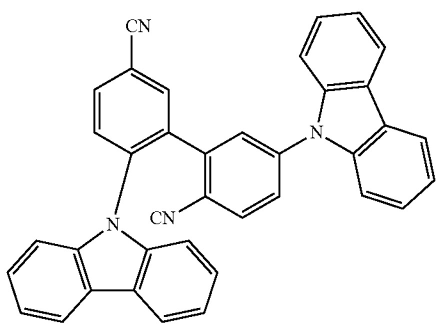
65
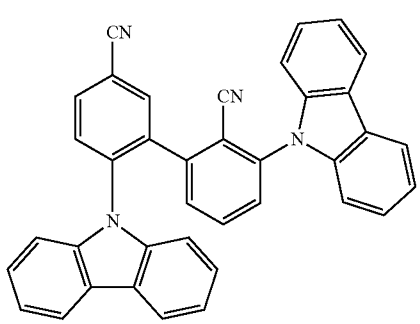
-continued
66
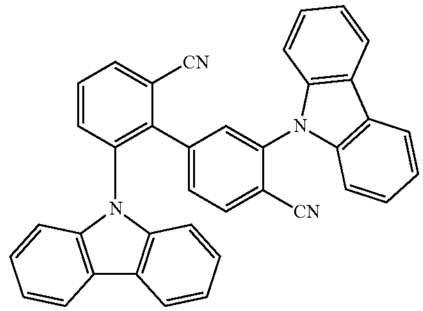
67
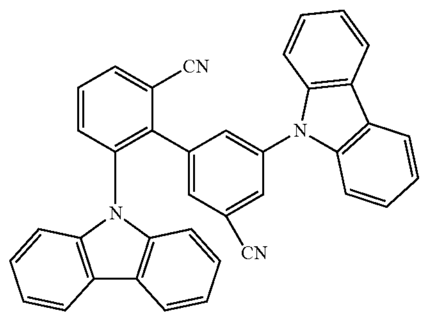
68
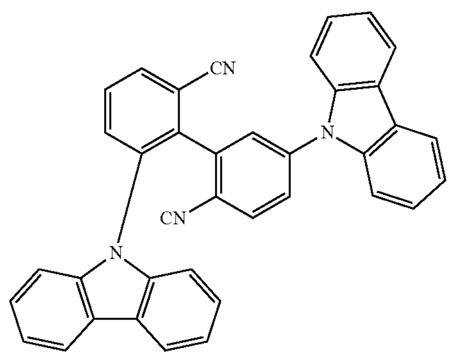
69
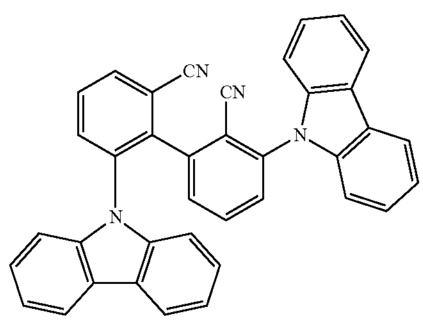
70
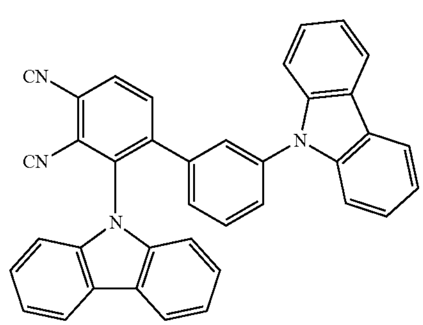

-continued
71
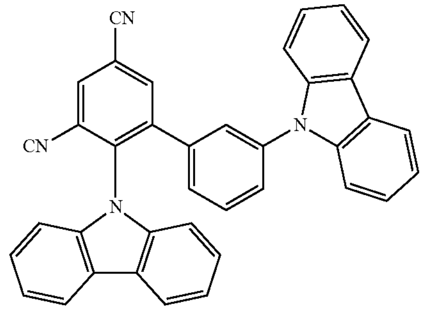
72
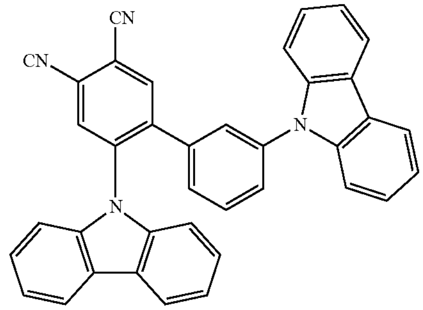
73
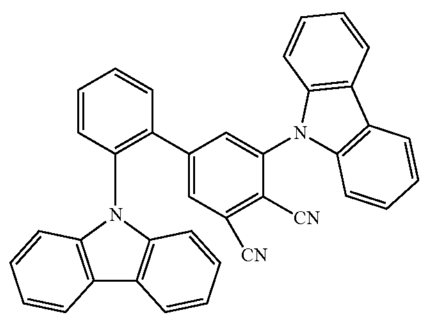
74
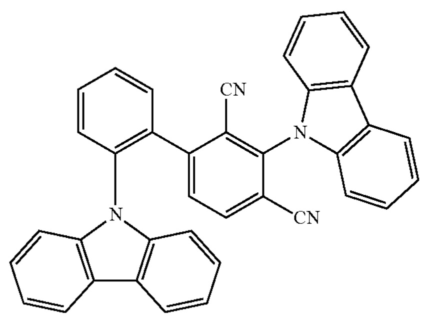
75
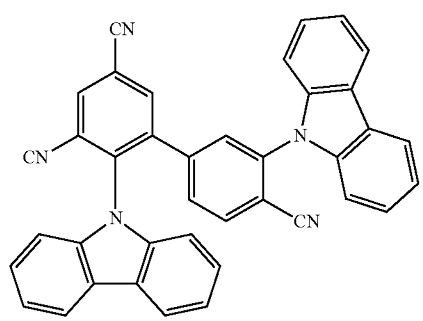
-continued
76
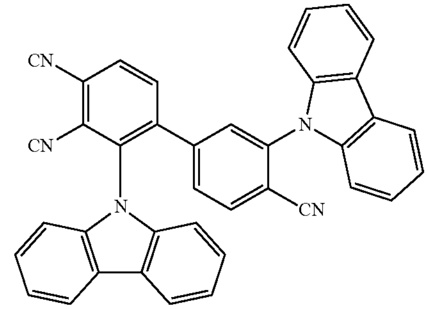
77
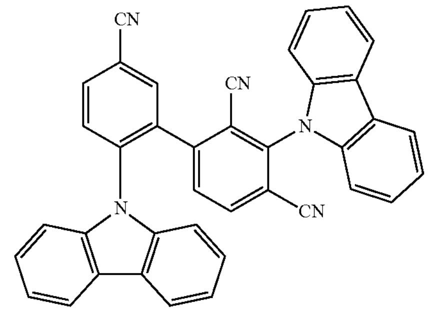
78
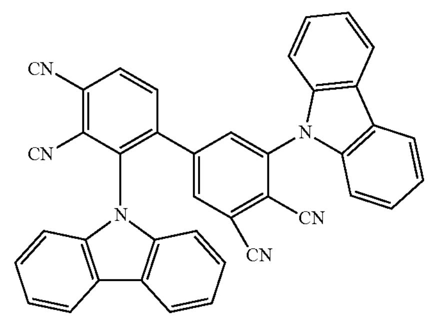
79
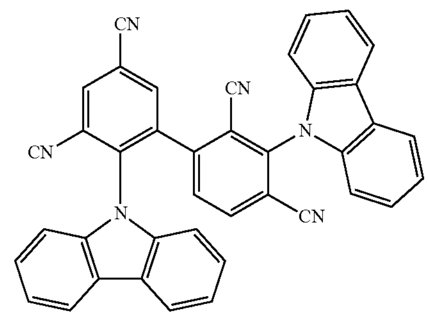
80
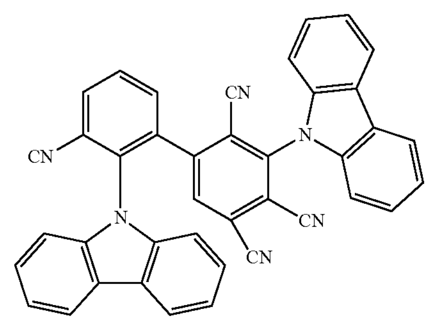

-continued
81
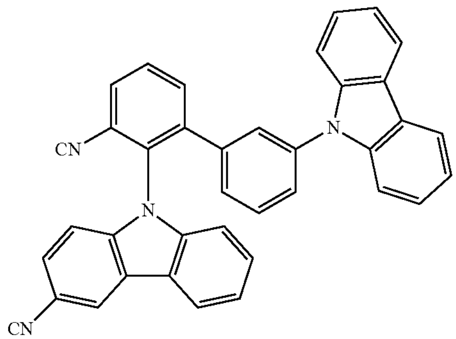
82
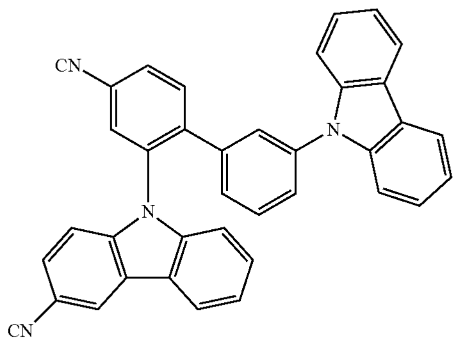
83
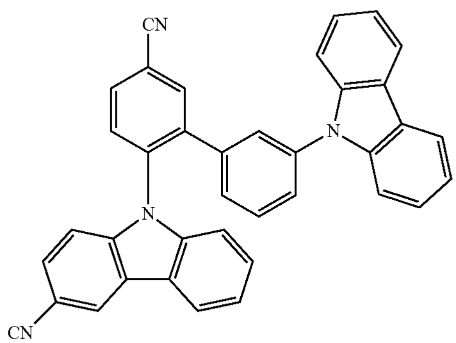
84
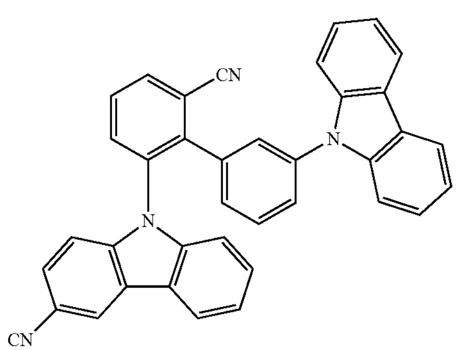
-continued
85
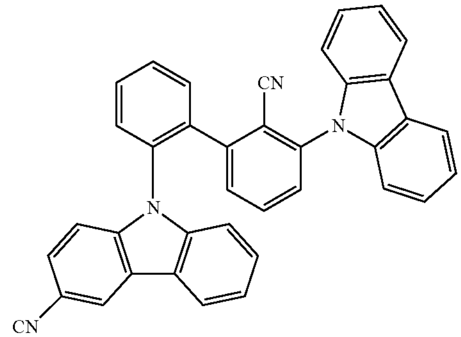
86
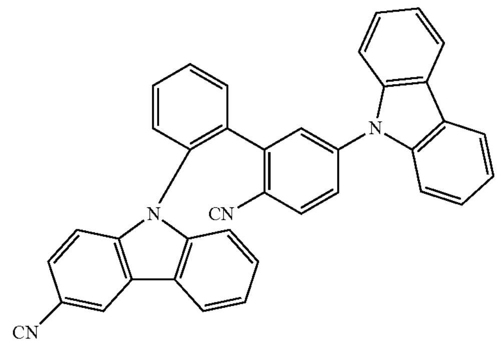
87
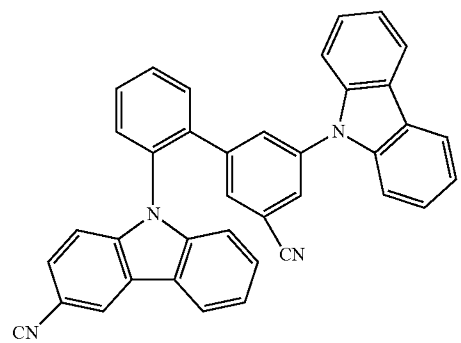
88
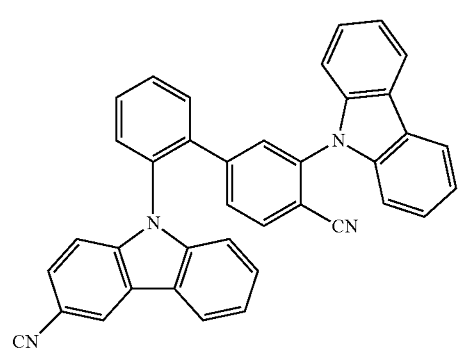

-continued
89
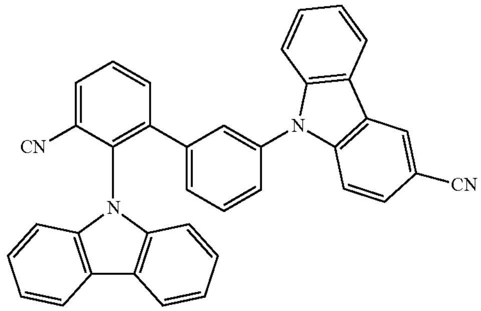
90
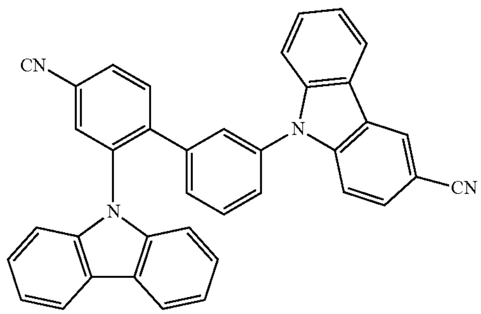
91
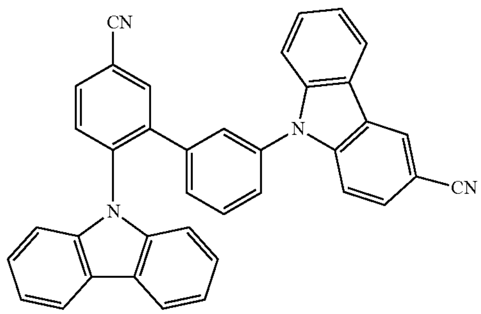
92
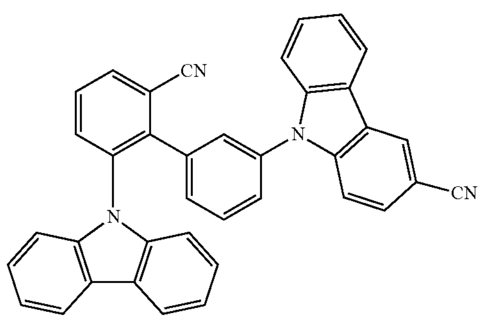
93
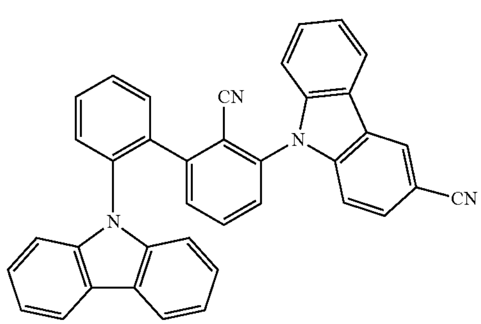
-continued
94
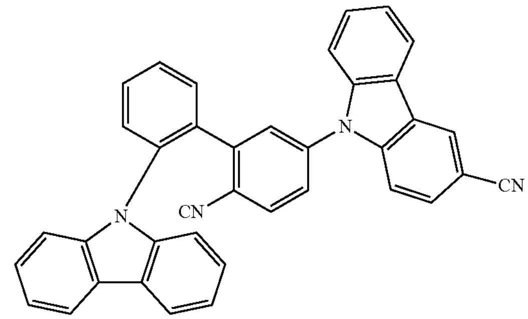
95
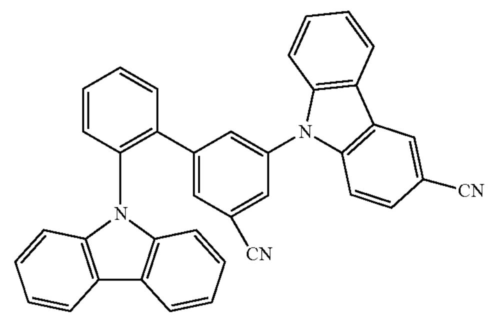
96
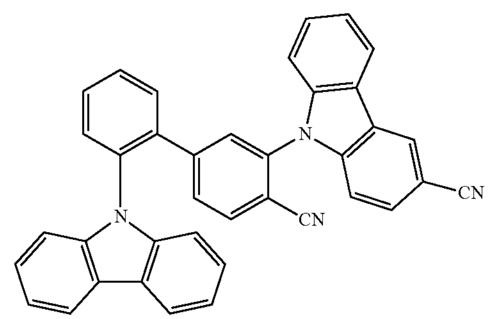
97
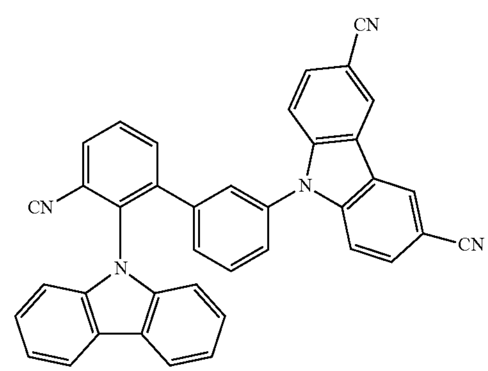

-continued
98
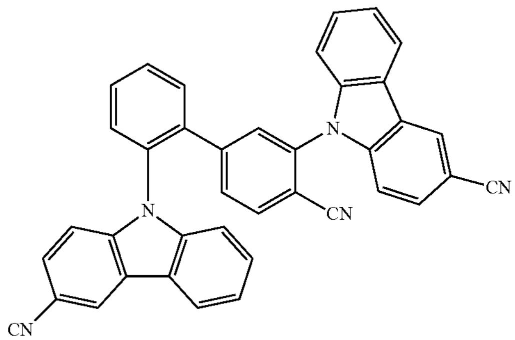
99
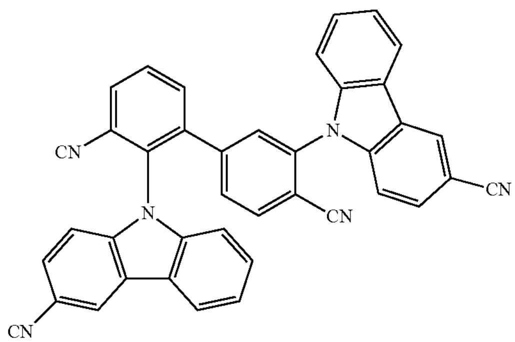
100
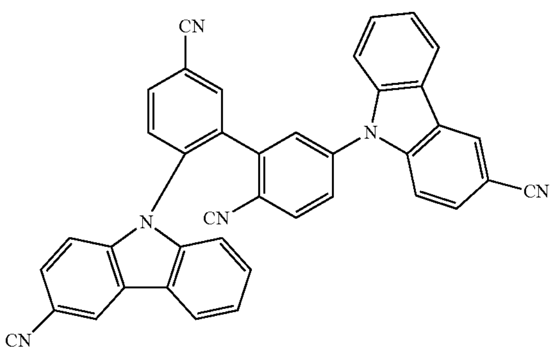
101
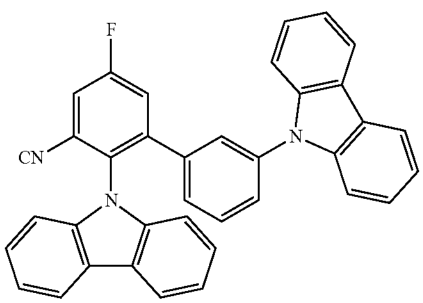
-continued
102
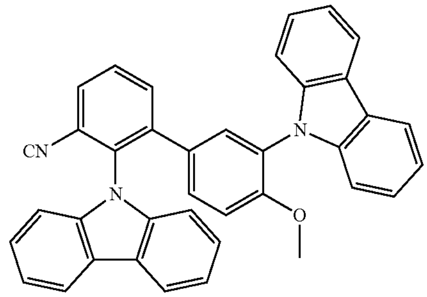
103
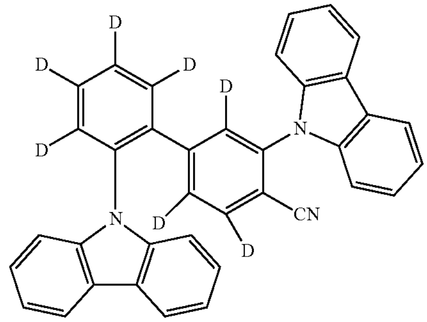
104
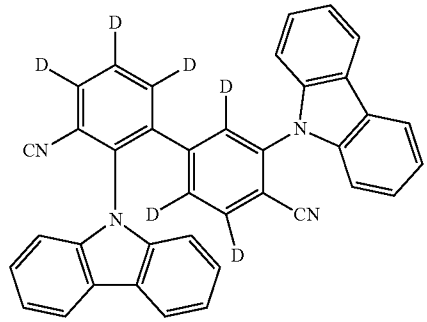
105
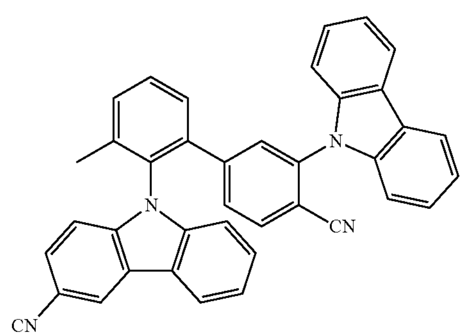
106
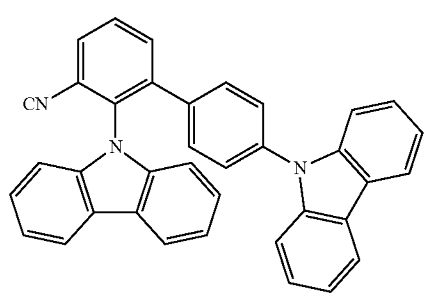

-continued
107
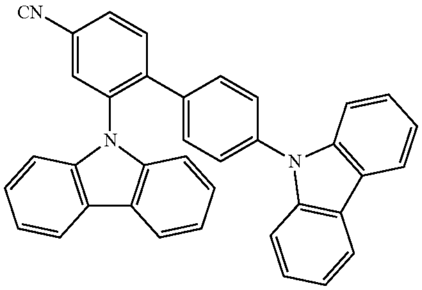
108
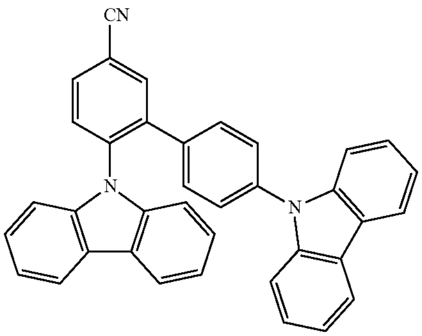
109
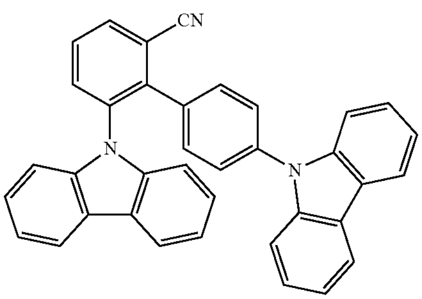
110
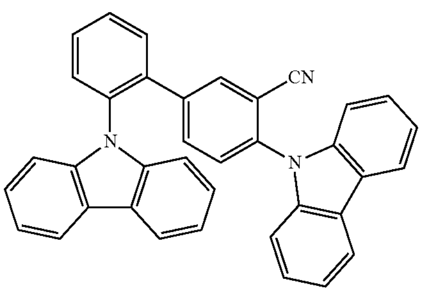
111
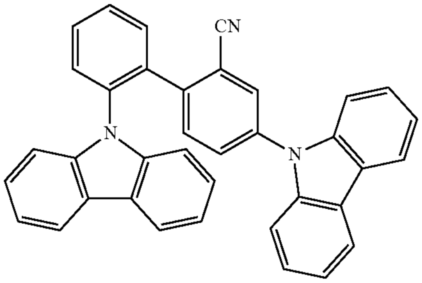
-continued
112
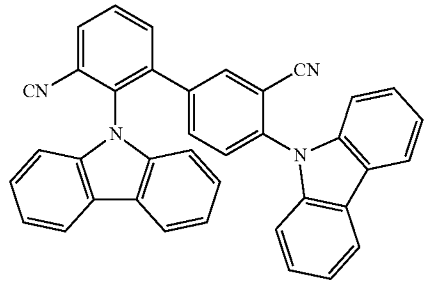
113
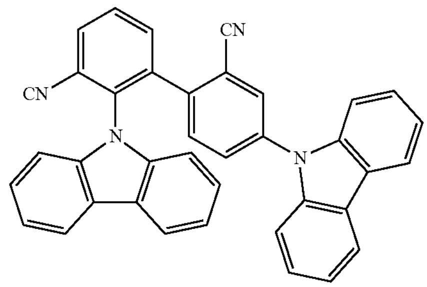
114
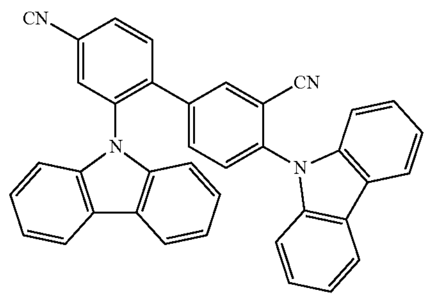
115
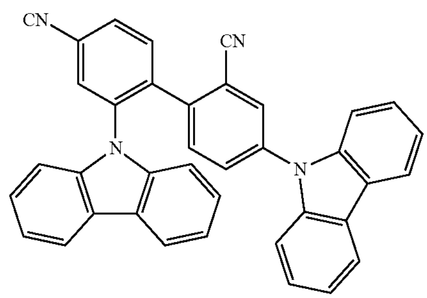
116
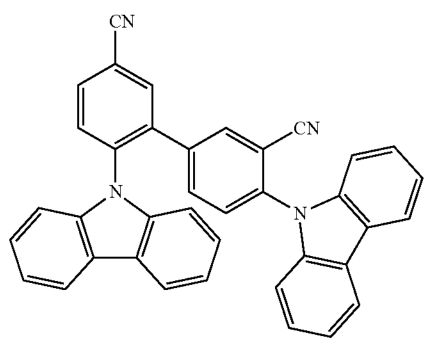

-continued
117
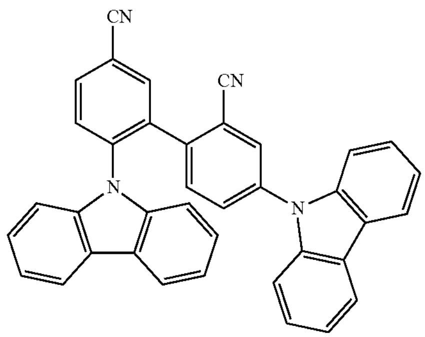
118
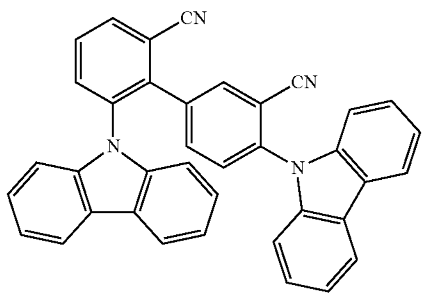
119
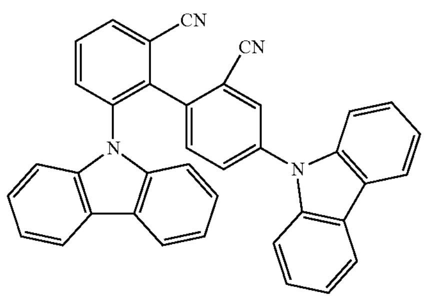
120
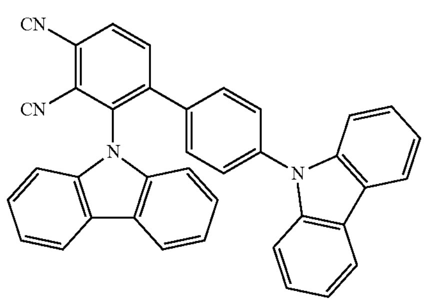
121
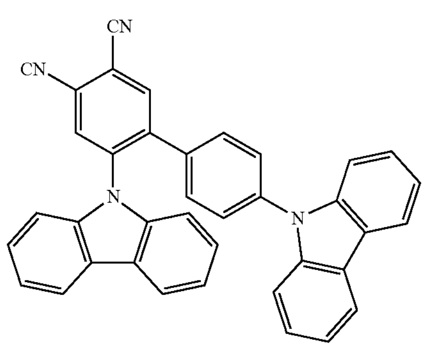
-continued
122
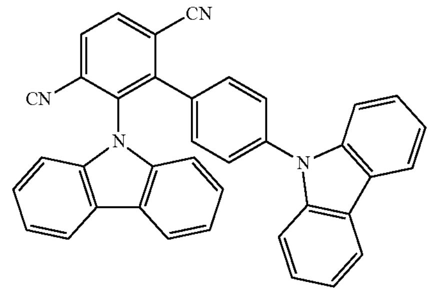
123
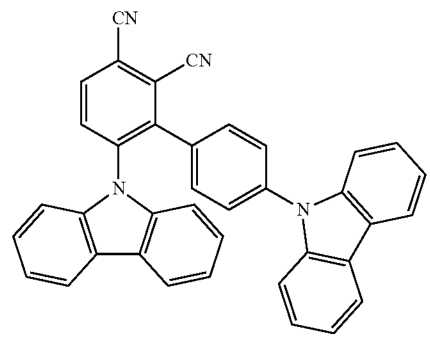
124
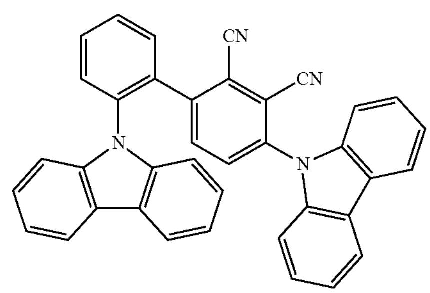
125
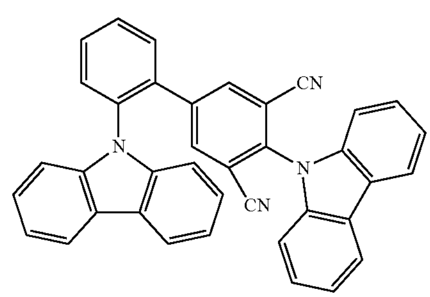
126
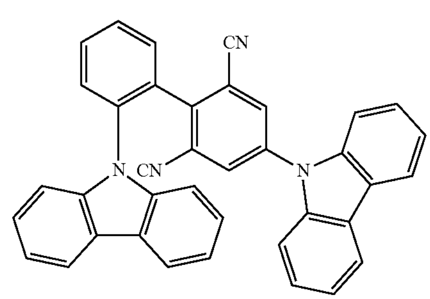

-continued
127
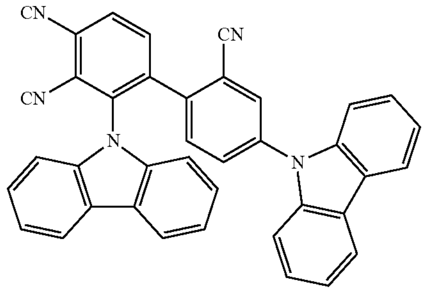
128
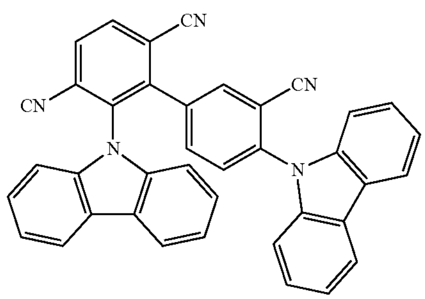
129
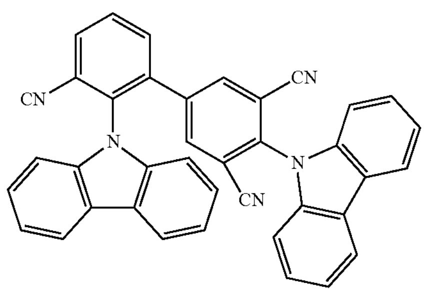
130
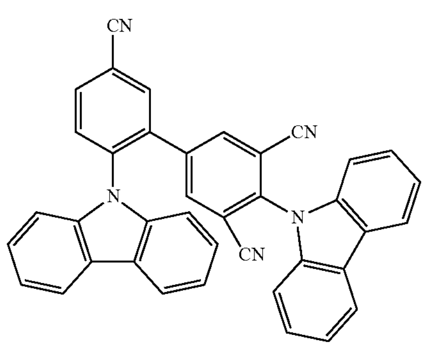
131
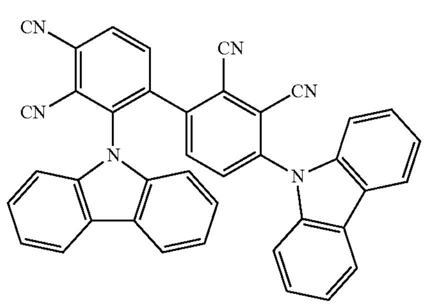
-continued
132
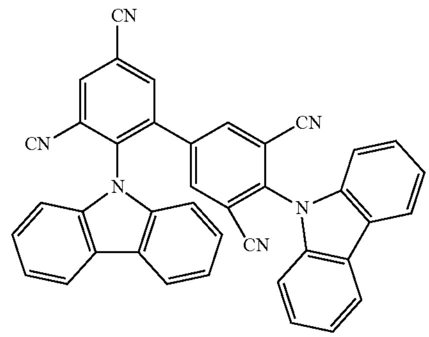
133
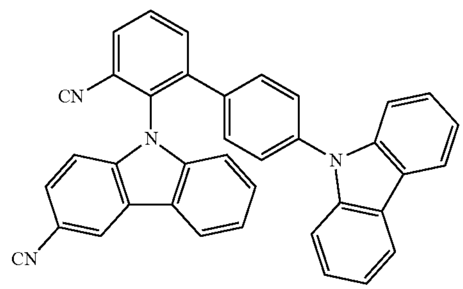
134
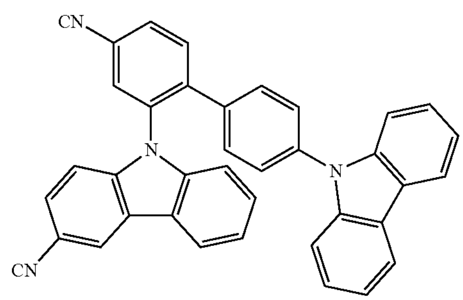
135
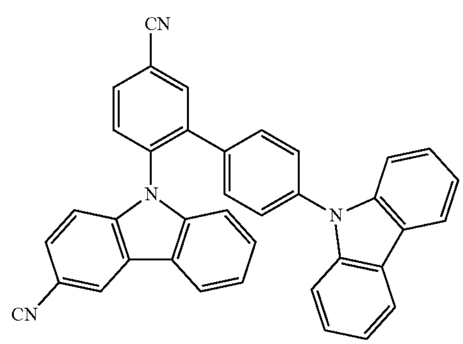
136
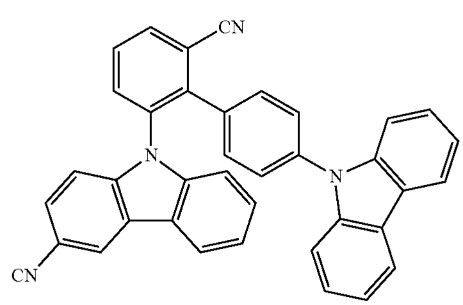

-continued
137
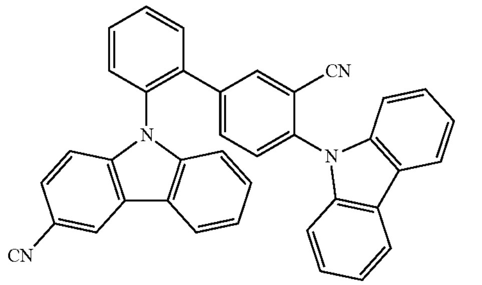
138
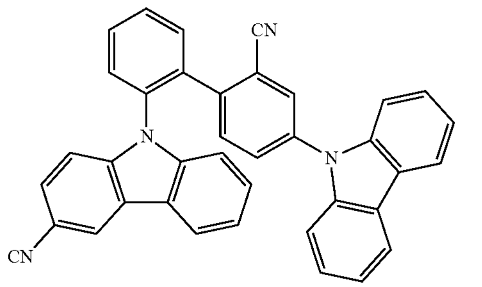
139
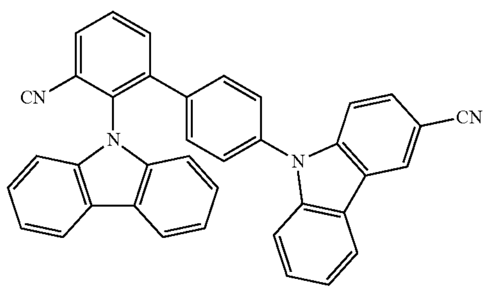
140
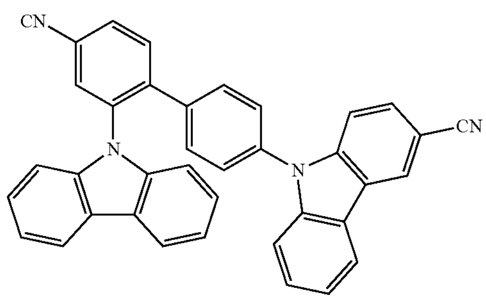
141
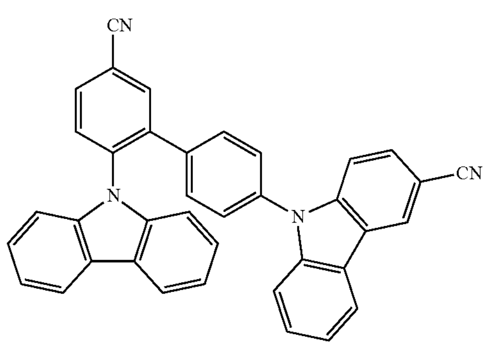
-continued
142
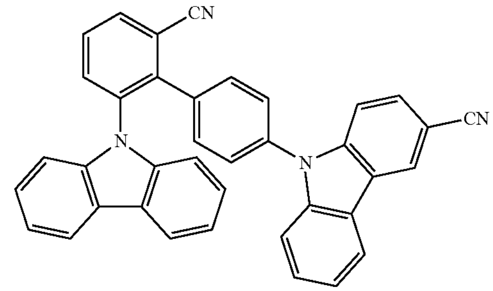
143
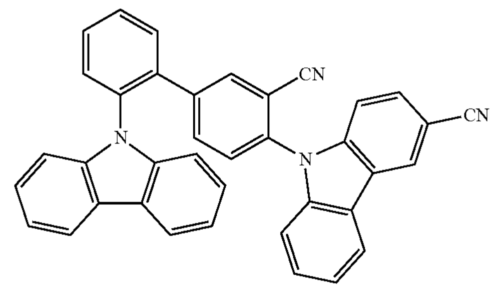
144
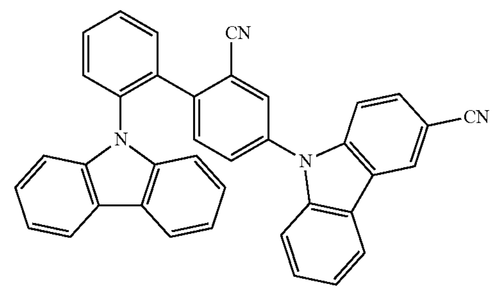
145
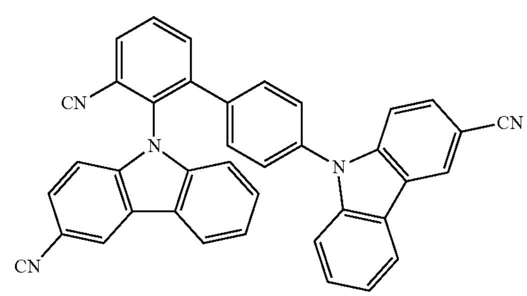
146
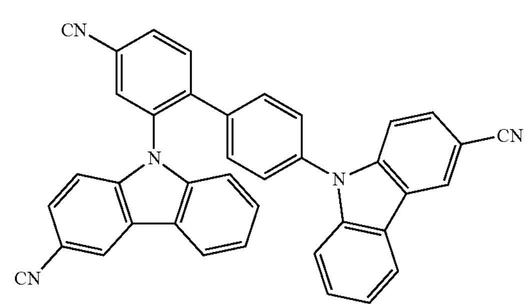

-continued
147
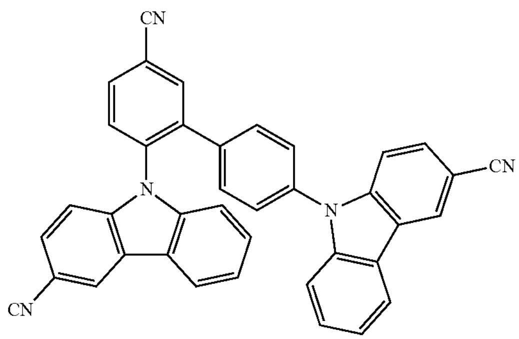
148
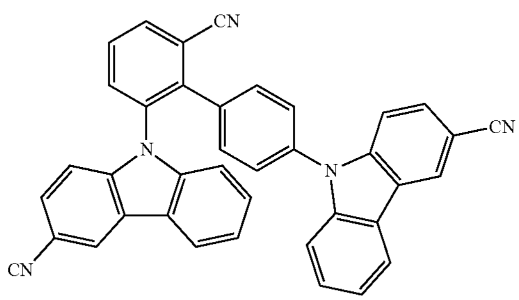
149
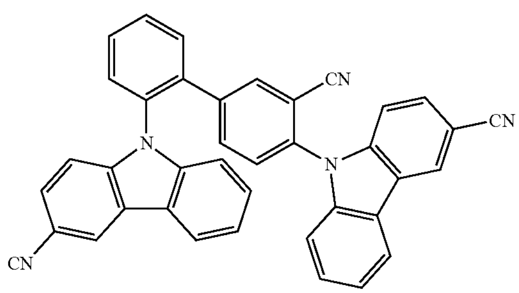
150
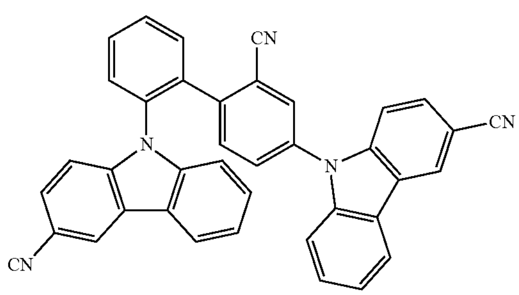
151
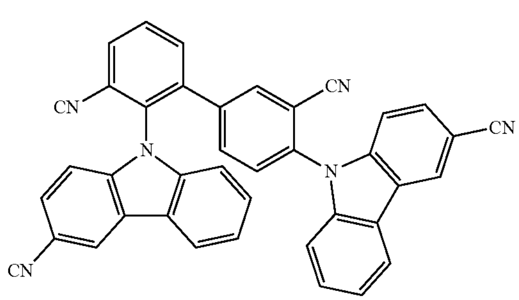
-continued
152
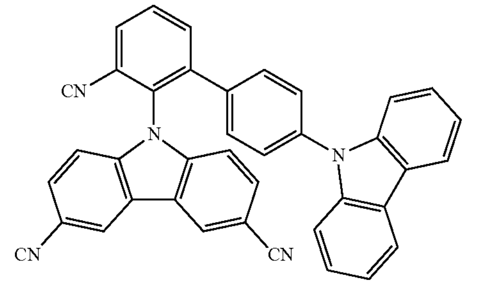
153
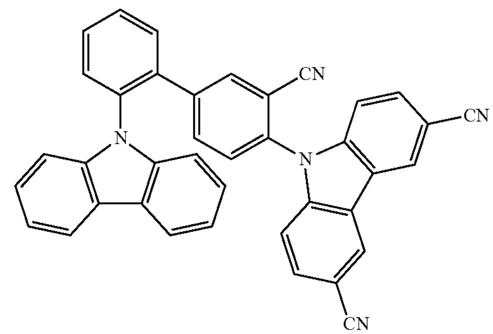
154
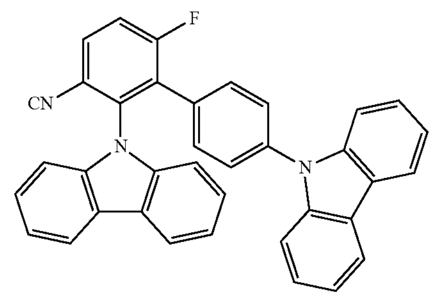
155
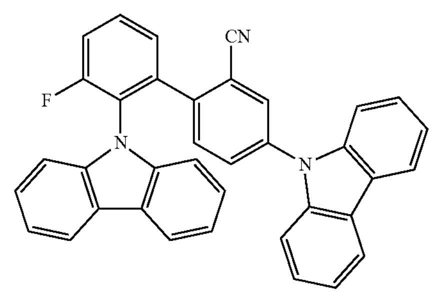
156
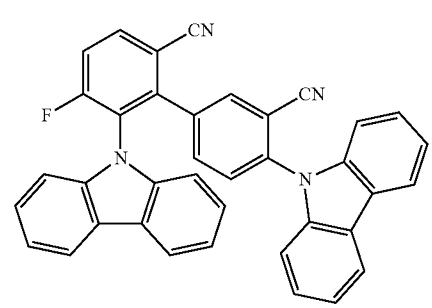

-continued
157
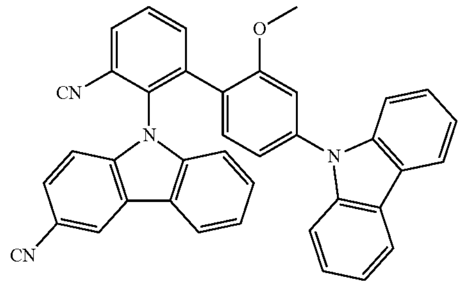
158
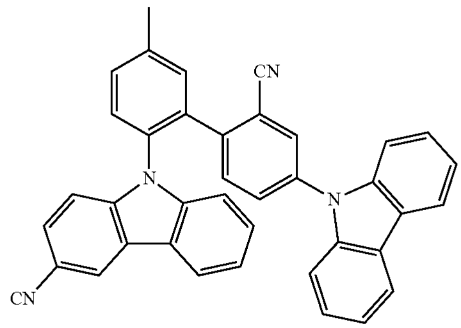
159
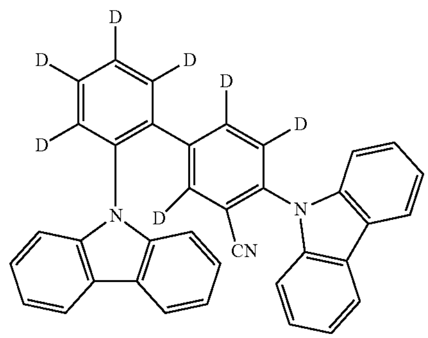
160
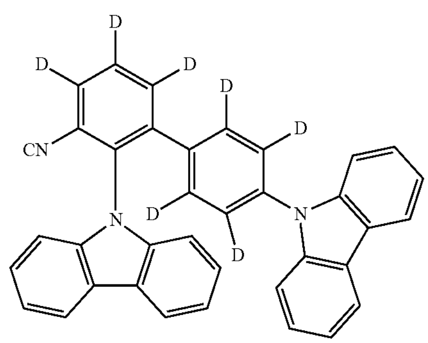
161
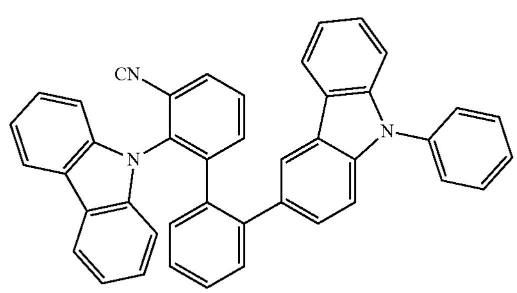
-continued
162
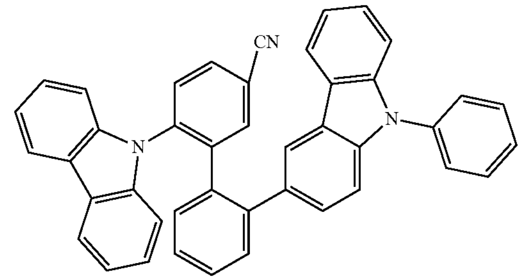
163
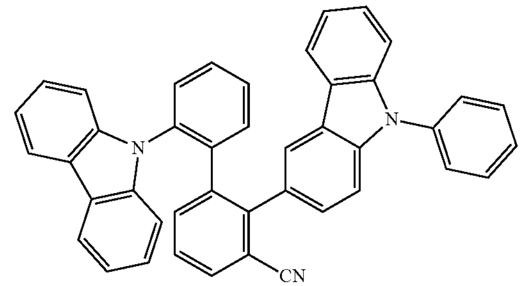
164
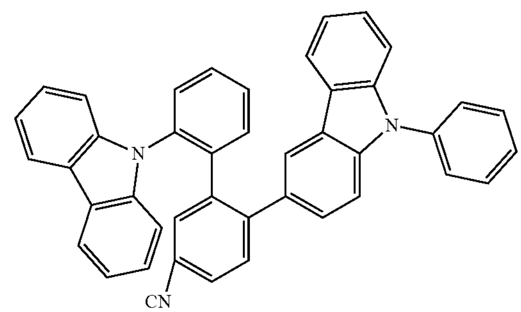
165
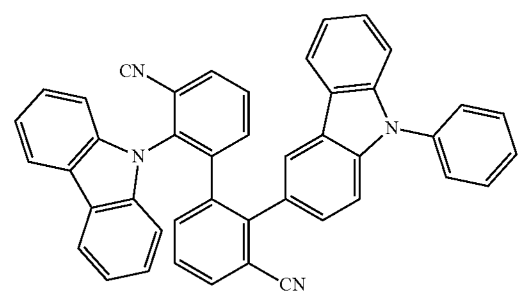
166
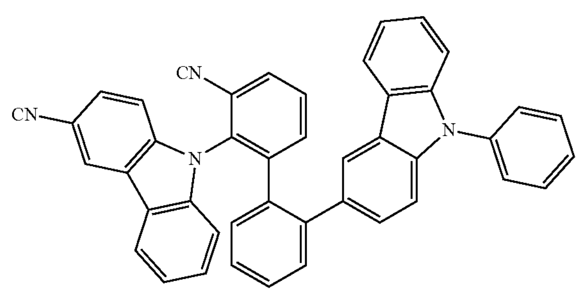

-continued
167
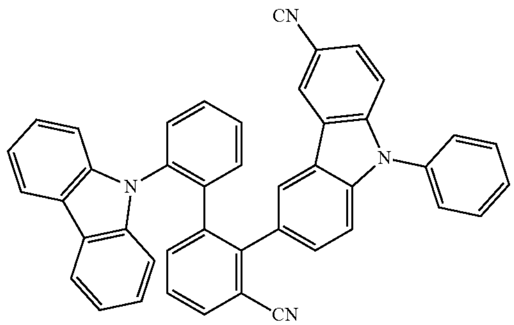
168
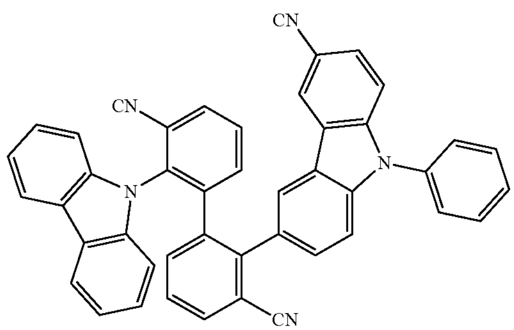
169
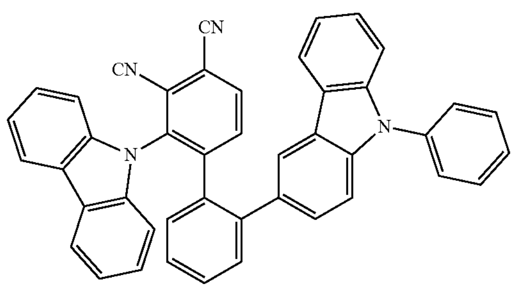
170
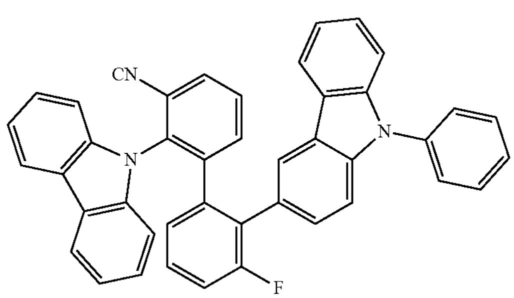
171
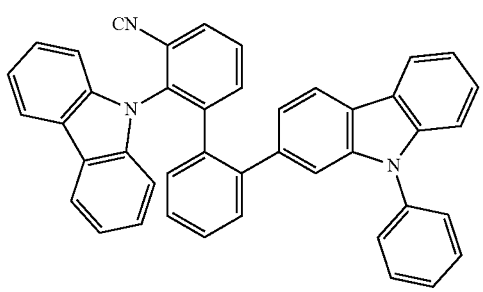
-continued
172
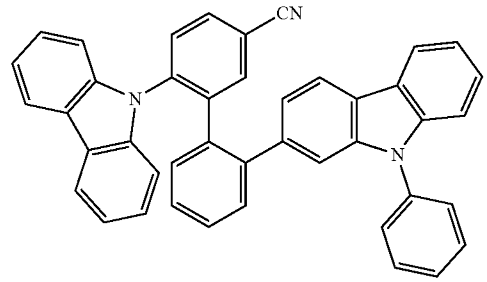
173
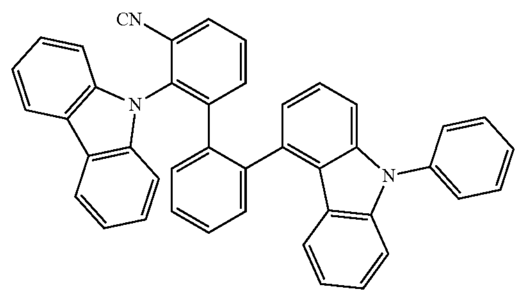
174
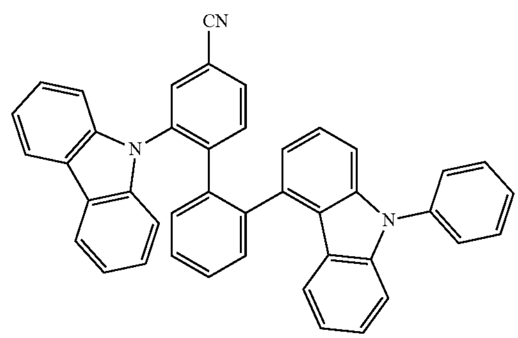
175
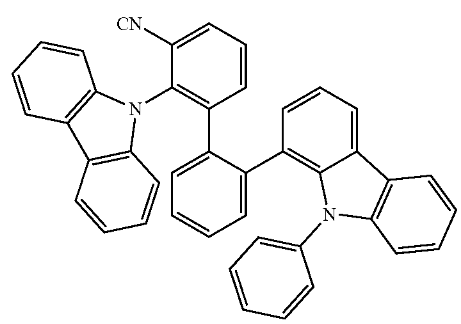
176
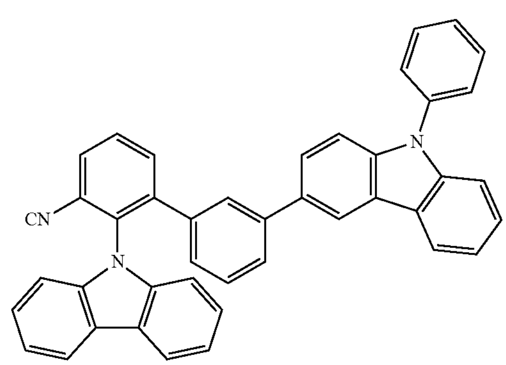

-continued
177
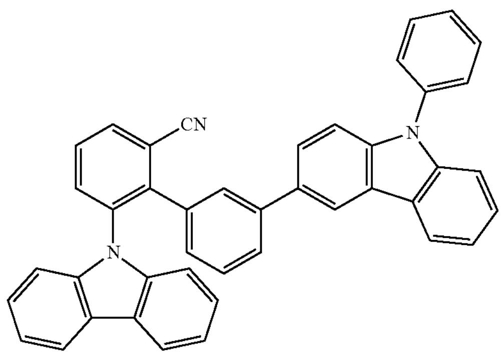
178
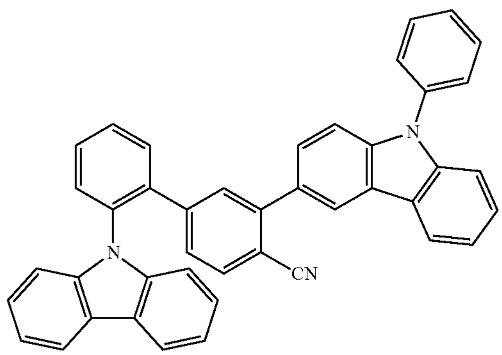
179
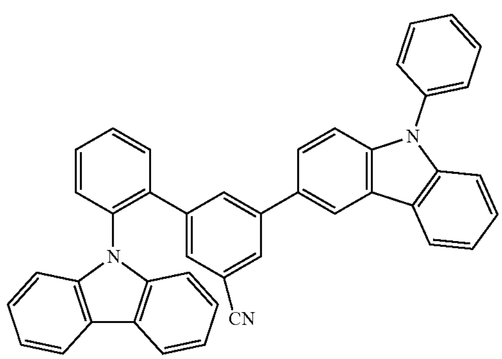
180
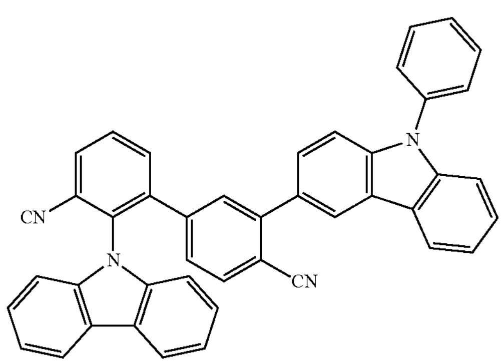
-continued
181
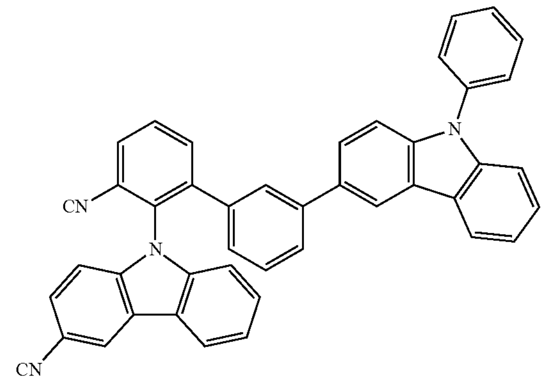
182
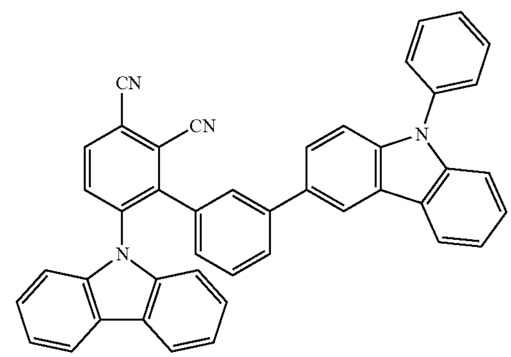
183
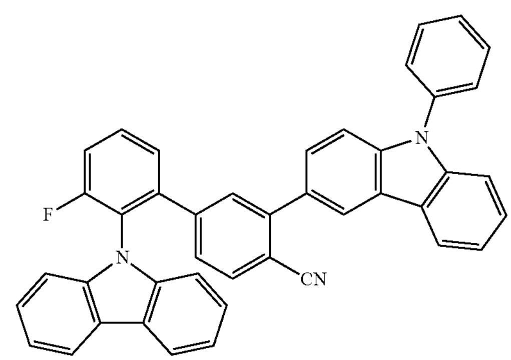
184
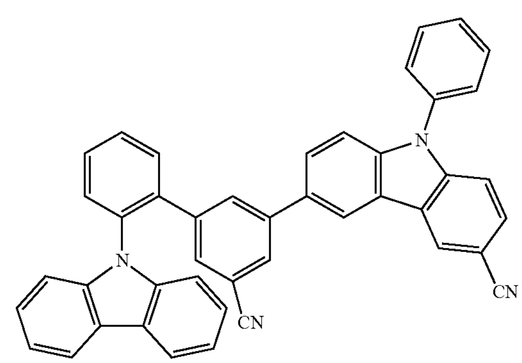

-continued
185
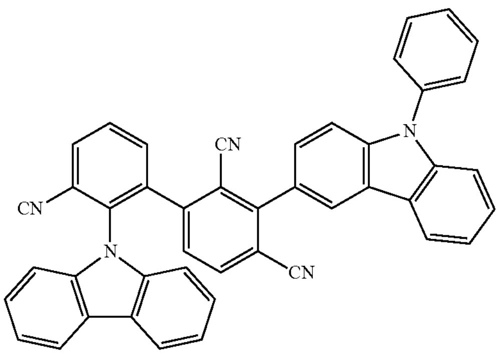
186
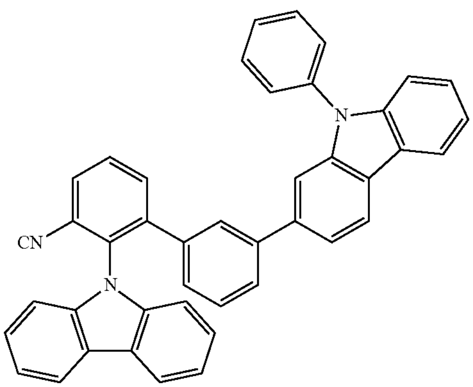
187
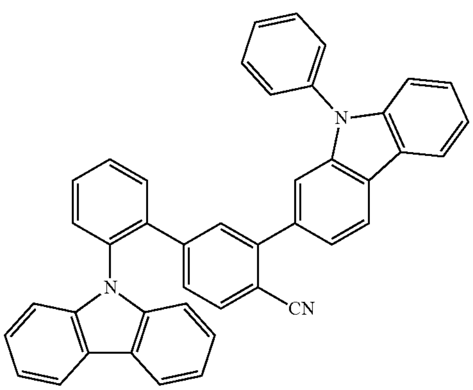
188
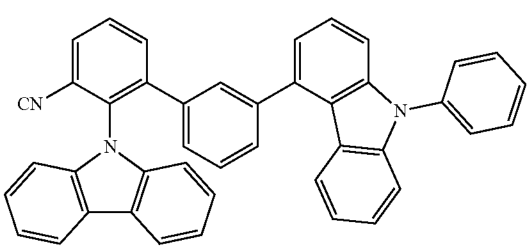
-continued
189
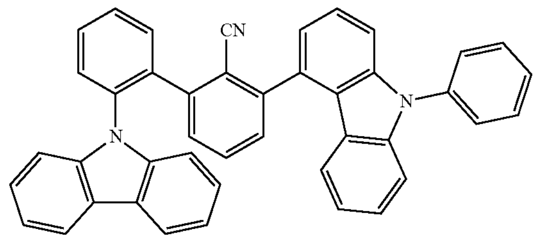
190
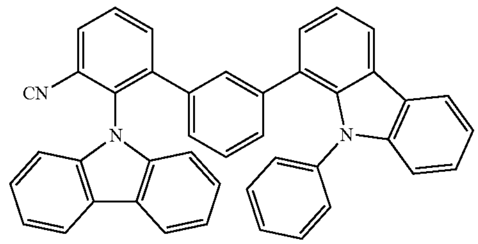
191
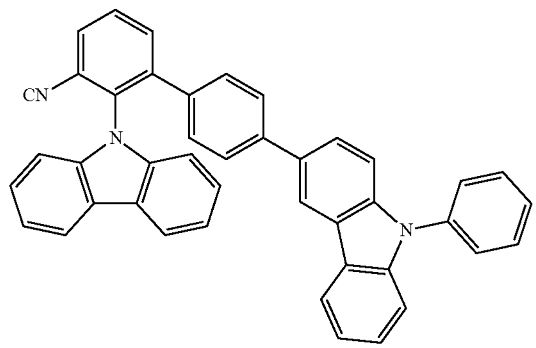
192
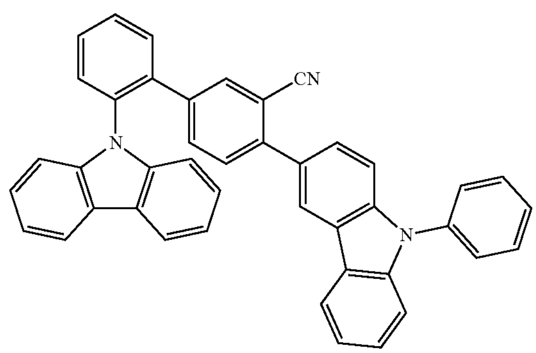
193
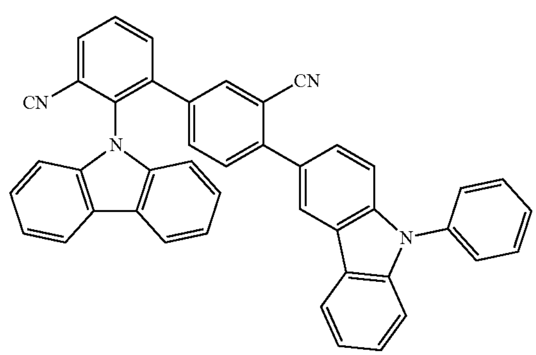

-continued
194
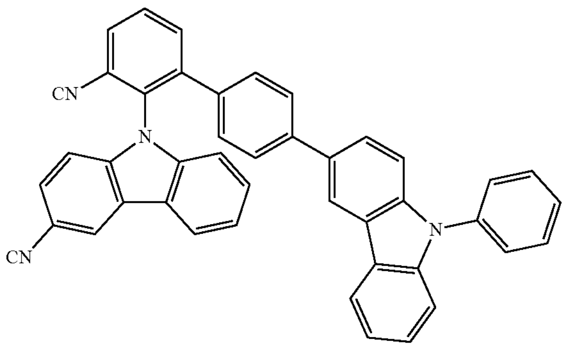
195
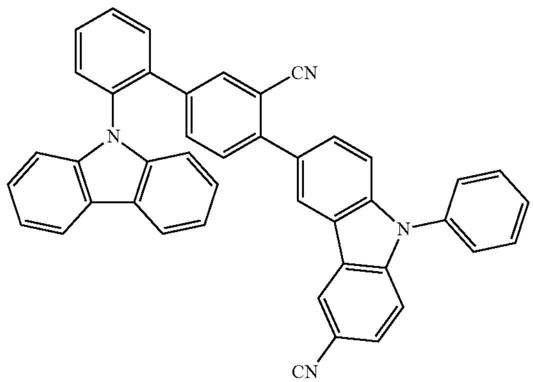
196
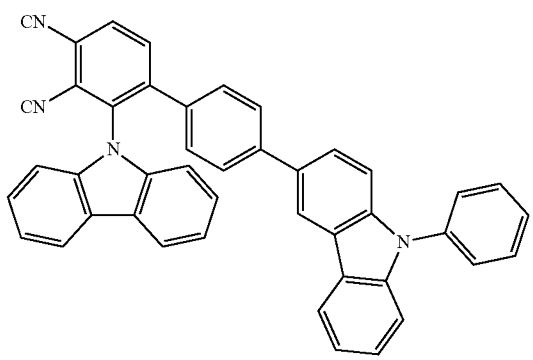
197
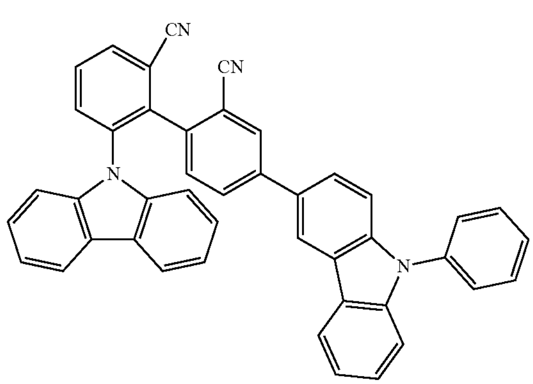
-continued
198
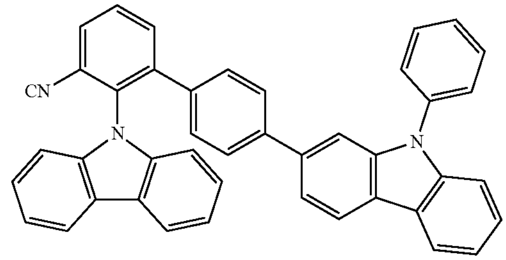
199
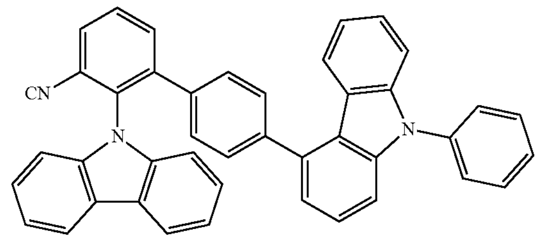
200
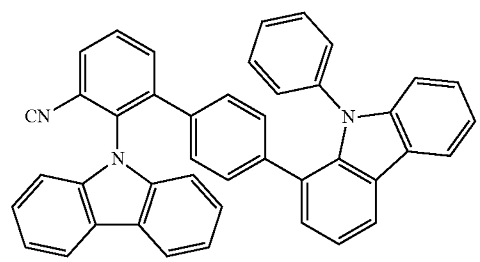
201
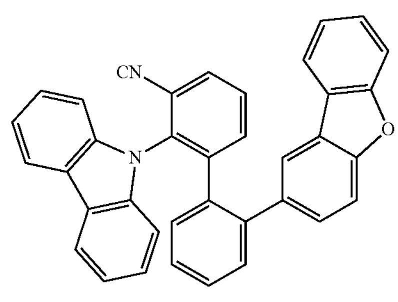
202
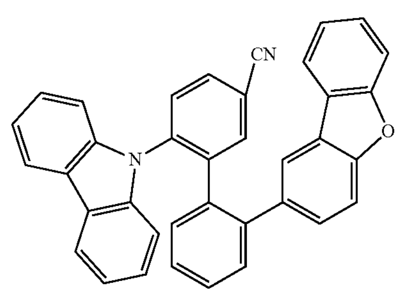

-continued
203
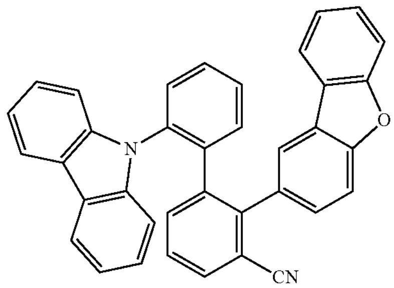
204
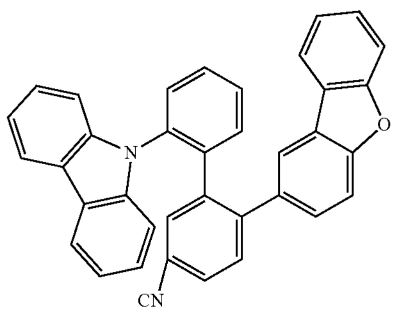
205
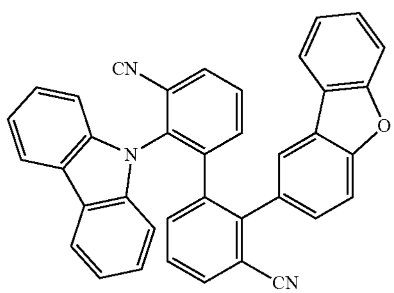
206
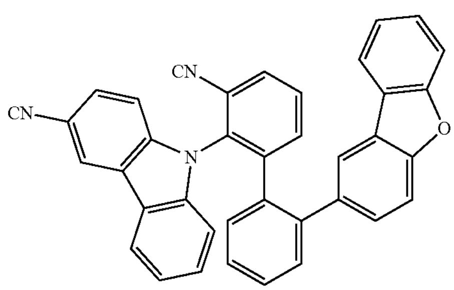
207
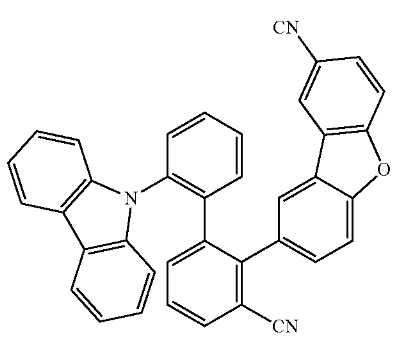
-continued
208
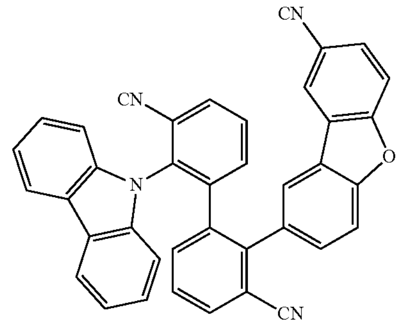
209
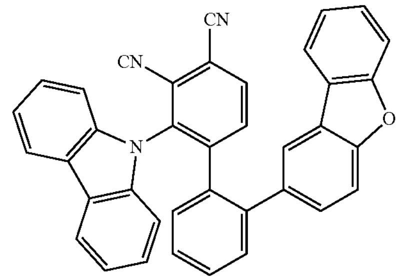
210
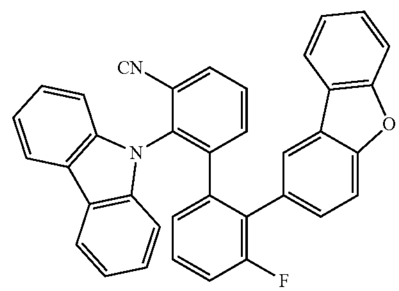
211
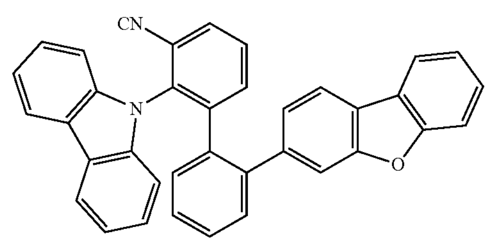
212
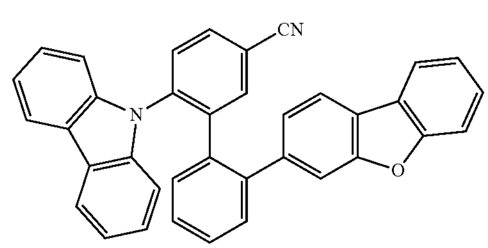

213
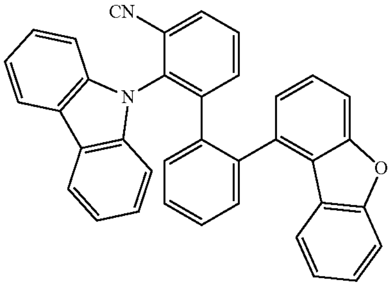
214
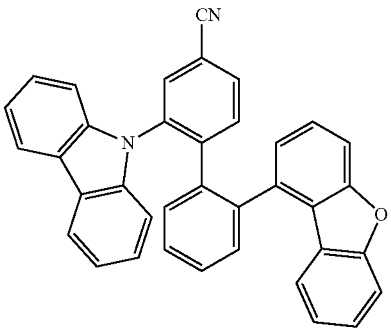
215
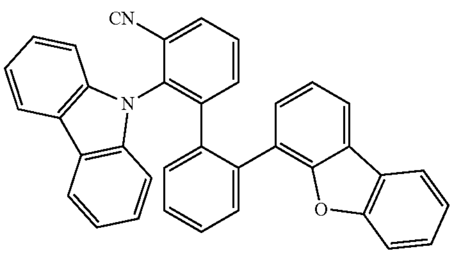
216
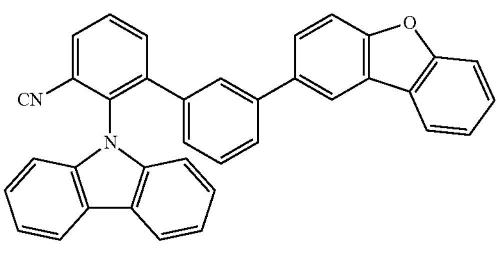
217
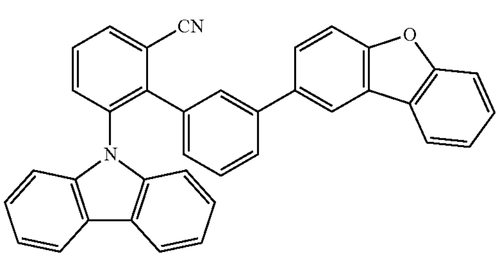
218
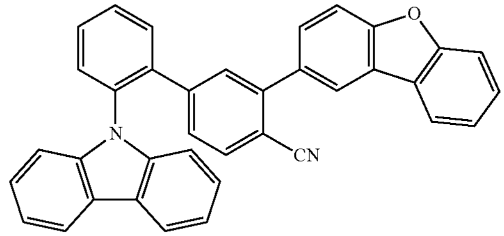
219
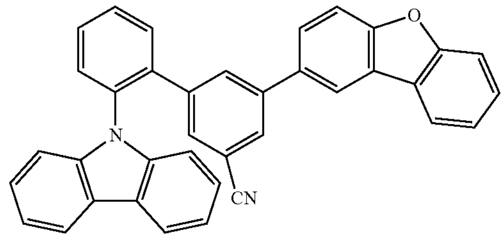
220
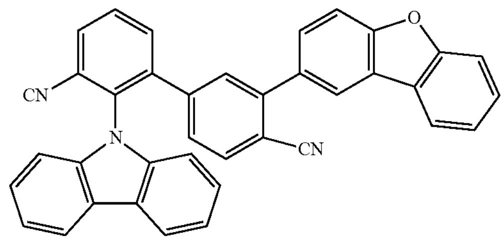
221
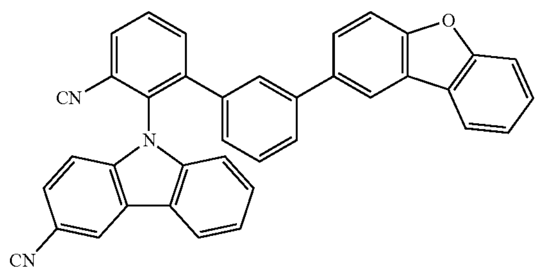
222
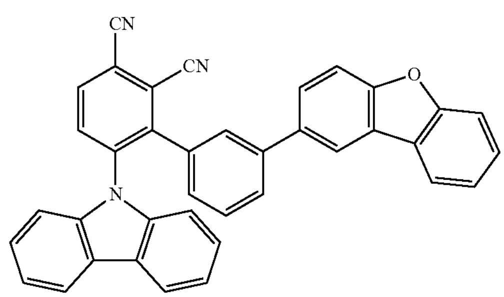
223
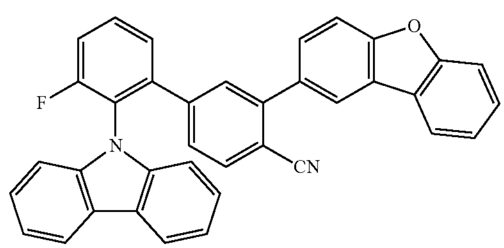

-continued
224
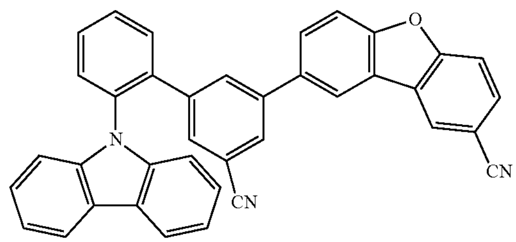
225
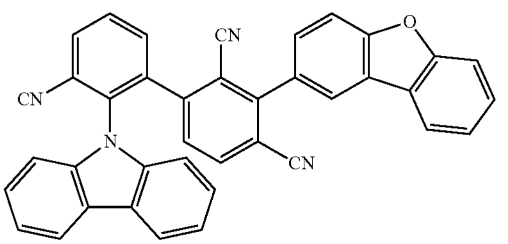
226
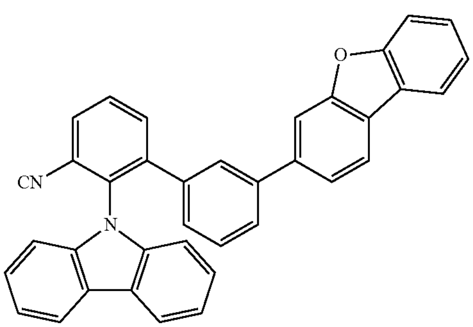
227
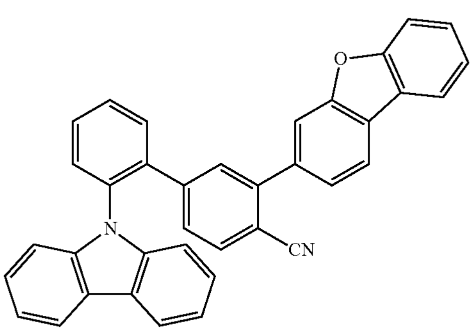
228
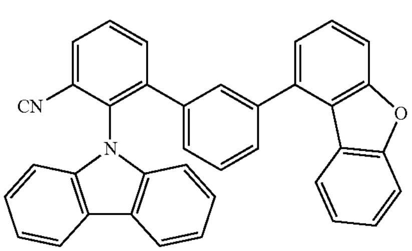
-continued
229
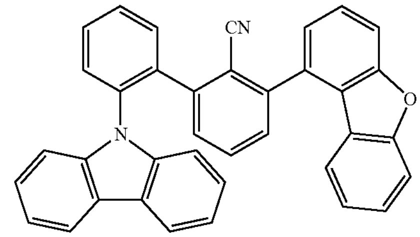
230
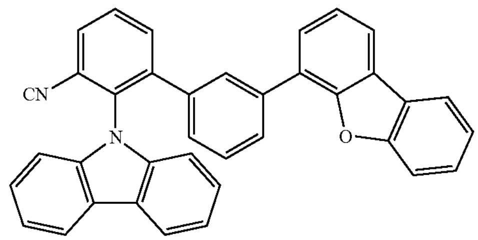
231
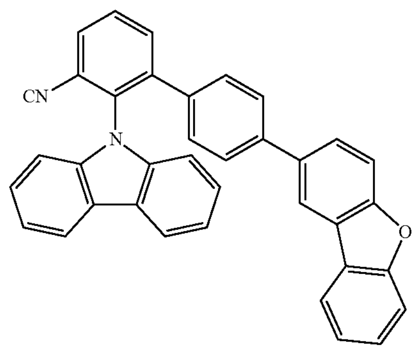
232
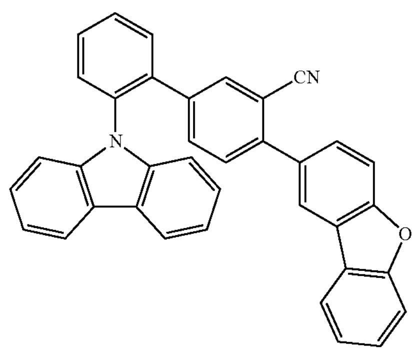
233
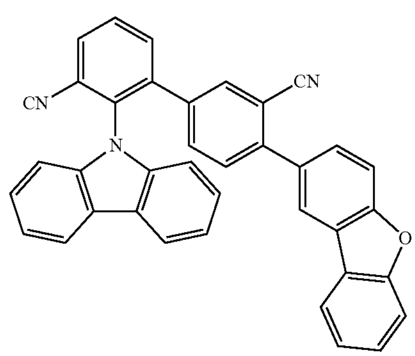

-continued
234
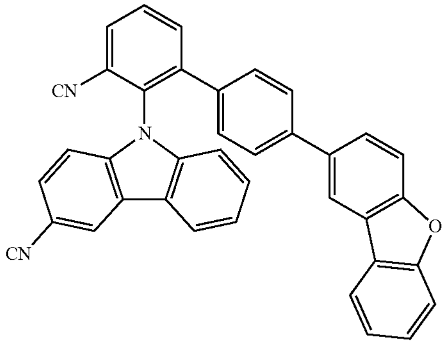
235
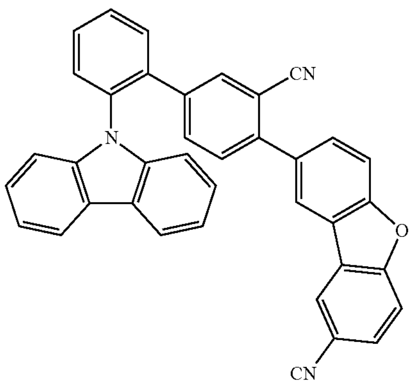
236
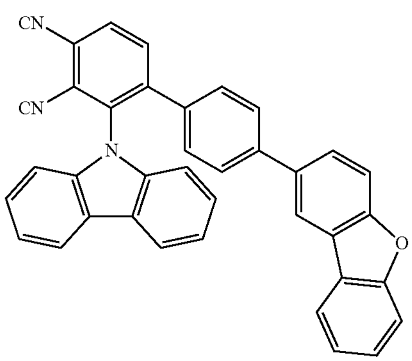
237
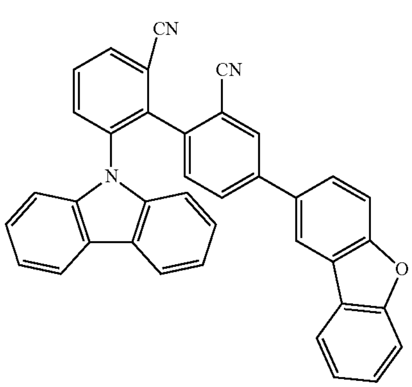
-continued
238
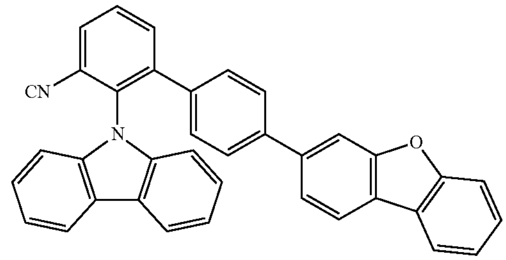
239
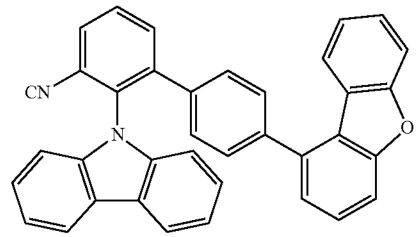
240
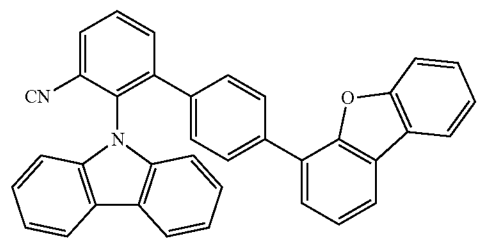
241
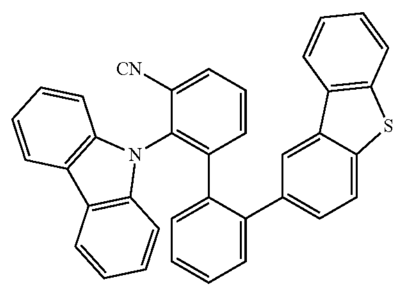
242
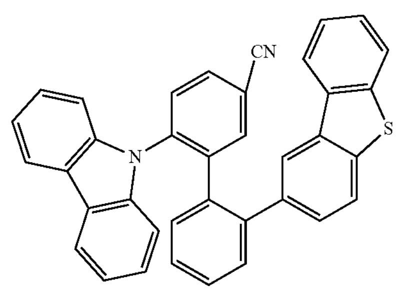
243
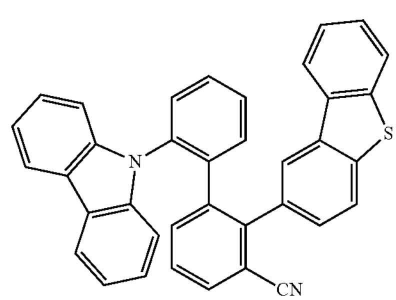

-continued
244
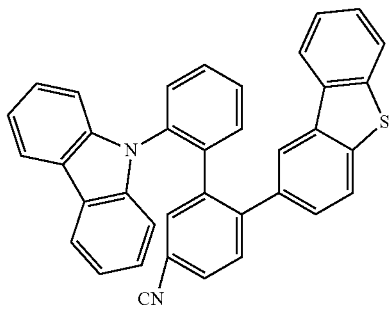
245
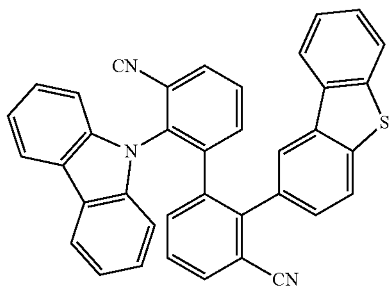
246
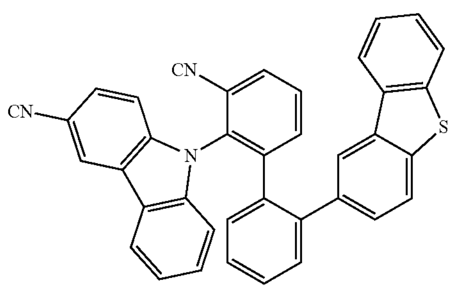
247
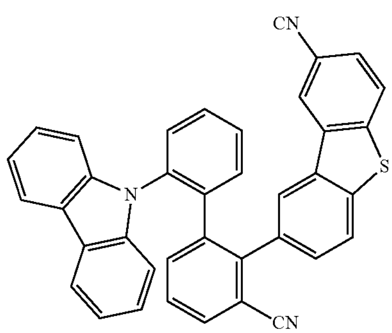
248
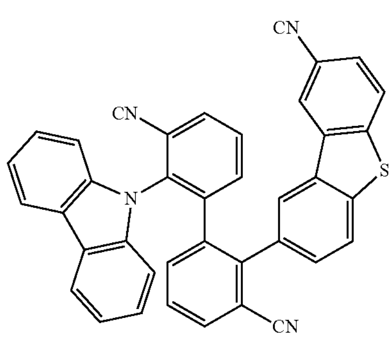
-continued
249
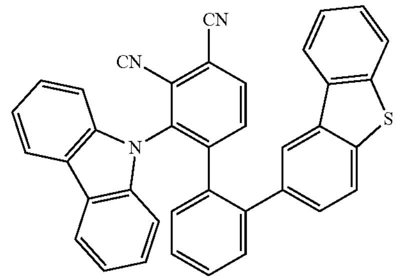
250
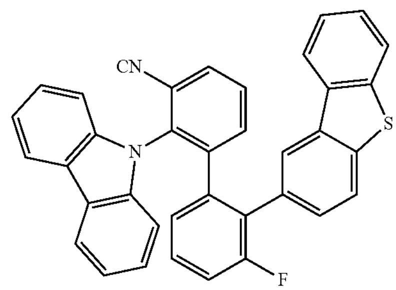
251
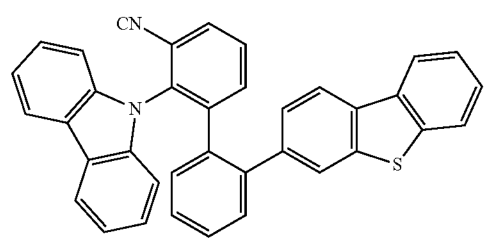
252
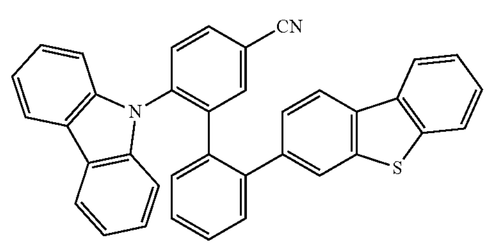
253
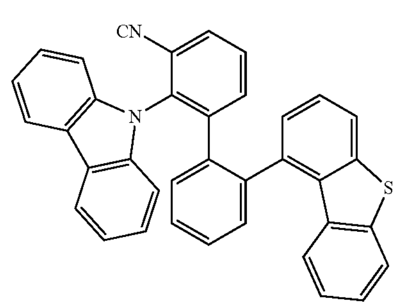

-continued
254
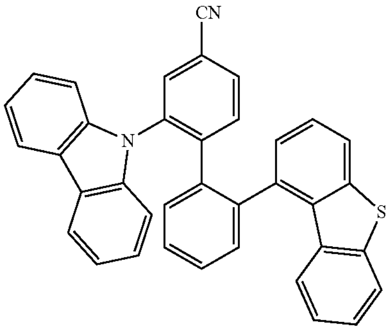
255
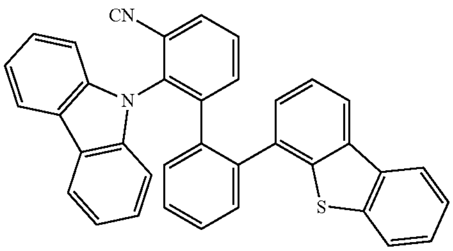
256
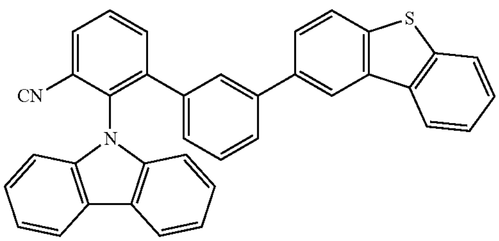
257
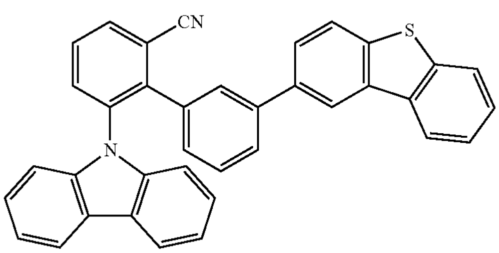
258
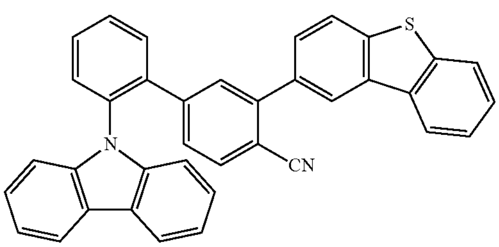
259
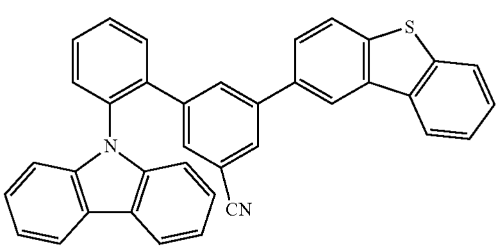
-continued
260
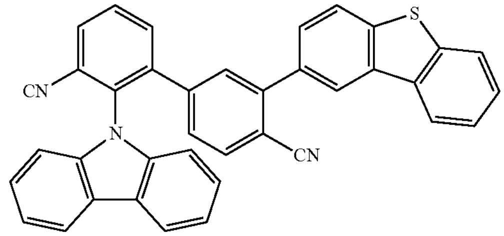
261
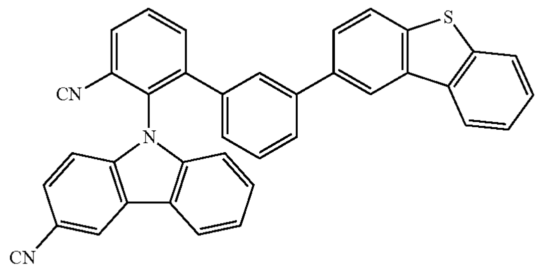
262
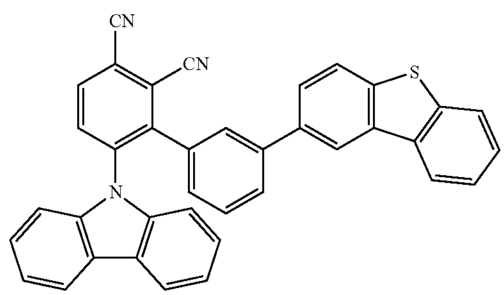
263
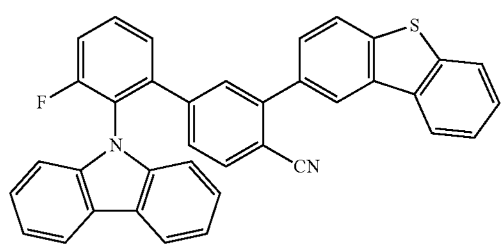
264
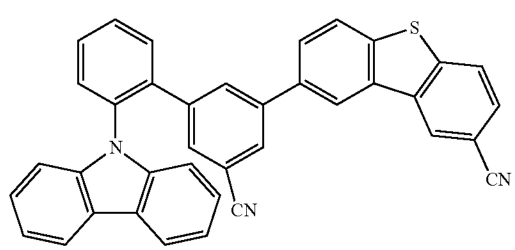

-continued
265
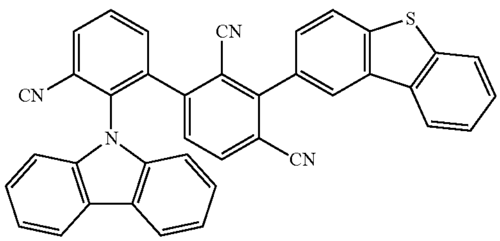
266
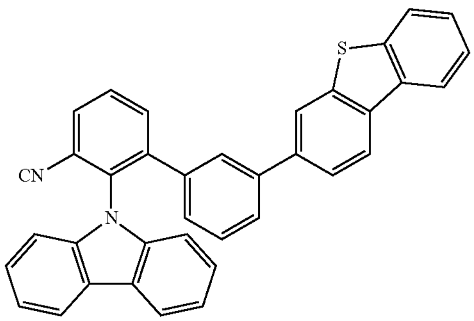
267
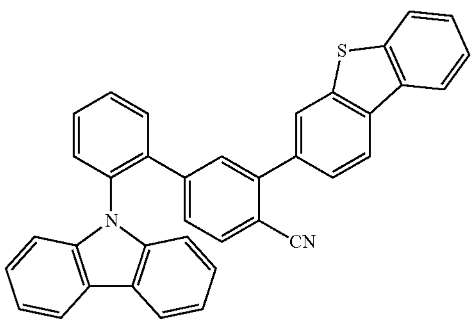
268
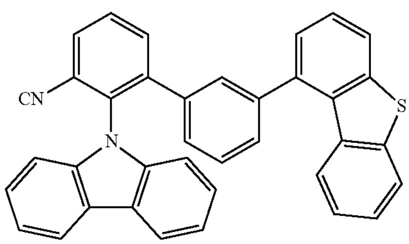
269
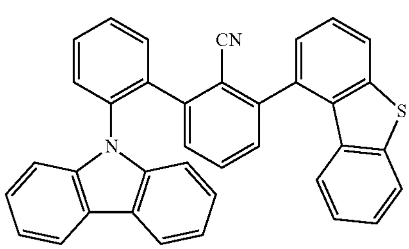
270
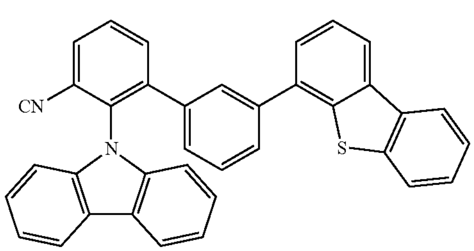
-continued
271
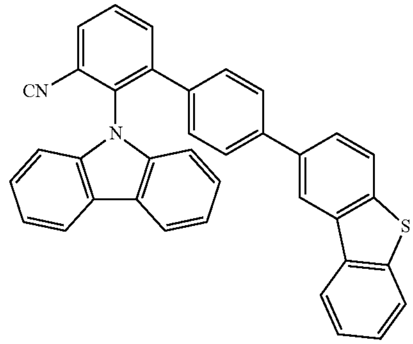
272
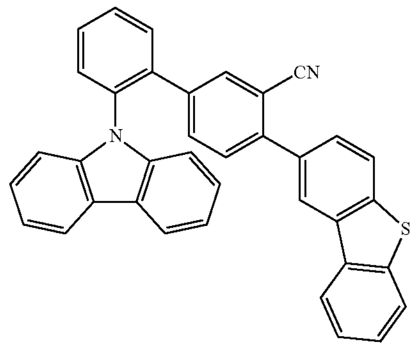
273
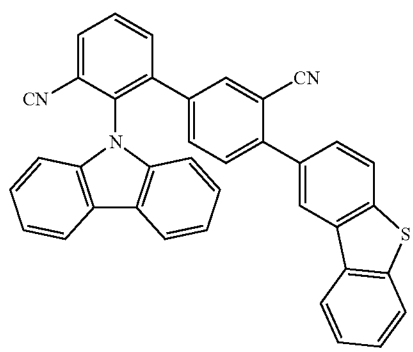
274
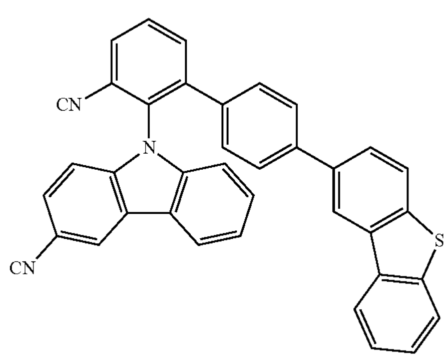

-continued
275
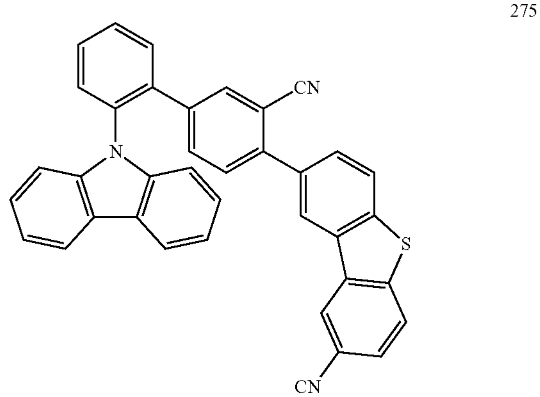
276
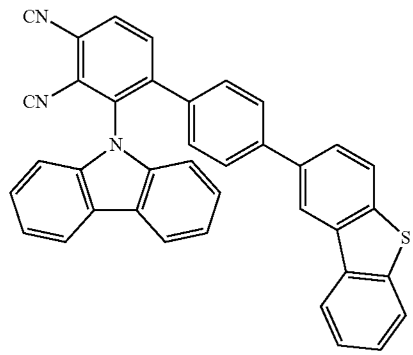
277
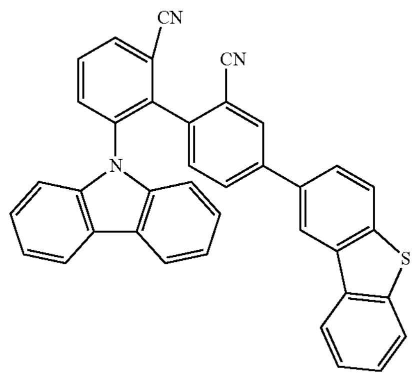
278
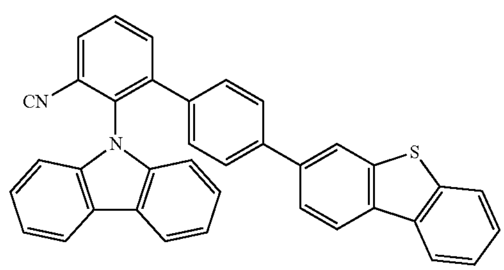
279
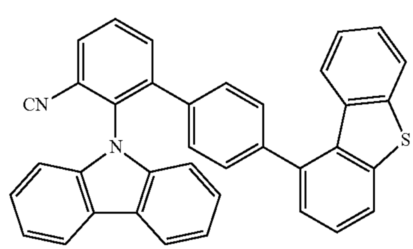
-continued
280
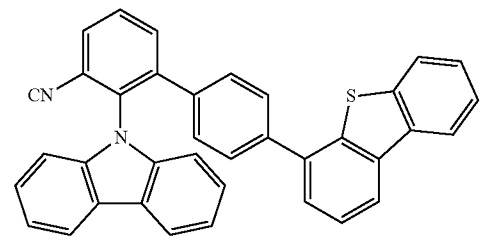
281
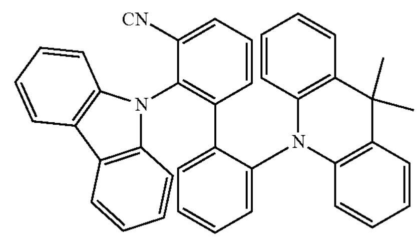
282
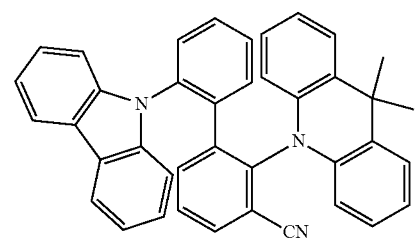
283
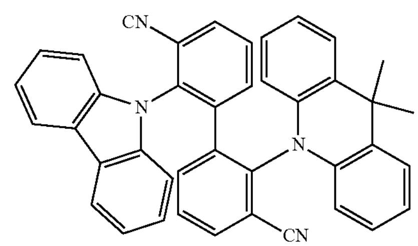
284
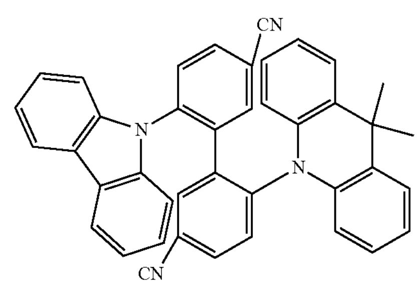
285
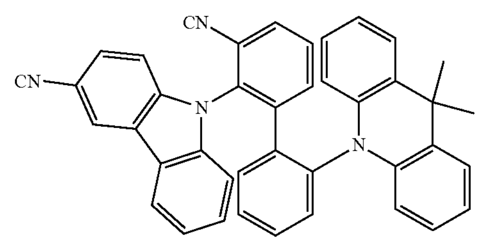

286
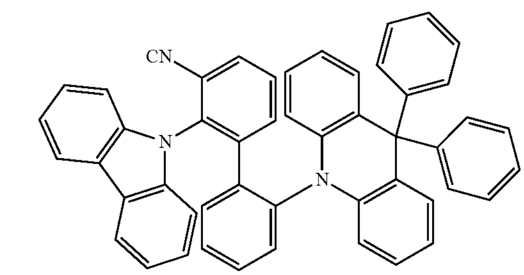
287
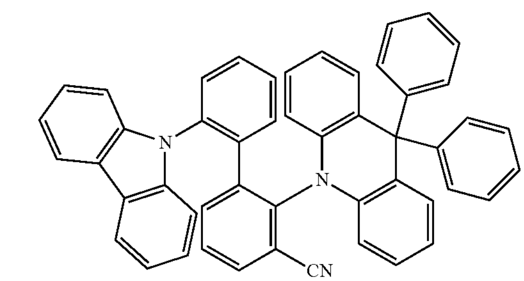
288
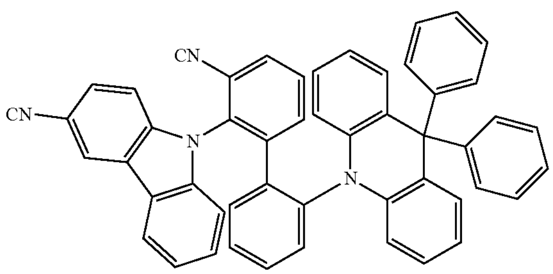
289
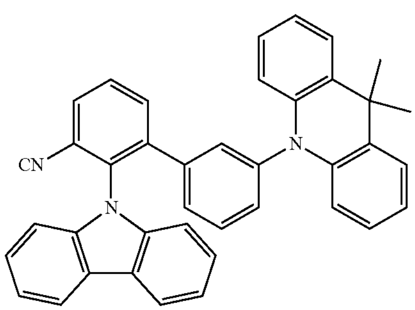
290
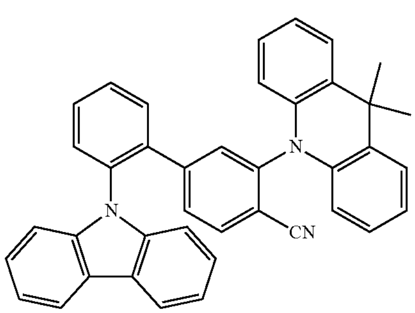
291
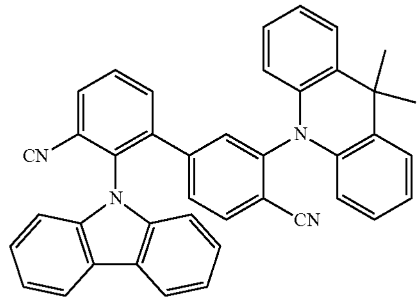
292
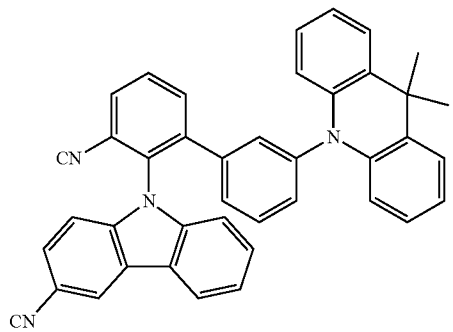
293
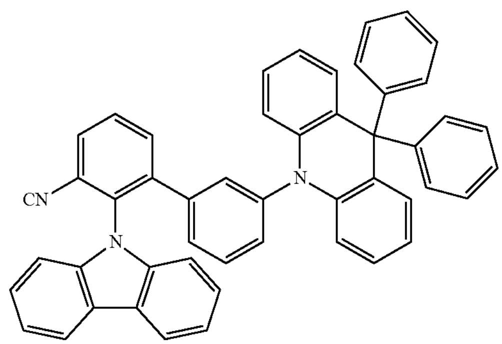
294
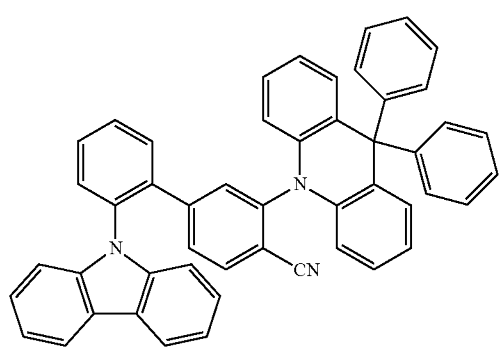

-continued
295
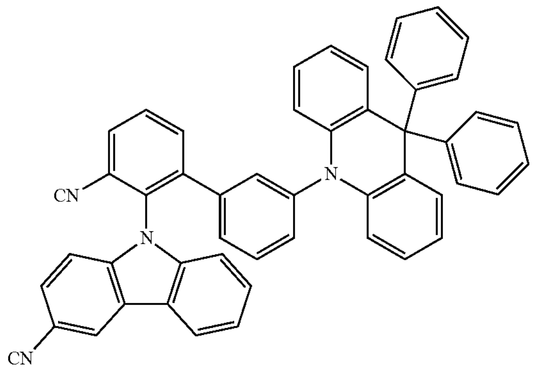
296
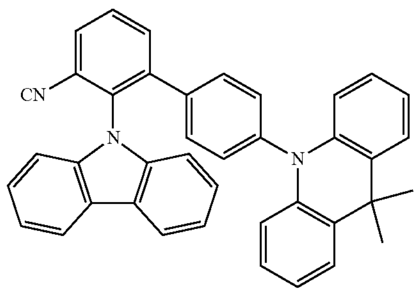
297
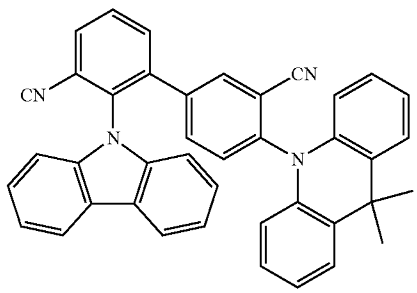
298
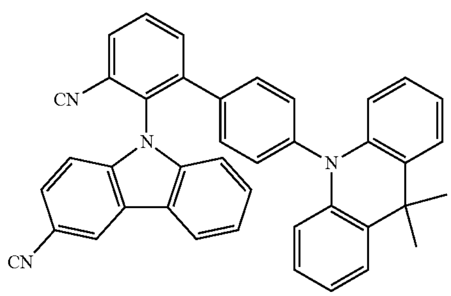
299
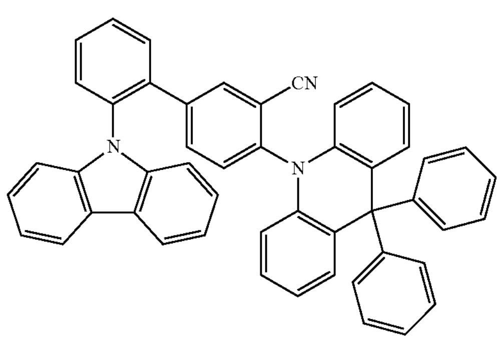
-continued
300
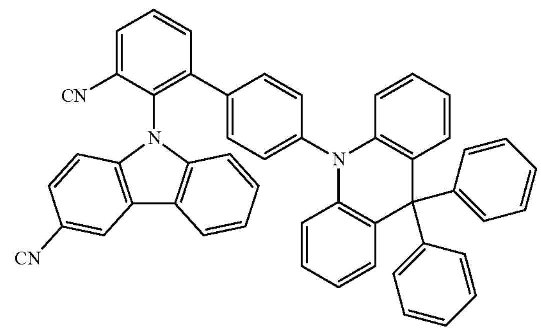
301
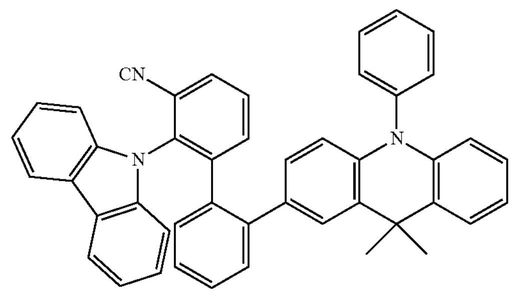
302
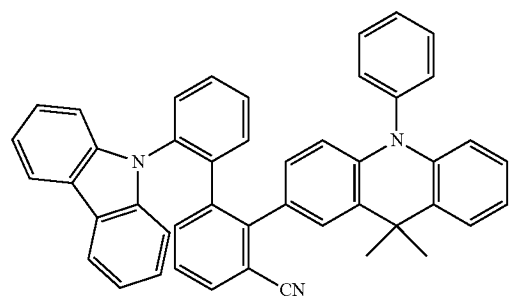
303
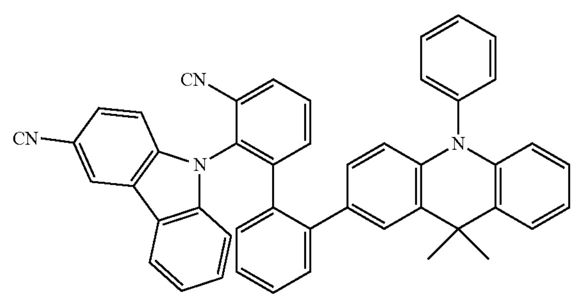
304
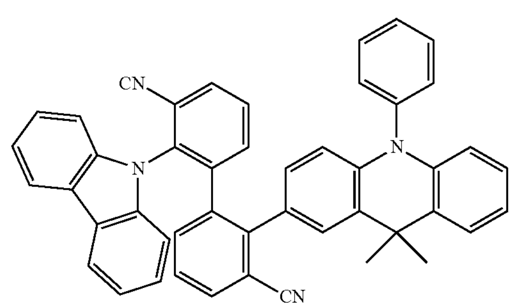

-continued
305
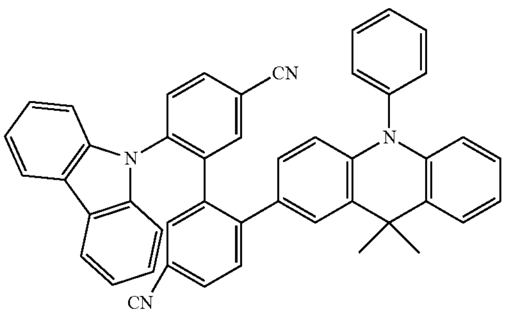
306
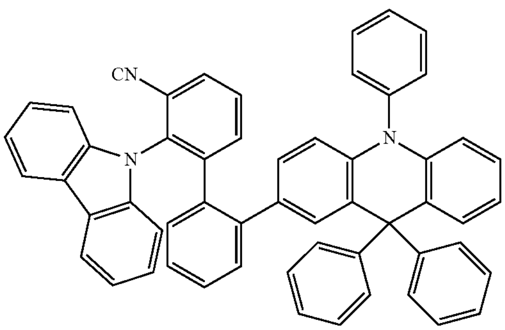
307
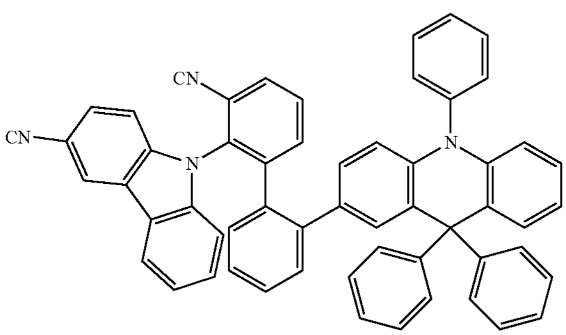
308
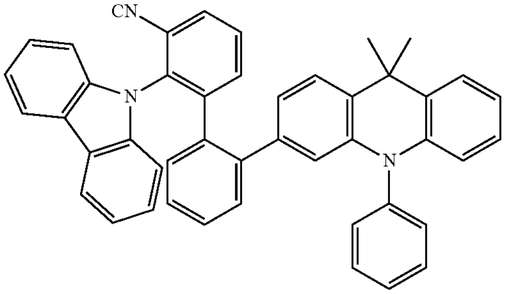
-continued
309
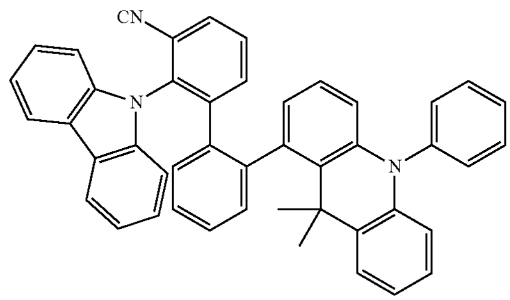
310
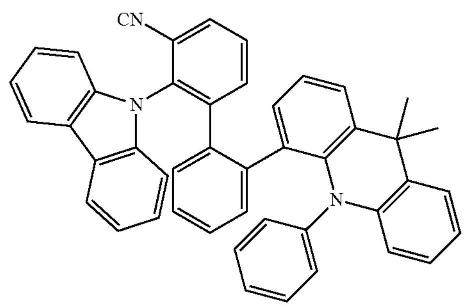
311
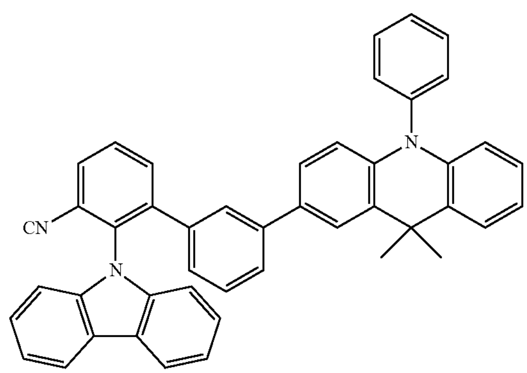
312
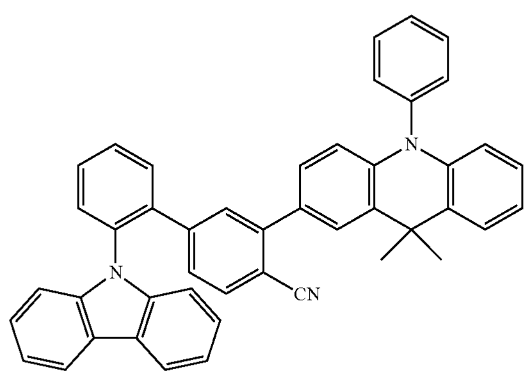

-continued
313
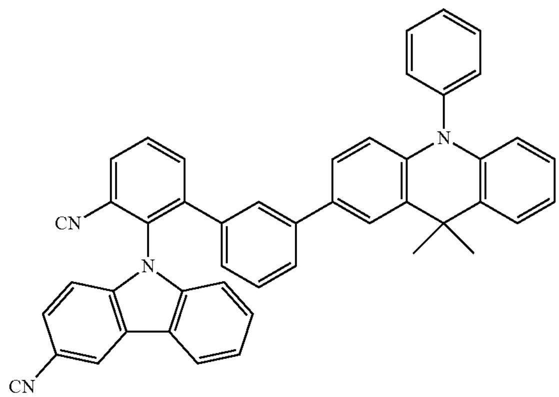
314
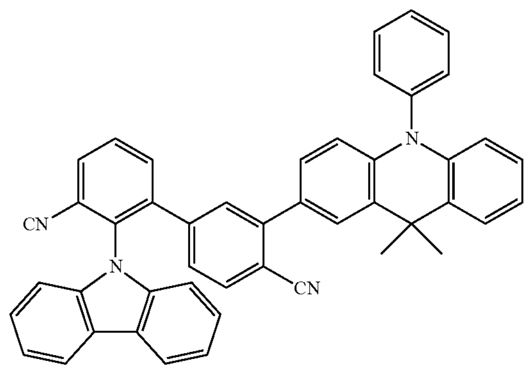
315
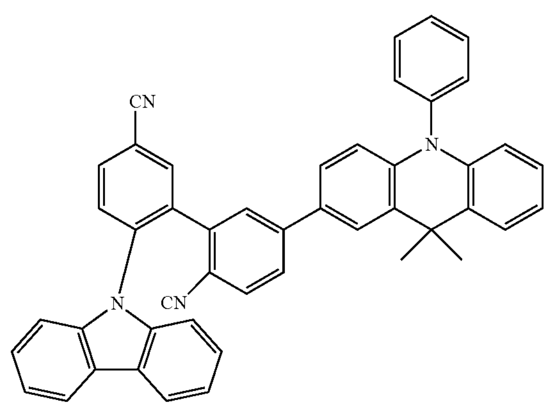
316
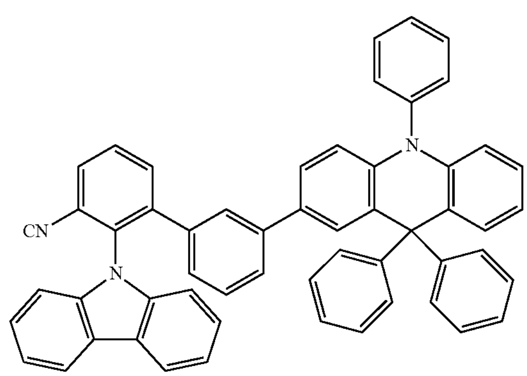
-continued
317
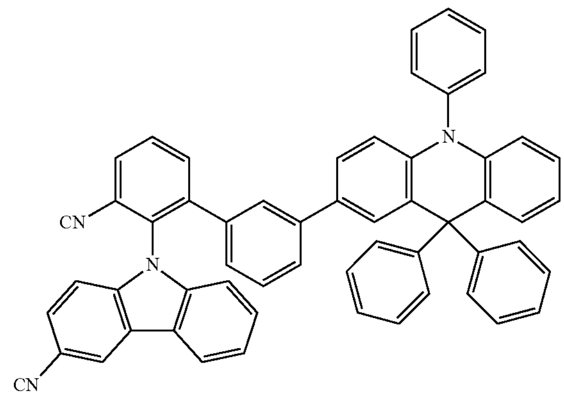
318
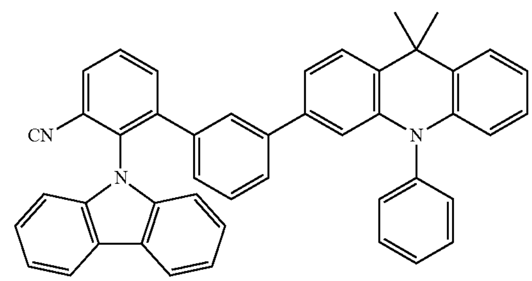
319
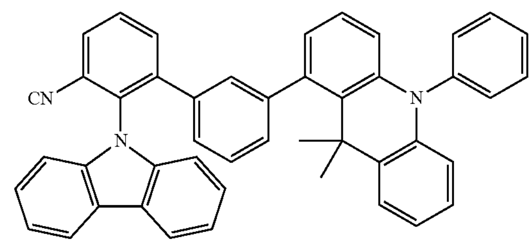
320
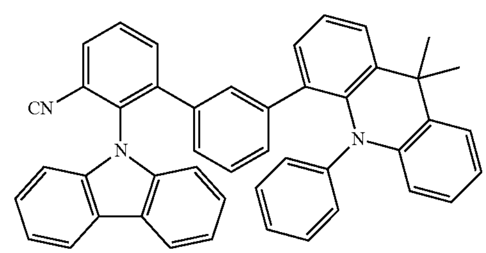
321
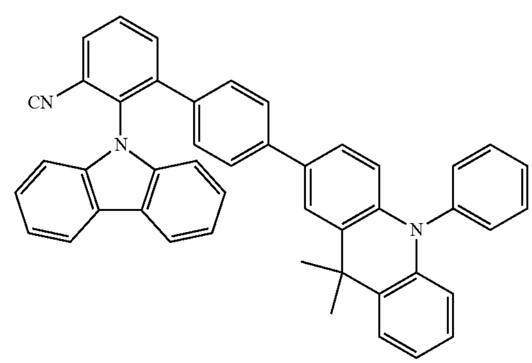

-continued
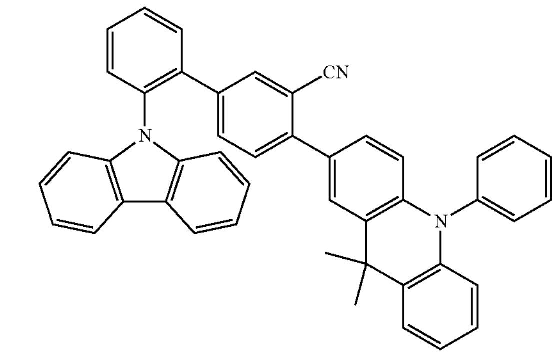
322
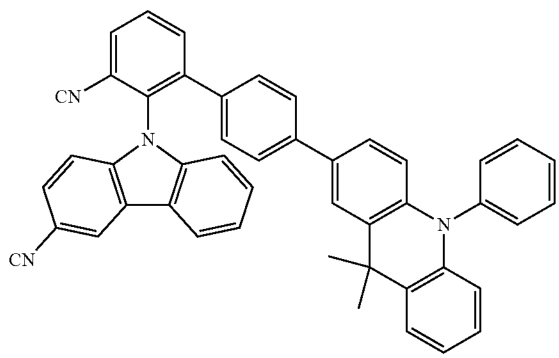
323
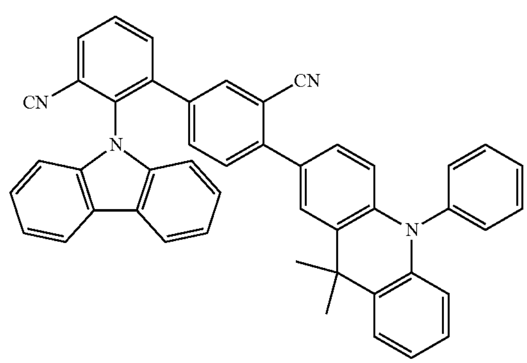
324
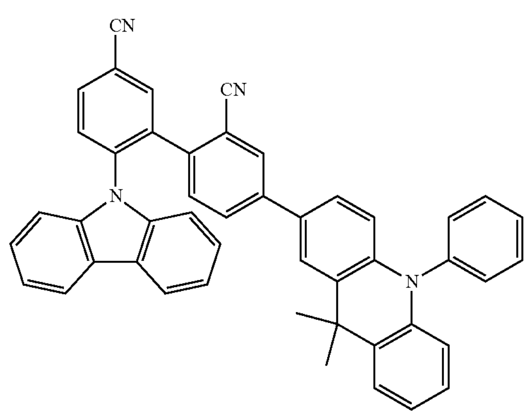
325
-continued
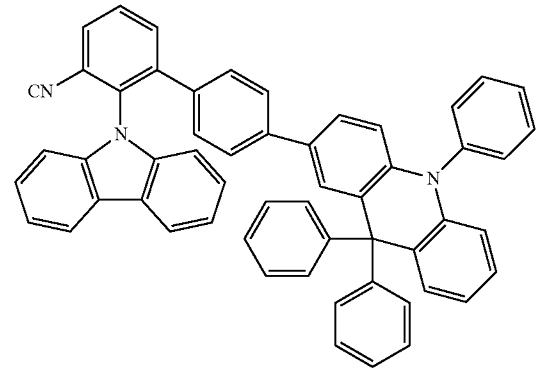
326
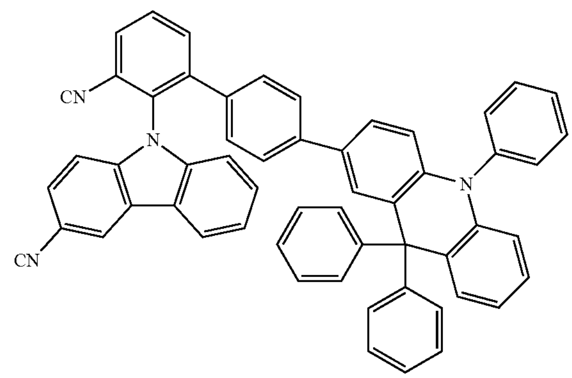
327
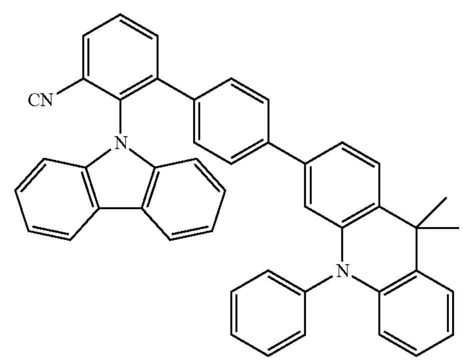
328
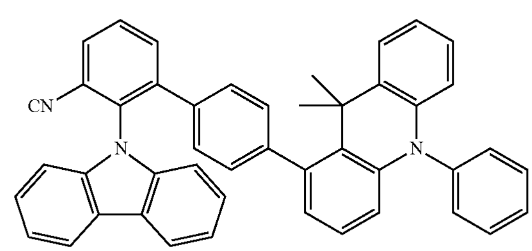
329

-continued
330
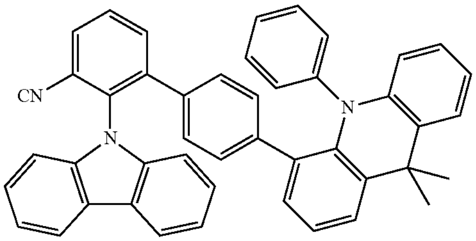
Group HE7
1
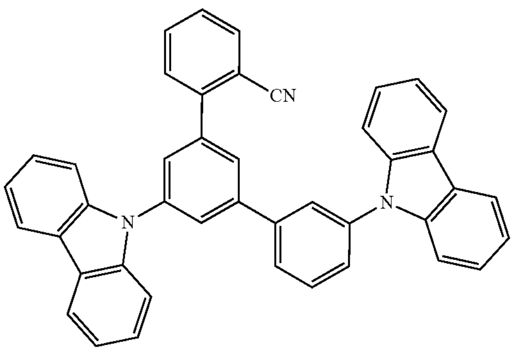
2
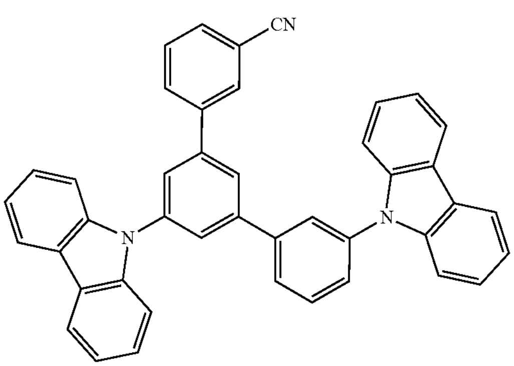
3
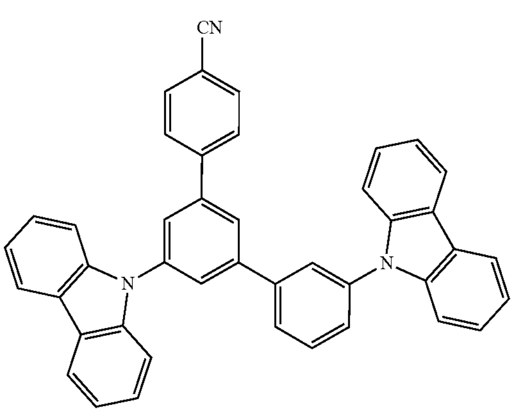
-continued
4
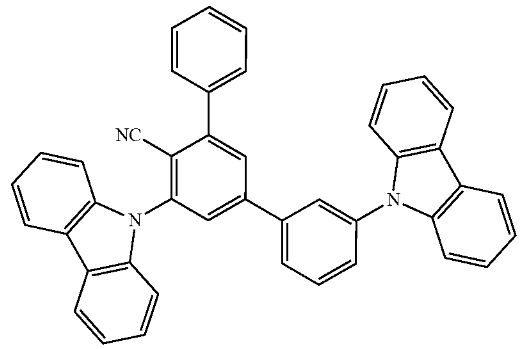
5
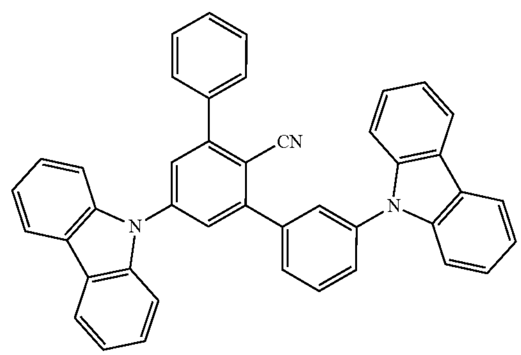
6
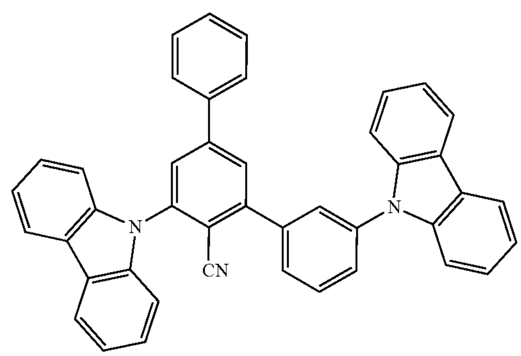
7
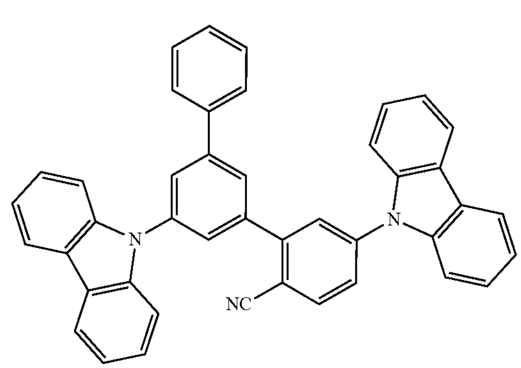

-continued
8
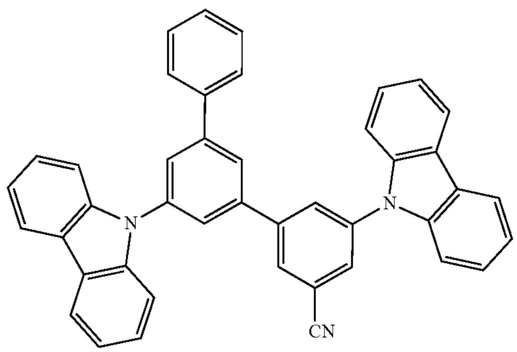
9
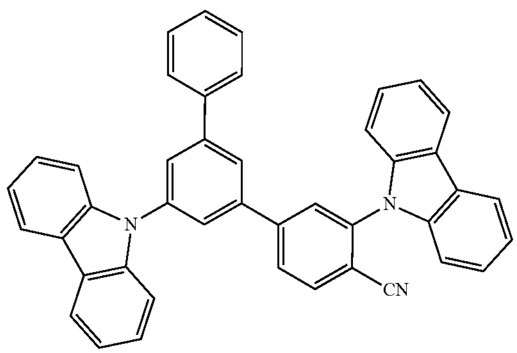
10
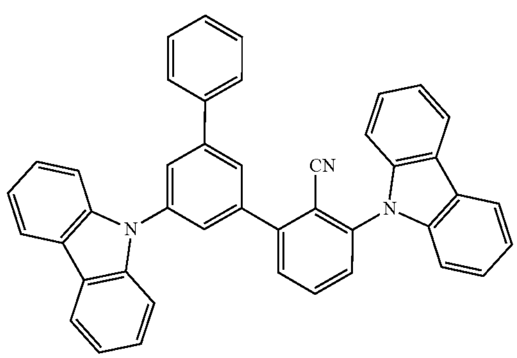
11
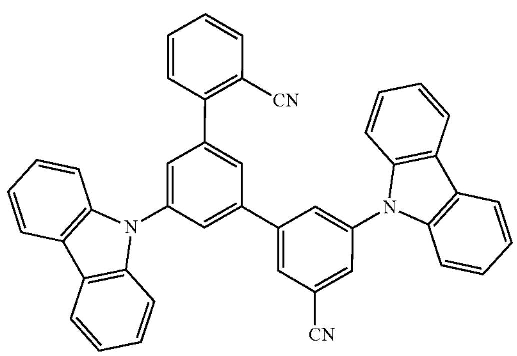
-continued
12
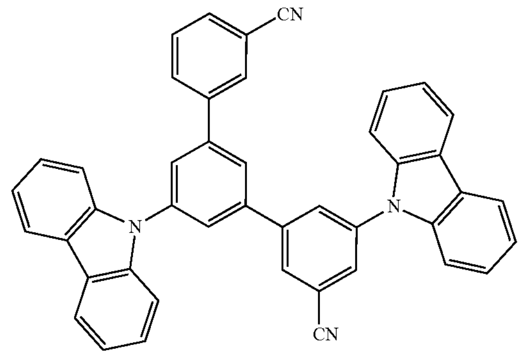
13
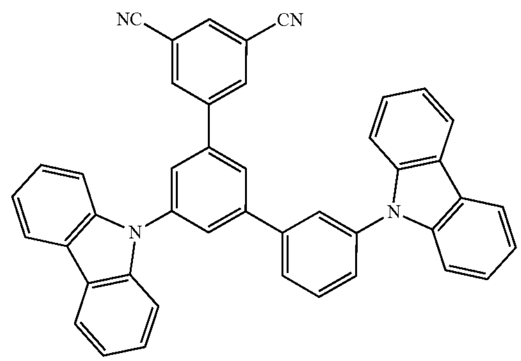
14
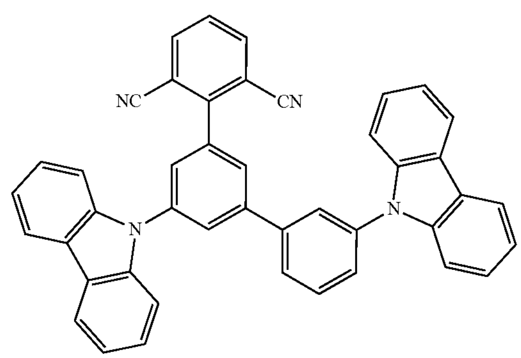
15
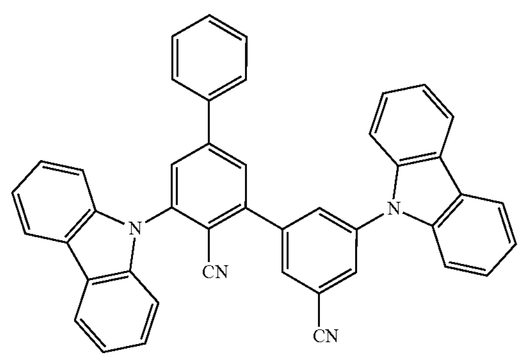

-continued
16
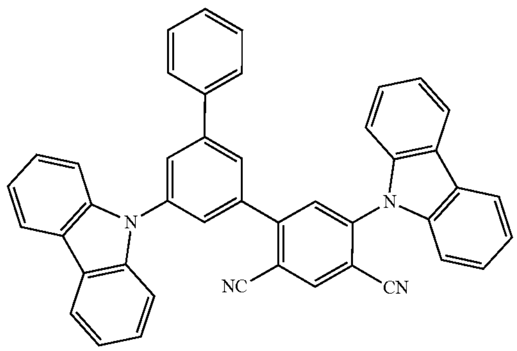
17
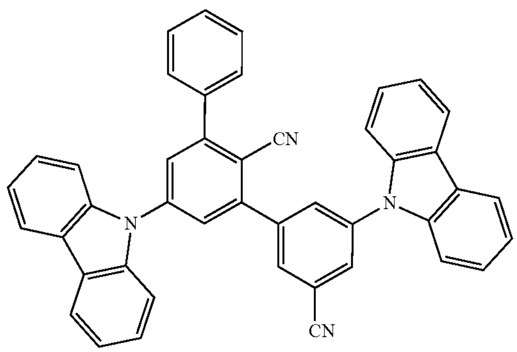
18
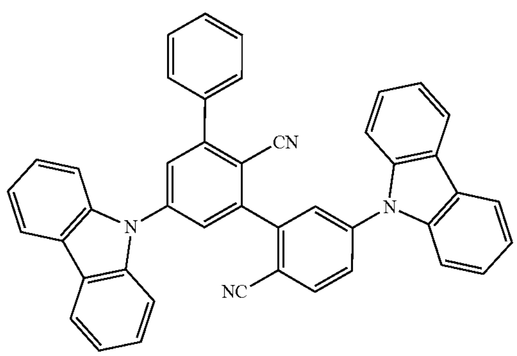
19
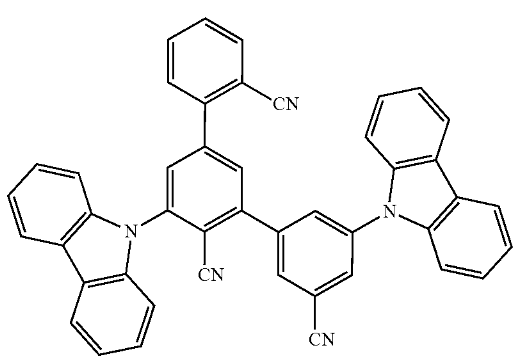
-continued
20
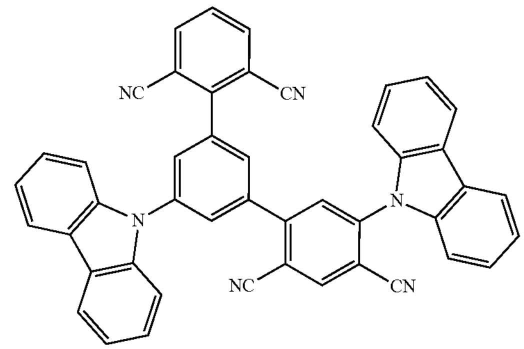
21
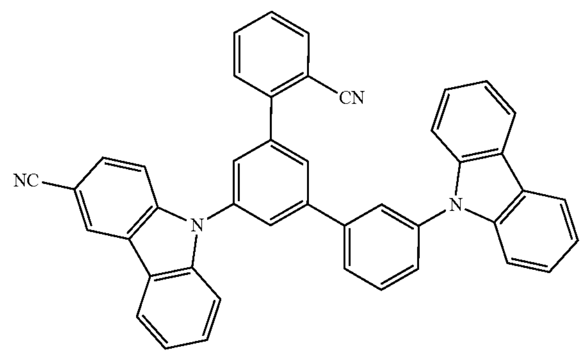
22
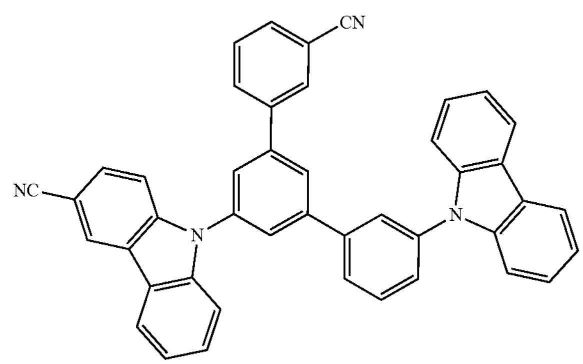
23
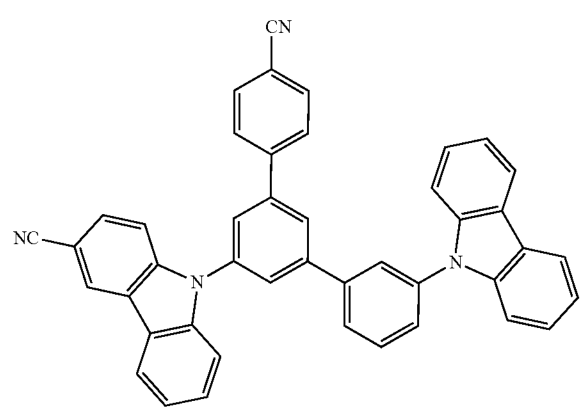

-continued
24
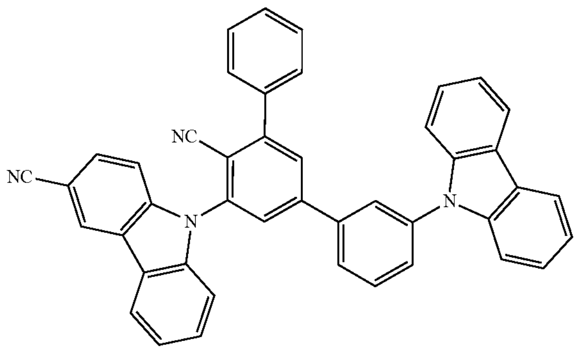
25
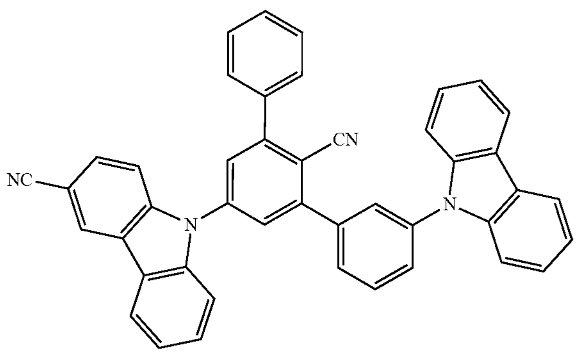
26
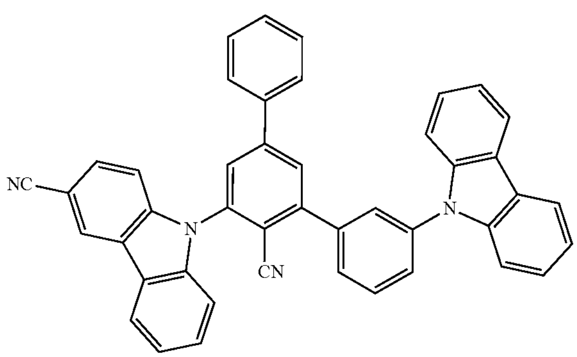
27
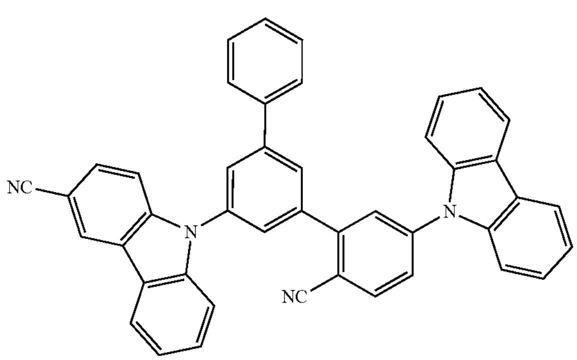
-continued
28
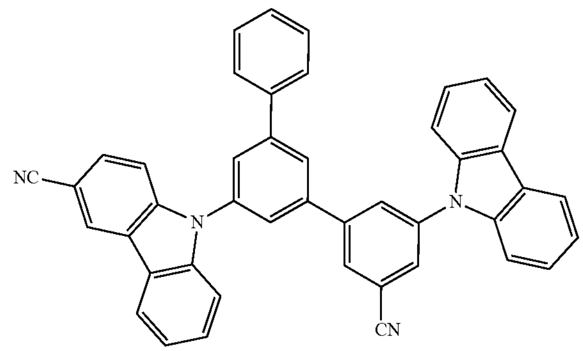
29
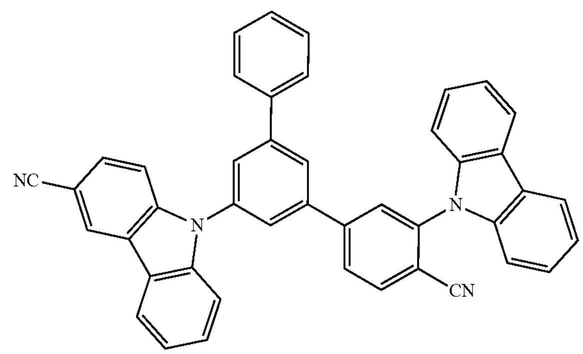
30
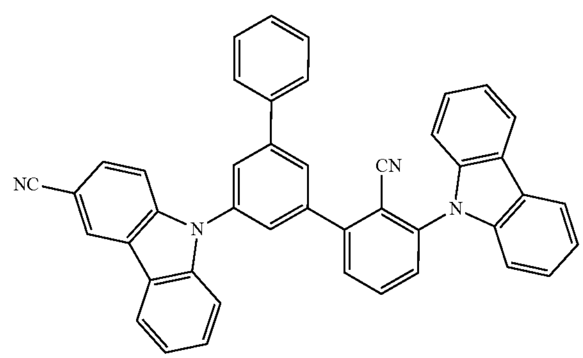
31
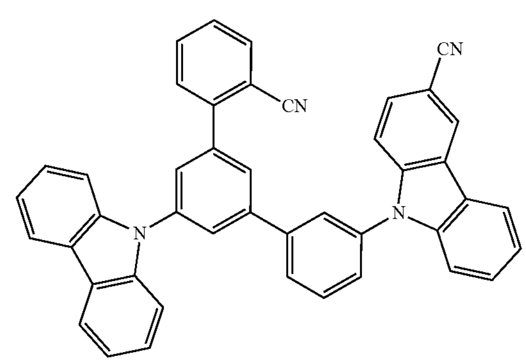

-continued
32
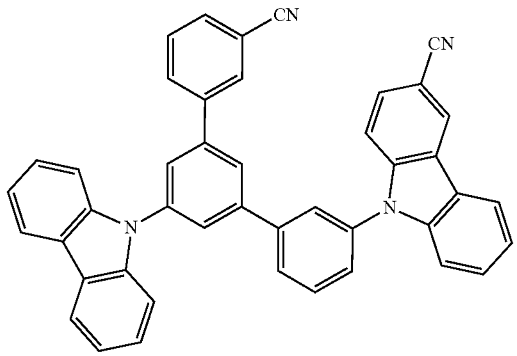
33
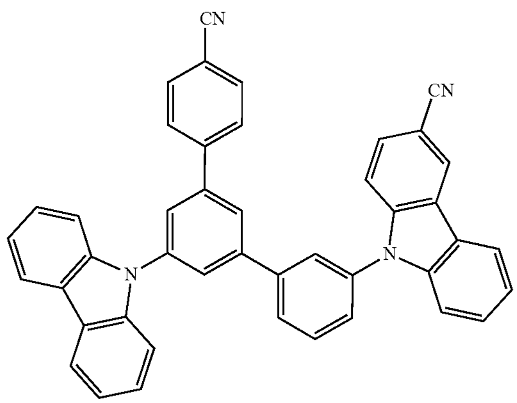
34
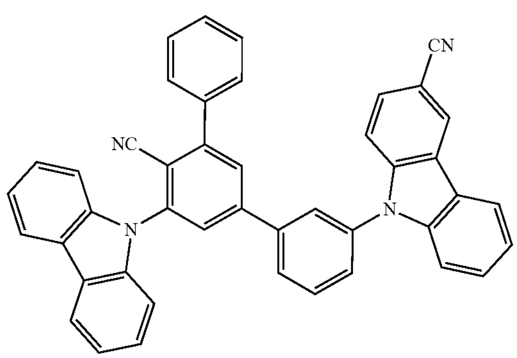
35
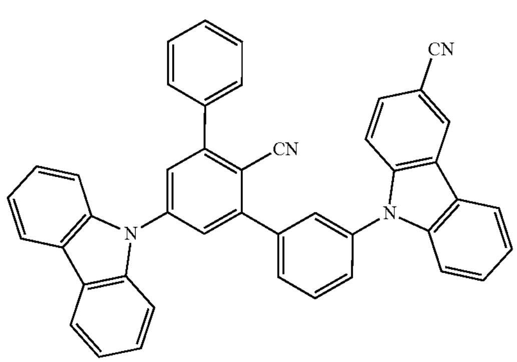
-continued
36
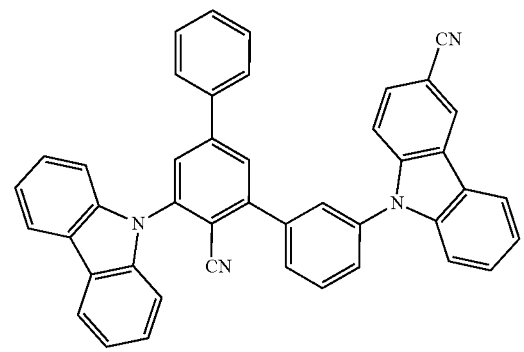
37
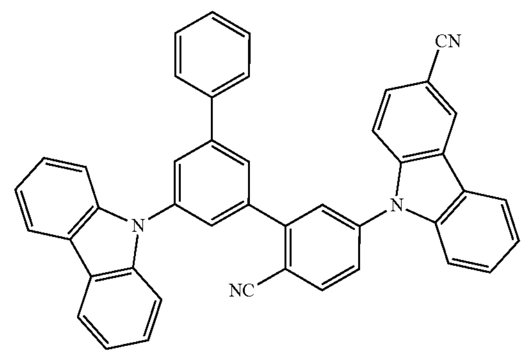
38
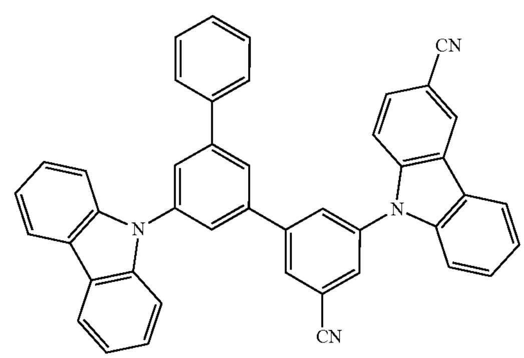
39
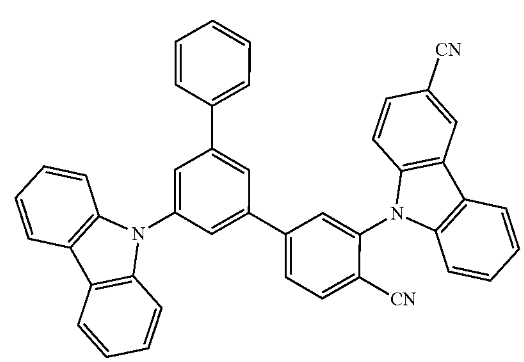

-continued
40
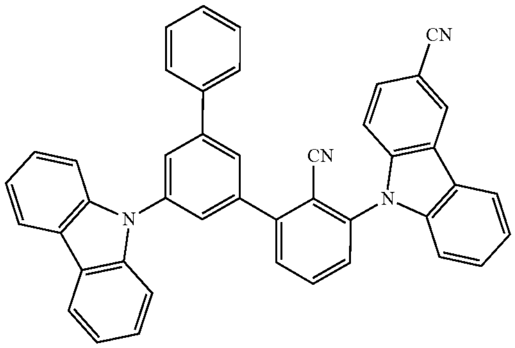
41
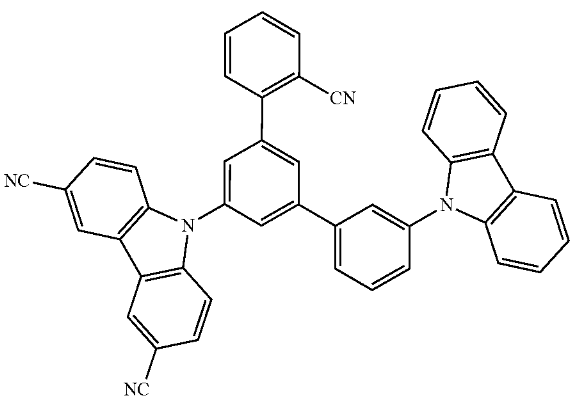
42
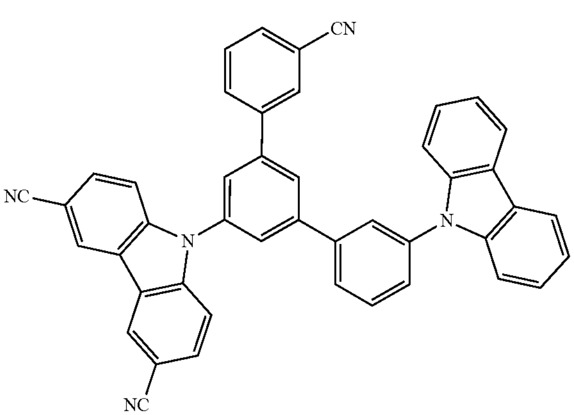
-continued
43
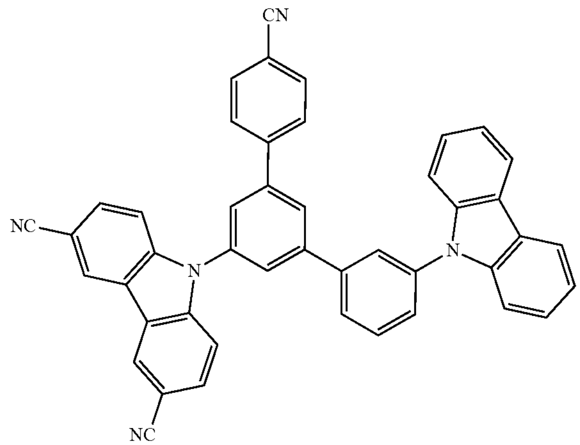
44
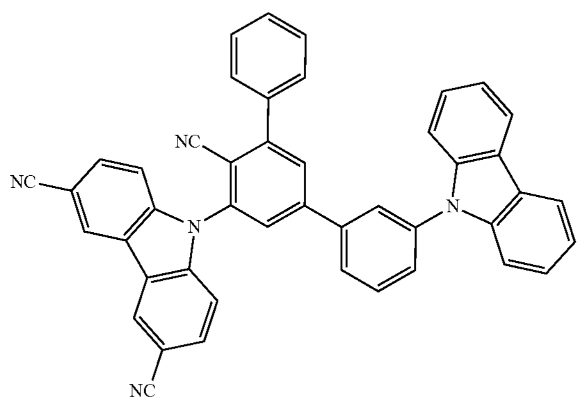
45
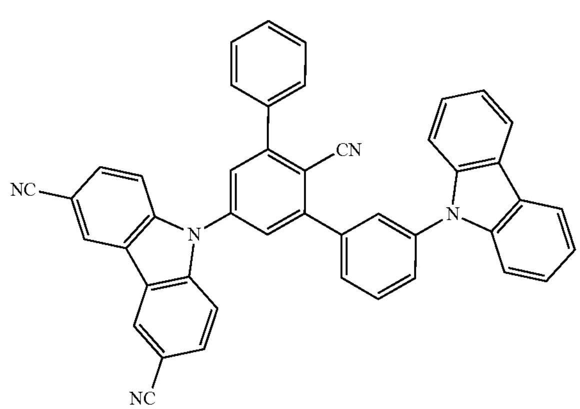

-continued
46
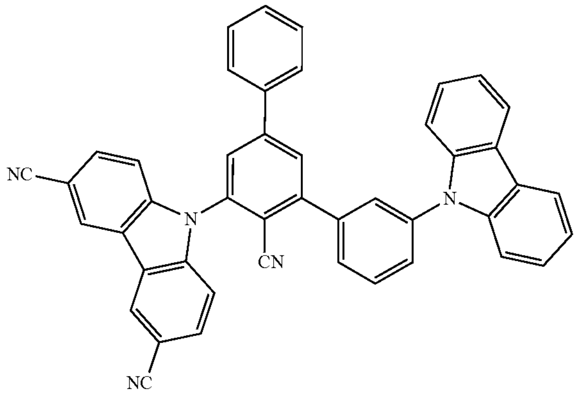
47
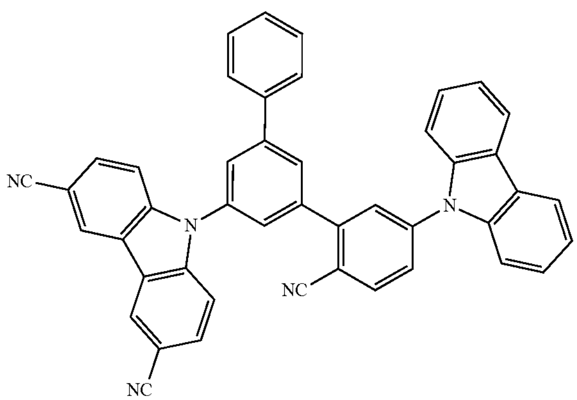
48
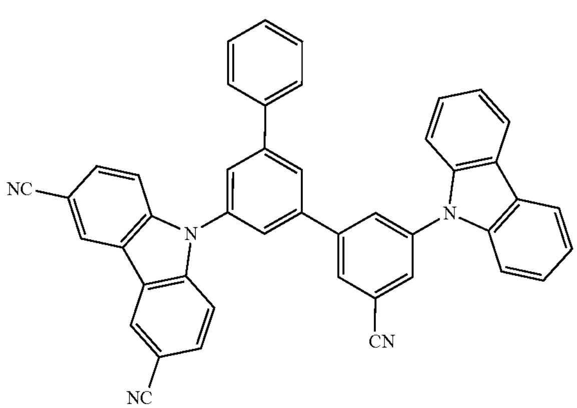
-continued
49
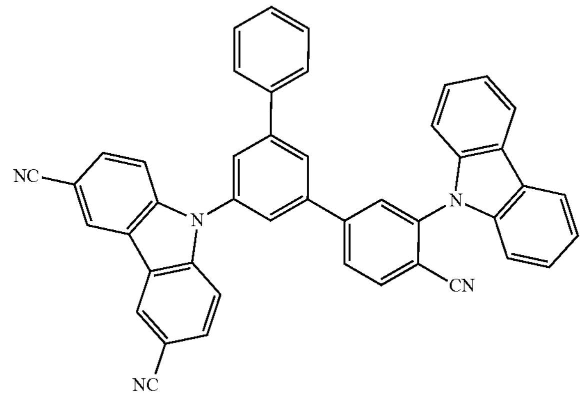
50
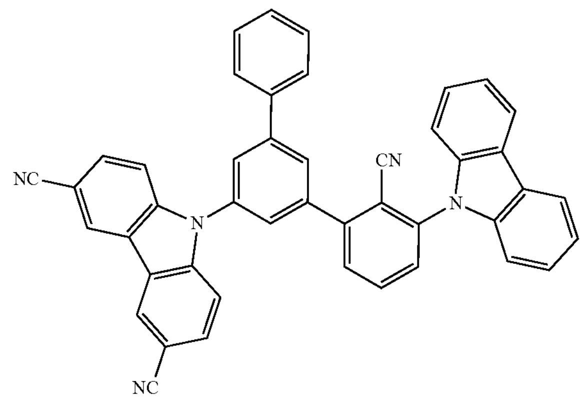
51
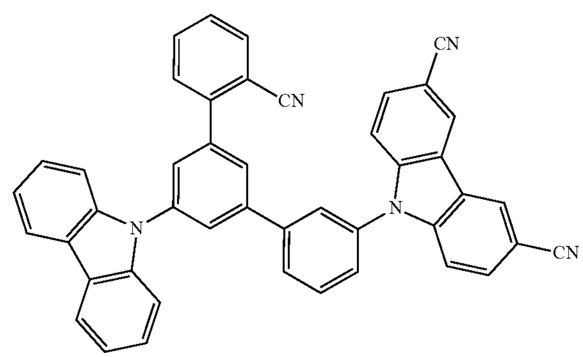
52
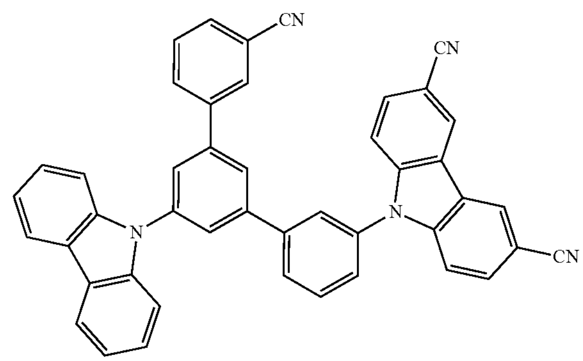

-continued
53
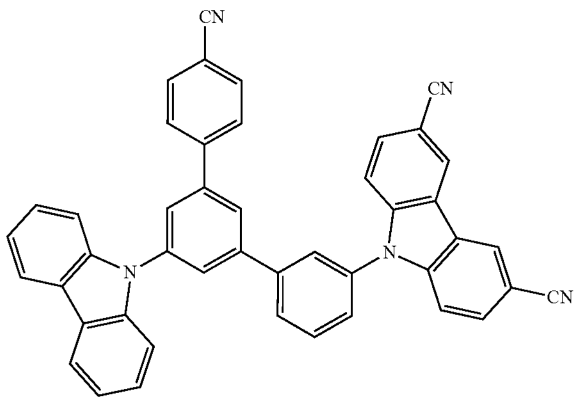
54
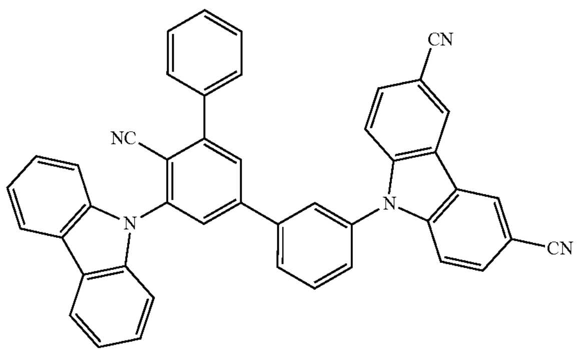
55
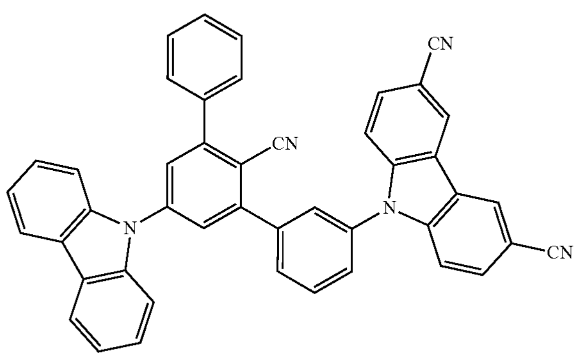
56
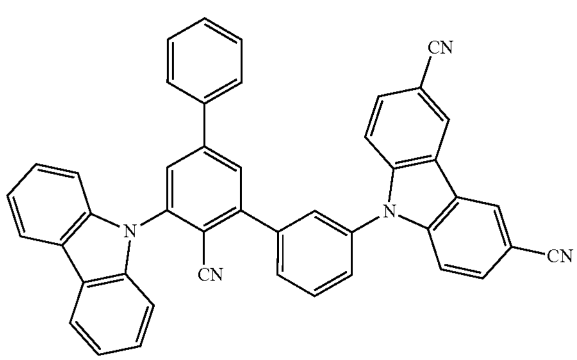
-continued
57
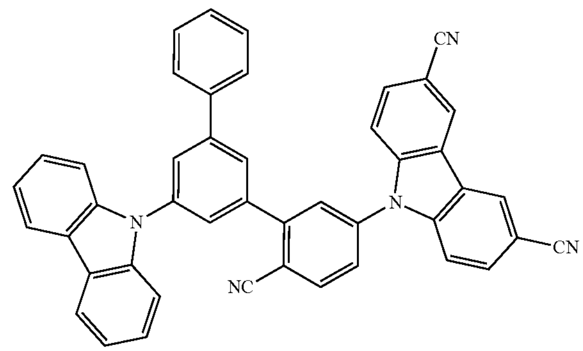
58
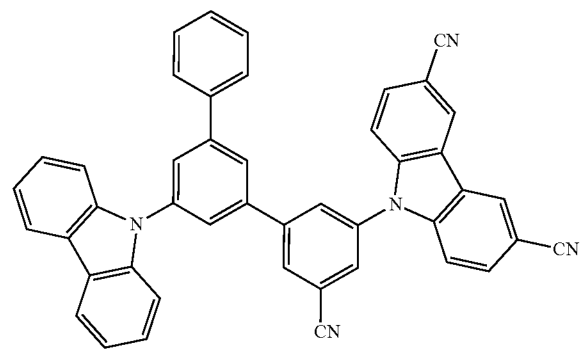
59
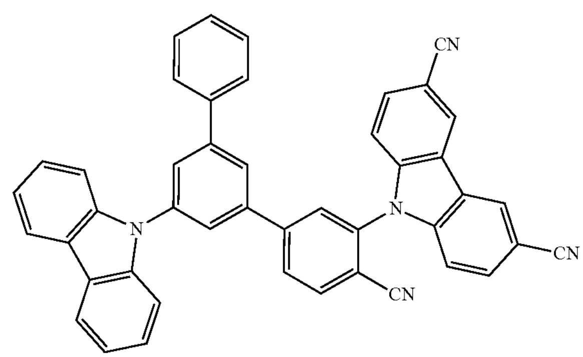
60
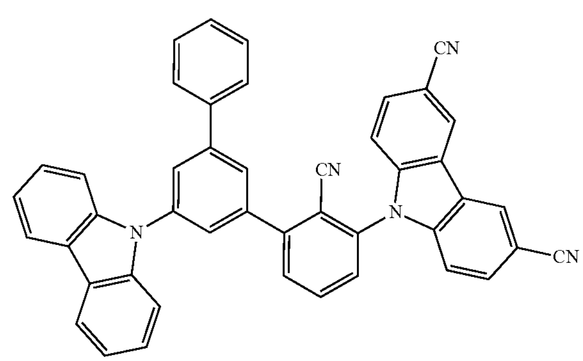

-continued
61
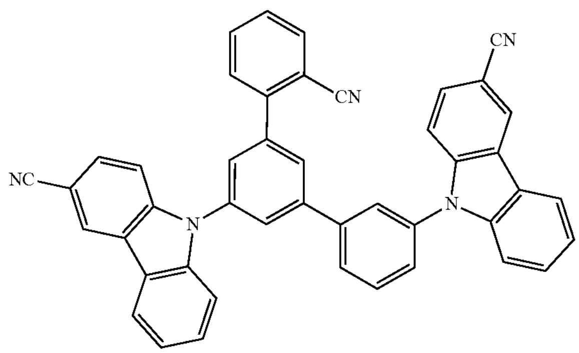
62
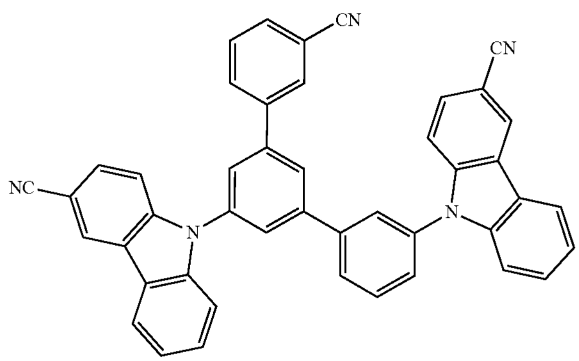
63
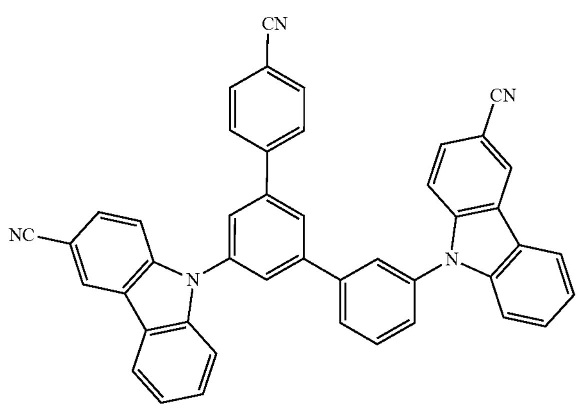
64
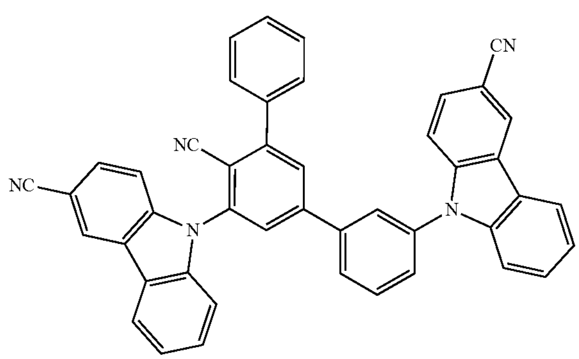
-continued
65
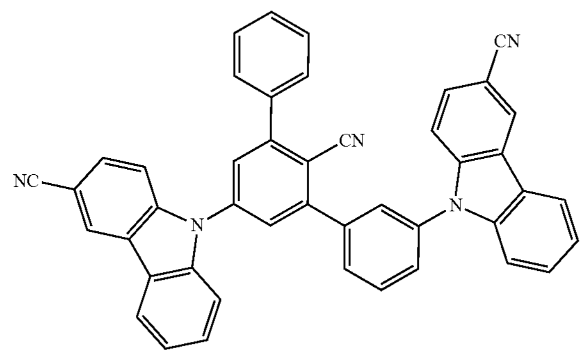
66
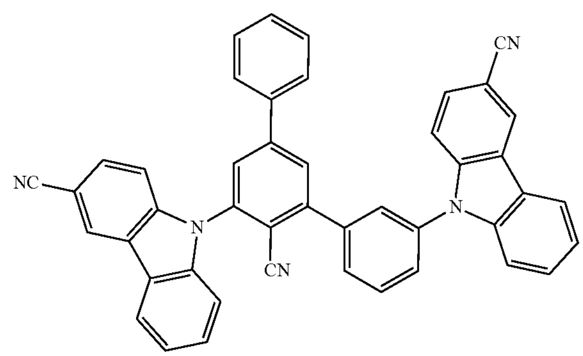
67
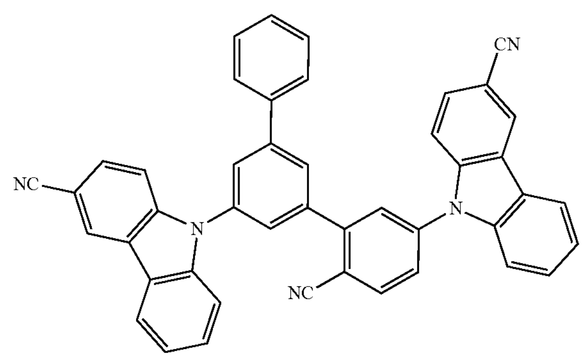
68
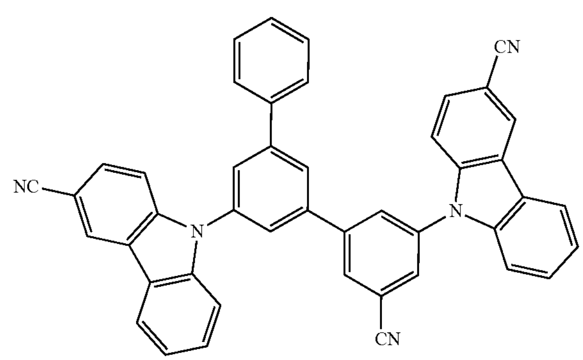

-continued
69
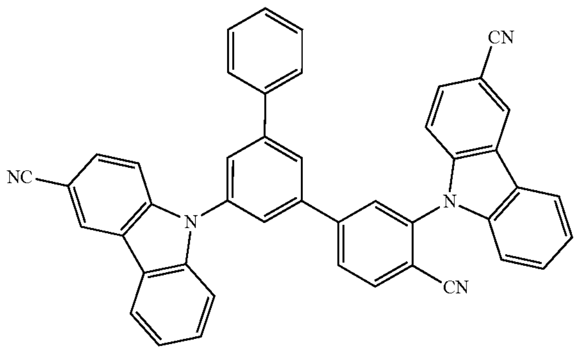
70
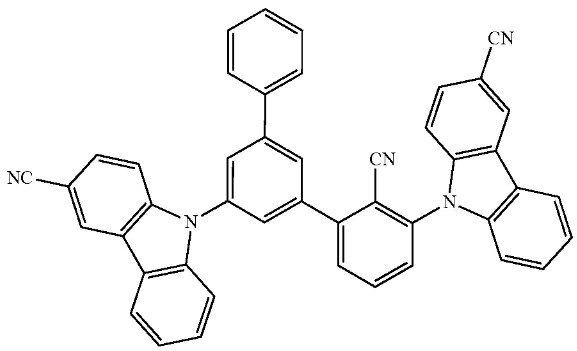
71
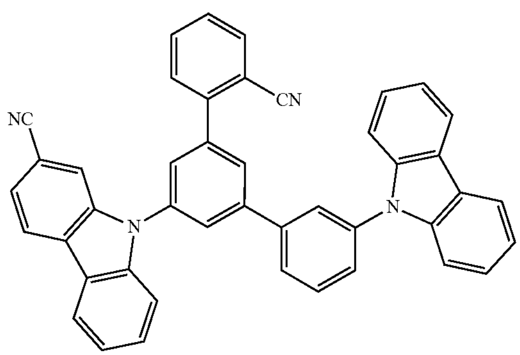
72
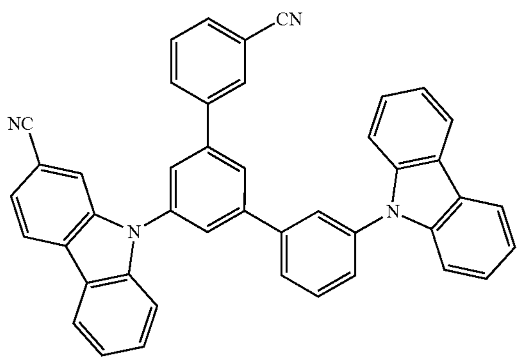
-continued
73
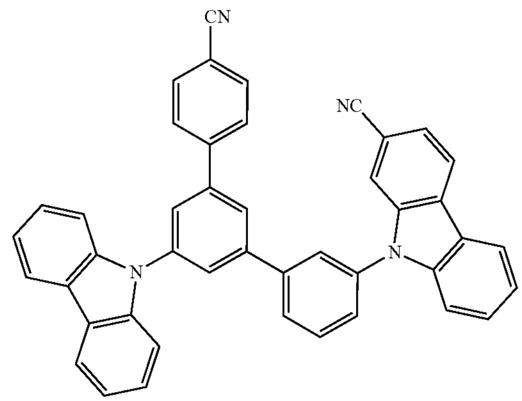
74
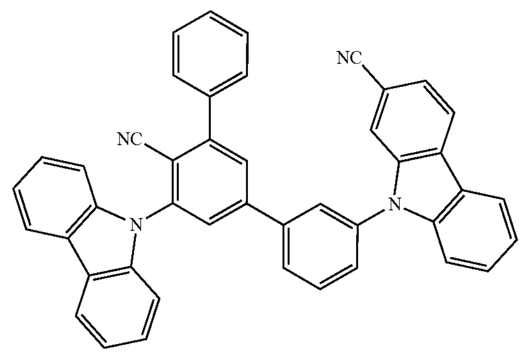
75
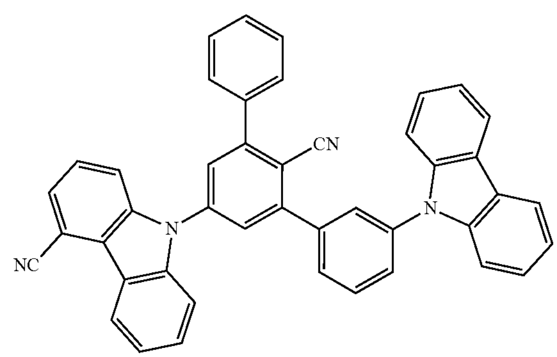
76
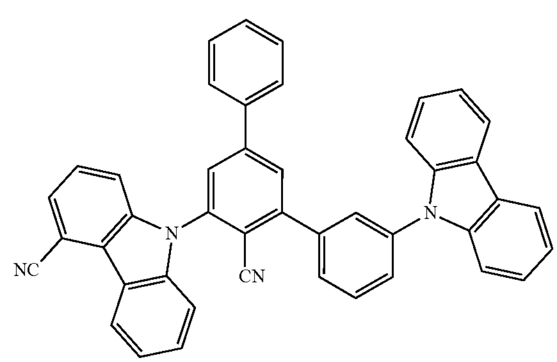

-continued
77
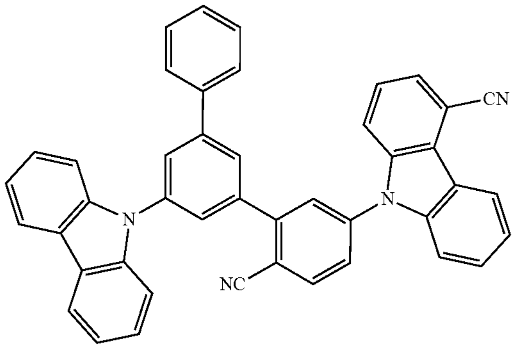
78
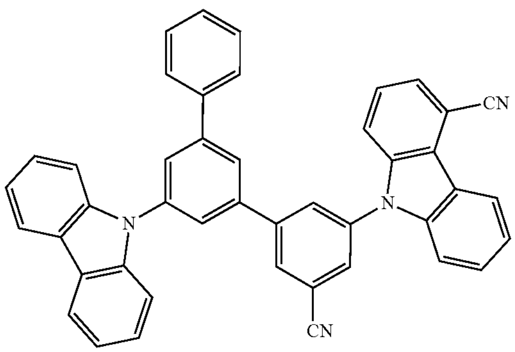
79
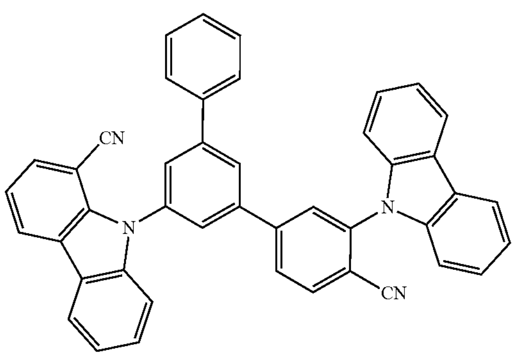
80
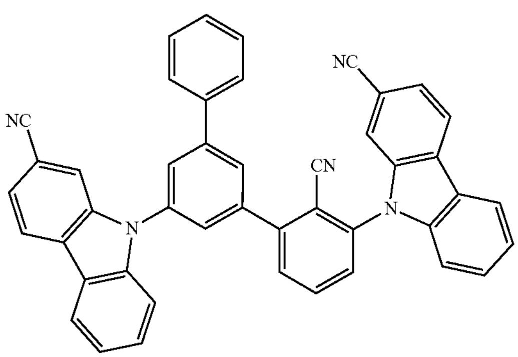
-continued
81
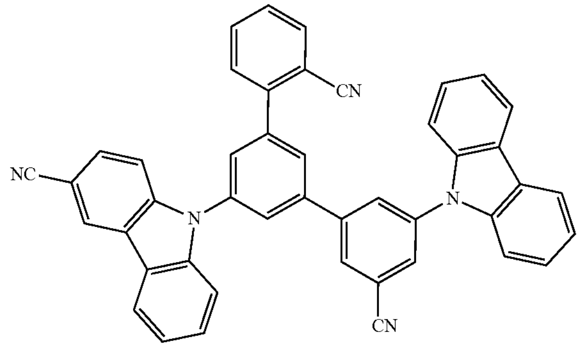
82
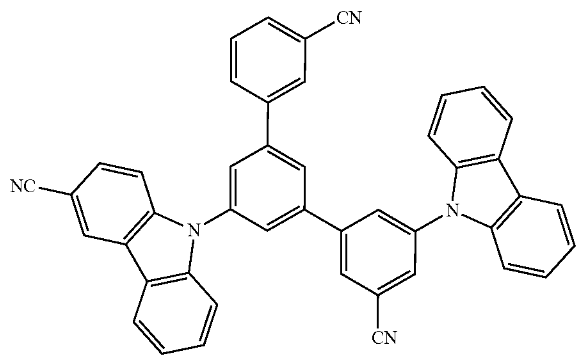
83
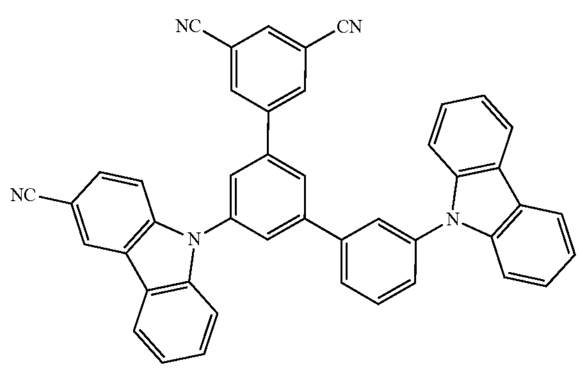
84
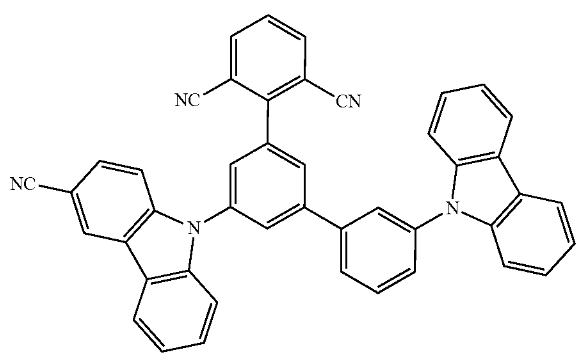

-continued
85
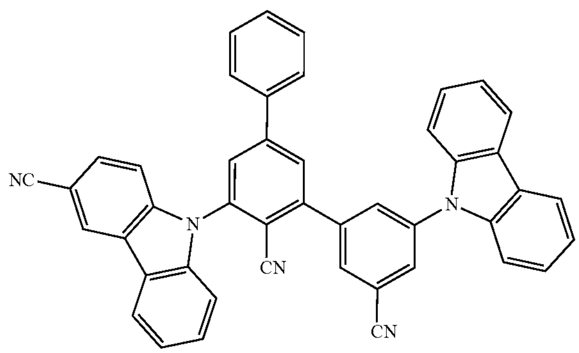
86
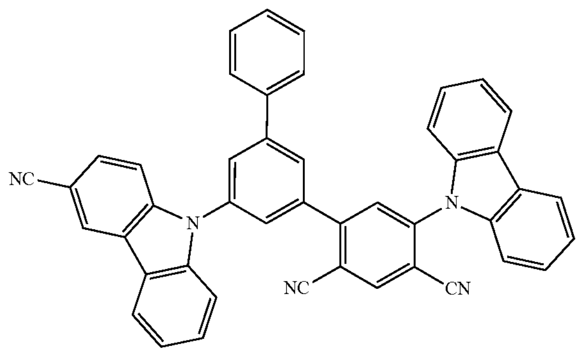
87
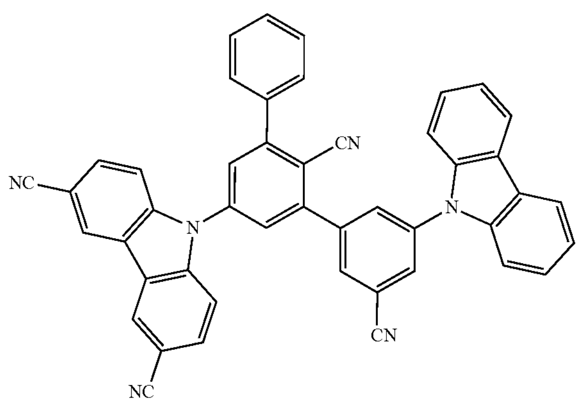
88
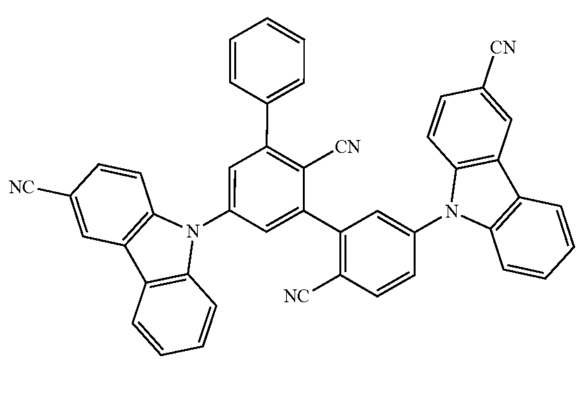
-continued
89
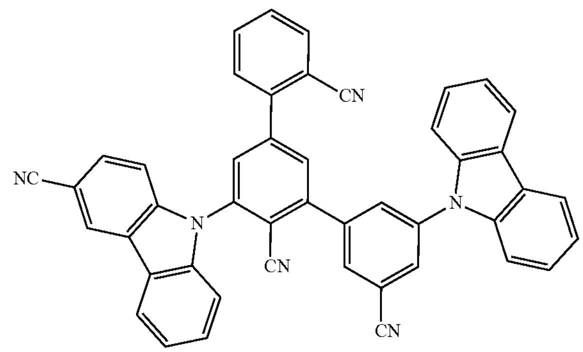
90
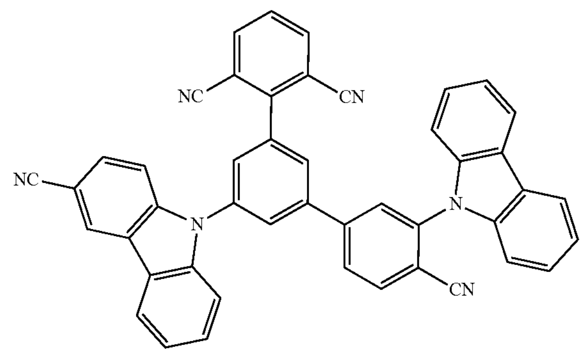
91
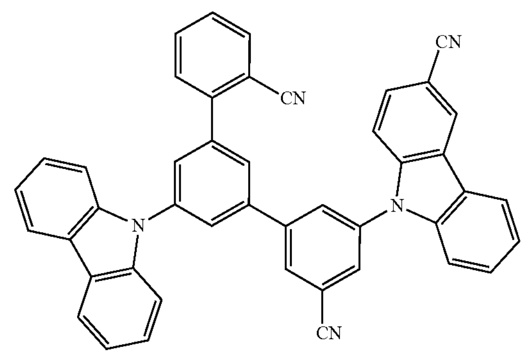
92
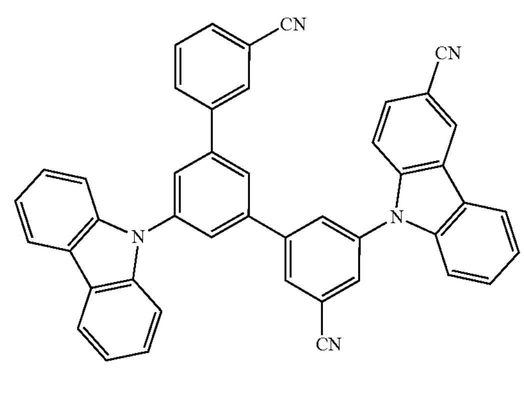

-continued
93
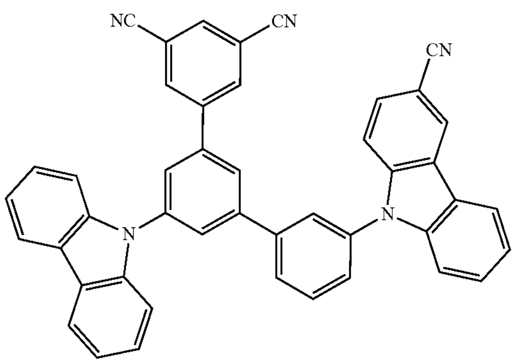
94
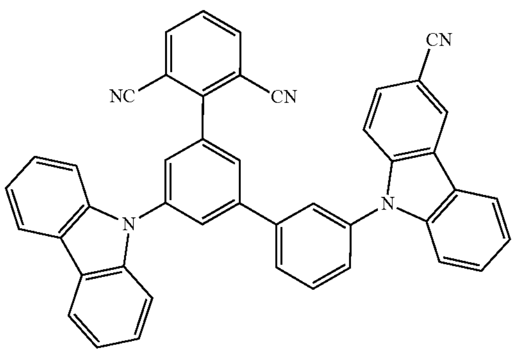
95
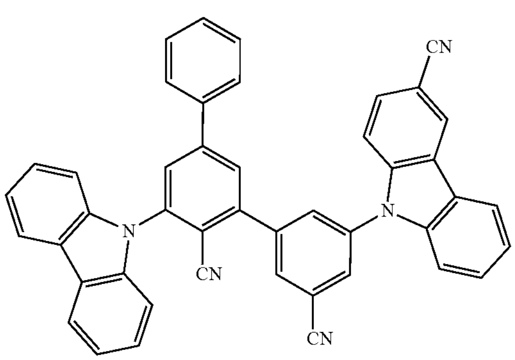
96
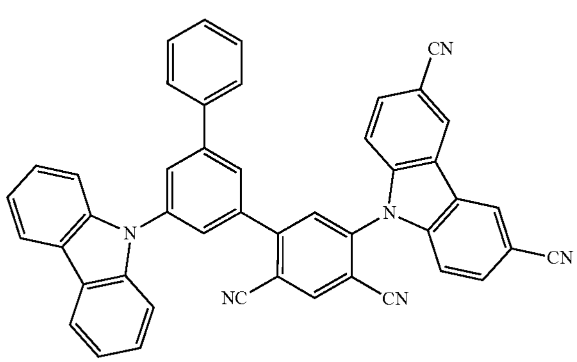
-continued
97
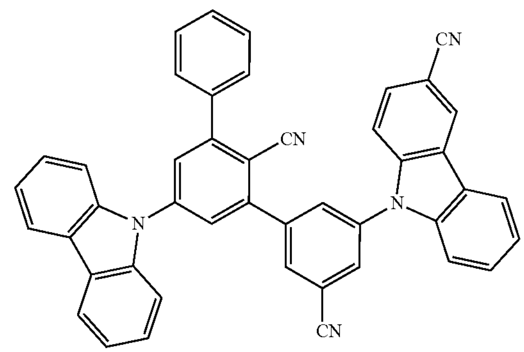
98
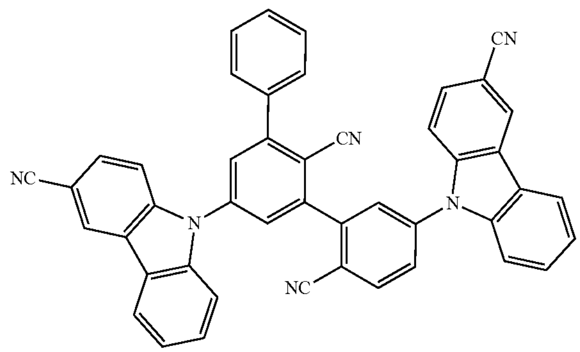
99
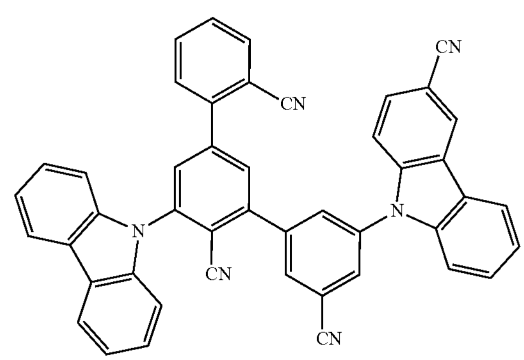
100
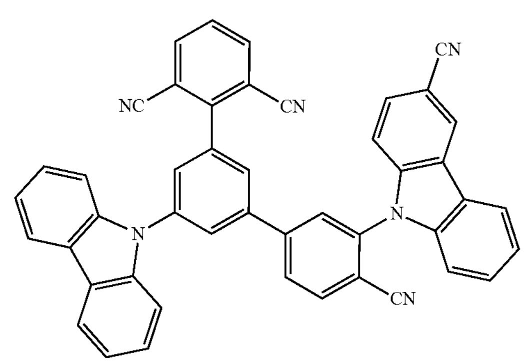

-continued
101
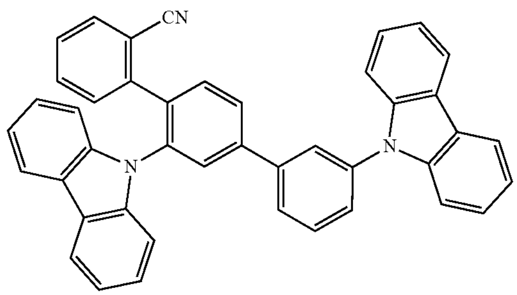
102
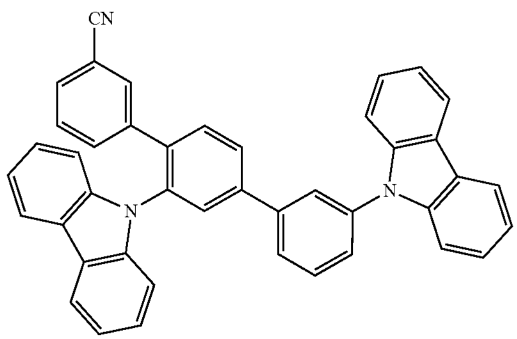
103
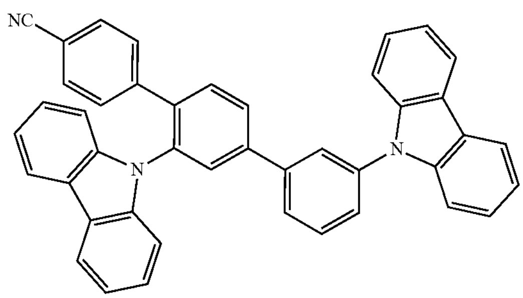
104
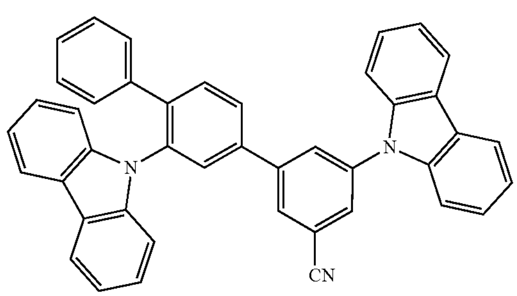
105
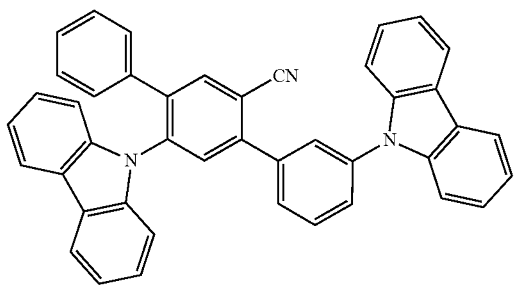
-continued
106
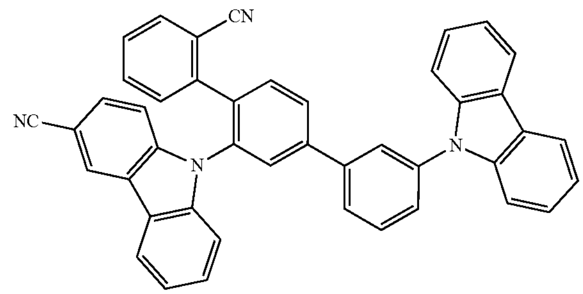
107
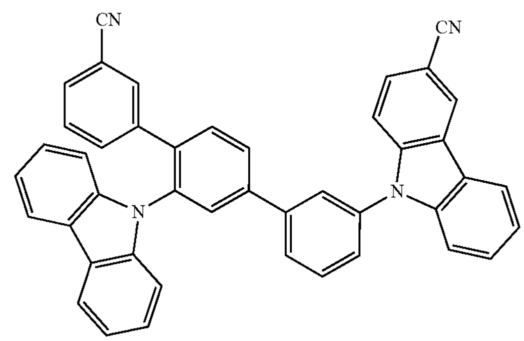
108
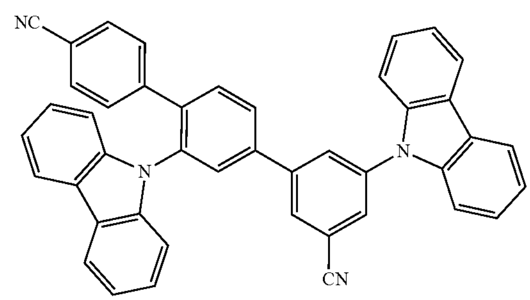
109
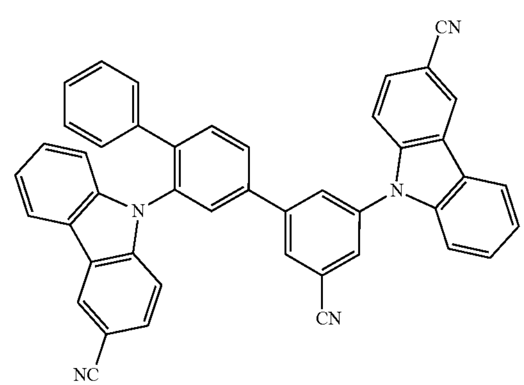

-continued
110
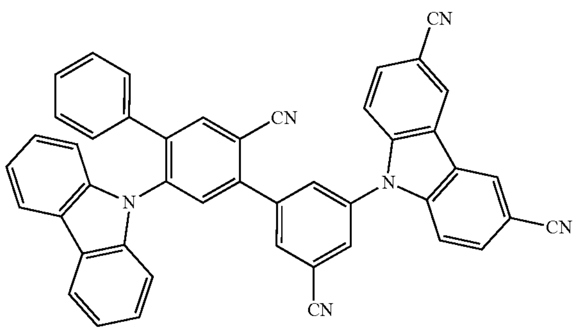
111
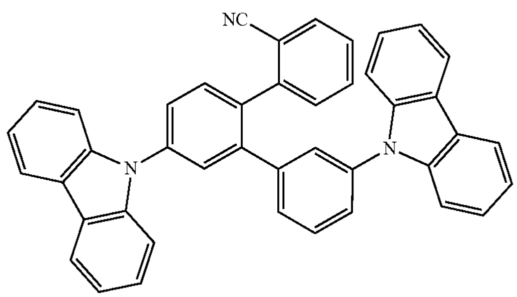
112
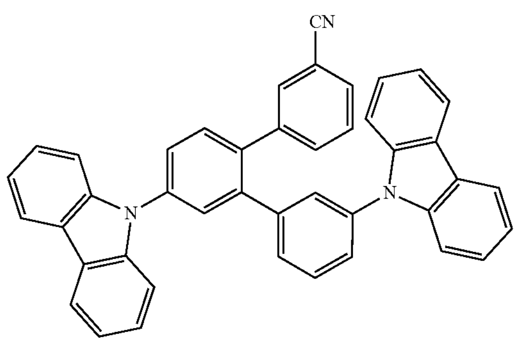
113
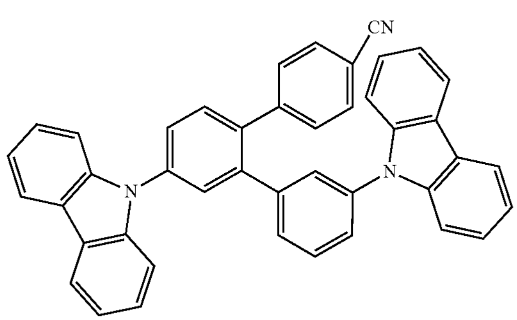
114
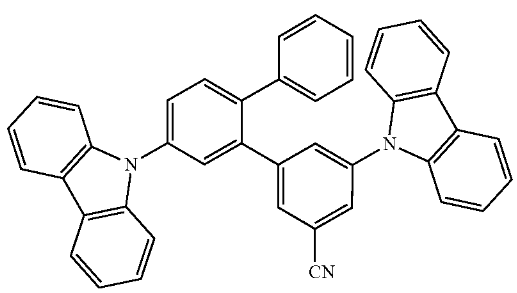
-continued
115
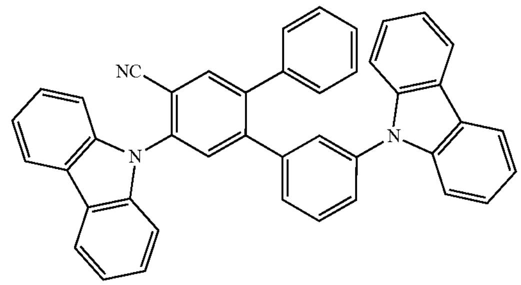
116
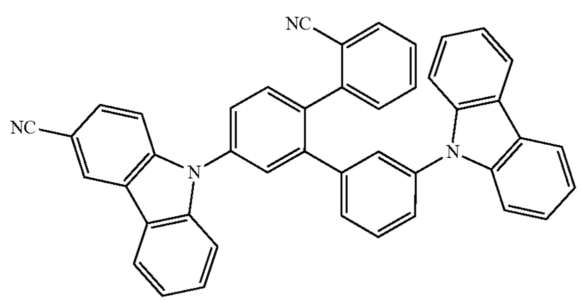
117
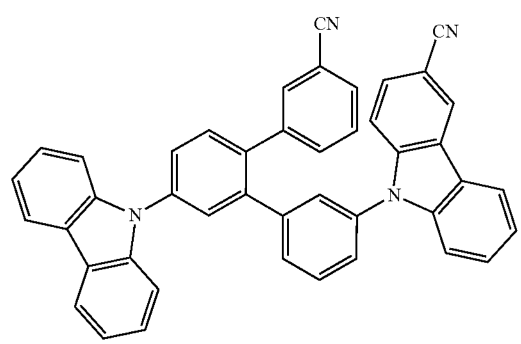
118
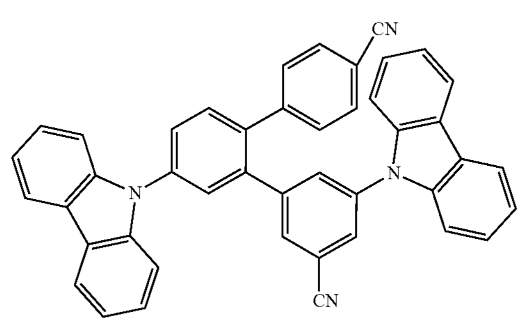

-continued
119
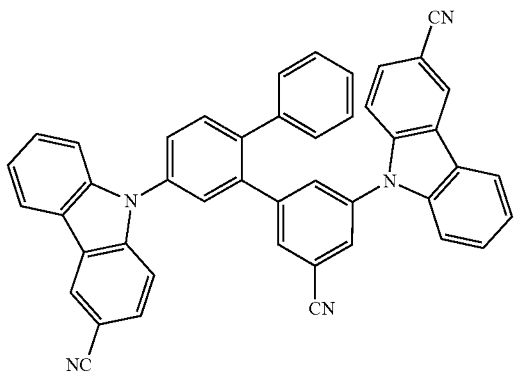
120
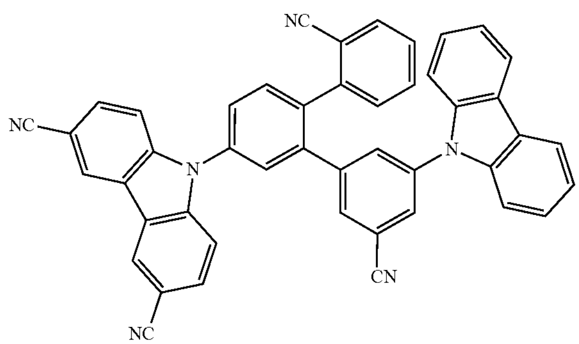
121
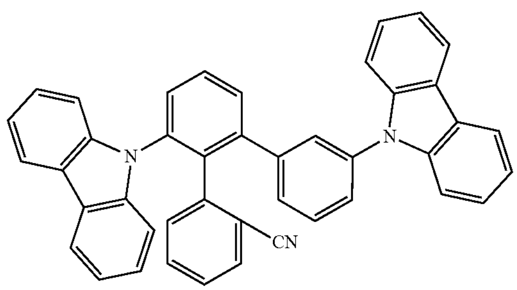
122
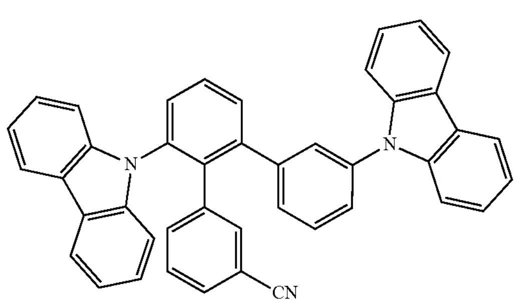
-continued
123
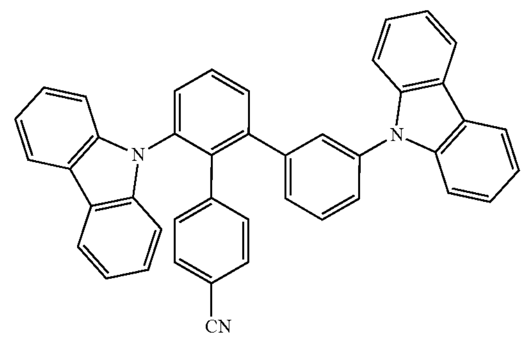
124
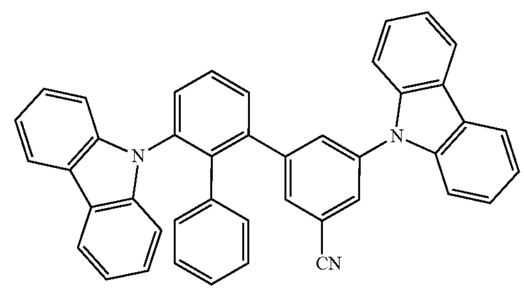
125
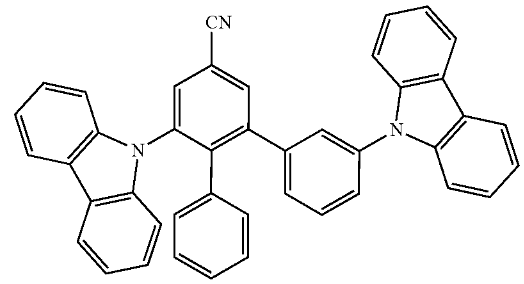
126
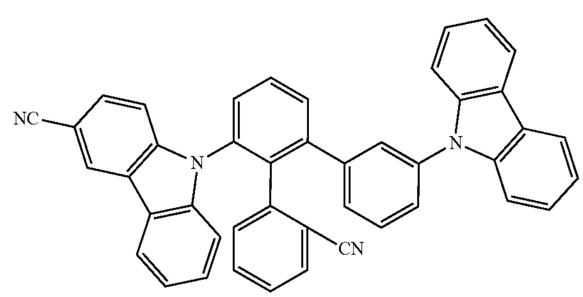
127
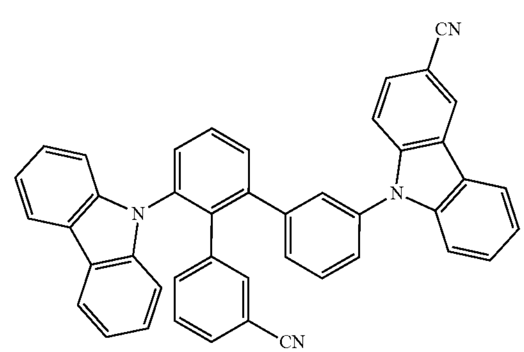

-continued
128
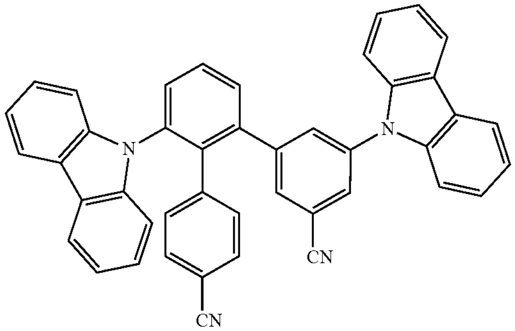
129
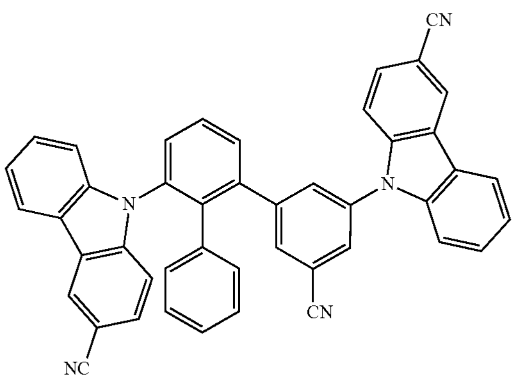
130
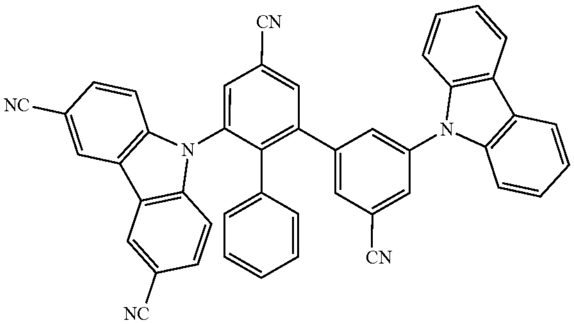
131
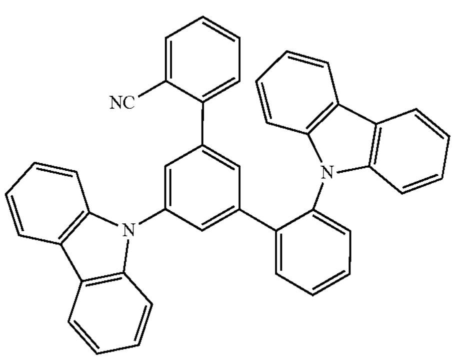
-continued
132
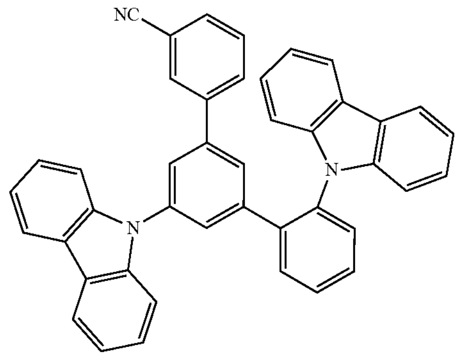
133
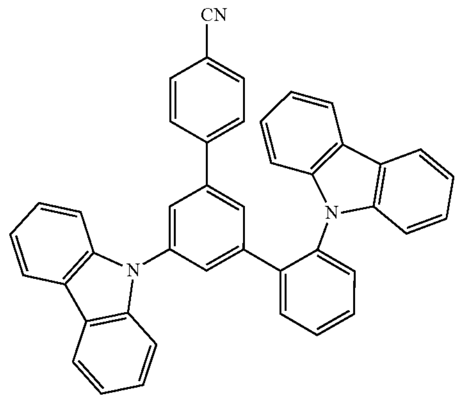
134
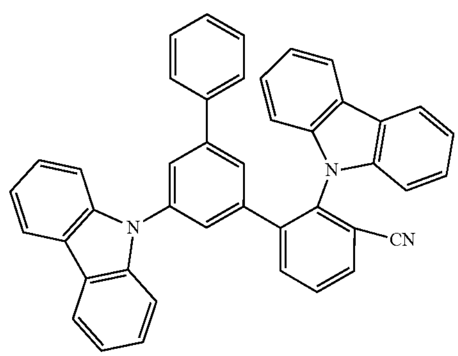
135
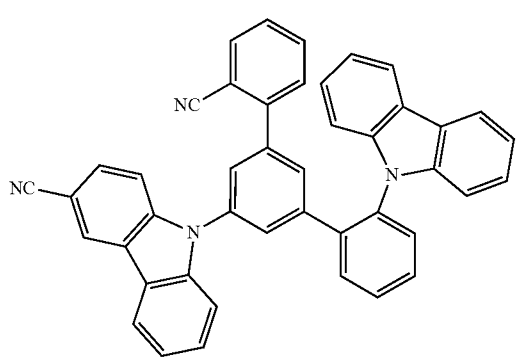

-continued
136
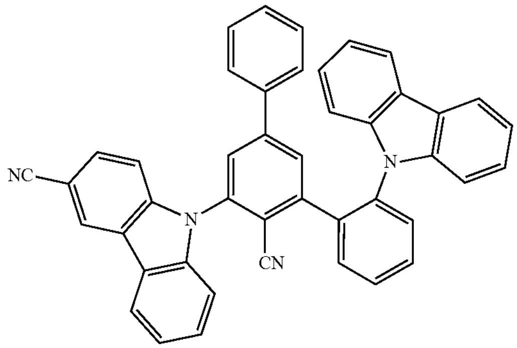
137
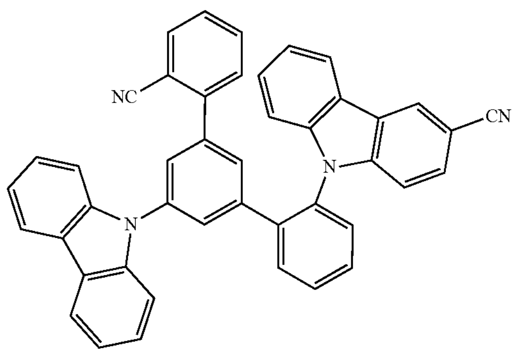
138
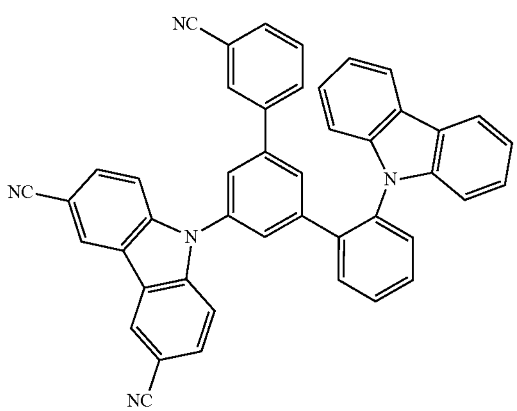
139
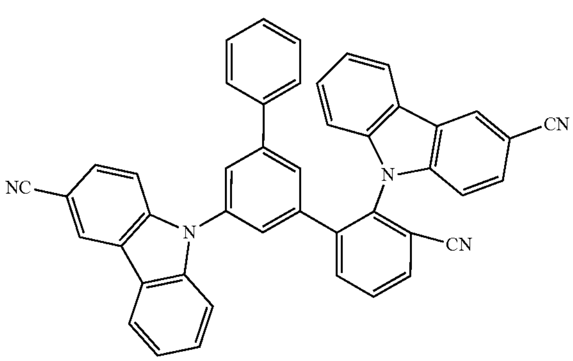
-continued
140
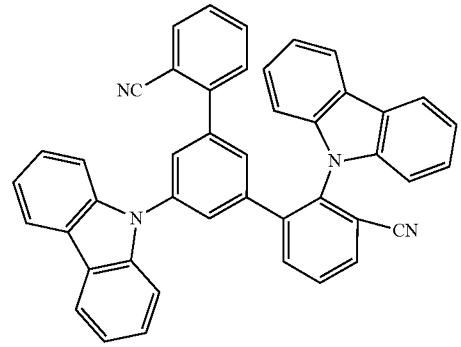
141
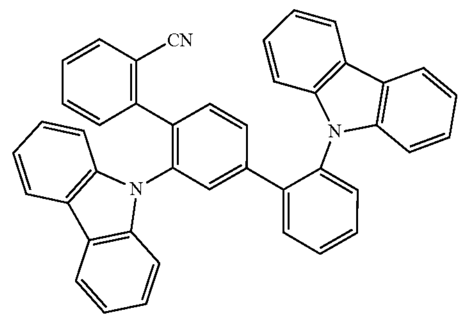
142
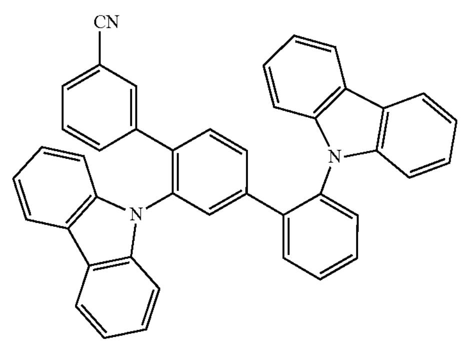
143
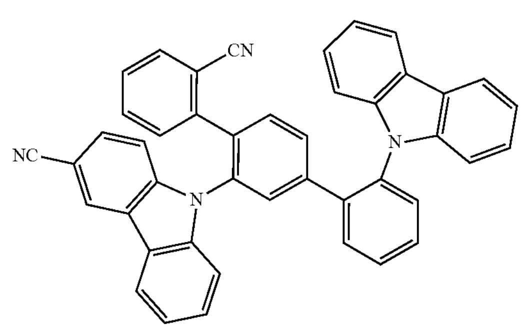

144
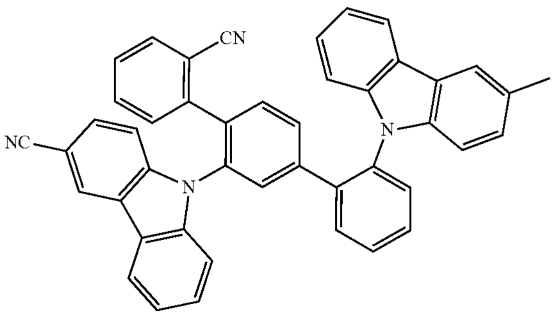
145
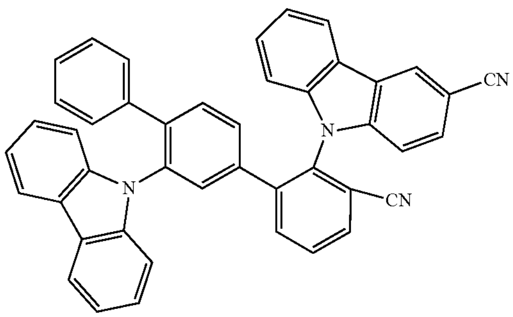
146
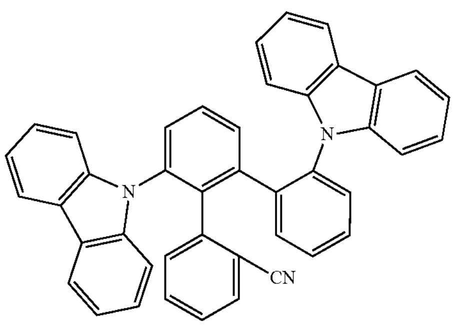
147
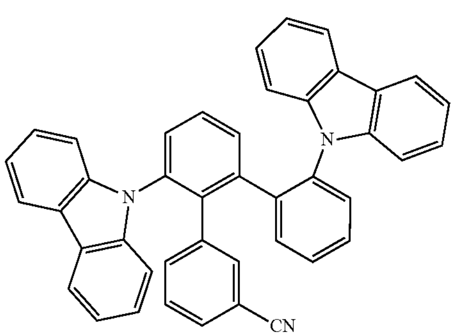
148
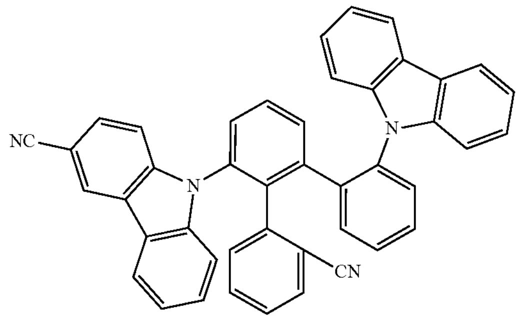
149
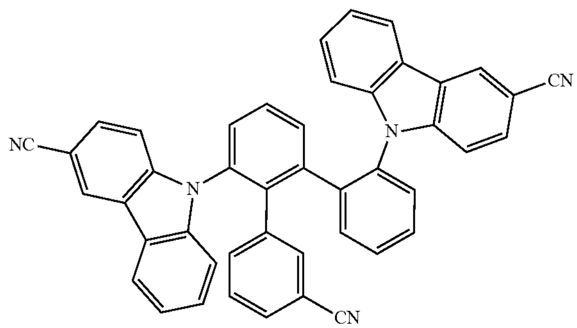
150
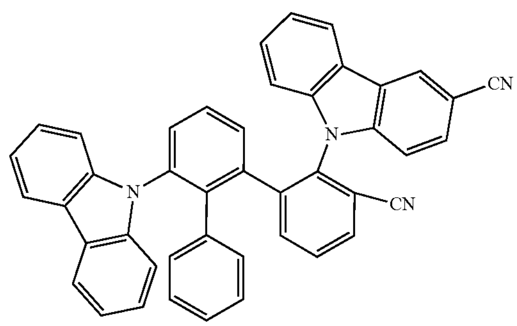
151
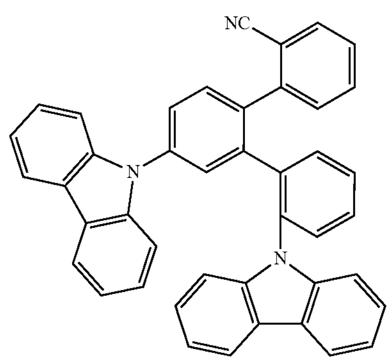

-continued
152
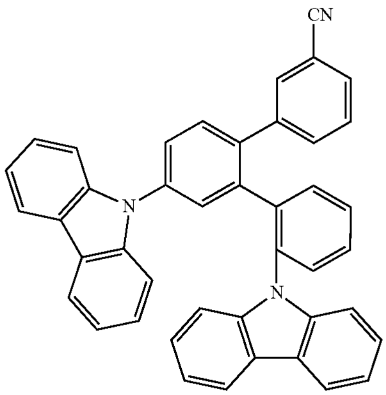
153
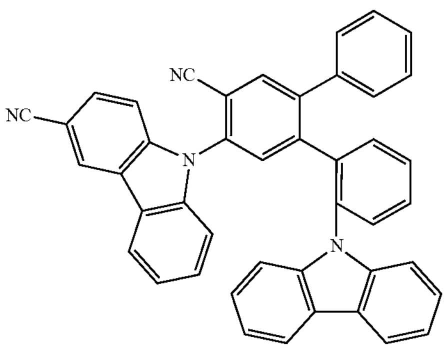
154
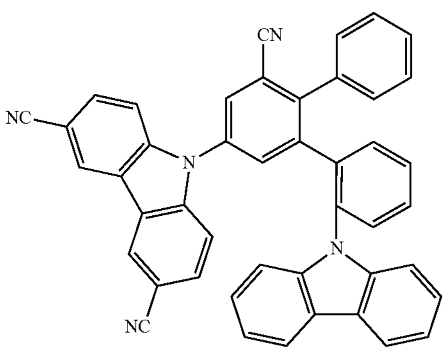
155
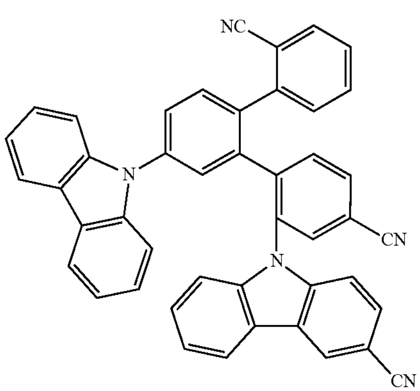
-continued
156
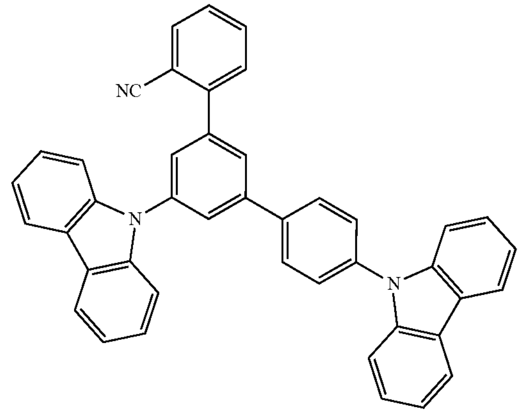
157
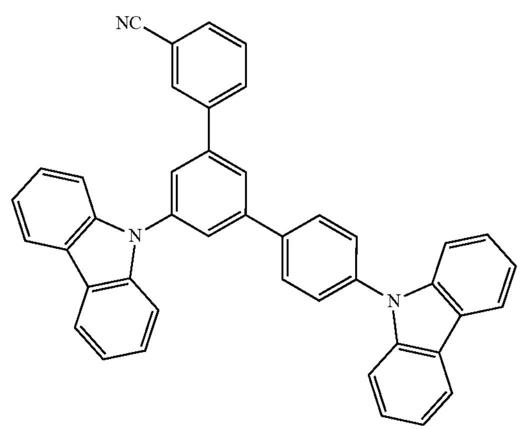
158
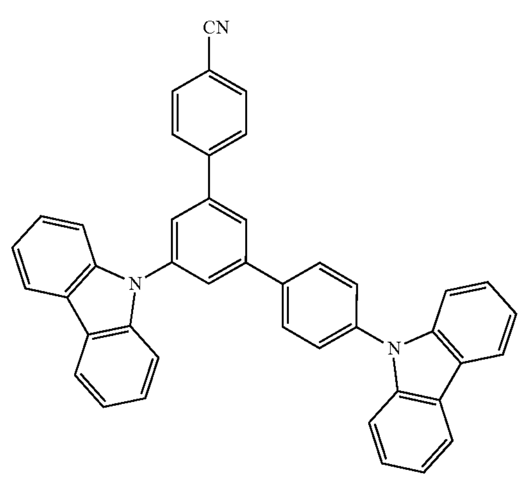

-continued
159
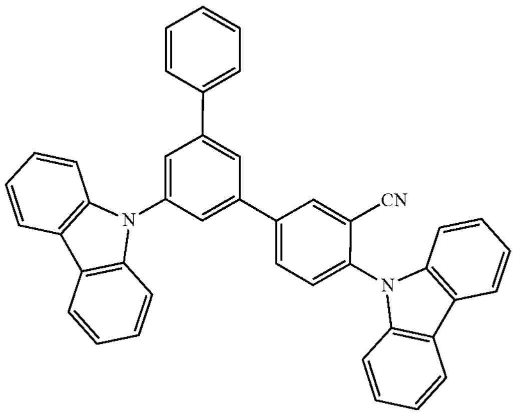
160
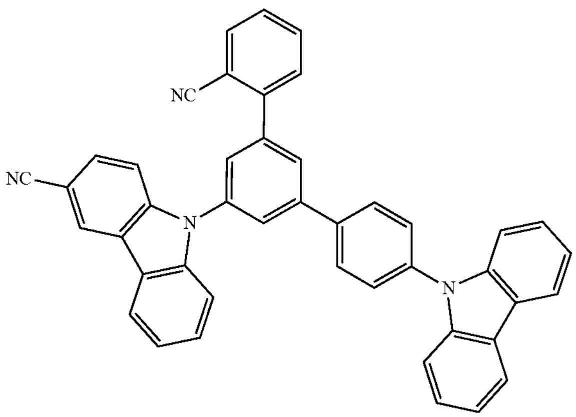
161
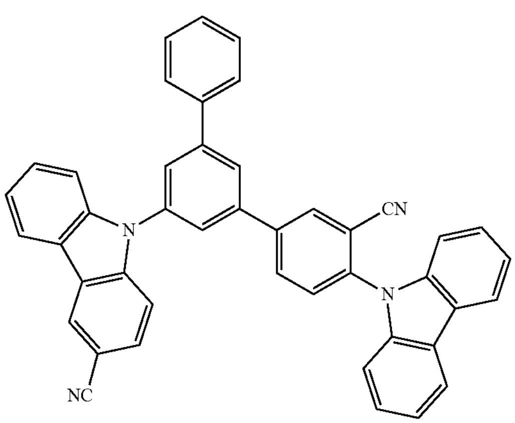
-continued
162
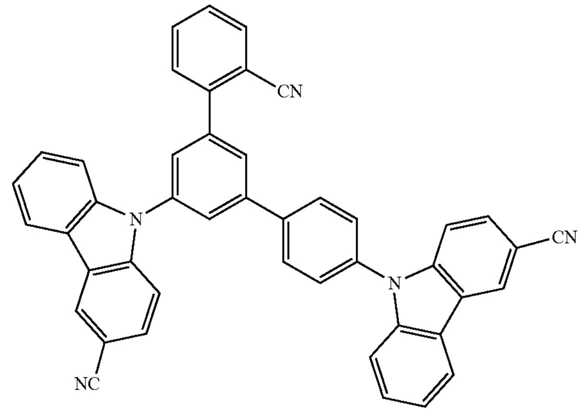
163
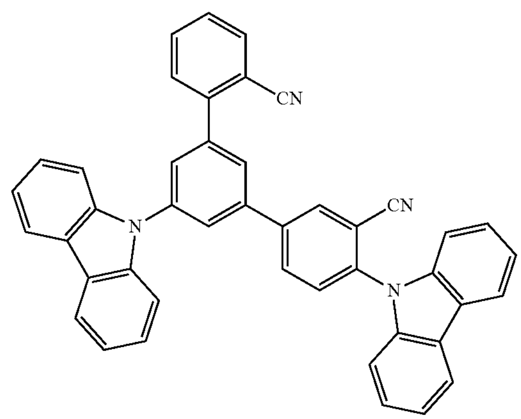
164
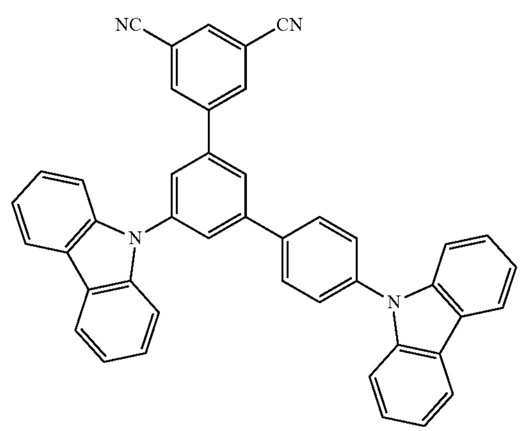

-continued
165
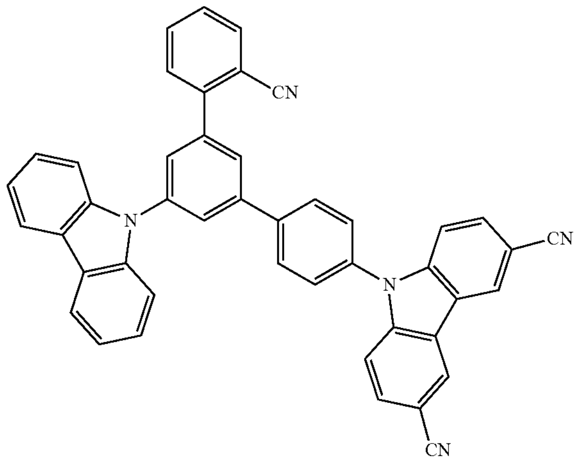
166
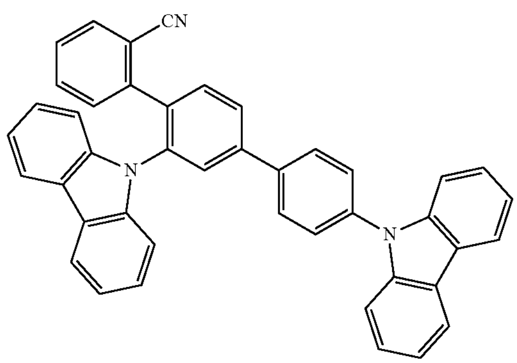
167
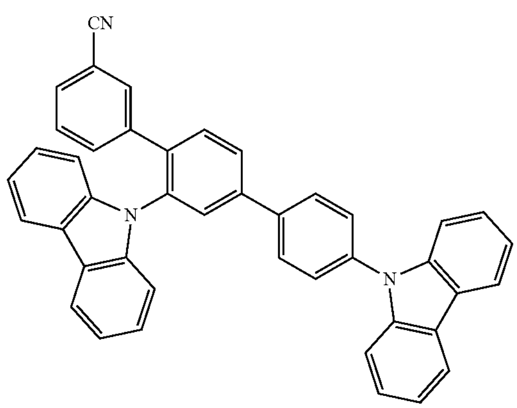
168
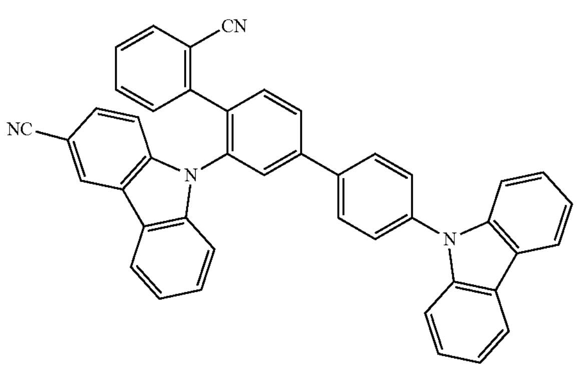
-continued
169
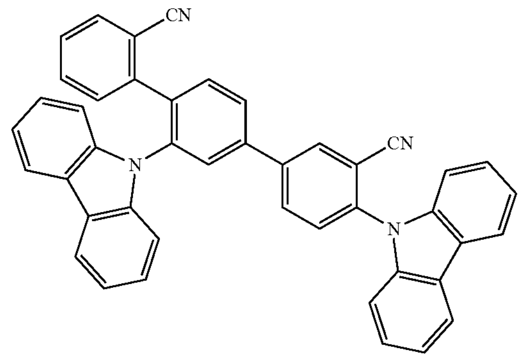
170
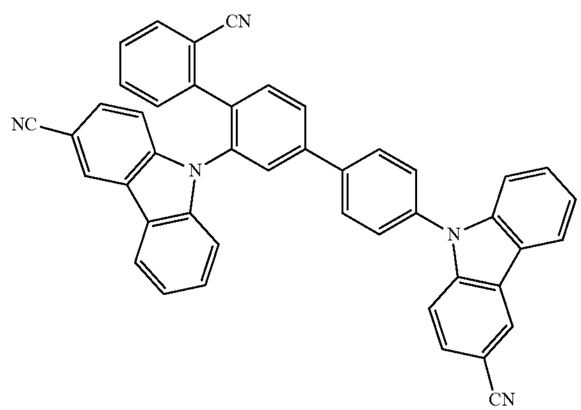
171
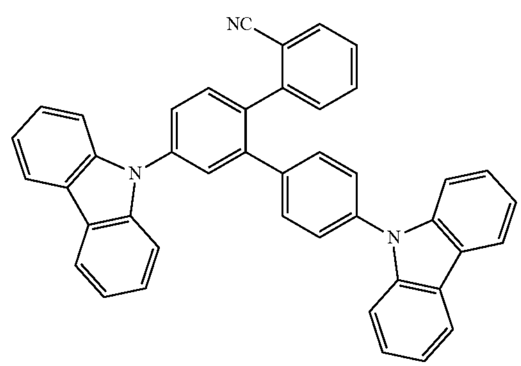
172
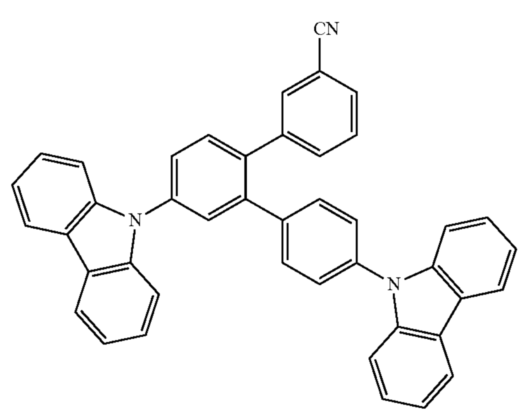

-continued
173
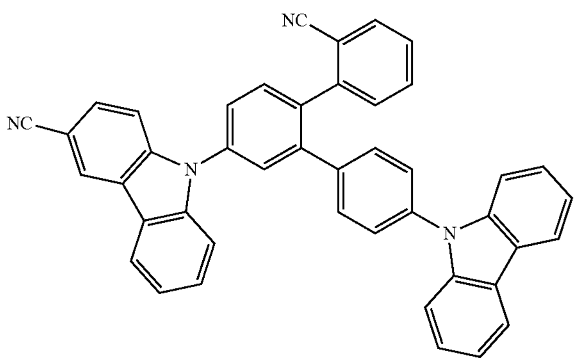
174
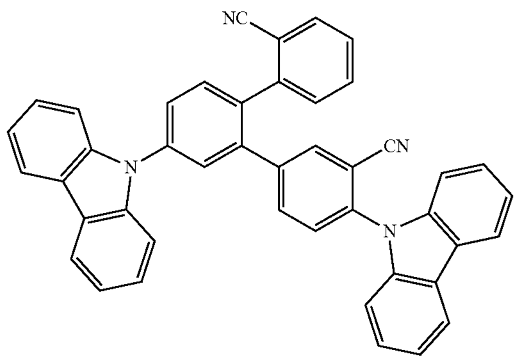
175
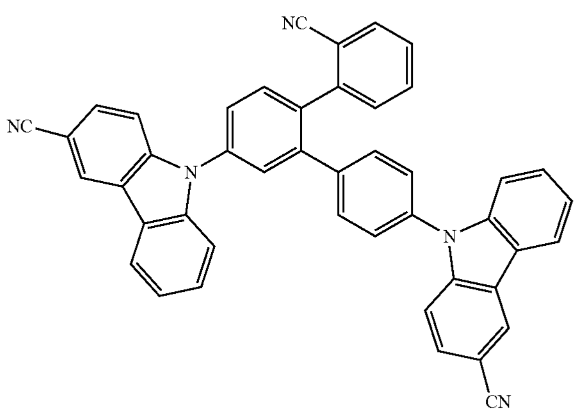
176
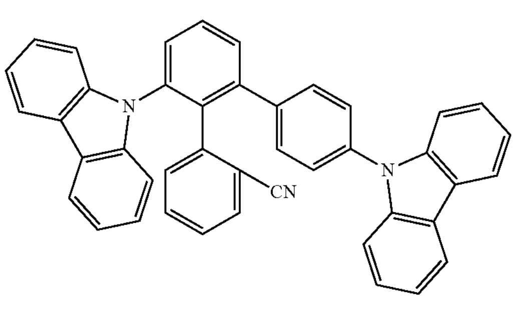
-continued
177
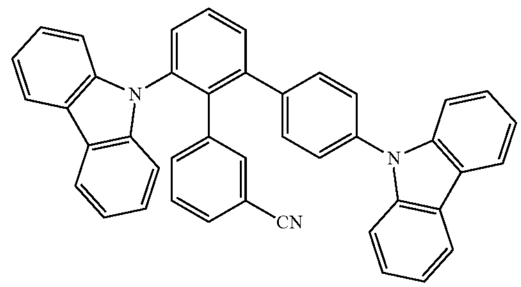
178
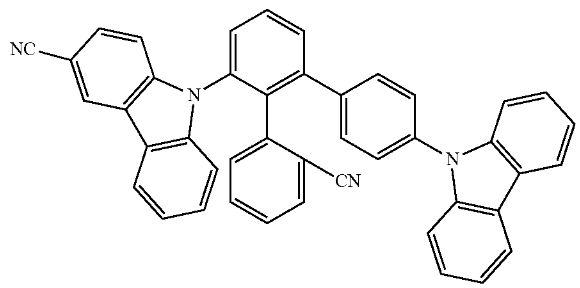
179
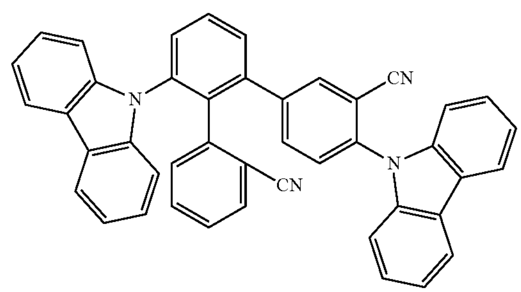
180
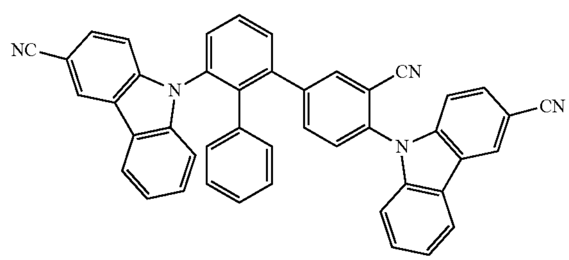
181
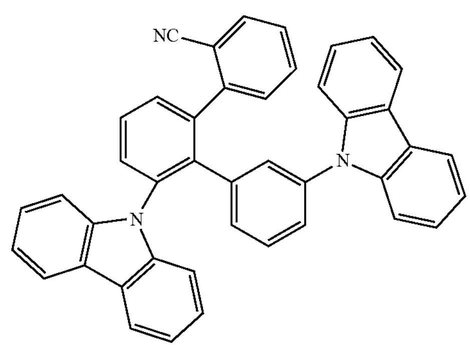

-continued
182
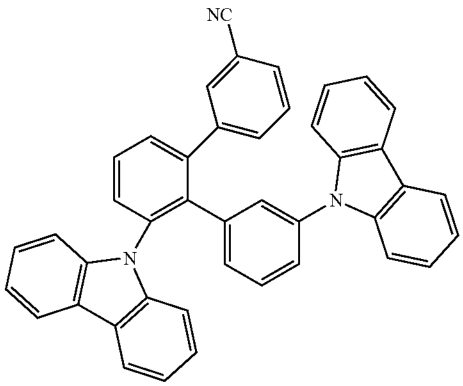
183
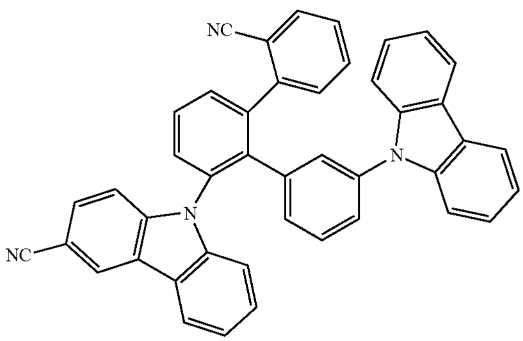
184
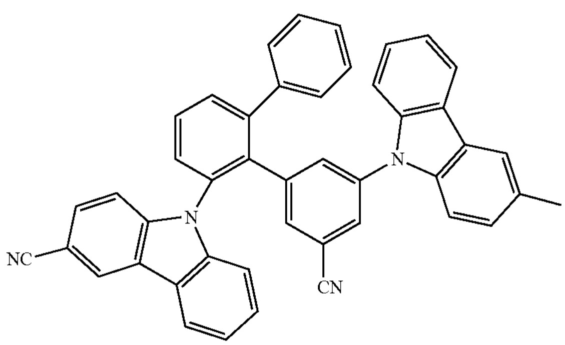
185
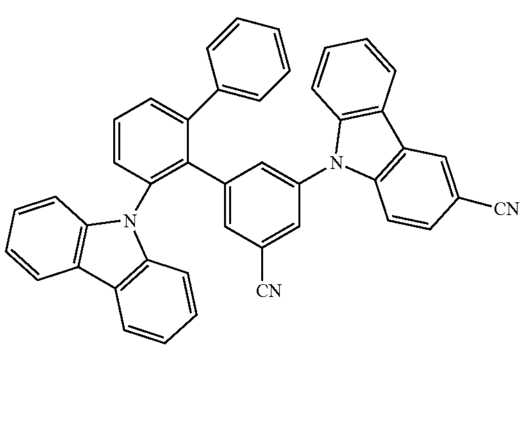
-continued
186
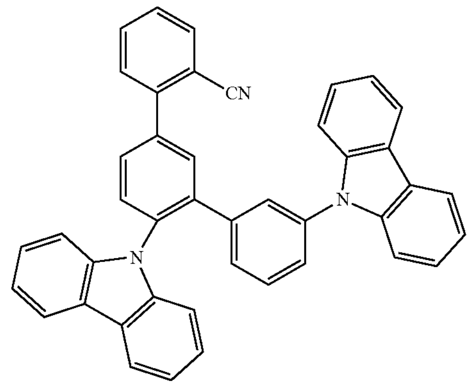
187
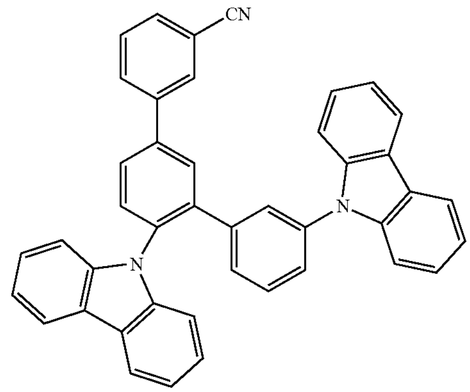
188
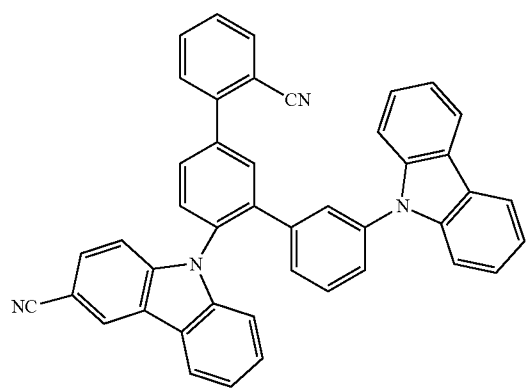
189
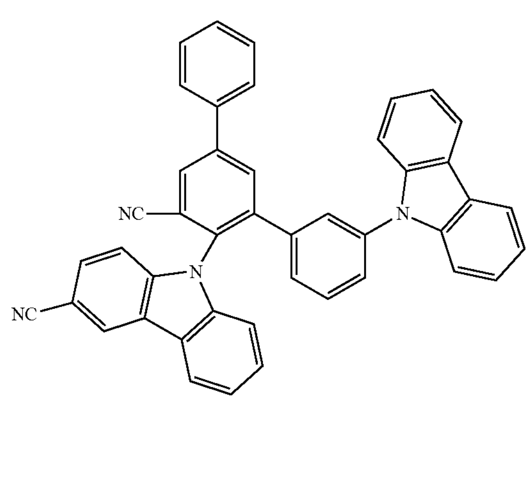

-continued
190
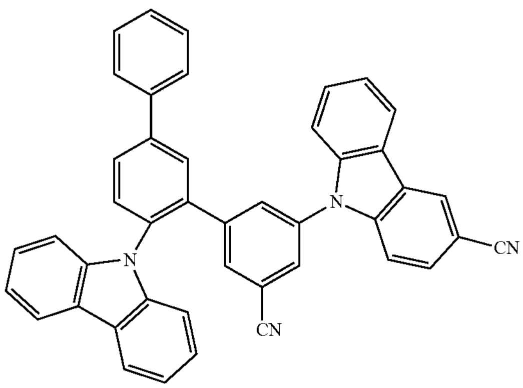
191
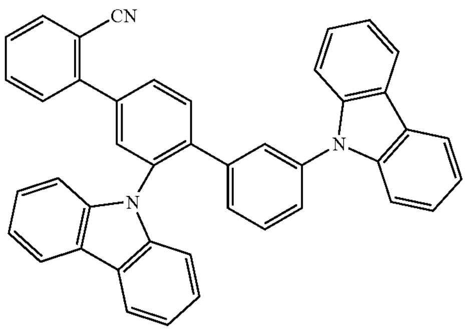
192
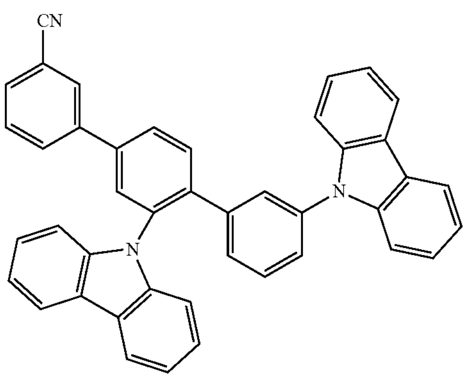
193
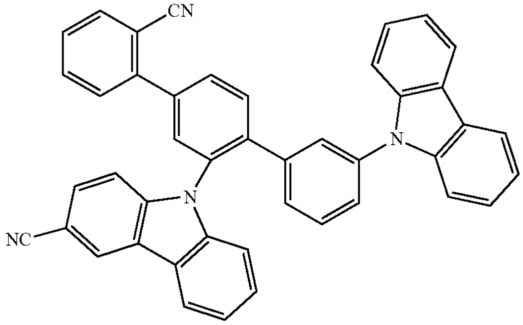
-continued
194
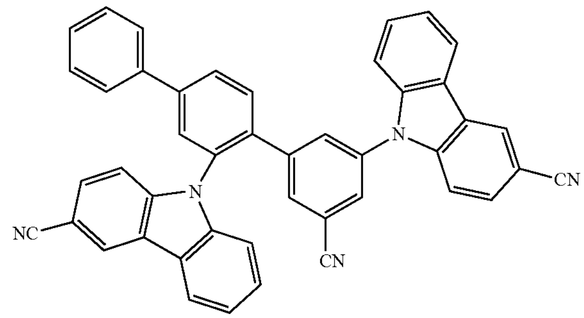
195
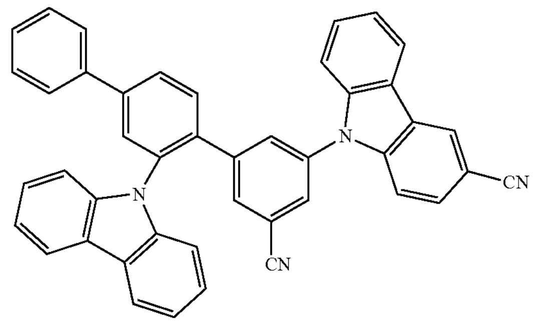
196
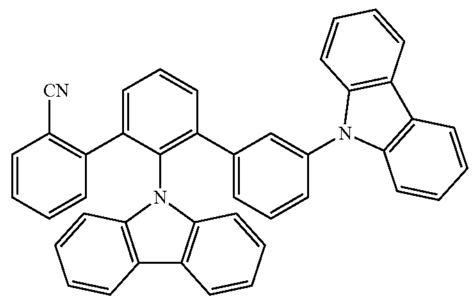
196
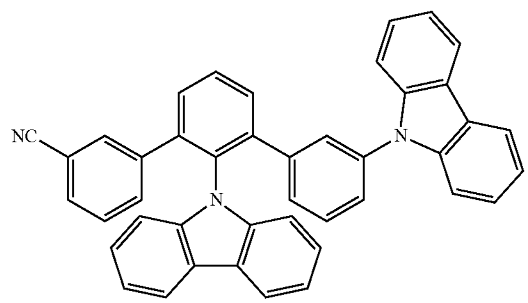
198
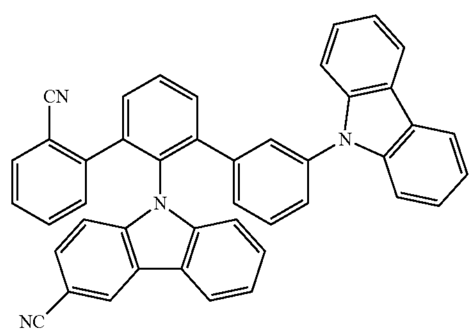

-continued
199
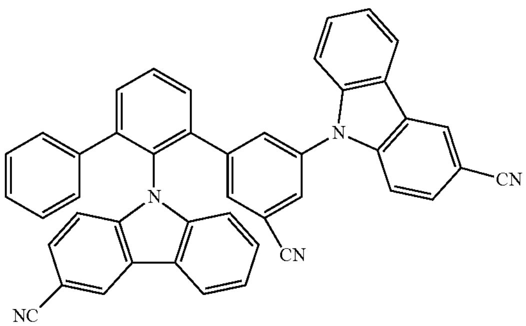
200
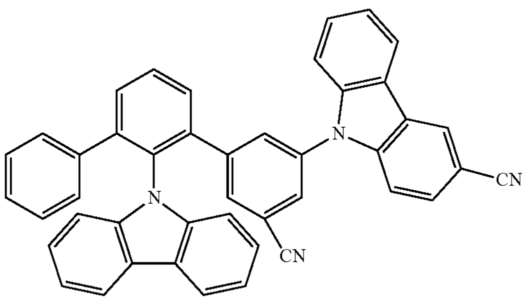
201
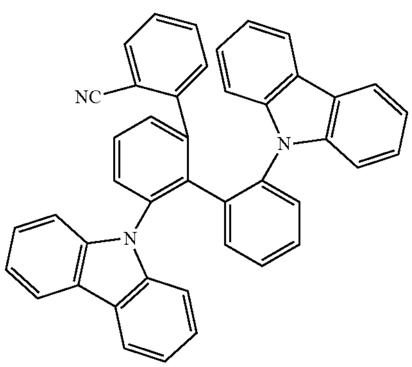
202
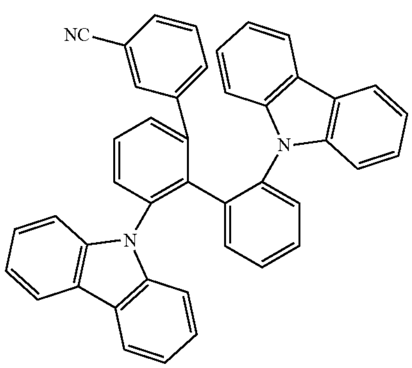
-continued
203
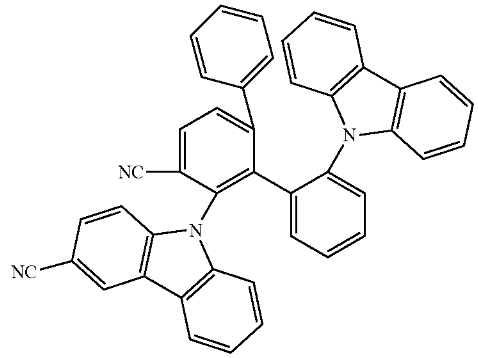
204
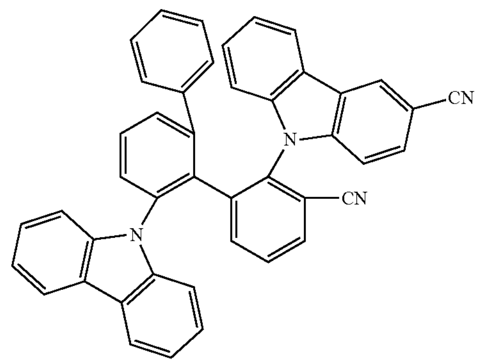
205
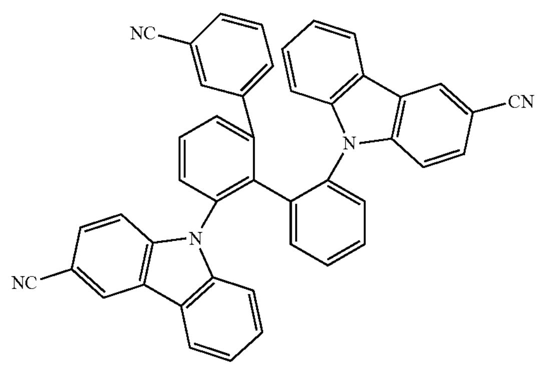
206
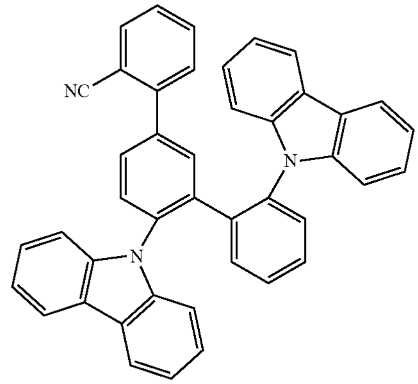

-continued
207
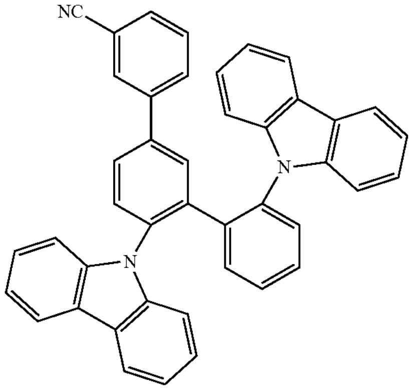
208
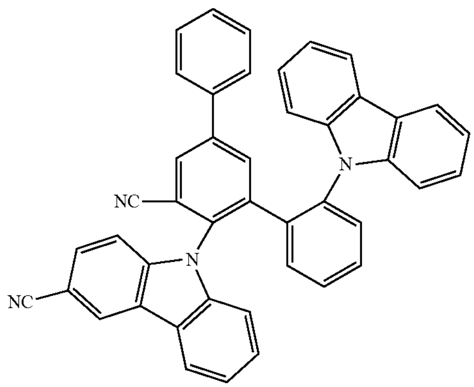
209
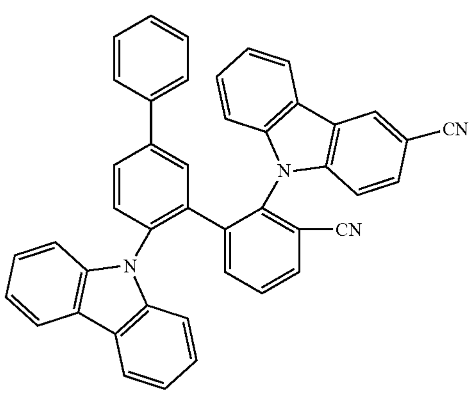
210
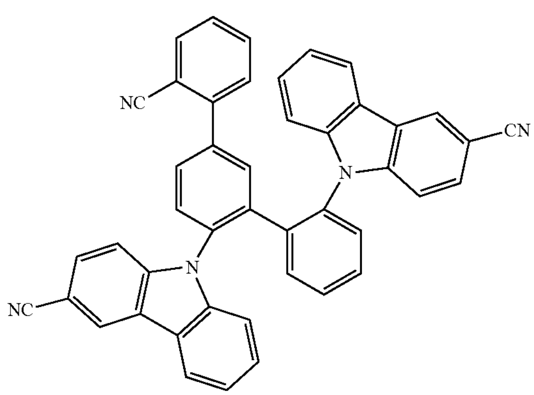
-continued
211
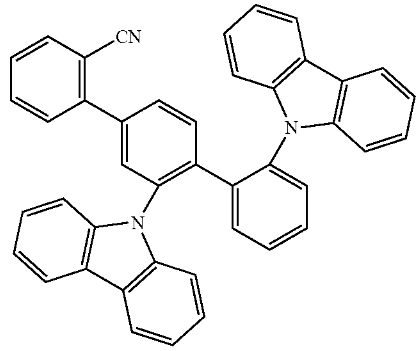
212
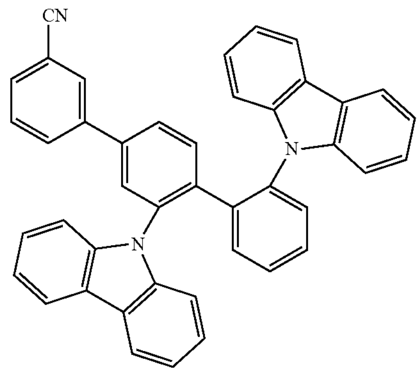
213
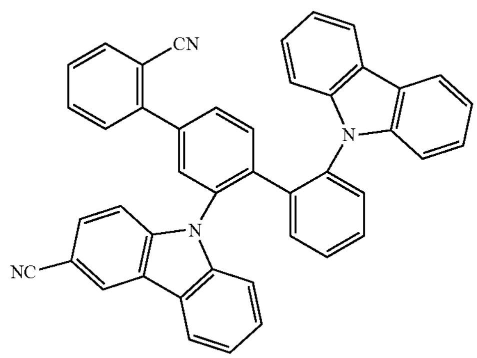
214
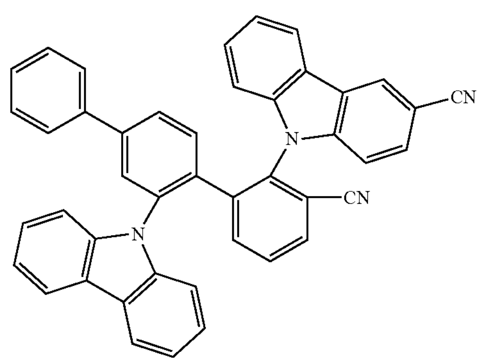

-continued
215
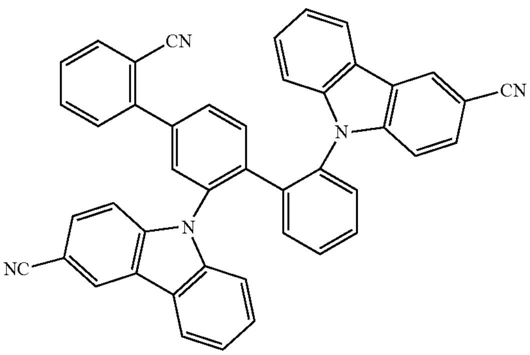
216
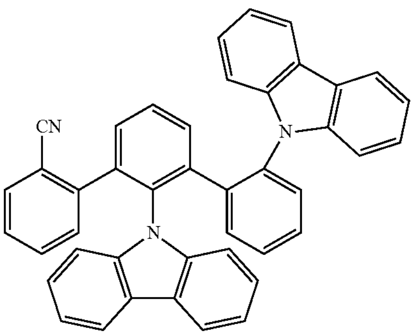
217
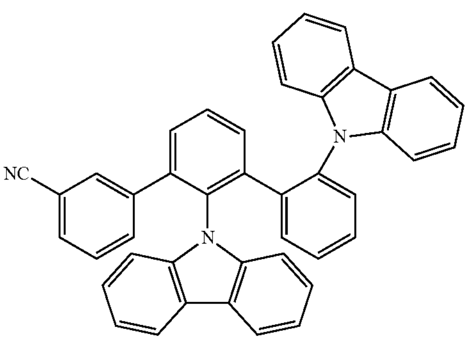
218
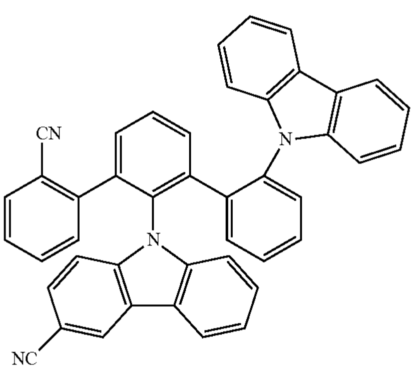
-continued
219
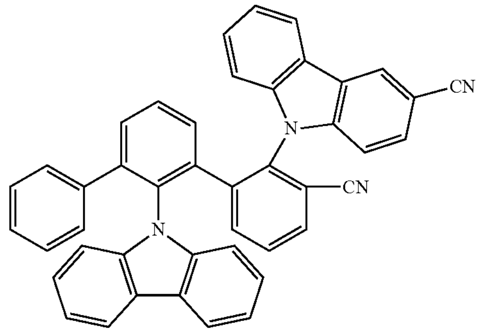
220
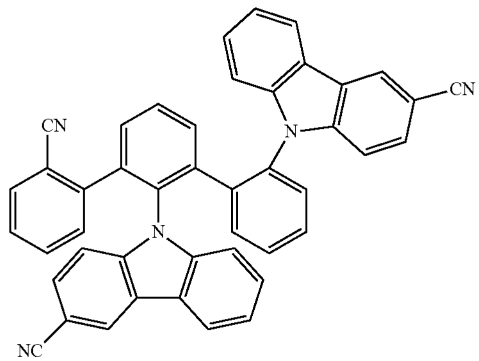
221
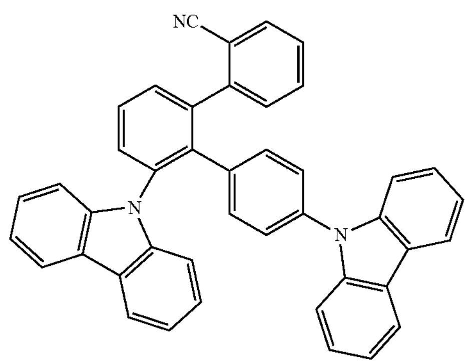
222
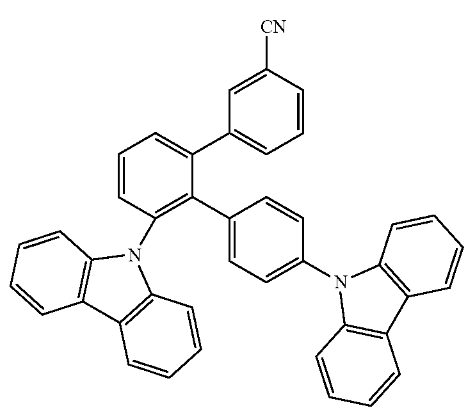

223
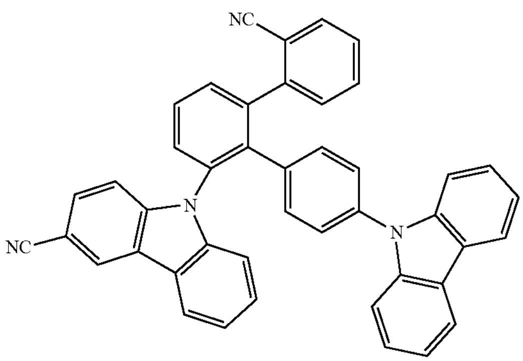
224
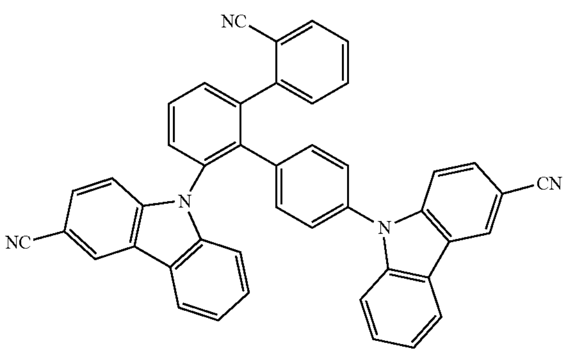
225
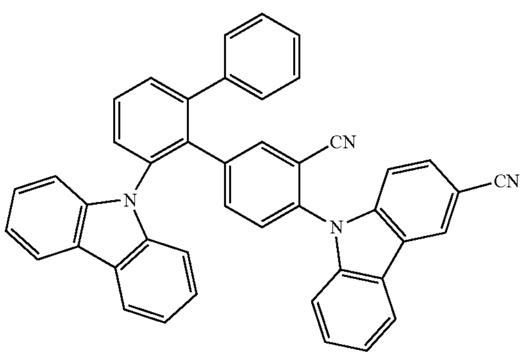
226
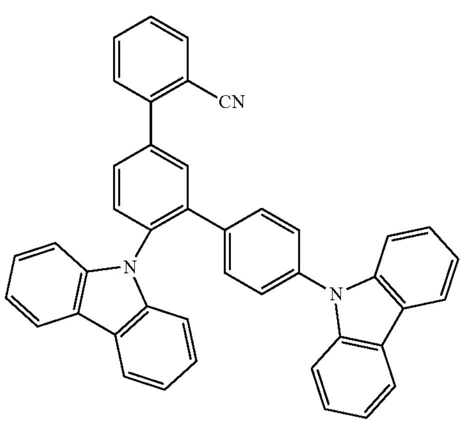
227
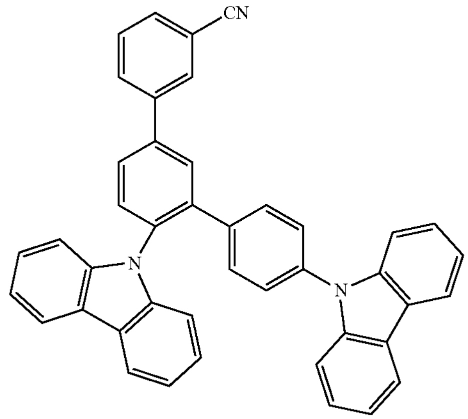
228
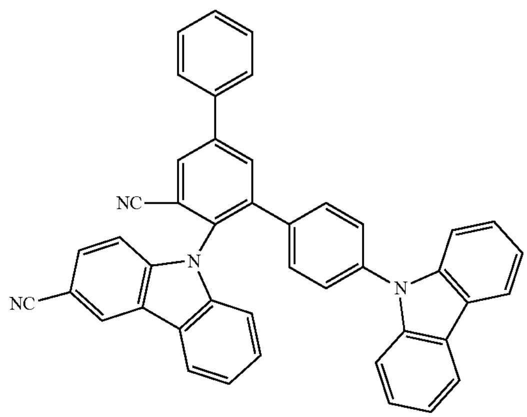
229
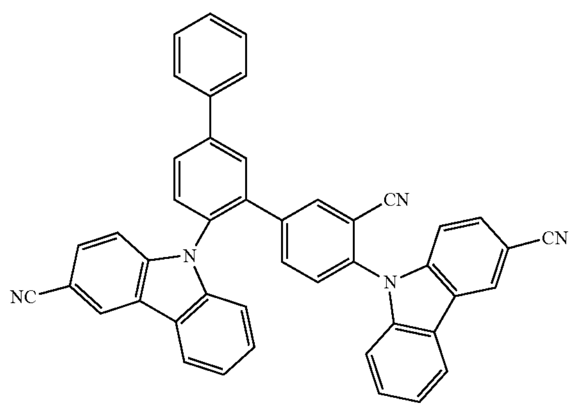

-continued
230
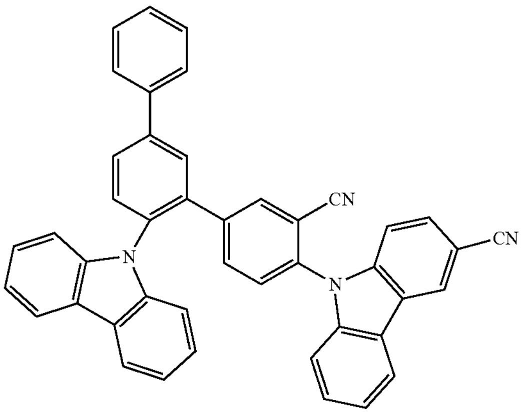
231
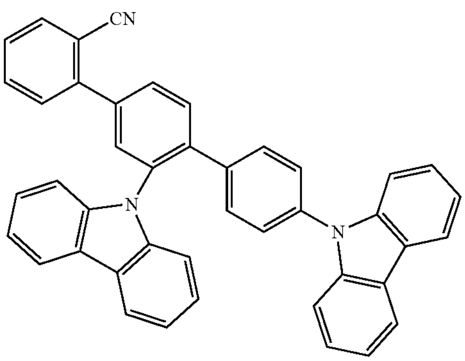
232
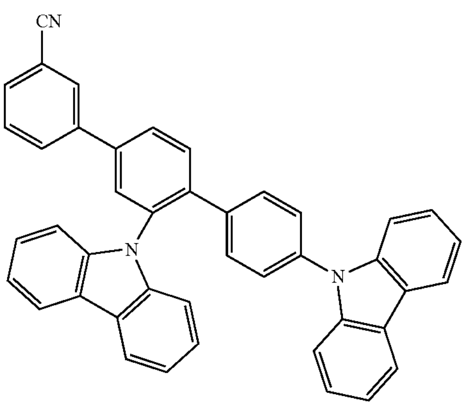
233
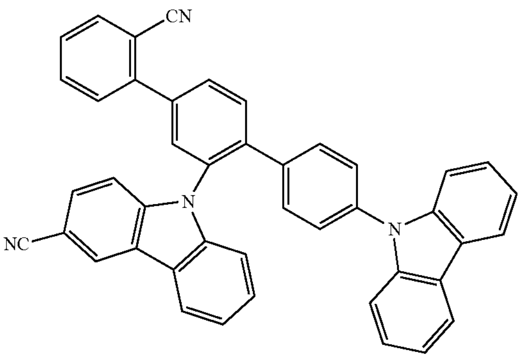
-continued
234
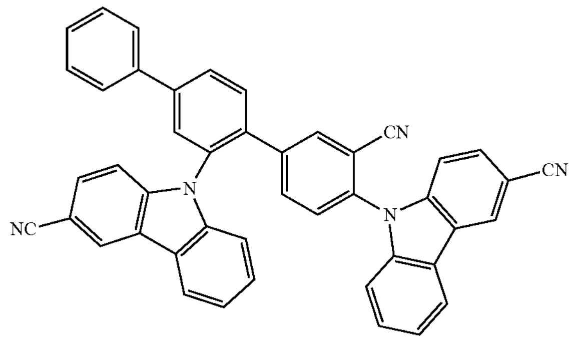
235
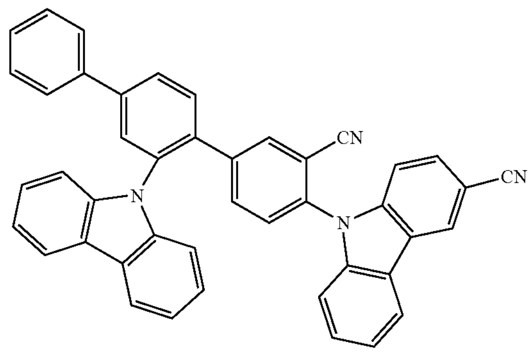
236
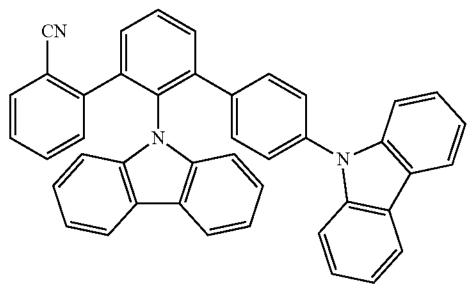
237
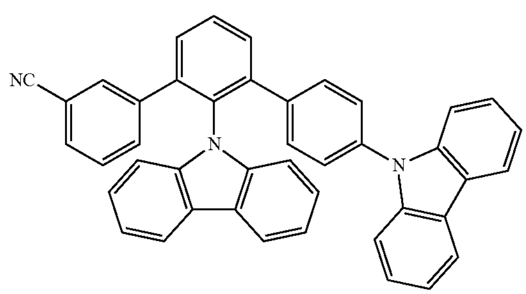
238
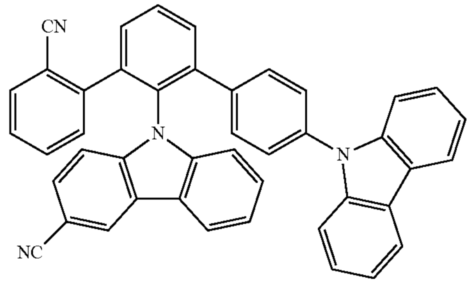

-continued
239
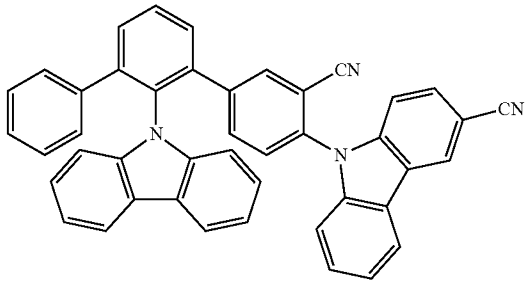
240
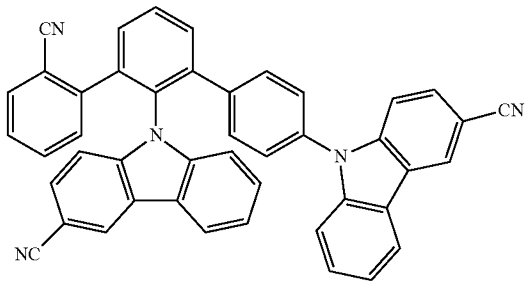
241
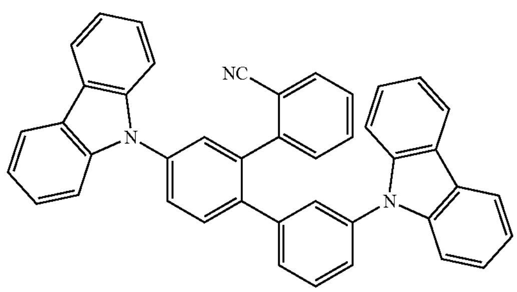
242
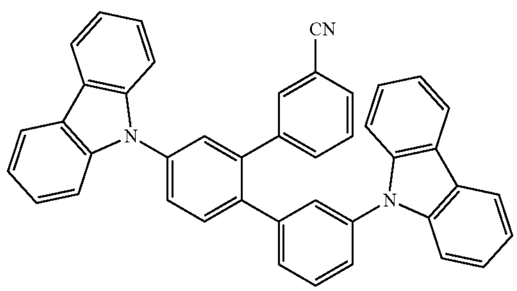
243
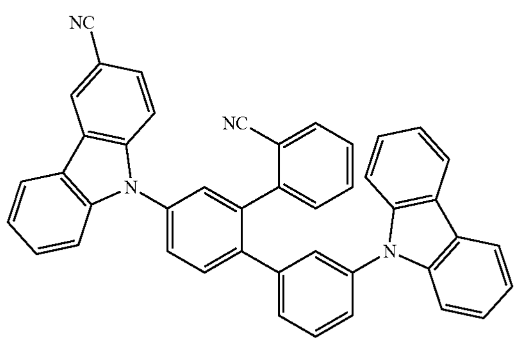
-continued
244
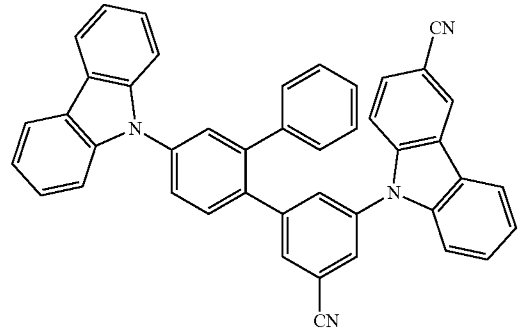
245
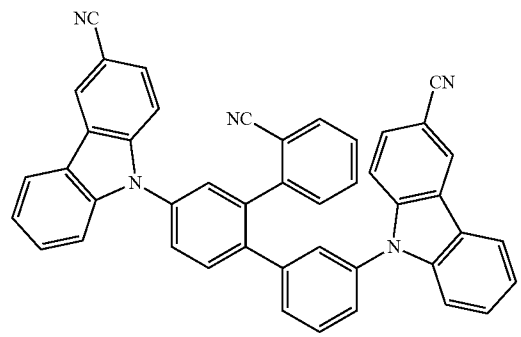
246
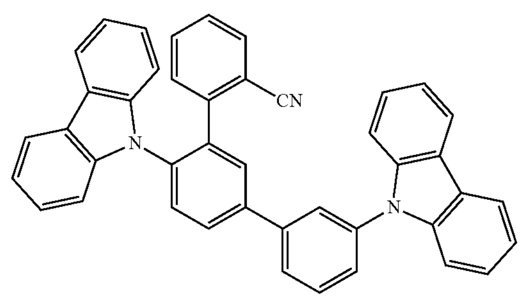
247
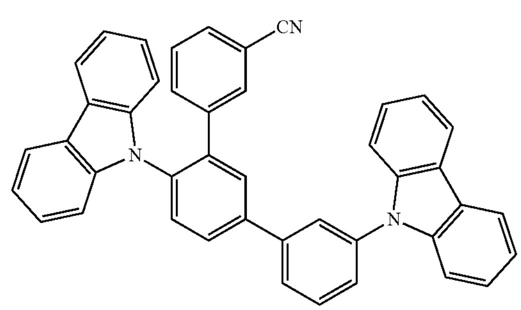

248
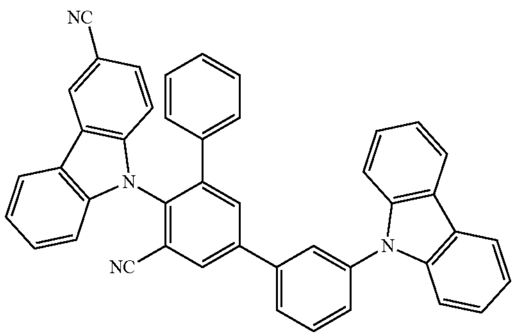
249
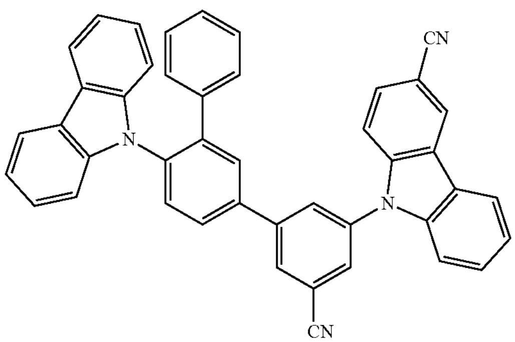
250
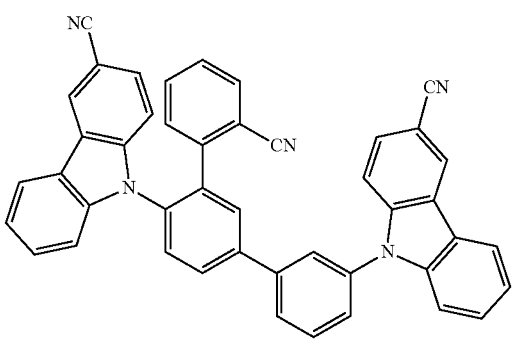
251
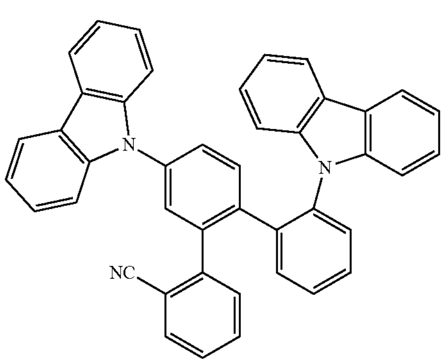
252
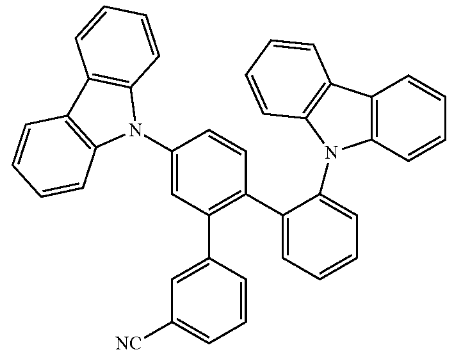
253
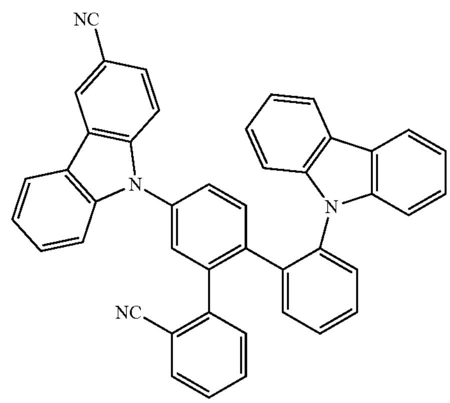
254
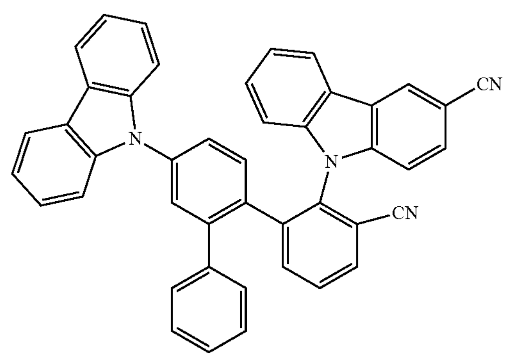
255
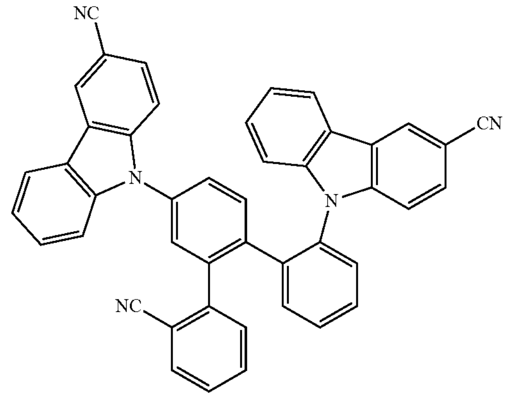

-continued
256
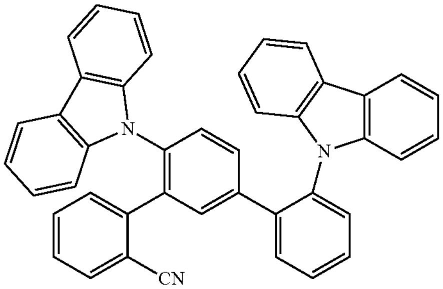
257
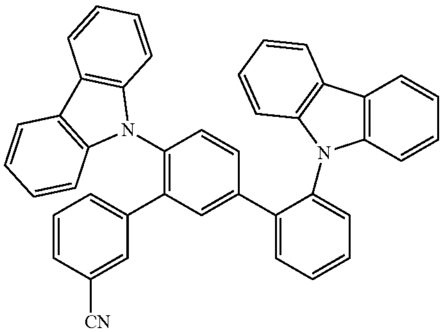
258
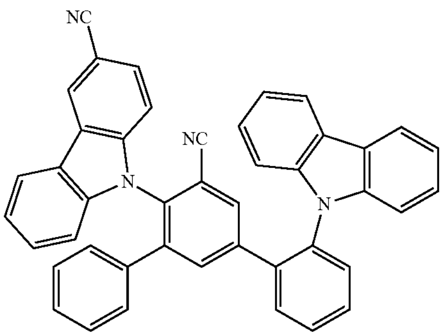
259
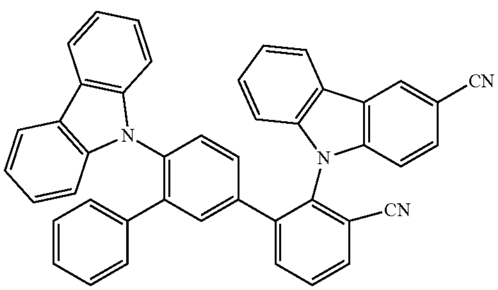
260
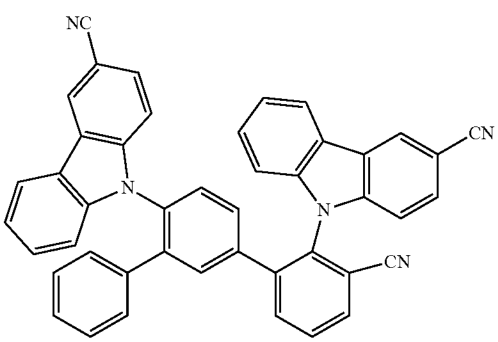
In one embodiment, the hole transport host may be one of Compounds H-H1 to H-H103, but embodiments of the present disclosure are not limited thereto:
H-H1
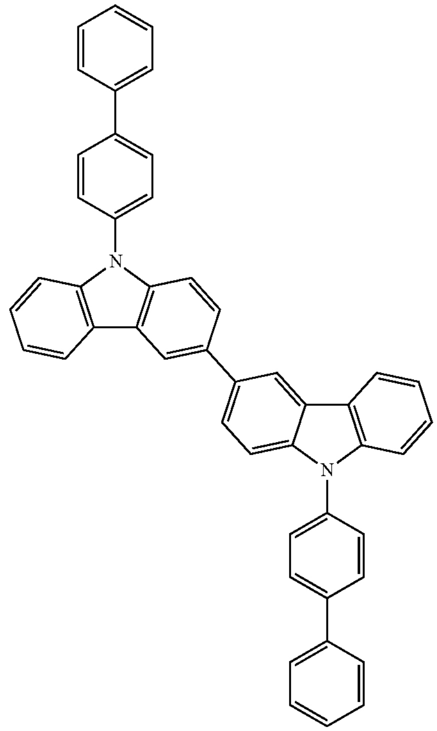
H-H2
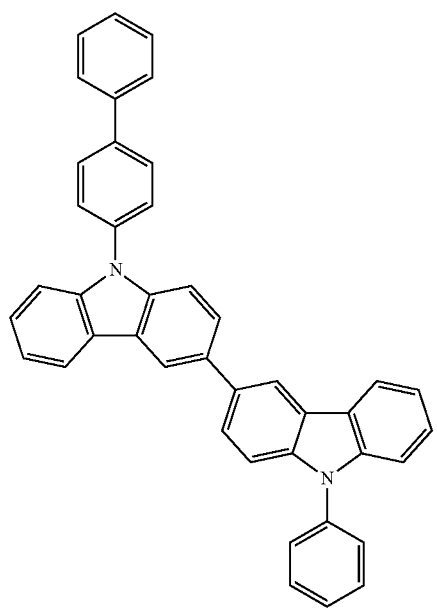

-continued
H-H3
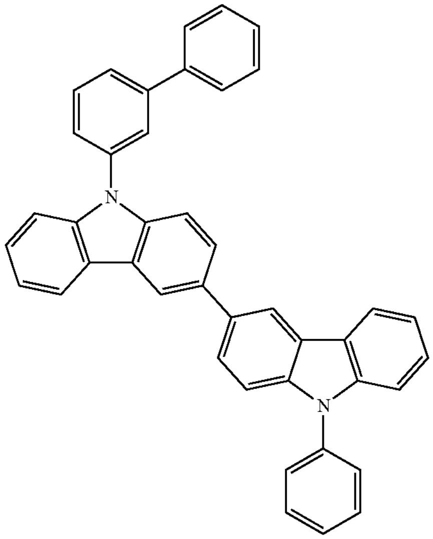
H-H4
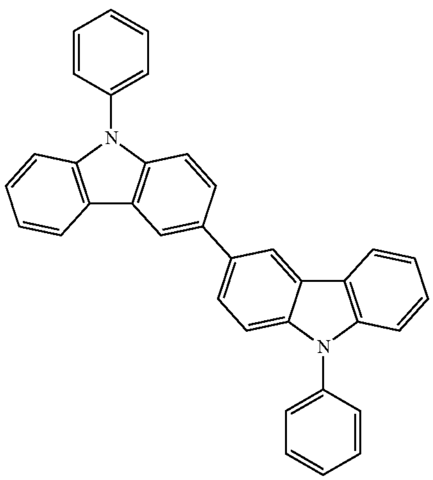
H-H5
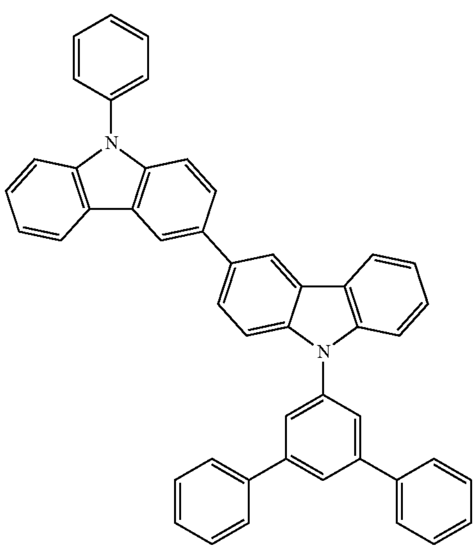
-continued
H-H6
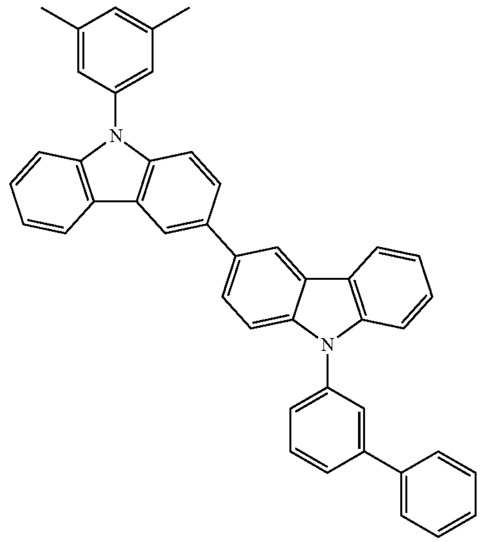
H-H7
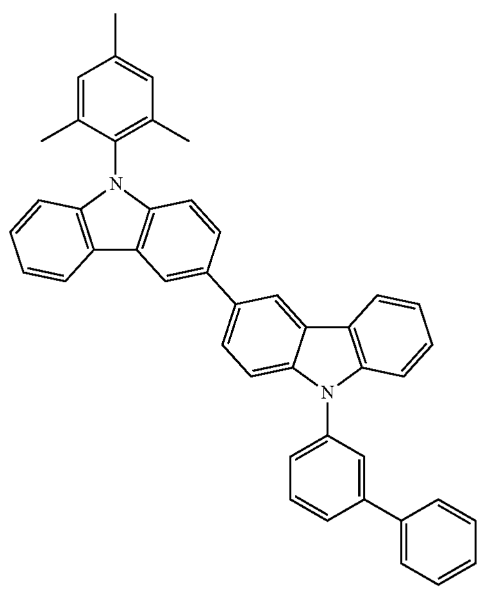

-continued
H-H8
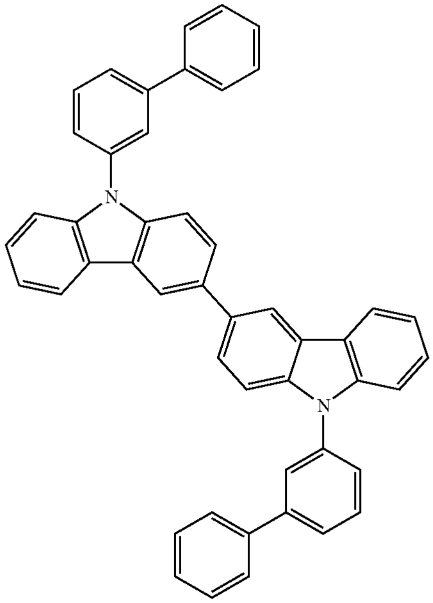
H-H9
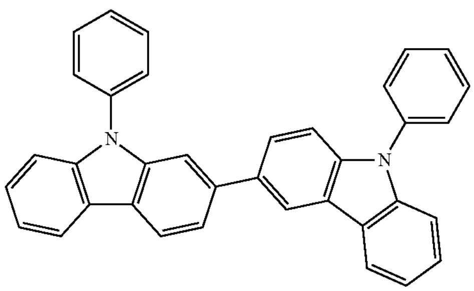
H-H10
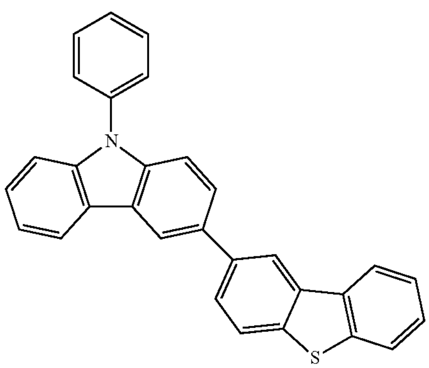
H-H11
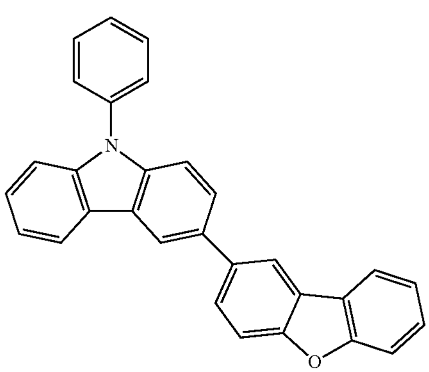
-continued
H-H12
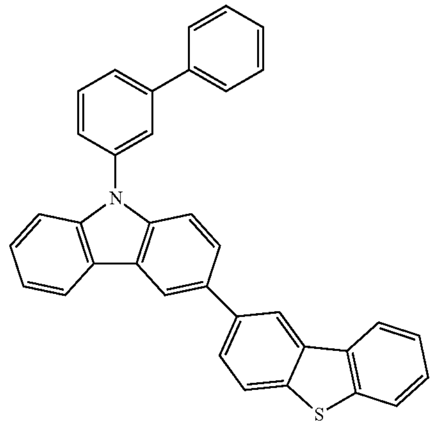
H-H13
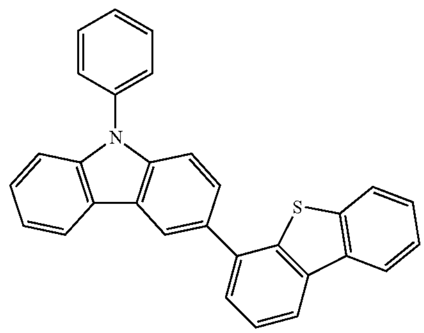
H-H14
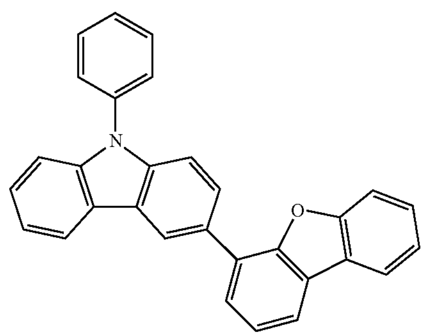
H-H15
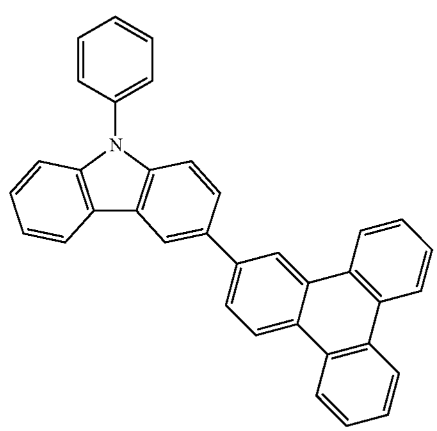

-continued
H-H16
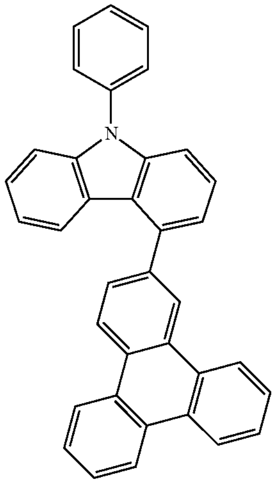
H-H17
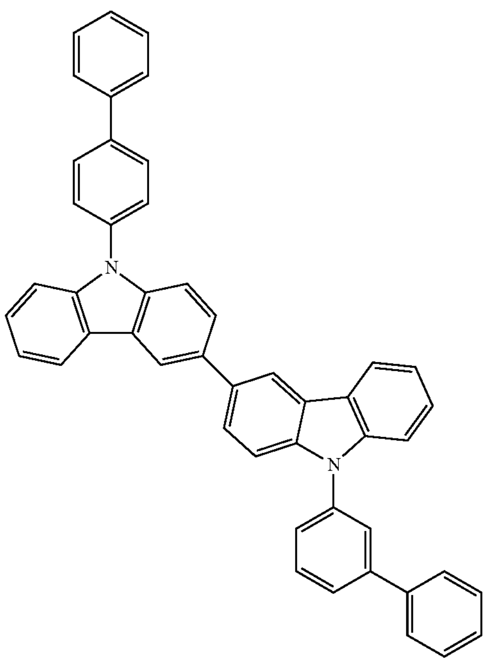
H-H18
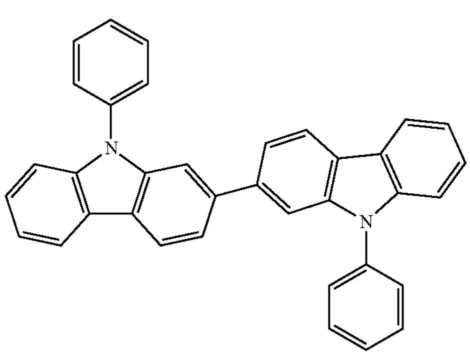
-continued
H-H19
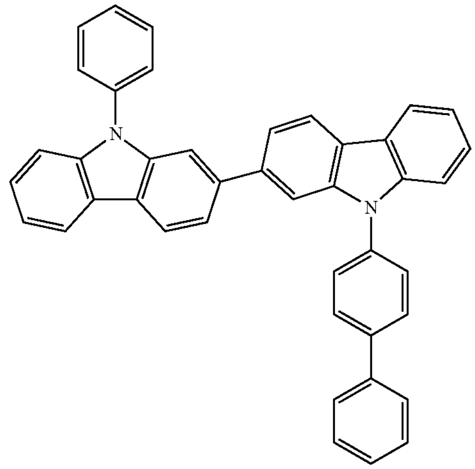
H-H20
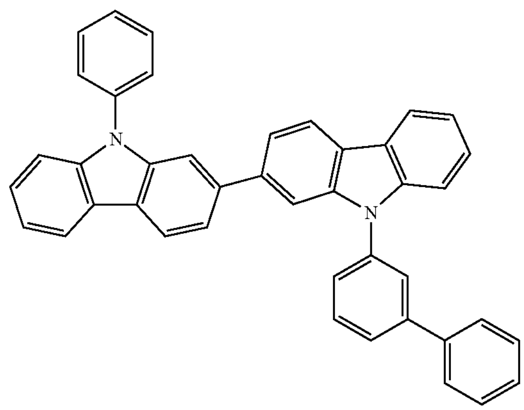
H-H21
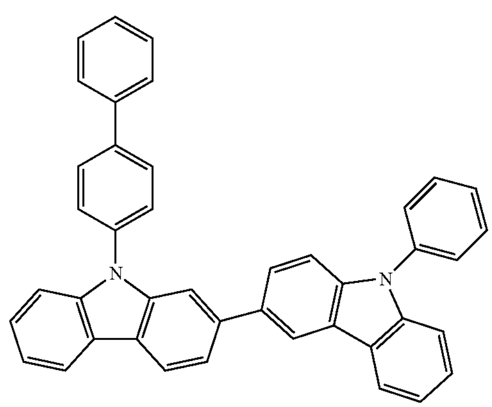

-continued
H-H22
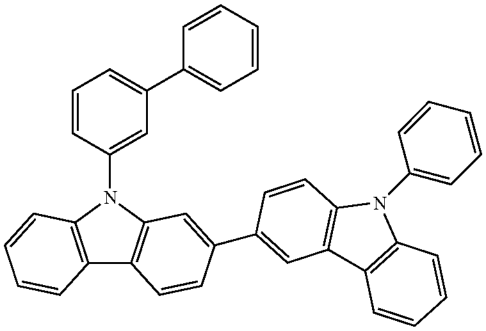
H-H23
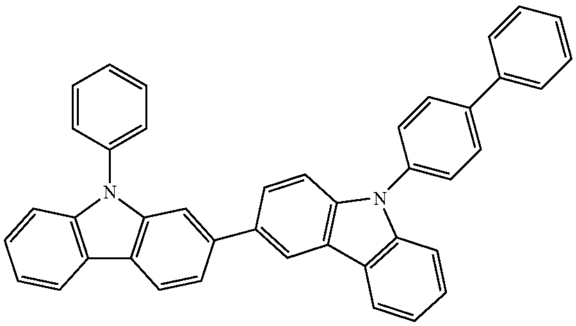
H-H24
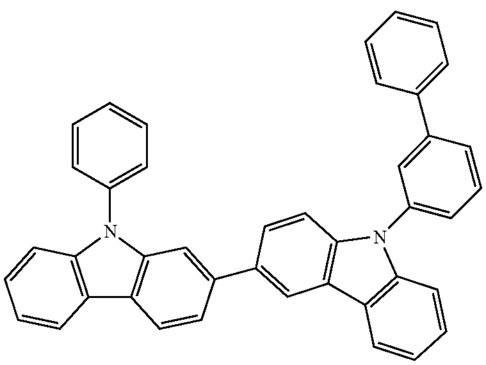
H-H25
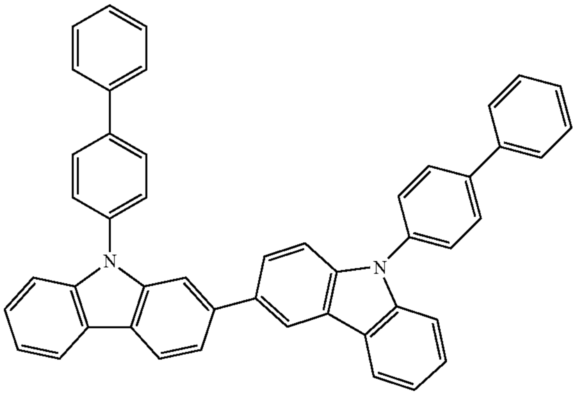
-continued
H-H26
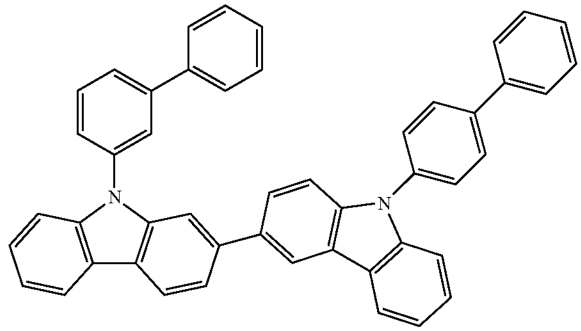
H-H27
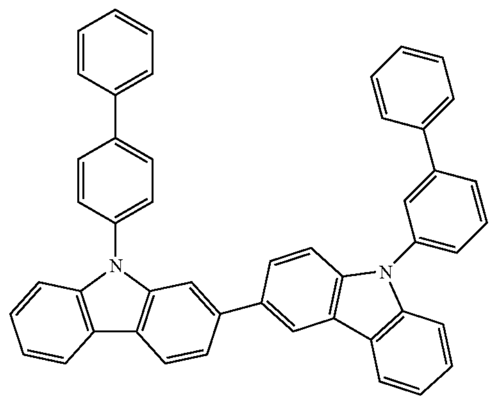
H-H28
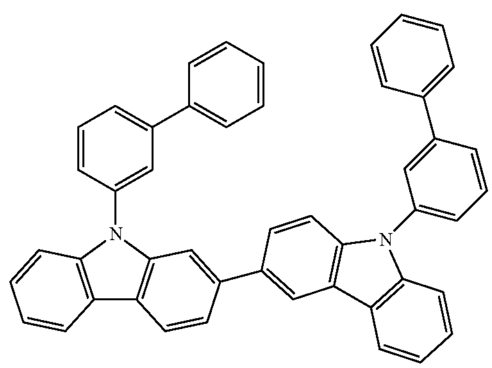

H-H29
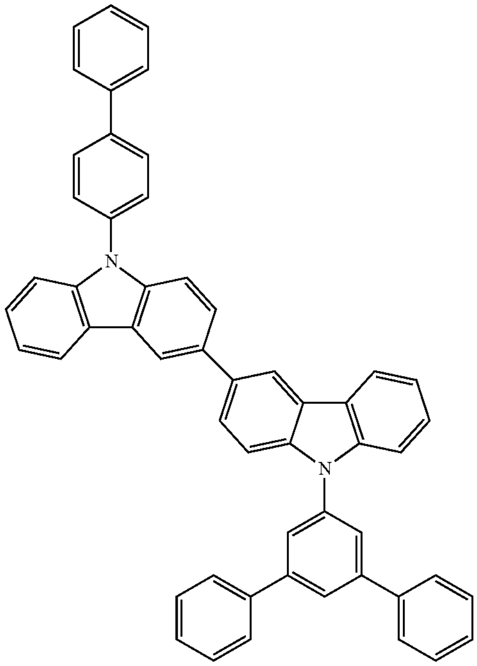
H-H30
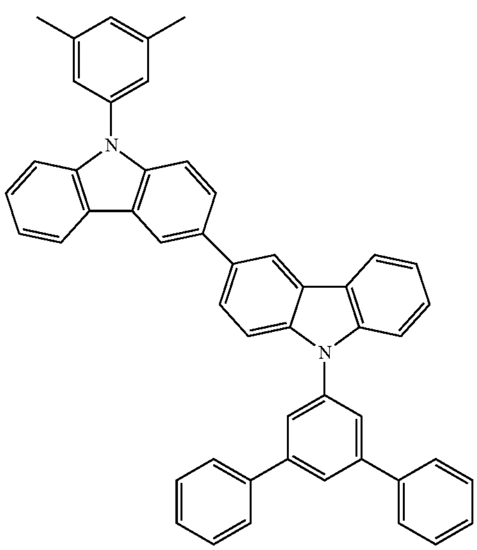
H-H31
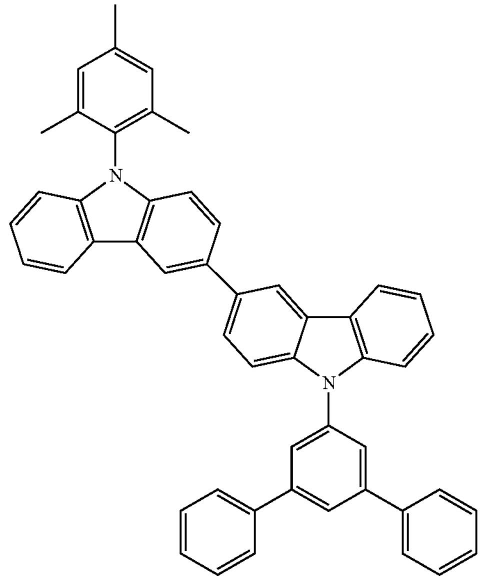
H-H32
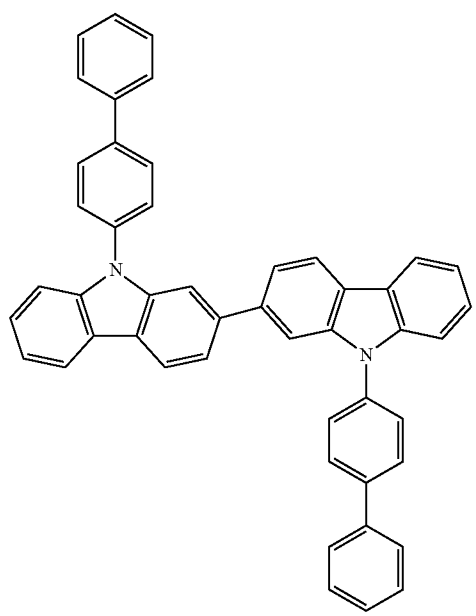

-continued
H-H33
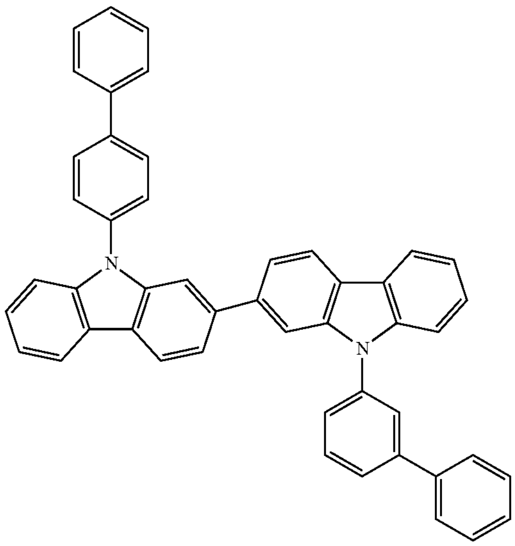
H-H34
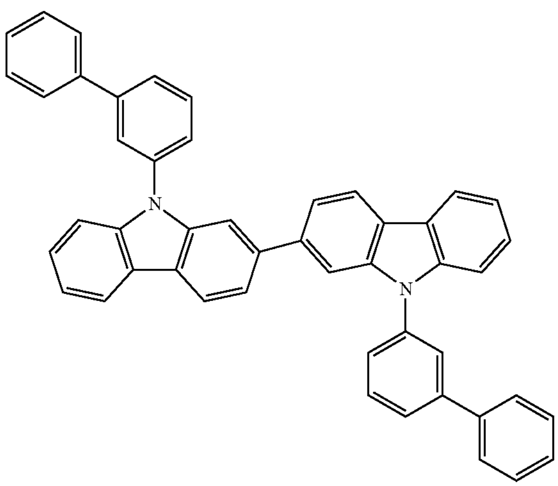
H-H35
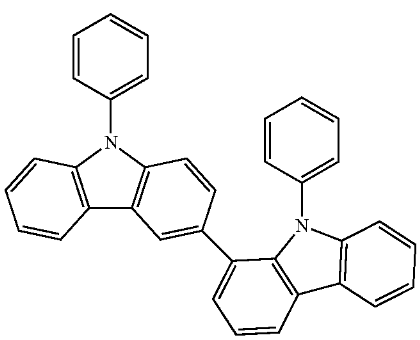
-continued
H-H36
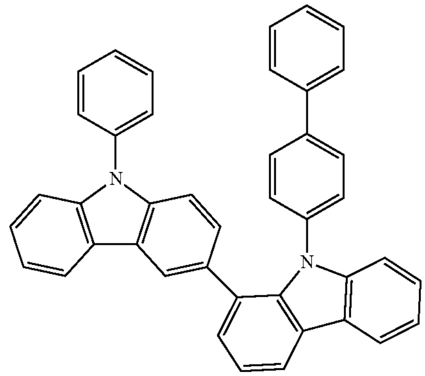
H-H37
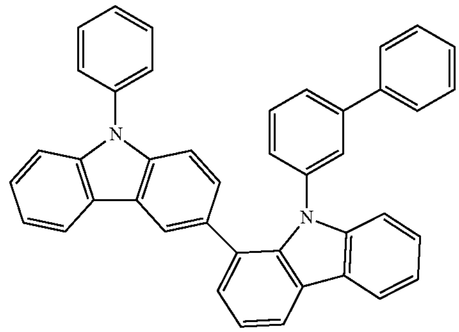
H-H38
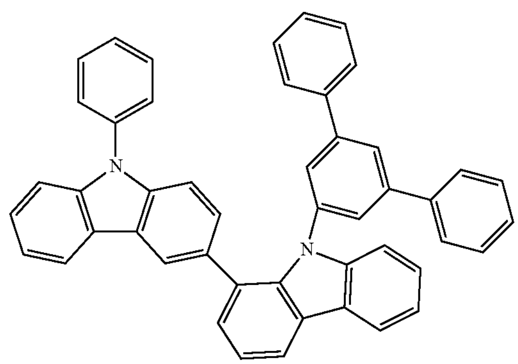
H-H39
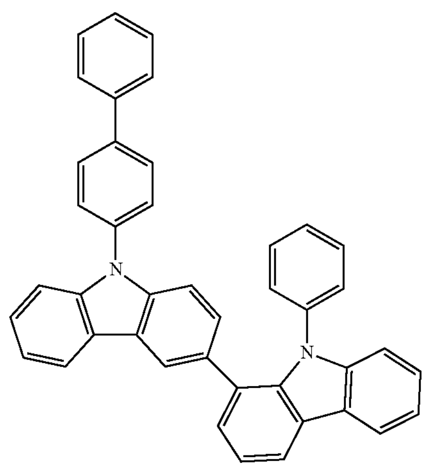

-continued
H-H40
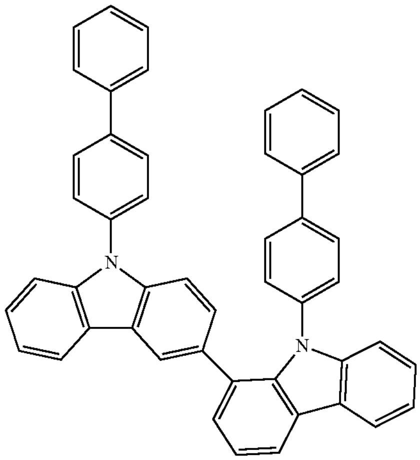
H-H41
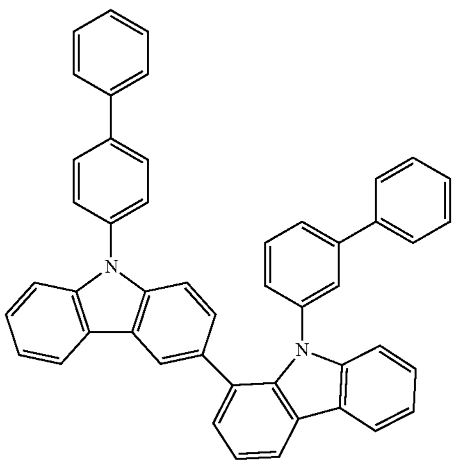
H-H42
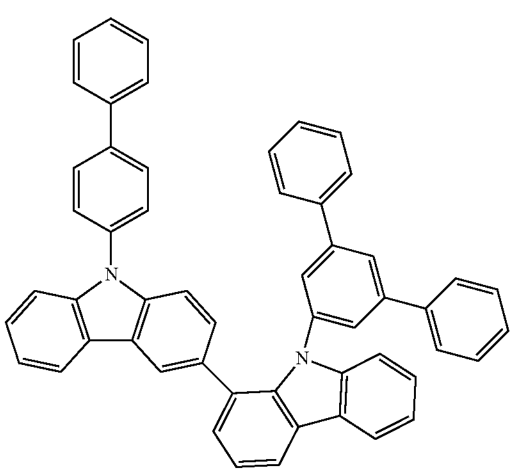
-continued
H-H43
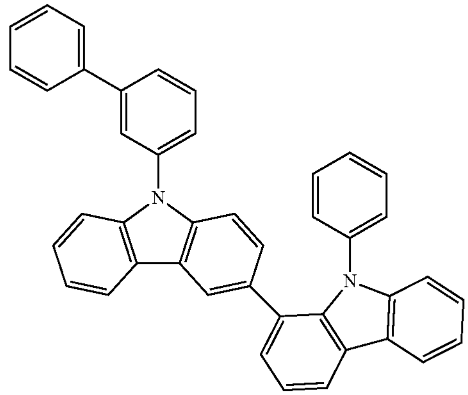
H-H44
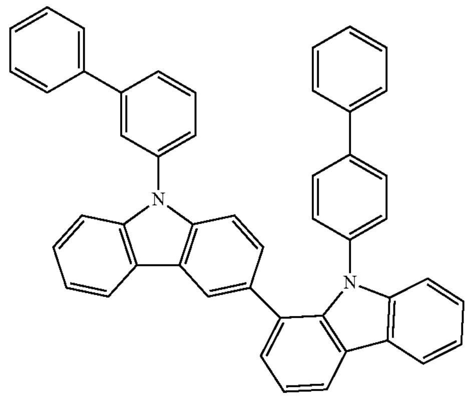
H-H45
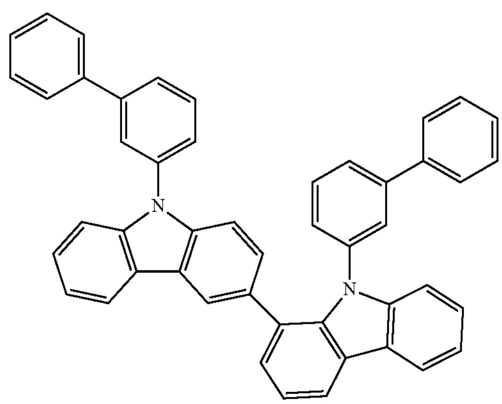
H-H46
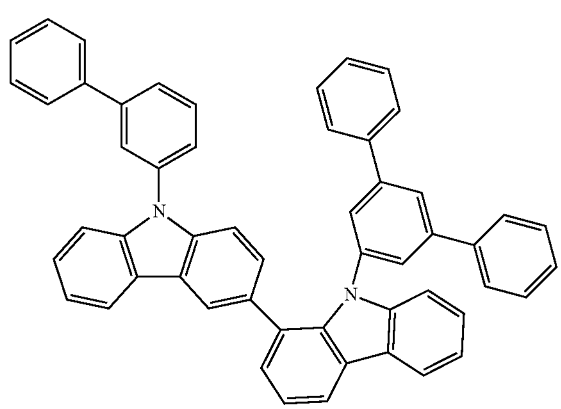

-continued
H-H47
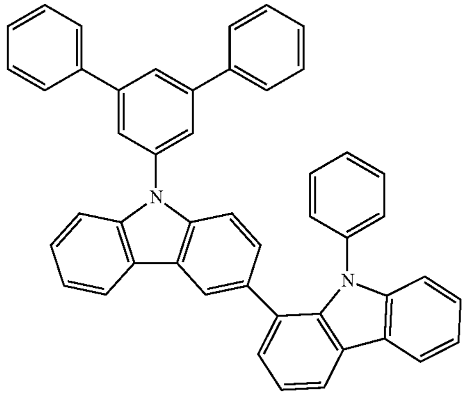
H-H48
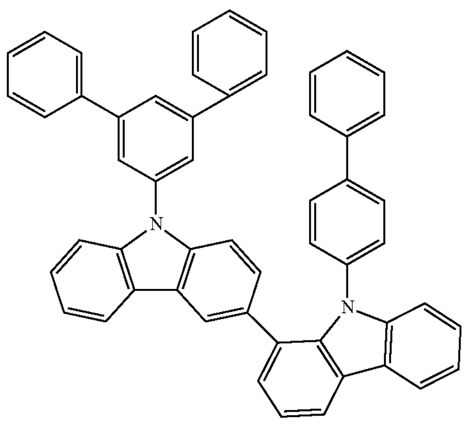
H-H49
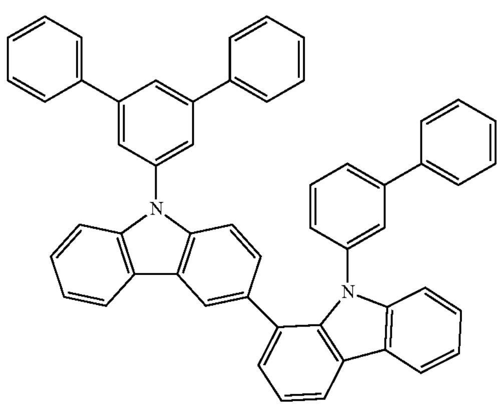
-continued
H-H50
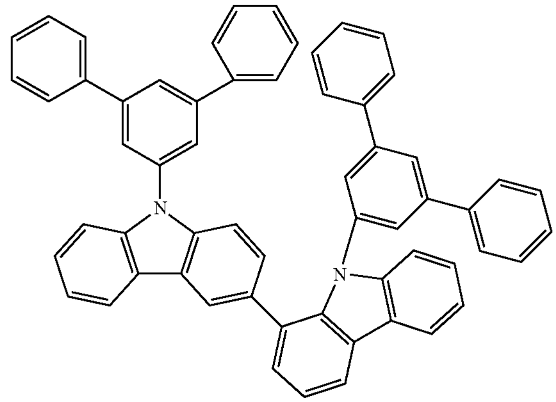
H-H51
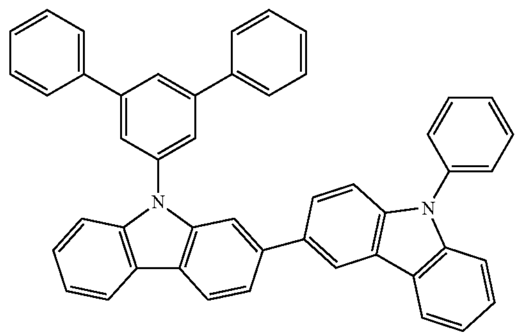
H-H52
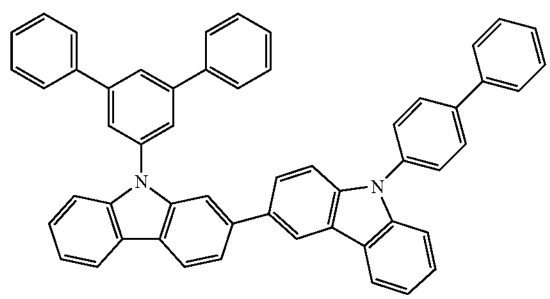
H-H53
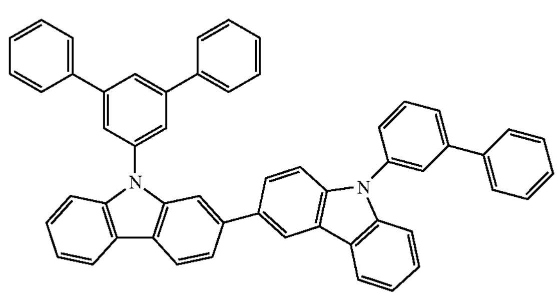

-continued
H-H54
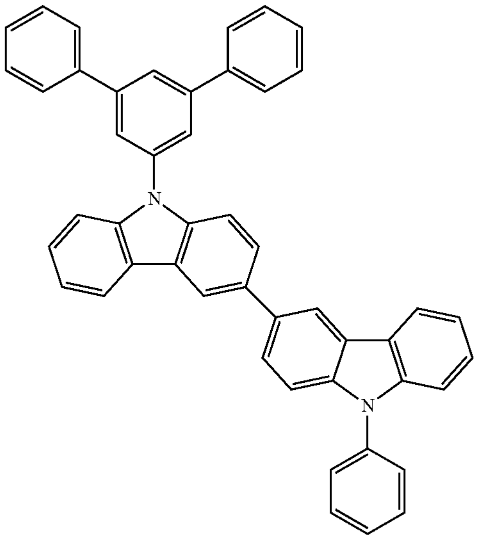
H-H55
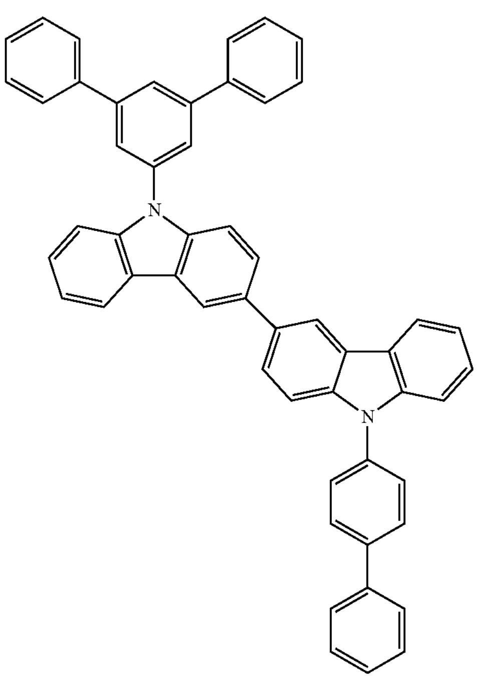
-continued
H-H56
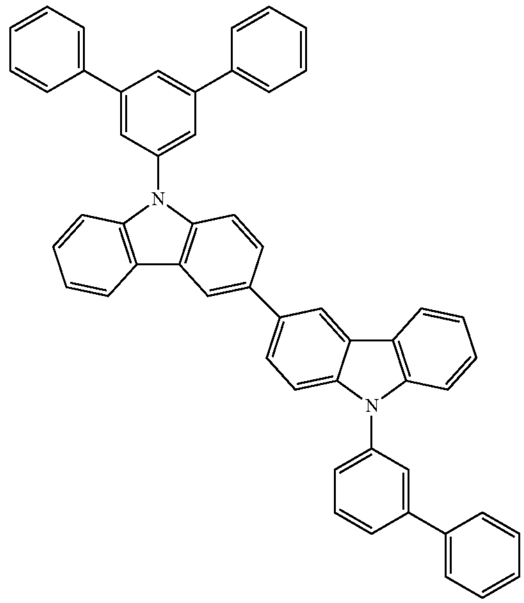
H-H57
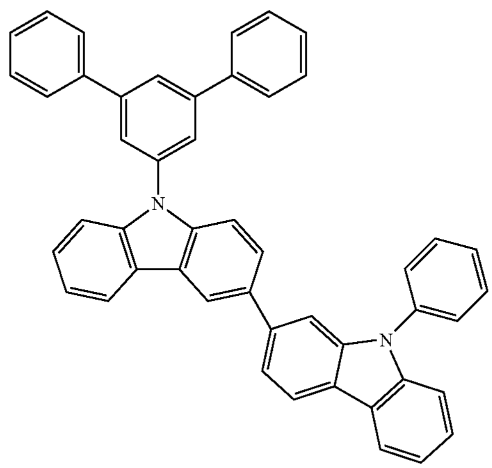
H-H58
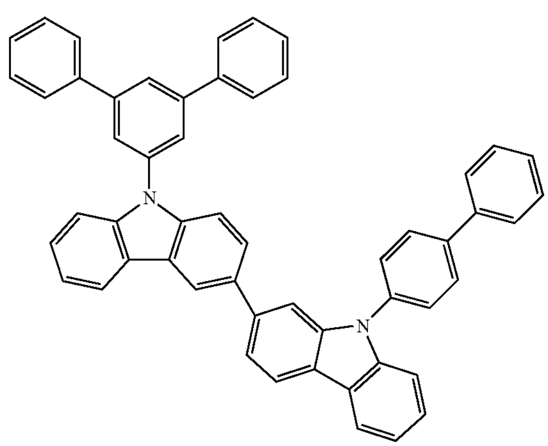

-continued
H-H59
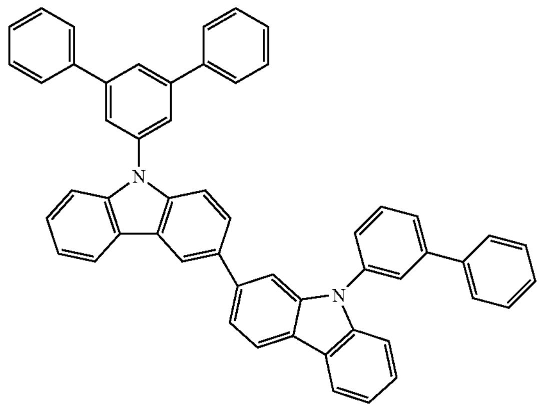
H-H60
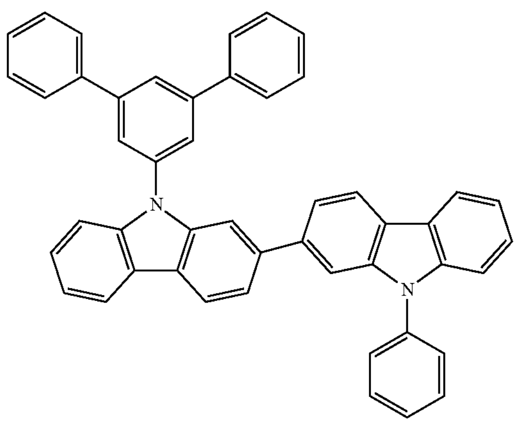
H-H61
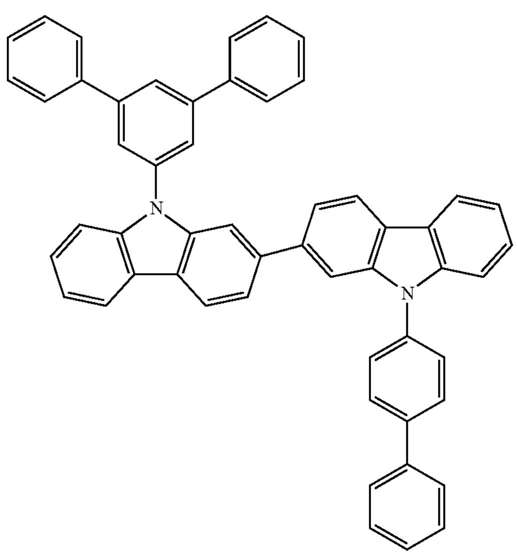
-continued
H-H62
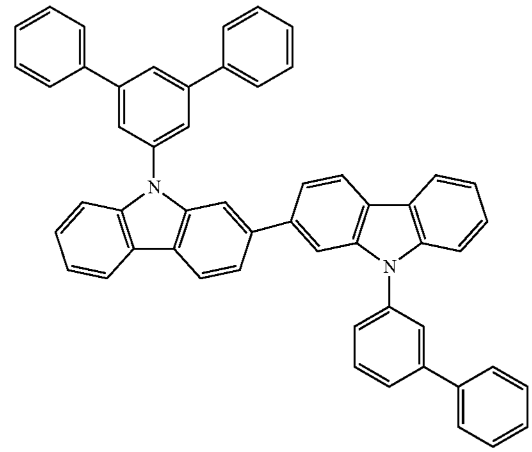
H-H63
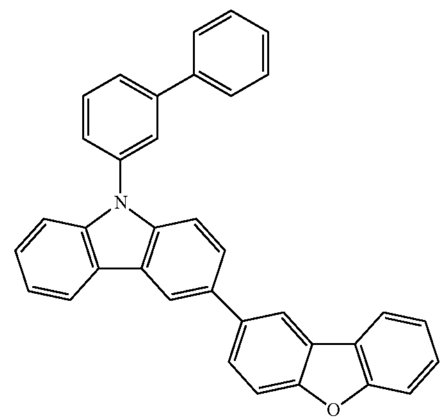
H-H64
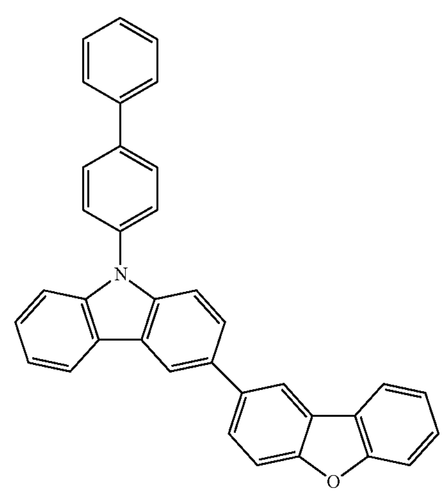

-continued
H-H65
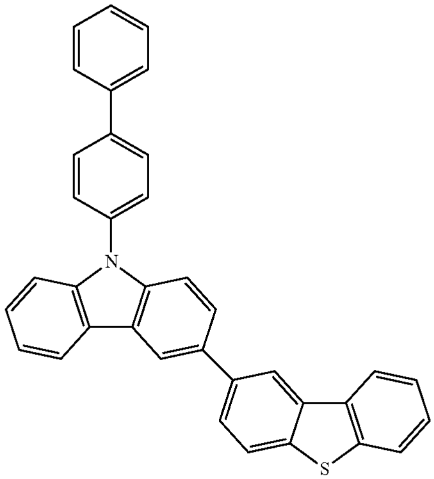
H-H66
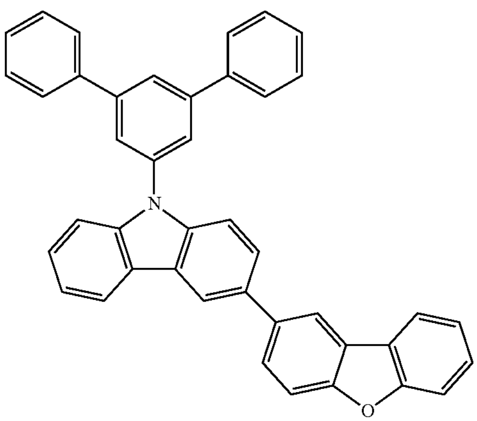
H-H67
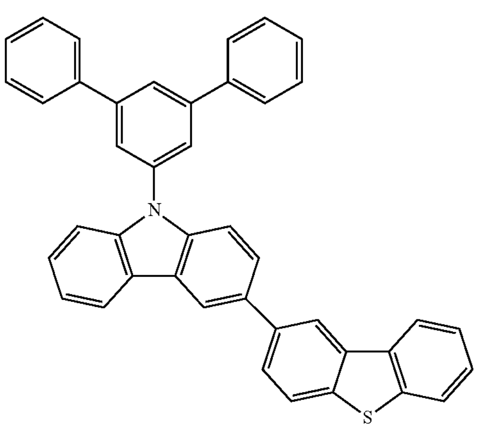
-continued
H-H68
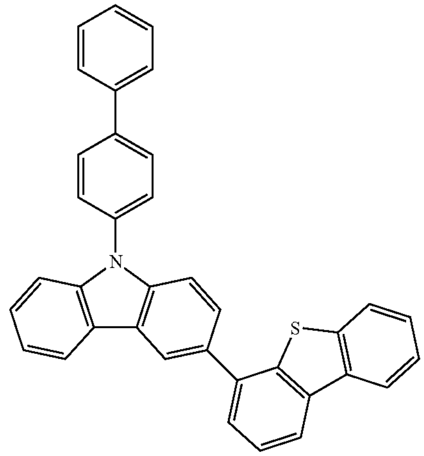
H-H69
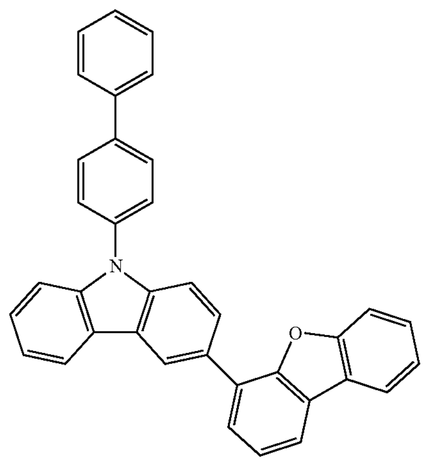
H-H70
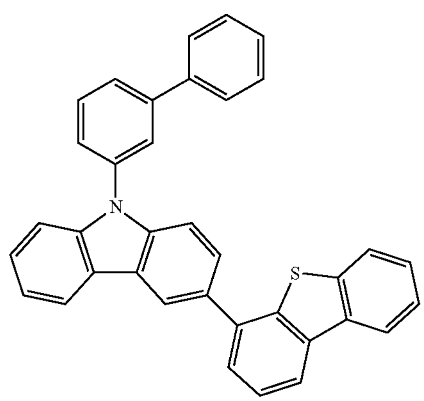

-continued
H-H71
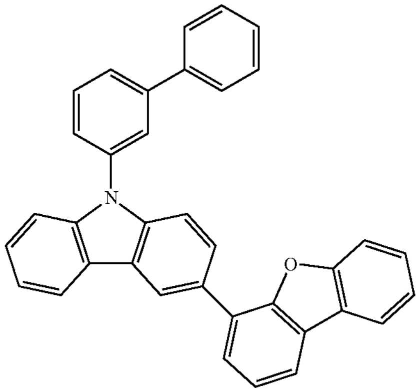
H-H72
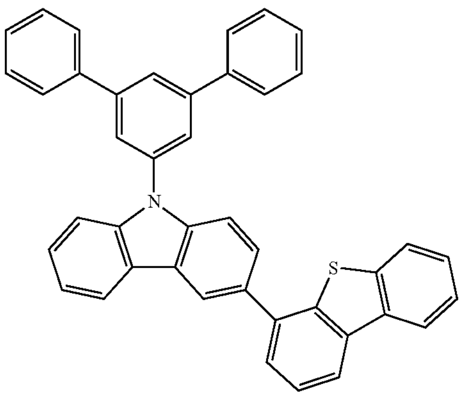
H-H73
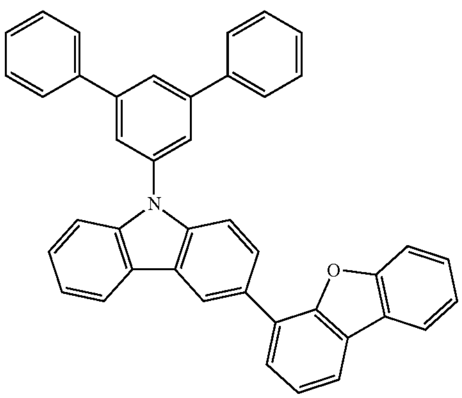
H-H74
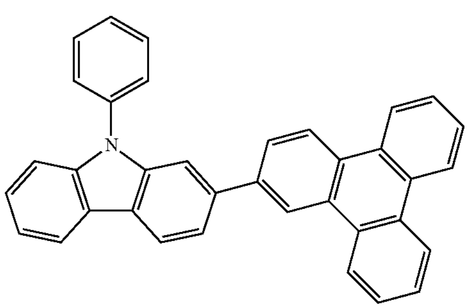
-continued
H-H75
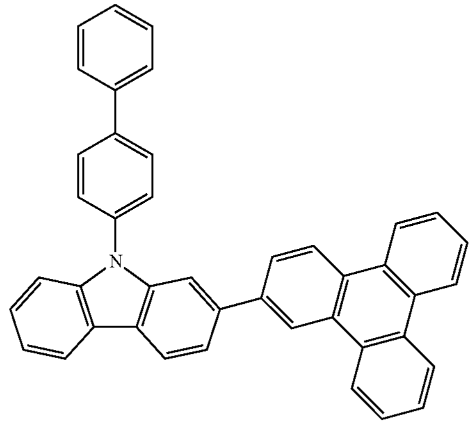
H-H76
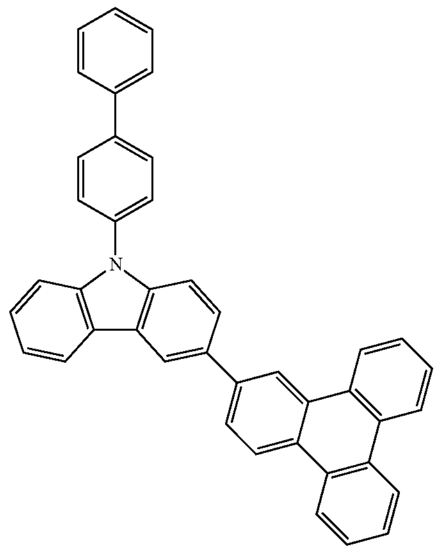
H-H77
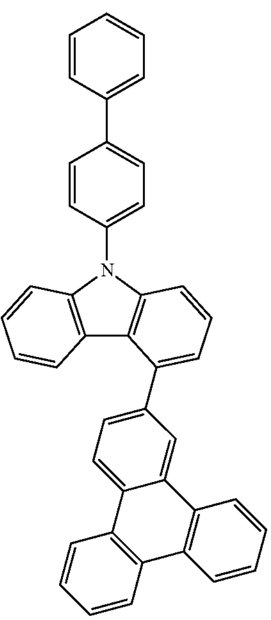

-continued
-continued
H-H78
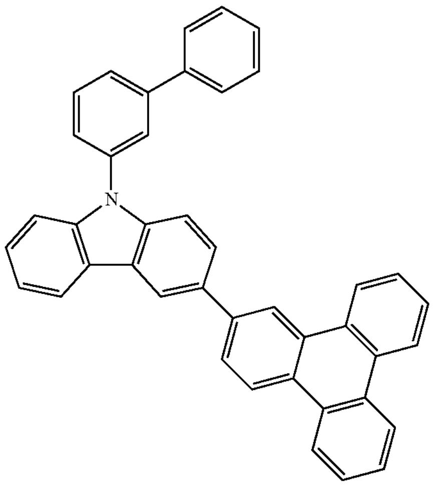
H-H81
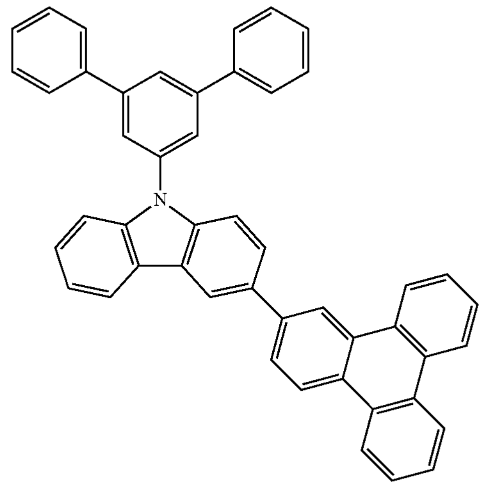
H-H79
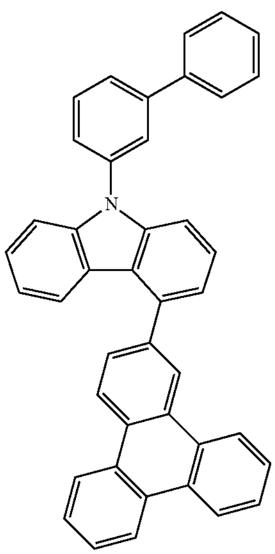
H-H82
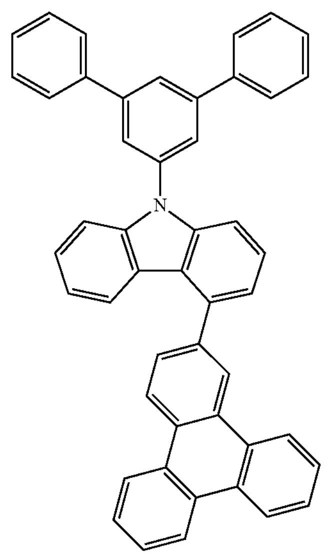
H-H80
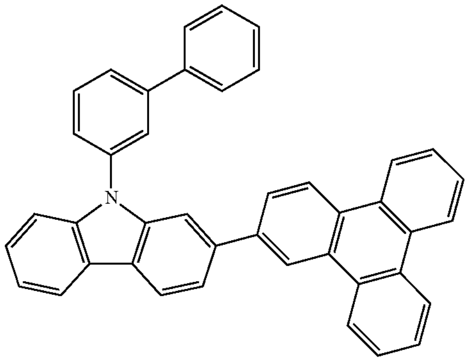
H-H83
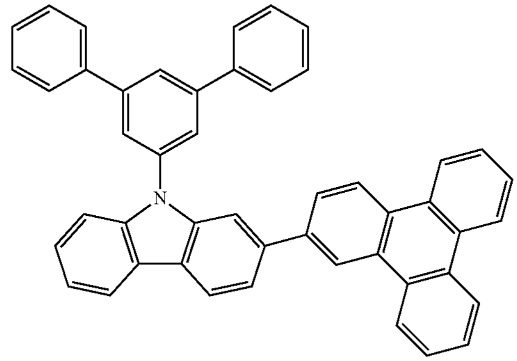

-continued
H-H84
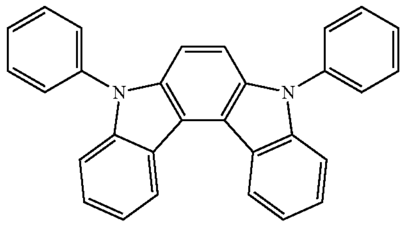
H-H85
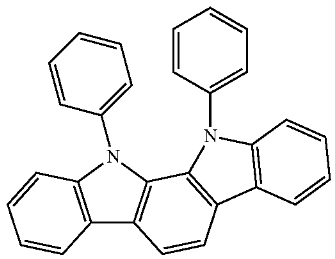
H-H86
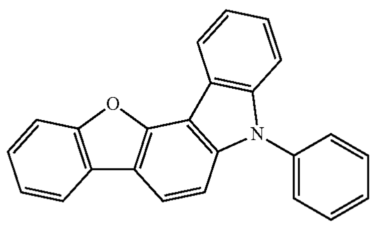
H-H87
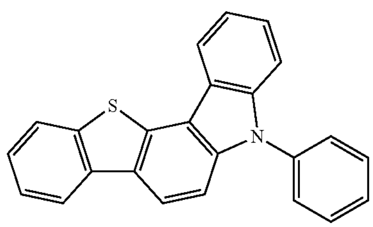
H-H88
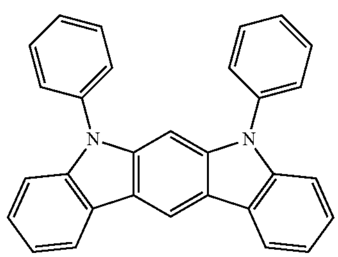
H-H89
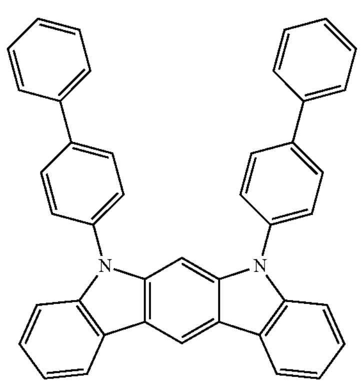
-continued
H-H90
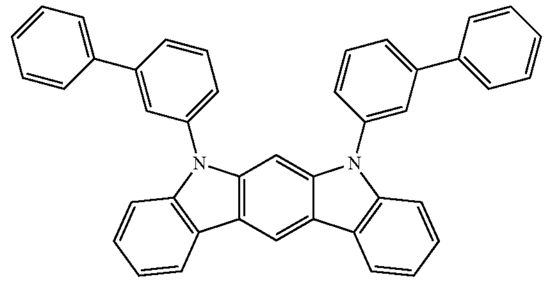
H-H91
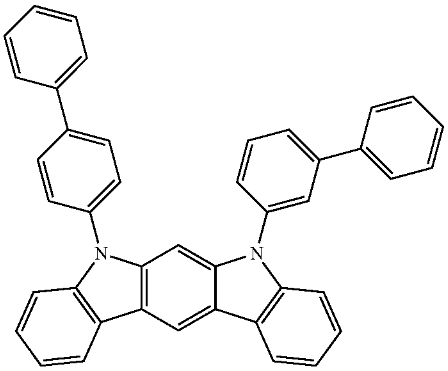
H-H92
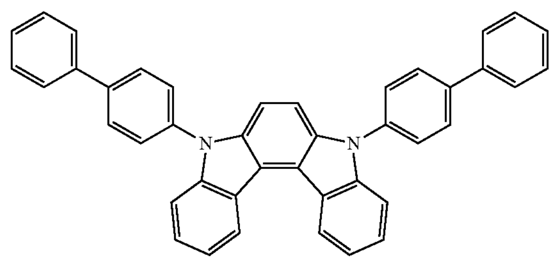
H-H93
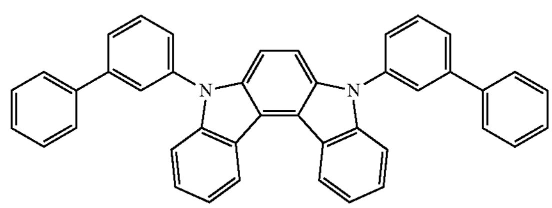
H-H94
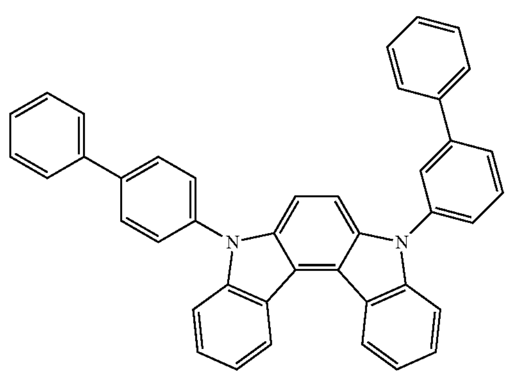

H-H95
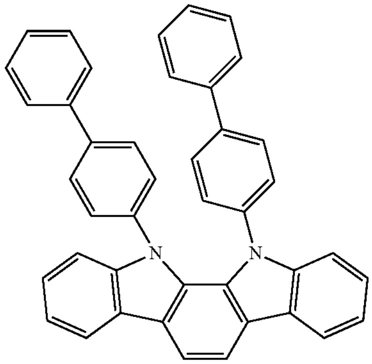
H-H96
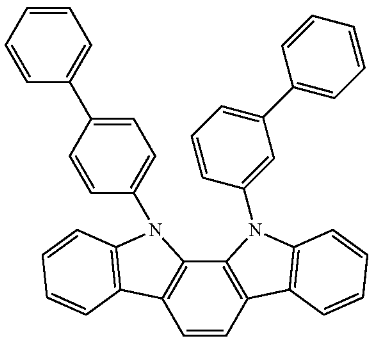
H-H97
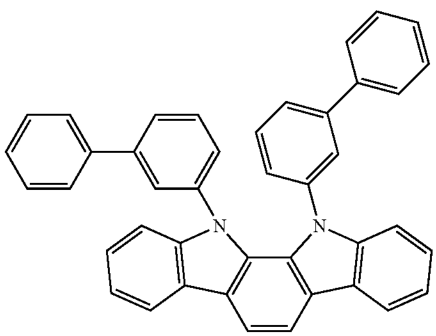
H-H98
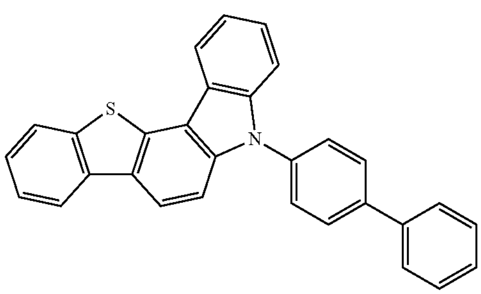
H-H99
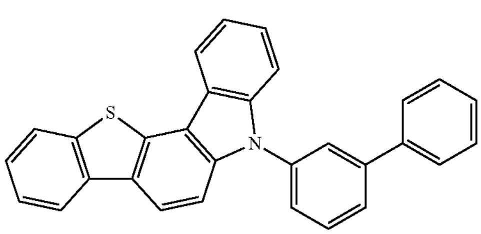
H-H100
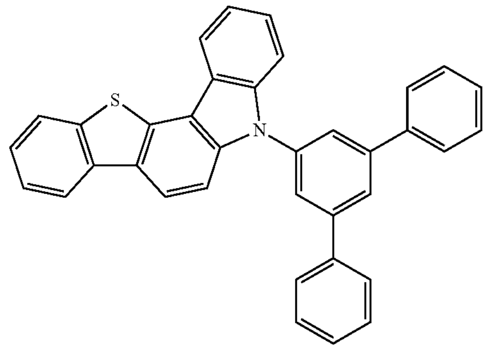
H-H101
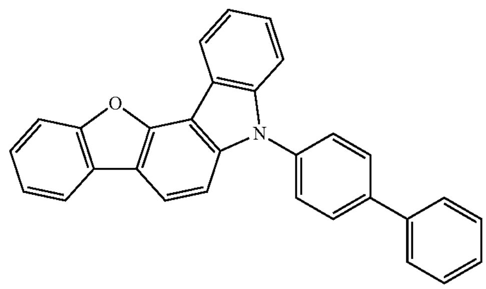
H-H102
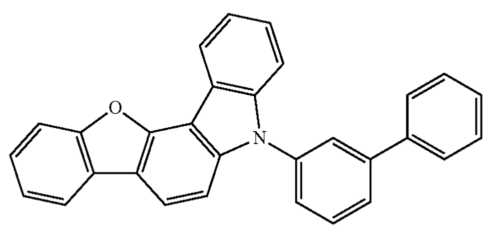
H-H103
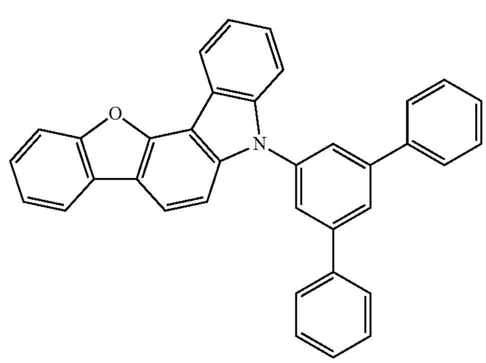

In one embodiment, the amphiprotic host may be one of Group HEH1, but embodiments of the present disclosure are not limited thereto:
Group HEH1
1
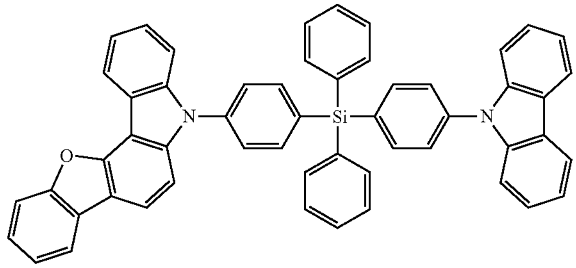
2
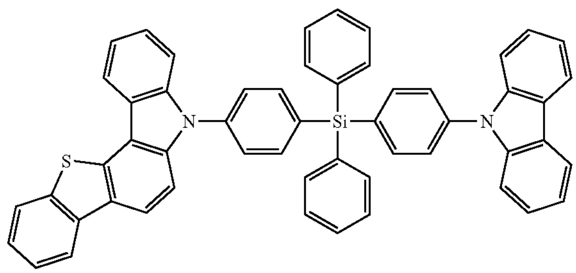
3
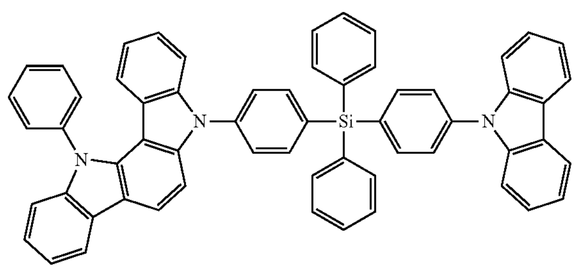
4
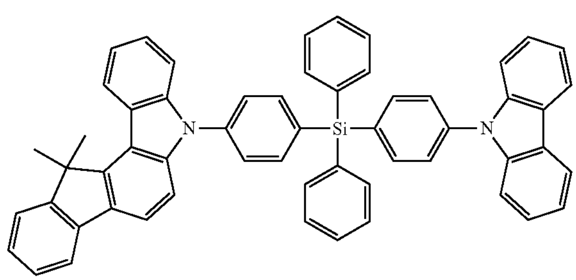
5
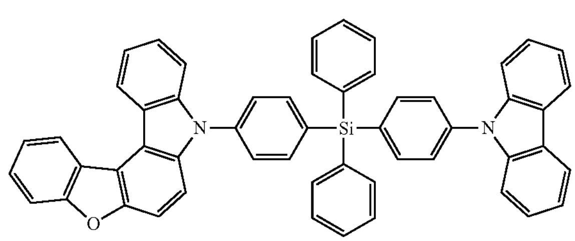
-continued
6
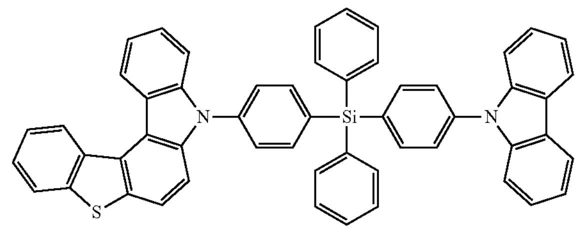
7
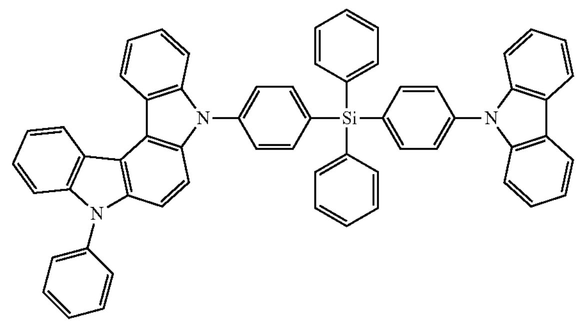
8
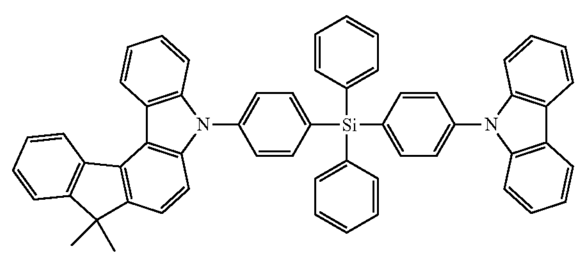
9
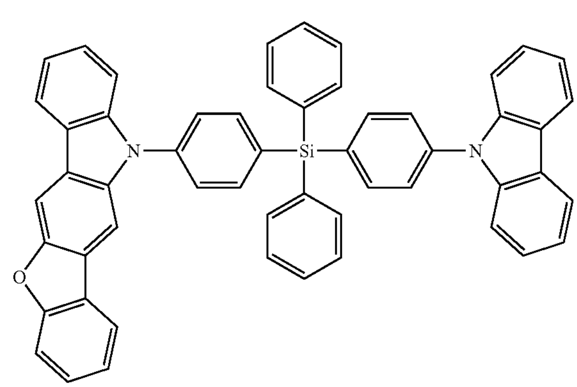

10
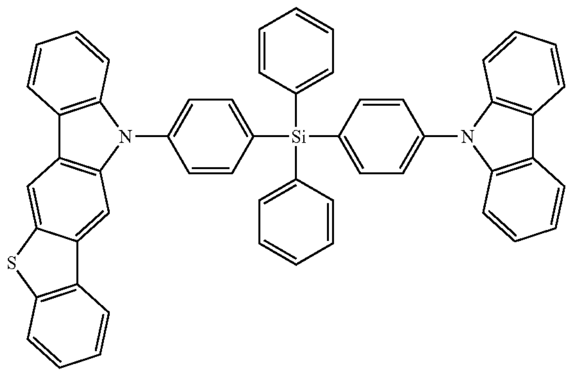
11
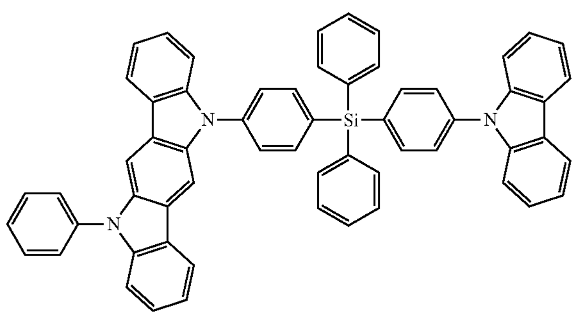
12
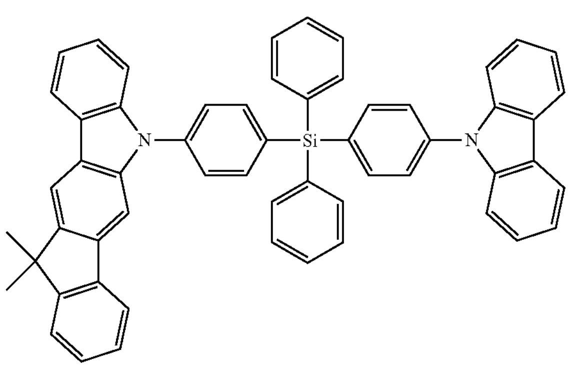
13
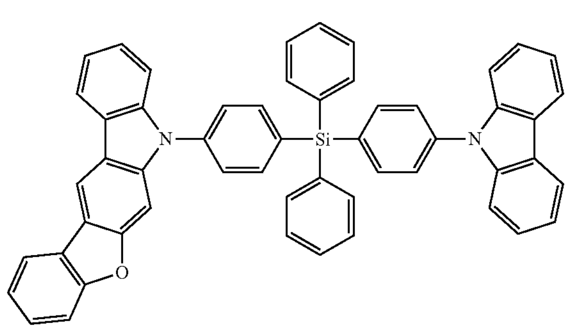
14
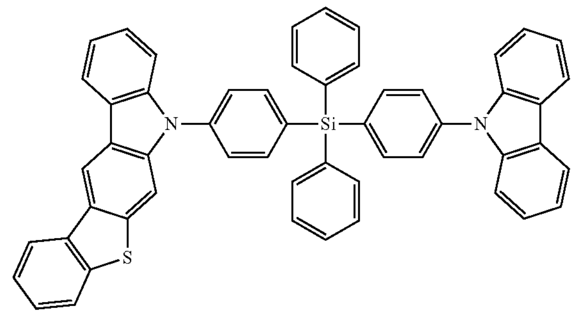
15
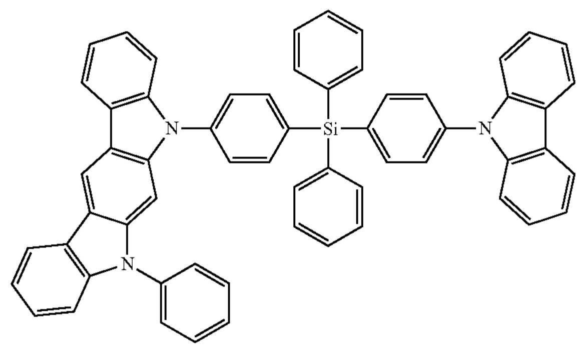
16
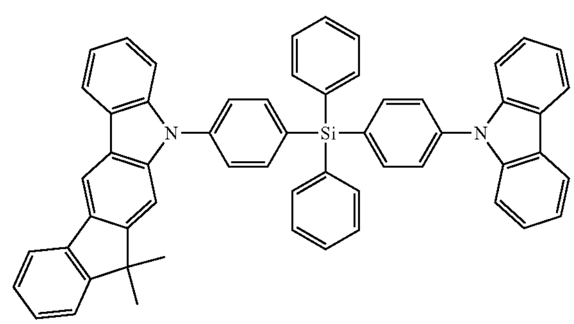
17
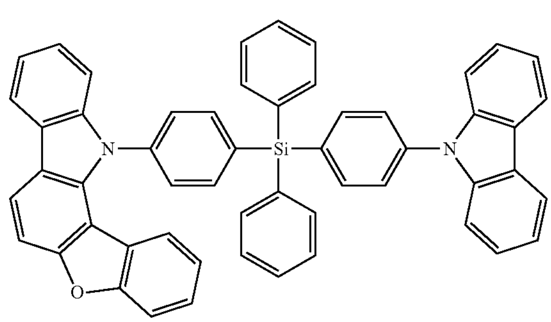

-continued
18
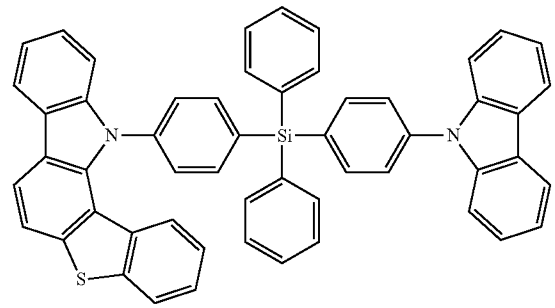
19
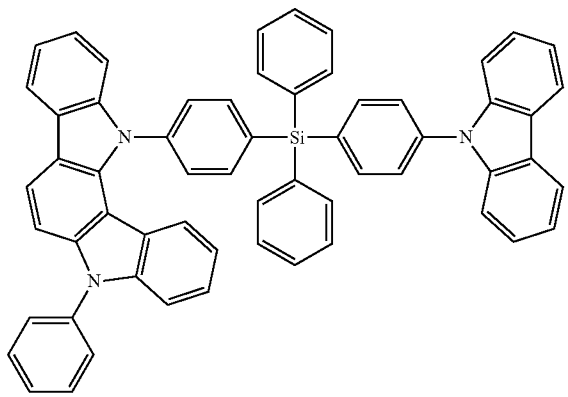
20
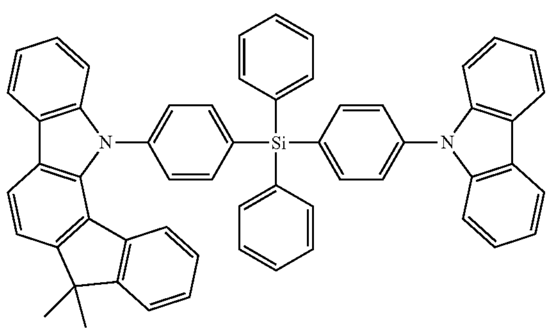
21
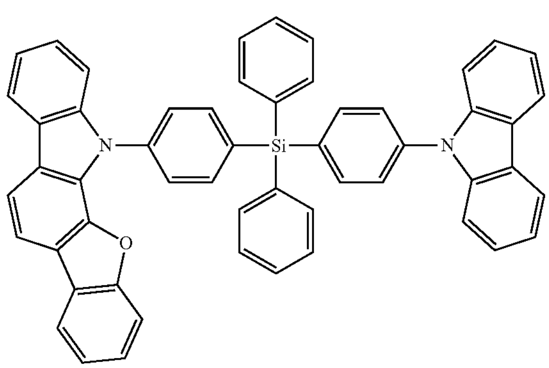
-continued
22
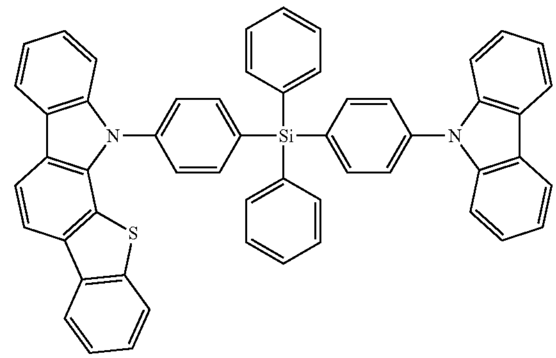
23
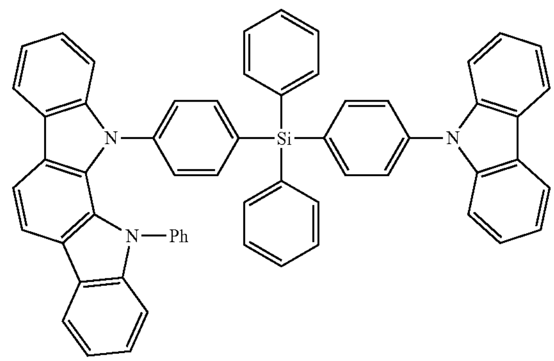
24
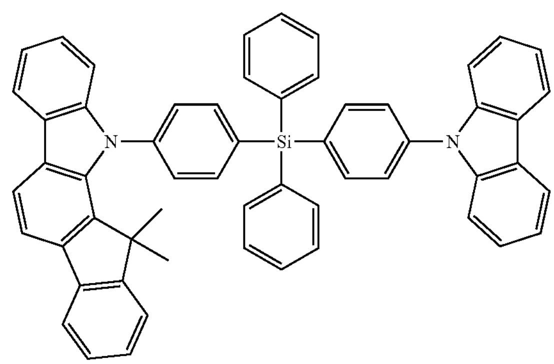
25
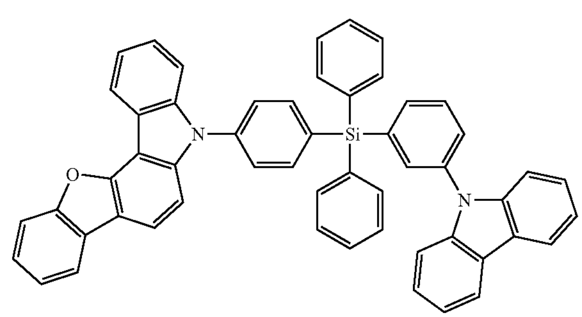

-continued
26
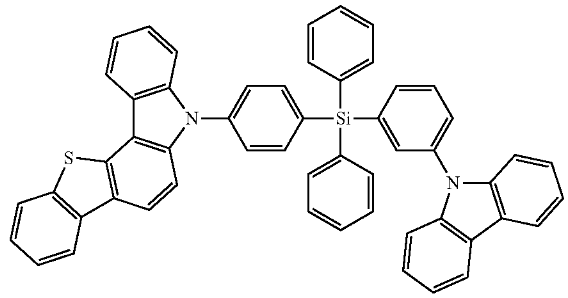
27
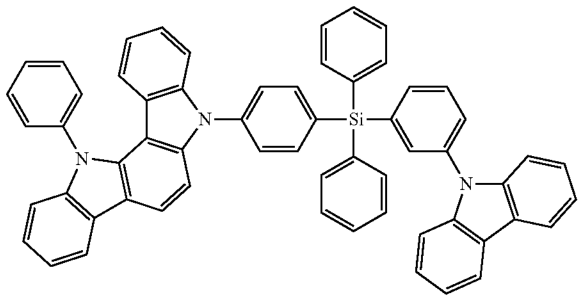
28
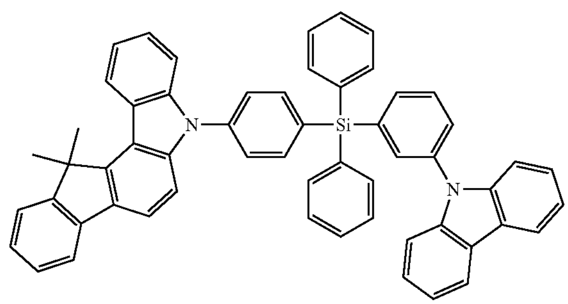
29
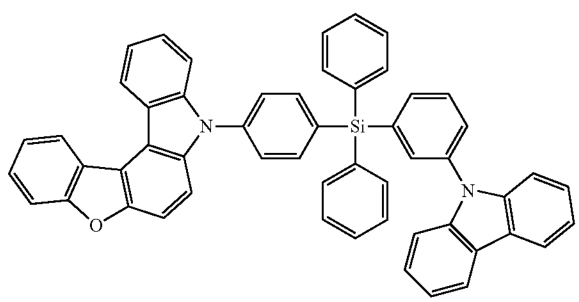
30
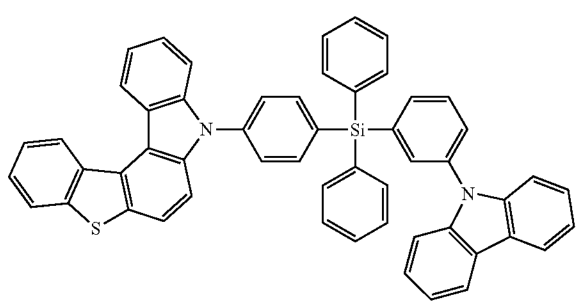
-continued
31
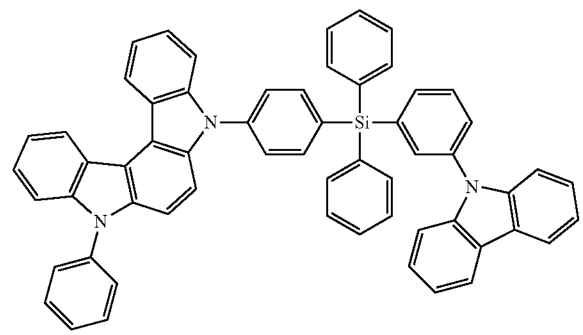
32
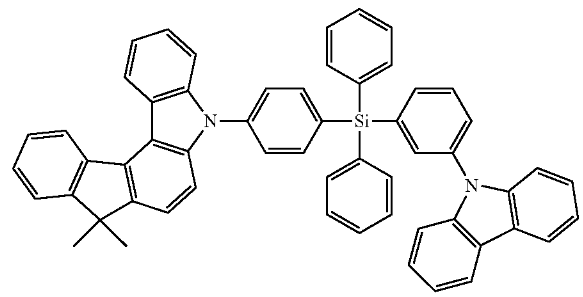
33
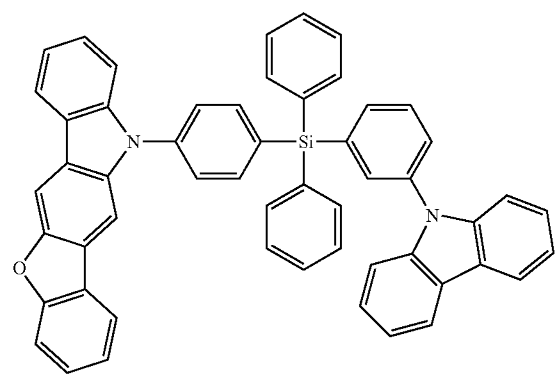
34
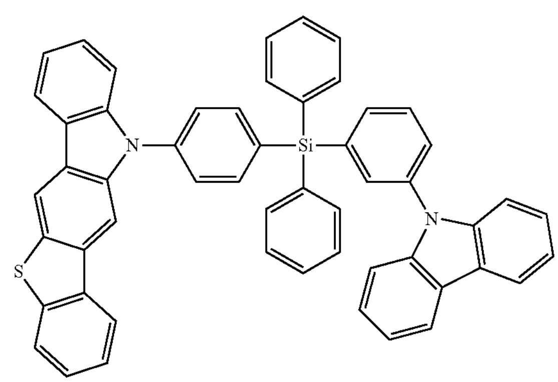

-continued
35
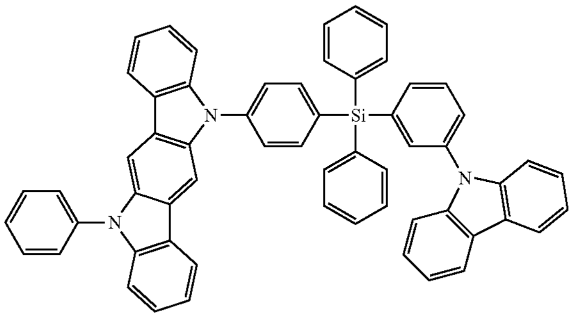
36
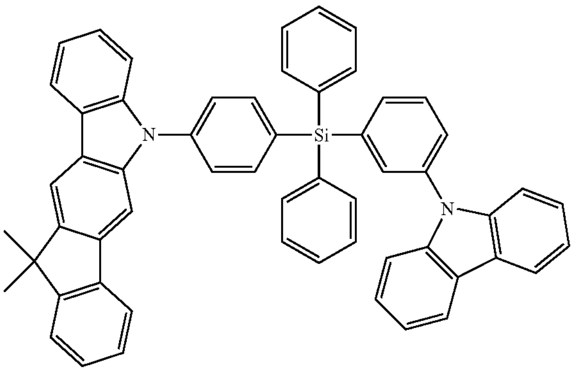
37
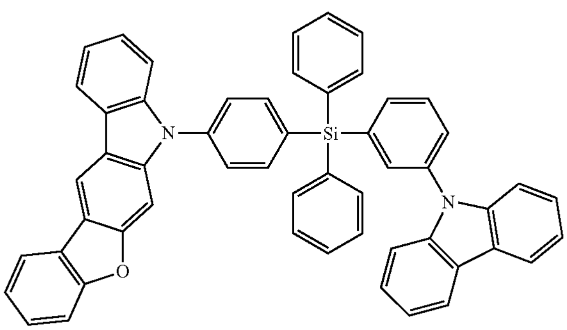
38
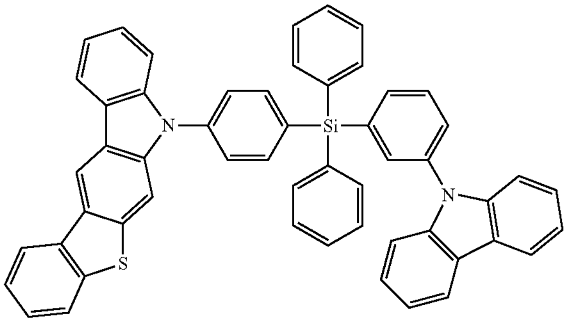
-continued
39
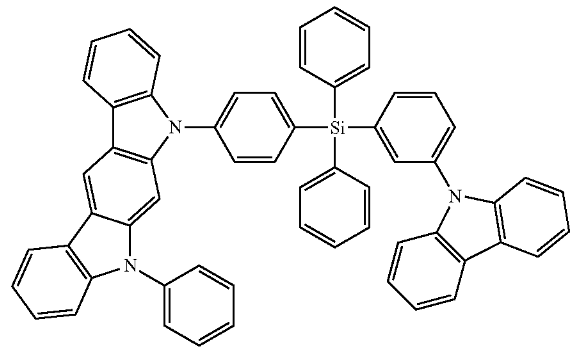
40
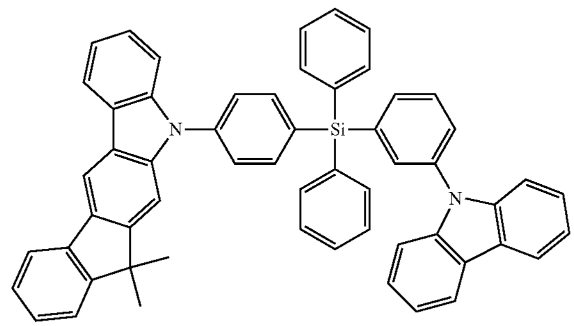
41
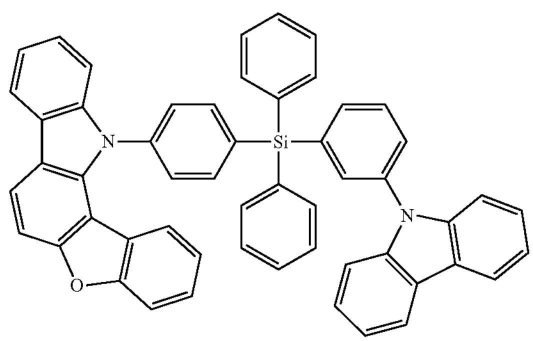
42
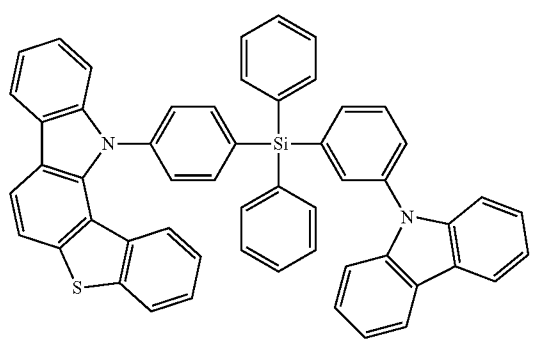

43
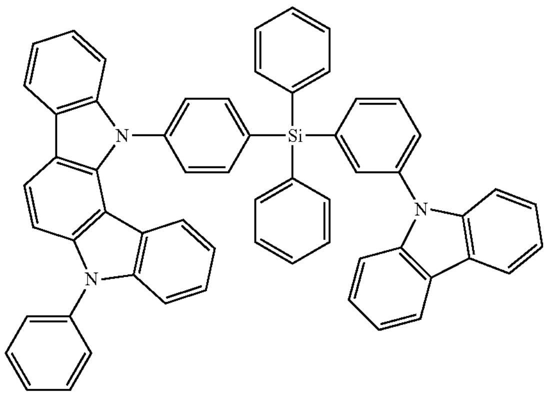
44
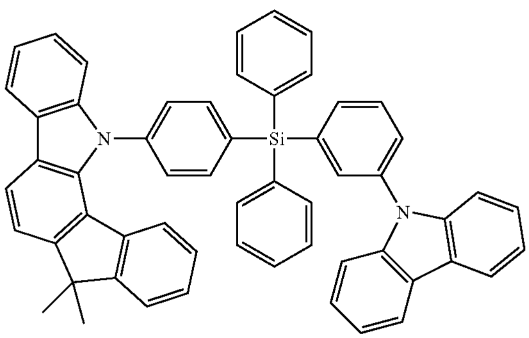
45
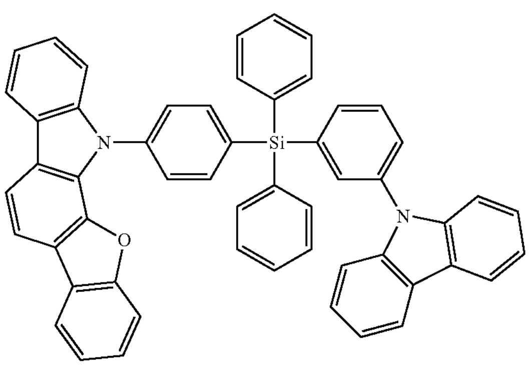
46
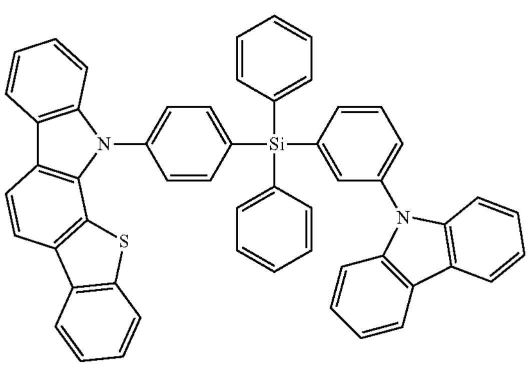
47
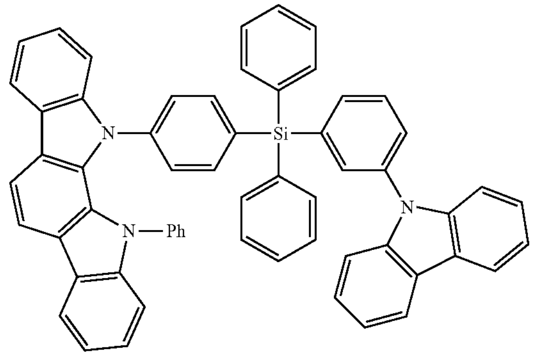
48
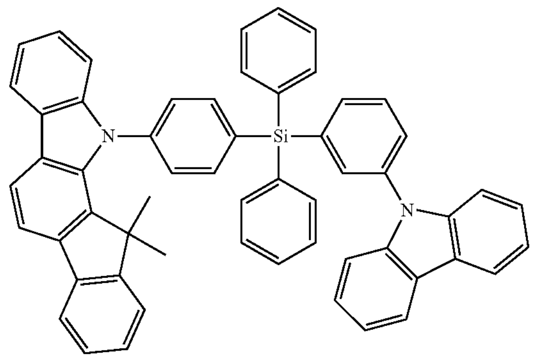
49
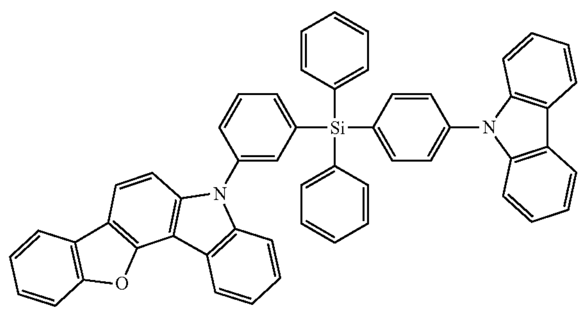
50
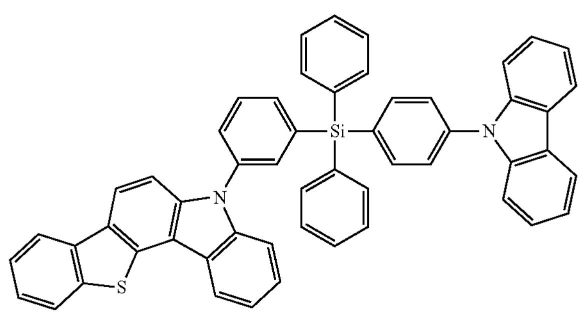

-continued
51
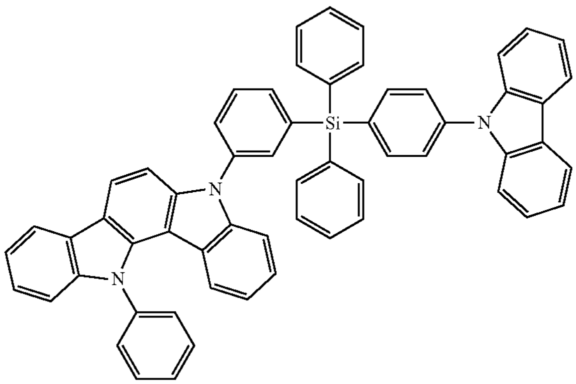
52
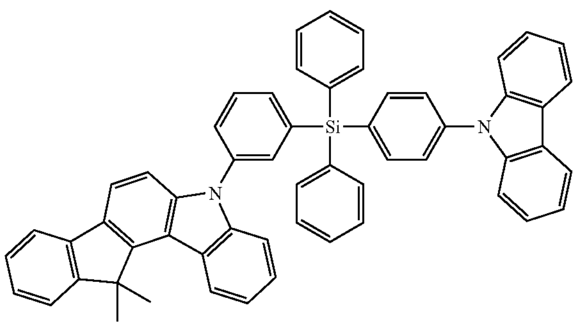
53
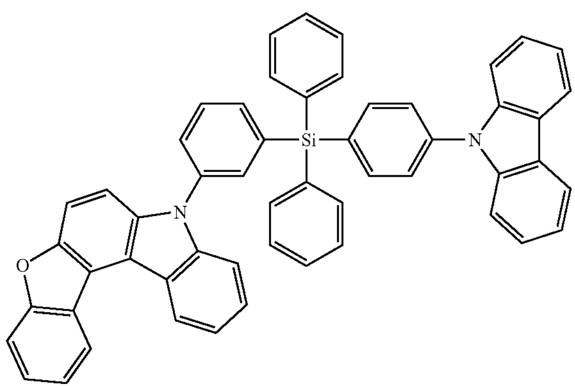
54
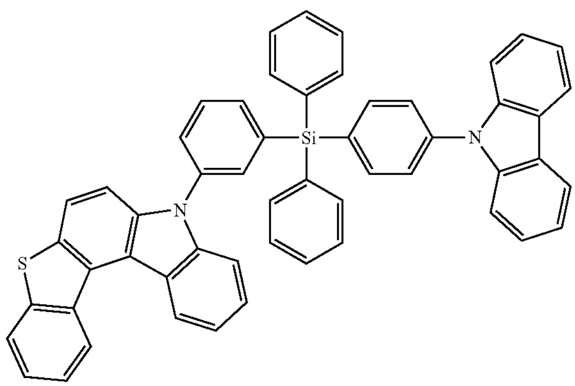
-continued
55
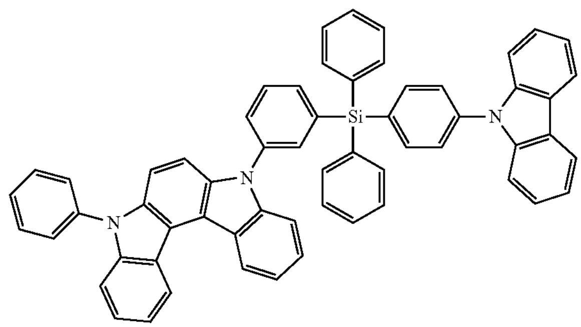
56
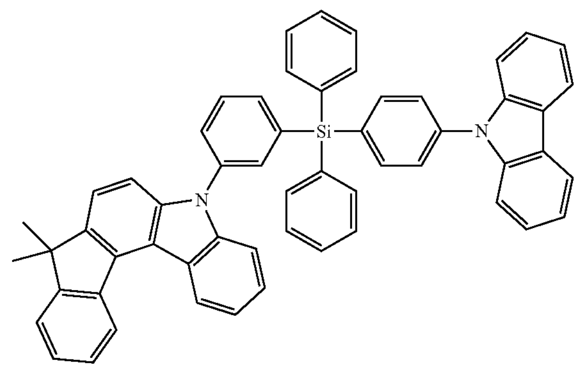
57
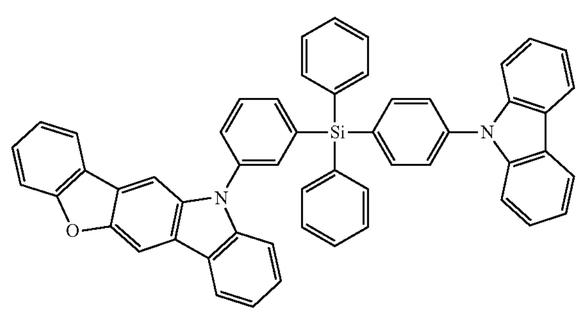
58
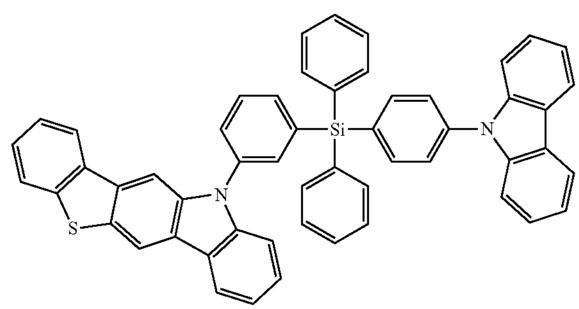

-continued
59
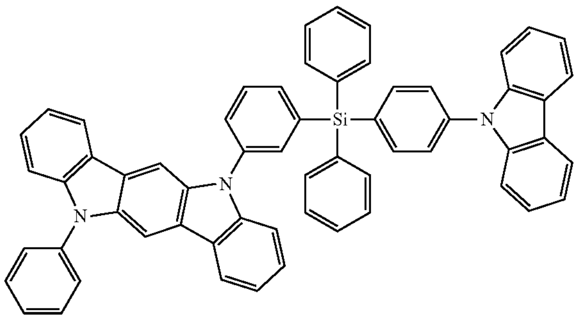
60
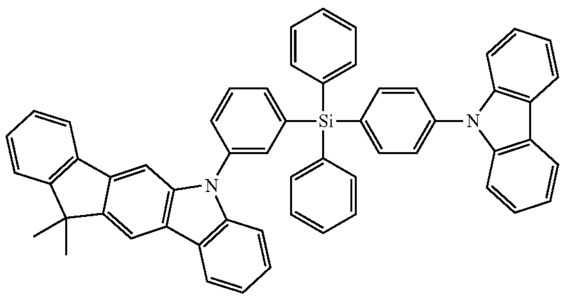
61
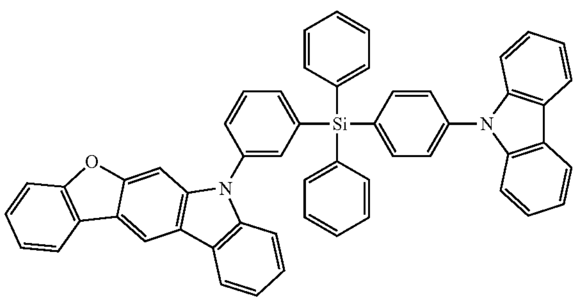
62
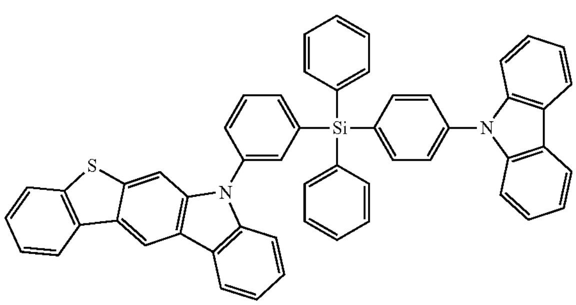
63
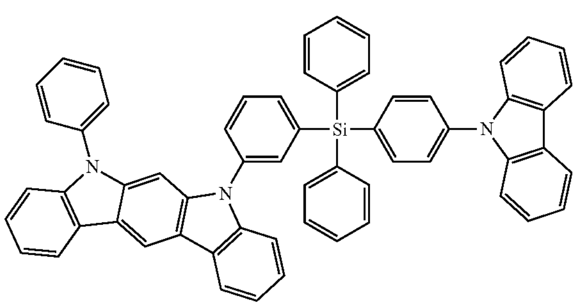
-continued
64
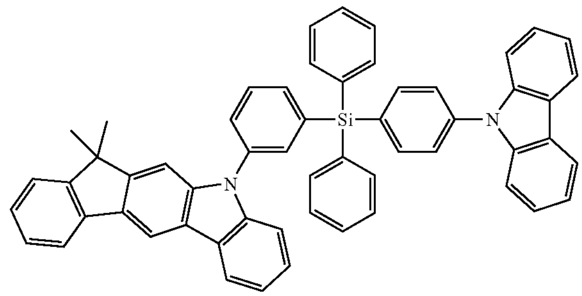
65
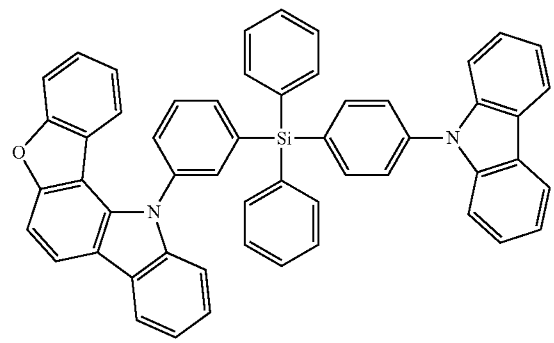
66
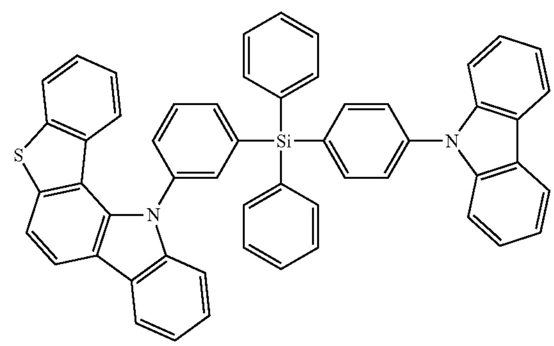
67
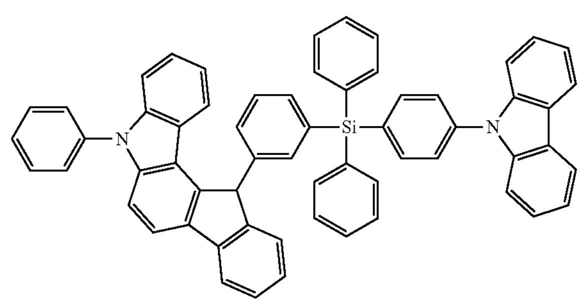

68
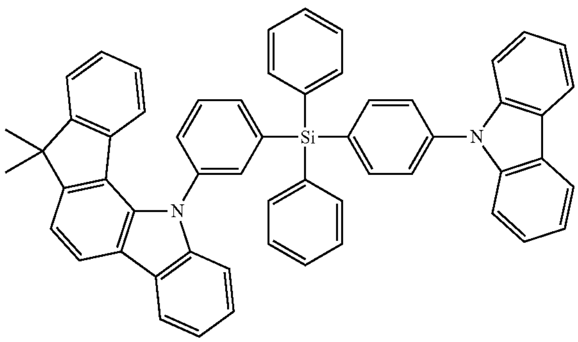
69
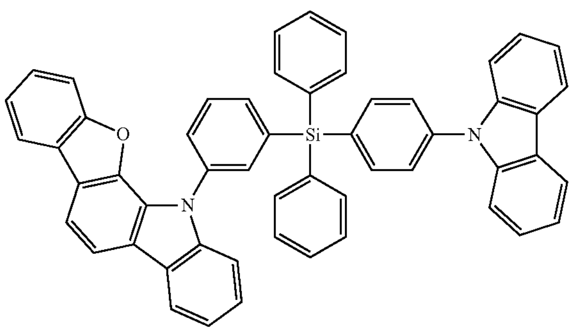
70
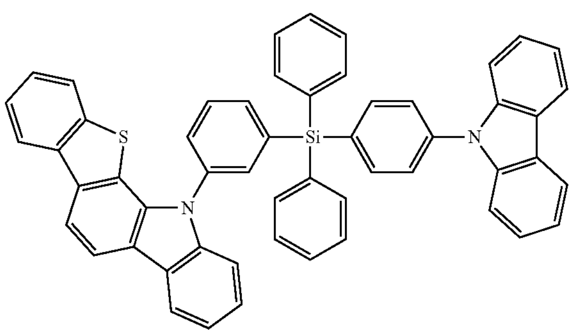
71
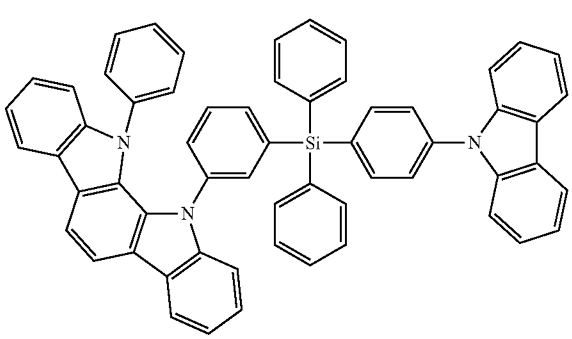
72
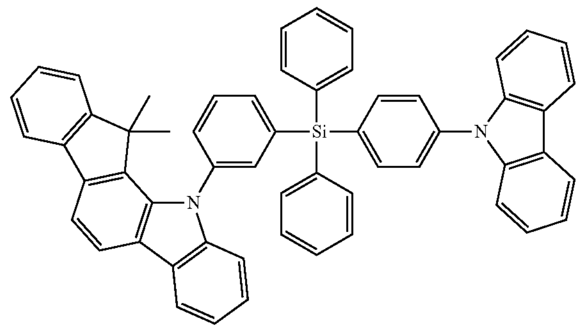
73
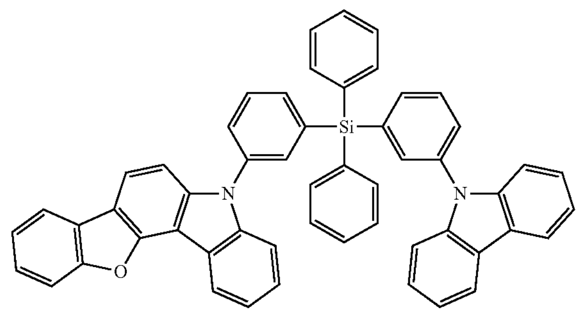
74
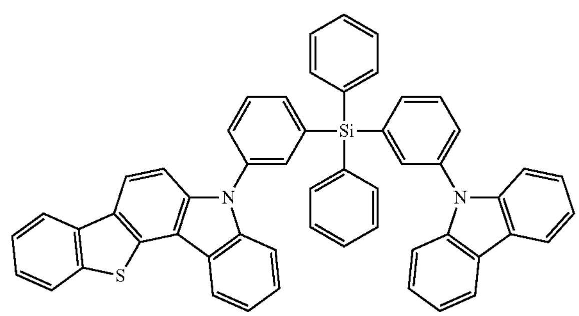
75
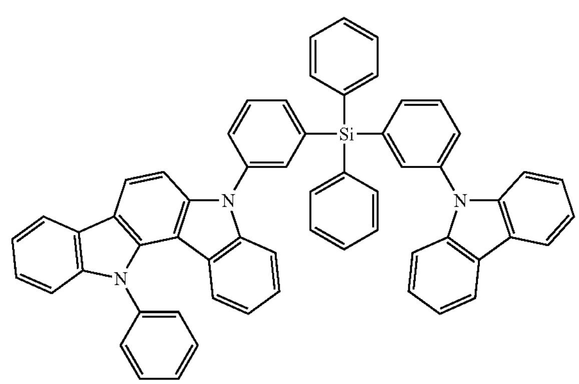

-continued
76
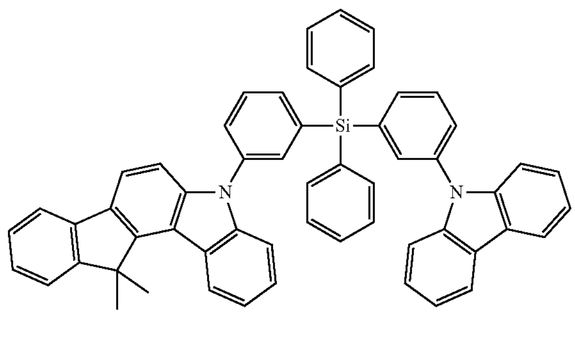
77
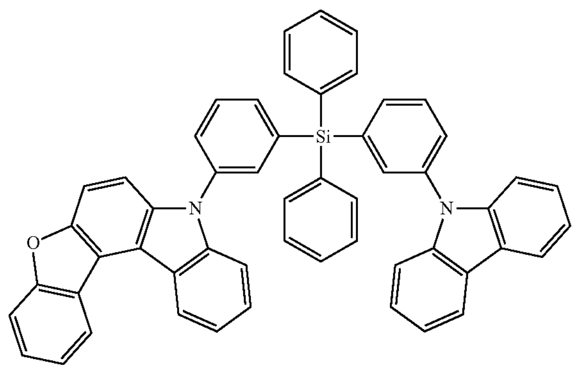
78
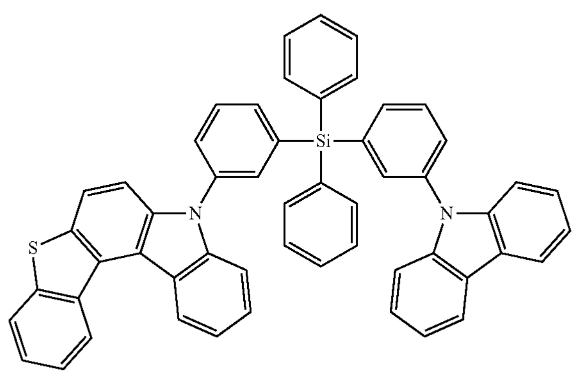
79
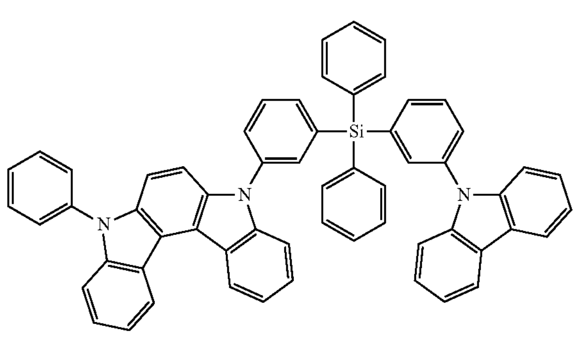
-continued
80
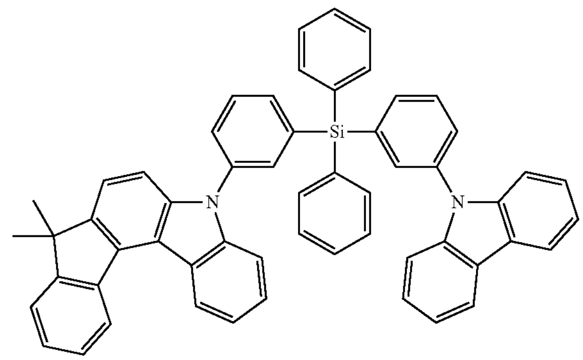
81
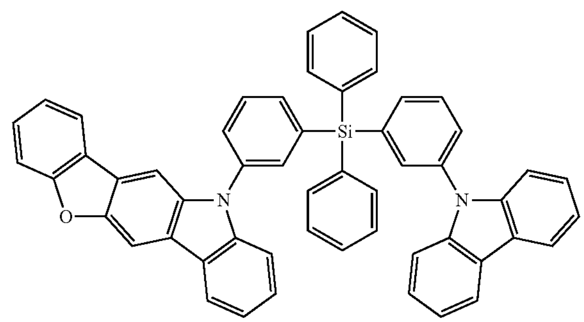
82
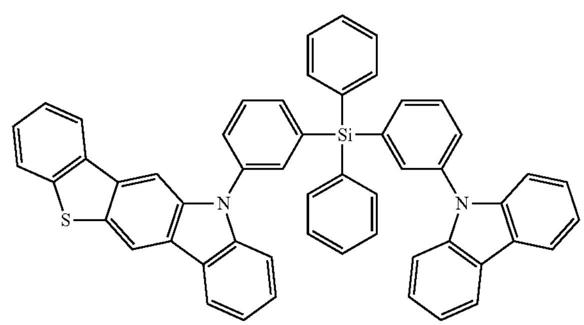
83
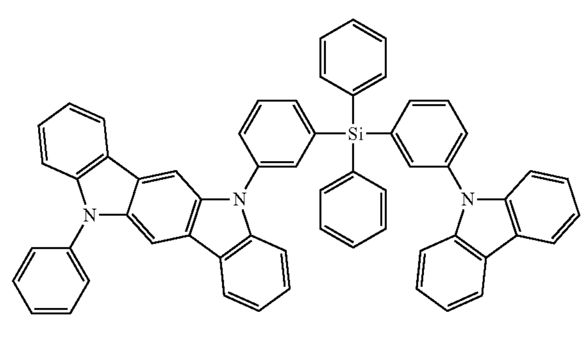

-continued
84
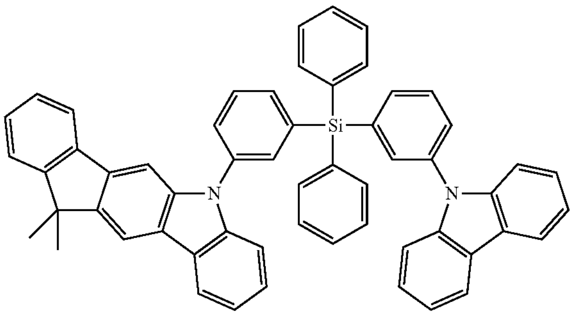
85
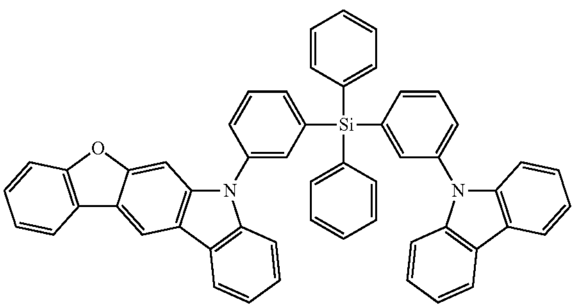
86
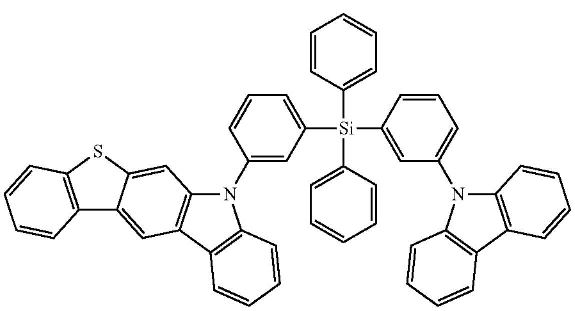
87
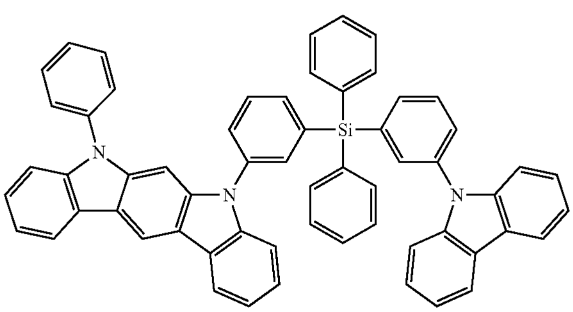
88
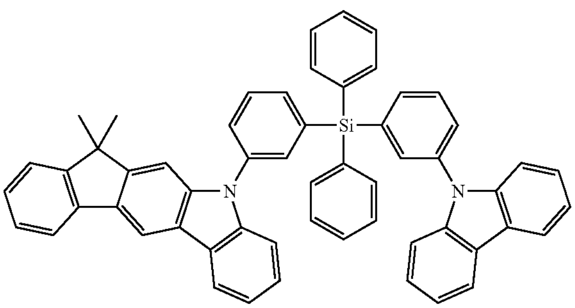
-continued
89
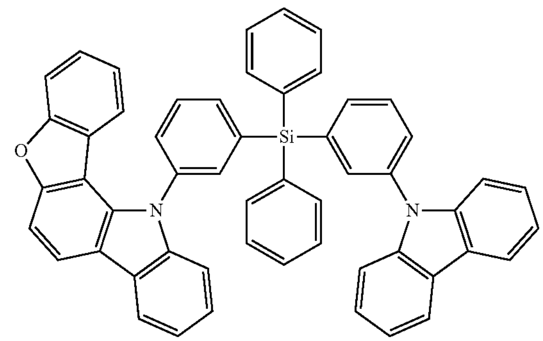
90
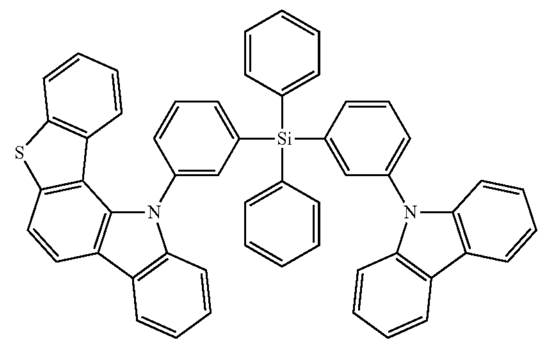
91
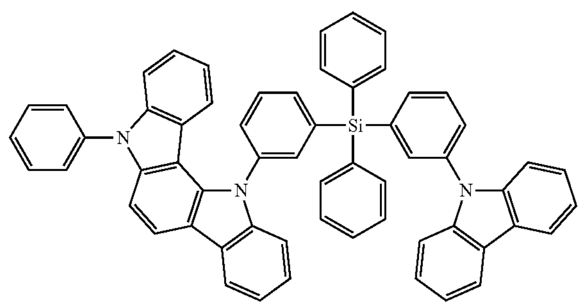
92
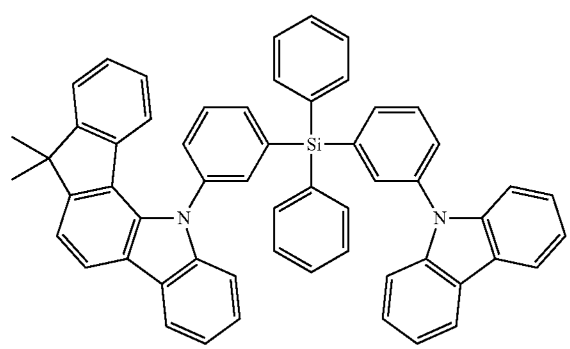

93
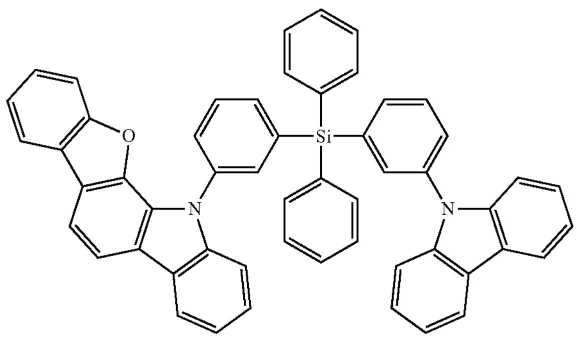
94
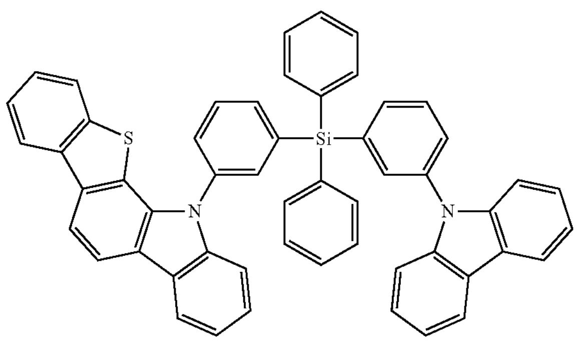
95
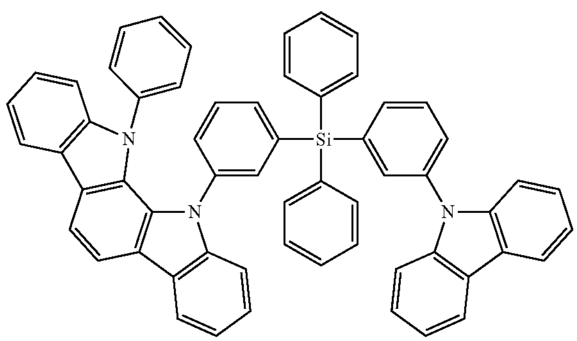
96
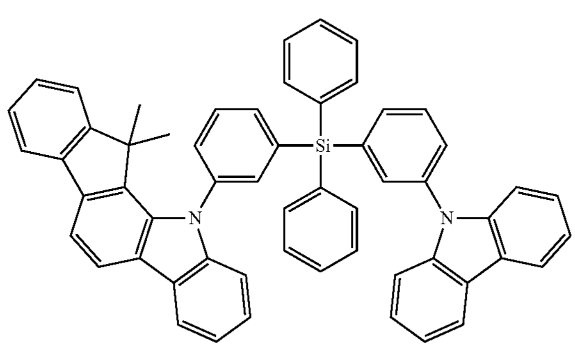
97
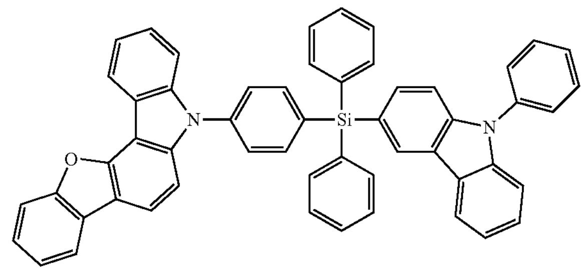
98
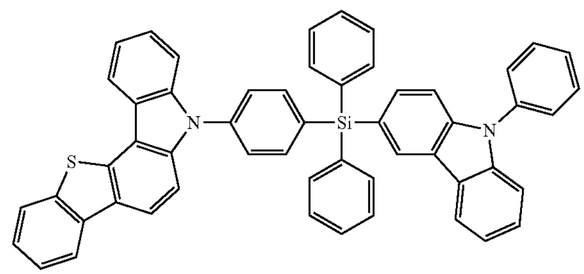
99
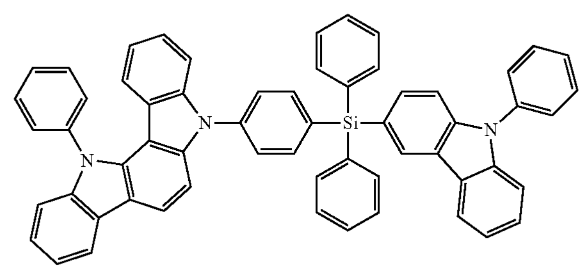
100
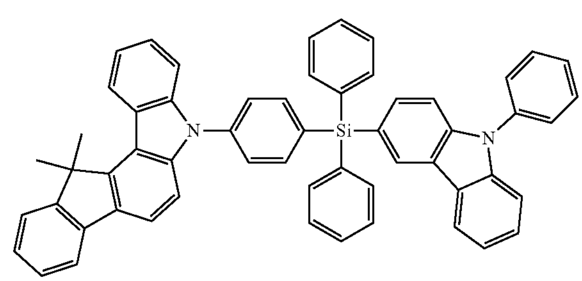
101
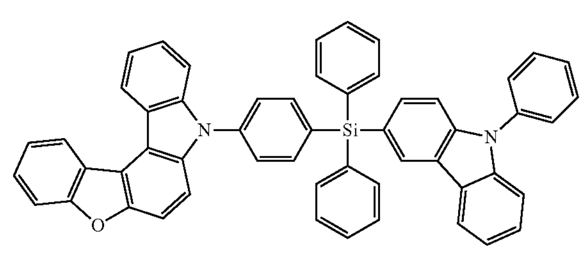

-continued
102
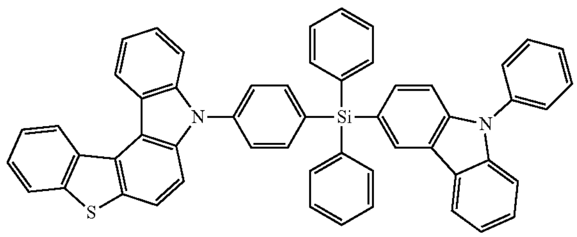
103
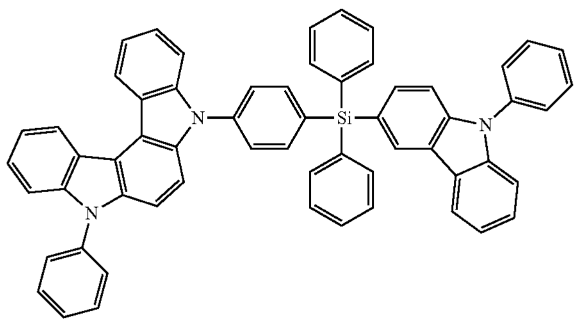
104
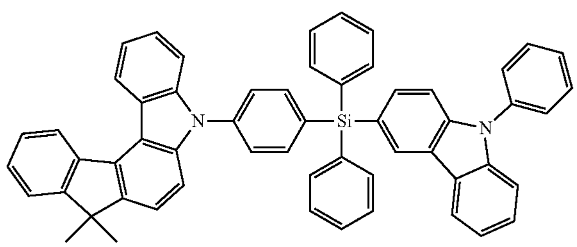
105
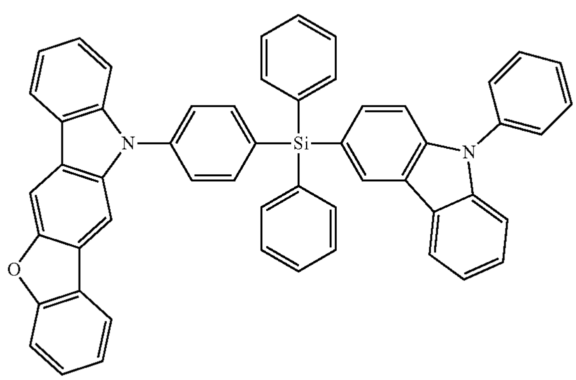
106
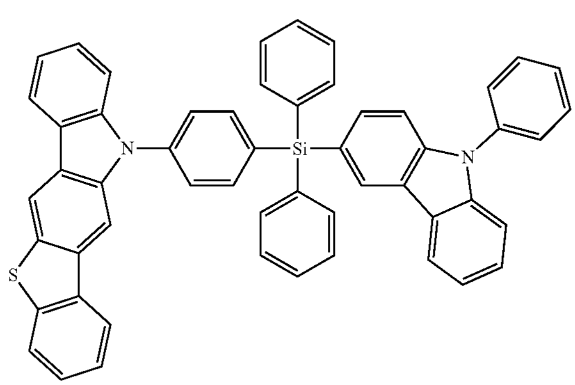
-continued
107
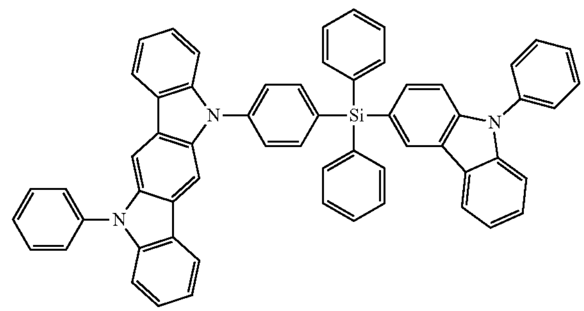
108
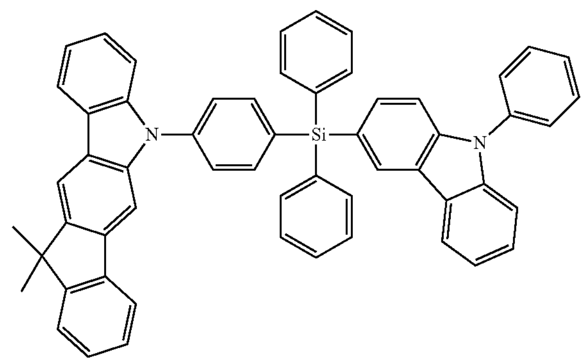
109
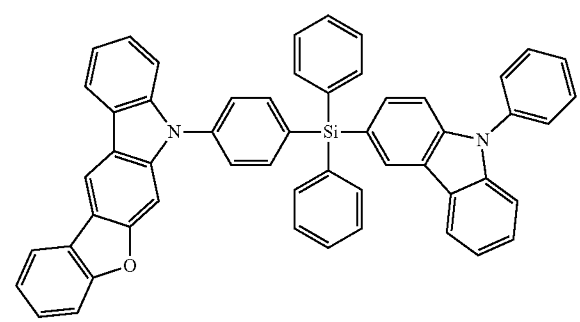
110
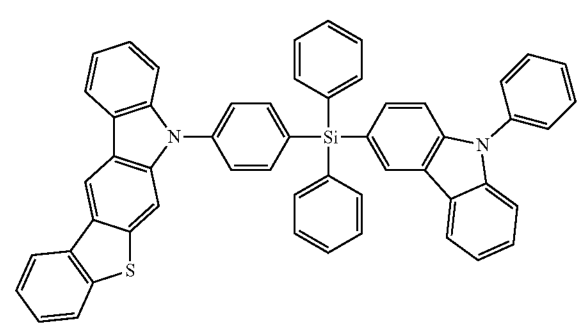

111
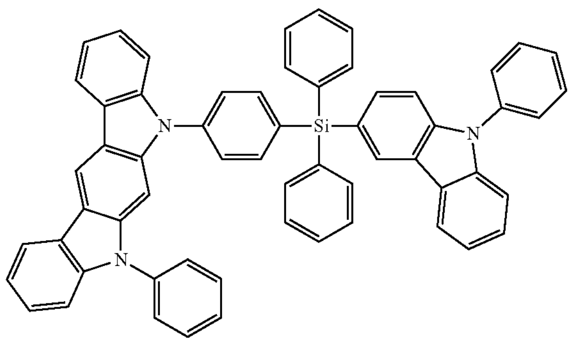
112
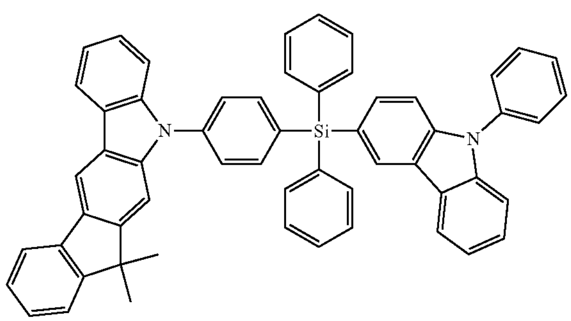
113
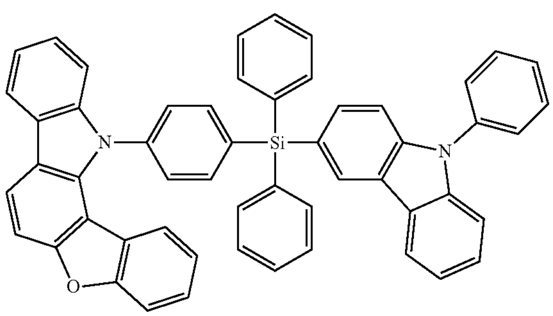
114
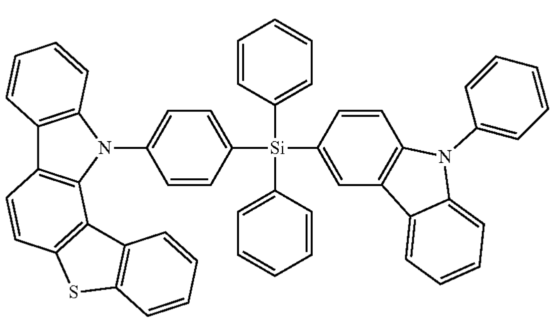
115
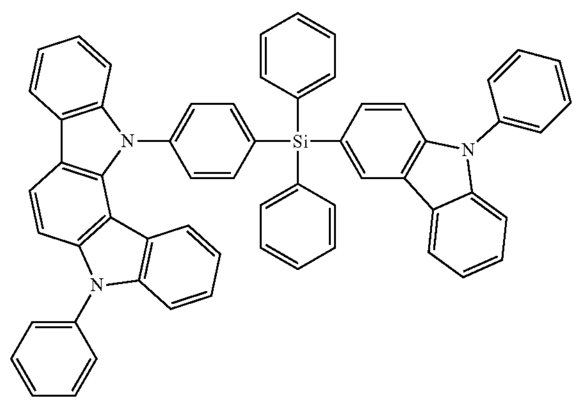
116
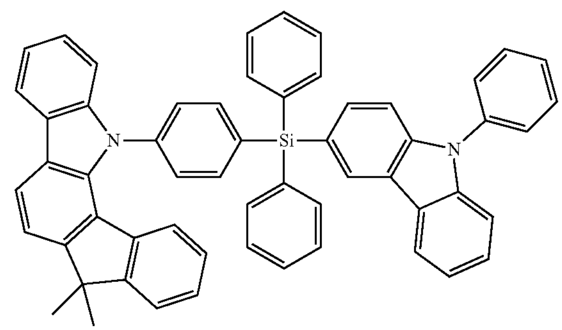
117
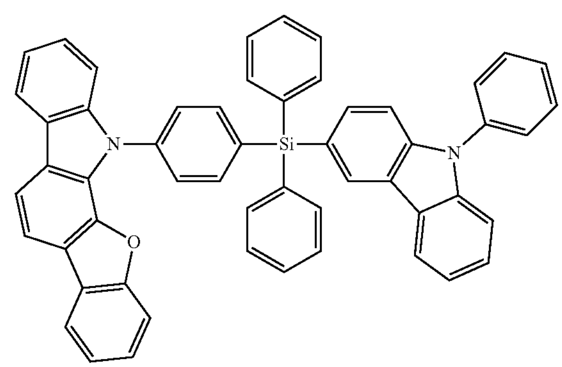
118
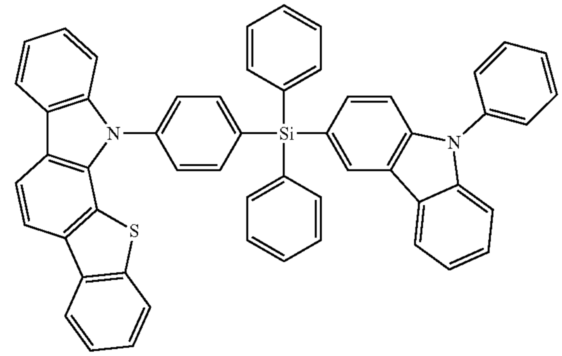

119
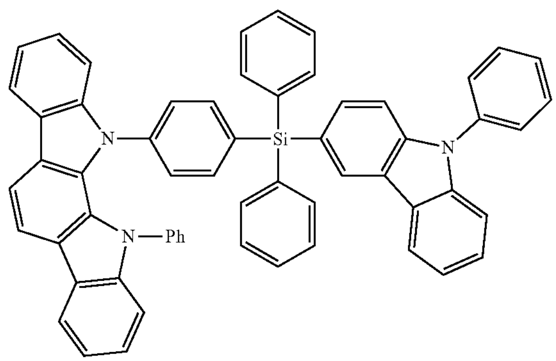
120
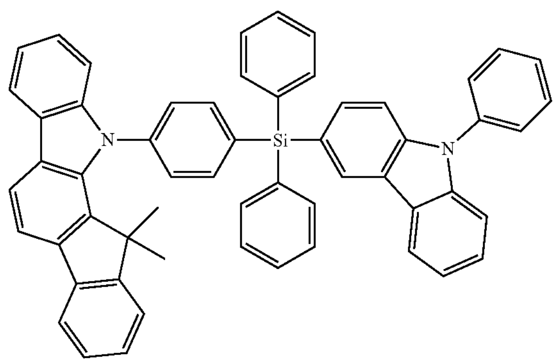
121
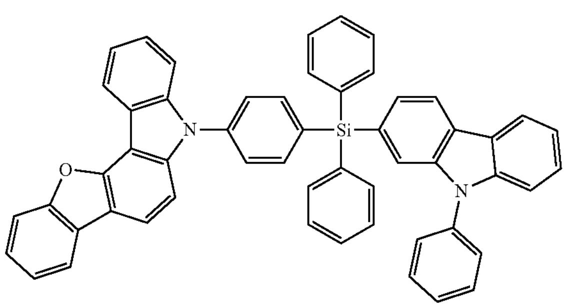
122
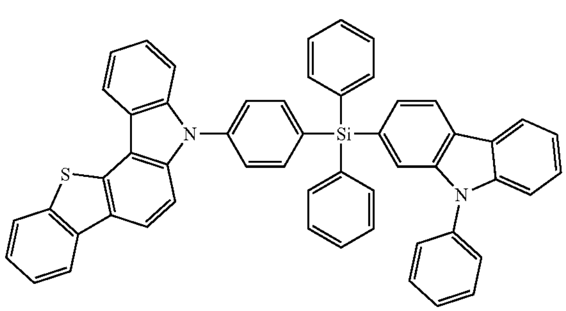
123
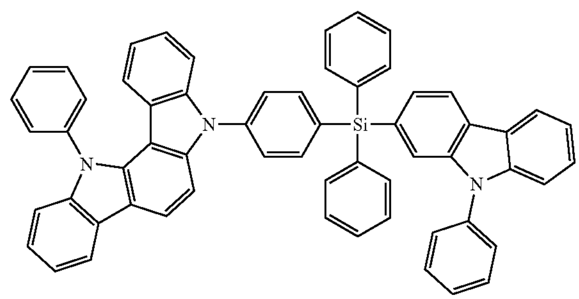
124
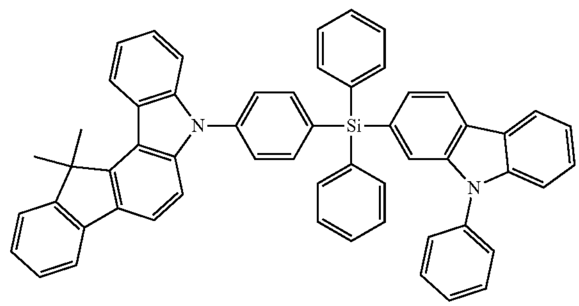
125
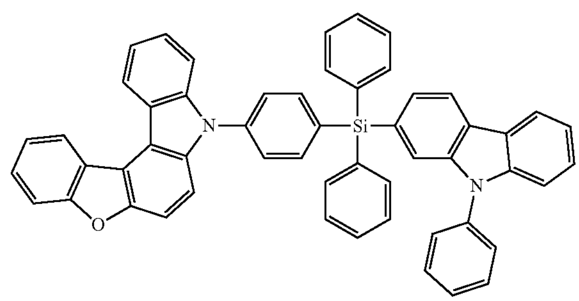
126
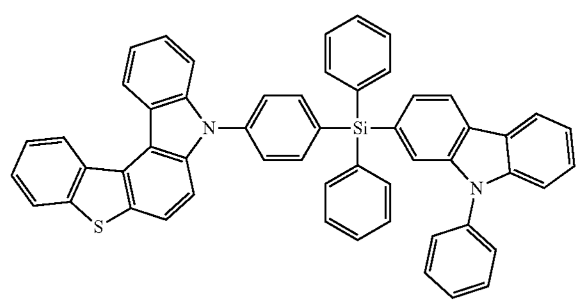
127
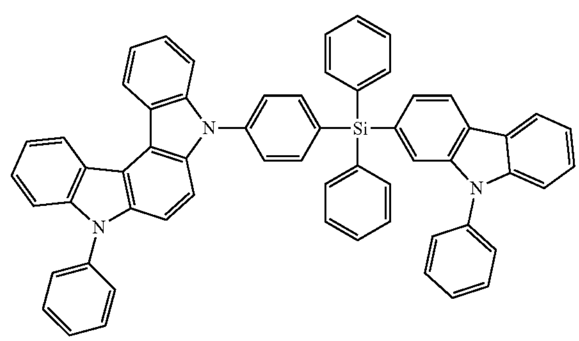

128
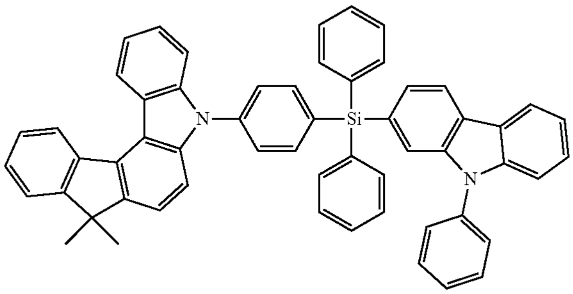
129
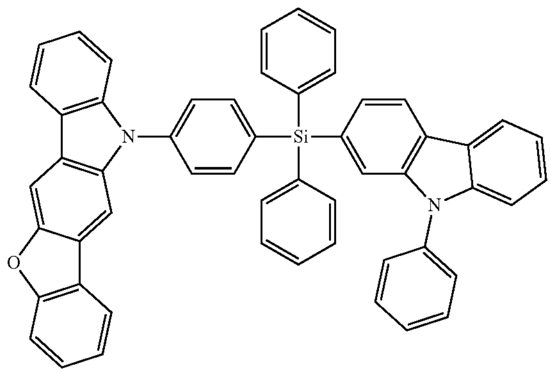
130
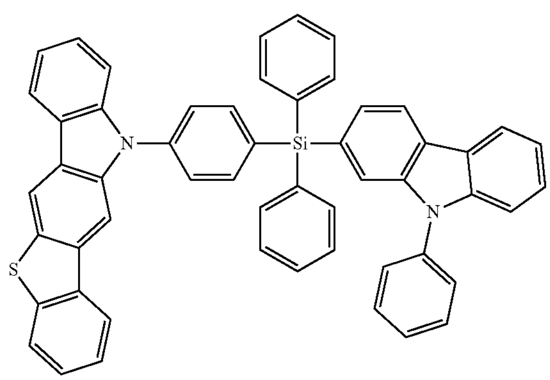
131
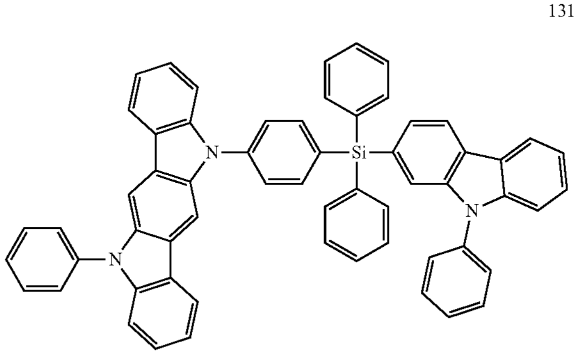
132
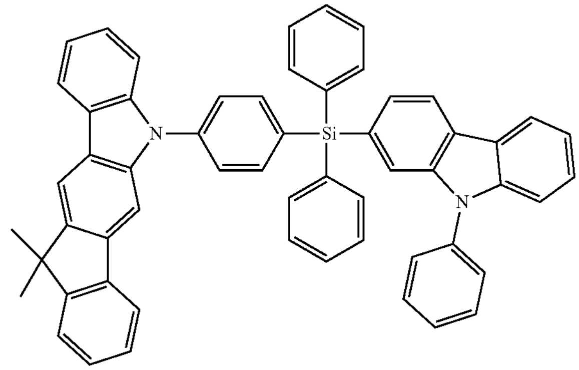
133
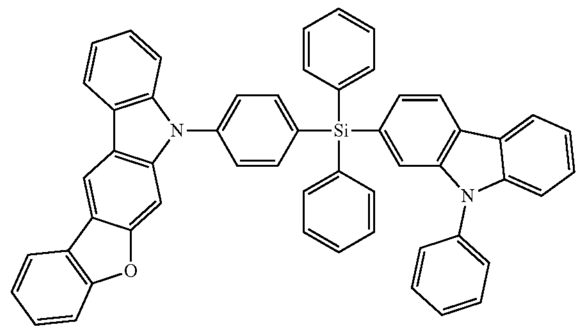
134
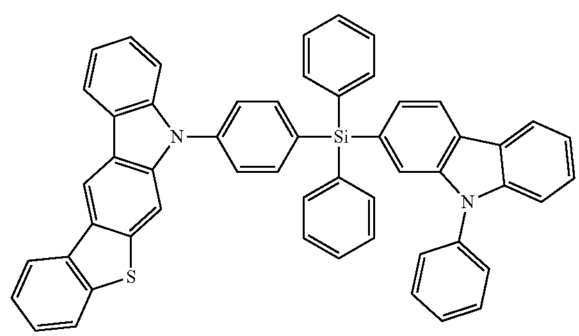
135
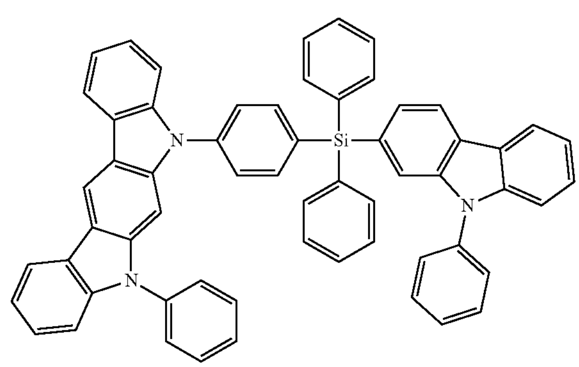

-continued
136
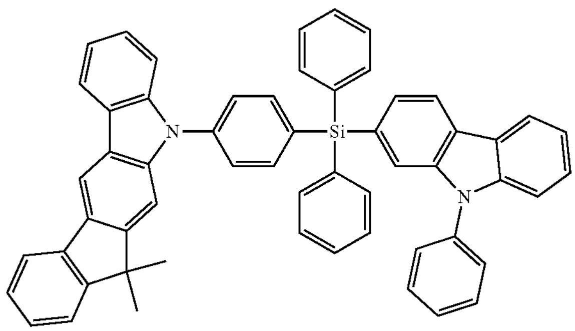
137
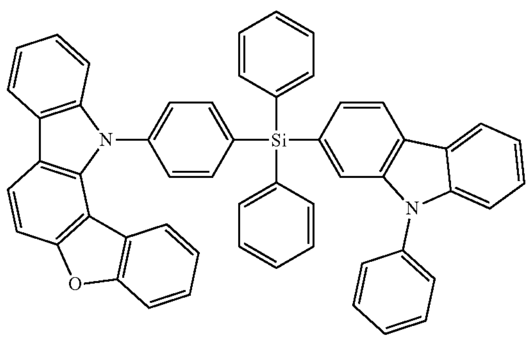
138
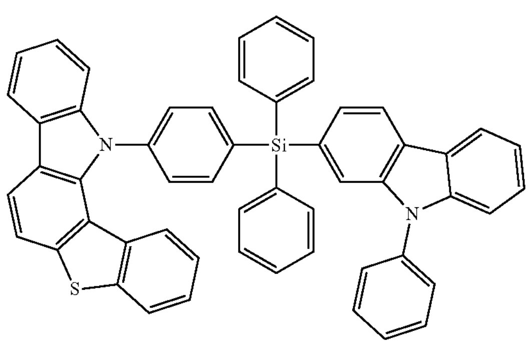
139
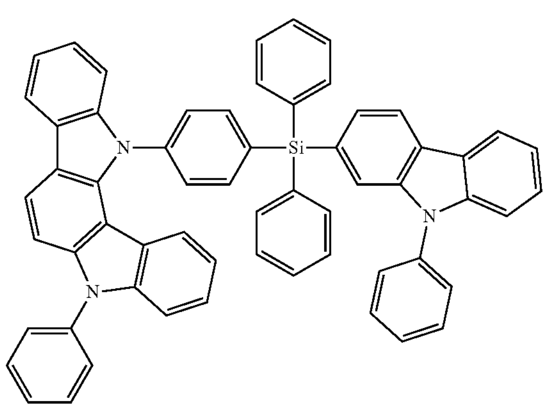
-continued
140
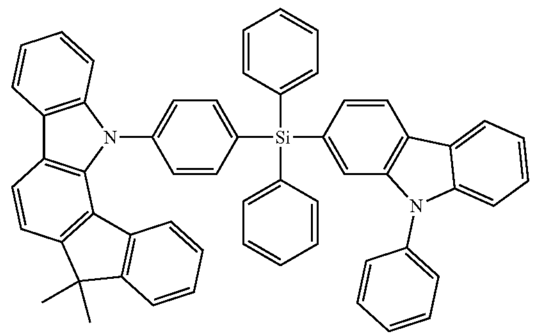
141
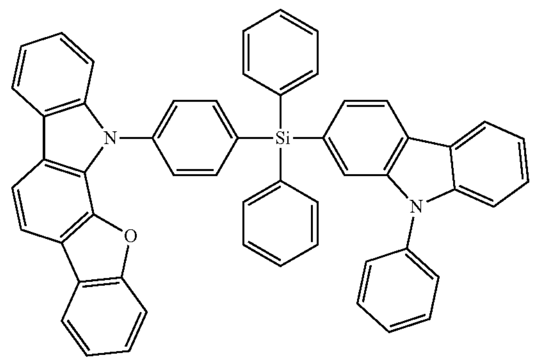
142
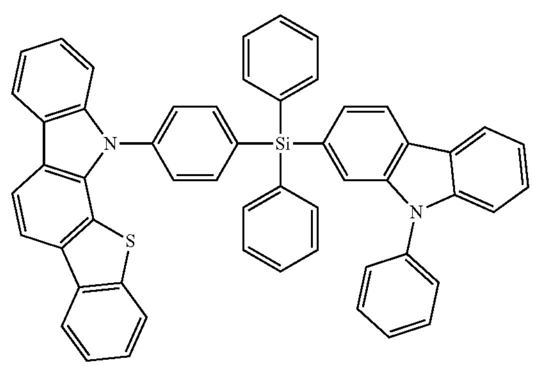
143
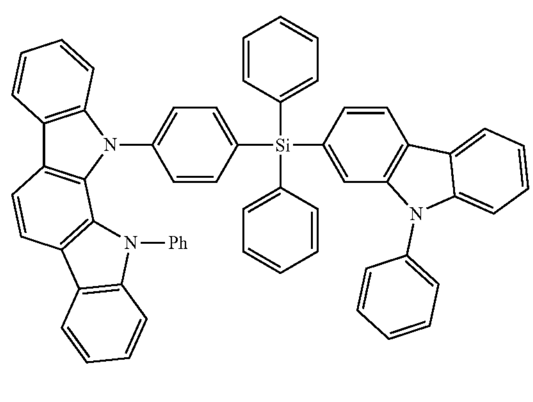

144
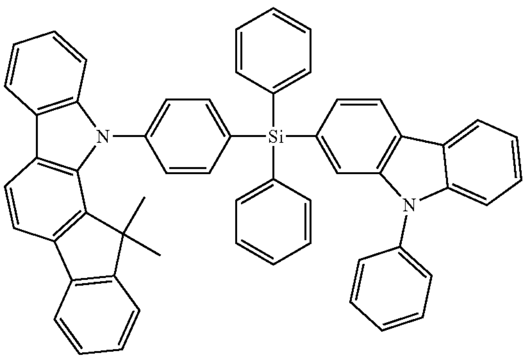
145
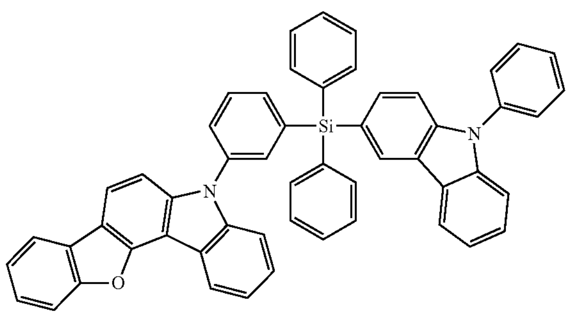
146
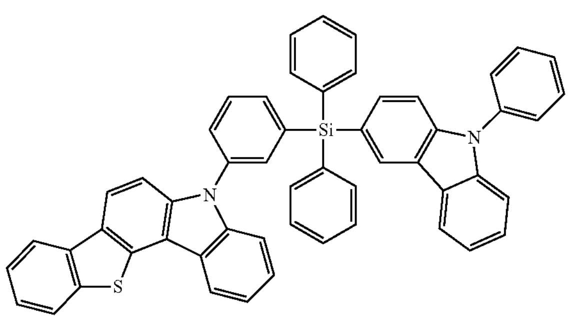
147
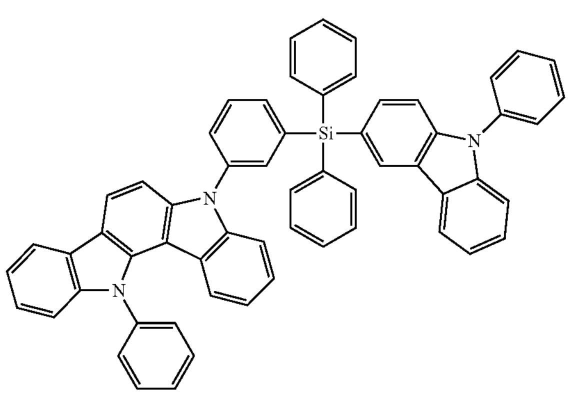
148
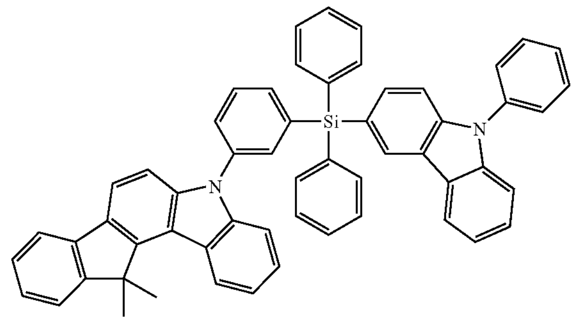
149
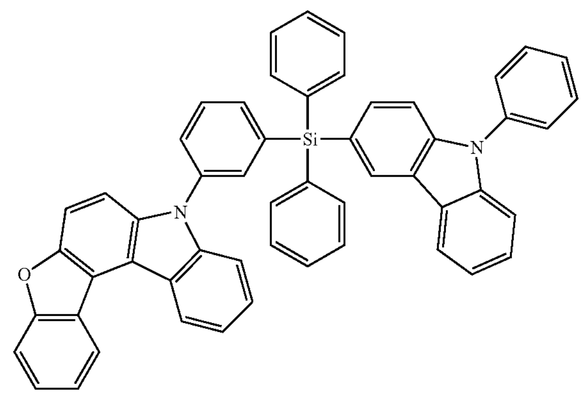
150
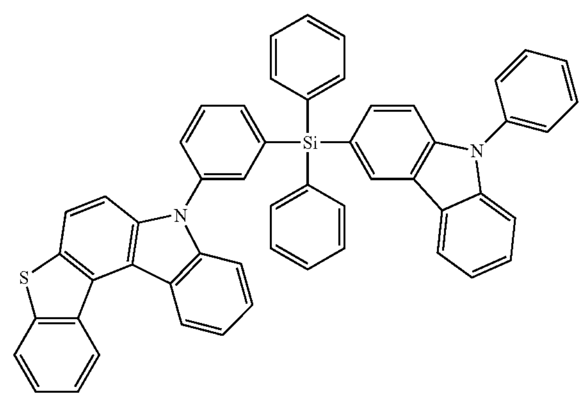
151
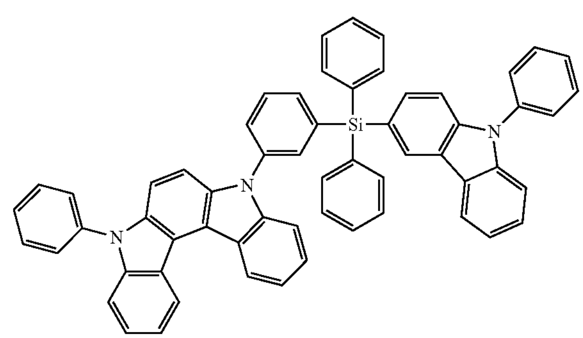

-continued
152
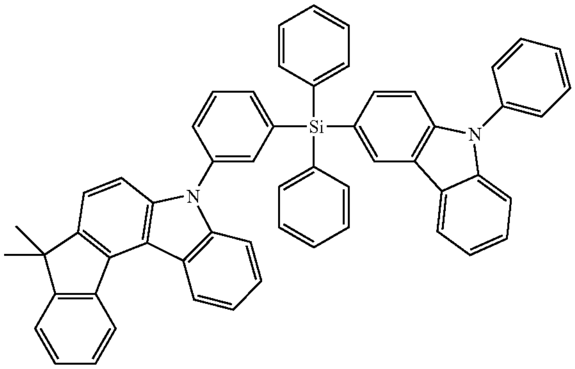
153
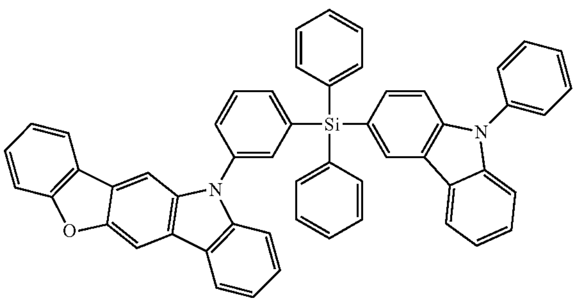
154
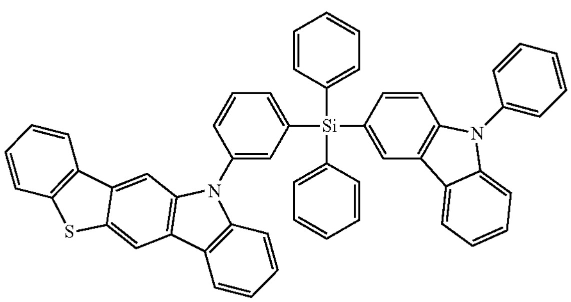
155
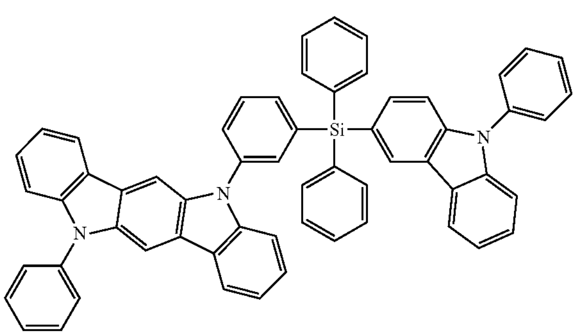
-continued
156
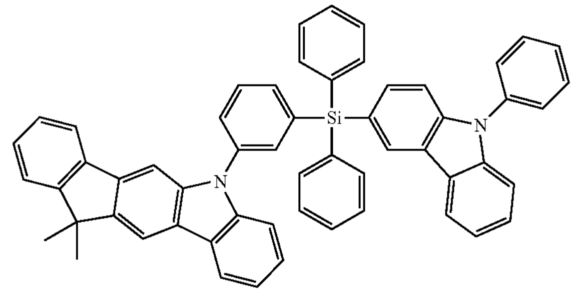
157
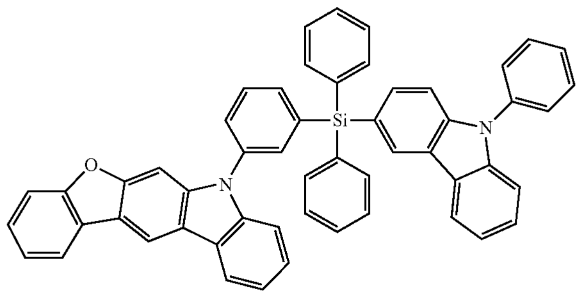
158
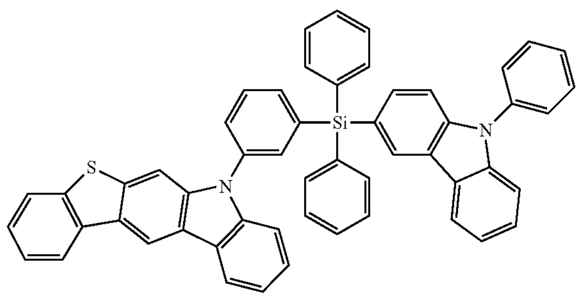
159
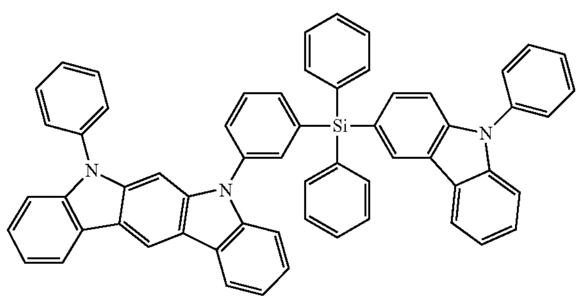
160
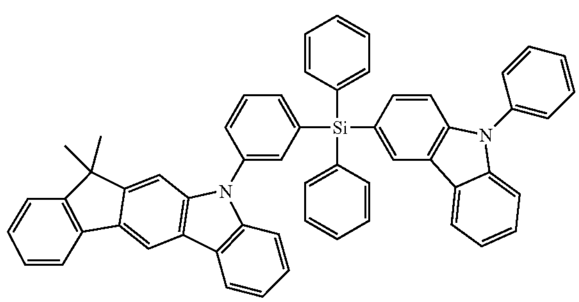

-continued
161
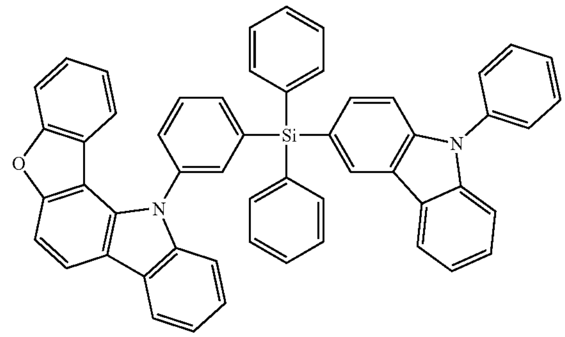
162
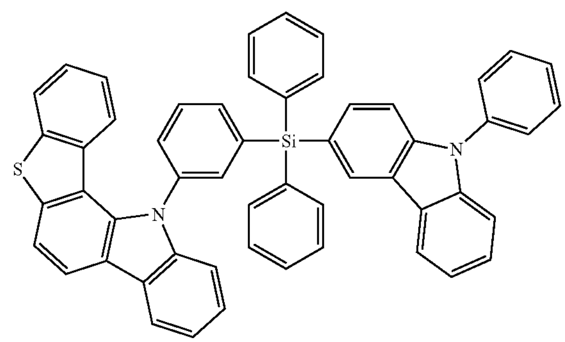
163
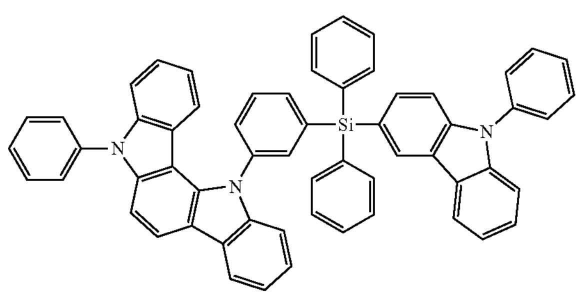
164
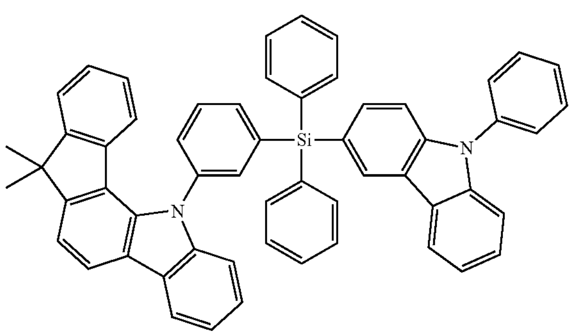
165
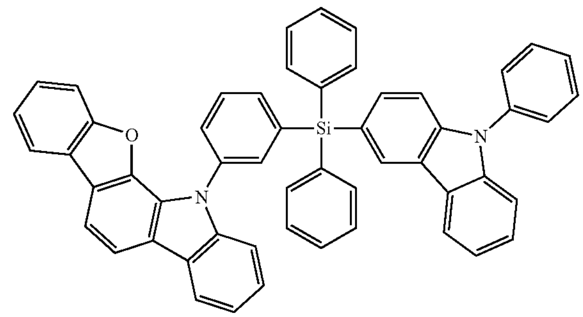
166
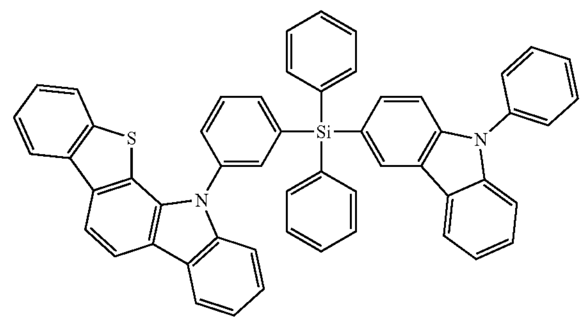
167
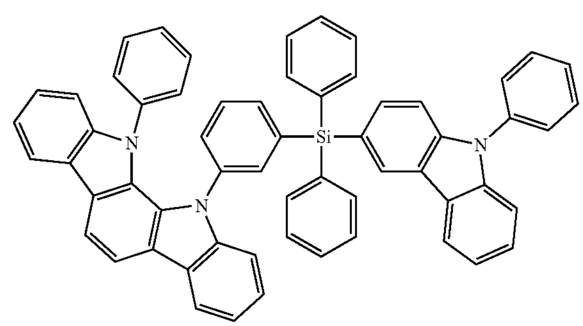
168
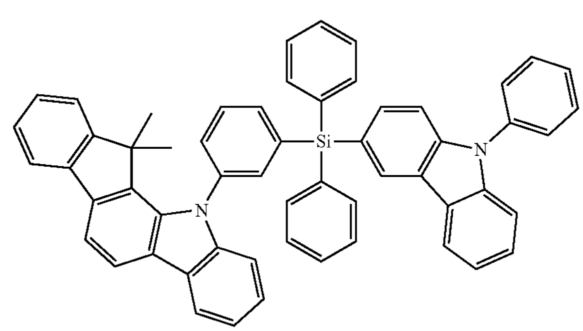

-continued
169
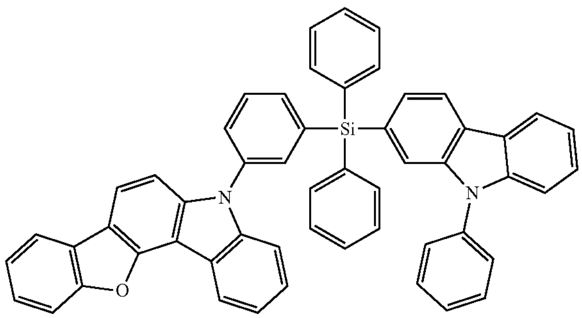
170
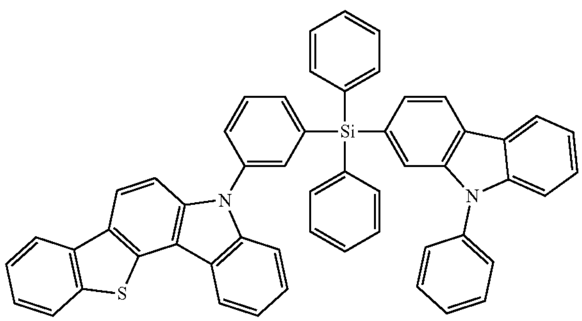
171
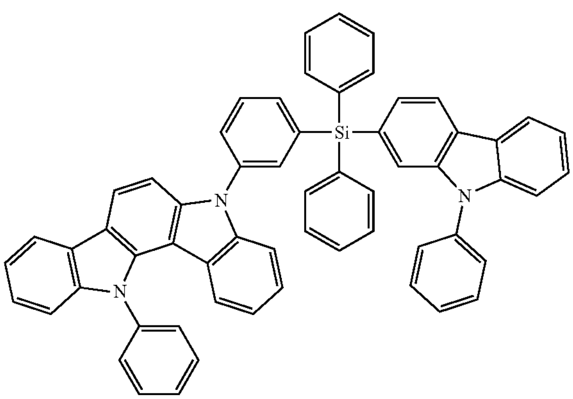
172
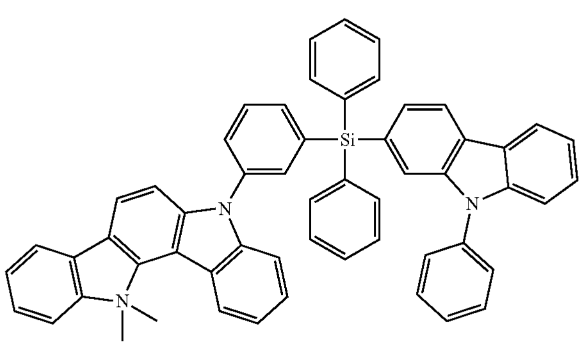
-continued
173
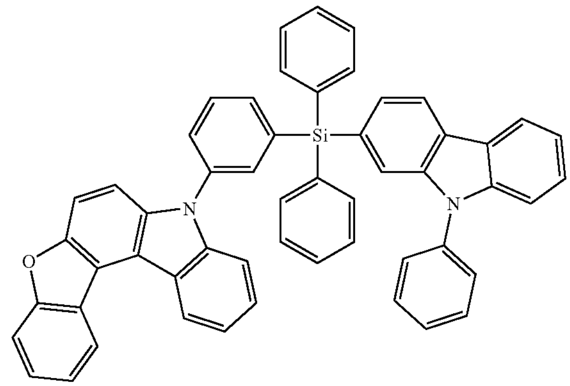
174
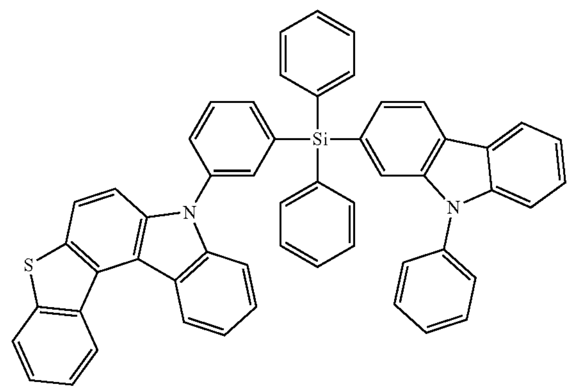
175
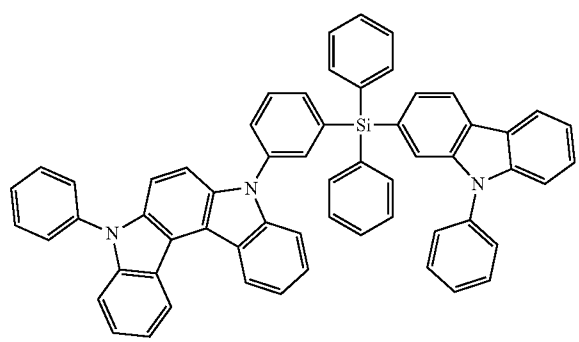
176
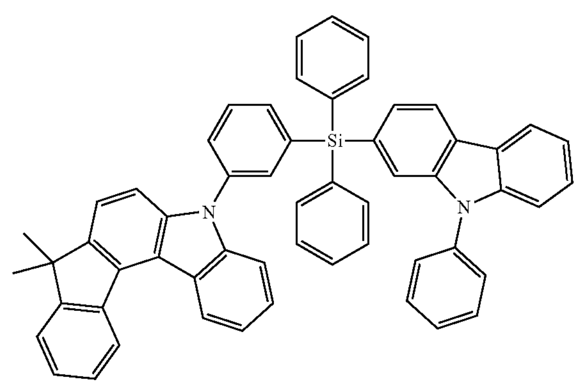

-continued
177
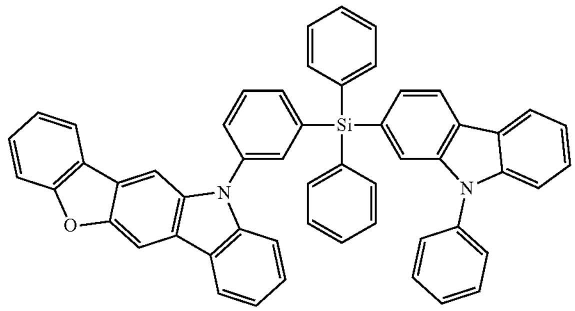
178
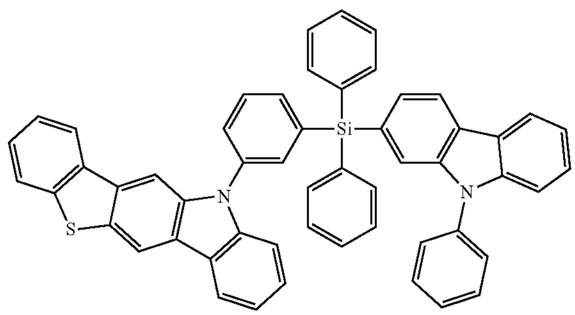
179
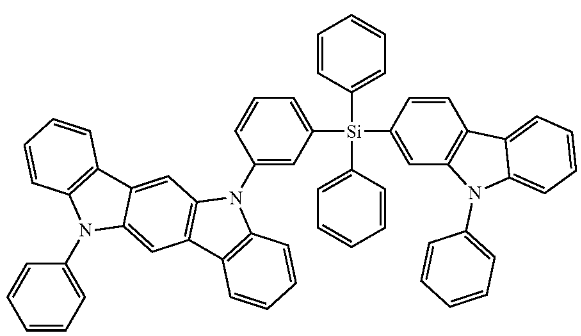
180
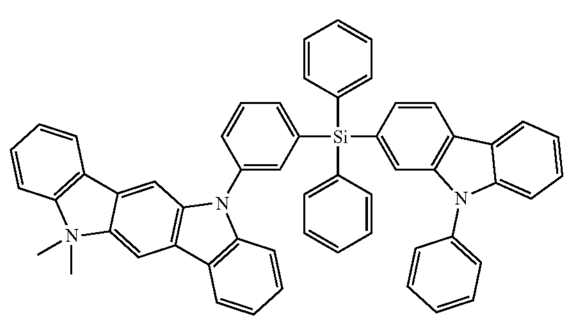
-continued
181
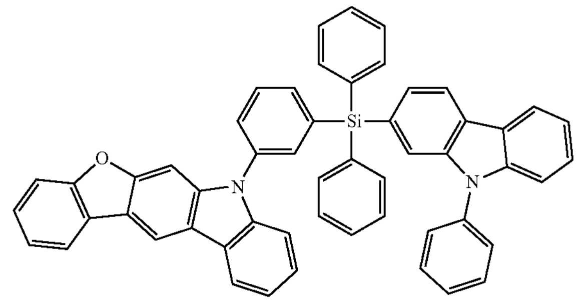
182
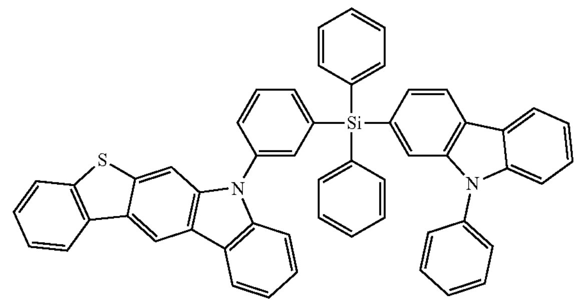
183
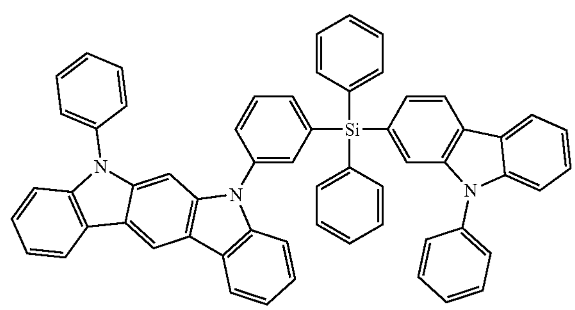
184
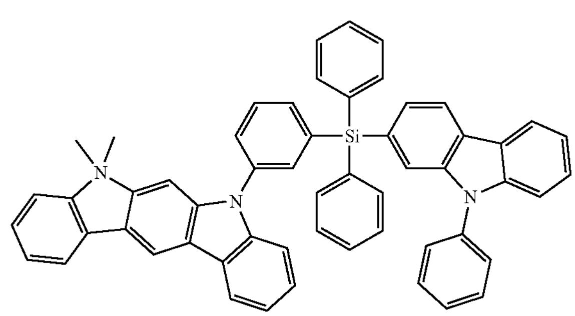

-continued
185
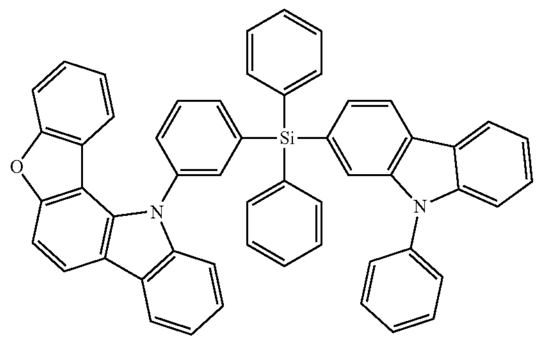
186
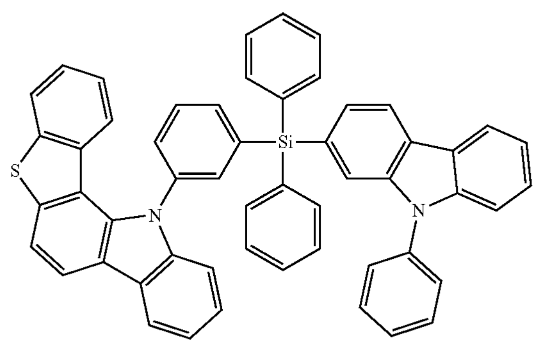
187
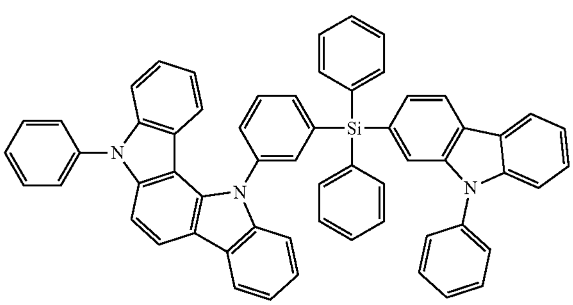
188
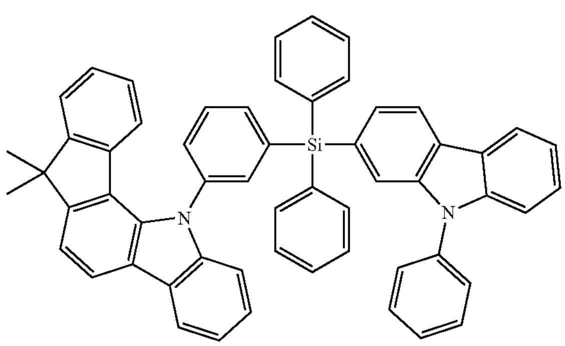
-continued
189
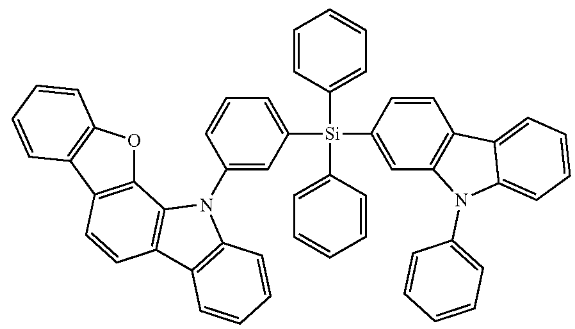
190
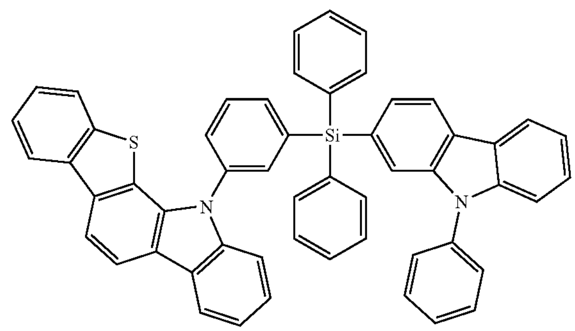
191
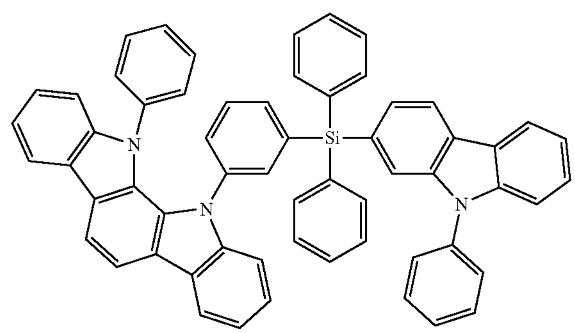
192
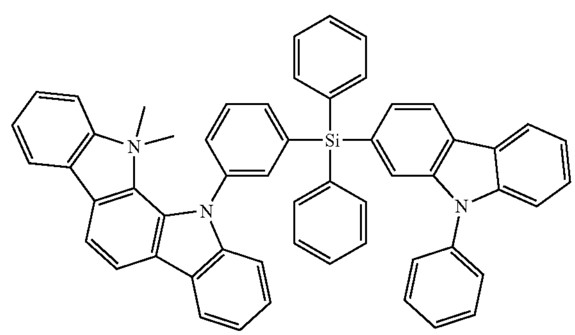

-continued
193
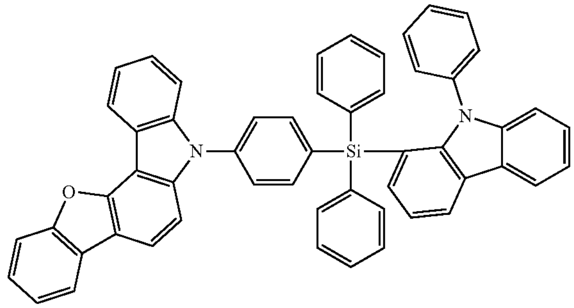
194
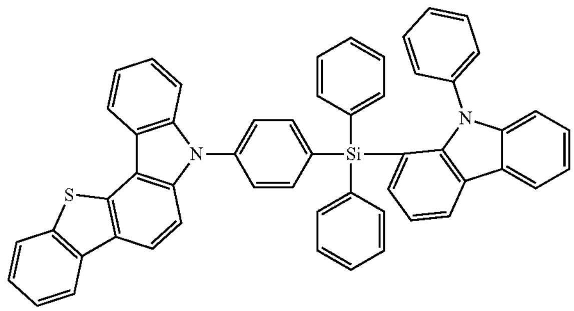
195
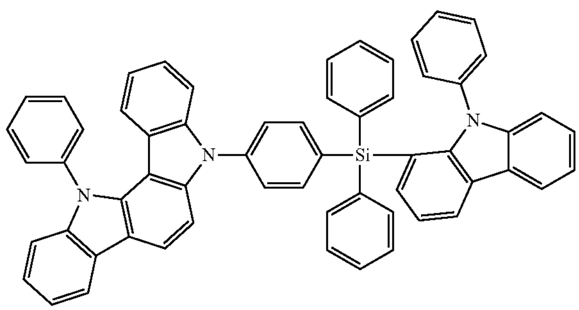
196
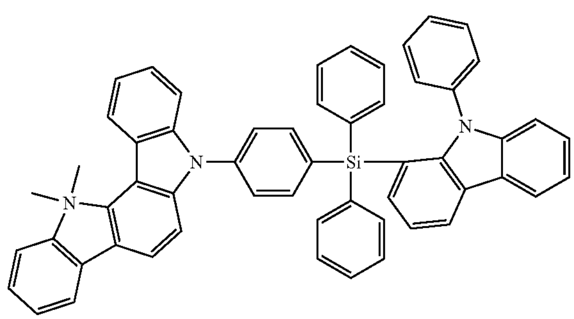
197
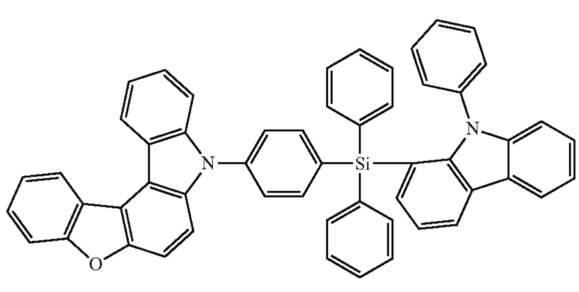
-continued
198
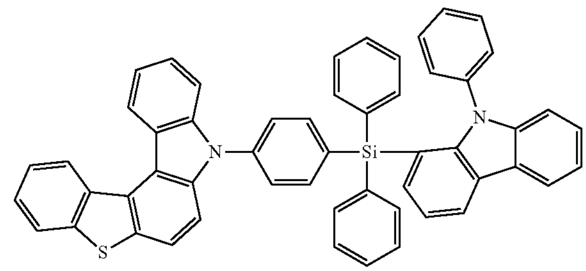
199
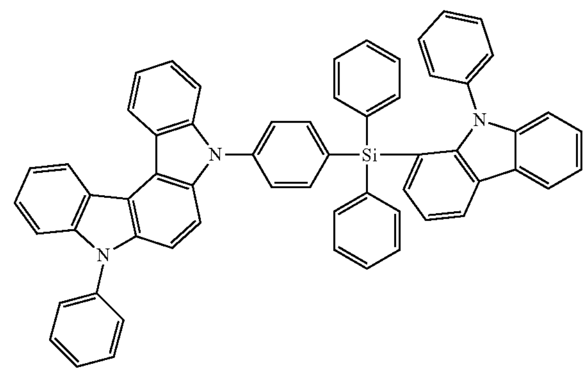
200
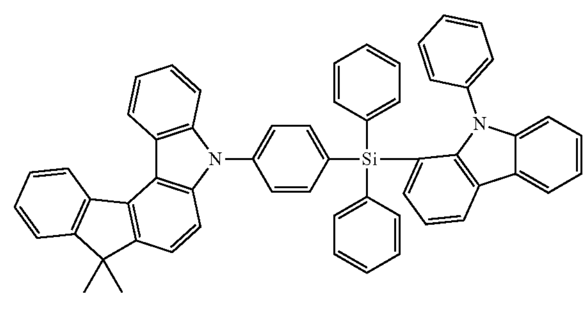
201
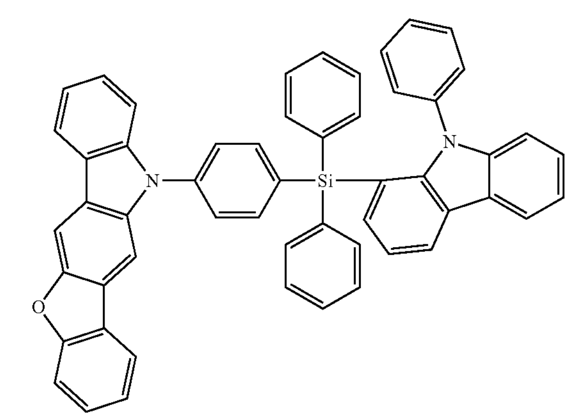

202
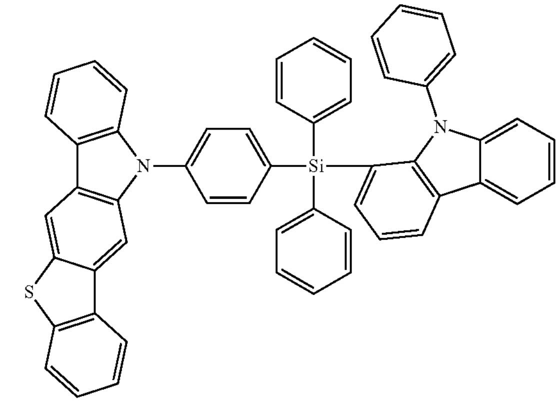
203
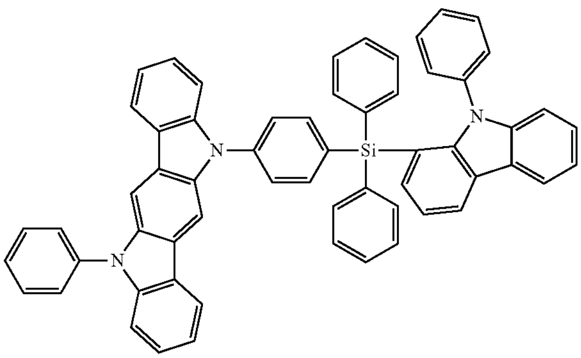
204
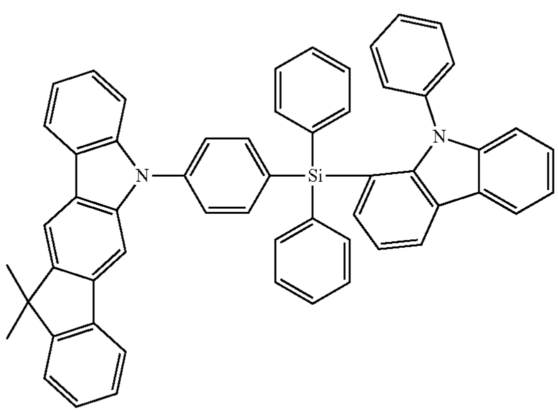
205
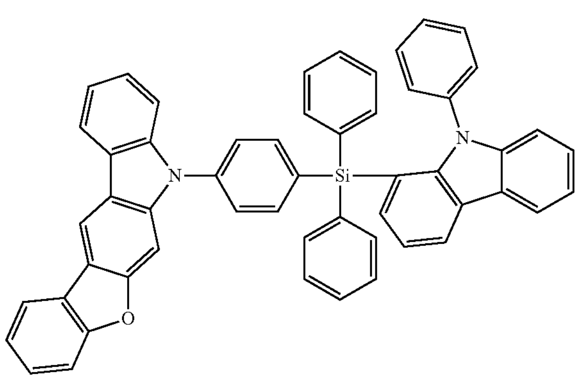
206
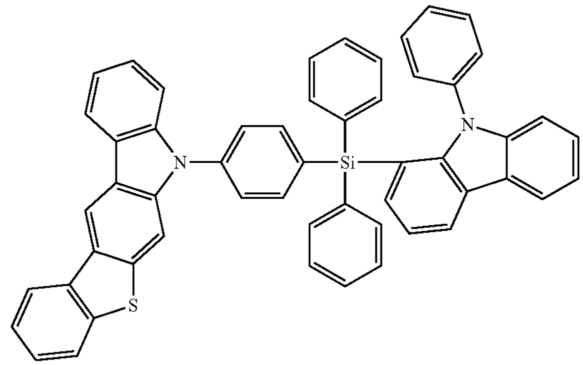
207
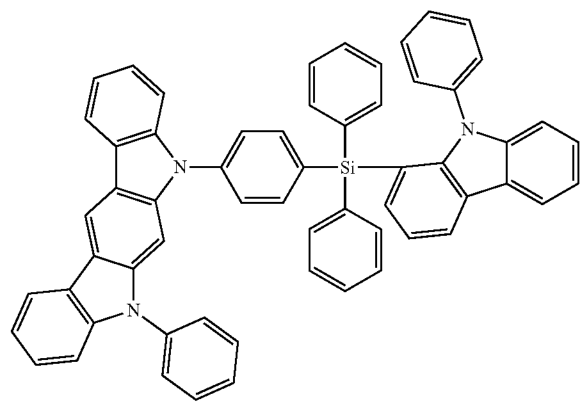
208
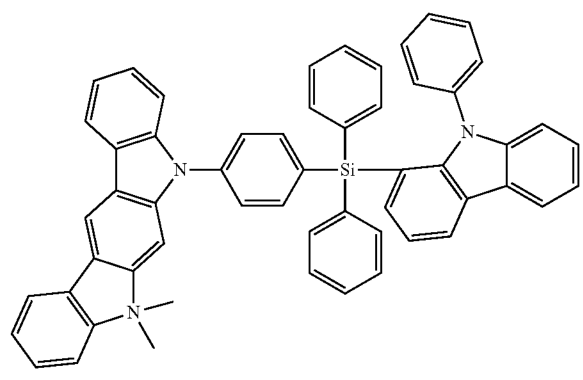
209
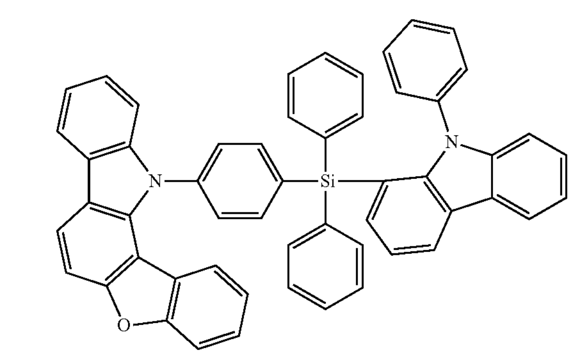

-continued
210
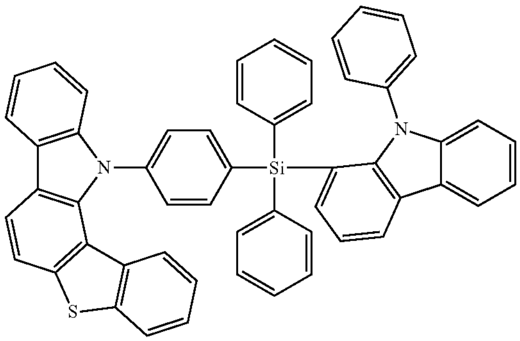
211
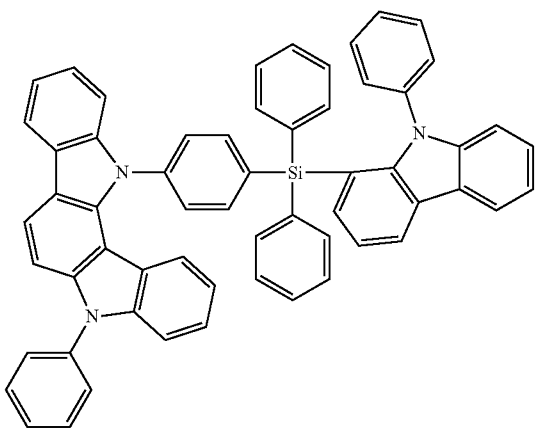
212
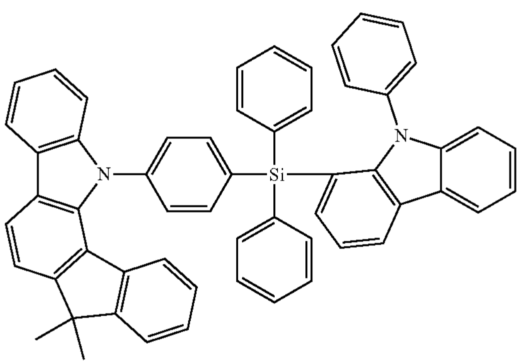
213
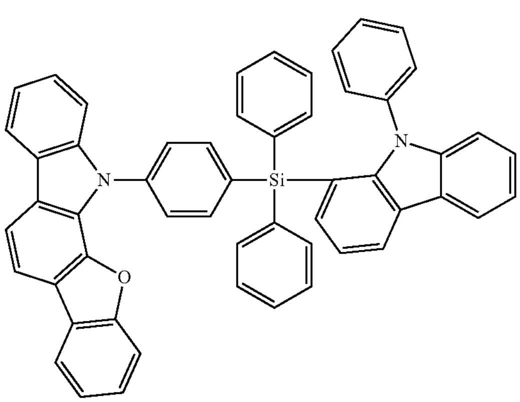
-continued
214
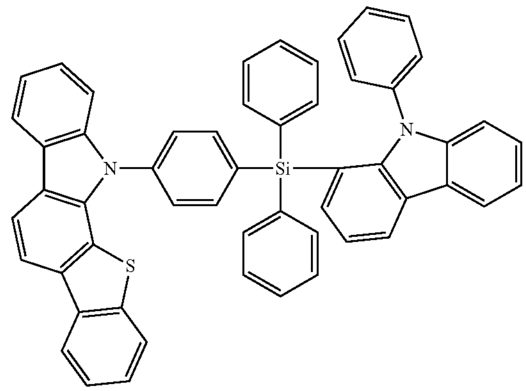
215
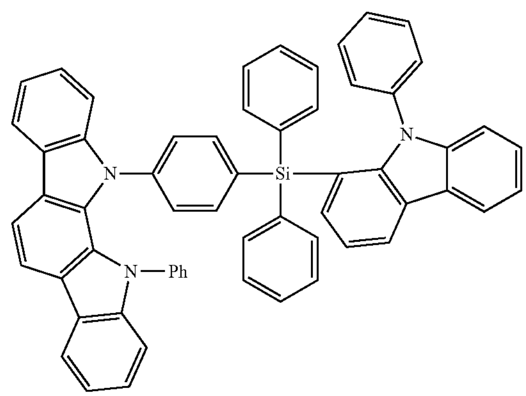
216
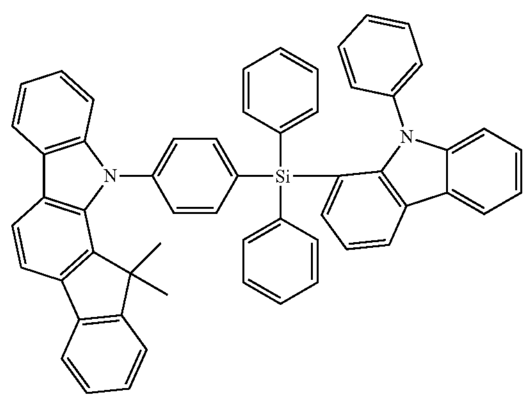
217
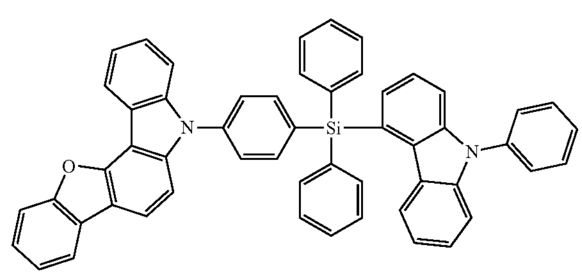

-continued
218
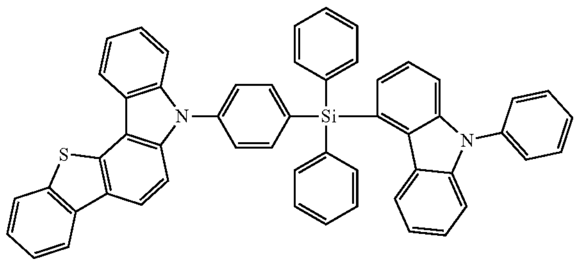
219
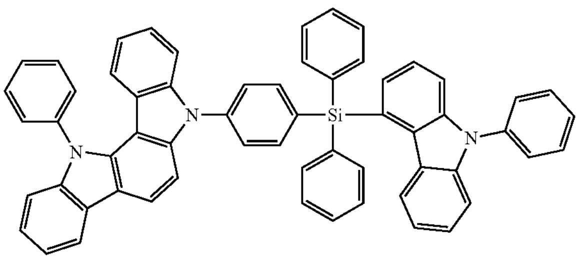
220
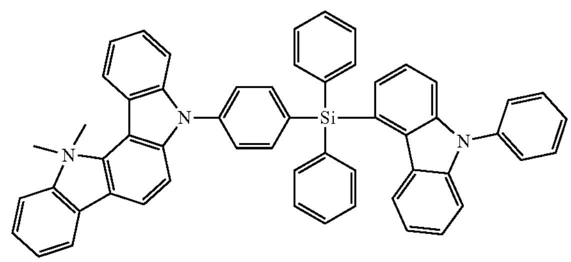
221
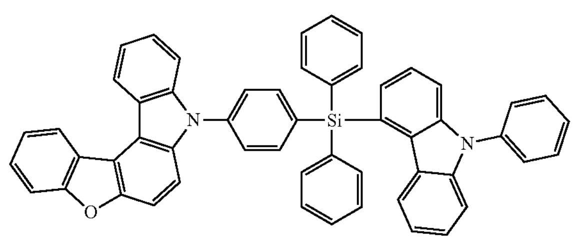
222
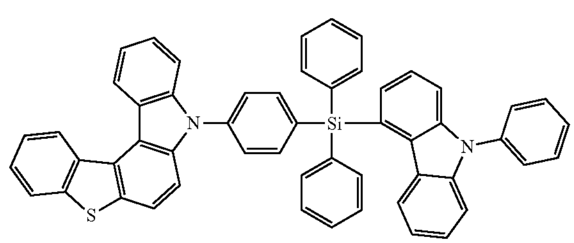
-continued
223
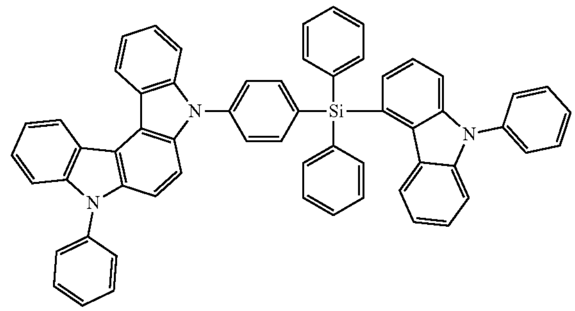
224
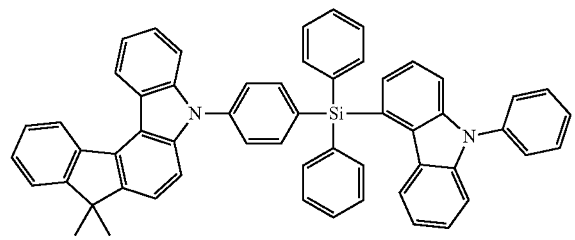
225
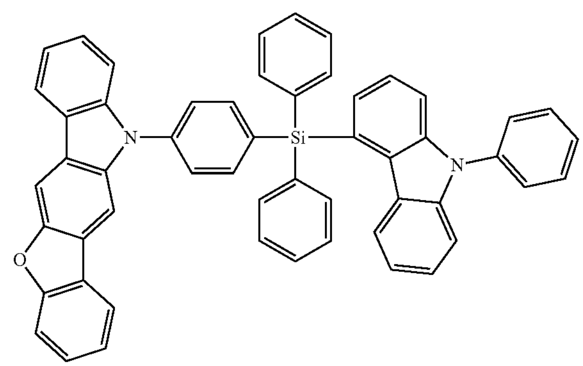
226
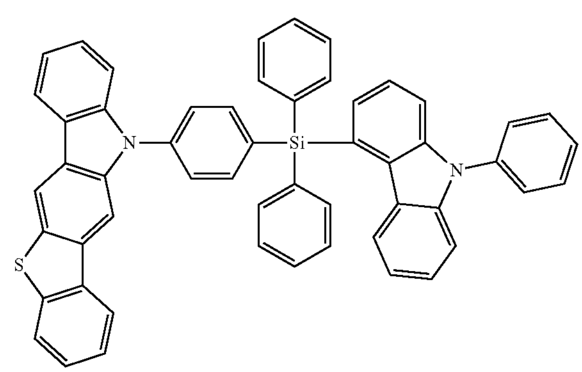

-continued
227
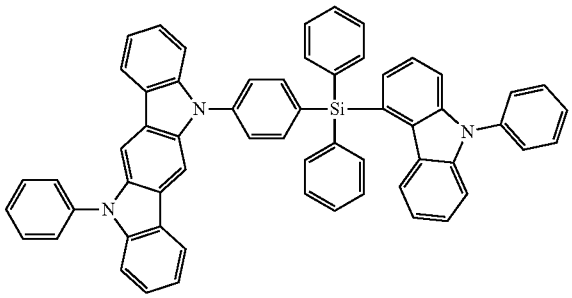
228
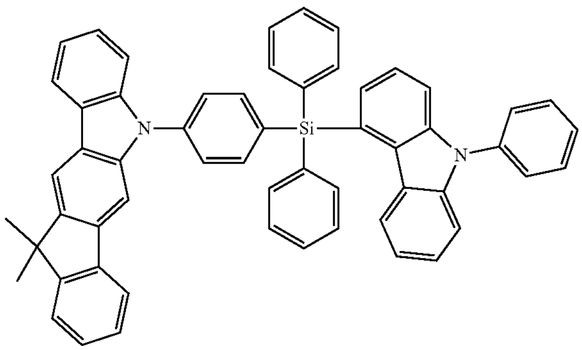
229
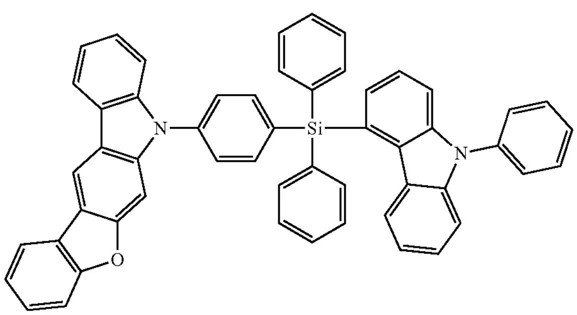
230
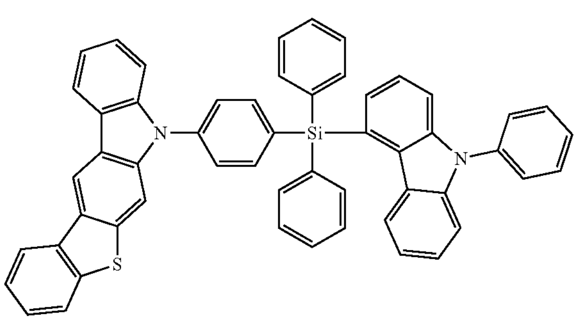
-continued
231
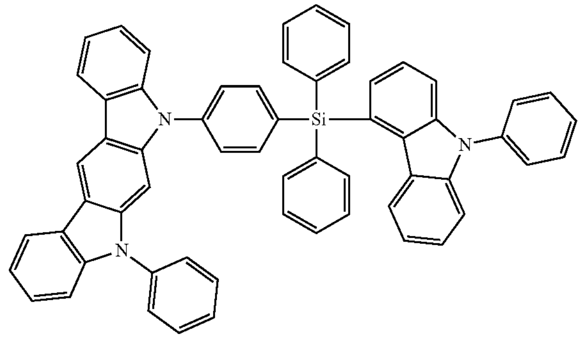
232
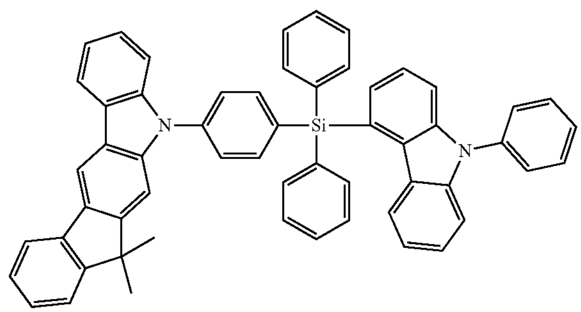
233
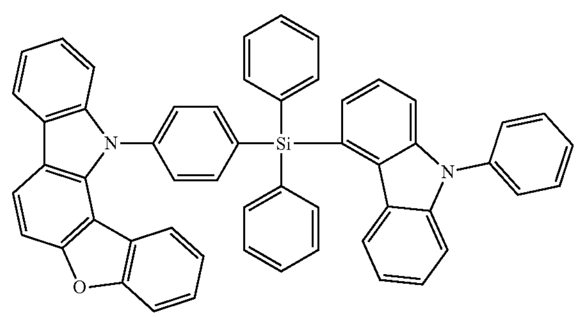
234
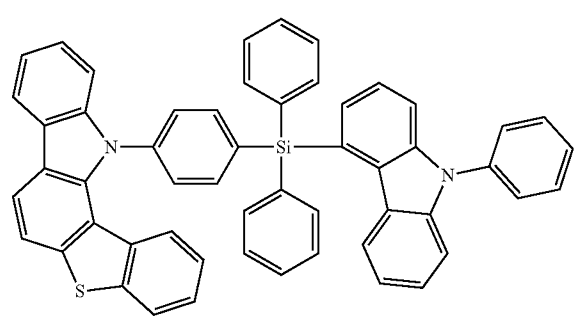

-continued
235
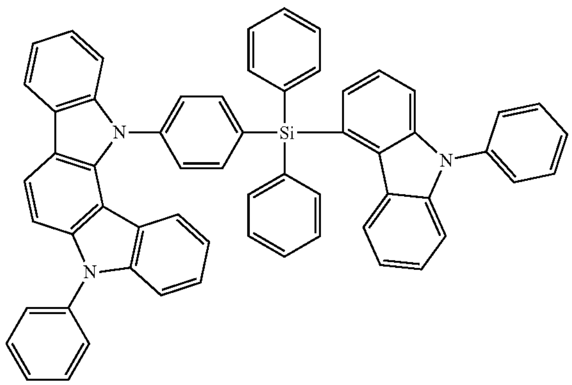
236
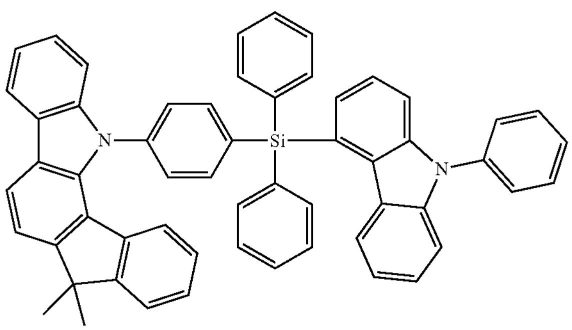
237
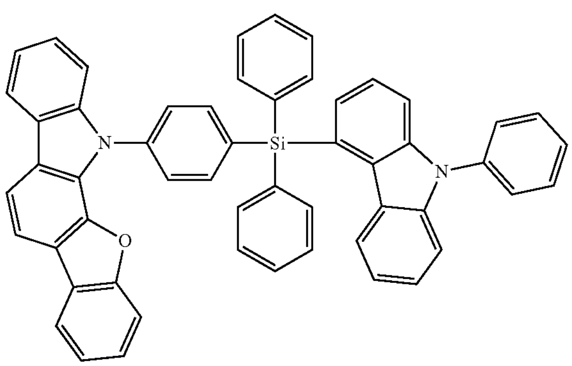
238
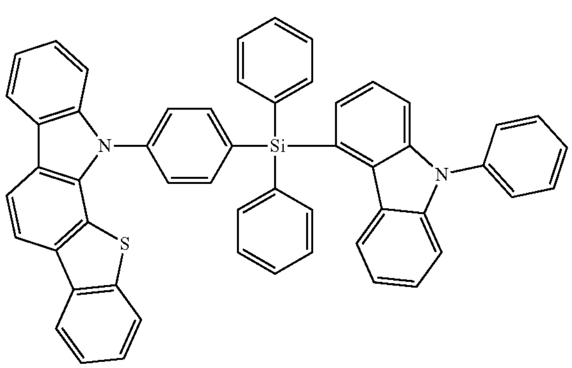
-continued
239
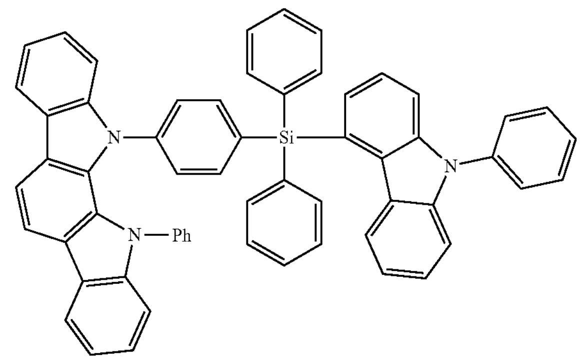
240
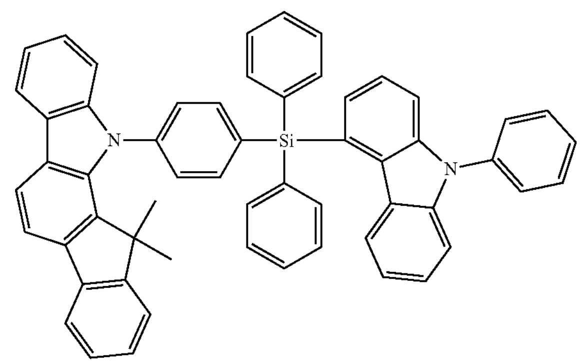
241
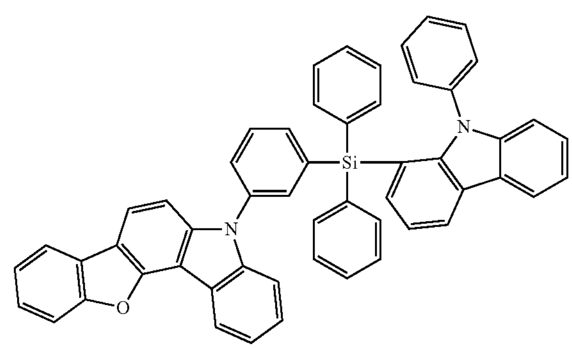
242
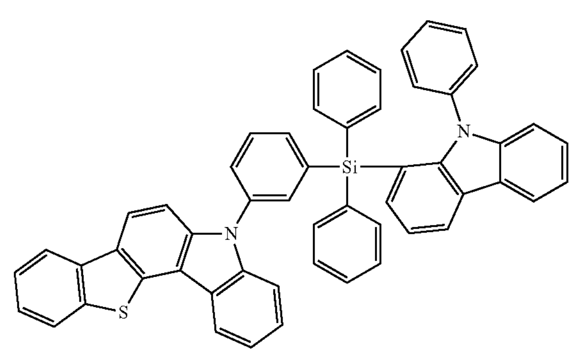

-continued
243
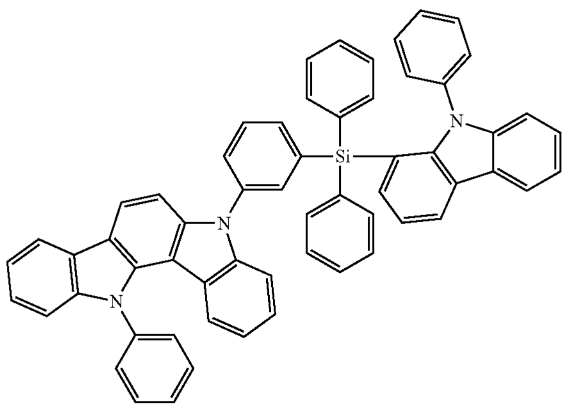
244
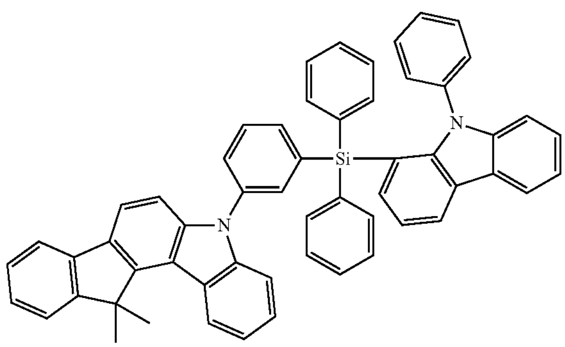
245
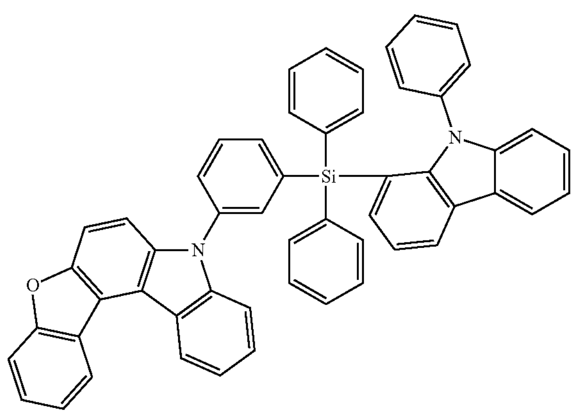
246
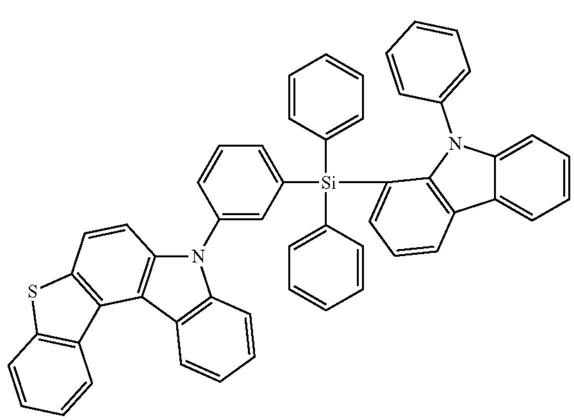
-continued
247
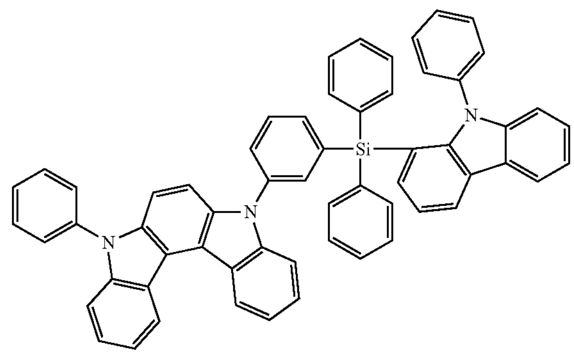
248
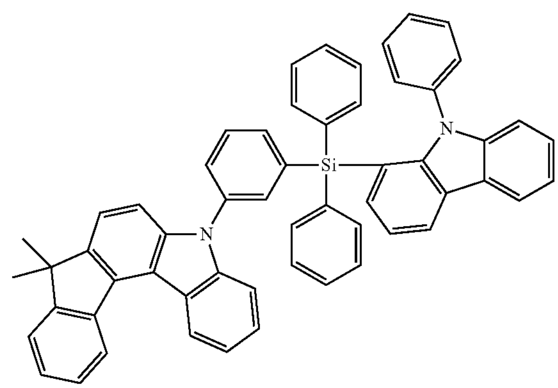
249
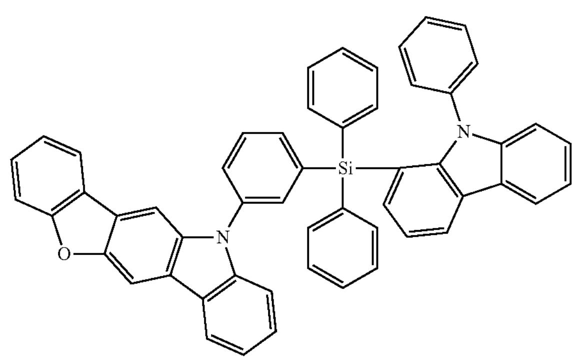
250
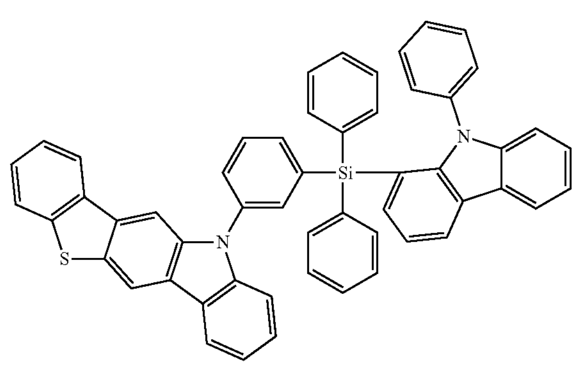

-continued
251
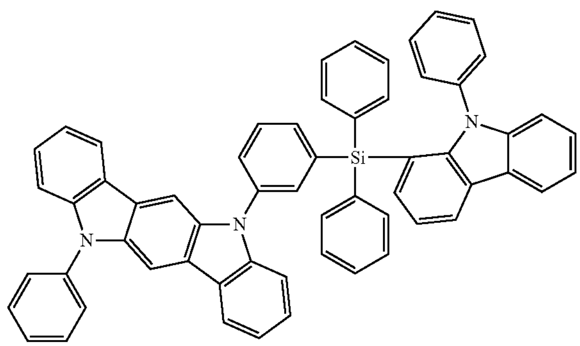
252
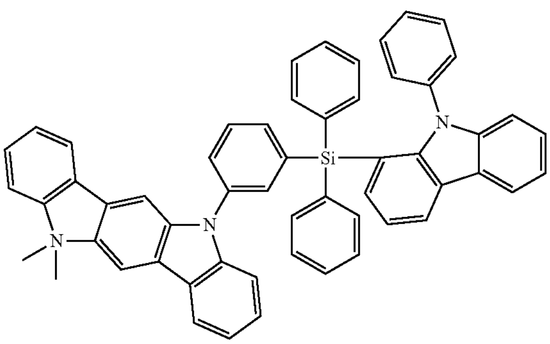
253
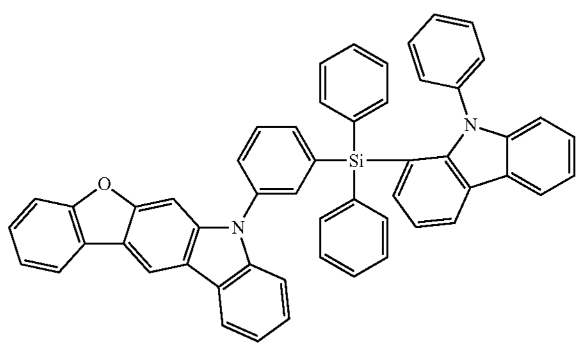
254
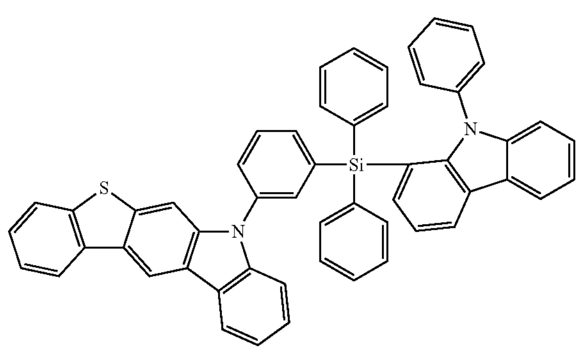
-continued
255
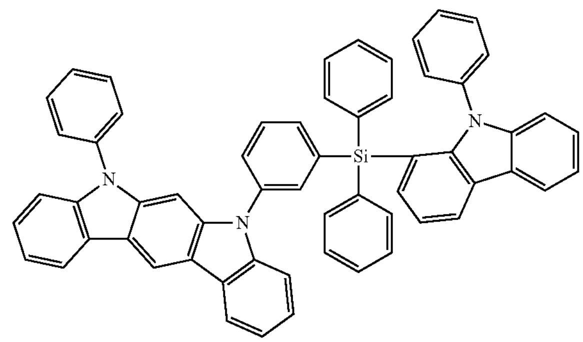
256
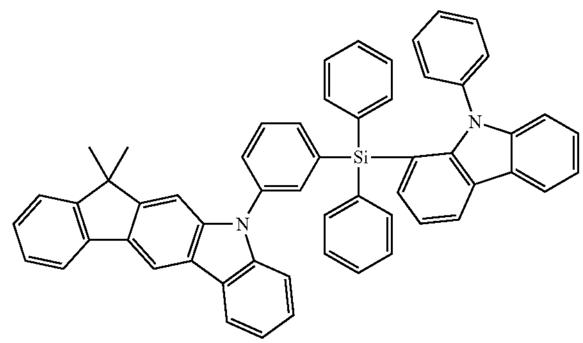
257
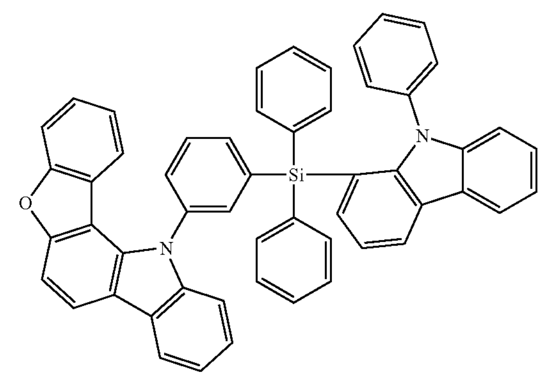
258
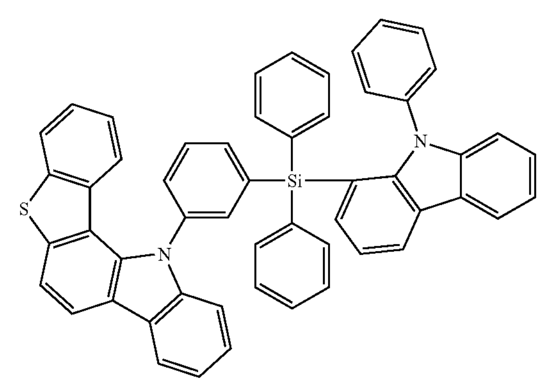

-continued
259
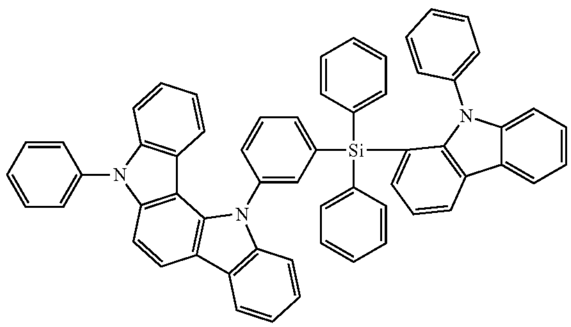
260
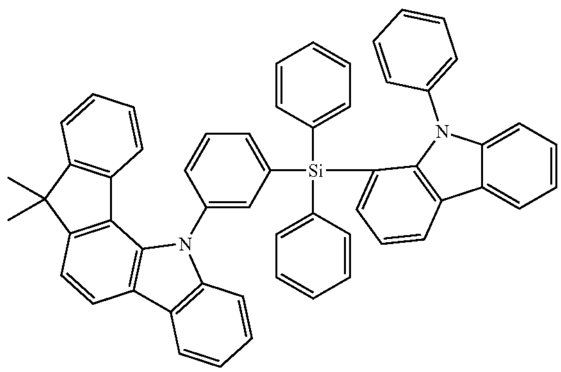
261
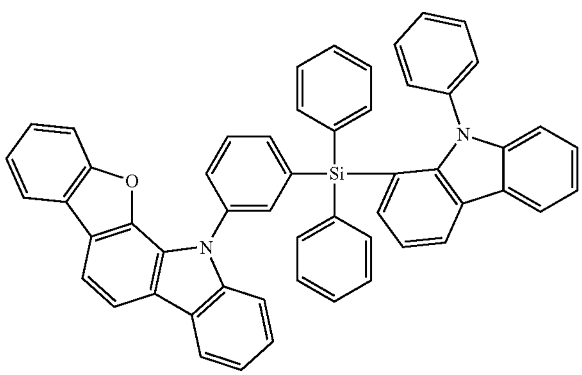
262
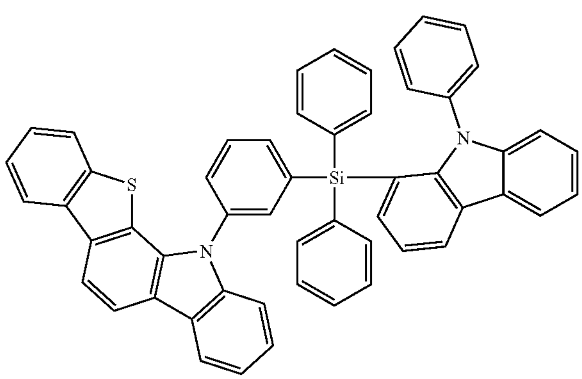
-continued
263
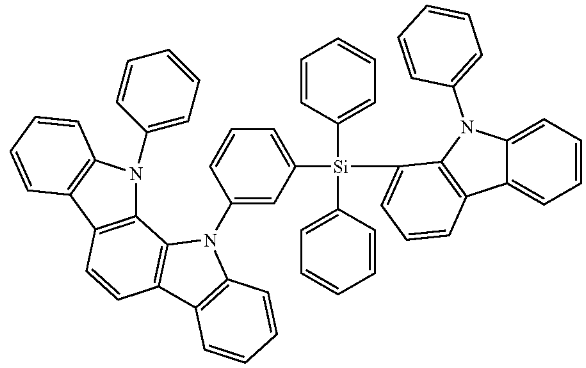
264
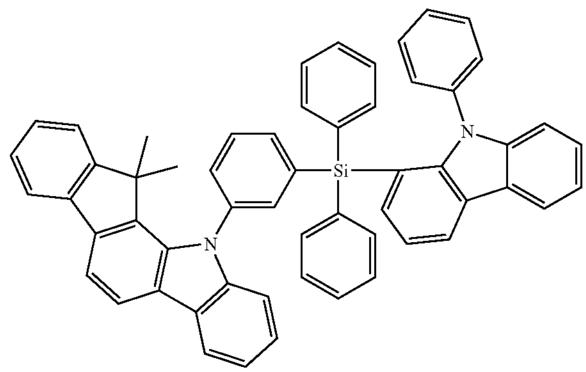
265
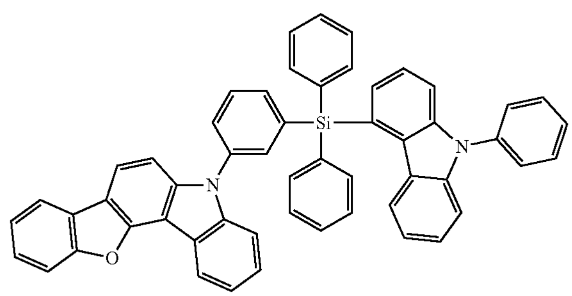
266
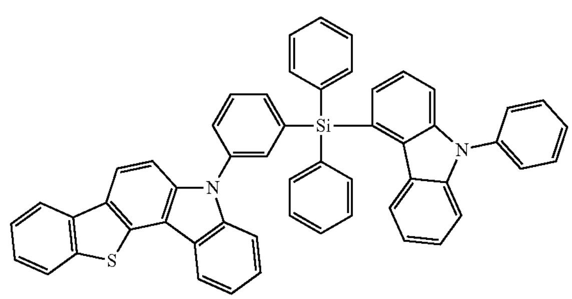

-continued
267
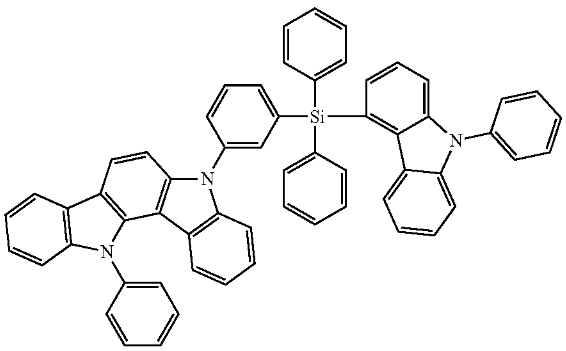
268
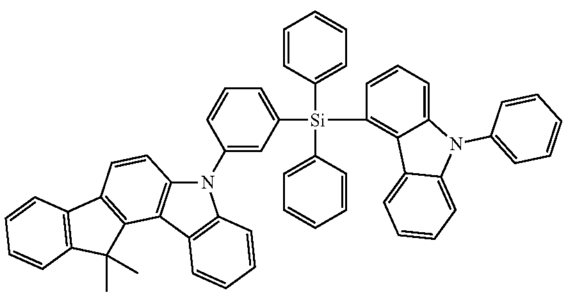
269
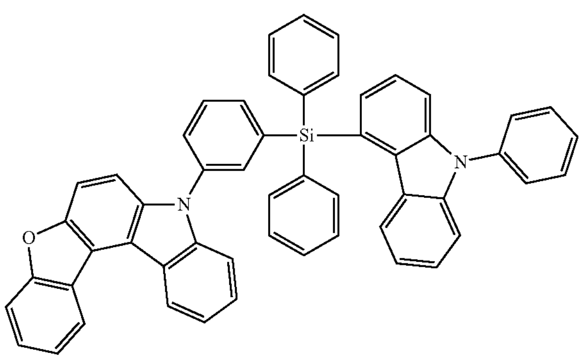
270
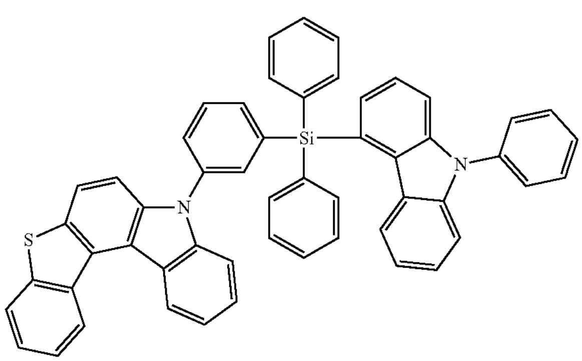
-continued
271
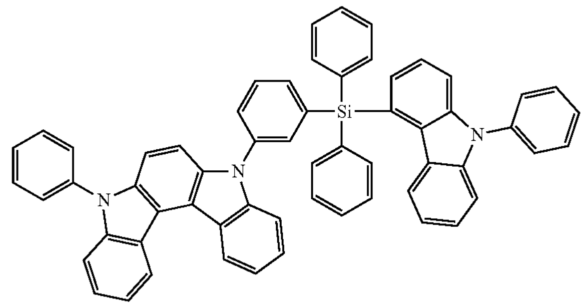
272
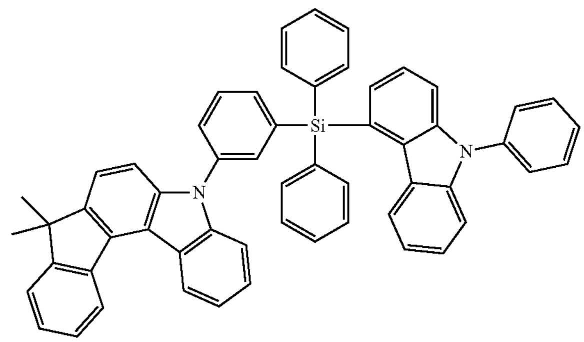
273
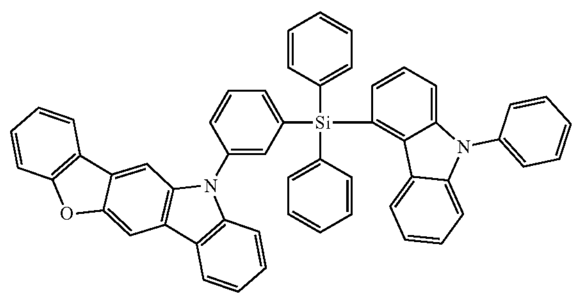
274
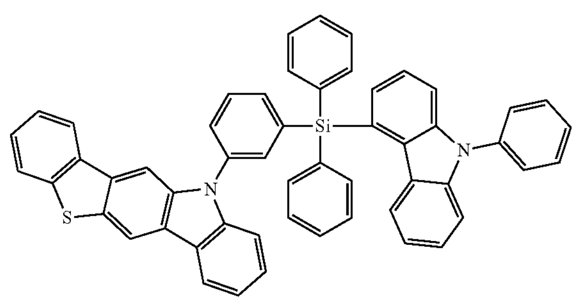
275
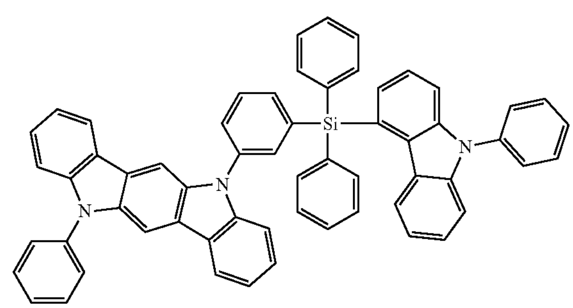

-continued
276
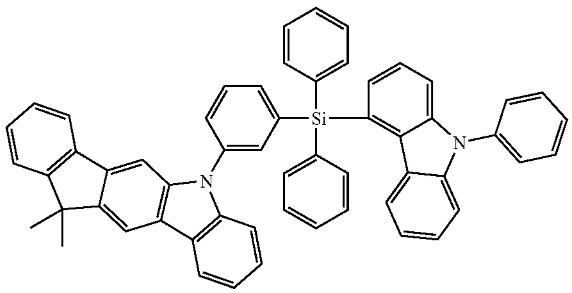
277
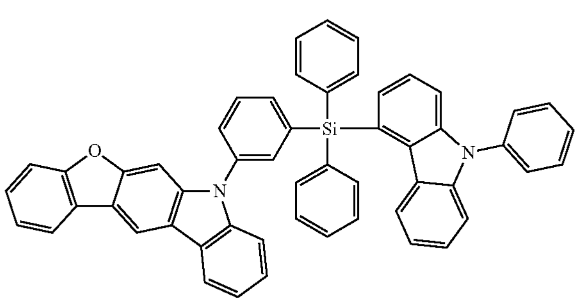
278
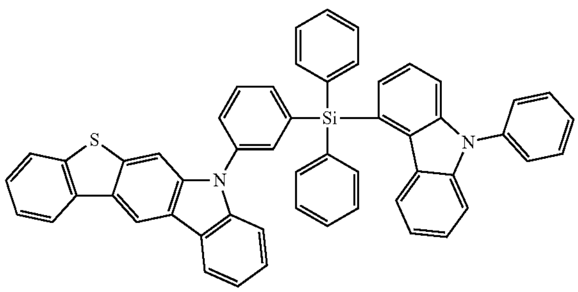
279
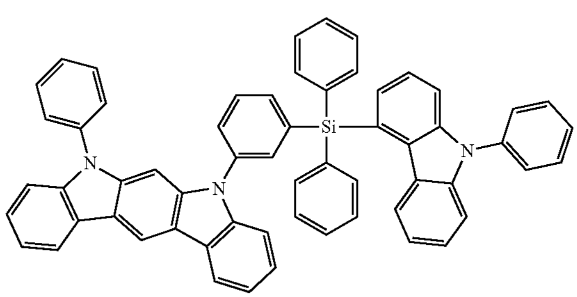
280
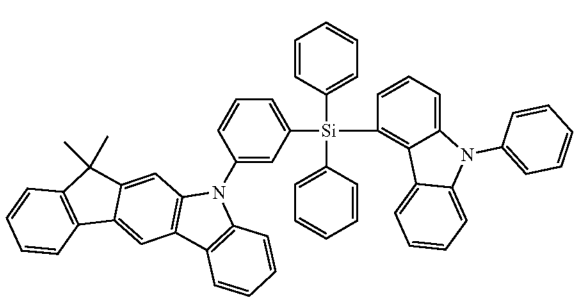
-continued
281
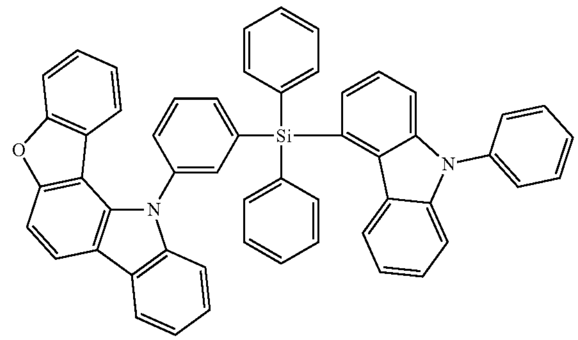
282
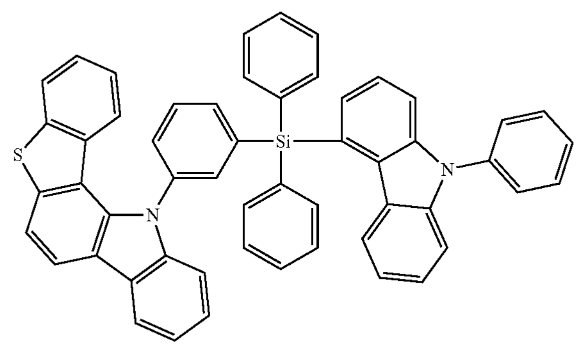
283
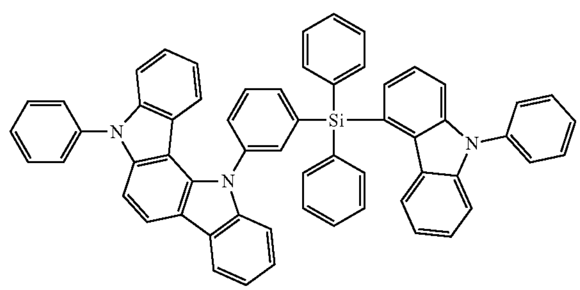
284
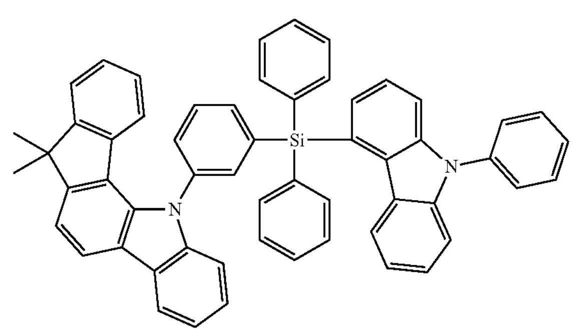

285
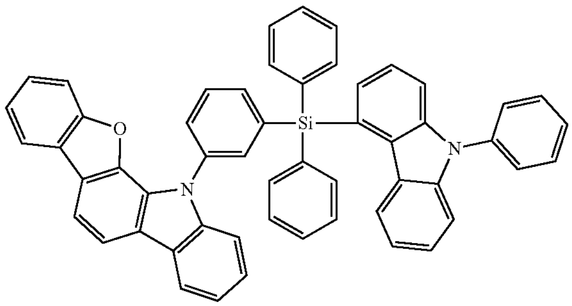
286
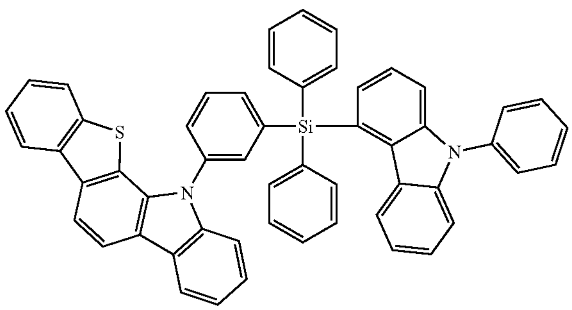
287
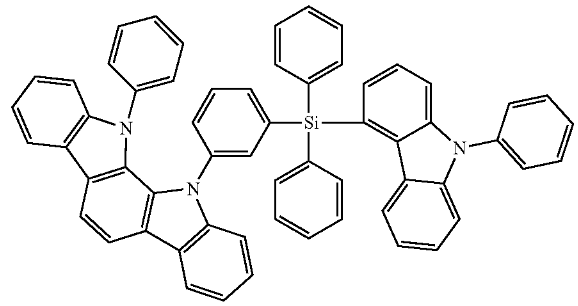
288
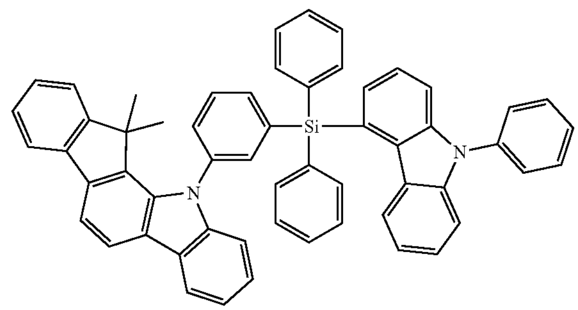
289
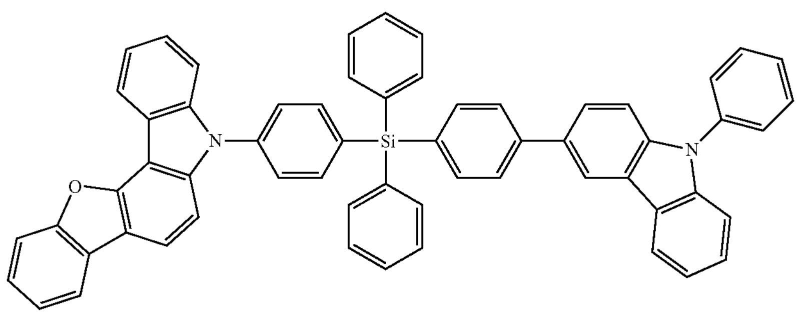
290
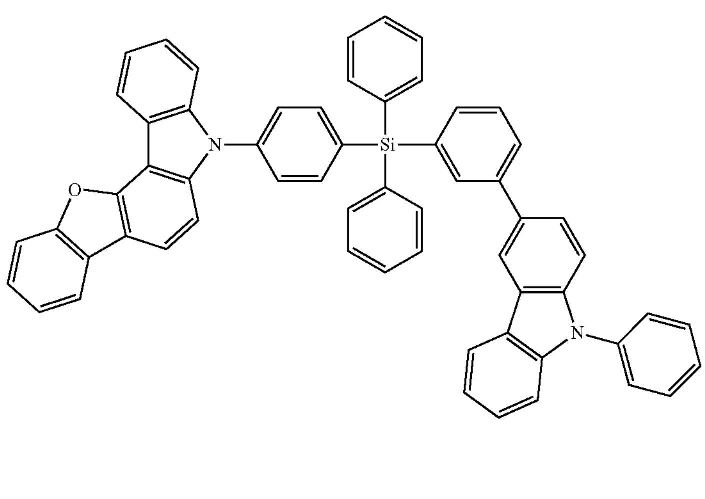

-continued
291
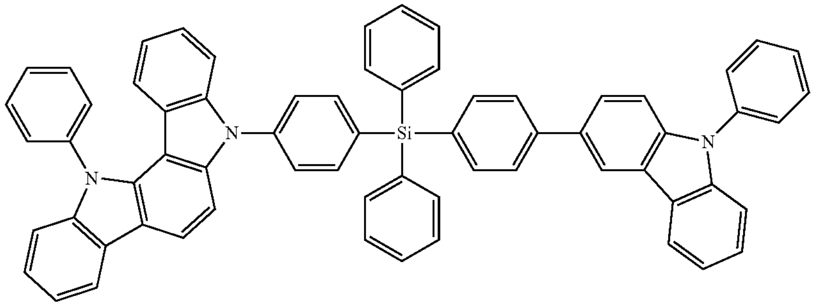
292
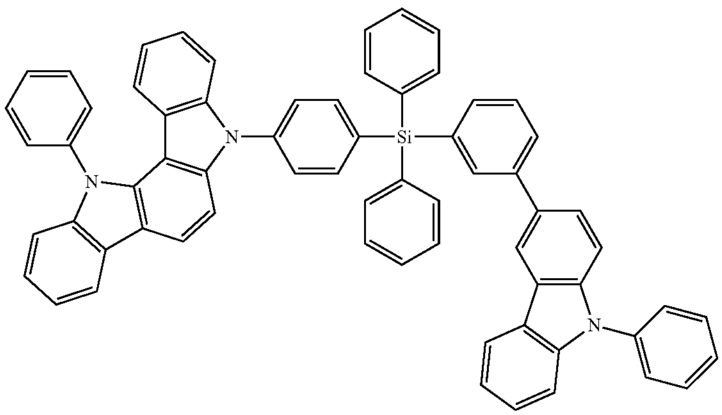
293
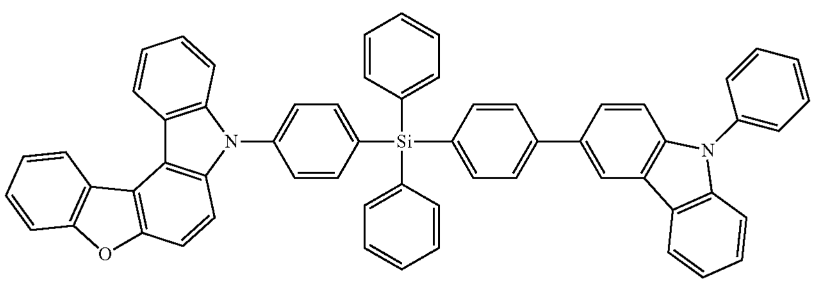
294
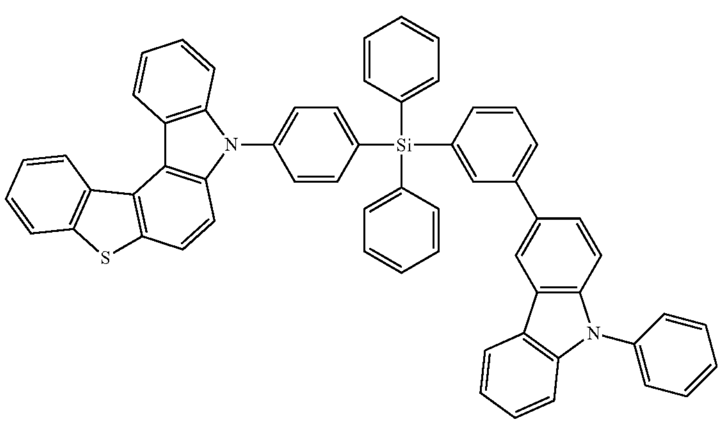

-continued
295
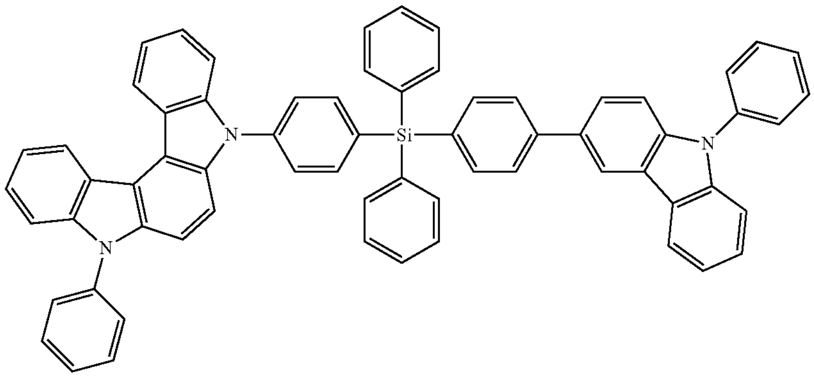
296
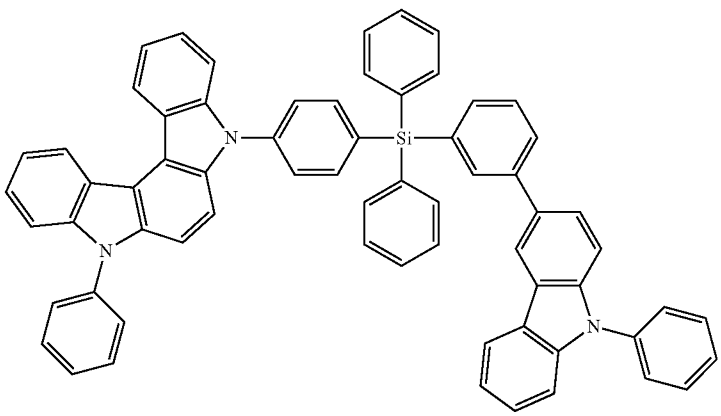
297
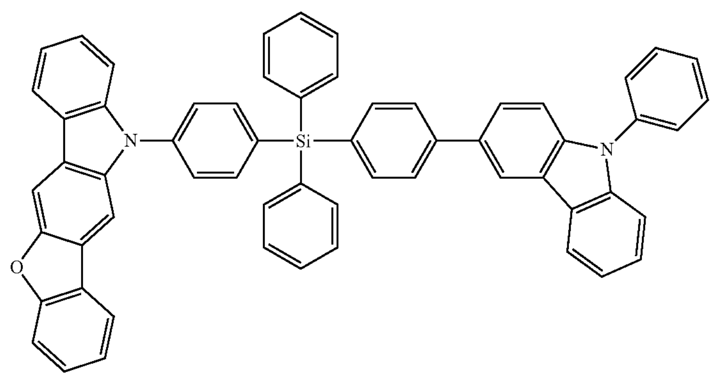
298
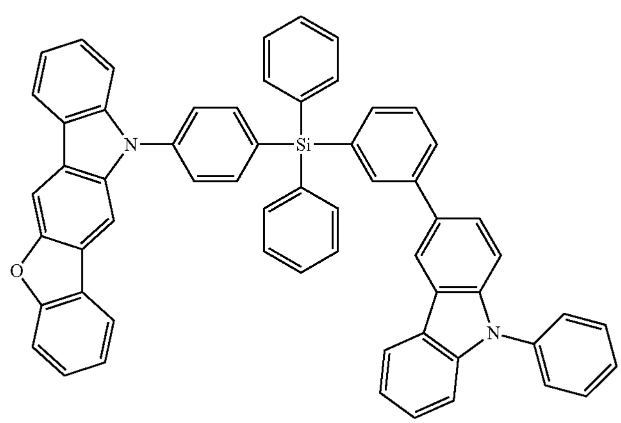

-continued
299
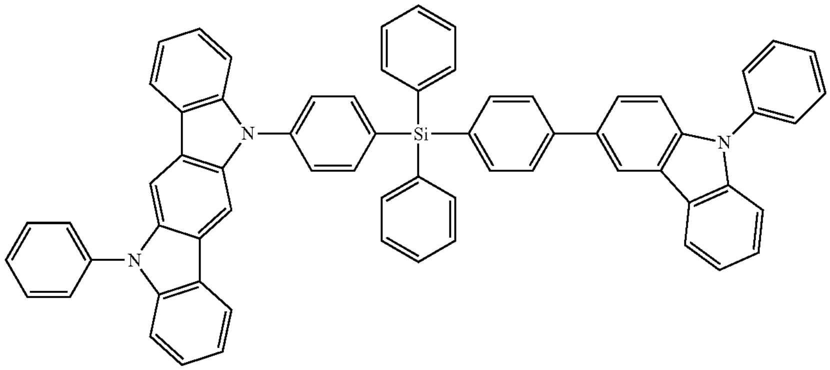
300
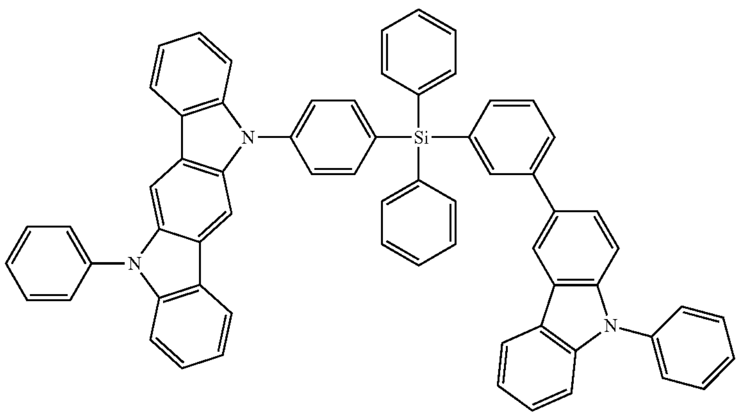
301
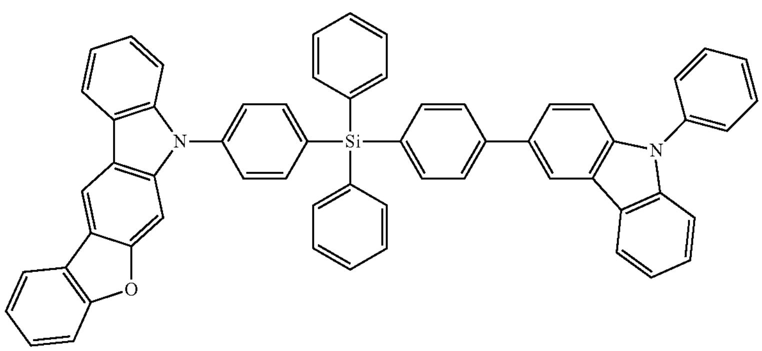
302
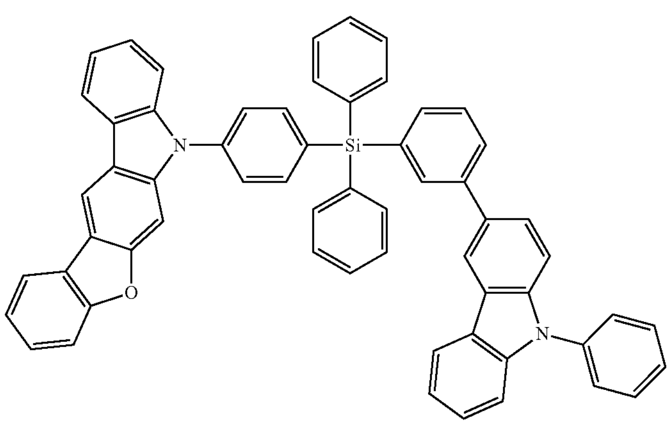

-continued
303
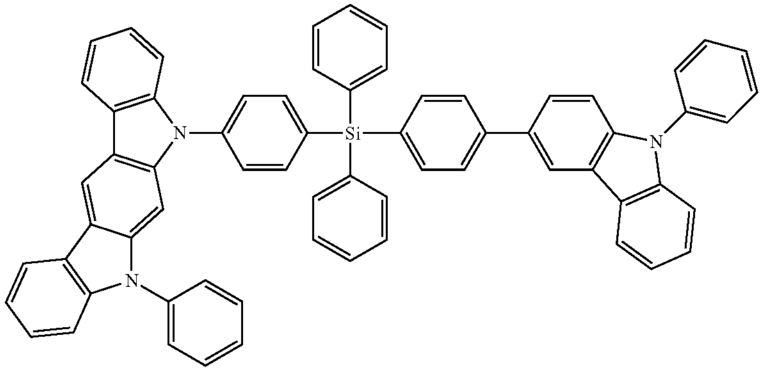
304
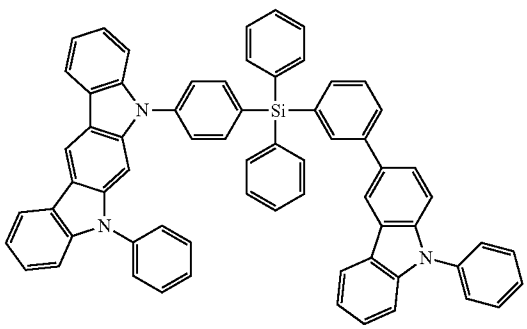
305
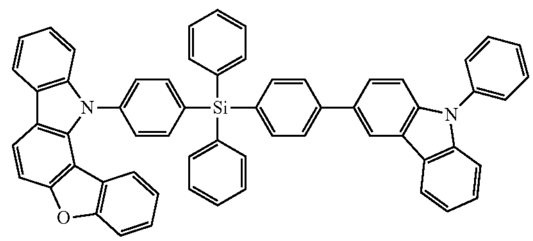
306
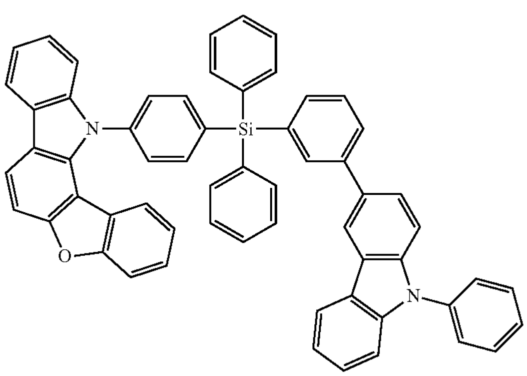
307
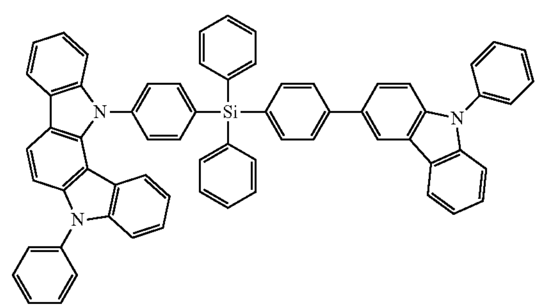
308
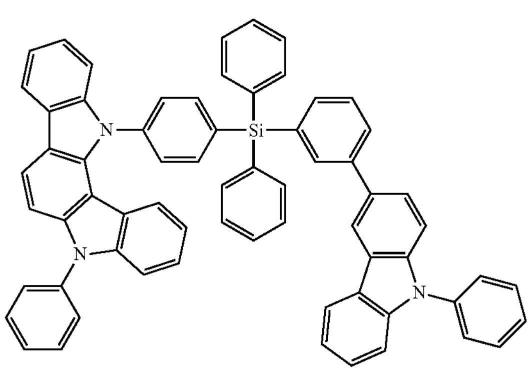
309
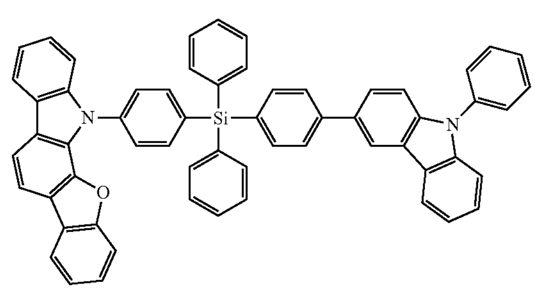

-continued
310
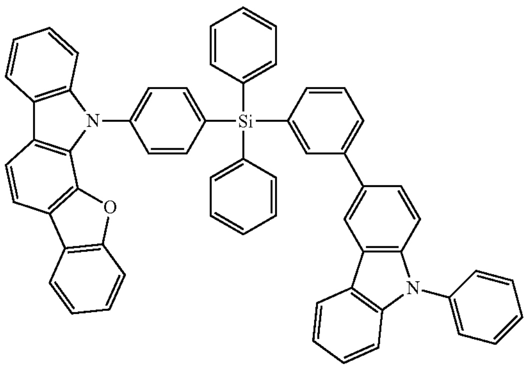
311
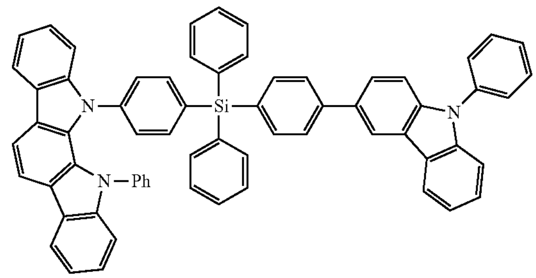
312
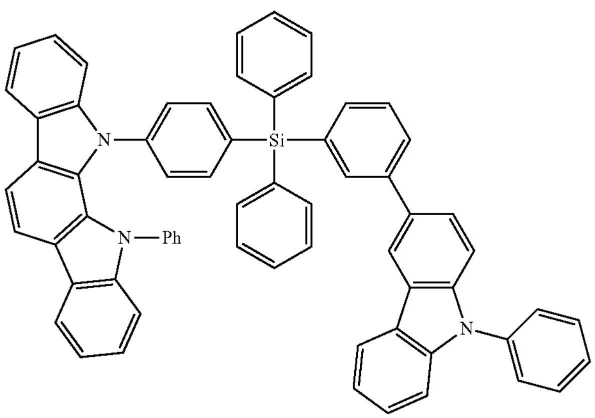
313
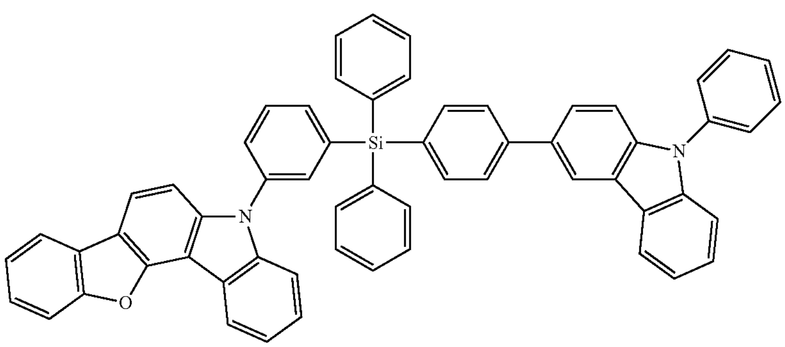
314
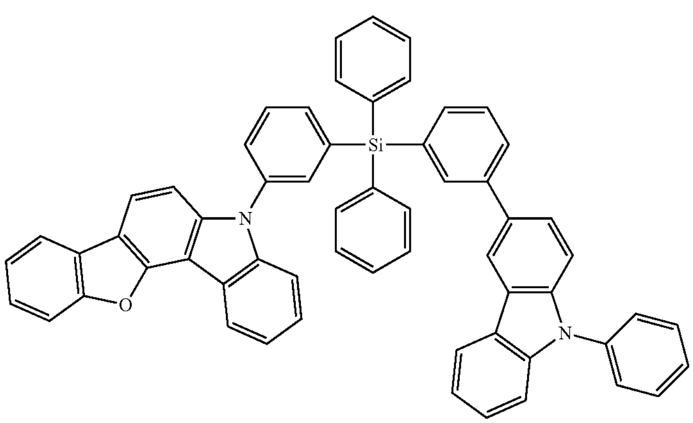

-continued
315
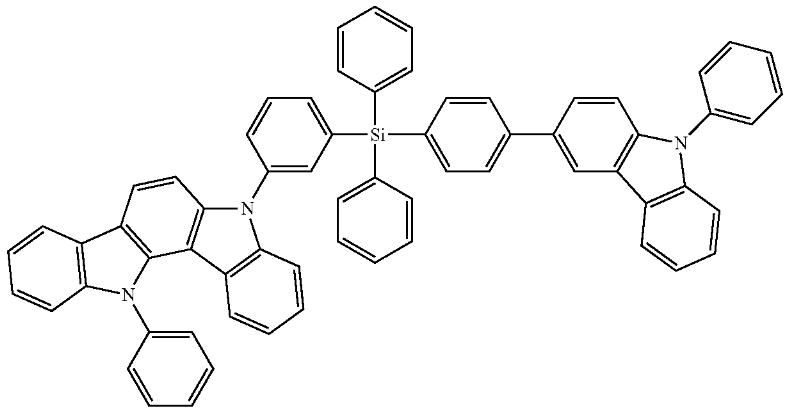
316
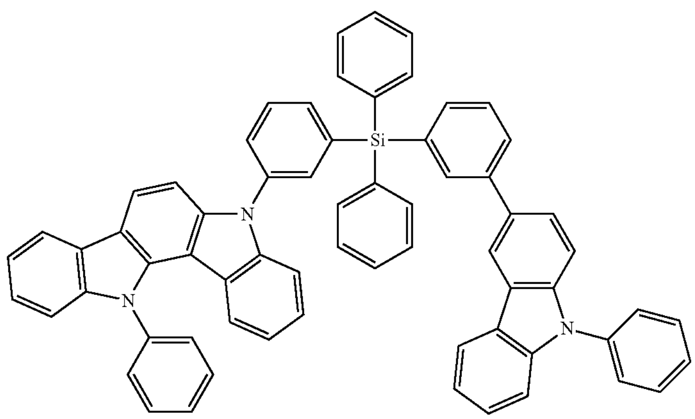
317
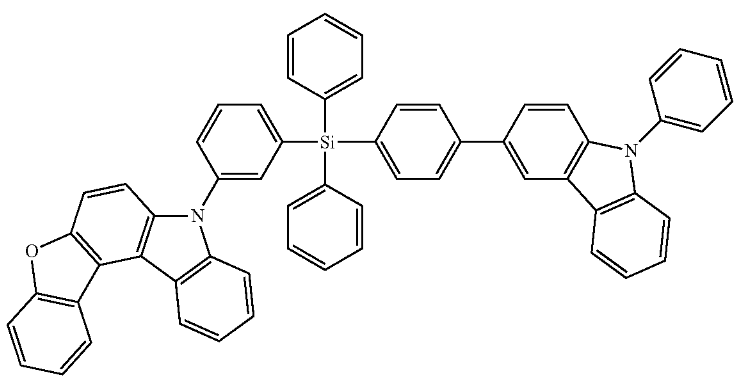
318
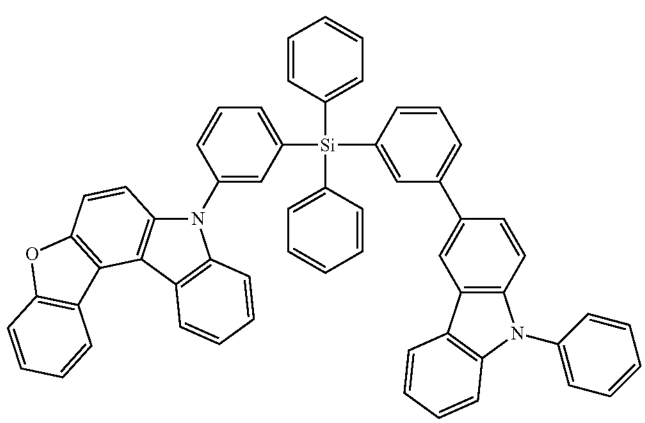

-continued
319
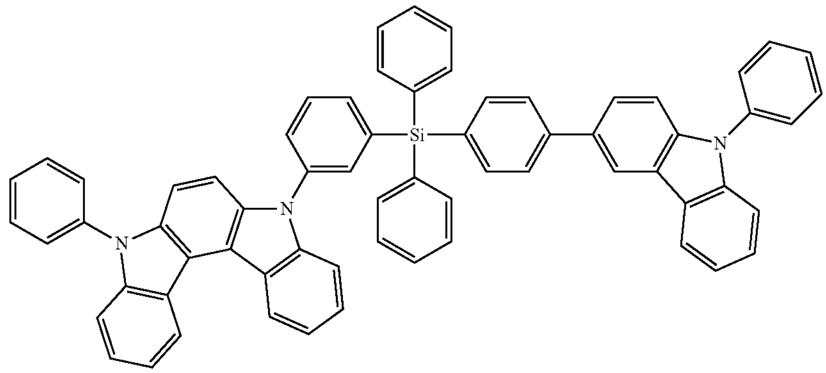
320
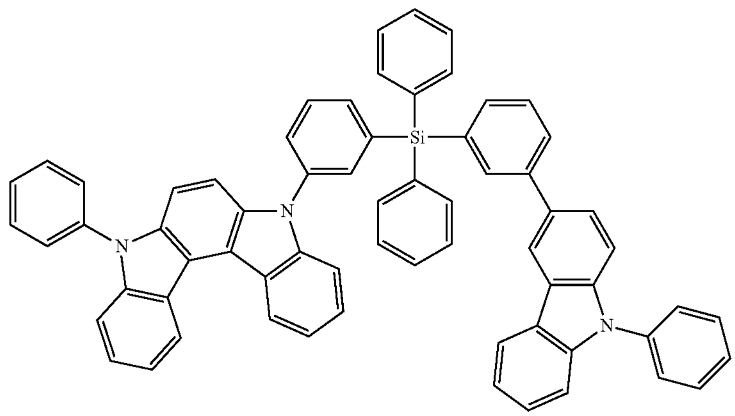
321
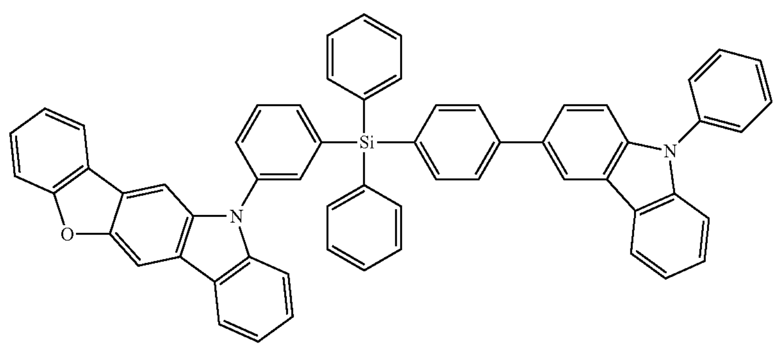
322
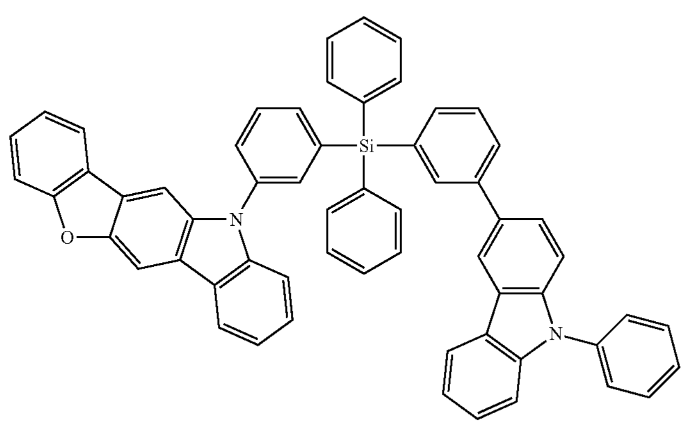

-continued
323
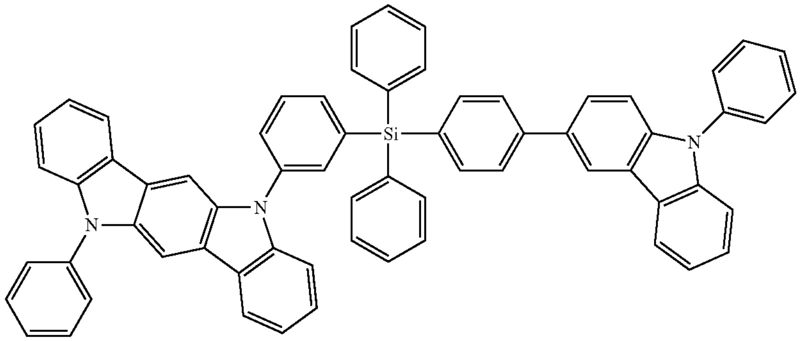
324
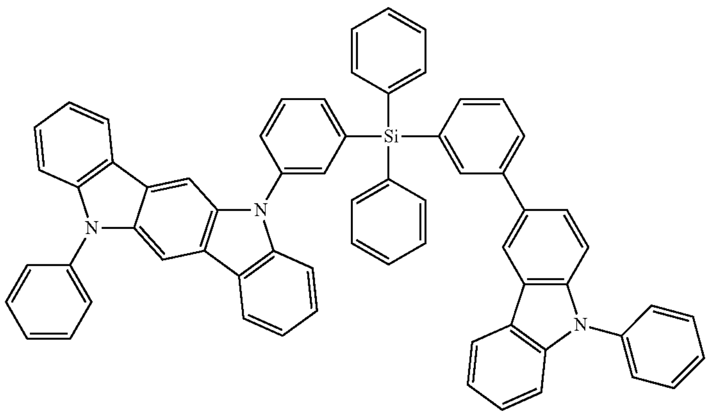
325
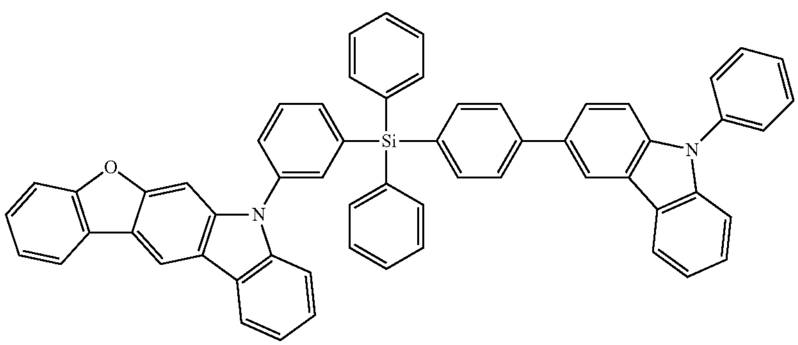
326
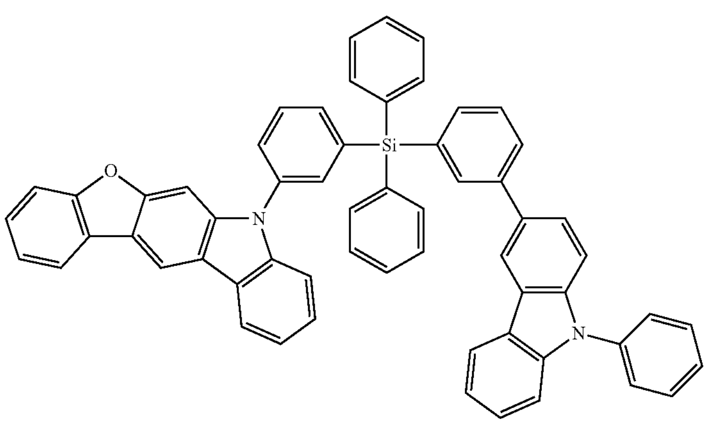

-continued
327
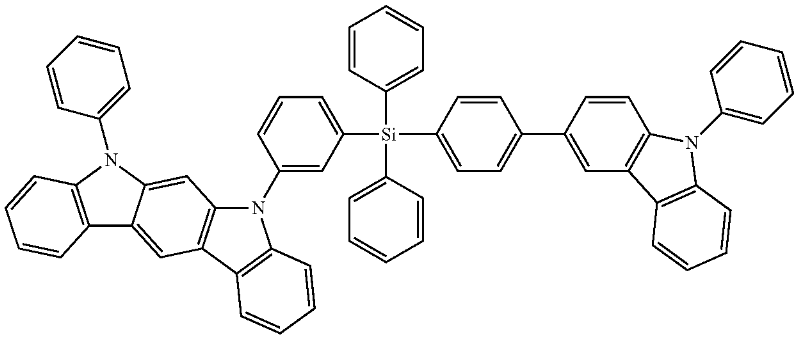
328
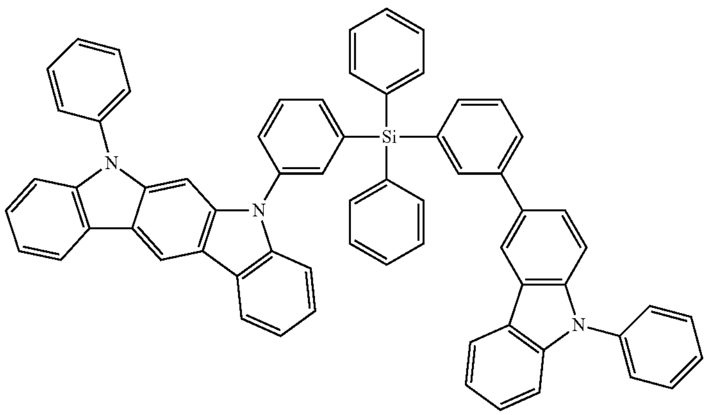
329
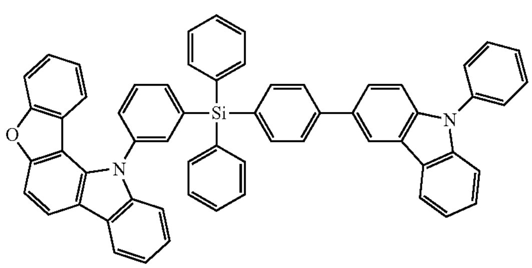
330
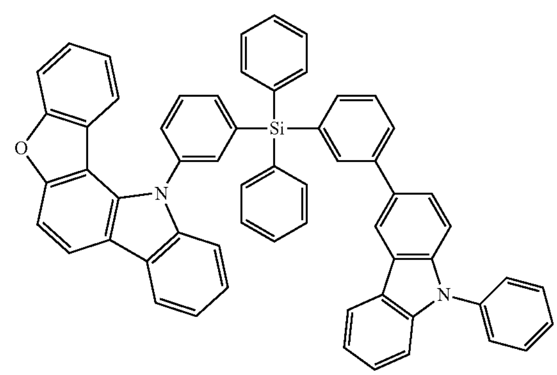
331
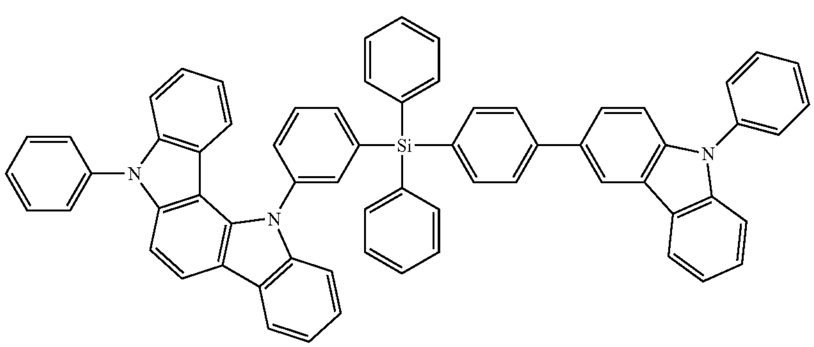

-continued
332
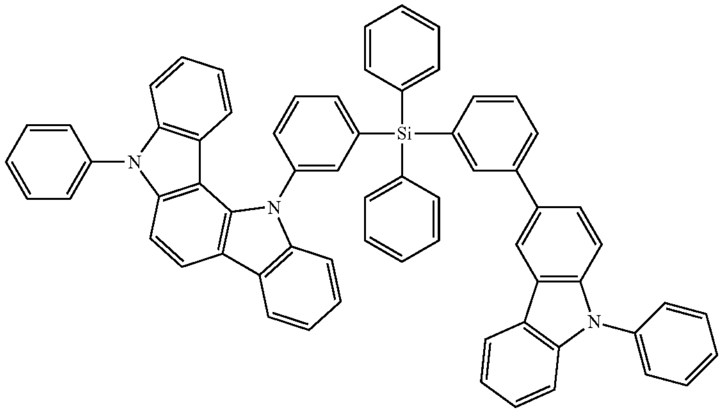
333
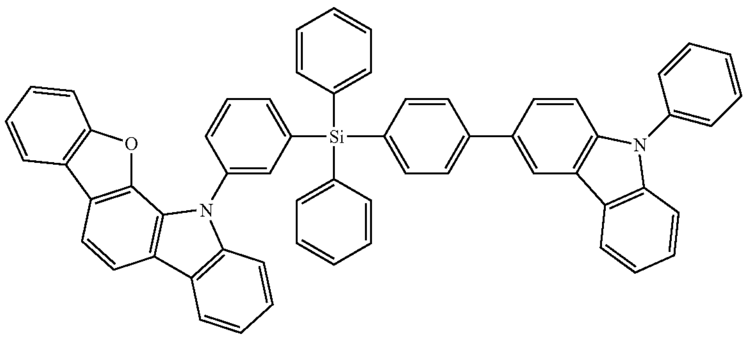
334
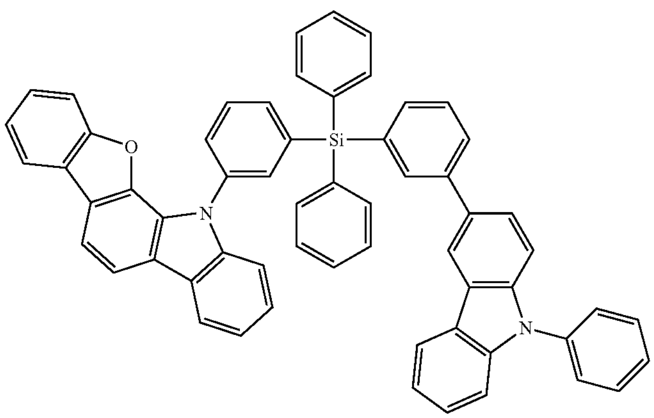
335
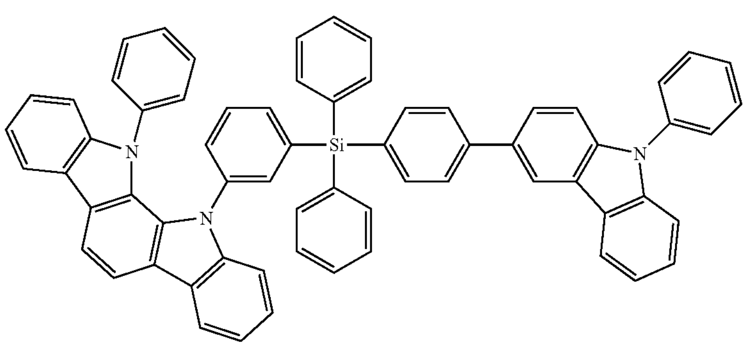

-continued
336
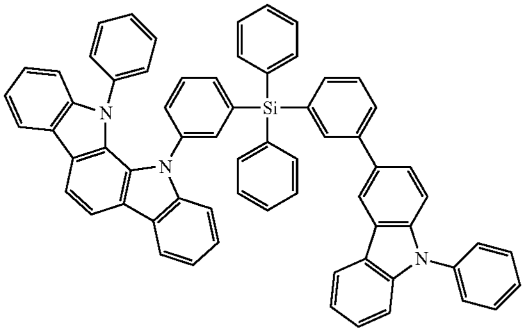
337
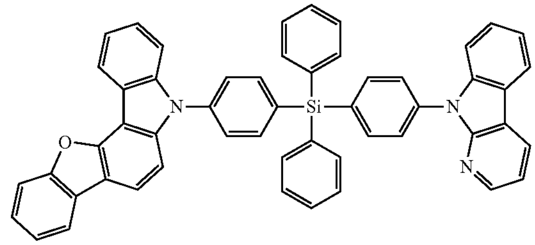
338
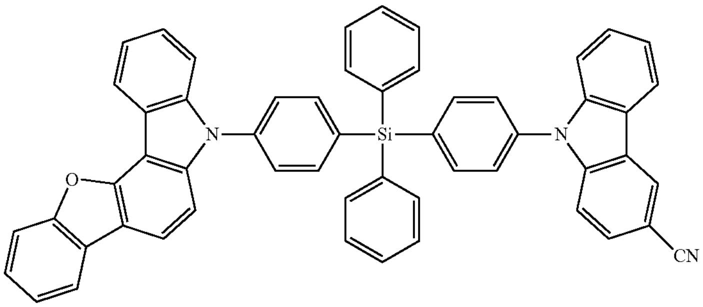
339
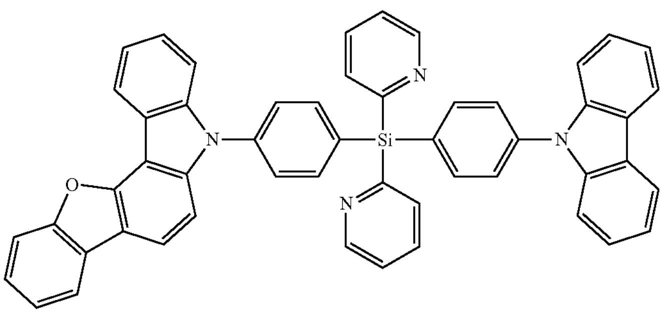
340
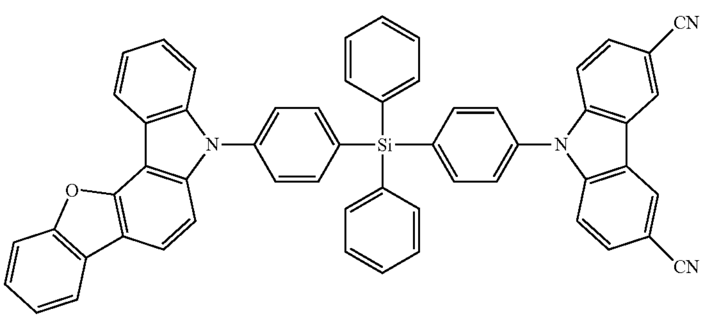
341
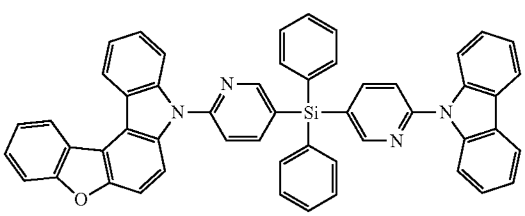
342
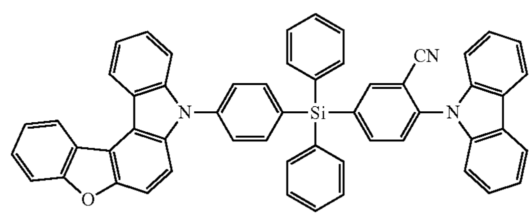

-continued
343
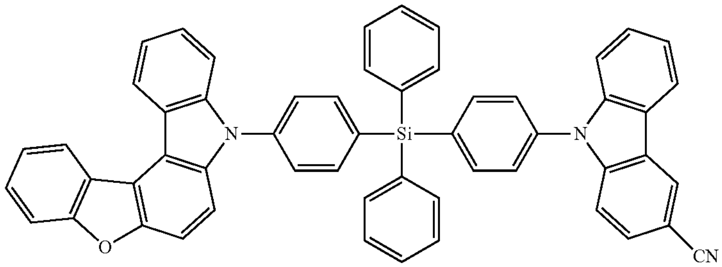
344
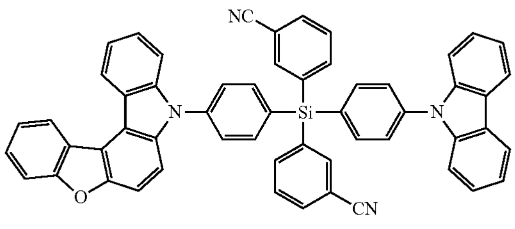
345
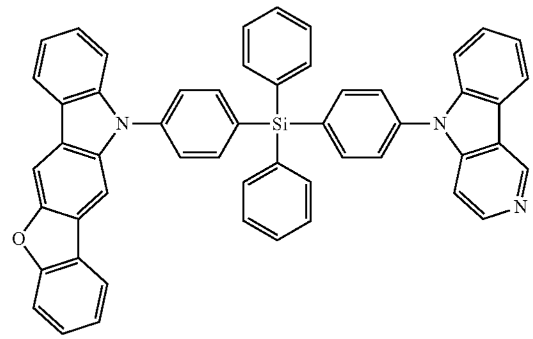
346
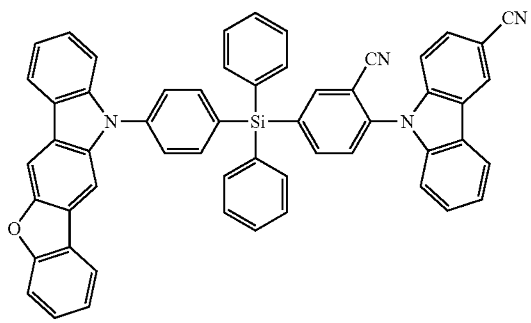
347
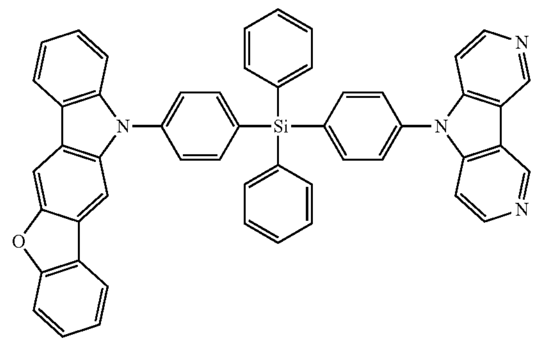
348
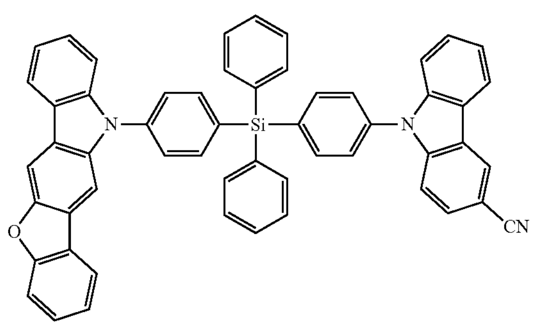
349
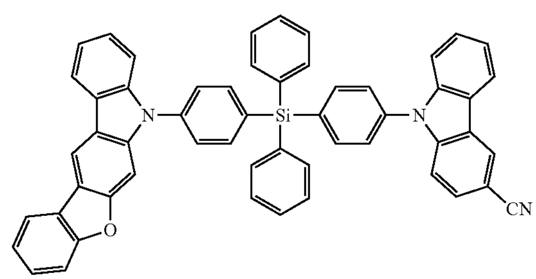
350
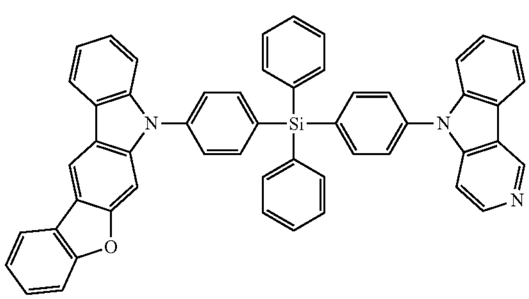
351
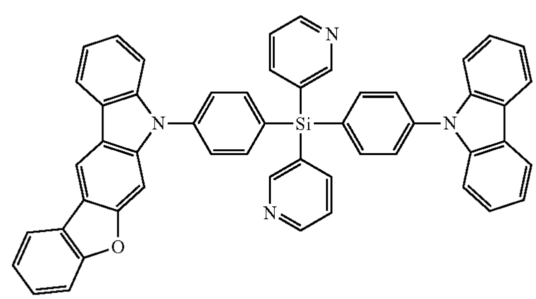

-continued
352
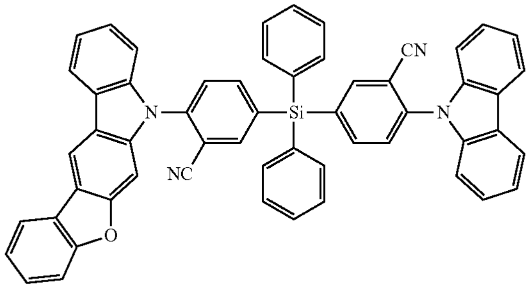
353
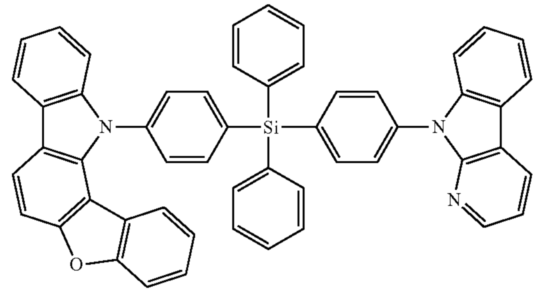
354
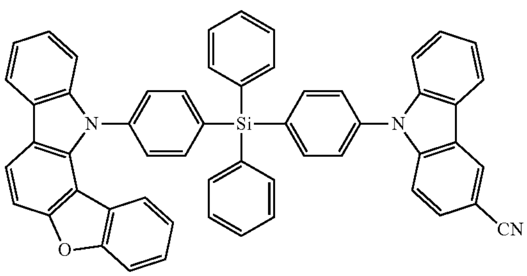
355
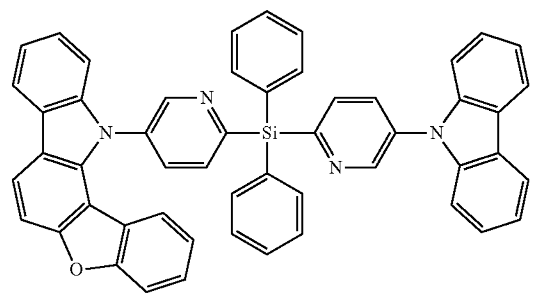
356
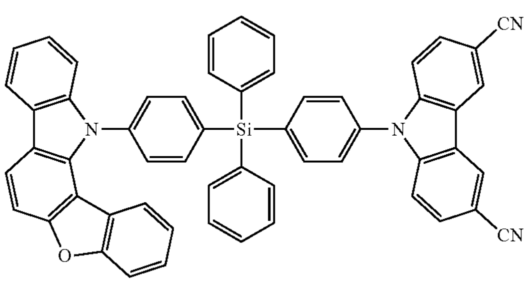
357
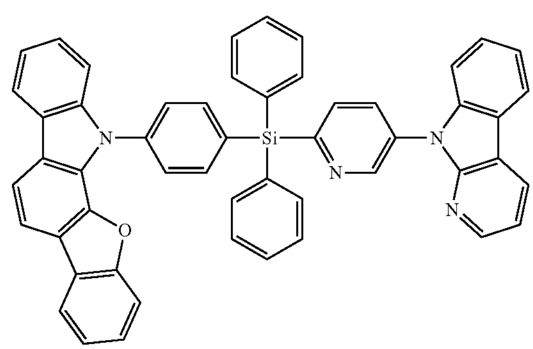
358
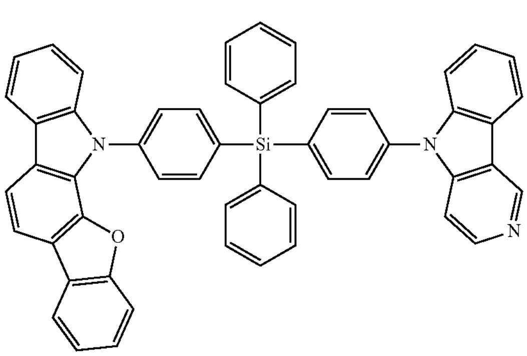
359
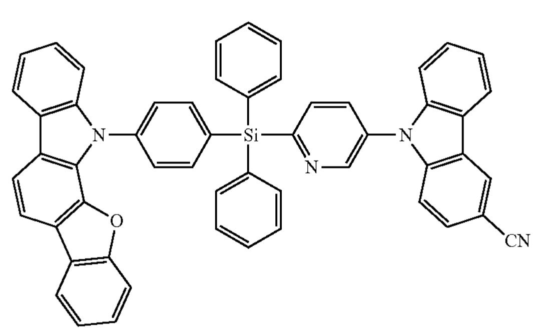

-continued
360
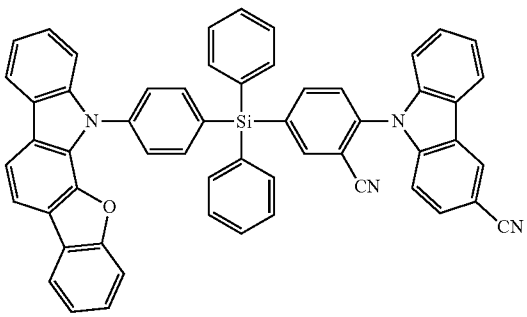
361
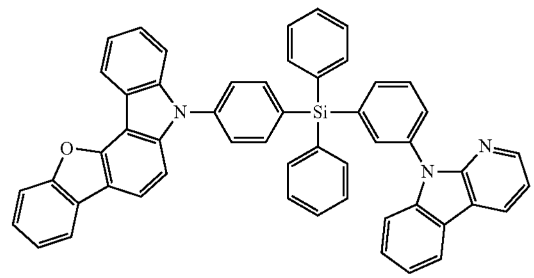
362
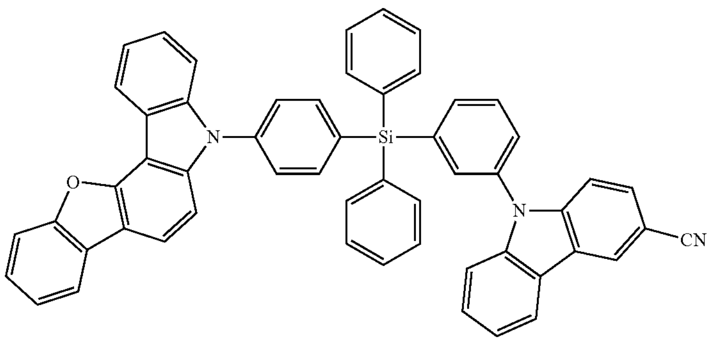
363
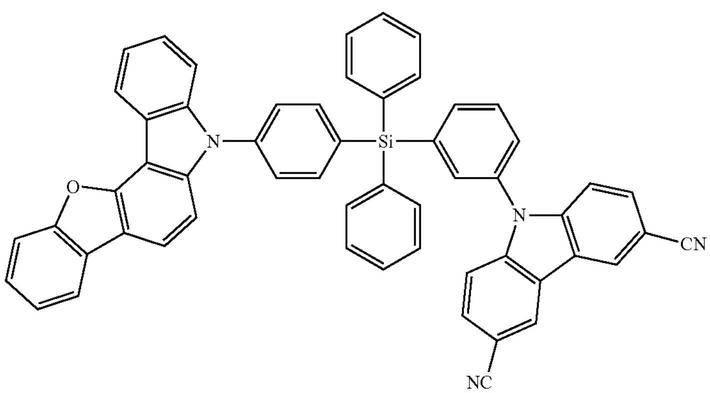
364
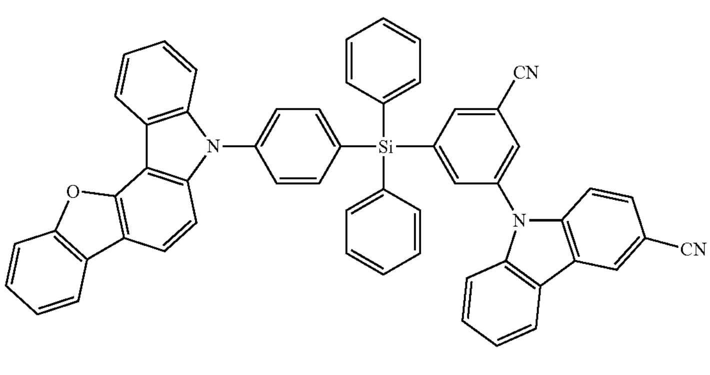

-continued
365
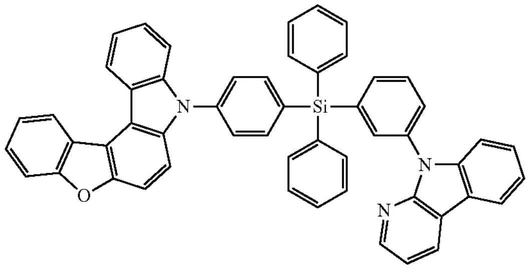
366
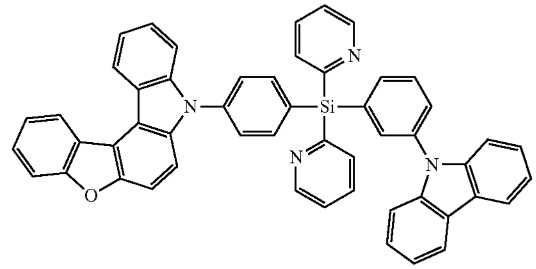
367
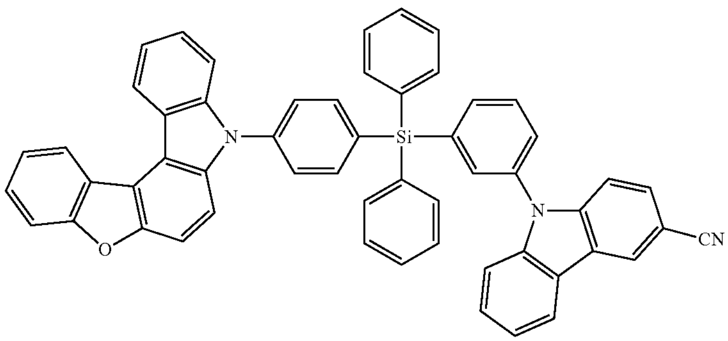
368
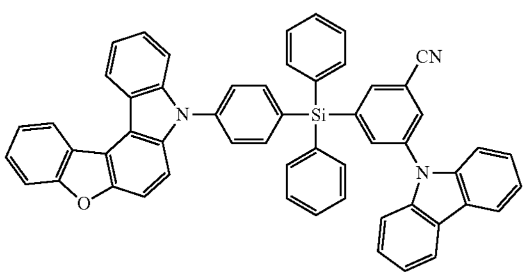
369
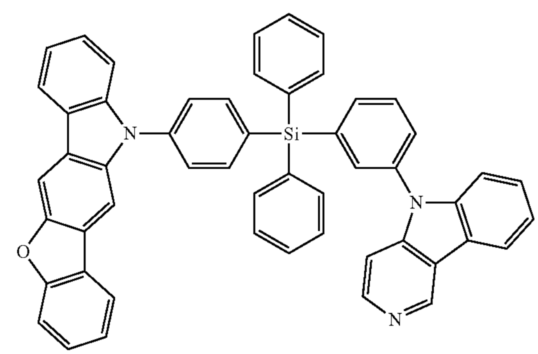
370
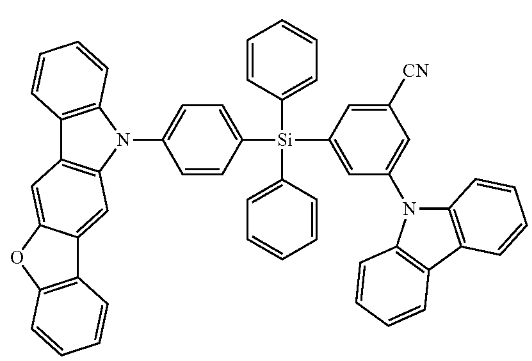
371
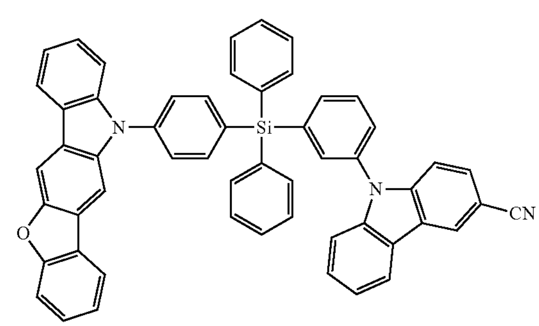

-continued
372
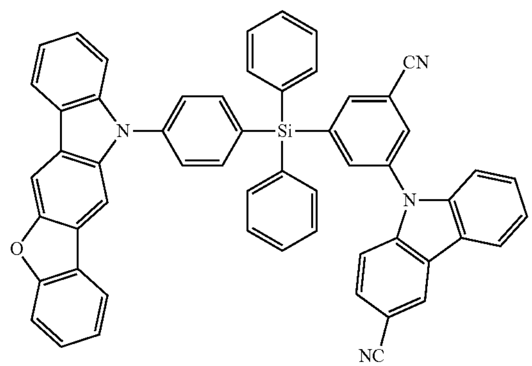
373
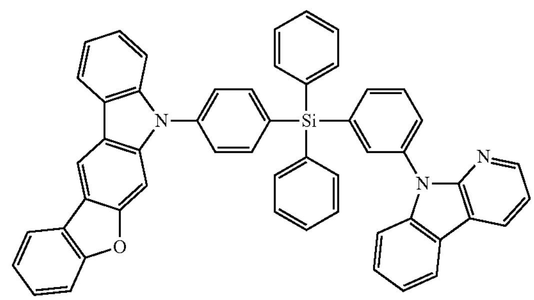
374
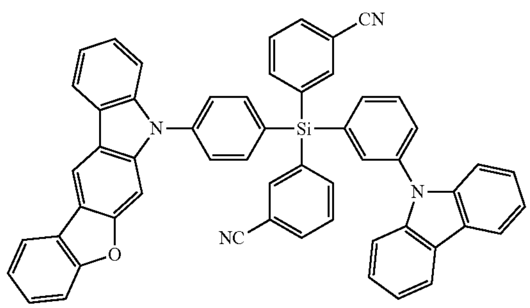
375
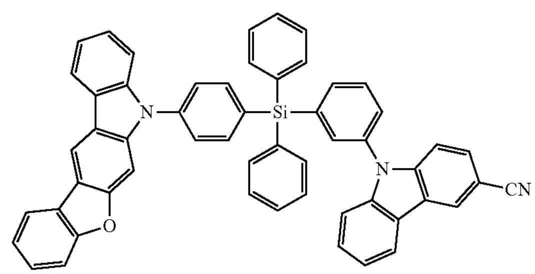
376
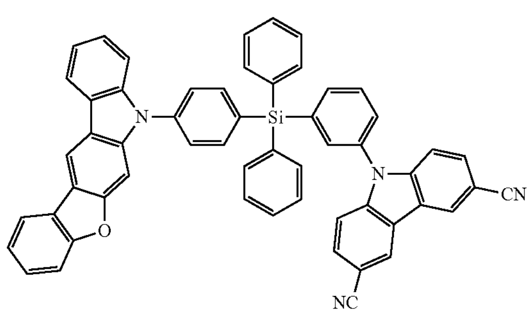
377
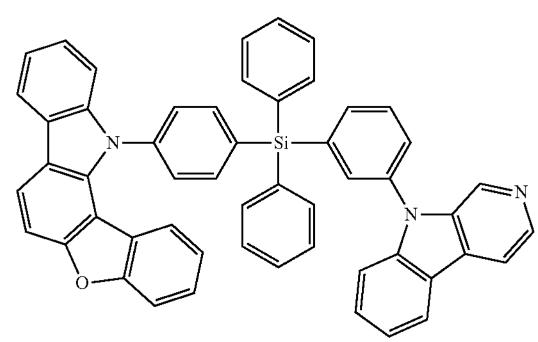
378
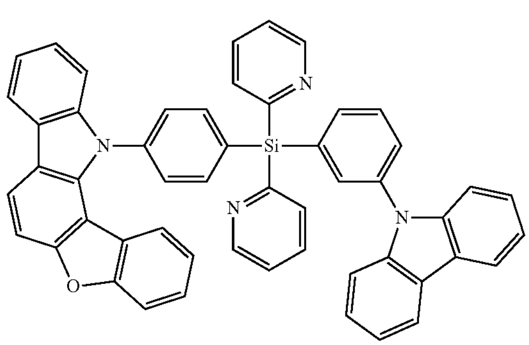
379
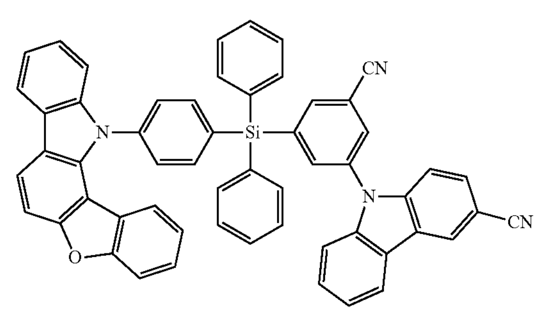

-continued
380
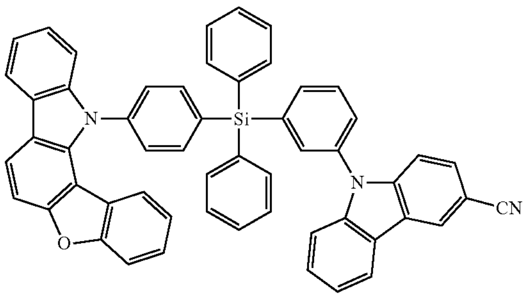
381
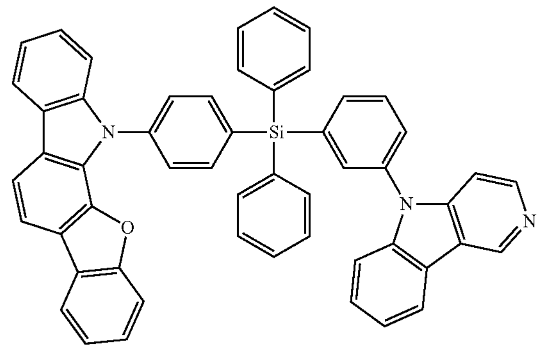
382
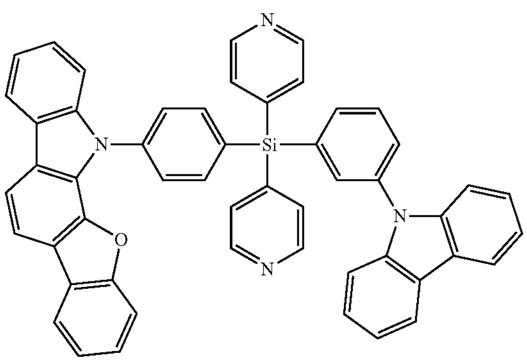
383
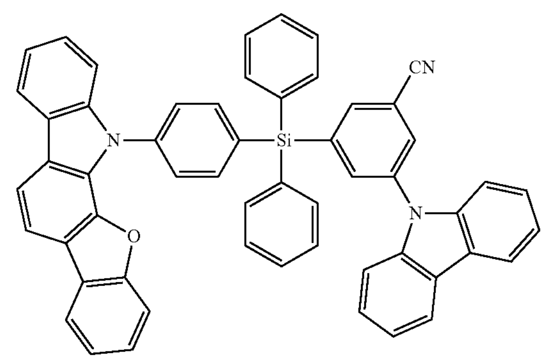
384
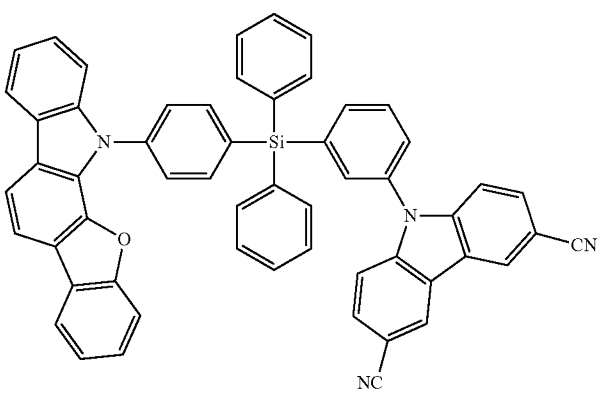
385
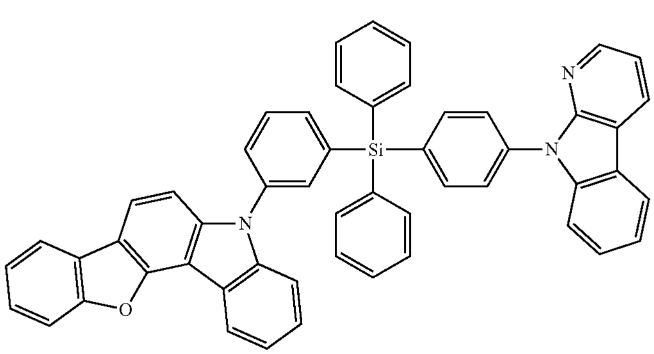

-continued
386
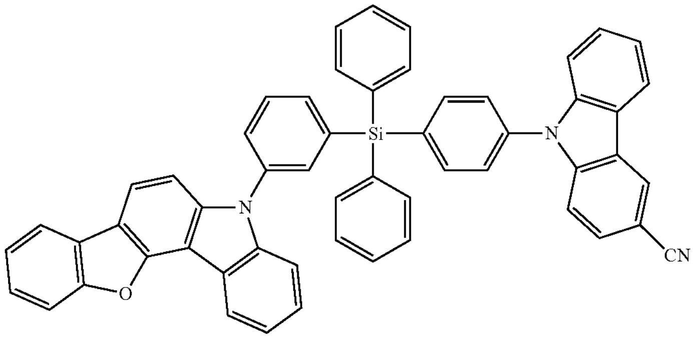
387
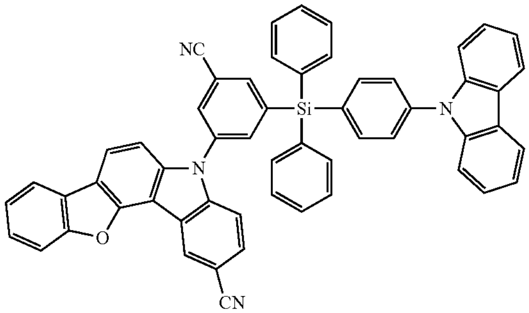
388
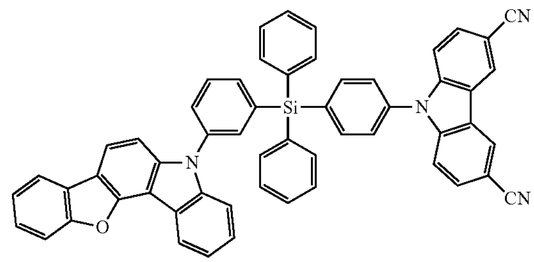
389
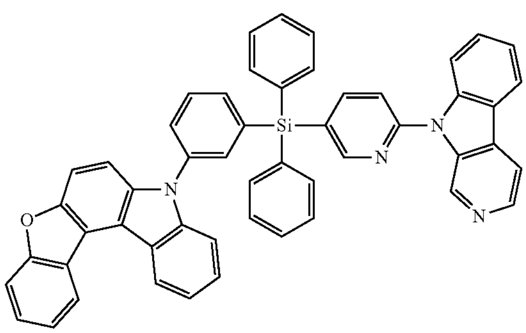
390
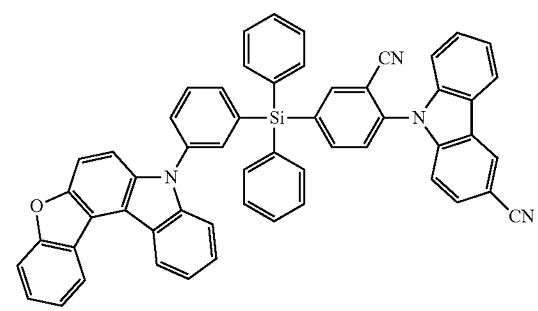
391
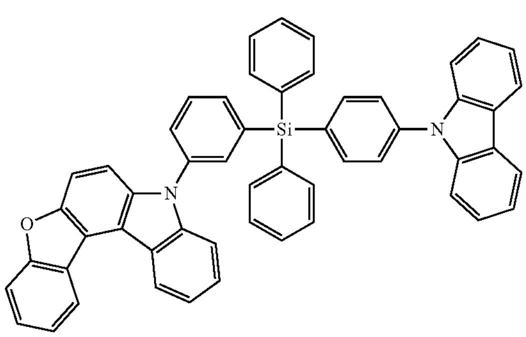
392
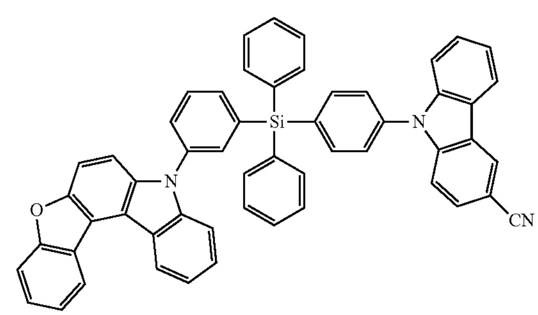

-continued
393
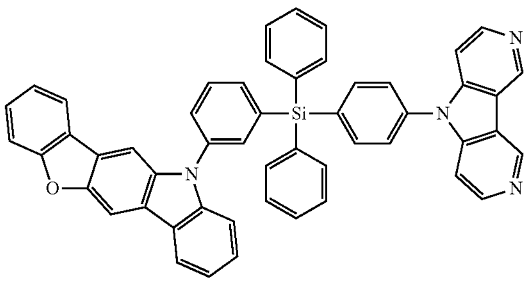
394
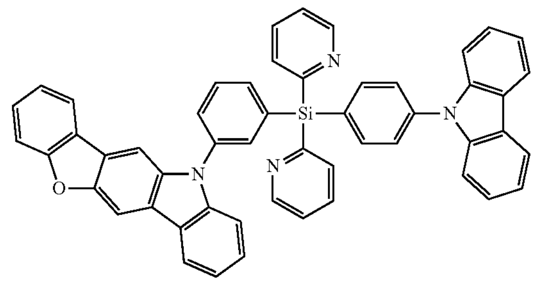
395
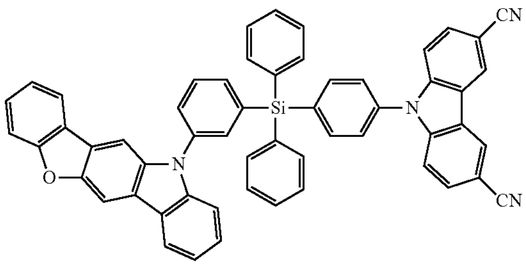
396
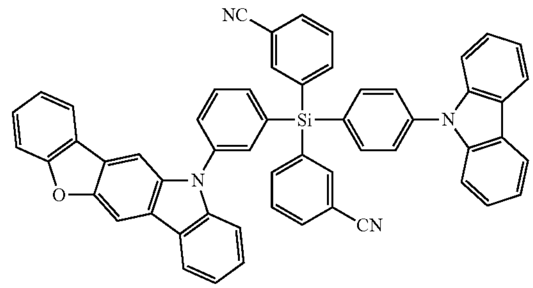
397
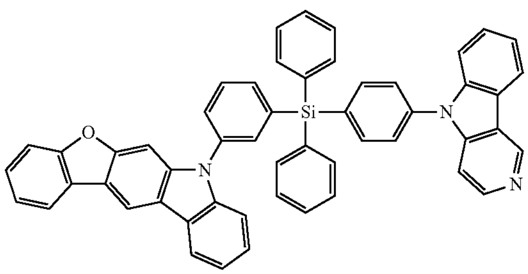
398
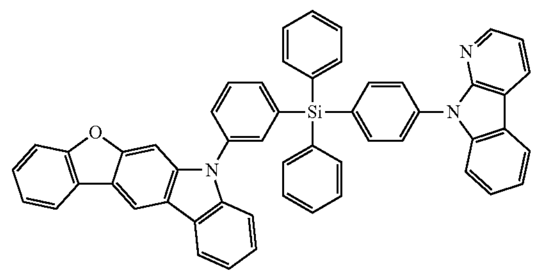
399
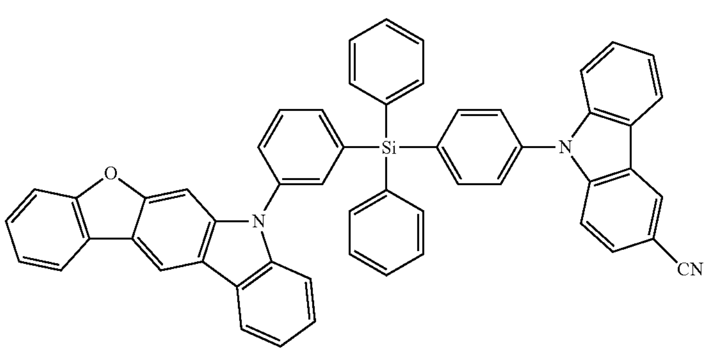
400
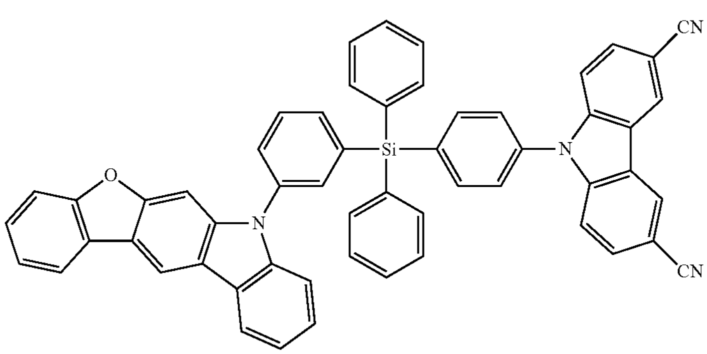

-continued
401
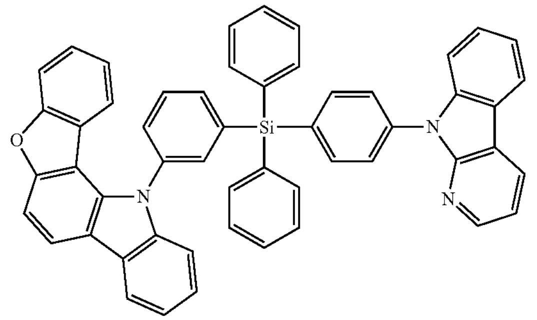
402
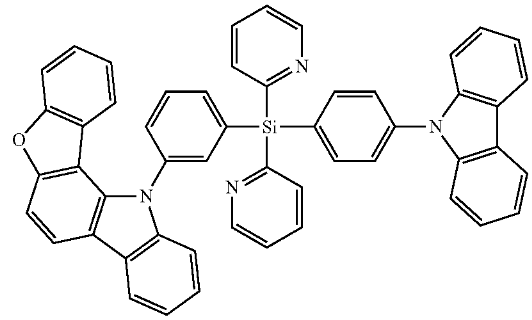
403
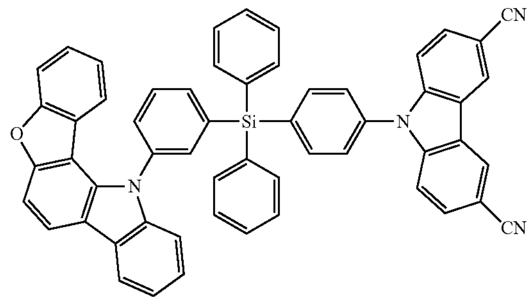
404
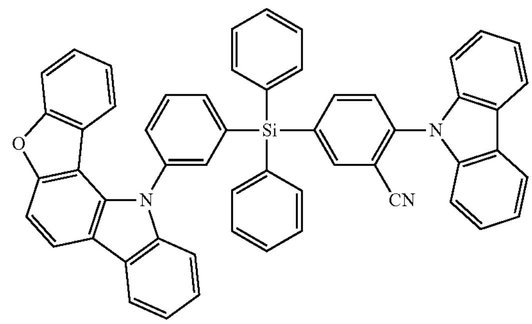
405
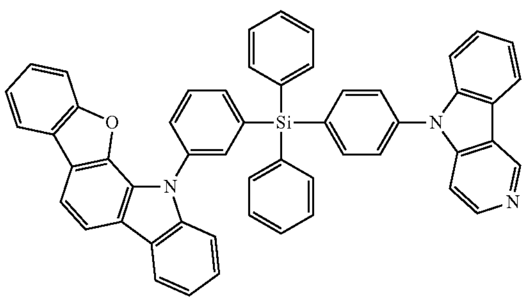
406
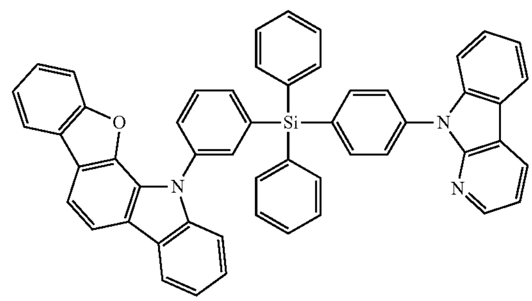
407
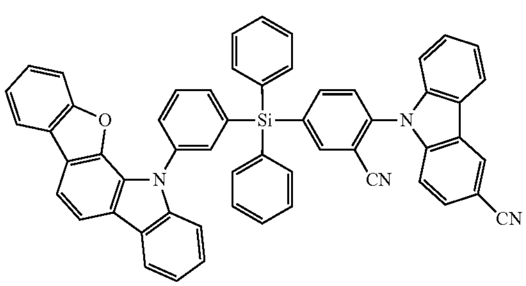
408
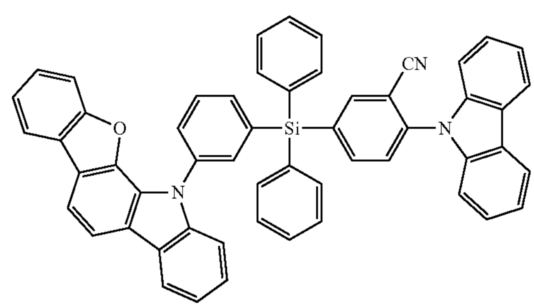
409
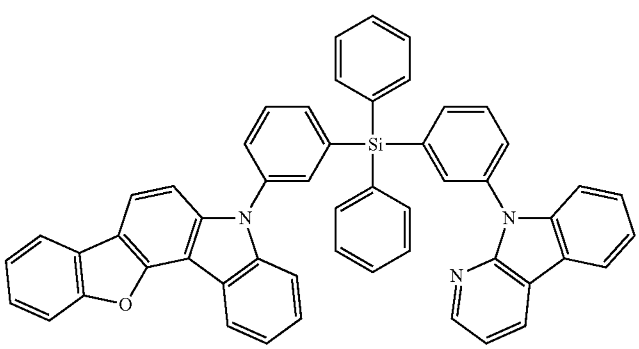

-continued
410
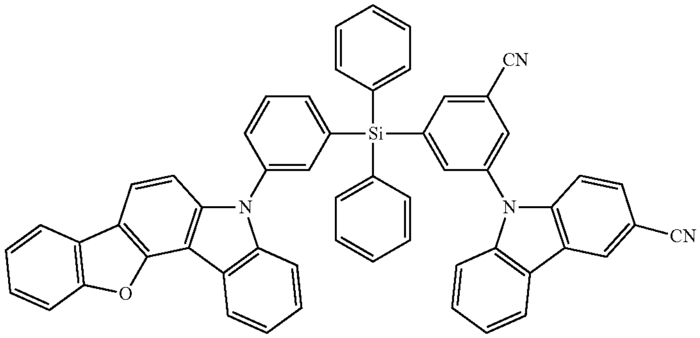
411
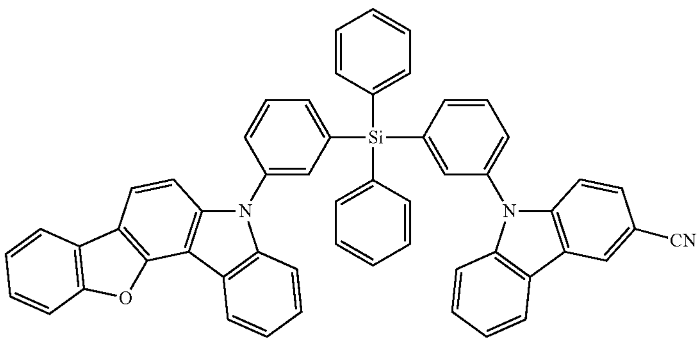
412
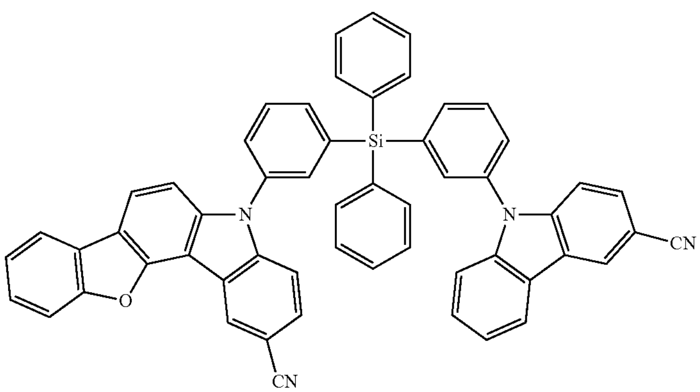
413
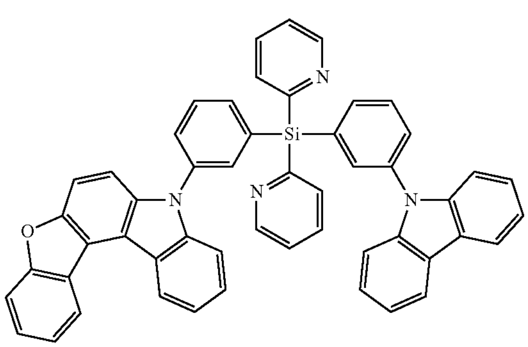
414
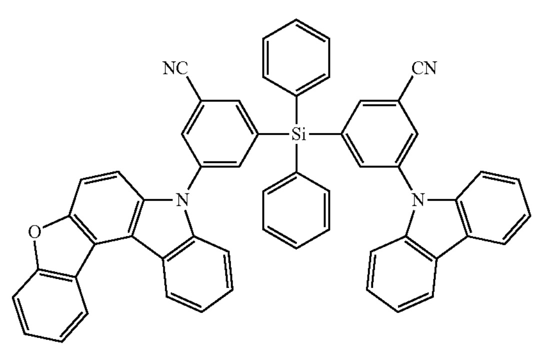

-continued
415
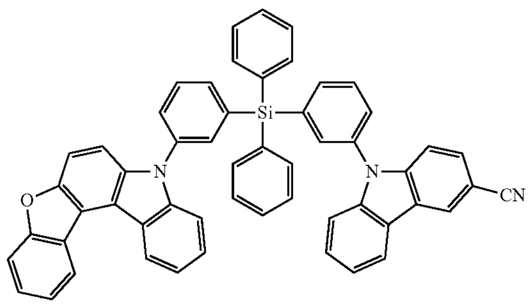
416
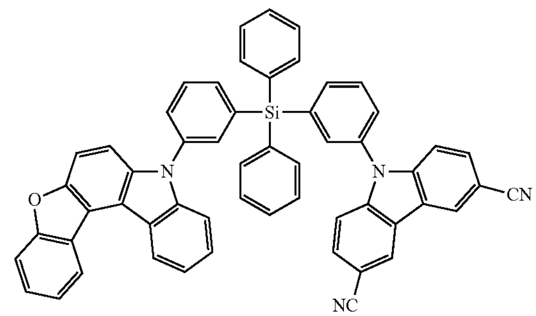
417
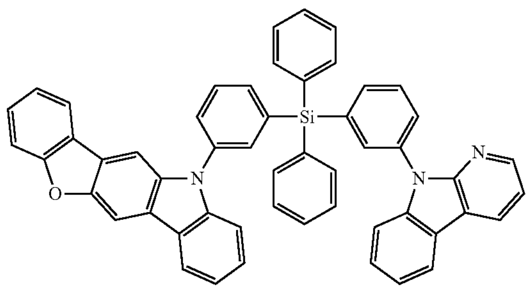
418
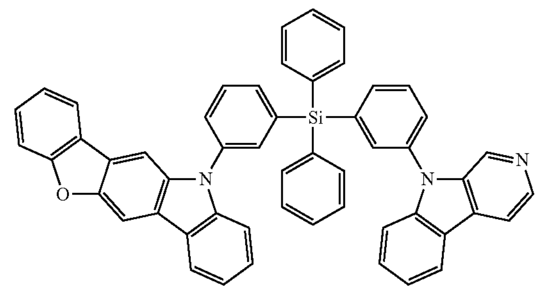
419
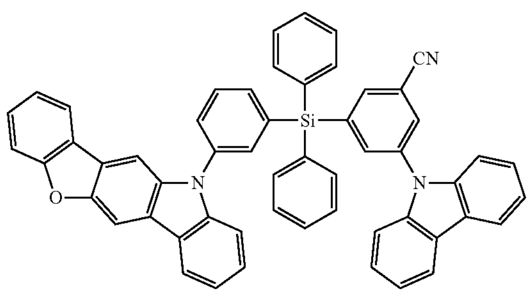
420
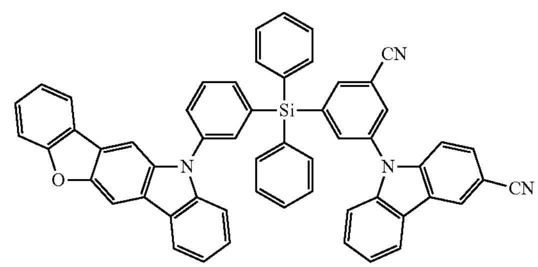
421
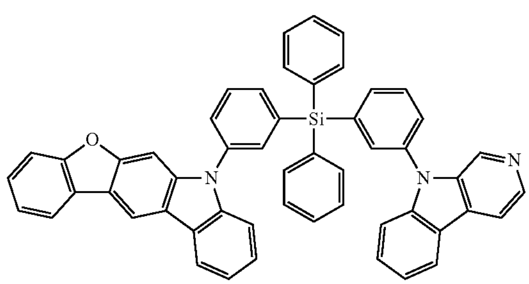
422
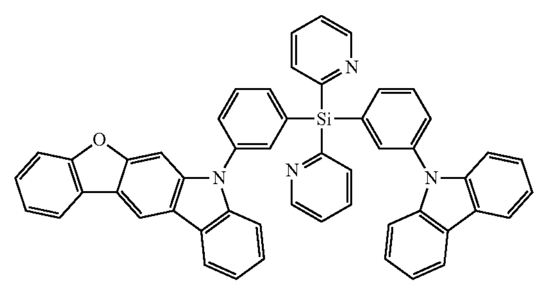
423
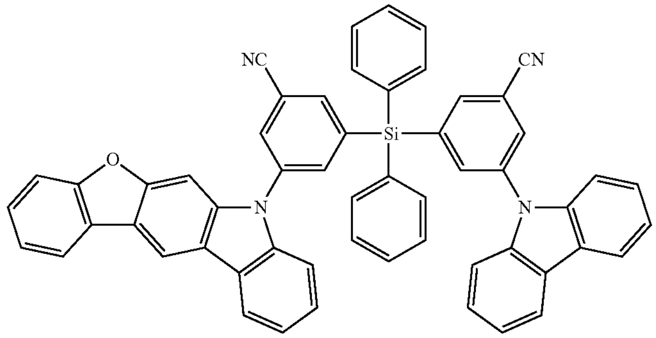

-continued
424
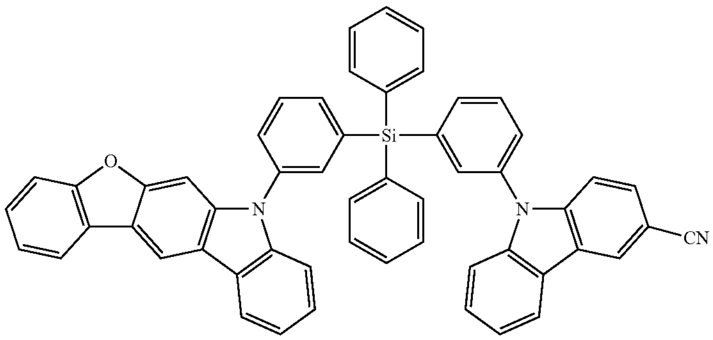
425
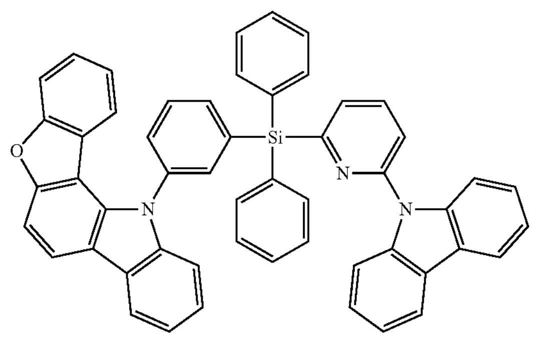
426
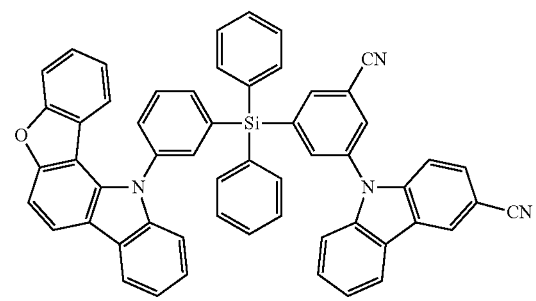
427
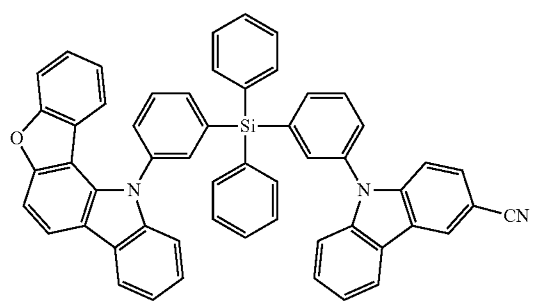
428
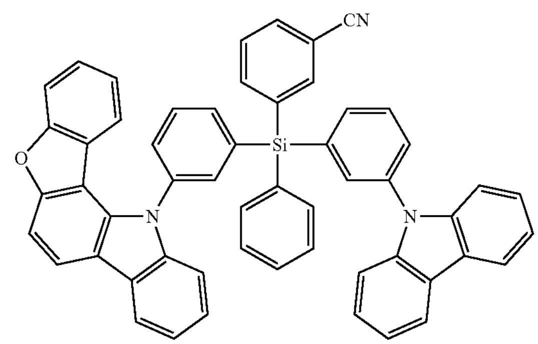
429
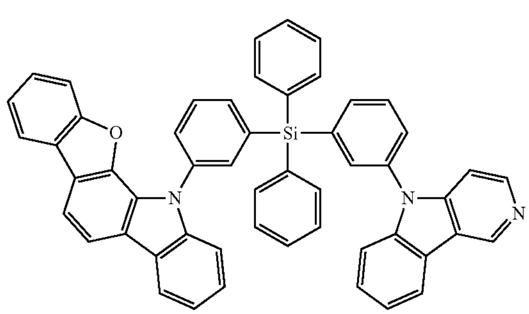
430
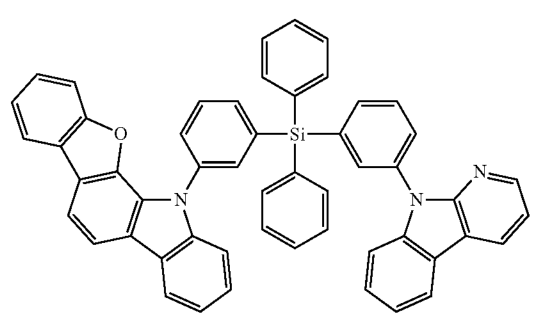

-continued

431

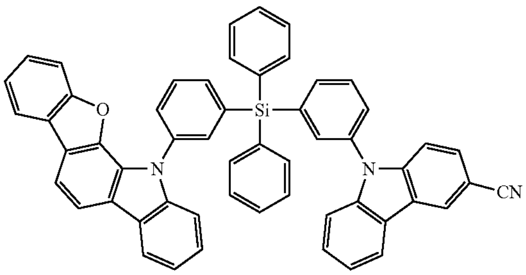

432

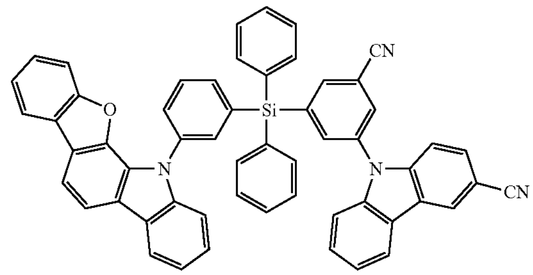

In Compounds 1 to 432,

Ph may be a phenyl group.

When the host is a mixture of an electron transport host and a hole transport host, the weight ratio of the electron transport host to the hole transport host may be 1:9 to 9:1, for example, 2:8 to 8:2, for example, 4:6 to 6:4, for example, 5:5. When the weight ratio of the electron transport host to the hole transport host satisfies the above-described ranges, the hole-and-electron transport balance in the emission layer 15 may be achieved.

Sensitizer in Emission Layer 15

The sensitizer may include a fourth-row transition metal of the Periodic Table of Elements, a fifth-row transition metal of the Periodic Table of Elements, a sixth-row transition metal of the Periodic Table of Elements, a lanthanide metal, an actinide metal, or any combination thereof.

In an embodiment, the sensitizer may include iridium (Ir), platinum (Pt), palladium (Pd), osmium (Os), titanium (Ti), gold (Au), silver (Ag), copper (Cu), ruthenium (Ru), rhenium (Re), rhodium (Rh), terbium (Tb), thulium (Tm), or any combination thereof.

In an embodiment, the sensitizer may include Ir, Pt, or any combination thereof.

In an embodiment, the sensitizer may be an organometallic compound represented by Formula 2:

$$M_{21}(L_{21})_{n21}(L_{22})_{n22} \qquad \text{Formula 2}$$

In Formula 2, $M_{21}$ includes a fourth-row transition metal of the Periodic Table of Elements, a fifth-row transition metal of the Periodic Table of Elements, a sixth-row transition metal of the Periodic Table of Elements, a lanthanide metal, an actinide metal, or any combination thereof, $L_{21}$ is a ligand represented by one of Formulae 2-1 to 2-4, $L_{22}$ is a monodentate ligand or a bidentate ligand, n11 is 1, 2, or 3, and n12 is 0, 1, 2, 3, or 4, 2-1

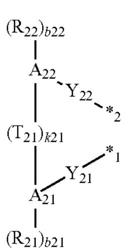

-continued 2-2

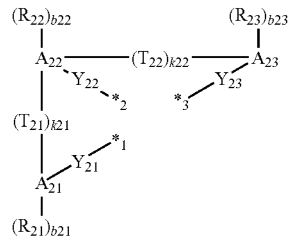

2-3

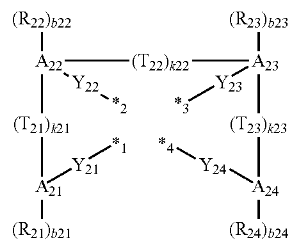

2-4

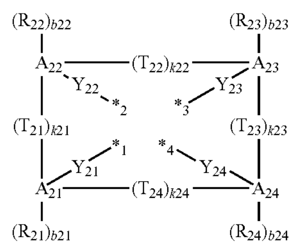

In Formulae 2-1 to 2-4, $A_{21}$ to $A_{24}$ are each independently a $C_5$-$C_{30}$ carbocyclic group, a $C_1$-$C_{30}$ heterocyclic group, or a non-cyclic group, $T_{21}$ to $T_{24}$ are each independently a single bond, a double bond, *—O—*', *—S—*', *—C(═O)—*', *—S(═O)—*', *—C($R_{25}$)($R_{26}$)—*', *—C($R_{25}$)═C($R_{26}$)—*', *—C($R_{25}$)═*', *—Si($R_{25}$)($R_{28}$)—*', *—B($R_{25}$)—*', *—N($R_{25}$)—*', or *—P($R_{25}$)—*', k21 to k24 are each independently 1, 2, or 3, $Y_{21}$ to $Y_{24}$ are each independently a single bond, *—O—*', *—C($R_{27}$)($R_{28}$)—*', *—Si($R_{27}$)($R_{28}$)—*', *—B($R_{27}$)—*', *—N($R_{27}$)—*', or *—P($R_{27}$)—*', $*_1$, $*_2$, $*_3$, and $*_4$ each indicate a binding site to $M_{21}$, $R_{21}$ to $R_{28}$ are each independently hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted heterocycloalkenyl group, a substituted or unsubstituted $C_8$-$C_{80}$ aryl group, a substituted or unsubstituted $C_7$-$C_{80}$ alkyl aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$C(Q_1)(Q_2)(Q_3)$, —$Si(Q_1)(Q_2)(Q_3)$, —$B(Q_1)(Q_2)$, —$N(Q_1)(Q_2)$, —$P(Q_1)(Q_2)$, —$C(=O)(Q_1)$, —$S(=O)(Q_1)$, —$S(=O)_2(Q_1)$, —$P(=O)(Q_1)(Q_2)$, or —$P(=S)(Q_1)(Q_2)$, $R_{21}$ to $R_{28}$ are optionally bonded to each other to form a substituted or unsubstituted $C_5$-$C_{60}$ carbocyclic group or a substituted or unsubstituted $C_1$-$C_{60}$ heterocyclic group, and b21 to b24 are each independently an integer from 0 to 10.

In detail, the sensitizer may be of Groups S-I to S-VI, but embodiments of the present disclosure are not limited thereto:

Group S-I

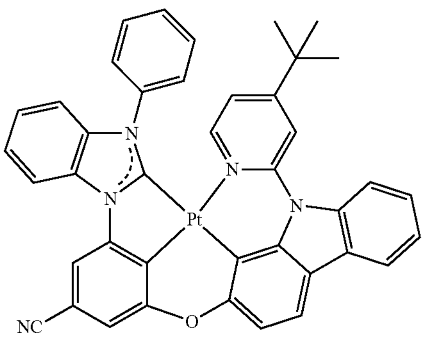

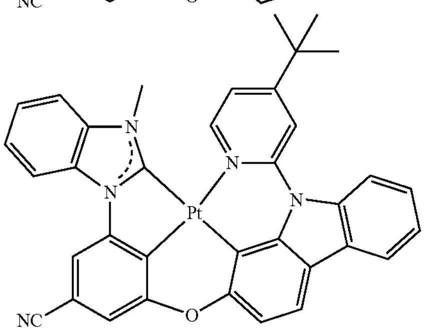

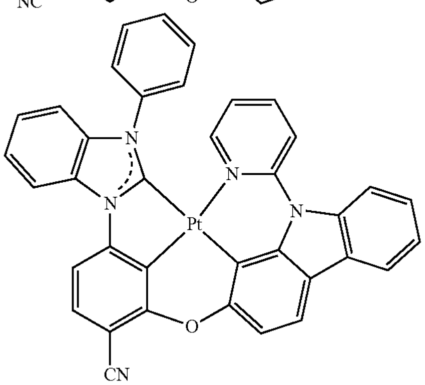

-continued

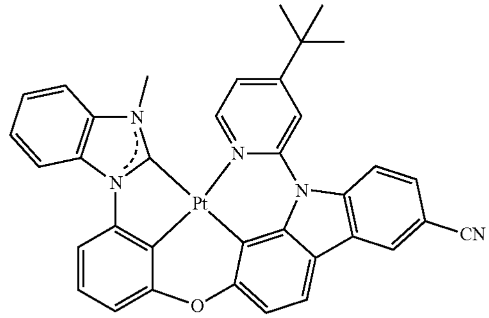

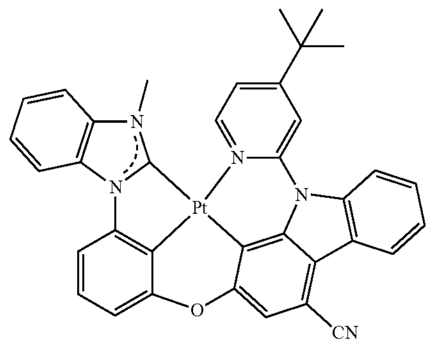

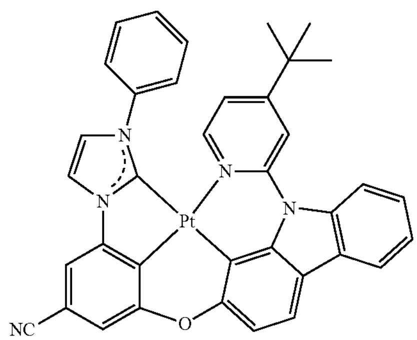

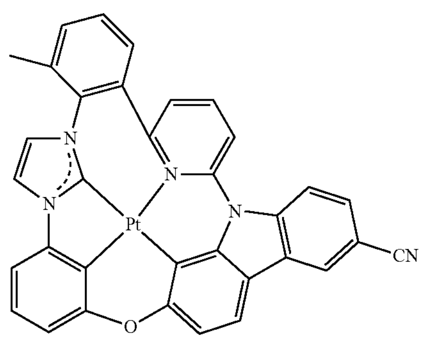

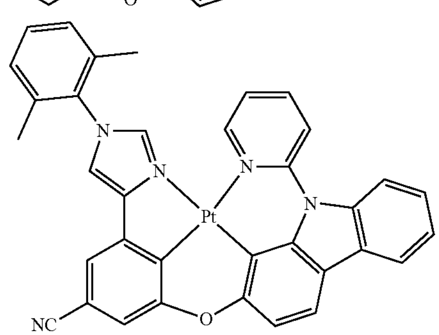

-continued
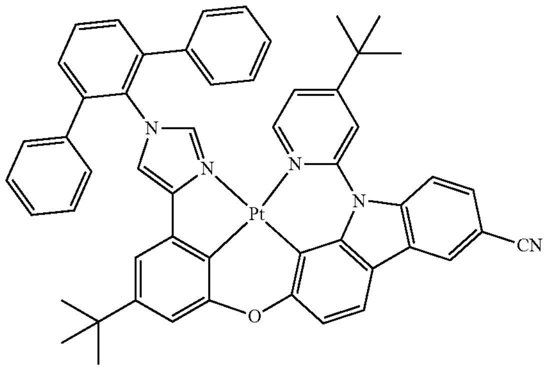
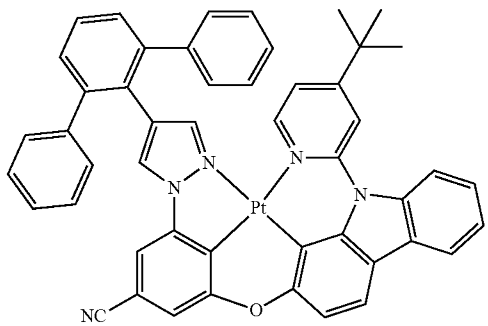
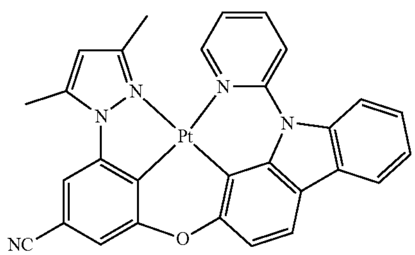
Group S-II
1
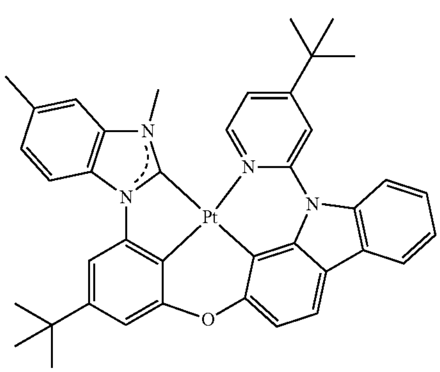
2
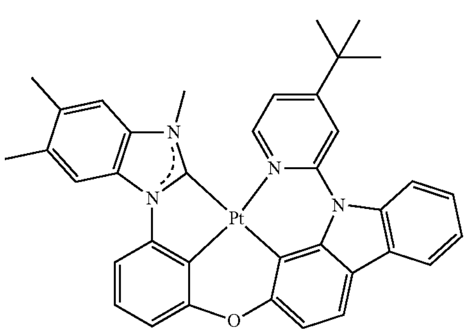
-continued
3
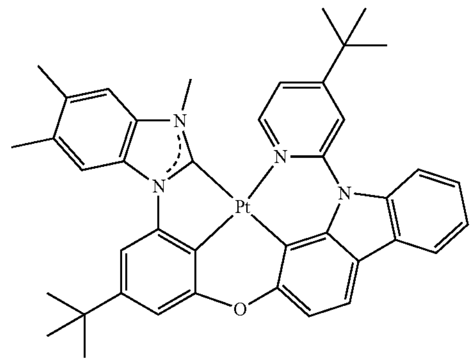
4
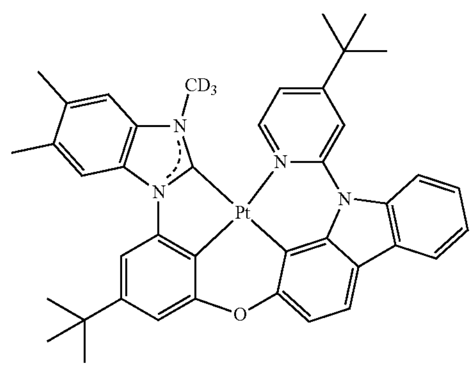
5
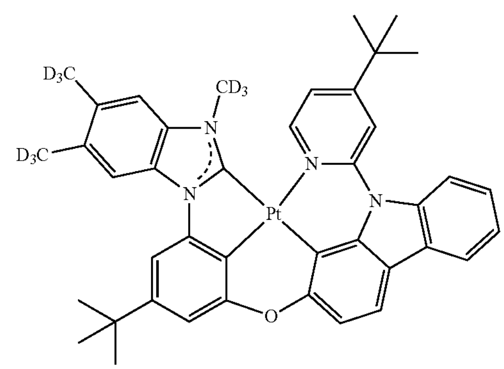
6
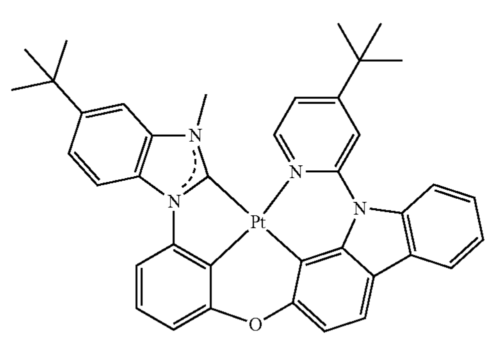

-continued
7
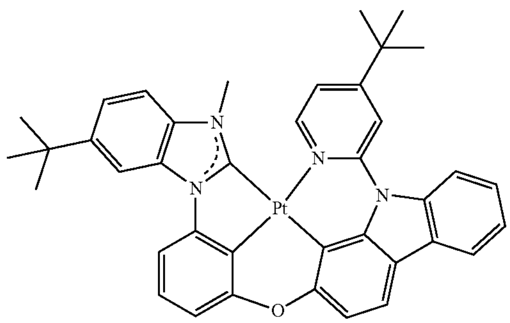
8
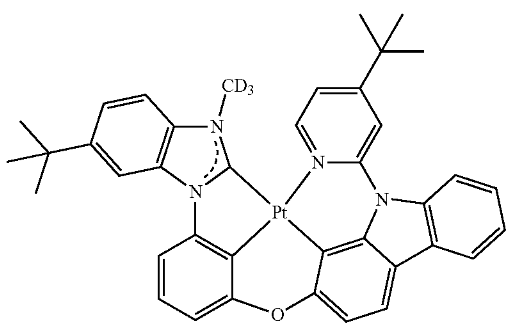
9
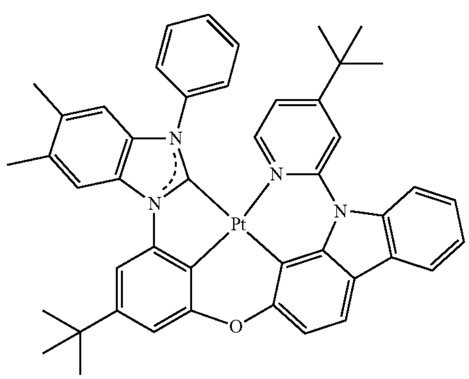
10
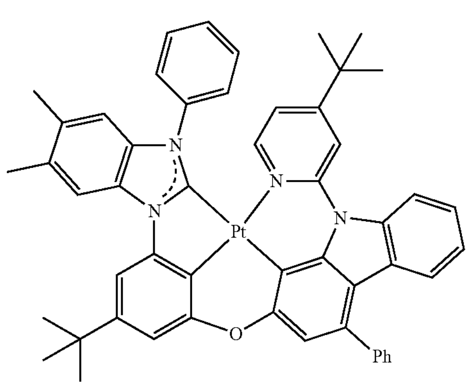
-continued
11
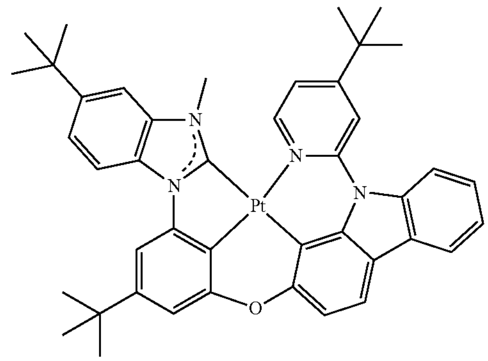
12
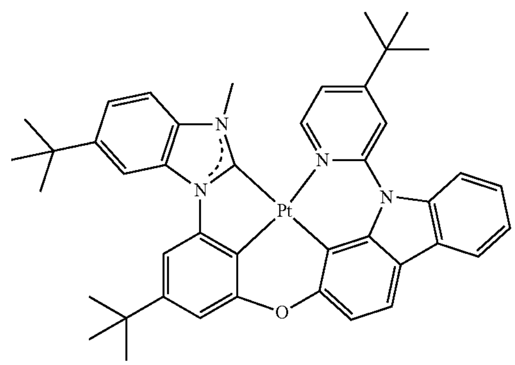
13
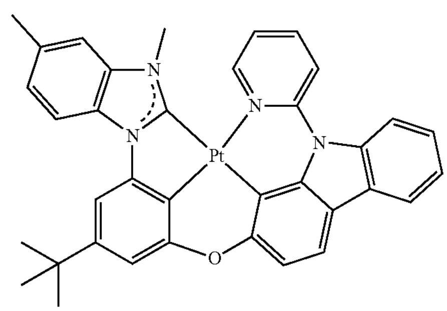
14
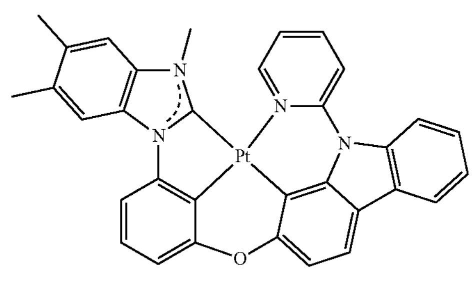
15
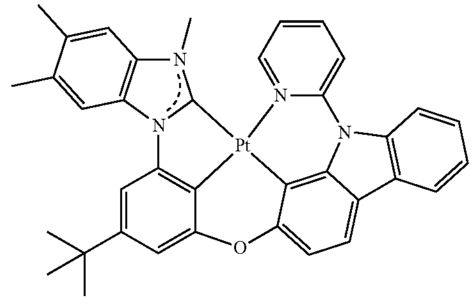

16
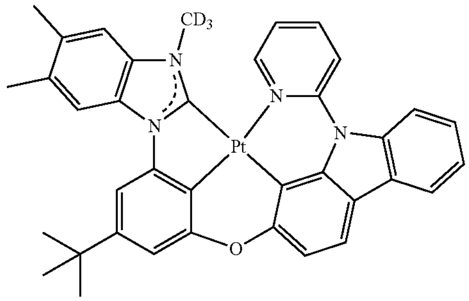
17
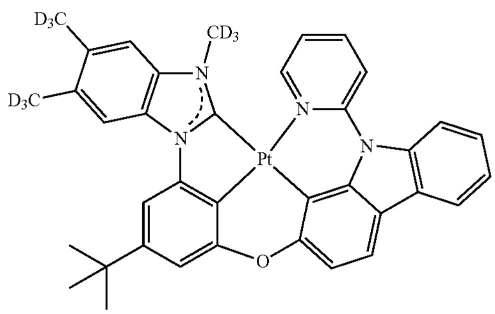
18
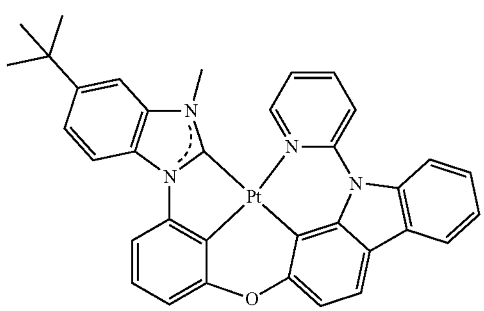
19
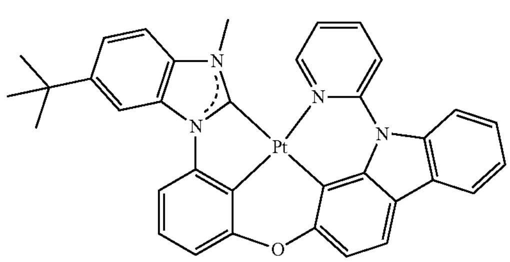
20
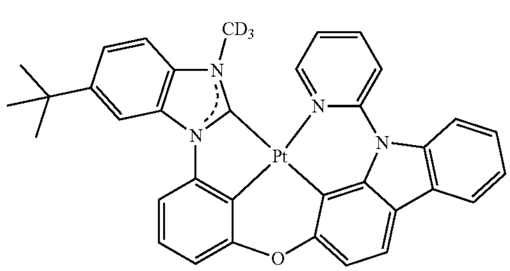
21
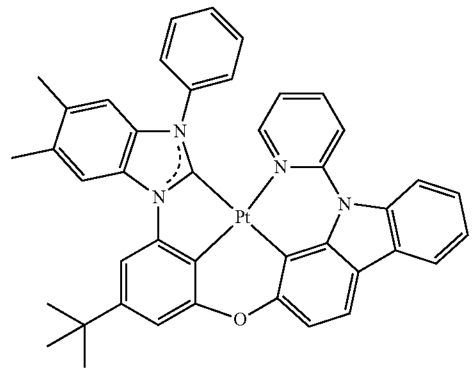
22
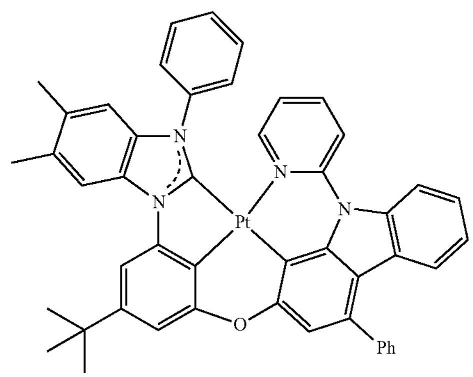
23
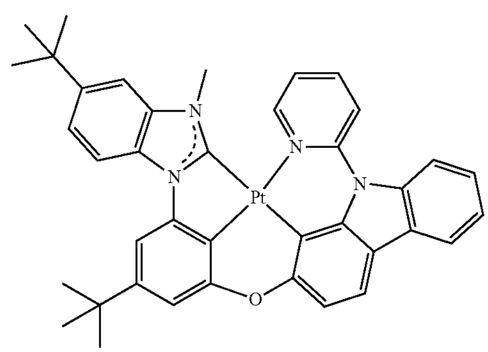
24
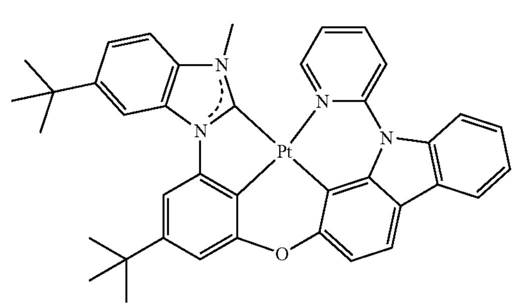

-continued
25
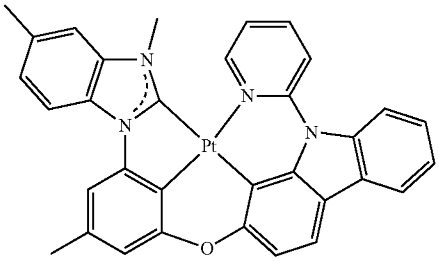
26
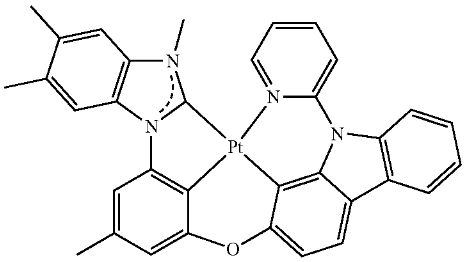
27
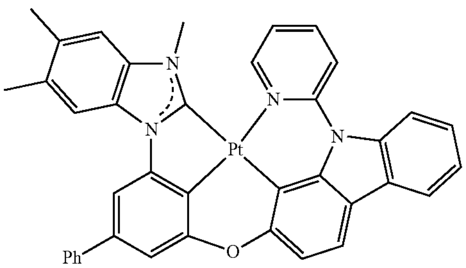
28
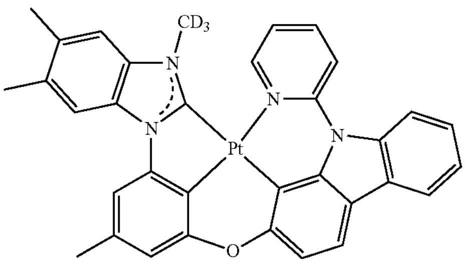
29
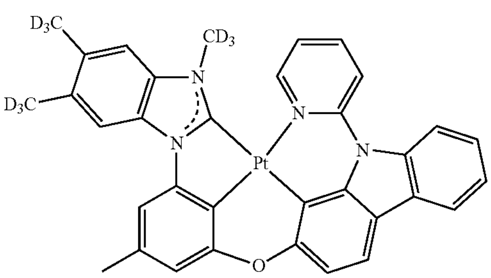
30
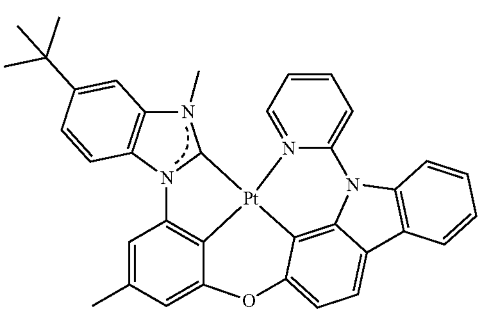
-continued
31
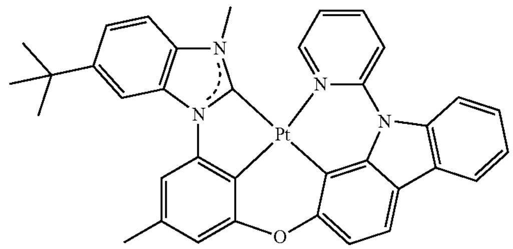
32
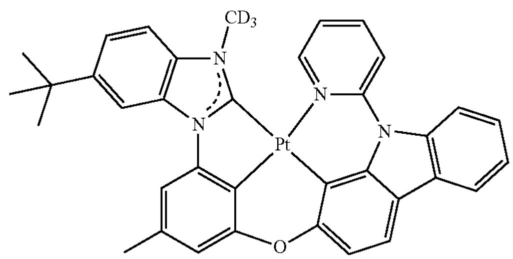
33
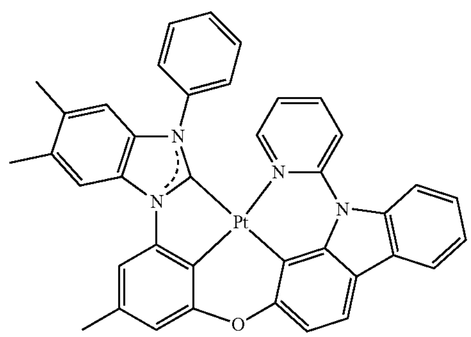
34
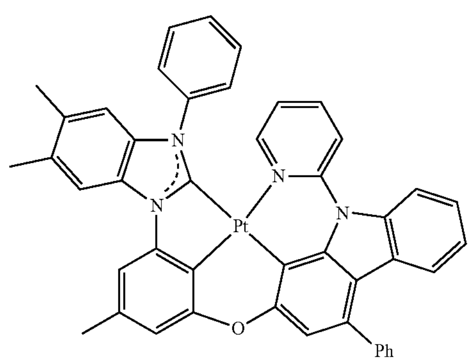
35
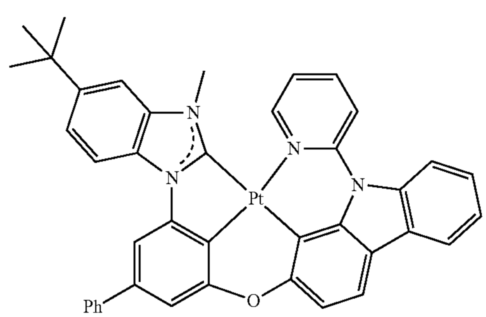

36
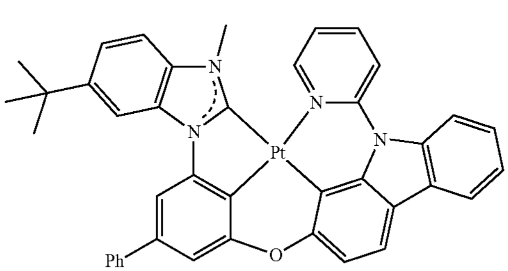
37
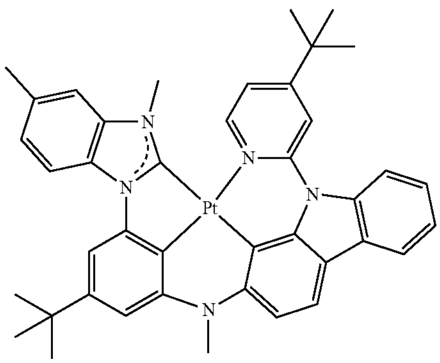
38
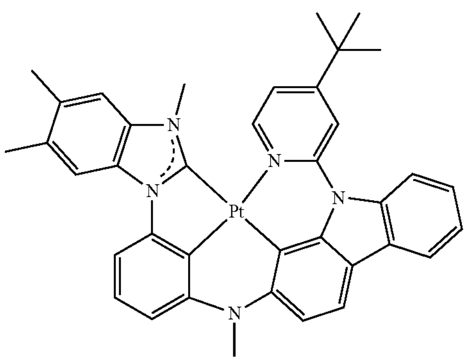
39
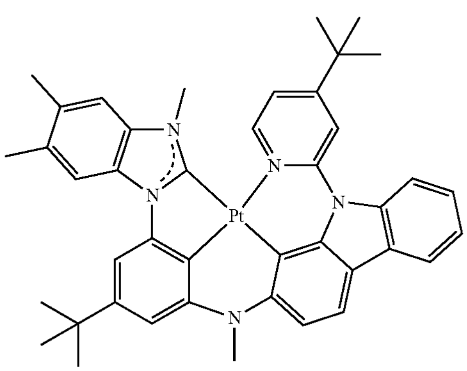
40
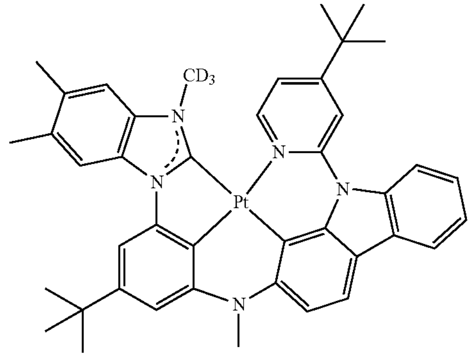
41
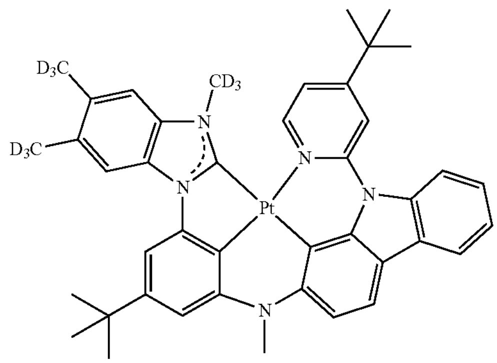
42
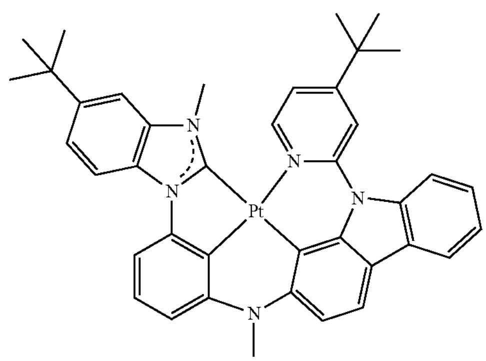
43
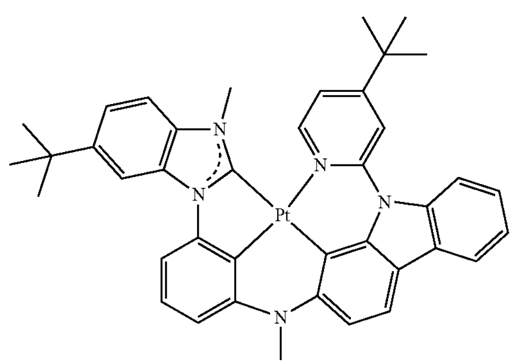

-continued
44
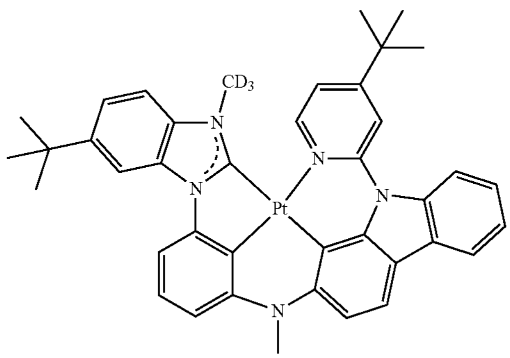
45
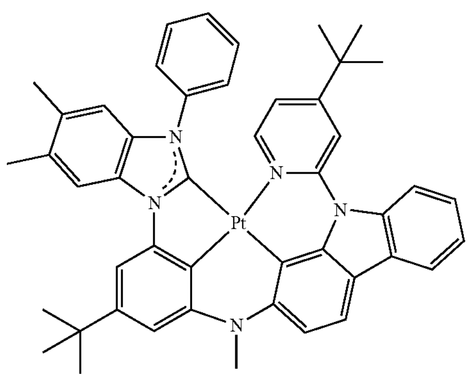
46
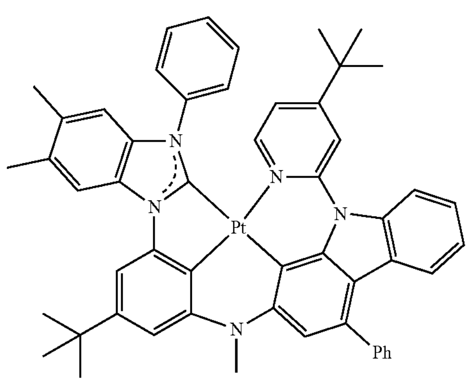
47
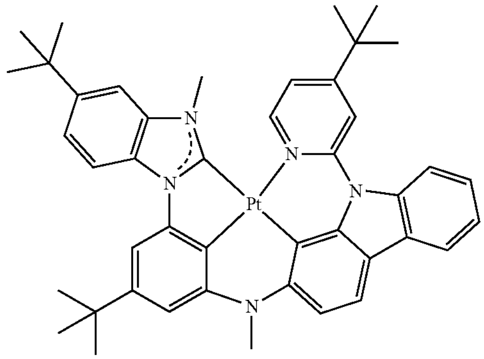
-continued
48
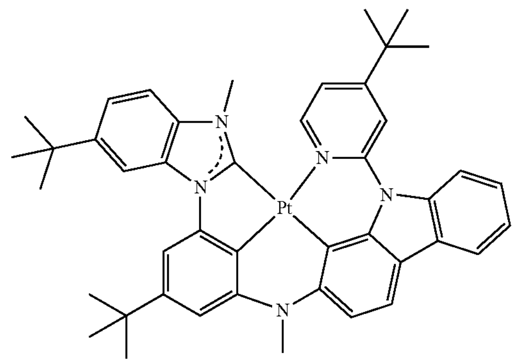
49
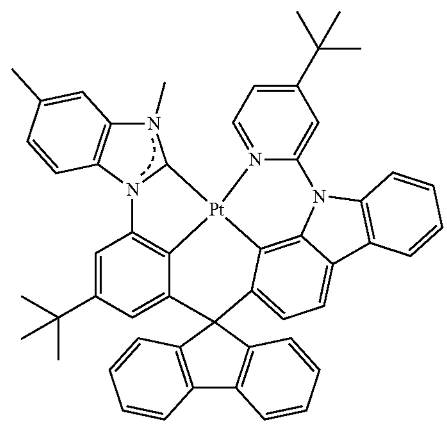
50
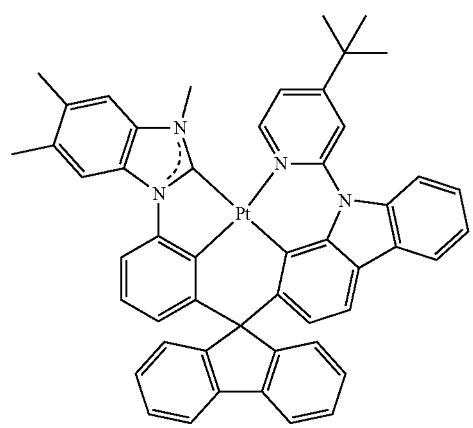
51
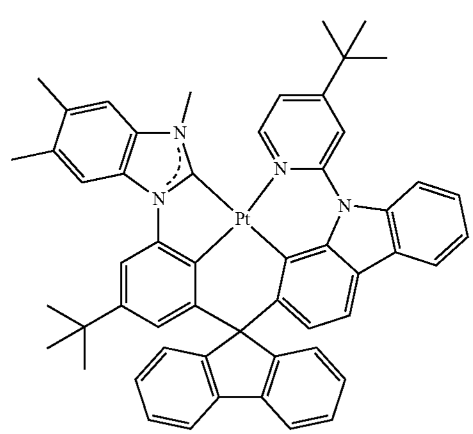

-continued
52
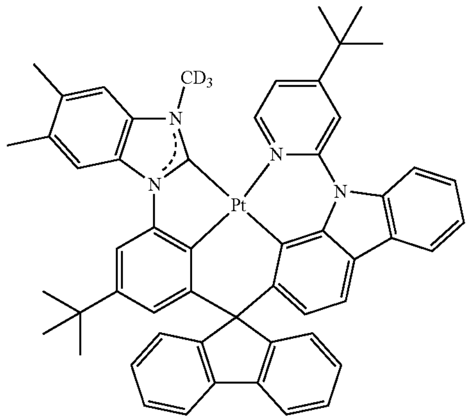
53
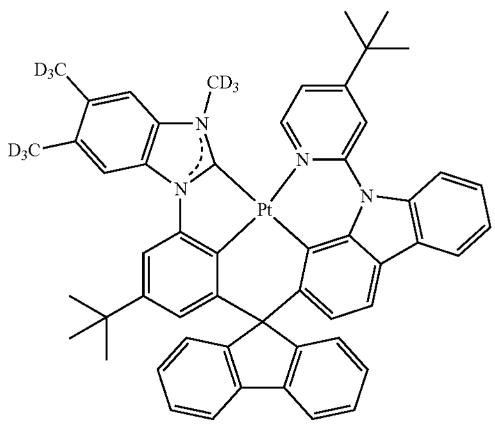
54
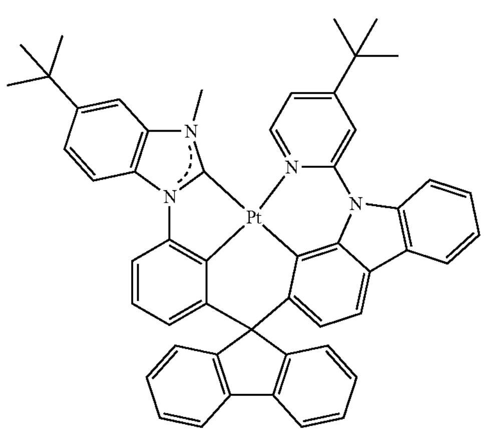
-continued
55
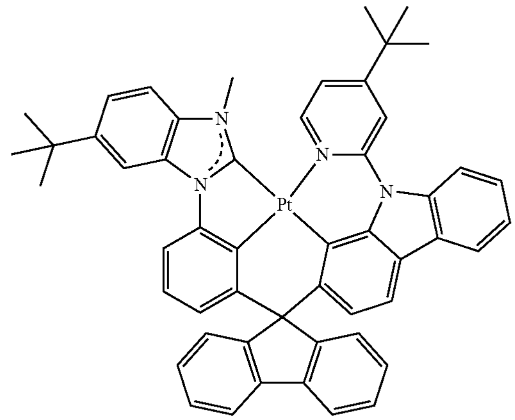
56
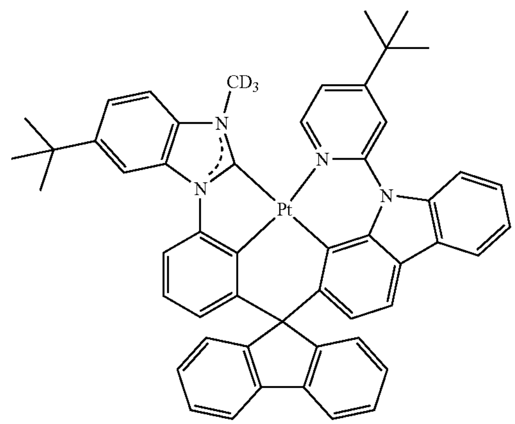
57
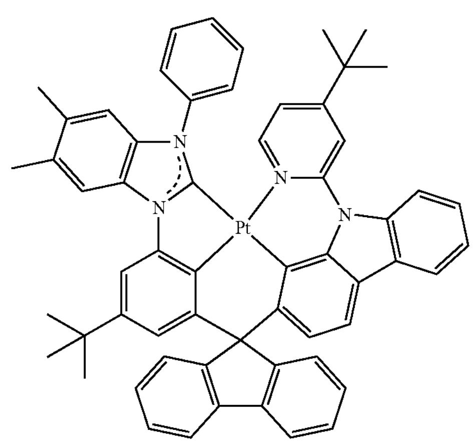

-continued
58
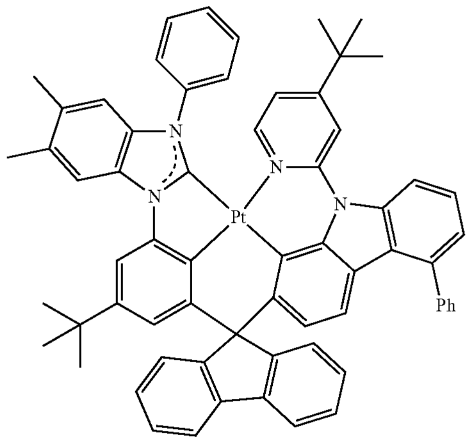
59
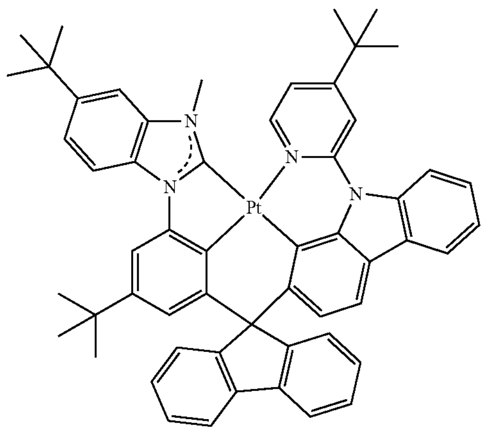
60
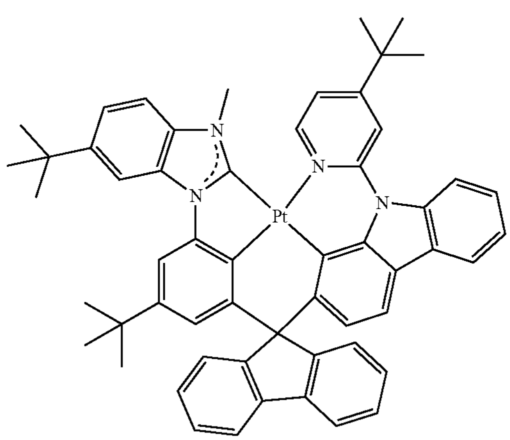
61
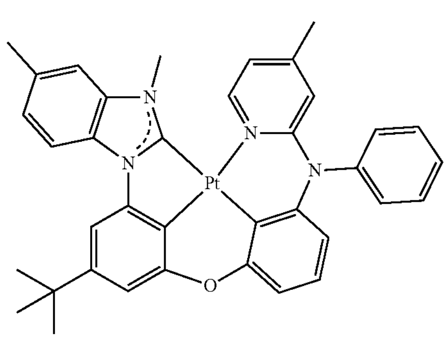
-continued
62
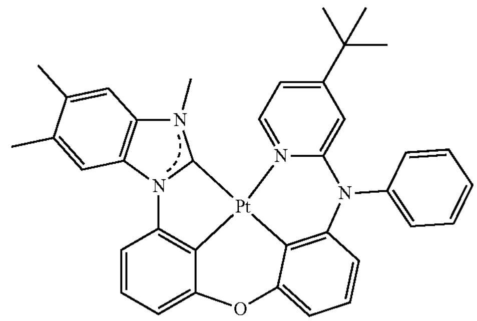
63
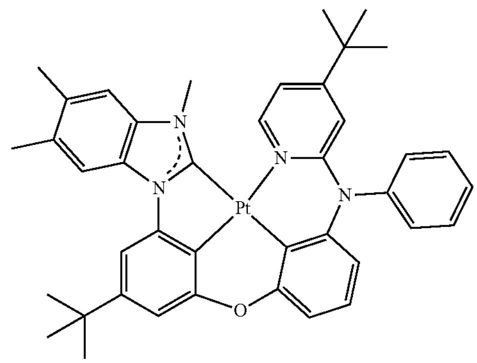
64
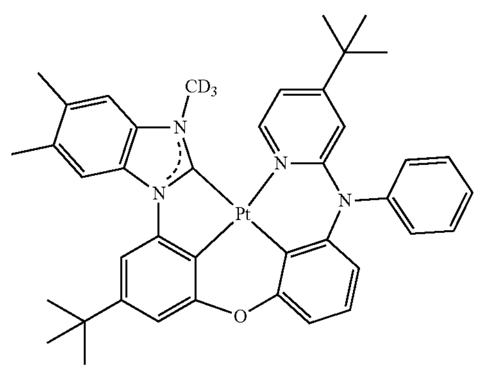
65
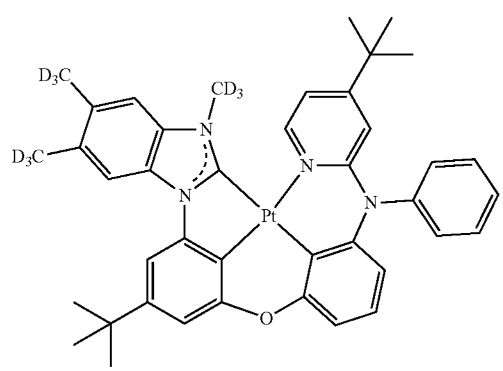

-continued
66
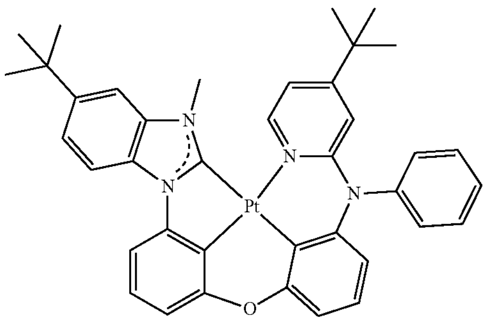
67
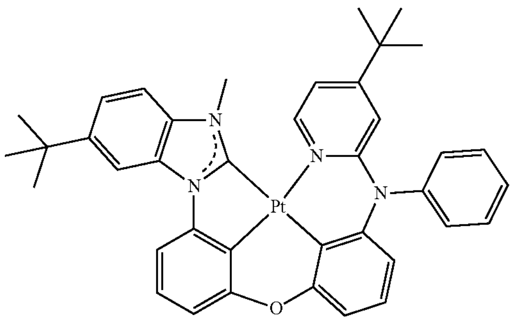
68
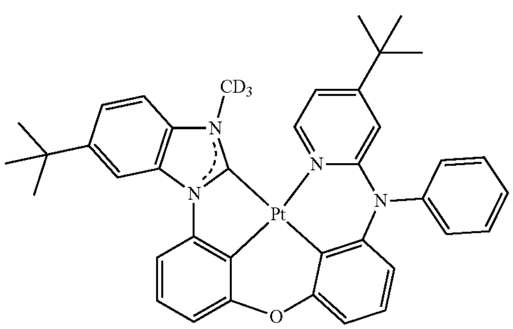
69
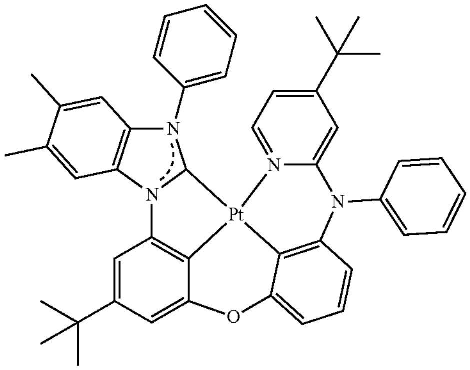
-continued
70
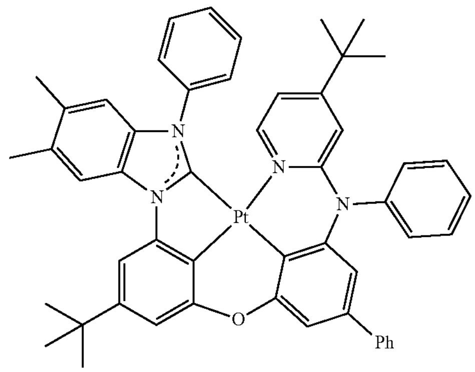
71
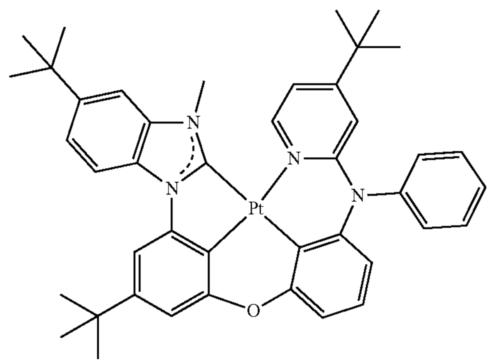
72
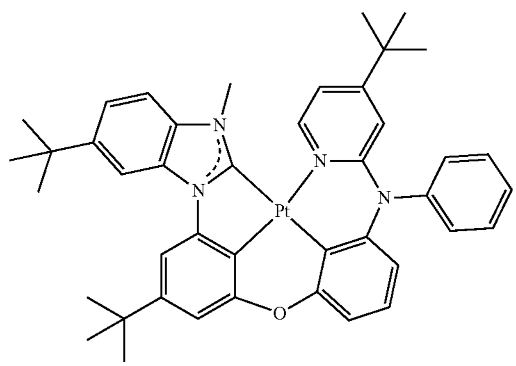
73
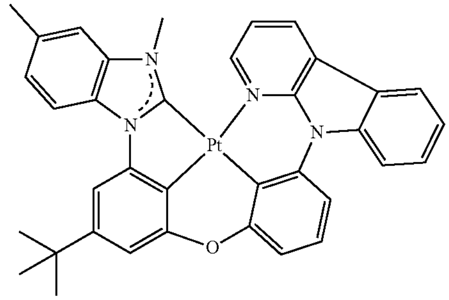

-continued
74
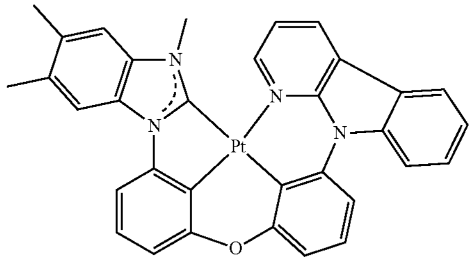
75
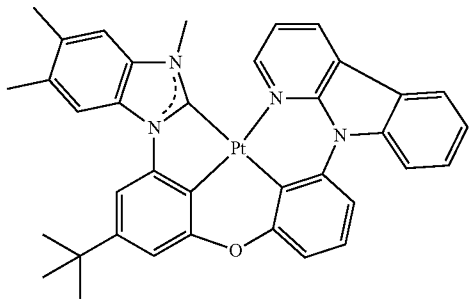
76
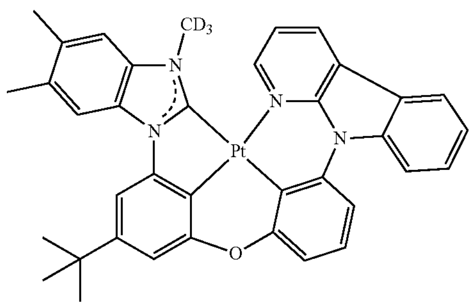
77
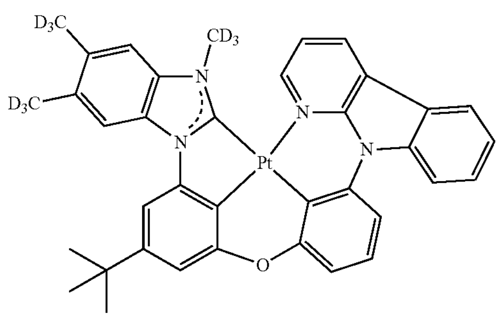
78
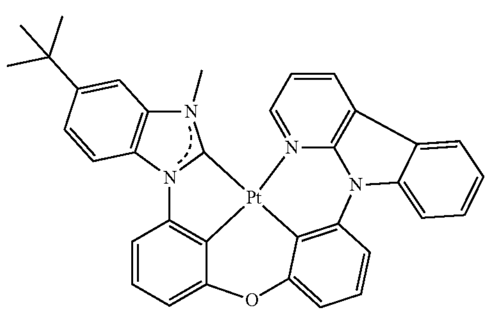
-continued
79
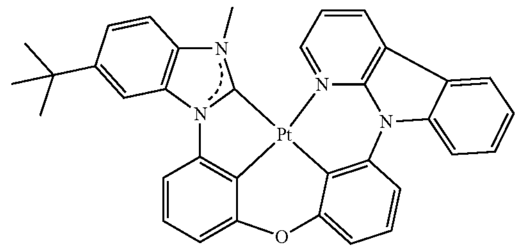
89
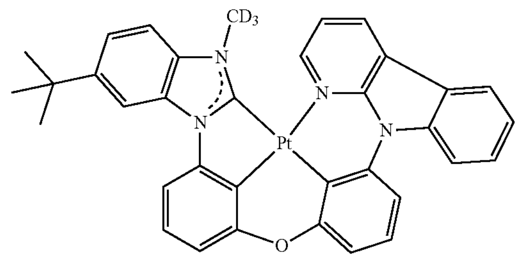
81
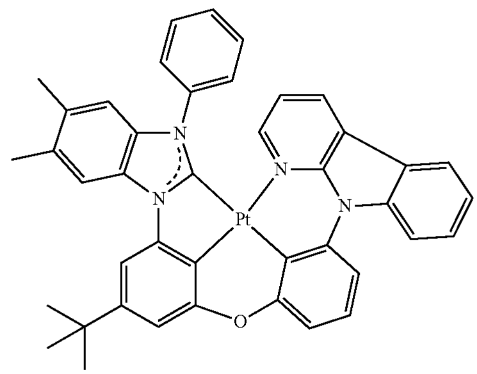
82
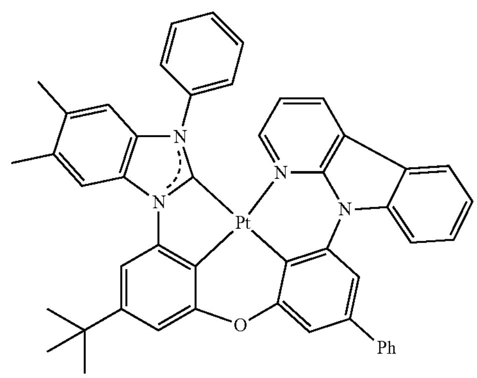
83
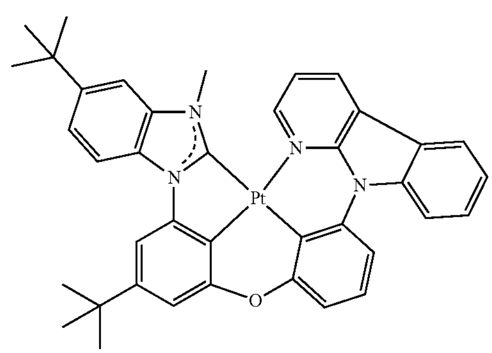

-continued
84
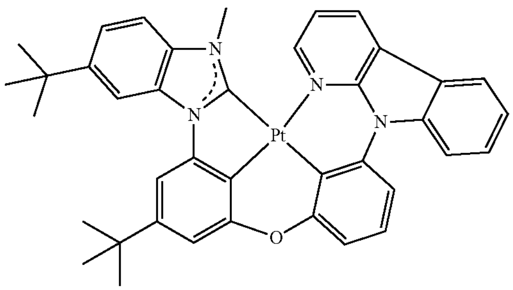
85
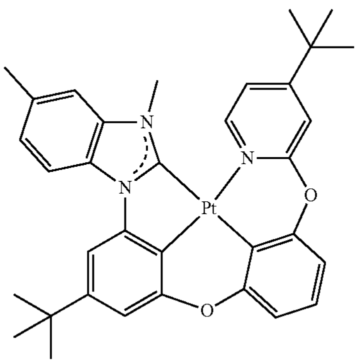
86
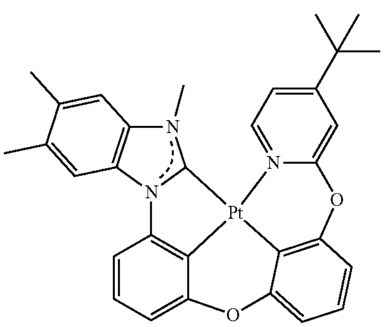
87
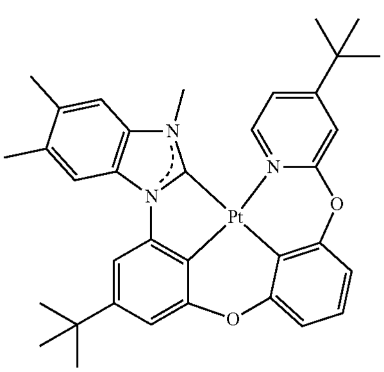
-continued
88
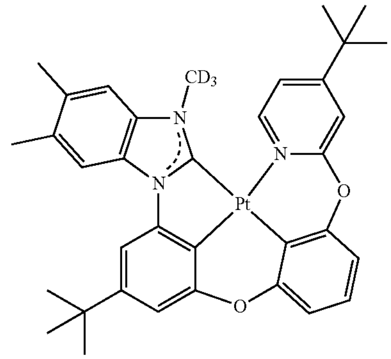
89
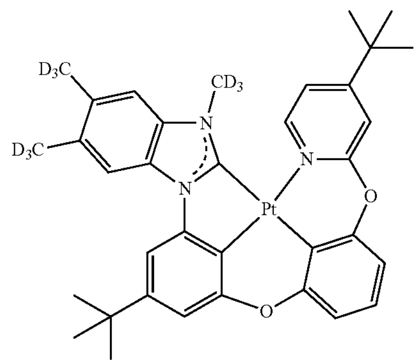
90
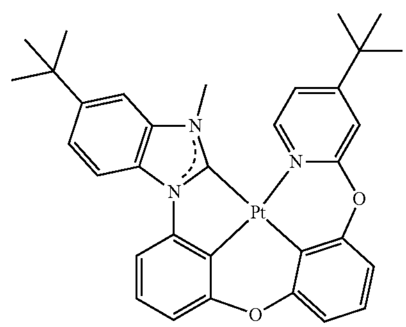
91
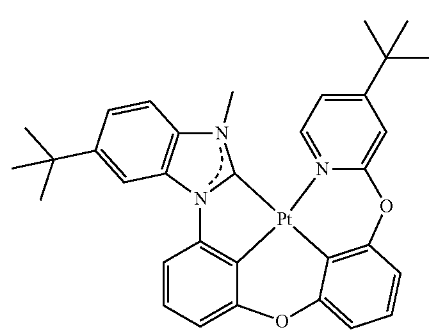

92
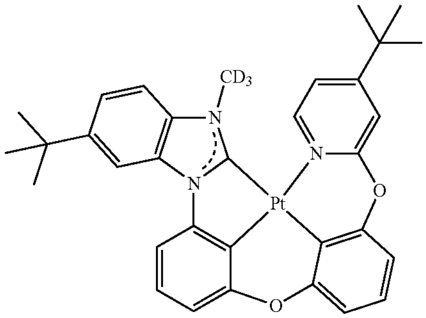
93
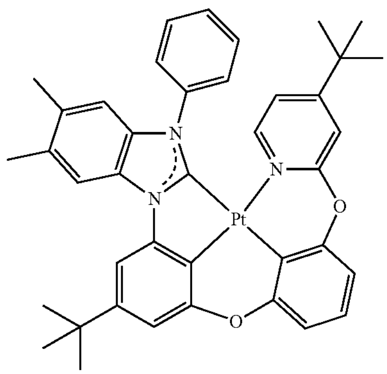
94
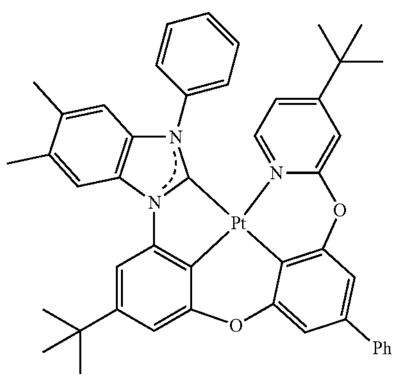
95
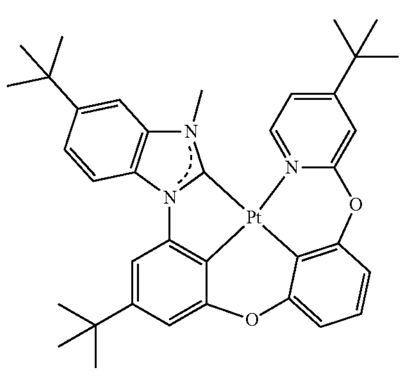
96
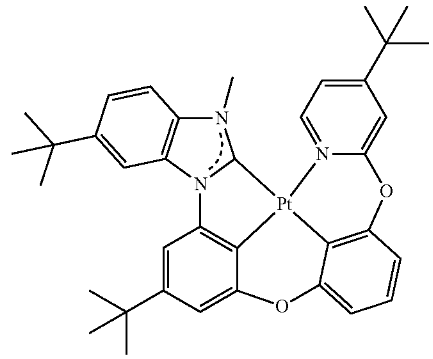
97
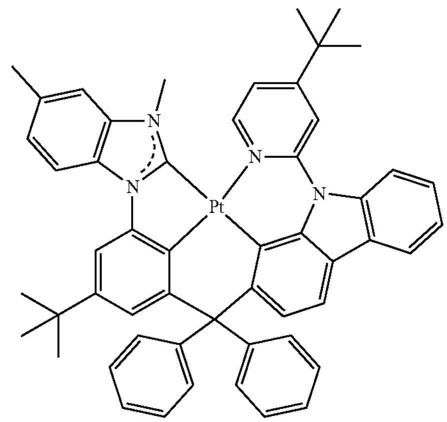
98
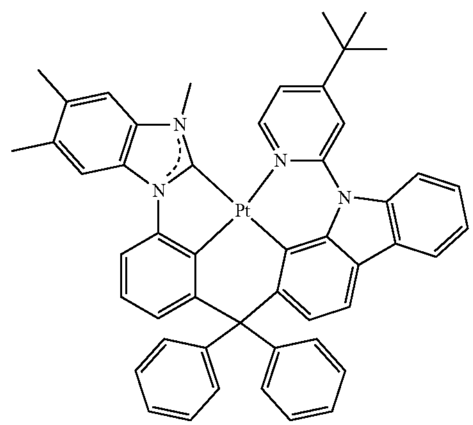
99
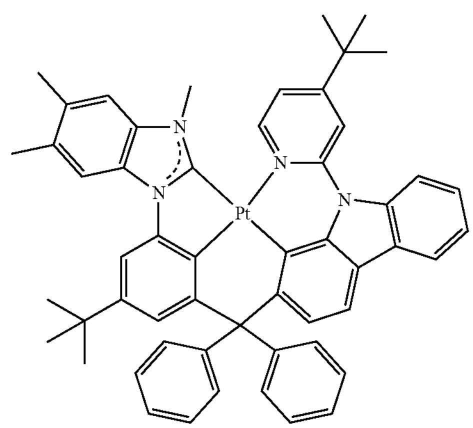

-continued
100
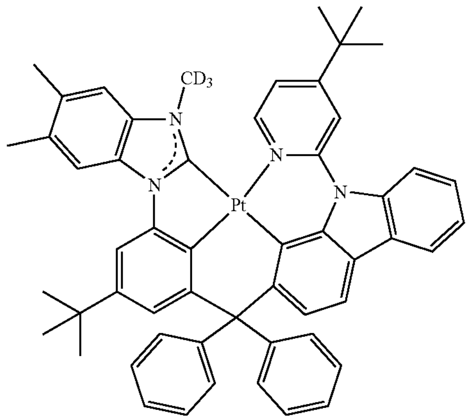
101
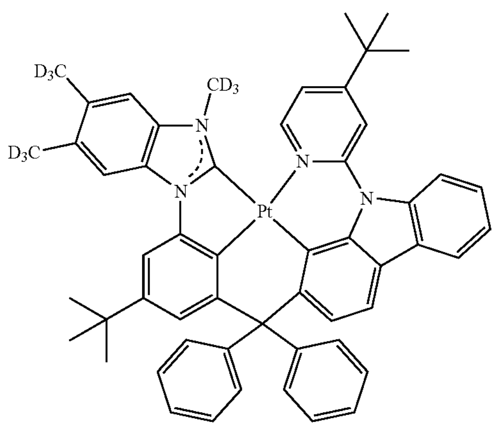
102
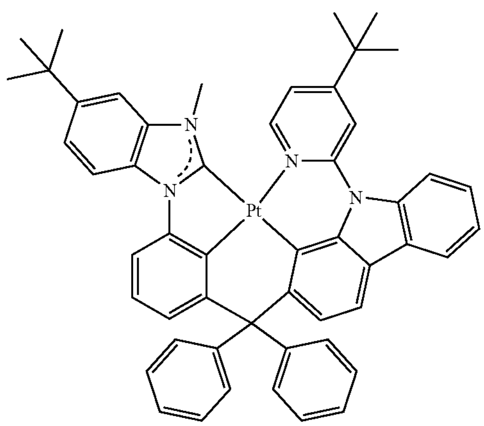
-continued
103
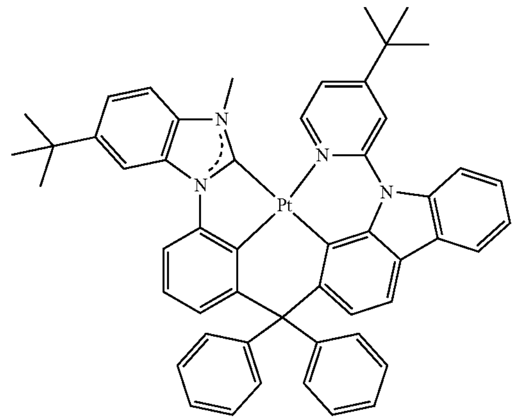
104
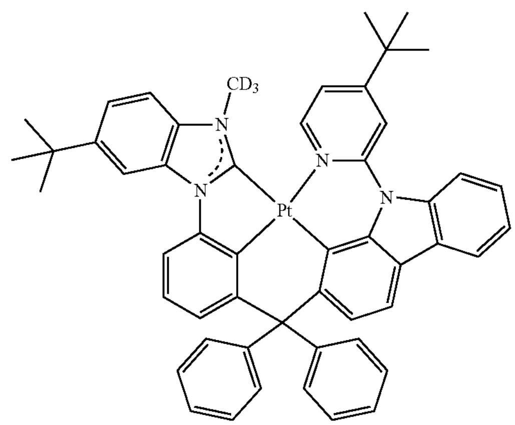
105
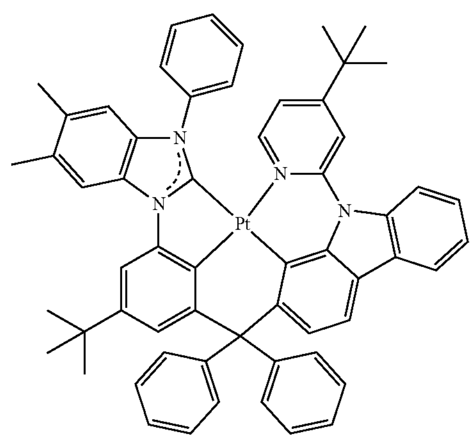

-continued
106
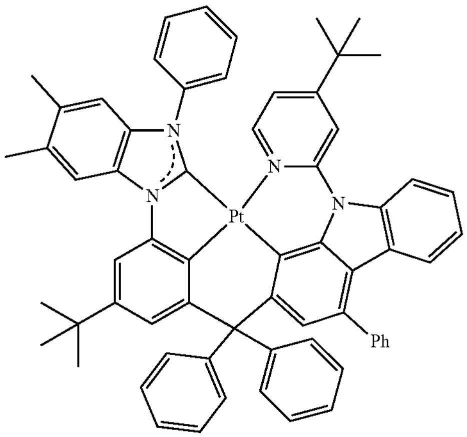
107
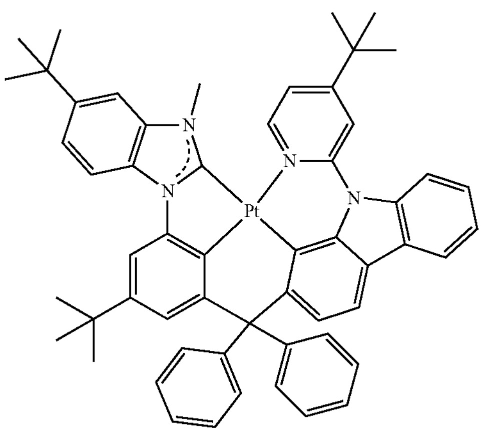
108
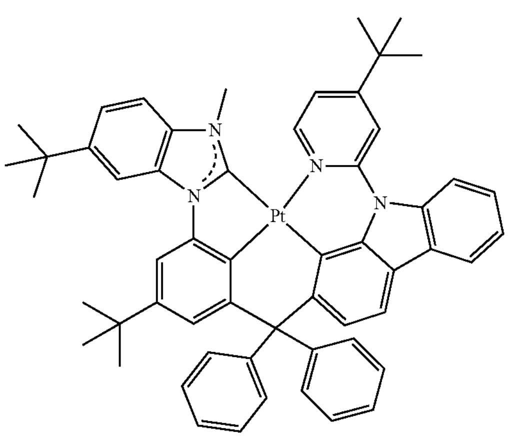
-continued
109
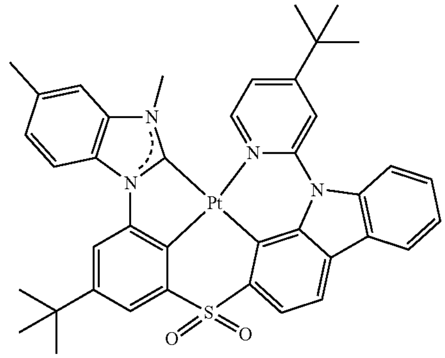
110
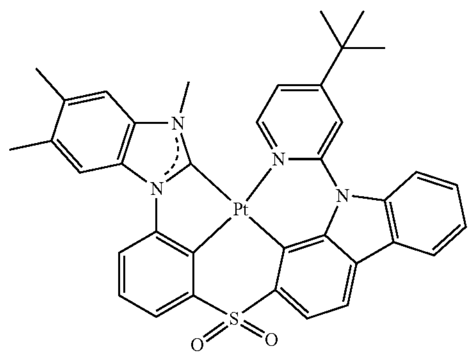
111
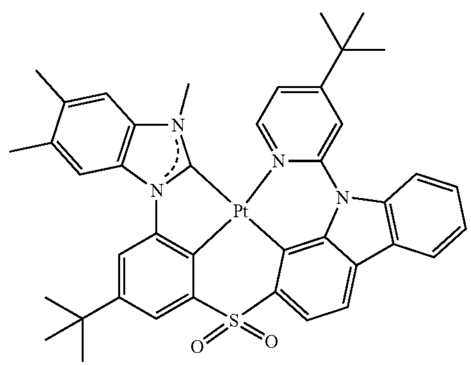
112
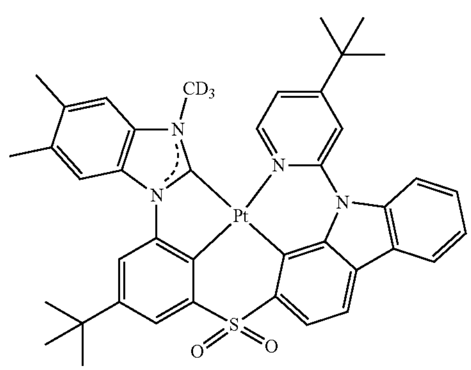

113
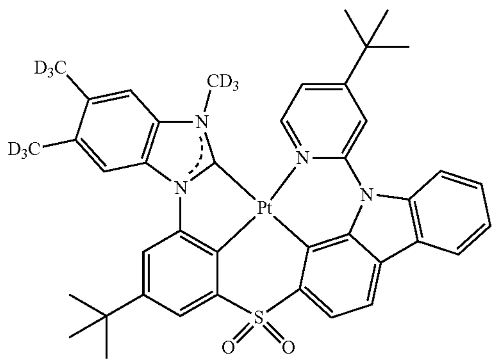
114
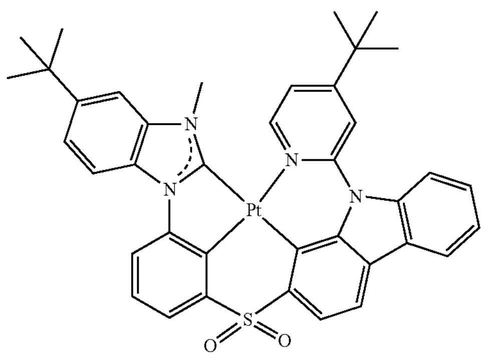
115
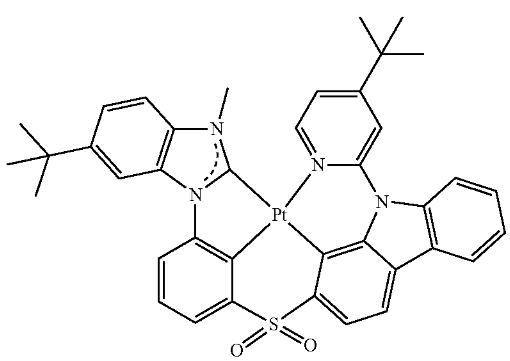
116
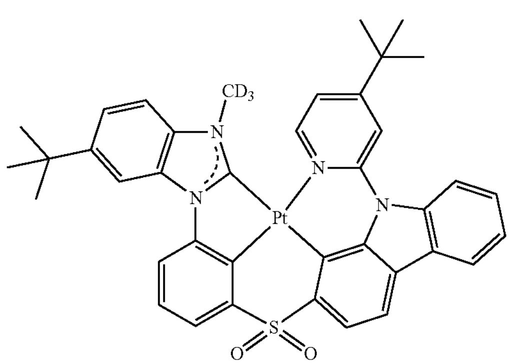
117
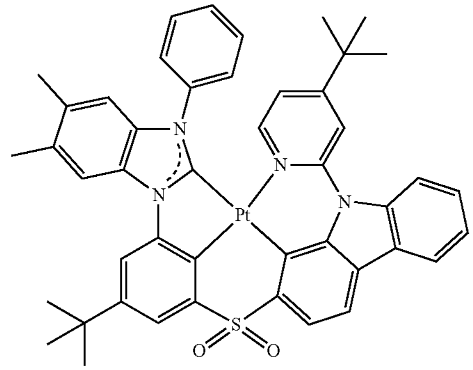
118
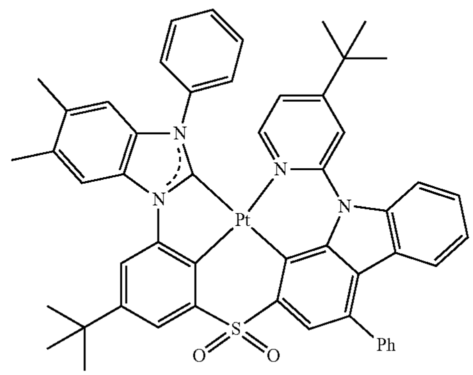
119
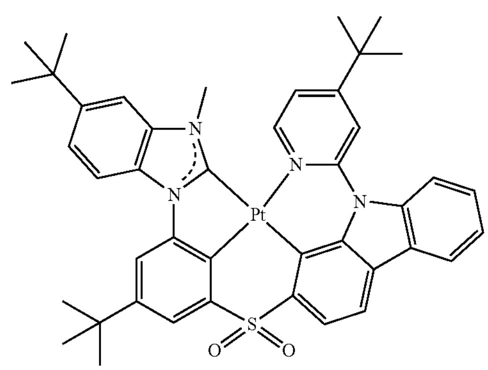
120
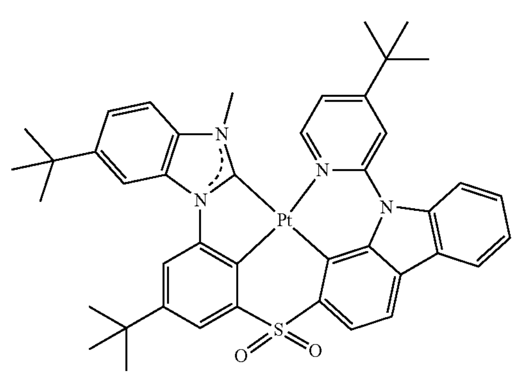

-continued
Group S-III
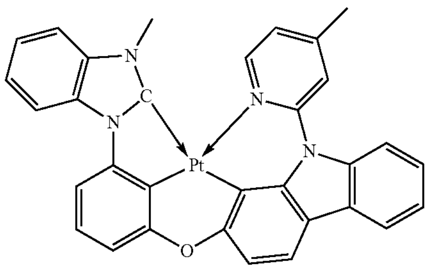
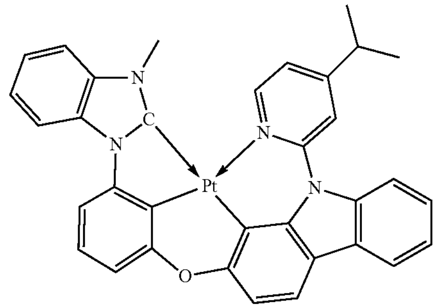
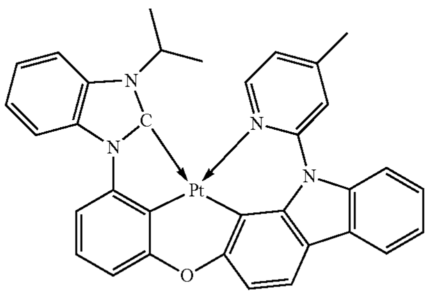
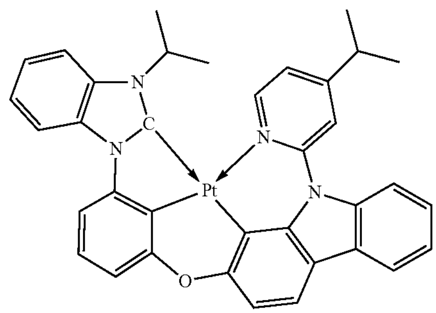
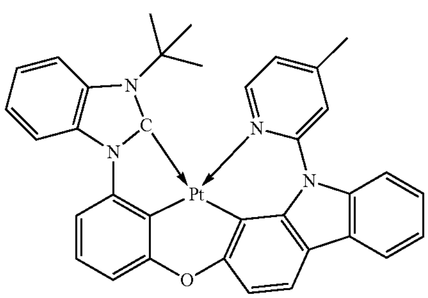
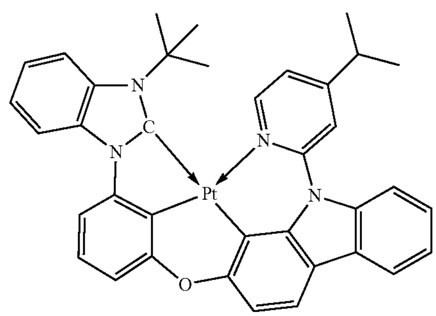
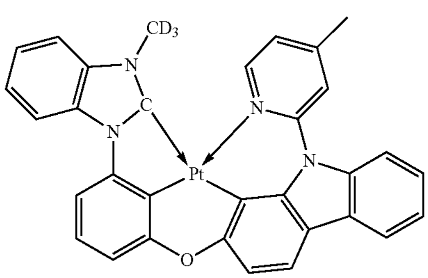
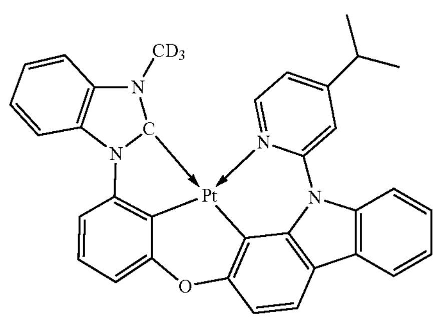
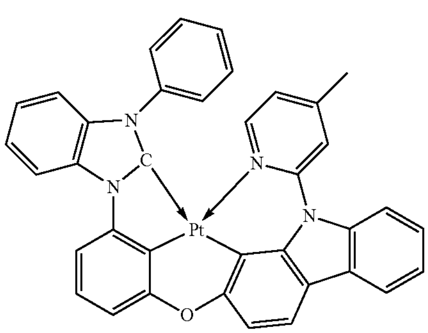
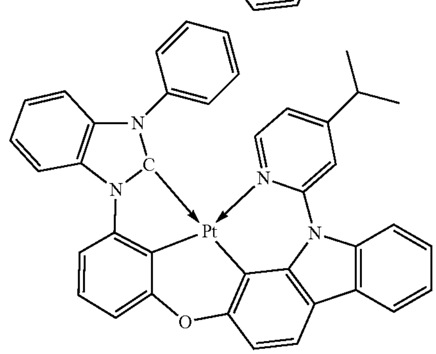

-continued
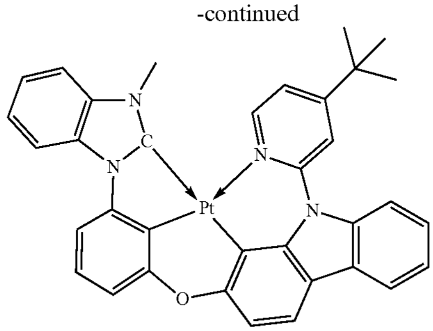
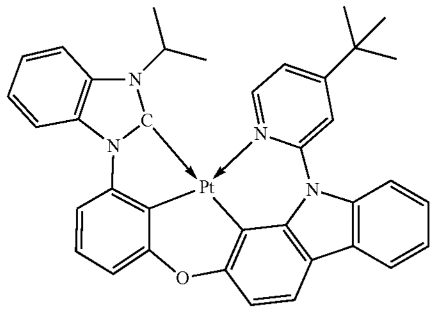
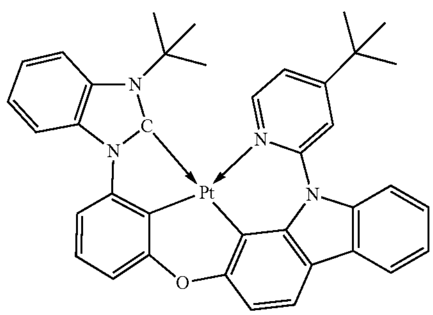
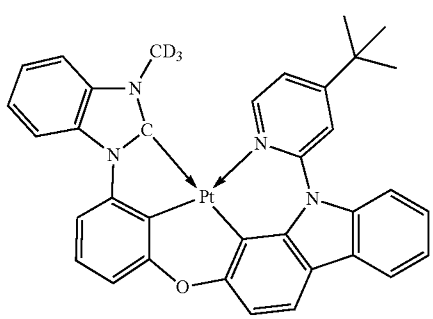
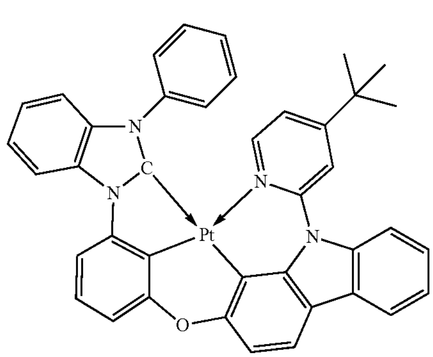
-continued
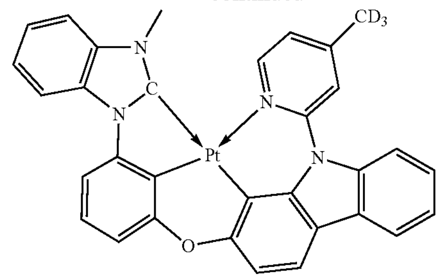
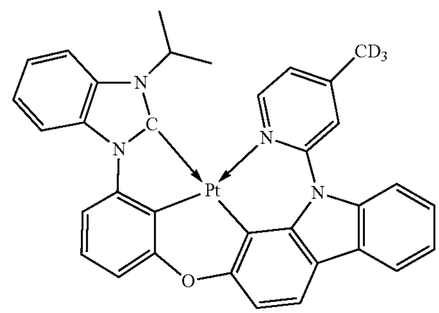
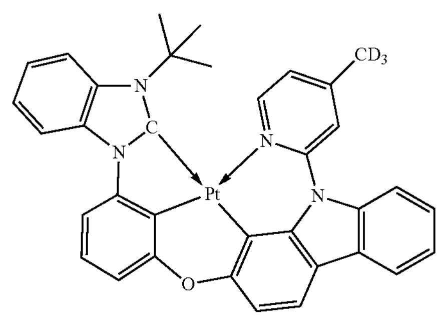
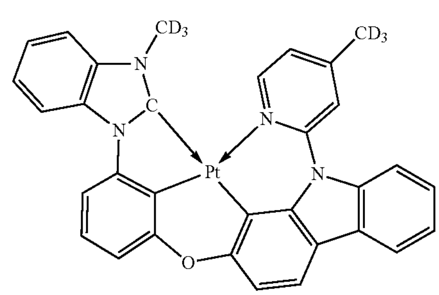
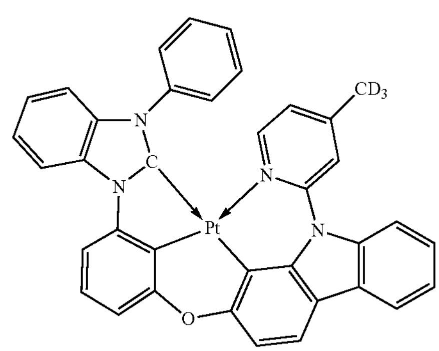

-continued
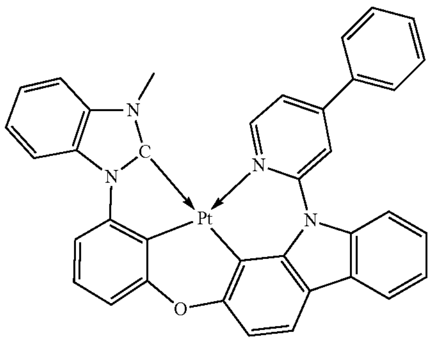
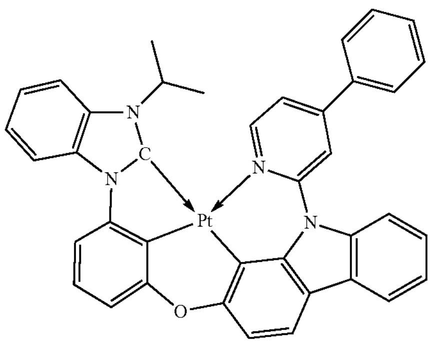
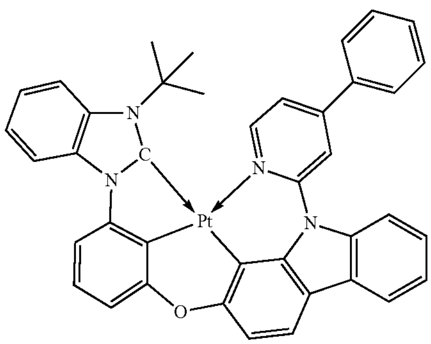
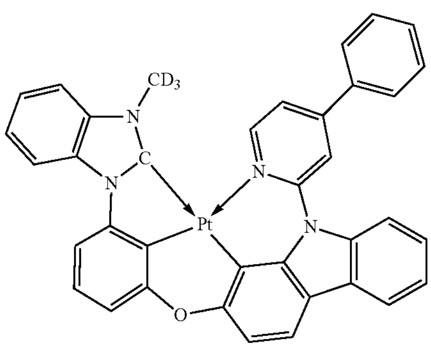
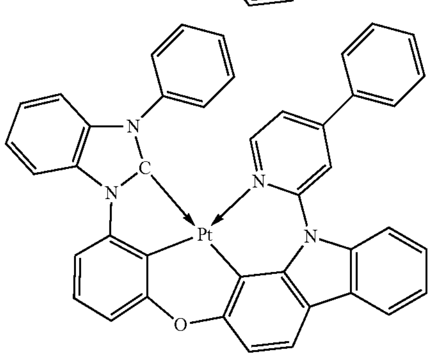
-continued
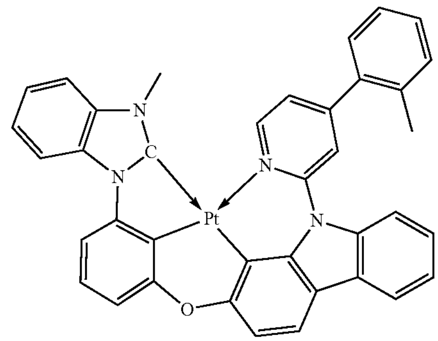
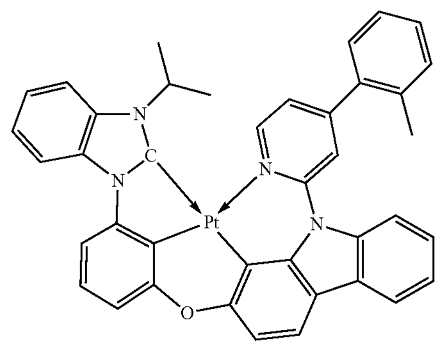
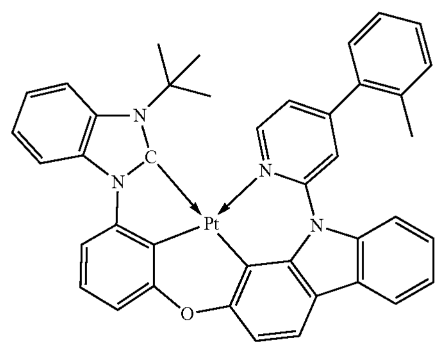
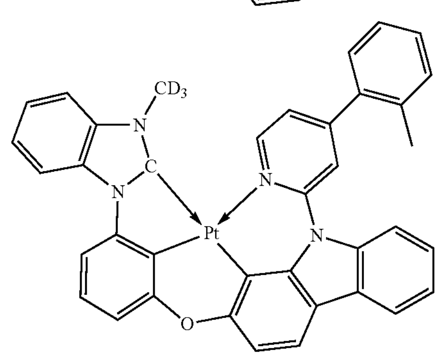
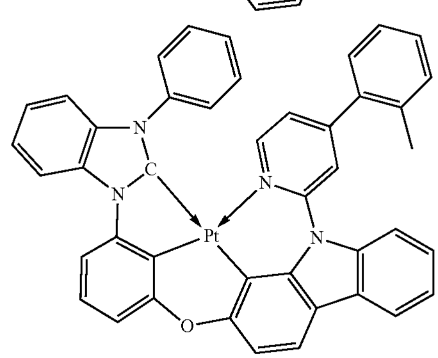

-continued
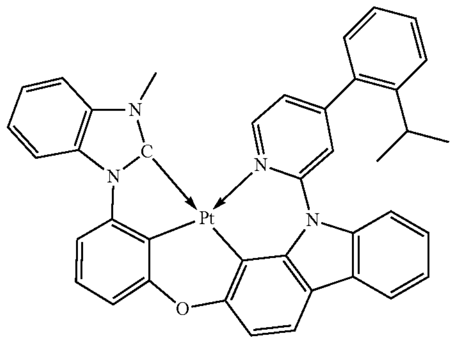
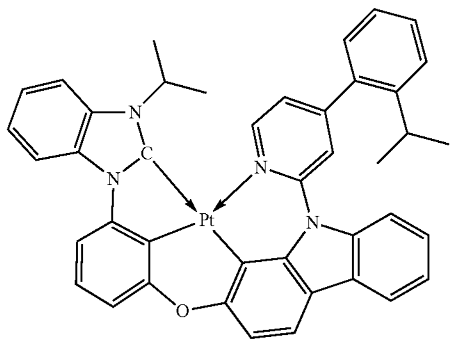
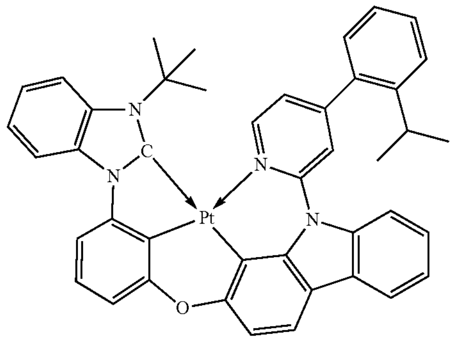
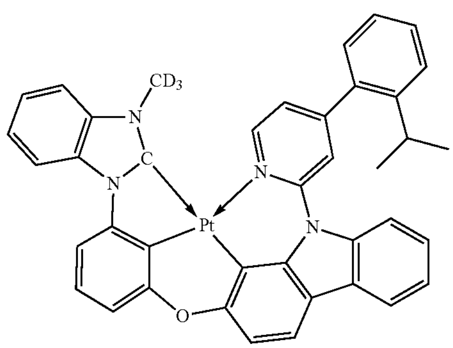
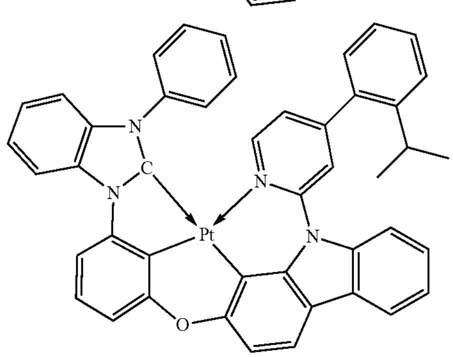
-continued
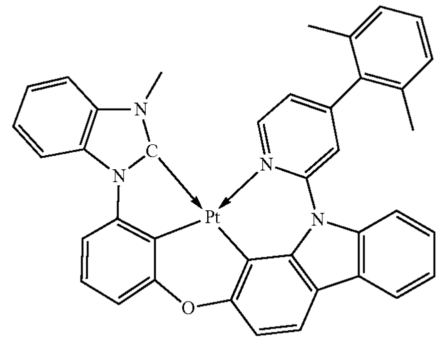
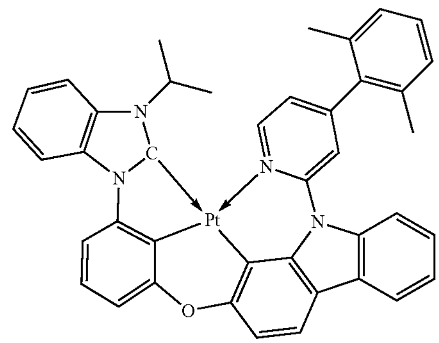
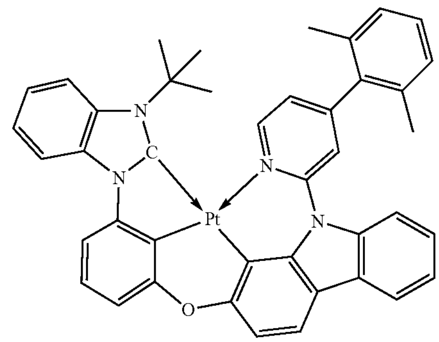
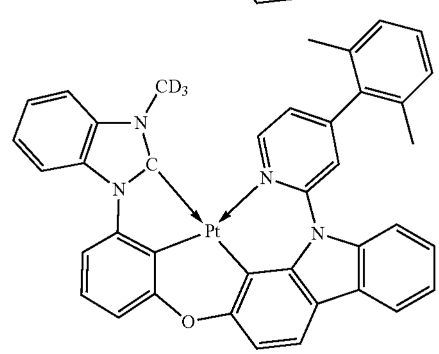
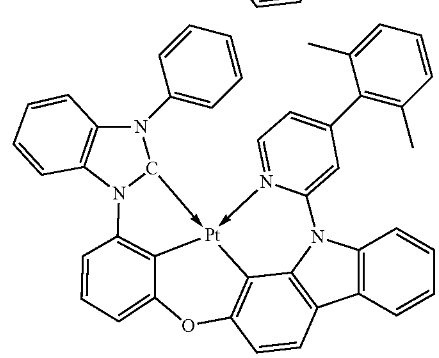

-continued
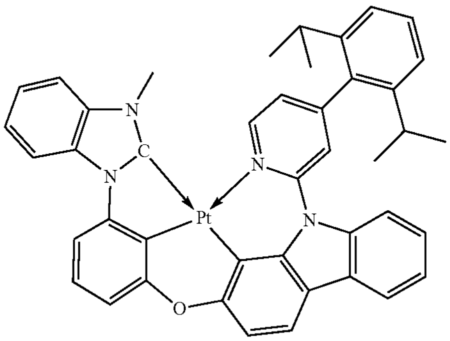
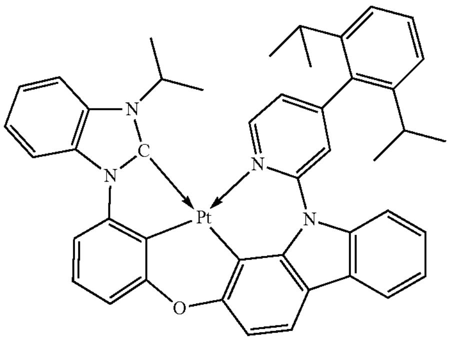
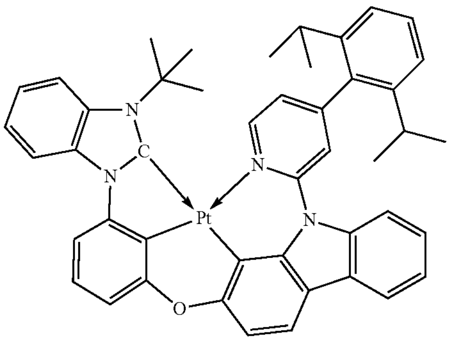
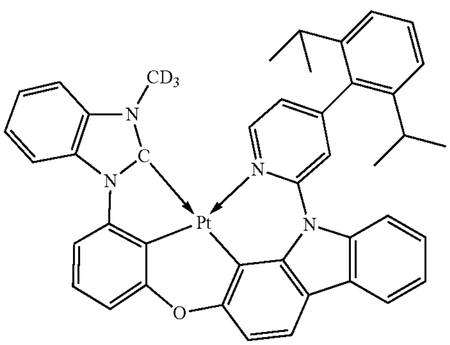
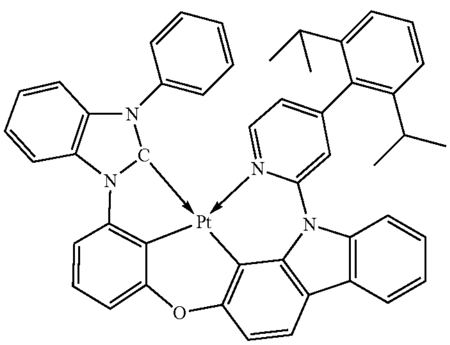
-continued
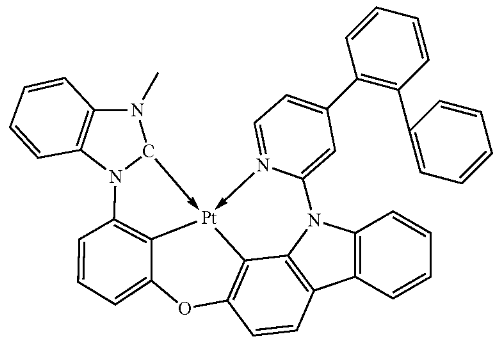
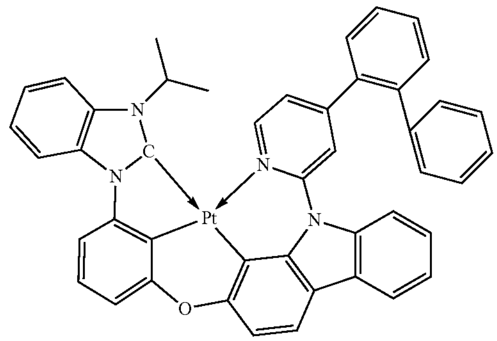
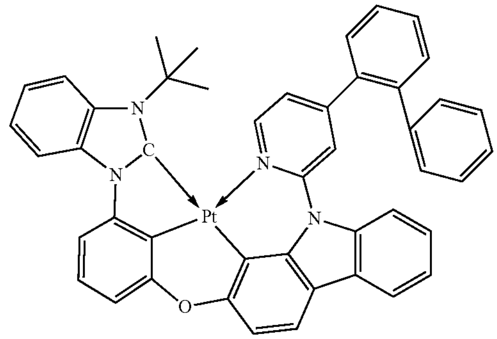
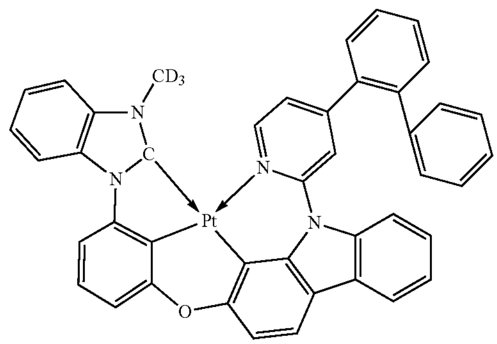
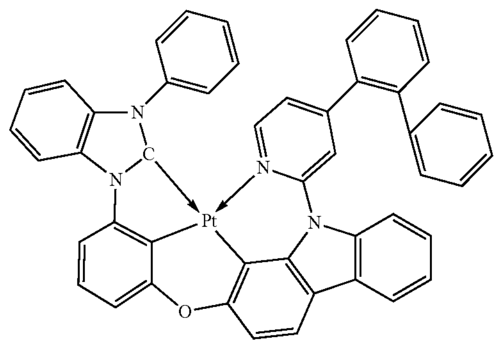

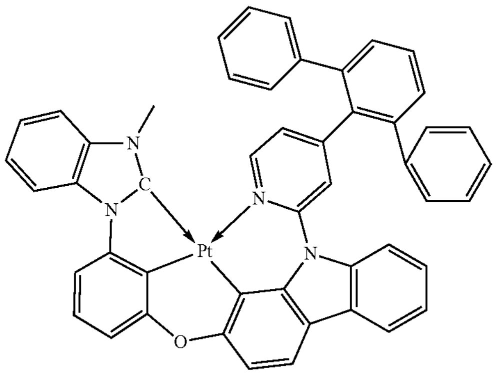
N
C
N
Pt
N
N
O
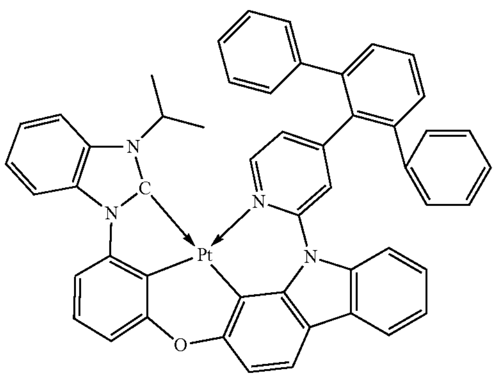
N
C
N
Pt
N
N
O
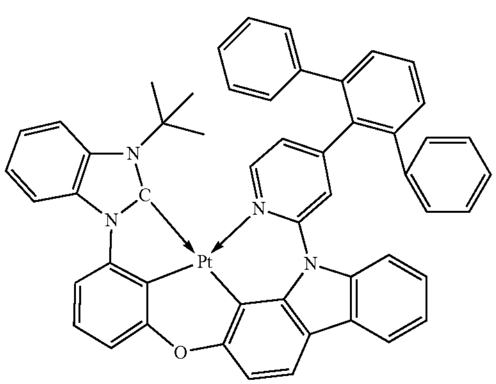
N
C
N
Pt
N
N
O
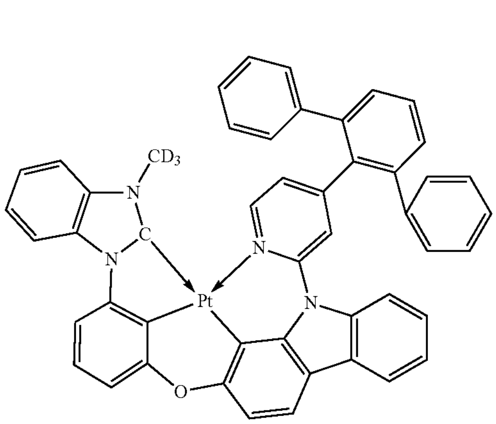
CD3
N
C
N
Pt
N
N
O
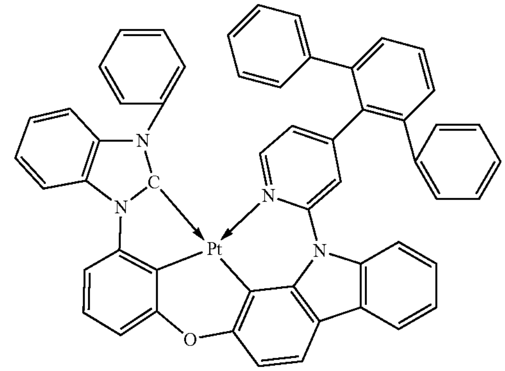
N
C
N
Pt
N
N
O
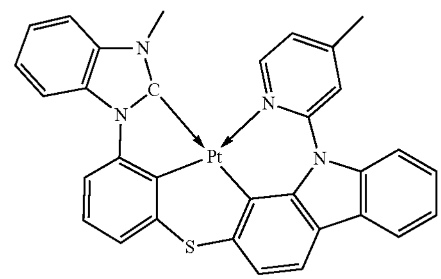
N
C
N
Pt
N
N
S
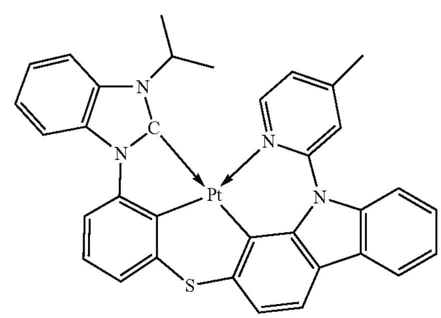
N
C
N
Pt
N
N
S
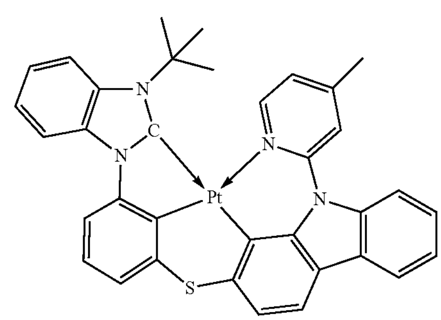
N
C
N
Pt
N
N
S
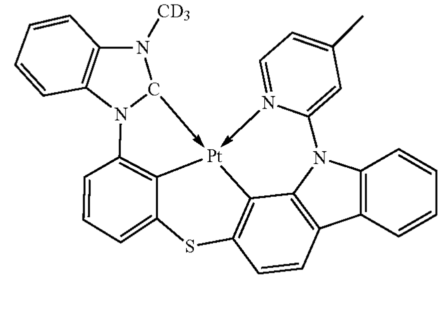
CD3
N
C
N
Pt
N
N
S -continued
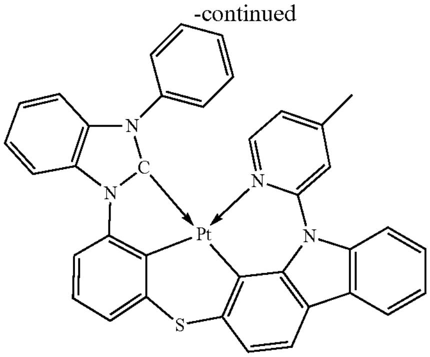
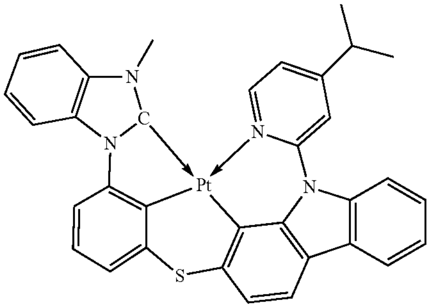
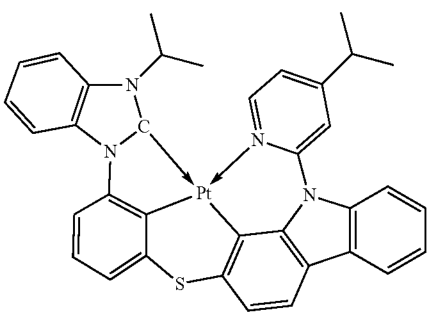
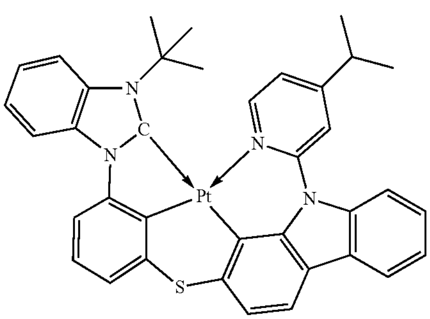
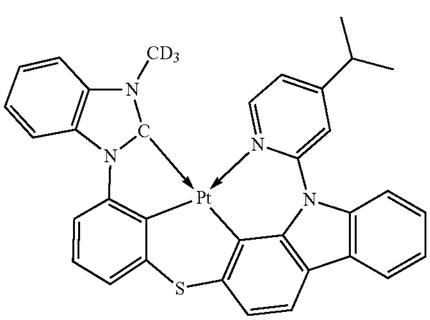
-continued
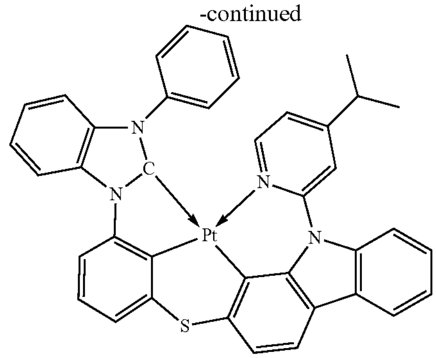
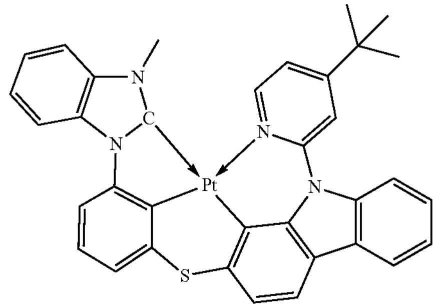
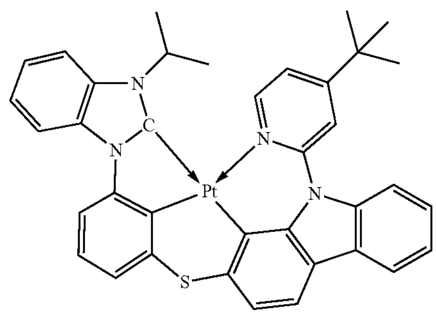
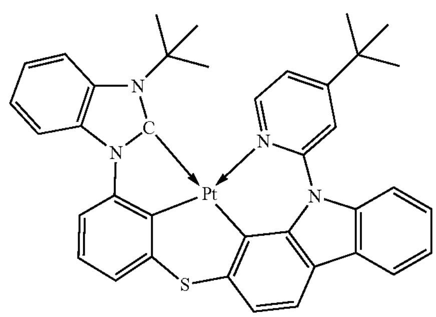
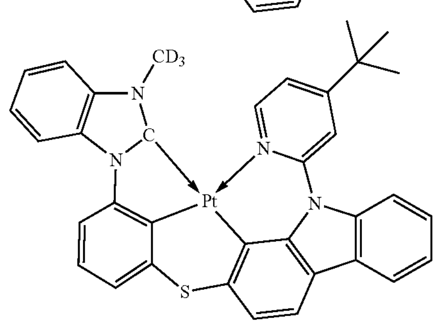

-continued
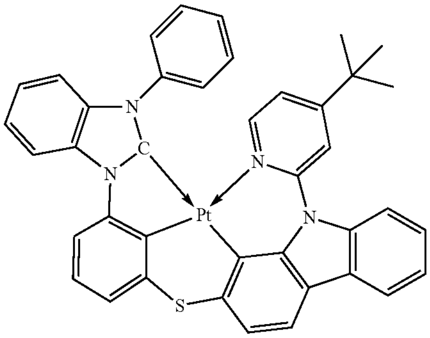
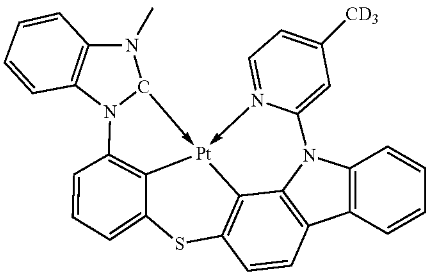
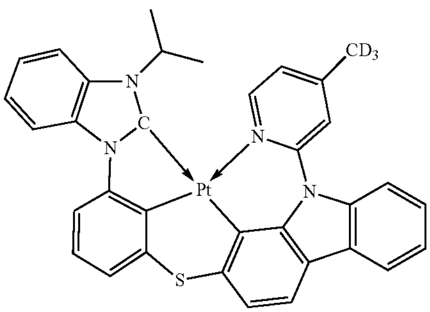
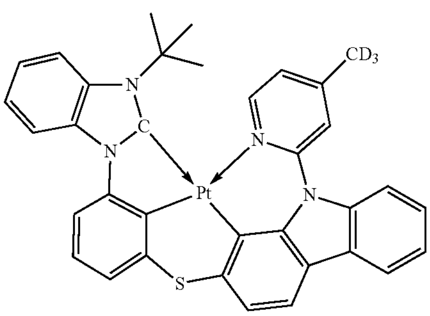
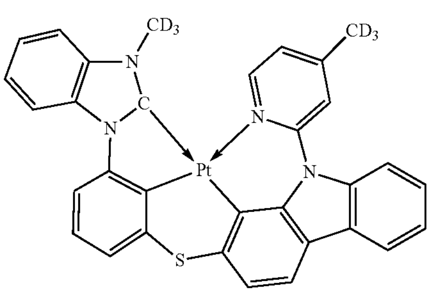
-continued
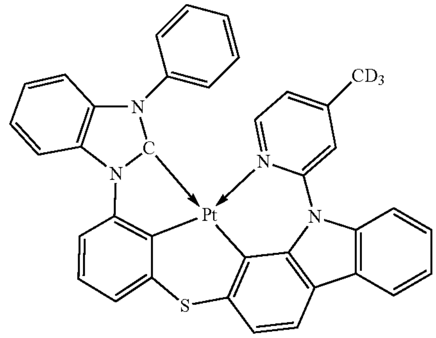
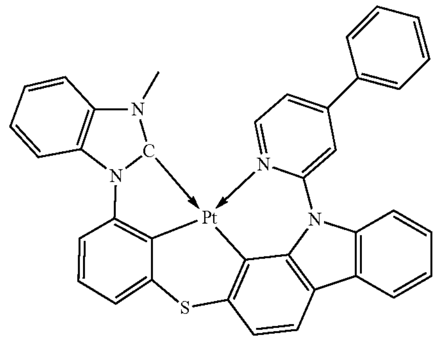
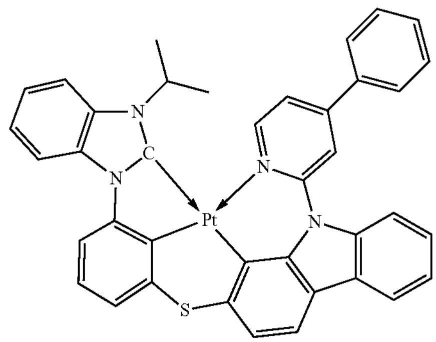
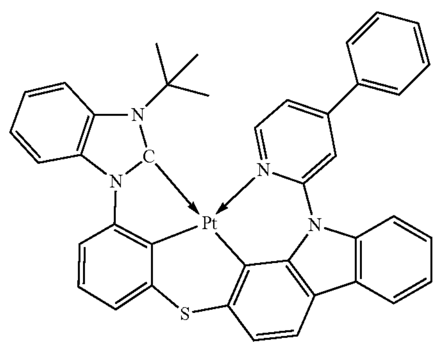
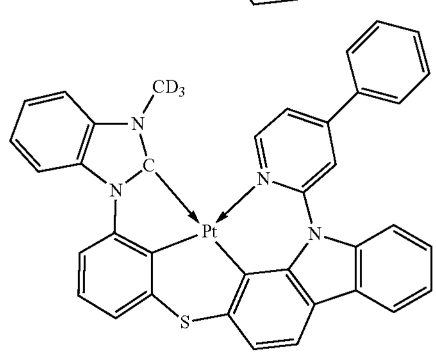

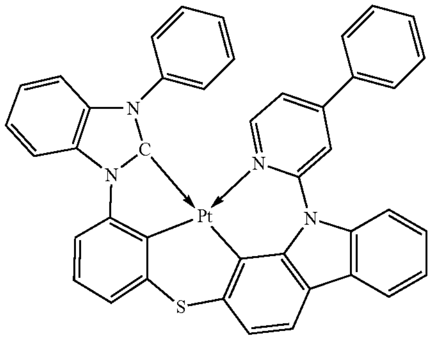
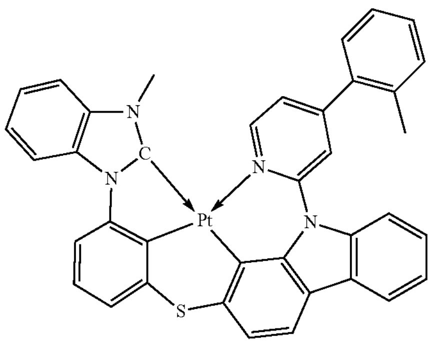
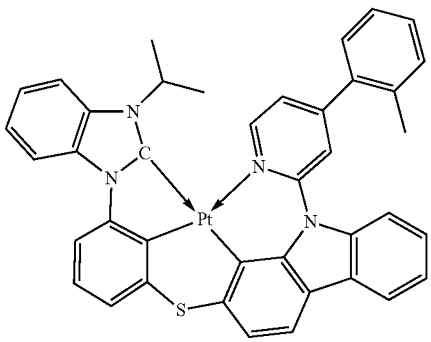
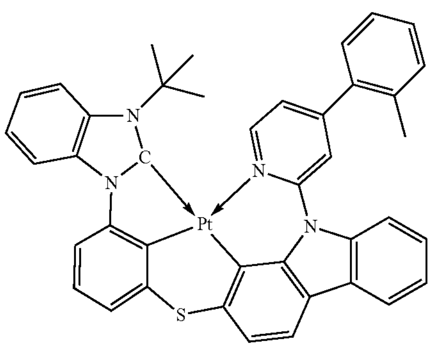
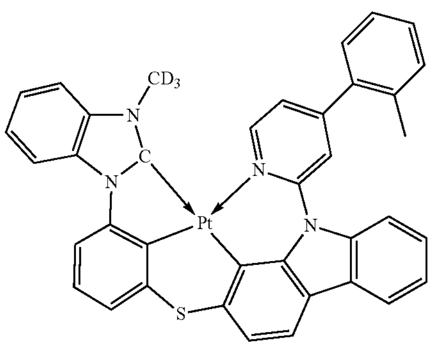
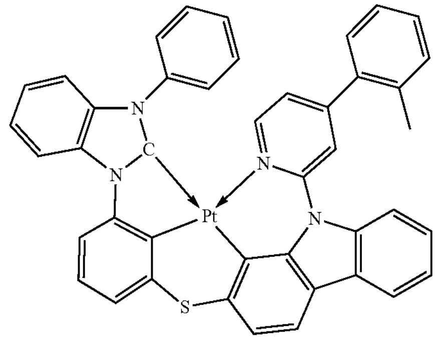
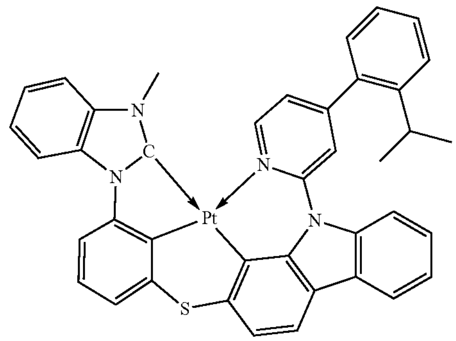
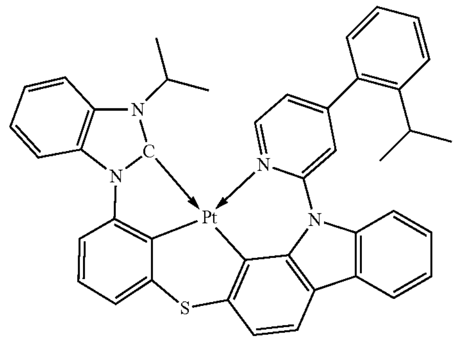
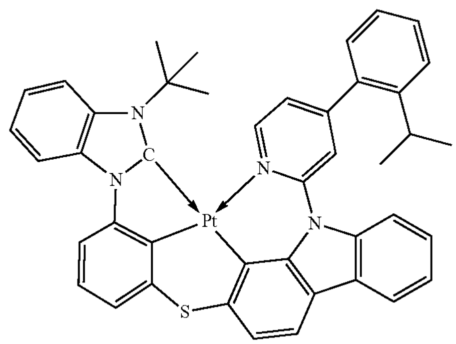
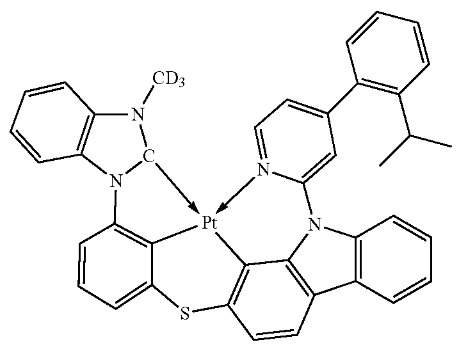

-continued
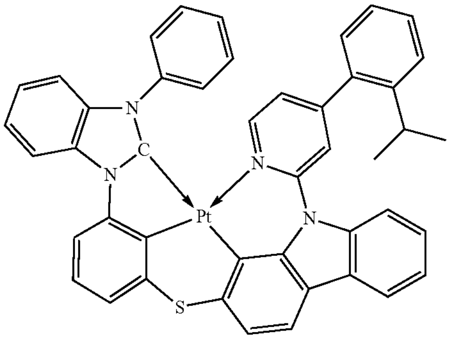
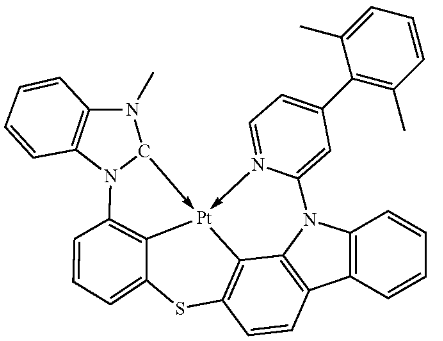
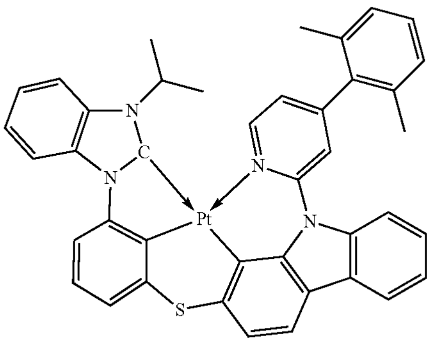
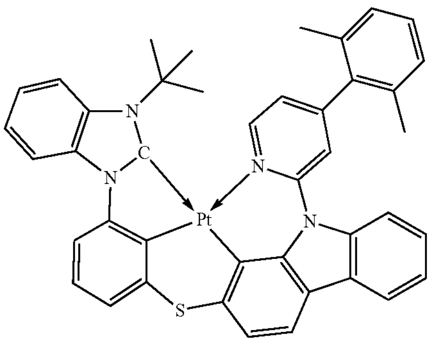
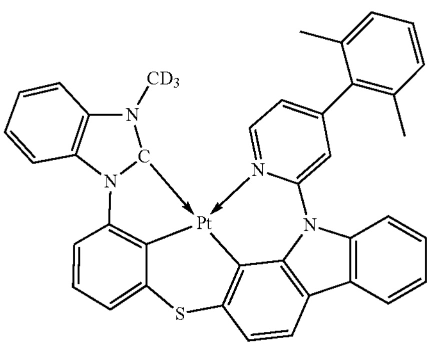
-continued
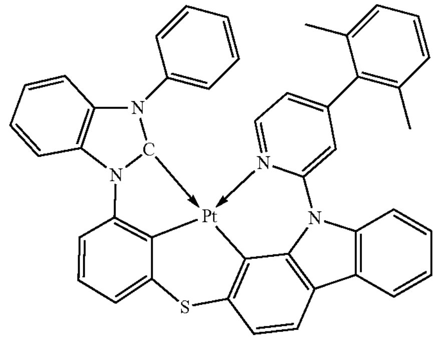
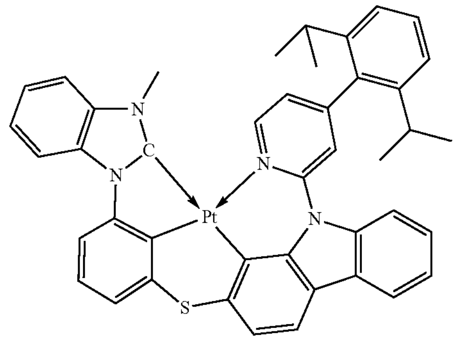
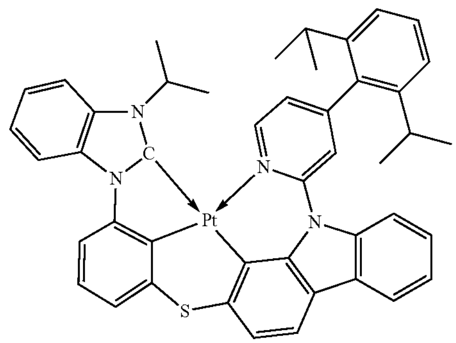
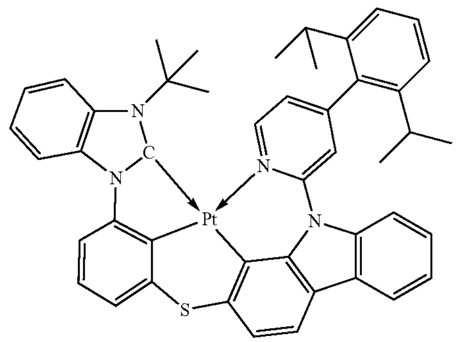
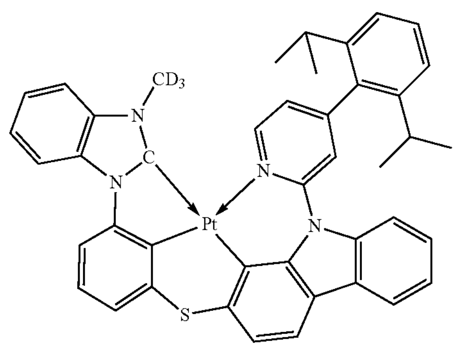

-continued
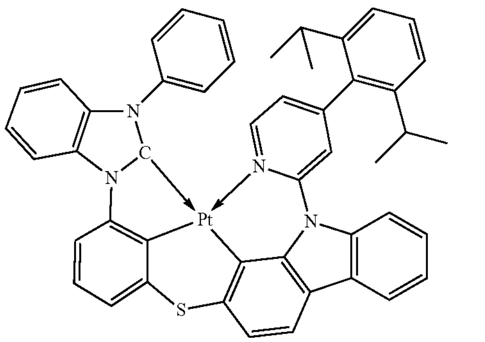
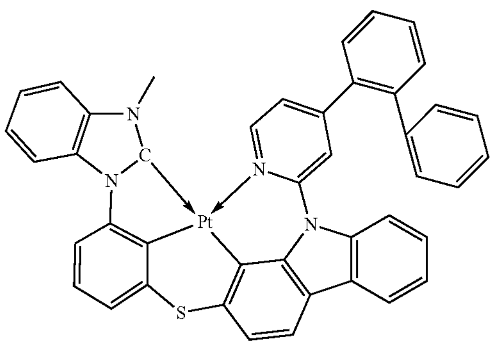
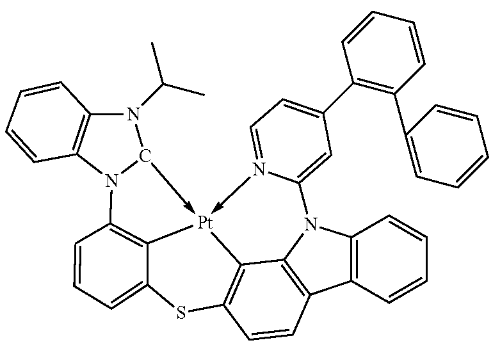
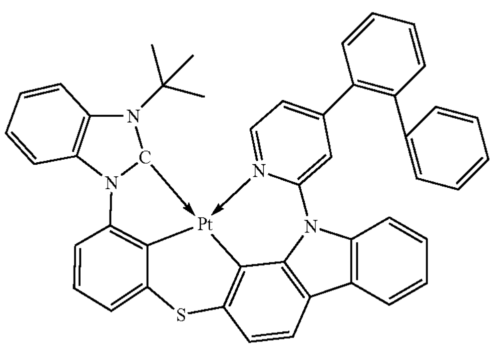
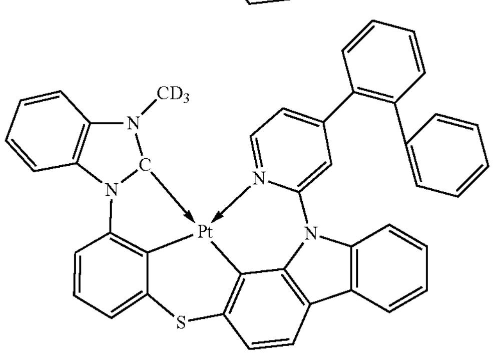
-continued
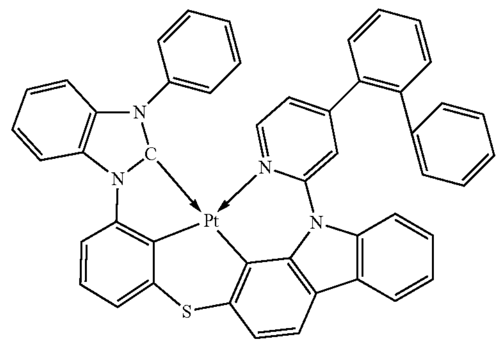
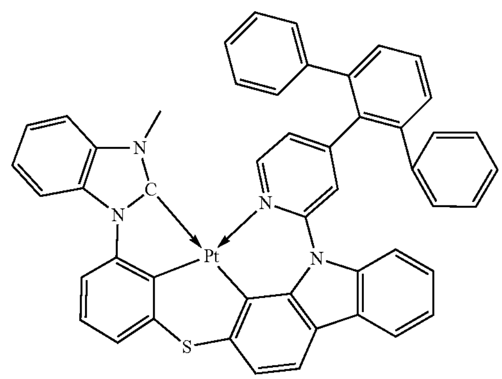
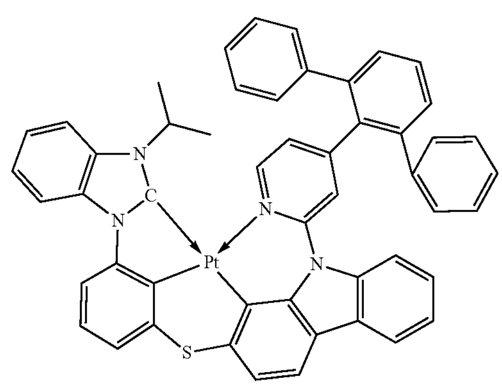
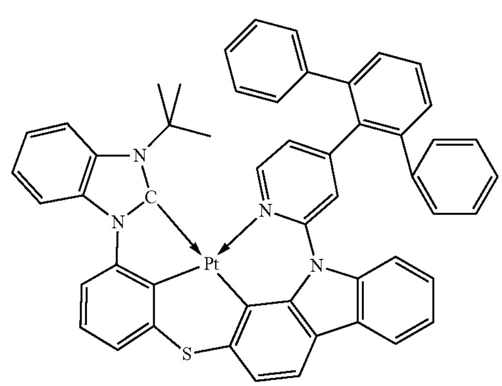

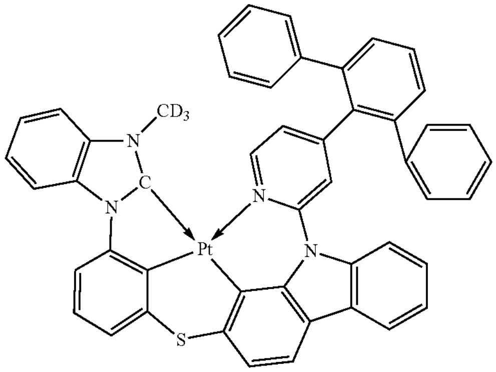
CD3
N
C
N
Pt
N
N
S
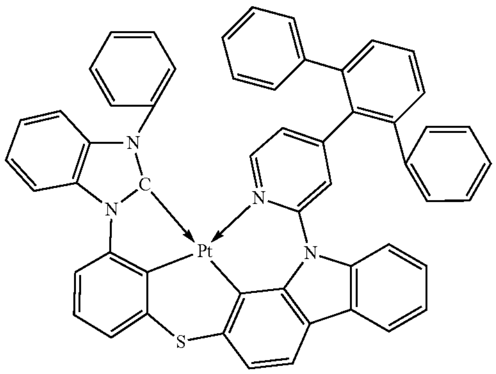
N
C
N
Pt
N
N
S
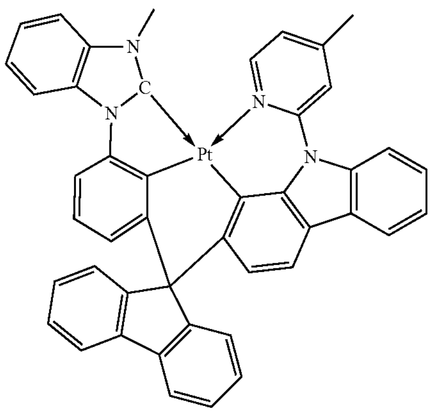
N
C
N
Pt
N
N
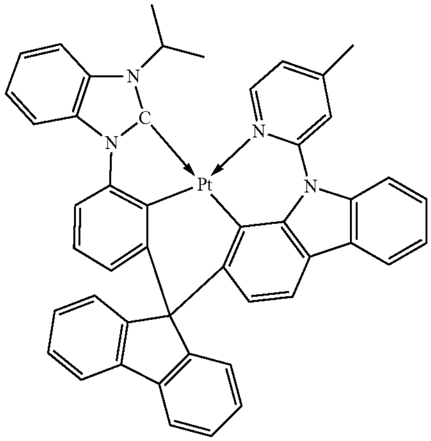
N
C
N
Pt
N
N
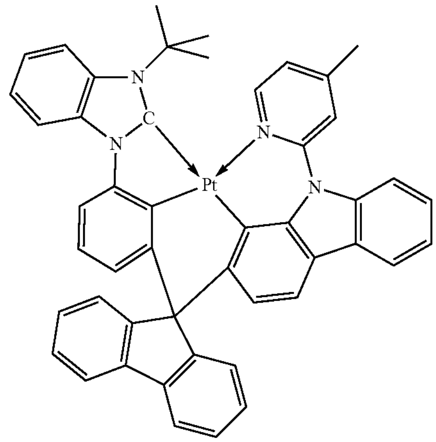
N
C
N
Pt
N
N
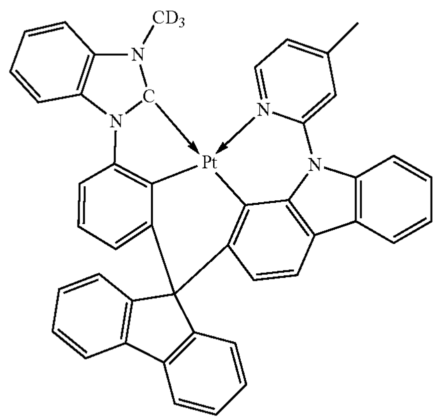
CD3
N
C
N
Pt
N
N
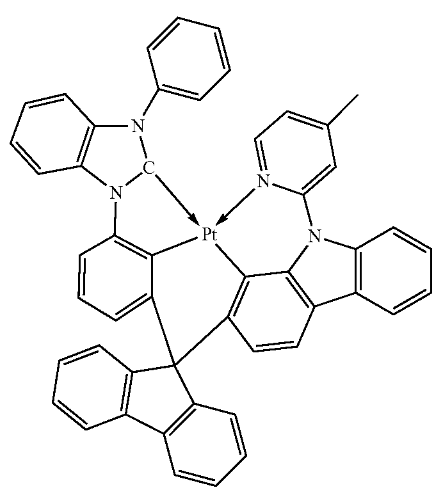
N
C
N
Pt
N
N

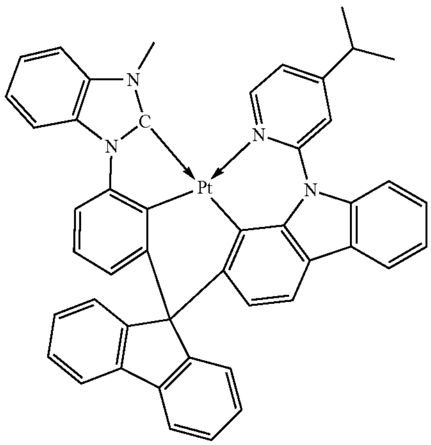
N
C
N
Pt
N
N
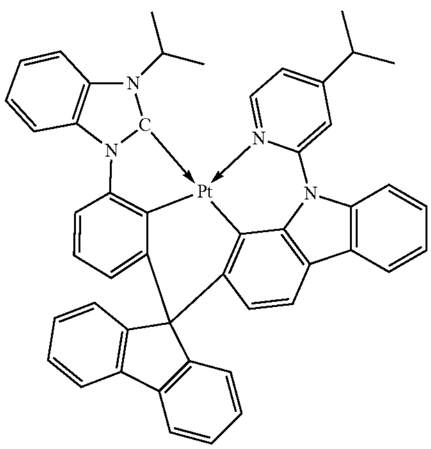
N
C
N
Pt
N
N
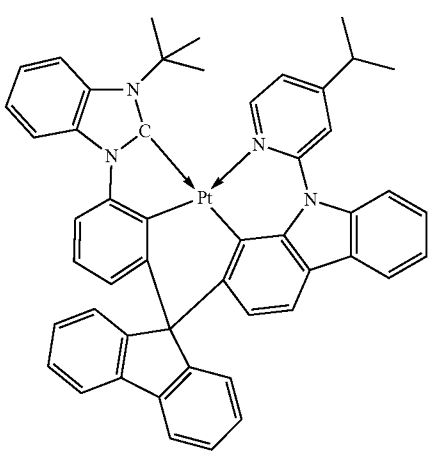
N
C
N
Pt
N
N
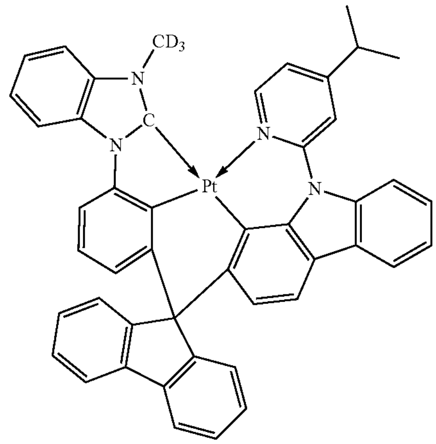
CD3
N
C
N
Pt
N
N
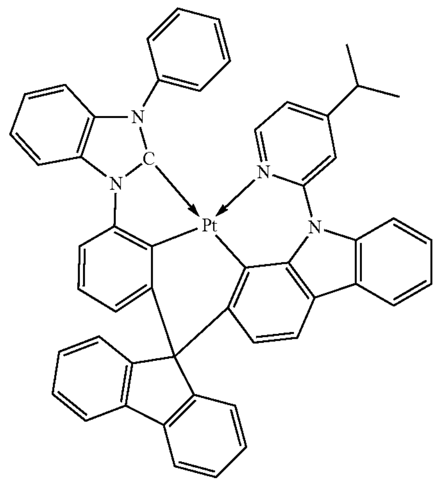
N
C
N
Pt
N
N
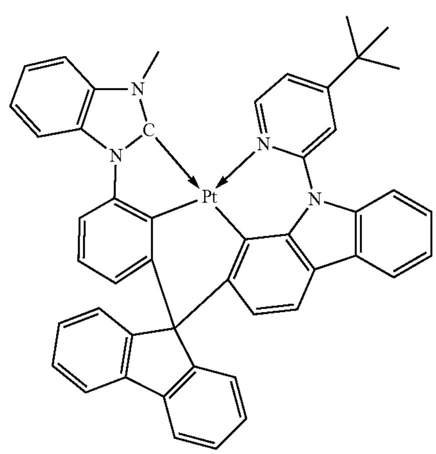
N
C
N
Pt
N
N -continued
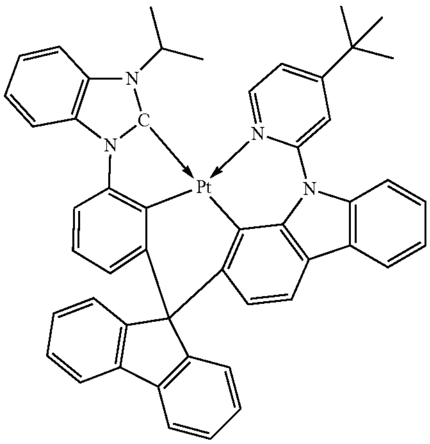
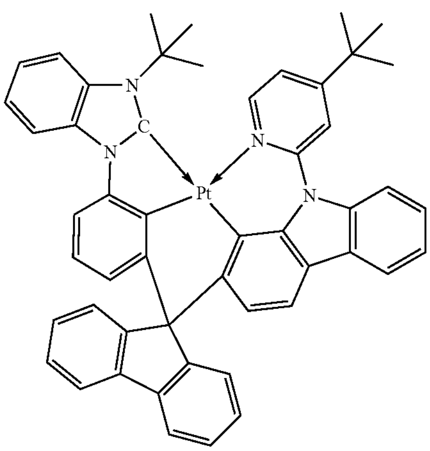
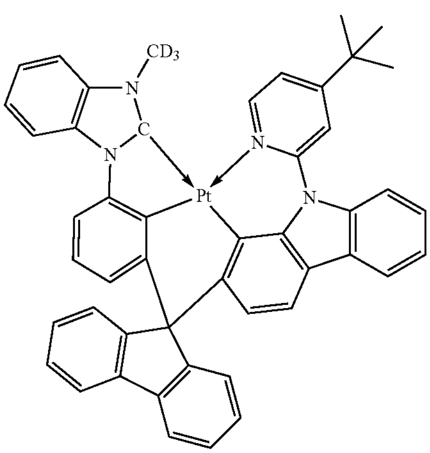
-continued
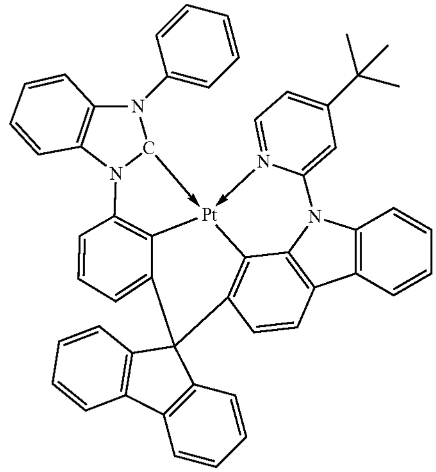
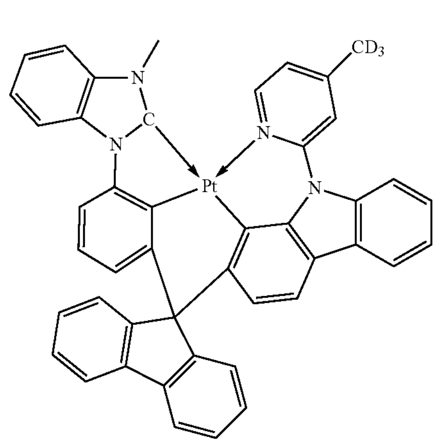
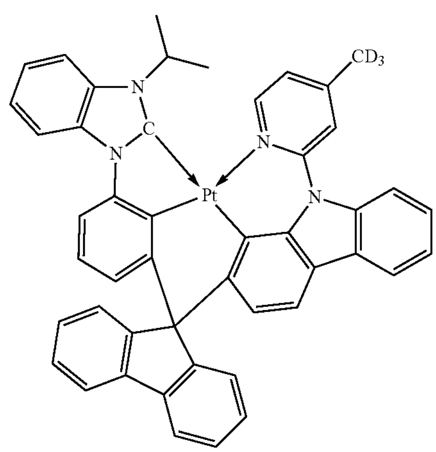

-continued
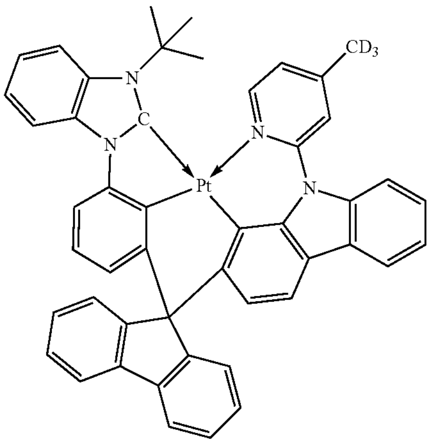
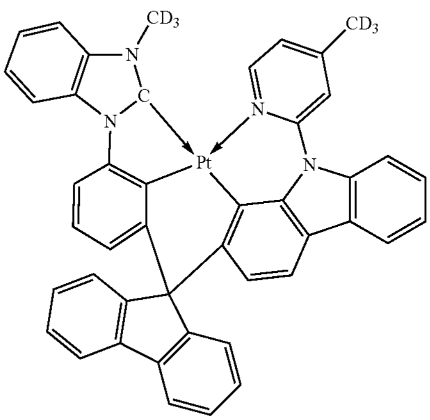
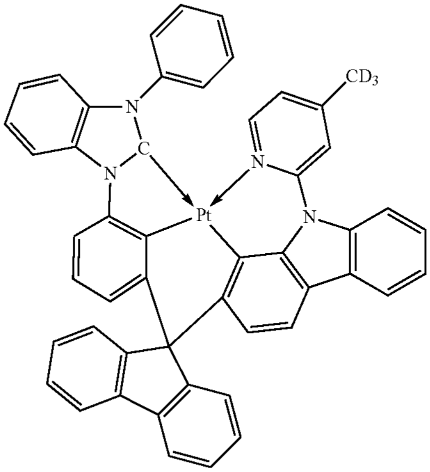
-continued
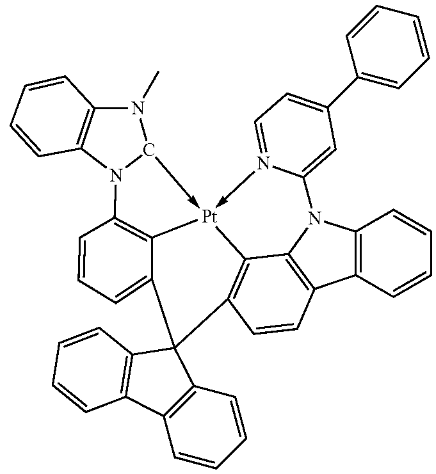
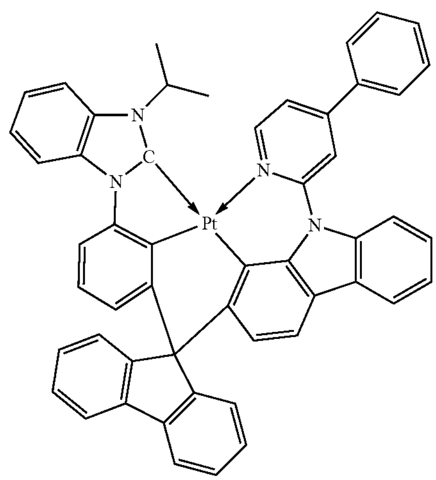
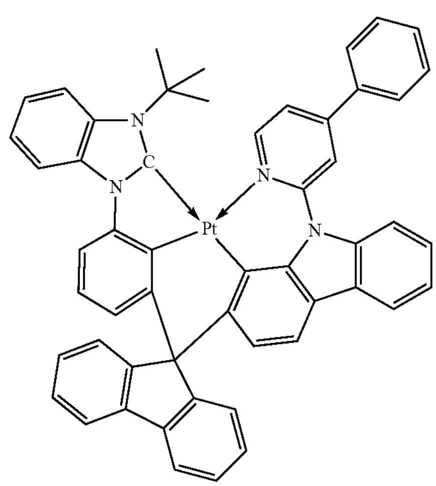

-continued
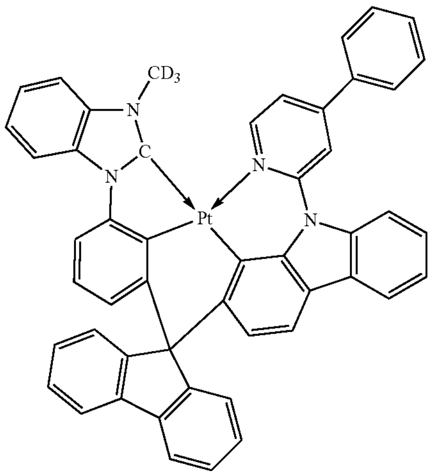
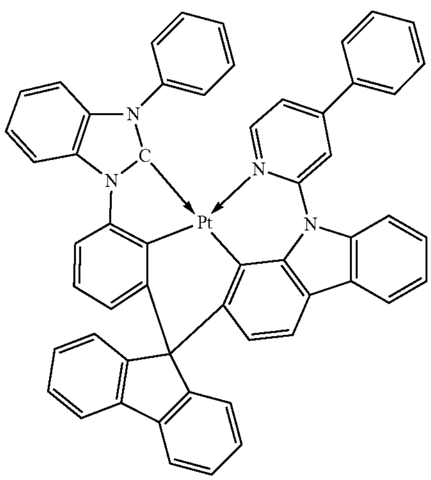
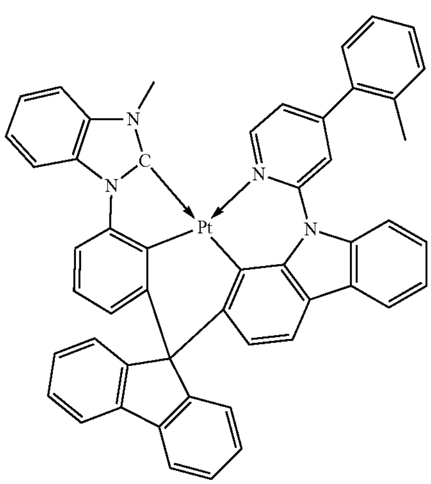
-continued
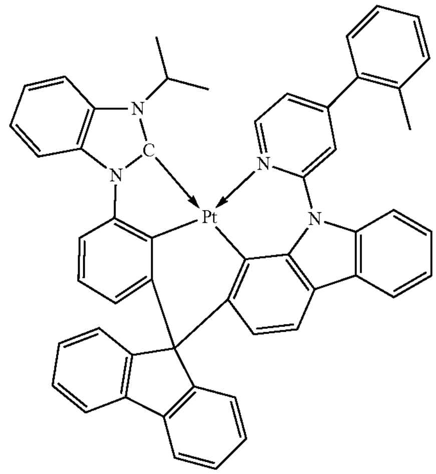
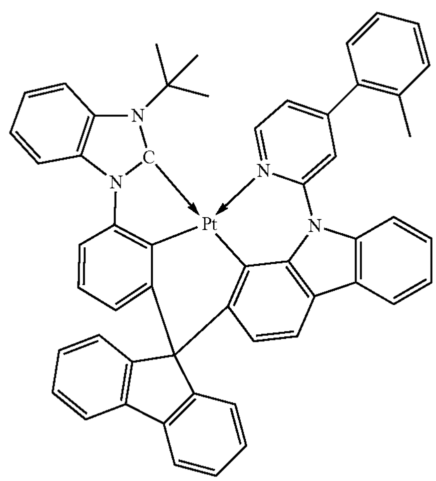
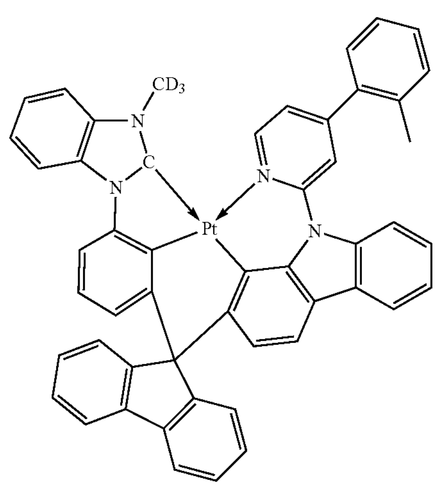

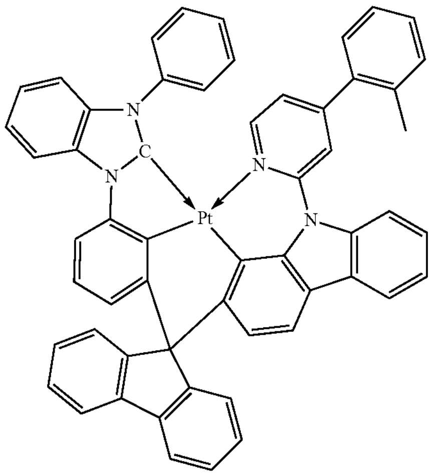
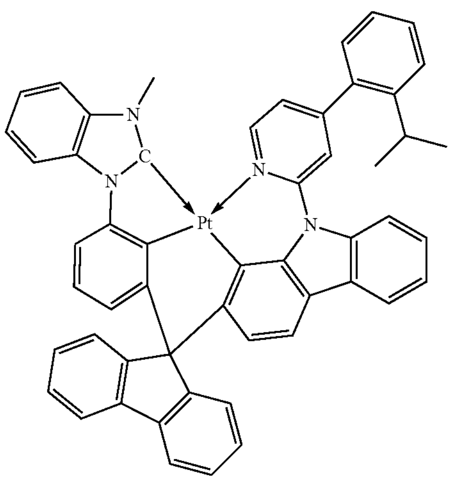
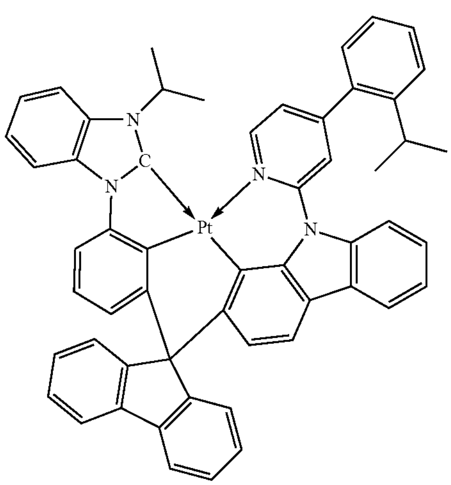
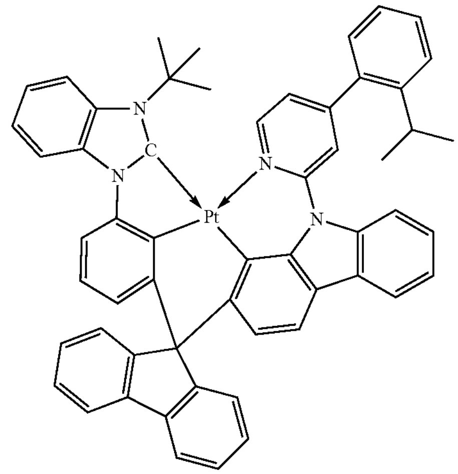
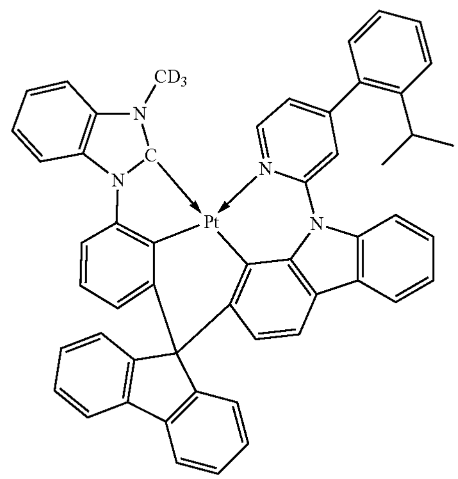
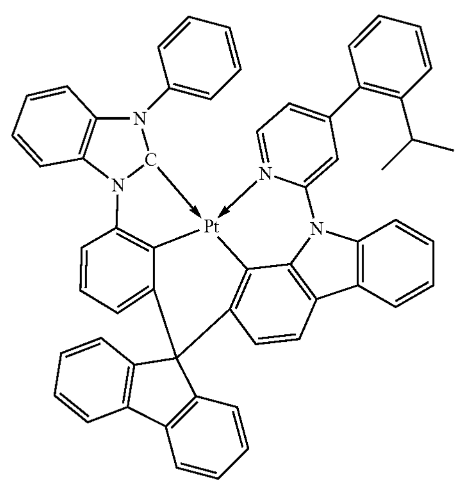

-continued
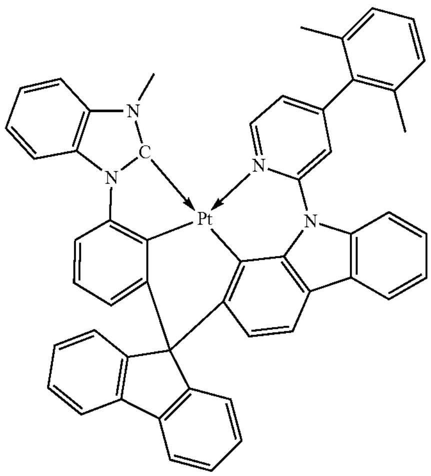
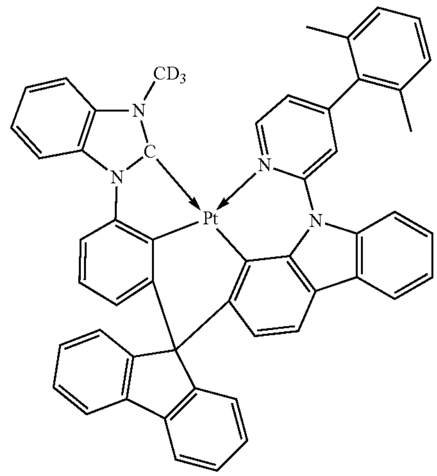
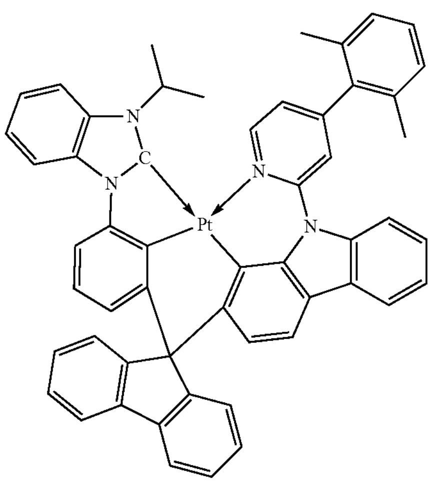
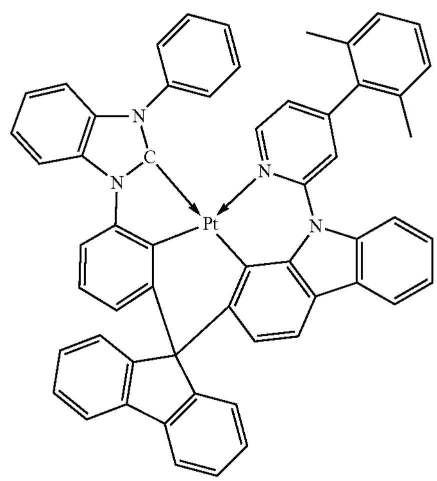
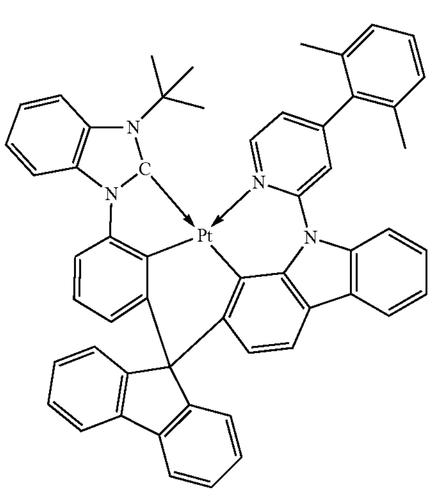
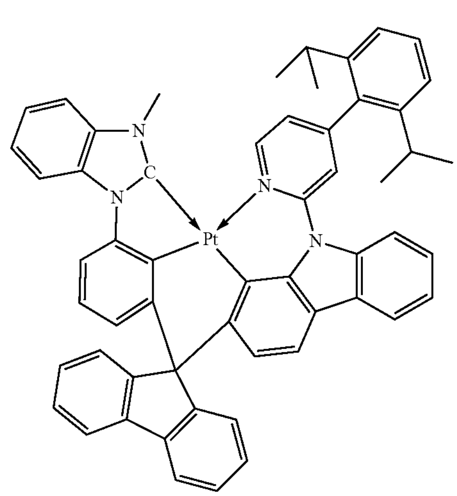

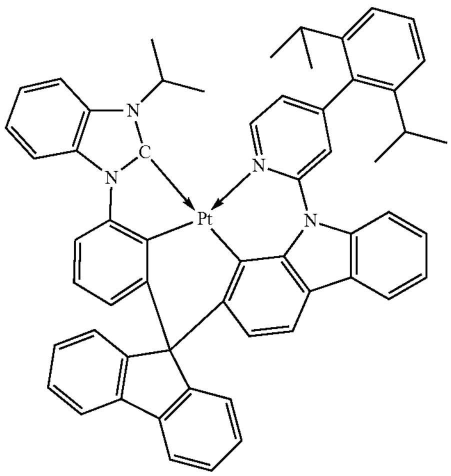
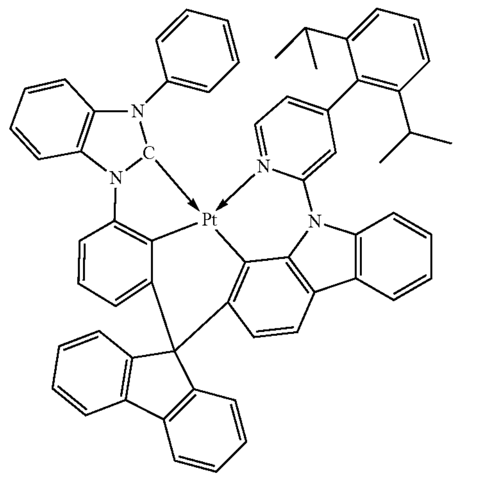
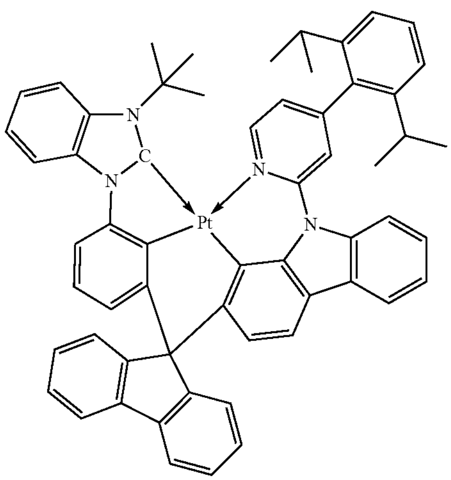
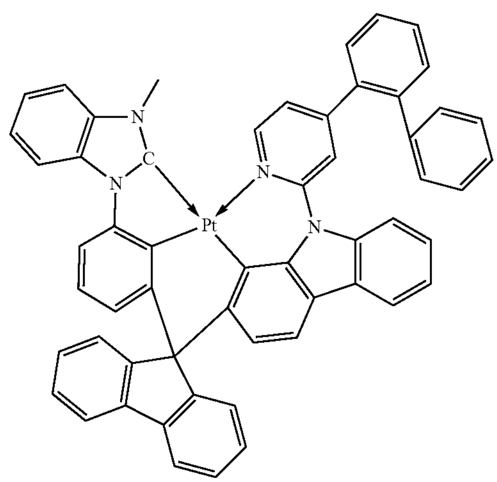
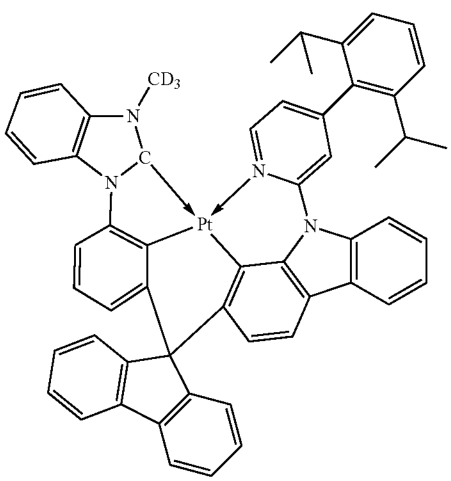
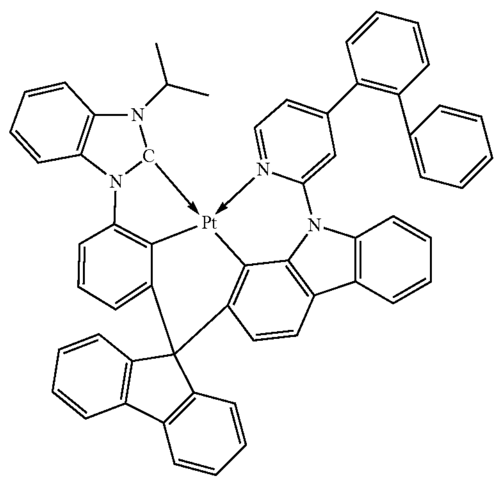

-continued
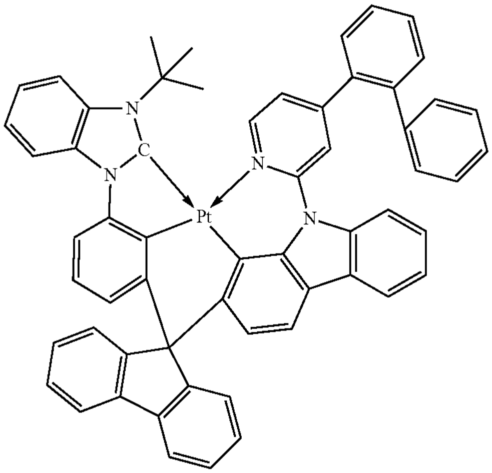
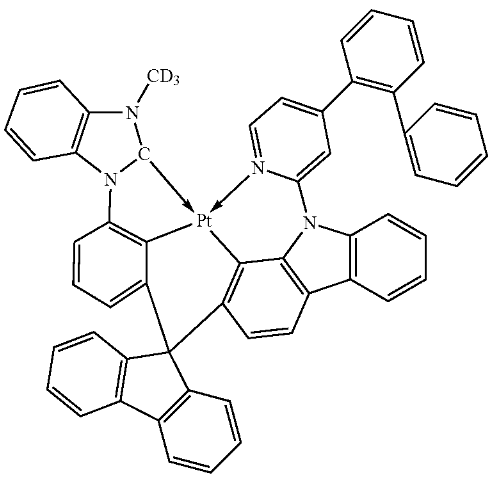
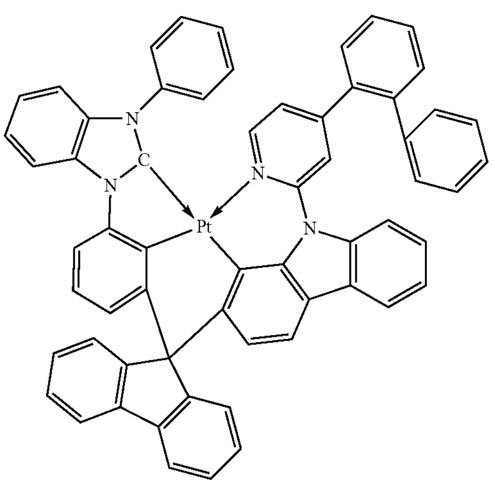
-continued
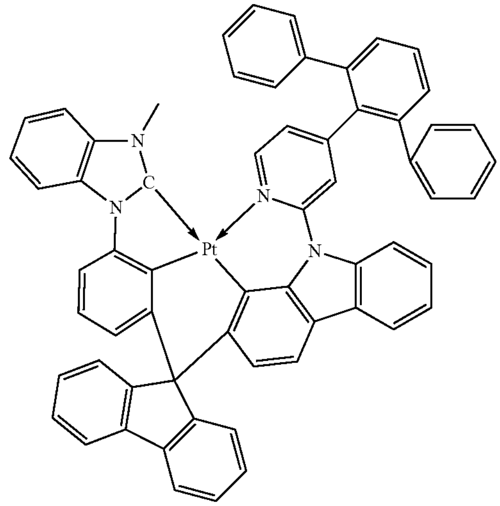
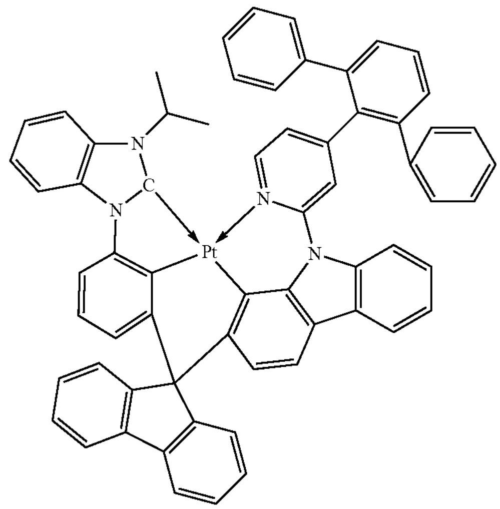
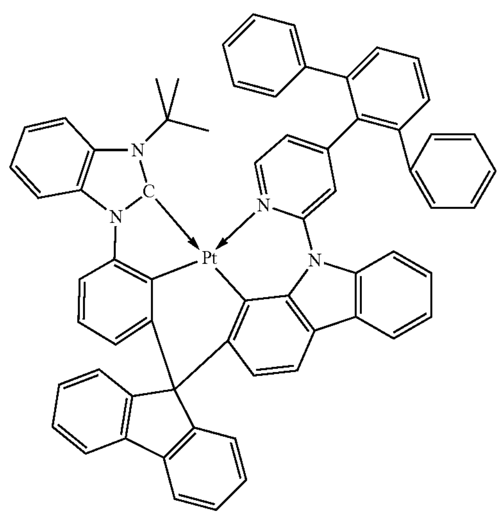

-continued
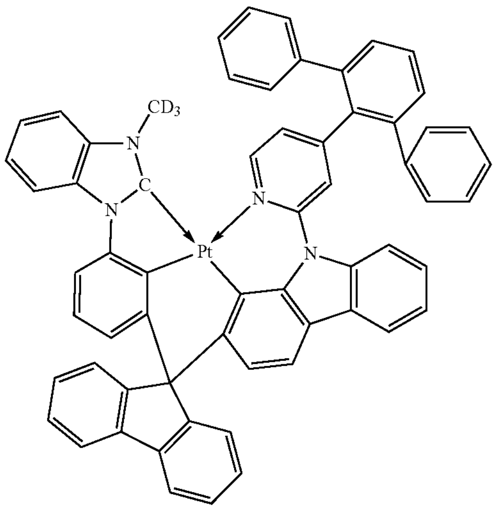
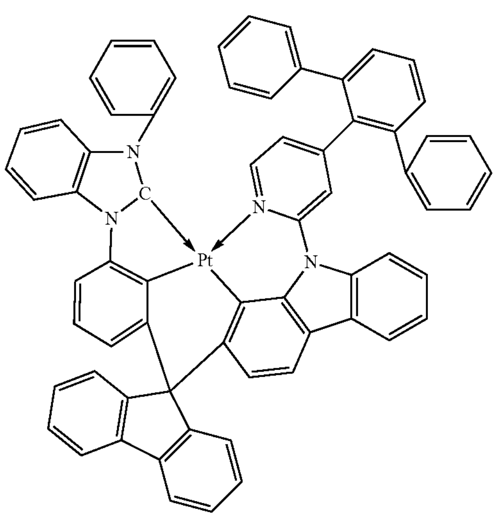
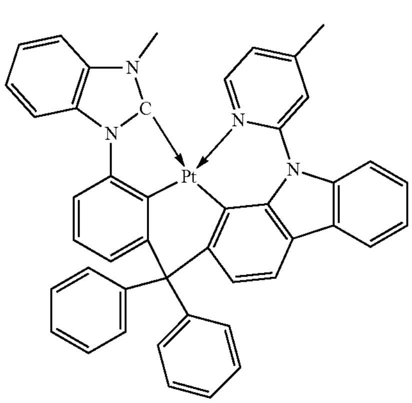
-continued
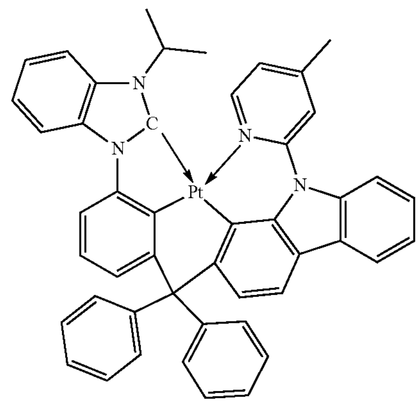
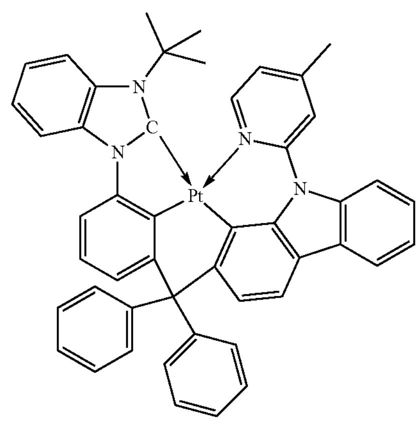
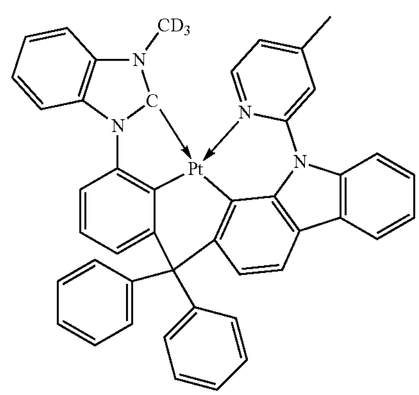
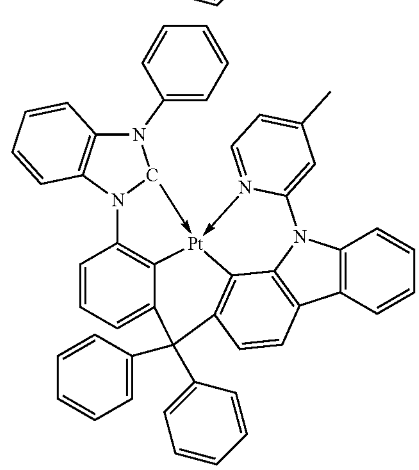

-continued
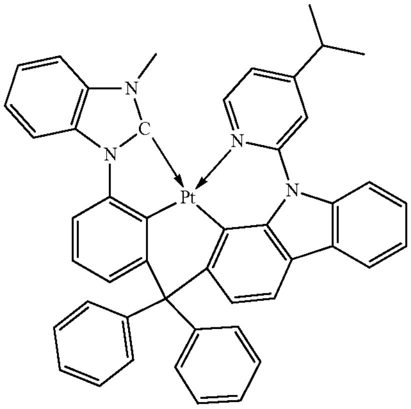
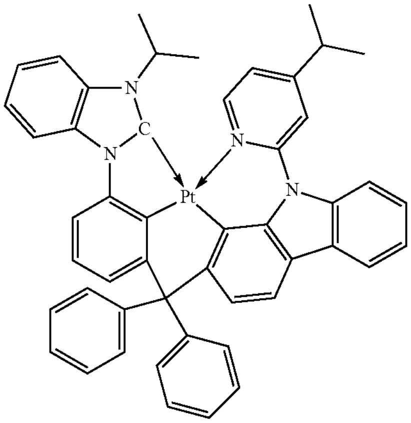
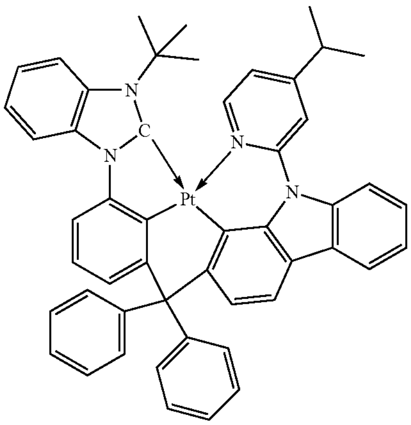
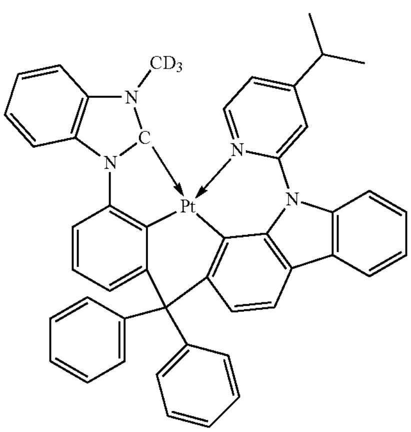
-continued
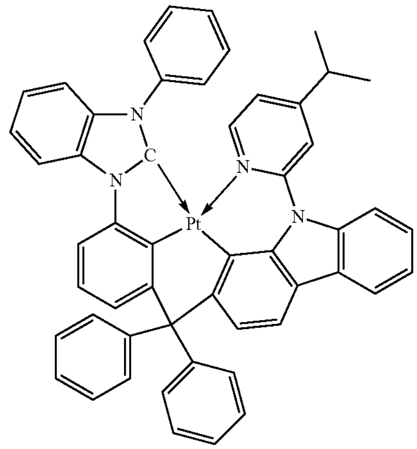
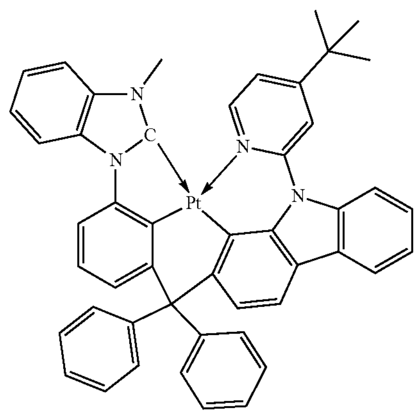
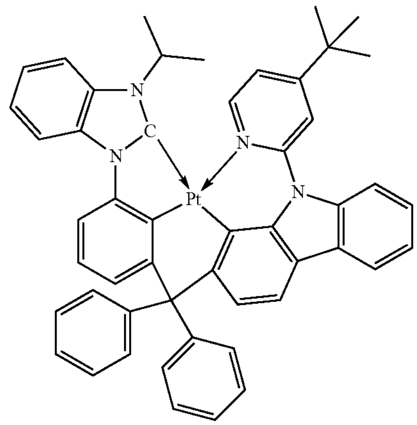
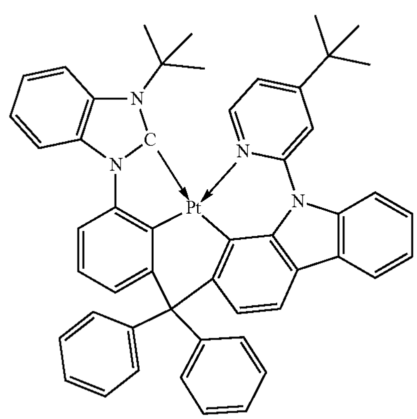

-continued
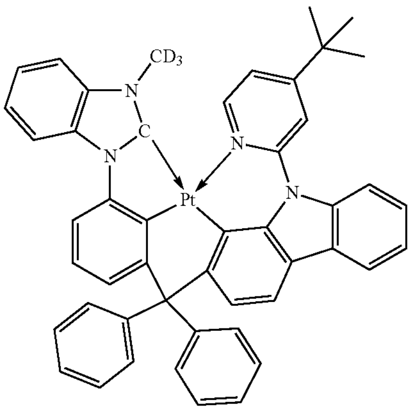
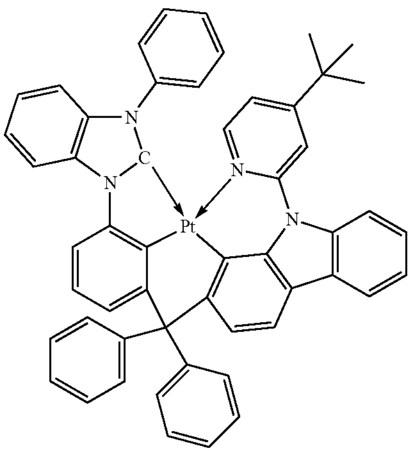
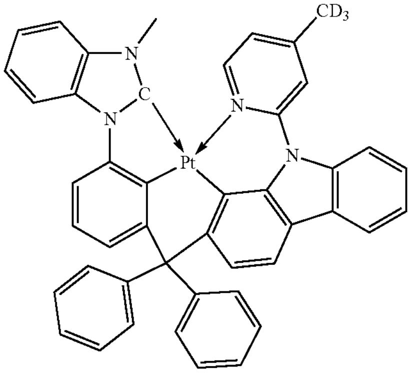
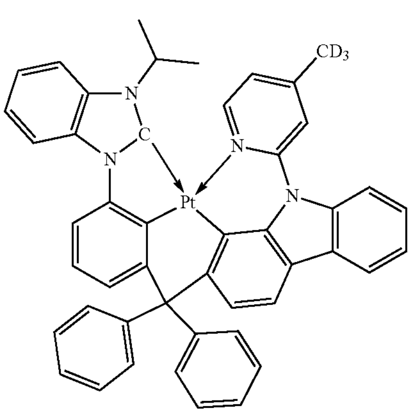
-continued
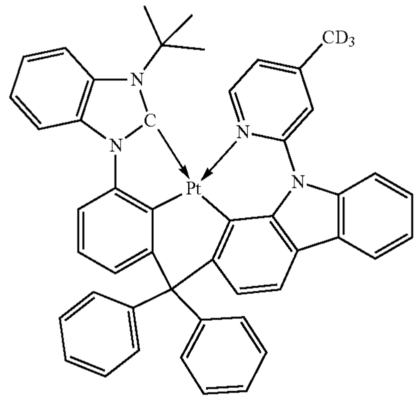
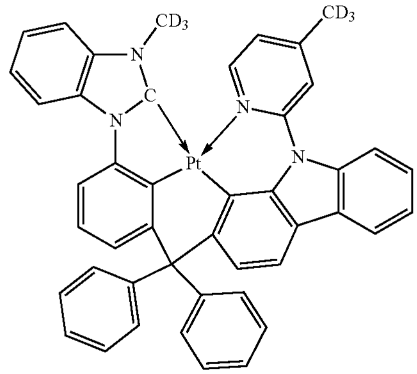
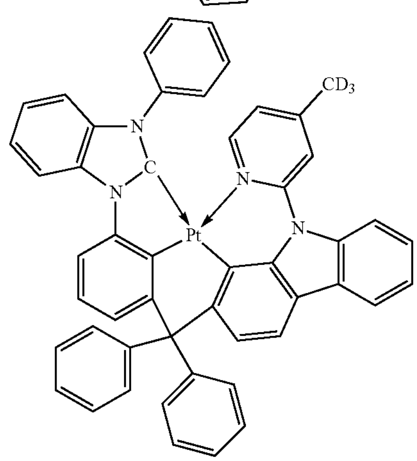
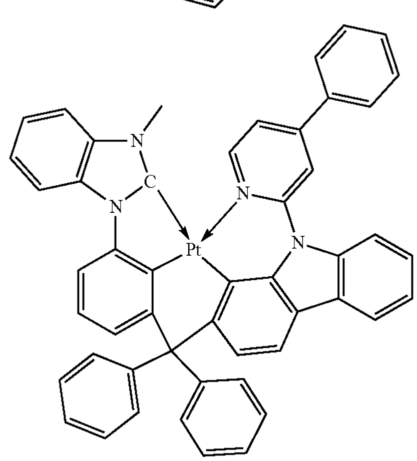

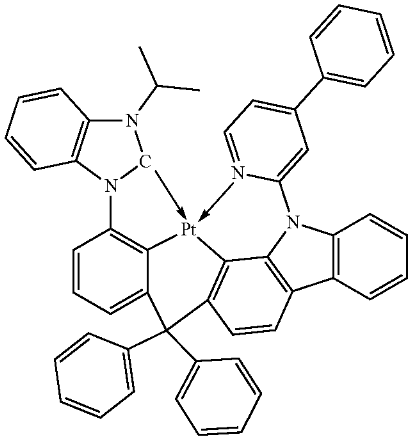
N
C
N
Pt
N
N
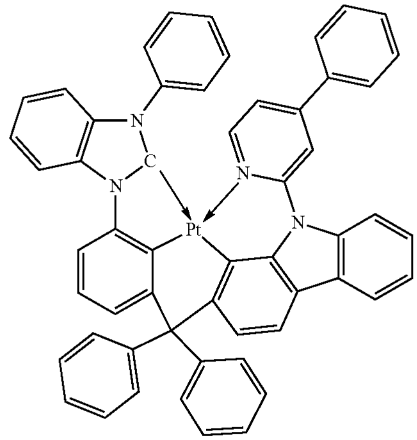
N
C
N
Pt
N
N
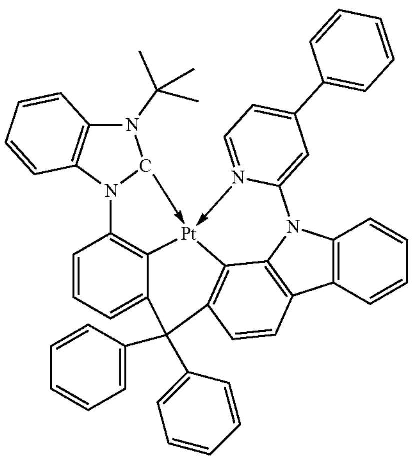
N
C
N
Pt
N
N
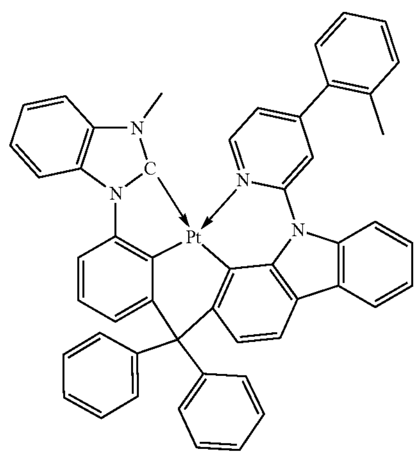
N
C
N
Pt
N
N
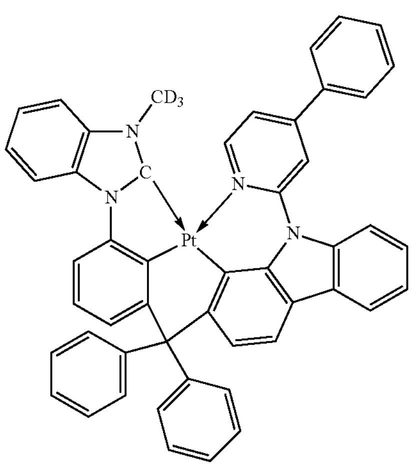
CD3
N
C
N
Pt
N
N
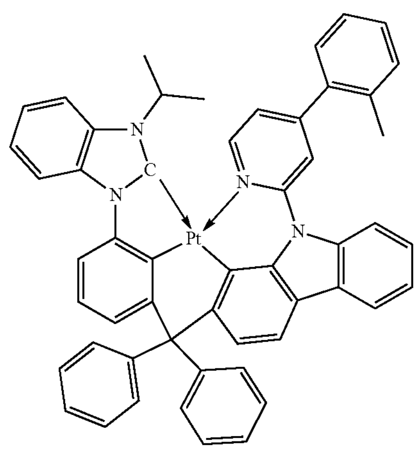
N
C
N
Pt
N
N -continued
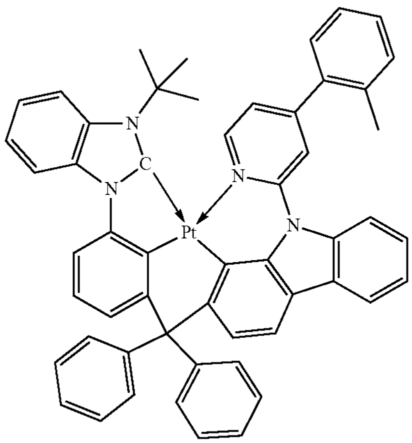
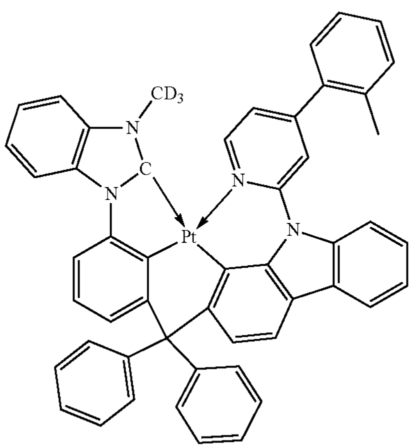
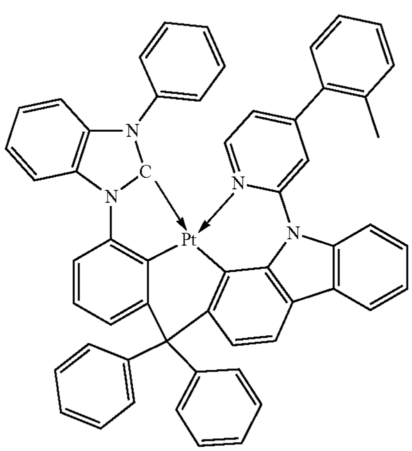
-continued
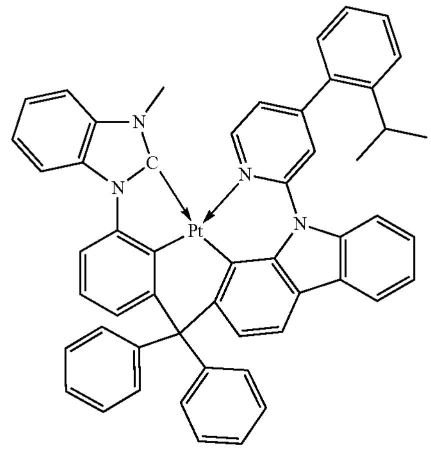
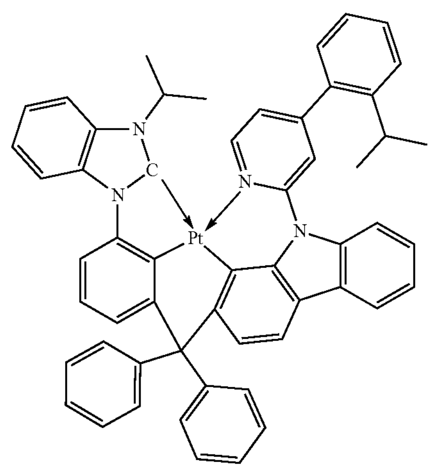
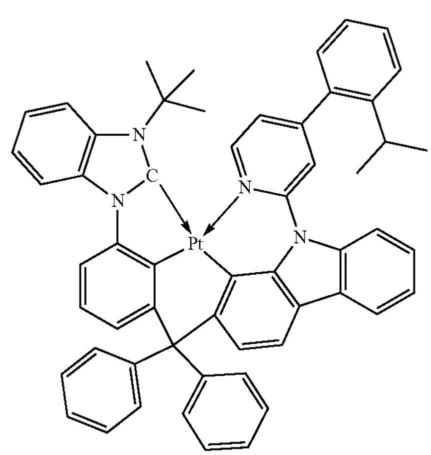

-continued
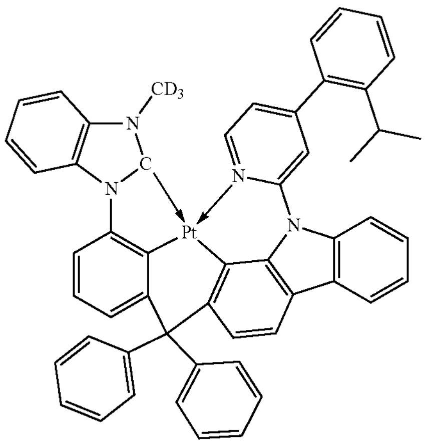
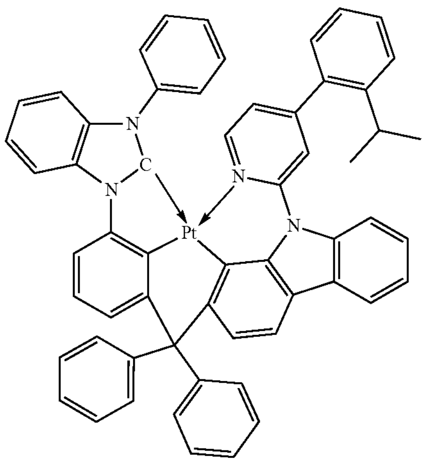
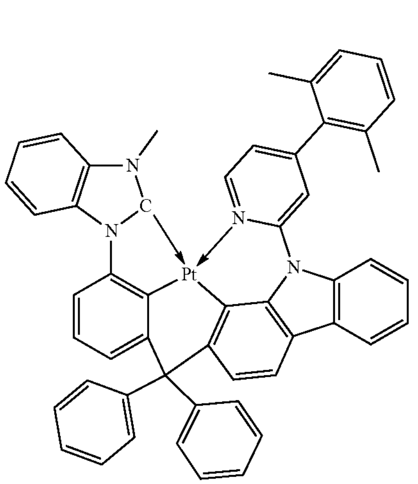
-continued
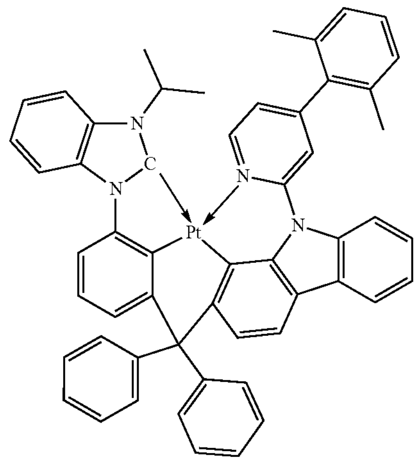
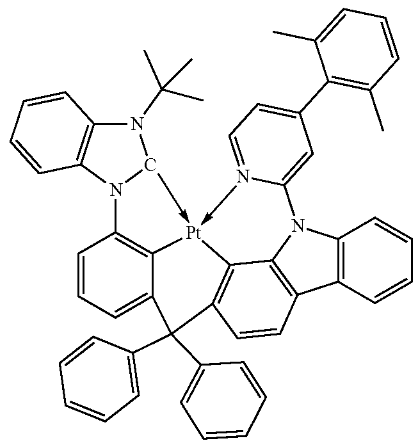
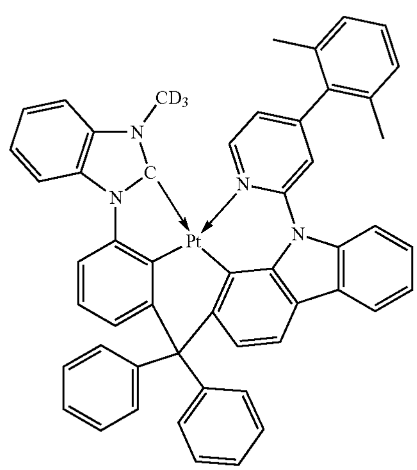

-continued
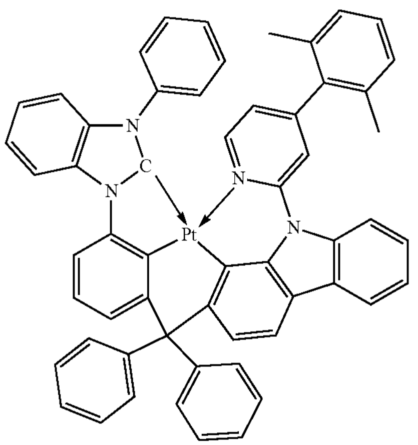
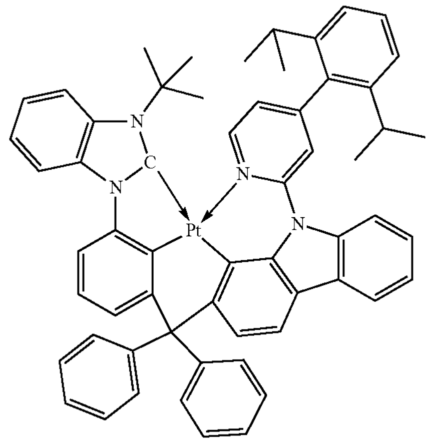
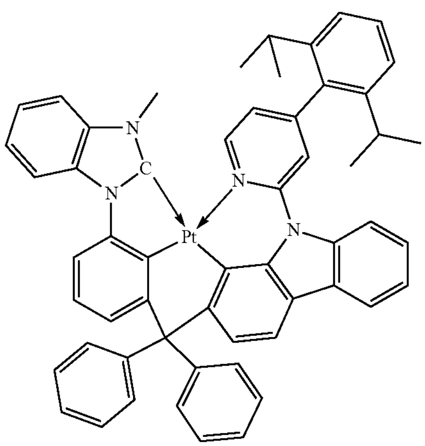
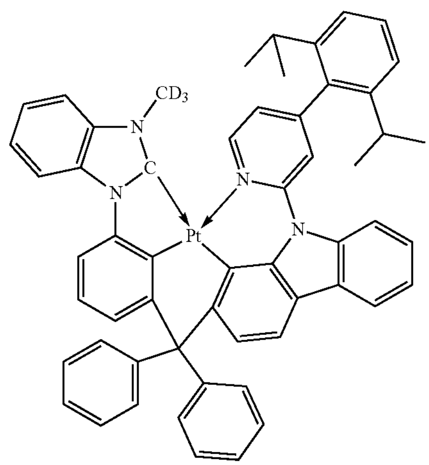
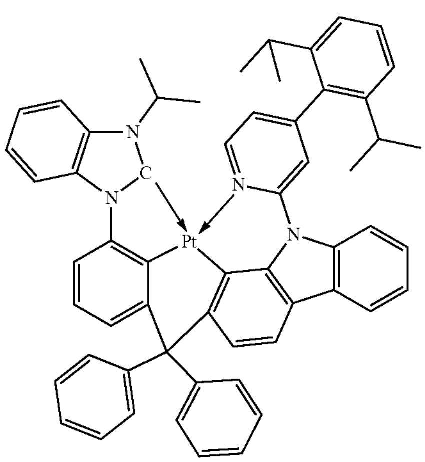
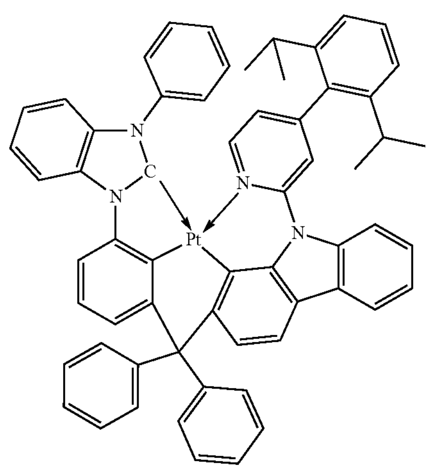

-continued
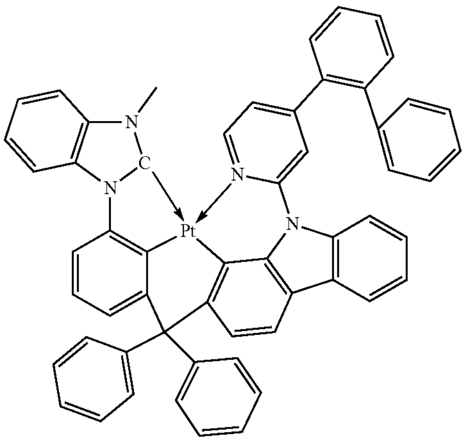
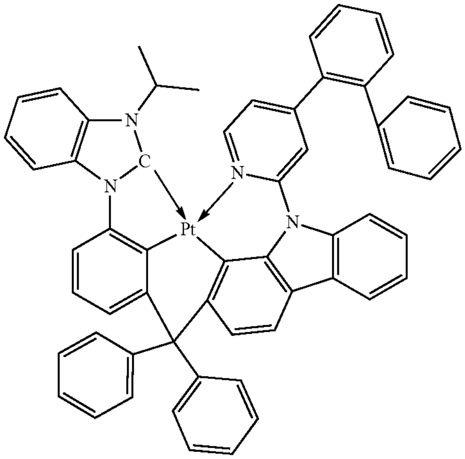
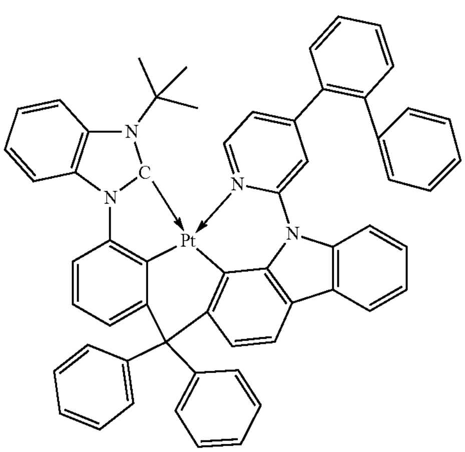
-continued
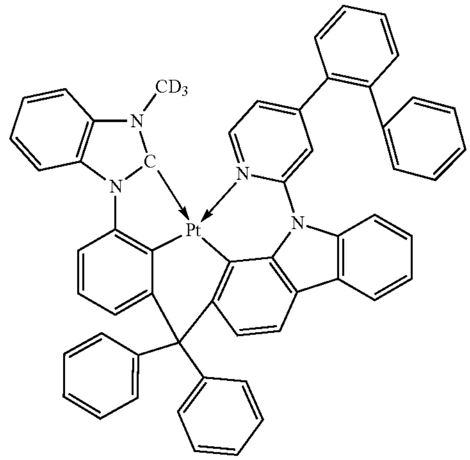
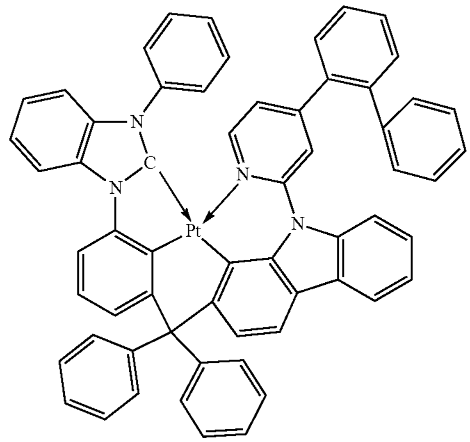
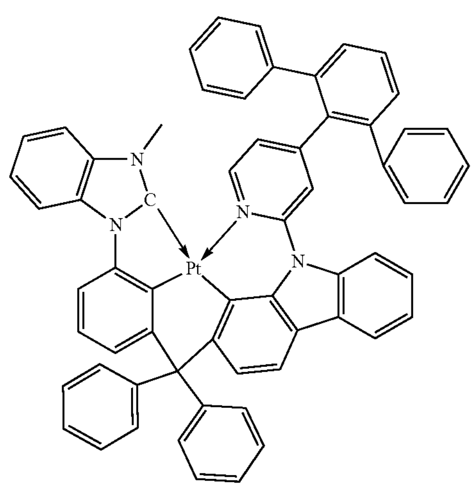

-continued
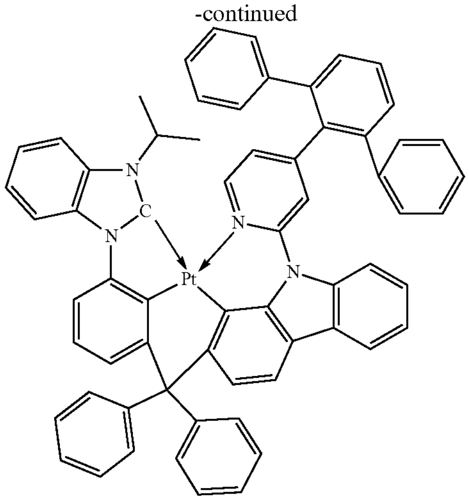
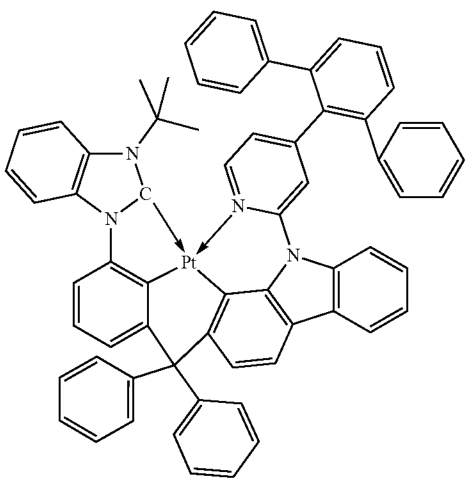
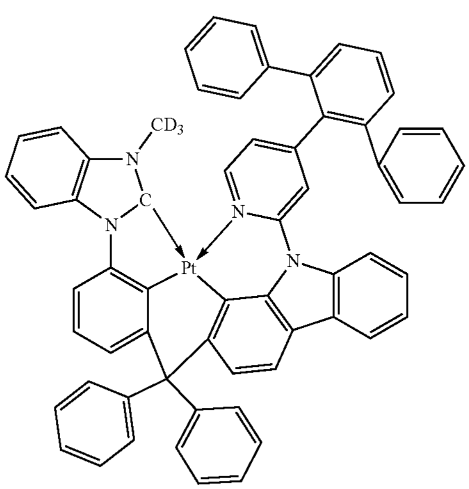
-continued
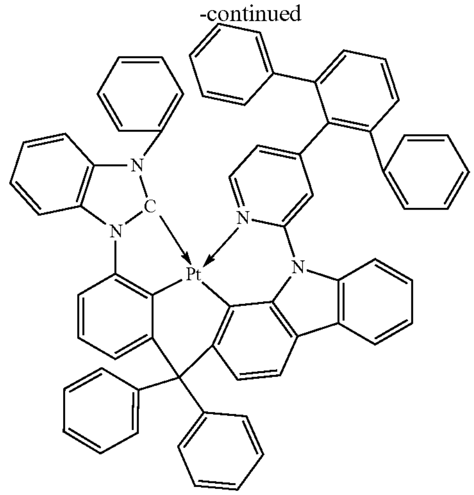
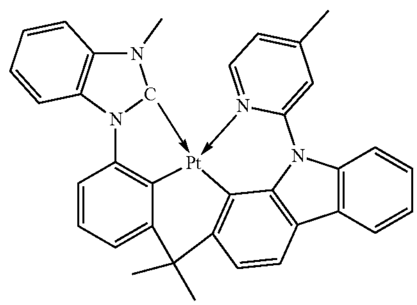
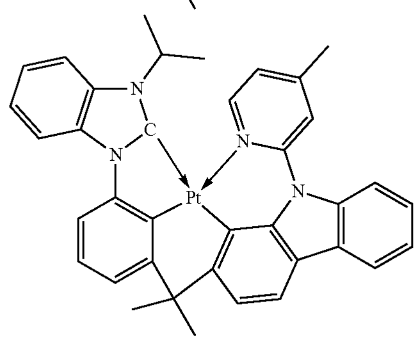
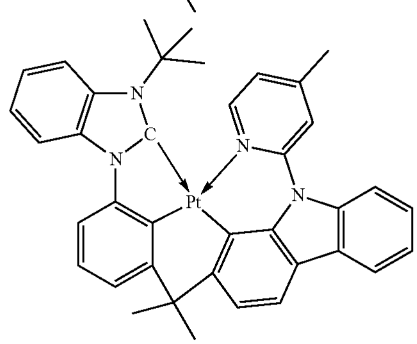
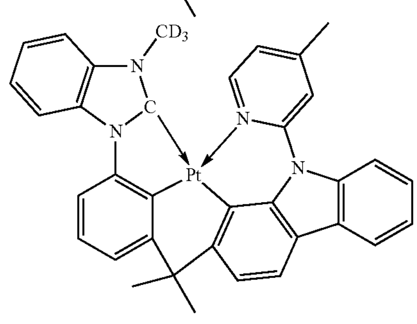

-continued
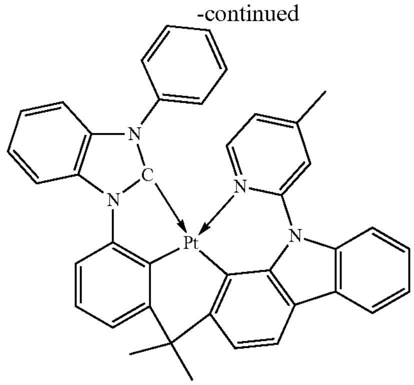
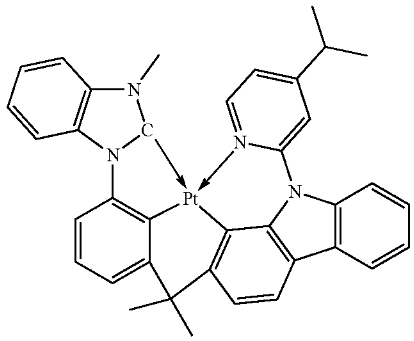
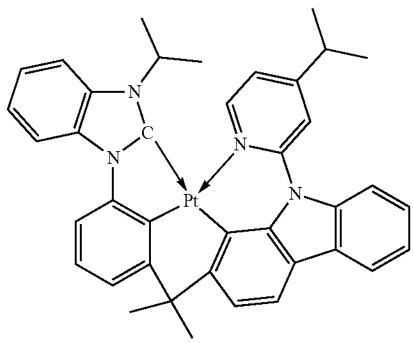
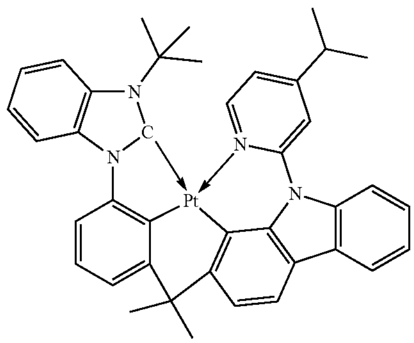
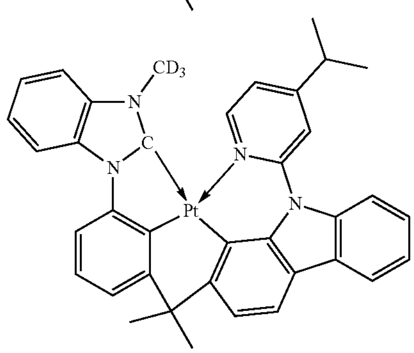
-continued
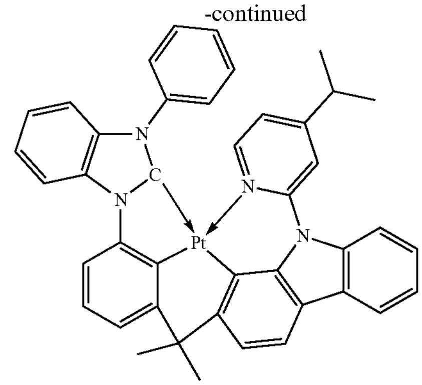
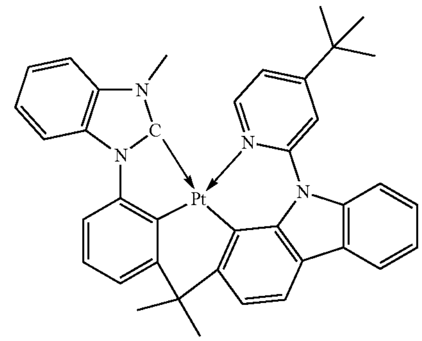
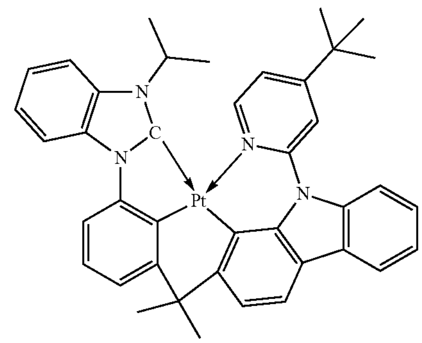
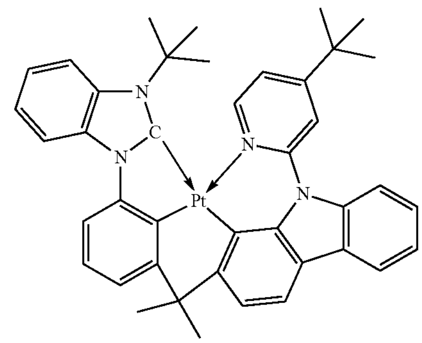
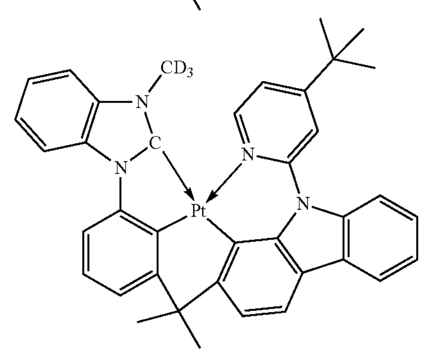

-continued
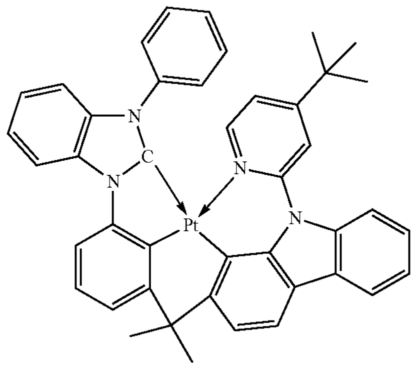
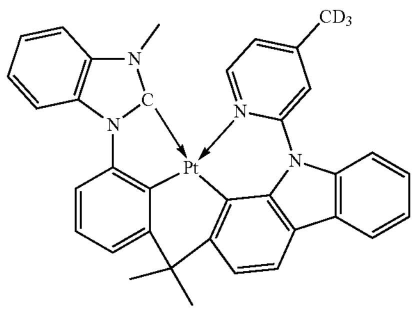
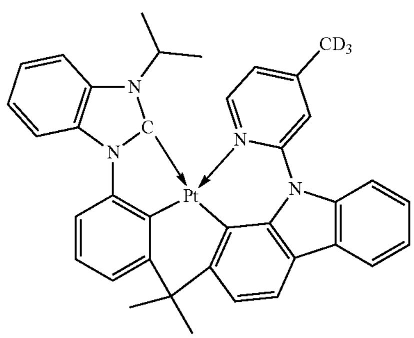
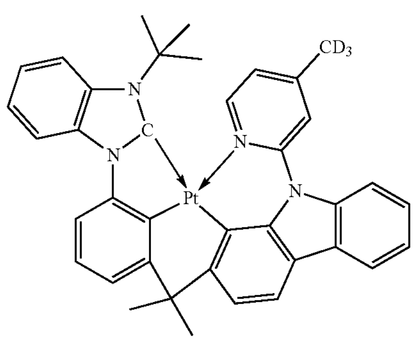
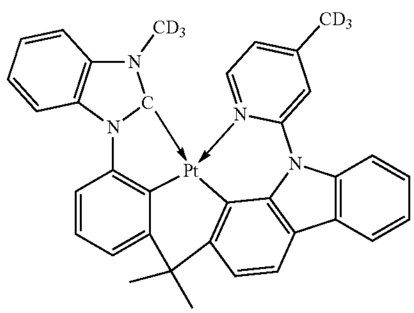
-continued
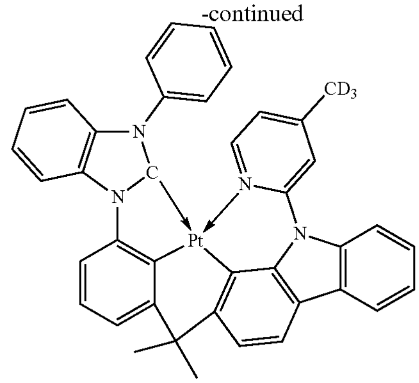
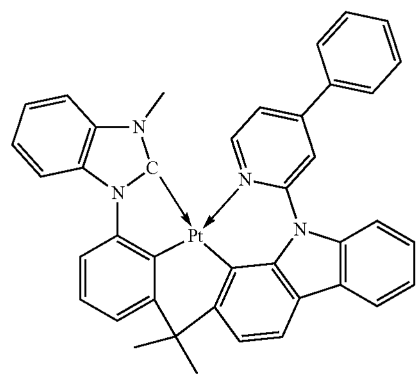
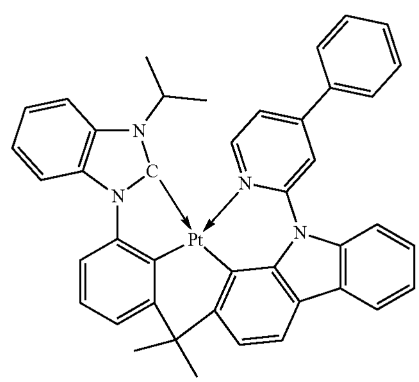
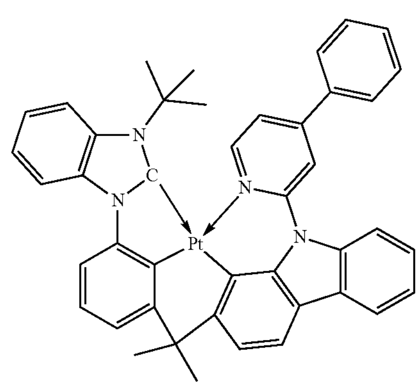

-continued
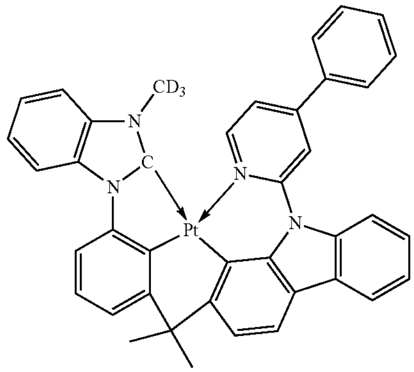
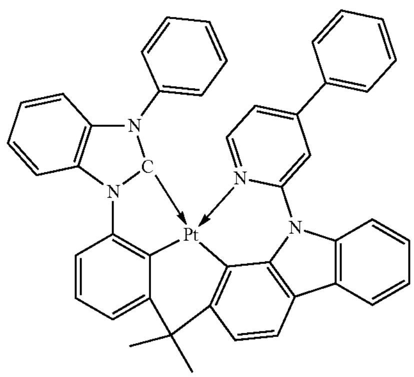
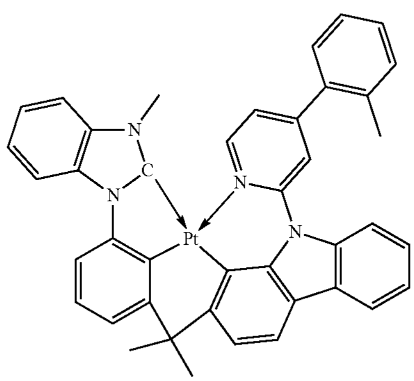
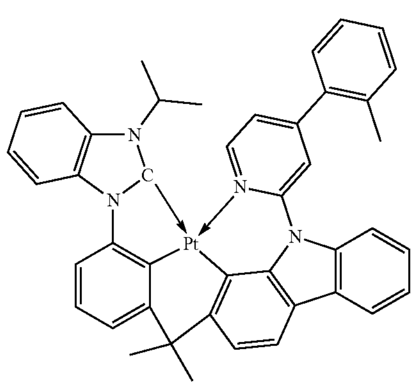
-continued
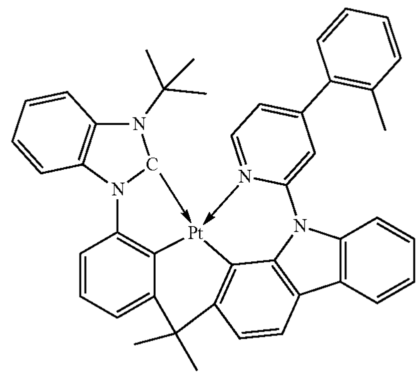
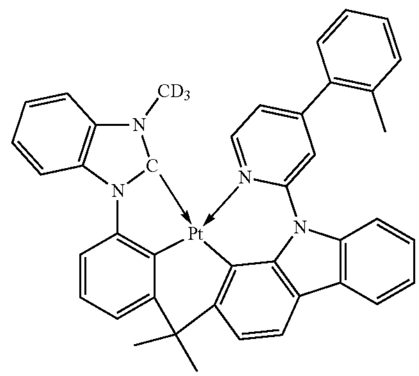
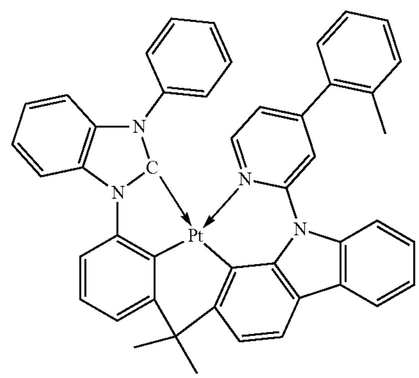
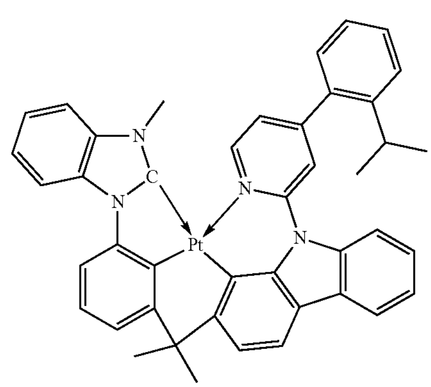

-continued
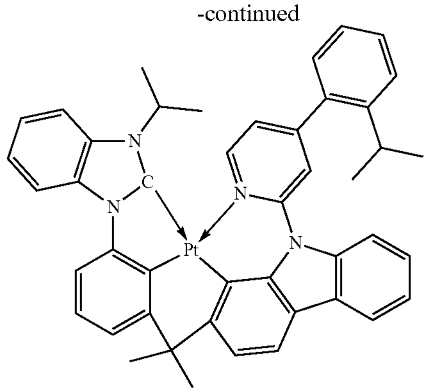
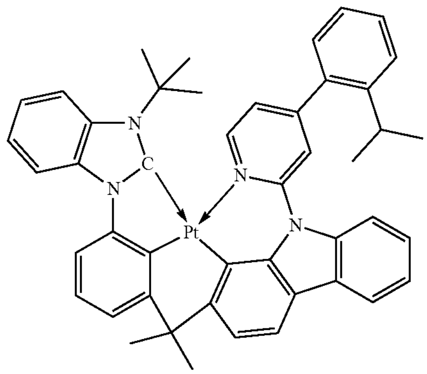
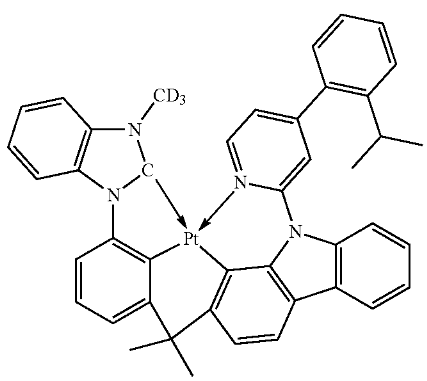
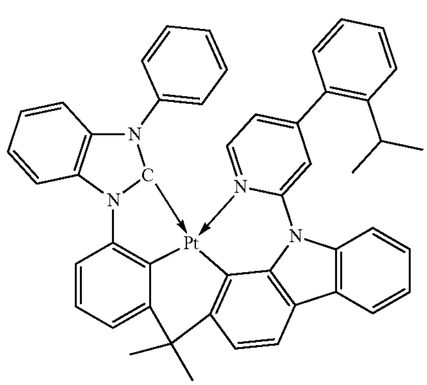
-continued
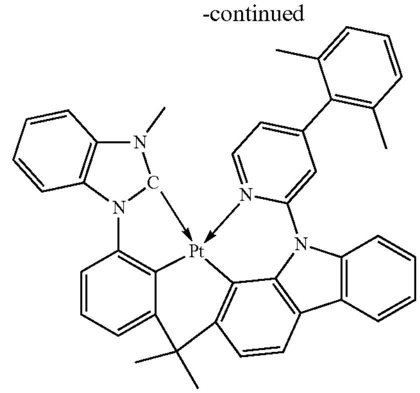
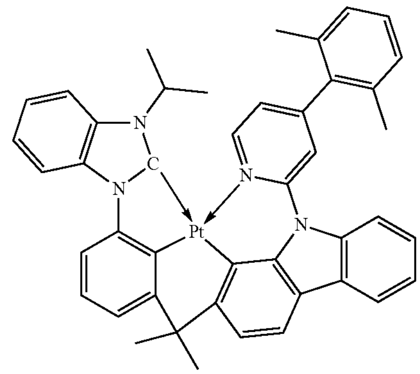
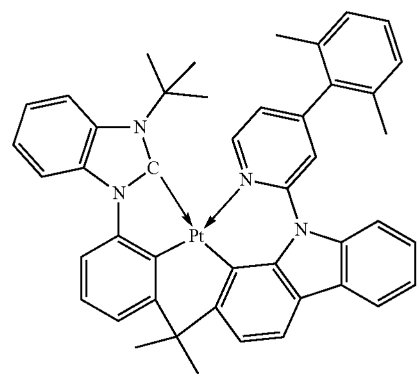
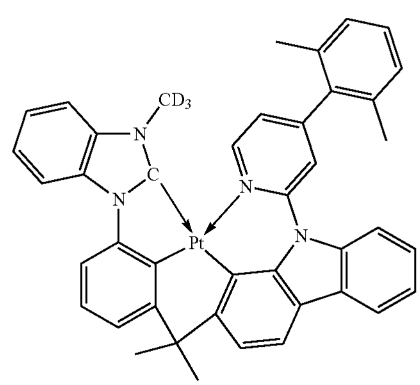

-continued
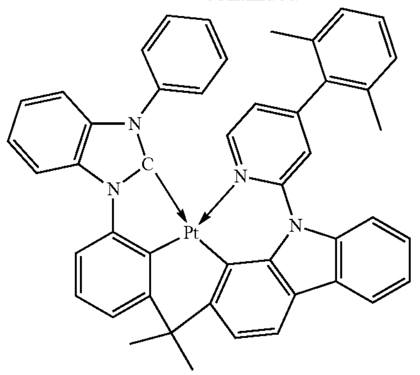
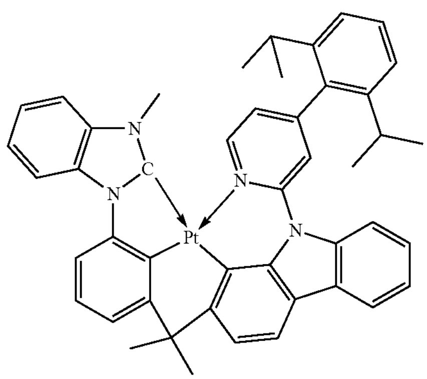
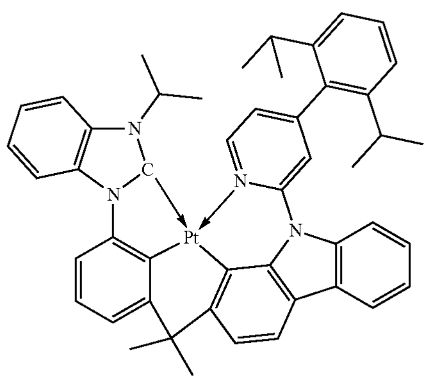
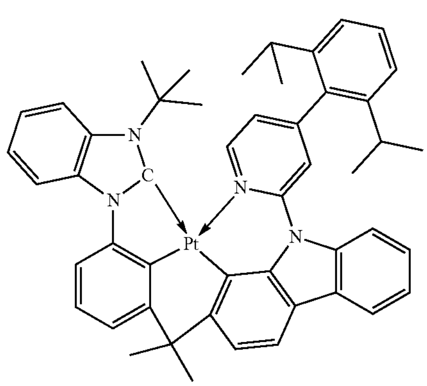
-continued
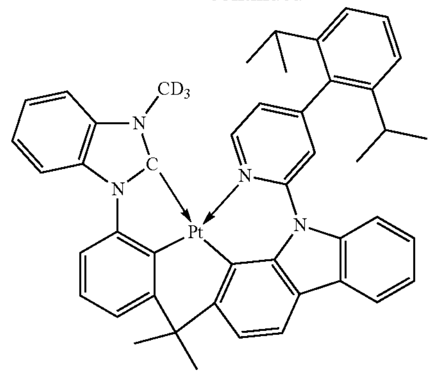
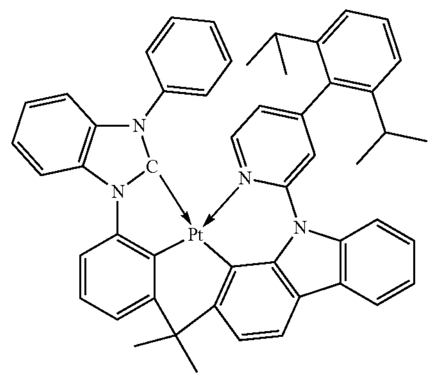
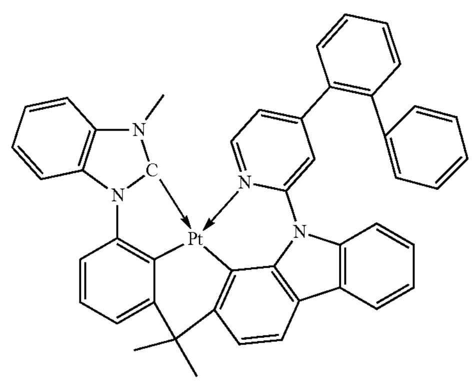
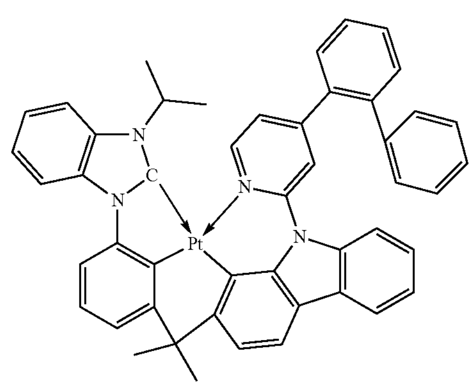

-continued
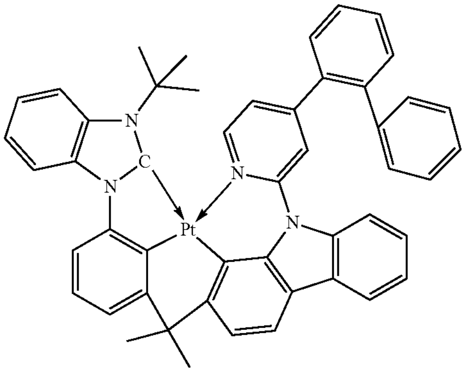
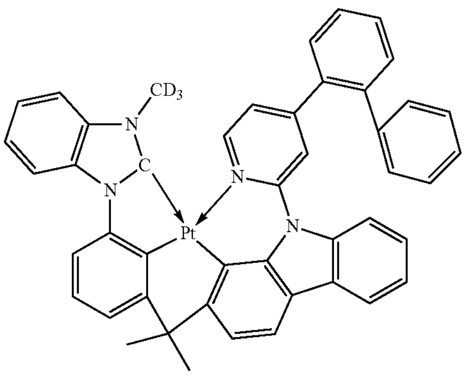
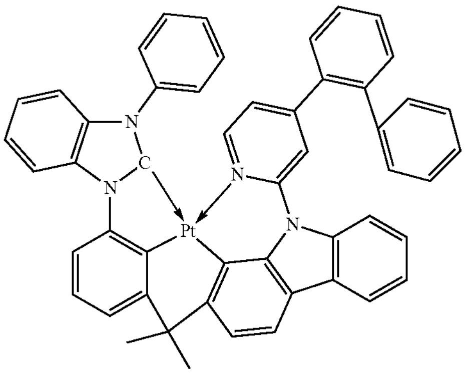
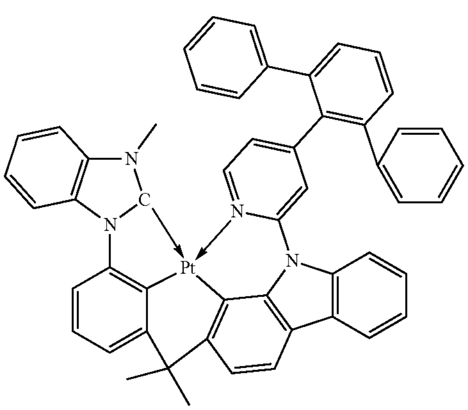
-continued
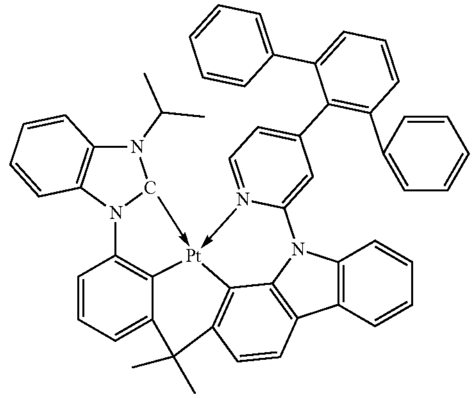
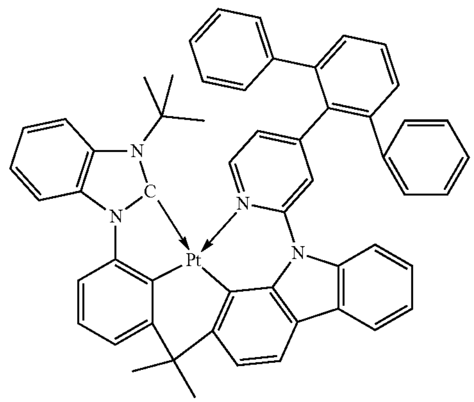
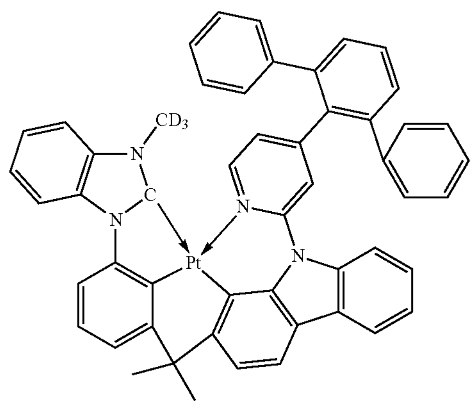
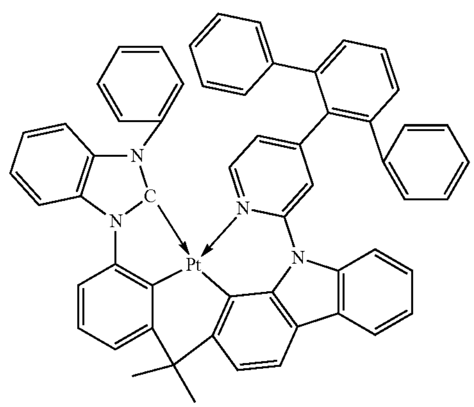

-continued
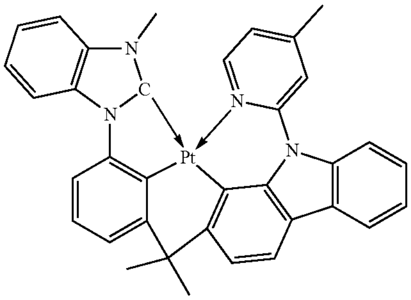
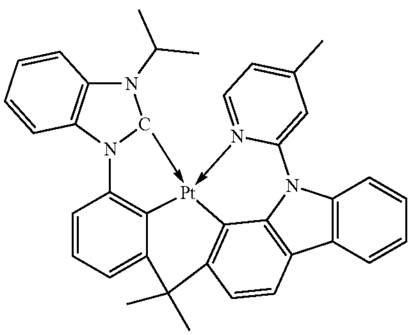
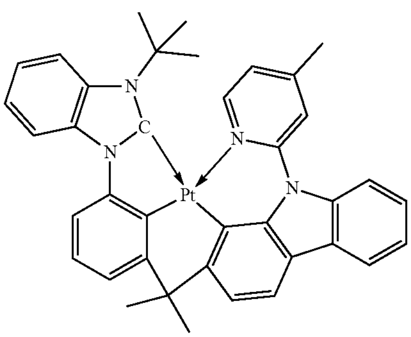
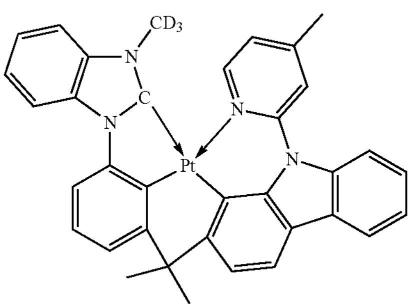
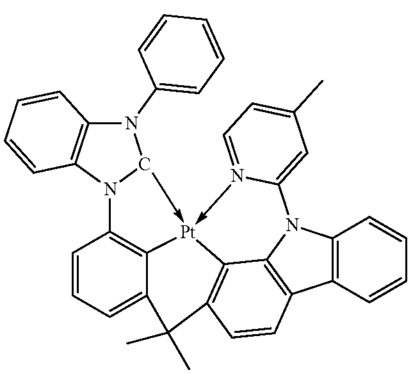
-continued
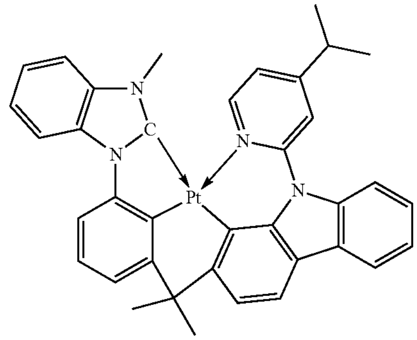
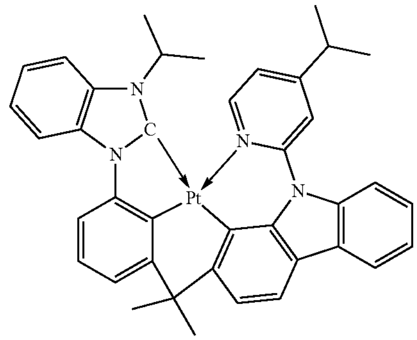
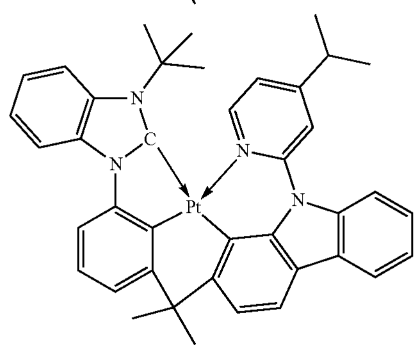
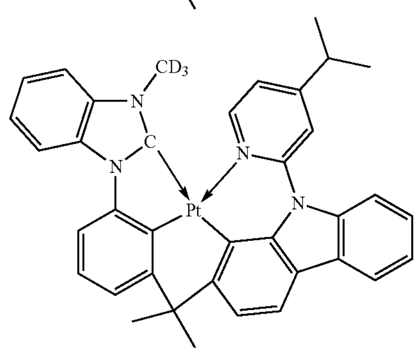
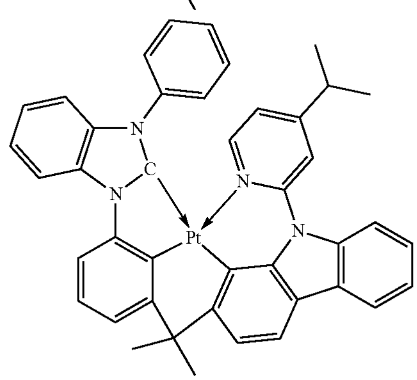

-continued
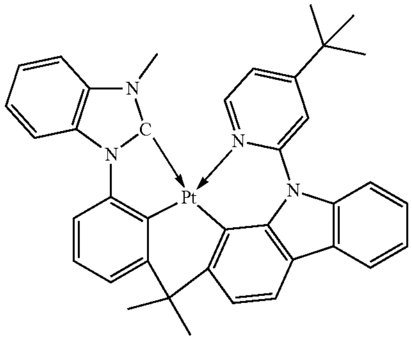
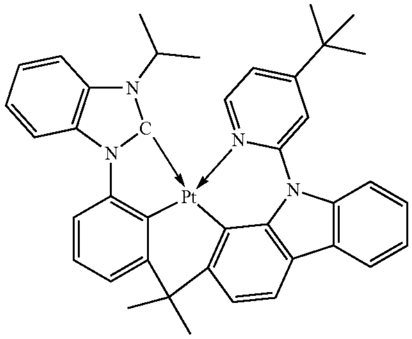
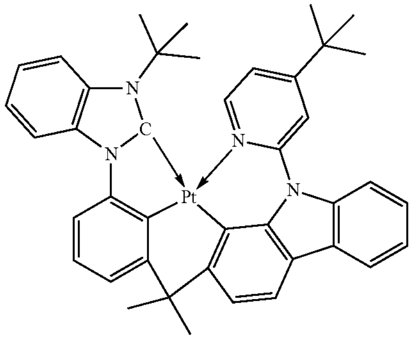
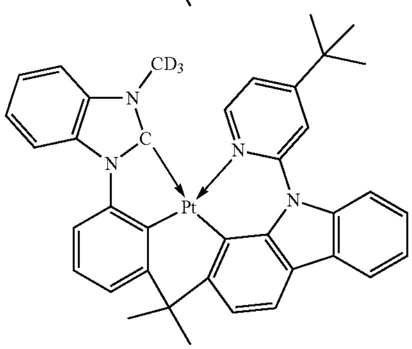
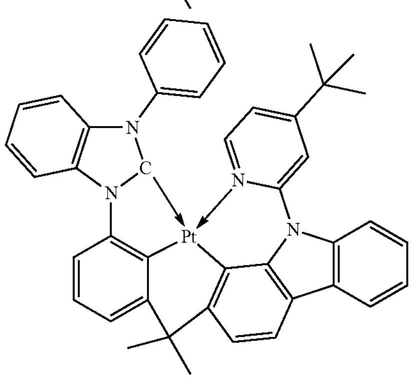
-continued
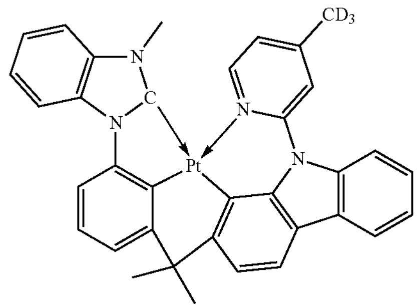
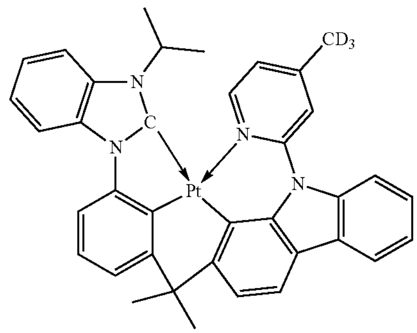
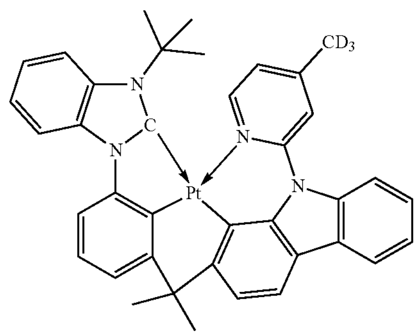
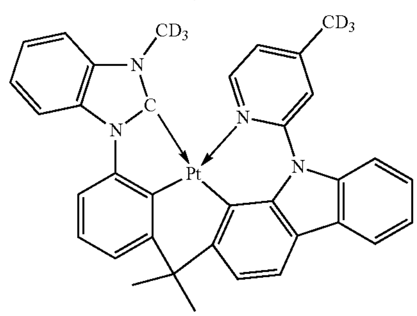
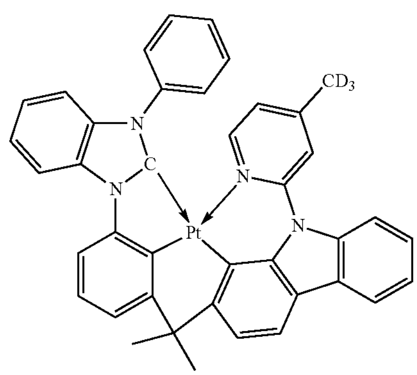

-continued
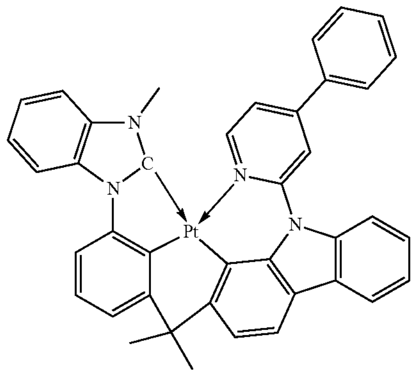
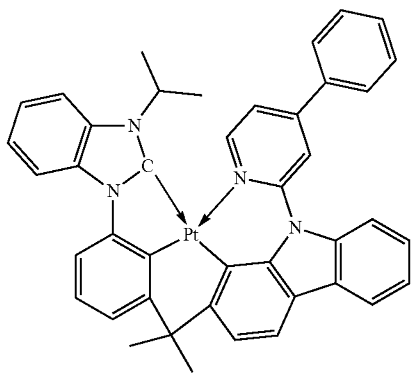
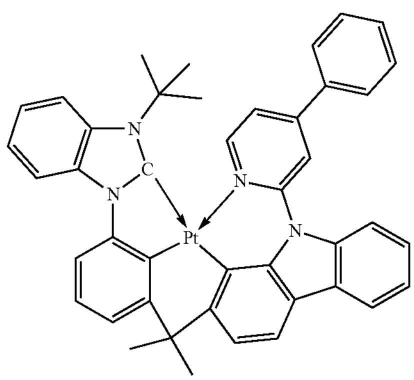
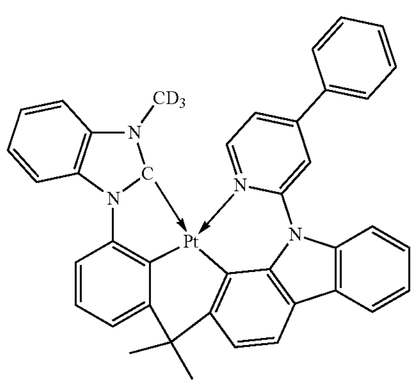
-continued
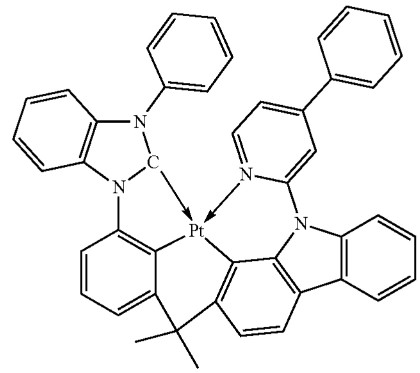
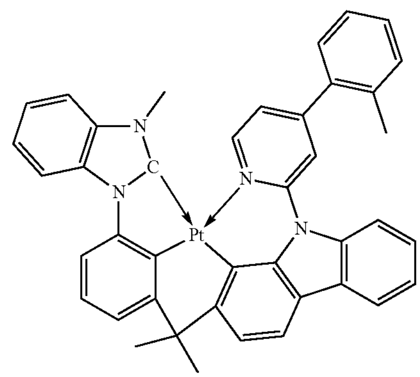
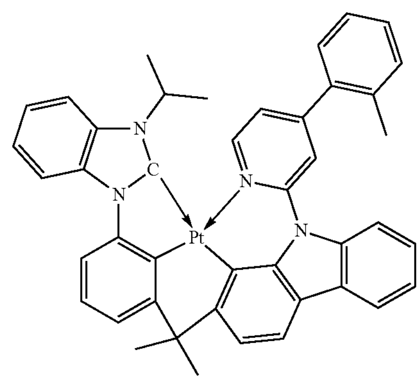
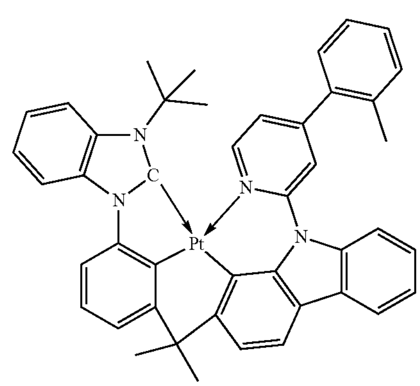

-continued
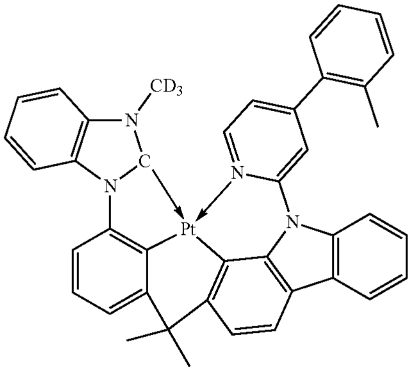
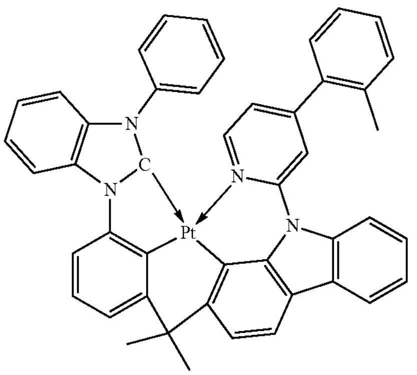
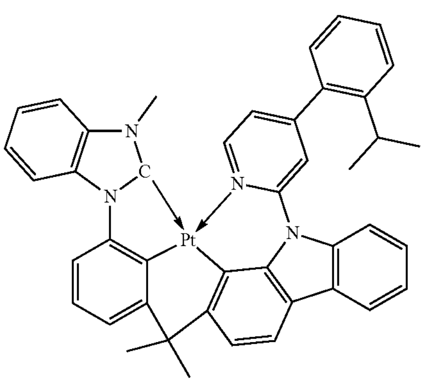
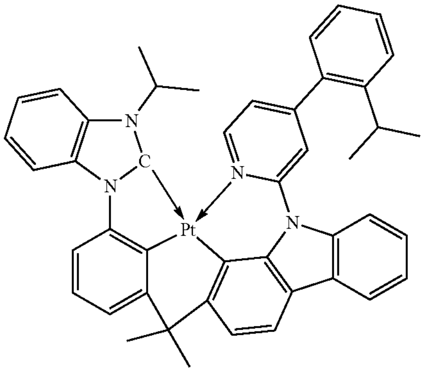
-continued
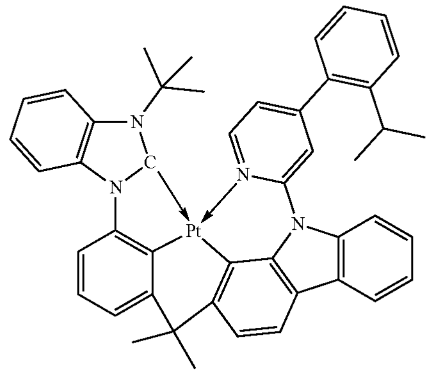
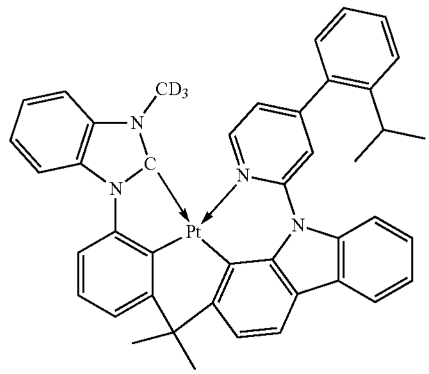
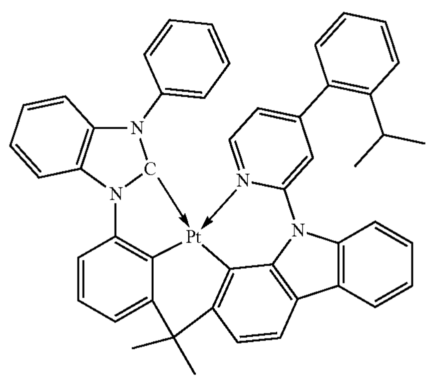
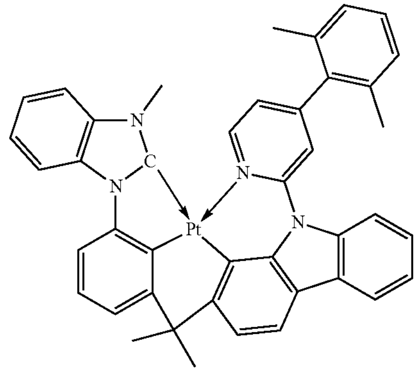

-continued
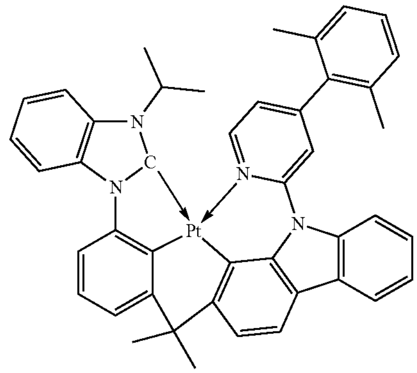
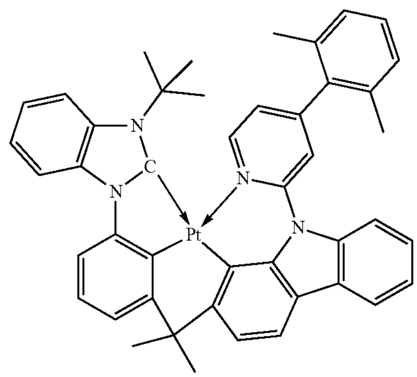
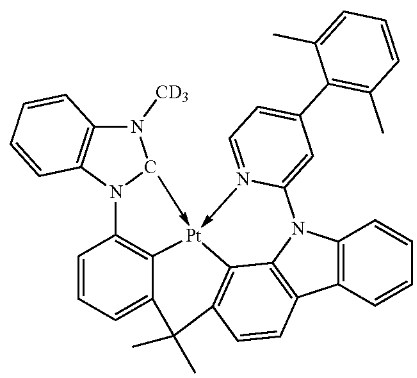
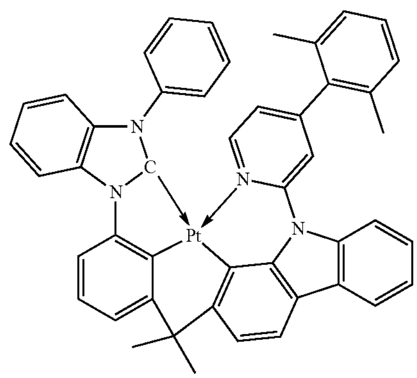
-continued
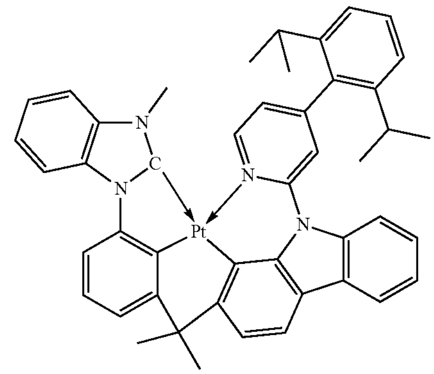
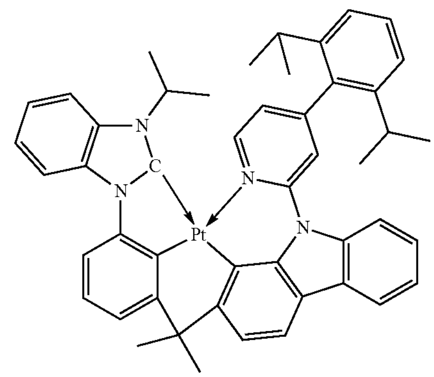
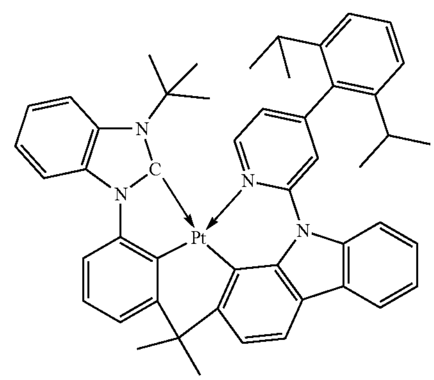
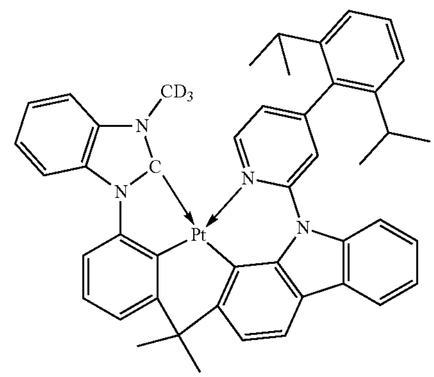

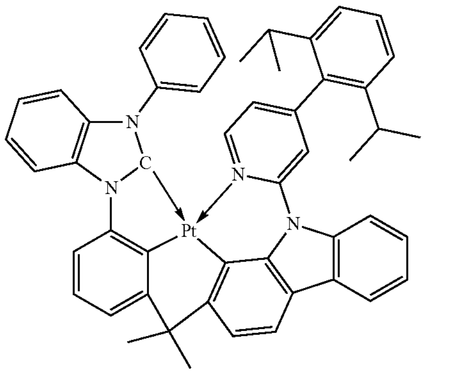
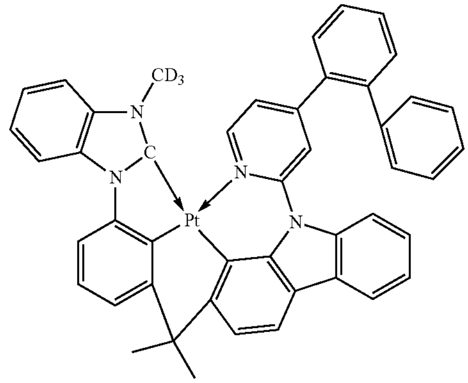
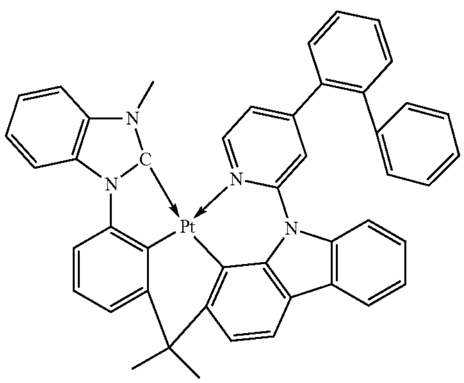
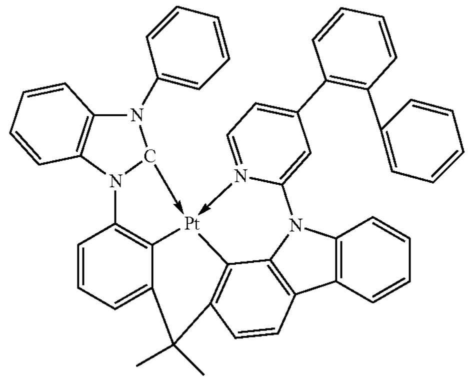
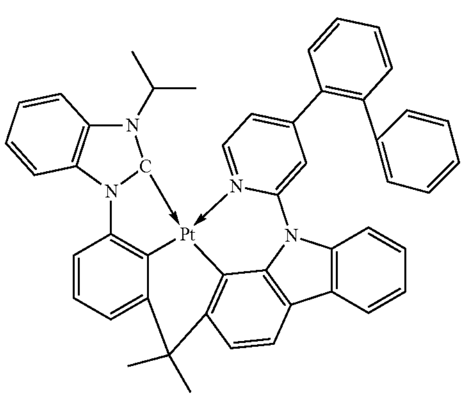
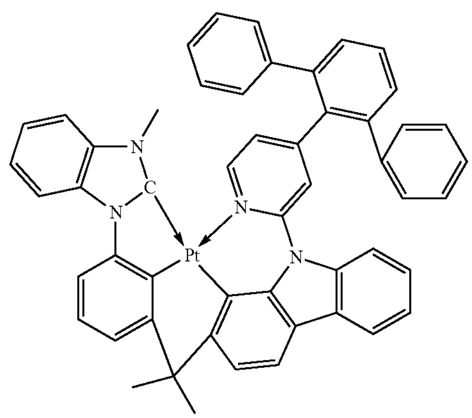
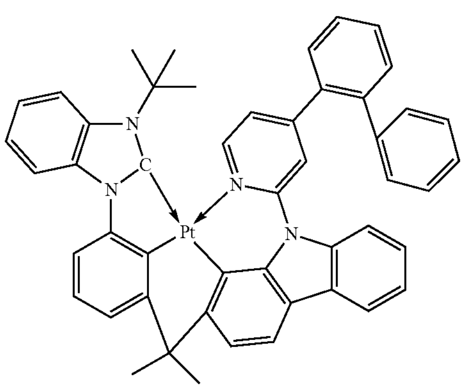
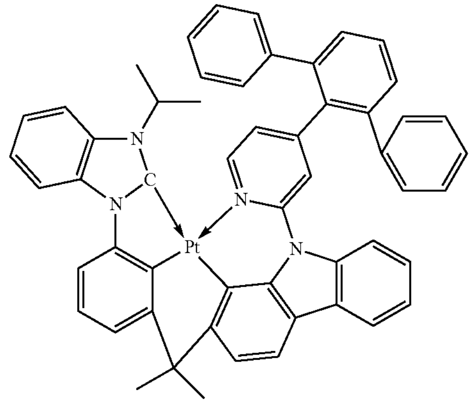
CD3

-continued
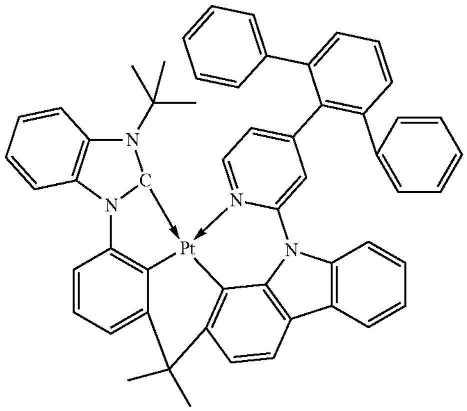
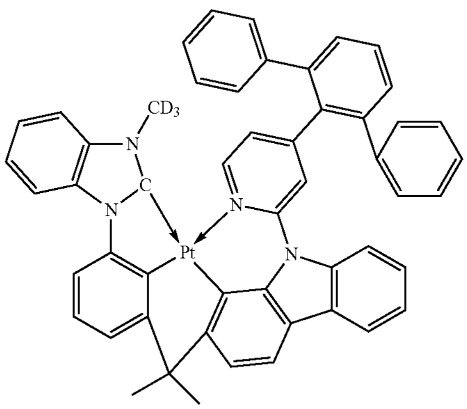
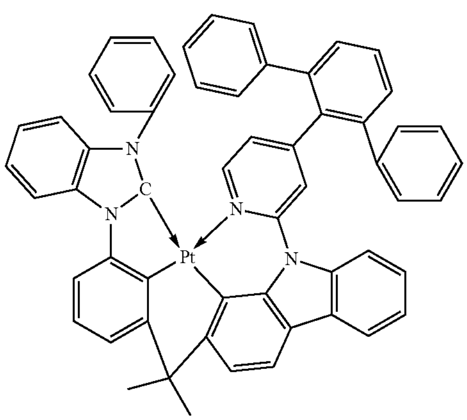
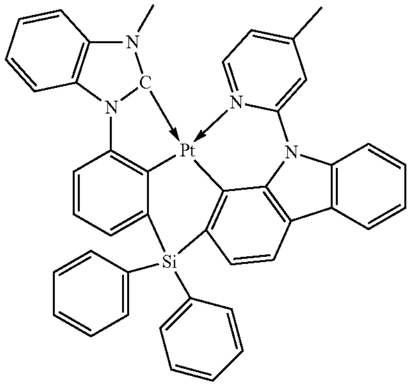
-continued
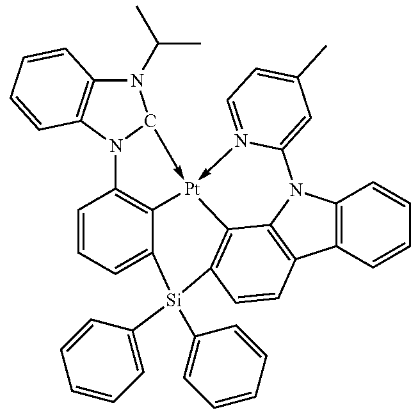
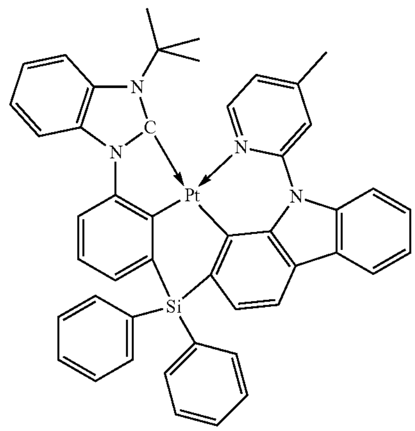
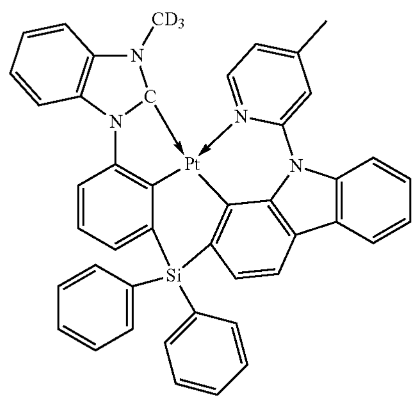
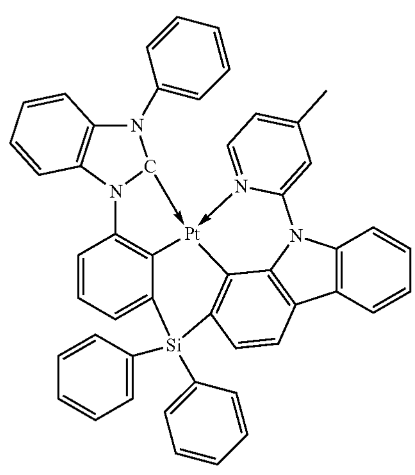

-continued
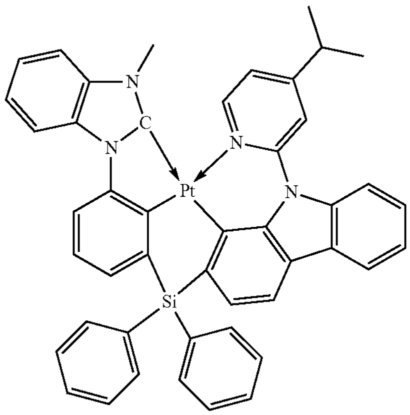
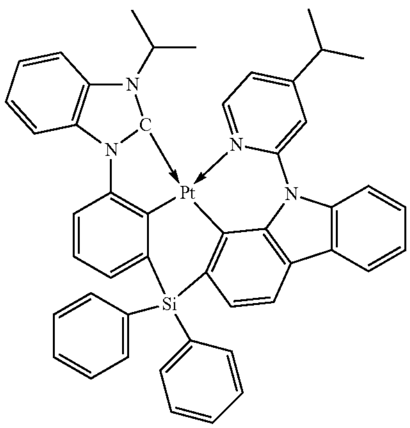
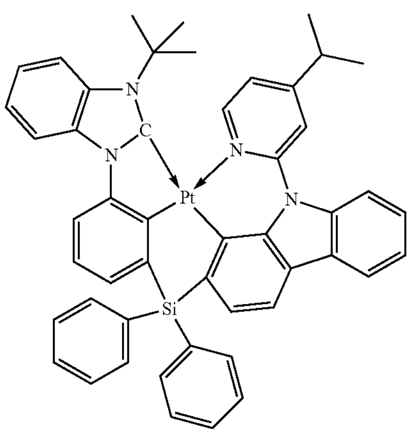
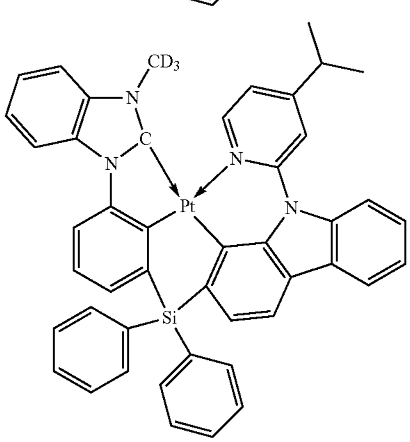
-continued
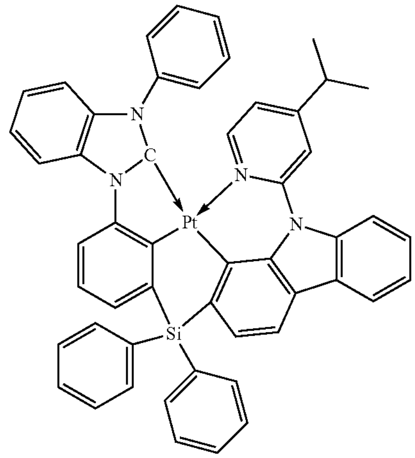
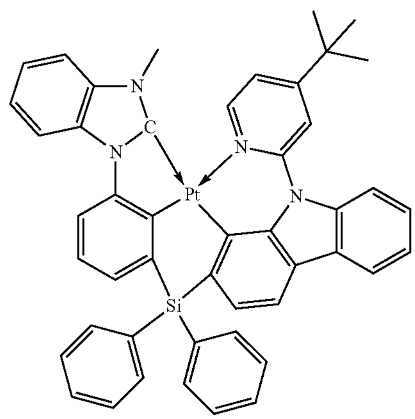
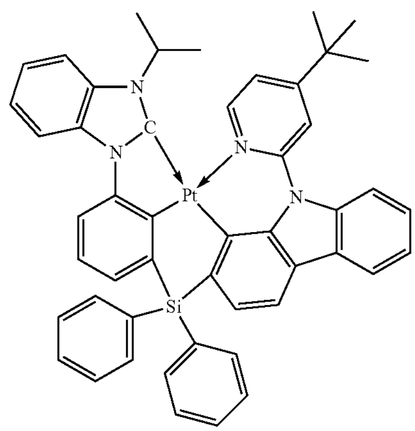
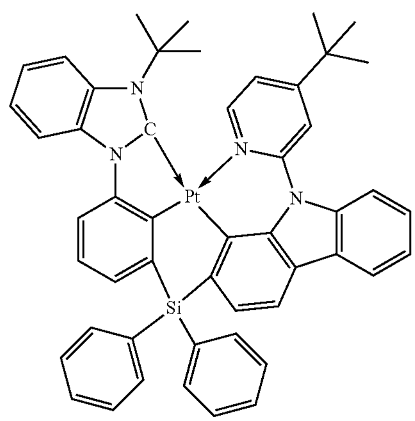

-continued
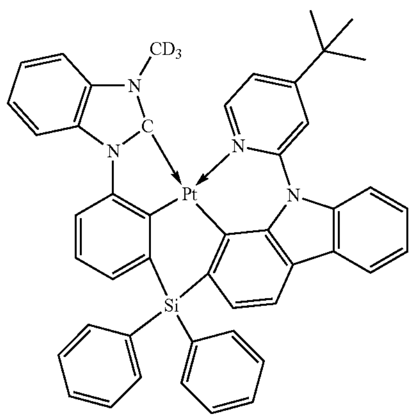
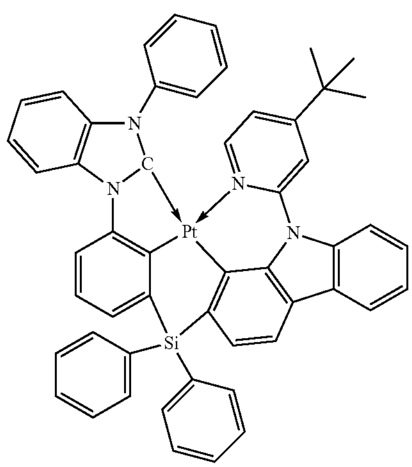
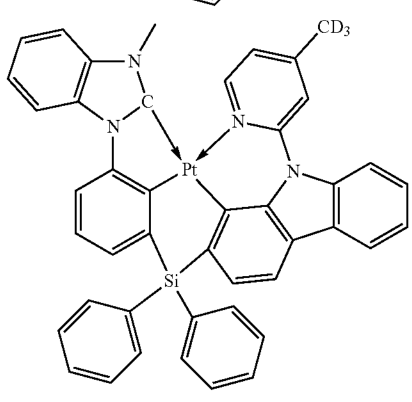
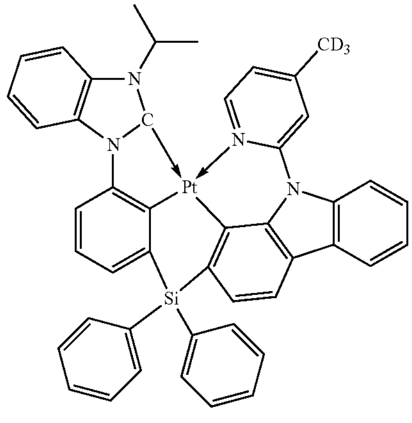
-continued
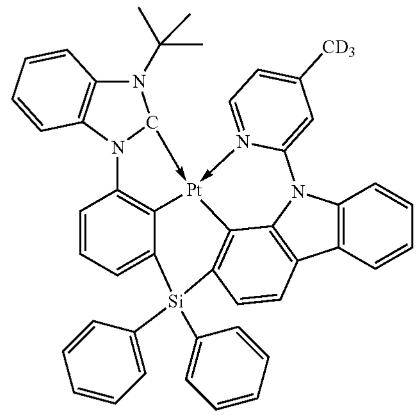
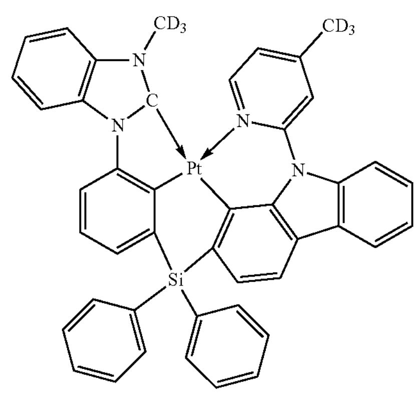
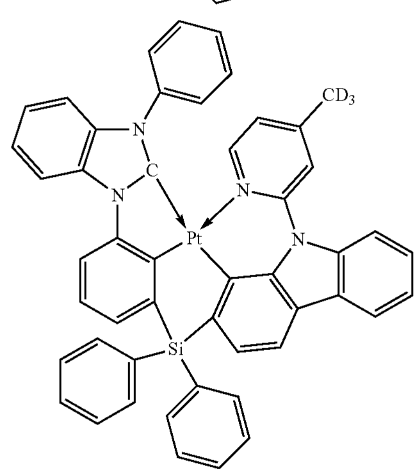
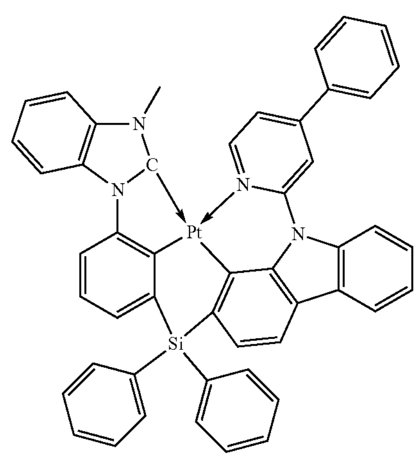

-continued
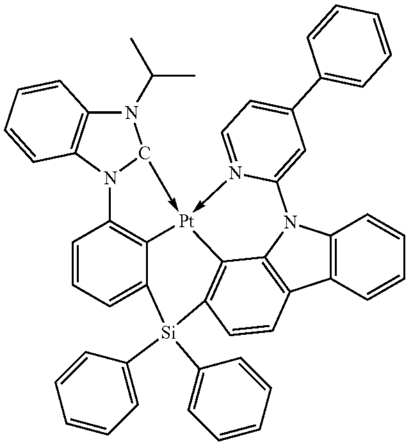
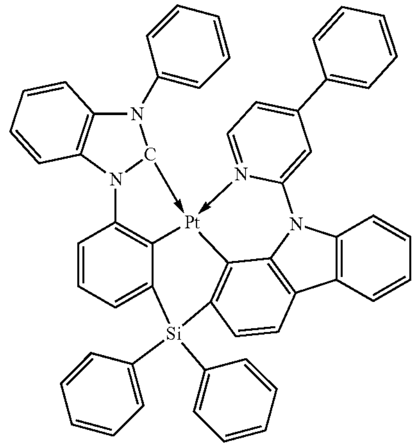
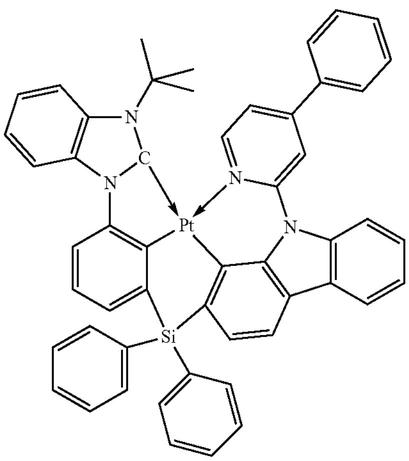
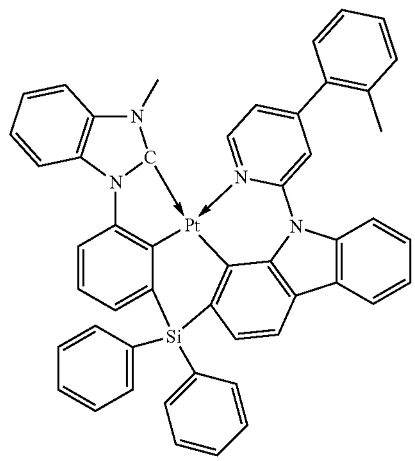
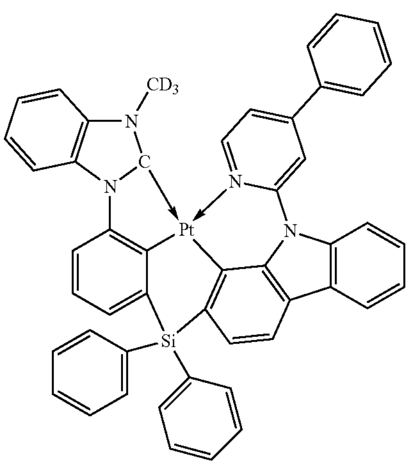
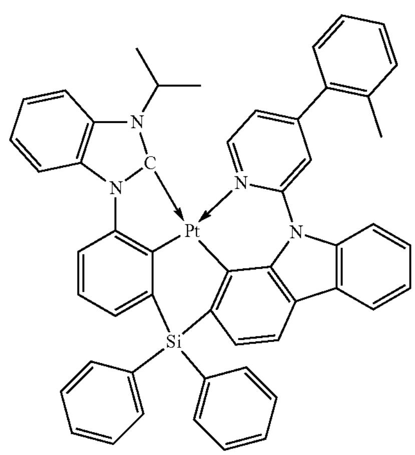

-continued
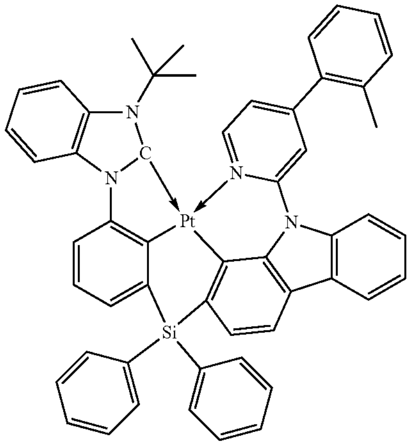
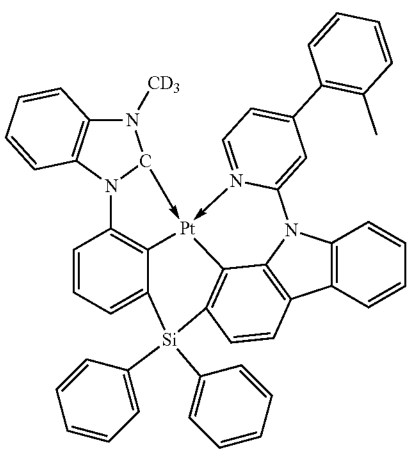
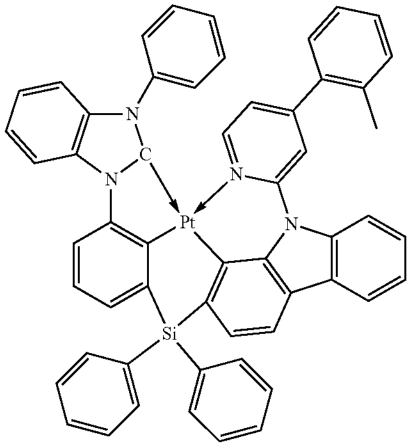
-continued
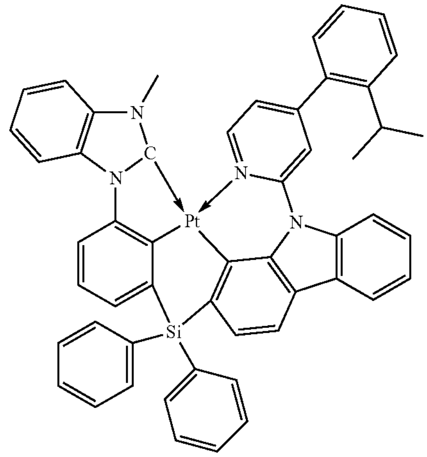
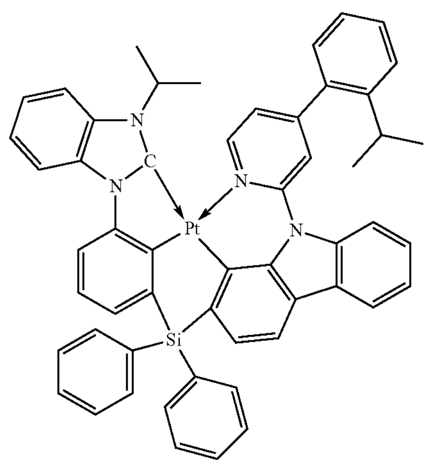
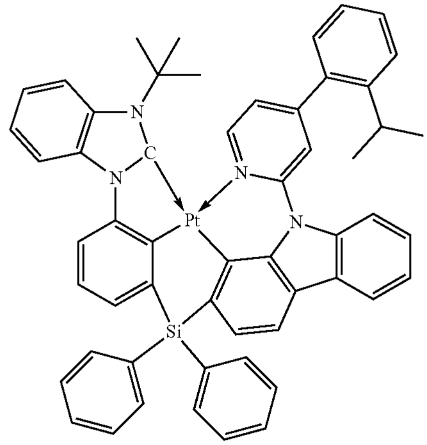

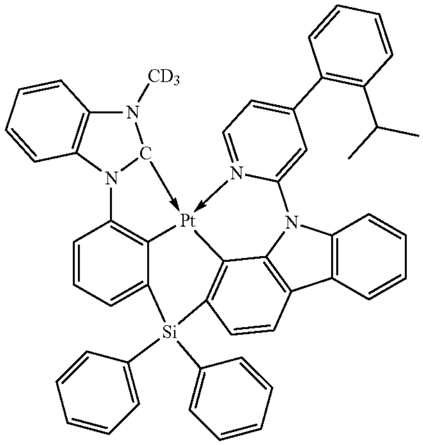
CD3
N
C
N
Pt
N
N
Si
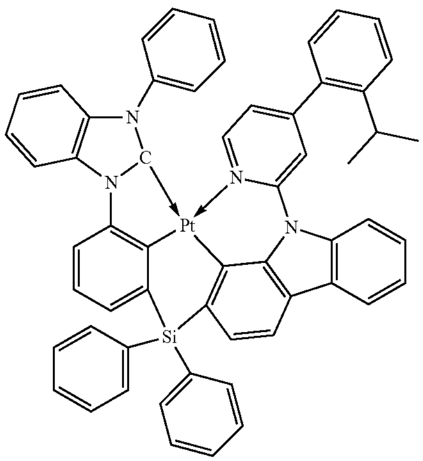
N
C
N
Pt
N
N
Si
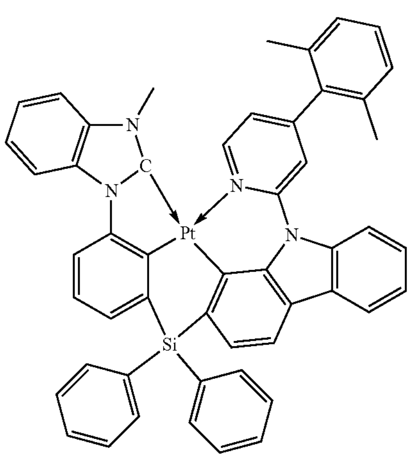
N
C
N
Pt
N
N
Si
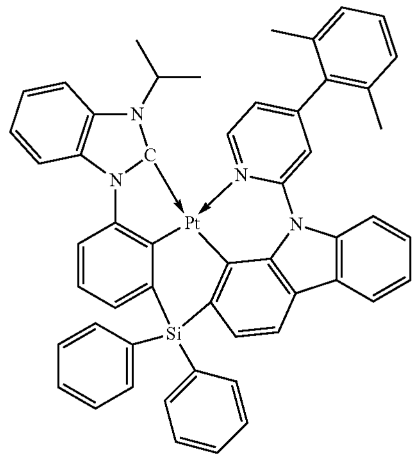
N
C
N
Pt
N
N
Si
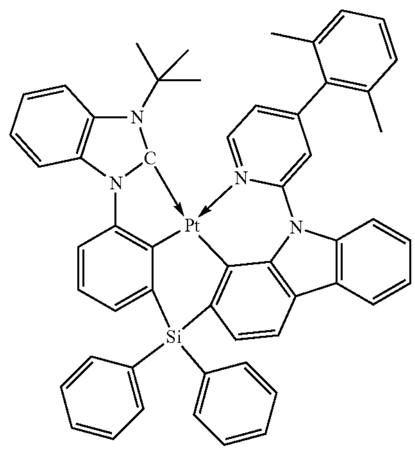
N
C
N
Pt
N
N
Si
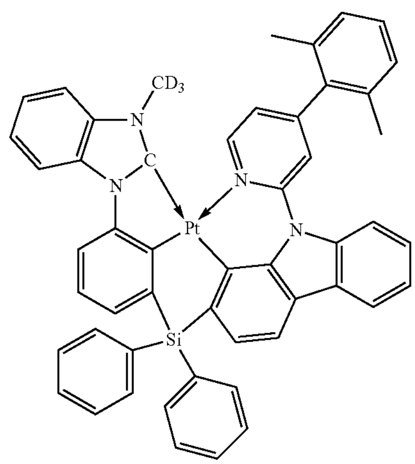
CD3
N
C
N
Pt
N
N
Si -continued
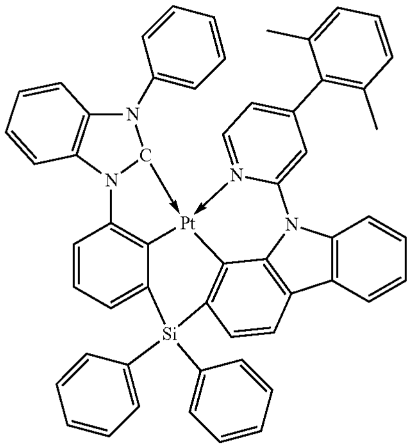
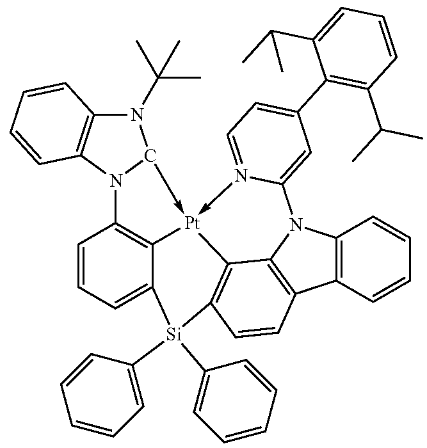
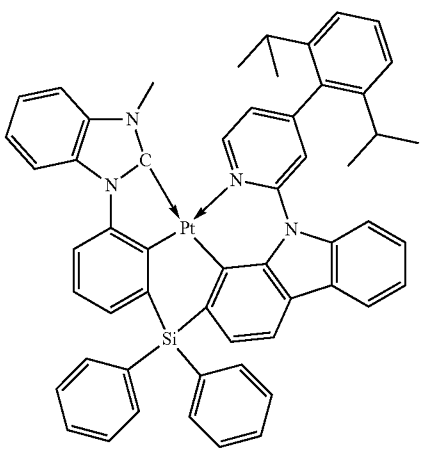
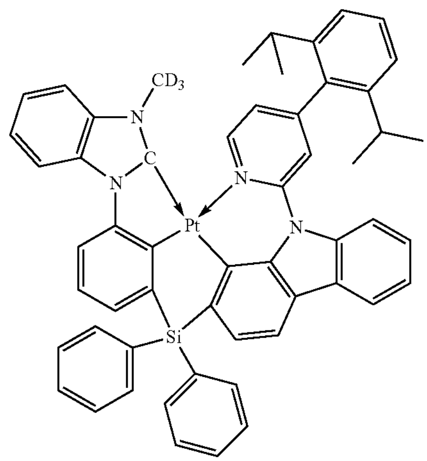
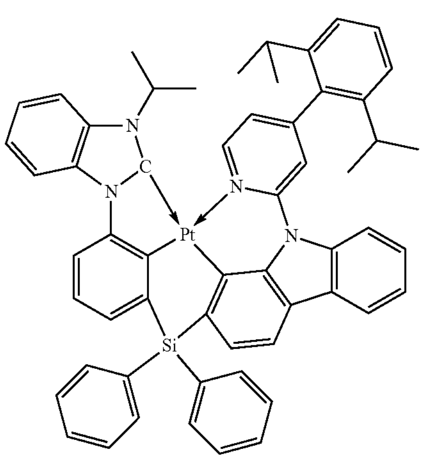
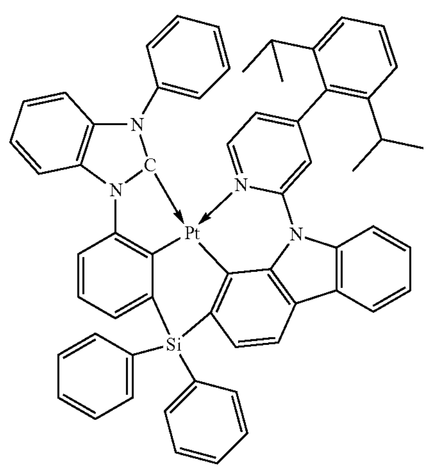
-continued -continued
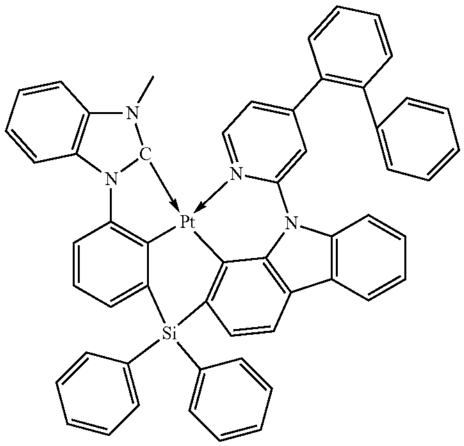
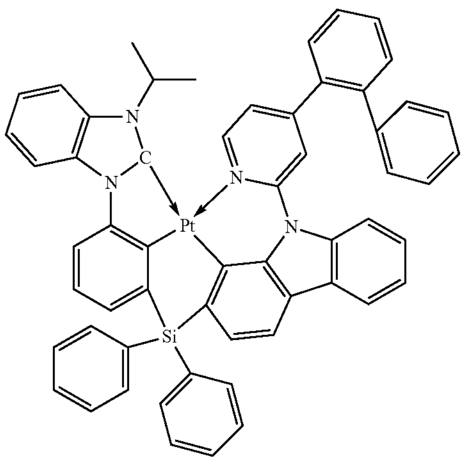
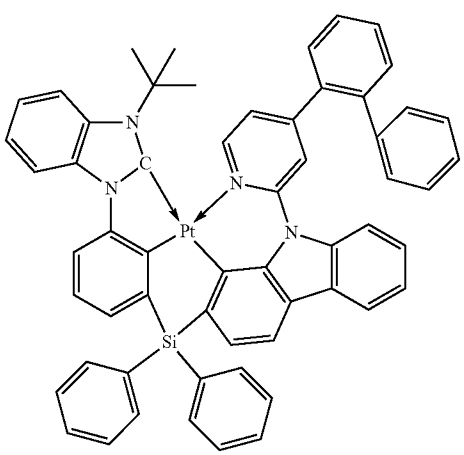
-continued
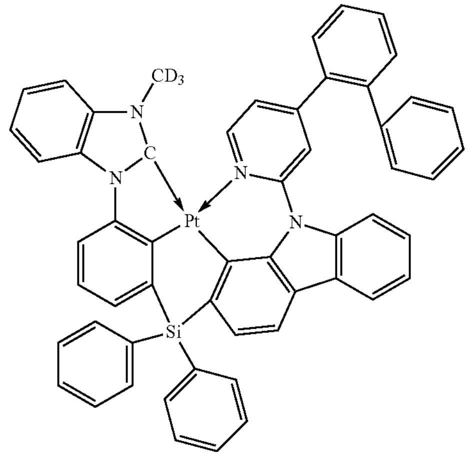
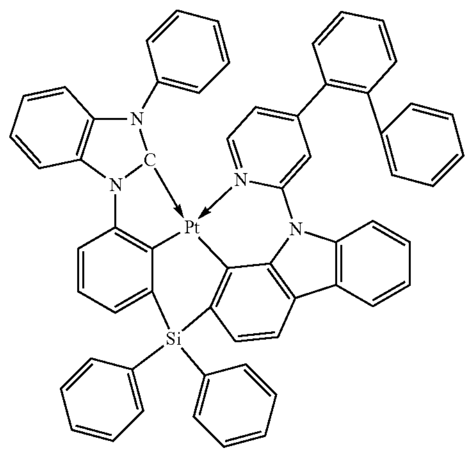
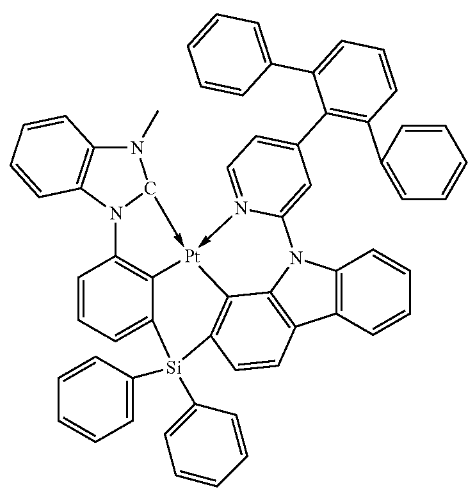

-continued
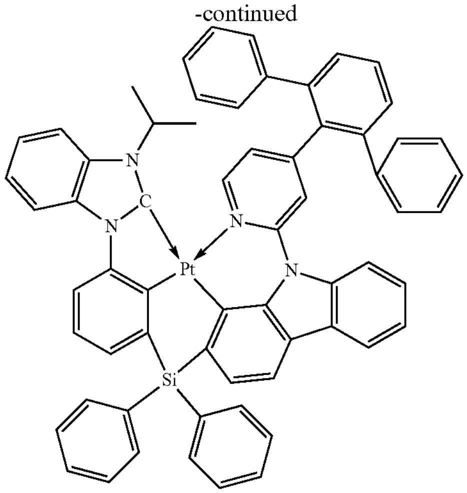
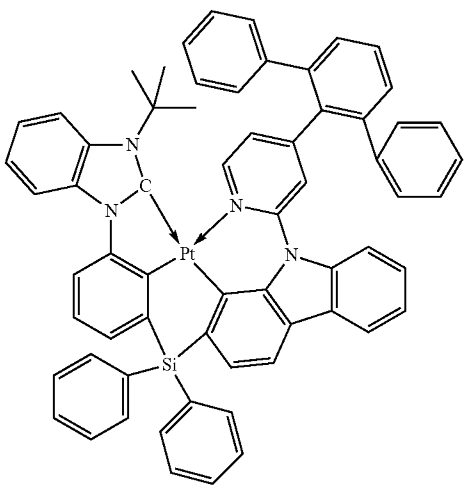
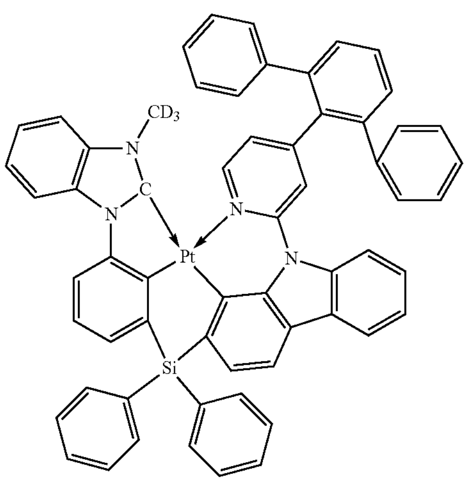
-continued
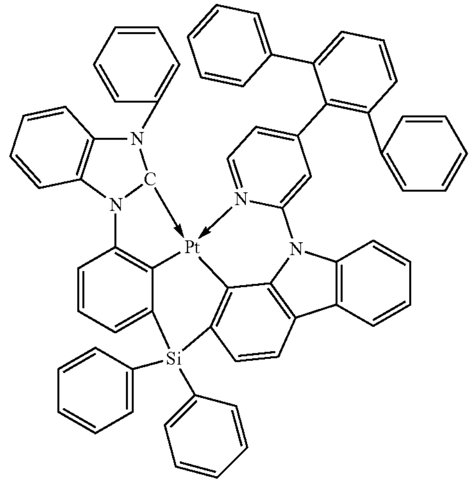
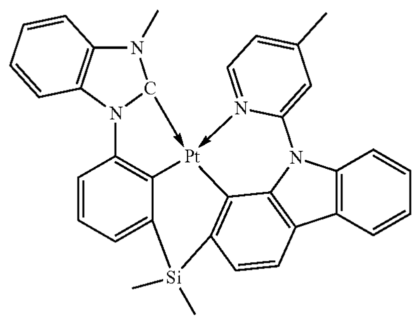
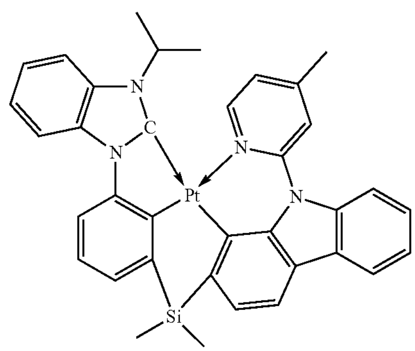
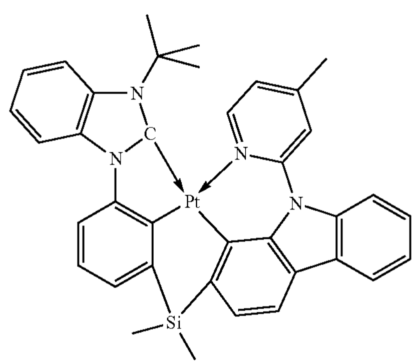

-continued
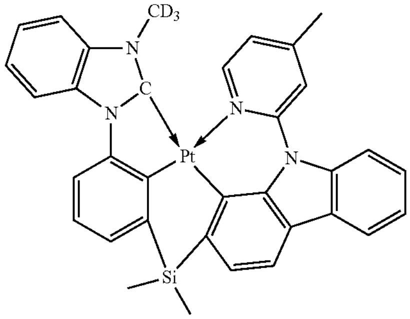
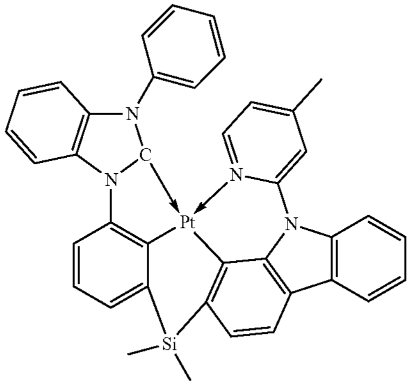
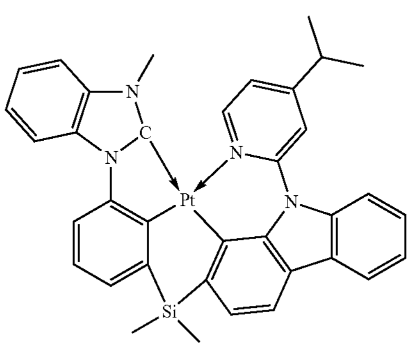
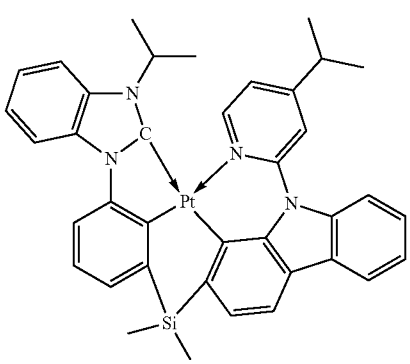
-continued
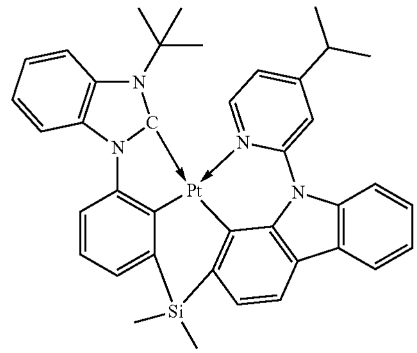
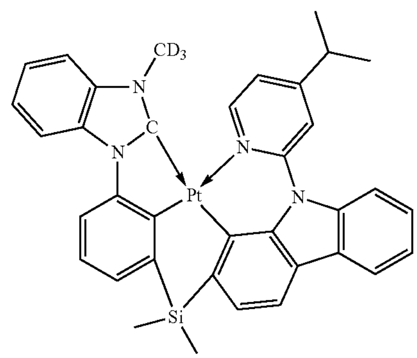
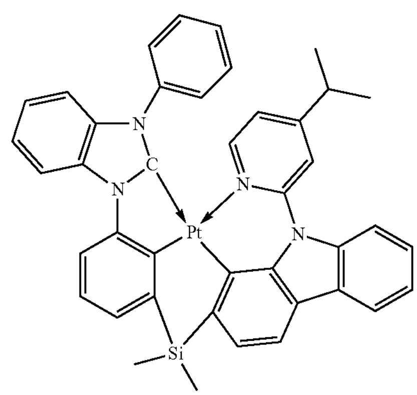
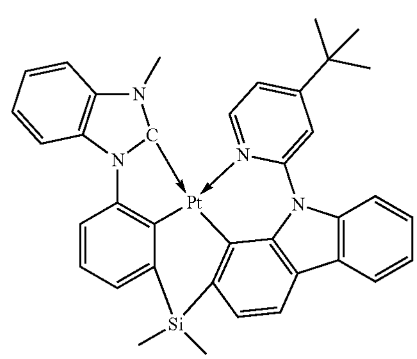

-continued
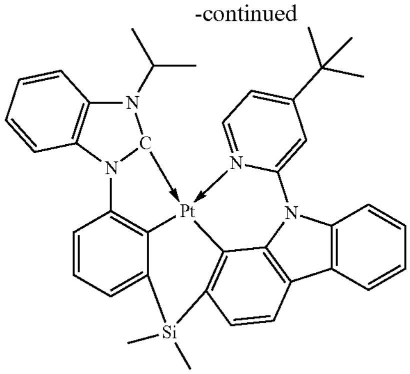
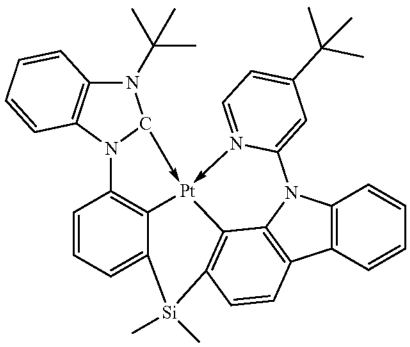
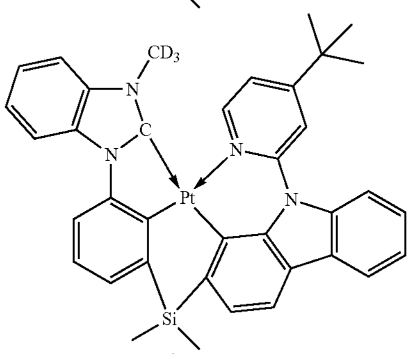
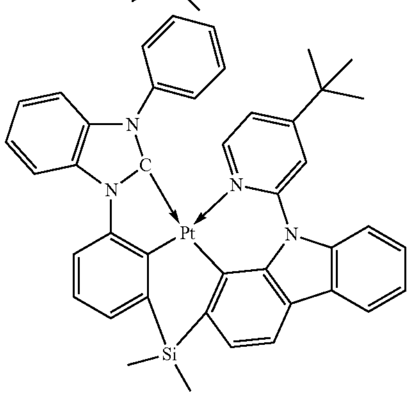
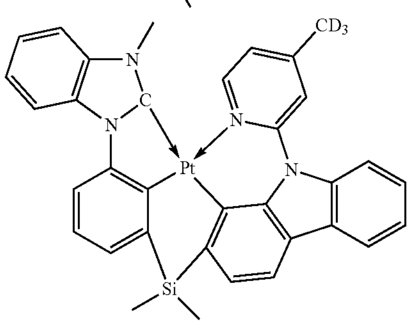
-continued
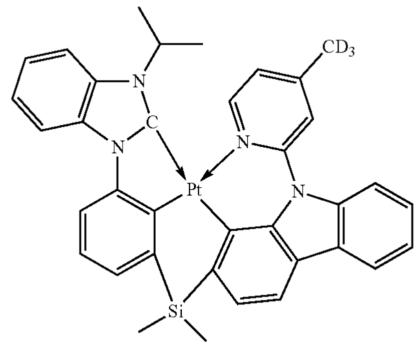
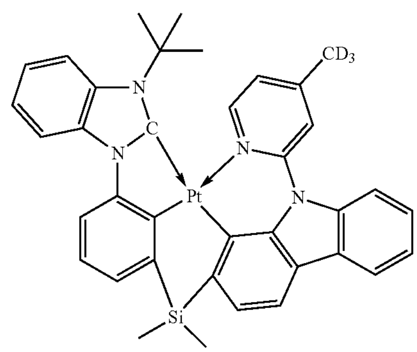
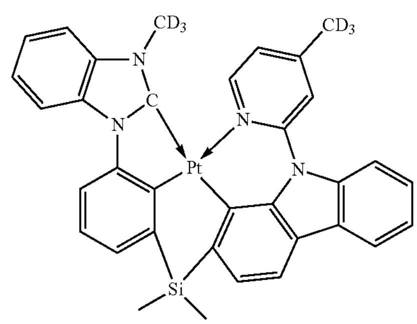
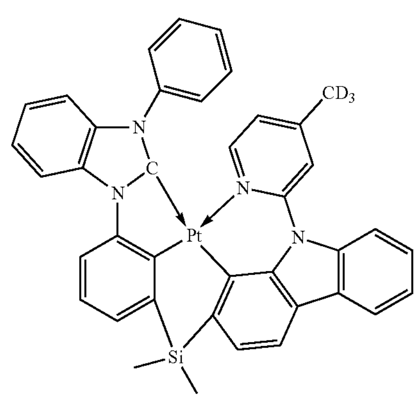

-continued
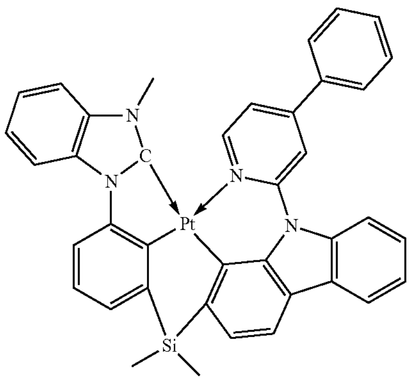
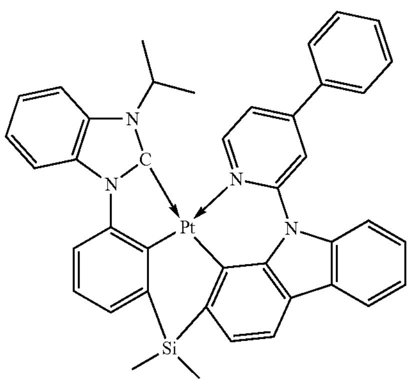
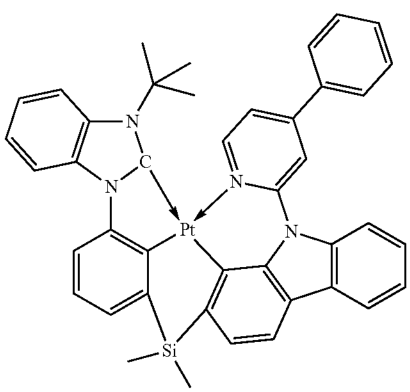
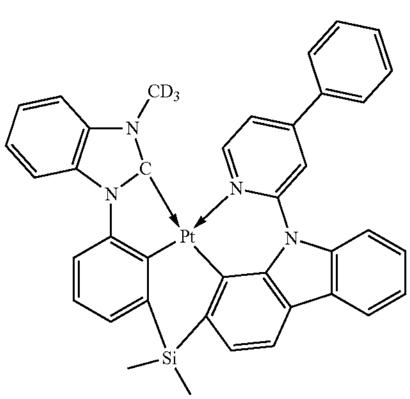
-continued
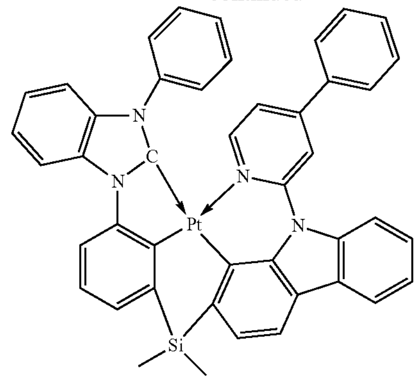
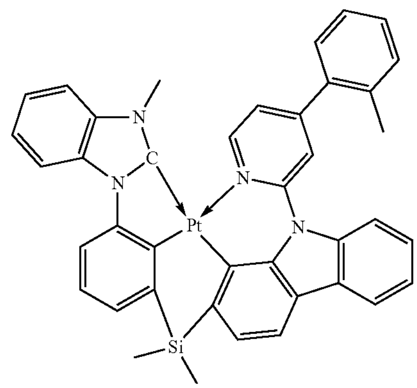
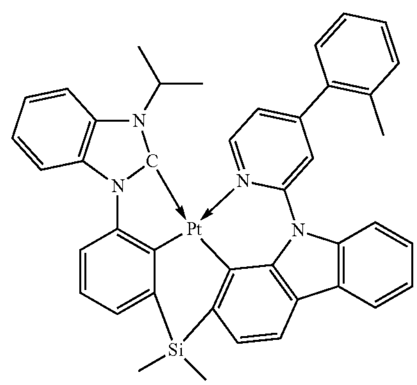
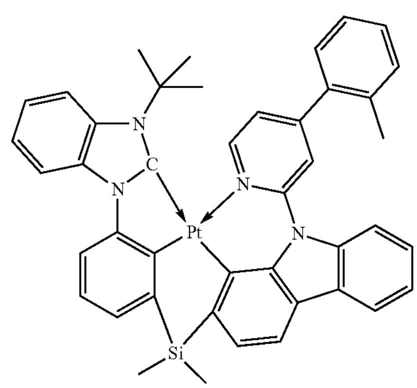

-continued
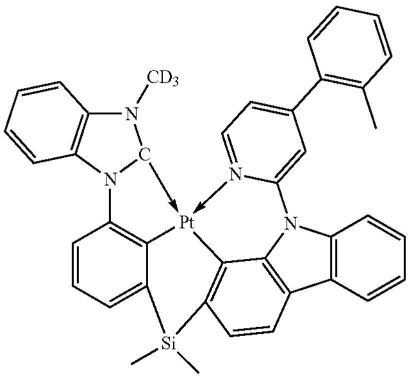
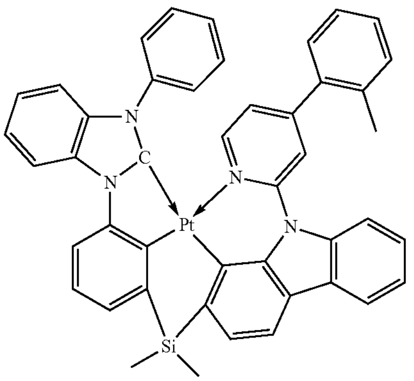
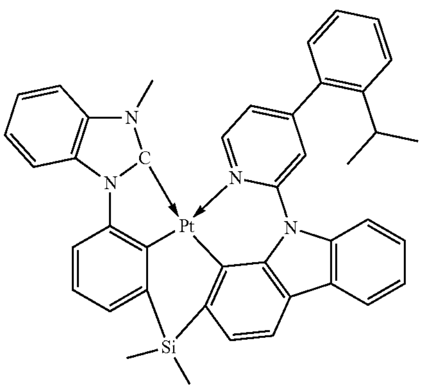
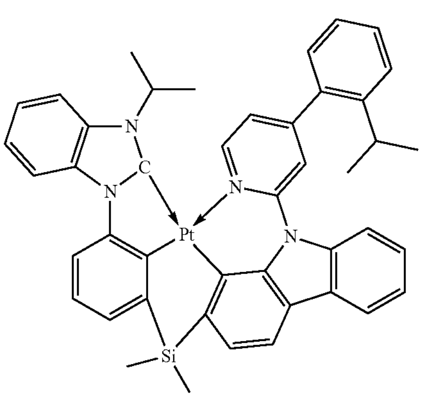
-continued
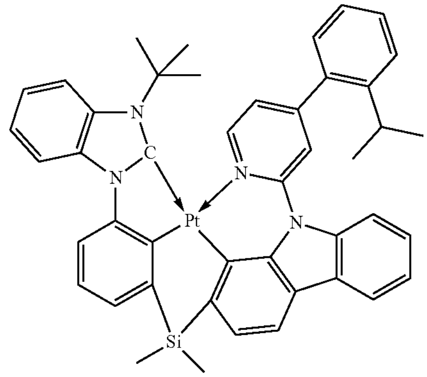
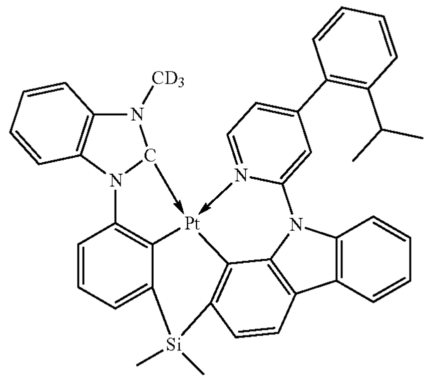
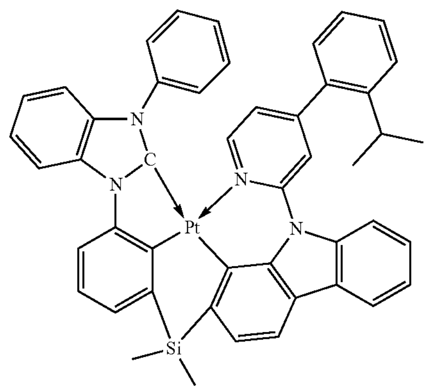
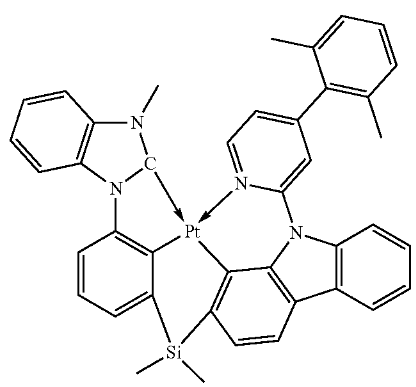

-continued
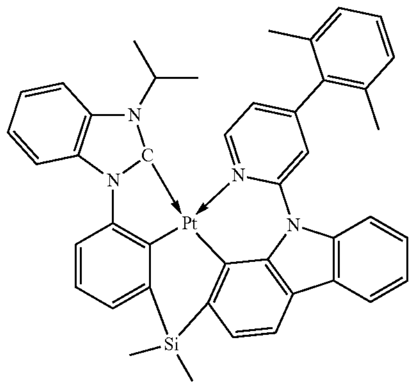
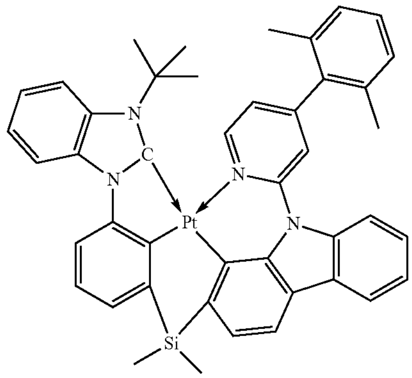
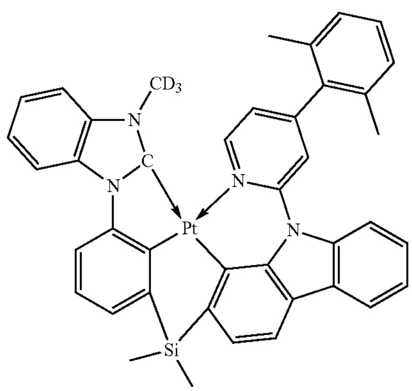
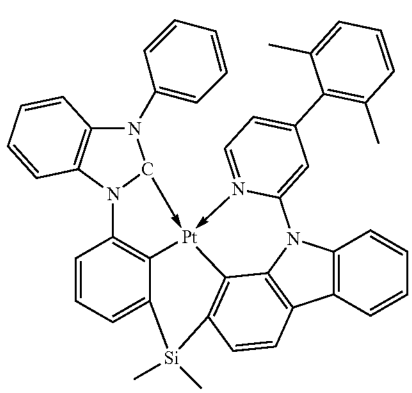
-continued
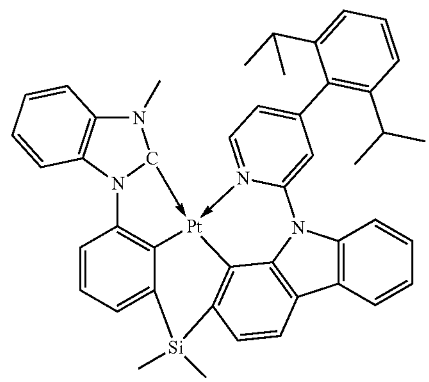
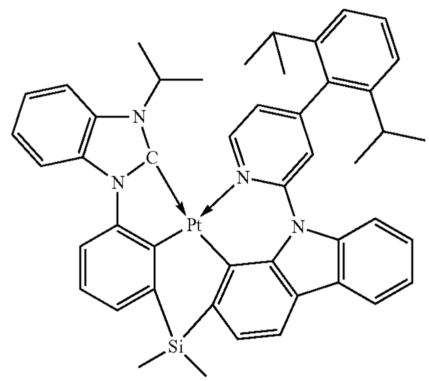
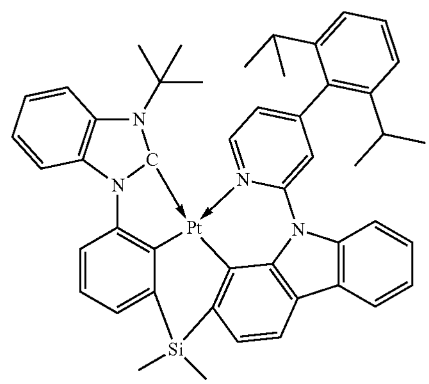
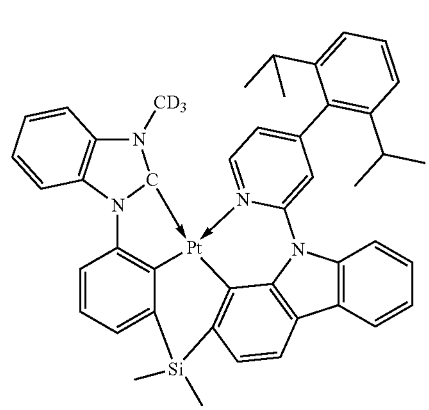

-continued
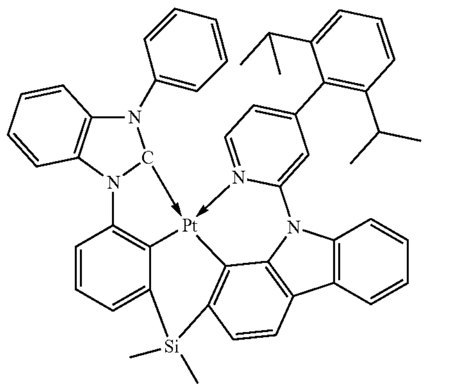
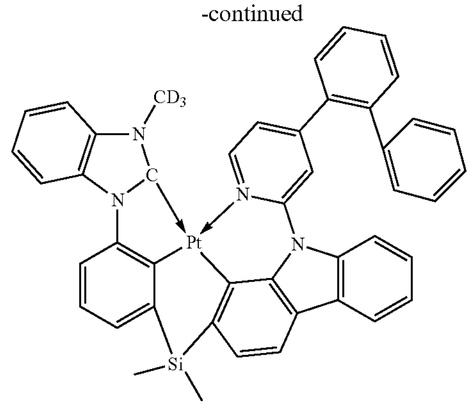
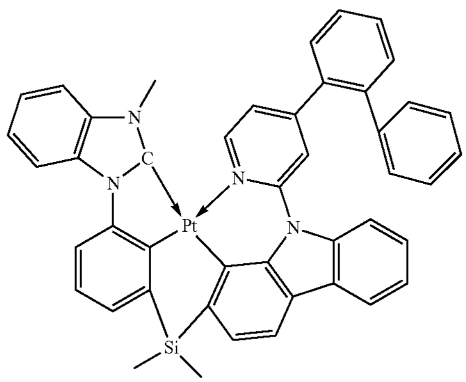
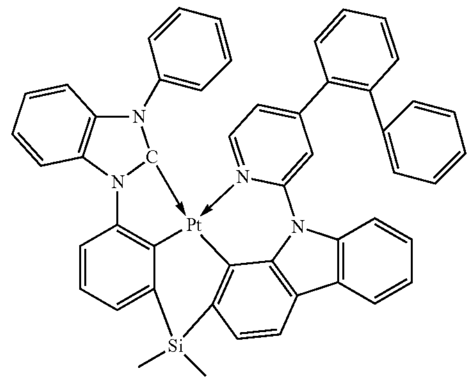
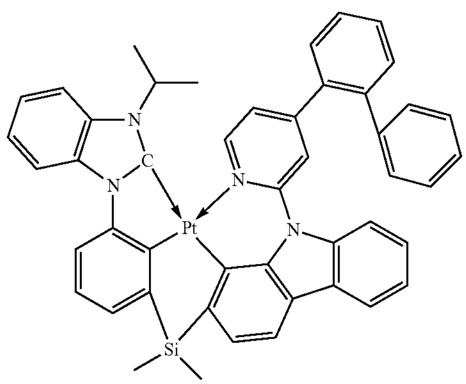
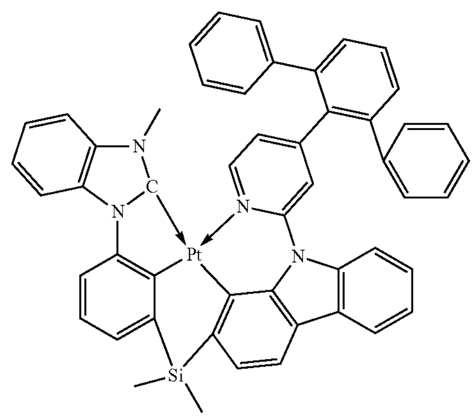
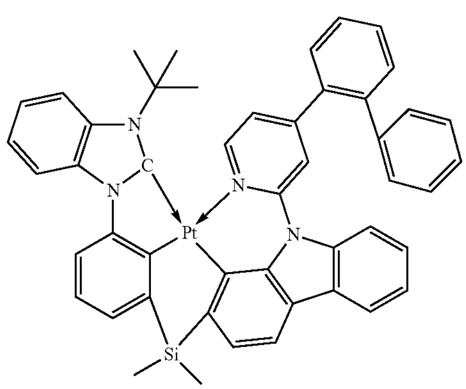
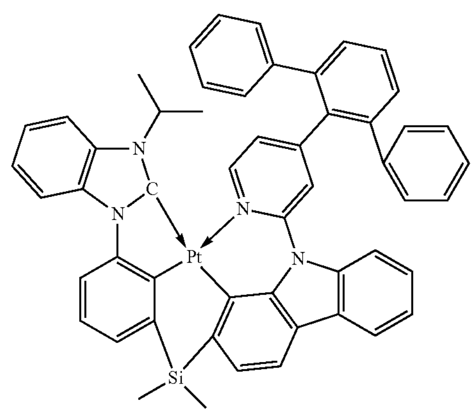

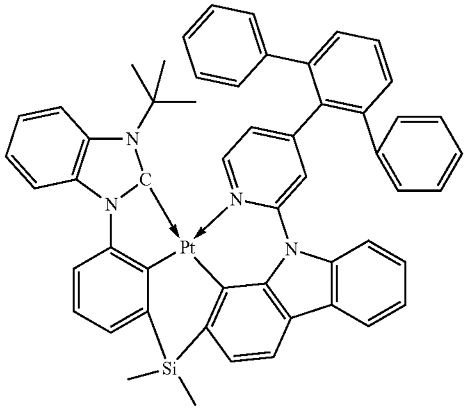
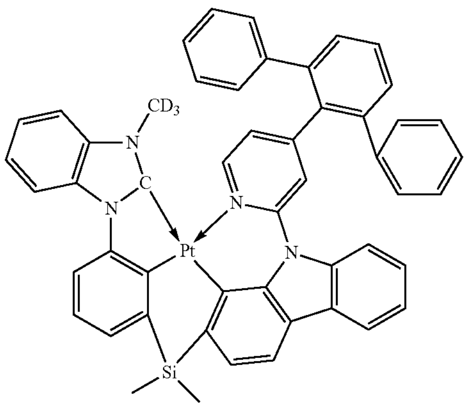
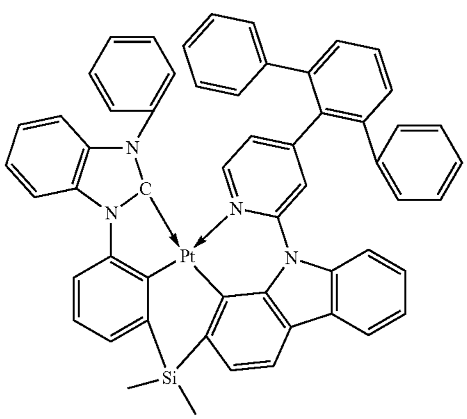
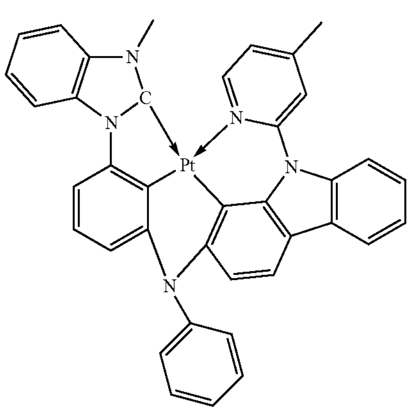
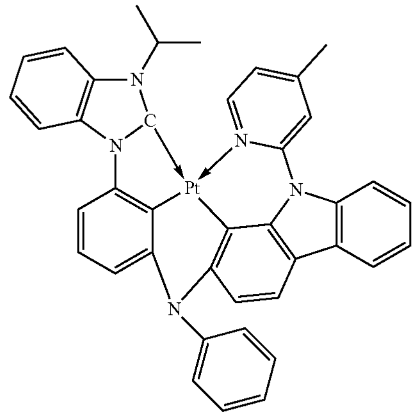
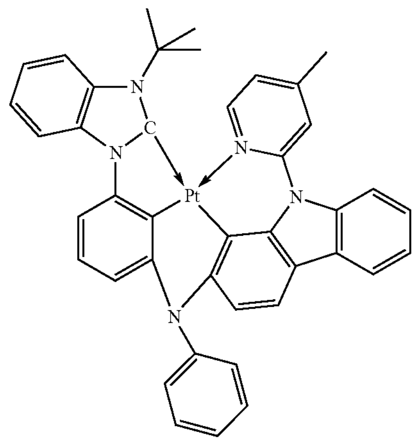
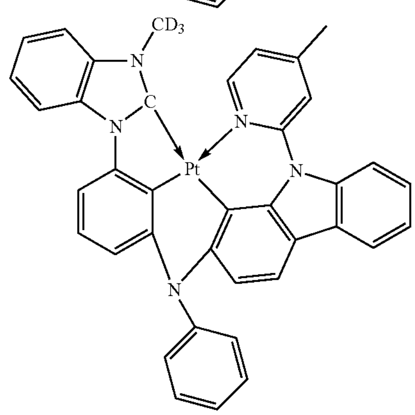
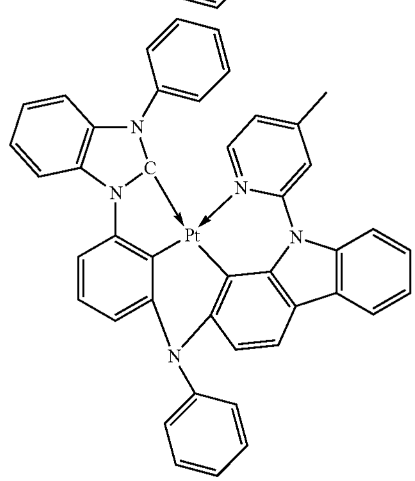

-continued
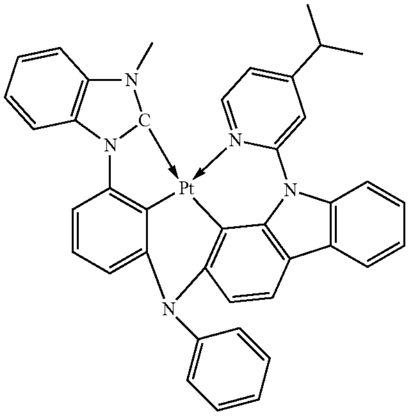
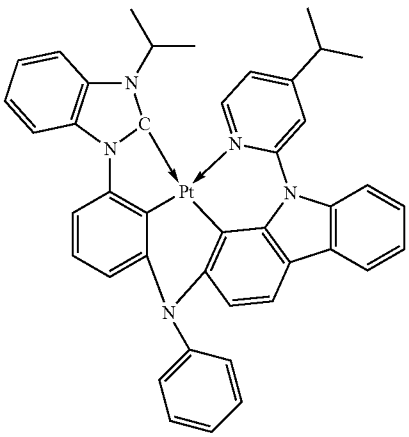
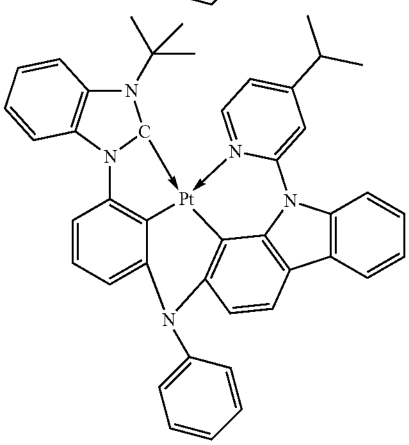
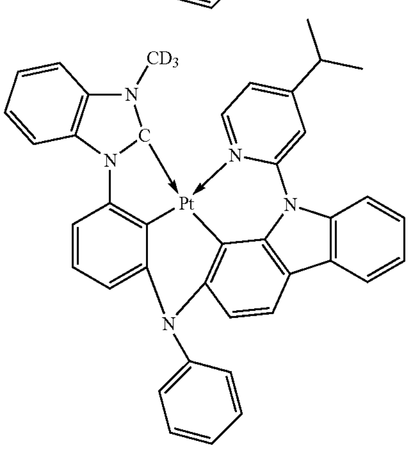
-continued
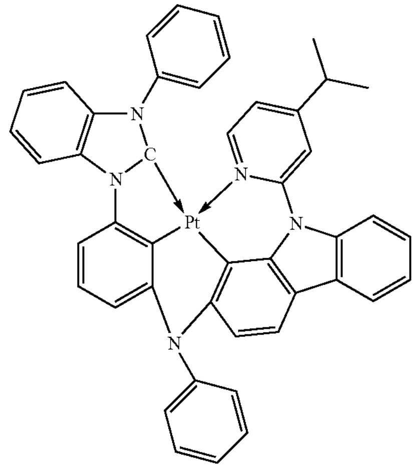
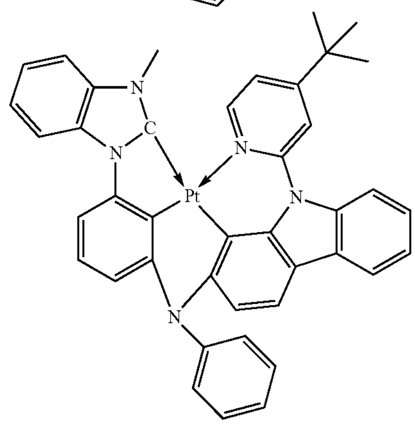
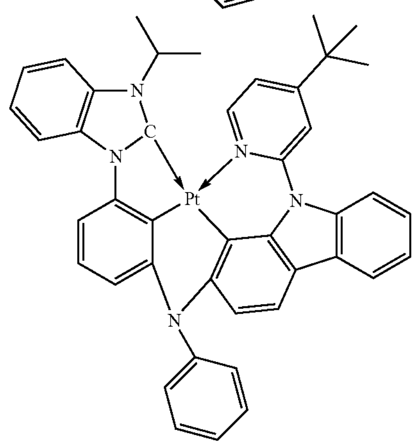
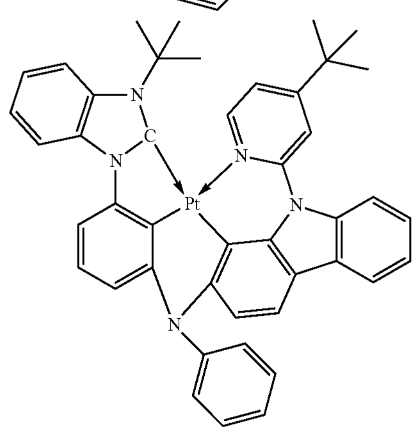

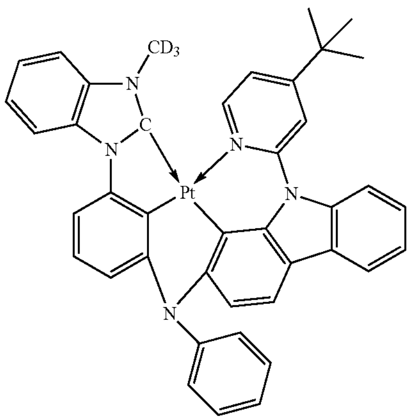
CD3
N
C
N
Pt
N
N
N
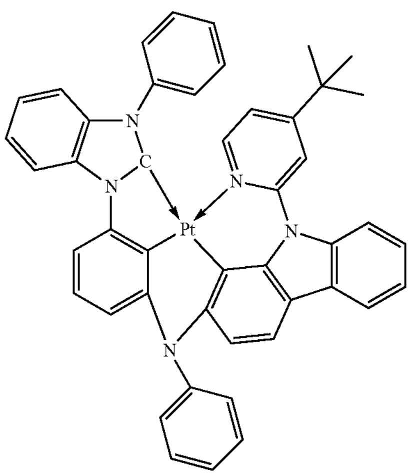
CD3
N
C
N
Pt
N
N
N
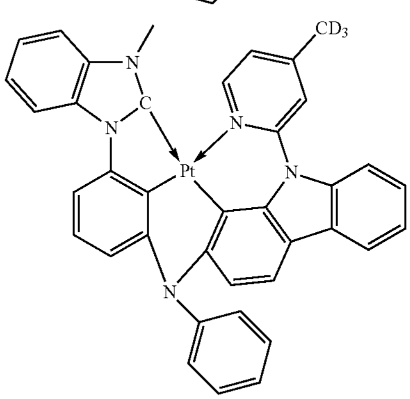
N
C
N
Pt
N
N
N
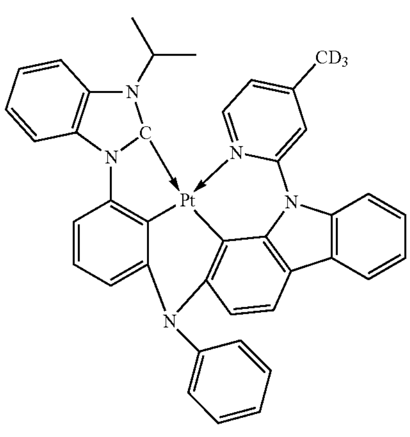
CD3
CD3
N
C
N
Pt
N
N
N
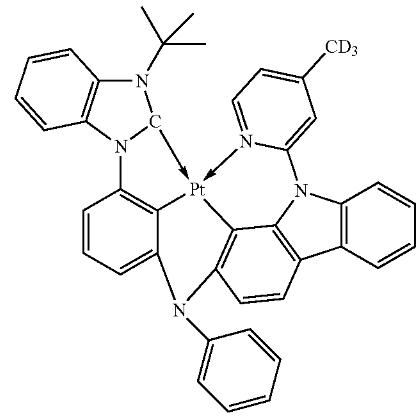
CD3
N
C
N
Pt
N
N
N
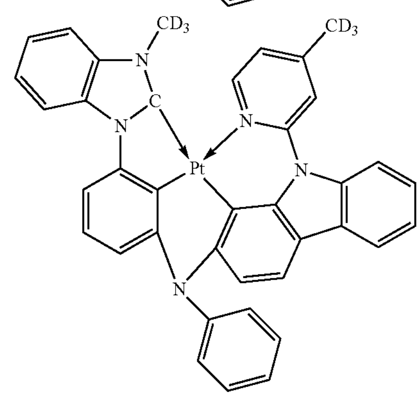
CD3
N
C
N
Pt
N
N
N
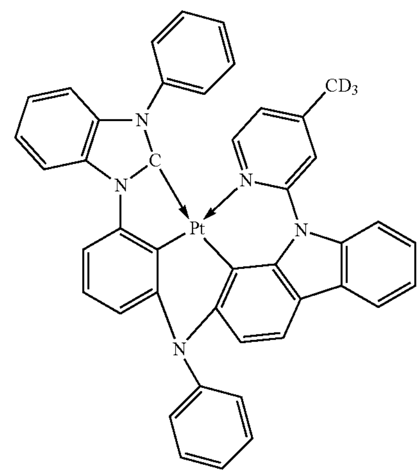
CD3
N
C
N
Pt
N
N
N
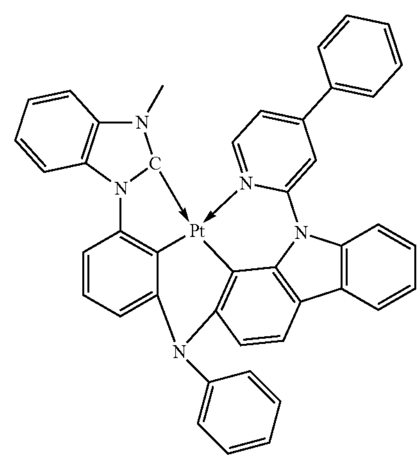
N
C
N
Pt
N
N
N -continued
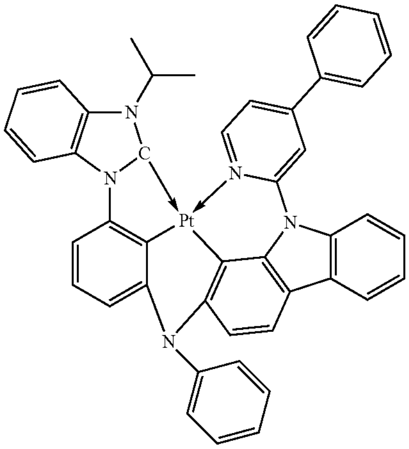
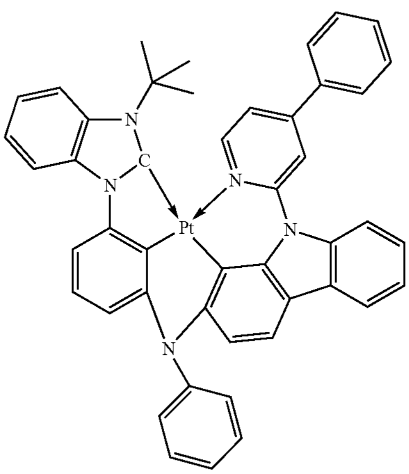
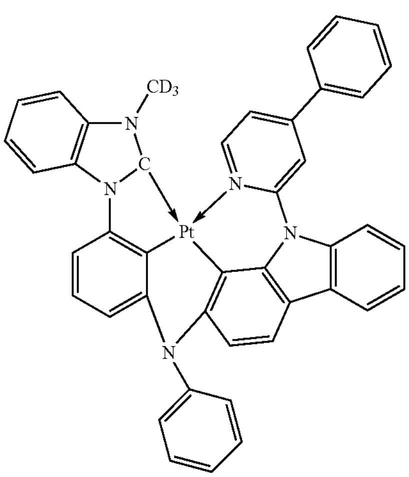
-continued
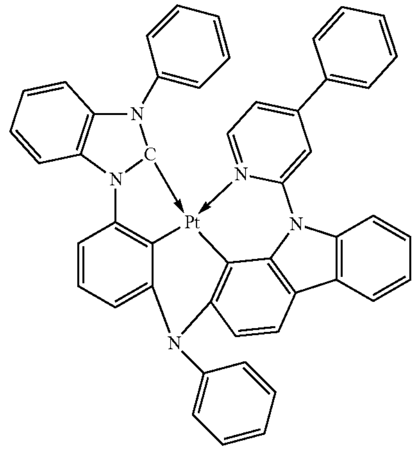
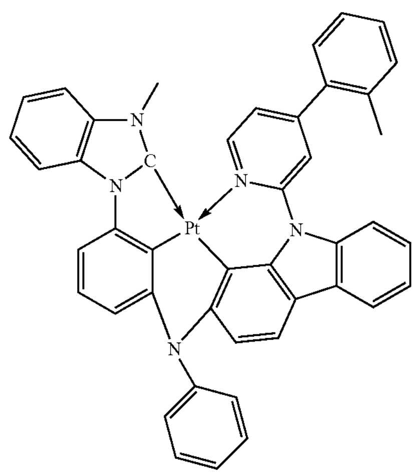
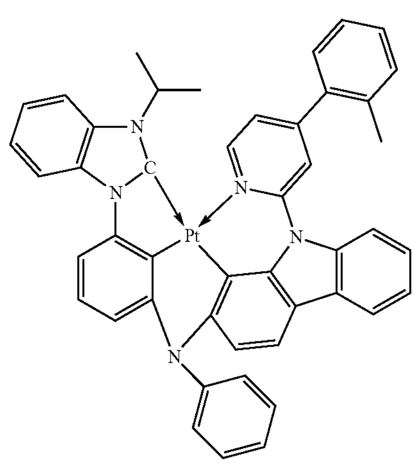

-continued
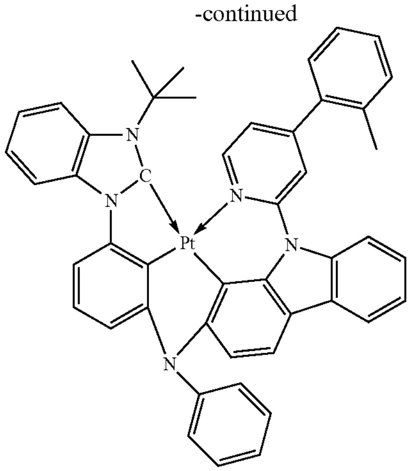
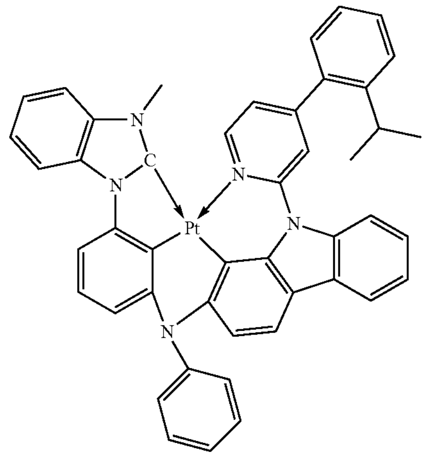
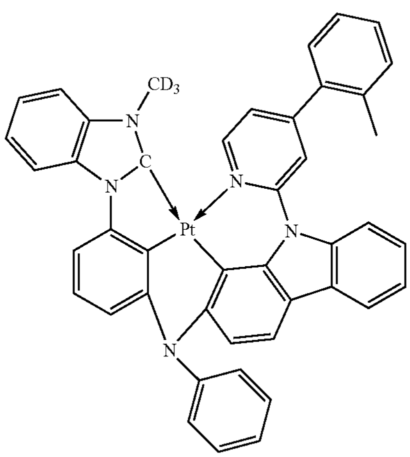
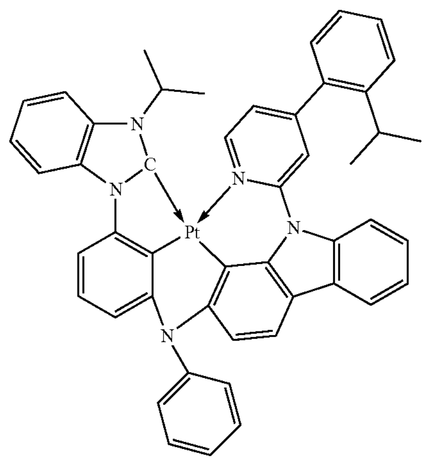
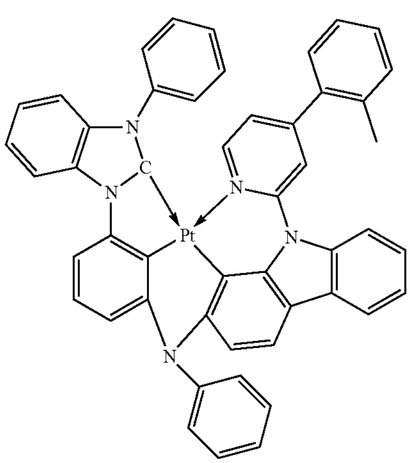
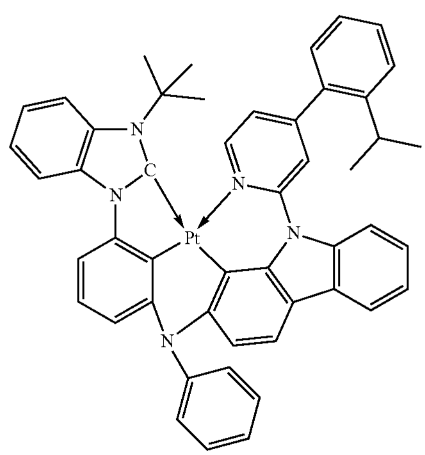

-continued
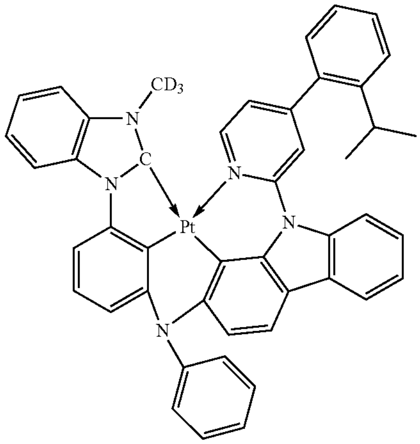
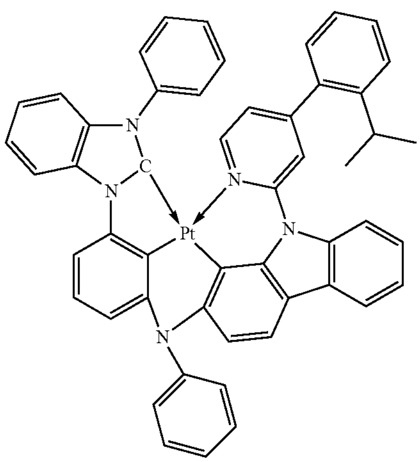
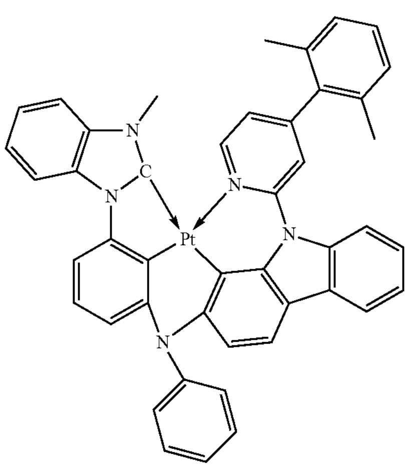
-continued
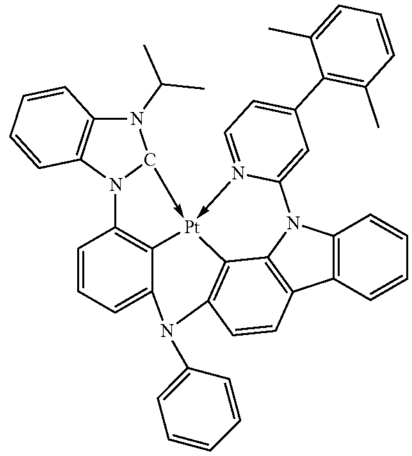
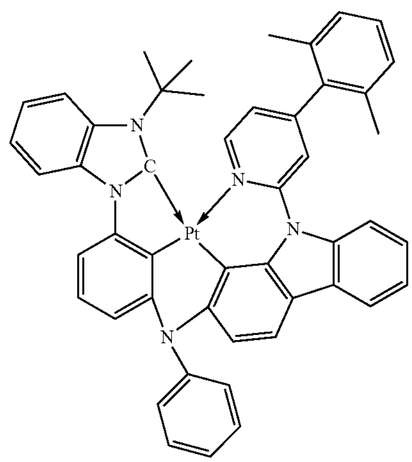
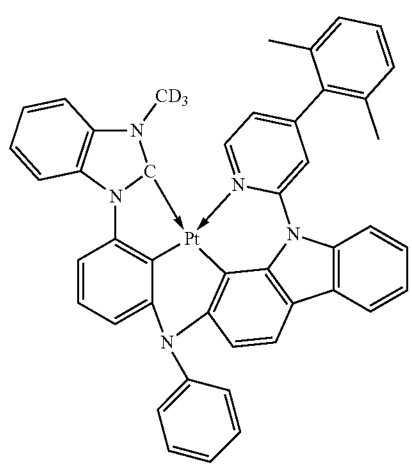

-continued
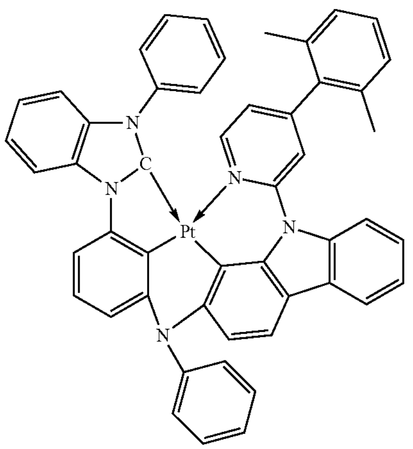
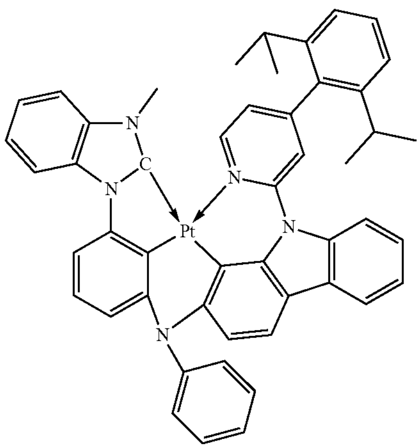
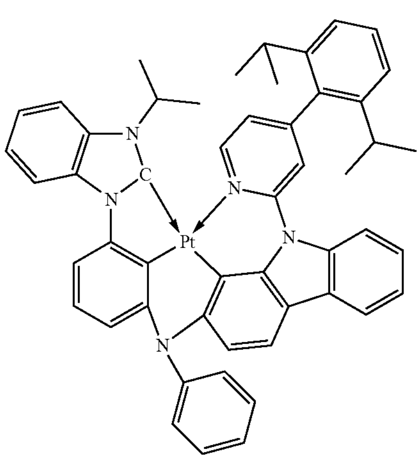
-continued
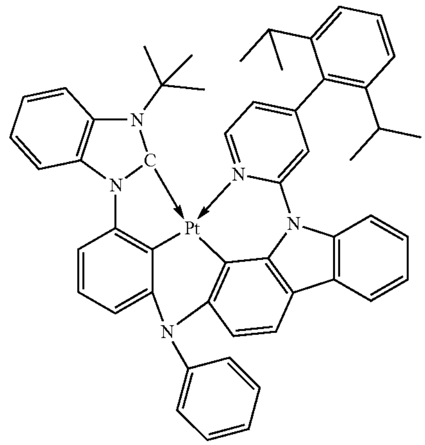
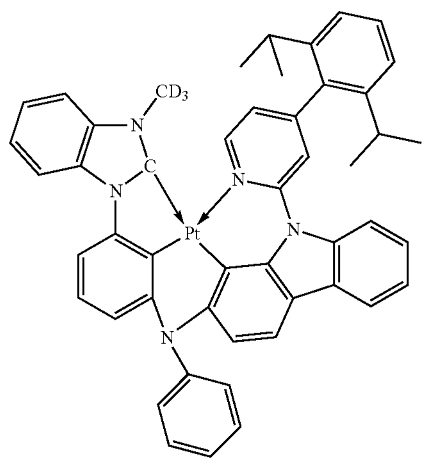
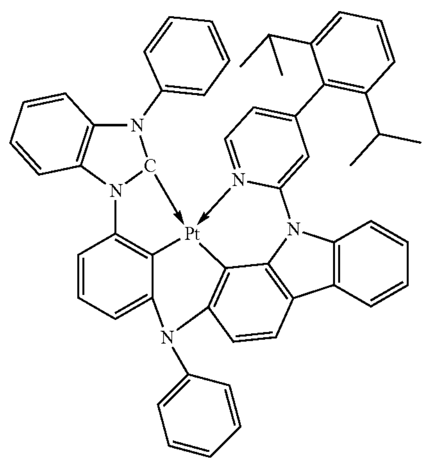

-continued
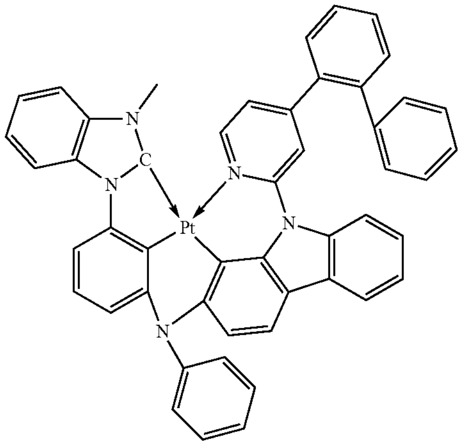
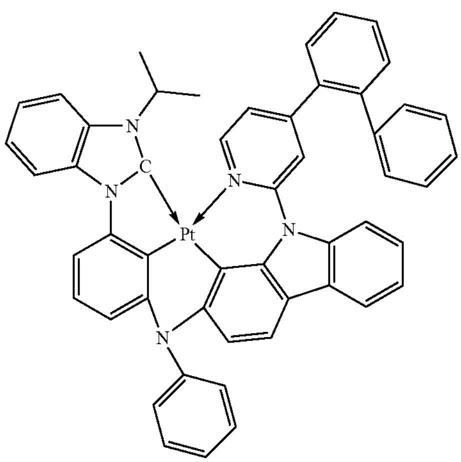
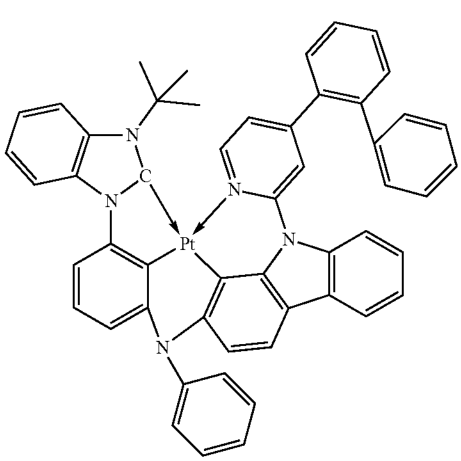
-continued
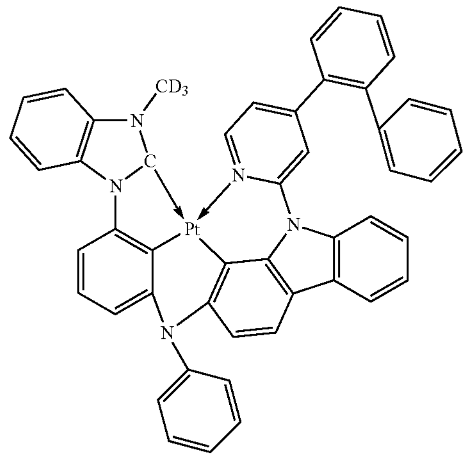
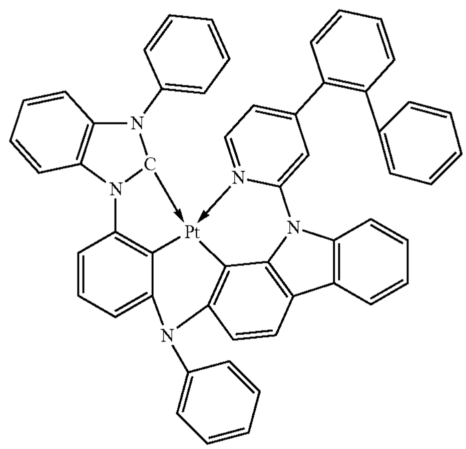
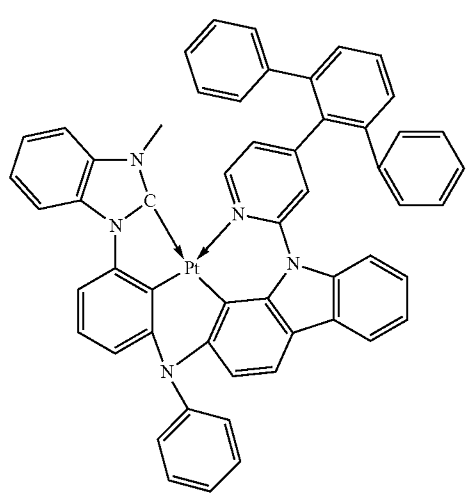

-continued
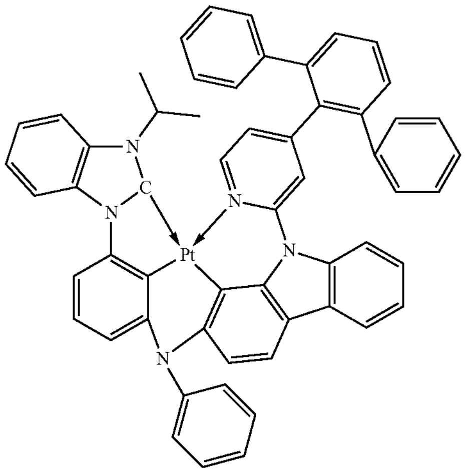
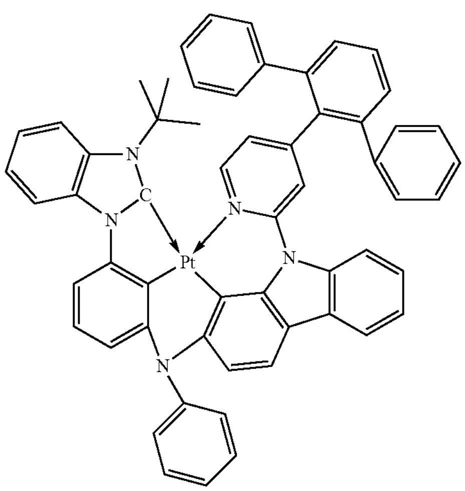
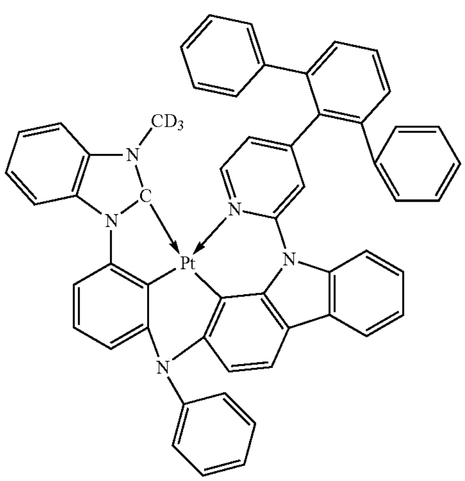
-continued
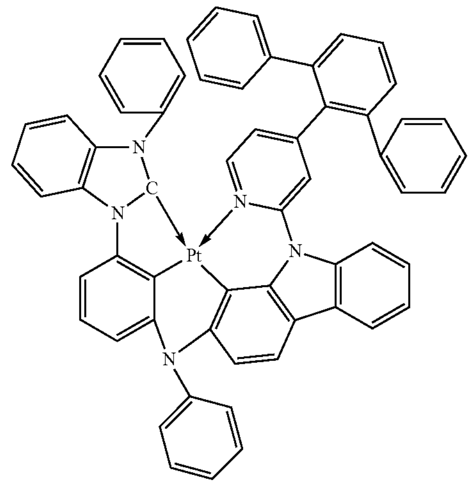
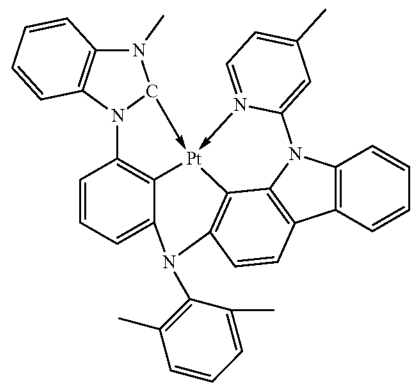
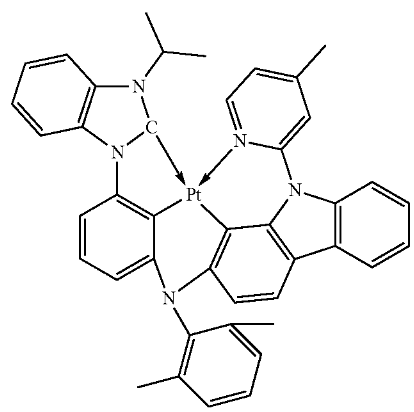
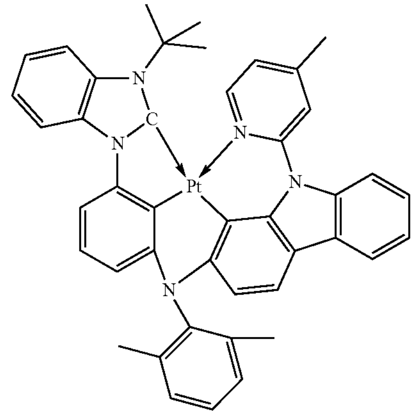

-continued
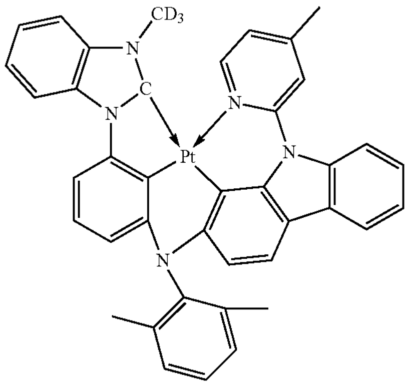
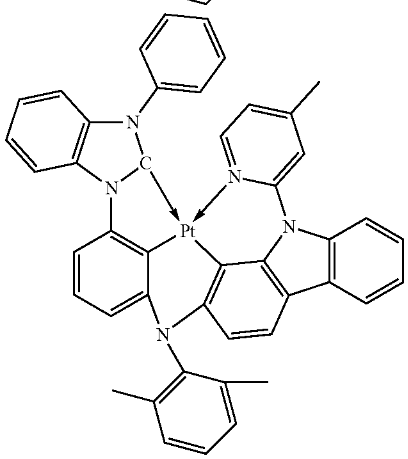
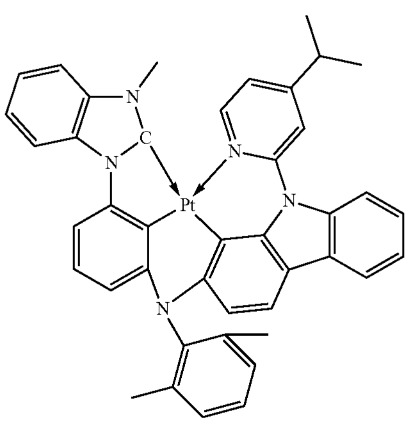
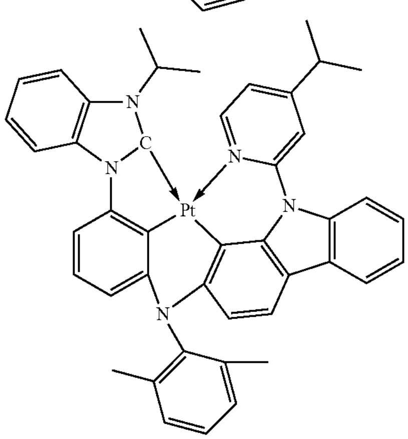
-continued
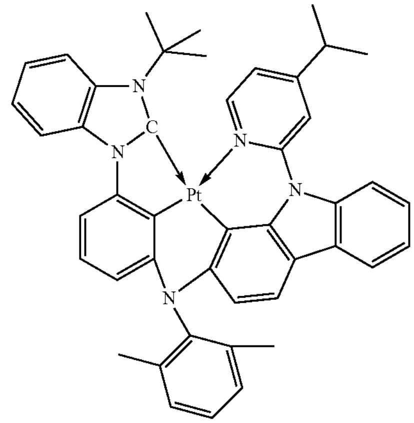
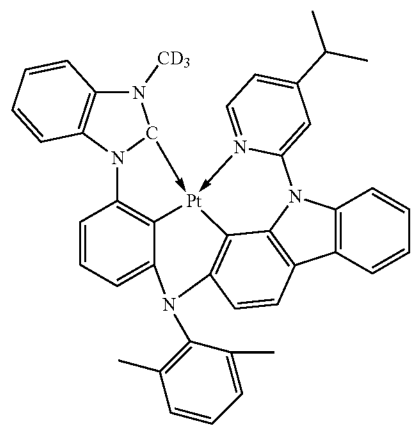
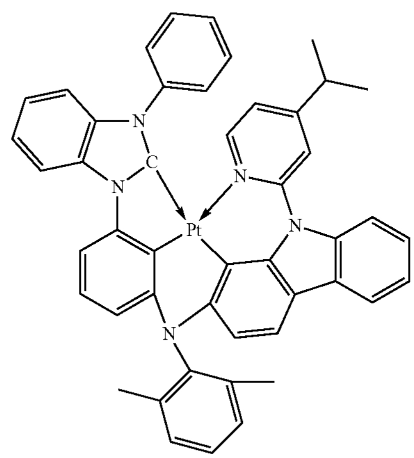
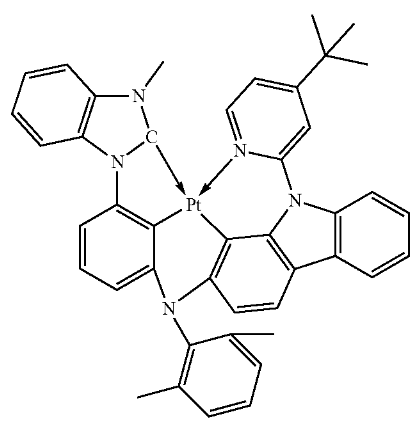

-continued
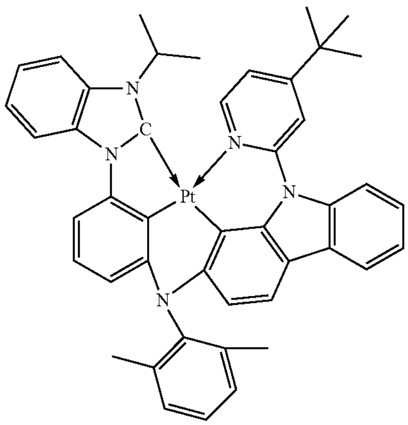
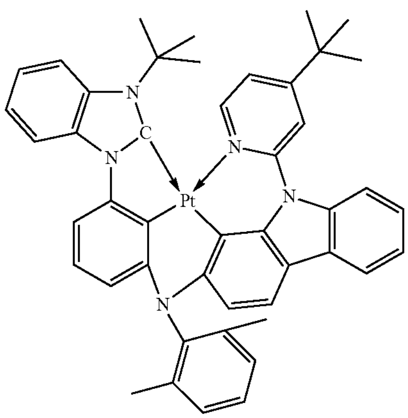
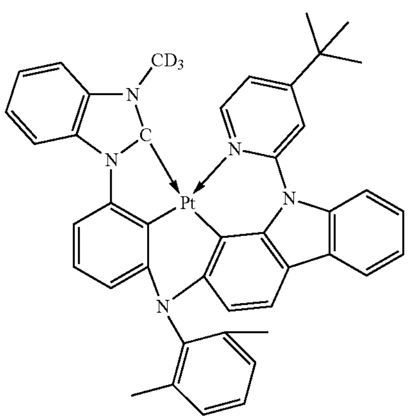
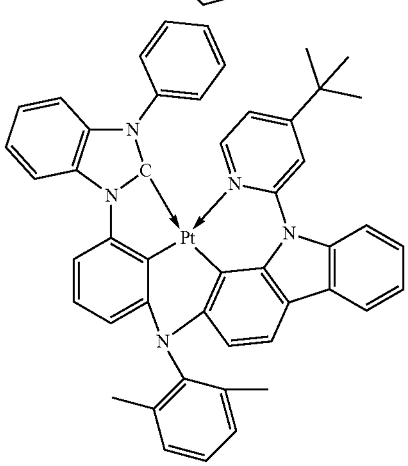
-continued
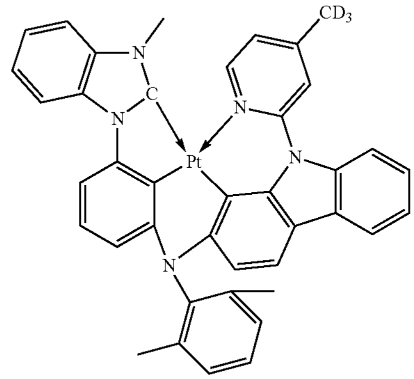
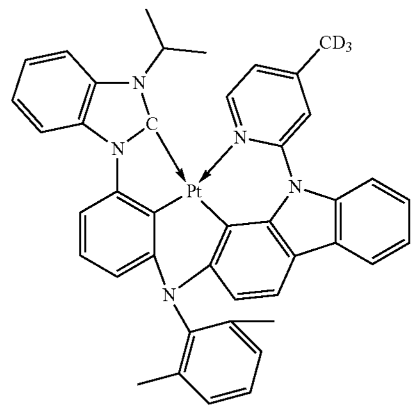
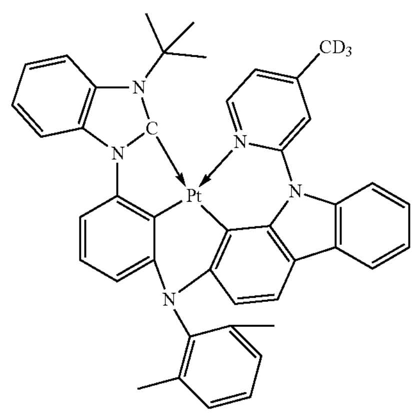
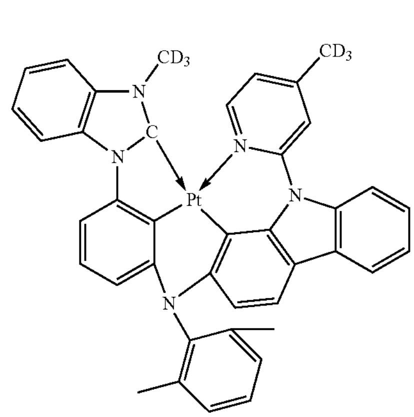

-continued
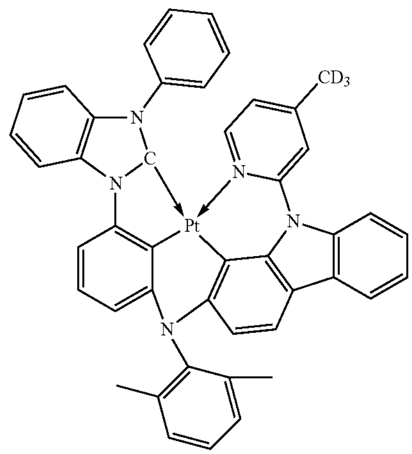
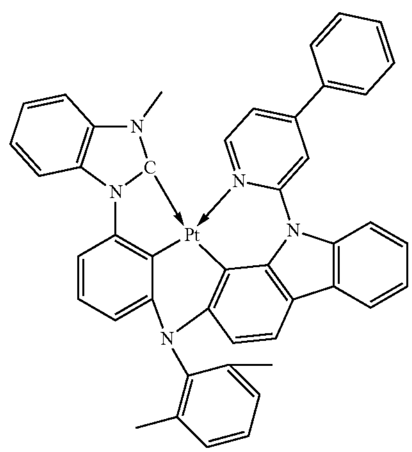
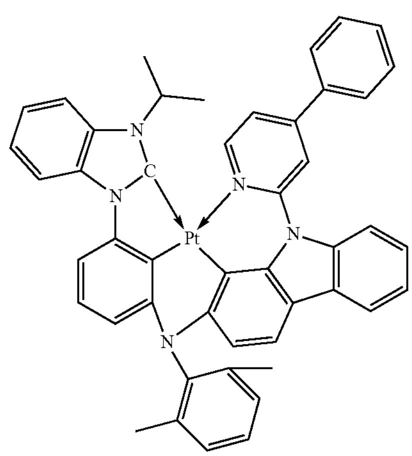
-continued
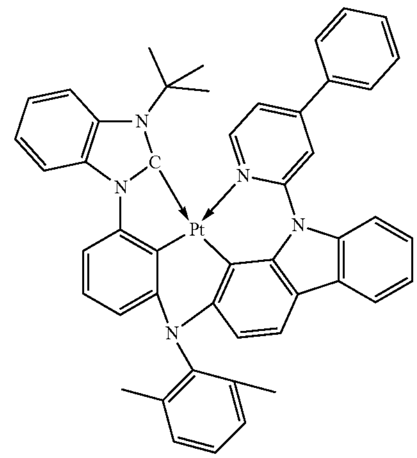
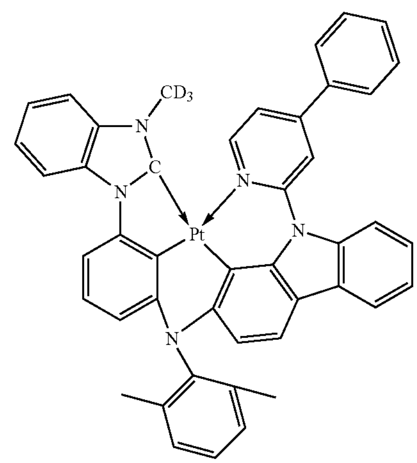
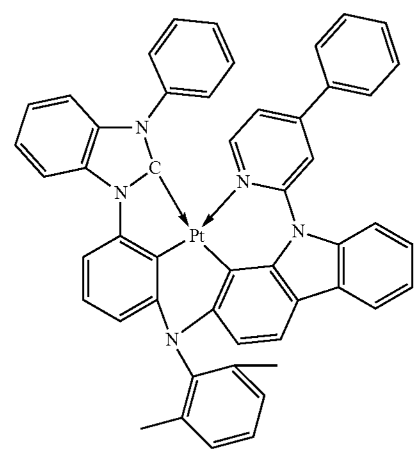

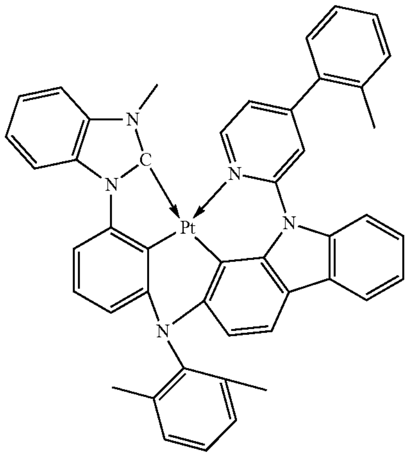
N
C
N
Pt
N
N
N
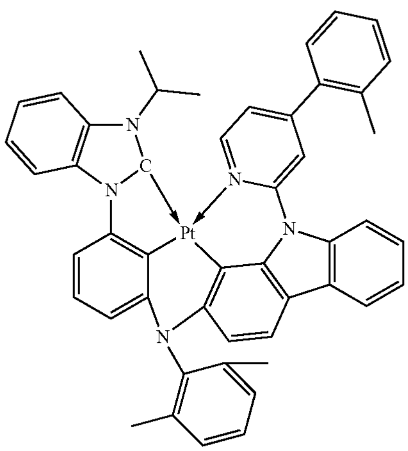
N
C
N
Pt
N
N
N
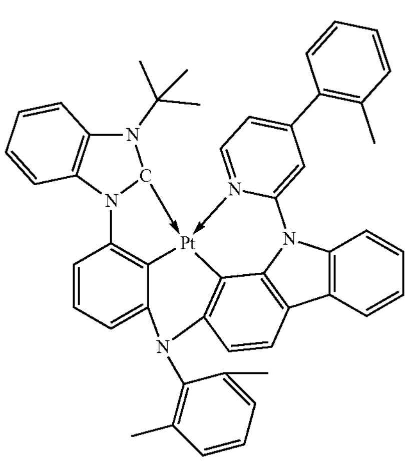
N
C
N
Pt
N
N
N
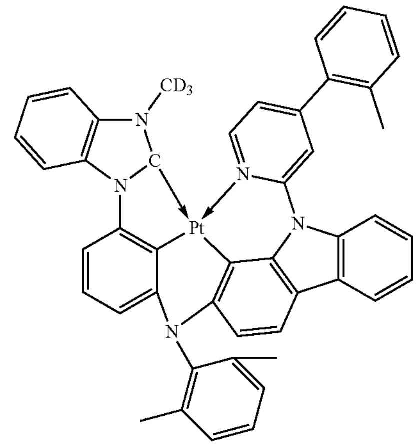
CD3
N
C
N
Pt
N
N
N
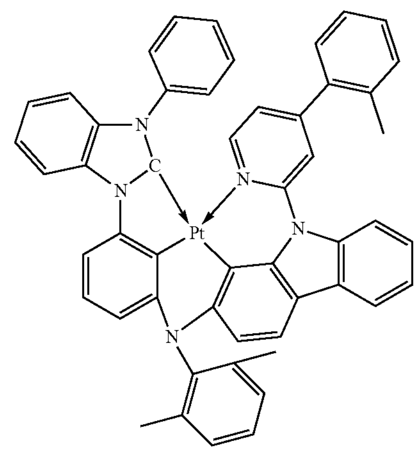
N
C
N
Pt
N
N
N
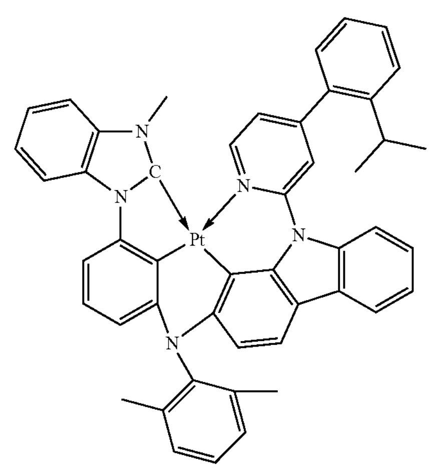
N
C
N
Pt
N
N
N -continued
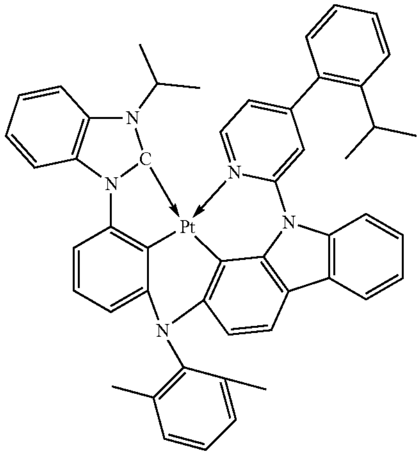
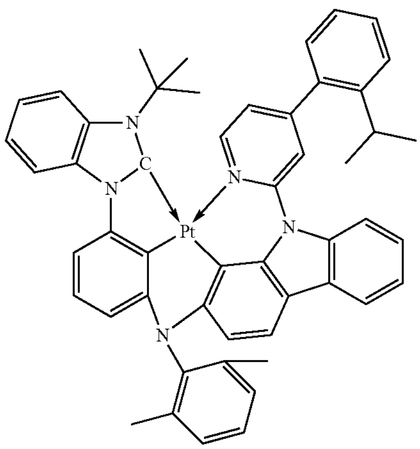
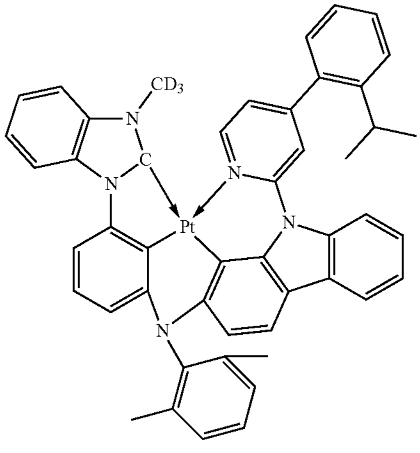
-continued
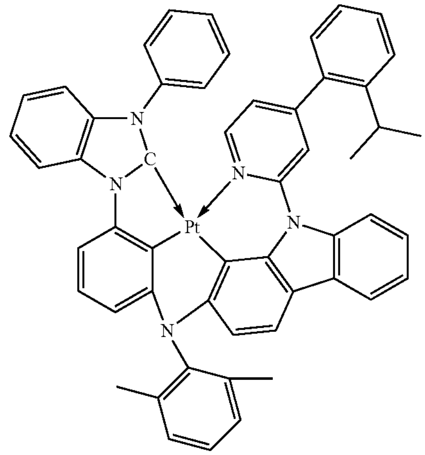
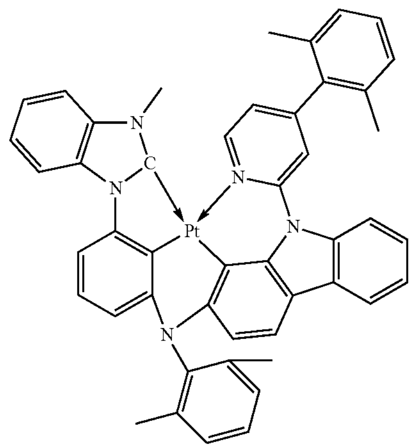
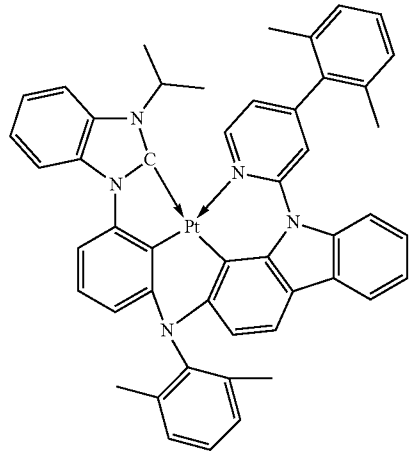

-continued
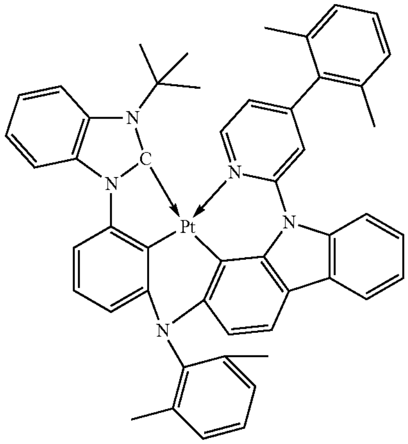
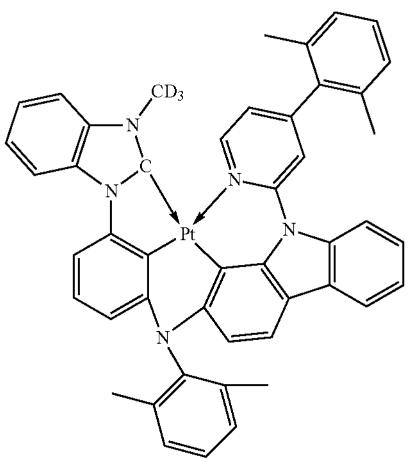
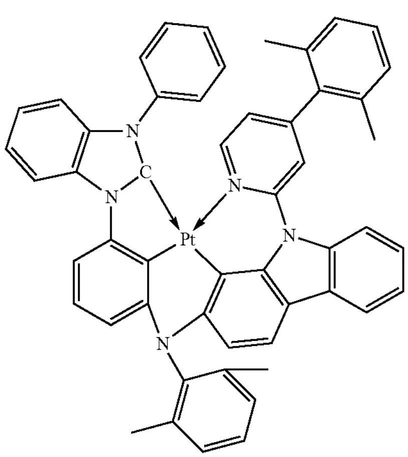
-continued
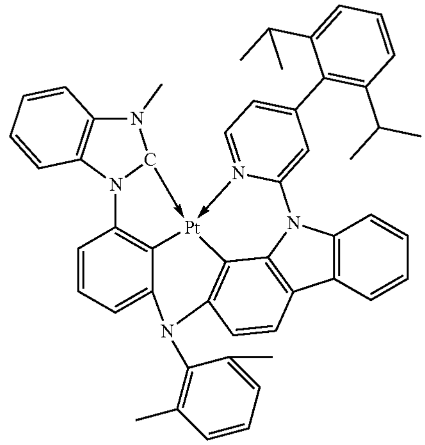
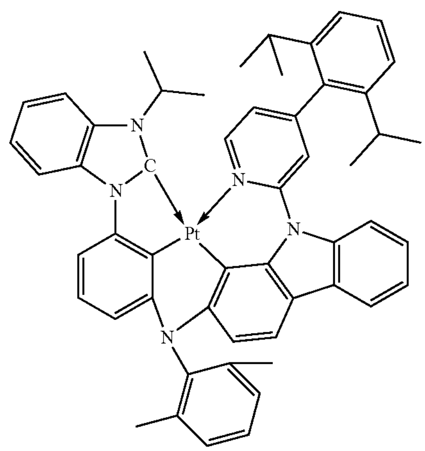
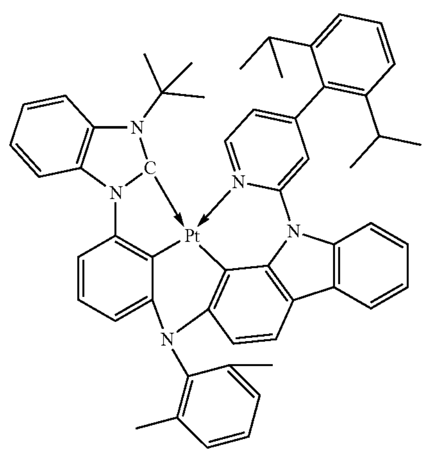

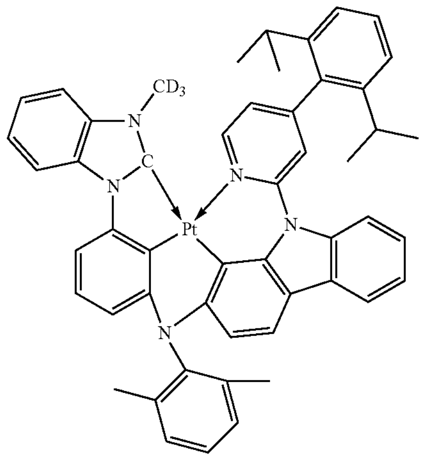
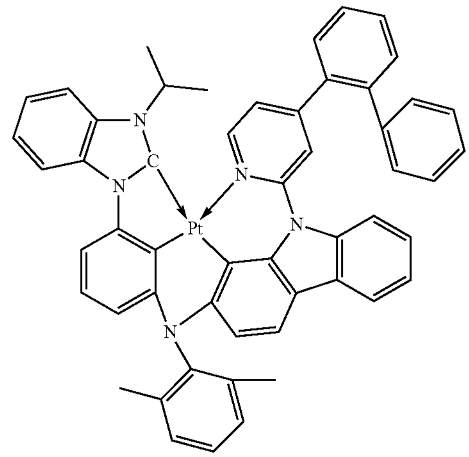
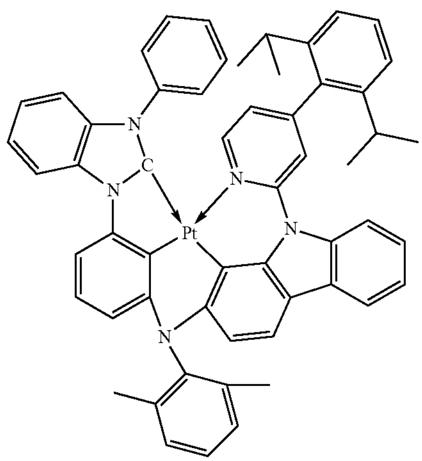
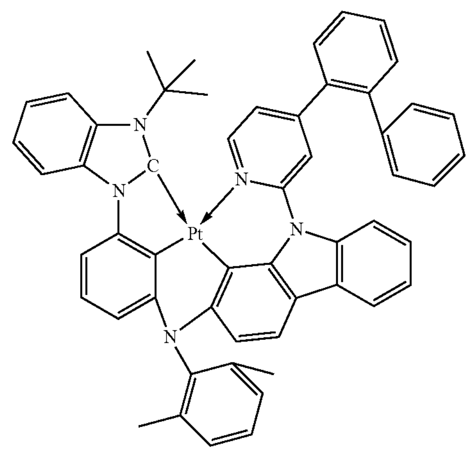
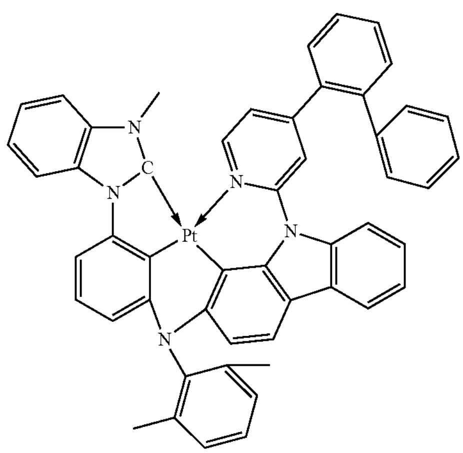
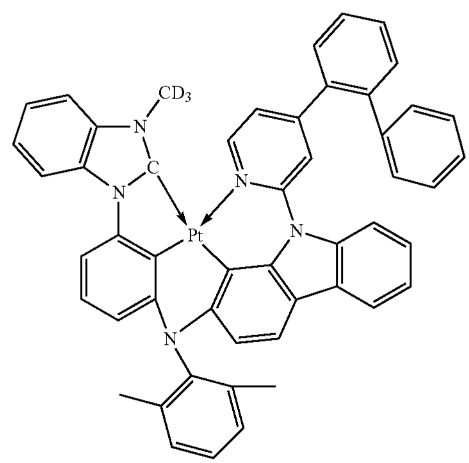

-continued
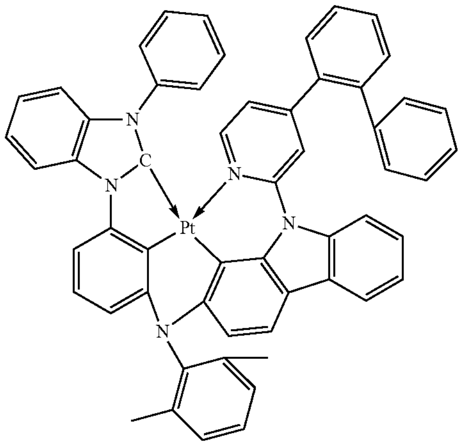
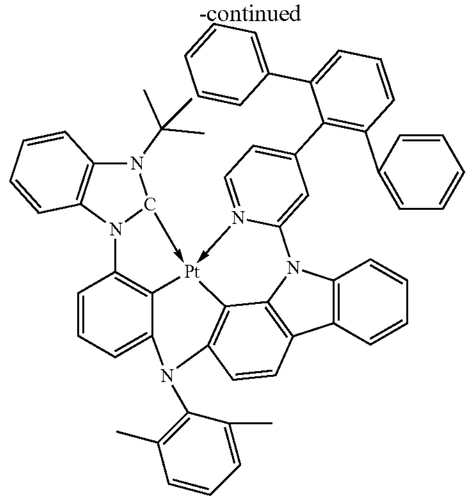
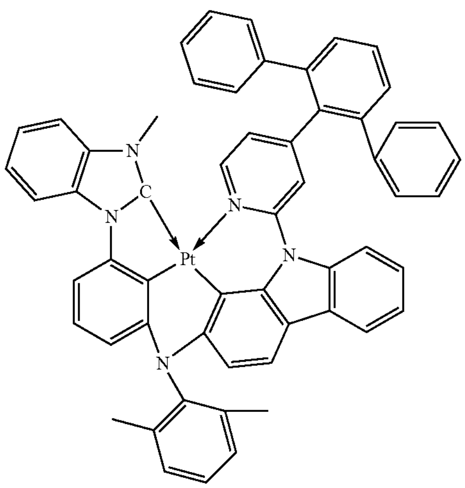
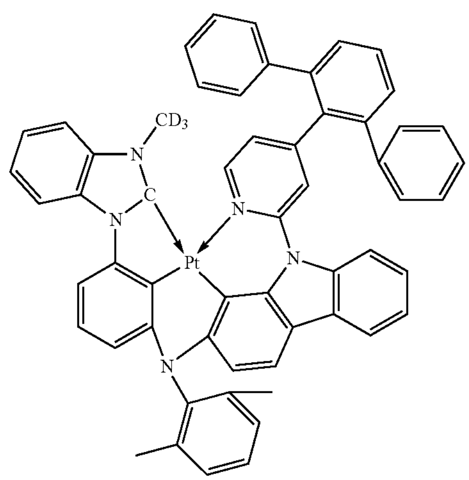
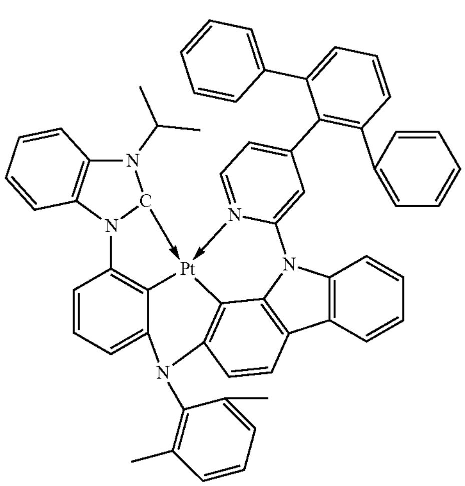
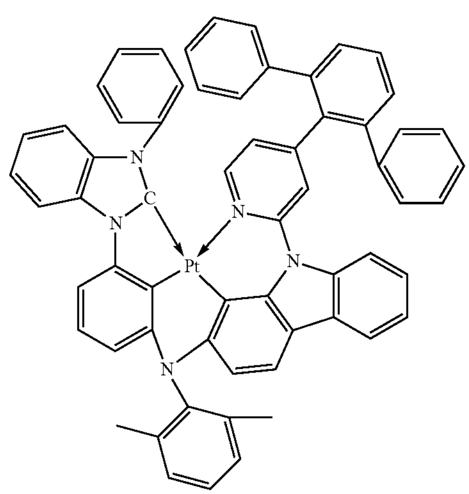

-continued
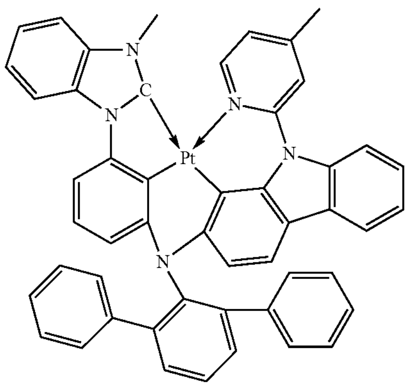
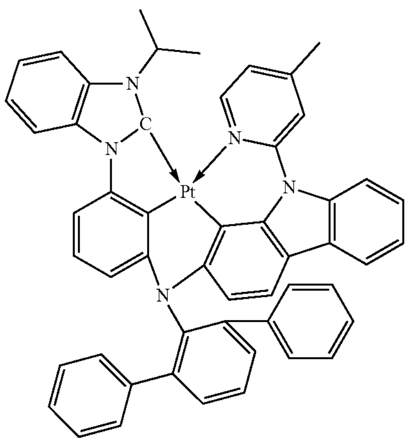
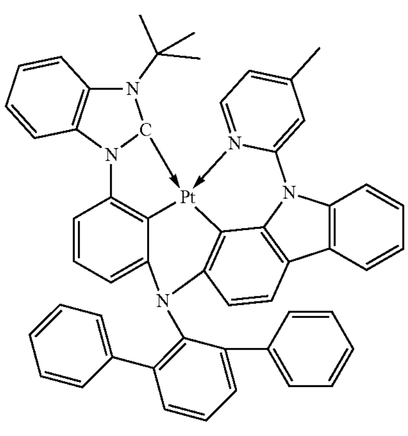
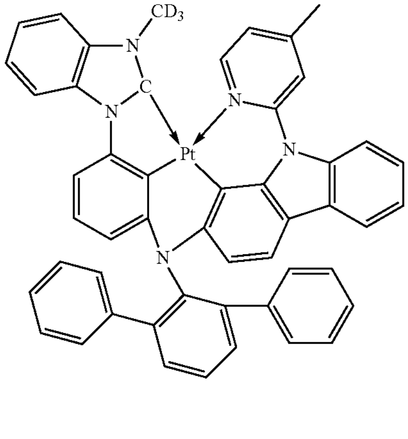
-continued
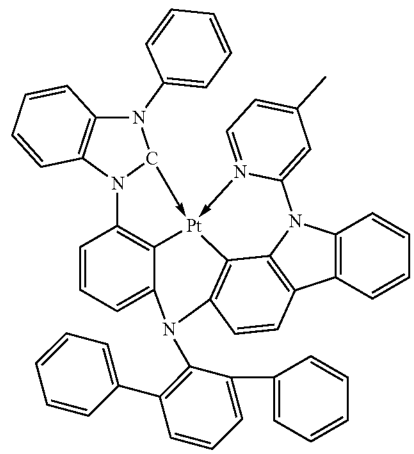
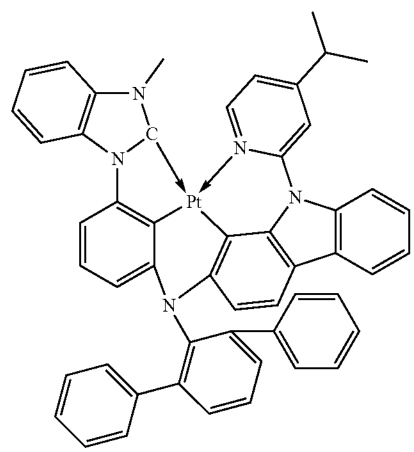
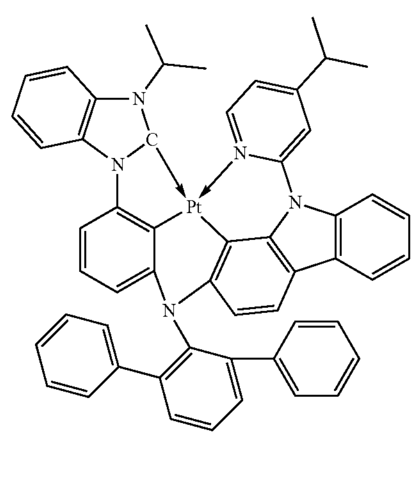

-continued
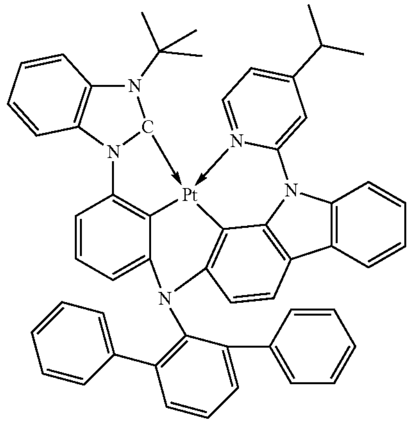
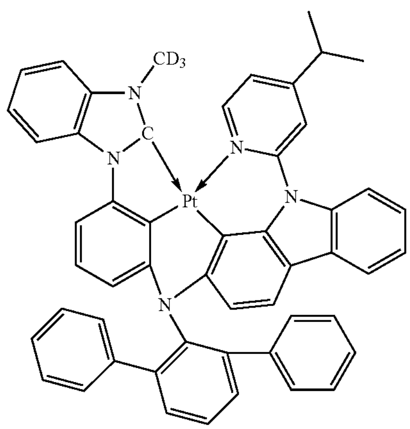
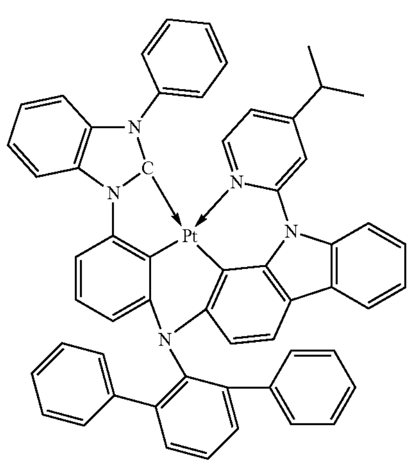
-continued
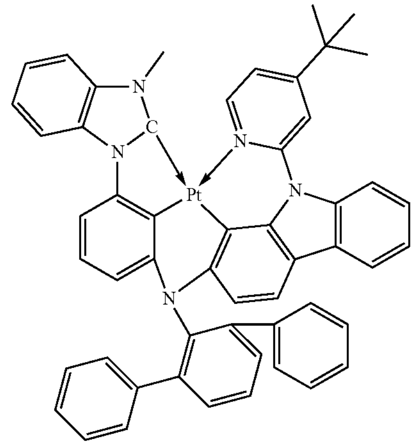
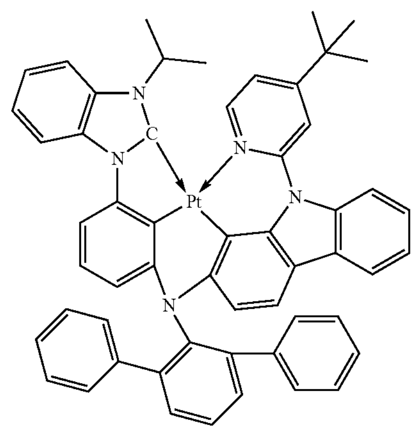
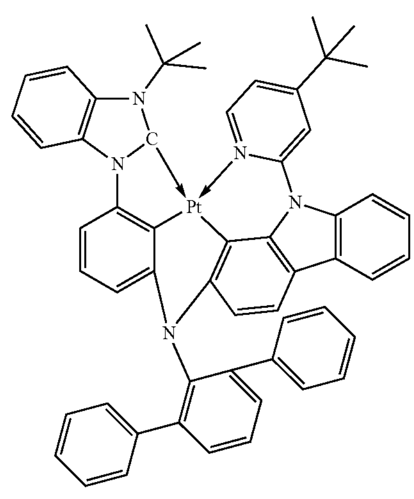

-continued
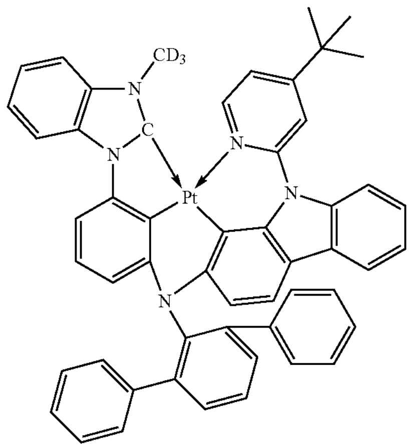
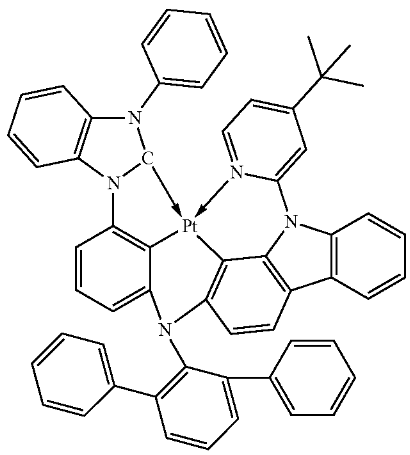
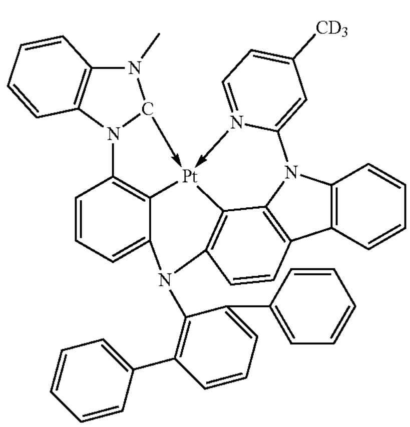
-continued
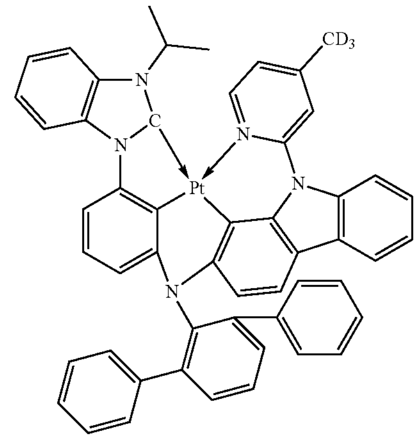
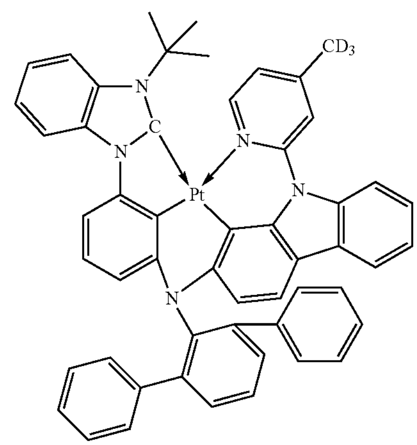
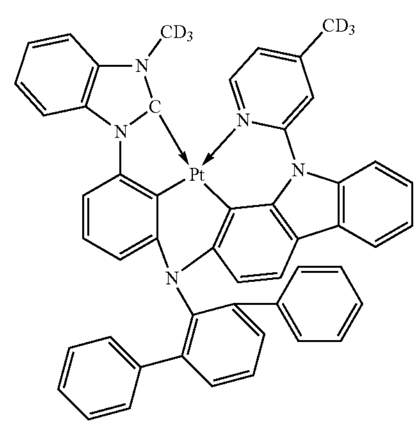

-continued
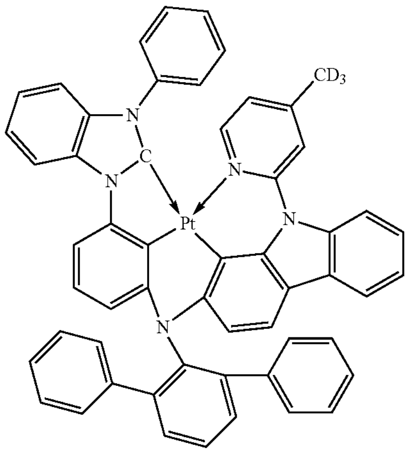
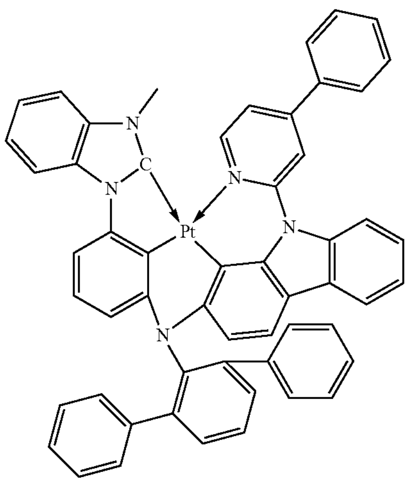
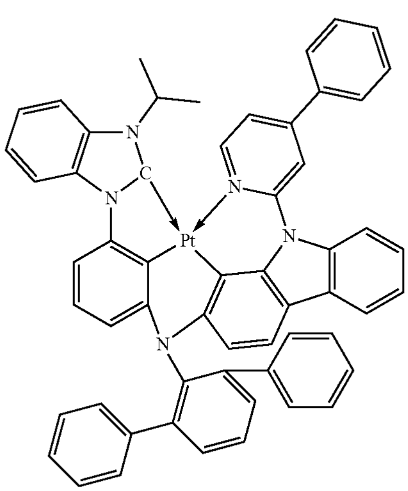
-continued
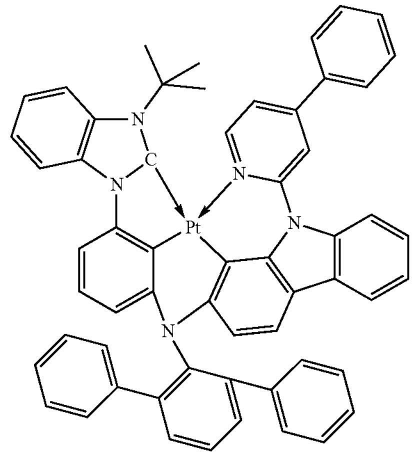
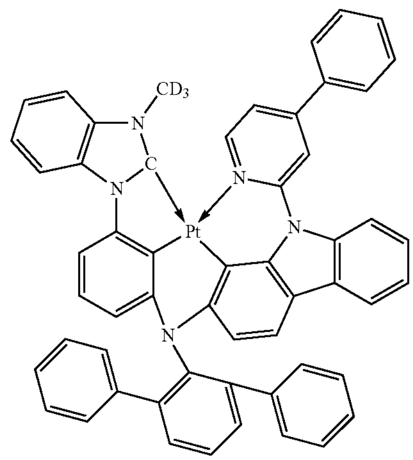
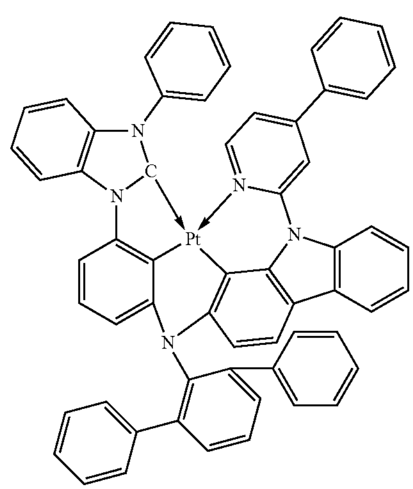

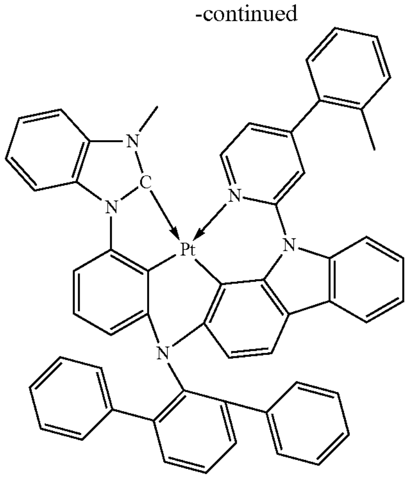
N
C
N
Pt
N
N
N
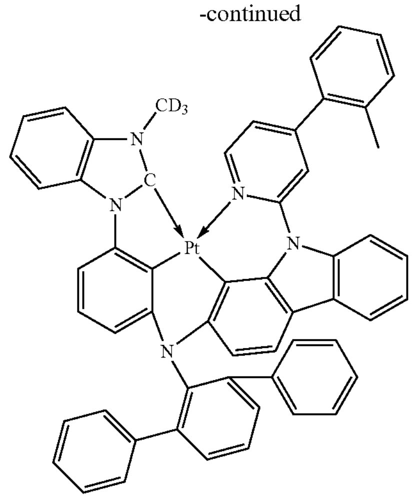
CD3
N
C
N
Pt
N
N
N
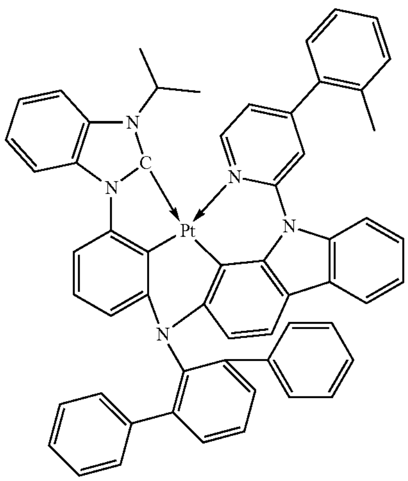
N
C
N
Pt
N
N
N
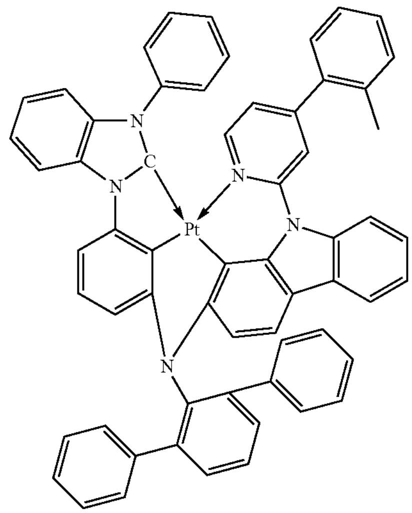
N
C
N
Pt
N
N
N
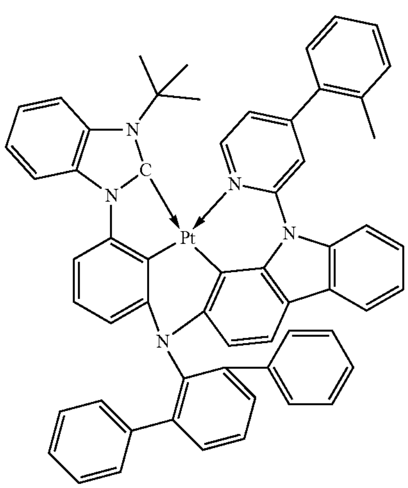
N
C
N
Pt
N
N
N
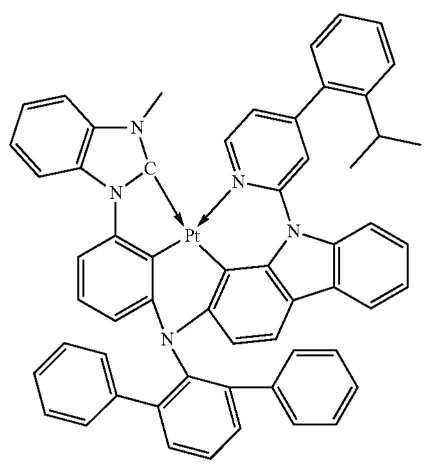
N
C
N
Pt
N
N
N

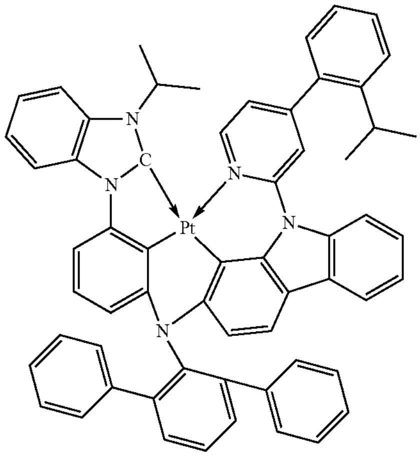
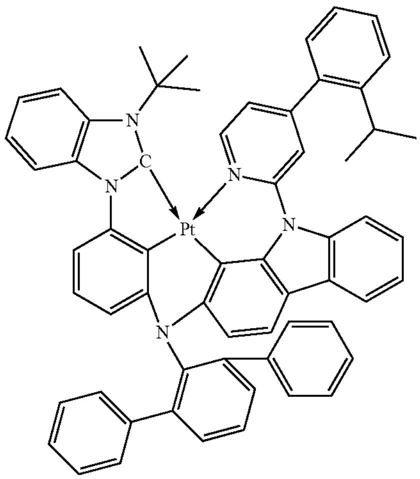
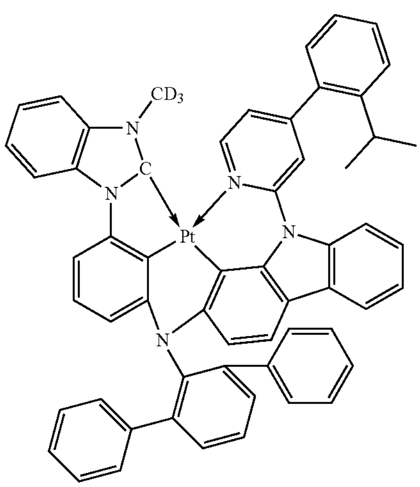
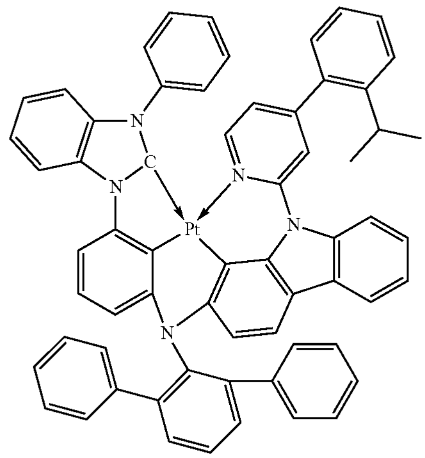
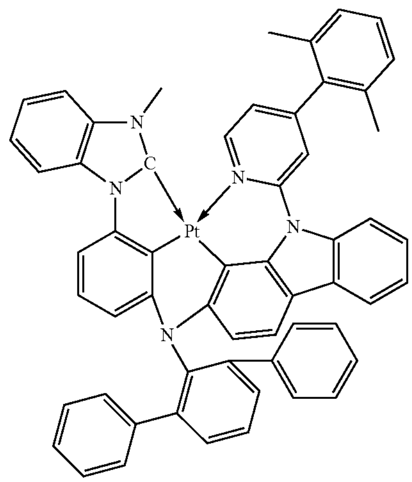
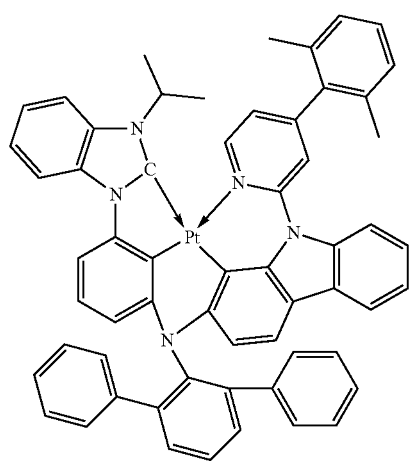

-continued
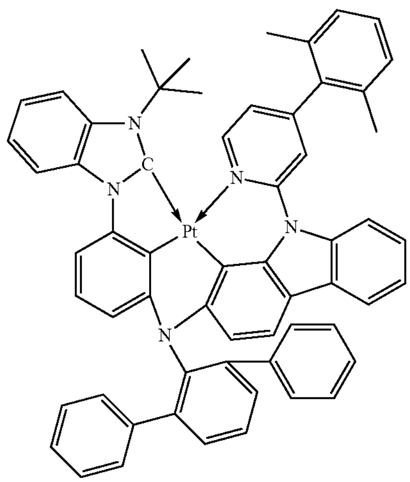
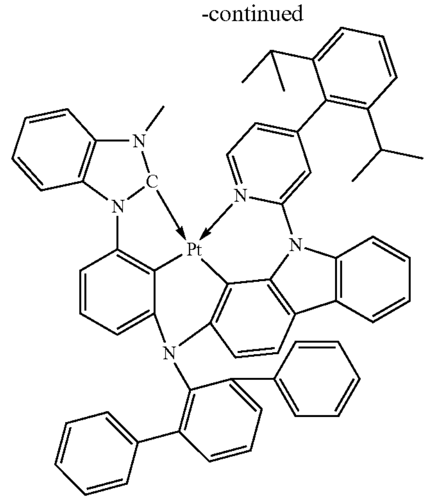
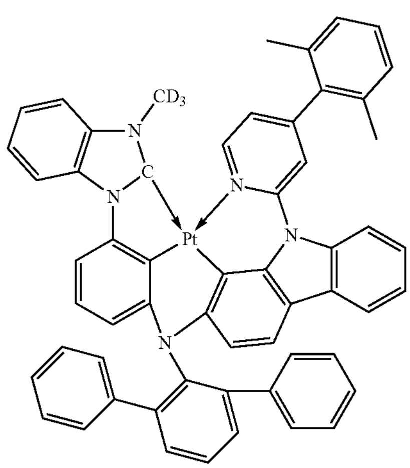
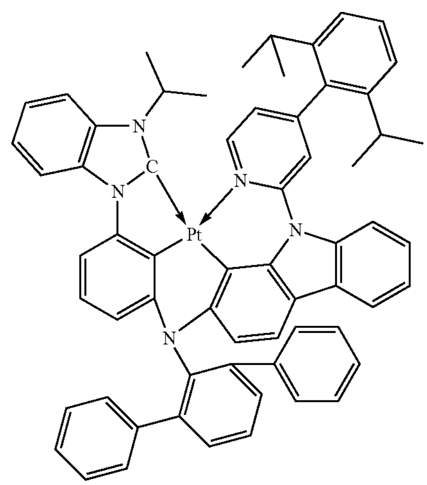
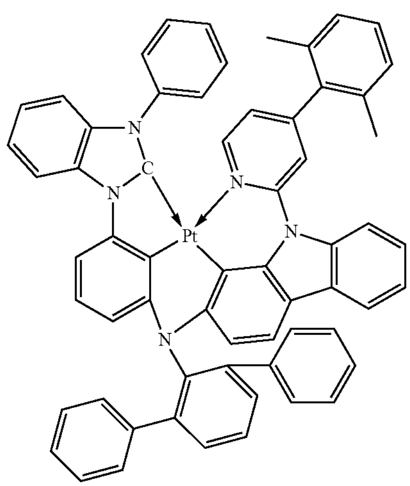
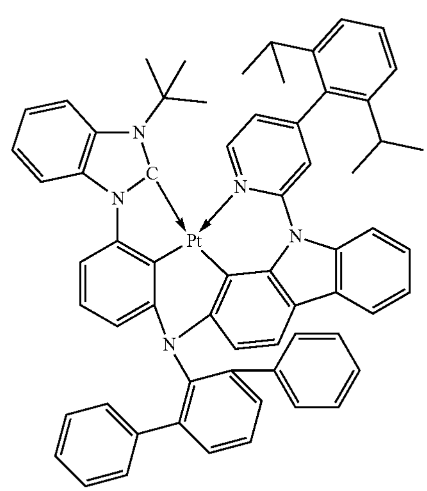
-continued -continued
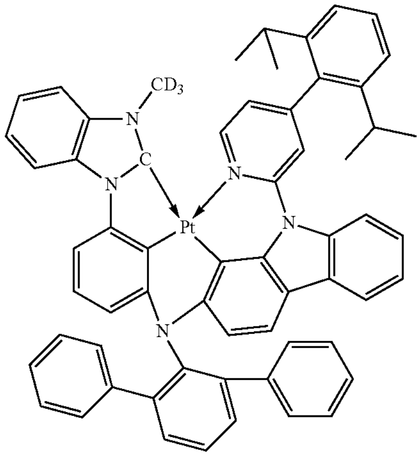
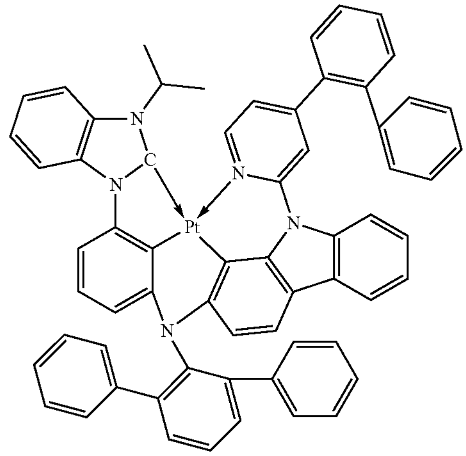
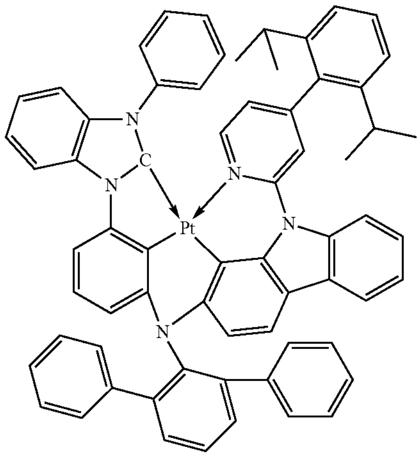
-continued
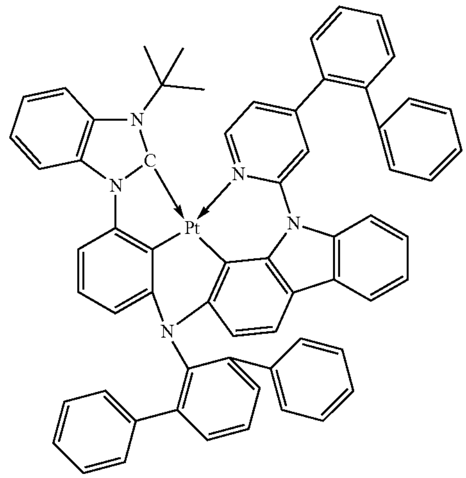
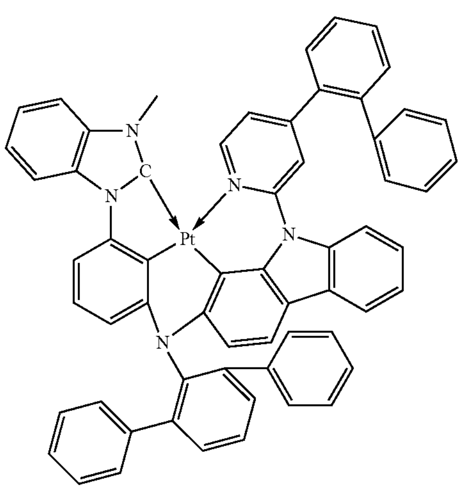
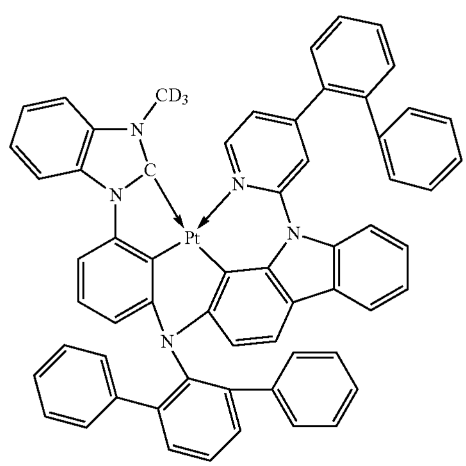

-continued
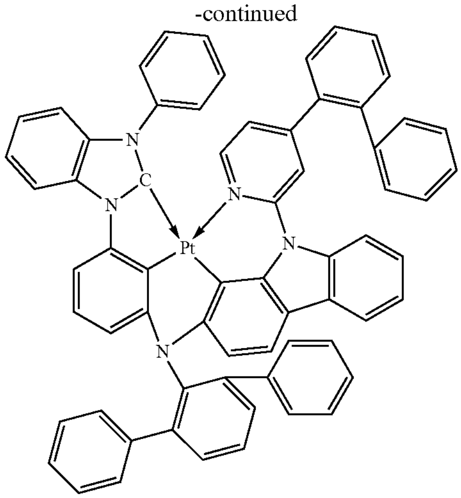
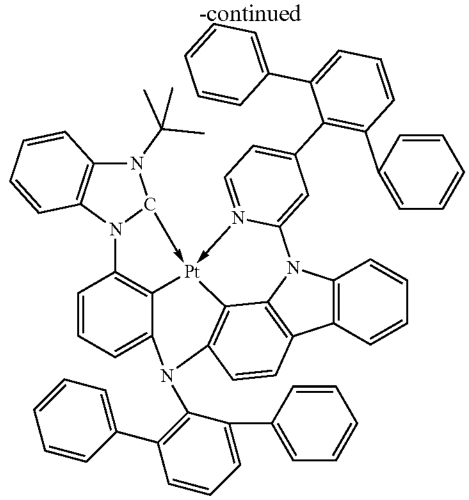
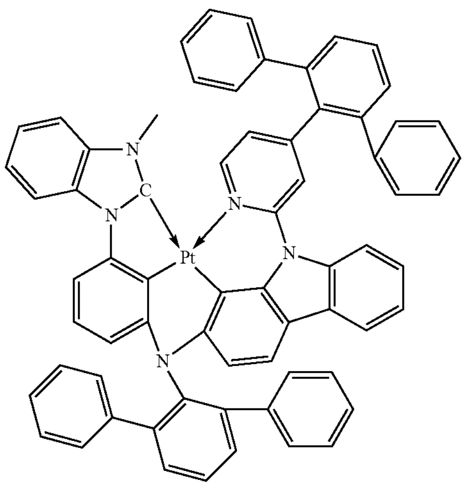
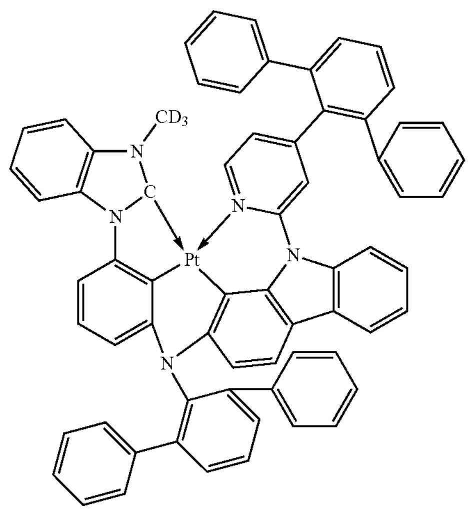
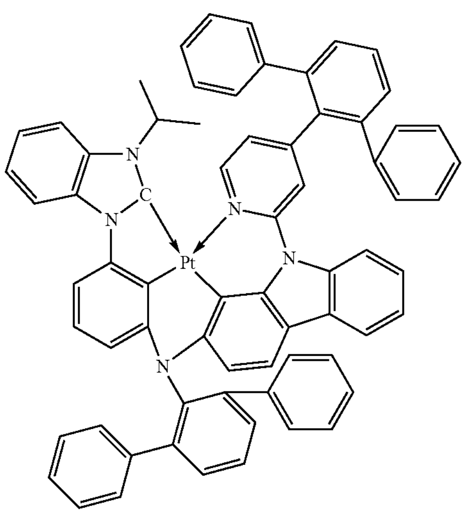
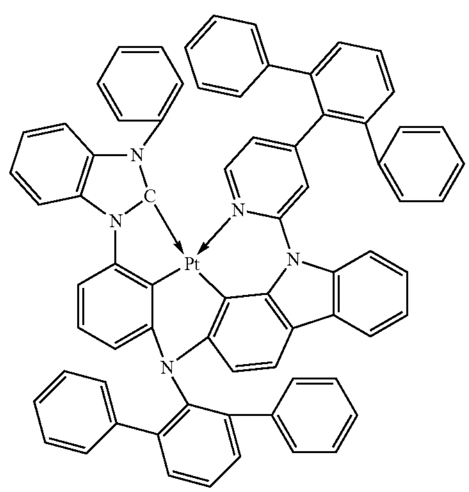

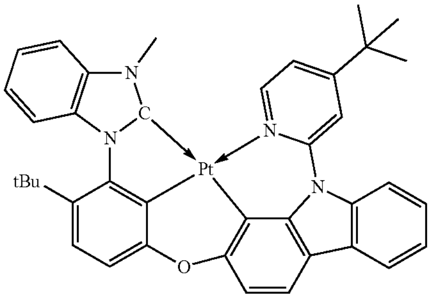
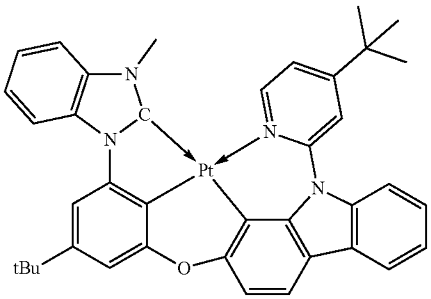
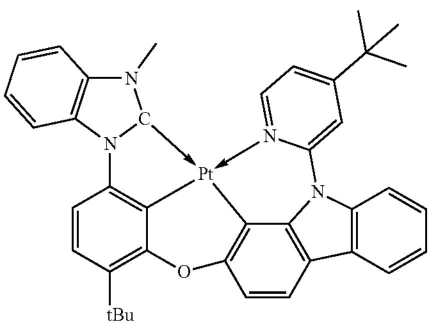
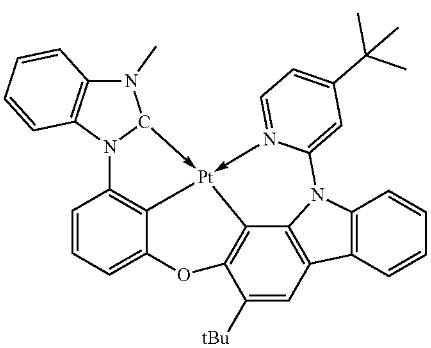
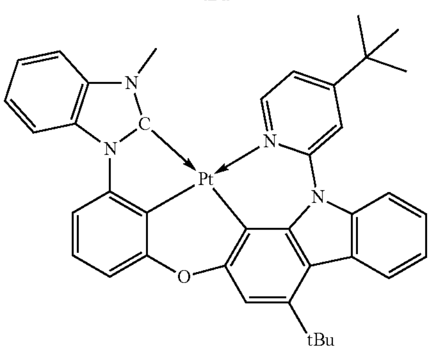
-continued
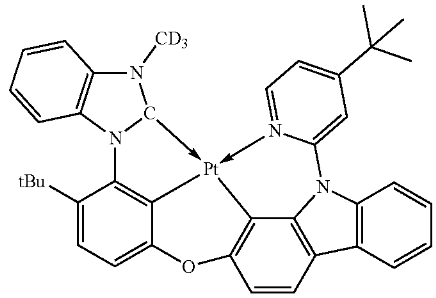
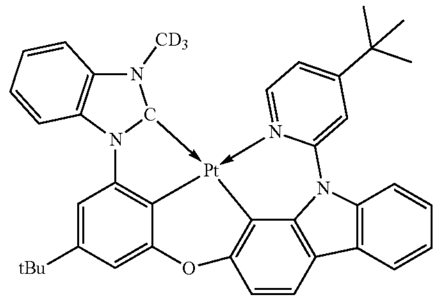
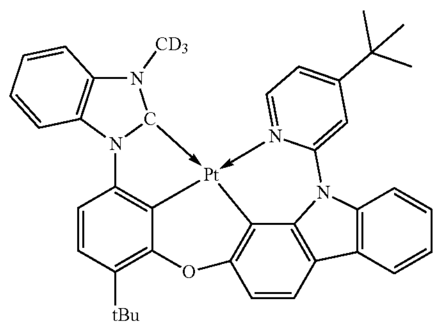
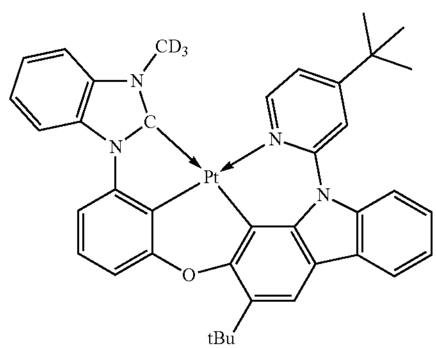
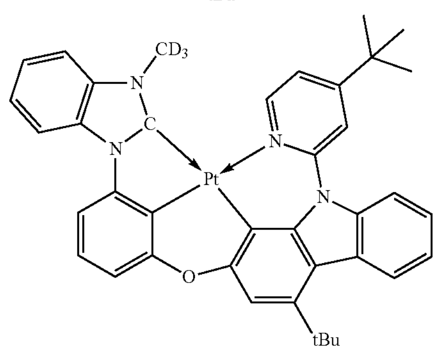

-continued
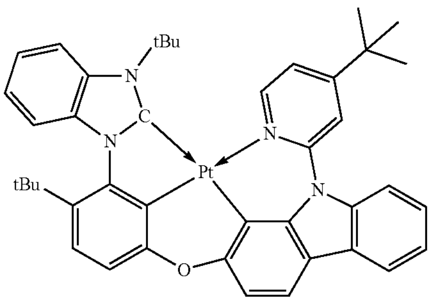
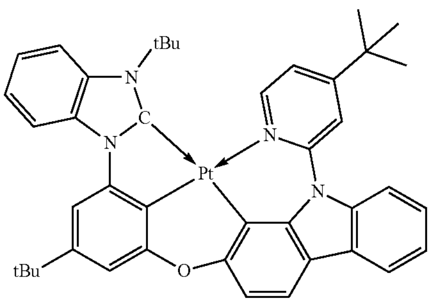
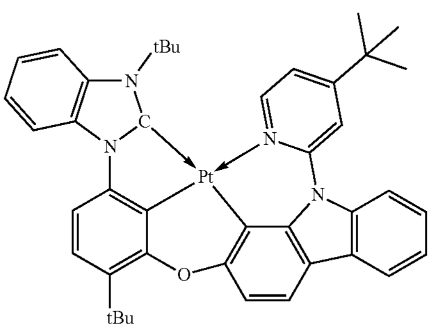
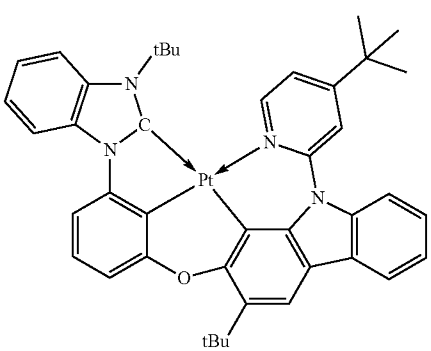
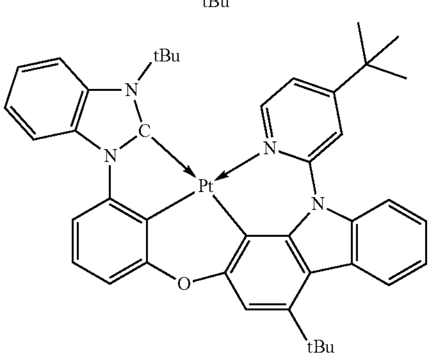
-continued
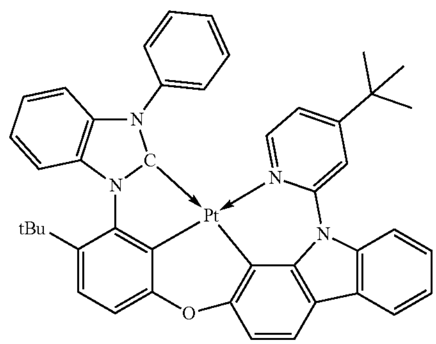
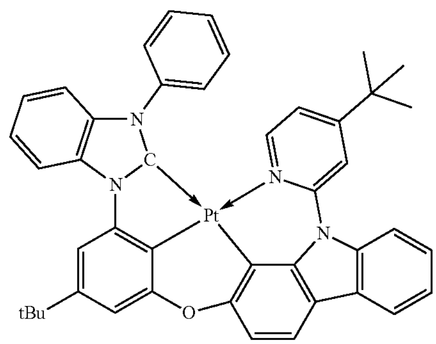
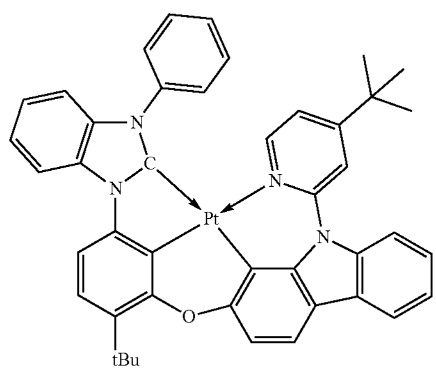
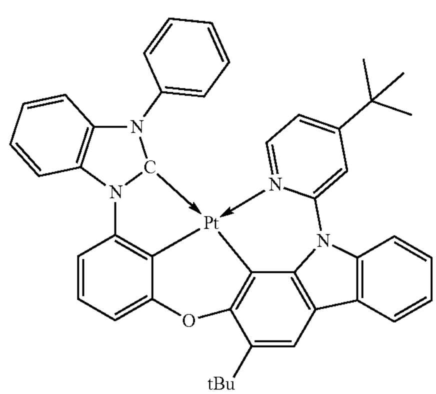

-continued
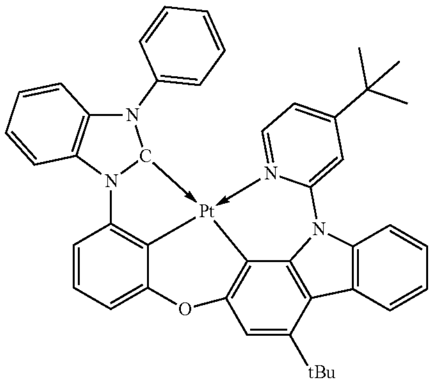
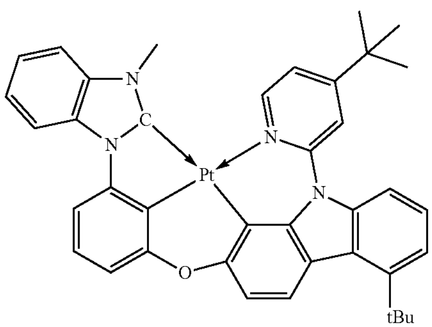
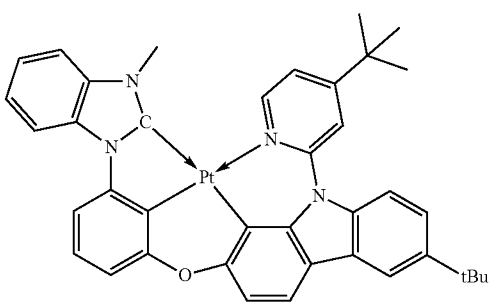
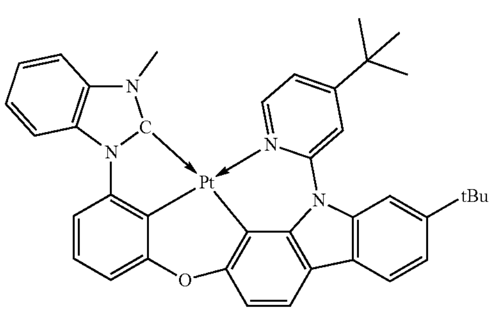
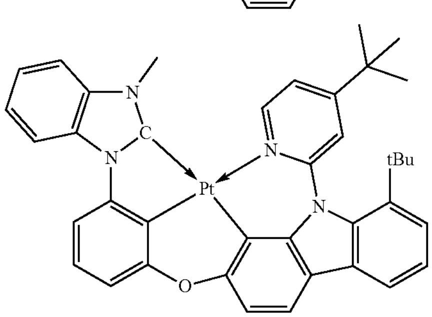
-continued
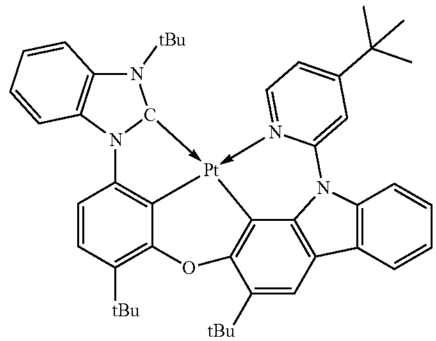
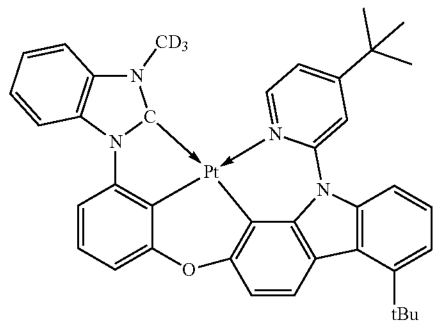
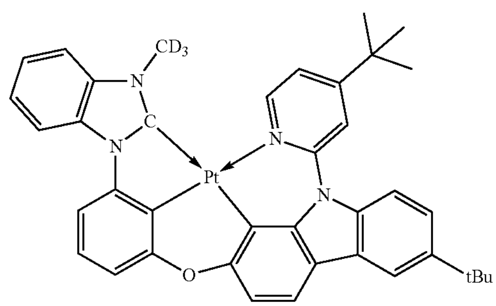
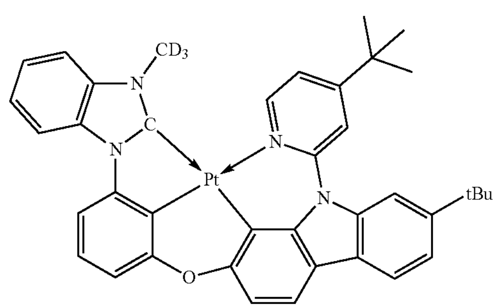
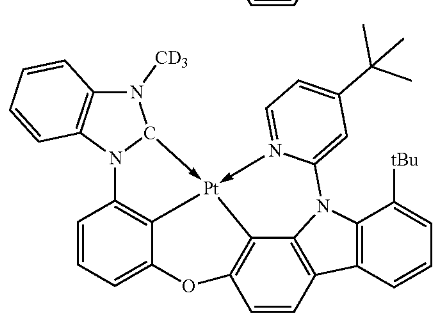

-continued
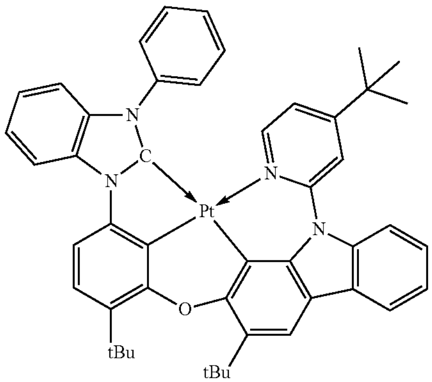
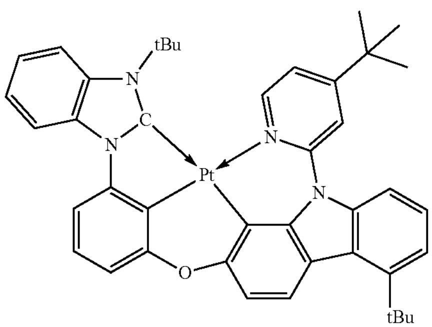
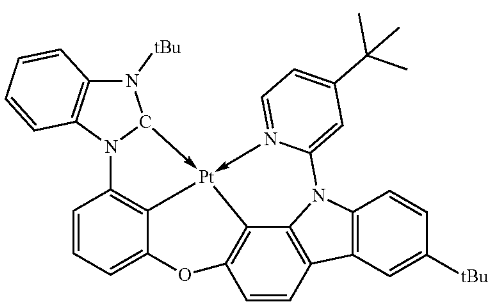
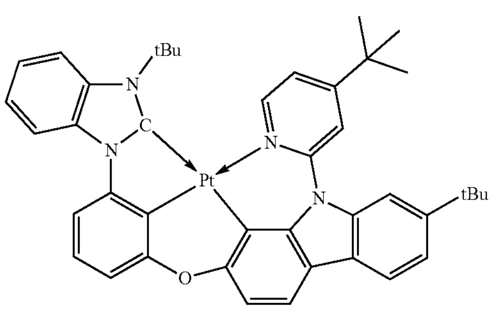
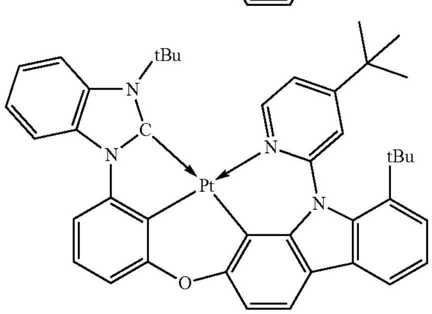
-continued
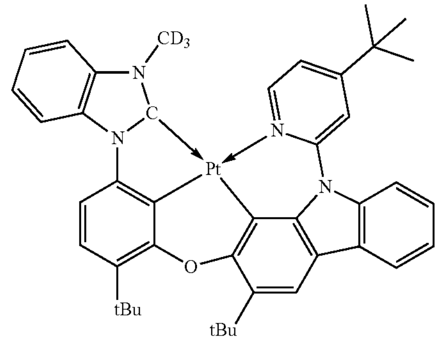
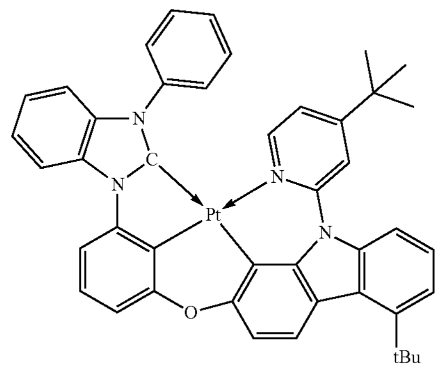
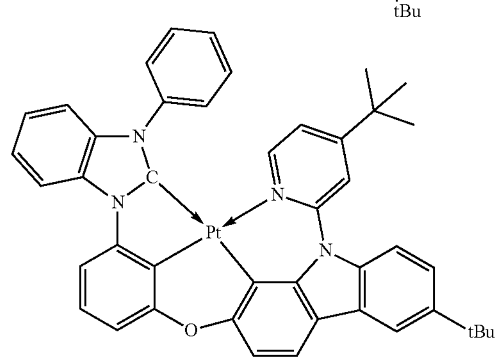
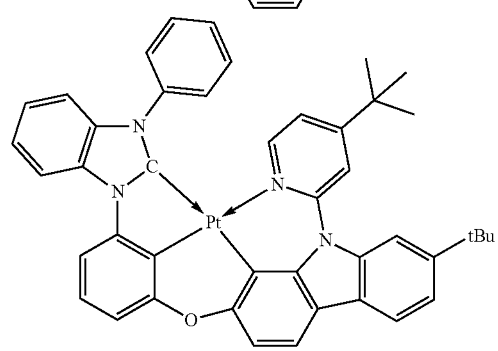
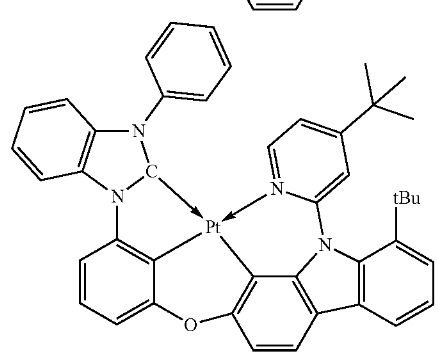

-continued
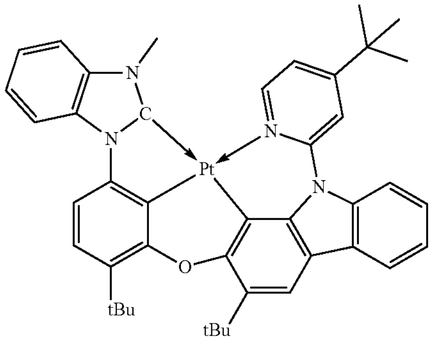
Group S-IV
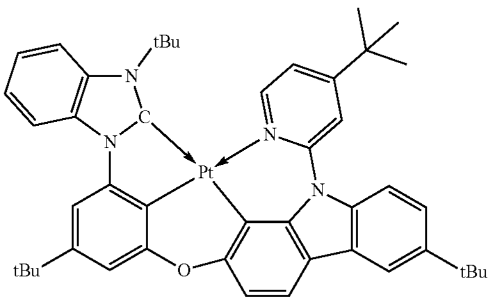
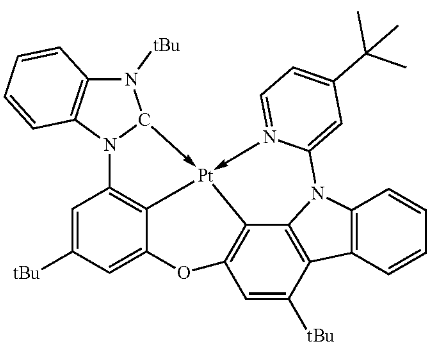
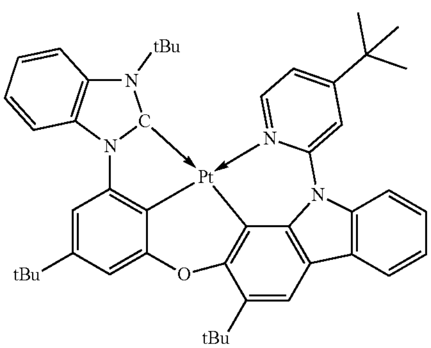
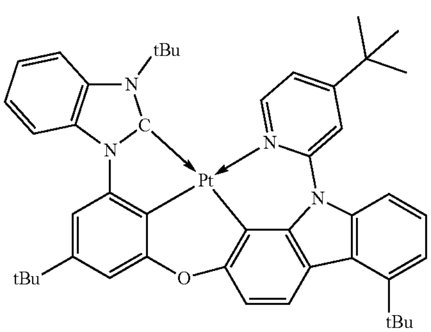
-continued
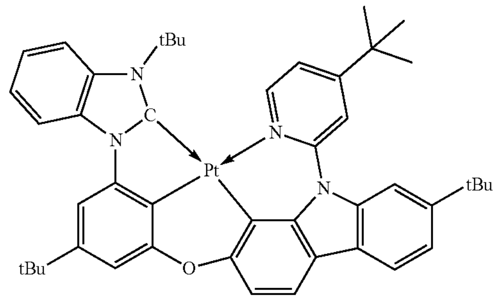
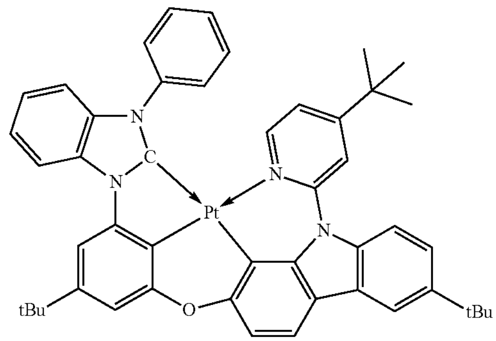
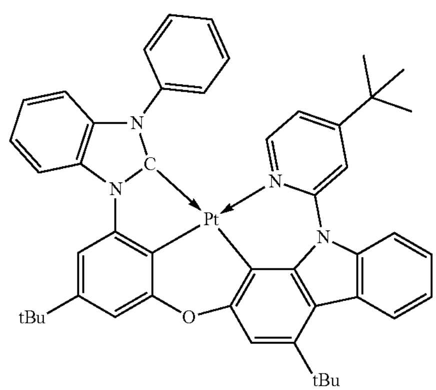
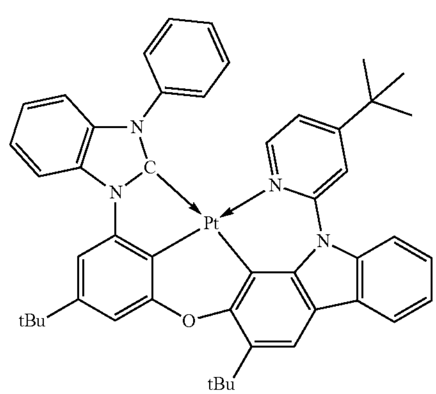

-continued
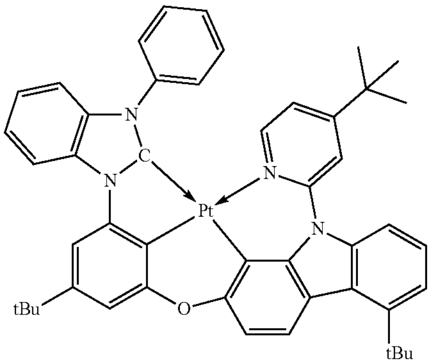
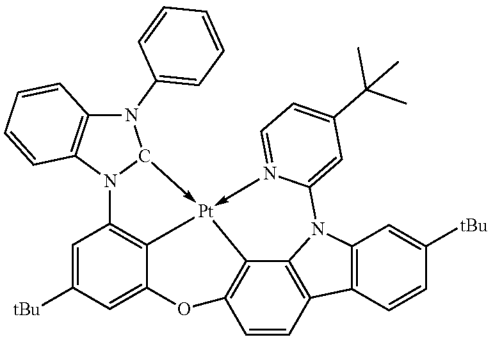
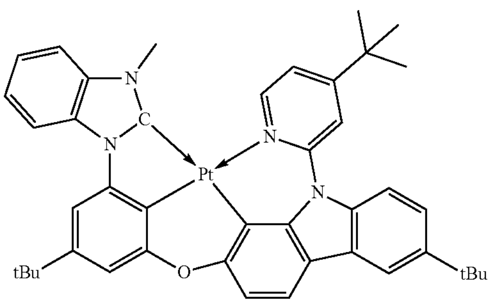
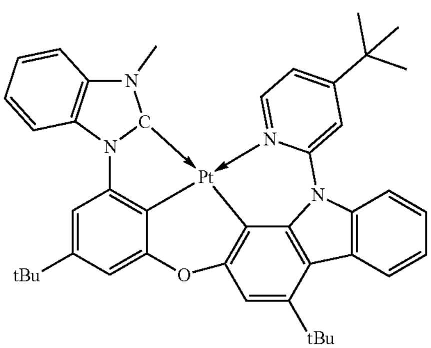
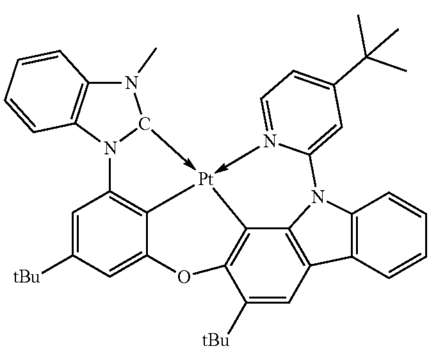
-continued
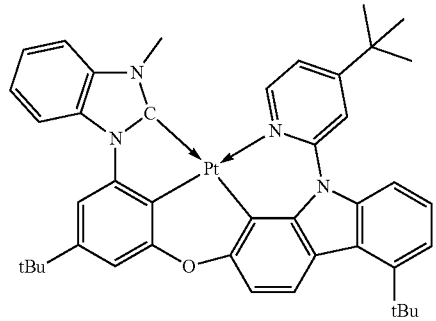
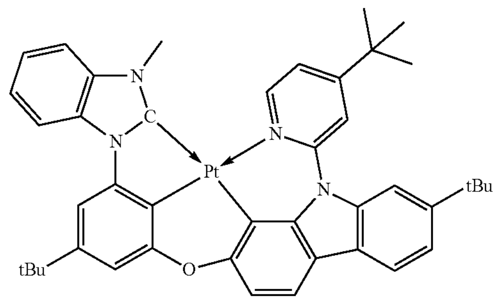
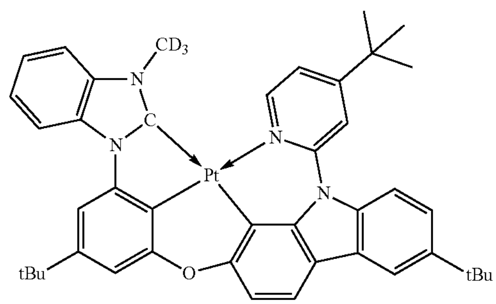
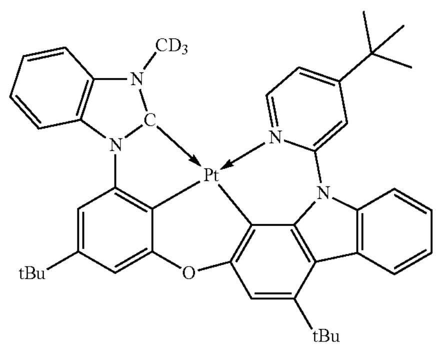
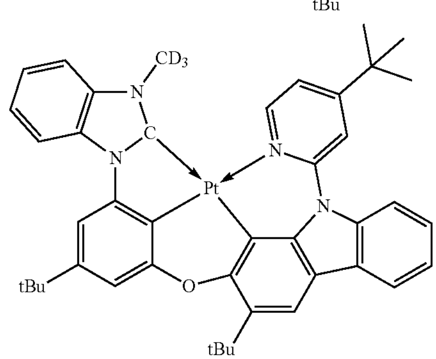

-continued
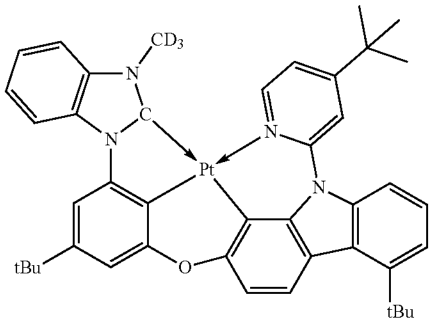
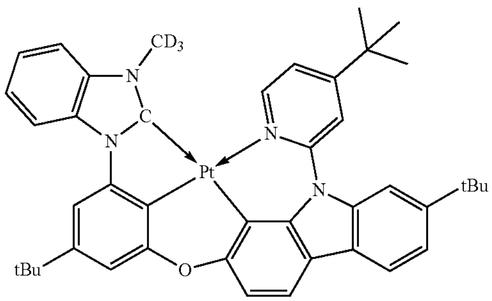
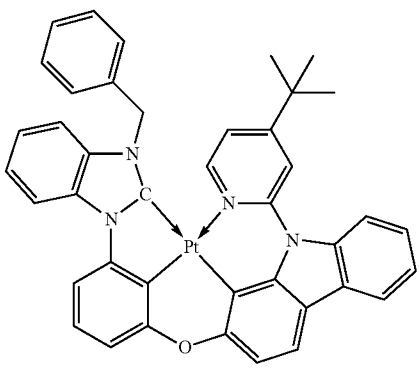
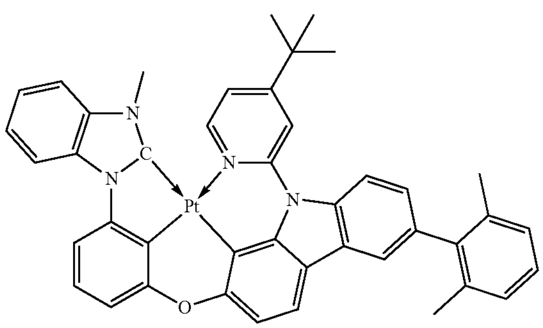
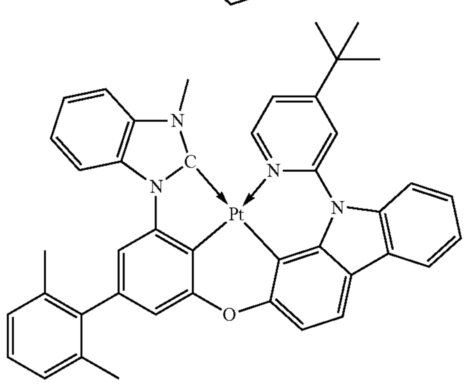
-continued
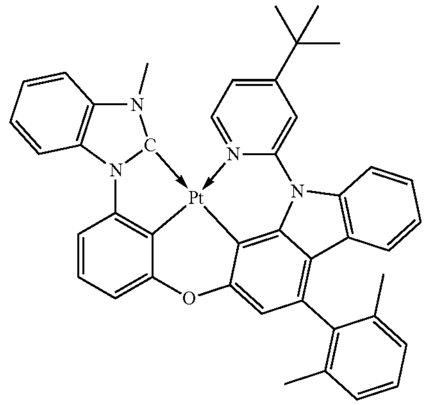
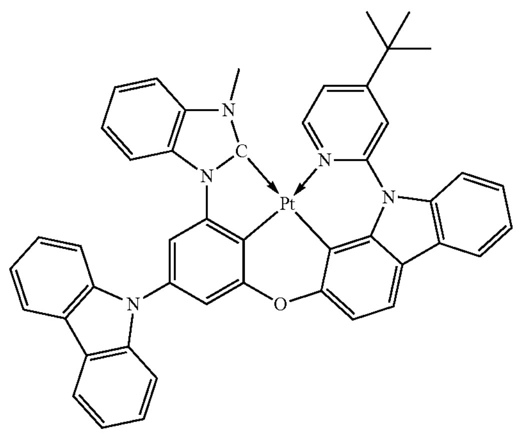
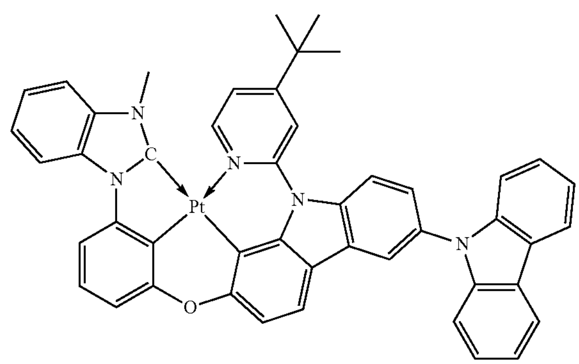
Group S-V
1
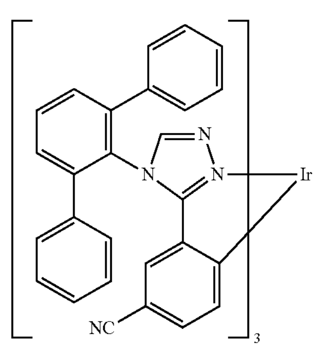

-continued
2
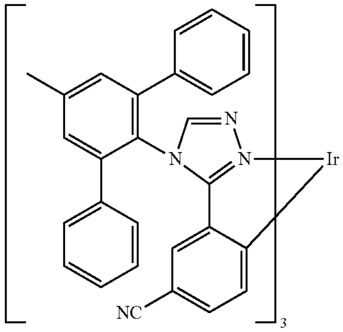
3
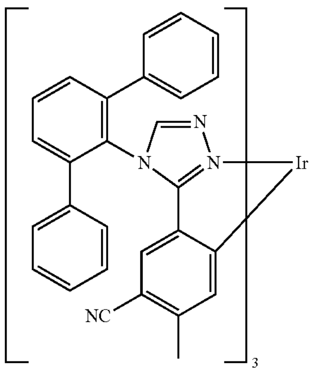
4
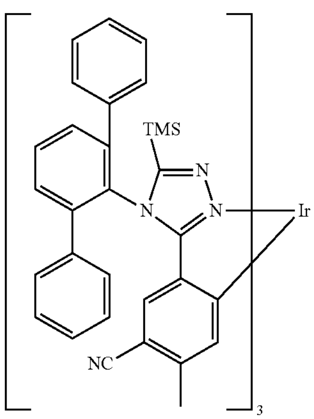
5
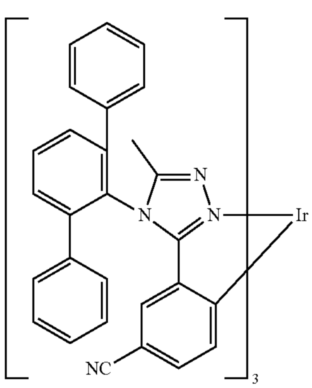
-continued
6
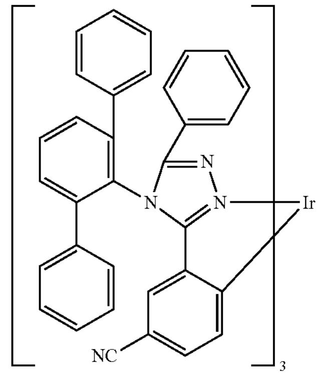
7
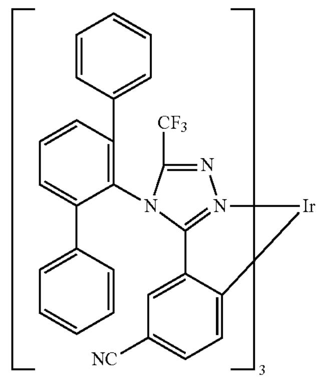
8
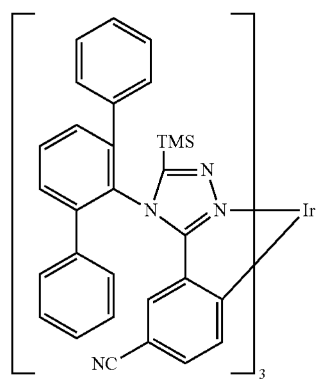
9
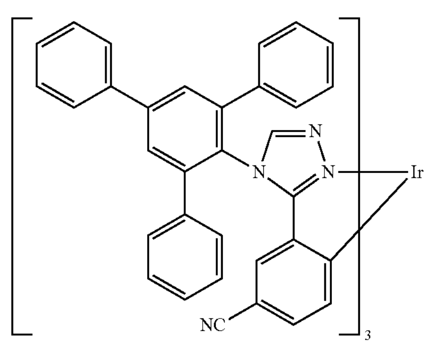

-continued

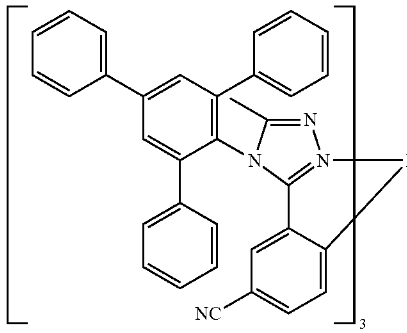

A compound represented by the following Formula A:

$(L_{101})_{n101}$-$M_{101}$-$(L_{102})_{m101}$. Formula A

In Formula A, $L_{101}$, n101, $M_{101}$, $L_{102}$, and m101 are the same as shown in Tables 1 to 3:

TABLE 1

| Compound name | $L_{101}$ | n101 | $M_{101}$ | $L_{102}$ | m101 | Compound name | $L_{101}$ | n101 | $M_{101}$ | $L_{102}$ | m101 |
|---|---|---|---|---|---|---|---|---|---|---|---|
| BD001 | LM1 | 3 | Ir | — | 0 | BD051 | LM51 | 3 | Ir | — | 0 |
| BD002 | LM2 | 3 | Ir | — | 0 | BD052 | LM52 | 3 | Ir | — | 0 |
| BD003 | LM3 | 3 | Ir | — | 0 | BD053 | LM53 | 3 | Ir | — | 0 |
| BD004 | LM4 | 3 | Ir | — | 0 | BD054 | LM54 | 3 | Ir | — | 0 |
| BD005 | LM5 | 3 | Ir | — | 0 | BD055 | LM55 | 3 | Ir | — | 0 |
| BD006 | LM6 | 3 | Ir | — | 0 | BD056 | LM56 | 3 | Ir | — | 0 |
| BD007 | LM7 | 3 | Ir | — | 0 | BD057 | LM57 | 3 | Ir | — | 0 |
| BD008 | LM8 | 3 | Ir | — | 0 | BD058 | LM58 | 3 | Ir | — | 0 |
| BD009 | LM9 | 3 | Ir | — | 0 | BD059 | LM59 | 3 | Ir | — | 0 |
| BD010 | LM10 | 3 | Ir | — | 0 | BD060 | LM60 | 3 | Ir | — | 0 |
| BD011 | LM11 | 3 | Ir | — | 0 | BD061 | LM61 | 3 | Ir | — | 0 |
| BD012 | LM12 | 3 | Ir | — | 0 | BD062 | LM62 | 3 | Ir | — | 0 |
| BD013 | LM13 | 3 | Ir | — | 0 | BD063 | LM63 | 3 | Ir | — | 0 |
| BD014 | LM14 | 3 | Ir | — | 0 | BD064 | LM64 | 3 | Ir | — | 0 |
| BD015 | LM15 | 3 | Ir | — | 0 | BD065 | LM65 | 3 | Ir | — | 0 |
| BD016 | LM16 | 3 | Ir | — | 0 | BD066 | LM66 | 3 | Ir | — | 0 |
| BD017 | LM17 | 3 | Ir | — | 0 | BD067 | LM67 | 3 | Ir | — | 0 |
| BD018 | LM18 | 3 | Ir | — | 0 | BD068 | LM68 | 3 | Ir | — | 0 |
| BD019 | LM19 | 3 | Ir | — | 0 | BD069 | LM69 | 3 | Ir | — | 0 |
| BD020 | LM20 | 3 | Ir | — | 0 | BD070 | LM70 | 3 | Ir | — | 0 |
| BD021 | LM21 | 3 | Ir | — | 0 | BD071 | LM71 | 3 | Ir | — | 0 |
| BD022 | LM22 | 3 | Ir | — | 0 | BD072 | LM72 | 3 | Ir | — | 0 |
| BD023 | LM23 | 3 | Ir | — | 0 | BD073 | LM73 | 3 | Ir | — | 0 |
| BD024 | LM24 | 3 | Ir | — | 0 | BD074 | LM74 | 3 | Ir | — | 0 |
| BD025 | LM25 | 3 | Ir | — | 0 | BD075 | LM75 | 3 | Ir | — | 0 |
| BD026 | LM26 | 3 | Ir | — | 0 | BD076 | LM76 | 3 | Ir | — | 0 |
| BD027 | LM27 | 3 | Ir | — | 0 | BD077 | LM77 | 3 | Ir | — | 0 |
| BD028 | LM28 | 3 | Ir | — | 0 | BD078 | LM78 | 3 | Ir | — | 0 |
| BD029 | LM29 | 3 | Ir | — | 0 | BD079 | LM79 | 3 | Ir | — | 0 |
| BD030 | LM30 | 3 | Ir | — | 0 | BD080 | LM80 | 3 | Ir | — | 0 |
| BD031 | LM31 | 3 | Ir | — | 0 | BD081 | LM81 | 3 | Ir | — | 0 |
| BD032 | LM32 | 3 | Ir | — | 0 | BD082 | LM82 | 3 | Ir | — | 0 |
| BD033 | LM33 | 3 | Ir | — | 0 | BD083 | LM83 | 3 | Ir | — | 0 |
| BD034 | LM34 | 3 | Ir | — | 0 | BD084 | LM84 | 3 | Ir | — | 0 |
| BD035 | LM35 | 3 | Ir | — | 0 | BD085 | LM85 | 3 | Ir | — | 0 |
| BD036 | LM36 | 3 | Ir | — | 0 | BD086 | LM86 | 3 | Ir | — | 0 |
| BD037 | LM37 | 3 | Ir | — | 0 | BD087 | LM87 | 3 | Ir | — | 0 |
| BD038 | LM38 | 3 | Ir | — | 0 | BD088 | LM88 | 3 | Ir | — | 0 |
| BD039 | LM39 | 3 | Ir | — | 0 | BD089 | LM89 | 3 | Ir | — | 0 |
| BD040 | LM40 | 3 | Ir | — | 0 | BD090 | LM90 | 3 | Ir | — | 0 |
| BD041 | LM41 | 3 | Ir | — | 0 | BD091 | LM91 | 3 | Ir | — | 0 |
| BD042 | LM42 | 3 | Ir | — | 0 | BD092 | LM92 | 3 | Ir | — | 0 |
| BD043 | LM43 | 3 | Ir | — | 0 | BD093 | LM93 | 3 | Ir | — | 0 |
| BD044 | LM44 | 3 | Ir | — | 0 | BD094 | LM94 | 3 | Ir | — | 0 |
| BD045 | LM45 | 3 | Ir | — | 0 | BD095 | LM95 | 3 | Ir | — | 0 |
| BD046 | LM46 | 3 | Ir | — | 0 | BD096 | LM96 | 3 | Ir | — | 0 |
| BD047 | LM47 | 3 | Ir | — | 0 | BD097 | LM97 | 3 | Ir | — | 0 |
| BD048 | LM48 | 3 | Ir | — | 0 | BD098 | LM98 | 3 | Ir | — | 0 |
| BD049 | LM49 | 3 | Ir | — | 0 | BD099 | LM99 | 3 | Ir | — | 0 |
| BD050 | LM50 | 3 | Ir | — | 0 | BD100 | LM100 | 3 | Ir | — | 0 |

TABLE 2

| Compound name | $L_{101}$ | n101 | $M_{101}$ | $L_{102}$ | m101 | Compound name | $L_{101}$ | n101 | $M_{101}$ | $L_{102}$ | m101 |
|---|---|---|---|---|---|---|---|---|---|---|---|
| BD101 | LM101 | 3 | Ir | — | 0 | BD151 | LM151 | 3 | Ir | — | 0 |
| BD102 | LM102 | 3 | Ir | — | 0 | BD152 | LM152 | 3 | Ir | — | 0 |
| BD103 | LM103 | 3 | Ir | — | 0 | BD153 | LM153 | 3 | Ir | — | 0 |
| BD104 | LM104 | 3 | Ir | — | 0 | BD154 | LM154 | 3 | Ir | — | 0 |
| BD105 | LM105 | 3 | Ir | — | 0 | BD155 | LM155 | 3 | Ir | — | 0 |
| BD106 | LM106 | 3 | Ir | — | 0 | BD156 | LM156 | 3 | Ir | — | 0 |
| BD107 | LM107 | 3 | Ir | — | 0 | BD157 | LM157 | 3 | Ir | — | 0 |
| BD108 | LM108 | 3 | Ir | — | 0 | BD158 | LM158 | 3 | Ir | — | 0 |
| BD109 | LM109 | 3 | Ir | — | 0 | BD159 | LM159 | 3 | Ir | — | 0 |
| BD110 | LM110 | 3 | Ir | — | 0 | BD160 | LM160 | 3 | Ir | — | 0 |
| BD111 | LM111 | 3 | Ir | — | 0 | BD161 | LM161 | 3 | Ir | — | 0 |
| BD112 | LM112 | 3 | Ir | — | 0 | BD162 | LM162 | 3 | Ir | — | 0 |
| BD113 | LM113 | 3 | Ir | — | 0 | BD163 | LM163 | 3 | Ir | — | 0 |
| BD114 | LM114 | 3 | Ir | — | 0 | BD164 | LM164 | 3 | Ir | — | 0 |
| BD115 | LM115 | 3 | Ir | — | 0 | BD165 | LM165 | 3 | Ir | — | 0 |
| BD116 | LM116 | 3 | Ir | — | 0 | BD166 | LM166 | 3 | Ir | — | 0 |
| BD117 | LM117 | 3 | Ir | — | 0 | BD167 | LM167 | 3 | Ir | — | 0 |
| BD118 | LM118 | 3 | Ir | — | 0 | BD168 | LM168 | 3 | Ir | — | 0 |
| BD119 | LM119 | 3 | Ir | — | 0 | BD169 | LM169 | 3 | Ir | — | 0 |
| BD120 | LM120 | 3 | Ir | — | 0 | BD170 | LM170 | 3 | Ir | — | 0 |
| BD121 | LM121 | 3 | Ir | — | 0 | BD171 | LM171 | 3 | Ir | — | 0 |
| BD122 | LM122 | 3 | Ir | — | 0 | BD172 | LM172 | 3 | Ir | — | 0 |
| BD123 | LM123 | 3 | Ir | — | 0 | BD173 | LM173 | 3 | Ir | — | 0 |
| BD124 | LM124 | 3 | Ir | — | 0 | BD174 | LM174 | 3 | Ir | — | 0 |
| BD125 | LM125 | 3 | Ir | — | 0 | BD175 | LM175 | 3 | Ir | — | 0 |
| BD126 | LM126 | 3 | Ir | — | 0 | BD176 | LM176 | 3 | Ir | — | 0 |
| BD127 | LM127 | 3 | Ir | — | 0 | BD177 | LM177 | 3 | Ir | — | 0 |
| BD128 | LM128 | 3 | Ir | — | 0 | BD178 | LM178 | 3 | Ir | — | 0 |
| BD129 | LM129 | 3 | Ir | — | 0 | BD179 | LM179 | 3 | Ir | — | 0 |
| BD130 | LM130 | 3 | Ir | — | 0 | BD180 | LM180 | 3 | Ir | — | 0 |
| BD131 | LM131 | 3 | Ir | — | 0 | BD181 | LM181 | 3 | Ir | — | 0 |
| BD132 | LM132 | 3 | Ir | — | 0 | BD182 | LM182 | 3 | Ir | — | 0 |
| BD133 | LM133 | 3 | Ir | — | 0 | BD183 | LM183 | 3 | Ir | — | 0 |
| BD134 | LM134 | 3 | Ir | — | 0 | BD184 | LM184 | 3 | Ir | — | 0 |
| BD135 | LM135 | 3 | Ir | — | 0 | BD185 | LM185 | 3 | Ir | — | 0 |
| BD136 | LM136 | 3 | Ir | — | 0 | BD186 | LM186 | 3 | Ir | — | 0 |
| BD137 | LM137 | 3 | Ir | — | 0 | BD187 | LM187 | 3 | Ir | — | 0 |
| BD138 | LM138 | 3 | Ir | — | 0 | BD188 | LM188 | 3 | Ir | — | 0 |
| BD139 | LM139 | 3 | Ir | — | 0 | BD189 | LM189 | 3 | Ir | — | 0 |
| BD140 | LM140 | 3 | Ir | — | 0 | BD190 | LM190 | 3 | Ir | — | 0 |
| BD141 | LM141 | 3 | Ir | — | 0 | BD191 | LM191 | 3 | Ir | — | 0 |
| BD142 | LM142 | 3 | Ir | — | 0 | BD192 | LM192 | 3 | Ir | — | 0 |
| BD143 | LM143 | 3 | Ir | — | 0 | BD193 | LM193 | 3 | Ir | — | 0 |
| BD144 | LM144 | 3 | Ir | — | 0 | BD194 | LM194 | 3 | Ir | — | 0 |
| BD145 | LM145 | 3 | Ir | — | 0 | BD195 | LM195 | 3 | Ir | — | 0 |
| BD146 | LM146 | 3 | Ir | — | 0 | BD196 | LM196 | 3 | Ir | — | 0 |
| BD147 | LM147 | 3 | Ir | — | 0 | BD197 | LM197 | 3 | Ir | — | 0 |
| BD148 | LM148 | 3 | Ir | — | 0 | BD198 | LM198 | 3 | Ir | — | 0 |
| BD149 | LM149 | 3 | Ir | — | 0 | BD199 | LM199 | 3 | Ir | — | 0 |
| BD150 | LM150 | 3 | Ir | — | 0 | BD200 | LM200 | 3 | Ir | — | 0 |

TABLE 3

| Compound name | $L_{101}$ | n101 | $M_{101}$ | $L_{102}$ | m101 | Compound name | $L_{101}$ | n101 | $M_{101}$ | $L_{102}$ | m101 |
|---|---|---|---|---|---|---|---|---|---|---|---|
| BD201 | LM201 | 3 | Ir | — | 0 | BD251 | LFP1 | 3 | Ir | — | 0 |
| BD202 | LM202 | 3 | Ir | — | 0 | BD252 | LFP2 | 3 | Ir | — | 0 |
| BD203 | LM203 | 3 | Ir | — | 0 | BD253 | LFP3 | 3 | Ir | — | 0 |
| BD204 | LM204 | 3 | Ir | — | 0 | BD254 | LFP4 | 3 | Ir | — | 0 |
| BD205 | LM205 | 3 | Ir | — | 0 | BD255 | LFP5 | 3 | Ir | — | 0 |
| BD206 | LM206 | 3 | Ir | — | 0 | BD256 | LFP6 | 3 | Ir | — | 0 |
| BD207 | LM207 | 3 | Ir | — | 0 | BD257 | LFP7 | 3 | Ir | — | 0 |
| BD208 | LM208 | 3 | Ir | — | 0 | BD258 | LM47 | 2 | Ir | AN1 | 1 |
| BD209 | LM209 | 3 | Ir | — | 0 | BD259 | LM47 | 2 | Ir | AN2 | 1 |
| BD210 | LM210 | 3 | Ir | — | 0 | BD260 | LM47 | 2 | Ir | AN3 | 1 |
| BD211 | LM211 | 3 | Ir | — | 0 | BD261 | LM47 | 2 | Ir | AN4 | 1 |
| BD212 | LM212 | 3 | Ir | — | 0 | BD262 | LM47 | 2 | Ir | AN5 | 1 |
| BD213 | LM213 | 3 | Ir | — | 0 | BD263 | LM11 | 2 | Pt | — | 0 |
| BD214 | LM214 | 3 | Ir | — | 0 | BD264 | LM13 | 2 | Pt | — | 0 |
| BD215 | LM215 | 3 | Ir | — | 0 | BD265 | LM15 | 2 | Pt | — | 0 |
| BD216 | LM216 | 3 | Ir | — | 0 | BD266 | LM45 | 2 | Pt | — | 0 |
| BD217 | LM217 | 3 | Ir | — | 0 | BD267 | LM47 | 2 | Pt | — | 0 |
| BD218 | LM218 | 3 | Ir | — | 0 | BD268 | LM49 | 2 | Pt | — | 0 |

TABLE 3-continued

| Compound name | $L_{101}$ | n101 | $M_{101}$ | $L_{102}$ | m101 | Compound name | $L_{101}$ | n101 | $M_{101}$ | $L_{102}$ | m101 |
|---|---|---|---|---|---|---|---|---|---|---|---|
| BD219 | LM219 | 3 | Ir | — | 0 | BD269 | LM98 | 2 | Pt | — | 0 |
| BD220 | LM220 | 3 | Ir | — | 0 | BD270 | LM100 | 2 | Pt | — | 0 |
| BD221 | LM221 | 3 | Ir | — | 0 | BD271 | LM102 | 2 | Pt | — | 0 |
| BD222 | LM222 | 3 | Ir | — | 0 | BD272 | LM132 | 2 | Pt | — | 0 |
| BD223 | LM223 | 3 | Ir | — | 0 | BD273 | LM134 | 2 | Pt | — | 0 |
| BD224 | LM224 | 3 | Ir | — | 0 | BD274 | LM136 | 2 | Pt | — | 0 |
| BD225 | LM225 | 3 | Ir | — | 0 | BD275 | LM151 | 2 | Pt | — | 0 |
| BD226 | LM226 | 3 | Ir | — | 0 | BD276 | LM153 | 2 | Pt | — | 0 |
| BD227 | LM227 | 3 | Ir | — | 0 | BD277 | LM158 | 2 | Pt | — | 0 |
| BD228 | LM228 | 3 | Ir | — | 0 | BD278 | LM180 | 2 | Pt | — | 0 |
| BD229 | LM229 | 3 | Ir | — | 0 | BD279 | LM182 | 2 | Pt | — | 0 |
| BD230 | LM230 | 3 | Ir | — | 0 | BD280 | LM187 | 2 | Pt | — | 0 |
| BD231 | LM231 | 3 | Ir | — | 0 | BD281 | LM201 | 2 | Pt | — | 0 |
| BD232 | LM232 | 3 | Ir | — | 0 | BD282 | LM206 | 2 | Pt | — | 0 |
| BD233 | LM233 | 3 | Ir | — | 0 | BD283 | LM211 | 2 | Pt | — | 0 |
| BD234 | LM234 | 3 | Ir | — | 0 | BD284 | LM233 | 2 | Pt | — | 0 |
| BD235 | LM235 | 3 | Ir | — | 0 | BD285 | LM235 | 2 | Pt | — | 0 |
| BD236 | LM236 | 3 | Ir | — | 0 | BD286 | LM240 | 2 | Pt | — | 0 |
| BD237 | LM237 | 3 | Ir | — | 0 | BD287 | LFM5 | 2 | Pt | — | 0 |
| BD238 | LM238 | 3 | Ir | — | 0 | BD288 | LFM6 | 2 | Pt | — | 0 |
| BD239 | LM239 | 3 | Ir | — | 0 | BD289 | LFM7 | 2 | Pt | — | 0 |
| BD240 | LM240 | 3 | Ir | — | 0 | BD290 | LFP5 | 2 | Pt | — | 0 |
| BD241 | LM241 | 3 | Ir | — | 0 | BD291 | LFP6 | 2 | Pt | — | 0 |
| BD242 | LM242 | 3 | Ir | — | 0 | BD292 | LFP7 | 2 | Pt | — | 0 |
| BD243 | LM243 | 3 | Ir | — | 0 | BD293 | LM47 | 1 | Pt | AN1 | 1 |
| BD244 | LFM1 | 3 | Ir | — | 0 | BD294 | LM47 | 1 | Pt | AN2 | 1 |
| BD245 | LFM2 | 3 | Ir | — | 0 | BD295 | LM47 | 1 | Pt | AN3 | 1 |
| BD246 | LFM3 | 3 | Ir | — | 0 | BD296 | LM47 | 1 | Pt | AN4 | 1 |
| BD247 | LFM4 | 3 | Ir | — | 0 | BD297 | LM47 | 1 | Pt | AN5 | 1 |
| BD248 | LFM5 | 3 | Ir | — | 0 | | | | | | |
| BD249 | LFM6 | 3 | Ir | — | 0 | | | | | | |
| BD250 | LFM7 | 3 | Ir | — | 0 | | | | | | |

In Table 1, AN1 to AN5 are as follows:

AN1

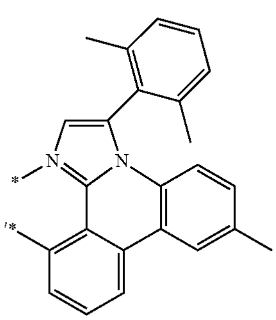

AN2

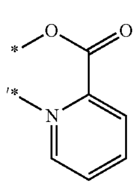

AN3

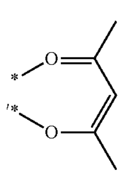

-continued

AN4

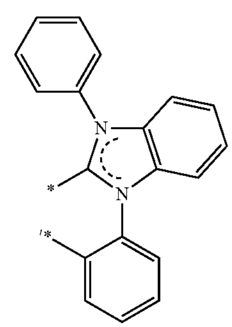

AN5

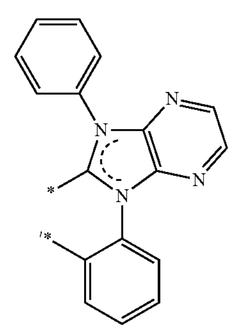

In Tables 1 to 3, LM1 to LM243 may be understood with reference to the following Formulae 1-1 to 1-3 and the following Tables 4 to 6:

1-1

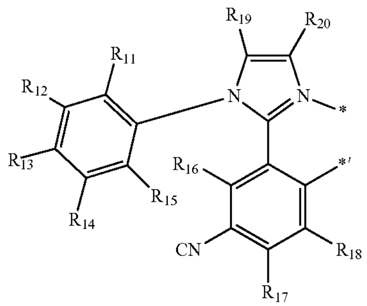

1-2

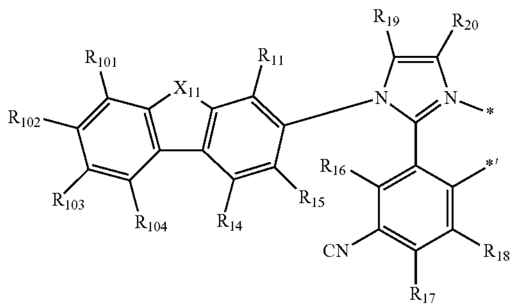

1-3

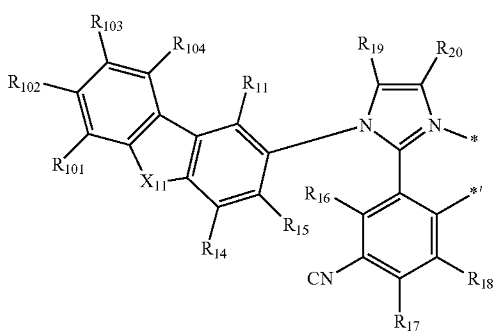

TABLE 4

| Formula 1-1 | | | | | | | | | | |
|---|---|---|---|---|---|---|---|---|---|---|
| Ligand name | $R_{11}$ | $R_{12}$ | $R_{13}$ | $R_{14}$ | $R_{15}$ | $R_{16}$ | $R_{17}$ | $R_{18}$ | $R_{19}$ | $R_{20}$ |
| LM1 | X1 | H | X3 | H | X1 | H | H | H | H | D |
| LM2 | X1 | H | X3 | H | X1 | H | H | H | D | H |
| LM3 | X1 | H | X3 | H | X1 | H | H | H | D | D |
| LM4 | Y1 | H | X3 | H | Y1 | H | H | H | D | D |
| LM5 | Y2 | H | X3 | H | Y2 | H | H | H | D | D |
| LM6 | Y3 | H | X3 | H | Y3 | H | H | H | D | D |
| LM7 | Y3 | D | X3 | D | Y3 | H | H | H | D | D |
| LM8 | Y3 | D | X3 | D | Y3 | D | H | H | D | D |
| LM9 | Y3 | D | X3 | D | Y3 | D | D | H | D | D |
| LM10 | Y3 | D | X3 | D | Y3 | D | D | D | D | D |
| LM11 | Y3 | D | Y11 | D | Y3 | D | D | D | D | D |
| LM12 | Y3 | D | Y11 | D | Y3 | H | X1 | H | D | D |
| LM13 | Y3 | D | Y11 | D | Y3 | D | Y3 | D | D | D |
| LM14 | Y3 | D | Y11 | D | Y3 | H | X4 | H | D | D |
| LM15 | Y3 | D | Y11 | D | Y3 | D | Y12 | D | D | D |
| LM16 | X2 | H | X3 | H | X2 | H | H | H | H | D |
| LM17 | X2 | H | X3 | H | X2 | H | H | H | D | H |
| LM18 | X2 | H | X3 | H | X2 | H | H | H | D | D |
| LM19 | Y4 | H | X3 | H | Y4 | H | H | H | D | D |
| LM20 | Y5 | H | X3 | H | Y5 | H | H | H | D | D |
| LM21 | Y6 | H | X3 | H | Y6 | H | H | H | D | D |
| LM22 | Y7 | H | X3 | H | Y7 | H | H | H | D | D |
| LM23 | Y8 | H | X3 | H | Y8 | H | H | H | D | D |

TABLE 4-continued

| Formula 1-1 | | | | | | | | | | |
|---|---|---|---|---|---|---|---|---|---|---|
| Ligand name | $R_{11}$ | $R_{12}$ | $R_{13}$ | $R_{14}$ | $R_{15}$ | $R_{16}$ | $R_{17}$ | $R_{18}$ | $R_{19}$ | $R_{20}$ |
| LM24 | Y9 | H | X3 | H | Y9 | H | H | H | D | D |
| LM25 | Y10 | H | X3 | H | Y10 | H | H | H | D | D |
| LM26 | Y10 | D | X3 | D | Y10 | H | H | H | D | D |
| LM27 | Y10 | D | X3 | D | Y10 | D | H | H | D | D |
| LM28 | Y10 | D | X3 | D | Y10 | D | D | H | D | D |
| LM29 | Y10 | D | X3 | D | Y10 | D | D | D | D | D |
| LM30 | Y10 | D | Y11 | D | Y10 | D | D | D | D | D |
| LM31 | Y10 | D | Y11 | D | Y10 | H | X1 | H | D | D |
| LM32 | Y10 | D | Y11 | D | Y10 | D | Y3 | D | D | D |
| LM33 | Y10 | D | Y11 | D | Y10 | H | X4 | H | D | D |
| LM34 | Y10 | D | Y11 | D | Y10 | D | Y12 | D | D | D |
| LM35 | X1 | H | X4 | H | X1 | H | H | H | H | D |
| LM36 | X1 | H | X4 | H | X1 | H | H | H | D | H |
| LM37 | X1 | H | X4 | H | X1 | H | H | H | D | D |
| LM38 | Y1 | H | X4 | H | Y1 | H | H | H | D | D |
| LM39 | Y2 | H | X4 | H | Y2 | H | H | H | D | D |
| LM40 | Y3 | H | X4 | H | Y3 | H | H | H | D | D |
| LM41 | Y3 | D | X4 | D | Y3 | H | H | H | D | D |
| LM42 | Y3 | D | X4 | D | Y3 | D | H | H | D | D |
| LM43 | Y3 | D | X4 | D | Y3 | D | D | H | D | D |
| LM44 | Y3 | D | X4 | D | Y3 | D | D | D | D | D |
| LM45 | Y3 | D | Y12 | D | Y3 | D | D | D | D | D |
| LM46 | Y3 | D | Y12 | D | Y3 | H | X1 | H | D | D |
| LM47 | Y3 | D | Y12 | D | Y3 | D | Y3 | D | D | D |
| LM48 | Y3 | D | Y12 | D | Y3 | H | X4 | H | D | D |
| LM49 | Y3 | D | Y12 | D | Y3 | D | Y12 | D | D | D |
| LM50 | X2 | H | X4 | H | X2 | H | H | H | H | D |
| LM51 | X2 | H | X4 | H | X2 | H | H | H | D | H |
| LM52 | X2 | H | X4 | H | X2 | H | H | H | D | D |
| LM53 | Y4 | H | X4 | H | Y4 | H | H | H | D | D |
| LM54 | Y5 | H | X4 | H | Y5 | H | H | H | D | D |
| LM55 | Y6 | H | X4 | H | Y6 | H | H | H | D | D |
| LM56 | Y7 | H | X4 | H | Y7 | H | H | H | D | D |
| LM57 | Y8 | H | X4 | H | Y8 | H | H | H | D | D |
| LM58 | Y9 | H | X4 | H | Y9 | H | H | H | D | D |
| LM59 | Y10 | H | X4 | H | Y10 | H | H | H | D | D |
| LM60 | Y10 | D | X4 | D | Y10 | H | H | H | D | D |
| LM61 | Y10 | D | X4 | D | Y10 | D | H | H | D | D |
| LM62 | Y10 | D | X4 | D | Y10 | D | D | H | D | D |
| LM63 | Y10 | D | X4 | D | Y10 | D | D | D | D | D |
| LM64 | Y10 | D | Y12 | D | Y10 | D | D | D | D | D |
| LM65 | Y10 | D | Y12 | D | Y10 | H | X1 | H | D | D |
| LM66 | Y10 | D | Y12 | D | Y10 | D | Y3 | D | D | D |
| LM67 | Y10 | D | Y12 | D | Y10 | H | X4 | H | D | D |
| LM68 | Y10 | D | Y12 | D | Y10 | D | Y12 | D | D | D |
| LM69 | X1 | H | X5 | H | X1 | H | H | H | H | D |
| LM70 | X1 | H | X5 | H | X1 | H | H | H | D | H |
| LM71 | X1 | H | X5 | H | X1 | H | H | H | D | D |
| LM72 | Y1 | H | X5 | H | Y1 | H | H | H | D | D |
| LM73 | Y2 | H | X5 | H | Y2 | H | H | H | D | D |
| LM74 | Y3 | H | X5 | H | Y3 | H | H | H | D | D |
| LM75 | Y3 | D | X5 | D | Y3 | H | H | H | D | D |
| LM76 | Y3 | D | X5 | D | Y3 | D | H | H | D | D |
| LM77 | Y3 | D | X5 | D | Y3 | D | D | H | D | D |
| LM78 | Y3 | D | X5 | D | Y3 | D | D | D | D | D |
| LM79 | Y3 | D | Y13 | D | Y3 | D | D | D | D | D |
| LM80 | Y3 | D | Y13 | D | Y3 | H | X1 | H | D | D |
| LM81 | Y3 | D | Y13 | D | Y3 | D | Y3 | D | D | D |
| LM82 | Y3 | D | Y13 | D | Y3 | H | X4 | H | D | D |
| LM83 | Y3 | D | Y13 | D | Y3 | D | Y12 | D | D | D |
| LM84 | X2 | H | X5 | H | X2 | H | H | H | H | D |
| LM85 | X2 | H | X5 | H | X2 | H | H | H | D | H |
| LM86 | X2 | H | X5 | H | X2 | H | H | H | D | D |
| LM87 | Y4 | H | X5 | H | Y4 | H | H | H | D | D |
| LM88 | Y5 | H | X5 | H | Y5 | H | H | H | D | D |
| LM89 | Y6 | H | X5 | H | Y6 | H | H | H | D | D |
| LM90 | Y7 | H | X5 | H | Y7 | H | H | H | D | D |
| LM91 | Y8 | H | X5 | H | Y8 | H | H | H | D | D |
| LM92 | Y9 | H | X5 | H | Y9 | H | H | H | D | D |
| LM93 | Y10 | H | X5 | H | Y10 | H | H | H | D | D |
| LM94 | Y10 | D | X5 | D | Y10 | H | H | H | D | D |
| LM95 | Y10 | D | X5 | D | Y10 | D | H | H | D | D |
| LM96 | Y10 | D | X5 | D | Y10 | D | D | H | D | D |
| LM97 | Y10 | D | X5 | D | Y10 | D | D | D | D | D |
| LM98 | Y10 | D | Y13 | D | Y10 | D | D | D | D | D |
| LM99 | Y10 | D | Y13 | D | Y10 | H | X1 | H | D | D |

TABLE 4-continued

Formula 1-1

| Ligand name | $R_{11}$ | $R_{12}$ | $R_{13}$ | $R_{14}$ | $R_{15}$ | $R_{16}$ | $R_{17}$ | $R_{18}$ | $R_{19}$ | $R_{20}$ |
|---|---|---|---|---|---|---|---|---|---|---|
| LM100 | Y10 | D | Y13 | D | Y10 | D | Y3 | D | D | D |
| LM101 | Y10 | D | Y13 | D | Y10 | H | X4 | H | D | D |
| LM102 | Y10 | D | Y13 | D | Y10 | D | Y12 | D | D | D |
| LM103 | X1 | H | X6 | H | X1 | H | H | H | H | D |
| LM104 | X1 | H | X6 | H | X1 | H | H | H | D | H |
| LM105 | X1 | H | X6 | H | X1 | H | H | H | D | D |
| LM106 | Y1 | H | X6 | H | Y1 | H | H | H | D | D |
| LM107 | Y2 | H | X6 | H | Y2 | H | H | H | D | D |
| LM108 | Y3 | H | X6 | H | Y3 | H | H | H | D | D |
| LM109 | Y3 | D | X6 | D | Y3 | H | H | H | D | D |
| LM110 | Y3 | D | X6 | D | Y3 | D | H | H | D | D |
| LM111 | Y3 | D | X6 | D | Y3 | D | D | H | D | D |
| LM112 | Y3 | D | X6 | D | Y3 | D | D | D | D | D |
| LM113 | Y3 | D | Y14 | D | Y3 | D | D | D | D | D |
| LM114 | Y3 | D | Y14 | D | Y3 | H | X1 | H | D | D |
| LM115 | Y3 | D | Y14 | D | Y3 | D | Y3 | D | D | D |
| LM116 | Y3 | D | Y14 | D | Y3 | H | X4 | H | D | D |
| LM117 | Y3 | D | Y14 | D | Y3 | D | Y12 | D | D | D |
| LM118 | X2 | H | X6 | H | X2 | H | H | H | H | D |
| LM119 | X2 | H | X6 | H | X2 | H | H | H | D | H |
| LM120 | X2 | H | X6 | H | X2 | H | H | H | D | D |
| LM121 | Y4 | H | X6 | H | Y4 | H | H | H | D | D |
| LM122 | Y5 | H | X6 | H | Y5 | H | H | H | D | D |
| LM123 | Y6 | H | X6 | H | Y6 | H | H | H | D | D |
| LM124 | Y7 | H | X6 | H | Y7 | H | H | H | D | D |
| LM125 | Y8 | H | X6 | H | Y8 | H | H | H | D | D |
| LM126 | Y9 | H | X6 | H | Y9 | H | H | H | D | D |
| LM127 | Y10 | H | X6 | H | Y10 | H | H | H | D | D |
| LM128 | Y10 | D | X6 | D | Y10 | H | H | H | D | D |
| LM129 | Y10 | D | X6 | D | Y10 | D | H | H | D | D |
| LM130 | Y10 | D | X6 | D | Y10 | D | D | H | D | D |
| LM131 | Y10 | D | X6 | D | Y10 | D | D | D | D | D |
| LM132 | Y10 | D | Y14 | D | Y10 | D | D | D | D | D |
| LM133 | Y10 | D | Y14 | D | Y10 | H | X1 | H | D | D |
| LM134 | Y10 | D | Y14 | D | Y10 | D | Y3 | D | D | D |
| LM135 | Y10 | D | Y14 | D | Y10 | H | X4 | H | D | D |
| LM136 | Y10 | D | Y14 | D | Y10 | D | Y12 | D | D | D |
| LM137 | X1 | H | X7 | H | X1 | H | H | H | H | D |
| LM138 | X1 | H | X7 | H | X1 | H | H | H | D | H |
| LM139 | X1 | H | X7 | H | X1 | H | H | H | D | D |
| LM140 | Y1 | H | X7 | H | Y1 | H | H | H | D | D |
| LM141 | Y2 | H | X7 | H | Y2 | H | H | H | D | D |
| LM142 | Y3 | H | X7 | H | Y3 | H | H | H | D | D |
| LM143 | Y3 | D | X7 | D | Y3 | H | H | H | D | D |
| LM144 | Y3 | D | X7 | D | Y3 | D | H | H | D | D |
| LM145 | Y3 | D | X7 | D | Y3 | D | D | H | D | D |
| LM146 | Y3 | D | X7 | D | Y3 | D | D | D | D | D |
| LM147 | Y3 | D | X8 | D | Y3 | D | D | D | D | D |
| LM148 | Y3 | D | Y16 | D | Y3 | D | D | D | D | D |
| LM149 | Y3 | D | Y17 | D | Y3 | D | D | D | D | D |
| LM150 | Y3 | D | Y18 | D | Y3 | D | D | D | D | D |
| LM151 | Y3 | D | Y15 | D | Y3 | D | D | D | D | D |
| LM152 | Y3 | D | Y15 | D | Y3 | H | X1 | H | D | D |
| LM153 | Y3 | D | Y15 | D | Y3 | D | Y3 | D | D | D |
| LM154 | Y3 | D | Y16 | D | Y3 | D | Y3 | D | D | D |
| LM155 | Y3 | D | Y17 | D | Y3 | D | Y3 | D | D | D |
| LM156 | Y3 | D | Y18 | D | Y3 | D | Y3 | D | D | D |
| LM157 | Y3 | D | Y15 | D | Y3 | H | X4 | H | D | D |
| LM158 | Y3 | D | Y15 | D | Y3 | D | Y12 | D | D | D |
| LM159 | Y3 | D | Y16 | D | Y3 | D | Y12 | D | D | D |
| LM160 | Y3 | D | Y17 | D | Y3 | D | Y12 | D | D | D |
| LM161 | Y3 | D | Y18 | D | Y3 | D | Y12 | D | D | D |
| LM162 | X2 | H | X7 | H | X2 | H | H | H | H | D |
| LM163 | X2 | H | X7 | H | X2 | H | H | H | D | H |
| LM164 | X2 | H | X7 | H | X2 | H | H | H | D | D |
| LM165 | Y4 | H | X7 | H | Y4 | H | H | H | D | D |
| LM166 | Y5 | H | X7 | H | Y5 | H | H | H | D | D |
| LM167 | Y6 | H | X7 | H | Y6 | H | H | H | D | D |
| LM168 | Y7 | H | X7 | H | Y7 | H | H | H | D | D |
| LM169 | Y8 | H | X7 | H | Y8 | H | H | H | D | D |
| LM170 | Y9 | H | X7 | H | Y9 | H | H | H | D | D |
| LM171 | Y10 | H | X7 | H | Y10 | H | H | H | D | D |
| LM172 | Y10 | D | X7 | D | Y10 | H | H | H | D | D |
| LM173 | Y10 | D | X7 | D | Y10 | D | H | H | D | D |
| LM174 | Y10 | D | X7 | D | Y10 | D | D | H | D | D |
| LM175 | Y10 | D | X7 | D | Y10 | D | D | D | D | D |

TABLE 4-continued

Formula 1-1

| Ligand name | $R_{11}$ | $R_{12}$ | $R_{13}$ | $R_{14}$ | $R_{15}$ | $R_{16}$ | $R_{17}$ | $R_{18}$ | $R_{19}$ | $R_{20}$ |
|---|---|---|---|---|---|---|---|---|---|---|
| LM176 | Y10 | D | X8 | D | Y10 | D | D | D | D | D |
| LM177 | Y10 | D | Y16 | D | Y10 | D | D | D | D | D |
| LM178 | Y10 | D | Y17 | D | Y10 | D | D | D | D | D |
| LM179 | Y10 | D | Y18 | D | Y10 | D | D | D | D | D |
| LM180 | Y10 | D | Y15 | D | Y10 | D | D | D | D | D |
| LM181 | Y10 | D | Y15 | D | Y10 | H | X1 | H | D | D |
| LM182 | Y10 | D | Y15 | D | Y10 | D | Y3 | D | D | D |
| LM183 | Y10 | D | Y16 | D | Y10 | D | Y3 | D | D | D |
| LM184 | Y10 | D | Y17 | D | Y10 | D | Y3 | D | D | D |
| LM185 | Y10 | D | Y18 | D | Y10 | D | Y3 | D | D | D |
| LM186 | Y10 | D | Y15 | D | Y10 | H | X4 | H | D | D |
| LM187 | Y10 | D | Y15 | D | Y10 | D | Y12 | D | D | D |
| LM188 | Y10 | D | Y16 | D | Y10 | D | Y12 | D | D | D |
| LM189 | Y10 | D | Y17 | D | Y10 | D | Y12 | D | D | D |
| LM190 | Y10 | D | Y18 | D | Y10 | D | Y12 | D | D | D |
| LM191 | X1 | X7 | H | H | X1 | H | H | H | H | D |
| LM192 | X1 | X7 | H | H | X1 | H | H | H | D | H |
| LM193 | X1 | X7 | H | H | X1 | H | H | H | D | D |
| LM194 | Y1 | X7 | H | H | Y1 | H | H | H | D | D |
| LM195 | Y2 | X7 | H | H | Y2 | H | H | H | D | D |
| LM196 | Y3 | X7 | H | H | Y3 | H | H | H | D | D |
| LM197 | Y3 | X7 | D | D | Y3 | H | H | H | D | D |
| LM198 | Y3 | X7 | D | D | Y3 | D | H | H | D | D |
| LM199 | Y3 | X7 | D | D | Y3 | D | D | H | D | D |
| LM200 | Y3 | X7 | D | D | Y3 | D | D | D | D | D |
| LM201 | Y3 | Y15 | D | D | Y3 | D | D | D | D | D |
| LM202 | Y3 | Y16 | D | D | Y3 | D | D | D | D | D |
| LM203 | Y3 | Y17 | D | D | Y3 | D | D | D | D | D |
| LM204 | Y3 | Y18 | D | D | Y3 | D | D | D | D | D |
| LM205 | Y3 | Y15 | D | D | Y3 | H | X1 | H | D | D |
| LM206 | Y3 | Y15 | D | D | Y3 | D | Y3 | D | D | D |
| LM207 | Y3 | Y16 | D | D | Y3 | D | Y3 | D | D | D |
| LM208 | Y3 | Y17 | D | D | Y3 | D | Y3 | D | D | D |
| LM209 | Y3 | Y18 | D | D | Y3 | D | Y3 | D | D | D |
| LM210 | Y3 | Y15 | D | D | Y3 | H | X4 | H | D | D |
| LM211 | Y3 | Y15 | D | D | Y3 | D | Y12 | D | D | D |
| LM212 | Y3 | Y16 | D | D | Y3 | D | Y12 | D | D | D |
| LM213 | Y3 | Y17 | D | D | Y3 | D | Y12 | D | D | D |
| LM214 | Y3 | Y18 | D | D | Y3 | D | Y12 | D | D | D |
| LM215 | X2 | X7 | H | H | X2 | H | H | H | H | D |
| LM216 | X2 | X7 | H | H | X2 | H | H | H | D | H |
| LM217 | X2 | X7 | H | H | X2 | H | H | H | D | D |
| LM218 | Y4 | X7 | H | H | Y4 | H | H | H | D | D |
| LM219 | Y5 | X7 | H | H | Y5 | H | H | H | D | D |
| LM220 | Y6 | X7 | H | H | Y6 | H | H | H | D | D |
| LM221 | Y7 | X7 | H | H | Y7 | H | H | H | D | D |
| LM222 | Y8 | X7 | H | H | Y8 | H | H | H | D | D |
| LM223 | Y9 | X7 | H | H | Y9 | H | H | H | D | D |
| LM224 | Y10 | X7 | H | H | Y10 | H | H | H | D | D |
| LM225 | Y10 | X7 | D | D | Y10 | H | H | H | D | D |
| LM226 | Y10 | X7 | D | D | Y10 | D | H | H | D | D |
| LM227 | Y10 | X7 | D | D | Y10 | D | D | H | D | D |
| LM228 | Y10 | X7 | D | D | Y10 | D | D | D | D | D |
| LM229 | Y10 | X8 | D | D | Y10 | D | D | D | D | D |
| LM230 | Y10 | Y16 | D | D | Y10 | D | D | D | D | D |
| LM231 | Y10 | Y17 | D | D | Y10 | D | D | D | D | D |
| LM232 | Y10 | Y18 | D | D | Y10 | D | D | D | D | D |
| LM233 | Y10 | Y15 | D | D | Y10 | D | D | D | D | D |
| LM234 | Y10 | Y15 | D | D | Y10 | H | X1 | H | D | D |
| LM235 | Y10 | Y15 | D | D | Y10 | D | Y3 | D | D | D |
| LM236 | Y10 | Y16 | D | D | Y10 | D | Y3 | D | D | D |
| LM237 | Y10 | Y17 | D | D | Y10 | D | Y3 | D | D | D |
| LM238 | Y10 | Y18 | D | D | Y10 | D | Y3 | D | D | D |
| LM239 | Y10 | Y15 | D | D | Y10 | H | X4 | H | D | D |
| LM240 | Y10 | Y15 | D | D | Y10 | D | Y12 | D | D | D |
| LM241 | Y10 | Y16 | D | D | Y10 | D | Y12 | D | D | D |
| LM242 | Y10 | Y17 | D | D | Y10 | D | Y12 | D | D | D |
| LM243 | Y10 | Y18 | D | D | Y10 | D | Y12 | D | D | D |

TABLE 5

| Formula 1-2 | | | | | | | | | | | | | |
|---|---|---|---|---|---|---|---|---|---|---|---|---|---|
| Ligand name | $R_{11}$ | $X_{11}$ | $R_{101}$ | $R_{102}$ | $R_{103}$ | $R_{104}$ | $R_{14}$ | $R_{15}$ | $R_{16}$ | $R_{17}$ | $R_{18}$ | $R_{19}$ | $R_{20}$ |
| LFM1 | Y10 | N-PH | D | D | D | D | D | Y10 | D | D | D | D | D |
| LFM2 | Y10 | S | D | D | D | D | D | Y10 | D | D | D | D | D |
| LFM3 | Y10 | O | D | D | D | D | D | Y10 | D | D | D | D | D |
| LFM4 | Y3 | O | D | D | D | D | D | Y3 | D | D | D | D | D |
| LFM5 | Y10 | O | D | D | D | D | D | Y10 | D | D | D | D | D |
| LFM6 | Y10 | O | D | D | D | D | D | Y10 | D | Y3 | D | D | D |
| LFM7 | Y10 | O | D | D | D | D | D | Y10 | D | Y12 | D | D | D |

TABLE 6

| Formula 1-3 | | | | | | | | | | | | | |
|---|---|---|---|---|---|---|---|---|---|---|---|---|---|
| Ligand name | $R_{11}$ | $X_{11}$ | $R_{101}$ | $R_{102}$ | $R_{103}$ | $R_{104}$ | $R_{14}$ | $R_{15}$ | $R_{16}$ | $R_{17}$ | $R_{18}$ | $R_{19}$ | $R_{20}$ |
| LFP1 | Y10 | N-PH | D | D | D | D | D | Y10 | D | D | D | D | D |
| LFP2 | Y10 | S | D | D | D | D | D | Y10 | D | D | D | D | D |
| LFP3 | Y10 | O | D | D | D | D | D | Y10 | D | D | D | D | D |
| LFP4 | Y3 | O | D | D | D | D | D | Y3 | D | D | D | D | D |
| LFP5 | Y10 | O | D | D | D | D | D | Y10 | D | D | D | D | D |
| LFP6 | Y10 | O | D | D | D | D | D | Y10 | D | Y3 | D | D | D |
| LFP7 | Y10 | O | D | D | D | D | D | Y10 | D | Y12 | D | D | D |

X1 to X10 and Y1 to Y18 in Tables 4 to 6 are as follows, and Ph in the tables refers to a phenyl group:

X1

*—$CH_3$

X2

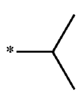

X3

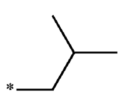

X4

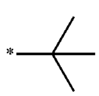

X5

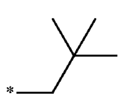

X6

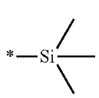

X7

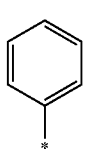

-continued

X8

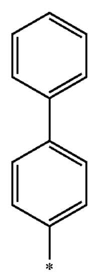

X9

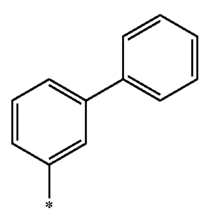

X10

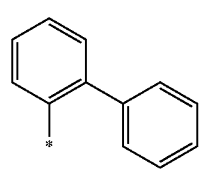

Y1

*—$CH_2D$

Y2

*—$CHD_2$

Y3

*—$CD_3$

Y4

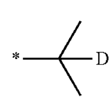

-continued
Y5
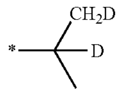
Y6
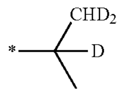
Y7
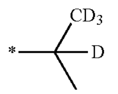
Y8
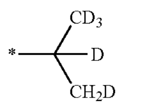
Y9
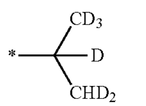
Y10
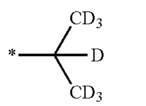
Y11
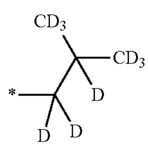
Y12
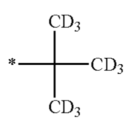
Y13
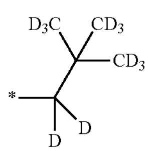
Y14
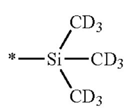
Y15
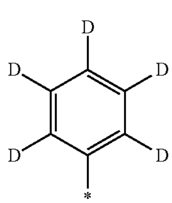
-continued
Y16
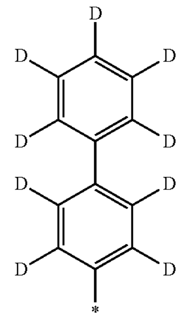
Y17
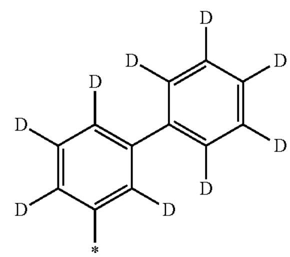
Y18
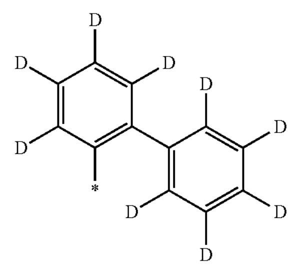
Group S-VI
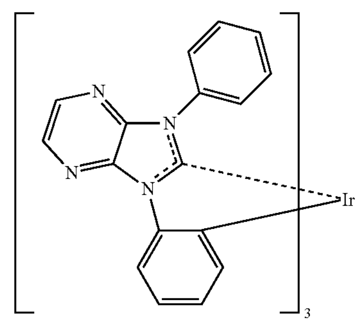
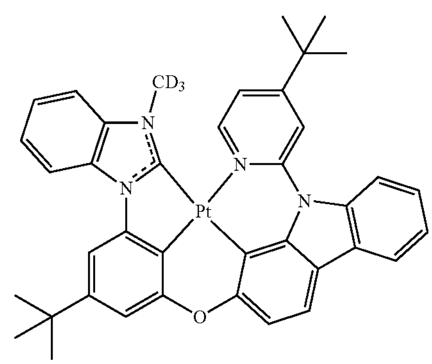

-continued

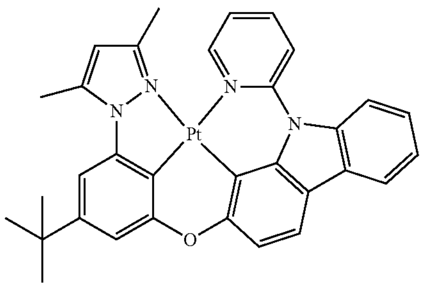

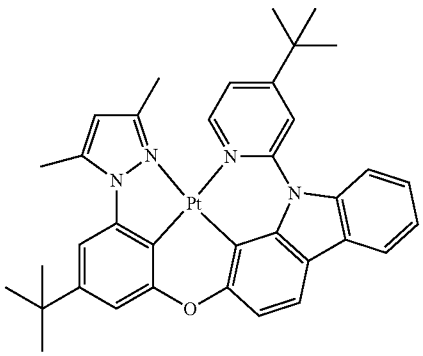

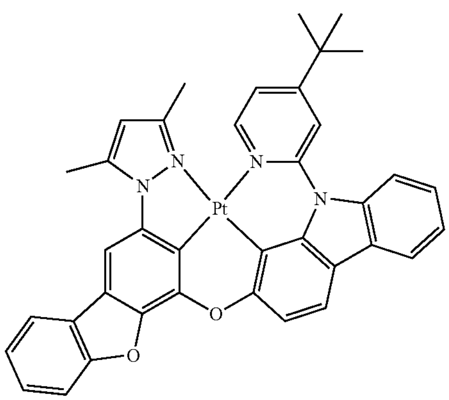

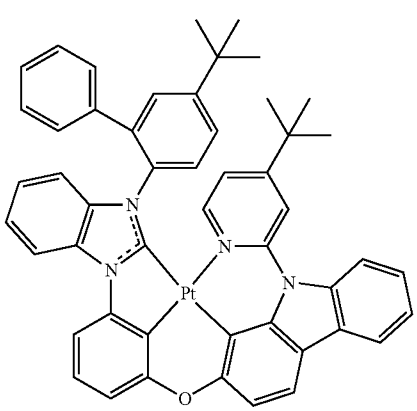

-continued

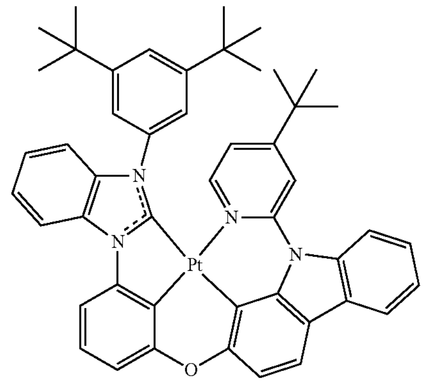

An amount of the sensitizer in the emission layer may be from about 5 wt % to about 50 wt %. Within this range, it is possible to achieve effective energy transfer in the emission layer, and accordingly, an organic light-emitting device having high efficiency and long lifespan may be embodied.

Emitter in Emission Layer 15

Because the emitter emits fluorescence, for example, delayed fluorescence, an organic light-emitting device including the emitter emitting fluorescence is clearly distinguished from an organic light-emitting device including a compound emitting phosphorescence.

In an embodiment, a horizontal orientation ratio of the emitter may be greater than or equal to about 90%.

The horizontal orientation ratio of the emitter is a value obtained by using a quartz substrate, in which the host and the emitter are deposited at a weight ratio of (100−d):d to have a thickness of 50 nm, and comparing a graph obtained by measuring PL intensity according to an angle for a range of 0° to 90° with respect to the quartz substrate with a simulated graph having different horizontal orientation ratios, for example, a horizontal orientation ratio of 100% and a horizontal orientation ratio of 67%. Here, d is an arbitrary constant. In the quartz substrate, only the emitter may substantially emit light and may further satisfy $T_1(H) > S_1(E)$.

A maximum emission wavelength of an emission spectrum of the emitter may be about 400 nm or more and about 550 nm or less. In an embodiment, a maximum emission wavelength of an emission spectrum of the emitter may be about 400 nm or more and about 495 nm or less, or about 450 nm or more and about 495 or less, but embodiments of the present disclosure are not limited thereto. That is, the emitter may emit blue light. The "maximum emission wavelength" refers to a wavelength at which the emission intensity is the greatest and may also be referred to as "a peak emission wavelength".

In an embodiment, the emitter does not include metal atoms.

The emitter may be a condensed cyclic compound represented by Formula 1 below:

Formula 1

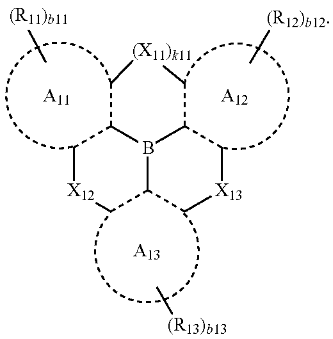

In Formula 1, $X_{11}$ is $NR_{14}$ or O, $X_{12}$ is $NR_{16}$ or O, $X_{13}$ is $NR_{16}$ or O, k11 is 0 or 1, wherein, when k11 is 0, $(X_{11})_{k11}$ does not exist, $A_{11}$ to $A_{13}$ are each independently a $C_5$-$C_{30}$ carbocyclic group or a $C_1$-$C_{30}$ heterocyclic group, $R_{11}$ to $R_{16}$ are each independently hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, $—C(Q_1)(Q_2)(Q_3)$, $—Si(Q_1)(Q_2)(Q_3)$, $—B(Q_1)(Q_2)$, $—N(Q_1)(Q_2)$, $—P(Q_1)(Q_2)$, $—C(=O)(Q_1)$, $—S(=O)(Q_1)$, $—S(=O)_2(Q_1)$, $—P(=O)(Q_1)(Q_2)$, or $—P(=S)(Q_1)(Q_2)$, wherein at least one of $R_{11}$ to $R_{13}$ is not hydrogen, $b_{11}$ to $b_{13}$ are each independently an integer from 0 to 10, and $Q_1$ to $Q_3$ are each independently hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group that is substituted with at least one deuterium, —F, a cyano group, a $C_1$-$C_{60}$ alkyl group, a $C_6$-$C_{60}$ aryl group, or any combination thereof, or a $C_6$-$C_{60}$ aryl group that is substituted with at least one deuterium, —F, a cyano group, a $C_1$-$C_{60}$ alkyl group, a $C_6$-$C_{60}$ aryl group, or any combination thereof.

In an, embodiment, in Formula 1, k11 may be 0.

In an embodiment, in Formula 1, at least one of $R_{11}$ to $R_{13}$ is a $C_1$-$C_{60}$ alkyl group, $—C(Q_1)(Q_2)(Q_3)$, or $—N(Q_1)(Q_2)$, and $Q_1$ to $Q_3$ are each independently a $C_1$-$C_{60}$ alkyl group, a $C_6$-$C_{60}$ aryl group, a $C_7$-$C_{60}$ alkyl aryl group, a $C_1$-$C_{60}$ alkyl group that is substituted with at least one deuterium, —F, a cyano group, a $C_1$-$C_{60}$ alkyl group, a $C_6$-$C_{60}$ aryl group, or any combination thereof, or a $C_6$-$C_{60}$ aryl group that is substituted with at least one deuterium, —F, a cyano group, a $C_1$-$C_{60}$ alkyl group, a $C_6$-$C_{60}$ aryl group, or any combination thereof.

In an embodiment, in Formula 1, $A_{11}$ to $A_{13}$ may each independently be a group represented by Formula 10A, a benzene group, a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, or a perylene group, and Formula 10A

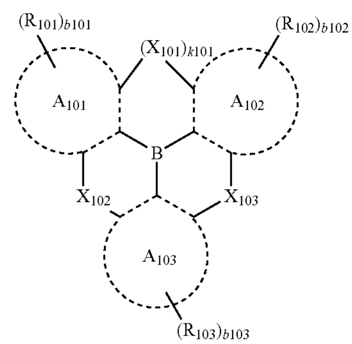

in Formula 10A, $X_{101}$ may be $NR_{104}$ or O, $X_{102}$ may be $NR_{105}$ or O, $X_{103}$ may be $NR_{106}$ or O, k101 may be 0 or 1, wherein, when k101 is 0, $(X_{101})_{k101}$ may not exist, $A_{101}$ to $A_{103}$ may each independently be a benzene group, a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, or a perylene group, $R_{101}$ to $R_{106}$ may each independently be hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —C($Q_1$)($Q_2$)($Q_3$), —Si($Q_1$)($Q_2$)($Q_3$), —B($Q_1$)($Q_2$), —N($Q_1$)($Q_2$), —P($Q_1$)($Q_2$), —C(═O)($Q_1$), —S(═O)($Q_1$), —S(═O)$_2$($Q_1$), —P(═O)($Q_1$)($Q_2$), or —P(═S)($Q_1$)($Q_2$), b101 to b103 may each independently be an integer from 0 to 10, and $Q_1$ to $Q_3$ may each independently be hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group that is substituted with at least one deuterium, —F, a cyano group, a $C_1$-$C_{60}$ alkyl group, a $C_6$-$C_{60}$ aryl group, or any combination thereof, or a $C_6$-$C_{60}$ aryl group that is substituted with at least one deuterium, —F, a cyano group, a $C_1$-$C_{60}$ alkyl group, a $C_6$-$C_{60}$ aryl group, or any combination thereof.

In an embodiment, in Formula 1, $A_{11}$ and $A_{13}$ may each independently be a benzene group, a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, or a perylene group, and $A_{12}$ may be a group represented by Formula 10A, or $A_{11}$ to $A_{13}$ may each independently be a benzene group, a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, or a perylene group.

In an embodiment, in Formulae 1 and 10A, k11 and k101 may be 0.

In detail, the emitter may be a condensed cyclic compound represented by Formula 1-1 or 1-2:

1-1

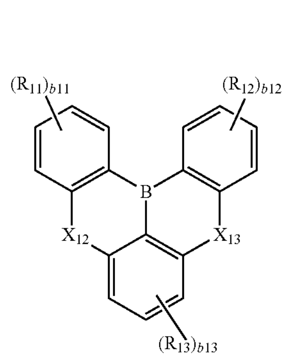

-continued 1-2

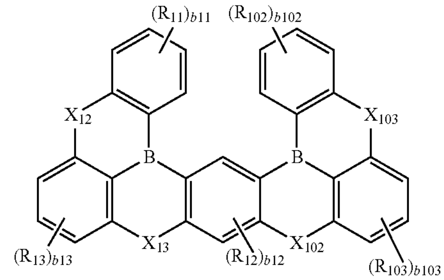

In Formulae 1-1 and 1-2, $X_{12}$ is $NR_{15}$ or O, $X_{13}$ is $NR_{16}$ or O, $X_{102}$ is $NR_{105}$ or O, $X_{103}$ is $NR_{106}$ or O, $R_{11}$ to $R_{13}$, $R_{15}$, $R_{16}$, $R_{102}$, $R_{103}$, $R_{105}$, and $R_{106}$ are each independently hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —C($Q_1$)($Q_2$)($Q_3$), —Si($Q_1$)($Q_2$)($Q_3$), —B($Q_1$)($Q_2$), —N($Q_1$)($Q_2$), —P($Q_1$)($Q_2$), —C(═O)($Q_1$), —S(═O)($Q_1$), —S(═O)$_2$($Q_1$), —P(═O)($Q_1$)($Q_2$), or —P(═S)($Q_1$)($Q_2$), wherein, at least one of $R_{11}$ to $R_{13}$ in Formula 1-1 is not hydrogen and at least one of $R_{11}$ to $R_{13}$, $R_{102}$, and $R_{103}$ in Formula 1-2 is not hydrogen, $b_{11}$ to $b_{13}$, b102, and b103 are each independently an integer from 0 to 10, and $Q_1$ to $Q_3$ are each independently hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group that is substituted with at least one deuterium, —F, a cyano group, a $C_1$-$C_{60}$ alkyl group, and a $C_6$-$C_{60}$ aryl group, or a $C_6$-$C_{60}$ aryl group that is substituted with at least one deuterium, —F, a cyano group, a $C_1$-$C_{60}$ alkyl group, or a $C_6$-$C_{60}$ aryl group.

In an embodiment, the emitter may be a compound the following Group E-I: Group E-I

E101

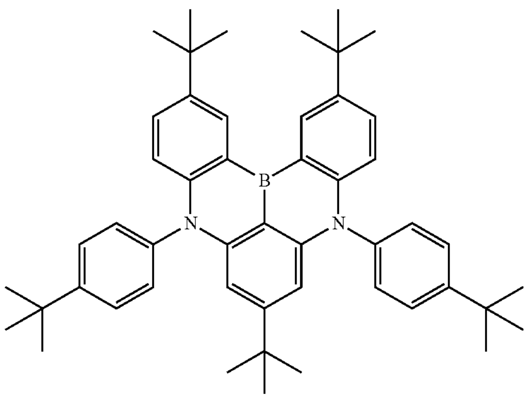

E102

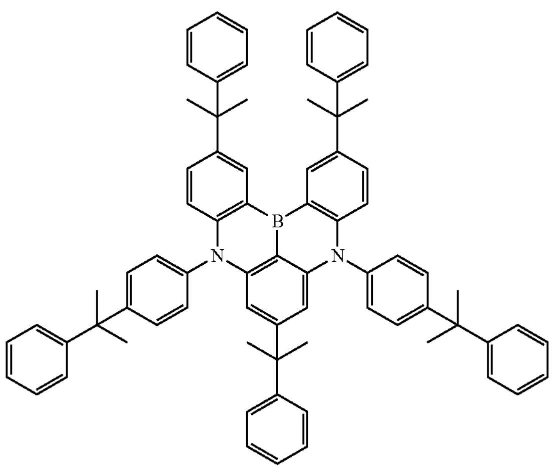

E201

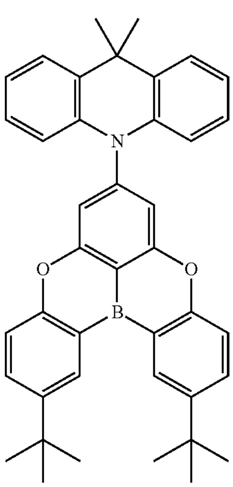

-continued

E301

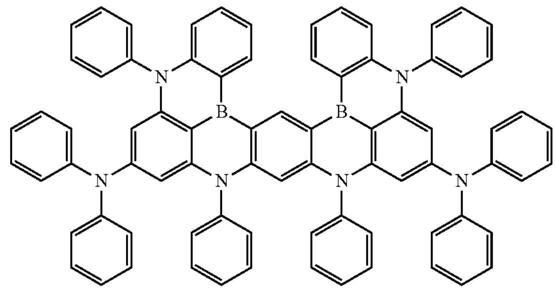

An amount of the sensitizer in the emission layer may be from about 5 wt % to about 50 wt %. Within these ranges, it is possible to achieve effective energy transfer in the emission layer, and accordingly, an organic light-emitting device having high efficiency and long lifespan may be obtained.

Hole Transport Region 12

The hole transport region 12 may be located between the first electrode 11 and the emission layer 15 of the organic light-emitting device 10.

The hole transport region 12 may have a single-layered structure or a multi-layered structure.

For example, the hole transport region 12 may have a hole injection layer, a hole transport layer, a hole injection layer/hole transport layer structure, a hole injection layer/first hole transport layer/second hole transport layer structure, a hole transport layer/interlayer structure, a hole injection layer/hole transport layer/interlayer structure, a hole transport layer/electron blocking layer structure, or a hole injection layer/hole transport layer/electron blocking layer structure, but embodiments of the present disclosure are not limited thereto.

The hole transport region 12 may include any compound having hole transport properties.

In an embodiment, the hole transport region 12 may include an amine-based compound.

In one embodiment, the hole transport region 12 may include at least one a compound represented by Formula 201 to a compound represented by Formula 205, but embodiments of the present disclosure are not limited thereto:

Formula 201

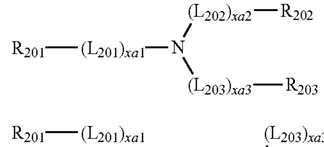

Formula 202

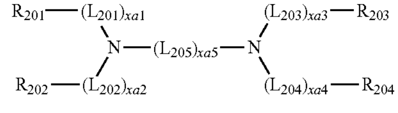

Formula 203

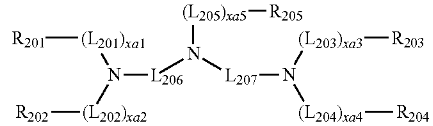

-continued

Formula 204

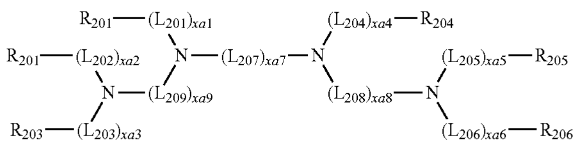

Formula 205

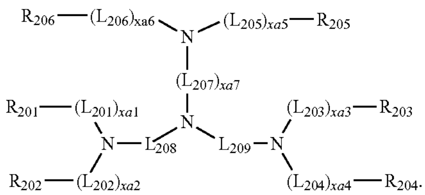

In Formulae 201 to 205, $L_{201}$ to $L_{209}$ may each independently be *—O—*', *—S—*', a substituted or unsubstituted $C_5$-$C_{60}$ carbocyclic group, or a substituted or unsubstituted $C_1$-$C_{60}$ heterocyclic group, xa1 to xa9 may each independently be an integer from 0 to 5, and $R_{201}$ to $R_{206}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein neighboring two groups of $R_{201}$ to $R_{206}$ may optionally be bonded to each other via a single bond, a dimethyl-methylene group, or a diphenyl-methylene group.

In an embodiment, $L_{201}$ to $L_{209}$ may be a benzene group, a heptalene group, an indene group, a naphthalene group, an azulene group, a heptalene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a corogen group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, and a triindolobenzene group, each unsubstituted or substituted with at least one deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group, or —Si$(Q_{11})(Q_{12})(Q_{13})$, xa1 to xa9 are each independently 0, 1, or 2, $R_{201}$ to $R_{206}$ are each independently a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an indeno carbazolyl group, an indolocarbazolyl group, a benzofurocarbazolyl group, or a benzothienocarbazolyl group, each unsubstituted or substituted with at least one deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si$(Q_{31})(Q_{32})(Q_{33})$, —N$(Q_{31})(Q_{32})$, or any combination thereof, and $Q_{11}$ to $Q_{13}$ and $Q_{31}$ to $Q_{33}$ are each independently a $C_1$-$C_{10}$ alkyl group, a $C_1$-$C_{10}$ alkoxy group, a phenyl group, a biphenyl group, a terphenyl group, or a naphthyl group.

In one or more embodiments, the hole transport region 12 may include a carbazole-containing amine-based compound.

In an embodiment, the hole transport region 12 may include a carbazole-containing amine-based compound and a carbazole-free amine-based compound.

The carbazole-containing amine-based compound may be, for example, a compound represented by Formula 201 including a carbazole group and further including at least one of a dibenzofuran group, a dibenzothiophene group, a fluorene group, a spiro-bifluorene group, an indenocarbazole group, an indolocarbazole group, a benzofurocarbazole group, or a benzothienocarbazole group.

The carbazole-free amine-based compound may be, for example, a compound represented by Formula 201 which do not include a carbazole group and which include at least one of a dibenzofuran group, a dibenzothiophene group, a fluorene group, a spiro-bifluorene group, an indenocarbazole group, an indolocarbazole group, a benzofurocarbazole group, a benzothienocarbazole group, or any combination thereof.

In one or more embodiments, the hole transport region 12 may include at least one compound represented by Formulae 201 or 202.

In one embodiment, the hole transport region 12 may include at least one compound represented by Formulae 201-1, 202-1, and 201-2, but embodiments of the present disclosure are not limited thereto:

Formula 201-1

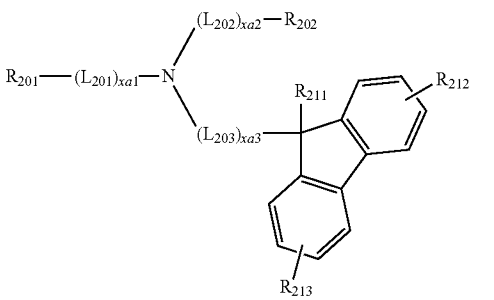

Formula 202-1

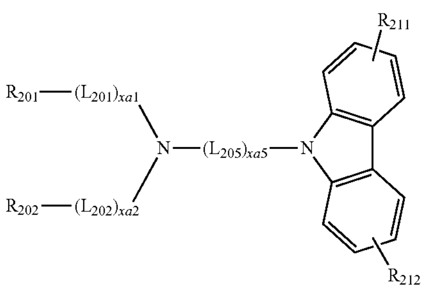

-continued

Formula 201-2

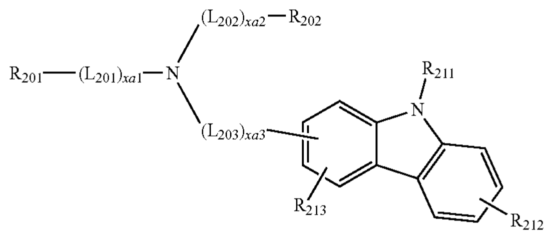

In Formulae 201-1, 202-1, and 201-2, $L_{201}$ to $L_{203}$, $L_{205}$, xa1 to xa3, xa5, $R_{201}$, and $R_{202}$ are the same as described herein, and $R_{211}$ to $R_{213}$ are each independently hydrogen, deuterium, —F, —Cl, —Br, —I, a hydroxyl group, a cyano group, a nitro group, an amidino group, a hydrazine group, a hydrazone group, a $C_1$-$C_{20}$ alkyl group, a $C_{20}$ alkoxy group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a dimethylfluorenyl group, a diphenylfluorenyl group, a triphenylenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, or a pyridinyl group.

In an embodiment, the hole transport region 12 may include at least one of Compounds HT1 to HT39, but embodiments of the present disclosure are not limited thereto.

HT1

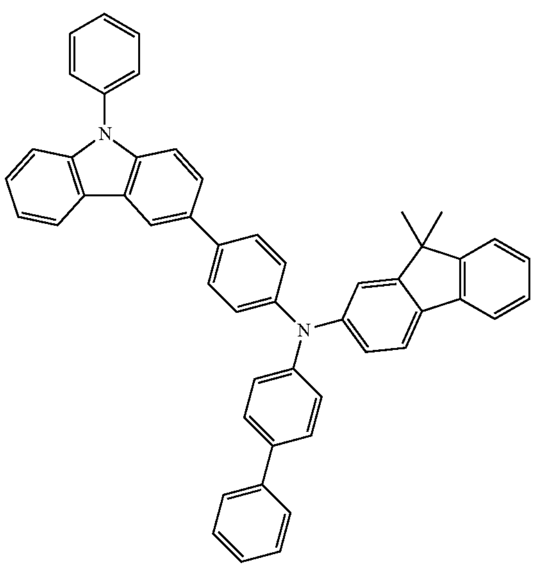

HT2

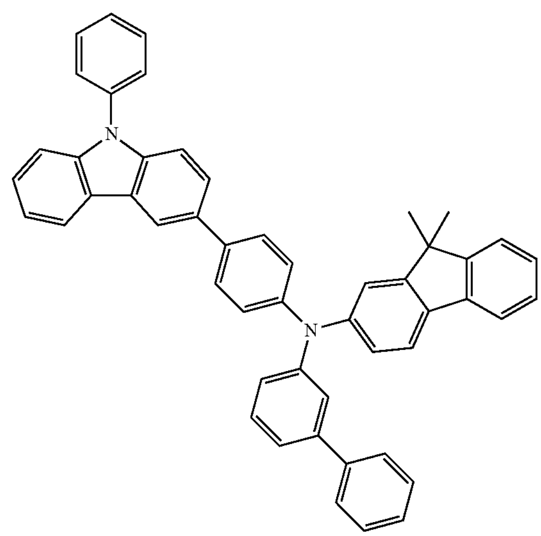

-continued
HT3
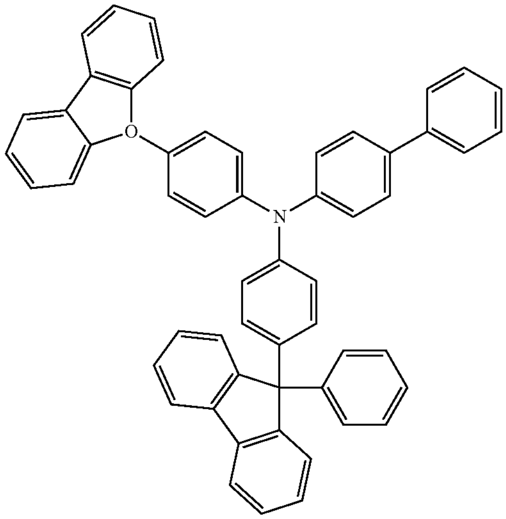
HT4
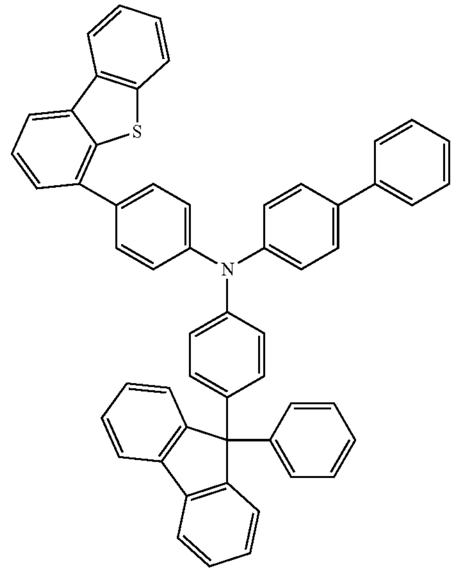
HT5
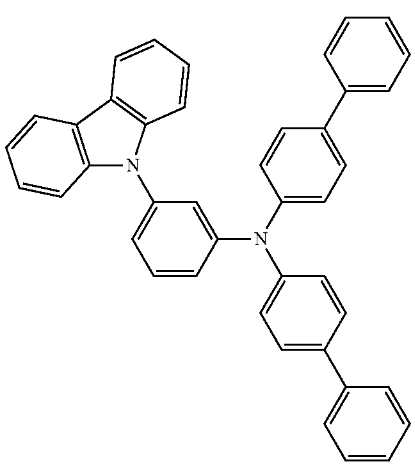
HT6
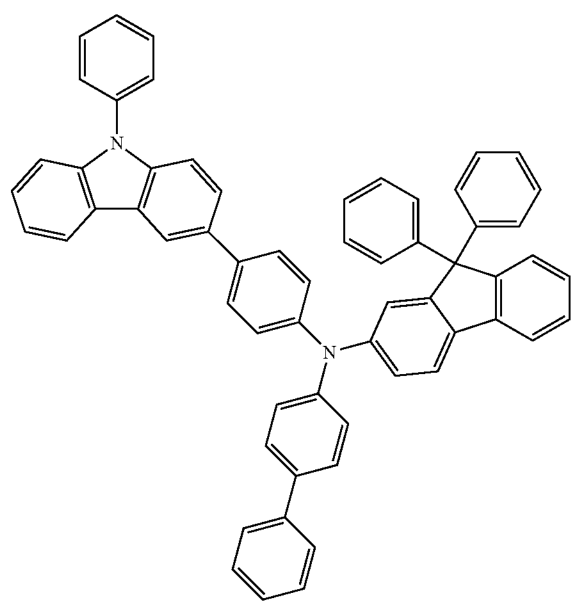

-continued
HT7
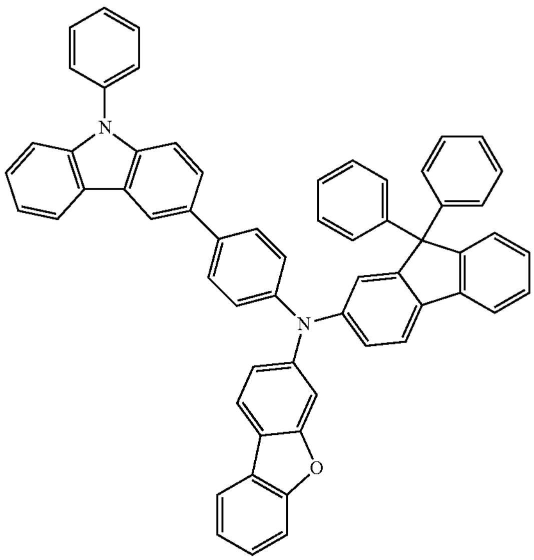
HT8
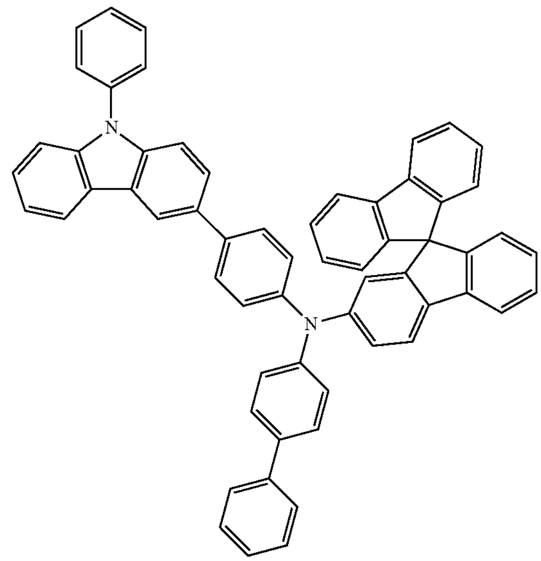
HT9
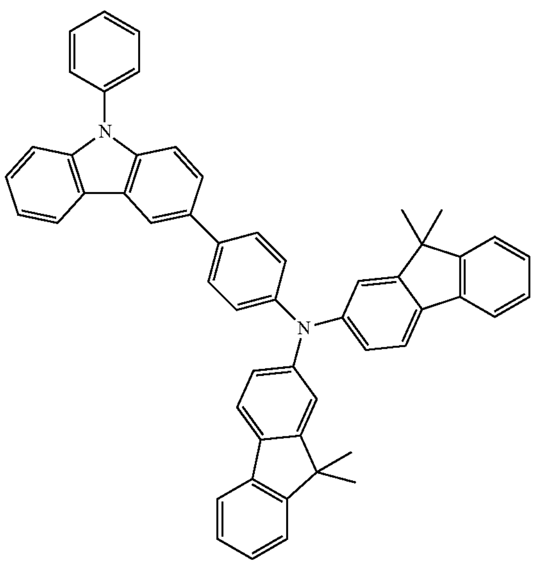
HT10
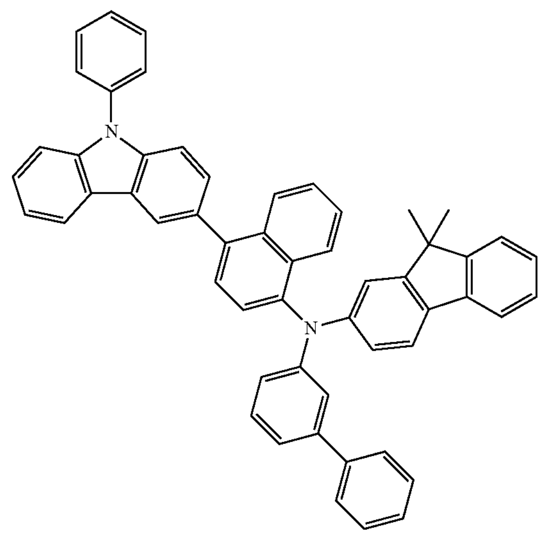
HT11
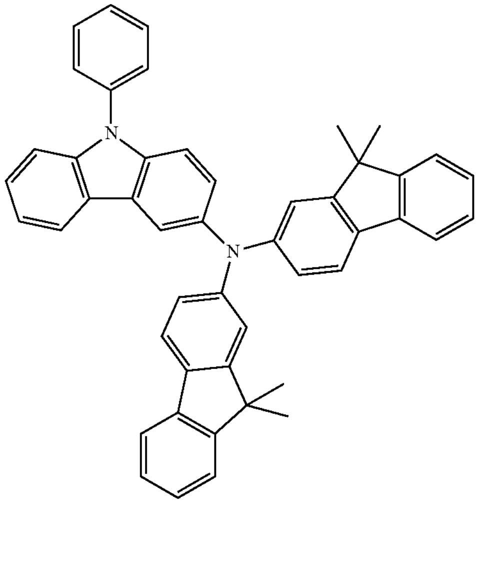
HT12
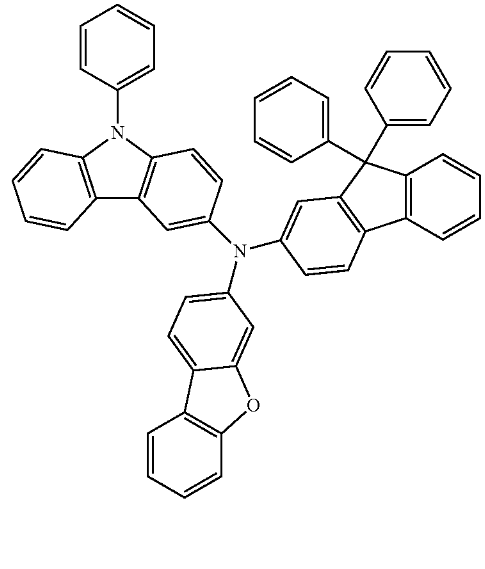

-continued
HT13
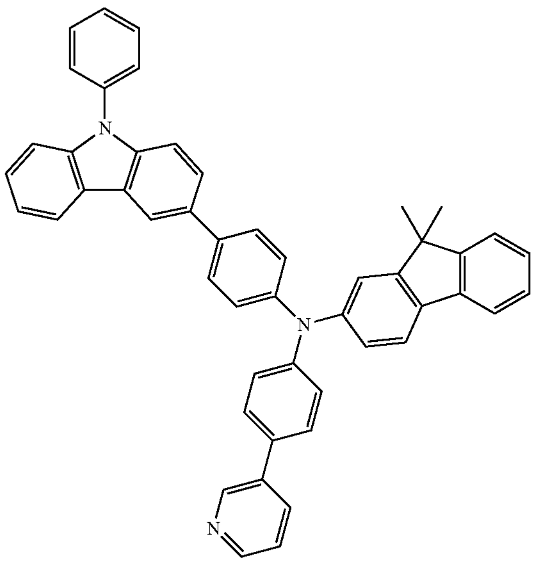
HT14
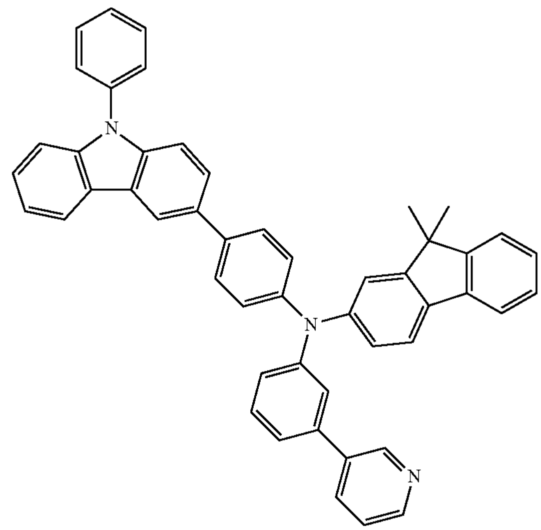
HT15
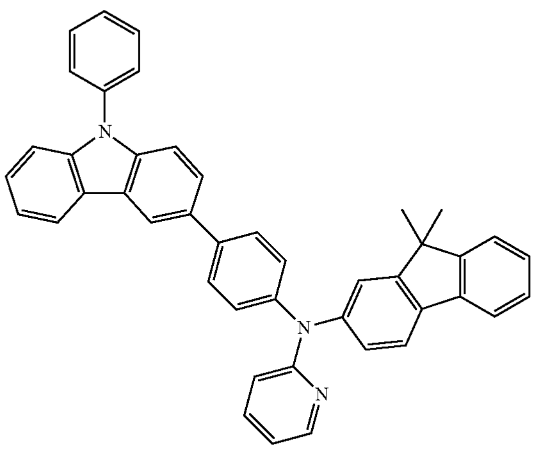
HT16
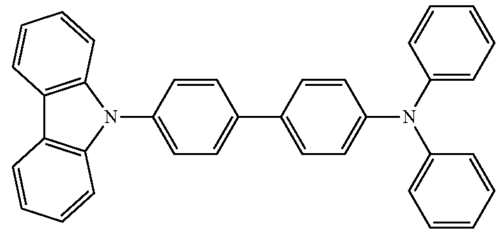
HT17
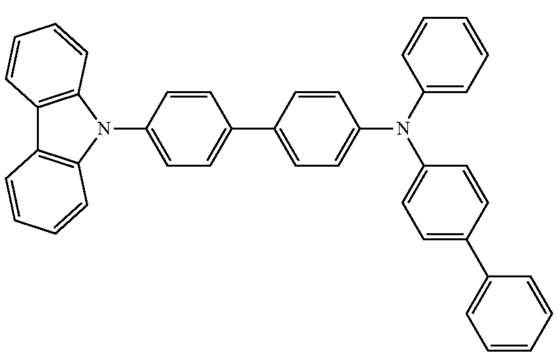
HT18
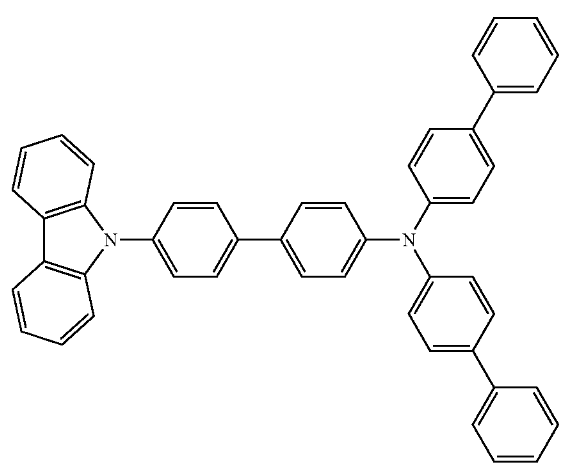

-continued
HT19
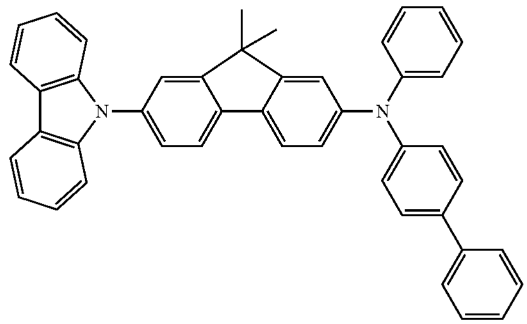
HT20
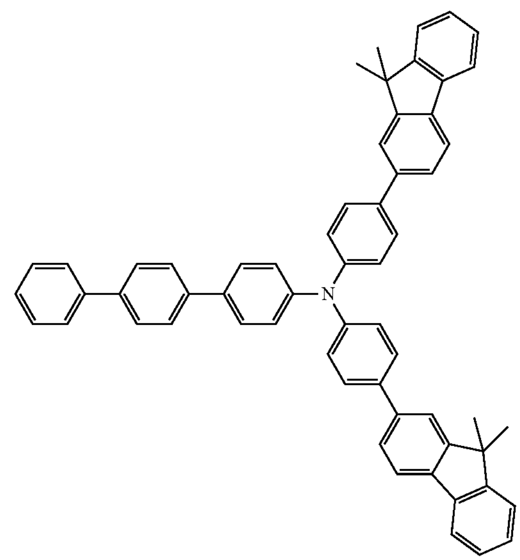
HT21
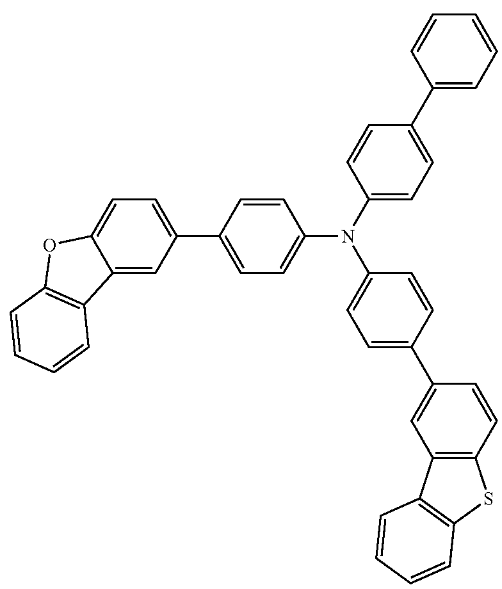
HT22
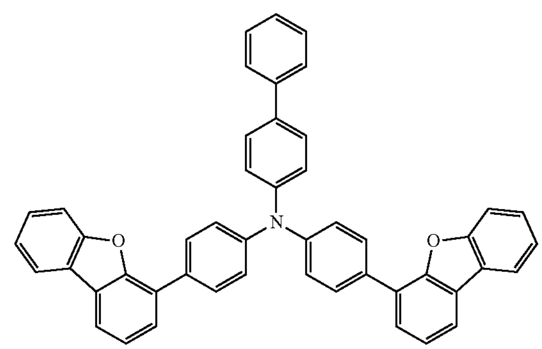
HT23
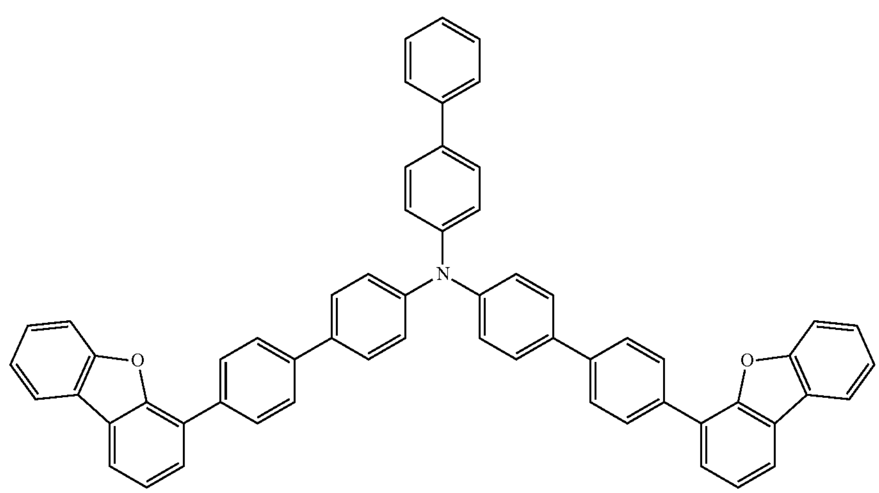

-continued
HT24
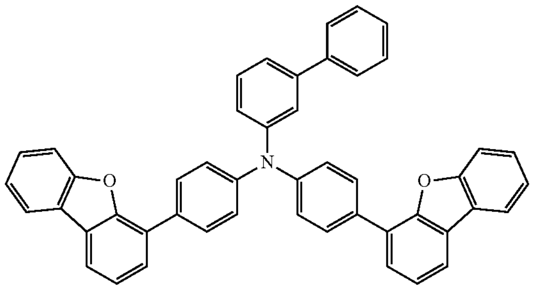
HT25
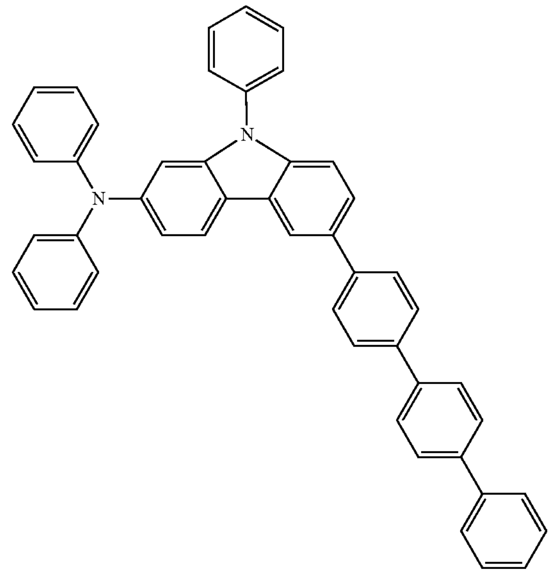
HT26
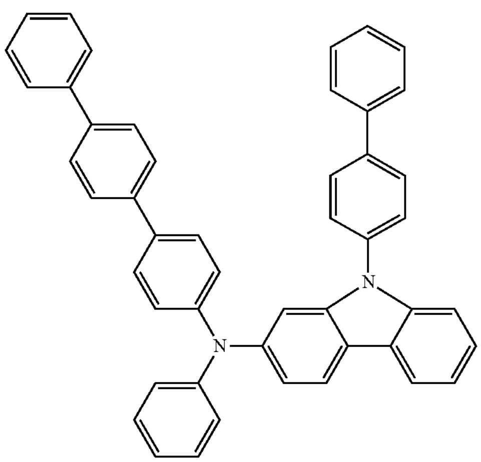
HT27
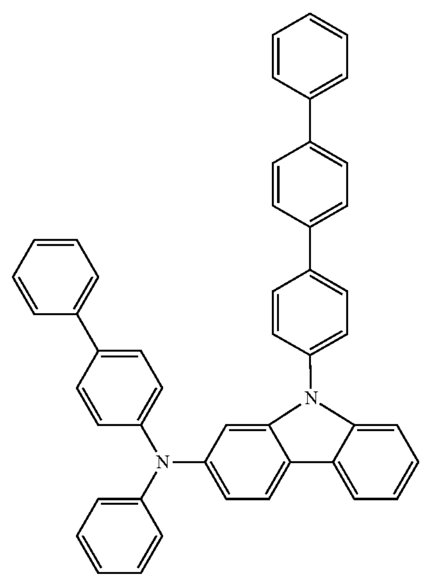
HT28
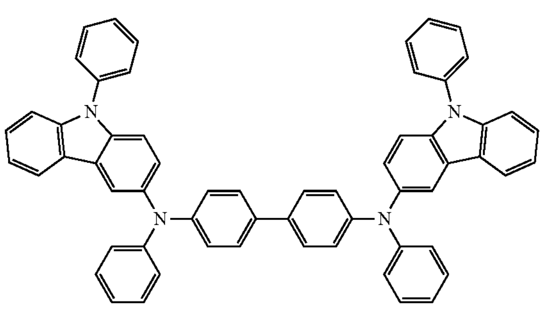
HT29
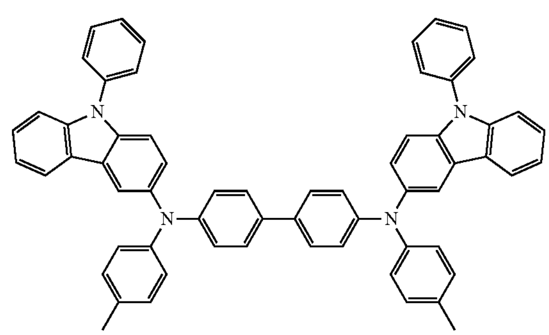

-continued
HT30
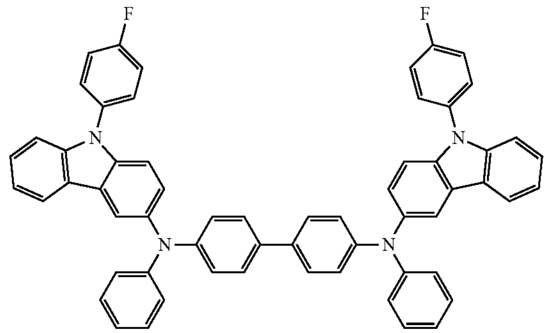
HT31
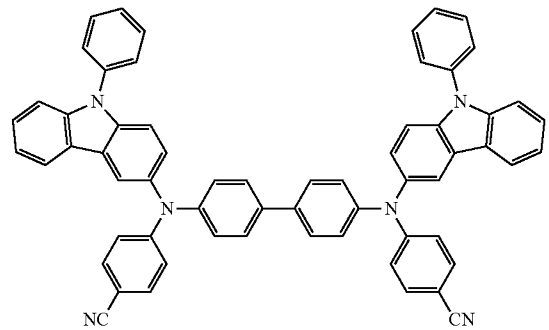
HT32
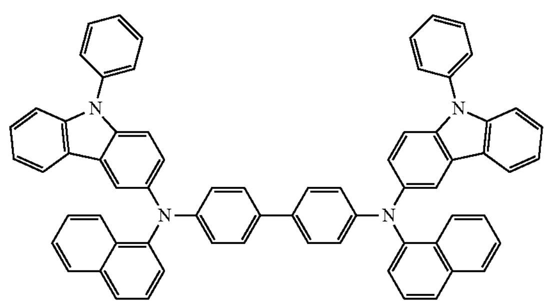
HT33
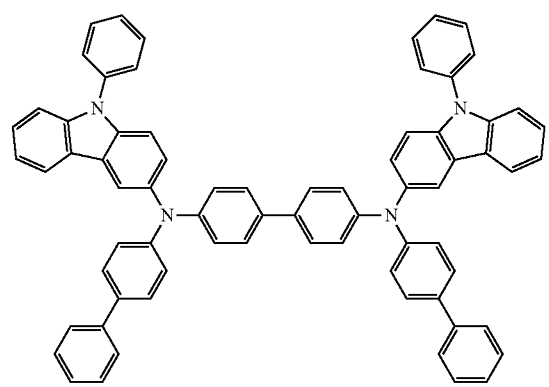
HT34
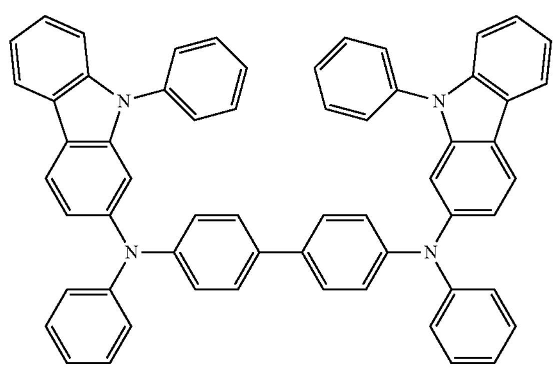
HT35
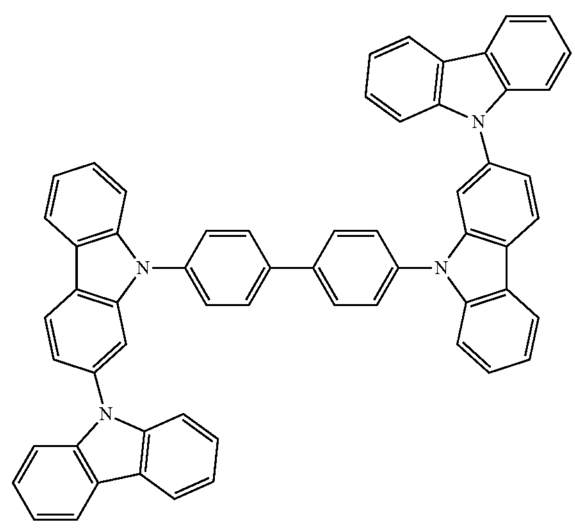

-continued

HT36

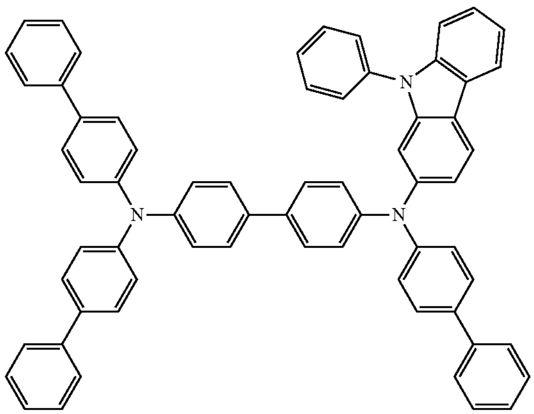

HT37

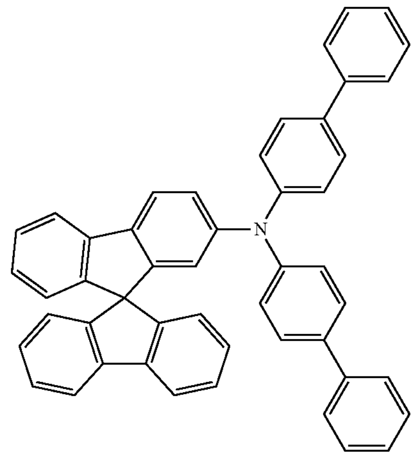

HT38

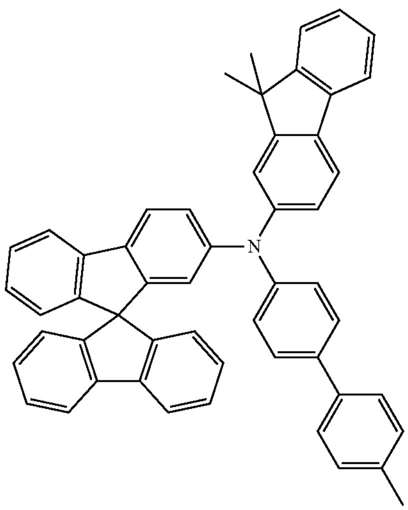

HT39

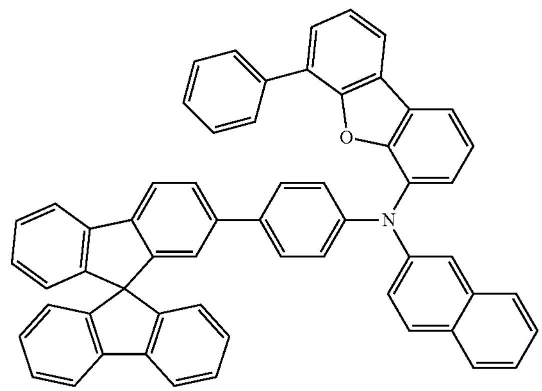

In one or more embodiments, the hole transport region 12 of the organic light-emitting device 10 may further include a p-dopant. When the hole transport region 12 further includes a p-dopant, the hole transport region 12 may have a matrix (for example, at least one compound represented by Formulae 201 to 205) and a p-dopant included in the matrix. The p-dopant may be uniformly or non-uniformly doped in the hole transport region 12.

In one embodiment, the lowest unoccupied molecular orbital (LUMO) energy level of the p-dopant may be about −3.5 eV or less.

The p-dopant may include at least one of a quinone derivative, a metal oxide, a cyano group-containing compound, or any combination thereof, but embodiments of the present disclosure are not limited thereto.

In an embodiment, the p-dopant may include at least one of:

a quinone derivative, such as tetracyanoquinodimethane (TCNQ),2,3,5,6-tetrafluoro-7,7,8,8-tetracyanoquinodimethane (F4-TCNQ), F6-TCNNQ, or any combination thereof;

a metal oxide, such as tungsten oxide or molybdenum oxide;

1,4,5,8,9,12-hexaazatriphenylene-hexacarbonitrile (HAT-CN);

a compound represented by Formula 221 below, or any combination thereof, but embodiments of the present disclosure are not limited thereto:

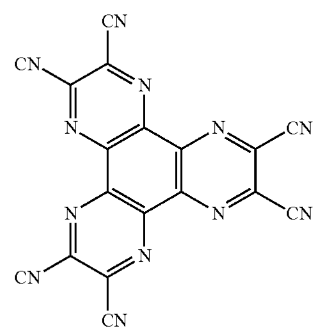

HAT-CN

-continued

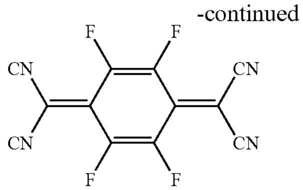

F4-TCNQ

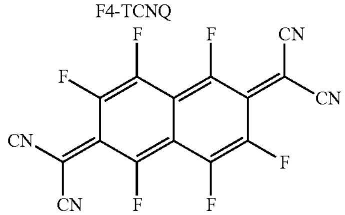

F6-TCNNQ

Formula 221

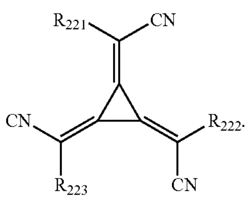

In Formula 221, $R_{221}$ to $R_{223}$ are each independently a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, and at least one of $R_{221}$ to $R_{223}$ may have at least one of a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, a $C_1$-$C_{20}$ alkyl group substituted with —I, or any combination thereof.

The hole transport region 12 may have a thickness of about 100 Å to about 10,000 Å, for example, about 400 Å to about 2,000 Å, and the emission layer 15 may have a thickness of about 100 Å to about 3,000 Å, for example, about 300 Å to about 1,000 Å. When the thickness of each of the hole transport region 12 and the emission layer 15 is within these ranges described above, satisfactory hole transportation characteristics and/or luminescence characteristics may be obtained without a substantial increase in driving voltage.

Electron Transport Region 17

The electron transport region 17 is located between the emission layer 15 and the second electrode 19 of the organic light-emitting device 10.

The electron transport region 17 may have a single-layered structure or a multi-layered structure.

For example, the electron transport region 17 may have an electron transport layer, an electron transport layer/electron injection layer structure, a buffer layer/electron transport layer structure, a hole blocking layer/electron transport layer structure, a buffer layer/electron transport layer/electron injection layer structure, or a hole blocking layer/electron transport layer/electron injection layer structure, but embodiments of the present disclosure are not limited thereto. The electron transport region 17 may further include an electron control layer.

The electron transport region 17 may include known electron transport materials.

The electron transport region (for example, a buffer layer, a hole blocking layer, an electron control layer, or an electron transport layer in the electron transport region) may include a metal-free compound containing at least one 7-electron-deficient nitrogen-containing cyclic group. The π-electron-deficient nitrogen-containing cyclic group is the same as described above.

In an embodiment, the electron transport region may include a compound represented by Formula 601 below.

$$[Ar_{601}]_{xe11}\text{-}[(L_{601})_{xe1}\text{-}R_{601}]_{xe21} \qquad \text{Formula 601}$$

In Formula 601, $Ar_{601}$ and $L_{601}$ are each independently a substituted or unsubstituted $C_5$-$C_{60}$ carbocyclic group or a substituted or unsubstituted $C_1$-$C_{60}$ heterocyclic group, xe11 is 1, 2, or 3, xe1 is an integer from 0 to 5, $R_{601}$ is a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—Si(Q_{601})(Q_{602})(Q_{603})$, $—C(=O)(Q_{601})$, $—S(=O)_2(Q_{601})$, or $—P(=O)(Q_{601})(Q_{602})$, $Q_{601}$ to $Q_{603}$ are each independently a $C_1$-$C_{10}$ alkyl group, a $C_1$-$C_{10}$ alkoxy group, a phenyl group, a biphenyl group, a terphenyl group, or a naphthyl group, and xe21 is an integer from 1 to 5.

In one embodiment, at least one of $Ar_{601}$(s) in the number of xe11 and $R_{601}$(s) in the number of xe21 may include the π-electron-deficient nitrogen-containing cyclic group.

In an embodiment, in Formula 601, ring $Ar_{601}$ and $L_{601}$ may each independently be a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, a benzoisoxazole group, a triazole group, a tetrazole group, an oxadiazole group, a triazine group, a thiadiazole group, an imidazopyridine group, an imidazopyrimidine group, or an azacarbazole group, each unsubstituted or substituted with at least one deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(=O)$_2$($Q_{31}$), —P(=O)($Q_{31}$)($Q_{32}$), or any combination thereof, wherein $Q_{31}$ to $Q_{33}$ may each independently be a $C_1$-$C_{10}$ alkyl group, a $C_1$-$C_{10}$ alkoxy group, a phenyl group, a biphenyl group, a terphenyl group, or a naphthyl group.

When xe11 in Formula 601 is 2 or more, two or more of $Ar_{601}$(s) may be bonded to each other via a single bond.

In one or more embodiments, $Ar_{601}$ in Formula 601 may be an anthracene group.

In one or more embodiments, a compound represented by Formula 601 may be represented by Formula 601-1 below:

Formula 601-1

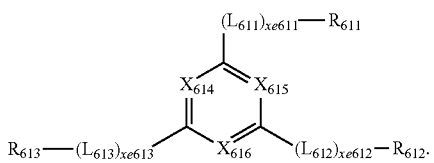

In Formula 601-1, $X_{614}$ may be N or C($R_{614}$), $X_{615}$ may be N or C($R_{615}$), $X_{616}$ may be N or C($R_{616}$), and at least one of X614 to X616 may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, or a naphthyl group.

In one or more embodiments, xe1 and xe611 to xe613 in Formulae 601 and 601-1 may each independently be 0, 1, or 2.

In one or more embodiments, $R_{601}$ and $R_{611}$ to $R_{613}$ in Formulae 601 and 601-1 are each independently: a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzoisothiazolyl group, a benzoxazolyl group, an isobenzoxazolyl group, a triazolyl group, a tetrazolyl group, an imidazopyridinyl group, an imidazopyrimidinyl group, or an azacarbazolyl group, each unsubstituted or substituted with at least one deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzoisothiazolyl group, a benzoxazolyl group, an isobenzoxazolyl group, a triazolyl group, a tetrazolyl group, an imidazopyridinyl group, an imidazopyrimidinyl group, an azacarbazolyl group, or any combination thereof;

—S(=O)$_2$($Q_{601}$) or —P(=O)($Q_{601}$)($Q_{602}$), wherein $Q_{601}$ and $Q_{602}$ are the same as described above.

The electron transport region may include at least one compound Compounds ET1 to ET36, but embodiments of the present disclosure are not limited thereto:

ET1

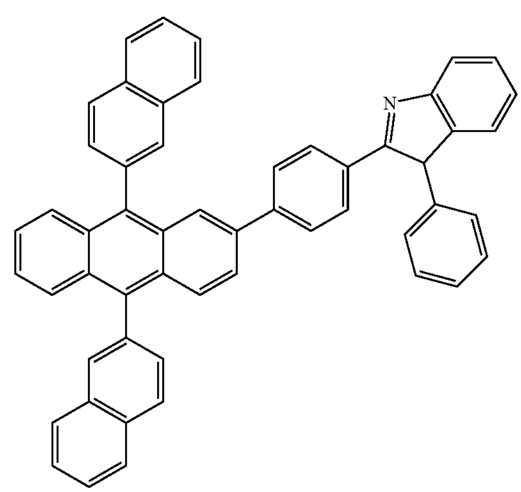

-continued
ET2
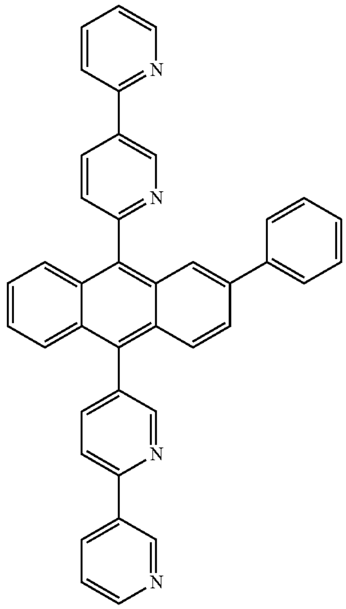
ET3
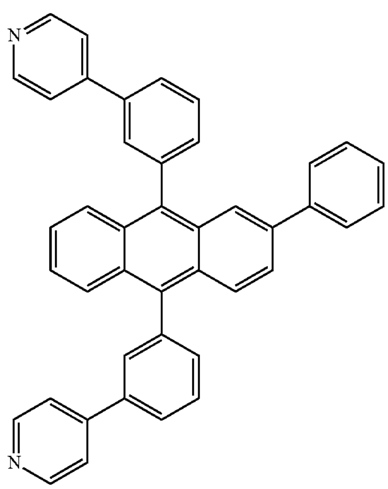
ET4
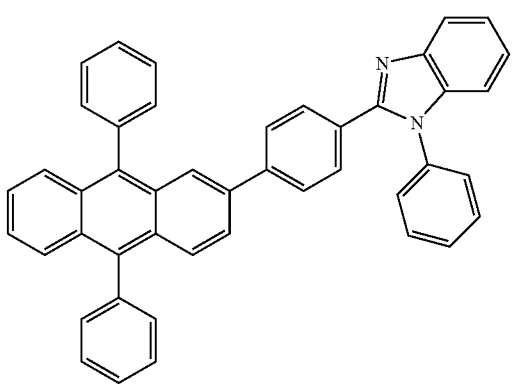
-continued
ET5
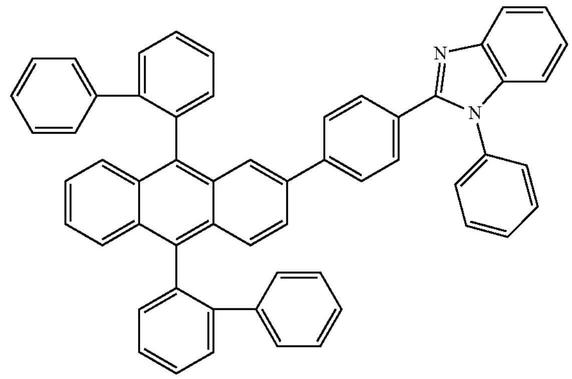
ET6
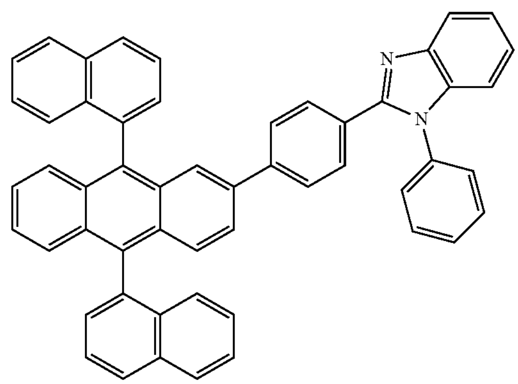
ET7
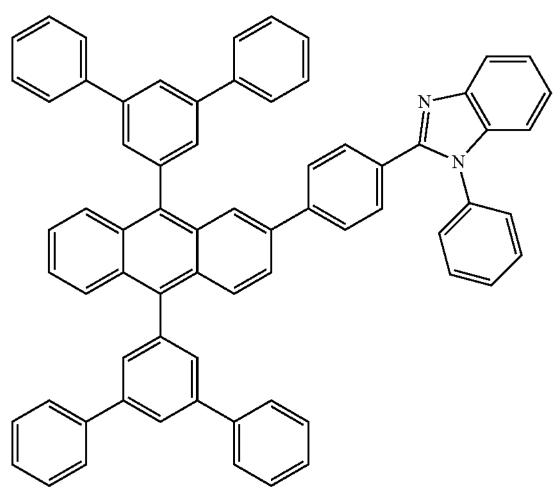

-continued
ET8
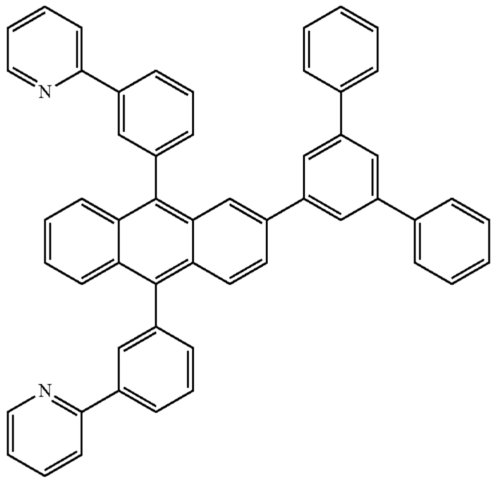
ET9
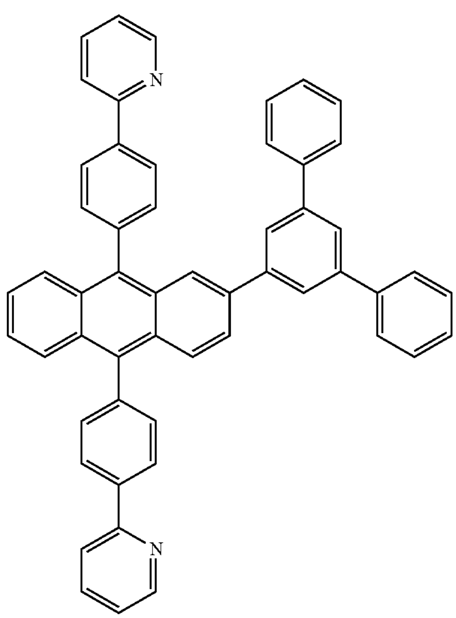
-continued
ET10
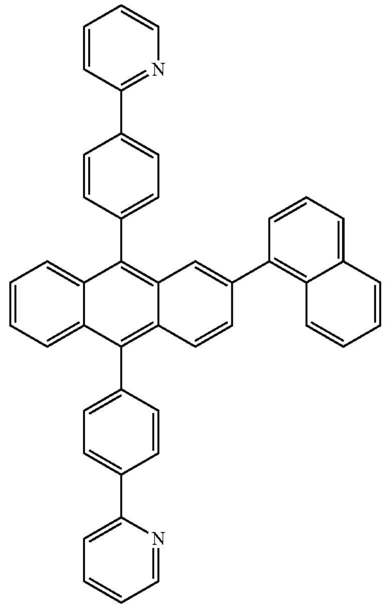
ET1
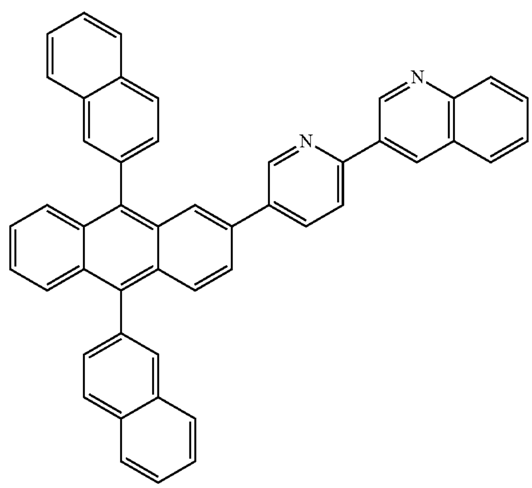
ET12
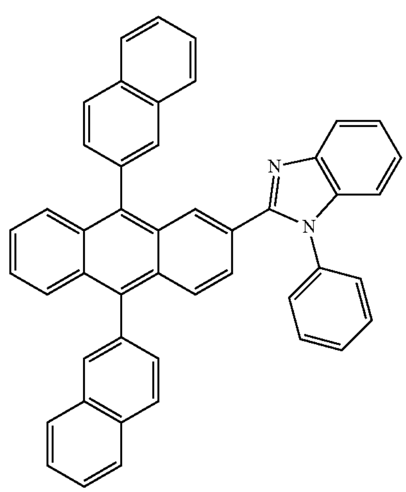

-continued
ET13
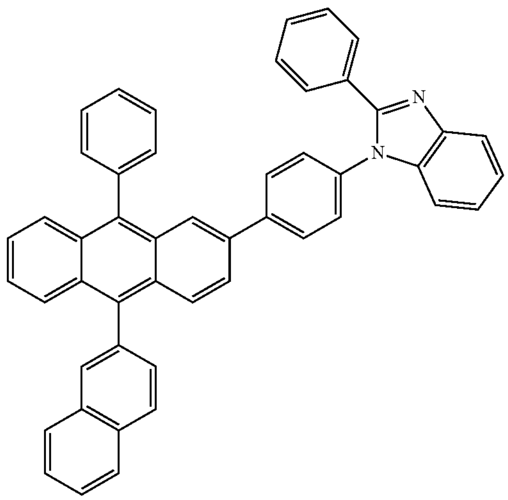
ET14
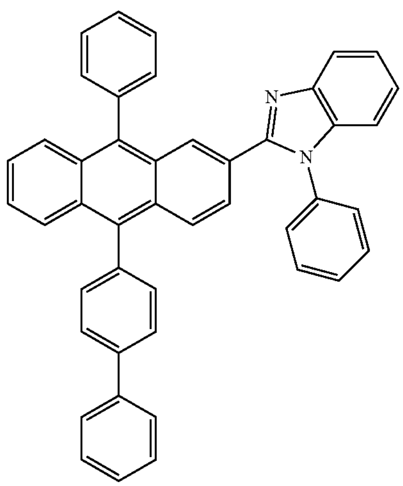
ET15
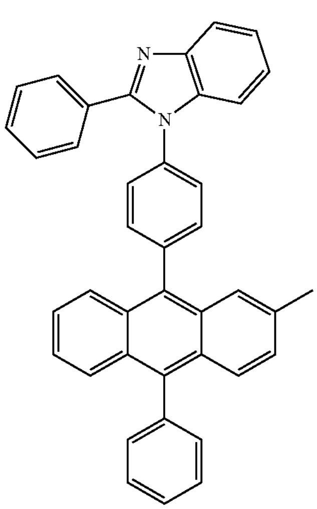
-continued
ET16
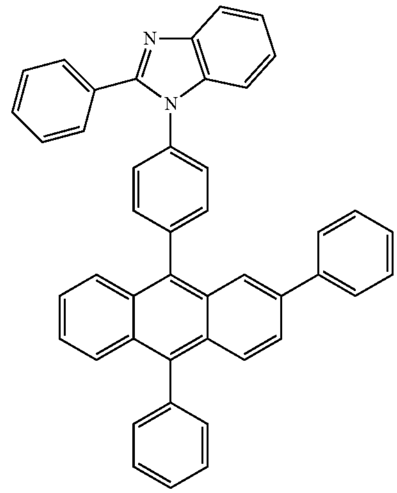
ET17
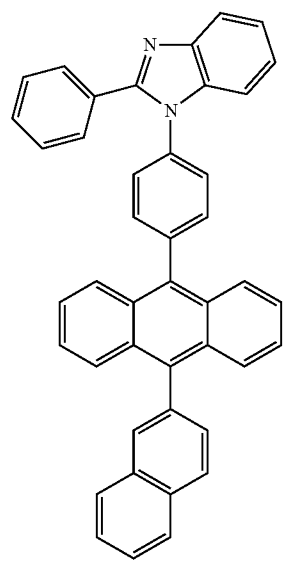
ET18
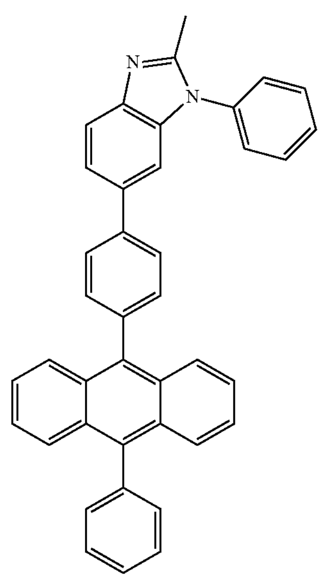

-continued
ET19
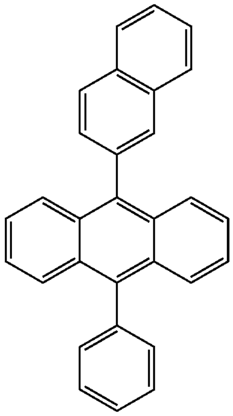
ET20
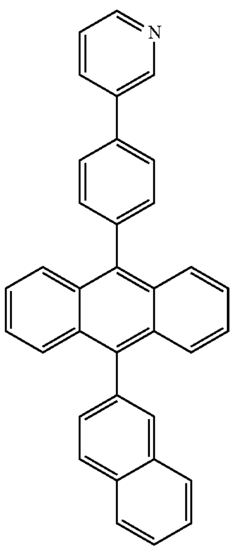
ET21
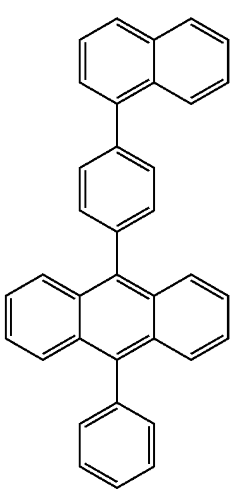
-continued
ET22
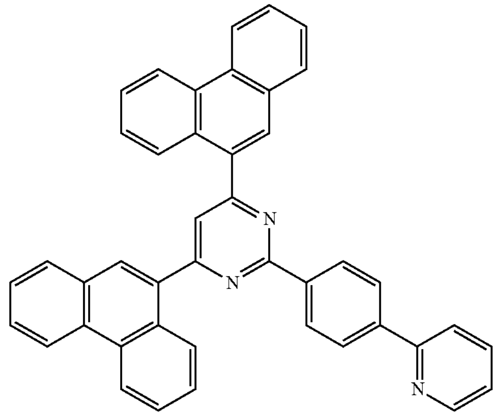
ET23
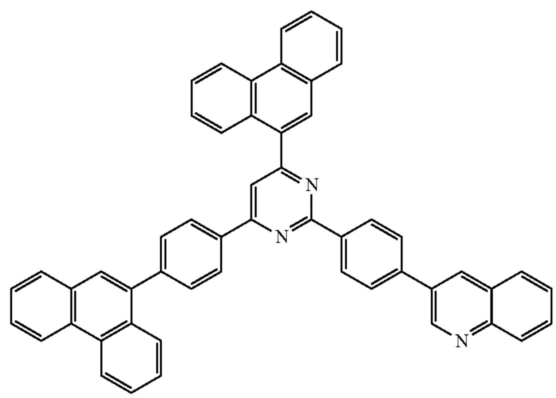
ET24
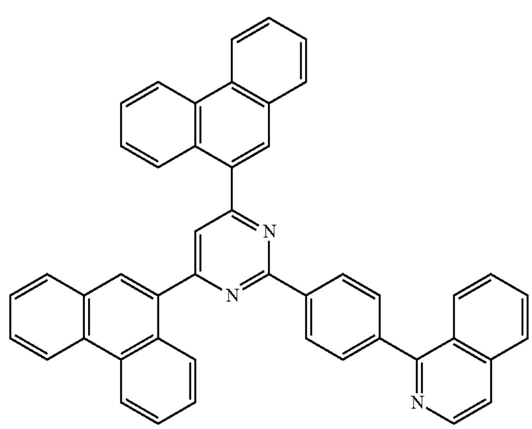

-continued
ET25
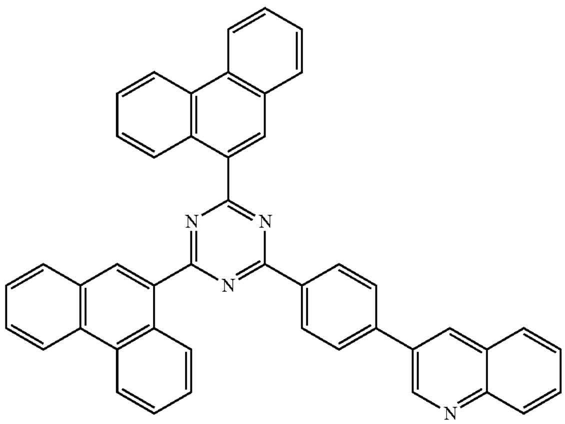
ET26
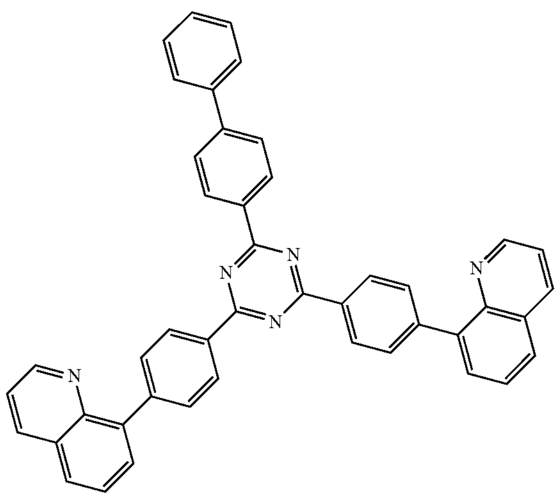
ET27
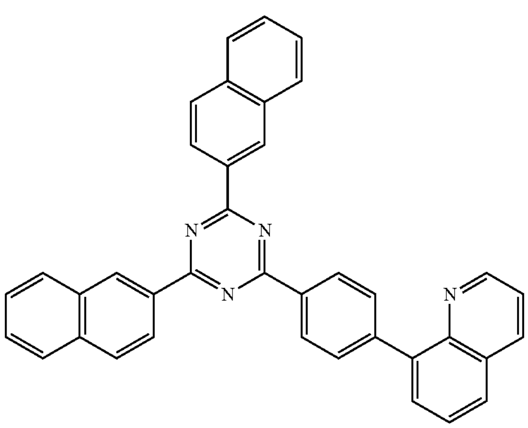
-continued
ET28
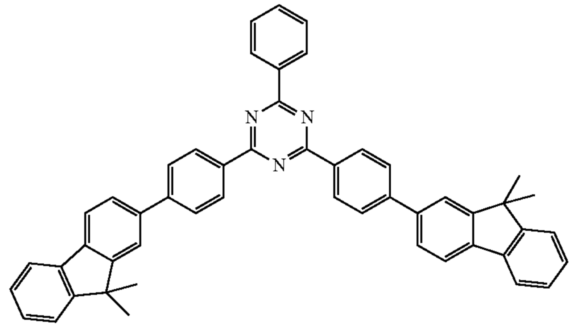
ET29
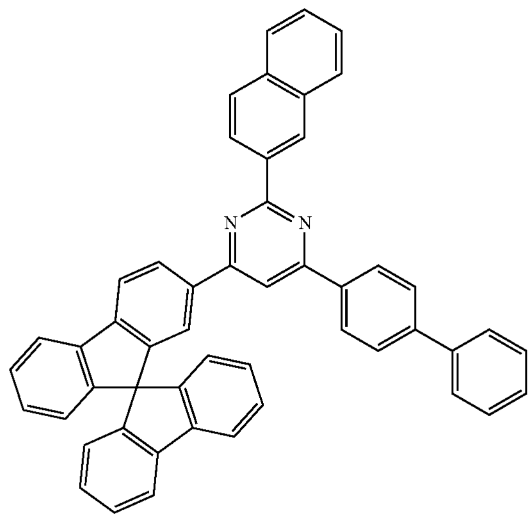
ET30
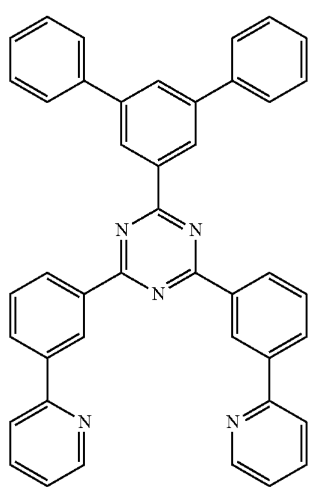

-continued
ET31
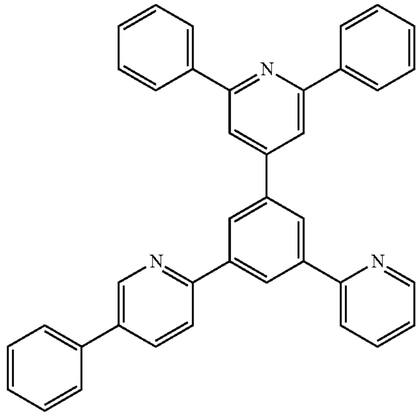
ET32
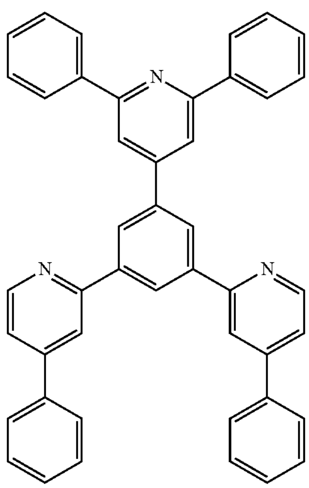
ET33
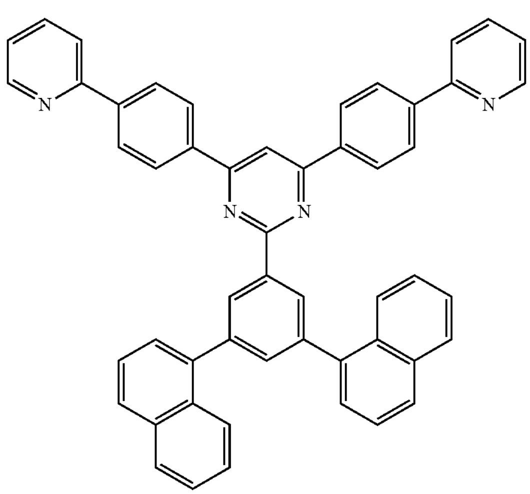
-continued
ET34
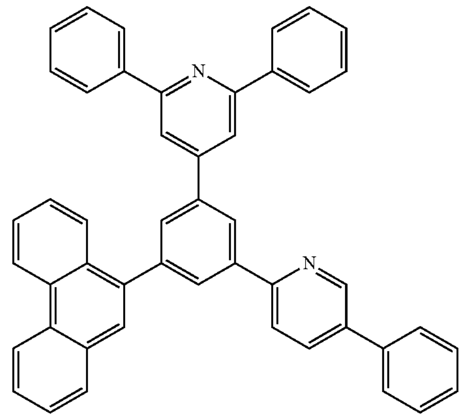
ET35
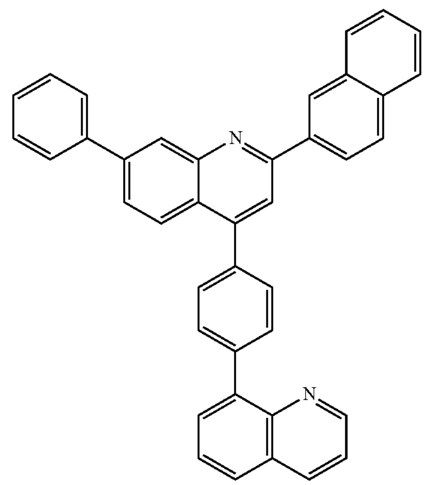
ET36
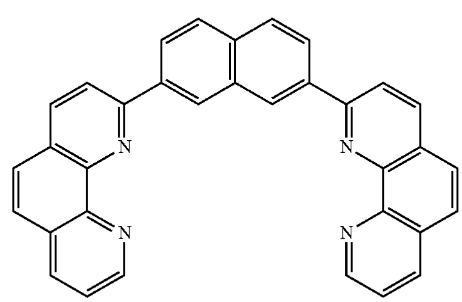
In one or more embodiments, the electron transport region may include at least one 2,9-dimethyl-4,7-diphenyl-1,10-phenanthroline (BCP), 4,7-dphenyl-1,10-phenanthroline (Bphen), $Alq_3$, BAlq, 3-(biphenyl-4-yl)-5-(4-tert-butylphenyl)-4-phenyl-4H-1,2,4-triazole (TAZ), NTAZ, or any combination thereof.

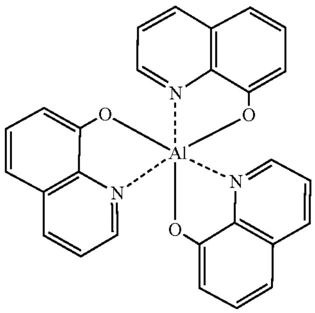

Alq3

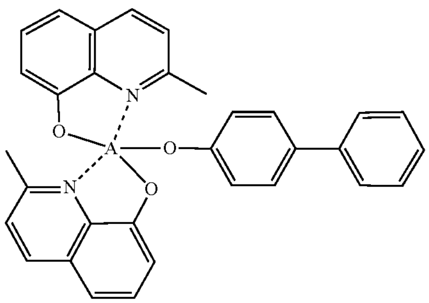

BAlq

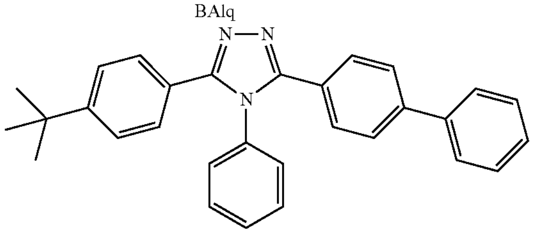

TAZ

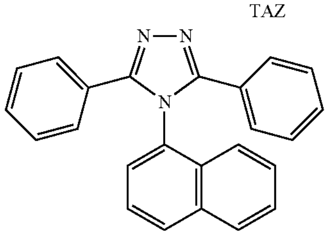

NTAZ

The thickness of the buffer layer, the hole blocking layer, and the electron control layer may each independently be in a range of about 20 Å to about 1,000 Å, for example, about 30 Å to about 300 Å. When the thicknesses of the buffer layer, the hole blocking layer, and the electron control layer are within these ranges, excellent hole blocking characteristics or excellent electron control characteristics may be obtained without a substantial increase in driving voltage.

A thickness of the electron transport layer may be in a range of about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

The electron transport region 17 (for example, the electron transport layer in the electron transport region) may further include, in addition to the materials described above, a metal-containing material.

The metal-containing material may include at least one of alkali metal complex, alkaline earth-metal complex, or any combination thereof. A metal ion of the alkali metal complex may be a Li ion, a Na ion, a K ion, a Rb ion, or a Cs ion, or a metal ion of the alkaline earth-metal complex may be a Be ion, a Mg ion, a Ca ion, a Sr ion, or a Ba ion. A ligand coordinated with the metal ion of the alkali metal complex or the alkaline earth-metal complex may be a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, and a cyclopentadiene, but embodiments of the present disclosure are not limited thereto.

In an embodiment, the metal-containing material may include a Li complex. The Li complex may include, for example, Compound ET-D1 (lithium quinolate, LiQ) or ET-D2:

ET-D1

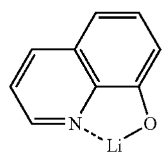

ET-D2

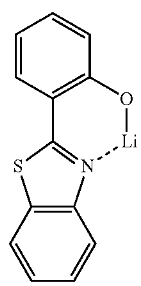

The electron transport region 17 may include an electron injection layer that facilitates the injection of electrons from the second electrode 19. The electron injection layer may be in direct contact with the second electrode 19.

The electron injection layer may have i) a single-layered structure consisting of a single layer consisting of a single material, ii) a single-layered structure consisting of a single layer consisting of a plurality of different materials, or iii) a multi-layered structure having a plurality of layers consisting of a plurality of different materials.

The electron injection layer may include an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combination thereof.

The alkali metal may be Li, Na, K, Rb, or Cs. In one embodiment, the alkali metal may be Li, Na, or Cs. In one or more embodiments, the alkali metal may be Li or Cs, but embodiments of the present disclosure are not limited thereto.

The alkaline earth metal may be Mg, Ca, Sr, or Ba.

The rare earth metal may be Sc, Y, Ce, Tb, Yb, or Gd.

The alkali metal compound, the alkaline earth-metal compound, and the rare earth metal compound may be an oxide or a halide (for example, fluorides, chlorides, bromides, or iodides) of the alkali metal, the alkaline earth-metal, or the rare earth metal.

The alkali metal compound may be an alkali metal oxide, such as $Li_2O$, $Cs_2O$, or $K_2O$, or an alkali metal halide, such as LiF, NaF, CsF, KF, LiI, NaI, CsI, or KI. In one embodiment, the alkali metal compound may be LiF, $Li_2O$, NaF, LiI, NaI, CsI, or KI, but embodiments of the present disclosure are not limited thereto.

The alkaline earth-metal compound may be an alkaline earth-metal oxide, such as BaO, SrO, CaO, $Ba_xSr_{1-x}O$ ($0<x<1$), or $Ba_xCa_{1-x}O$ ($0<x<1$). In one embodiment, the alkaline earth-metal compound may be BaO, SrO, or CaO, but embodiments of the present disclosure are not limited thereto.

The rare earth metal compound may be $YbF_3$, $ScF_3$, $ScO_3$, $Y_2O_3$, $Ce_2O_3$, $GdF_3$, or $TbF_3$. In one embodiment, the rare earth metal compound may be $YbF_3$, $ScF_3$, $TbF_3$, $YbI_3$, $ScI_3$, or $TbI_3$, but embodiments of the present disclosure are not limited thereto.

The alkali metal complex, the alkaline earth-metal complex, and the rare earth metal complex may include an ion of an alkali metal, an alkaline earth-metal, or a rare earth metal as described above, and a ligand coordinated with a metal ion of the alkali metal complex, the alkaline earth-metal complex, or the rare earth metal complex may be hydroxy quinoline, hydroxy isoquinoline, hydroxy benzoquinoline, hydroxy acridine, hydroxy phenanthridine, hydroxy phenyloxazole, hydroxy phenylthiazole, hydroxy diphenyloxadiazole, hydroxy diphenylthiadiazole, hydroxy phenylpyridine, hydroxy phenylbenzimidazole, hydroxy phenylbenzothiazole, bipyridine, phenanthroline, or cyclopentadiene, but embodiments of the present disclosure are not limited thereto.

The electron injection layer may include an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof, as described above. In one or more embodiments, the electron injection layer may further include the organic material. When the electron injection layer further includes an organic material, an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combination thereof may be homogeneously or non-homogeneously dispersed in a matrix including the organic material.

A thickness of the electron injection layer may be in a range of about 1 Å to about 100 Å, for example, about 3 Å to about 90 Å. When the thickness of the electron injection layer is within the range described above, the electron injection layer may have satisfactory electron injection characteristics without a substantial increase in driving voltage.

Second Electrode 19

The second electrode 19 is located on the organic layer 10A having such a structure. The second electrode 19 may be a cathode which is an electron injection electrode, and in this regard, a material for forming the second electrode 19 may be a metal, an alloy, an electrically conductive compound, and a combination thereof, which have a relatively low work function.

The second electrode 19 may include at least one of lithium (Li), silver (Ag), magnesium (Mg), aluminum (Al), aluminum-lithium (Al—Li), calcium (Ca), magnesium-indium (Mg—In), magnesium-silver (Mg—Ag), ITO, IZO, or any combination thereof, but embodiments of the present disclosure are not limited thereto. The second electrode 19 may be a transmissive electrode, a semi-transmissive electrode, or a reflective electrode.

The second electrode 19 may have a single-layered structure having a single layer or a multi-layered structure including two or more layers.

Hereinbefore, the organic light-emitting device has been described with reference to FIG. 1, but embodiments of the present disclosure are not limited thereto. Description of FIG. 2

Figure 2:
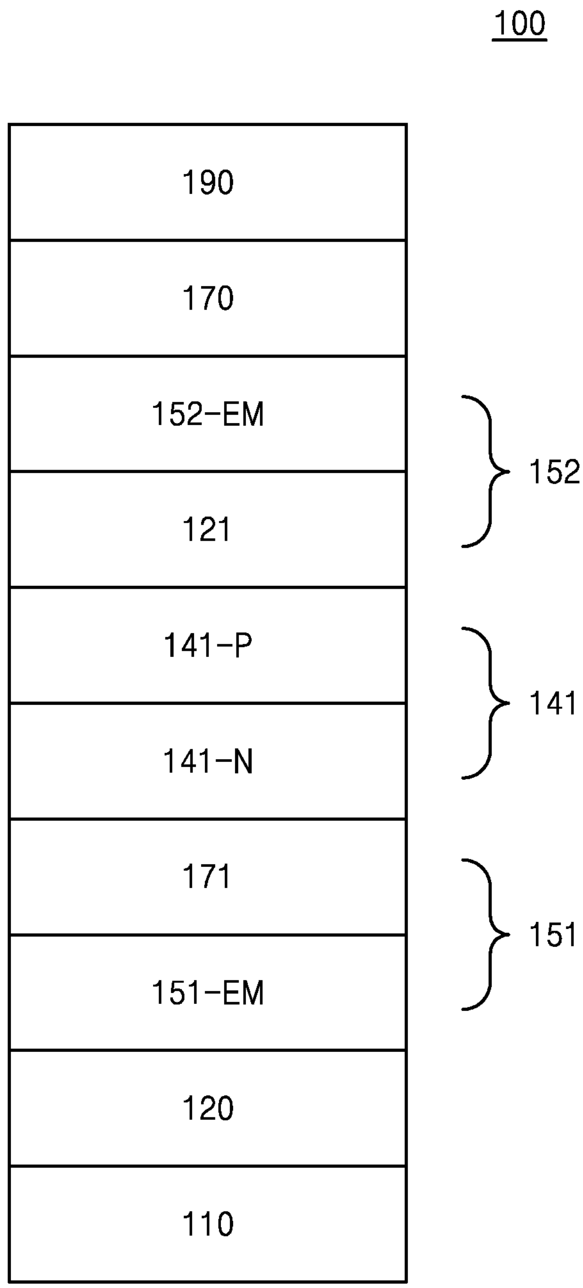
FIG. 2 is a schematic cross-sectional view of an organic light-emitting device according to another exemplary embodiment.

FIG. 2 is a schematic cross-sectional view of an organic light-emitting device 100 according to another exemplary embodiment.

The organic light-emitting device 100 of FIG. 2 includes a first electrode 110, a second electrode 190 facing the first electrode 110, and a first emission unit 151 and a second emission unit 152 between the first electrode 110 and the second electrode 190. A charge generation layer 141 is located between the first emission unit 151 and the second emission unit 152, and the charge generation layer 141 includes an n-type charge generation layer 141-N and a p-type charge generation layer 141-P. The charge generation layer 141 is a layer that generates charge and supplies the charge to neighboring emission units, and any known material may be used therefor.

The first emission unit 151 includes a first emission layer 151-EM, and the second emission unit 152 includes a second emission layer 152-EM. A maximum emission wavelength of light emitted from the first emission unit 151 may be different from a maximum emission wavelength of light emitted from the second emission unit 152. In an embodiment, the mixed light of the light emitted from the first emission unit 151 and the light emitted from the second emission unit 152 may be white light, but embodiments of the present disclosure are not limited thereto.

The hole transport region 120 is located between the first emission unit 151 and the first electrode 110, and the second emission unit 152 includes the first hole transport region 121 located on the side of the first electrode 110.

An electron transport region 170 is located between the second emission unit 152 and the second electrode 190, and the first emission unit 151 includes a first electron transport region 171 located between the charge generation layer 141 and the first emission layer 151-EM.

The first emission layer 151-EM is a thin film including a host, a sensitizer, and an emitter, the sensitizer includes a fourth-row transition metal of the Periodic Table of Elements, a fifth-row transition metal of the Periodic Table of Elements, a sixth-row transition metal of the Periodic Table of Elements, a lanthanide metal, an actinide metal, or any combination thereof, and a horizontal orientation ratio of the thin film may be greater than or equal to about 80%.

The second emission layer 152-EM is a thin film including a host, a sensitizer, and an emitter, the sensitizer includes a fourth-row transition metal of the Periodic Table of Elements, a fifth-row transition metal of the Periodic Table of Elements, a sixth-row transition metal of the Periodic Table of Elements, a lanthanide metal, an actinide metal, or any combination thereof, and a horizontal orientation ratio of the thin film may be greater than or equal to about 80%.

The first electrode 110 and the second electrode 190 illustrated in FIG. 2 may be the same as described in connection with the first electrode 11 and the second electrode 19 illustrated in FIG. 1.

The first emission layer 151-EM and the second emission layer 152-EM illustrated in FIG. 2 are each the same as described in connection with the emission layer 15 illustrated in FIG. 1.

The hole transport region 120 and the first hole transport region 121 illustrated in FIG. 2 are each the same as described in connection with the hole transport region 12 illustrated in FIG. 1.

The electron transport region 170 and the first electron transport region 171 illustrated in FIG. 2 are each the same as described in connection with the electron transport region 17 illustrated in FIG. 1.

Hereinbefore, referring to FIG. 2, although an organic light-emitting device including the first emission unit 151 and the second emission unit 152, each including an emission layer that includes a host, a sensitizer, and an emitter, has been described, one of the first emission unit 151 and the second emission unit 152 of the organic light-emitting device shown in FIG. 2 may be replaced with any known emission unit or may include three or more emission units, and various modifications are possible.

Figure 3:
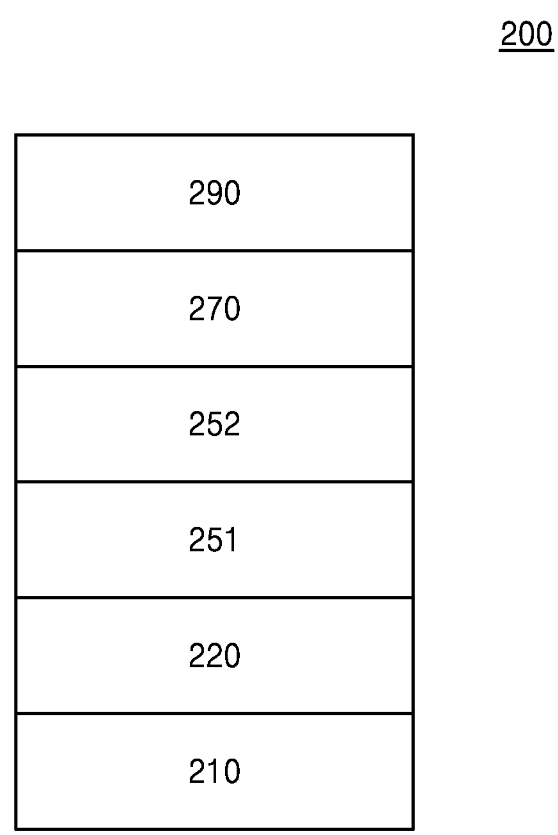
FIG. 3 is a schematic cross-sectional view of an organic light-emitting device according to another exemplary embodiment.

Description of FIG. 3

FIG. 3 is a schematic cross-sectional view of an organic light-emitting device 200 according to another exemplary embodiment.

The organic light-emitting device 200 includes a first electrode 210, a second electrode 290 facing the first electrode 210, and a first emission layer 251 and a second emission layer 252 which are stacked between the first electrode 210 and the second electrode 290.

A maximum emission wavelength of light emitted from the first emission layer 251 may be different from a maximum emission wavelength of light emitted from the second emission layer 252. In an embodiment, the mixed light of the light emitted from the first emission layer 251 and the light emitted from the second emission layer 252 may be white light, but embodiments of the present disclosure are not limited thereto.

Meanwhile, a hole transport region 220 may be located between the first emission layer 251 and the first electrode 210, and an electron transport region 270 may be located between the second emission layer 252 and the second electrode 290.

The first emission layer 251 is a thin film including a host, a sensitizer, and an emitter, the sensitizer includes a fourth-row transition metal of the Periodic Table of Elements, a fifth-row transition metal of the Periodic Table of Elements, a sixth-row transition metal of the Periodic Table of Elements, a lanthanide metal, an actinide metal, or any combination thereof, and a horizontal orientation ratio of the thin film may be greater than or equal to about 80%.

The second emission layer 252 is a thin film including a host, a sensitizer, and an emitter, the sensitizer includes a fourth-row transition metal of the Periodic Table of Elements, a fifth-row transition metal of the Periodic Table of Elements, a sixth-row transition metal of the Periodic Table of Elements, a lanthanide metal, an actinide metal, or any combination thereof, and a horizontal orientation ratio of the thin film may be greater than or equal to 80%.

The first electrode 210, the hole transport region 220, and the second electrode 290 illustrated in FIG. 3 are respectively the same as described in connection with the first electrode 11, the hole transport region 12, and the second electrode 19 illustrated in FIG. 1.

The first emission layer 251 and the second emission layer 252 illustrated in FIG. 3 are each the same as described in connection with the emission layer 15 illustrated in FIG. 1.

The electron transport region 270 illustrated in FIG. 3 may be the same as described in connection with the electron transport region 17 in FIG. 1.

Hereinbefore, referring to FIG. 3, although an organic light-emitting device including the first emission layer 251 and the second emission layer 252, each including a host, a sensitizer, and an emitter, as described in the present specification, has been described, one of the first emission layer 251 and the second emission layer 252 shown in FIG. 3 may be replaced with a known emission layer, may include three or more emission layers, or may further include an interlayer between neighboring emission layers, and various modifications are possible.

Explanation of Terms

The term "$C_1$-$C_{60}$ alkyl group" as used herein refers to a linear or branched saturated aliphatic hydrocarbon monovalent group having 1 to 60 carbon atoms, and examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_2$-$C_{60}$ alkenyl group" as used herein has a structure including at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein has a structure including at least one carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent monocyclic group having at least one heteroatom of N, O, P, Si, B, Se, Te, Ge, or any combination thereof, as a ring-forming atom and 1 to 10 carbon atoms, and examples thereof include a tetrahydrofuranyl group and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom N, O, P, Si, B, Se, Te, Ge, or any combination thereof, as a ring-forming atom, 1 to 10 carbon atoms, and at least one carbon-carbon double bond in its ring. Examples of the $C_1$-$C_{10}$ heterocycloalkenyl group include a 2,3-dihydrofuranyl group and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a heterocarbocyclic aromatic system that has at least one heteroatom of N, O, P, Si, B, Se, Te, Ge, or any combination thereof, as a ring-forming atom, and 1 to 60 carbon atoms. The term "$C_1$-$C_{60}$ heteroarylene group" as used herein refers to a divalent group having a carbocyclic aromatic system that has at least one heteroatom of N, O, P, Si, B, Se, Te, Ge, or any combination thereof, as a ring-forming atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group" as used herein refers to —$OA_{102}$ (wherein $A_{102}$ is the $C_6$-$C_{60}$ aryl group), and the term "$C_6$-$C_{60}$ arylthio group" as used herein refers to —$SA_{103}$ (wherein $A_{103}$ is the $C_6$-$C_{60}$ aryl group).

The term "monovalent non-aromatic condensed polycyclic group" used herein refers to a monovalent group in which two or more rings are condensed with each other, only carbon is used as a ring-forming atom (for example, the number of carbon atoms may be 8 to 60) and the whole molecule is a non-aromaticity group. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group having two or more rings condensed to each other, a heteroatom of N, O, P, Si, B, Se, Te, Ge, or any combination thereof, other than carbon atoms(for example, having 1 to 60 carbon atoms), as a ring-forming atom, and non-aromaticity in its entire molecular structure. Examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group, and may be a monovalent, divalent, trivalent, tetravalent, pentavalent, or hexavalent group, depending on the formula structure.

The term "$C_1$-$C_{30}$ heterocyclic group" as used herein refers to a saturated or unsaturated cyclic group having, as a ring-forming atom, at least one heteroatom of N, O, P, Si, B, Se, Te, Ge, or any combination thereof, other than 1 to 30 carbon atoms. The $C_1$-$C_{30}$ heterocyclic group may be a monocyclic group or a polycyclic group, and may be a monovalent, divalent, trivalent, tetravalent, pentavalent, or hexavalent group, depending on the formula structure.

In the present specification, a substituent is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, —$P(=O)(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), —P(═O)($Q_{28}$)($Q_{29}$), or any combination thereof; or —N($Q_{31}$)($Q_{32}$), —Si($Q_{33}$)($Q_{34}$)($Q_{35}$), —B($Q_{36}$)($Q_{37}$), or —P(═O)($Q_{38}$)($Q_{39}$), wherein $Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one of a $C_1$-$C_{60}$ alkyl group and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group.

The term "room temperature" used herein refers to a temperature of about 25° C.

The terms "a biphenyl group, a terphenyl group, and a tetraphenyl group" used herein respectively refer to monovalent groups in which two, three, or four phenyl groups which are linked together via a single bond.

The terms "a cyano-containing phenyl group, a cyano-containing biphenyl group, a cyano-containing terphenyl group, and a cyano-containing tetraphenyl group" used herein respectively refer to a phenyl group, a biphenyl group, a terphenyl group, and a tetraphenyl group, each of which is substituted with at least one cyano group. In "a cyano-containing phenyl group, a cyano-containing biphenyl group, a cyano-containing terphenyl group, and a cyano-containing tetraphenyl group", a cyano group may be substituted to any position of the corresponding group, and the "cyano-containing phenyl group, the cyano-containing biphenyl group, the cyano-containing terphenyl group, and the cyano-containing tetraphenyl group" may further include substituents other than a cyano group. For example, a phenyl group substituted with a cyano group, and a phenyl group substituted with a cyano group and a methyl group may all belong to "a cyano-containing phenyl group."

Hereinafter, a compound and an organic light-emitting device according to embodiments are described in detail with reference to Synthesis Examples and Examples. However, the organic light-emitting device is not limited thereto. The wording '*B' was used instead of 'A"' used in describing Synthesis Examples means that an amount of 'A' used was identical to an amount of 'B' used, in terms of a molar equivalent.

EXAMPLES

Compounds used in the Examples are as follows.

1) Host

HT1

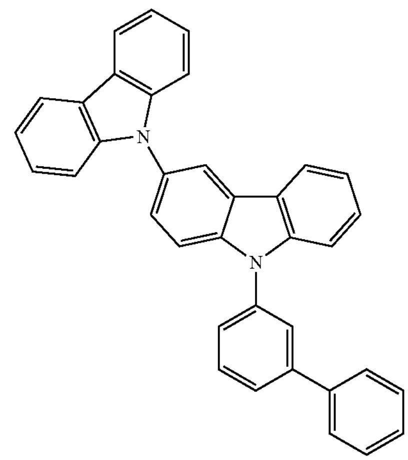

ET1

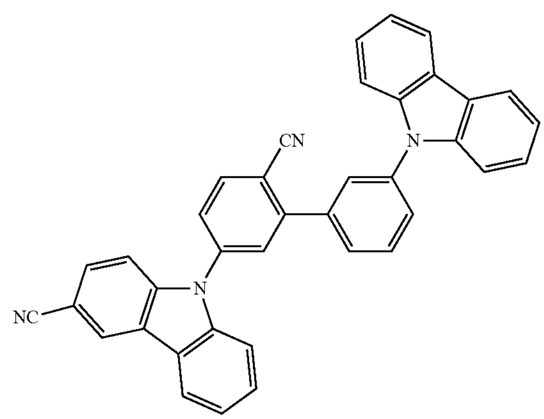

HT2

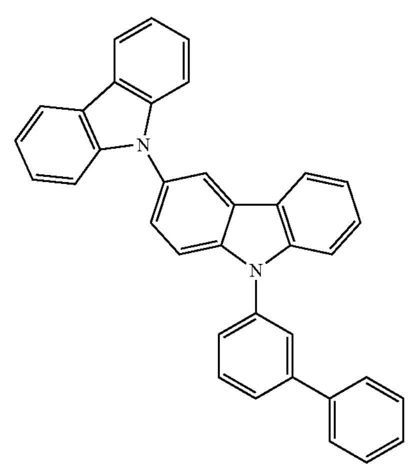

-continued
ET2
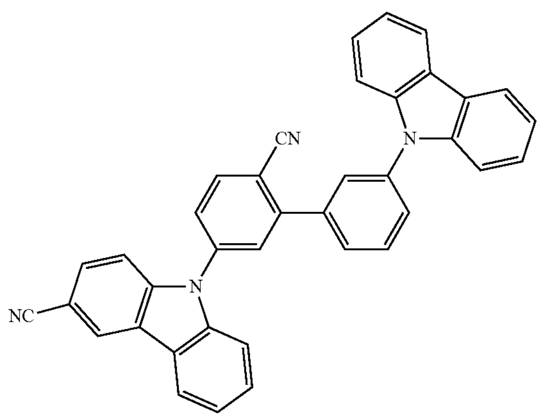
2) Sensitizer
S1
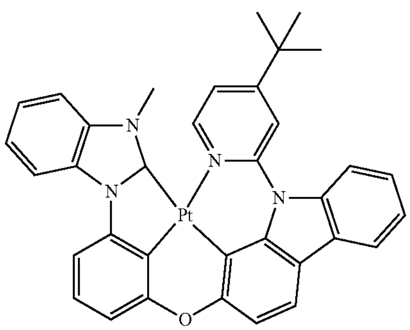
S2
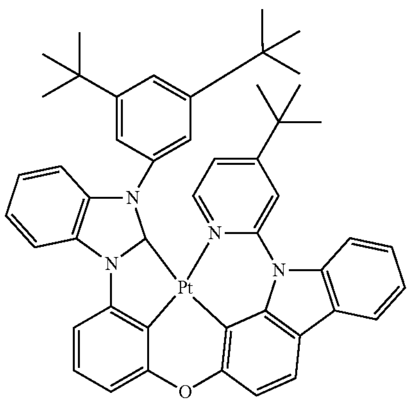
S3
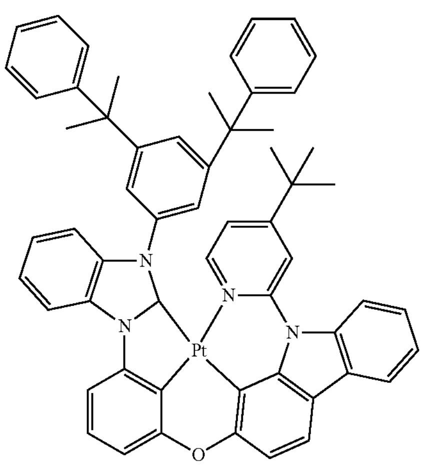
-continued
S4
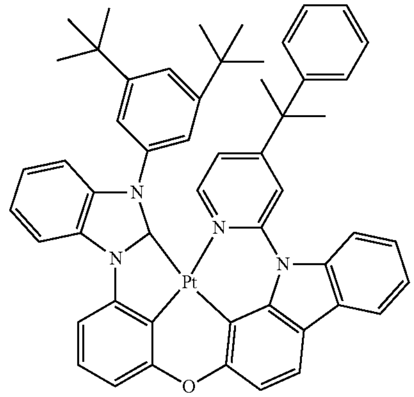
S5
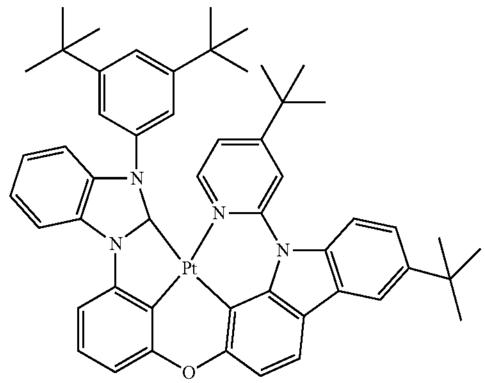
S6
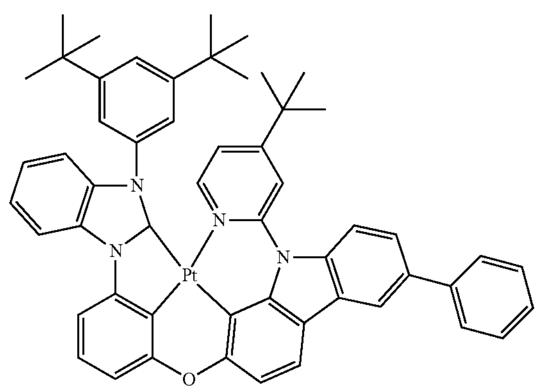
S7
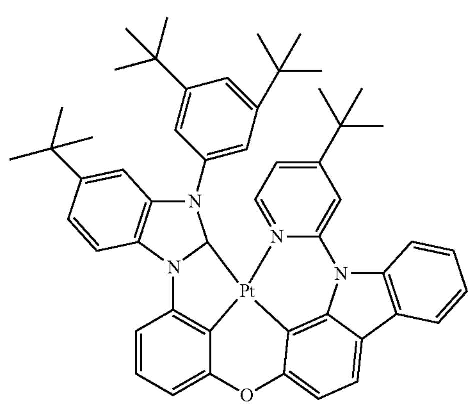

-continued
S8
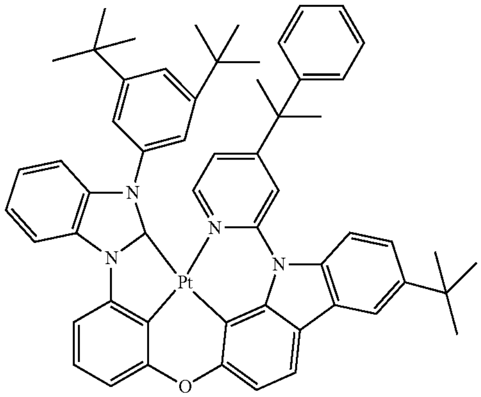
S9
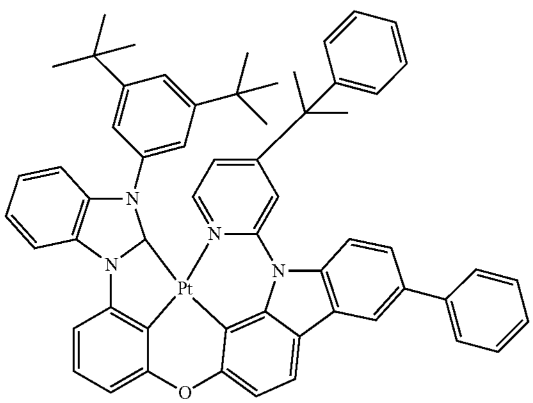
S10
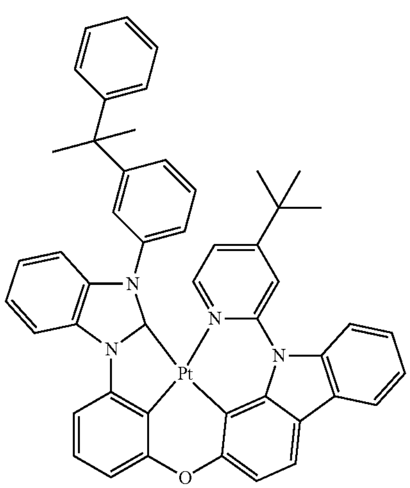
-continued
S11
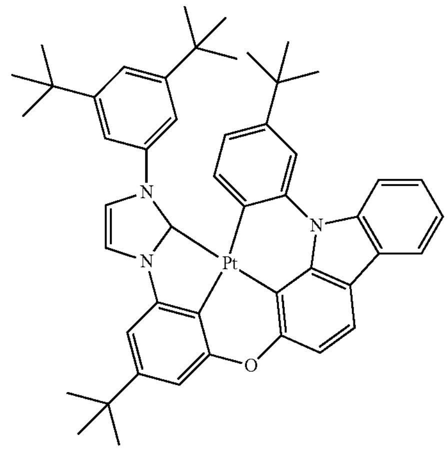
S12
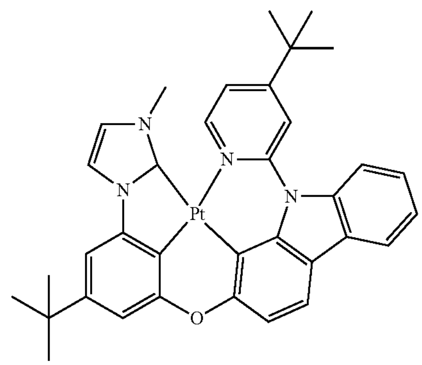
S13
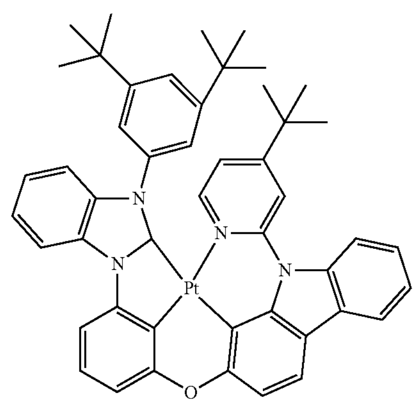
3) Emitter
E1
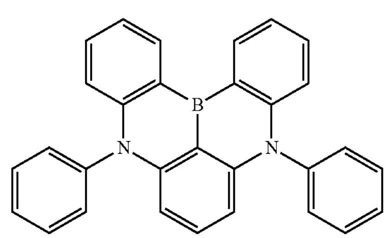

-continued

E2

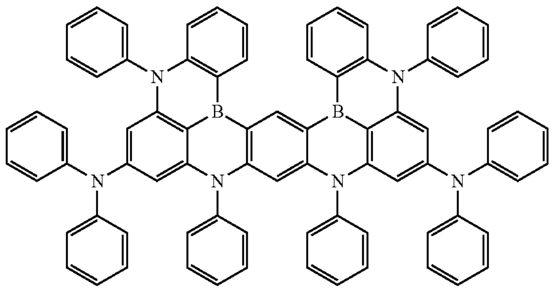

Evaluation Example 1: Horizontal Orientation Ratio

A host, a sensitizer, an emitter described in the following Table 7 were vacuum-deposited on a quartz substrate at a weight ratio shown in Table 7 at a vacuum pressure of $10^{-7}$ torr, to thereby manufacture samples having a thickness of 50 nm. With respect to the samples, Luxol-OLED/analyzer LOA-100 available from CoCoLink company was used to measure PL intensity for each angle in the range of 0° to 90°, an analyzer fitting program was used to determine horizontal orientation ratios obtained by assuming that a horizontal orientation ratio is 67% in a fully anisotropic case and a horizontal orientation ratio is 100% in a fully oriented case, and the horizontal orientation ratios are shown in the following Table 7. A host and a sensitizer described in the following Table 8 were vacuum-deposited on a quartz substrate at a weight ratio shown in Table 8 at a vacuum pressure of $10^{-7}$ torr, to thereby manufacture samples having a thickness of 50 nm. A horizontal orientation ratio was calculated in the same manner with respect to the samples, and results are shown in Table 8. Based on values shown in Tables 7 and 8, $\ominus_{H+S+E}/\ominus_{H+S}\times 100$ was calculated, and results are shown in Table 9.

TABLE 7

| Sample No. | First host | Second host | Sensitizer | Emitter | Weight ratio (first host:second host:sensitizer:emitter) | Horizontal orientation ratio (%) |
|---|---|---|---|---|---|---|
| Sample 1 | HT2 | ET2 | S2 | E2 | 44.75:44.75:10:0.5 | 93 |
| Sample 2 | HT2 | ET2 | S1 | E2 | 44.75:44.75:10:0.5 | 92 |
| Sample 3 | HT2 | ET2 | S3 | E2 | 44.75:44.75:10:0.5 | 93 |
| Sample 4 | HT2 | ET2 | S4 | E2 | 44.75:44.75:10:0.5 | 94 |
| Sample 5 | HT2 | ET2 | S5 | E2 | 44.75:44.75:10:0.5 | 92 |
| Sample 6 | HT2 | ET2 | S6 | E2 | 44.75:44.75:10:0.5 | 92 |
| Sample 7 | HT2 | ET2 | S7 | E2 | 44.75:44.75:10:0.5 | 91 |
| Sample 8 | HT2 | ET2 | S8 | E2 | 44.75:44.75:10:0.5 | 93 |
| Sample 9 | HT2 | ET2 | S9 | E2 | 44.75:44.75:10:0.5 | 93 |
| Sample 10 | HT2 | ET2 | S10 | E2 | 44.75:44.75:10:0.5 | 93 |
| Sample 11 | HT2 | ET2 | S11 | E2 | 44.75:44.75:10:0.5 | 92 |
| Sample 12 | HT2 | ET2 | S12 | E2 | 44.75:44.75:10:0.5 | 93 |
| Sample 13 | HT2 | ET2 | S13 | E2 | 44.75:44.75:10:0.5 | 91 |
| Comparative Sample 1 | HT2 | ET2 | S1 | E1 | 44.75:44.75:10:0.5 | 66 |

TABLE 8

| Sample No. | First host | Second host | Sensitizer | Weight ratio (host:sensitizer) | Horizontal Orientation ratio (%) |
|---|---|---|---|---|---|
| Sample 1A | HT2 | ET2 | S2 | 44.75:44.75:10 | 80 |
| Sample 2A | HT2 | ET2 | S1 | 44.75:44.75:10 | 68 |
| Sample 3A | HT2 | ET2 | S3 | 44.75:44.75:10 | 75 |
| Sample 4A | HT2 | ET2 | S4 | 44.75:44.75:10 | 80 |
| Sample 5A | HT2 | ET2 | S5 | 44.75:44.75:10 | 79 |
| Sample 6A | HT2 | ET2 | S6 | 44.75:44.75:10 | 82 |
| Sample 7A | HT2 | ET2 | S7 | 44.75:44.75:10 | 81 |
| Sample 8A | HT2 | ET2 | S8 | 44.75:44.75:10 | 75 |
| Sample 9A | HT2 | ET2 | S9 | 44.75:44.75:10 | 71 |
| Sample 10A | HT2 | ET2 | S10 | 44.75:44.75:10 | 81 |
| Sample 11A | HT2 | ET2 | S11 | 44.75:44.75:10 | 71 |
| Sample 12A | HT2 | ET2 | S12 | 44.75:44.75:10 | 82 |
| Sample 13A | HT2 | ET2 | S13 | 44.75:44.75:10 | 82 |

TABLE 9

| $\ominus_{H+S+E}$ sample No. | $\ominus_{H+S}$ sample No. | Ratio of Horizontal orientation ratio ($\ominus_{H+E}/\ominus_{H+S}\times$ 100) (%) |
|---|---|---|
| Sample 1 | Sample 1A | 116 |
| Sample 2 | Sample 2A | 135 |
| Sample 3 | Sample 3A | 124 |
| Sample 4 | Sample 4A | 118 |
| Sample 5 | Sample 5A | 116 |
| Sample 6 | Sample 6A | 112 |
| Sample 7 | Sample 7A | 112 |
| Sample 8 | Sample 8A | 124 |
| Sample 9 | Sample 9A | 131 |
| Sample 10 | Sample 10A | 115 |
| Sample 11 | Sample 11A | 130 |
| Sample 12 | Sample 12A | 113 |
| Sample 13 | Sample 13A | 111 |
| Comparative Sample 1 | Sample 1A | 83 |

Referring to Table 9, it was confirmed that a horizontal orientation ratio of a sample including an emitter is improved, a rate of increase of each of the horizontal orientation ratios of Samples 1 to 13 are relatively high, and the ratio of the horizontal orientation ratios are at least 109% or more.

Evaluation Example 2: SOI

With respect to the sensitizer and the emitter used in Evaluation Example 1, SOI constant (J) was calculated from Equation 1, and results are shown in Table 10.

$$J = \int_0^\infty F_D(\lambda)\varepsilon_A(\lambda)\lambda^4 d\lambda \quad \text{Equation 1}$$

In Equation 1,

λ is an emission wavelength (nm), $F_D(\lambda)$ is an emission spectrum of the sensitizer, and $\varepsilon_A(\lambda)$ is an extinction coefficient spectrum of the emitter.

TABLE 10

| Sample No. | Sensitizer | Emitter | J |
|---|---|---|---|
| Sample 1B | S2 | E2 | 4.56 × 1014 |
| Sample 2B | S1 | E2 | 5.41 × 1014 |
| Sample 3B | S3 | E2 | 4.23 × 1014 |
| Sample 4B | S4 | E2 | 4.41 × 1014 |
| Sample 5B | S5 | E2 | 4.13 × 1014 |
| Sample 6B | S6 | E2 | 4.494 × 1014 |
| Sample 7B | S7 | E2 | 4.73 × 1014 |
| Sample 8B | S8 | E2 | 4.59 × 1014 |
| Sample 9B | S9 | E2 | 5.58 × 1014 |
| Sample 10B | S10 | E2 | 4.20 × 1014 |
| Sample 11B | S11 | E2 | 4.79 × 1014 |
| Sample 12B | S12 | E2 | 4.89 × 1014 |
| Sample 13B | S13 | E2 | 4.94 × 1014 |
| Comparative Sample 1B | S1 | E1 | 5.14 × 1013 |

Example 1

A glass substrate with a 50 nm-thick of ITO electrode pattern was ultrasonically cleaned in acetone, isopropyl alcohol, and pure water for 15 minutes each, and then cleaned by exposure of UV ozone thereto for 30 minutes.

Subsequently, N,N'-diphenyl-N,N'-bis-[4-(phenyl-m-tolyl-amino)-phenyl]-biphenyl-4,4'-diamine (DNTPD) was deposited to a thickness of 40 nm, N,N,N'N'-tetra[(1,10-biphenyl)-4-yl]-(1,10-biphenyl)-4,4'-diamine (BPBPA) was deposited to a thickness of 10 nm, and 3,3-di(9H-carbazol-9-yl)biphenyl (mCBP) was deposited to a thickness of 10 nm, on the ITO electrode (anode) of the glass substrate in this stated order.

Next, a host, a sensitizer, and an emitter shown in Table 9 were co-deposited at a ratio described in Table 11 to thereby form an emission layer having a thickness of 50 nm.

On the emission layer, 2,8-bis(4,6-diphenyl-1,3,5-triazin-2-yl)dibenzo[b,d]thiophene (DBFTrz) was deposited to a thickness of 5 nm, 9,10-di(naphthalene-2-yl)anthracen-2-yl-(4,1-phenylene)(1-phenyl-1Hbenzo[d]imidazole (ZADN) was deposited to a thickness of 20 nm, LiF was deposited to a thickness of 1.5 nm, and Al was deposited to a thickness of 200 nm, to thereby complete the manufacture of an organic light-emitting device having a structure of ITO (50 nm)/DNTPD (40 nm)/BPBPA (10 nm)/mCBP (10 nm)/emission layer (30 nm)/DBFTrz (5 nm)/ZADN (20 nm)/LiF (1.5 nm)/Al (200 nm).

Example 2 to 13 and Comparative Example 1

Organic light-emitting devices were manufactured in the same manner as in Example 1, except that a corresponding host, a corresponding sensitizer, and a corresponding emitter were used as shown in Table 11 in forming an emission layer.

Evaluation Example 3: Measurement on Lifespan and External Quantum Efficiency of OLED With respect to each of the organic light-emitting devices manufactured in Examples 1 to 13, external quantum efficiency (EQE) and lifespan were evaluated and calculated as a relative value (%) and results thereof are shown in Table 11. A luminance meter (Minolta Cs-1000A) was used as an evaluation apparatus. Lifespan ($T_{95}$) was determined by evaluating the time that is taken for luminance to become 95% compared to the initial luminance of 100%, under the same luminance measurement conditions.

TABLE 11

| No. | Emission layer composition | External quantum efficiency (%) | Lifespan ($T_{95}$) (time) |
|---|---|---|---|
| Example 1 | Same as Sample 1 | 126% | 164% |
| Example 2 | Same as Sample 2 | 155% | 415% |
| Example 3 | Same as Sample 3 | 125% | 192% |
| Example 4 | Same as Sample 4 | 117% | 150% |
| Example 5 | Same as Sample 5 | 116% | 111% |
| Example 6 | Same as Sample 6 | 111% | 184% |
| Example 7 | Same as Sample 7 | 117% | 124% |
| Example 8 | Same as Sample 8 | 160% | 196% |
| Example 9 | Same as Sample 9 | 163% | 532% |
| Example 10 | Same as Sample 10 | 114% | 118% |
| Example 11 | Same as Sample 11 | 166% | 450% |
| Example 12 | Same as Sample 12 | 115% | 147% |
| Example 13 | Same as Sample 13 | 116% | 186% |
| Comparative Example 1 | Comparative Sample 1 | 87% | 23% |

From Table 11, it was confirmed that the organic light-emitting devices of Examples 1 to 13 have improved efficiency and improved lifespan compared to the organic light-emitting device of Comparative Example 1.

Figure 4:
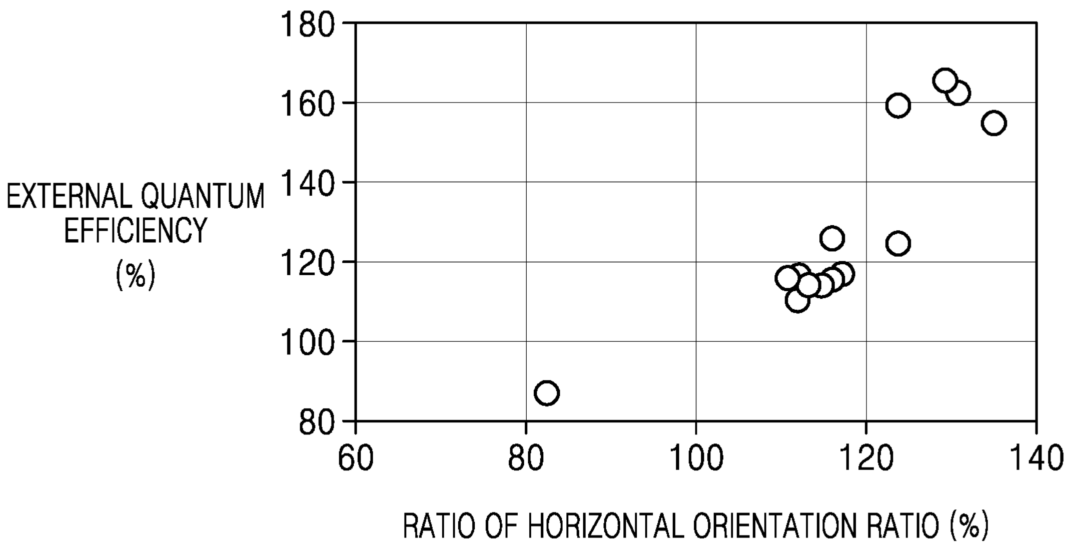
FIG. 4 is a graph of a correlation between a change in a horizontal orientation ratio and an external quantum efficiency, according to an absence/presence of emitter.
Figure 5:
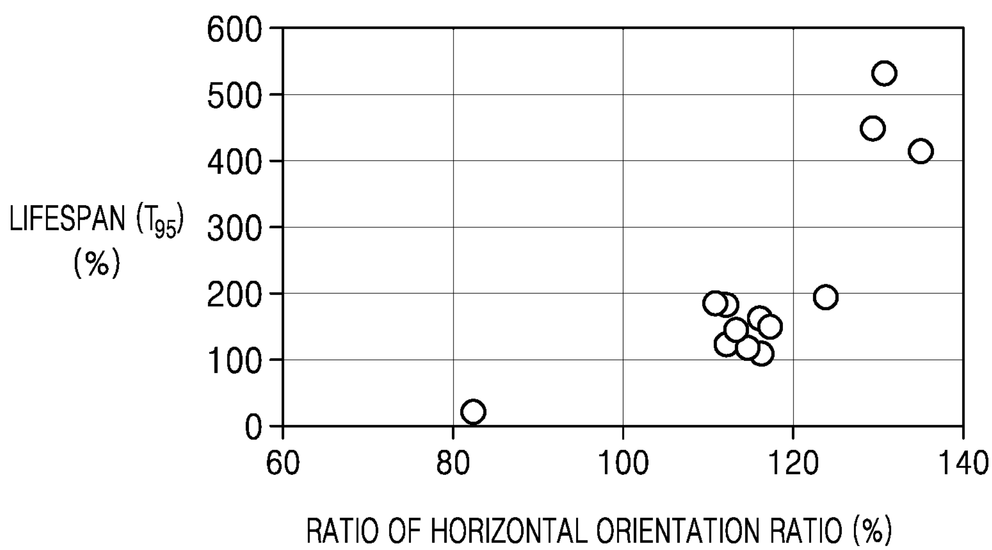
FIG. 5 is a graph of a correlation between a change in a horizontal orientation ratio and a lifespan, according to an absence/presence of an emitter.

Evaluation Example 4: Correlation Between Change in Horizontal Orientation Ratio and External Quantum Efficiency and Lifespan A correlation between a change in a horizontal orientation ratio and external quantum efficiency, according to an absence/presence of emitter, is illustrated in FIG. 4. A correlation between a change in a horizontal orientation ratio and lifespan, according to an absence/presence of emitter, is illustrated in FIG. 5. In this case, the correlation between a change in a horizontal orientation ratio and external quantum efficiency and the correlation between a change in a horizontal orientation ratio and lifespan were derived based on data (see Table 11) about external quantum efficiency and lifespan obtained from Examples 1 to 13 and Comparative Example 1 and data (see Table 9) about ratios of horizontal orientation ratio of samples corresponding to composition of emission layers used in Examples 1 to 13 and Comparative Example 1.

From FIGS. 4 and 5, it may be confirmed that when the ratio of horizontal orientation ratio is greater than about 109%, a degree of improvement in lifespan and efficiency of an organic light-emitting device is apparent.

The organic light-emitting device may have improved efficiency and/or improved lifespan.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An organic light-emitting device comprising:

a first electrode; a second electrode; and an organic layer between the first electrode and the second electrode, wherein the organic layer comprises an emission layer, the emission layer comprises a host, a sensitizer, and an emitter, wherein the content of the sensitizer is 5 to 50% by weight, the sensitizer comprises a fourth-row transition metal of the Periodic Table of Elements, a fifth-row transition metal of the Periodic Table of Elements, a sixth-row transition metal of the Periodic Table of Elements, a lanthanide metal, an actinide metal, or any combination thereof, and the emission layer satisfies Condition 1 below:

$$\Theta_{H+S+E}/\Theta_{H+S}\times 100>\text{about } 109(\%) \qquad \text{Condition 1}$$

wherein, in Condition 1, $\Theta_{H+S+E}$ is a horizontal orientation ratio of the emission layer, and $\Theta_{H+S}$ is a horizontal orientation ratio of a thin film consisting of the host and the sensitizer included in the emission layer.

2. The organic light-emitting device of claim 1, wherein $\Theta_{H+S+E}/\Theta_{H+S}\times 100$ is less than or equal to about 140%.

3. The organic light-emitting device of claim 1, wherein $\Theta_{H+S+E}$ is greater than or equal to about 80%.

4. The organic light-emitting device of claim 1, wherein the emitter is a condensed cyclic compound represented by Formula 1:

Formula 1

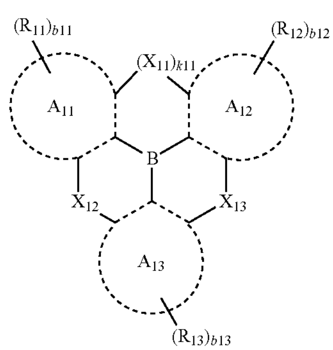

wherein, in Formula 1, $X_{11}$ is $NR_{14}$ or O, $X_{12}$ is $NR_{15}$ or O, $X_{13}$ is $NR_{16}$ or O, k11 is 0 or 1, wherein, when k11 is 0, $(X_{11})_{k11}$ does not exist, $A_{11}$ to $A_{13}$ are each independently a $C_5$-$C_{30}$ carbocyclic group or a $C_1$-$C_{30}$ heterocyclic group, $R_{11}$ to $R_{16}$ are each independently hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$C(Q_1)(Q_2)(Q_3)$, —$Si(Q_1)(Q_2)(Q_3)$, —$B(Q_1)(Q_2)$, —$N(Q_1)(Q_2)$, —$P(Q_1)(Q_2)$, —$C(=O)(Q_1)$, —$S(=O)(Q_1)$, —$S(=O)_2(Q_1)$, —$P(=O)(Q_1)(Q_2)$, or —$P(=S)(Q_1)(Q_2)$, wherein at least one of $R_{11}$ to $R_{13}$ is not hydrogen, b11 to b13 are each independently an integer from 0 to 10, and $Q_1$ to $Q_3$ are each independently hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group that is substituted with at least one of deuterium, —F, a cyano group, a $C_1$-$C_{60}$ alkyl group, a $C_6$-$C_{60}$ aryl group, or any combination thereof, or a $C_6$-$C_{60}$ aryl group that is substituted with at least one of deuterium, —F, a cyano group, a $C_1$-$C_{60}$ alkyl group, a $C_6$-$C_{60}$ aryl group, or any combination thereof.

5. The organic light-emitting device of claim 4, wherein at least one of $R_{11}$ to $R_{13}$ is a $C_1$-$C_{60}$ alkyl group, —$C(Q_1)(Q_2)(Q_3)$, or —$N(Q_1)(Q_2)$, and $Q_1$ to $Q_3$ are each independently a $C_1$-$C_{60}$ alkyl group, a $C_6$-$C_{60}$ aryl group, a $C_7$-$C_{60}$ alkyl aryl group, a $C_1$-$C_{60}$ alkyl group that is substituted with at least one deuterium, —F, a cyano group, a $C_1$-$C_{60}$ alkyl group, and a $C_6$-$C_{60}$ aryl group, or a $C_6$-$C_{60}$ aryl group that is substituted with at least one of a deuterium, —F, a cyano group, a $C_1$-$C_{60}$ alkyl group, a $C_6$-$C_{60}$ aryl group, or any combination thereof.

6. The organic light-emitting device of claim 4, wherein k11 is 0.

7. The organic light-emitting device of claim 4, wherein $A_{11}$ to $A_{13}$ are each independently a group represented by Formula 10A below, a benzene group, a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, or a perylene group, Formula 10A

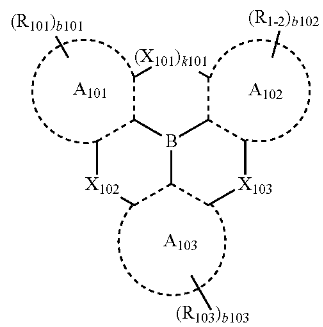

wherein, in Formula 10A, $X_{101}$ is $NR_{104}$ or O, $X_{102}$ is $NR_{105}$ or O, $X_{103}$ is $NR_{106}$ or O, k101 is 0 or 1, wherein, when k101 is 0, $(X_{101})_{k101}$ does not exist, $A_{101}$ to $A_{103}$ are each independently a benzene group, a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, or a perylene group, $R_{101}$ to $R_{106}$ are each independently hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —C($Q_1$)($Q_2$)($Q_3$), —Si($Q_1$)($Q_2$)($Q_3$), —B($Q_1$)($Q_2$), —N($Q_1$)($Q_2$), —P($Q_1$)($Q_2$), —C(═O)($Q_1$), —S(═O)($Q_1$), —S(═O)$_2$($Q_1$), —P(═O)($Q_1$)($Q_2$), or —P(═S)($Q_1$)($Q_2$), b101 to b103 are each independently an integer from 0 to 10, and $Q_1$ to $Q_3$ are each independently hydrogen, deuterium, —F, —CL, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group that is substituted with at least one deuterium, —F, a cyano group, a $C_1$-$C_{60}$ alkyl group, a $C_6$-$C_{60}$ aryl group, or any combination thereof, or a $C_6$-$C_{60}$ aryl group that is substituted with at least one deuterium, —F, a cyano group, a $C_1$-$C_{60}$ alkyl group, a $C_6$-$C_{60}$ aryl group, or any combination thereof.

8. The organic light-emitting device of claim 7, wherein $A_{11}$ and $A_{13}$ are each independently a benzene group, a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, or a perylene group, and Au is a group represented by Formula 10A, or $A_{11}$ to $A_{13}$ are each independently a benzene group, a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, or a perylene group.

9. The organic light-emitting device of claim 1, wherein the emitter is a condensed cyclic compound represented by Formula 1-1 or 1-2:

1-1

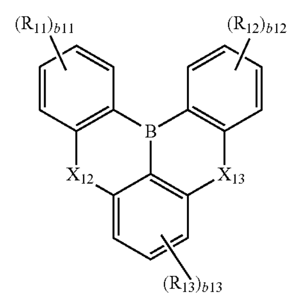

1-2

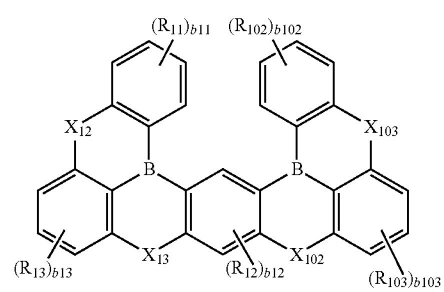

wherein, in Formulae 1-1 and 1-2, $X_{12}$ is $NR_{15}$ or O, $X_{13}$ is $NR_{16}$ or O, $X_{102}$ is $NR_{105}$ or O, $X_{103}$ is $NR_{106}$ or O, $R_{11}$ to $R_{13}$, $R_{15}$, $R_{16}$, $R_{102}$, $R_{103}$, $R_{105}$, and $R_{106}$ are each independently hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$C(Q_1)(Q_2)(Q_3)$, —$Si(Q_1)(Q_2)(Q_3)$, —$B(Q_1)(Q_2)$, —$N(Q_1)(Q_2)$, —$P(Q_1)(Q_2)$, —$C(=O)(Q_1)$, —$S(=O)(Q_1)$, —$S(=O)_2(Q_1)$, —$P(=O)(Q_1)(Q_2)$, or —$P(=S)(Q_1)(Q_2)$, wherein, at least one of $R_{11}$ to $R_{13}$ in Formula 1-1 is not hydrogen and at least one of $R_{11}$ to $R_{13}$, $R_{102}$, and $R_{103}$ in Formula 1-2 is not hydrogen, b11 to b13, b102, and b103 are each independently an integer from 0 to 10, and $Q_1$ to $Q_3$ are each independently hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group that is substituted with at least one deuterium, —F, a cyano group, a $C_1$-$C_{60}$ alkyl group, a $C_6$-$C_{60}$ aryl group, or any combination thereof, or a $C_6$-$C_{60}$ aryl group that is substituted with at least one deuterium, —F, a cyano group, a $C_1$-$C_{60}$ alkyl group, a $C_6$-$C_{60}$ aryl group, or any combination thereof.

10. The organic light-emitting device of claim 1, wherein the emitter is a compound of Group E-I:

Group E-I

E101

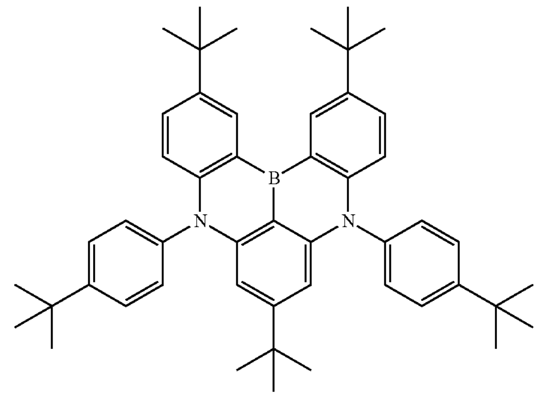

E102

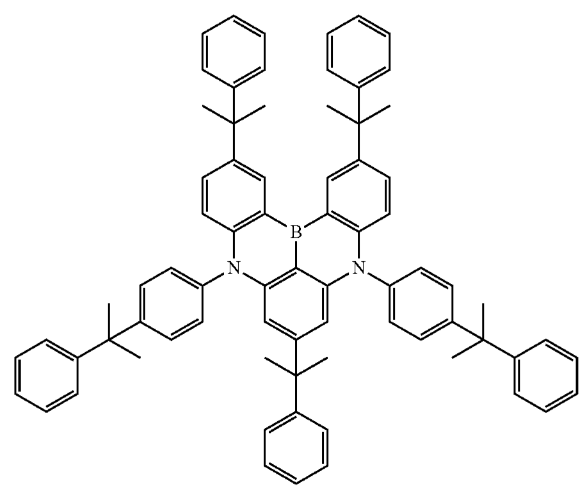

E201

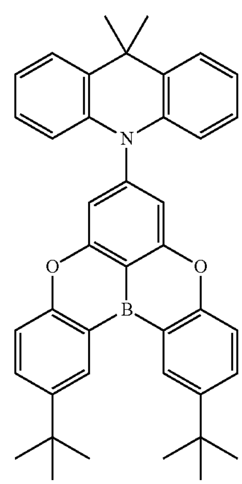

-continued

E301

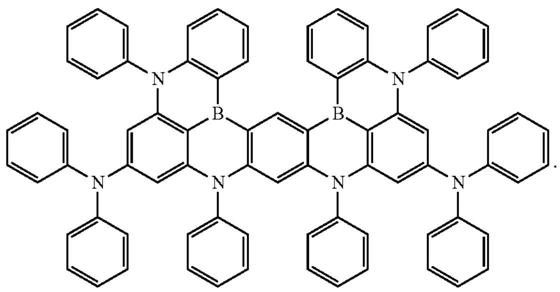

11. The organic light-emitting device of claim 1, wherein a horizontal orientation ratio of the emitter is greater than or equal to about 90%.

12. The organic light-emitting device of claim 1, wherein the sensitizer comprises iridium (Ir), platinum (Pt), palladium (Pd), osmium (Os), titanium (Ti), gold (Au), silver (Ag), copper(Cu), ruthenium (Ru), rhenium (Re), rhodium (Rh), terbium (Tb), thulium (Tm), or any combination thereof.

13. The organic light-emitting device of claim 1, wherein the sensitizer is an organometallic compound represented by Formula 2:

$$M_{21}(L_{21})_{n21}(L_{22})_{n22} \quad \text{Formula 2}$$

wherein, in Formula 2, $M_{21}$ comprises a fourth-row transition metal of the Periodic Table of Elements, a fifth-row transition metal of the Periodic Table of Elements, a sixth-row transition metal of the Periodic Table of Elements, a lanthanide metal, an actinide metal, or any combination thereof, $L_{21}$ is a ligand represented by one of Formulae 2-1 to 2-4, $L_{22}$ is a monodentate ligand or a bidentate ligand, n11 is 1, 2, or 3, and n12 is 0, 1, 2, 3, or 4, 2-1

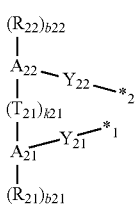

2-2

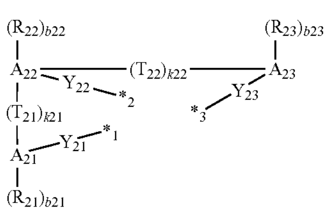

2-3

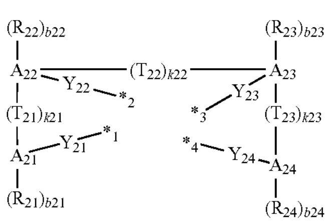

-continued 2-4

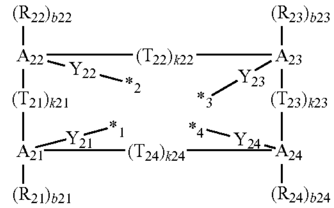

wherein, in Formulae 2-1 to 2-4, $A_{21}$ to $A_{24}$ are each independently a $C_5$-$C_{30}$ carbocyclic group, a $C_1$-$C_{30}$ heterocyclic group, or a non-cyclic group, $T_{21}$ to $T_{24}$ are each independently a single bond, a double bond, *—O—*', *—S—*', *—C(═O)—*', *—S(═O)—*', *—C($R_{25}$)($R_{26}$)—*', *—C($R_{25}$)═C($R_{26}$)—*', *—C($R_{25}$)═*', *—Si($R_{25}$)($R_{26}$)—*', *—B($R_{25}$)—*', *—N($R_{25}$)—*', or *—P($R_{25}$)—*', k21 to k24 are each independently 1, 2, or 3, $Y_{21}$ to $Y_{24}$ are each independently a single bond, *—O—*', *—S—*', *—C($R_{27}$)($R_{28}$)—*', *—Si($R_{27}$)($R_{28}$)—*', *—B($R_{27}$)—*', *—N($R_{27}$)—*', or *—P($R_{27}$)—*', $*_1$, $*_2$, $*_3$, and $*_4$ each indicate a binding site to $M_{21}$, $R_{21}$ to $R_{28}$ are each independently hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropoly cyclic group, —C($Q_1$)($Q_2$)($Q_3$), —Si($Q_1$)($Q_2$)($Q_3$), —B($Q_1$)($Q_2$), —N($Q_1$)($Q_2$), —P($Q_1$)($Q_2$), —C(═O)($Q_1$), —S(═O)($Q_1$), —S(═O)$_2$($Q_1$), —P(═O)($Q_1$)($Q_2$), or —P(═S)($Q_1$)($Q_2$), $R_{21}$ to $R_{28}$ are optionally bonded to each other to form a substituted or unsubstituted $C_5$-$C_{60}$ carbocyclic group or a substituted or unsubstituted $C_1$-$C_{60}$ heterocyclic group, and b21 to b24 are each independently an integer from 0 to 10.

14. The organic light-emitting device of claim 1, wherein the host comprises an electron transport host, a hole transport host, or a combination thereof, the electron transport host comprises at least one electron transport moiety, the hole transport host does not comprise an electron transport moiety, the electron transport moiety is a cyano group, —F, —$CFH_2$, —$CF_2H$, —$CF_3$, a π-electron-deficient nitrogen-containing cyclic group, a group represented by one of formulae below, or any combination thereof:

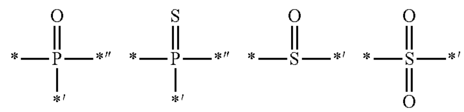

wherein, in the formulae, *, *', and *" each indicate a binding site to a neighboring atom.

15. The organic light-emitting device of claim 1, wherein each of the host and the sensitizer does not emit light.

16. The organic light-emitting device of claim 1, wherein the host, the emitter, and the sensitizer further satisfy Condition 2 below:

$$T_1(H) \geq T_1(S) \geq S_1(E) \qquad \text{Condition 2}$$

wherein, in Condition 2, $T_1(H)$ is a lowest excitation triplet energy level of the host, $S_1(E)$ is a lowest excitation singlet energy level of the emitter, and $T_1(S)$ is a lowest excitation triplet energy level of the sensitizer.

17. The organic light-emitting device of claim 1, wherein the host and the sensitizer further satisfy Condition 3 below:

$$T_1(H) > T_1(S) \qquad \text{Condition 3}$$

wherein, in Condition 3, $T_1(H)$ is a lowest excitation triplet energy level of the host, and $T_1(S)$ is a lowest excitation triplet energy level of the sensitizer.

18. The organic light-emitting device of claim 1, wherein a spectral overlap integral (SOI) constant (J) of the sensitizer and the emitter is greater than or equal to about $1\times10^{14}$.

19. An organic light-emitting device comprising:

a first electrode; a second electrode; m emission units located between the first electrode and the second electrode and comprising at least one emission layer; and m−1 charge generation layers located between two adjacent emission units of the m emission units and comprising an n-type charge generation layer and a p-type charge generation layer, wherein m is an integer of 2 or more, wherein a maximum emission wavelength of light emitted from the at least one emission unit of the m emission units is different from a maximum emission wavelength of light emitted from at least one emission unit of the remaining emission units, wherein the at least one of emission layer comprises a host, a sensitizer, and an emitter, wherein the sensitizer comprises a fourth-row transition metal of the Periodic Table of Elements, a fifth-row transition metal of the Periodic Table of Elements, a sixth-row transition metal of the Periodic Table of Elements, a lanthanide metal, an actinide metal, or any combination thereof, and the at least one emission layer satisfies Condition 1 below:

$$\Theta_{H+S+E}/\Theta_{H+S}\times100 > \text{about } 109\% \qquad \text{Condition 1}$$

wherein, in Condition 1, $\Theta_{H+S+E}$ is a horizontal orientation ratio of an emission layer, and $\Theta_{H+S}$ is a horizontal orientation ratio of a thin film consisting of the host and the sensitizer included in the emission layer.

20. An organic light-emitting device comprising:

a first electrode; a second electrode; and m emission layers between the first electrode and the second electrode, wherein m is an integer of 2 or more, a maximum emission wavelength of light emitted from the at least one emission layer of the m emission layers is different from a maximum emission wavelength of light emitted from at least one emission layer of the remaining emission layers, and wherein the at least one of the m emission layers comprises a host, a sensitizer, and an emitter, wherein the sensitizer comprises a fourth-row transition metal of the Periodic Table of Elements, a fifth-row transition metal of the Periodic Table of Elements, a sixth-row transition metal of the Periodic Table of Elements, a lanthanide metal, an actinide metal, or any combination thereof, and the emission layers satisfy Condition 1 below:

$$\Theta_{H+S+E}/\Theta_{H+S}\times100 > \text{about } 109\% \qquad \text{Condition 1}$$

wherein, in Condition 1, $\Theta_{H+S+E}$ is a horizontal orientation ratio of an emission layer, and $\Theta_{H+S}$ is a horizontal orientation ratio of a thin film consisting of the host and the sensitizer included in the emission layer.

* * * * *